US010523242B2

(12) United States Patent
Ikegaya et al.

(10) Patent No.: US 10,523,242 B2
(45) Date of Patent: Dec. 31, 2019

(54) DATA PROCESSING APPARATUS AND METHOD

(71) Applicant: Sony Corporation, Tokyo (JP)

(72) Inventors: Ryoji Ikegaya, Kanagawa (JP); Makiko Yamamoto, Tokyo (JP); Lachlan Michael, Saitama (JP); Muhammad Nabil Sven Loghin, Tokyo (JP); Yuji Shinohara, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/030,350

(22) Filed: Jul. 9, 2018

(65) Prior Publication Data

US 2019/0181885 A1 Jun. 13, 2019

Related U.S. Application Data

(63) Continuation of application No. 14/840,888, filed on Aug. 31, 2015, now abandoned.

(Continued)

(51) Int. Cl.
*H03M 13/27* (2006.01)
*H03M 13/03* (2006.01)
(Continued)

(52) U.S. Cl.
CPC ..... *H03M 13/2792* (2013.01); *H03M 13/036* (2013.01); *H03M 13/1165* (2013.01);
(Continued)

(58) Field of Classification Search
CPC ........... H03M 13/2792; H03M 13/036; H03M 13/1165; H03M 13/271; H03M 13/2906;
(Continued)

(56) References Cited

U.S. PATENT DOCUMENTS 8,595,783 B2 11/2013 Dewa
8,705,933 B2 4/2014 Eyer
(Continued)

FOREIGN PATENT DOCUMENTS

JP 10-163887 A 6/1998
JP 2002-76915 A 3/2002
(Continued)

OTHER PUBLICATIONS

International Search Report dated Feb. 9, 2016 in PCT/JP2016/050017 (with English Translation).

(Continued)

*Primary Examiner* — Cynthia Britt
*Assistant Examiner* — Rong Tang
(74) *Attorney, Agent, or Firm* — Oblon, McClelland, Maier & Neustadt, L.L.P.

(57) ABSTRACT

A data processing apparatus includes a group-wise interleaving unit that performs group-wise interleaving; and a block interleaving unit that performs block interleaving in such a manner that an LDPC code obtained by performing the group-wise interleaving is written in m number of columns as storage regions arranged in the row direction. A type of the block interleaving includes a type A and a type B. A MODCOD which is a combination of the LDPC code and the modulation scheme includes a MODCOD-A which is a MODCOD based on the assumption that the block interleaving of the type A is performed, and a MDOCOD-B which is a MDOCOD based on the assumption that the block interleaving of the type B is performed.

4 Claims, 362 Drawing Sheets

Related U.S. Application Data

(60) Provisional application No. 62/102,941, filed on Jan. 13, 2015, provisional application No. 62/105,494, filed on Jan. 20, 2015.

(51) Int. Cl.
*H03M 13/11* (2006.01)
*H03M 13/25* (2006.01)
*H03M 13/29* (2006.01)
*H03M 13/15* (2006.01)

(52) U.S. Cl.
CPC ....... *H03M 13/253* (2013.01); *H03M 13/255* (2013.01); *H03M 13/271* (2013.01); *H03M 13/2707* (2013.01); *H03M 13/2778* (2013.01); *H03M 13/2906* (2013.01); *H03M 13/152* (2013.01)

(58) Field of Classification Search
CPC ........... H03M 13/255; H03M 13/2778; H03M 13/152
See application file for complete search history.

(56) References Cited

U.S. PATENT DOCUMENTS

| | | | |
|---|---|---|---|
| 8,839,338 | B2 | 9/2014 | Eyer |
| 8,842,974 | B2 | 9/2014 | Kitazato |
| 8,863,171 | B2 | 10/2014 | Blanchard et al. |
| 8,872,888 | B2 | 10/2014 | Kitazato |
| 8,875,169 | B2 | 10/2014 | Yamagishi |
| 8,875,204 | B2 | 10/2014 | Kitazato |
| 8,884,800 | B1 | 11/2014 | Fay |
| 8,886,009 | B2 | 11/2014 | Eyer |
| 8,892,636 | B2 | 11/2014 | Yamagishi |
| 8,893,210 | B2 | 11/2014 | Eyer |
| 8,896,755 | B2 | 11/2014 | Kitazato et al. |
| 8,898,720 | B2 | 11/2014 | Eyer |
| 8,904,417 | B2 | 12/2014 | Kitahara et al. |
| 8,908,103 | B2 | 12/2014 | Kitazato |
| 8,909,694 | B2 | 12/2014 | Yamagishi et al. |
| 8,914,832 | B2 | 12/2014 | Yamagishi |
| 8,917,358 | B2 | 12/2014 | Eyer |
| 8,918,801 | B2 | 12/2014 | Kitazato et al. |
| 8,925,016 | B2 | 12/2014 | Eyer |
| 8,930,988 | B2 | 1/2015 | Kitazato et al. |
| 8,938,756 | B2 | 1/2015 | Kitazato |
| 8,941,779 | B2 | 1/2015 | Eyer |
| 8,966,564 | B2 | 2/2015 | Kitazato |
| 8,988,612 | B2 | 3/2015 | Kitazato |
| 8,989,723 | B2 | 3/2015 | Coppinger et al. |
| 9,015,785 | B2 | 4/2015 | Yamagishi |
| 9,038,095 | B2 | 5/2015 | Fay et al. |
| 9,043,857 | B2 | 5/2015 | Dewa |
| 9,078,031 | B2 | 7/2015 | Kitazato et al. |
| 2003/0088821 | A1 | 5/2003 | Yokokawa et al. |
| 2011/0088075 | A1 | 4/2011 | Eyer |
| 2011/0243536 | A1 | 10/2011 | Eyer |
| 2011/0246488 | A1 | 10/2011 | Eyer |
| 2011/0247028 | A1 | 10/2011 | Eyer |
| 2011/0298981 | A1 | 12/2011 | Eyer |
| 2011/0299827 | A1 | 12/2011 | Eyer |
| 2011/0302599 | A1 | 12/2011 | Eyer |
| 2011/0302611 | A1 | 12/2011 | Eyer |
| 2012/0050619 | A1 | 3/2012 | Kitazato et al. |
| 2012/0054214 | A1 | 3/2012 | Yamagishi et al. |
| 2012/0054235 | A1 | 3/2012 | Kitazato et al. |
| 2012/0060197 | A1 | 3/2012 | Kitahara et al. |
| 2012/0063508 | A1 | 3/2012 | Hattori et al. |
| 2012/0072965 | A1 | 3/2012 | Dewa |
| 2012/0081607 | A1 | 4/2012 | Kitazato |
| 2012/0084802 | A1 | 4/2012 | Kitazato |
| 2012/0185888 | A1 | 7/2012 | Eyer et al. |
| 2012/0253826 | A1 | 10/2012 | Kitazato et al. |
| 2013/0024894 | A1 | 1/2013 | Eyer |
| 2013/0036440 | A1 | 2/2013 | Eyer |
| 2013/0055313 | A1 | 2/2013 | Eyer |
| 2013/0103716 | A1 | 4/2013 | Yamagishi |
| 2013/0191860 | A1 | 7/2013 | Kitazato et al. |
| 2013/0201399 | A1 | 8/2013 | Kitazato et al. |
| 2013/0205327 | A1 | 8/2013 | Eyer |
| 2013/0212634 | A1 | 8/2013 | Kitazato |
| 2013/0254824 | A1 | 9/2013 | Eyer |
| 2013/0282870 | A1 | 10/2013 | Dewa et al. |
| 2013/0283311 | A1 | 10/2013 | Eyer |
| 2013/0283328 | A1 | 10/2013 | Kitazato |
| 2013/0291022 | A1 | 10/2013 | Eyer |
| 2013/0340007 | A1 | 12/2013 | Eyer |
| 2014/0013347 | A1 | 1/2014 | Yamagishi |
| 2014/0013379 | A1 | 1/2014 | Kitazato et al. |
| 2014/0040965 | A1 | 2/2014 | Kitazato et al. |
| 2014/0040968 | A1 | 2/2014 | Kitazato et al. |
| 2014/0043540 | A1 | 2/2014 | Kitazato et al. |
| 2014/0053174 | A1 | 2/2014 | Eyer et al. |
| 2014/0067922 | A1 | 3/2014 | Yamagishi et al. |
| 2014/0099078 | A1 | 4/2014 | Kitahara et al. |
| 2014/0122528 | A1 | 5/2014 | Yamagishi |
| 2014/0129895 | A1 | 5/2014 | Petrov |
| 2014/0137153 | A1 | 5/2014 | Fay et al. |
| 2014/0137165 | A1 | 5/2014 | Yamagishi |
| 2014/0150040 | A1 | 5/2014 | Kitahara et al. |
| 2014/0157304 | A1 | 6/2014 | Fay et al. |
| 2014/0186008 | A1 | 7/2014 | Eyer |
| 2014/0208375 | A1 | 7/2014 | Fay et al. |
| 2014/0208380 | A1 | 7/2014 | Fay et al. |
| 2014/0229580 | A1 | 8/2014 | Yamagishi |
| 2014/0229979 | A1 | 8/2014 | Kitazato et al. |
| 2014/0253683 | A1 | 9/2014 | Eyer et al. |
| 2014/0327825 | A1 | 11/2014 | Eyer |
| 2014/0348448 | A1 | 11/2014 | Eyer |
| 2014/0351877 | A1 | 11/2014 | Eyer |
| 2014/0354890 | A1 | 12/2014 | Eyer |
| 2015/0007215 | A1 | 1/2015 | Fay et al. |
| 2015/0007219 | A1 | 1/2015 | Blanchard et al. |
| 2015/0007242 | A1 | 1/2015 | Fay |
| 2015/0012588 | A1 | 1/2015 | Yamagishi |
| 2015/0012955 | A1 | 1/2015 | Kitazato |
| 2015/0020146 | A1 | 1/2015 | Eyer |
| 2015/0026730 | A1 | 1/2015 | Eyer |
| 2015/0026739 | A1 | 1/2015 | Kitazato |
| 2015/0033280 | A1 | 1/2015 | Fay |
| 2015/0038100 | A1 | 2/2015 | Fay |
| 2015/0039973 | A1 | 2/2015 | Jeong et al. |
| 2015/0046937 | A1 | 2/2015 | Kitazato et al. |
| 2015/0046942 | A1 | 2/2015 | Eyer |
| 2015/0058410 | A1 | 2/2015 | Yamagishi et al. |
| 2015/0058875 | A1 | 2/2015 | Kitahara et al. |
| 2015/0058906 | A1 | 2/2015 | Kitazato et al. |
| 2015/0058911 | A1 | 2/2015 | Kitazato et al. |
| 2015/0062428 | A1 | 3/2015 | Eyer |
| 2015/0067713 | A1 | 3/2015 | Yamagishi |
| 2015/0074704 | A1 | 3/2015 | Kitazato |
| 2015/0082131 | A1 | 3/2015 | Jeong et al. |
| 2015/0082367 | A1 | 3/2015 | Kitazato |
| 2015/0100997 | A1 | 4/2015 | Kitazato |
| 2015/0163557 | A1 | 6/2015 | Kitazato |
| 2015/0195605 | A1 | 7/2015 | Eyer |
| 2015/0215673 | A1 | 7/2015 | Yamagishi |
| 2015/0222941 | A1 | 8/2015 | Fay et al. |
| 2015/0222963 | A1 | 8/2015 | Dewa |
| 2016/0380726 | A1 | 12/2016 | Jeong et al. |

FOREIGN PATENT DOCUMENTS

| | | | |
|---|---|---|---|
| WO | WO 2012/157286 | A1 | 11/2012 |
| WO | WO 2015/002507 | A1 | 1/2015 |

OTHER PUBLICATIONS

Advanced Television Systems Committee, ATSC Digital Television Standard—Part 2: RF/Transmission System Characteristics [online], Internet :< URL:http://atsc.org/standards/atsc-standards/> Dec. 15, 2011, pp. 11-18.

(56) References Cited

OTHER PUBLICATIONS

Advanced Television Systems Committee, ATSC Candidate Standard: Physical Layer Protocol [online], Internet :<URL:http://atsc.org/standards/candidate-standards/>, Sep. 28, 2015, pp. 35-40.

Extended European Search Report dated Aug. 31, 2018 in corresponding European Patent Application No. 16737227.5, 15 pages.

"ATSC Candidate Standard: Physical Layer Protocol", Advanced Television Systems Committee, Doc. S32-230r21, Sep. 28, 2015, pp. 1-228.

FIG. 3

$$H=\begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 1 & 0 & 0 & 1 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

FIG. 13

NUMBER OF COLUMNS OF EACH COLUMN WEIGHT

| | N=64800 | | | | N=16200 | | | |
|---|---|---|---|---|---|---|---|---|
| NORMAL CODE RATE | X | KX | K3 | M | X | KX | K3 | M |
| 1/4 | 12 | 5400 | 10800 | 48600 | 12 | 1440 | 1800 | 12960 |
| 1/3 | 12 | 7200 | 14400 | 43200 | 12 | 1800 | 3600 | 10800 |
| 2/5 | 12 | 8640 | 17280 | 38880 | 12 | 2160 | 4320 | 9720 |
| 1/2 | 8 | 12960 | 19440 | 32400 | 8 | 1800 | 5400 | 9000 |
| 3/5 | 12 | 12960 | 25920 | 25920 | 12 | 3240 | 6480 | 6480 |
| 2/3 | 13 | 4320 | 38880 | 21600 | 13 | 1080 | 9720 | 5400 |
| 3/4 | 12 | 5400 | 43200 | 16200 | 12 | 360 | 11520 | 4320 |
| 4/5 | 11 | 6480 | 45360 | 12960 | - | 0 | 12600 | 3600 |
| 5/6 | 13 | 5400 | 48600 | 10800 | 13 | 360 | 12960 | 2880 |
| 8/9 | 4 | 7200 | 50400 | 7200 | 4 | 1800 | 12600 | 1800 |
| 9/10 | 4 | 6480 | 51840 | 6480 | --- | --- | --- | --- |

DUAL DIAGONAL STRUCTURE OF PARITY MATRIX

DUAL DIAGONAL STRUCTURE PART OF TANNER GRAPH r1/4 16K 6295 9626 304 7695 4839 4936 1660 144 11203 5567 6347 12557
10691 4988 3859 3734 3071 3494 7687 10313 5964 8069 8296 11090
10774 3613 5208 11177 7676 3549 8746 6583 7239 12265 2674 4292
11869 3708 5981 8718 4908 10650 6805 3334 2627 10461 9285 11120
7844 3079 10773
3385 10854 5747
1360 12010 12202
6189 4241 2343
9840 12726 4977

FIG. 21

DISPLAY ROW NUMBER OF PARITY CHECK MATRIX (INFORMATION MATRIX $H_A$) FROM FIRST COLUMN WITH INTERVAL OF 360 COLUMNS

ROW NUMBER OF PARITY CHECK MATRIX

FIRST COLUMN OF $H_A$ → 0 2084 1613 1548 1286 1460 3196 4297 2481 3369 3451 4620 2622
361ST COLUMN OF $H_A$ → 1 122 1516 3448 2880 1407 1847 3799 3529 373 971 4358 3108
721ST COLUMN OF $H_A$ → 2 259 3399 929 2650 864 3996 3833 107 5287 164 3125 2350 ($h_{3,5}$ = 2650)
1081ST COLUMN OF $H_A$ → 3 342 3529
4 4198 2147
5 1880 4836
6 3864 4910
7 243 1542
8 3011 1436
9 2167 2512
10 4606 1003
11 2835 705
12 3426 2365
13 3848 2474
14 1360 1743
0 163 2536
1 2583 1180
2 1542 509
3 4418 1005
4 5212 5117
5 2155 2922
6 347 2696
7 226 4296
8 1560 487
9 3926 1640
10 149 2928
11 2364 563
12 635 688
13 231 1684
14 1129 3894

PARITY CHECK MATRIX INITIAL VALUE TABLE

| |
|---|
| 2 6 18 |
| 2 10 19 |
| 22 |
| 19 |
| 15 |

OFFERED FROM CRC/ETRI

FIG. 30

N=16200, rate=8/15

N=16200, rate=10/15

N=16200, rate=12/15
3 394 1014 1214 1361 1477 1534 1660 1856 2745 2987 2991 3124 3155
59 136 528 781 803 928 1293 1489 1944 2041 2200 2613 2690 2847
155 245 311 621 1114 1269 1281 1783 1995 2047 2672 2803 2885 3014
79 870 974 1326 1449 1531 2077 2317 2467 2627 2811 3083 3101 3132
4 582 660 902 1048 1482 1697 1744 1928 2628 2699 2728 3045 3104
175 395 429 1027 1061 1068 1154 1168 1175 2147 2359 2376 2613 2682
1388 2241 3118 3148
143 506 2067 3148
1594 2217 2705
398 988 2551
1149 2588 2654
678 2844 3115
1508 1547 1954
1199 1267 1710
2589 3163 3207
1 2583 2974
2766 2897 3166
929 1823 2742
1113 3007 3239
1753 2478 3127
0 509 1811
1672 2646 2984
965 1462 3230
3 1077 2917
1183 1316 1662
968 1593 3239
64 1996 2226
1442 2058 3181
513 973 1058
1263 3185 3229
681 1394 3017
419 2853 3217
3 2404 3175
2417 2792 2854
1879 2940 3235
647 1704 3060

FIG. 33

N=64800, rate=7/15

N=64800, rate=9/15

N=64800, rate=11/15

N=64800, rate=13/15

N=64800, rate=6/15

1606 3402 4961 6751 7132 11516 12300 12482 12592 13342 13764 14123 21576 23946 24533 25376 25667 26836 31799 34173 35462 36153 36740 37085 37152 37468 37658
4621 5007 6910 8732 9757 11508 13099 15513 16335 18052 19512 21319 23663 25628 27208 31333 32219 33003 33239 33447 36200 36473 36938 37201 37283 37495 38642
16 1094 2020 3080 4194 5098 5631 6877 7889 8237 9804 10067 11017 11366 13136 13354 15379 18934 20199 24522 26172 28666 30386 32714 36390 37015 37162
700 897 1708 6017 6490 7372 7825 9546 10398 16605 18561 18745 21625 22137 23693 24340 24966 25015 26995 28586 28895 29687 33938 34520 34858 37056 38297
159 2010 2573 3617 4452 4958 5556 5832 6481 8227 9924 10836 14954 15594 16623 18065 19249 22394 22677 23408 23731 24076 24776 27007 28222 30343 38371
3118 3545 4768 4992 5227 6732 8170 9397 10522 11508 15536 20218 21921 28599 29445 29758 29968 31014 32027 33685 34378 35867 36323 36728 36870 38335 38623
1264 4254 6936 9165 9486 9950 10861 11653 13697 13961 15164 15665 18444 19470 20313 21189 24371 26431 26999 28086 28251 29261 31981 34015 35850 36129 37186
111 1307 1628 2041 2524 5358 7988 8191 10322 11905 12919 14127 15515 15711 17061 19024 21195 22902 23727 24401 24608 25111 25228 27338 35398 37794 38196
961 3035 7174 7948 13355 13607 14971 18189 18339 18665 18875 19142 20615 21136 21309 21758 23366 24745 25849 25982 27583 30006 31118 32106 36469 36583 37920
2990 3549 4273 4808 5707 6021 6509 7456 8240 10044 12262 12660 13085 14750 15680 16049 21587 23997 25803 28343 28693 34393 34860 35490 36021 37737 38296
955 4323 5145 6885 8123 9730 11840 12216 19194 20313 23056 24248 24830 25268 26617 26801 28557 29753 30745 31450 31973 32839 33025 33296 35710 37366 37509
264 605 4181 4483 5156 7238 8863 10939 11251 12964 16254 17511 20017 22395 22818 23261 23422 24064 26329 27723 28186 30434 31956 33971 34372 36764 38123
520 2562 2794 3528 3860 4402 5676 6963 8655 9018 9783 11933 16336 17193 17320 19035 20606 23579 23769 24123 24966 27866 32457 34011 34499 36620 37526
10106 10637 10906 34242
1856 15100 19378 21848
943 11191 27806 29411
4575 6359 13629 19383
4476 4953 18782 24313
5441 6381 21840 35943
9638 9763 12546 30120
9587 10626 11047 25700
4088 15298 28768 35047
2332 6363 8782 28863
4625 4933 28298 30289
3541 4918 18257 31746
1221 25233 26757 34892
8150 16677 27934 30021
8500 25016 33043 38070
7374 10207 16189 35811
611 18480 20064 38261
25416 27352 36089 38469
1667 17614 25839 32776
4118 12481 21912 37945
5573 13222 23619 31271
18271 26251 27182 30587
14690 26430 26799 34355

OFFERED FROM Samsung

OFFERED FROM Samsung

FIG. 49

N=64800, rate=8/15

2768 3039 4059 5856 6245 7013 8157 9341 9802 10470 11521 12083 16610 18361 20321 24601 27420 28206 29788
2739 8244 8891 9157 12624 12973 15534 16622 16919 18402 18780 19854 20220 20543 22306 25540 27478 27678 28053
1727 2268 6246 7815 9010 9556 10134 10472 11389 14599 15719 16204 17342 17666 18850 22058 25579 25860 29207
28 1346 3721 5565 7019 9240 12355 13109 14800 16040 16839 17369 17631 19357 19473 19891 20381 23911 29683
869 2450 4386 5316 6160 7107 10362 11132 11271 13149 16397 16532 17113 19894 22043 22784 27383 28615 28804
508 4292 5831 8559 10044 10412 11283 14810 15888 17243 17538 19903 20528 22090 22652 27235 27384 28208 28485
389 2248 5840 6043 7000 9054 11075 11760 12217 12565 13587 15403 19422 19528 21493 25142 27777 28566 28702
1015 2002 5764 6777 9346 9629 11039 11153 12690 13068 13990 16841 17702 20021 24106 26300 29332 30081 30196
1480 3084 3467 4401 4798 5187 7851 11368 12323 14325 14546 16360 17158 18010 21333 25612 26556 26906 27005
6925 8876 12392 14529 15253 15437 19226 19950 20321 23021 23651 24393 24653 26668 27205 28269 28529 29041 29292
2547 3404 3538 4666 5126 5468 7695 8799 14732 15072 15881 17410 18971 19609 19717 22150 24941 27908 29018
888 1581 2311 5511 7218 9107 10454 12252 13662 15714 15894 17025 18671 24304 25316 25556 28489 28977 29212
1047 1494 1718 4645 5030 6811 7868 8146 10611 15767 17682 18391 22614 23021 23763 25478 26491 29088 29757
59 1781 1900 3814 4121 8044 8906 9175 11156 14841 15789 16033 16755 17292 18550 19310 22505 29567 29850
1952 3057 4399 9476 10171 10769 11335 11569 15002 19501 20621 22642 23452 24360 25109 25290 25828 28505 29122
2895 3070 3437 4764 4905 6670 9244 11845 13352 13573 13975 14600 15871 17996 19672 20079 20579 25327 27958
612 1528 2004 4244 4599 4926 5843 7684 10122 10443 12267 14368 18413 19058 22985 24257 26202 26596 27899
1361 2195 4146 6708 7158 7538 9138 9998 14862 15359 16076 18925 21401 21573 22503 24146 24247 27778 29312
5229 6235 7134 7655 9139 13527 15408 16058 16705 18320 19909 20901 22238 22437 23654 25131 27550 28247 29903
697 2035 4887 5275 6909 9166 11805 15338 16381 18403 20425 20688 21547 24590 25171 26726 28848 29224 29412
5379 17329 22659 23062
11814 14759 22329 22936
2423 2811 10296 12727
8460 15260 16769 17290
14191 14608 29536 30187
7103 10069 20111 22850
4285 15413 26448 29069
548 2137 9189 10928
4581 7077 23382 23949

OFFERED FROM Samsung

OFFERED FROM Samsung

OFFERED FROM Samsung

FIG. 52

N=64800, rate=12/15

584 1472 1621 1867 3338 3568 3723 4185 5126 5889 7737 8632 8940 9725
221 445 590 3779 3835 6939 7743 8280 8448 8491 9367 10042 11242 12917
4662 4837 4900 5029 6449 6687 6751 8684 9936 11681 11811 11886 12089 12909
2418 3018 3647 4210 4473 7447 7502 9490 10067 11092 11139 11256 12201 12383
2591 2947 3349 3406 4417 4519 5176 6672 8498 8863 9201 11294 11376 12184
27 101 197 290 871 1727 3911 5411 6676 8701 9350 10310 10798 12439
1765 1897 2923 3584 3901 4048 6963 7054 7132 9165 10184 10824 11278 12669
2183 3740 4808 5217 5660 6375 6787 8219 8466 9037 10353 10583 11118 12762
73 1594 2146 2715 3501 3572 3639 3725 6959 7187 8406 10120 10507 10691
240 732 1215 2185 2788 2830 3499 3881 4197 4991 6425 7061 9756 10491
831 1568 1828 3424 4319 4516 4639 6018 9702 10203 10417 11240 11518 12458
2024 2970 3048 3638 3676 4152 5284 5779 5926 9426 9945 10873 11787 11837
1049 1218 1651 2328 3493 4363 5750 6483 7613 8782 9738 9803 11744 11937
1193 2060 2289 2964 3478 4592 4756 6709 7162 8231 8326 11140 11908 12243
978 2120 2439 3338 3850 4589 6567 8745 9656 9708 10161 10542 10711 12639
2403 2938 3117 3247 3711 5593 5844 5932 7801 10152 10226 11498 12162 12941
1781 2229 2276 2533 3582 3951 5279 5774 7930 9824 10920 11038 12340 12440
289 384 1980 2230 3464 3873 5958 8656 8942 9006 10175 11425 11745 12530
155 354 1090 1330 2002 2236 3559 3705 4922 5958 6576 8564 9972 12760
303 876 2059 2142 5244 5330 6644 7576 8614 9598 10410 10718 11033 12957
3449 3617 4408 4602 4727 6182 8835 8928 9372 9644 10237 10747 11655 12747
811 2565 2820 8677 8974 9632 11069 11548 11839 12107 12411 12695 12812 12890
972 4123 4943 6385 6449 7339 7477 8379 9177 9359 10074 11709 12552 12831
842 973 1541 2262 2905 5276 6758 7099 7894 8128 8325 8663 8875 10050
474 791 968 3902 4924 4965 5085 5908 6109 6329 7931 9038 9401 10568
1397 4461 4658 5911 6037 7127 7318 8678 8924 9000 9473 9602 10446 12692
1334 7571 12881
1393 1447 7972
633 1257 10597
4843 5102 11056
3294 8015 10513
1108 10374 10546
5353 7824 10111
3398 7674 8569
7719 9478 10503
2997 9418 9581
5777 6519 11229
1966 5214 9899
6 4088 5827
836 9248 9612
483 7229 7548
7865 8289 9804
2915 11098 11900
6180 7096 9481
1431 6786 8924
748 6757 8625
3312 4475 7204
1852 8958 11020
1915 2903 4006

OFFERED FROM Samsung

OFFERED FROM Samsung

OFFERED FROM Samsung

FIG. 55

N=16200, rate=6/15

27 430 519 828 1897 1943 2513 2600 2640 3310 3415 4266 5044 5100 5328 5483 592
8 6204 6392 6416 6602 7019 7415 7623 8112 8485 8724 8994 9445 9667
27 174 188 631 1172 1427 1779 2217 2270 2601 2813 3196 3582 3895 3908 3948 446
3 4955 5120 5809 5988 6478 6604 7096 7673 7735 7795 8925 9613 9670
27 370 617 852 910 1030 1326 1521 1606 2118 2248 2909 3214 3413 3623 3742 3752
4317 4694 5300 5687 6039 6100 6232 6491 6621 6860 7304 8542 8634
990 1753 7635 8540
933 1415 5666 8745
27 6567 8707 9216
2341 8692 9580 9615
260 1092 5839 6080
352 3750 4847 7726
4610 6580 9506 9597
2512 2974 4814 9348
1461 4021 5060 7009
1796 2883 5553 8306
1249 5422 7057
3965 6968 9422
1498 2931 5092
27 1090 6215
26 4232 6354

OFFERED FROM LGE

FIG. 56

N=16200, rate=7/15

553 742 901 1327 1544 2179 2519 3131 3280 3603 3789 3792 4253 5340 5934 5962 6
004 6698 7793 8001 8058 8126 8276 8559
503 590 598 1185 1266 1336 1806 2473 3021 3356 3490 3680 3936 4501 4659 5891 6
132 6340 6602 7447 8007 8045 8059 8249
795 831 947 1330 1502 2041 2328 2513 2814 2829 4048 4802 6044 6109 6461 6777 6
800 7099 7126 8095 8428 8519 8556 8610
601 787 899 1757 2259 2518 2783 2816 2823 2949 3396 4330 4494 4684 4700 4837 4
881 4975 5130 5464 6554 6912 7094 8297
4229 5628 7917 7992
1506 3374 4174 5547
4275 5650 8208 8533
1504 1747 3433 6345
3659 6955 7575 7852
607 3002 4913 6453
3533 6860 7895 8048
4094 6366 8314
2206 4513 5411
32 3882 5149
389 3121 4626
1308 4419 6520
2092 2373 6849
1815 3679 7152
3582 3979 6948
1049 2135 3754
2276 4442 6591

OFFERED FROM LGE

FIG. 57

N=16200, rate=9/15

212 255 540 967 1033 1517 1538 3124 3408 3800 4373 4864 4905 5163 5177 6186
275 660 1351 2211 2876 3063 3433 4088 4273 4544 4618 4632 5548 6101 6111 6136
279 335 494 865 1662 1681 3414 3775 4252 4595 5272 5471 5796 5907 5986 6008
345 352 3094 3188 4297 4338 4490 4865 5303 6477
222 681 1218 3169 3850 4878 4954 5666 6001 6237
172 512 1536 1559 2179 2227 3334 4049 6464
716 934 1694 2890 3276 3608 4332 4468 5945
1133 1593 1825 2571 3017 4251 5221 5639 5845
1076 1222 6465
159 5064 6078
374 4073 5357
2833 5526 5845
1594 3639 5419
1028 1392 4239
115 622 2175
300 1748 6245
2724 3276 5349
1433 6117 6448
485 663 4955
711 1132 4315
177 3266 4339
1171 4841 4982
33 1584 3692
2820 3485 4249
1716 2428 3125
250 2275 6338
108 1719 4961

OFFERED FROM LGE

FIG. 58

N=16200, rate=11/15

49 719 784 794 968 2382 2685 2873 2974 2995 3540 4179
272 281 374 1279 2034 2067 2112 3429 3613 3815 3838 4216
206 714 820 1800 1925 2147 2168 2769 2806 3253 3415 4311
62 159 166 605 1496 1711 2652 3016 3347 3517 3654 4113
363 733 1118 2062 2613 2736 3143 3427 3664 4100 4157 4314
57 142 436 983 1364 2105 2113 3074 3639 3835 4164 4242
870 921 950 1212 1861 2128 2707 2993 3730 3968 3983 4227
185 2684 3263
2035 2123 2913
883 2221 3521
1344 1773 4132
438 3178 3650
543 756 1639
1057 2337 2898
171 3298 3929
1626 2960 3503
484 3050 3323
2283 2336 4189
2732 4132 4318
225 2335 3497
600 2246 2658
1240 2790 3020
301 1097 3539
1222 1267 2594
1364 2004 3603
1142 1185 2147
564 1505 2086
697 991 2908
1467 2073 3462
2574 2818 3637
748 2577 2772
1151 1419 4129
164 1238 3401

OFFERED FROM LGE

FIG. 59

N=16200, rate=13/15
71 334 645 779 786 1124 1131 1267 1379 1554 1766 1798 1939
6 183 364 506 512 922 972 981 1039 1121 1537 1840 2111
6 71 153 204 253 268 781 799 873 1118 1194 1661 2036
6 247 353 581 921 940 1108 1146 1208 1268 1511 1527 1671
6 37 466 548 747 1142 1203 1271 1512 1516 1837 1904 2125
6 171 863 953 1025 1244 1378 1396 1723 1783 1816 1914 2121
1268 1360 1647 1769
6 458 1231 1414
183 535 1244 1277
107 360 498 1456
6 2007 2059 2120
1480 1523 1670 1927
139 573 711 1790
6 1541 1889 2023
6 374 957 1174
287 423 872 1285
6 1809 1918
65 818 1396
590 766 2107
192 814 1843
775 1163 1256
42 735 1415
334 1008 2055
109 596 1785
406 534 1852
684 719 1543
401 465 1040
112 392 621
82 897 1950
887 1962 2125
793 1088 2159
723 919 1139
610 839 1302
218 1080 1816
627 1646 1749
496 1165 1741
916 1055 1662
182 722 945
5 595 1674

OFFERED FROM LGE

FIG. 60

N=64800, rate=10/15

316 1271 3692 9495 12147 12849 14928 16671 16938 17864 19108 20502 21097 21115
2341 2559 2643 2816 2865 5137 5331 7000 7523 8023 10439 10797 13208 15041
5556 6858 7677 10162 10207 11349 12321 12398 14787 15743 15859 15952 19313 208
79
349 573 910 2702 3654 6214 9246 9353 10638 11772 14447 14953 16620 19888
204 1390 2887 3835 6230 6533 7443 7876 9299 10291 10896 13960 18287 20086
541 2429 2838 7144 8523 8637 10490 10585 11074 12074 15762 16812 17900 18548
733 1659 3838 5323 5805 7882 9429 10682 13697 16909 18846 19587 19592 20904
1134 2136 4631 4653 4718 5197 10410 11666 14996 15305 16048 17417 18960 20303
734 1001 1283 4959 10016 10176 10973 11578 12051 15550 15915 19022 19430 20121
745 4057 5855 9885 10594 10989 13156 13219 13351 13631 13685 14577 17713 20386
968 1446 2130 2502 3092 3787 5323 8104 8418 9998 11681 13972 17747 17929
3020 3857 5275 5786 6319 8608 11943 14062 17144 17752 18001 18453 19311 21414
709 747 1038 2181 5320 8292 10584 10859 13964 15009 15277 16953 20675 21509
1663 3247 5003 5760 7186 7360 10346 14211 14717 14792 15155 16128 17355 17970
516 578 1914 6147 9419 11148 11434 13289 13325 13332 19106 19257 20962 21556
5009 5632 6531 9430 9886 10621 11765 13969 16178 16413 18110 18249 20616 20759
457 2686 3318 4608 5620 5858 6480 7430 9602 12691 14664 18777 20152 20848
33 2877 5334 6851 7907 8654 10688 15401 16123 17942 17969 18747 18931 20224
87 897 7636 8663 11425 12288 12672 14199 16435 17615 17950 18953 19667 20281
1042 1832 2545 2719 2947 3672 3700 6249 6398 6833 11114 14283 17694 20477
326 488 2662 2880 3009 5357 6587 8882 11604 14374 18781 19051 19057 20508
854 1294 2436 2852 4903 6466 7761 9072 9564 10321 13638 15658 16946 19119
194 899 1711 2408 2786 5391 7108 8079 8716 11453 17303 19484 20989 21389
1631 3121 3994 5005 7810 8850 10315 10589 13407 17162 18624 18758 19311 20301
736 2424 4792 5600 6370 10061 16053 16775 18600
1254 8163 8876 9157 12141 14587 16545 17175 18191
388 6641 8974 10607 10716 14477 16825 17191 18400
5578 6082 6824 7360 7745 8655 11402 11665 12428
3603 8729 13463 14698 15210 19112 19550 20727 21052
48 1732 3805 5158 15442 16909 19854 21071 21579
11707 14014 21531
1542 4133 4925
10083 13505 21198
14300 15765 16752
778 1237 11215
1325 3199 14534
2007 14510 20599
1996 5881 16429
5111 15018 15980
4989 10681 12810
3763 10715 16515
2259 10080 15642
9032 11319 21305
3915 15213 20884
11150 15022 20201
1147 6749 19625
12139 12939 18870
3840 4634 10244

OFFERED FROM LGE

OFFERED FROM LGE

OFFERED FROM LGE

FIG. 63

N=64800, rate=9/15

218 592 1116 2229 2989 3217 3922 4338 5063 7196 8516 9168 10774 12013 12355 12485 13238 13315 13365 15102 16325 16379 17222 17866 19091 21096 21677 22183 22884 23023 23059 23295 23694 24888 25755

142 556 754 1359 1813 2861 3733 4015 4103 4137 4590 5431 7423 8429 9924 10043 11764 12672 13476 14250 15182 15575 15835 16093 16893 17014 17993 18328 19778 20782 22151 22347 23841 25434 25647

8 1287 1813 2927 4094 4691 5599 7087 7503 8777 9100 11299 11310 12283 12638 12774 12983 13161 13750 13899 14093 14581 15066 18310 19537 21141 21530 21920 22726 23080 23250 23588 23749 25129 25493

170 2231 2273 4646 5468 5912 7624 7804 8019 8715 9157 10173 10978 13144 14209 14508 15118 15510 16699 17285 18189 18842 19164 19242 19568 20657 20745 22599 22754 24105 24136 24644 25091 25259 25476

611 3593 5689 5980 6779 7830 8200 8420 8701 10161 10601 10863 11251 11540 12306 12364 12396 13247 13256 13454 13683 13810 13912 14254 14665 15530 16749 18022 21173 21359 21564 21860 23562 23936 25873

225 490 1197 1357 2322 3436 3759 5720 5886 10068 10994 12476 13186 13403 13774 14376 14505 14946 15555 16515 17068 17581 18317 19533 19993 20376 20597 21656 23103 23230 23860 24883 25100 25576 25835

910 1479 3144 3600 4255 5851 6277 6587 7337 8562 9592 11428 11534 12127 12452 13565 14336 15311 15470 16915 17520 18194 18324 18385 18575 19627 20126 20219 21108 21294 22218 22466 22541 23614 24218

120 6693 11582 11756 14656 16088 24473 24811
990 3571 8517 10259 14187 15732 17864 23697
2366 5536 8236 14281 16178 19247 25431 25641
9056 10221 16011 17287 22095 22694 23634 24541
1138 3241 4444 11816 14651 17585 20317 24036
3166 5421 7828 11855 13148 16492 22830 25181
3644 5858 7555 12551 14018 15716 20181 20877
3405 7546 10508 12355 12455 16386 22014 22846
5305 12878 13734 15949 16747 17458 18068 23552
2717 4365 5192 9626 11487 17811 24163 25201
4705 5787 12649 14298 15570 19876 23193 24688
3394 4960 9629 11445 19031 23128 23563 25774
1648 4768 8372 11388 11448 13373 14773 15814
4043 10049 13225 14765 18206 19663 20316 25534
8820 15709 17949 18383 18624 19746 23307 25346
221 10075 12281 13163 16430 18834 20637 21646
264 296 2837 4856 9223 10324 16336 18557
4532 7935 12782 16508 17549 21310 23929 24846
5143 5666 6753 8248 12394 13840 14926 15611
4289 9811 10826 11025 11425 15567 20767 25246
1826 4386 6372 6698 7467 20479 23360 24751
740 1873 3727 8628 11803 21326 24482 25134
315 664 2026 10700 12624 21194 24678 24802
8431 9604 11559 12120 19557 21047 21161 21584
6275 8787 9830 10580 12795 15287 20794 21063
3780 7735 9717 10410 14334 19217 24239 24857
4214 9796 10451 17817 18072 18697 19265 24591
2497 5485 6337 10065 13070 14240 20115 23668

OFFERED FROM NERC

OFFERED FROM NERC

OFFERED FROM NERC

FIG. 66

N=16200, rate=5/15

69 244 706 5145 5994 6066 6763 6815 8509
257 541 618 3933 6188 7048 7484 8424 9104
69 500 536 1494 1669 7075 7553 8202 10305
11 189 340 2103 3199 6775 7471 7918 10530
333 400 434 1806 3264 5693 8534 9274 10344
111 129 260 3562 3676 3680 3809 5169 7308 8280
100 303 342 3133 3952 4226 4713 5053 5717 9931
83 87 374 828 2460 4943 6311 8657 9272 9571
114 166 325 2680 4698 7703 7886 8791 9978 10684
281 542 549 1671 3178 3955 7153 7432 9052 10219
202 271 608 3860 4173 4203 5169 6871 8113 9757
16 359 419 3333 4198 4737 6170 7987 9573 10095
235 244 584 4640 5007 5563 6029 6816 7678 9968
123 449 646 2460 3845 4161 6610 7245 7686 8651
136 231 468 835 2622 3292 5158 5294 6584 9926
3085 4683 8191 9027 9922 9928 10550
2462 3185 3976 4091 8089 8772 9342

OFFERED FROM CRC/ETRI

FIG. 67

N=64800, rate=5/15

221 1011 1218 4299 7143 8728 11072 15533 17356 33909 36833
360 1210 1375 2313 3493 16822 21373 23588 23656 26267 34098
544 1347 1433 2457 9186 10945 13583 14858 19195 34606 37441
37 596 715 4134 8091 12106 24307 24658 34108 40591 42883
235 398 1204 2075 6742 11670 13512 23231 24784 27915 34752
204 873 890 13550 16570 19774 34012 35249 37655 39885 42890
221 371 514 11984 14972 15690 28827 29069 30531 31018 43121
280 549 1435 1889 3310 10234 11575 15243 20748 30469 36005
223 666 1248 13304 14433 14732 18943 21248 23127 38529 39272
370 819 1065 9461 10319 25294 31958 33542 37458 39681 40039
585 870 1028 5087 5216 12228 16216 16381 16937 27132 27893
164 167 1210 7386 11151 20413 22713 23134 24188 36771 38992
298 511 809 4620 7347 8873 19602 24162 29198 34304 41145
105 830 1212 2415 14759 15440 16361 16748 22123 32684 42575
659 665 668 6458 22130 25972 30697 31074 32048 36078 37129
91 808 953 8015 8988 13492 13987 15979 28355 34509 39698
594 983 1265 3028 4029 9366 11069 11512 27066 40939 41639
506 740 1321 1484 10747 16376 17384 20285 31502 38925 42606
338 356 975 2022 3578 18689 18772 19826 22914 24733 27431
709 1264 1366 4617 8893 25226 27800 29080 30277 37781 39644
840 1179 1338 2973 3541 7043 12712 15005 17149 19910 36795
1009 1267 1380 4919 12679 22889 29638 30987 34637 36232 37284
466 913 1247 1646 3049 5924 9014 20539 34546 35029 36540
374 697 984 1654 5870 10883 11684 20294 28888 31612 34031
117 240 635 5093 8673 11323 12456 14145 21397 39619 42559
122 1265 1427 13528 14282 15241 16852 17227 34723 36836 39791
595 1180 1310 6952 17916 24725 24971 27243 29555 32138 35987
140 470 1017 13222 13253 18462 20806 21117 28673 31598 37235
7 710 1072 8014 10804 13303 14292 16690 26676 36443 41966
48 189 759 12438 14523 16388 23178 27315 28656 29111 29694
285 387 410 4294 4467 5949 25386 27898 34880 41169 42614
474 545 1320 10506 13186 18126 27110 31498 35353 36193 37322
1075 1130 1424 11390 13312 14161 16927 25071 25844 34287 38151
161 396 427 5944 17281 22201 25218 30143 35566 38261 42513
233 247 694 1446 3180 3507 9069 20764 21940 33422 39358
271 508 1013 6271 21760 21858 24887 29808 31099 35475 39924
8 674 1329 3135 5110 14460 28108 28388 31043 31137 31863
1035 1222 1409 8287 16083 24450 24888 29356 30329 37834 39684
391 1090 1128 1866 4095 10643 13121 14499 20056 22195 30593
55 161 1402 6289 6837 8791 17937 21425 26602 30461 37241
110 377 1228 6875 13253 17032 19008 23274 32285 33452 41630
360 638 1355 5933 12593 13533 23377 23881 24586 26040 41663
535 1240 1333 3354 10860 16032 32573 34908 34957 39255 40759
526 936 1321 7992 10260 18527 28248 29356 32636 34666 35552
336 785 875 7530 13062 13075 18925 27963 28703 33688 36502
36 591 1062 1518 3821 7048 11197 17781 19408 22731 24783
214 1145 1223 1546 9475 11170 16061 21273 38688 40051 42479
1136 1226 1423 20227 22573 24951 26462 29586 34915 42441 43048
26 276 1425 6048 7224 7917 8747 27559 28515 35002 37649

OFFERED FROM CRC/ETRI

OFFERED FROM CRC/ETRI

FIG. 69

N=64800, rate=6/15

71 276 856 6867 12964 17373 18159 26420 28460 28477
257 322 672 2533 5316 6578 9037 10231 13845 36497
233 765 904 1366 3875 13145 15409 18620 23910 30825
100 224 405 12776 13868 14787 16781 23886 29099 31419
23 496 891 2512 12589 14074 19392 20339 27658 28684
473 712 759 1283 4374 9898 12551 13814 24242 32728
511 567 815 11823 17106 17900 19338 22315 24396 26448
45 733 836 1923 3727 17468 25746 33806 35995 36657
17 487 675 2670 3922 5145 18009 23993 31073 36624
72 751 773 1937 17324 28512 30666 30934 31016 31849
257 343 594 14041 19141 24914 26864 28809 32055 34753
99 241 491 2650 9670 17433 17785 18988 22235 30742
198 299 655 6737 8304 10917 16092 19387 20755 37690
351 916 926 18151 21708 23216 30321 33578 34052 37949
54 332 373 2010 3332 5623 16301 34337 36451 37861
139 257 1068 11090 20289 29694 29732 32640 35133 36404
457 885 968 2115 4956 5422 5949 17570 26673 32387
137 570 619 5006 6099 7979 14429 16650 25443 32789
46 282 287 10258 18383 20258 27186 27494 28429 38266
445 486 1058 1868 9976 11294 20364 23695 30826 35330
134 900 931 12518 14544 17715 19623 21111 33868 34570
62 66 586 8020 20270 23831 31041 31965 32224 35189
174 290 784 6740 14673 17642 26286 27382 33447 34879
332 675 1033 1838 12004 15439 20765 31721 34225 38863
527 558 832 3867 6318 8317 10883 13466 18427 25377
431 780 1021 1112 2873 7675 13059 17793 20570 20771
339 536 1015 5725 6916 10846 14487 21156 28123 32614
456 830 1078 7511 11801 12362 12705 17401 28867 34032
222 538 989 5593 6022 8302 14008 23445 25127 29022
37 393 788 3025 7768 11367 22276 22761 28232 30394
234 257 1045 1307 2908 6337 26530 28142 34129 35997
35 46 978 9912 9978 12567 17843 24194 34887 35206
39 959 967 5027 10847 14657 18859 28075 28214 36325
275 477 823 11376 18073 28997 30521 31661 31941 32116
185 580 966 11733 12013 12760 13358 19372 32534 35504
760 891 1046 11150 20358 21638 29930 31014 33050 34840
360 389 1057 5316 5938 14186 16404 32445 34021 35722
306 344 679 5224 6674 10305 18753 25583 30585 36943
103 171 1016 8780 11741 12144 19470 20955 22495 27377
818 832 894 3883 14279 14497 22505 28129 28719 31246
215 411 760 5886 25612 28556 32213 32704 35901 36130
229 489 1067 2385 8587 20565 23431 28102 30147 32859
288 664 980 8138 8531 21676 23787 26708 28798 34490
89 552 847 6656 9889 23949 26226 27080 31236 35823
66 142 443 3339 3813 7977 14944 15464 19186 25983
605 876 931 16682 17669 25800 28220 33432 35738 37382
346 423 806 5669 7668 8789 9928 19724 24039 27893
48 460 1055 3512 7389 7549 20216 22180 28221 35437
187 636 824 1678 4508 13588 19683 21750 30311 33480

OFFERED FROM CRC/ETRI

OFFERED FROM CRC/ETRI

FIG. 71

N=64800, rate=7/15

460 792 1007 4580 11452 13130 26882 27020 32439
35 472 1056 7154 12700 13326 13414 16828 19102
45 440 772 4854 7863 26945 27684 28651 31875
744 812 892 1509 9018 12925 14140 21357 25106
271 474 761 4268 6706 9609 19701 19707 24870
223 477 662 1987 9247 18376 22148 24948 27694
44 379 786 8823 12322 14666 16377 28688 29924
104 219 562 5832 19665 20615 21043 22759 32180
41 43 870 7963 13718 14136 17216 30470 33428
592 744 887 4513 6192 18116 19482 25032 34095
456 821 1078 7162 7443 8774 15567 17243 33085
151 666 977 6946 10358 11172 18129 19777 32234
236 793 870 2001 6805 9047 13877 30131 34252
297 698 772 3449 4204 11608 22950 26071 27512
202 428 474 3205 3726 6223 7708 20214 25283
139 719 915 1447 2938 11864 15932 21748 28598
135 853 902 3239 18590 20579 30578 33374 34045
9 13 971 11834 13642 17628 21669 24741 30965
344 531 730 1880 16895 17587 21901 28620 31957
7 192 380 3168 3729 5518 6827 20372 34168
28 521 681 4313 7465 14209 21501 23364 25980
269 393 898 3561 11066 11985 17311 26127 30309
42 82 707 4880 4890 9818 23340 25959 31695
189 262 707 6573 14082 22259 24230 24390 24664
383 568 573 5498 13449 13990 16904 22629 34203
585 596 820 2440 2488 21956 28261 28703 29591
755 763 795 5636 16433 21714 23452 31150 34545
23 343 669 1159 3507 13096 17978 24241 34321
316 384 944 4872 8491 18913 21085 23198 24798
64 314 765 3706 7136 8634 14227 17127 23437
220 693 899 8791 12417 13487 18335 22126 27428
285 794 1045 8624 8801 9547 19167 21894 32657
386 621 1045 1634 1882 3172 13686 16027 22448
95 622 693 2827 7098 11452 14112 18831 31308
446 813 928 7976 8935 13146 27117 27766 33111
89 138 241 3218 9283 20458 31484 31538 34216
277 420 704 9281 12576 12788 14496 15357 20585
141 643 758 4894 10264 15144 16357 22478 26461
17 108 160 13183 15424 17939 19276 23714 26655
109 285 608 1682 20223 21791 24615 29622 31983
123 515 622 7037 13946 15292 15606 16262 23742
264 565 923 6460 13622 13934 23181 25475 26134
202 548 789 8003 10993 12478 16051 25114 27579
121 450 575 5972 10062 18693 21852 23874 28031
507 560 889 12064 13316 19629 21547 25461 28732
664 786 1043 9137 9294 10163 23389 31436 34297
45 830 907 10730 16541 21232 30354 30605 31847
203 507 1060 6971 12216 13321 17861 22671 29825
369 881 952 3035 12279 12775 17682 17805 34281

OFFERED FROM CRC/ETRI

OFFERED FROM CRC/ETRI

CODE LENGTH: N=16200
CODE RATE: {8, 10, 12}/15

| RATE | PERFORMANCE THRESHOLD (Es/N0) | MINIMUM CYCLE LENGTH |
|---|---|---|
| 8/15 | 0. 805765 | 6 |
| 10/15 | 2. 471011 | 6 |
| 12/15 | 4. 269922 | 6 |

| RATE | X1 | KX1 | X2 | KX2 | Y1 | KY1 | Y2 | KY2 | M |
|---|---|---|---|---|---|---|---|---|---|
| 8/15 | 32 | 720 | 14 | 1080 | 4 | 1440 | 3 | 5400 | 7560 |
| 10/15 | 25 | 720 | 14 | 1440 | 4 | 360 | 3 | 8280 | 5400 |
| 12/15 | 14 | 2160 | — | 0 | 4 | 720 | 3 | 10080 | 3240 |

CODE LENGTH: N=64800

CODE RATE: {7, 9, 11, 13}/15

| RATE | PERFORMANCE THRESHOLD (Es/N0) | MINIMUM CYCLE LENGTH |
|---|---|---|
| 7/15 | -0. 093751 | 6 |
| 9/15 | 1. 658523 | 8 |
| 11/15 | 3. 351930 | 6 |
| 13/15 | 5. 301749 | 6 |

| RATE | X1 | KX1 | X2 | KX2 | Y1 | KY1 | Y2 | KY2 | M |
|---|---|---|---|---|---|---|---|---|---|
| 7/15 | 33 | 2160 | 15 | 5040 | 4 | 0 | 3 | 23040 | 34560 |
| 9/15 | 19 | 6840 | — | 0 | 4 | 6840 | 3 | 25200 | 25920 |
| 11/15 | 15 | 8280 | — | 0 | 4 | 2520 | 3 | 36720 | 17280 |
| 13/15 | 13 | 9360 | — | 0 | 4 | 360 | 3 | 46440 | 8640 |

CODE LENGTH: N=64800
CODE RATE: {6, 8, 12}/15

| RATE | X1 | KX1 | X2 | KX2 | Y1 | KY1 | Y2 | KY2 | M |
|---|---|---|---|---|---|---|---|---|---|
| 6/15 | 27 | 4680 | — | 0 | 4 | 13680 | 3 | 7560 | 38880 |
| 8/15 | 19 | 7200 | — | 0 | 4 | 5760 | 3 | 21600 | 30240 |
| 12/15 | 14 | 9360 | — | 0 | 4 | 0 | 3 | 42480 | 12960 |

OFFERED FROM Samsung

CODE LENGTH: N=16200
CODE RATE: {6, 7, 9, 11, 13}/15

| RATE | X1 | KX1 | X2 | KX2 | Y1 | KY1 | Y2 | KY2 | M |
|---|---|---|---|---|---|---|---|---|---|
| 6/15 | 30 | 1080 | – | – | 4 | 3600 | 3 | 1800 | 9720 |
| 7/15 | 24 | 1440 | – | – | 4 | 2520 | 3 | 3600 | 8640 |
| 9/15 | 16 | 1080 | 10 | 720 | 9 | 1080 | 3 | 6840 | 6480 |
| 11/15 | 12 | 2520 | – | – | – | – | 3 | 9360 | 4320 |
| 13/15 | 13 | 2160 | – | – | 4 | 3600 | 3 | 8280 | 2160 |

OFFERED FROM LGE

CODE LENGTH: N=64800
CODE RATE: 10/15

| RATE | X1 | KX1 | X2 | KX2 | Y1 | KY1 | Y2 | KY2 | M |
|---|---|---|---|---|---|---|---|---|---|
| 10/15 | 14 | 8640 | 9 | 2160 | 4 | 0 | 3 | 32400 | 21600 |

OFFERED FROM LGE

CODE LENGTH: N=64800
CODE RATE: 9/15

| RATE | X1 | KX1 | X2 | KX2 | Y1 | KY1 | Y2 | KY2 | M |
|---|---|---|---|---|---|---|---|---|---|
| 9/15 | 35 | 2520 | 8 | 11520 | 4 | 1080 | 3 | 23760 | 25920 |

OFFERED FROM NERC

CODE LENGTH: N=16200
CODE RATE: 5/15

| RATE | N | K | N−K | g | Q1 | Q2 |
|---|---|---|---|---|---|---|
| 5/15 | 16200 | 5400 | 10800 | 720 | 2 | 28 |

*Q1=g/360, Q2=(N−K−g)/360

OFFERED FROM CRC/ETRI

CODE LENGTH: N=64800

CODE RATE: {5, 6, 7}/15

| RATE | N | K | N-K | M1 | M2 | Q1 | Q2 |
|---|---|---|---|---|---|---|---|
| 5/15 | 64800 | 21600 | 43200 | 1440 | 41760 | 4 | 116 |
| 6/15 | 64800 | 25920 | 38880 | 1080 | 37800 | 3 | 105 |
| 7/15 | 64800 | 30240 | 34560 | 1080 | 33480 | 3 | 93 |

*M1=g, M2=N-K-g, Q1=M1/360, Q2=M2/360

OFFERED FROM CRC/ETRI

FIG. 89

| INPUT CELL WORD y | CONSTELLATION POINT zq |
|---|---|
| (00) | $(1+1i)/\sqrt{2}$ |
| (01) | $(1-1i)/\sqrt{2}$ |
| (10) | $(-1+1i)/\sqrt{2}$ |
| (11) | $(-1-1i)/\sqrt{2}$ |

FIG. 90

| w/Shape | NUC_16_5/15 | NUC_16_6/15 | NUC_16_7/15 | NUC_16_8/15 |
|---|---|---|---|---|
| w0 | 0.5309 + 1.1928i | 0.5115 + 1.2092i | 0.5029 + 1.1949i | 0.4951 + 1.2068i |
| w1 | 1.1928 + 0.5309i | 1.2092 + 0.5115i | 1.1962 + 0.5050i | 1.2068 + 0.4951i |
| w2 | 0.2842 + 0.4633i | 0.2663 + 0.4530i | 0.2632 + 0.4959i | 0.2575 + 0.4819i |
| w3 | 0.4633 + 0.2842i | 0.4530 + 0.2663i | 0.4993 + 0.2625i | 0.4819 + 0.2575i |

| w/Shape | NUC_16_9/15 | NUC_16_10/15 | NUC_16_11/15 | NUC_16_12/15 | NUC_16_13/15 |
|---|---|---|---|---|---|
| w0 | 0.4967 + 1.1932i | 0.4487 + 1.1657i | 0.9342 + 0.9847i | 0.9555 + 0.9555i | 0.9517 + 0.9511i |
| w1 | 1.1896 + 0.4896i | 1.2080 + 0.5377i | 0.9866 + 0.2903i | 0.9555 + 0.2949i | 0.9524 + 0.3061i |
| w2 | 0.2452 + 0.5326i | 0.2213 + 0.4416i | 0.2716 + 0.9325i | 0.2949 + 0.9555i | 0.3067 + 0.9524i |
| w3 | 0.5210 + 0.2440i | 0.6186 + 0.2544i | 0.2901 + 0.2695i | 0.2949 + 0.2949i | 0.3061 + 0.3067i |

FIG. 91

| w/Shape | NUC_64_5/15 | NUC_64_6/15 | NUC_64_7/15 | NUC_64_8/15 |
|---|---|---|---|---|
| w0 | 1.4327+0.3305i | 1.4521+0.3005i | 1.4865+0.2932i | 1.4827+0.2920i |
| w1 | 1.0909+0.2971i | 1.2657+0.8178i | 1.2618+0.8446i | 1.2563+0.8411i |
| w2 | 1.2484+0.7803i | 1.0666+0.2744i | 1.0271+0.2345i | 1.0211+0.2174i |
| w3 | 0.9762+0.5715i | 0.9500+0.5641i | 0.8976+0.5624i | 0.8798+0.5702i |
| w4 | 0.3309+1.4326i | 0.3011+1.4529i | 0.2943+1.4811i | 0.2920+1.4827i |
| w5 | 0.2979+1.0923i | 0.8202+1.2651i | 0.8402+1.2602i | 0.8410+1.2563i |
| w6 | 0.7829+1.2477i | 0.2750+1.0676i | 0.2356+1.0261i | 0.2174+1.0211i |
| w7 | 0.5739+0.9763i | 0.5656+0.9499i | 0.5632+0.8957i | 0.5702+0.8798i |
| w8 | 0.3901+0.2112i | 0.3553+0.1948i | 0.3147+0.1567i | 0.3040+0.1475i |
| w9 | 0.5317+0.2475i | 0.3569+0.2094i | 0.3116+0.1730i | 0.3028+0.1691i |
| w10 | 0.3945+0.2289i | 0.5596+0.2431i | 0.6512+0.2053i | 0.6855+0.1871i |
| w11 | 0.5236+0.2894i | 0.5410+0.3002i | 0.5965+0.3353i | 0.6126+0.3563i |
| w12 | 0.2108+0.3911i | 0.1946+0.3566i | 0.1567+0.3125i | 0.1475+0.3040i |
| w13 | 0.2475+0.5327i | 0.2094+0.3579i | 0.1733+0.3091i | 0.1691+0.3028i |
| w14 | 0.2287+0.3955i | 0.2430+0.5607i | 0.2056+0.6506i | 0.1871+0.6855i |
| w15 | 0.2898+0.5246i | 0.3004+0.5417i | 0.3364+0.5943i | 0.3563+0.6126i |

| w/Shape | NUC_64_9/15 | NUC_64_10/15 | NUC_64_11/15 | NUC_64_12/15 | NUC_64_13/15 |
|---|---|---|---|---|---|
| w0 | 1.4678+0.3029i | 1.4388+0.2878i | 1.4443+0.2683i | 1.4480+0.2403i | 1.4303+0.2329i |
| w1 | 1.2296+0.8500i | 1.2150+0.8133i | 0.7471+1.2243i | 0.6406+1.1995i | 0.6297+1.1818i |
| w2 | 1.0496+0.2245i | 1.0386+0.2219i | 1.1749+0.7734i | 1.0952+0.9115i | 1.0803+0.9154i |
| w3 | 0.8739+0.6079i | 0.8494+0.6145i | 0.7138+0.8201i | 0.6868+0.8108i | 0.6870+0.8095i |
| w4 | 0.2834+1.4645i | 0.2931+1.4656i | 0.1638+1.0769i | 1.0500+0.1642i | 1.0444+0.1681i |
| w5 | 0.8084+1.2532i | 0.8230+1.2278i | 0.2927+1.4217i | 0.7170+0.1473i | 0.7240+0.1548i |
| w6 | 0.2038+1.0260i | 0.2069+1.0649i | 0.1462+0.7457i | 1.0519+0.5188i | 1.0553+0.5250i |
| w7 | 0.5574+0.8905i | 0.5677+0.8971i | 0.4134+0.7408i | 0.7146+0.4532i | 0.7142+0.4710i |
| w8 | 0.3884+0.1313i | 0.4119+0.1177i | 1.0203+0.1517i | 0.1677+1.0405i | 0.2114+1.4305i |
| w9 | 0.3771+0.1914i | 0.3998+0.2516i | 0.6653+0.1357i | 0.2402+1.4087i | 0.2020+1.0575i |
| w10 | 0.7243+0.1752i | 0.7442+0.1559i | 0.9639+0.4465i | 0.1369+0.7073i | 0.1221+0.6613i |
| w11 | 0.6116+0.4008i | 0.5954+0.4328i | 0.6746+0.4339i | 0.4044+0.7057i | 0.3735+0.7557i |
| w12 | 0.1358+0.2445i | 0.1166+0.1678i | 0.1271+0.1428i | 0.1374+0.1295i | 0.1455+0.1275i |
| w13 | 0.1677+0.2860i | 0.1582+0.3325i | 0.3782+0.1406i | 0.4185+0.1357i | 0.4322+0.1389i |
| w14 | 0.1555+0.6756i | 0.1355+0.7408i | 0.1311+0.4288i | 0.1325+0.3998i | 0.1432+0.3852i |
| w15 | 0.3472+0.6007i | 0.3227+0.6200i | 0.3919+0.4276i | 0.4122+0.4120i | 0.4220+0.4278i |

FIG. 92

| w/Shape | NUC_256_5/15 | NUC_256_6/15 | NUC_256_7/15 | NUC_256_8/15 |
|---|---|---|---|---|
| w0 | 0.3454+1.7407i | 0.6800+1.6926i | 0.1256+0.2068i | 1.0804+1.3788i |
| w1 | 0.2848+1.4216i | 0.3911+1.3645i | 0.1255+0.2077i | 1.0487+0.9862i |
| w2 | 0.2900+1.4190i | 0.2191+1.7524i | 0.1265+0.2240i | 1.6464+0.7428i |
| w3 | 0.2737+1.3492i | 0.2274+1.4208i | 0.1264+0.2247i | 1.3245+0.9414i |
| w4 | 0.9875+1.4751i | 0.8678+1.2487i | 0.1557+0.2325i | 0.7198+1.2427i |
| w5 | 0.8056+1.2096i | 0.7275+1.1667i | 0.1555+0.2328i | 0.8106+1.0040i |
| w6 | 0.8024+1.2105i | 0.8747+1.0470i | 0.1594+0.2446i | 0.5595+1.0317i |
| w7 | 0.7633+1.1501i | 0.7930+1.0406i | 0.1590+0.2447i | 0.6118+0.9722i |
| w8 | 0.2418+1.0058i | 0.2098+0.9768i | 0.1383+0.6402i | 1.6768+0.2002i |
| w9 | 0.2421+1.0268i | 0.2241+1.0454i | 0.1417+0.6402i | 0.9997+0.6844i |
| w10 | 0.2430+1.0263i | 0.1858+0.9878i | 0.1344+0.6027i | 1.4212+0.4769i |
| w11 | 0.2435+1.0473i | 0.1901+1.0659i | 0.1366+0.6023i | 1.1479+0.6312i |
| w12 | 0.5466+0.8834i | 0.5547+0.8312i | 0.3330+0.5769i | 0.6079+0.6566i |
| w13 | 0.5600+0.8986i | 0.5479+0.8651i | 0.3228+0.5787i | 0.7284+0.6957i |
| w14 | 0.5596+0.8990i | 0.6073+0.8182i | 0.3089+0.5483i | 0.5724+0.7031i |
| w15 | 0.5732+0.9141i | 0.5955+0.8420i | 0.3017+0.5493i | 0.6302+0.7259i |
| w16 | 1.7419+0.3438i | 1.4070+0.1790i | 0.4168+0.1173i | 0.1457+1.4010i |
| w17 | 1.4213+0.2870i | 1.7227+0.2900i | 0.4168+0.1185i | 0.1866+1.7346i |
| w18 | 1.4197+0.2879i | 1.3246+0.2562i | 0.4205+0.1200i | 0.1174+1.1035i |
| w19 | 1.3494+0.2745i | 1.3636+0.3654i | 0.4202+0.1215i | 0.1095+1.0132i |
| w20 | 1.4793+0.9855i | 1.3708+1.2834i | 0.3852+0.1797i | 0.4357+1.3636i |
| w21 | 1.2123+0.8007i | 1.6701+0.8403i | 0.3860+0.1803i | 0.5853+1.6820i |
| w22 | 1.2118+0.7988i | 1.1614+0.7909i | 0.3867+0.1760i | 0.3439+1.0689i |
| w23 | 1.1521+0.7597i | 1.2241+0.7367i | 0.3879+0.1765i | 0.3234+0.9962i |
| w24 | 1.0044+0.2394i | 0.9769+0.1863i | 0.7366+0.1528i | 0.1092+0.6174i |
| w25 | 1.0250+0.2403i | 0.9452+0.2057i | 0.7255+0.1884i | 0.1074+0.6307i |
| w26 | 1.0252+0.2408i | 1.0100+0.2182i | 0.7219+0.1535i | 0.1109+0.6996i |
| w27 | 1.0460+0.2418i | 0.9795+0.2417i | 0.7117+0.1857i | 0.1076+0.7345i |
| w28 | 0.8845+0.5424i | 0.8241+0.4856i | 0.5825+0.4149i | 0.3291+0.6264i |
| w29 | 0.8997+0.5562i | 0.8232+0.4837i | 0.6012+0.4001i | 0.3126+0.6373i |
| w30 | 0.9000+0.5558i | 0.8799+0.5391i | 0.5715+0.3988i | 0.3392+0.6999i |
| w31 | 0.9148+0.5690i | 0.8796+0.5356i | 0.5889+0.3864i | 0.3202+0.7282i |
| w32 | 0.1617+0.3255i | 0.1376+0.3342i | 0.1671+1.7095i | 0.9652+0.1066i |
| w33 | 0.1624+0.3255i | 0.1383+0.3292i | 0.4420+1.6137i | 0.9075+0.1666i |
| w34 | 0.1624+0.3255i | 0.1363+0.3322i | 0.1477+1.3374i | 0.9724+0.1171i |
| w35 | 0.1621+0.3256i | 0.1370+0.3273i | 0.3135+1.3073i | 0.9186+0.1752i |
| w36 | 0.1790+0.3237i | 0.1655+0.3265i | 1.0214+1.3784i | 0.6342+0.1372i |
| w37 | 0.1789+0.3238i | 0.1656+0.3227i | 0.7434+1.5169i | 0.6550+0.1495i |
| w38 | 0.1791+0.3239i | 0.1634+0.3246i | 0.7869+1.1040i | 0.6290+0.1393i |
| w39 | 0.1791+0.3240i | 0.1636+0.3208i | 0.6252+1.2041i | 0.6494+0.1504i |
| w40 | 0.2113+0.6188i | 0.1779+0.6841i | 0.1526+0.9140i | 1.3127+0.1240i |
| w41 | 0.2119+0.6257i | 0.1828+0.6845i | 0.1914+0.9087i | 0.9572+0.4344i |
| w42 | 0.2122+0.6254i | 0.1745+0.6828i | 0.1539+1.0179i | 1.2403+0.2631i |
| w43 | 0.2127+0.6319i | 0.1793+0.6829i | 0.2095+1.0084i | 1.0254+0.4130i |
| w44 | 0.3178+0.5735i | 0.3547+0.6009i | 0.5021+0.7976i | 0.6096+0.4214i |
| w45 | 0.3218+0.5787i | 0.3593+0.6011i | 0.4537+0.8238i | 0.6773+0.4284i |
| w46 | 0.3215+0.5788i | 0.3576+0.5990i | 0.5683+0.8802i | 0.5995+0.4102i |
| w47 | 0.3257+0.5842i | 0.3624+0.5994i | 0.5021+0.9146i | 0.6531+0.4101i |
| w48 | 0.3188+0.1624i | 0.2697+0.1443i | 1.7030+0.1913i | 0.1250+0.1153i |
| w49 | 0.3195+0.1623i | 0.2704+0.1433i | 1.6116+0.5458i | 0.1252+0.1158i |
| w50 | 0.3195+0.1624i | 0.2644+0.1442i | 1.3788+0.1641i | 0.1245+0.1152i |
| w51 | 0.3201+0.1623i | 0.2650+0.1432i | 1.3121+0.4320i | 0.1247+0.1156i |
| w52 | 0.3184+0.1783i | 0.2763+0.1638i | 1.2722+1.1406i | 0.3768+0.1244i |
| w53 | 0.3196+0.1785i | 0.2768+0.1626i | 1.4536+0.8623i | 0.3707+0.1237i |
| w54 | 0.3189+0.1791i | 0.2715+0.1630i | 1.0204+0.9076i | 0.3779+0.1260i |
| w55 | 0.3200+0.1794i | 0.2719+0.1618i | 1.1634+0.7212i | 0.3717+0.1252i |
| w56 | 0.6175+0.2099i | 0.6488+0.1696i | 0.9978+0.1554i | 0.1161+0.3693i |
| w57 | 0.6234+0.2098i | 0.6462+0.1706i | 0.9681+0.2706i | 0.1157+0.3645i |
| w58 | 0.6230+0.2110i | 0.6456+0.1745i | 1.0795+0.1672i | 0.1178+0.3469i |
| w59 | 0.6291+0.2117i | 0.6431+0.1753i | 1.0514+0.3095i | 0.1171+0.3424i |
| w60 | 0.5729+0.3146i | 0.5854+0.3186i | 0.7488+0.6179i | 0.3530+0.3899i |
| w61 | 0.5781+0.3186i | 0.5862+0.3167i | 0.8017+0.5596i | 0.3422+0.3808i |
| w62 | 0.5779+0.3189i | 0.5864+0.3275i | 0.8168+0.6803i | 0.3614+0.3755i |
| w63 | 0.5831+0.3226i | 0.5873+0.3254i | 0.8882+0.5928i | 0.3509+0.3656i |

FIG. 93

| w/Shape | NUC_256_9/15 | NUC_256_10/15 | NUC_256_11/15 | NUC_256_12/15 | NUC_256_13/15 |
|---|---|---|---|---|---|
| w0 | 0.0899+0.1337i | 1.6097+0.1548i | 0.0591+0.3040i | 1.1980+1.1541i | 1.5315+0.2812i |
| w1 | 0.0910+0.1377i | 1.5549+0.4605i | 0.1067+0.3390i | 0.9192+1.2082i | 0.9982+1.2680i |
| w2 | 0.0873+0.3862i | 1.3226+0.1290i | 0.0687+0.4930i | 1.2778+0.8523i | 1.2623+0.9828i |
| w3 | 0.0883+0.3873i | 1.2772+0.3829i | 0.1491+0.4654i | 1.0390+0.9253i | 1.0130+1.0317i |
| w4 | 0.1115+0.1442i | 1.2753+1.0242i | 0.0887+0.2236i | 0.6057+1.2200i | 0.5551+1.2232i |
| w5 | 0.1135+0.1472i | 1.4434+0.7540i | 0.1828+0.2696i | 0.7371+1.4217i | 0.7500+1.3030i |
| w6 | 0.2067+0.3591i | 1.0491+0.8476i | 0.3356+0.3853i | 0.6678+1.0021i | 0.6087+1.0227i |
| w7 | 0.1975+0.3621i | 1.1861+0.6253i | 0.2702+0.3881i | 0.8412+0.9448i | 0.7948+1.0535i |
| w8 | 0.1048+0.7533i | 0.9326+0.0970i | 0.0835+0.7880i | 1.2128+0.5373i | 1.4036+0.5215i |
| w9 | 0.1770+0.7412i | 0.8962+0.2804i | 0.2394+0.7591i | 1.0048+0.5165i | 0.9890+0.6534i |
| w10 | 0.1022+0.5904i | 1.1044+0.1102i | 0.0760+0.6412i | 1.4321+0.6343i | 1.2520+0.7351i |
| w11 | 0.1191+0.5890i | 1.0648+0.3267i | 0.1987+0.6157i | 1.0245+0.7152i | 1.0227+0.8252i |
| w12 | 0.4264+0.6230i | 0.7325+0.6071i | 0.5245+0.6123i | 0.6384+0.6073i | 0.6403+0.6582i |
| w13 | 0.3650+0.6689i | 0.8260+0.4559i | 0.3927+0.6985i | 0.8175+0.5684i | 0.8060+0.6652i |
| w14 | 0.3254+0.5153i | 0.8744+0.7153i | 0.4287+0.4942i | 0.6568+0.7801i | 0.6373+0.8319i |
| w15 | 0.2959+0.5302i | 0.9882+0.5300i | 0.3318+0.5634i | 0.8311+0.7459i | 0.8148+0.8469i |
| w16 | 0.3256+0.0768i | 0.1646+1.6407i | 0.0989+0.0607i | 0.1349+1.4742i | 0.0862+1.1910i |
| w17 | 0.3266+0.0870i | 0.4867+1.5743i | 0.2630+0.0643i | 0.1105+1.2309i | 0.1233+1.4227i |
| w18 | 0.4721+0.0994i | 0.1363+1.3579i | 0.4932+0.0751i | 0.0634+0.9796i | 0.0755+0.9944i |
| w19 | 0.4721+0.1206i | 0.4023+1.3026i | 0.4161+0.0867i | 0.1891+1.0198i | 0.2181+0.9629i |
| w20 | 0.2927+0.1267i | 1.0542+1.2584i | 0.0968+0.0986i | 0.4142+1.4461i | 0.4487+1.4550i |
| w21 | 0.2947+0.1296i | 0.7875+1.4450i | 0.2399+0.1452i | 0.3323+1.2279i | 0.3074+1.2765i |
| w22 | 0.3823+0.2592i | 0.8687+1.0407i | 0.4202+0.2731i | 0.4998+0.9827i | 0.4457+0.9767i |
| w23 | 0.3944+0.2521i | 0.6502+1.1951i | 0.3814+0.2140i | 0.3467+1.0202i | 0.3244+1.0818i |
| w24 | 0.7755+0.1118i | 0.0982+0.9745i | 0.8082+0.0772i | 0.0680+0.6501i | 0.0654+0.6354i |
| w25 | 0.7513+0.2154i | 0.2842+0.9344i | 0.7885+0.2238i | 0.2016+0.6464i | 0.1971+0.6324i |
| w26 | 0.6591+0.1033i | 0.1142+1.1448i | 0.6399+0.0777i | 0.0719+0.8075i | 0.0669+0.8037i |
| w27 | 0.6446+0.1737i | 0.3385+1.0973i | 0.6420+0.1790i | 0.2088+0.8146i | 0.2018+0.7966i |
| w28 | 0.5906+0.4930i | 0.6062+0.7465i | 0.6417+0.5007i | 0.4809+0.6296i | 0.4855+0.6442i |
| w29 | 0.6538+0.4155i | 0.4607+0.8538i | 0.7299+0.3774i | 0.3374+0.6412i | 0.3382+0.6322i |
| w30 | 0.4981+0.3921i | 0.7263+0.8764i | 0.5309+0.3792i | 0.4955+0.8008i | 0.4757+0.8090i |
| w31 | 0.5373+0.3586i | 0.5450+1.0067i | 0.5944+0.3031i | 0.3431+0.8141i | 0.3361+0.7848i |
| w32 | 0.1630+1.6621i | 0.2655+0.0746i | 0.1546+1.5857i | 1.2731+0.1108i | 1.1297+0.0851i |
| w33 | 0.4720+1.5898i | 0.2664+0.0759i | 0.4570+1.5271i | 1.0794+0.0977i | 0.9487+0.0716i |
| w34 | 0.1268+1.3488i | 0.4571+0.0852i | 0.1299+1.3237i | 1.5126+0.1256i | 1.3237+0.1117i |
| w35 | 0.3752+1.2961i | 0.4516+0.1062i | 0.3843+1.2747i | 0.9029+0.0853i | 0.9393+0.2065i |
| w36 | 1.0398+1.2991i | 0.2559+0.1790i | 1.0096+1.2448i | 0.5429+0.0694i | 0.6190+0.0700i |
| w37 | 0.7733+1.4772i | 0.2586+0.1772i | 0.7469+1.4138i | 0.6795+0.0559i | 0.7738+0.0686i |
| w38 | 0.8330+1.0552i | 0.3592+0.2811i | 0.8493+1.0396i | 0.5628+0.1945i | 0.6220+0.2081i |
| w39 | 0.6242+1.2081i | 0.3728+0.2654i | 0.6271+1.1808i | 0.7326+0.1410i | 0.7757+0.2088i |
| w40 | 0.1103+0.9397i | 0.7706+0.0922i | 0.0962+0.9482i | 1.2283+0.3217i | 1.1814+0.4884i |
| w41 | 0.2415+0.9155i | 0.7407+0.2260i | 0.2825+0.9136i | 1.0269+0.3261i | 0.9824+0.4891i |
| w42 | 0.1118+1.1163i | 0.6180+0.0927i | 0.1111+1.1188i | 1.4663+0.3716i | 1.1993+0.3009i |
| w43 | 0.3079+1.0866i | 0.6019+0.1658i | 0.3278+1.0767i | 0.9085+0.2470i | 0.9901+0.3353i |
| w44 | 0.5647+0.7638i | 0.6007+0.4980i | 0.6212+0.7418i | 0.6160+0.4549i | 0.6359+0.4984i |
| w45 | 0.4385+0.8433i | 0.6673+0.3928i | 0.4618+0.8431i | 0.7818+0.4247i | 0.8014+0.4986i |
| w46 | 0.6846+0.8841i | 0.4786+0.3935i | 0.7246+0.8784i | 0.5938+0.3170i | 0.6291+0.3515i |
| w47 | 0.5165+1.0034i | 0.5176+0.3391i | 0.5361+0.9967i | 0.7600+0.2850i | 0.7895+0.3529i |
| w48 | 1.6489+0.1630i | 0.0757+0.1003i | 1.6072+0.1609i | 0.0595+0.0707i | 0.0671+0.0678i |
| w49 | 1.5848+0.4983i | 0.0753+0.1004i | 1.5432+0.4731i | 0.1722+0.0706i | 0.1990+0.0681i |
| w50 | 1.3437+0.1389i | 0.0777+0.4788i | 1.3489+0.1333i | 0.0599+0.2119i | 0.0672+0.2013i |
| w51 | 1.2850+0.4025i | 0.0867+0.4754i | 1.2954+0.3928i | 0.1748+0.2114i | 0.2001+0.2020i |
| w52 | 1.2728+1.0661i | 0.1023+0.2243i | 1.2390+1.0268i | 0.4134+0.0701i | 0.4732+0.0691i |
| w53 | 1.4509+0.7925i | 0.1010+0.2242i | 1.4186+0.7656i | 0.2935+0.0705i | 0.3357+0.0687i |
| w54 | 1.0249+0.8794i | 0.1950+0.3919i | 1.0410+0.8559i | 0.4231+0.2066i | 0.4760+0.2065i |
| w55 | 1.1758+0.6545i | 0.1881+0.3969i | 1.1906+0.6386i | 0.2979+0.2100i | 0.3369+0.2036i |
| w56 | 0.9629+0.1113i | 0.0930+0.8122i | 0.9742+0.0932i | 0.0638+0.5002i | 0.0662+0.4806i |
| w57 | 0.9226+0.2849i | 0.2215+0.7840i | 0.9407+0.2747i | 0.1905+0.4966i | 0.1986+0.4811i |
| w58 | 1.1062+0.1118i | 0.0937+0.6514i | 1.1464+0.1111i | 0.0612+0.3552i | 0.0673+0.3384i |
| w59 | 1.0674+0.3393i | 0.1540+0.6366i | 1.1015+0.3295i | 0.1810+0.3533i | 0.1996+0.3401i |
| w60 | 0.7234+0.6223i | 0.4810+0.6306i | 0.7601+0.6105i | 0.4630+0.4764i | 0.4830+0.4908i |
| w61 | 0.8211+0.4860i | 0.3856+0.7037i | 0.8677+0.4536i | 0.3231+0.4895i | 0.3383+0.4845i |
| w62 | 0.8457+0.7260i | 0.3527+0.5230i | 0.8874+0.7222i | 0.4416+0.3397i | 0.4783+0.3476i |
| w63 | 0.9640+0.5518i | 0.3100+0.5559i | 1.0145+0.5366i | 0.3083+0.3490i | 0.3375+0.3430i |

FIG. 94

| u/Shape | NUC_1k_5/15 | NUC_1k_6/15 | NUC_1k_7/15 | NUC_1k_8/15 | NUC_1k_9/15 | NUC_1k_10/15 | NUC_1k_11/15 | NUC_1k_12/15 | NUC_1k_13/15 |
|---|---|---|---|---|---|---|---|---|---|
| u1 | 0.9997 | 1.0003 | 0.9963 | 1.0005 | 1.0011 | 1.0772 | 1.2776 | 2.5983 | 2.9754 |
| u2 | 0.9916 | 1.0149 | 1.1928 | 2.0897 | 2.7364 | 2.8011 | 3.2278 | 4.5193 | 4.9976 |
| u3 | 0.9911 | 1.0158 | 1.1963 | 2.0888 | 2.7353 | 2.9634 | 3.6845 | 6.1649 | 7.0187 |
| u4 | 2.4349 | 2.6848 | 3.0187 | 3.9945 | 4.7973 | 4.8127 | 5.5155 | 8.2107 | 9.1029 |
| u5 | 2.4346 | 2.6903 | 3.0304 | 3.9931 | 4.7912 | 5.1864 | 6.3531 | 9.9594 | 11.2221 |
| u6 | 2.486 | 2.882 | 3.6381 | 5.3843 | 6.7638 | 6.7838 | 8.0757 | 12.0321 | 13.4239 |
| u7 | 2.4864 | 2.8747 | 3.6181 | 5.3894 | 6.7793 | 7.5029 | 9.3579 | 13.9574 | 15.6992 |
| u8 | 4.4576 | 4.7815 | 5.5244 | 7.5206 | 9.0009 | 9.2380 | 11.0655 | 16.2598 | 18.0937 |
| u9 | 4.4646 | 4.7619 | 5.4955 | 7.6013 | 9.1536 | 10.3200 | 12.7075 | 18.4269 | 20.6137 |
| u10 | 4.9706 | 5.5779 | 6.7182 | 9.3371 | 11.3648 | 12.0115 | 14.5719 | 20.9273 | 23.2898 |
| u11 | 4.9552 | 5.6434 | 6.9391 | 9.8429 | 12.0321 | 13.5356 | 16.5813 | 23.4863 | 26.1557 |
| u12 | 6.7222 | 7.3854 | 8.7621 | 11.9255 | 14.393 | 15.6099 | 18.8402 | 26.4823 | 29.2399 |
| u13 | 7.0327 | 7.8797 | 9.6592 | 13.3962 | 16.1857 | 17.7524 | 21.3824 | 29.7085 | 32.5936 |
| u14 | 8.5382 | 9.635 | 11.7195 | 15.8981 | 19.1014 | 20.5256 | 24.2862 | 33.6247 | 36.309 |
| u15 | 10.4411 | 11.7874 | 14.3731 | 19.1591 | 22.8664 | 24.1254 | 27.7376 | 38.5854 | 40.584 |

FIG. 95A

| | | | | | | | | | | | | | | | | |
|---|---|---|---|---|---|---|---|---|---|---|---|---|---|---|---|---|
| y0, q | 1 | 1 | 1 | 1 | 1 | 1 | 1 | 1 | 1 | 1 | 1 | 1 | 1 | 1 | 1 | 1 |
| y2, q | 0 | 0 | 0 | 0 | 0 | 0 | 0 | 0 | 1 | 1 | 1 | 1 | 1 | 1 | 1 | 1 |
| y4, q | 0 | 0 | 0 | 0 | 1 | 1 | 1 | 1 | 1 | 1 | 1 | 1 | 0 | 0 | 0 | 0 |
| y6, q | 0 | 0 | 1 | 1 | 1 | 1 | 0 | 0 | 0 | 0 | 1 | 1 | 1 | 1 | 0 | 0 |
| y8, q | 0 | 1 | 1 | 0 | 0 | 1 | 1 | 0 | 0 | 1 | 1 | 0 | 0 | 1 | 1 | 0 |
| $Re(z_q)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | -1 |
| Y0, q | 0 | 0 | 0 | 0 | 0 | 0 | 0 | 0 | 0 | 0 | 0 | 0 | 0 | 0 | 0 | 0 |
| y2, q | 1 | 1 | 1 | 1 | 1 | 1 | 1 | 1 | 0 | 0 | 0 | 0 | 0 | 0 | 0 | 0 |
| y4, q | 0 | 0 | 0 | 0 | 1 | 1 | 1 | 1 | 1 | 1 | 1 | 1 | 0 | 0 | 0 | 0 |
| y6, q | 0 | 0 | 1 | 1 | 1 | 1 | 0 | 0 | 0 | 0 | 1 | 1 | 1 | 1 | 0 | 0 |
| y8, q | 0 | 1 | 1 | 0 | 0 | 1 | 1 | 0 | 0 | 1 | 1 | 0 | 0 | 1 | 1 | 0 |
| $Re(z_q)$ | 1 | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

FIG. 95B

| | | | | | | | | | | | | | | | | |
|---|---|---|---|---|---|---|---|---|---|---|---|---|---|---|---|---|
| y1, q | 1 | 1 | 1 | 1 | 1 | 1 | 1 | 1 | 1 | 1 | 1 | 1 | 1 | 1 | 1 | 1 |
| y3, q | 0 | 0 | 0 | 0 | 0 | 0 | 0 | 0 | 1 | 1 | 1 | 1 | 1 | 1 | 1 | 1 |
| y5, q | 0 | 0 | 0 | 0 | 1 | 1 | 1 | 1 | 1 | 1 | 1 | 1 | 0 | 0 | 0 | 0 |
| y7, q | 0 | 0 | 1 | 1 | 1 | 1 | 0 | 0 | 0 | 0 | 1 | 1 | 1 | 1 | 0 | 0 |
| y9, q | 0 | 1 | 1 | 0 | 0 | 1 | 1 | 0 | 0 | 1 | 1 | 0 | 0 | 1 | 1 | 0 |
| $Im(z_q)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | -1 |
| y1, q | 0 | 0 | 0 | 0 | 0 | 0 | 0 | 0 | 0 | 0 | 0 | 0 | 0 | 0 | 0 | 0 |
| y3, q | 1 | 1 | 1 | 1 | 1 | 1 | 1 | 1 | 0 | 0 | 0 | 0 | 0 | 0 | 0 | 0 |
| y5, q | 0 | 0 | 0 | 0 | 1 | 1 | 1 | 1 | 1 | 1 | 1 | 1 | 0 | 0 | 0 | 0 |
| y7, q | 0 | 0 | 1 | 1 | 1 | 1 | 0 | 0 | 0 | 0 | 1 | 1 | 1 | 1 | 0 | 0 |
| y9, q | 0 | 1 | 1 | 0 | 0 | 1 | 1 | 0 | 0 | 1 | 1 | 0 | 0 | 1 | 1 | 0 |
| $Im(z_q)$ | 1 | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

FIG. 96

| u/code rate | 5/15 | 6/15 | 7/15 | 8/15 | 9/15 | 10/15 | 11/15 | 12/15 | 13/15 |
|---|---|---|---|---|---|---|---|---|---|
| u1 | 1.0004 | 0.9998 | 0.9988 | 0.9999 | 0.9999 | 1.0009 | 1.0043 | 2.031 | 2.7135 |
| u2 | 1.0009 | 0.9984 | 0.9996 | 1.0004 | 1.0364 | 2.272 | 2.7379 | 3.8448 | 4.6426 |
| u3 | 1.0008 | 0.9983 | 0.998 | 1.0013 | 1.037 | 2.2732 | 2.746 | 4.8763 | 6.3617 |
| u4 | 0.9953 | 1.2356 | 2.0374 | 2.5341 | 2.7604 | 4.1332 | 4.6828 | 6.8402 | 8.3598 |
| u5 | 0.9956 | 1.2354 | 2.0374 | 2.5347 | 2.7604 | 4.1327 | 4.7079 | 7.912 | 10.0999 |
| u6 | 0.9956 | 1.2372 | 2.0374 | 2.5328 | 2.8536 | 5.4651 | 6.4365 | 9.7373 | 12.0627 |
| u7 | 0.9957 | 1.2366 | 2.0366 | 2.5362 | 2.8534 | 5.4655 | 6.5065 | 10.8859 | 13.8413 |
| u8 | 2.5769 | 2.9864 | 3.93 | 4.5077 | 4.7342 | 7.4777 | 8.4445 | 12.8891 | 15.9032 |
| u9 | 2.5774 | 2.9867 | 3.931 | 4.5089 | 4.7345 | 7.478 | 8.6065 | 14.1091 | 17.7263 |
| u10 | 2.5794 | 2.9906 | 3.9297 | 4.5202 | 5.0028 | 8.9382 | 10.254 | 15.9704 | 19.7625 |
| u11 | 2.5793 | 2.9912 | 3.9294 | 4.5204 | 5.0025 | 8.9384 | 10.5627 | 17.2797 | 21.6431 |
| u12 | 2.6756 | 3.5858 | 5.277 | 6.2318 | 6.6184 | 10.9166 | 12.3025 | 19.2948 | 23.7857 |
| u13 | 2.6764 | 3.5859 | 5.2757 | 6.2314 | 6.6189 | 10.9185 | 12.8281 | 20.7185 | 25.7402 |
| u14 | 2.6747 | 3.577 | 5.2792 | 6.3219 | 7.215 | 12.5855 | 14.3539 | 22.6727 | 27.9051 |
| u15 | 2.6746 | 3.5775 | 5.2795 | 6.3212 | 7.2149 | 12.5908 | 15.1126 | 24.2439 | 29.9595 |
| u16 | 4.6252 | 5.474 | 7.4011 | 8.3718 | 8.9581 | 14.7944 | 16.7817 | 26.3916 | 32.2702 |
| u17 | 4.6243 | 5.4757 | 7.3997 | 8.372 | 8.9585 | 14.8184 | 17.7277 | 28.1062 | 34.4336 |
| u18 | 4.6188 | 5.4675 | 7.4646 | 8.7429 | 9.94 | 16.6805 | 19.2664 | 30.2335 | 36.7993 |
| u19 | 4.62 | 5.4681 | 7.4665 | 8.7398 | 9.9394 | 16.8025 | 20.3968 | 32.1242 | 39.1019 |
| u20 | 5.246 | 6.7028 | 9.1828 | 10.5001 | 11.5978 | 18.9131 | 22.1002 | 34.4644 | 41.6513 |
| u21 | 5.2441 | 6.7104 | 9.1919 | 10.4999 | 11.6041 | 19.325 | 23.4306 | 36.5679 | 44.1297 |
| u22 | 5.2556 | 6.8816 | 9.641 | 11.4966 | 12.9965 | 21.168 | 25.1704 | 39.027 | 46.8305 |
| u23 | 5.2584 | 6.8738 | 9.6278 | 11.5018 | 13.088 | 22.0945 | 26.7556 | 41.4123 | 49.5435 |
| u24 | 7.0279 | 8.6613 | 11.7039 | 13.483 | 14.878 | 24.1425 | 28.7536 | 44.2002 | 52.5353 |
| u25 | 7.0459 | 8.6344 | 11.6913 | 13.5672 | 15.2586 | 25.575 | 30.6214 | 46.9287 | 55.5551 |
| u26 | 7.4305 | 9.4101 | 12.9619 | 15.1187 | 16.8096 | 27.6541 | 32.829 | 50.0315 | 58.8707 |
| u27 | 7.3941 | 9.5027 | 13.2128 | 15.6519 | 17.8237 | 29.6567 | 35.1146 | 53.2678 | 62.3471 |
| u28 | 8.8516 | 11.1654 | 15.161 | 17.6098 | 19.6965 | 32.2679 | 37.8272 | 57.0085 | 66.2558 |
| u29 | 9.1461 | 11.7322 | 16.204 | 19.1046 | 21.4926 | 35.0526 | 40.7685 | 61.0847 | 70.5087 |
| u30 | 10.4828 | 13.5243 | 18.4804 | 21.5413 | 23.9997 | 38.6023 | 44.3725 | 65.9903 | 75.5397 |
| u31 | 12.3176 | 15.7967 | 21.4433 | 24.7641 | 27.2995 | 43.2007 | 48.9596 | 72.1993 | 81.8379 |

FIG. 97A

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 0 | 0 | 0 | 0 | 0 | 0 | 0 | 0 | 0 | 0 | 0 | 0 | 0 | 0 | 0 | 0 |
| $y_{4,q}$ | 0 | 0 | 0 | 0 | 0 | 0 | 0 | 0 | 1 | 1 | 1 | 1 | 1 | 1 | 1 | 1 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | $-u_{31}$ | $-u_{30}$ | $-u_{29}$ | $-u_{28}$ | $-u_{27}$ | $-u_{26}$ | $-u_{25}$ | $-u_{24}$ | $-u_{23}$ | $-u_{22}$ | $-u_{21}$ | $-u_{20}$ | $-u_{19}$ | $-u_{18}$ | $-u_{17}$ | $-u_{16}$ |
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 1 | 1 | 1 | 1 | 1 | 1 | 1 | 1 | 1 | 1 | 1 | 1 | 1 | 1 | 1 | 1 |
| $y_{4,q}$ | 1 | 1 | 1 | 1 | 1 | 1 | 1 | 1 | 0 | 0 | 0 | 0 | 0 | 0 | 0 | 0 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | $-u_{15}$ | $-u_{14}$ | $-u_{13}$ | $-u_{12}$ | $-u_{11}$ | $-u_{10}$ | $-u_{9}$ | $-u_{8}$ | $-u_{7}$ | $-u_{6}$ | $-u_{5}$ | $-u_{4}$ | $-u_{3}$ | $-u_{2}$ | $-u_{1}$ | $-1$ |
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 1 | 1 | 1 | 1 | 1 | 1 | 1 | 1 | 1 | 1 | 1 | 1 | 1 | 1 | 1 | 1 |
| $y_{4,q}$ | 0 | 0 | 0 | 0 | 0 | 0 | 0 | 0 | 1 | 1 | 1 | 1 | 1 | 1 | 1 | 1 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | 1 | $u_{1}$ | $u_{2}$ | $u_{3}$ | $u_{4}$ | $u_{5}$ | $u_{6}$ | $u_{7}$ | $u_{8}$ | $u_{9}$ | $u_{10}$ | $u_{11}$ | $u_{12}$ | $u_{13}$ | $u_{14}$ | $u_{15}$ |
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 0 | 0 | 0 | 0 | 0 | 0 | 0 | 0 | 0 | 0 | 0 | 0 | 0 | 0 | 0 | 0 |
| $y_{4,q}$ | 1 | 1 | 1 | 1 | 1 | 1 | 1 | 1 | 0 | 0 | 0 | 0 | 0 | 0 | 0 | 0 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | $u_{16}$ | $u_{17}$ | $u_{18}$ | $u_{19}$ | $u_{20}$ | $u_{21}$ | $u_{22}$ | $u_{23}$ | $u_{24}$ | $u_{25}$ | $u_{26}$ | $u_{27}$ | $u_{28}$ | $u_{29}$ | $u_{30}$ | $u_{31}$ |

FIG. 97B

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 0 | 0 | 0 | 0 | 0 | 0 | 0 | 0 | 0 | 0 | 0 | 0 | 0 | 0 | 0 | 0 |
| $y_{5,q}$ | 0 | 0 | 0 | 0 | 0 | 0 | 0 | 0 | 1 | 1 | 1 | 1 | 1 | 1 | 1 | 1 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | $-u_{31}$ | $-u_{30}$ | $-u_{29}$ | $-u_{28}$ | $-u_{27}$ | $-u_{26}$ | $-u_{25}$ | $-u_{24}$ | $-u_{23}$ | $-u_{22}$ | $-u_{21}$ | $-u_{20}$ | $-u_{19}$ | $-u_{18}$ | $-u_{17}$ | $-u_{16}$ |
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 1 | 1 | 1 | 1 | 1 | 1 | 1 | 1 | 1 | 1 | 1 | 1 | 1 | 1 | 1 | 1 |
| $y_{5,q}$ | 1 | 1 | 1 | 1 | 1 | 1 | 1 | 1 | 0 | 0 | 0 | 0 | 0 | 0 | 0 | 0 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | $-u_{15}$ | $-u_{14}$ | $-u_{13}$ | $-u_{12}$ | $-u_{11}$ | $-u_{10}$ | $-u_{9}$ | $-u_{8}$ | $-u_{7}$ | $-u_{6}$ | $-u_{5}$ | $-u_{4}$ | $-u_{3}$ | $-u_{2}$ | $-u_{1}$ | $-1$ |
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 1 | 1 | 1 | 1 | 1 | 1 | 1 | 1 | 1 | 1 | 1 | 1 | 1 | 1 | 1 | 1 |
| $y_{5,q}$ | 0 | 0 | 0 | 0 | 0 | 0 | 0 | 0 | 1 | 1 | 1 | 1 | 1 | 1 | 1 | 1 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | 1 | $u_{1}$ | $u_{2}$ | $u_{3}$ | $u_{4}$ | $u_{5}$ | $u_{6}$ | $u_{7}$ | $u_{8}$ | $u_{9}$ | $u_{10}$ | $u_{11}$ | $u_{12}$ | $u_{13}$ | $u_{14}$ | $u_{15}$ |
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 0 | 0 | 0 | 0 | 0 | 0 | 0 | 0 | 0 | 0 | 0 | 0 | 0 | 0 | 0 | 0 |
| $y_{5,q}$ | 1 | 1 | 1 | 1 | 1 | 1 | 1 | 1 | 0 | 0 | 0 | 0 | 0 | 0 | 0 | 0 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | $u_{16}$ | $u_{17}$ | $u_{18}$ | $u_{19}$ | $u_{20}$ | $u_{21}$ | $u_{22}$ | $u_{23}$ | $u_{24}$ | $u_{25}$ | $u_{26}$ | $u_{27}$ | $u_{28}$ | $u_{29}$ | $u_{30}$ | $u_{31}$ |

FIG. 101

| w/Shape | NUC_16_5/15 | NUC_16_6/15 | NUC_16_7/15 | NUC_16_8/15 |
|---|---|---|---|---|
| w0 | 0.3192 + 0.5011i | 0.5115 + 1.2092i | 0.2593 + 0.489i | 0.2535 + 0.4923i |
| w1 | 0.5011 + 0.3192i | 1.2092 + 0.5115i | 0.489 + 0.2593i | 0.4923 + 0.2535i |
| w2 | 0.5575 + 1.1559i | 0.2663 + 0.453i | 0.5074 + 1.1984i | 0.4927 + 1.2044i |
| w3 | 1.1559 + 0.5575i | 0.453 + 0.2663i | 1.1984 + 0.5074i | 1.2044 + 0.4927i |

| w/Shape | NUC_16_9/15 | NUC_16_10/15 | NUC_16_11/15 | NUC_16_12/15 | NUC_16_13/15 |
|---|---|---|---|---|---|
| w0 | 0.2386 + 0.5296i | 0.4487 + 1.1657i | 0.9342 + 0.9847i | 0.9555 + 0.9555i | 0.9517 + 0.9511i |
| w1 | 0.5296 + 0.2386i | 1.208 + 0.5377i | 0.9866 + 0.2903i | 0.9555 + 0.2949i | 0.9524 + 0.3061i |
| w2 | 0.4882 + 1.1934i | 0.2213 + 0.4416i | 0.2716 + 0.9325i | 0.2949 + 0.9555i | 0.3067 + 0.9524i |
| w3 | 1.1934 + 0.4882i | 0.6186 + 0.2544i | 0.2901 + 0.2695i | 0.2949 + 0.2949i | 0.3061 + 0.3067i |

FIG. 102

| w/Shape | NUC_64_5/15 | NUC_64_6/15 | NUC_64_7/15 | NUC_64_8/15 |
|---|---|---|---|---|
| w0 | 1.4327 + 0.3305i | 1.4521 + 0.3005i | 0.1567 + 0.3112i | 1.4827 + 0.292i |
| w1 | 1.0909 + 0.2971i | 1.2657 + 0.8178i | 0.1709 + 0.3037i | 1.2563 + 0.8411i |
| w2 | 1.2484 + 0.7803i | 1.0666 + 0.2744i | 0.2093 + 0.6562i | 1.0211 + 0.2174i |
| w3 | 0.9762 + 0.5715i | 0.95 + 0.5641i | 0.3315 + 0.6038i | 0.8798 + 0.5702i |
| w4 | 0.3309 + 1.4326i | 0.3011 + 1.4529i | 0.3112 + 0.1567i | 0.292 + 1.4827i |
| w5 | 0.2979 + 1.0923i | 0.8202 + 1.2651i | 0.3037 + 0.1709i | 0.841 + 1.2563i |
| w6 | 0.7829 + 1.2477i | 0.275 + 1.0676i | 0.6562 + 0.2093i | 0.2174 + 1.0211i |
| w7 | 0.5739 + 0.9763i | 0.5656 + 0.9499i | 0.6038 + 0.3315i | 0.5702 + 0.8798i |
| w8 | 0.3901 + 0.2112i | 0.3553 + 0.1948i | 0.2959 + 1.4877i | 0.304 + 0.1475i |
| w9 | 0.5317 + 0.2475i | 0.3569 + 0.2094i | 0.8427 + 1.2612i | 0.3028 + 0.1691i |
| w10 | 0.3945 + 0.2289i | 0.5596 + 0.2431i | 0.2389 + 1.0228i | 0.6855 + 0.1871i |
| w11 | 0.5236 + 0.2894i | 0.541 + 0.3002i | 0.5559 + 0.8912i | 0.6126 + 0.3563i |
| w12 | 0.2108 + 0.3911i | 0.1946 + 0.3566i | 1.4877 + 0.2959i | 0.1475 + 0.304i |
| w13 | 0.2475 + 0.5327i | 0.2094 + 0.3579i | 1.2612 + 0.8427i | 0.1691 + 0.3028i |
| w14 | 0.2287 + 0.3955i | 0.243 + 0.5607i | 1.0228 + 0.2389i | 0.1871 + 0.6855i |
| w15 | 0.2898 + 0.5246i | 0.3004 + 0.5417i | 0.8912 + 0.5559i | 0.3563 + 0.6126i |

| w/Shape | NUC_64_9/15 | NUC_64_10/15 | NUC_64_11/15 | NUC_64_12/15 | NUC_64_13/15 |
|---|---|---|---|---|---|
| w0 | 0.1305 + 0.3311i | 0.1177 + 0.1729i | 1.4443 + 0.2683i | 1.448 + 0.2403i | 1.4319 + 0.23i |
| w1 | 0.1633 + 0.3162i | 0.1601 + 0.3212i | 0.7471 + 1.2243i | 0.6406 + 1.1995i | 1.0762 + 0.925i |
| w2 | 0.1622 + 0.7113i | 0.1352 + 0.7279i | 1.1749 + 0.7734i | 1.0952 + 0.9115i | 0.629 + 1.182i |
| w3 | 0.3905 + 0.6163i | 0.3246 + 0.6148i | 0.7138 + 0.8201i | 0.6868 + 0.8108i | 0.6851 + 0.8072i |
| w4 | 0.3311 + 0.1305i | 0.4192 + 0.1179i | 0.1638 + 1.0769i | 1.05 + 0.1642i | 1.0443 + 0.1688i |
| w5 | 0.3162 + 0.1633i | 0.4033 + 0.2421i | 0.2927 + 1.4217i | 0.717 + 0.1473i | 1.0635 + 0.5305i |
| w6 | 0.7113 + 0.1622i | 0.7524 + 0.1581i | 0.1462 + 0.7457i | 1.0519 + 0.5188i | 0.722 + 0.154i |
| w7 | 0.6163 + 0.3905i | 0.5996 + 0.433i | 0.4134 + 0.7408i | 0.7146 + 0.4532i | 0.7151 + 0.4711i |
| w8 | 0.2909 + 1.4626i | 0.2902 + 1.4611i | 1.0203 + 0.1517i | 0.1677 + 1.0405i | 0.2099 + 1.4205i |
| w9 | 0.8285 + 1.2399i | 0.818 + 1.2291i | 0.6653 + 0.1357i | 0.2402 + 1.4087i | 0.119 + 0.6677i |
| w10 | 0.2062 + 1.0367i | 0.2036 + 1.0575i | 0.9639 + 0.4465i | 0.1369 + 0.7073i | 0.2031 + 1.0551i |
| w11 | 0.5872 + 0.8789i | 0.5641 + 0.8965i | 0.6746 + 0.4339i | 0.4044 + 0.7057i | 0.3722 + 0.7548i |
| w12 | 1.4626 + 0.2909i | 1.4453 + 0.2907i | 0.1271 + 0.1428i | 0.1374 + 0.1295i | 0.1438 + 0.1287i |
| w13 | 1.2399 + 0.8285i | 1.2157 + 0.8186i | 0.3782 + 0.1406i | 0.4185 + 0.1357i | 0.1432 + 0.3903i |
| w14 | 1.0367 + 0.2062i | 1.0447 + 0.2242i | 0.1311 + 0.4288i | 0.1325 + 0.3998i | 0.4298 + 0.1384i |
| w15 | 0.8789 + 0.5872i | 0.8497 + 0.6176i | 0.3919 + 0.4276i | 0.4122 + 0.412i | 0.4215 + 0.4279i |

FIG. 103

| w/Shape | NUC_256_5/15 | NUC_256_6/15 | NUC_256_7/15 | NUC_256_8/15 |
|---|---|---|---|---|
| w0 | 0.1524 + 0.3087i | 0.143 + 0.3078i | 0.117 + 0.3003i | 0.0995 + 0.2435i |
| w1 | 0.1525 + 0.3087i | 0.143 + 0.3077i | 0.1171 + 0.3003i | 0.0996 + 0.2434i |
| w2 | 0.1513 + 0.3043i | 0.1413 + 0.3003i | 0.1204 + 0.3233i | 0.1169 + 0.3886i |
| w3 | 0.1513 + 0.3043i | 0.1414 + 0.3002i | 0.1204 + 0.3233i | 0.1179 + 0.3883i |
| w4 | 0.1682 + 0.3004i | 0.1637 + 0.2973i | 0.1454 + 0.2877i | 0.1192 + 0.2345i |
| w5 | 0.1682 + 0.3005i | 0.1636 + 0.2973i | 0.1453 + 0.2877i | 0.1192 + 0.2345i |
| w6 | 0.1663 + 0.2964i | 0.1604 + 0.2905i | 0.1566 + 0.3074i | 0.1953 + 0.3558i |
| w7 | 0.1663 + 0.2964i | 0.1603 + 0.2905i | 0.1565 + 0.3074i | 0.1944 + 0.3563i |
| w8 | 0.1964 + 0.6584i | 0.1768 + 0.6686i | 0.1427 + 0.6856i | 0.1293 + 0.7217i |
| w9 | 0.1965 + 0.6583i | 0.1793 + 0.6679i | 0.1562 + 0.6826i | 0.1616 + 0.7151i |
| w10 | 0.1967 + 0.6652i | 0.1769 + 0.6707i | 0.1422 + 0.6584i | 0.1287 + 0.6355i |
| w11 | 0.1968 + 0.6652i | 0.1793 + 0.67i | 0.1529 + 0.656i | 0.1456 + 0.6318i |
| w12 | 0.3371 + 0.5987i | 0.3506 + 0.5961i | 0.384 + 0.5856i | 0.4191 + 0.6016i |
| w13 | 0.337 + 0.5987i | 0.3484 + 0.5974i | 0.3723 + 0.5931i | 0.3816 + 0.6198i |
| w14 | 0.3414 + 0.6039i | 0.3523 + 0.5975i | 0.3651 + 0.566i | 0.3585 + 0.5403i |
| w15 | 0.3413 + 0.6039i | 0.3501 + 0.5987i | 0.3559 + 0.5718i | 0.3439 + 0.5497i |
| w16 | 0.3087 + 0.1524i | 0.3078 + 0.143i | 0.3003 + 0.117i | 0.2435 + 0.0995i |
| w17 | 0.3087 + 0.1525i | 0.3077 + 0.143i | 0.3003 + 0.1171i | 0.2434 + 0.0996i |
| w18 | 0.3043 + 0.1513i | 0.3003 + 0.1413i | 0.3233 + 0.1204i | 0.3886 + 0.1169i |
| w19 | 0.3043 + 0.1513i | 0.3002 + 0.1414i | 0.3233 + 0.1204i | 0.3883 + 0.1179i |
| w20 | 0.3004 + 0.1682i | 0.2973 + 0.1637i | 0.2877 + 0.1454i | 0.2345 + 0.1192i |
| w21 | 0.3005 + 0.1682i | 0.2973 + 0.1636i | 0.2877 + 0.1453i | 0.2345 + 0.1192i |
| w22 | 0.2964 + 0.1663i | 0.2905 + 0.1604i | 0.3074 + 0.1566i | 0.3558 + 0.1953i |
| w23 | 0.2964 + 0.1663i | 0.2905 + 0.1603i | 0.3074 + 0.1565i | 0.3563 + 0.1944i |
| w24 | 0.6584 + 0.1964i | 0.6686 + 0.1768i | 0.6856 + 0.1427i | 0.7217 + 0.1293i |
| w25 | 0.6583 + 0.1965i | 0.6679 + 0.1793i | 0.6826 + 0.1562i | 0.7151 + 0.1616i |
| w26 | 0.6652 + 0.1967i | 0.6707 + 0.1769i | 0.6584 + 0.1422i | 0.6355 + 0.1287i |
| w27 | 0.6652 + 0.1968i | 0.67 + 0.1793i | 0.656 + 0.1529i | 0.6318 + 0.1456i |
| w28 | 0.5987 + 0.3371i | 0.5961 + 0.3506i | 0.5856 + 0.384i | 0.6016 + 0.4191i |
| w29 | 0.5987 + 0.337i | 0.5974 + 0.3484i | 0.5931 + 0.3723i | 0.6198 + 0.3916i |
| w30 | 0.6039 + 0.3414i | 0.5975 + 0.3523i | 0.566 + 0.3651i | 0.5403 + 0.3585i |
| w31 | 0.6039 + 0.3413i | 0.5987 + 0.3501i | 0.5718 + 0.3559i | 0.5497 + 0.3439i |
| w32 | 0.3183 + 1.5992i | 0.2071 + 1.669i | 0.1683 + 1.7041i | 0.1665 + 1.6859i |
| w33 | 0.3186 + 1.5991i | 0.4482 + 1.621i | 0.4972 + 1.6386i | 0.4919 + 1.6211i |
| w34 | 0.2756 + 1.3848i | 0.208 + 1.3641i | 0.1495 + 1.356i | 0.136 + 1.3498i |
| w35 | 0.2759 + 1.3847i | 0.3307 + 1.3397i | 0.3814 + 1.3099i | 0.3914 + 1.2989i |
| w36 | 0.906 + 1.3557i | 1.0341 + 1.3264i | 1.0862 + 1.3238i | 1.0746 + 1.3096i |
| w37 | 0.9058 + 1.3559i | 0.8297 + 1.463i | 0.8074 + 1.5101i | 0.7987 + 1.494i |
| w38 | 0.7846 + 1.1739i | 0.8178 + 1.1114i | 0.8534 + 1.0644i | 0.8585 + 1.0504i |
| w39 | 0.7843 + 1.1741i | 0.7138 + 1.1809i | 0.6568 + 1.1958i | 0.6419 + 1.1951i |
| w40 | 0.2257 + 0.9956i | 0.1957 + 0.9674i | 0.1552 + 0.9481i | 0.1334 + 0.9483i |
| w41 | 0.2259 + 0.9956i | 0.217 + 0.9629i | 0.22 + 0.9352i | 0.2402 + 0.9271i |
| w42 | 0.2276 + 1.0326i | 0.1977 + 1.0341i | 0.1577 + 1.0449i | 0.1323 + 1.0786i |
| w43 | 0.2278 + 1.0326i | 0.2288 + 1.0277i | 0.2548 + 1.0255i | 0.291 + 1.047i |
| w44 | 0.5446 + 0.8635i | 0.5458 + 0.8224i | 0.5609 + 0.78i | 0.5764 + 0.7648i |
| w45 | 0.5445 + 0.8636i | 0.5276 + 0.8342i | 0.506 + 0.8167i | 0.486 + 0.8252i |
| w46 | 0.5694 + 0.891i | 0.5916 + 0.8709i | 0.6276 + 0.8501i | 0.6693 + 0.8561i |
| w47 | 0.5692 + 0.8911i | 0.5651 + 0.8883i | 0.5452 + 0.9052i | 0.5348 + 0.9459i |
| w48 | 1.5992 + 0.3183i | 1.669 + 0.2071i | 1.7041 + 0.1683i | 1.6859 + 0.1665i |
| w49 | 1.5991 + 0.3186i | 1.621 + 0.4482i | 1.6386 + 0.4972i | 1.6211 + 0.4919i |
| w50 | 1.3848 + 0.2756i | 1.3641 + 0.208i | 1.356 + 0.1495i | 1.3498 + 0.136i |
| w51 | 1.3847 + 0.2759i | 1.3397 + 0.3307i | 1.3099 + 0.3814i | 1.2989 + 0.3914i |
| w52 | 1.3557 + 0.906i | 1.3264 + 1.0341i | 1.3238 + 1.0862i | 1.3096 + 1.0746i |
| w53 | 1.3559 + 0.9058i | 1.463 + 0.8297i | 1.5101 + 0.8074i | 1.494 + 0.7987i |
| w54 | 1.1739 + 0.7846i | 1.1114 + 0.8178i | 1.0644 + 0.8534i | 1.0504 + 0.8585i |
| w55 | 1.1741 + 0.7843i | 1.1809 + 0.7138i | 1.1958 + 0.6568i | 1.1951 + 0.6419i |
| w56 | 0.9956 + 0.2257i | 0.9674 + 0.1957i | 0.9481 + 0.1552i | 0.9483 + 0.1334i |
| w57 | 0.9956 + 0.2259i | 0.9629 + 0.217i | 0.9352 + 0.22i | 0.9271 + 0.2402i |
| w58 | 1.0326 + 0.2276i | 1.0341 + 0.1977i | 1.0449 + 0.1577i | 1.0786 + 0.1323i |
| w59 | 1.0326 + 0.2278i | 1.0277 + 0.2288i | 1.0255 + 0.2548i | 1.047 + 0.291i |
| w60 | 0.8635 + 0.5446i | 0.8224 + 0.5458i | 0.78 + 0.5609i | 0.7648 + 0.5764i |
| w61 | 0.8636 + 0.5445i | 0.8342 + 0.5276i | 0.8167 + 0.506i | 0.8252 + 0.486i |
| w62 | 0.891 + 0.5694i | 0.8709 + 0.5916i | 0.8501 + 0.6276i | 0.8561 + 0.6693i |
| w63 | 0.8911 + 0.5692i | 0.8883 + 0.5651i | 0.9052 + 0.5452i | 0.9459 + 0.5348i |

FIG. 104

| w/Shape | NUC_256_9/15 | NUC_256_10/15 | NUC_256_11/15 | NUC_256_12/15 | NUC_256_13/15 |
|---|---|---|---|---|---|
| w0 | 0.0899 + 0.1337i | 0.0754 + 0.231i | 0.0593 + 0.2193i | 1.198 + 1.1541i | 1.2412 + 1.0688i |
| w1 | 0.091 + 0.1377i | 0.0768 + 0.2305i | 0.069 + 0.3047i | 0.9192 + 1.2082i | 1.2668 + 0.8034i |
| w2 | 0.0873 + 0.3862i | 0.0924 + 0.4136i | 0.0663 + 0.4879i | 1.2778 + 0.8523i | 0.986 + 1.1758i |
| w3 | 0.0883 + 0.3873i | 0.1043 + 0.4125i | 0.1151 + 0.4474i | 1.039 + 0.9253i | 1.0365 + 0.9065i |
| w4 | 0.1115 + 0.1442i | 0.0829 + 0.1135i | 0.1689 + 0.2163i | 0.6057 + 1.22i | 1.2111 + 0.5135i |
| w5 | 0.1135 + 0.1472i | 0.0836 + 0.1149i | 0.1971 + 0.2525i | 0.7371 + 1.4217i | 1.4187 + 0.6066i |
| w6 | 0.2067 + 0.3591i | 0.2682 + 0.3856i | 0.3098 + 0.3798i | 0.6678 + 1.0021i | 1.0103 + 0.4879i |
| w7 | 0.1975 + 0.3621i | 0.2531 + 0.3906i | 0.2489 + 0.3933i | 0.8412 + 0.9448i | 1.038 + 0.6906i |
| w8 | 0.1048 + 0.7533i | 0.0836 + 0.7817i | 0.079 + 0.797i | 1.2128 + 0.5373i | 0.6963 + 1.3442i |
| w9 | 0.177 + 0.7412i | 0.2052 + 0.7608i | 0.234 + 0.771i | 1.0048 + 0.5165i | 0.7089 + 1.1122i |
| w10 | 0.1022 + 0.5904i | 0.0838 + 0.6034i | 0.0723 + 0.6395i | 1.4321 + 0.6343i | 0.1256 + 1.4745i |
| w11 | 0.1191 + 0.589i | 0.1394 + 0.5961i | 0.1896 + 0.6163i | 1.0245 + 0.7152i | 0.8331 + 0.9455i |
| w12 | 0.4264 + 0.623i | 0.4861 + 0.6331i | 0.509 + 0.6272i | 0.6384 + 0.6073i | 0.6615 + 0.6012i |
| w13 | 0.365 + 0.6689i | 0.3661 + 0.7034i | 0.3787 + 0.7126i | 0.8175 + 0.5684i | 0.6894 + 0.7594i |
| w14 | 0.3254 + 0.5153i | 0.3732 + 0.5159i | 0.4079 + 0.5049i | 0.6568 + 0.7801i | 0.8373 + 0.5633i |
| w15 | 0.2959 + 0.5302i | 0.3095 + 0.5511i | 0.3088 + 0.5677i | 0.8311 + 0.7459i | 0.8552 + 0.741i |
| w16 | 0.3256 + 0.0768i | 0.303 + 0.0811i | 0.0675 + 0.0626i | 0.1349 + 1.4742i | 1.2666 + 0.1027i |
| w17 | 0.3266 + 0.087i | 0.3017 + 0.0853i | 0.3475 + 0.0595i | 0.1105 + 1.2309i | 1.4915 + 0.1198i |
| w18 | 0.4721 + 0.0994i | 0.4758 + 0.0932i | 0.5482 + 0.0626i | 0.0634 + 0.9796i | 1.0766 + 0.0945i |
| w19 | 0.4721 + 0.1206i | 0.4676 + 0.1242i | 0.4784 + 0.1124i | 0.1891 + 1.0198i | 0.9007 + 0.0848i |
| w20 | 0.2927 + 0.1267i | 0.2425 + 0.1081i | 0.1674 + 0.0751i | 0.4142 + 1.4461i | 1.2454 + 0.3064i |
| w21 | 0.2947 + 0.1296i | 0.2447 + 0.1115i | 0.2856 + 0.1132i | 0.3323 + 1.2279i | 1.4646 + 0.36i |
| w22 | 0.3823 + 0.2592i | 0.3837 + 0.2813i | 0.4134 + 0.3028i | 0.4998 + 0.9827i | 1.057 + 0.2995i |
| w23 | 0.3944 + 0.2521i | 0.3959 + 0.2642i | 0.4235 + 0.2289i | 0.3467 + 1.0202i | 0.914 + 0.253i |
| w24 | 0.7755 + 0.1118i | 0.7828 + 0.0859i | 0.8258 + 0.084i | 0.068 + 0.6501i | 0.5461 + 0.0678i |
| w25 | 0.7513 + 0.2154i | 0.7652 + 0.2324i | 0.7936 + 0.2483i | 0.2016 + 0.6464i | 0.5681 + 0.1947i |
| w26 | 0.6591 + 0.1033i | 0.6365 + 0.0872i | 0.6788 + 0.0783i | 0.0719 + 0.8075i | 0.6874 + 0.0537i |
| w27 | 0.6446 + 0.1737i | 0.6207 + 0.1757i | 0.6501 + 0.2025i | 0.2088 + 0.8146i | 0.7375 + 0.1492i |
| w28 | 0.5906 + 0.493i | 0.6149 + 0.5145i | 0.6246 + 0.5211i | 0.4809 + 0.6296i | 0.629 + 0.4553i |
| w29 | 0.6538 + 0.4155i | 0.6987 + 0.3934i | 0.7241 + 0.3961i | 0.3374 + 0.6412i | 0.6007 + 0.3177i |
| w30 | 0.4981 + 0.3921i | 0.5063 + 0.4029i | 0.5144 + 0.4089i | 0.4955 + 0.8008i | 0.7885 + 0.4231i |
| w31 | 0.5373 + 0.3586i | 0.5526 + 0.3356i | 0.5918 + 0.3146i | 0.3431 + 0.8141i | 0.7627 + 0.2849i |
| w32 | 0.163 + 1.6621i | 0.1598 + 1.6262i | 0.1631 + 1.5801i | 1.2731 + 0.1108i | 0.0816 + 1.1632i |
| w33 | 0.472 + 1.5898i | 0.4733 + 1.5637i | 0.4806 + 1.5133i | 1.0794 + 0.0977i | 0.083 + 0.9813i |
| w34 | 0.1268 + 1.3488i | 0.1307 + 1.3502i | 0.128 + 1.3385i | 1.5126 + 0.1256i | 0.2528 + 1.2315i |
| w35 | 0.3752 + 1.2961i | 0.3877 + 1.2983i | 0.375 + 1.2897i | 0.9029 + 0.0853i | 0.2502 + 1.01i |
| w36 | 1.0398 + 1.2991i | 1.0328 + 1.2617i | 1.0324 + 1.2029i | 0.5429 + 0.0694i | 0.0732 + 0.6827i |
| w37 | 0.7733 + 1.4772i | 0.7675 + 1.4398i | 0.7737 + 1.3837i | 0.6795 + 0.0559i | 0.0811 + 0.8293i |
| w38 | 0.838 + 1.0552i | 0.8496 + 1.0508i | 0.835 + 1.0529i | 0.5628 + 0.1945i | 0.2159 + 0.6673i |
| w39 | 0.6242 + 1.2081i | 0.6297 + 1.1967i | 0.6147 + 1.1949i | 0.7326 + 0.141i | 0.2359 + 0.8283i |
| w40 | 0.1103 + 0.9397i | 0.091 + 0.9531i | 0.0929 + 0.9596i | 1.2283 + 0.3217i | 0.4302 + 1.4458i |
| w41 | 0.2415 + 0.9155i | 0.2649 + 0.9198i | 0.2768 + 0.926i | 1.0269 + 0.3261i | 0.5852 + 0.968i |
| w42 | 0.1118 + 1.1163i | 0.108 + 1.134i | 0.1095 + 1.1349i | 1.4663 + 0.3716i | 0.4528 + 1.2074i |
| w43 | 0.3079 + 1.0866i | 0.3214 + 1.0926i | 0.325 + 1.0941i | 0.9085 + 0.247i | 0.4167 + 1.0099i |
| w44 | 0.5647 + 0.7638i | 0.5941 + 0.7527i | 0.6086 + 0.7556i | 0.616 + 0.4549i | 0.5035 + 0.6307i |
| w45 | 0.4385 + 0.8433i | 0.4371 + 0.8528i | 0.4514 + 0.8566i | 0.7818 + 0.4247i | 0.5359 + 0.7954i |
| w46 | 0.6846 + 0.8841i | 0.7093 + 0.888i | 0.7161 + 0.8933i | 0.5938 + 0.317i | 0.358 + 0.6532i |
| w47 | 0.5165 + 1.0034i | 0.5235 + 1.009i | 0.5294 + 1.0121i | 0.76 + 0.285i | 0.3841 + 0.8207i |
| w48 | 1.6489 + 0.163i | 1.618 + 0.1602i | 1.5809 + 0.1471i | 0.0595 + 0.0707i | 0.0576 + 0.0745i |
| w49 | 1.5848 + 0.4983i | 1.554 + 0.4734i | 1.5253 + 0.4385i | 0.1722 + 0.0706i | 0.0581 + 0.2241i |
| w50 | 1.3437 + 0.1389i | 1.3411 + 0.1336i | 1.338 + 0.1363i | 0.0599 + 0.2119i | 0.172 + 0.0742i |
| w51 | 1.285 + 0.4025i | 1.2883 + 0.3955i | 1.2837 + 0.4026i | 0.1748 + 0.2114i | 0.1753 + 0.2222i |
| w52 | 1.2728 + 1.0661i | 1.2561 + 1.0337i | 1.2476 + 0.9785i | 0.4134 + 0.0701i | 0.0652 + 0.5269i |
| w53 | 1.4509 + 0.7925i | 1.4311 + 0.7676i | 1.4137 + 0.7196i | 0.2935 + 0.0705i | 0.0611 + 0.3767i |
| w54 | 1.0249 + 0.8794i | 1.0362 + 0.8626i | 1.0246 + 0.8681i | 0.4231 + 0.2066i | 0.1972 + 0.5178i |
| w55 | 1.1758 + 0.6545i | 1.1845 + 0.6419i | 1.1771 + 0.6494i | 0.2979 + 0.21i | 0.1836 + 0.3695i |
| w56 | 0.9629 + 0.1113i | 0.9546 + 0.0957i | 0.9782 + 0.0985i | 0.0638 + 0.5002i | 0.4145 + 0.0709i |
| w57 | 0.9226 + 0.2849i | 0.9163 + 0.2834i | 0.9383 + 0.2922i | 0.1905 + 0.4966i | 0.4266 + 0.21i |
| w58 | 1.1062 + 0.1118i | 1.1282 + 0.1128i | 1.1455 + 0.1158i | 0.0612 + 0.3552i | 0.2912 + 0.073i |
| w59 | 1.0674 + 0.3393i | 1.0838 + 0.334i | 1.0972 + 0.3418i | 0.181 + 0.3533i | 0.2982 + 0.2177i |
| w60 | 0.7234 + 0.6223i | 0.7329 + 0.6204i | 0.7446 + 0.6273i | 0.463 + 0.4764i | 0.4766 + 0.4821i |
| w61 | 0.8211 + 0.486i | 0.8428 + 0.4615i | 0.8573 + 0.4721i | 0.3231 + 0.4895i | 0.4497 + 0.3448i |
| w62 | 0.8457 + 0.726i | 0.868 + 0.7295i | 0.8767 + 0.7377i | 0.4418 + 0.3397i | 0.3334 + 0.5025i |
| w63 | 0.964 + 0.5518i | 0.9959 + 0.5426i | 1.0059 + 0.5518i | 0.3083 + 0.349i | 0.3125 + 0.3601i |

FIG. 106

| | N=64800 | | | | | |
|---|---|---|---|---|---|---|
| | QPSK | 16QAM | 64QAM | 256QAM | 1024QAM | 4096QAM |
| C | 2 | 4 | 6 | 8 | 10 | 12 |
| R1 | 32400 | 16200 | 10800 | 7920 | 6480 | 5400 |
| R2 | 0 | 0 | 0 | 180 | 0 | 0 |

| | N=16200 | | | | | |
|---|---|---|---|---|---|---|
| | QPSK | 16QAM | 64QAM | 256QAM | 1024QAM | 4096QAM |
| C | 2 | 4 | 6 | 8 | 10 | 12 |
| R1 | 7920 | 3960 | 2520 | 1800 | 1440 | 1080 |
| R2 | 180 | 90 | 180 | 225 | 180 | 270 |

C: NUMBER OF COLUMNS (NUMBER OF BITS OF SYMBOL)
R1: NUMBER OF ROWS OF PART 1
R2: NUMBER OF ROWS OF PART 2

FIG. 109

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 39 | 47 | 96 | 176 | 33 | 75 | 165 | 38 | 27 | 58 | 90 | 76 | 17 | 46 | 10 | 91 | 133 | 69 | 171 | 32 | 117 | 78 |
| 13 | 146 | 101 | 36 | 0 | 138 | 25 | 77 | 122 | 49 | 14 | 125 | 140 | 93 | 130 | 2 | 104 | 102 | 128 | 4 | 111 | 151 |
| 84 | 167 | 35 | 127 | 156 | 55 | 82 | 85 | 66 | 114 | 8 | 147 | 115 | 113 | 5 | 31 | 100 | 106 | 48 | 52 | 67 | 107 |
| 18 | 126 | 112 | 50 | 9 | 143 | 28 | 160 | 71 | 79 | 43 | 98 | 86 | 94 | 64 | 3 | 166 | 105 | 103 | 118 | 63 | 51 |
| 139 | 172 | 141 | 175 | 56 | 74 | 95 | 29 | 45 | 129 | 120 | 168 | 92 | 150 | 7 | 162 | 153 | 137 | 108 | 159 | 157 | 173 |
| 23 | 89 | 132 | 57 | 37 | 70 | 134 | 40 | 21 | 149 | 80 | 1 | 121 | 59 | 110 | 142 | 152 | 15 | 154 | 145 | 12 | 170 |
| 54 | 155 | 99 | 22 | 123 | 72 | 177 | 131 | 116 | 44 | 158 | 73 | 11 | 65 | 164 | 119 | 174 | 34 | 83 | 53 | 24 | 42 |
| 60 | 26 | 161 | 68 | 178 | 41 | 148 | 109 | 87 | 144 | 135 | 20 | 62 | 81 | 169 | 124 | 6 | 19 | 30 | 163 | 61 | 179 |
| 136 | 97 | 16 | 88 | | | | | | | | | | | | | | | | | | |

FIG. 110

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

| | | | | | | | | | | | | | | | | | | | | | |
|---|---|---|---|---|---|---|---|---|---|---|---|---|---|---|---|---|---|---|---|---|---|
| 6 | 14 | 1 | 127 | 161 | 177 | 75 | 123 | 62 | 103 | 17 | 18 | 167 | 88 | 27 | 34 | 8 | 110 | 7 | 78 | 94 | 44 |
| 45 | 166 | 149 | 61 | 163 | 145 | 155 | 157 | 82 | 130 | 70 | 92 | 151 | 139 | 160 | 133 | 26 | 2 | 79 | 15 | 95 | 122 |
| 126 | 178 | 101 | 24 | 138 | 146 | 179 | 30 | 86 | 58 | 11 | 121 | 159 | 49 | 84 | 132 | 117 | 119 | 50 | 52 | 4 | 51 |
| 48 | 74 | 114 | 59 | 40 | 131 | 33 | 89 | 66 | 136 | 72 | 16 | 134 | 37 | 164 | 77 | 99 | 173 | 20 | 158 | 156 | 90 |
| 41 | 176 | 81 | 42 | 60 | 109 | 22 | 150 | 105 | 120 | 12 | 64 | 56 | 68 | 111 | 21 | 148 | 53 | 169 | 97 | 108 | 35 |
| 140 | 91 | 115 | 152 | 36 | 106 | 154 | 0 | 25 | 54 | 63 | 172 | 80 | 168 | 142 | 118 | 162 | 135 | 73 | 83 | 153 | 141 |
| 9 | 28 | 55 | 31 | 112 | 107 | 85 | 100 | 175 | 23 | 57 | 47 | 38 | 170 | 137 | 76 | 147 | 93 | 19 | 98 | 124 | 39 |
| 87 | 174 | 144 | 46 | 10 | 129 | 69 | 71 | 125 | 96 | 116 | 171 | 128 | 65 | 102 | 5 | 43 | 143 | 104 | 13 | 67 | 29 |
| 3 | 113 | 32 | 165 | | | | | | | | | | | | | | | | | | |

FIG. 111

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 103 | 116 | 158 | 0 | 27 | 73 | 140 | 30 | 148 | 36 | 153 | 154 | 10 | 174 | 122 | 178 | 6 | 106 | 162 | 59 | 142 | 112 |
| 7 | 74 | 11 | 51 | 49 | 72 | 31 | 65 | 156 | 95 | 171 | 105 | 173 | 168 | 1 | 155 | 125 | 82 | 86 | 161 | 57 | 165 |
| 54 | 26 | 121 | 25 | 157 | 93 | 22 | 34 | 33 | 39 | 19 | 46 | 150 | 141 | 12 | 9 | 79 | 118 | 24 | 17 | 85 | 117 |
| 67 | 58 | 129 | 160 | 89 | 61 | 146 | 77 | 130 | 102 | 101 | 137 | 94 | 69 | 14 | 133 | 60 | 149 | 136 | 16 | 108 | 41 |
| 90 | 28 | 144 | 13 | 175 | 114 | 2 | 18 | 63 | 68 | 21 | 109 | 53 | 123 | 75 | 81 | 143 | 169 | 42 | 119 | 138 | 104 |
| 4 | 131 | 145 | 8 | 5 | 76 | 15 | 88 | 177 | 124 | 45 | 97 | 64 | 100 | 37 | 132 | 38 | 44 | 107 | 35 | 43 | 80 |
| 50 | 91 | 152 | 78 | 166 | 55 | 115 | 170 | 159 | 147 | 167 | 87 | 83 | 29 | 96 | 172 | 48 | 98 | 62 | 139 | 70 | 164 |
| 84 | 47 | 151 | 134 | 126 | 113 | 179 | 110 | 111 | 128 | 32 | 52 | 66 | 40 | 135 | 176 | 99 | 127 | 163 | 3 | 120 | 71 |
| 56 | 92 | 23 | 20 | | | | | | | | | | | | | | | | | | |

FIG. 112

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 139 | 106 | 125 | 81 | 88 | 104 | 3 | 66 | 60 | 65 | 2 | 95 | 155 | 24 | 151 | 5 | 51 | 53 | 29 | 75 | 52 | 85 |
| 8 | 22 | 98 | 93 | 168 | 15 | 86 | 126 | 173 | 100 | 130 | 176 | 20 | 10 | 87 | 92 | 175 | 36 | 143 | 110 | 67 | 146 |
| 149 | 127 | 133 | 42 | 84 | 64 | 78 | 1 | 48 | 159 | 79 | 138 | 46 | 112 | 164 | 31 | 152 | 57 | 144 | 69 | 27 | 136 |
| 122 | 170 | 132 | 171 | 129 | 115 | 107 | 134 | 89 | 157 | 113 | 119 | 135 | 45 | 148 | 83 | 114 | 71 | 128 | 161 | 140 | 26 |
| 13 | 59 | 38 | 35 | 96 | 28 | 0 | 80 | 174 | 137 | 49 | 16 | 101 | 74 | 179 | 91 | 44 | 55 | 169 | 131 | 163 | 123 |
| 145 | 162 | 108 | 178 | 12 | 77 | 167 | 21 | 154 | 82 | 54 | 90 | 177 | 17 | 41 | 39 | 7 | 102 | 156 | 62 | 109 | 14 |
| 37 | 23 | 153 | 6 | 147 | 50 | 47 | 63 | 18 | 70 | 68 | 124 | 72 | 33 | 158 | 32 | 118 | 99 | 105 | 94 | 25 | 121 |
| 166 | 120 | 160 | 141 | 165 | 111 | 19 | 150 | 97 | 76 | 73 | 142 | 117 | 4 | 172 | 58 | 11 | 30 | 9 | 103 | 40 | 61 |
| 43 | 34 | 56 | 116 | | | | | | | | | | | | | | | | | | |

FIG. 114

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 8 | 27 | 7 | 70 | 75 | 84 | 50 | 131 | 146 | 99 | 96 | 141 | 155 | 157 | 82 | 57 | 120 | 38 | 137 | 13 | 83 | 23 |
| 40 | 9 | 56 | 171 | 124 | 172 | 39 | 142 | 20 | 128 | 133 | 2 | 89 | 153 | 103 | 112 | 129 | 151 | 162 | 106 | 14 | 62 |
| 107 | 110 | 73 | 71 | 177 | 154 | 80 | 176 | 24 | 91 | 32 | 173 | 25 | 16 | 17 | 159 | 21 | 92 | 6 | 67 | 81 | 37 |
| 15 | 136 | 100 | 64 | 102 | 163 | 168 | 18 | 78 | 76 | 45 | 140 | 123 | 118 | 58 | 122 | 11 | 19 | 86 | 98 | 119 | 111 |
| 26 | 138 | 125 | 74 | 97 | 63 | 10 | 152 | 161 | 175 | 87 | 52 | 60 | 22 | 79 | 104 | 30 | 158 | 54 | 145 | 49 | 34 |
| 166 | 109 | 179 | 174 | 93 | 41 | 116 | 48 | 3 | 29 | 134 | 167 | 105 | 132 | 114 | 169 | 147 | 144 | 77 | 61 | 170 | 90 |
| 178 | 0 | 43 | 149 | 130 | 117 | 47 | 44 | 36 | 115 | 88 | 101 | 148 | 69 | 46 | 94 | 143 | 164 | 139 | 126 | 160 | 156 |
| 33 | 113 | 65 | 121 | 53 | 42 | 66 | 165 | 85 | 127 | 135 | 5 | 55 | 150 | 72 | 35 | 31 | 51 | 4 | 1 | 68 | 12 |
| 28 | 95 | 59 | 108 | | | | | | | | | | | | | | | | | | |

FIG. 116

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 11 | 5 | 8 | 18 | 1 | 25 | 32 | 31 | 19 | 21 | 50 | 102 | 65 | 85 | 45 | 86 | 98 | 104 | 64 | 78 | 72 | 53 |
| 103 | 79 | 93 | 41 | 82 | 108 | 112 | 116 | 120 | 124 | 128 | 132 | 136 | 140 | 144 | 148 | 152 | 156 | 160 | 164 | 168 | 172 |
| 176 | 4 | 12 | 15 | 3 | 10 | 20 | 26 | 34 | 23 | 33 | 68 | 63 | 69 | 92 | 44 | 90 | 75 | 56 | 100 | 47 | 106 |
| 42 | 39 | 97 | 99 | 89 | 52 | 109 | 113 | 117 | 121 | 125 | 129 | 133 | 137 | 141 | 145 | 149 | 153 | 157 | 161 | 165 | 169 |
| 173 | 177 | 6 | 16 | 14 | 7 | 13 | 36 | 28 | 29 | 37 | 73 | 70 | 54 | 76 | 91 | 66 | 80 | 88 | 51 | 96 | 81 |
| 95 | 38 | 57 | 105 | 107 | 59 | 61 | 110 | 114 | 118 | 122 | 126 | 130 | 134 | 138 | 142 | 146 | 150 | 154 | 158 | 162 | 166 |
| 170 | 174 | 178 | 0 | 9 | 17 | 2 | 27 | 30 | 24 | 22 | 35 | 77 | 74 | 46 | 94 | 62 | 87 | 83 | 101 | 49 | 43 |
| 84 | 48 | 60 | 67 | 71 | 58 | 40 | 55 | 111 | 115 | 119 | 123 | 127 | 131 | 135 | 139 | 143 | 147 | 151 | 155 | 159 | 163 |
| 167 | 171 | 175 | 179 | | | | | | | | | | | | | | | | | | |

FIG. 117

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 9 | 18 | 15 | 13 | 35 | 26 | 28 | 99 | 40 | 68 | 85 | 58 | 63 | 104 | 50 | 52 | 94 | 69 | 108 | 114 | 120 | 126 |
| 132 | 138 | 144 | 150 | 156 | 162 | 168 | 174 | 8 | 16 | 17 | 24 | 37 | 23 | 22 | 103 | 64 | 43 | 47 | 56 | 92 | 59 |
| 70 | 42 | 106 | 60 | 109 | 115 | 121 | 127 | 133 | 139 | 145 | 151 | 157 | 163 | 169 | 175 | 4 | 1 | 10 | 19 | 30 | 31 |
| 89 | 86 | 77 | 81 | 51 | 79 | 83 | 48 | 45 | 62 | 67 | 65 | 110 | 116 | 122 | 128 | 134 | 140 | 146 | 152 | 158 | 164 |
| 170 | 176 | 6 | 2 | 0 | 25 | 20 | 34 | 98 | 105 | 82 | 96 | 90 | 107 | 53 | 74 | 73 | 93 | 55 | 102 | 111 | 117 |
| 123 | 129 | 135 | 141 | 147 | 153 | 159 | 165 | 171 | 177 | 14 | 7 | 3 | 27 | 21 | 33 | 44 | 97 | 38 | 75 | 72 | 41 |
| 84 | 80 | 100 | 87 | 76 | 57 | 112 | 118 | 124 | 130 | 136 | 142 | 148 | 154 | 160 | 166 | 172 | 178 | 5 | 11 | 12 | 32 |
| 29 | 36 | 88 | 71 | 78 | 95 | 49 | 54 | 61 | 66 | 46 | 39 | 101 | 91 | 113 | 119 | 125 | 131 | 137 | 143 | 149 | 155 |
| 161 | 167 | 173 | 179 | | | | | | | | | | | | | | | | | | |

FIG. 119

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 21 | 11 | 12 | 9 | 0 | 6 | 24 | 25 | 85 | 103 | 118 | 122 | 71 | 101 | 41 | 93 | 55 | 73 | 100 | 40 | 106 | 119 |
| 45 | 80 | 128 | 68 | 129 | 61 | 124 | 36 | 126 | 117 | 114 | 132 | 136 | 140 | 144 | 148 | 152 | 156 | 160 | 164 | 168 | 172 |
| 176 | 20 | 18 | 10 | 13 | 16 | 8 | 26 | 27 | 54 | 111 | 52 | 44 | 87 | 113 | 115 | 58 | 116 | 49 | 77 | 95 | 86 |
| 30 | 78 | 81 | 56 | 125 | 53 | 89 | 94 | 50 | 123 | 65 | 83 | 133 | 137 | 141 | 145 | 149 | 153 | 157 | 161 | 165 | 169 |
| 173 | 177 | 2 | 17 | 1 | 4 | 7 | 15 | 29 | 82 | 32 | 102 | 76 | 121 | 92 | 130 | 127 | 62 | 107 | 38 | 46 | 43 |
| 110 | 75 | 104 | 70 | 91 | 69 | 96 | 120 | 42 | 34 | 79 | 35 | 105 | 134 | 138 | 142 | 146 | 150 | 154 | 158 | 162 | 166 |
| 170 | 174 | 178 | 19 | 5 | 3 | 14 | 22 | 28 | 23 | 109 | 51 | 108 | 131 | 33 | 84 | 88 | 64 | 63 | 59 | 57 | 97 |
| 98 | 48 | 31 | 99 | 37 | 72 | 39 | 74 | 66 | 60 | 67 | 47 | 112 | 90 | 135 | 139 | 143 | 147 | 151 | 155 | 159 | 163 |
| 167 | 171 | 175 | 179 | | | | | | | | | | | | | | | | | | |

FIG. 120

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 12 | 15 | 2 | 16 | 27 | 50 | 35 | 74 | 38 | 70 | 108 | 32 | 112 | 54 | 30 | 122 | 72 | 116 | 36 | 90 | 49 | 85 |
| 132 | 138 | 144 | 150 | 156 | 162 | 168 | 174 | 0 | 14 | 9 | 5 | 23 | 66 | 68 | 52 | 96 | 117 | 84 | 128 | 100 | 63 |
| 60 | 127 | 81 | 99 | 53 | 55 | 103 | 95 | 133 | 139 | 145 | 151 | 157 | 163 | 169 | 175 | 10 | 22 | 13 | 11 | 28 | 104 |
| 37 | 57 | 115 | 46 | 65 | 129 | 107 | 75 | 119 | 110 | 31 | 43 | 97 | 78 | 125 | 58 | 134 | 140 | 146 | 152 | 158 | 164 |
| 170 | 176 | 4 | 19 | 6 | 8 | 24 | 44 | 101 | 94 | 118 | 130 | 69 | 71 | 83 | 34 | 86 | 124 | 48 | 106 | 89 | 40 |
| 102 | 91 | 135 | 141 | 147 | 153 | 159 | 165 | 171 | 177 | 3 | 20 | 7 | 17 | 25 | 87 | 41 | 120 | 47 | 80 | 59 | 62 |
| 88 | 45 | 56 | 131 | 61 | 126 | 113 | 92 | 51 | 98 | 136 | 142 | 148 | 154 | 160 | 166 | 172 | 178 | 21 | 18 | 1 | 26 |
| 29 | 39 | 73 | 121 | 105 | 77 | 42 | 114 | 93 | 82 | 111 | 109 | 67 | 79 | 123 | 64 | 76 | 33 | 137 | 143 | 149 | 155 |
| 161 | 167 | 173 | 179 | | | | | | | | | | | | | | | | | | |

FIG. 123

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 8 | 112 | 92 | 165 | 12 | 55 | 5 | 126 | 87 | 70 | 69 | 94 | 103 | 78 | 137 | 148 | 9 | 60 | 13 | 7 | 178 | 79 |
| 43 | 136 | 34 | 68 | 118 | 152 | 49 | 15 | 99 | 61 | 66 | 28 | 109 | 125 | 33 | 167 | 81 | 93 | 97 | 26 | 35 | 30 |
| 153 | 131 | 122 | 71 | 107 | 130 | 76 | 4 | 95 | 42 | 58 | 134 | 0 | 89 | 75 | 40 | 129 | 31 | 80 | 101 | 52 | 16 |
| 142 | 44 | 138 | 46 | 116 | 27 | 82 | 88 | 143 | 128 | 72 | 29 | 83 | 117 | 172 | 14 | 51 | 159 | 48 | 160 | 100 | 1 |
| 102 | 90 | 22 | 3 | 114 | 19 | 108 | 113 | 39 | 73 | 111 | 155 | 106 | 105 | 91 | 150 | 54 | 25 | 135 | 139 | 147 | 36 |
| 56 | 123 | 6 | 67 | 104 | 96 | 157 | 10 | 62 | 164 | 86 | 74 | 133 | 120 | 174 | 53 | 140 | 156 | 171 | 149 | 127 | 85 |
| 59 | 124 | 84 | 11 | 21 | 132 | 41 | 145 | 158 | 32 | 17 | 23 | 50 | 169 | 170 | 38 | 18 | 151 | 24 | 166 | 175 | 2 |
| 47 | 57 | 98 | 20 | 177 | 161 | 154 | 176 | 163 | 37 | 110 | 168 | 141 | 64 | 65 | 173 | 162 | 121 | 45 | 77 | 115 | 179 |
| 63 | 119 | 146 | 144 | | | | | | | | | | | | | | | | | | |

FIG. 124

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 103 | 138 | 168 | 82 | 116 | 45 | 178 | 28 | 160 | 2 | 129 | 148 | 150 | 23 | 54 | 106 | 24 | 78 | 49 | 87 | 145 | 179 |
| 26 | 112 | 119 | 12 | 18 | 174 | 21 | 48 | 134 | 137 | 102 | 147 | 152 | 72 | 68 | 3 | 22 | 169 | 30 | 64 | 108 | 142 |
| 131 | 13 | 113 | 115 | 121 | 37 | 133 | 136 | 101 | 59 | 73 | 161 | 38 | 164 | 43 | 167 | 42 | 144 | 41 | 85 | 91 | 58 |
| 128 | 154 | 172 | 57 | 75 | 17 | 157 | 19 | 4 | 86 | 15 | 25 | 35 | 9 | 105 | 123 | 14 | 34 | 56 | 111 | 60 | 90 |
| 74 | 149 | 146 | 62 | 163 | 31 | 16 | 141 | 88 | 6 | 155 | 130 | 89 | 107 | 135 | 79 | 8 | 10 | 124 | 171 | 114 | 162 |
| 33 | 66 | 126 | 71 | 44 | 158 | 51 | 84 | 165 | 173 | 120 | 7 | 11 | 170 | 176 | 1 | 156 | 96 | 175 | 153 | 36 | 47 |
| 110 | 63 | 132 | 29 | 95 | 143 | 98 | 70 | 20 | 122 | 53 | 100 | 93 | 140 | 109 | 139 | 76 | 151 | 52 | 61 | 46 | 125 |
| 94 | 50 | 67 | 81 | 69 | 65 | 40 | 127 | 77 | 32 | 39 | 27 | 99 | 97 | 159 | 166 | 80 | 117 | 55 | 92 | 118 | 0 |
| 5 | 83 | 177 | 104 | | | | | | | | | | | | | | | | | | |

FIG. 125

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 104 | 120 | 47 | 136 | 116 | 109 | 22 | 20 | 117 | 61 | 52 | 108 | 86 | 99 | 76 | 90 | 37 | 58 | 36 | 138 | 95 | 130 |
| 177 | 93 | 56 | 33 | 24 | 82 | 0 | 67 | 83 | 46 | 79 | 70 | 154 | 18 | 75 | 43 | 49 | 63 | 162 | 16 | 167 | 80 |
| 125 | 1 | 123 | 107 | 9 | 45 | 53 | 15 | 38 | 23 | 57 | 141 | 4 | 178 | 165 | 113 | 21 | 105 | 11 | 124 | 126 | 77 |
| 146 | 29 | 131 | 27 | 176 | 40 | 74 | 91 | 140 | 64 | 73 | 44 | 129 | 157 | 172 | 51 | 10 | 128 | 119 | 163 | 103 | 28 |
| 85 | 156 | 78 | 6 | 8 | 173 | 160 | 106 | 31 | 54 | 122 | 25 | 139 | 68 | 150 | 164 | 87 | 135 | 97 | 166 | 42 | 169 |
| 161 | 137 | 26 | 39 | 133 | 5 | 94 | 69 | 2 | 30 | 171 | 149 | 115 | 96 | 145 | 101 | 92 | 143 | 12 | 88 | 81 | 71 |
| 19 | 147 | 50 | 152 | 159 | 155 | 151 | 174 | 60 | 32 | 3 | 142 | 72 | 14 | 170 | 112 | 65 | 89 | 175 | 158 | 17 | 114 |
| 62 | 144 | 13 | 98 | 66 | 59 | 7 | 118 | 48 | 153 | 100 | 134 | 84 | 111 | 132 | 127 | 41 | 168 | 110 | 102 | 34 | 121 |
| 179 | 148 | 55 | 35 | | | | | | | | | | | | | | | | | | |

FIG. 126

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 37 | 98 | 160 | 63 | 18 | 6 | 94 | 136 | 8 | 50 | 0 | 75 | 65 | 32 | 107 | 60 | 108 | 17 | 21 | 156 | 157 | 5 |
| 73 | 66 | 38 | 177 | 162 | 130 | 171 | 76 | 57 | 126 | 103 | 62 | 120 | 134 | 154 | 101 | 143 | 29 | 13 | 149 | 16 | 33 |
| 55 | 56 | 159 | 128 | 23 | 146 | 153 | 141 | 169 | 49 | 46 | 152 | 89 | 155 | 111 | 127 | 48 | 14 | 93 | 41 | 7 | 78 |
| 135 | 69 | 123 | 179 | 36 | 87 | 27 | 58 | 88 | 170 | 125 | 110 | 15 | 97 | 178 | 90 | 121 | 173 | 30 | 102 | 10 | 80 |
| 104 | 166 | 64 | 4 | 147 | 1 | 52 | 45 | 148 | 68 | 158 | 31 | 140 | 100 | 85 | 115 | 151 | 70 | 39 | 82 | 122 | 79 |
| 12 | 91 | 133 | 132 | 22 | 163 | 47 | 19 | 119 | 144 | 35 | 25 | 42 | 83 | 92 | 26 | 72 | 138 | 54 | 124 | 24 | 74 |
| 118 | 117 | 168 | 71 | 109 | 112 | 106 | 176 | 175 | 44 | 145 | 11 | 9 | 161 | 96 | 77 | 174 | 137 | 34 | 84 | 2 | 164 |
| 129 | 43 | 150 | 61 | 53 | 20 | 165 | 113 | 142 | 116 | 95 | 3 | 28 | 40 | 81 | 99 | 139 | 114 | 59 | 67 | 172 | 131 |
| 105 | 167 | 51 | 86 | | | | | | | | | | | | | | | | | | |

FIG. 127

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 58 | 70 | 23 | 32 | 26 | 63 | 55 | 48 | 35 | 41 | 53 | 20 | 38 | 51 | 61 | 65 | 44 | 29 | 7 | 2 | 113 | 68 |
| 96 | 104 | 106 | 89 | 27 | 0 | 119 | 21 | 4 | 49 | 46 | 100 | 13 | 36 | 57 | 98 | 102 | 9 | 42 | 39 | 33 | 62 |
| 22 | 95 | 101 | 15 | 91 | 25 | 93 | 132 | 69 | 87 | 47 | 59 | 67 | 124 | 17 | 11 | 31 | 43 | 40 | 37 | 85 | 50 |
| 97 | 140 | 45 | 92 | 56 | 30 | 34 | 60 | 107 | 24 | 52 | 94 | 64 | 5 | 71 | 90 | 66 | 103 | 88 | 86 | 84 | 19 |
| 169 | 159 | 147 | 126 | 28 | 130 | 14 | 162 | 144 | 166 | 108 | 153 | 115 | 135 | 120 | 122 | 112 | 139 | 151 | 156 | 16 | 172 |
| 164 | 123 | 99 | 54 | 136 | 81 | 105 | 128 | 116 | 150 | 155 | 76 | 18 | 142 | 170 | 175 | 83 | 146 | 78 | 109 | 73 | 131 |
| 127 | 82 | 167 | 77 | 110 | 79 | 137 | 152 | 3 | 173 | 148 | 72 | 158 | 117 | 1 | 6 | 12 | 8 | 161 | 74 | 143 | 133 |
| 168 | 171 | 134 | 163 | 138 | 121 | 141 | 160 | 111 | 10 | 149 | 80 | 75 | 165 | 157 | 174 | 129 | 145 | 114 | 125 | 154 | 118 |
| 176 | 177 | 178 | 179 | | | | | | | | | | | | | | | | | | |

FIG. 128

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 40 | 159 | 100 | 14 | 88 | 75 | 53 | 24 | 157 | 84 | 23 | 77 | 140 | 145 | 32 | 28 | 112 | 39 | 76 | 50 | 93 | 27 |
| 107 | 25 | 152 | 101 | 127 | 5 | 129 | 71 | 9 | 21 | 96 | 73 | 35 | 106 | 158 | 49 | 136 | 30 | 137 | 115 | 139 | 48 |
| 167 | 85 | 74 | 72 | 7 | 110 | 161 | 41 | 170 | 147 | 82 | 128 | 149 | 33 | 8 | 120 | 47 | 68 | 58 | 67 | 87 | 155 |
| 11 | 18 | 103 | 151 | 29 | 36 | 83 | 135 | 79 | 150 | 97 | 54 | 70 | 138 | 156 | 31 | 121 | 34 | 20 | 130 | 61 | 57 |
| 2 | 166 | 117 | 15 | 6 | 165 | 118 | 98 | 116 | 131 | 109 | 62 | 126 | 175 | 22 | 111 | 164 | 16 | 133 | 102 | 55 | 105 |
| 64 | 177 | 78 | 37 | 162 | 124 | 119 | 19 | 4 | 69 | 132 | 65 | 123 | 160 | 17 | 52 | 38 | 1 | 80 | 90 | 42 | 81 |
| 104 | 13 | 144 | 51 | 114 | 3 | 43 | 146 | 163 | 59 | 45 | 89 | 122 | 169 | 44 | 94 | 86 | 99 | 66 | 171 | 173 | 0 |
| 141 | 148 | 176 | 26 | 143 | 178 | 60 | 153 | 142 | 91 | 179 | 12 | 168 | 113 | 95 | 174 | 56 | 134 | 92 | 46 | 108 | 125 |
| 10 | 172 | 154 | 63 | | | | | | | | | | | | | | | | | | |

FIG. 129

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 143 | 57 | 67 | 26 | 134 | 112 | 136 | 103 | 13 | 94 | 16 | 116 | 169 | 95 | 98 | 6 | 174 | 173 | 102 | 15 | 114 | 39 |
| 127 | 78 | 18 | 123 | 121 | 4 | 89 | 115 | 24 | 108 | 74 | 63 | 175 | 82 | 48 | 20 | 104 | 92 | 27 | 3 | 33 | 106 |
| 62 | 148 | 154 | 25 | 129 | 69 | 178 | 156 | 87 | 83 | 100 | 122 | 70 | 93 | 50 | 140 | 43 | 125 | 166 | 41 | 128 | 85 |
| 157 | 49 | 86 | 66 | 79 | 130 | 133 | 171 | 21 | 165 | 126 | 51 | 153 | 38 | 142 | 109 | 10 | 65 | 23 | 91 | 90 | 73 |
| 61 | 42 | 47 | 131 | 77 | 9 | 58 | 96 | 101 | 37 | 7 | 159 | 44 | 2 | 170 | 160 | 162 | 0 | 137 | 31 | 45 | 110 |
| 144 | 88 | 8 | 11 | 40 | 81 | 168 | 135 | 56 | 151 | 107 | 105 | 32 | 120 | 132 | 1 | 84 | 161 | 179 | 72 | 176 | 71 |
| 145 | 139 | 75 | 141 | 97 | 17 | 149 | 124 | 80 | 60 | 36 | 52 | 164 | 53 | 158 | 113 | 34 | 76 | 5 | 111 | 155 | 138 |
| 19 | 35 | 167 | 172 | 14 | 147 | 55 | 152 | 59 | 64 | 54 | 117 | 146 | 118 | 119 | 150 | 29 | 163 | 68 | 99 | 46 | 177 |
| 28 | 22 | 30 | 12 | | | | | | | | | | | | | | | | | | |

FIG. 131

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 62 | 17 | 10 | 25 | 174 | 13 | 159 | 14 | 108 | 0 | 42 | 57 | 78 | 67 | 41 | 132 | 110 | 87 | 77 | 27 | 88 | 56 |
| 8 | 161 | 7 | 164 | 171 | 44 | 75 | 176 | 145 | 165 | 157 | 34 | 142 | 98 | 103 | 52 | 11 | 82 | 141 | 116 | 15 | 158 |
| 139 | 120 | 36 | 61 | 20 | 112 | 144 | 53 | 128 | 24 | 96 | 122 | 114 | 104 | 150 | 50 | 51 | 80 | 109 | 33 | 5 | 95 |
| 59 | 16 | 134 | 105 | 111 | 21 | 40 | 146 | 18 | 133 | 60 | 23 | 160 | 106 | 32 | 79 | 55 | 6 | 1 | 154 | 117 | 19 |
| 152 | 167 | 166 | 30 | 35 | 100 | 74 | 131 | 99 | 156 | 39 | 76 | 86 | 43 | 178 | 155 | 179 | 177 | 136 | 175 | 81 | 64 |
| 124 | 153 | 84 | 163 | 135 | 115 | 125 | 47 | 45 | 143 | 72 | 48 | 172 | 97 | 85 | 107 | 126 | 91 | 129 | 137 | 83 | 118 |
| 54 | 2 | 9 | 58 | 169 | 73 | 123 | 4 | 92 | 168 | 162 | 94 | 138 | 119 | 22 | 31 | 63 | 89 | 90 | 69 | 49 | 173 |
| 28 | 127 | 26 | 29 | 101 | 170 | 93 | 140 | 147 | 149 | 148 | 66 | 65 | 121 | 12 | 71 | 37 | 70 | 102 | 46 | 38 | 68 |
| 130 | 3 | 113 | 151 | | | | | | | | | | | | | | | | | | |

FIG. 132

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 168 | 18 | 46 | 131 | 88 | 90 | 11 | 89 | 111 | 174 | 172 | 38 | 78 | 153 | 9 | 80 | 53 | 27 | 44 | 79 | 35 | 83 |
| 171 | 51 | 37 | 99 | 95 | 119 | 117 | 127 | 112 | 166 | 28 | 123 | 33 | 160 | 29 | 6 | 135 | 10 | 66 | 69 | 74 | 92 |
| 15 | 109 | 106 | 178 | 65 | 141 | 0 | 3 | 154 | 156 | 164 | 7 | 45 | 115 | 122 | 148 | 110 | 24 | 121 | 126 | 23 | 175 |
| 21 | 113 | 58 | 43 | 26 | 143 | 56 | 142 | 39 | 147 | 30 | 25 | 101 | 145 | 136 | 19 | 4 | 48 | 158 | 118 | 133 | 49 |
| 20 | 102 | 14 | 151 | 5 | 2 | 72 | 103 | 75 | 60 | 84 | 34 | 157 | 169 | 31 | 161 | 81 | 70 | 85 | 159 | 132 | 41 |
| 152 | 179 | 98 | 144 | 36 | 16 | 87 | 40 | 91 | 1 | 130 | 108 | 139 | 94 | 97 | 8 | 104 | 13 | 150 | 137 | 47 | 73 |
| 62 | 12 | 50 | 61 | 105 | 100 | 86 | 146 | 165 | 22 | 17 | 57 | 167 | 59 | 96 | 120 | 155 | 77 | 162 | 55 | 68 | 140 |
| 134 | 82 | 76 | 125 | 32 | 176 | 138 | 173 | 177 | 163 | 107 | 170 | 71 | 129 | 63 | 93 | 42 | 52 | 116 | 149 | 54 | 128 |
| 124 | 114 | 67 | 64 | | | | | | | | | | | | | | | | | | |

FIG. 133

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 18 | 150 | 165 | 42 | 81 | 48 | 63 | 45 | 93 | 152 | 25 | 16 | 174 | 29 | 47 | 83 | 8 | 60 | 30 | 66 | 11 | 113 |
| 44 | 148 | 4 | 155 | 59 | 33 | 134 | 99 | 32 | 176 | 109 | 72 | 36 | 111 | 106 | 73 | 170 | 126 | 64 | 88 | 20 | 17 |
| 172 | 154 | 120 | 121 | 139 | 77 | 98 | 43 | 105 | 133 | 19 | 41 | 78 | 15 | 7 | 145 | 94 | 136 | 131 | 163 | 65 | 31 |
| 96 | 79 | 119 | 143 | 10 | 95 | 9 | 146 | 14 | 118 | 162 | 37 | 97 | 49 | 22 | 51 | 127 | 6 | 71 | 132 | 87 | 21 |
| 39 | 38 | 54 | 115 | 159 | 161 | 84 | 108 | 13 | 102 | 135 | 103 | 156 | 67 | 173 | 76 | 75 | 164 | 52 | 142 | 69 | 130 |
| 56 | 153 | 74 | 166 | 158 | 124 | 141 | 58 | 116 | 85 | 175 | 169 | 168 | 147 | 35 | 62 | 5 | 123 | 100 | 90 | 122 | 101 |
| 149 | 112 | 140 | 86 | 68 | 89 | 125 | 27 | 177 | 160 | 0 | 80 | 55 | 151 | 53 | 2 | 70 | 167 | 114 | 129 | 179 | 138 |
| 1 | 92 | 26 | 50 | 28 | 110 | 61 | 82 | 91 | 117 | 107 | 178 | 34 | 157 | 137 | 128 | 40 | 24 | 57 | 3 | 171 | 46 |
| 104 | 12 | 144 | 23 | | | | | | | | | | | | | | | | | | |

FIG. 134

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 18 | 8 | 166 | 117 | 4 | 111 | 142 | 148 | 176 | 91 | 120 | 144 | 99 | 124 | 20 | 25 | 31 | 78 | 36 | 72 | 2 | 98 |
| 93 | 74 | 174 | 52 | 152 | 62 | 88 | 75 | 23 | 97 | 147 | 15 | 71 | 1 | 127 | 138 | 81 | 83 | 68 | 94 | 112 | 119 |
| 121 | 89 | 163 | 85 | 86 | 28 | 17 | 64 | 14 | 44 | 158 | 159 | 150 | 32 | 128 | 70 | 90 | 29 | 30 | 63 | 100 | 65 |
| 129 | 140 | 177 | 46 | 84 | 92 | 10 | 33 | 58 | 7 | 96 | 151 | 171 | 40 | 76 | 6 | 3 | 37 | 104 | 57 | 135 | 103 |
| 141 | 107 | 116 | 160 | 41 | 153 | 175 | 55 | 130 | 118 | 131 | 42 | 27 | 133 | 95 | 179 | 34 | 21 | 87 | 106 | 105 | 108 |
| 79 | 134 | 113 | 26 | 164 | 114 | 73 | 102 | 77 | 22 | 110 | 161 | 43 | 122 | 123 | 82 | 5 | 48 | 139 | 60 | 49 | 154 |
| 115 | 146 | 67 | 69 | 137 | 109 | 143 | 24 | 101 | 45 | 16 | 12 | 19 | 178 | 80 | 51 | 47 | 149 | 50 | 172 | 170 | 169 |
| 61 | 9 | 39 | 136 | 59 | 38 | 54 | 156 | 126 | 125 | 145 | 0 | 13 | 155 | 132 | 162 | 11 | 157 | 66 | 165 | 173 | 56 |
| 168 | 167 | 53 | 35 | | | | | | | | | | | | | | | | | | |

FIG. 135

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 77 | 50 | 109 | 128 | 153 | 12 | 48 | 17 | 147 | 55 | 173 | 172 | 135 | 121 | 99 | 162 | 52 | 40 | 129 | 168 | 103 | 87 |
| 134 | 105 | 179 | 10 | 131 | 151 | 3 | 26 | 100 | 15 | 123 | 88 | 18 | 91 | 54 | 160 | 49 | 1 | 76 | 80 | 74 | 31 |
| 47 | 58 | 161 | 9 | 16 | 34 | 41 | 21 | 177 | 11 | 63 | 6 | 39 | 165 | 169 | 125 | 114 | 57 | 37 | 67 | 93 | 96 |
| 73 | 106 | 83 | 166 | 24 | 51 | 142 | 65 | 43 | 64 | 53 | 72 | 156 | 81 | 4 | 155 | 33 | 163 | 56 | 150 | 70 | 167 |
| 107 | 112 | 144 | 149 | 36 | 32 | 35 | 59 | 101 | 29 | 127 | 138 | 176 | 90 | 141 | 92 | 170 | 102 | 119 | 25 | 75 | 14 |
| 0 | 68 | 20 | 97 | 110 | 28 | 89 | 118 | 154 | 126 | 2 | 22 | 124 | 85 | 175 | 78 | 46 | 152 | 23 | 86 | 27 | 79 |
| 130 | 66 | 45 | 113 | 111 | 62 | 61 | 7 | 30 | 133 | 108 | 171 | 143 | 60 | 178 | 5 | 122 | 44 | 38 | 148 | 157 | 84 |
| 42 | 139 | 145 | 8 | 104 | 115 | 71 | 137 | 132 | 146 | 164 | 98 | 13 | 117 | 174 | 158 | 95 | 116 | 140 | 94 | 136 | 120 |
| 82 | 69 | 159 | 19 | | | | | | | | | | | | | | | | | | |

FIG. 136

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 51 | 47 | 53 | 43 | 55 | 59 | 49 | 33 | 35 | 31 | 24 | 37 | 0 | 2 | 45 | 41 | 39 | 57 | 42 | 44 | 52 | 40 |
| 23 | 30 | 32 | 34 | 54 | 56 | 46 | 50 | 122 | 48 | 1 | 36 | 38 | 58 | 77 | 3 | 65 | 81 | 67 | 147 | 83 | 69 |
| 26 | 75 | 85 | 73 | 79 | 145 | 71 | 63 | 5 | 61 | 70 | 78 | 68 | 62 | 66 | 6 | 64 | 149 | 60 | 82 | 80 | 4 |
| 76 | 84 | 72 | 154 | 86 | 74 | 89 | 128 | 137 | 91 | 141 | 93 | 101 | 7 | 87 | 9 | 103 | 99 | 95 | 11 | 13 | 143 |
| 97 | 133 | 136 | 12 | 100 | 94 | 14 | 88 | 142 | 96 | 92 | 8 | 152 | 10 | 139 | 102 | 104 | 132 | 90 | 98 | 114 | 112 |
| 146 | 123 | 110 | 15 | 125 | 150 | 120 | 153 | 29 | 106 | 134 | 27 | 127 | 108 | 130 | 116 | 28 | 107 | 126 | 25 | 131 | 124 |
| 129 | 151 | 121 | 105 | 111 | 115 | 135 | 148 | 109 | 117 | 158 | 113 | 170 | 119 | 162 | 178 | 155 | 176 | 18 | 20 | 164 | 157 |
| 160 | 22 | 140 | 16 | 168 | 166 | 172 | 174 | 175 | 179 | 118 | 138 | 156 | 19 | 169 | 167 | 163 | 173 | 161 | 177 | 165 | 144 |
| 171 | 17 | 21 | 159 | | | | | | | | | | | | | | | | | | |

FIG. 137

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 49 | 2 | 57 | 47 | 31 | 35 | 24 | 39 | 59 | 0 | 45 | 41 | 55 | 53 | 51 | 37 | 33 | 43 | 56 | 38 | 48 | 32 |
| 50 | 23 | 34 | 54 | 1 | 36 | 44 | 52 | 40 | 58 | 122 | 46 | 42 | 30 | 3 | 75 | 73 | 65 | 145 | 71 | 79 | 67 |
| 69 | 83 | 85 | 147 | 63 | 81 | 77 | 61 | 5 | 26 | 62 | 64 | 74 | 70 | 82 | 149 | 76 | 4 | 78 | 84 | 80 | 86 |
| 66 | 68 | 72 | 6 | 60 | 154 | 103 | 95 | 101 | 143 | 9 | 89 | 141 | 128 | 97 | 137 | 133 | 7 | 13 | 99 | 91 | 93 |
| 87 | 11 | 136 | 90 | 88 | 94 | 10 | 8 | 14 | 96 | 104 | 92 | 132 | 142 | 100 | 98 | 12 | 102 | 152 | 139 | 150 | 106 |
| 146 | 130 | 27 | 108 | 153 | 112 | 114 | 29 | 110 | 134 | 116 | 15 | 127 | 125 | 123 | 120 | 148 | 151 | 113 | 126 | 124 | 135 |
| 129 | 109 | 25 | 28 | 158 | 117 | 105 | 115 | 111 | 131 | 107 | 121 | 18 | 170 | 164 | 20 | 140 | 160 | 166 | 162 | 119 | 155 |
| 168 | 178 | 22 | 174 | 172 | 176 | 16 | 157 | 159 | 171 | 161 | 118 | 17 | 163 | 21 | 165 | 19 | 179 | 177 | 167 | 138 | 173 |
| 156 | 144 | 169 | 175 | | | | | | | | | | | | | | | | | | |

FIG. 139

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 66 | 61 | 150 | 157 | 63 | 42 | 78 | 44 | 23 | 154 | 133 | 101 | 82 | 26 | 84 | 123 | 89 | 31 | 45 | 102 | 36 | 134 |
| 83 | 117 | 170 | 27 | 73 | 137 | 25 | 32 | 62 | 91 | 4 | 20 | 144 | 145 | 21 | 74 | 113 | 148 | 24 | 135 | 5 | 19 |
| 2 | 34 | 43 | 168 | 14 | 64 | 142 | 115 | 87 | 38 | 147 | 39 | 51 | 152 | 56 | 86 | 122 | 76 | 57 | 129 | 172 | 6 |
| 126 | 10 | 97 | 85 | 164 | 3 | 80 | 90 | 79 | 124 | 138 | 120 | 17 | 103 | 99 | 116 | 46 | 98 | 162 | 151 | 143 | 11 |
| 175 | 160 | 96 | 132 | 81 | 171 | 94 | 65 | 118 | 161 | 125 | 178 | 95 | 112 | 88 | 174 | 13 | 35 | 1 | 167 | 0 | 128 |
| 12 | 58 | 29 | 169 | 67 | 28 | 119 | 166 | 60 | 55 | 54 | 130 | 92 | 146 | 177 | 149 | 111 | 9 | 173 | 179 | 176 | 75 |
| 77 | 114 | 48 | 159 | 8 | 141 | 107 | 139 | 52 | 100 | 136 | 105 | 127 | 47 | 18 | 69 | 109 | 16 | 121 | 59 | 163 | 165 |
| 108 | 106 | 70 | 22 | 93 | 41 | 33 | 110 | 53 | 140 | 153 | 158 | 50 | 15 | 37 | 72 | 156 | 7 | 131 | 49 | 71 | 68 |
| 104 | 30 | 40 | 155 | | | | | | | | | | | | | | | | | | |

FIG. 140

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 75 | 83 | 11 | 24 | 86 | 104 | 156 | 76 | 37 | 173 | 127 | 61 | 43 | 139 | 106 | 69 | 49 | 2 | 128 | 140 | 68 | 14 |
| 100 | 8 | 36 | 73 | 148 | 65 | 16 | 47 | 177 | 6 | 132 | 45 | 5 | 30 | 13 | 22 | 29 | 27 | 101 | 150 | 23 | 90 |
| 41 | 93 | 89 | 92 | 135 | 4 | 71 | 87 | 44 | 124 | 26 | 64 | 1 | 129 | 157 | 130 | 107 | 18 | 91 | 118 | 3 | 82 |
| 144 | 113 | 121 | 54 | 84 | 97 | 122 | 120 | 7 | 154 | 56 | 134 | 57 | 161 | 33 | 116 | 28 | 96 | 72 | 172 | 12 | 115 |
| 38 | 164 | 32 | 167 | 145 | 17 | 88 | 39 | 151 | 80 | 0 | 136 | 169 | 142 | 74 | 147 | 126 | 166 | 163 | 40 | 110 | 171 |
| 50 | 160 | 131 | 70 | 175 | 103 | 125 | 77 | 162 | 31 | 85 | 66 | 67 | 52 | 108 | 159 | 133 | 42 | 153 | 21 | 51 | 119 |
| 123 | 98 | 35 | 48 | 111 | 149 | 25 | 58 | 60 | 158 | 102 | 59 | 117 | 20 | 141 | 143 | 46 | 53 | 155 | 15 | 165 | 152 |
| 112 | 176 | 105 | 178 | 99 | 174 | 168 | 114 | 179 | 78 | 10 | 19 | 62 | 63 | 170 | 138 | 34 | 109 | 9 | 146 | 95 | 94 |
| 55 | 137 | 81 | 79 | | | | | | | | | | | | | | | | | | |

FIG. 162
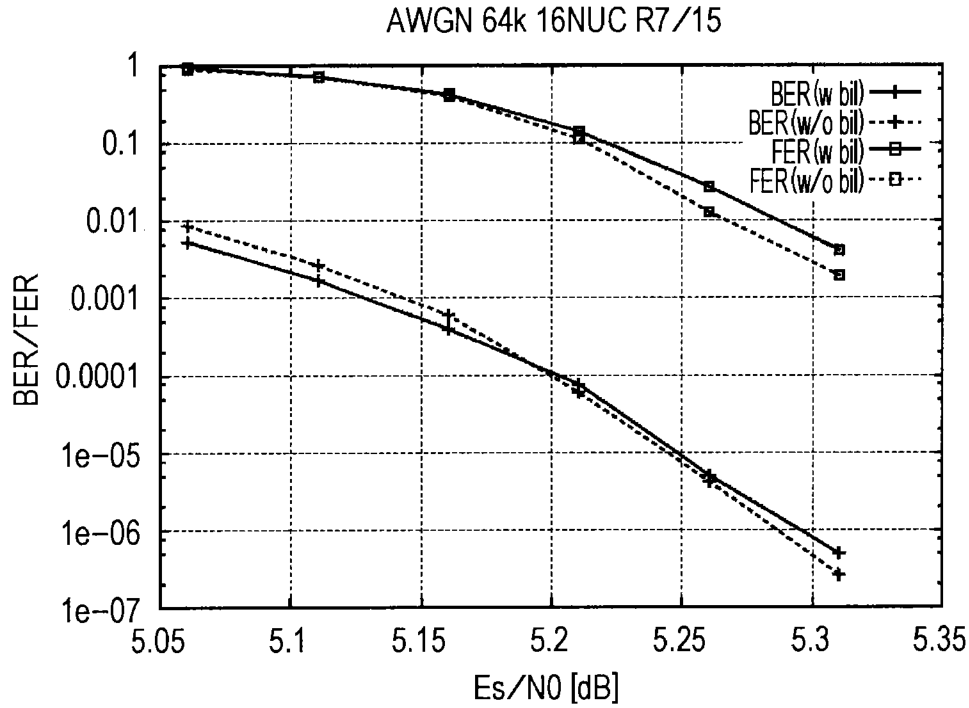
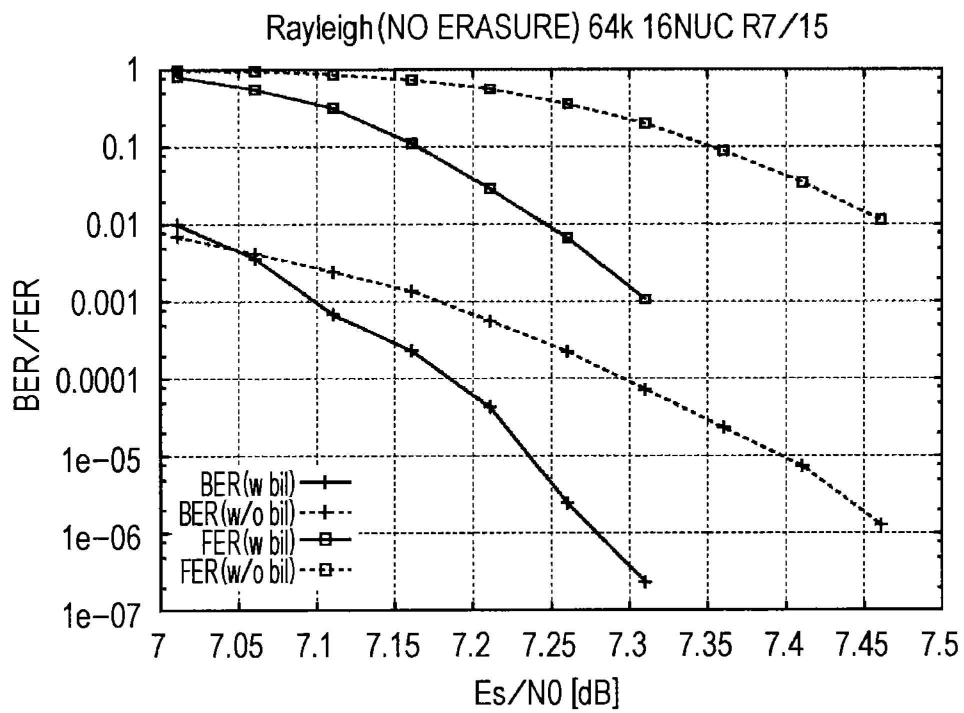

FIG. 184
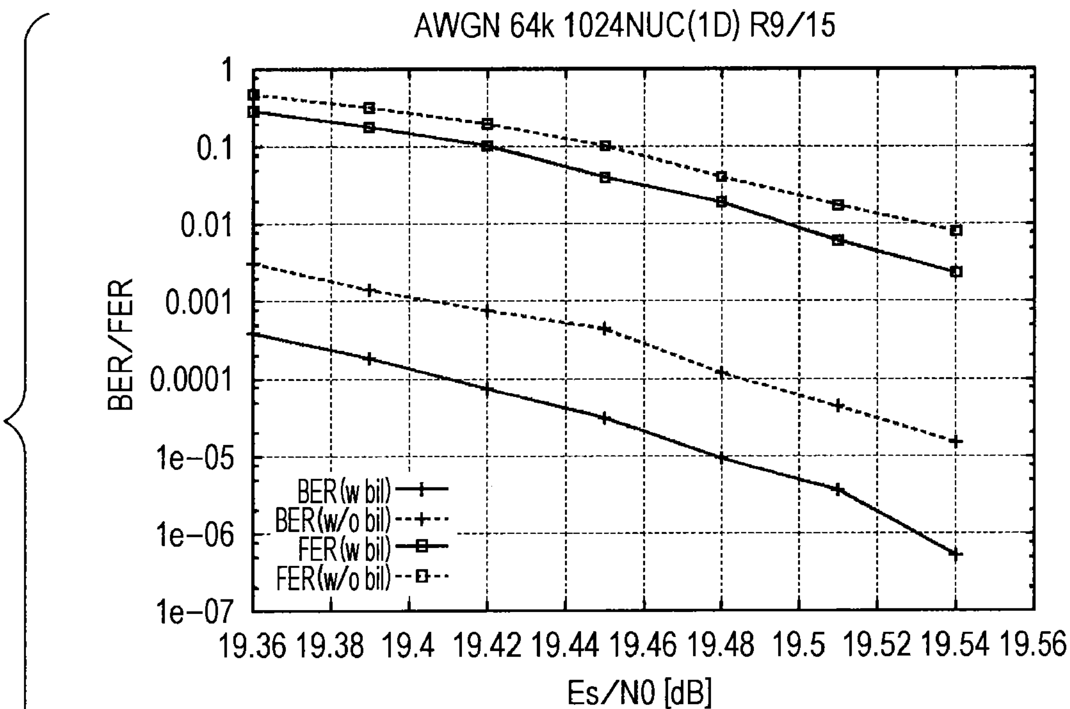
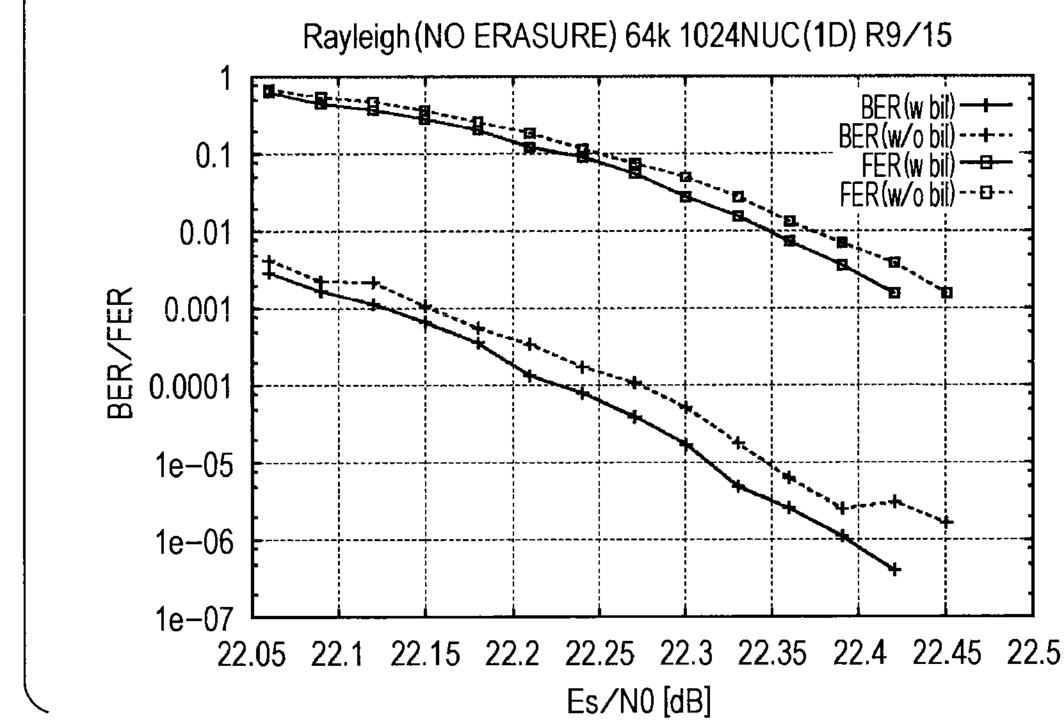

| | N=64800 | | | | | |
|---|---|---|---|---|---|---|
| | QPSK | 16QAM | 64QAM | 256QAM | 1024QAM | 4096QAM |
| C | 2 | 4 | 6 | 8 | 10 | 12 |
| R1 | 32400 | 16200 | 10800 | 7920 | 6480 | 5400 |
| R2 | 0 | 0 | 0 | 180 | 0 | 0 |

| | N=16200 | | | | | |
|---|---|---|---|---|---|---|
| | QPSK | 16QAM | 64QAM | 256QAM | 1024QAM | 4096QAM |
| C | 2 | 4 | 6 | 8 | 10 | 12 |
| R1 | 7920 | 3960 | 2520 | 1800 | 1440 | 1080 |
| R2 | 180 | 90 | 180 | 225 | 180 | 270 |

C: NUMBER OF COLUMNS (NUMBER OF BITS OF SYMBOL)
R1: NUMBER OF ROWS OF PART 1
R2: NUMBER OF ROWS OF PART 2

FIG. 230

| MOD \ CR | 2 | 3 | 4 | 5 | 6 | 7 | 8 | 9 | 10 | 11 | 12 | 13 |
|---|---|---|---|---|---|---|---|---|---|---|---|---|
| 2 | A | A | A | A | A | A | A | A | A | A | A | A |
| 4 | A | A | A | B | A | A | B | B | A | A | A | A |
| 6 | A | A | A | A | A | B | A | B | B | A | A | B |
| 8 | A | A | A | B | B | B | B | A | B | B | A | B |
| 10 | A | A | A | B | A | B | A | B | B | B | A | A |
| 12 | A | A | A | A | A | A | A | A | A | A | A | A |

FIG. 231

QPSK CR 2/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 70 | 149 | 136 | 153 | 104 | 110 | 134 | 61 | 129 | 126 | 58 | 150 | 177 | 168 | 78 | 71 | 120 | 60 | 155 | 175 | 9 | 161 |
| 103 | 123 | 91 | 173 | 57 | 106 | 143 | 151 | 89 | 86 | 35 | 77 | 133 | 31 | 7 | 23 | 51 | 5 | 121 | 83 | 64 | 176 |
| 119 | 98 | 49 | 130 | 128 | 79 | 162 | 32 | 172 | 87 | 131 | 45 | 114 | 93 | 96 | 39 | 68 | 105 | 85 | 109 | 13 | 33 |
| 145 | 18 | 12 | 54 | 111 | 14 | 156 | 8 | 16 | 73 | 2 | 84 | 47 | 42 | 101 | 63 | 88 | 25 | 52 | 170 | 24 | 69 |
| 142 | 178 | 20 | 65 | 97 | 66 | 80 | 11 | 59 | 19 | 115 | 154 | 26 | 147 | 28 | 50 | 160 | 102 | 55 | 139 | 125 | 116 |
| 138 | 167 | 53 | 169 | 165 | 99 | 159 | 148 | 179 | 0 | 146 | 90 | 6 | 100 | 74 | 117 | 48 | 75 | 135 | 41 | 137 | 76 |
| 92 | 164 | 113 | 152 | 72 | 36 | 3 | 163 | 15 | 46 | 21 | 44 | 108 | 34 | 56 | 140 | 127 | 158 | 94 | 67 | 122 | 1 |
| 27 | 171 | 30 | 157 | 112 | 81 | 118 | 43 | 29 | 124 | 22 | 62 | 37 | 40 | 4 | 107 | 166 | 82 | 95 | 10 | 144 | 141 |
| 132 | 174 | 38 | 17 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 70 | 20 | 149 | 65 | 136 | 97 | 153 | 66 | 104 | 80 | 110 | 11 | 134 | 59 | 61 | 19 | 129 | 115 | 126 | 154 | 58 | 26 |
| 150 | 147 | 177 | 28 | 168 | 50 | 78 | 160 | 71 | 102 | 120 | 55 | 60 | 139 | 155 | 125 | 175 | 116 | 9 | 138 | 161 | 167 |
| 103 | 53 | 123 | 169 | 91 | 165 | 173 | 99 | 57 | 159 | 106 | 148 | 143 | 179 | 151 | 0 | 89 | 146 | 86 | 90 | 35 | 6 |
| 77 | 100 | 133 | 74 | 31 | 117 | 7 | 48 | 23 | 75 | 51 | 135 | 5 | 41 | 121 | 137 | 83 | 76 | 64 | 92 | 176 | 164 |
| 119 | 113 | 98 | 152 | 49 | 72 | 130 | 36 | 128 | 3 | 79 | 163 | 162 | 15 | 32 | 46 | 172 | 21 | 87 | 44 | 131 | 108 |
| 45 | 34 | 114 | 56 | 93 | 140 | 96 | 127 | 39 | 158 | 68 | 94 | 105 | 67 | 85 | 122 | 109 | 1 | 13 | 27 | 33 | 171 |
| 145 | 30 | 18 | 157 | 12 | 112 | 54 | 81 | 111 | 118 | 14 | 43 | 156 | 29 | 8 | 124 | 16 | 22 | 73 | 62 | 2 | 37 |
| 84 | 40 | 47 | 4 | 42 | 107 | 101 | 166 | 63 | 82 | 88 | 95 | 25 | 10 | 52 | 144 | 170 | 141 | 24 | 132 | 69 | 174 |
| 142 | 38 | 178 | 17 | | | | | | | | | | | | | | | | | | |

FIG. 232

QPSK CR 3/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 75 | 170 | 132 | 174 | 7 | 111 | 30 | 4 | 49 | 133 | 50 | 160 | 92 | 106 | 27 | 126 | 116 | 178 | 41 | 166 | 88 | 84 |
| 80 | 153 | 103 | 51 | 58 | 107 | 167 | 39 | 108 | 24 | 145 | 96 | 74 | 65 | 8 | 40 | 76 | 140 | 44 | 68 | 125 | 119 |
| 82 | 53 | 152 | 102 | 38 | 28 | 86 | 162 | 171 | 61 | 93 | 147 | 117 | 32 | 150 | 26 | 59 | 3 | 148 | 173 | 141 | 130 |
| 154 | 97 | 33 | 172 | 115 | 118 | 127 | 6 | 16 | 0 | 143 | 9 | 100 | 67 | 98 | 110 | 2 | 169 | 47 | 83 | 164 | 155 |
| 123 | 159 | 42 | 105 | 12 | 158 | 81 | 20 | 66 | 57 | 121 | 25 | 1 | 90 | 175 | 35 | 60 | 79 | 87 | 135 | 10 | 139 |
| 156 | 177 | 77 | 89 | 73 | 113 | 52 | 109 | 134 | 36 | 176 | 54 | 69 | 146 | 31 | 15 | 71 | 18 | 95 | 124 | 85 | 14 |
| 78 | 129 | 161 | 19 | 72 | 13 | 122 | 21 | 63 | 137 | 120 | 144 | 91 | 157 | 48 | 34 | 46 | 22 | 29 | 104 | 45 | 56 |
| 151 | 62 | 43 | 94 | 163 | 99 | 64 | 138 | 101 | 23 | 11 | 17 | 136 | 128 | 114 | 112 | 165 | 5 | 142 | 179 | 37 | 70 |
| 131 | 55 | 168 | 149 | | | | | | | | | | | | | | | | | | |

CONVERTED PATTERN (B):

| | | | | | | | | | | | | | | | | | | | | | |
|---|---|---|---|---|---|---|---|---|---|---|---|---|---|---|---|---|---|---|---|---|---|
| 75 | 42 | 170 | 105 | 132 | 12 | 174 | 158 | 7 | 81 | 111 | 20 | 30 | 66 | 4 | 57 | 49 | 121 | 133 | 25 | 50 | 1 |
| 160 | 90 | 92 | 175 | 106 | 35 | 27 | 60 | 126 | 79 | 116 | 87 | 178 | 135 | 41 | 10 | 166 | 139 | 88 | 156 | 84 | 177 |
| 80 | 77 | 153 | 89 | 103 | 73 | 51 | 113 | 58 | 52 | 107 | 109 | 167 | 134 | 39 | 36 | 108 | 176 | 24 | 54 | 145 | 69 |
| 96 | 146 | 74 | 31 | 65 | 15 | 8 | 71 | 40 | 18 | 76 | 95 | 140 | 124 | 44 | 85 | 68 | 14 | 125 | 78 | 119 | 129 |
| 82 | 161 | 53 | 19 | 152 | 72 | 102 | 13 | 38 | 122 | 28 | 21 | 86 | 63 | 162 | 137 | 171 | 120 | 61 | 144 | 93 | 91 |
| 147 | 157 | 117 | 48 | 32 | 34 | 150 | 46 | 26 | 22 | 59 | 29 | 3 | 104 | 148 | 45 | 173 | 56 | 141 | 151 | 130 | 62 |
| 154 | 43 | 97 | 94 | 33 | 163 | 172 | 99 | 115 | 64 | 118 | 138 | 127 | 101 | 6 | 23 | 16 | 11 | 0 | 17 | 143 | 136 |
| 9 | 128 | 100 | 114 | 67 | 112 | 98 | 165 | 110 | 5 | 2 | 142 | 169 | 179 | 47 | 37 | 83 | 70 | 164 | 131 | 155 | 55 |
| 123 | 168 | 159 | 149 | | | | | | | | | | | | | | | | | | |

FIG. 233

QPSK CR 4/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 141 | 86 | 22 | 20 | 176 | 21 | 37 | 82 | 6 | 122 | 130 | 40 | 62 | 44 | 24 | 117 | 8 | 145 | 36 | 79 | 172 | 149 |
| 127 | 163 | 9 | 160 | 73 | 100 | 16 | 153 | 124 | 110 | 49 | 154 | 152 | 4 | 168 | 54 | 177 | 158 | 113 | 57 | 2 | 102 |
| 161 | 147 | 18 | 103 | 1 | 41 | 104 | 144 | 39 | 105 | 131 | 77 | 69 | 108 | 159 | 61 | 45 | 156 | 0 | 83 | 157 | 119 |
| 112 | 118 | 92 | 109 | 75 | 67 | 142 | 96 | 51 | 139 | 31 | 166 | 179 | 89 | 167 | 23 | 34 | 60 | 93 | 165 | 128 | 90 |
| 19 | 33 | 70 | 173 | 174 | 129 | 55 | 98 | 88 | 97 | 146 | 123 | 84 | 111 | 132 | 71 | 140 | 136 | 10 | 115 | 63 | 46 |
| 42 | 50 | 138 | 81 | 59 | 53 | 15 | 52 | 72 | 164 | 150 | 29 | 17 | 91 | 101 | 14 | 38 | 35 | 66 | 64 | 7 | 125 |
| 151 | 56 | 126 | 171 | 68 | 121 | 28 | 65 | 106 | 78 | 47 | 143 | 12 | 169 | 120 | 27 | 74 | 48 | 133 | 43 | 116 | 137 |
| 94 | 3 | 25 | 134 | 13 | 107 | 162 | 32 | 99 | 85 | 175 | 80 | 170 | 5 | 135 | 178 | 11 | 26 | 76 | 95 | 87 | 155 |
| 58 | 30 | 148 | 114 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 141 | 70 | 86 | 173 | 22 | 174 | 20 | 129 | 176 | 55 | 21 | 98 | 37 | 88 | 82 | 97 | 6 | 146 | 122 | 123 | 130 | 84 |
| 40 | 111 | 62 | 132 | 44 | 71 | 24 | 140 | 117 | 136 | 8 | 10 | 145 | 115 | 36 | 63 | 79 | 46 | 172 | 42 | 149 | 50 |
| 127 | 138 | 163 | 81 | 9 | 59 | 160 | 53 | 73 | 15 | 100 | 52 | 16 | 72 | 153 | 164 | 124 | 150 | 110 | 29 | 49 | 17 |
| 154 | 91 | 152 | 101 | 4 | 14 | 168 | 38 | 54 | 35 | 177 | 66 | 158 | 64 | 113 | 7 | 57 | 125 | 2 | 151 | 102 | 56 |
| 161 | 126 | 147 | 171 | 18 | 68 | 103 | 121 | 1 | 28 | 41 | 65 | 104 | 106 | 144 | 78 | 39 | 47 | 105 | 143 | 131 | 12 |
| 77 | 169 | 69 | 120 | 108 | 27 | 159 | 74 | 61 | 48 | 45 | 133 | 156 | 43 | 0 | 116 | 83 | 137 | 157 | 94 | 119 | 3 |
| 112 | 25 | 118 | 134 | 92 | 13 | 109 | 107 | 75 | 162 | 67 | 32 | 142 | 99 | 96 | 85 | 51 | 175 | 139 | 80 | 31 | 170 |
| 166 | 5 | 179 | 135 | 89 | 178 | 167 | 11 | 23 | 26 | 34 | 76 | 60 | 95 | 93 | 87 | 165 | 155 | 128 | 58 | 90 | 30 |
| 19 | 148 | 33 | 114 | | | | | | | | | | | | | | | | | | |

FIG. 234

QPSK CR 5/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 39 | 47 | 96 | 176 | 33 | 75 | 165 | 38 | 27 | 58 | 90 | 76 | 17 | 46 | 10 | 91 | 133 | 69 | 171 | 32 | 117 | 78 |
| 13 | 146 | 101 | 36 | 0 | 138 | 25 | 77 | 122 | 49 | 14 | 125 | 140 | 93 | 130 | 2 | 104 | 102 | 128 | 4 | 111 | 151 |
| 84 | 167 | 35 | 127 | 156 | 55 | 82 | 85 | 66 | 114 | 8 | 147 | 115 | 113 | 5 | 31 | 100 | 106 | 48 | 52 | 67 | 107 |
| 18 | 126 | 112 | 50 | 9 | 143 | 28 | 160 | 71 | 79 | 43 | 98 | 86 | 94 | 64 | 3 | 166 | 105 | 103 | 118 | 63 | 51 |
| 139 | 172 | 141 | 175 | 56 | 74 | 95 | 29 | 45 | 129 | 120 | 168 | 92 | 150 | 7 | 162 | 153 | 137 | 108 | 159 | 157 | 173 |
| 23 | 89 | 132 | 57 | 37 | 70 | 134 | 40 | 21 | 149 | 80 | 1 | 121 | 59 | 110 | 142 | 152 | 15 | 154 | 145 | 12 | 170 |
| 54 | 155 | 99 | 22 | 123 | 72 | 177 | 131 | 116 | 44 | 158 | 73 | 11 | 65 | 164 | 119 | 174 | 34 | 83 | 53 | 24 | 42 |
| 60 | 26 | 161 | 68 | 178 | 41 | 148 | 109 | 87 | 144 | 135 | 20 | 62 | 81 | 169 | 124 | 6 | 19 | 30 | 163 | 61 | 179 |
| 136 | 97 | 16 | 88 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 39 | 141 | 47 | 175 | 96 | 56 | 176 | 74 | 33 | 95 | 75 | 29 | 165 | 45 | 38 | 129 | 27 | 120 | 58 | 168 | 90 | 92 |
| 76 | 150 | 17 | 7 | 46 | 162 | 10 | 153 | 91 | 137 | 133 | 108 | 69 | 159 | 171 | 157 | 32 | 173 | 117 | 23 | 78 | 89 |
| 13 | 132 | 146 | 57 | 101 | 37 | 36 | 70 | 0 | 134 | 138 | 40 | 25 | 21 | 77 | 149 | 122 | 80 | 49 | 1 | 14 | 121 |
| 125 | 59 | 140 | 110 | 93 | 142 | 130 | 152 | 2 | 15 | 104 | 154 | 102 | 145 | 128 | 12 | 4 | 170 | 111 | 54 | 151 | 155 |
| 84 | 99 | 167 | 22 | 35 | 123 | 127 | 72 | 156 | 177 | 55 | 131 | 82 | 116 | 85 | 44 | 66 | 158 | 114 | 73 | 8 | 11 |
| 147 | 65 | 115 | 164 | 113 | 119 | 5 | 174 | 31 | 34 | 100 | 83 | 106 | 53 | 48 | 24 | 52 | 42 | 67 | 60 | 107 | 26 |
| 18 | 161 | 126 | 68 | 112 | 178 | 50 | 41 | 9 | 148 | 143 | 109 | 28 | 87 | 160 | 144 | 71 | 135 | 79 | 20 | 43 | 62 |
| 98 | 81 | 86 | 169 | 94 | 124 | 64 | 6 | 3 | 19 | 166 | 30 | 105 | 163 | 103 | 61 | 118 | 179 | 63 | 136 | 51 | 97 |
| 139 | 16 | 172 | 88 | | | | | | | | | | | | | | | | | | |

FIG. 235

QPSK CR 6/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 0 | 14 | 19 | 21 | 2 | 11 | 22 | 9 | 8 | 7 | 16 | 3 | 26 | 24 | 27 | 80 | 100 | 121 | 107 | 31 | 36 | 42 |
| 46 | 49 | 75 | 93 | 127 | 95 | 119 | 73 | 61 | 63 | 117 | 89 | 99 | 129 | 52 | 111 | 124 | 48 | 122 | 82 | 106 | 91 |
| 92 | 71 | 103 | 102 | 81 | 113 | 101 | 97 | 33 | 115 | 59 | 112 | 90 | 51 | 126 | 85 | 123 | 40 | 83 | 53 | 69 | 70 |
| 132 | 134 | 136 | 138 | 140 | 142 | 144 | 146 | 148 | 150 | 152 | 154 | 156 | 158 | 160 | 162 | 164 | 166 | 168 | 170 | 172 | 174 |
| 176 | 178 | 4 | 5 | 10 | 12 | 20 | 6 | 18 | 13 | 17 | 15 | 1 | 29 | 28 | 23 | 25 | 67 | 116 | 66 | 104 | 44 |
| 50 | 47 | 84 | 76 | 65 | 130 | 56 | 128 | 77 | 39 | 94 | 87 | 120 | 62 | 88 | 74 | 35 | 110 | 131 | 98 | 60 | 37 |
| 45 | 78 | 125 | 41 | 34 | 118 | 38 | 72 | 108 | 58 | 43 | 109 | 57 | 105 | 68 | 86 | 79 | 96 | 32 | 114 | 64 | 55 |
| 30 | 54 | 133 | 135 | 137 | 139 | 141 | 143 | 145 | 147 | 149 | 151 | 153 | 155 | 157 | 159 | 161 | 163 | 165 | 167 | 169 | 171 |
| 173 | 175 | 177 | 179 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 0 | 4 | 14 | 5 | 19 | 10 | 21 | 12 | 2 | 20 | 11 | 6 | 22 | 18 | 9 | 13 | 8 | 17 | 7 | 15 | 16 | 1 |
| 3 | 29 | 26 | 28 | 24 | 23 | 27 | 25 | 80 | 67 | 100 | 116 | 121 | 66 | 107 | 104 | 31 | 44 | 36 | 50 | 42 | 47 |
| 46 | 84 | 49 | 76 | 75 | 65 | 93 | 130 | 127 | 56 | 95 | 128 | 119 | 77 | 73 | 39 | 61 | 94 | 63 | 87 | 117 | 120 |
| 89 | 62 | 99 | 88 | 129 | 74 | 52 | 35 | 111 | 110 | 124 | 131 | 48 | 98 | 122 | 60 | 82 | 37 | 106 | 45 | 91 | 78 |
| 92 | 125 | 71 | 41 | 103 | 34 | 102 | 118 | 81 | 38 | 113 | 72 | 101 | 108 | 97 | 58 | 33 | 43 | 115 | 109 | 59 | 57 |
| 112 | 105 | 90 | 68 | 51 | 86 | 126 | 79 | 85 | 96 | 123 | 32 | 40 | 114 | 83 | 64 | 53 | 55 | 69 | 30 | 70 | 54 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

FIG. 236

QPSK CR 7/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 152 | 172 | 113 | 167 | 100 | 163 | 159 | 144 | 114 | 47 | 161 | 125 | 99 | 89 | 179 | 123 | 149 | 177 | 1 | 132 | 37 | 26 |
| 16 | 57 | 166 | 81 | 133 | 112 | 33 | 151 | 117 | 83 | 52 | 178 | 85 | 124 | 143 | 28 | 59 | 130 | 31 | 157 | 170 | 44 |
| 61 | 102 | 155 | 111 | 153 | 55 | 54 | 176 | 17 | 68 | 169 | 20 | 104 | 38 | 147 | 7 | 174 | 6 | 90 | 15 | 56 | 120 |
| 13 | 34 | 48 | 122 | 110 | 154 | 76 | 64 | 75 | 84 | 162 | 77 | 103 | 156 | 128 | 150 | 87 | 27 | 42 | 3 | 23 | 96 |
| 171 | 145 | 91 | 24 | 78 | 5 | 69 | 175 | 8 | 29 | 106 | 137 | 131 | 43 | 93 | 160 | 108 | 164 | 12 | 140 | 71 | 63 |
| 141 | 109 | 129 | 82 | 80 | 173 | 105 | 9 | 66 | 65 | 92 | 32 | 41 | 72 | 74 | 4 | 36 | 94 | 67 | 158 | 10 | 88 |
| 142 | 45 | 126 | 2 | 86 | 118 | 73 | 79 | 121 | 148 | 95 | 70 | 51 | 53 | 21 | 115 | 135 | 25 | 168 | 11 | 136 | 18 |
| 138 | 134 | 119 | 146 | 0 | 97 | 22 | 165 | 40 | 19 | 60 | 46 | 14 | 49 | 139 | 58 | 101 | 39 | 116 | 127 | 30 | 98 |
| 50 | 107 | 35 | 62 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 152 | 91 | 172 | 24 | 113 | 78 | 167 | 5 | 100 | 69 | 163 | 175 | 159 | 8 | 144 | 29 | 114 | 106 | 47 | 137 | 161 | 131 |
| 125 | 43 | 99 | 93 | 89 | 160 | 179 | 108 | 123 | 164 | 149 | 12 | 177 | 40 | 1 | 71 | 132 | 63 | 37 | 141 | 26 | 109 |
| 16 | 129 | 57 | 82 | 166 | 80 | 81 | 173 | 133 | 105 | 112 | 9 | 33 | 66 | 151 | 65 | 117 | 92 | 83 | 32 | 52 | 41 |
| 178 | 72 | 85 | 74 | 124 | 4 | 143 | 36 | 28 | 94 | 59 | 67 | 130 | 158 | 31 | 10 | 157 | 88 | 170 | 142 | 44 | 45 |
| 61 | 126 | 102 | 2 | 155 | 86 | 111 | 118 | 153 | 73 | 55 | 79 | 54 | 121 | 176 | 148 | 17 | 95 | 68 | 70 | 169 | 51 |
| 20 | 53 | 104 | 21 | 38 | 115 | 147 | 135 | 7 | 25 | 174 | 168 | 6 | 11 | 90 | 136 | 15 | 18 | 56 | 138 | 120 | 134 |
| 13 | 119 | 34 | 146 | 48 | 0 | 122 | 97 | 110 | 22 | 154 | 165 | 76 | 40 | 64 | 19 | 75 | 60 | 84 | 46 | 162 | 14 |
| 77 | 49 | 103 | 139 | 156 | 58 | 128 | 101 | 150 | 39 | 87 | 116 | 27 | 127 | 42 | 30 | 3 | 98 | 23 | 50 | 96 | 107 |
| 171 | 35 | 145 | 62 | | | | | | | | | | | | | | | | | | |

FIG. 237

QPSK CR 8/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 0 | 2 | 4 | 6 | 8 | 10 | 12 | 14 | 16 | 18 | 20 | 22 | 24 | 26 | 28 | 30 | 32 | 34 | 36 | 38 | 40 | 42 |
| 44 | 46 | 48 | 50 | 52 | 54 | 56 | 58 | 60 | 62 | 64 | 66 | 68 | 70 | 72 | 74 | 76 | 78 | 80 | 82 | 84 | 86 |
| 88 | 90 | 92 | 94 | 96 | 98 | 100 | 102 | 104 | 106 | 108 | 110 | 112 | 114 | 116 | 118 | 120 | 122 | 124 | 126 | 128 | 130 |
| 132 | 134 | 136 | 138 | 140 | 142 | 144 | 146 | 148 | 150 | 152 | 154 | 156 | 158 | 160 | 162 | 164 | 166 | 168 | 170 | 172 | 174 |
| 176 | 178 | 1 | 3 | 5 | 7 | 9 | 11 | 13 | 15 | 17 | 19 | 21 | 23 | 25 | 27 | 29 | 31 | 33 | 35 | 37 | 39 |
| 41 | 43 | 45 | 47 | 49 | 51 | 53 | 55 | 57 | 59 | 61 | 63 | 65 | 67 | 69 | 71 | 73 | 75 | 77 | 79 | 81 | 83 |
| 85 | 87 | 89 | 91 | 93 | 95 | 97 | 99 | 101 | 103 | 105 | 107 | 109 | 111 | 113 | 115 | 117 | 119 | 121 | 123 | 125 | 127 |
| 129 | 131 | 133 | 135 | 137 | 139 | 141 | 143 | 145 | 147 | 149 | 151 | 153 | 155 | 157 | 159 | 161 | 163 | 165 | 167 | 169 | 171 |
| 173 | 175 | 177 | 179 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

FIG. 238

QPSK CR 9/15:

ORIGINAL PATTERN (A):

| | | | | | | | | | | | | | | | | | | | | | |
|---|---|---|---|---|---|---|---|---|---|---|---|---|---|---|---|---|---|---|---|---|---|
| 0 | 2 | 4 | 6 | 8 | 10 | 12 | 14 | 16 | 18 | 20 | 22 | 24 | 26 | 28 | 30 | 32 | 34 | 36 | 38 | 40 | 42 |
| 44 | 46 | 48 | 50 | 52 | 54 | 56 | 58 | 60 | 62 | 64 | 66 | 68 | 70 | 72 | 74 | 76 | 78 | 80 | 82 | 84 | 86 |
| 88 | 90 | 92 | 94 | 96 | 98 | 100 | 102 | 104 | 106 | 108 | 110 | 112 | 114 | 116 | 118 | 120 | 122 | 124 | 126 | 128 | 130 |
| 132 | 134 | 136 | 138 | 140 | 142 | 144 | 146 | 148 | 150 | 152 | 154 | 156 | 158 | 160 | 162 | 164 | 166 | 168 | 170 | 172 | 174 |
| 176 | 178 | 1 | 3 | 5 | 7 | 9 | 11 | 13 | 15 | 17 | 19 | 21 | 23 | 25 | 27 | 29 | 31 | 33 | 35 | 37 | 39 |
| 41 | 43 | 45 | 47 | 49 | 51 | 53 | 55 | 57 | 59 | 61 | 63 | 65 | 67 | 69 | 71 | 73 | 75 | 77 | 79 | 81 | 83 |
| 85 | 87 | 89 | 91 | 93 | 95 | 97 | 99 | 101 | 103 | 105 | 107 | 109 | 111 | 113 | 115 | 117 | 119 | 121 | 123 | 125 | 127 |
| 129 | 131 | 133 | 135 | 137 | 139 | 141 | 143 | 145 | 147 | 149 | 151 | 153 | 155 | 157 | 159 | 161 | 163 | 165 | 167 | 169 | 171 |
| 173 | 175 | 177 | 179 | | | | | | | | | | | | | | | | | | |

BIT GROUP

⇨

CONVERTED PATTERN (B):

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

FIG. 239

QPSK CR 10/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 0 | 2 | 4 | 6 | 8 | 10 | 12 | 14 | 16 | 18 | 20 | 22 | 24 | 26 | 28 | 30 | 32 | 34 | 36 | 38 | 40 | 42 |
| 44 | 46 | 48 | 50 | 52 | 54 | 56 | 58 | 60 | 62 | 64 | 66 | 68 | 70 | 72 | 74 | 76 | 78 | 80 | 82 | 84 | 86 |
| 88 | 90 | 92 | 94 | 96 | 98 | 100 | 102 | 104 | 106 | 108 | 110 | 112 | 114 | 116 | 118 | 120 | 122 | 124 | 126 | 128 | 130 |
| 132 | 134 | 136 | 138 | 140 | 142 | 144 | 146 | 148 | 150 | 152 | 154 | 156 | 158 | 160 | 162 | 164 | 166 | 168 | 170 | 172 | 174 |
| 176 | 178 | 1 | 3 | 5 | 7 | 9 | 11 | 13 | 15 | 17 | 19 | 21 | 23 | 25 | 27 | 29 | 31 | 33 | 35 | 37 | 39 |
| 41 | 43 | 45 | 47 | 49 | 51 | 53 | 55 | 57 | 59 | 61 | 63 | 65 | 67 | 69 | 71 | 73 | 75 | 77 | 79 | 81 | 83 |
| 85 | 87 | 89 | 91 | 93 | 95 | 97 | 99 | 101 | 103 | 105 | 107 | 109 | 111 | 113 | 115 | 117 | 119 | 121 | 123 | 125 | 127 |
| 129 | 131 | 133 | 135 | 137 | 139 | 141 | 143 | 145 | 147 | 149 | 151 | 153 | 155 | 157 | 159 | 161 | 163 | 165 | 167 | 169 | 171 |
| 173 | 175 | 177 | 179 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

FIG. 240

QPSK CR 11/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 0 | 14 | 19 | 21 | 2 | 11 | 22 | 9 | 8 | 7 | 16 | 3 | 26 | 24 | 27 | 80 | 100 | 121 | 107 | 31 | 36 | 42 |
| 46 | 49 | 75 | 93 | 127 | 95 | 119 | 73 | 61 | 63 | 117 | 89 | 99 | 129 | 52 | 111 | 124 | 48 | 122 | 82 | 106 | 91 |
| 92 | 71 | 103 | 102 | 81 | 113 | 101 | 97 | 33 | 115 | 59 | 112 | 90 | 51 | 126 | 85 | 123 | 40 | 83 | 53 | 69 | 70 |
| 132 | 134 | 136 | 138 | 140 | 142 | 144 | 146 | 148 | 150 | 152 | 154 | 156 | 158 | 160 | 162 | 164 | 166 | 168 | 170 | 172 | 174 |
| 176 | 178 | 4 | 5 | 10 | 12 | 20 | 6 | 18 | 13 | 17 | 15 | 1 | 29 | 28 | 23 | 25 | 67 | 116 | 66 | 104 | 44 |
| 50 | 47 | 84 | 76 | 65 | 130 | 56 | 128 | 77 | 39 | 94 | 87 | 120 | 62 | 88 | 74 | 35 | 110 | 131 | 98 | 60 | 37 |
| 45 | 78 | 125 | 41 | 34 | 118 | 38 | 72 | 108 | 58 | 43 | 109 | 57 | 105 | 68 | 86 | 79 | 96 | 32 | 114 | 64 | 55 |
| 30 | 54 | 133 | 135 | 137 | 139 | 141 | 143 | 145 | 147 | 149 | 151 | 153 | 155 | 157 | 159 | 161 | 163 | 165 | 167 | 169 | 171 |
| 173 | 175 | 177 | 179 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 0 | 4 | 14 | 5 | 19 | 10 | 21 | 12 | 2 | 20 | 11 | 6 | 22 | 18 | 9 | 13 | 8 | 17 | 7 | 15 | 16 | 1 |
| 3 | 29 | 26 | 28 | 24 | 23 | 27 | 25 | 80 | 67 | 100 | 116 | 121 | 66 | 107 | 104 | 31 | 44 | 36 | 50 | 42 | 47 |
| 46 | 84 | 49 | 76 | 75 | 65 | 93 | 130 | 127 | 56 | 95 | 128 | 119 | 77 | 73 | 39 | 61 | 94 | 63 | 87 | 117 | 120 |
| 89 | 62 | 99 | 88 | 129 | 74 | 52 | 35 | 111 | 110 | 124 | 131 | 48 | 98 | 122 | 60 | 82 | 37 | 106 | 45 | 91 | 78 |
| 92 | 125 | 71 | 41 | 103 | 34 | 102 | 118 | 81 | 38 | 113 | 72 | 101 | 108 | 97 | 58 | 33 | 43 | 115 | 109 | 59 | 57 |
| 112 | 105 | 90 | 68 | 51 | 86 | 126 | 79 | 85 | 96 | 123 | 32 | 40 | 114 | 83 | 64 | 53 | 55 | 69 | 30 | 70 | 54 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

FIG. 241

QPSK CR 12/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 0 | 2 | 4 | 6 | 8 | 10 | 12 | 14 | 16 | 18 | 20 | 22 | 24 | 26 | 28 | 30 | 32 | 34 | 36 | 38 | 40 | 42 |
| 44 | 46 | 48 | 50 | 52 | 54 | 56 | 58 | 60 | 62 | 64 | 66 | 68 | 70 | 72 | 74 | 76 | 78 | 80 | 82 | 84 | 86 |
| 88 | 90 | 92 | 94 | 96 | 98 | 100 | 102 | 104 | 106 | 108 | 110 | 112 | 114 | 116 | 118 | 120 | 122 | 124 | 126 | 128 | 130 |
| 132 | 134 | 136 | 138 | 140 | 142 | 144 | 146 | 148 | 150 | 152 | 154 | 156 | 158 | 160 | 162 | 164 | 166 | 168 | 170 | 172 | 174 |
| 176 | 178 | 1 | 3 | 5 | 7 | 9 | 11 | 13 | 15 | 17 | 19 | 21 | 23 | 25 | 27 | 29 | 31 | 33 | 35 | 37 | 39 |
| 41 | 43 | 45 | 47 | 49 | 51 | 53 | 55 | 57 | 59 | 61 | 63 | 65 | 67 | 69 | 71 | 73 | 75 | 77 | 79 | 81 | 83 |
| 85 | 87 | 89 | 91 | 93 | 95 | 97 | 99 | 101 | 103 | 105 | 107 | 109 | 111 | 113 | 115 | 117 | 119 | 121 | 123 | 125 | 127 |
| 129 | 131 | 133 | 135 | 137 | 139 | 141 | 143 | 145 | 147 | 149 | 151 | 153 | 155 | 157 | 159 | 161 | 163 | 165 | 167 | 169 | 171 |
| 173 | 175 | 177 | 179 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

FIG. 242

QPSK CR 13/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 0 | 2 | 4 | 6 | 8 | 10 | 12 | 14 | 16 | 18 | 20 | 22 | 24 | 26 | 28 | 30 | 32 | 34 | 36 | 38 | 40 | 42 |
| 44 | 46 | 48 | 50 | 52 | 54 | 56 | 58 | 60 | 62 | 64 | 66 | 68 | 70 | 72 | 74 | 76 | 78 | 80 | 82 | 84 | 86 |
| 88 | 90 | 92 | 94 | 96 | 98 | 100 | 102 | 104 | 106 | 108 | 110 | 112 | 114 | 116 | 118 | 120 | 122 | 124 | 126 | 128 | 130 |
| 132 | 134 | 136 | 138 | 140 | 142 | 144 | 146 | 148 | 150 | 152 | 154 | 156 | 158 | 160 | 162 | 164 | 166 | 168 | 170 | 172 | 174 |
| 176 | 178 | 1 | 3 | 5 | 7 | 9 | 11 | 13 | 15 | 17 | 19 | 21 | 23 | 25 | 27 | 29 | 31 | 33 | 35 | 37 | 39 |
| 41 | 43 | 45 | 47 | 49 | 51 | 53 | 55 | 57 | 59 | 61 | 63 | 65 | 67 | 69 | 71 | 73 | 75 | 77 | 79 | 81 | 83 |
| 85 | 87 | 89 | 91 | 93 | 95 | 97 | 99 | 101 | 103 | 105 | 107 | 109 | 111 | 113 | 115 | 117 | 119 | 121 | 123 | 125 | 127 |
| 129 | 131 | 133 | 135 | 137 | 139 | 141 | 143 | 145 | 147 | 149 | 151 | 153 | 155 | 157 | 159 | 161 | 163 | 165 | 167 | 169 | 171 |
| 173 | 175 | 177 | 179 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

FIG. 243

16QAM CR 2/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 5 | 58 | 29 | 154 | 125 | 34 | 0 | 169 | 80 | 59 | 13 | 42 | 77 | 167 | 32 | 87 | 24 | 92 | 124 | 143 | 114 | 120 |
| 166 | 138 | 64 | 136 | 149 | 57 | 18 | 101 | 119 | 35 | 33 | 113 | 75 | 108 | 104 | 3 | 27 | 39 | 172 | 159 | 129 | 62 |
| 146 | 142 | 19 | 147 | 111 | 70 | 74 | 79 | 10 | 132 | 1 | 161 | 155 | 90 | 15 | 133 | 47 | 112 | 84 | 28 | 160 | 117 |
| 150 | 49 | 7 | 81 | 44 | 63 | 118 | 4 | 158 | 148 | 82 | 69 | 36 | 162 | 86 | 71 | 22 | 26 | 61 | 40 | 126 | 170 |
| 177 | 23 | 91 | 68 | 56 | 110 | 21 | 93 | 107 | 85 | 20 | 128 | 109 | 66 | 83 | 12 | 179 | 141 | 97 | 78 | 157 | 72 |
| 130 | 99 | 165 | 45 | 11 | 152 | 168 | 14 | 16 | 2 | 137 | 140 | 121 | 173 | 50 | 55 | 94 | 144 | 73 | 51 | 98 | 174 |
| 178 | 17 | 100 | 9 | 122 | 54 | 38 | 156 | 131 | 127 | 164 | 102 | 116 | 176 | 30 | 37 | 139 | 95 | 43 | 135 | 53 | 89 |
| 106 | 171 | 76 | 175 | 153 | 96 | 151 | 115 | 52 | 6 | 123 | 134 | 31 | 103 | 163 | 65 | 105 | 48 | 25 | 8 | 60 | 67 |
| 88 | 46 | 41 | 145 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 5 | 142 | 91 | 9 | 58 | 19 | 68 | 122 | 29 | 147 | 56 | 54 | 154 | 111 | 110 | 38 | 125 | 70 | 21 | 156 | 34 | 74 |
| 93 | 131 | 0 | 79 | 107 | 127 | 169 | 10 | 85 | 164 | 80 | 132 | 20 | 102 | 59 | 1 | 128 | 116 | 13 | 161 | 109 | 176 |
| 42 | 155 | 66 | 30 | 77 | 90 | 83 | 37 | 167 | 15 | 12 | 139 | 32 | 133 | 179 | 95 | 87 | 47 | 141 | 43 | 24 | 112 |
| 97 | 135 | 92 | 84 | 78 | 53 | 124 | 28 | 157 | 89 | 143 | 160 | 72 | 106 | 114 | 117 | 130 | 171 | 120 | 150 | 99 | 76 |
| 166 | 49 | 165 | 175 | 138 | 7 | 45 | 153 | 64 | 81 | 11 | 96 | 136 | 44 | 152 | 151 | 149 | 63 | 168 | 115 | 57 | 118 |
| 14 | 52 | 18 | 4 | 16 | 6 | 101 | 158 | 2 | 123 | 119 | 148 | 137 | 134 | 35 | 82 | 140 | 31 | 33 | 69 | 121 | 103 |
| 113 | 36 | 173 | 163 | 75 | 162 | 50 | 65 | 108 | 86 | 55 | 105 | 104 | 71 | 94 | 48 | 3 | 22 | 144 | 25 | 27 | 26 |
| 73 | 8 | 39 | 61 | 51 | 60 | 172 | 40 | 98 | 67 | 159 | 126 | 174 | 88 | 129 | 170 | 178 | 46 | 62 | 177 | 17 | 41 |
| 146 | 23 | 100 | 145 | | | | | | | | | | | | | | | | | | |

FIG. 244

16QAM CR 3/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 52 | 92 | 175 | 26 | 45 | 81 | 117 | 74 | 119 | 147 | 120 | 135 | 144 | 87 | 3 | 51 | 20 | 170 | 143 | 125 | 15 | 39 |
| 5 | 174 | 79 | 16 | 176 | 44 | 19 | 69 | 11 | 111 | 121 | 37 | 160 | 88 | 50 | 76 | 129 | 138 | 157 | 86 | 113 | 164 |
| 142 | 98 | 9 | 93 | 166 | 78 | 73 | 167 | 168 | 40 | 131 | 27 | 89 | 156 | 177 | 171 | 116 | 152 | 0 | 127 | 36 | 8 |
| 153 | 59 | 75 | 13 | 105 | 55 | 122 | 132 | 172 | 2 | 58 | 126 | 162 | 30 | 77 | 158 | 17 | 96 | 100 | 42 | 63 | 134 |
| 154 | 6 | 90 | 128 | 83 | 60 | 146 | 124 | 178 | 99 | 123 | 108 | 133 | 159 | 151 | 145 | 61 | 53 | 68 | 31 | 41 | 94 |
| 35 | 21 | 49 | 82 | 80 | 4 | 155 | 7 | 57 | 95 | 62 | 56 | 65 | 140 | 163 | 148 | 23 | 161 | 169 | 47 | 67 | 139 |
| 72 | 43 | 110 | 46 | 150 | 109 | 115 | 32 | 14 | 179 | 85 | 165 | 112 | 25 | 64 | 173 | 10 | 102 | 114 | 71 | 66 | 84 |
| 24 | 141 | 29 | 104 | 107 | 54 | 12 | 91 | 1 | 118 | 136 | 18 | 101 | 149 | 130 | 103 | 106 | 38 | 70 | 48 | 28 | 137 |
| 97 | 34 | 22 | 33 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 52 | 98 | 90 | 46 | 92 | 9 | 128 | 150 | 175 | 93 | 83 | 109 | 26 | 166 | 60 | 115 | 45 | 78 | 146 | 32 | 81 | 73 |
| 124 | 14 | 117 | 167 | 178 | 179 | 74 | 168 | 99 | 85 | 119 | 40 | 123 | 165 | 147 | 131 | 108 | 112 | 120 | 27 | 133 | 25 |
| 135 | 89 | 159 | 64 | 144 | 156 | 151 | 173 | 87 | 177 | 145 | 10 | 3 | 171 | 61 | 102 | 51 | 116 | 53 | 114 | 20 | 152 |
| 68 | 71 | 170 | 0 | 31 | 66 | 143 | 127 | 41 | 84 | 125 | 36 | 94 | 24 | 15 | 8 | 35 | 141 | 39 | 153 | 21 | 29 |
| 5 | 59 | 49 | 104 | 174 | 75 | 82 | 107 | 79 | 13 | 80 | 54 | 16 | 105 | 4 | 12 | 176 | 55 | 155 | 91 | 44 | 122 |
| 7 | 1 | 19 | 132 | 57 | 118 | 69 | 172 | 95 | 136 | 11 | 2 | 62 | 18 | 111 | 58 | 56 | 101 | 121 | 126 | 65 | 149 |
| 37 | 162 | 140 | 130 | 160 | 30 | 163 | 103 | 88 | 77 | 148 | 106 | 50 | 158 | 23 | 38 | 76 | 17 | 161 | 70 | 129 | 96 |
| 169 | 48 | 138 | 100 | 47 | 28 | 157 | 42 | 67 | 137 | 86 | 63 | 139 | 97 | 113 | 134 | 72 | 34 | 164 | 154 | 43 | 22 |
| 142 | 6 | 110 | 33 | | | | | | | | | | | | | | | | | | |

FIG. 245

16QAM CR 4/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 165 | 8 | 136 | 2 | 58 | 30 | 127 | 64 | 38 | 164 | 123 | 45 | 78 | 17 | 47 | 105 | 159 | 134 | 124 | 147 | 148 | 109 |
| 67 | 98 | 157 | 57 | 156 | 170 | 46 | 12 | 172 | 29 | 9 | 3 | 144 | 97 | 83 | 151 | 26 | 52 | 10 | 39 | 50 | 104 |
| 92 | 163 | 72 | 125 | 36 | 14 | 55 | 48 | 1 | 149 | 33 | 110 | 6 | 130 | 140 | 89 | 77 | 22 | 171 | 139 | 112 | 113 |
| 152 | 16 | 7 | 85 | 11 | 28 | 153 | 73 | 62 | 44 | 135 | 116 | 4 | 61 | 117 | 53 | 111 | 178 | 94 | 81 | 68 | 114 |
| 173 | 75 | 101 | 88 | 65 | 99 | 126 | 141 | 43 | 15 | 18 | 90 | 35 | 24 | 142 | 25 | 120 | 19 | 154 | 0 | 174 | 93 |
| 167 | 150 | 107 | 86 | 129 | 175 | 87 | 21 | 66 | 106 | 82 | 179 | 118 | 41 | 95 | 145 | 37 | 23 | 168 | 166 | 49 | 103 |
| 108 | 56 | 91 | 69 | 128 | 121 | 96 | 133 | 100 | 161 | 143 | 119 | 102 | 59 | 20 | 40 | 70 | 79 | 80 | 51 | 13 | 177 |
| 131 | 132 | 176 | 155 | 31 | 63 | 5 | 162 | 76 | 42 | 160 | 115 | 71 | 158 | 54 | 137 | 146 | 32 | 169 | 122 | 138 | 84 |
| 74 | 60 | 34 | 27 | | | | | | | | | | | | | | | | | | |

CONVERTED PATTERN (B):

| | | | | | | | | | | | | | | | | | | | | | |
|---|---|---|---|---|---|---|---|---|---|---|---|---|---|---|---|---|---|---|---|---|---|
| 165 | 163 | 101 | 69 | 8 | 72 | 88 | 128 | 136 | 125 | 65 | 121 | 2 | 36 | 99 | 96 | 58 | 14 | 126 | 133 | 30 | 55 |
| 141 | 100 | 127 | 48 | 43 | 161 | 64 | 1 | 15 | 143 | 38 | 149 | 18 | 119 | 164 | 33 | 90 | 102 | 123 | 110 | 35 | 59 |
| 45 | 6 | 24 | 20 | 78 | 130 | 142 | 40 | 17 | 140 | 25 | 70 | 47 | 89 | 120 | 79 | 105 | 77 | 19 | 80 | 159 | 22 |
| 154 | 51 | 134 | 171 | 0 | 13 | 124 | 139 | 174 | 177 | 147 | 112 | 93 | 131 | 148 | 113 | 167 | 132 | 109 | 152 | 150 | 176 |
| 67 | 16 | 107 | 155 | 98 | 7 | 86 | 31 | 157 | 85 | 129 | 63 | 57 | 11 | 175 | 5 | 156 | 28 | 87 | 162 | 170 | 153 |
| 21 | 76 | 46 | 73 | 66 | 42 | 12 | 62 | 106 | 160 | 172 | 44 | 82 | 115 | 29 | 135 | 179 | 71 | 9 | 116 | 118 | 158 |
| 3 | 4 | 41 | 54 | 144 | 61 | 95 | 137 | 97 | 117 | 145 | 146 | 83 | 53 | 37 | 32 | 151 | 111 | 23 | 169 | 26 | 178 |
| 168 | 122 | 52 | 94 | 166 | 138 | 10 | 81 | 49 | 84 | 39 | 68 | 103 | 74 | 50 | 114 | 108 | 60 | 104 | 173 | 56 | 34 |
| 92 | 75 | 91 | 27 | | | | | | | | | | | | | | | | | | |

FIG. 246

16QAM CR 5/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 129 | 65 | 160 | 140 | 32 | 50 | 162 | 86 | 177 | 57 | 157 | 9 | 134 | 104 | 24 | 7 | 122 | 46 | 17 | 77 | 31 | 92 |
| 163 | 148 | 133 | 99 | 18 | 0 | 167 | 101 | 110 | 135 | 124 | 71 | 107 | 5 | 123 | 69 | 108 | 141 | 179 | 96 | 113 | 83 |
| 176 | 52 | 117 | 81 | 125 | 59 | 15 | 137 | 170 | 63 | 112 | 88 | 34 | 61 | 106 | 3 | 42 | 100 | 152 | 87 | 171 | 72 |
| 161 | 4 | 178 | 64 | 150 | 10 | 128 | 49 | 26 | 75 | 41 | 102 | 28 | 2 | 168 | 93 | 156 | 12 | 38 | 45 | 151 | 142 |
| 44 | 66 | 25 | 139 | 173 | 51 | 29 | 147 | 175 | 90 | 164 | 80 | 131 | 58 | 114 | 145 | 121 | 70 | 115 | 146 | 120 | 55 |
| 158 | 8 | 39 | 97 | 159 | 138 | 33 | 47 | 116 | 79 | 174 | 74 | 21 | 6 | 130 | 54 | 109 | 76 | 35 | 98 | 155 | 144 |
| 36 | 94 | 23 | 78 | 165 | 56 | 154 | 89 | 132 | 67 | 119 | 143 | 40 | 53 | 20 | 136 | 172 | 91 | 27 | 13 | 127 | 73 |
| 105 | 85 | 30 | 103 | 19 | 84 | 37 | 48 | 153 | 11 | 166 | 60 | 111 | 14 | 169 | 95 | 118 | 1 | 126 | 68 | 22 | 149 |
| 43 | 62 | 16 | 82 | | | | | | | | | | | | | | | | | | |

⇩

CONVERTED PATTERN (A):

| | | | | | | | | | | | | | | | | | | | | | |
|---|---|---|---|---|---|---|---|---|---|---|---|---|---|---|---|---|---|---|---|---|---|
| 129 | 32 | 177 | 134 | 122 | 31 | 133 | 167 | 124 | 123 | 179 | 176 | 125 | 170 | 34 | 42 | 171 | 178 | 128 | 41 | 168 | 38 |
| 44 | 173 | 175 | 131 | 121 | 120 | 39 | 33 | 174 | 130 | 35 | 36 | 165 | 132 | 40 | 172 | 127 | 30 | 37 | 166 | 169 | 126 |
| 43 | 65 | 50 | 57 | 104 | 46 | 92 | 99 | 101 | 71 | 69 | 96 | 52 | 59 | 63 | 61 | 100 | 72 | 64 | 49 | 102 | 93 |
| 45 | 66 | 51 | 90 | 58 | 70 | 55 | 97 | 47 | 74 | 54 | 98 | 94 | 56 | 67 | 53 | 91 | 73 | 103 | 48 | 60 | 95 |
| 68 | 62 | 160 | 162 | 157 | 24 | 17 | 163 | 18 | 110 | 107 | 108 | 113 | 117 | 15 | 112 | 106 | 152 | 161 | 150 | 26 | 28 |
| 156 | 151 | 25 | 29 | 164 | 114 | 115 | 158 | 159 | 116 | 21 | 109 | 155 | 23 | 154 | 119 | 20 | 27 | 105 | 19 | 153 | 111 |
| 118 | 22 | 16 | 140 | 86 | 9 | 7 | 77 | 148 | 0 | 135 | 5 | 141 | 83 | 81 | 137 | 88 | 3 | 87 | 4 | 10 | 75 |
| 2 | 12 | 142 | 139 | 147 | 80 | 145 | 146 | 8 | 138 | 79 | 6 | 76 | 144 | 78 | 89 | 143 | 136 | 13 | 85 | 84 | 11 |
| 14 | 1 | 149 | 82 | | | | | | | | | | | | | | | | | | |

FIG. 247

16QAM CR 6/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 55 | 146 | 83 | 52 | 62 | 176 | 160 | 68 | 53 | 56 | 81 | 97 | 79 | 113 | 163 | 61 | 58 | 69 | 133 | 108 | 66 | 71 |
| 86 | 144 | 57 | 67 | 116 | 59 | 70 | 156 | 172 | 65 | 149 | 155 | 82 | 138 | 136 | 141 | 111 | 96 | 170 | 90 | 140 | 64 |
| 159 | 15 | 14 | 37 | 54 | 44 | 63 | 43 | 18 | 47 | 7 | 25 | 34 | 29 | 30 | 26 | 39 | 16 | 41 | 45 | 36 | 0 |
| 23 | 32 | 28 | 27 | 38 | 48 | 33 | 22 | 49 | 51 | 60 | 46 | 21 | 4 | 3 | 20 | 13 | 50 | 35 | 24 | 40 | 17 |
| 42 | 6 | 112 | 93 | 127 | 101 | 94 | 115 | 105 | 31 | 19 | 177 | 74 | 10 | 145 | 162 | 102 | 120 | 126 | 95 | 73 | 152 |
| 129 | 174 | 125 | 72 | 128 | 78 | 171 | 8 | 142 | 178 | 154 | 85 | 107 | 75 | 12 | 9 | 151 | 77 | 117 | 109 | 80 | 106 |
| 134 | 98 | 1 | 122 | 173 | 161 | 150 | 110 | 175 | 166 | 131 | 119 | 103 | 139 | 148 | 157 | 114 | 147 | 87 | 158 | 121 | 164 |
| 104 | 89 | 179 | 123 | 118 | 99 | 88 | 11 | 92 | 165 | 84 | 168 | 124 | 169 | 2 | 130 | 167 | 153 | 137 | 143 | 91 | 100 |
| 5 | 76 | 132 | 135 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 55 | 15 | 112 | 122 | 146 | 14 | 93 | 173 | 83 | 37 | 127 | 161 | 52 | 54 | 101 | 150 | 62 | 44 | 94 | 110 | 176 | 63 |
| 115 | 175 | 160 | 43 | 105 | 166 | 68 | 18 | 31 | 131 | 53 | 47 | 19 | 119 | 56 | 7 | 177 | 103 | 81 | 25 | 74 | 139 |
| 97 | 34 | 10 | 148 | 79 | 29 | 145 | 157 | 113 | 30 | 162 | 114 | 163 | 26 | 102 | 147 | 61 | 39 | 120 | 87 | 58 | 16 |
| 126 | 158 | 69 | 41 | 95 | 121 | 133 | 45 | 73 | 164 | 108 | 36 | 152 | 104 | 66 | 0 | 129 | 89 | 71 | 23 | 174 | 179 |
| 86 | 32 | 125 | 123 | 144 | 28 | 72 | 118 | 57 | 27 | 128 | 99 | 67 | 38 | 78 | 88 | 116 | 48 | 171 | 11 | 59 | 33 |
| 8 | 92 | 70 | 22 | 142 | 165 | 156 | 49 | 178 | 84 | 172 | 51 | 154 | 168 | 65 | 60 | 85 | 124 | 149 | 46 | 107 | 169 |
| 155 | 21 | 75 | 2 | 82 | 4 | 12 | 130 | 138 | 3 | 9 | 167 | 136 | 20 | 151 | 153 | 141 | 13 | 77 | 137 | 111 | 50 |
| 117 | 143 | 96 | 35 | 109 | 91 | 170 | 24 | 80 | 100 | 90 | 40 | 106 | 5 | 140 | 17 | 134 | 76 | 64 | 42 | 98 | 132 |
| 159 | 6 | 1 | 135 | | | | | | | | | | | | | | | | | | |

FIG. 248

16QAM CR 7/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 174 | 148 | 56 | 168 | 38 | 7 | 110 | 9 | 42 | 153 | 160 | 15 | 46 | 21 | 121 | 88 | 114 | 85 | 13 | 83 | 74 | 81 |
| 70 | 27 | 119 | 118 | 144 | 31 | 80 | 109 | 73 | 141 | 93 | 45 | 16 | 77 | 108 | 57 | 36 | 78 | 124 | 79 | 169 | 143 |
| 6 | 58 | 75 | 67 | 5 | 104 | 125 | 140 | 172 | 8 | 39 | 17 | 29 | 159 | 86 | 87 | 41 | 99 | 89 | 47 | 128 | 43 |
| 161 | 154 | 101 | 163 | 116 | 94 | 120 | 71 | 158 | 145 | 37 | 112 | 68 | 95 | 1 | 113 | 64 | 72 | 90 | 92 | 35 | 167 |
| 44 | 149 | 66 | 28 | 82 | 178 | 176 | 152 | 23 | 115 | 130 | 98 | 123 | 102 | 24 | 129 | 150 | 34 | 136 | 171 | 54 | 107 |
| 2 | 3 | 60 | 69 | 10 | 117 | 91 | 157 | 33 | 105 | 155 | 62 | 162 | 40 | 127 | 14 | 165 | 26 | 52 | 19 | 48 | 137 |
| 4 | 22 | 122 | 173 | 18 | 11 | 111 | 106 | 76 | 53 | 61 | 147 | 97 | 175 | 32 | 59 | 166 | 179 | 135 | 177 | 103 | 100 |
| 139 | 50 | 146 | 134 | 133 | 96 | 49 | 126 | 151 | 84 | 156 | 30 | 138 | 164 | 132 | 12 | 0 | 20 | 63 | 170 | 142 | 65 |
| 55 | 25 | 51 | 131 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 174 | 58 | 66 | 173 | 148 | 75 | 28 | 18 | 56 | 67 | 82 | 11 | 168 | 5 | 178 | 111 | 38 | 104 | 176 | 106 | 7 | 125 |
| 152 | 76 | 110 | 140 | 23 | 53 | 9 | 172 | 115 | 61 | 42 | 8 | 130 | 147 | 153 | 39 | 98 | 97 | 160 | 17 | 123 | 175 |
| 15 | 29 | 102 | 32 | 46 | 159 | 24 | 59 | 21 | 86 | 129 | 166 | 121 | 87 | 150 | 179 | 88 | 41 | 34 | 135 | 114 | 99 |
| 136 | 177 | 85 | 89 | 171 | 103 | 13 | 47 | 54 | 100 | 83 | 128 | 107 | 139 | 74 | 43 | 2 | 50 | 81 | 161 | 3 | 146 |
| 70 | 154 | 60 | 134 | 27 | 101 | 69 | 133 | 119 | 163 | 10 | 96 | 118 | 116 | 117 | 49 | 144 | 94 | 91 | 126 | 31 | 120 |
| 157 | 151 | 80 | 71 | 33 | 84 | 109 | 158 | 105 | 156 | 73 | 145 | 155 | 30 | 141 | 37 | 62 | 138 | 93 | 112 | 162 | 164 |
| 45 | 68 | 40 | 132 | 16 | 95 | 127 | 12 | 77 | 1 | 14 | 0 | 108 | 113 | 165 | 20 | 57 | 64 | 26 | 63 | 36 | 72 |
| 52 | 170 | 78 | 90 | 19 | 142 | 124 | 92 | 48 | 65 | 79 | 35 | 137 | 55 | 169 | 167 | 4 | 25 | 143 | 44 | 22 | 51 |
| 6 | 149 | 122 | 131 | | | | | | | | | | | | | | | | | | |

FIG. 249

16QAM CR 8/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 71 | 81 | 170 | 101 | 143 | 77 | 128 | 112 | 155 | 41 | 40 | 54 | 57 | 28 | 179 | 114 | 97 | 13 | 18 | 151 | 91 | 88 |
| 79 | 92 | 137 | 27 | 122 | 107 | 135 | 82 | 125 | 103 | 74 | 36 | 9 | 93 | 0 | 86 | 63 | 158 | 148 | 25 | 167 | 116 |
| 70 | 43 | 102 | 106 | 149 | 24 | 169 | 113 | 127 | 34 | 165 | 100 | 136 | 75 | 134 | 156 | 96 | 84 | 178 | 150 | 140 | 20 |
| 126 | 73 | 68 | 130 | 121 | 48 | 53 | 22 | 129 | 99 | 11 | 33 | 124 | 157 | 161 | 29 | 123 | 160 | 55 | 26 | 168 | 98 |
| 67 | 15 | 7 | 94 | 144 | 1 | 61 | 65 | 146 | 42 | 172 | 115 | 59 | 76 | 4 | 162 | 39 | 85 | 12 | 72 | 58 | 44 |
| 132 | 47 | 141 | 35 | 176 | 104 | 139 | 80 | 6 | 95 | 87 | 90 | 173 | 163 | 69 | 32 | 8 | 154 | 145 | 23 | 177 | 111 |
| 60 | 38 | 171 | 62 | 46 | 21 | 5 | 153 | 49 | 78 | 2 | 109 | 147 | 89 | 166 | 152 | 138 | 31 | 14 | 131 | 50 | 37 |
| 16 | 117 | 66 | 19 | 10 | 159 | 142 | 105 | 3 | 164 | 51 | 83 | 174 | 108 | 52 | 17 | 64 | 119 | 45 | 133 | 175 | 110 |
| 56 | 30 | 120 | 118 | | | | | | | | | | | | | | | | | | |

⇩

CONVERTED PATTERN (A):

| | | | | | | | | | | | | | | | | | | | | | |
|---|---|---|---|---|---|---|---|---|---|---|---|---|---|---|---|---|---|---|---|---|---|
| 71 | 143 | 155 | 57 | 97 | 91 | 137 | 135 | 74 | 0 | 148 | 70 | 149 | 127 | 136 | 96 | 140 | 68 | 53 | 11 | 161 | 55 |
| 67 | 144 | 146 | 59 | 39 | 58 | 141 | 139 | 87 | 69 | 145 | 60 | 46 | 49 | 147 | 138 | 50 | 66 | 142 | 51 | 52 | 45 |
| 56 | 81 | 77 | 41 | 28 | 13 | 88 | 27 | 82 | 36 | 86 | 25 | 43 | 24 | 34 | 75 | 84 | 20 | 130 | 22 | 33 | 29 |
| 26 | 15 | 1 | 42 | 76 | 85 | 44 | 35 | 80 | 90 | 32 | 23 | 38 | 21 | 78 | 89 | 31 | 37 | 19 | 105 | 83 | 17 |
| 133 | 30 | 170 | 128 | 40 | 179 | 18 | 79 | 122 | 125 | 9 | 63 | 167 | 102 | 169 | 165 | 134 | 178 | 126 | 121 | 129 | 124 |
| 123 | 168 | 7 | 61 | 172 | 4 | 12 | 132 | 176 | 6 | 173 | 8 | 177 | 171 | 5 | 2 | 166 | 14 | 16 | 10 | 3 | 174 |
| 64 | 175 | 120 | 101 | 112 | 54 | 114 | 151 | 92 | 107 | 103 | 93 | 158 | 116 | 106 | 113 | 100 | 156 | 150 | 73 | 48 | 99 |
| 157 | 160 | 98 | 94 | 65 | 115 | 162 | 72 | 47 | 104 | 95 | 163 | 154 | 111 | 62 | 153 | 109 | 152 | 131 | 117 | 159 | 164 |
| 108 | 119 | 110 | 118 | | | | | | | | | | | | | | | | | | |

FIG. 250

16QAM CR 9/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 23 | 89 | 10 | 142 | 19 | 41 | 1 | 146 | 68 | 87 | 9 | 51 | 114 | 92 | 121 | 69 | 107 | 97 | 166 | 162 | 55 | 174 |
| 126 | 149 | 110 | 128 | 172 | 28 | 111 | 78 | 82 | 120 | 71 | 52 | 5 | 141 | 29 | 30 | 132 | 148 | 72 | 85 | 17 | 160 |
| 156 | 154 | 131 | 164 | 65 | 76 | 125 | 50 | 16 | 130 | 129 | 143 | 133 | 98 | 0 | 42 | 63 | 83 | 173 | 49 | 74 | 43 |
| 8 | 147 | 61 | 36 | 167 | 119 | 27 | 86 | 102 | 48 | 115 | 99 | 38 | 163 | 73 | 101 | 4 | 153 | 118 | 90 | 124 | 151 |
| 66 | 93 | 123 | 157 | 24 | 44 | 168 | 80 | 15 | 39 | 178 | 45 | 21 | 37 | 11 | 136 | 113 | 77 | 122 | 158 | 64 | 81 |
| 6 | 60 | 54 | 35 | 13 | 57 | 171 | 100 | 117 | 46 | 62 | 33 | 175 | 137 | 59 | 103 | 127 | 70 | 108 | 88 | 179 | 40 |
| 112 | 104 | 170 | 140 | 67 | 32 | 105 | 159 | 26 | 96 | 169 | 135 | 109 | 47 | 177 | 56 | 116 | 79 | 106 | 150 | 25 | 94 |
| 134 | 152 | 22 | 84 | 176 | 139 | 20 | 34 | 165 | 138 | 7 | 91 | 12 | 145 | 58 | 95 | 2 | 144 | 53 | 75 | 14 | 155 |
| 18 | 31 | 3 | 161 | | | | | | | | | | | | | | | | | | |

⇩

CONVERTED PATTERN (A):

| | | | | | | | | | | | | | | | | | | | | | |
|---|---|---|---|---|---|---|---|---|---|---|---|---|---|---|---|---|---|---|---|---|---|
| 23 | 19 | 68 | 114 | 107 | 55 | 110 | 111 | 71 | 29 | 72 | 156 | 65 | 16 | 133 | 63 | 74 | 61 | 27 | 115 | 73 | 118 |
| 66 | 24 | 15 | 21 | 113 | 64 | 54 | 171 | 62 | 59 | 108 | 112 | 67 | 26 | 109 | 116 | 25 | 22 | 20 | 7 | 58 | 53 |
| 18 | 89 | 41 | 87 | 92 | 97 | 174 | 128 | 78 | 52 | 30 | 85 | 154 | 76 | 130 | 98 | 83 | 43 | 36 | 86 | 99 | 101 |
| 90 | 93 | 44 | 39 | 37 | 77 | 81 | 35 | 100 | 33 | 103 | 88 | 104 | 32 | 96 | 47 | 79 | 94 | 84 | 34 | 91 | 95 |
| 75 | 31 | 10 | 1 | 9 | 121 | 166 | 126 | 172 | 82 | 5 | 132 | 17 | 131 | 125 | 129 | 0 | 173 | 8 | 167 | 102 | 38 |
| 4 | 124 | 123 | 168 | 178 | 11 | 122 | 6 | 13 | 117 | 175 | 127 | 179 | 170 | 105 | 169 | 177 | 106 | 134 | 176 | 165 | 12 |
| 2 | 14 | 3 | 142 | 146 | 51 | 69 | 162 | 149 | 28 | 120 | 141 | 148 | 160 | 164 | 50 | 143 | 42 | 49 | 147 | 119 | 48 |
| 163 | 153 | 151 | 157 | 80 | 45 | 136 | 158 | 60 | 57 | 46 | 137 | 70 | 40 | 140 | 159 | 135 | 56 | 150 | 152 | 139 | 138 |
| 145 | 144 | 155 | 161 | | | | | | | | | | | | | | | | | | |

FIG. 251

16QAM CR 10/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 68 | 71 | 54 | 19 | 25 | 21 | 102 | 32 | 105 | 29 | 16 | 79 | 53 | 82 | 107 | 91 | 67 | 94 | 85 | 48 | 83 | 58 |
| 42 | 57 | 28 | 76 | 31 | 26 | 96 | 65 | 119 | 114 | 109 | 9 | 125 | 81 | 43 | 103 | 93 | 70 | 46 | 89 | 112 | 61 |
| 45 | 66 | 38 | 77 | 115 | 56 | 87 | 113 | 100 | 75 | 72 | 60 | 47 | 92 | 36 | 98 | 4 | 59 | 6 | 44 | 20 | 86 |
| 3 | 73 | 95 | 104 | 8 | 34 | 0 | 84 | 111 | 35 | 30 | 64 | 55 | 80 | 40 | 97 | 101 | 2 | 69 | 63 | 74 | 62 |
| 118 | 110 | 159 | 18 | 50 | 33 | 7 | 175 | 51 | 131 | 106 | 134 | 88 | 140 | 117 | 132 | 147 | 153 | 116 | 161 | 10 | 39 |
| 126 | 136 | 90 | 37 | 174 | 41 | 158 | 5 | 120 | 12 | 52 | 99 | 146 | 144 | 78 | 155 | 128 | 165 | 141 | 179 | 150 | 157 |
| 171 | 143 | 108 | 170 | 22 | 49 | 11 | 27 | 160 | 178 | 133 | 142 | 121 | 168 | 173 | 123 | 13 | 15 | 154 | 127 | 139 | 151 |
| 163 | 172 | 138 | 176 | 145 | 129 | 162 | 152 | 177 | 137 | 149 | 167 | 1 | 14 | 169 | 124 | 148 | 164 | 130 | 17 | 156 | 122 |
| 23 | 166 | 135 | 24 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 68 | 66 | 159 | 170 | 71 | 38 | 18 | 22 | 54 | 77 | 50 | 49 | 19 | 115 | 33 | 11 | 25 | 56 | 7 | 27 | 21 | 87 |
| 175 | 160 | 102 | 113 | 51 | 178 | 32 | 100 | 131 | 133 | 105 | 75 | 106 | 142 | 29 | 72 | 134 | 121 | 16 | 60 | 88 | 168 |
| 79 | 47 | 140 | 173 | 53 | 92 | 117 | 123 | 82 | 36 | 132 | 13 | 107 | 98 | 147 | 15 | 91 | 4 | 153 | 154 | 67 | 59 |
| 116 | 127 | 94 | 6 | 161 | 139 | 85 | 44 | 10 | 151 | 48 | 20 | 39 | 163 | 83 | 86 | 126 | 172 | 58 | 3 | 136 | 138 |
| 42 | 73 | 90 | 176 | 57 | 95 | 37 | 145 | 28 | 104 | 174 | 129 | 76 | 8 | 41 | 162 | 31 | 34 | 158 | 152 | 26 | 0 |
| 5 | 177 | 96 | 84 | 120 | 137 | 65 | 111 | 12 | 149 | 119 | 35 | 52 | 167 | 114 | 30 | 99 | 1 | 109 | 64 | 146 | 14 |
| 9 | 55 | 144 | 169 | 125 | 80 | 78 | 124 | 81 | 40 | 155 | 148 | 43 | 97 | 128 | 164 | 103 | 101 | 165 | 130 | 93 | 2 |
| 141 | 17 | 70 | 69 | 179 | 156 | 46 | 63 | 150 | 122 | 89 | 74 | 157 | 23 | 112 | 62 | 171 | 166 | 61 | 118 | 143 | 135 |
| 45 | 110 | 108 | 24 | | | | | | | | | | | | | | | | | | |

FIG. 252

16QAM CR 11/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 21 | 11 | 12 | 9 | 0 | 6 | 24 | 25 | 85 | 103 | 118 | 122 | 71 | 101 | 41 | 93 | 55 | 73 | 100 | 40 | 106 | 119 |
| 45 | 80 | 128 | 68 | 129 | 61 | 124 | 36 | 126 | 117 | 114 | 132 | 136 | 140 | 144 | 148 | 152 | 156 | 160 | 164 | 168 | 172 |
| 176 | 20 | 18 | 10 | 13 | 16 | 8 | 26 | 27 | 54 | 111 | 52 | 44 | 87 | 113 | 115 | 58 | 116 | 49 | 77 | 95 | 86 |
| 30 | 78 | 81 | 56 | 125 | 53 | 89 | 94 | 50 | 123 | 65 | 83 | 133 | 137 | 141 | 145 | 149 | 153 | 157 | 161 | 165 | 169 |
| 173 | 177 | 2 | 17 | 1 | 4 | 7 | 15 | 29 | 82 | 32 | 102 | 76 | 121 | 92 | 130 | 127 | 62 | 107 | 38 | 46 | 43 |
| 110 | 75 | 104 | 70 | 91 | 69 | 96 | 120 | 42 | 34 | 79 | 35 | 105 | 134 | 138 | 142 | 146 | 150 | 154 | 158 | 162 | 166 |
| 170 | 174 | 178 | 19 | 5 | 3 | 14 | 22 | 28 | 23 | 109 | 51 | 108 | 131 | 33 | 84 | 88 | 64 | 63 | 59 | 57 | 97 |
| 98 | 48 | 31 | 99 | 37 | 72 | 39 | 74 | 66 | 60 | 67 | 47 | 112 | 90 | 135 | 139 | 143 | 147 | 151 | 155 | 159 | 163 |
| 167 | 171 | 175 | 179 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 21 | 20 | 2 | 19 | 11 | 18 | 17 | 5 | 12 | 10 | 1 | 3 | 9 | 13 | 4 | 14 | 0 | 16 | 7 | 22 | 6 | 8 |
| 15 | 28 | 24 | 26 | 29 | 23 | 25 | 27 | 82 | 109 | 85 | 54 | 32 | 51 | 103 | 111 | 102 | 108 | 118 | 52 | 76 | 131 |
| 122 | 44 | 121 | 33 | 71 | 87 | 92 | 84 | 101 | 113 | 130 | 88 | 41 | 115 | 127 | 64 | 93 | 58 | 62 | 63 | 55 | 116 |
| 107 | 59 | 73 | 49 | 38 | 57 | 100 | 77 | 46 | 97 | 40 | 95 | 43 | 98 | 106 | 86 | 110 | 48 | 119 | 30 | 75 | 31 |
| 45 | 78 | 104 | 99 | 80 | 81 | 70 | 37 | 128 | 56 | 91 | 72 | 68 | 125 | 69 | 39 | 129 | 53 | 96 | 74 | 61 | 89 |
| 120 | 66 | 124 | 94 | 42 | 60 | 36 | 50 | 34 | 67 | 126 | 123 | 79 | 47 | 117 | 65 | 35 | 112 | 114 | 83 | 105 | 90 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

FIG. 253

16QAM CR 12/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 120 | 32 | 38 | 113 | 71 | 31 | 65 | 109 | 36 | 106 | 134 | 66 | 29 | 86 | 136 | 108 | 83 | 70 | 79 | 81 | 105 | 48 |
| 30 | 125 | 107 | 44 | 99 | 75 | 64 | 78 | 51 | 95 | 88 | 49 | 60 | 54 | 122 | 140 | 137 | 89 | 74 | 129 | 82 | 164 |
| 59 | 3 | 67 | 92 | 98 | 42 | 77 | 28 | 121 | 87 | 18 | 21 | 93 | 72 | 2 | 142 | 112 | 9 | 50 | 8 | 90 | 139 |
| 14 | 97 | 63 | 85 | 104 | 124 | 52 | 20 | 118 | 34 | 5 | 94 | 41 | 68 | 80 | 110 | 12 | 133 | 131 | 53 | 116 | 123 |
| 96 | 61 | 111 | 33 | 173 | 165 | 175 | 166 | 169 | 174 | 159 | 148 | 158 | 155 | 145 | 178 | 126 | 100 | 154 | 156 | 179 | 157 |
| 46 | 149 | 171 | 37 | 153 | 163 | 152 | 146 | 177 | 103 | 160 | 147 | 76 | 172 | 144 | 150 | 132 | 176 | 168 | 167 | 162 | 170 |
| 138 | 151 | 161 | 40 | 26 | 130 | 119 | 114 | 117 | 115 | 84 | 57 | 62 | 13 | 47 | 24 | 0 | 7 | 10 | 69 | 19 | 127 |
| 17 | 16 | 27 | 91 | 4 | 73 | 35 | 102 | 15 | 55 | 23 | 25 | 11 | 56 | 45 | 58 | 128 | 43 | 135 | 1 | 143 | 141 |
| 6 | 22 | 101 | 39 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 120 | 3 | 111 | 40 | 32 | 67 | 33 | 26 | 38 | 92 | 173 | 130 | 113 | 98 | 165 | 119 | 71 | 42 | 175 | 114 | 31 | 77 |
| 166 | 117 | 65 | 28 | 169 | 115 | 109 | 121 | 174 | 84 | 36 | 87 | 159 | 57 | 106 | 18 | 148 | 62 | 134 | 21 | 158 | 13 |
| 66 | 93 | 155 | 47 | 29 | 72 | 145 | 24 | 86 | 2 | 178 | 0 | 136 | 142 | 126 | 7 | 108 | 112 | 100 | 10 | 83 | 9 |
| 154 | 69 | 70 | 50 | 156 | 19 | 79 | 8 | 179 | 127 | 81 | 90 | 157 | 17 | 105 | 139 | 46 | 16 | 48 | 14 | 149 | 27 |
| 30 | 97 | 171 | 91 | 125 | 63 | 37 | 4 | 107 | 85 | 153 | 73 | 44 | 104 | 163 | 35 | 99 | 124 | 152 | 102 | 75 | 52 |
| 146 | 15 | 64 | 20 | 177 | 55 | 78 | 118 | 103 | 23 | 51 | 34 | 160 | 25 | 95 | 5 | 147 | 11 | 88 | 94 | 76 | 56 |
| 49 | 41 | 172 | 45 | 60 | 68 | 144 | 58 | 54 | 80 | 150 | 128 | 122 | 110 | 132 | 43 | 140 | 12 | 176 | 135 | 137 | 133 |
| 168 | 1 | 89 | 131 | 167 | 143 | 74 | 53 | 162 | 141 | 129 | 116 | 170 | 6 | 82 | 123 | 138 | 22 | 164 | 96 | 151 | 101 |
| 59 | 61 | 161 | 39 | | | | | | | | | | | | | | | | | | |

FIG. 254

16QAM CR 13/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 0 | 4 | 8 | 12 | 16 | 20 | 24 | 28 | 32 | 36 | 40 | 44 | 48 | 52 | 56 | 60 | 64 | 68 | 72 | 76 | 80 | 84 |
| 88 | 92 | 96 | 100 | 104 | 108 | 112 | 116 | 120 | 124 | 128 | 132 | 136 | 140 | 144 | 148 | 152 | 156 | 160 | 164 | 168 | 172 |
| 176 | 1 | 5 | 9 | 13 | 17 | 21 | 25 | 29 | 33 | 37 | 41 | 45 | 49 | 53 | 57 | 61 | 65 | 69 | 73 | 77 | 81 |
| 85 | 89 | 93 | 97 | 101 | 105 | 109 | 113 | 117 | 121 | 125 | 129 | 133 | 137 | 141 | 145 | 149 | 153 | 157 | 161 | 165 | 169 |
| 173 | 177 | 2 | 6 | 10 | 14 | 18 | 22 | 26 | 30 | 34 | 38 | 42 | 46 | 50 | 54 | 58 | 62 | 66 | 70 | 74 | 78 |
| 82 | 86 | 90 | 94 | 98 | 102 | 106 | 110 | 114 | 118 | 122 | 126 | 130 | 134 | 138 | 142 | 146 | 150 | 154 | 158 | 162 | 166 |
| 170 | 174 | 178 | 3 | 7 | 11 | 15 | 19 | 23 | 27 | 31 | 35 | 39 | 43 | 47 | 51 | 55 | 59 | 63 | 67 | 71 | 75 |
| 79 | 83 | 87 | 91 | 95 | 99 | 103 | 107 | 111 | 115 | 119 | 123 | 127 | 131 | 135 | 139 | 143 | 147 | 151 | 155 | 159 | 163 |
| 167 | 171 | 175 | 179 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

FIG. 255

64QAM CR 2/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 57 | 149 | 83 | 142 | 29 | 20 | 30 | 52 | 5 | 100 | 156 | 22 | 130 | 167 | 121 | 126 | 137 | 158 | 132 | 82 | 138 | 128 |
| 89 | 88 | 162 | 32 | 107 | 3 | 97 | 166 | 125 | 129 | 1 | 6 | 68 | 148 | 40 | 87 | 0 | 80 | 49 | 24 | 78 | 101 |
| 43 | 112 | 75 | 172 | 23 | 154 | 12 | 146 | 19 | 135 | 48 | 170 | 123 | 147 | 95 | 91 | 13 | 35 | 127 | 61 | 60 | 139 |
| 44 | 59 | 55 | 109 | 157 | 177 | 153 | 165 | 66 | 152 | 77 | 98 | 131 | 11 | 81 | 62 | 175 | 141 | 171 | 51 | 155 | 76 |
| 150 | 174 | 58 | 143 | 37 | 63 | 31 | 41 | 140 | 118 | 94 | 27 | 10 | 70 | 56 | 93 | 176 | 124 | 151 | 106 | 46 | 163 |
| 179 | 4 | 18 | 144 | 178 | 161 | 145 | 71 | 114 | 7 | 105 | 133 | 84 | 86 | 17 | 21 | 28 | 54 | 74 | 65 | 110 | 122 |
| 169 | 64 | 111 | 119 | 42 | 85 | 73 | 8 | 116 | 79 | 120 | 69 | 53 | 115 | 67 | 104 | 16 | 173 | 92 | 15 | 159 | 134 |
| 99 | 96 | 117 | 38 | 9 | 26 | 164 | 47 | 103 | 113 | 136 | 168 | 102 | 14 | 45 | 72 | 25 | 50 | 34 | 36 | 90 | 160 |
| 2 | 33 | 39 | 108 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 57 | 125 | 13 | 58 | 105 | 92 | 149 | 129 | 35 | 143 | 133 | 15 | 83 | 1 | 127 | 37 | 84 | 159 | 142 | 6 | 61 | 63 |
| 86 | 134 | 29 | 68 | 60 | 31 | 17 | 99 | 20 | 148 | 139 | 41 | 21 | 96 | 30 | 40 | 44 | 140 | 28 | 117 | 52 | 87 |
| 59 | 118 | 54 | 38 | 5 | 0 | 55 | 94 | 74 | 9 | 100 | 80 | 109 | 27 | 65 | 26 | 156 | 49 | 157 | 10 | 110 | 164 |
| 22 | 24 | 177 | 70 | 122 | 47 | 130 | 78 | 153 | 56 | 169 | 103 | 167 | 101 | 165 | 93 | 64 | 113 | 121 | 43 | 66 | 176 |
| 111 | 136 | 126 | 112 | 152 | 124 | 119 | 168 | 137 | 75 | 77 | 151 | 42 | 102 | 158 | 172 | 98 | 106 | 85 | 14 | 132 | 23 |
| 131 | 46 | 73 | 45 | 82 | 154 | 11 | 163 | 8 | 72 | 138 | 12 | 81 | 179 | 116 | 25 | 128 | 146 | 62 | 4 | 79 | 50 |
| 89 | 19 | 175 | 18 | 120 | 34 | 88 | 135 | 141 | 144 | 69 | 36 | 162 | 48 | 171 | 178 | 53 | 90 | 32 | 170 | 51 | 161 |
| 115 | 160 | 107 | 123 | 155 | 145 | 67 | 2 | 3 | 147 | 76 | 71 | 104 | 33 | 97 | 95 | 150 | 114 | 16 | 39 | 166 | 91 |
| 174 | 7 | 173 | 108 | | | | | | | | | | | | | | | | | | |

FIG. 256

64QAM CR 3/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 74 | 72 | 104 | 62 | 122 | 35 | 130 | 0 | 95 | 150 | 139 | 151 | 133 | 109 | 31 | 59 | 18 | 148 | 9 | 105 | 57 | 132 |
| 102 | 100 | 115 | 101 | 7 | 21 | 141 | 30 | 8 | 1 | 93 | 92 | 163 | 108 | 52 | 159 | 24 | 89 | 117 | 88 | 178 | 113 |
| 98 | 179 | 144 | 156 | 54 | 164 | 12 | 63 | 39 | 22 | 25 | 137 | 13 | 41 | 44 | 80 | 87 | 111 | 145 | 23 | 85 | 166 |
| 83 | 55 | 154 | 20 | 84 | 58 | 26 | 126 | 170 | 103 | 11 | 33 | 172 | 155 | 116 | 169 | 142 | 70 | 161 | 47 | 3 | 162 |
| 77 | 19 | 28 | 97 | 124 | 6 | 168 | 107 | 60 | 76 | 143 | 121 | 42 | 157 | 65 | 43 | 173 | 56 | 171 | 90 | 131 | 119 |
| 94 | 5 | 68 | 138 | 149 | 73 | 67 | 53 | 61 | 4 | 86 | 99 | 75 | 36 | 15 | 48 | 177 | 167 | 174 | 51 | 176 | 81 |
| 120 | 158 | 123 | 34 | 49 | 128 | 10 | 134 | 147 | 96 | 160 | 50 | 146 | 16 | 38 | 78 | 91 | 152 | 46 | 127 | 27 | 175 |
| 135 | 79 | 125 | 82 | 2 | 129 | 153 | 14 | 40 | 32 | 114 | 106 | 17 | 110 | 140 | 71 | 136 | 112 | 45 | 64 | 29 | 69 |
| 118 | 66 | 37 | 165 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 74 | 8 | 87 | 28 | 86 | 46 | 72 | 1 | 111 | 97 | 99 | 127 | 104 | 93 | 145 | 124 | 75 | 27 | 62 | 92 | 23 | 6 |
| 36 | 175 | 122 | 163 | 85 | 168 | 15 | 135 | 35 | 108 | 166 | 107 | 48 | 79 | 130 | 52 | 83 | 60 | 177 | 125 | 0 | 159 |
| 55 | 76 | 167 | 82 | 95 | 24 | 154 | 143 | 174 | 2 | 150 | 89 | 20 | 121 | 51 | 129 | 139 | 117 | 84 | 42 | 176 | 153 |
| 151 | 88 | 58 | 157 | 81 | 14 | 133 | 178 | 26 | 65 | 120 | 40 | 109 | 113 | 126 | 43 | 158 | 32 | 31 | 98 | 170 | 173 |
| 123 | 114 | 59 | 179 | 103 | 56 | 34 | 106 | 18 | 144 | 11 | 171 | 49 | 17 | 148 | 156 | 33 | 90 | 128 | 110 | 9 | 54 |
| 172 | 131 | 10 | 140 | 105 | 164 | 155 | 119 | 134 | 71 | 57 | 12 | 116 | 94 | 147 | 136 | 132 | 63 | 169 | 5 | 96 | 112 |
| 102 | 39 | 142 | 68 | 160 | 45 | 100 | 22 | 70 | 138 | 50 | 64 | 115 | 25 | 161 | 149 | 146 | 29 | 101 | 137 | 47 | 73 |
| 16 | 69 | 7 | 13 | 3 | 67 | 38 | 118 | 21 | 41 | 162 | 53 | 78 | 66 | 141 | 44 | 77 | 61 | 91 | 37 | 30 | 80 |
| 19 | 4 | 152 | 165 | | | | | | | | | | | | | | | | | | |

FIG. 257

64QAM CR 4/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 141 | 80 | 47 | 89 | 44 | 7 | 46 | 11 | 175 | 173 | 99 | 2 | 155 | 52 | 86 | 128 | 174 | 33 | 170 | 31 | 35 | 162 |
| 64 | 95 | 92 | 4 | 16 | 49 | 137 | 104 | 29 | 9 | 60 | 167 | 50 | 23 | 43 | 176 | 121 | 71 | 132 | 103 | 144 | 39 |
| 12 | 90 | 114 | 131 | 106 | 76 | 118 | 66 | 24 | 58 | 122 | 150 | 57 | 149 | 93 | 53 | 14 | 73 | 165 | 82 | 126 | 97 |
| 59 | 133 | 154 | 153 | 72 | 36 | 5 | 96 | 120 | 134 | 101 | 61 | 115 | 0 | 28 | 42 | 18 | 145 | 156 | 85 | 146 | 6 |
| 161 | 10 | 22 | 138 | 127 | 151 | 87 | 54 | 20 | 139 | 140 | 152 | 13 | 91 | 111 | 25 | 123 | 77 | 78 | 69 | 3 | 177 |
| 41 | 81 | 19 | 107 | 45 | 148 | 70 | 160 | 51 | 21 | 116 | 48 | 157 | 17 | 125 | 142 | 83 | 110 | 37 | 98 | 179 | 129 |
| 168 | 172 | 1 | 40 | 166 | 159 | 147 | 56 | 100 | 63 | 26 | 169 | 135 | 15 | 75 | 84 | 163 | 79 | 143 | 113 | 94 | 74 |
| 102 | 30 | 38 | 178 | 68 | 108 | 136 | 105 | 158 | 117 | 34 | 109 | 67 | 62 | 32 | 119 | 124 | 171 | 8 | 55 | 65 | 130 |
| 88 | 112 | 27 | 164 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 141 | 29 | 14 | 22 | 116 | 143 | 80 | 9 | 73 | 138 | 48 | 113 | 47 | 60 | 165 | 127 | 157 | 94 | 89 | 167 | 82 | 151 |
| 17 | 74 | 44 | 50 | 126 | 87 | 125 | 102 | 7 | 23 | 97 | 54 | 142 | 30 | 46 | 43 | 59 | 20 | 83 | 38 | 11 | 176 |
| 133 | 139 | 110 | 178 | 175 | 121 | 154 | 140 | 37 | 68 | 173 | 71 | 153 | 152 | 98 | 108 | 99 | 132 | 72 | 13 | 179 | 136 |
| 2 | 103 | 36 | 91 | 129 | 105 | 155 | 144 | 5 | 111 | 168 | 158 | 52 | 39 | 96 | 25 | 172 | 117 | 86 | 12 | 120 | 123 |
| 1 | 34 | 128 | 90 | 134 | 77 | 40 | 109 | 174 | 114 | 101 | 78 | 166 | 67 | 33 | 131 | 61 | 69 | 159 | 62 | 170 | 106 |
| 115 | 3 | 147 | 32 | 31 | 76 | 0 | 177 | 56 | 119 | 35 | 118 | 28 | 41 | 100 | 124 | 162 | 66 | 42 | 81 | 63 | 171 |
| 64 | 24 | 18 | 19 | 26 | 8 | 95 | 58 | 145 | 107 | 169 | 55 | 92 | 122 | 156 | 45 | 135 | 65 | 4 | 150 | 85 | 148 |
| 15 | 130 | 16 | 57 | 146 | 70 | 75 | 88 | 49 | 149 | 6 | 160 | 84 | 112 | 137 | 93 | 161 | 51 | 163 | 27 | 104 | 53 |
| 10 | 21 | 79 | 164 | | | | | | | | | | | | | | | | | | |

FIG. 258

64QAM CR 5/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 166 | 54 | 6 | 27 | 141 | 134 | 58 | 46 | 55 | 91 | 56 | 100 | 172 | 80 | 18 | 152 | 12 | 108 | 170 | 29 | 144 | 147 |
| 106 | 165 | 17 | 127 | 57 | 88 | 35 | 72 | 5 | 63 | 118 | 1 | 85 | 77 | 61 | 62 | 84 | 159 | 92 | 102 | 98 | 177 |
| 132 | 139 | 59 | 149 | 11 | 8 | 154 | 129 | 33 | 15 | 143 | 4 | 95 | 101 | 53 | 42 | 40 | 9 | 111 | 130 | 123 | 82 |
| 81 | 114 | 119 | 175 | 157 | 41 | 38 | 128 | 161 | 52 | 142 | 7 | 26 | 145 | 2 | 68 | 28 | 126 | 121 | 70 | 16 | 65 |
| 83 | 125 | 50 | 79 | 37 | 74 | 164 | 168 | 160 | 122 | 60 | 32 | 24 | 138 | 75 | 69 | 0 | 36 | 97 | 117 | 14 | 109 |
| 173 | 120 | 112 | 87 | 176 | 124 | 151 | 67 | 13 | 94 | 105 | 133 | 64 | 76 | 153 | 31 | 136 | 140 | 150 | 39 | 96 | 66 |
| 3 | 115 | 20 | 99 | 171 | 49 | 25 | 45 | 22 | 30 | 156 | 158 | 163 | 135 | 21 | 146 | 90 | 169 | 78 | 93 | 178 | 116 |
| 19 | 155 | 110 | 73 | 104 | 167 | 44 | 113 | 162 | 89 | 47 | 43 | 86 | 48 | 107 | 71 | 137 | 51 | 174 | 103 | 131 | 179 |
| 148 | 10 | 23 | 34 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 166 | 5 | 40 | 50 | 105 | 78 | 54 | 63 | 9 | 79 | 133 | 93 | 6 | 118 | 111 | 37 | 64 | 178 | 27 | 1 | 130 | 74 |
| 76 | 116 | 141 | 85 | 123 | 164 | 153 | 19 | 134 | 77 | 82 | 168 | 31 | 155 | 58 | 61 | 81 | 160 | 136 | 110 | 46 | 62 |
| 114 | 122 | 140 | 73 | 55 | 84 | 119 | 60 | 150 | 104 | 91 | 159 | 175 | 32 | 39 | 167 | 56 | 92 | 157 | 24 | 96 | 44 |
| 100 | 102 | 41 | 138 | 66 | 113 | 172 | 98 | 38 | 75 | 3 | 162 | 80 | 177 | 128 | 69 | 115 | 89 | 18 | 132 | 161 | 0 |
| 20 | 47 | 152 | 139 | 52 | 36 | 99 | 43 | 12 | 59 | 142 | 97 | 171 | 86 | 108 | 149 | 7 | 117 | 49 | 48 | 170 | 11 |
| 26 | 14 | 25 | 107 | 29 | 8 | 145 | 109 | 45 | 71 | 144 | 154 | 2 | 173 | 22 | 137 | 147 | 129 | 68 | 120 | 30 | 51 |
| 106 | 33 | 28 | 112 | 156 | 174 | 165 | 15 | 126 | 87 | 158 | 103 | 17 | 143 | 121 | 176 | 163 | 131 | 127 | 4 | 70 | 124 |
| 135 | 179 | 57 | 95 | 16 | 151 | 21 | 148 | 88 | 101 | 65 | 67 | 146 | 10 | 35 | 53 | 83 | 13 | 90 | 23 | 72 | 42 |
| 125 | 94 | 169 | 34 | | | | | | | | | | | | | | | | | | |

FIG. 259

64QAM CR 6/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 29 | 17 | 38 | 37 | 27 | 43 | 31 | 35 | 16 | 46 | 44 | 9 | 23 | 1 | 34 | 45 | 14 | 18 | 156 | 19 | 22 | 40 |
| 50 | 24 | 56 | 49 | 26 | 42 | 69 | 47 | 59 | 61 | 66 | 52 | 64 | 65 | 67 | 54 | 170 | 68 | 132 | 51 | 70 | 41 |
| 21 | 5 | 160 | 7 | 13 | 55 | 62 | 53 | 63 | 58 | 3 | 167 | 71 | 57 | 151 | 60 | 36 | 25 | 74 | 39 | 32 | 72 |
| 85 | 86 | 107 | 113 | 48 | 88 | 2 | 129 | 137 | 20 | 73 | 166 | 75 | 77 | 142 | 174 | 15 | 149 | 28 | 145 | 92 | 169 |
| 30 | 133 | 163 | 119 | 82 | 176 | 152 | 134 | 139 | 148 | 164 | 99 | 173 | 104 | 83 | 106 | 112 | 135 | 153 | 0 | 128 | 144 |
| 98 | 171 | 94 | 97 | 143 | 110 | 118 | 127 | 84 | 79 | 108 | 126 | 131 | 93 | 111 | 91 | 4 | 125 | 162 | 157 | 158 | 109 |
| 140 | 123 | 154 | 150 | 80 | 11 | 12 | 146 | 96 | 81 | 165 | 8 | 89 | 138 | 105 | 141 | 103 | 6 | 100 | 161 | 172 | 78 |
| 101 | 115 | 179 | 147 | 116 | 136 | 122 | 87 | 33 | 130 | 124 | 175 | 120 | 90 | 102 | 10 | 114 | 159 | 76 | 177 | 178 | 121 |
| 168 | 95 | 117 | 155 | | | | | | | | | | | | | | | | | | |

CONVERTED PATTERN (B):

| | | | | | | | | | | | | | | | | | | | | | |
|---|---|---|---|---|---|---|---|---|---|---|---|---|---|---|---|---|---|---|---|---|---|
| 29 | 59 | 36 | 163 | 108 | 100 | 17 | 61 | 25 | 119 | 126 | 161 | 38 | 66 | 74 | 82 | 131 | 172 | 37 | 52 | 39 | 176 |
| 93 | 78 | 27 | 64 | 32 | 152 | 111 | 101 | 43 | 65 | 72 | 134 | 91 | 115 | 31 | 67 | 85 | 139 | 4 | 179 | 35 | 54 |
| 86 | 148 | 125 | 147 | 16 | 170 | 107 | 164 | 162 | 116 | 46 | 68 | 113 | 99 | 157 | 136 | 44 | 132 | 48 | 173 | 158 | 122 |
| 9 | 51 | 88 | 104 | 109 | 87 | 23 | 70 | 2 | 83 | 140 | 33 | 1 | 41 | 129 | 106 | 123 | 130 | 34 | 21 | 137 | 112 |
| 154 | 124 | 45 | 5 | 20 | 135 | 150 | 175 | 14 | 160 | 73 | 153 | 80 | 120 | 18 | 7 | 166 | 0 | 11 | 90 | 156 | 13 |
| 75 | 128 | 12 | 102 | 19 | 55 | 77 | 144 | 146 | 10 | 22 | 62 | 142 | 98 | 96 | 114 | 40 | 53 | 174 | 171 | 81 | 159 |
| 50 | 63 | 15 | 94 | 165 | 76 | 24 | 58 | 149 | 97 | 8 | 177 | 56 | 3 | 28 | 143 | 89 | 178 | 49 | 167 | 145 | 110 |
| 138 | 121 | 26 | 71 | 92 | 118 | 105 | 168 | 42 | 57 | 169 | 127 | 141 | 95 | 69 | 151 | 30 | 84 | 103 | 117 | 47 | 60 |
| 133 | 79 | 6 | 155 | | | | | | | | | | | | | | | | | | |

FIG. 260

64QAM CR 7/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 103 | 36 | 155 | 175 | 52 | 130 | 16 | 178 | 141 | 86 | 49 | 129 | 73 | 84 | 142 | 177 | 110 | 8 | 96 | 77 | 139 | 167 |
| 109 | 2 | 17 | 37 | 146 | 169 | 54 | 134 | 101 | 78 | 135 | 70 | 153 | 6 | 29 | 41 | 143 | 63 | 47 | 124 | 90 | 31 |
| 152 | 98 | 59 | 133 | 15 | 79 | 164 | 67 | 50 | 128 | 23 | 34 | 154 | 69 | 45 | 9 | 27 | 35 | 156 | 170 | 113 | 127 |
| 102 | 82 | 149 | 176 | 46 | 13 | 22 | 30 | 163 | 60 | 114 | 11 | 92 | 44 | 157 | 74 | 48 | 132 | 24 | 87 | 140 | 66 |
| 118 | 123 | 104 | 89 | 136 | 64 | 107 | 14 | 99 | 43 | 115 | 71 | 117 | 12 | 26 | 38 | 147 | 62 | 57 | 131 | 94 | 33 |
| 151 | 172 | 116 | 10 | 25 | 75 | 144 | 179 | 51 | 120 | 20 | 80 | 160 | 174 | 106 | 1 | 21 | 88 | 137 | 61 | 105 | 5 |
| 18 | 32 | 158 | 72 | 56 | 125 | 28 | 42 | 161 | 168 | 53 | 7 | 100 | 40 | 145 | 171 | 55 | 3 | 95 | 83 | 162 | 173 |
| 119 | 126 | 91 | 39 | 150 | 165 | 112 | 122 | 93 | 76 | 138 | 166 | 108 | 121 | 97 | 81 | 148 | 65 | 111 | 4 | 19 | 85 |
| 159 | 68 | 58 | 0 | | | | | | | | | | | | | | | | | | |

⇩

CONVERTED PATTERN (A):

| | | | | | | | | | | | | | | | | | | | | | |
|---|---|---|---|---|---|---|---|---|---|---|---|---|---|---|---|---|---|---|---|---|---|
| 103 | 16 | 73 | 96 | 17 | 101 | 29 | 90 | 15 | 23 | 27 | 102 | 22 | 92 | 24 | 104 | 99 | 26 | 94 | 25 | 20 | 21 |
| 18 | 28 | 100 | 95 | 91 | 93 | 97 | 19 | 36 | 178 | 84 | 77 | 37 | 78 | 41 | 31 | 79 | 34 | 35 | 82 | 30 | 44 |
| 87 | 89 | 43 | 38 | 33 | 75 | 80 | 88 | 32 | 42 | 40 | 83 | 39 | 76 | 81 | 85 | 155 | 141 | 142 | 139 | 146 | 135 |
| 143 | 152 | 164 | 154 | 156 | 149 | 163 | 157 | 140 | 136 | 115 | 147 | 151 | 144 | 160 | 137 | 158 | 161 | 145 | 162 | 150 | 138 |
| 148 | 159 | 175 | 86 | 177 | 167 | 169 | 70 | 63 | 98 | 67 | 69 | 170 | 176 | 60 | 74 | 66 | 64 | 71 | 62 | 172 | 179 |
| 174 | 61 | 72 | 168 | 171 | 173 | 165 | 166 | 65 | 68 | 52 | 49 | 110 | 109 | 54 | 153 | 47 | 59 | 50 | 45 | 113 | 46 |
| 114 | 48 | 118 | 107 | 117 | 57 | 116 | 51 | 106 | 105 | 56 | 53 | 55 | 119 | 112 | 108 | 111 | 58 | 130 | 129 | 8 | 2 |
| 134 | 6 | 124 | 133 | 128 | 9 | 127 | 13 | 11 | 132 | 123 | 14 | 12 | 131 | 10 | 120 | 1 | 5 | 125 | 7 | 3 | 126 |
| 122 | 121 | 4 | 0 | | | | | | | | | | | | | | | | | | |

FIG. 261

64QAM CR 8/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 86 | 71 | 51 | 48 | 89 | 94 | 46 | 81 | 67 | 49 | 80 | 37 | 55 | 61 | 36 | 57 | 52 | 92 | 60 | 82 | 76 | 72 |
| 44 | 42 | 91 | 62 | 50 | 90 | 40 | 78 | 53 | 58 | 47 | 85 | 70 | 4 | 69 | 43 | 54 | 84 | 93 | 38 | 8 | 64 |
| 6 | 18 | 77 | 95 | 66 | 59 | 83 | 73 | 17 | 87 | 3 | 75 | 65 | 88 | 79 | 14 | 151 | 117 | 32 | 22 | 123 | 30 |
| 33 | 162 | 144 | 9 | 121 | 108 | 139 | 142 | 24 | 34 | 20 | 157 | 159 | 138 | 143 | 29 | 140 | 163 | 150 | 175 | 114 | 31 |
| 12 | 35 | 145 | 28 | 27 | 26 | 16 | 98 | 102 | 103 | 133 | 161 | 21 | 25 | 107 | 153 | 45 | 156 | 23 | 125 | 141 | 56 |
| 166 | 5 | 1 | 170 | 119 | 68 | 134 | 41 | 74 | 179 | 2 | 129 | 169 | 101 | 99 | 109 | 127 | 168 | 176 | 11 | 0 | 122 |
| 110 | 113 | 146 | 132 | 165 | 19 | 13 | 39 | 7 | 164 | 106 | 172 | 154 | 149 | 10 | 173 | 131 | 167 | 63 | 147 | 155 | 100 |
| 171 | 158 | 160 | 15 | 178 | 148 | 152 | 104 | 124 | 177 | 97 | 130 | 118 | 137 | 111 | 126 | 120 | 105 | 115 | 136 | 112 | 96 |
| 135 | 116 | 174 | 128 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 86 | 53 | 151 | 145 | 2 | 63 | 71 | 58 | 117 | 28 | 129 | 147 | 51 | 47 | 32 | 27 | 169 | 155 | 48 | 85 | 22 | 26 |
| 101 | 100 | 89 | 70 | 123 | 16 | 99 | 171 | 94 | 4 | 30 | 98 | 109 | 158 | 46 | 69 | 33 | 102 | 127 | 160 | 81 | 43 |
| 162 | 103 | 168 | 15 | 67 | 54 | 144 | 133 | 176 | 178 | 49 | 84 | 9 | 161 | 11 | 148 | 80 | 93 | 121 | 21 | 0 | 152 |
| 37 | 38 | 108 | 25 | 122 | 104 | 55 | 8 | 139 | 107 | 110 | 124 | 61 | 64 | 142 | 153 | 113 | 177 | 36 | 6 | 24 | 45 |
| 146 | 97 | 57 | 18 | 34 | 156 | 132 | 130 | 52 | 77 | 20 | 23 | 165 | 118 | 92 | 95 | 157 | 125 | 19 | 137 | 60 | 66 |
| 159 | 141 | 13 | 111 | 82 | 59 | 138 | 56 | 39 | 126 | 76 | 83 | 143 | 166 | 7 | 120 | 72 | 73 | 29 | 5 | 164 | 105 |
| 44 | 17 | 140 | 1 | 106 | 115 | 42 | 87 | 163 | 170 | 172 | 136 | 91 | 3 | 150 | 119 | 154 | 112 | 62 | 75 | 175 | 68 |
| 149 | 96 | 50 | 65 | 114 | 134 | 10 | 135 | 90 | 88 | 31 | 41 | 173 | 116 | 40 | 79 | 12 | 74 | 131 | 174 | 78 | 14 |
| 35 | 179 | 167 | 128 | | | | | | | | | | | | | | | | | | |

FIG. 262

64QAM CR 9/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 175 | 60 | 133 | 11 | 5 | 4 | 70 | 97 | 131 | 80 | 42 | 136 | 50 | 104 | 32 | 75 | 176 | 87 | 109 | 61 | 39 | 107 |
| 0 | 172 | 23 | 90 | 54 | 160 | 48 | 173 | 27 | 100 | 129 | 14 | 7 | 142 | 20 | 103 | 38 | 126 | 157 | 144 | 21 | 64 |
| 44 | 79 | 105 | 146 | 49 | 93 | 1 | 84 | 81 | 145 | 18 | 15 | 106 | 91 | 12 | 169 | 63 | 71 | 125 | 37 | 120 | 138 |
| 17 | 113 | 31 | 130 | 140 | 8 | 25 | 74 | 134 | 115 | 9 | 171 | 46 | 68 | 33 | 116 | 2 | 179 | 52 | 92 | 36 | 78 |
| 164 | 177 | 24 | 72 | 122 | 118 | 162 | 121 | 16 | 73 | 45 | 53 | 77 | 110 | 30 | 66 | 29 | 76 | 158 | 148 | 111 | 94 |
| 43 | 83 | 139 | 10 | 56 | 98 | 114 | 117 | 152 | 174 | 47 | 62 | 128 | 85 | 155 | 178 | 26 | 96 | 41 | 82 | 150 | 143 |
| 58 | 69 | 127 | 86 | 13 | 141 | 35 | 101 | 149 | 108 | 3 | 154 | 51 | 95 | 132 | 135 | 163 | 137 | 28 | 102 | 123 | 112 |
| 151 | 167 | 59 | 19 | 156 | 119 | 153 | 168 | 55 | 65 | 34 | 6 | 159 | 170 | 57 | 67 | 40 | 89 | 147 | 165 | 22 | 99 |
| 124 | 88 | 161 | 166 | | | | | | | | | | | | | | | | | | |

⇩

CONVERTED PATTERN (A):

| | | | | | | | | | | | | | | | | | | | | | |
|---|---|---|---|---|---|---|---|---|---|---|---|---|---|---|---|---|---|---|---|---|---|
| 175 | 70 | 50 | 109 | 23 | 27 | 20 | 21 | 49 | 18 | 63 | 17 | 25 | 46 | 52 | 24 | 16 | 30 | 111 | 56 | 47 | 26 |
| 58 | 35 | 51 | 28 | 59 | 55 | 57 | 22 | 60 | 97 | 104 | 61 | 90 | 100 | 103 | 64 | 93 | 15 | 71 | 113 | 74 | 68 |
| 92 | 72 | 73 | 66 | 94 | 98 | 62 | 96 | 69 | 101 | 95 | 102 | 19 | 65 | 67 | 99 | 133 | 131 | 32 | 39 | 54 | 129 |
| 38 | 44 | 1 | 106 | 125 | 31 | 134 | 33 | 36 | 122 | 45 | 29 | 43 | 114 | 128 | 41 | 127 | 149 | 132 | 123 | 156 | 34 |
| 40 | 124 | 11 | 80 | 75 | 107 | 160 | 14 | 126 | 79 | 84 | 91 | 37 | 130 | 115 | 116 | 78 | 118 | 53 | 76 | 83 | 117 |
| 85 | 82 | 86 | 108 | 135 | 112 | 119 | 6 | 89 | 88 | 5 | 42 | 176 | 0 | 48 | 7 | 157 | 105 | 81 | 12 | 120 | 140 |
| 9 | 2 | 164 | 162 | 77 | 158 | 139 | 152 | 155 | 150 | 13 | 3 | 163 | 151 | 153 | 159 | 147 | 161 | 4 | 136 | 87 | 172 |
| 173 | 142 | 144 | 146 | 145 | 169 | 138 | 8 | 171 | 179 | 177 | 121 | 110 | 148 | 10 | 174 | 178 | 143 | 141 | 154 | 137 | 167 |
| 168 | 170 | 165 | 166 | | | | | | | | | | | | | | | | | | |

FIG. 263

64QAM CR 10/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 16 | 163 | 92 | 56 | 111 | 141 | 65 | 118 | 78 | 55 | 5 | 148 | 19 | 153 | 75 | 128 | 32 | 178 | 22 | 156 | 99 | 124 |
| 4 | 168 | 20 | 115 | 87 | 122 | 9 | 166 | 27 | 155 | 94 | 134 | 38 | 137 | 67 | 161 | 90 | 127 | 43 | 171 | 64 | 162 |
| 98 | 133 | 34 | 138 | 73 | 154 | 100 | 58 | 103 | 169 | 23 | 117 | 88 | 50 | 13 | 175 | 68 | 39 | 102 | 54 | 37 | 149 |
| 29 | 150 | 104 | 59 | 3 | 139 | 69 | 110 | 77 | 131 | 42 | 142 | 25 | 158 | 80 | 47 | 35 | 143 | 72 | 151 | 84 | 57 |
| 8 | 176 | 61 | 46 | 41 | 51 | 10 | 173 | 63 | 107 | 125 | 48 | 11 | 177 | 24 | 30 | 91 | 76 | 109 | 140 | 74 | 114 |
| 82 | 120 | 1 | 79 | 66 | 119 | 93 | 159 | 36 | 174 | 26 | 112 | 101 | 123 | 44 | 145 | 60 | 157 | 97 | 45 | 33 | 167 |
| 70 | 152 | 85 | 126 | 40 | 135 | 62 | 108 | 95 | 49 | 31 | 147 | 71 | 113 | 89 | 132 | 6 | 144 | 18 | 105 | 83 | 130 |
| 2 | 172 | 17 | 164 | 81 | 52 | 7 | 179 | 28 | 160 | 136 | 121 | 14 | 146 | 15 | 106 | 86 | 129 | 12 | 170 | 21 | 116 |
| 96 | 53 | 0 | 165 | | | | | | | | | | | | | | | | | | |

CONVERTED PATTERN (A):

| | | | | | | | | | | | | | | | | | | | | | |
|---|---|---|---|---|---|---|---|---|---|---|---|---|---|---|---|---|---|---|---|---|---|
| 16 | 65 | 19 | 22 | 20 | 27 | 67 | 64 | 73 | 23 | 68 | 29 | 69 | 25 | 72 | 61 | 63 | 24 | 74 | 66 | 26 | 60 |
| 70 | 62 | 71 | 18 | 17 | 28 | 15 | 21 | 163 | 118 | 153 | 156 | 115 | 155 | 161 | 162 | 154 | 117 | 39 | 150 | 110 | 158 |
| 151 | 46 | 107 | 30 | 114 | 119 | 112 | 157 | 152 | 108 | 113 | 105 | 164 | 160 | 106 | 116 | 92 | 78 | 75 | 99 | 87 | 94 |
| 90 | 98 | 100 | 88 | 102 | 104 | 77 | 80 | 84 | 41 | 125 | 91 | 82 | 93 | 101 | 97 | 85 | 95 | 89 | 83 | 81 | 136 |
| 86 | 96 | 56 | 55 | 128 | 124 | 122 | 134 | 127 | 133 | 58 | 50 | 54 | 59 | 131 | 47 | 57 | 51 | 48 | 76 | 120 | 159 |
| 123 | 45 | 126 | 49 | 132 | 130 | 52 | 121 | 129 | 53 | 111 | 5 | 32 | 4 | 9 | 38 | 43 | 34 | 103 | 13 | 37 | 3 |
| 42 | 35 | 8 | 10 | 11 | 109 | 1 | 36 | 44 | 33 | 40 | 31 | 6 | 2 | 7 | 14 | 12 | 0 | 141 | 148 | 178 | 168 |
| 166 | 137 | 171 | 138 | 169 | 175 | 149 | 139 | 142 | 143 | 176 | 173 | 177 | 140 | 79 | 174 | 145 | 167 | 135 | 147 | 144 | 172 |
| 179 | 146 | 170 | 165 | | | | | | | | | | | | | | | | | | |

FIG. 264

64QAM CR 11/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 12 | 15 | 2 | 16 | 27 | 50 | 35 | 74 | 38 | 70 | 108 | 32 | 112 | 54 | 30 | 122 | 72 | 116 | 36 | 90 | 49 | 85 |
| 132 | 138 | 144 | 150 | 156 | 162 | 168 | 174 | 0 | 14 | 9 | 5 | 23 | 66 | 68 | 52 | 96 | 117 | 84 | 128 | 100 | 63 |
| 60 | 127 | 81 | 99 | 53 | 55 | 103 | 95 | 133 | 139 | 145 | 151 | 157 | 163 | 169 | 175 | 10 | 22 | 13 | 11 | 28 | 104 |
| 37 | 57 | 115 | 46 | 65 | 129 | 107 | 75 | 119 | 110 | 31 | 43 | 97 | 78 | 125 | 58 | 134 | 140 | 146 | 152 | 158 | 164 |
| 170 | 176 | 4 | 19 | 6 | 8 | 24 | 44 | 101 | 94 | 118 | 130 | 69 | 71 | 83 | 34 | 86 | 124 | 48 | 106 | 89 | 40 |
| 102 | 91 | 135 | 141 | 147 | 153 | 159 | 165 | 171 | 177 | 3 | 20 | 7 | 17 | 25 | 87 | 41 | 120 | 47 | 80 | 59 | 62 |
| 88 | 45 | 56 | 131 | 61 | 126 | 113 | 92 | 51 | 98 | 136 | 142 | 148 | 154 | 160 | 166 | 172 | 178 | 21 | 18 | 1 | 26 |
| 29 | 39 | 73 | 121 | 105 | 77 | 42 | 114 | 93 | 82 | 111 | 109 | 67 | 79 | 123 | 64 | 76 | 33 | 137 | 143 | 149 | 155 |
| 161 | 167 | 173 | 179 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 12 | 0 | 10 | 4 | 3 | 21 | 15 | 14 | 22 | 19 | 20 | 18 | 2 | 9 | 13 | 6 | 7 | 1 | 16 | 5 | 11 | 8 |
| 17 | 26 | 27 | 23 | 28 | 24 | 25 | 29 | 50 | 66 | 104 | 44 | 87 | 39 | 35 | 68 | 37 | 101 | 41 | 73 | 74 | 52 |
| 57 | 94 | 120 | 121 | 38 | 96 | 115 | 118 | 47 | 105 | 70 | 117 | 46 | 130 | 80 | 77 | 108 | 84 | 65 | 69 | 59 | 42 |
| 32 | 128 | 129 | 71 | 62 | 114 | 112 | 100 | 107 | 83 | 88 | 93 | 54 | 63 | 75 | 34 | 45 | 82 | 30 | 60 | 119 | 86 |
| 56 | 111 | 122 | 127 | 110 | 124 | 131 | 109 | 72 | 81 | 31 | 48 | 61 | 67 | 116 | 99 | 43 | 106 | 126 | 79 | 36 | 53 |
| 97 | 89 | 113 | 123 | 90 | 55 | 78 | 40 | 92 | 64 | 49 | 103 | 125 | 102 | 51 | 76 | 85 | 95 | 58 | 91 | 98 | 33 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

FIG. 265

64QAM CR 12/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 83 | 93 | 94 | 47 | 55 | 40 | 38 | 77 | 110 | 124 | 87 | 61 | 102 | 76 | 33 | 35 | 92 | 59 | 74 | 11 | 138 | 72 |
| 67 | 37 | 10 | 95 | 139 | 131 | 44 | 57 | 97 | 53 | 142 | 0 | 136 | 9 | 143 | 86 | 100 | 21 | 15 | 75 | 62 | 19 |
| 65 | 129 | 101 | 79 | 22 | 68 | 73 | 23 | 18 | 81 | 98 | 112 | 8 | 128 | 103 | 25 | 43 | 126 | 54 | 90 | 28 | 109 |
| 46 | 91 | 41 | 82 | 113 | 134 | 52 | 105 | 78 | 27 | 135 | 96 | 56 | 140 | 64 | 66 | 89 | 34 | 120 | 108 | 63 | 45 |
| 69 | 121 | 88 | 39 | 29 | 133 | 106 | 117 | 127 | 32 | 42 | 58 | 71 | 118 | 51 | 84 | 85 | 80 | 104 | 132 | 111 | 30 |
| 26 | 48 | 50 | 31 | 141 | 116 | 123 | 114 | 70 | 107 | 178 | 145 | 173 | 36 | 144 | 130 | 176 | 171 | 175 | 125 | 99 | 162 |
| 159 | 20 | 164 | 115 | 169 | 172 | 165 | 161 | 151 | 119 | 122 | 152 | 157 | 4 | 137 | 148 | 153 | 170 | 154 | 166 | 13 | 150 |
| 16 | 167 | 174 | 163 | 49 | 6 | 168 | 147 | 146 | 1 | 149 | 158 | 179 | 12 | 5 | 160 | 177 | 60 | 24 | 156 | 7 | 155 |
| 17 | 3 | 2 | 14 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 83 | 97 | 43 | 88 | 178 | 154 | 93 | 53 | 126 | 39 | 145 | 166 | 94 | 142 | 54 | 29 | 173 | 13 | 47 | 0 | 90 | 133 |
| 36 | 150 | 55 | 136 | 28 | 106 | 144 | 16 | 40 | 9 | 109 | 117 | 130 | 167 | 38 | 143 | 46 | 127 | 176 | 174 | 77 | 86 |
| 91 | 32 | 171 | 163 | 110 | 100 | 41 | 42 | 175 | 49 | 124 | 21 | 82 | 58 | 125 | 6 | 87 | 15 | 113 | 71 | 99 | 168 |
| 61 | 75 | 134 | 118 | 162 | 147 | 102 | 62 | 52 | 51 | 159 | 146 | 76 | 19 | 105 | 84 | 20 | 1 | 33 | 65 | 78 | 85 |
| 164 | 149 | 35 | 129 | 27 | 80 | 115 | 158 | 92 | 101 | 135 | 104 | 169 | 179 | 59 | 79 | 96 | 132 | 172 | 12 | 74 | 22 |
| 56 | 111 | 165 | 5 | 11 | 68 | 140 | 30 | 161 | 160 | 138 | 73 | 64 | 26 | 151 | 177 | 72 | 23 | 66 | 48 | 119 | 60 |
| 67 | 18 | 89 | 50 | 122 | 24 | 37 | 81 | 34 | 31 | 152 | 156 | 10 | 98 | 120 | 141 | 157 | 7 | 95 | 112 | 108 | 116 |
| 4 | 155 | 139 | 8 | 63 | 123 | 137 | 17 | 131 | 128 | 45 | 114 | 148 | 3 | 44 | 103 | 69 | 70 | 153 | 2 | 57 | 25 |
| 121 | 107 | 170 | 14 | | | | | | | | | | | | | | | | | | |

FIG. 266

64QAM CR 13/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 146 | 91 | 63 | 144 | 46 | 12 | 58 | 137 | 25 | 79 | 70 | 33 | 134 | 148 | 66 | 38 | 163 | 118 | 139 | 130 | 72 | 92 |
| 160 | 23 | 133 | 153 | 128 | 86 | 152 | 106 | 53 | 93 | 61 | 5 | 158 | 172 | 121 | 135 | 44 | 149 | 168 | 0 | 124 | 143 |
| 27 | 30 | 151 | 114 | 113 | 43 | 138 | 89 | 159 | 17 | 120 | 136 | 102 | 81 | 170 | 176 | 142 | 104 | 21 | 78 | 155 | 8 |
| 52 | 95 | 62 | 40 | 174 | 6 | 131 | 48 | 18 | 1 | 179 | 34 | 123 | 77 | 26 | 84 | 157 | 85 | 56 | 147 | 67 | 76 |
| 162 | 10 | 51 | 103 | 140 | 87 | 175 | 115 | 4 | 101 | 69 | 80 | 169 | 75 | 49 | 97 | 154 | 83 | 14 | 2 | 132 | 96 |
| 16 | 37 | 166 | 109 | 54 | 42 | 28 | 32 | 171 | 119 | 55 | 94 | 65 | 20 | 165 | 3 | 47 | 90 | 117 | 88 | 177 | 11 |
| 59 | 68 | 73 | 41 | 150 | 111 | 127 | 100 | 110 | 31 | 167 | 13 | 122 | 145 | 71 | 22 | 173 | 116 | 126 | 141 | 29 | 39 |
| 178 | 57 | 125 | 36 | 19 | 7 | 156 | 107 | 9 | 98 | 74 | 45 | 161 | 112 | 50 | 99 | 24 | 35 | 164 | 64 | 129 | 15 |
| 60 | 82 | 108 | 105 | | | | | | | | | | | | | | | | | | |

⇩

CONVERTED PATTERN (A):

| | | | | | | | | | | | | | | | | | | | | | |
|---|---|---|---|---|---|---|---|---|---|---|---|---|---|---|---|---|---|---|---|---|---|
| 146 | 58 | 134 | 139 | 133 | 53 | 121 | 124 | 113 | 120 | 142 | 52 | 131 | 123 | 56 | 51 | 4 | 49 | 132 | 54 | 55 | 47 |
| 59 | 127 | 122 | 126 | 125 | 9 | 50 | 129 | 91 | 137 | 148 | 130 | 153 | 93 | 135 | 143 | 43 | 136 | 104 | 95 | 48 | 77 |
| 147 | 103 | 101 | 97 | 96 | 42 | 94 | 90 | 68 | 100 | 145 | 141 | 36 | 98 | 99 | 15 | 63 | 25 | 66 | 72 | 128 | 61 |
| 44 | 27 | 138 | 102 | 21 | 62 | 18 | 26 | 67 | 140 | 69 | 154 | 16 | 28 | 65 | 117 | 73 | 110 | 71 | 29 | 19 | 74 |
| 24 | 60 | 144 | 79 | 38 | 92 | 86 | 5 | 149 | 30 | 89 | 81 | 78 | 40 | 1 | 84 | 76 | 87 | 80 | 83 | 37 | 32 |
| 20 | 88 | 41 | 31 | 22 | 39 | 7 | 45 | 35 | 82 | 46 | 70 | 163 | 160 | 152 | 158 | 168 | 151 | 159 | 170 | 155 | 174 |
| 179 | 157 | 162 | 175 | 169 | 14 | 166 | 171 | 165 | 177 | 150 | 167 | 173 | 178 | 156 | 161 | 164 | 108 | 12 | 33 | 118 | 23 |
| 106 | 172 | 0 | 114 | 17 | 176 | 8 | 6 | 34 | 85 | 10 | 115 | 75 | 2 | 109 | 119 | 3 | 11 | 111 | 13 | 116 | 57 |
| 107 | 112 | 64 | 105 | | | | | | | | | | | | | | | | | | |

FIG. 267

256QAM CR 2/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 112 | 78 | 104 | 6 | 59 | 80 | 49 | 120 | 114 | 27 | 113 | 3 | 109 | 44 | 69 | 164 | 91 | 137 | 39 | 31 | 21 | 127 |
| 151 | 8 | 47 | 176 | 117 | 68 | 122 | 148 | 79 | 73 | 7 | 166 | 51 | 50 | 116 | 66 | 152 | 61 | 29 | 107 | 22 | 154 |
| 118 | 94 | 24 | 35 | 55 | 38 | 88 | 54 | 2 | 15 | 19 | 67 | 101 | 74 | 169 | 138 | 41 | 162 | 175 | 136 | 62 | 161 |
| 121 | 163 | 115 | 135 | 123 | 25 | 140 | 156 | 58 | 33 | 119 | 111 | 146 | 129 | 150 | 147 | 97 | 18 | 60 | 4 | 81 | 168 |
| 43 | 105 | 36 | 65 | 13 | 5 | 108 | 145 | 23 | 70 | 20 | 173 | 159 | 100 | 128 | 172 | 170 | 1 | 37 | 83 | 102 | 103 |
| 157 | 139 | 179 | 32 | 144 | 92 | 131 | 75 | 155 | 14 | 9 | 149 | 63 | 11 | 134 | 53 | 99 | 17 | 57 | 90 | 30 | 98 |
| 64 | 40 | 87 | 158 | 77 | 93 | 124 | 46 | 171 | 141 | 133 | 85 | 177 | 132 | 26 | 160 | 42 | 34 | 82 | 96 | 48 | 10 |
| 142 | 125 | 178 | 153 | 72 | 45 | 89 | 52 | 28 | 126 | 143 | 167 | 76 | 86 | 130 | 110 | 174 | 16 | 165 | 56 | 84 | 95 |
| 0 | 106 | 12 | 71 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 112 | 151 | 118 | 121 | 43 | 157 | 64 | 142 | 78 | 8 | 94 | 163 | 105 | 139 | 40 | 125 | 104 | 47 | 24 | 115 | 36 | 179 |
| 87 | 178 | 6 | 176 | 35 | 135 | 65 | 32 | 158 | 153 | 59 | 117 | 55 | 123 | 13 | 144 | 77 | 72 | 80 | 68 | 38 | 25 |
| 5 | 92 | 93 | 45 | 49 | 122 | 88 | 140 | 108 | 131 | 124 | 89 | 120 | 148 | 54 | 156 | 145 | 75 | 46 | 52 | 114 | 79 |
| 2 | 58 | 23 | 155 | 171 | 28 | 27 | 73 | 15 | 33 | 70 | 14 | 141 | 126 | 113 | 7 | 19 | 119 | 20 | 9 | 133 | 143 |
| 3 | 166 | 67 | 111 | 173 | 149 | 85 | 167 | 109 | 51 | 101 | 146 | 159 | 63 | 177 | 76 | 44 | 50 | 74 | 129 | 100 | 11 |
| 132 | 86 | 69 | 116 | 169 | 150 | 128 | 134 | 26 | 130 | 164 | 66 | 138 | 147 | 172 | 53 | 160 | 110 | 91 | 152 | 41 | 97 |
| 170 | 99 | 42 | 174 | 137 | 61 | 162 | 18 | 1 | 17 | 34 | 16 | 39 | 29 | 175 | 60 | 37 | 57 | 82 | 165 | 31 | 107 |
| 136 | 4 | 83 | 90 | 96 | 56 | 21 | 22 | 62 | 81 | 102 | 30 | 48 | 84 | 127 | 154 | 161 | 168 | 103 | 98 | 10 | 95 |
| 0 | 106 | 12 | 71 | | | | | | | | | | | | | | | | | | |

FIG. 268

256QAM CR 3/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 136 | 28 | 85 | 38 | 40 | 89 | 133 | 117 | 3 | 58 | 154 | 77 | 14 | 179 | 96 | 101 | 26 | 169 | 37 | 83 | 162 | 165 |
| 24 | 66 | 109 | 126 | 10 | 155 | 70 | 157 | 105 | 175 | 67 | 158 | 32 | 42 | 147 | 140 | 30 | 7 | 92 | 59 | 119 | 56 |
| 0 | 5 | 90 | 174 | 13 | 47 | 76 | 88 | 86 | 108 | 27 | 18 | 12 | 8 | 61 | 145 | 75 | 125 | 112 | 69 | 120 | 137 |
| 116 | 20 | 178 | 98 | 176 | 29 | 68 | 168 | 124 | 21 | 35 | 150 | 131 | 159 | 163 | 84 | 23 | 123 | 65 | 103 | 93 | 99 |
| 102 | 31 | 64 | 74 | 46 | 94 | 80 | 129 | 142 | 128 | 148 | 111 | 134 | 173 | 60 | 118 | 2 | 170 | 135 | 1 | 115 | 143 |
| 95 | 177 | 73 | 43 | 11 | 114 | 91 | 78 | 107 | 172 | 25 | 36 | 164 | 149 | 153 | 110 | 44 | 146 | 82 | 127 | 45 | 33 |
| 50 | 41 | 52 | 156 | 34 | 4 | 79 | 141 | 138 | 122 | 53 | 160 | 81 | 16 | 100 | 130 | 71 | 121 | 132 | 9 | 22 | 113 |
| 6 | 152 | 15 | 171 | 17 | 57 | 49 | 151 | 161 | 63 | 55 | 139 | 166 | 97 | 19 | 51 | 72 | 167 | 106 | 48 | 144 | 87 |
| 104 | 62 | 54 | 39 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 136 | 24 | 0 | 116 | 102 | 95 | 50 | 6 | 28 | 66 | 5 | 20 | 31 | 177 | 41 | 152 | 85 | 109 | 90 | 178 | 64 | 73 |
| 52 | 15 | 38 | 126 | 174 | 98 | 74 | 43 | 156 | 171 | 40 | 10 | 13 | 176 | 46 | 11 | 34 | 17 | 89 | 155 | 47 | 29 |
| 94 | 114 | 4 | 57 | 133 | 70 | 76 | 68 | 80 | 91 | 79 | 49 | 117 | 157 | 88 | 168 | 129 | 78 | 141 | 151 | 3 | 105 |
| 86 | 124 | 142 | 107 | 138 | 161 | 58 | 175 | 108 | 21 | 128 | 172 | 122 | 63 | 154 | 67 | 27 | 35 | 148 | 25 | 53 | 55 |
| 77 | 158 | 18 | 150 | 111 | 36 | 160 | 139 | 14 | 32 | 12 | 131 | 134 | 164 | 81 | 166 | 179 | 42 | 8 | 159 | 173 | 149 |
| 16 | 97 | 96 | 147 | 61 | 163 | 60 | 153 | 100 | 19 | 101 | 140 | 145 | 84 | 118 | 110 | 130 | 51 | 26 | 30 | 75 | 23 |
| 2 | 44 | 71 | 72 | 169 | 7 | 125 | 123 | 170 | 146 | 121 | 167 | 37 | 92 | 112 | 65 | 135 | 82 | 132 | 106 | 83 | 59 |
| 69 | 103 | 1 | 127 | 9 | 48 | 162 | 119 | 120 | 93 | 115 | 45 | 22 | 144 | 165 | 56 | 137 | 99 | 143 | 33 | 113 | 87 |
| 104 | 62 | 54 | 39 | | | | | | | | | | | | | | | | | | |

FIG. 269

256QAM CR 4/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 13 | 121 | 137 | 29 | 27 | 1 | 70 | 116 | 35 | 132 | 109 | 51 | 55 | 58 | 11 | 67 | 136 | 25 | 145 | 7 | 75 | 107 |
| 45 | 21 | 127 | 52 | 90 | 22 | 100 | 123 | 69 | 112 | 155 | 92 | 151 | 59 | 5 | 179 | 44 | 87 | 56 | 139 | 65 | 170 |
| 46 | 0 | 124 | 78 | 166 | 8 | 61 | 97 | 120 | 103 | 4 | 19 | 64 | 79 | 28 | 134 | 93 | 86 | 60 | 135 | 126 | 53 |
| 63 | 14 | 122 | 17 | 150 | 76 | 42 | 39 | 23 | 153 | 95 | 66 | 50 | 141 | 176 | 34 | 161 | 26 | 106 | 10 | 43 | 85 |
| 131 | 2 | 147 | 148 | 144 | 54 | 115 | 146 | 101 | 172 | 114 | 119 | 3 | 96 | 133 | 99 | 167 | 164 | 9 | 142 | 68 | 149 |
| 94 | 83 | 16 | 175 | 73 | 38 | 143 | 159 | 130 | 84 | 169 | 18 | 138 | 102 | 72 | 47 | 32 | 160 | 82 | 81 | 168 | 30 |
| 12 | 173 | 156 | 158 | 125 | 98 | 62 | 178 | 48 | 163 | 117 | 110 | 91 | 37 | 80 | 105 | 31 | 174 | 111 | 49 | 113 | 108 |
| 74 | 157 | 128 | 24 | 118 | 40 | 88 | 177 | 154 | 6 | 162 | 129 | 77 | 36 | 165 | 20 | 89 | 140 | 15 | 33 | 104 | 152 |
| 71 | 171 | 57 | 41 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 13 | 45 | 46 | 63 | 131 | 94 | 12 | 74 | 121 | 21 | 0 | 14 | 2 | 83 | 173 | 157 | 137 | 127 | 124 | 122 | 147 | 16 |
| 156 | 128 | 29 | 52 | 78 | 17 | 148 | 175 | 158 | 24 | 27 | 90 | 166 | 150 | 144 | 73 | 125 | 118 | 1 | 22 | 8 | 76 |
| 54 | 38 | 98 | 40 | 70 | 100 | 61 | 42 | 115 | 143 | 62 | 88 | 116 | 123 | 97 | 39 | 146 | 159 | 178 | 177 | 35 | 69 |
| 120 | 23 | 101 | 130 | 48 | 154 | 132 | 112 | 103 | 153 | 172 | 84 | 163 | 6 | 109 | 155 | 4 | 95 | 114 | 169 | 117 | 162 |
| 51 | 92 | 19 | 66 | 119 | 18 | 110 | 129 | 55 | 151 | 64 | 50 | 3 | 138 | 91 | 77 | 58 | 59 | 79 | 141 | 96 | 102 |
| 37 | 36 | 11 | 5 | 28 | 176 | 133 | 72 | 80 | 165 | 67 | 179 | 134 | 34 | 99 | 47 | 105 | 20 | 136 | 44 | 93 | 161 |
| 167 | 32 | 31 | 89 | 25 | 87 | 86 | 26 | 164 | 160 | 174 | 140 | 145 | 56 | 60 | 106 | 9 | 82 | 111 | 15 | 7 | 139 |
| 135 | 10 | 142 | 81 | 49 | 33 | 75 | 65 | 126 | 43 | 68 | 168 | 113 | 104 | 107 | 170 | 53 | 85 | 149 | 30 | 108 | 152 |
| 71 | 171 | 57 | 41 | | | | | | | | | | | | | | | | | | |

FIG. 270

256QAM CR 5/15:

Original Pattern (B):

BIT GROUP

| | | | | | | | | | | | | | | | | | | | | | |
|---|---|---|---|---|---|---|---|---|---|---|---|---|---|---|---|---|---|---|---|---|---|
| 39 | 45 | 128 | 84 | 143 | 148 | 2 | 75 | 43 | 50 | 130 | 87 | 137 | 151 | 7 | 71 | 55 | 51 | 133 | 90 | 140 | 149 |
| 6 | 177 | 37 | 124 | 99 | 83 | 23 | 159 | 0 | 176 | 41 | 121 | 96 | 89 | 30 | 161 | 18 | 172 | 60 | 49 | 134 | 104 |
| 139 | 166 | 14 | 179 | 62 | 48 | 129 | 105 | 146 | 160 | 16 | 174 | 33 | 54 | 132 | 112 | 145 | 150 | 9 | 77 | 34 | 117 |
| 92 | 82 | 136 | 165 | 4 | 67 | 36 | 44 | 101 | 81 | 141 | 156 | 3 | 175 | 58 | 47 | 91 | 102 | 32 | 158 | 13 | 178 |
| 63 | 118 | 100 | 85 | 26 | 167 | 1 | 173 | 38 | 116 | 131 | 107 | 138 | 162 | 8 | 72 | 42 | 115 | 98 | 108 | 24 | 152 |
| 17 | 171 | 64 | 123 | 94 | 110 | 28 | 147 | 19 | 169 | 61 | 46 | 97 | 106 | 144 | 164 | 5 | 70 | 59 | 53 | 127 | 88 |
| 31 | 153 | 10 | 73 | 66 | 119 | 126 | 111 | 29 | 155 | 15 | 170 | 57 | 120 | 125 | 80 | 142 | 168 | 11 | 68 | 56 | 52 |
| 95 | 103 | 27 | 154 | 21 | 78 | 40 | 122 | 93 | 86 | 25 | 163 | 20 | 79 | 35 | 114 | 135 | 109 | 22 | 157 | 12 | 69 |
| 65 | 74 | 76 | 113 | | | | | | | | | | | | | | | | | | |

⇩

Converted Pattern (A):

| | | | | | | | | | | | | | | | | | | | | | |
|---|---|---|---|---|---|---|---|---|---|---|---|---|---|---|---|---|---|---|---|---|---|
| 39 | 43 | 55 | 37 | 41 | 60 | 62 | 33 | 34 | 36 | 58 | 63 | 38 | 42 | 64 | 61 | 59 | 66 | 57 | 56 | 40 | 35 |
| 45 | 50 | 51 | 124 | 121 | 49 | 48 | 54 | 117 | 44 | 47 | 118 | 116 | 115 | 123 | 46 | 53 | 119 | 120 | 52 | 122 | 114 |
| 128 | 130 | 133 | 99 | 96 | 134 | 129 | 132 | 92 | 101 | 91 | 100 | 131 | 98 | 94 | 97 | 127 | 126 | 125 | 95 | 93 | 135 |
| 84 | 87 | 90 | 83 | 89 | 104 | 105 | 112 | 82 | 81 | 102 | 85 | 107 | 108 | 110 | 106 | 88 | 111 | 80 | 103 | 86 | 109 |
| 143 | 137 | 140 | 23 | 30 | 139 | 146 | 145 | 136 | 141 | 32 | 26 | 138 | 24 | 28 | 144 | 31 | 29 | 142 | 27 | 25 | 22 |
| 148 | 151 | 149 | 159 | 161 | 166 | 160 | 150 | 165 | 156 | 158 | 167 | 162 | 152 | 147 | 164 | 153 | 155 | 168 | 154 | 163 | 157 |
| 2 | 7 | 6 | 0 | 18 | 14 | 16 | 9 | 4 | 3 | 13 | 1 | 8 | 17 | 19 | 5 | 10 | 15 | 11 | 21 | 20 | 12 |
| 75 | 71 | 177 | 176 | 172 | 179 | 174 | 77 | 67 | 175 | 178 | 173 | 72 | 171 | 169 | 70 | 73 | 170 | 68 | 78 | 79 | 69 |
| 65 | 74 | 76 | 113 | | | | | | | | | | | | | | | | | | |

FIG. 271

256QAM CR 6/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 99 | 100 | 15 | 107 | 54 | 76 | 153 | 174 | 61 | 0 | 36 | 71 | 62 | 137 | 108 | 114 | 65 | 98 | 151 | 19 | 112 | 109 |
| 152 | 117 | 35 | 93 | 43 | 90 | 154 | 73 | 150 | 165 | 23 | 16 | 91 | 5 | 169 | 175 | 120 | 149 | 26 | 59 | 49 | 56 |
| 156 | 136 | 110 | 80 | 58 | 55 | 40 | 103 | 159 | 83 | 127 | 111 | 155 | 167 | 11 | 52 | 116 | 142 | 133 | 1 | 2 | 96 |
| 77 | 86 | 122 | 6 | 131 | 29 | 51 | 21 | 17 | 45 | 126 | 12 | 3 | 168 | 41 | 30 | 37 | 64 | 164 | 78 | 8 | 118 |
| 113 | 39 | 48 | 140 | 14 | 60 | 82 | 134 | 25 | 33 | 50 | 84 | 28 | 105 | 123 | 145 | 7 | 27 | 34 | 92 | 115 | 147 |
| 74 | 10 | 68 | 102 | 67 | 63 | 101 | 18 | 66 | 129 | 24 | 4 | 119 | 87 | 42 | 170 | 143 | 121 | 38 | 57 | 95 | 148 |
| 89 | 81 | 158 | 171 | 32 | 22 | 69 | 53 | 130 | 104 | 161 | 75 | 141 | 9 | 47 | 79 | 162 | 146 | 124 | 157 | 70 | 106 |
| 31 | 132 | 166 | 128 | 138 | 125 | 44 | 13 | 85 | 88 | 135 | 144 | 173 | 163 | 20 | 46 | 97 | 94 | 139 | 172 | 72 | 160 |
| 176 | 177 | 178 | 179 | | | | | | | | | | | | | | | | | | |

⇩

CONVERTED PATTERN (A):

| | | | | | | | | | | | | | | | | | | | | | |
|---|---|---|---|---|---|---|---|---|---|---|---|---|---|---|---|---|---|---|---|---|---|
| 99 | 61 | 65 | 35 | 23 | 26 | 58 | 155 | 2 | 51 | 41 | 113 | 25 | 7 | 68 | 24 | 38 | 32 | 141 | 70 | 44 | 20 |
| 100 | 0 | 98 | 93 | 16 | 59 | 55 | 167 | 96 | 21 | 30 | 39 | 33 | 27 | 102 | 4 | 57 | 22 | 9 | 106 | 13 | 46 |
| 15 | 36 | 151 | 43 | 91 | 49 | 40 | 11 | 77 | 17 | 37 | 48 | 50 | 34 | 67 | 119 | 95 | 69 | 47 | 31 | 85 | 97 |
| 107 | 71 | 19 | 90 | 5 | 56 | 103 | 52 | 86 | 45 | 64 | 140 | 84 | 92 | 63 | 87 | 148 | 53 | 79 | 132 | 88 | 94 |
| 54 | 62 | 112 | 154 | 169 | 156 | 159 | 116 | 122 | 126 | 164 | 14 | 28 | 115 | 101 | 42 | 89 | 130 | 162 | 166 | 135 | 139 |
| 76 | 137 | 109 | 73 | 175 | 136 | 83 | 142 | 6 | 12 | 78 | 60 | 105 | 147 | 18 | 170 | 81 | 104 | 146 | 128 | 144 | 172 |
| 153 | 108 | 152 | 150 | 120 | 110 | 127 | 133 | 131 | 3 | 8 | 82 | 123 | 74 | 66 | 143 | 158 | 161 | 124 | 138 | 173 | 72 |
| 174 | 114 | 117 | 165 | 149 | 80 | 111 | 1 | 29 | 168 | 118 | 134 | 145 | 10 | 129 | 121 | 171 | 75 | 157 | 125 | 163 | 160 |
| 176 | 177 | 178 | 179 | | | | | | | | | | | | | | | | | | |

FIG. 272

256QAM CR 7/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 24 | 157 | 0 | 43 | 126 | 172 | 135 | 65 | 32 | 18 | 114 | 42 | 162 | 67 | 104 | 61 | 23 | 11 | 4 | 96 | 163 | 75 |
| 109 | 58 | 79 | 154 | 3 | 95 | 168 | 73 | 103 | 60 | 84 | 148 | 113 | 40 | 164 | 173 | 143 | 49 | 29 | 156 | 7 | 89 |
| 132 | 179 | 138 | 53 | 85 | 12 | 117 | 36 | 122 | 66 | 107 | 64 | 28 | 147 | 2 | 90 | 131 | 70 | 144 | 55 | 26 | 15 |
| 112 | 35 | 128 | 176 | 106 | 59 | 80 | 19 | 6 | 92 | 129 | 174 | 99 | 62 | 82 | 13 | 121 | 41 | 127 | 71 | 139 | 63 |
| 25 | 151 | 9 | 39 | 159 | 69 | 142 | 52 | 77 | 21 | 119 | 38 | 167 | 178 | 101 | 56 | 87 | 155 | 5 | 91 | 166 | 169 |
| 146 | 50 | 81 | 20 | 111 | 88 | 165 | 177 | 108 | 47 | 27 | 149 | 115 | 33 | 161 | 72 | 102 | 57 | 86 | 16 | 110 | 97 |
| 123 | 68 | 100 | 48 | 31 | 14 | 8 | 93 | 130 | 170 | 133 | 44 | 78 | 150 | 118 | 94 | 158 | 76 | 134 | 46 | 83 | 152 |
| 1 | 37 | 160 | 171 | 136 | 54 | 22 | 17 | 116 | 34 | 125 | 175 | 105 | 45 | 30 | 153 | 10 | 98 | 124 | 74 | 137 | 51 |
| 120 | 141 | 140 | 145 | | | | | | | | | | | | | | | | | | |

⇩

CONVERTED PATTERN (A):

| | | | | | | | | | | | | | | | | | | | | | |
|---|---|---|---|---|---|---|---|---|---|---|---|---|---|---|---|---|---|---|---|---|---|
| 24 | 32 | 23 | 79 | 84 | 29 | 85 | 28 | 26 | 80 | 82 | 25 | 77 | 87 | 81 | 27 | 86 | 31 | 78 | 83 | 22 | 30 |
| 157 | 18 | 11 | 154 | 148 | 156 | 12 | 147 | 15 | 19 | 13 | 151 | 21 | 155 | 20 | 149 | 16 | 14 | 150 | 152 | 17 | 153 |
| 0 | 114 | 4 | 3 | 113 | 7 | 117 | 2 | 112 | 6 | 121 | 9 | 119 | 5 | 111 | 115 | 110 | 8 | 118 | 1 | 116 | 10 |
| 43 | 42 | 96 | 95 | 40 | 89 | 36 | 90 | 35 | 92 | 41 | 39 | 38 | 91 | 88 | 33 | 97 | 93 | 94 | 37 | 34 | 98 |
| 126 | 162 | 163 | 168 | 164 | 132 | 122 | 131 | 128 | 129 | 127 | 159 | 167 | 166 | 165 | 161 | 123 | 130 | 158 | 160 | 125 | 124 |
| 172 | 67 | 75 | 73 | 173 | 179 | 66 | 70 | 176 | 174 | 71 | 69 | 178 | 169 | 177 | 72 | 68 | 170 | 76 | 171 | 175 | 74 |
| 135 | 104 | 109 | 103 | 143 | 138 | 107 | 144 | 106 | 99 | 139 | 142 | 101 | 146 | 108 | 102 | 100 | 133 | 134 | 136 | 105 | 137 |
| 65 | 61 | 58 | 60 | 49 | 53 | 64 | 55 | 59 | 62 | 63 | 52 | 56 | 50 | 47 | 57 | 48 | 44 | 46 | 54 | 45 | 51 |
| 120 | 141 | 140 | 145 | | | | | | | | | | | | | | | | | | |

FIG. 273

256QAM CR 8/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 85 | 3 | 148 | 161 | 96 | 99 | 154 | 13 | 78 | 160 | 61 | 36 | 21 | 141 | 121 | 115 | 82 | 1 | 59 | 72 | 43 | 135 |
| 168 | 139 | 46 | 10 | 56 | 67 | 108 | 134 | 111 | 105 | 66 | 89 | 137 | 130 | 104 | 143 | 113 | 11 | 84 | 157 | 32 | 73 |
| 90 | 38 | 117 | 146 | 53 | 2 | 60 | 93 | 91 | 71 | 114 | 19 | 47 | 4 | 26 | 75 | 109 | 41 | 50 | 153 | 54 | 163 |
| 31 | 24 | 106 | 42 | 170 | 62 | 80 | 164 | 65 | 128 | 12 | 142 | 167 | 155 | 88 | 8 | 22 | 131 | 158 | 33 | 178 | 145 |
| 70 | 9 | 51 | 69 | 102 | 140 | 173 | 147 | 83 | 165 | 30 | 126 | 100 | 138 | 171 | 103 | 45 | 159 | 27 | 74 | 97 | 122 |
| 120 | 16 | 52 | 162 | 132 | 124 | 94 | 133 | 172 | 149 | 86 | 77 | 25 | 68 | 177 | 64 | 174 | 15 | 0 | 125 | 63 | 35 |
| 34 | 40 | 179 | 20 | 44 | 7 | 55 | 28 | 101 | 150 | 110 | 18 | 119 | 5 | 29 | 76 | 107 | 136 | 112 | 144 | 48 | 81 |
| 57 | 49 | 92 | 95 | 118 | 17 | 156 | 166 | 23 | 129 | 79 | 37 | 175 | 152 | 87 | 6 | 58 | 127 | 98 | 123 | 39 | 14 |
| 116 | 169 | 176 | 151 | | | | | | | | | | | | | | | | | | |

⇩

CONVERTED PATTERN (A):

| | | | | | | | | | | | | | | | | | | | | | |
|---|---|---|---|---|---|---|---|---|---|---|---|---|---|---|---|---|---|---|---|---|---|
| 85 | 78 | 82 | 46 | 66 | 84 | 53 | 47 | 54 | 80 | 88 | 70 | 83 | 45 | 52 | 86 | 0 | 44 | 119 | 48 | 156 | 87 |
| 3 | 160 | 1 | 10 | 89 | 157 | 2 | 4 | 163 | 164 | 8 | 9 | 165 | 159 | 162 | 77 | 125 | 7 | 5 | 81 | 166 | 6 |
| 148 | 61 | 59 | 56 | 137 | 32 | 60 | 26 | 31 | 65 | 22 | 51 | 30 | 27 | 132 | 25 | 63 | 55 | 29 | 57 | 23 | 58 |
| 161 | 36 | 72 | 67 | 130 | 73 | 93 | 75 | 24 | 128 | 131 | 69 | 126 | 74 | 124 | 68 | 35 | 28 | 76 | 49 | 129 | 127 |
| 96 | 21 | 43 | 108 | 104 | 90 | 91 | 109 | 106 | 12 | 158 | 102 | 100 | 97 | 94 | 177 | 34 | 101 | 107 | 92 | 79 | 98 |
| 99 | 141 | 135 | 134 | 143 | 38 | 71 | 41 | 42 | 142 | 33 | 140 | 138 | 122 | 133 | 64 | 40 | 150 | 136 | 95 | 37 | 123 |
| 154 | 121 | 168 | 111 | 113 | 117 | 114 | 50 | 170 | 167 | 178 | 173 | 171 | 120 | 172 | 174 | 179 | 110 | 112 | 118 | 175 | 39 |
| 13 | 115 | 139 | 105 | 11 | 146 | 19 | 153 | 62 | 155 | 145 | 147 | 103 | 16 | 149 | 15 | 20 | 18 | 144 | 17 | 152 | 14 |
| 116 | 169 | 176 | 151 | | | | | | | | | | | | | | | | | | |

FIG. 274

256QAM CR 9/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 58 | 70 | 23 | 32 | 26 | 63 | 55 | 48 | 35 | 41 | 53 | 20 | 38 | 51 | 61 | 65 | 44 | 29 | 7 | 2 | 113 | 68 |
| 96 | 104 | 106 | 89 | 27 | 0 | 119 | 21 | 4 | 49 | 46 | 100 | 13 | 36 | 57 | 98 | 102 | 9 | 42 | 39 | 33 | 62 |
| 22 | 95 | 101 | 15 | 91 | 25 | 93 | 132 | 69 | 87 | 47 | 59 | 67 | 124 | 17 | 11 | 31 | 43 | 40 | 37 | 85 | 50 |
| 97 | 140 | 45 | 92 | 56 | 30 | 34 | 60 | 107 | 24 | 52 | 94 | 64 | 5 | 71 | 90 | 66 | 103 | 88 | 86 | 84 | 19 |
| 169 | 159 | 147 | 126 | 28 | 130 | 14 | 162 | 144 | 166 | 108 | 153 | 115 | 135 | 120 | 122 | 112 | 139 | 151 | 156 | 16 | 172 |
| 164 | 123 | 99 | 54 | 136 | 81 | 105 | 128 | 116 | 150 | 155 | 76 | 18 | 142 | 170 | 175 | 83 | 146 | 78 | 109 | 73 | 131 |
| 127 | 82 | 167 | 77 | 110 | 79 | 137 | 152 | 3 | 173 | 148 | 72 | 158 | 117 | 1 | 6 | 12 | 8 | 161 | 74 | 143 | 133 |
| 168 | 171 | 134 | 163 | 138 | 121 | 141 | 160 | 111 | 10 | 149 | 80 | 75 | 165 | 157 | 174 | 129 | 145 | 114 | 125 | 154 | 118 |
| 176 | 177 | 178 | 179 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 58 | 96 | 22 | 97 | 169 | 164 | 127 | 168 | 70 | 104 | 95 | 140 | 159 | 123 | 82 | 171 | 23 | 106 | 101 | 45 | 147 | 99 |
| 167 | 134 | 32 | 89 | 15 | 92 | 126 | 54 | 77 | 163 | 26 | 27 | 91 | 56 | 28 | 136 | 110 | 138 | 63 | 0 | 25 | 30 |
| 130 | 81 | 79 | 121 | 55 | 119 | 93 | 34 | 14 | 105 | 137 | 141 | 48 | 21 | 132 | 60 | 162 | 128 | 152 | 160 | 35 | 4 |
| 69 | 107 | 144 | 116 | 3 | 111 | 41 | 49 | 87 | 24 | 166 | 150 | 173 | 10 | 53 | 46 | 47 | 52 | 108 | 155 | 148 | 149 |
| 20 | 100 | 59 | 94 | 153 | 76 | 72 | 80 | 38 | 13 | 67 | 64 | 115 | 18 | 158 | 75 | 51 | 36 | 124 | 5 | 135 | 142 |
| 117 | 165 | 61 | 57 | 17 | 71 | 120 | 170 | 1 | 157 | 65 | 98 | 11 | 90 | 122 | 175 | 6 | 174 | 44 | 102 | 31 | 66 |
| 112 | 83 | 12 | 129 | 29 | 9 | 43 | 103 | 139 | 146 | 8 | 145 | 7 | 42 | 40 | 88 | 151 | 78 | 161 | 114 | 2 | 39 |
| 37 | 86 | 156 | 109 | 74 | 125 | 113 | 33 | 85 | 84 | 16 | 73 | 143 | 154 | 68 | 62 | 50 | 19 | 172 | 131 | 133 | 118 |
| 176 | 177 | 178 | 179 | | | | | | | | | | | | | | | | | | |

FIG. 275

256QAM CR 10/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 45 | 31 | 67 | 35 | 159 | 157 | 177 | 2 | 44 | 23 | 73 | 148 | 163 | 118 | 176 | 4 | 14 | 97 | 142 | 37 | 143 | 149 |
| 179 | 3 | 12 | 32 | 140 | 42 | 167 | 166 | 41 | 126 | 13 | 30 | 144 | 57 | 113 | 147 | 173 | 6 | 52 | 24 | 39 | 64 |
| 80 | 112 | 104 | 174 | 11 | 151 | 71 | 109 | 162 | 79 | 171 | 127 | 46 | 92 | 38 | 132 | 81 | 120 | 100 | 1 | 53 | 88 |
| 76 | 60 | 103 | 139 | 99 | 125 | 48 | 93 | 135 | 161 | 77 | 110 | 107 | 121 | 18 | 95 | 69 | 63 | 83 | 111 | 170 | 7 |
| 16 | 98 | 141 | 61 | 86 | 116 | 172 | 130 | 49 | 25 | 40 | 65 | 87 | 108 | 101 | 5 | 21 | 89 | 75 | 43 | 82 | 146 |
| 105 | 128 | 17 | 29 | 106 | 34 | 160 | 155 | 175 | 124 | 15 | 28 | 134 | 62 | 119 | 145 | 72 | 10 | 58 | 91 | 74 | 36 |
| 68 | 150 | 8 | 9 | 54 | 26 | 137 | 56 | 165 | 115 | 114 | 0 | 47 | 27 | 22 | 20 | 168 | 154 | 102 | 123 | 50 | 94 |
| 66 | 33 | 85 | 59 | 164 | 131 | 51 | 90 | 70 | 138 | 84 | 117 | 178 | 122 | 19 | 96 | 156 | 55 | 78 | 158 | 169 | 129 |
| 133 | 152 | 136 | 153 | | | | | | | | | | | | | | | | | | |

⇩

CONVERTED PATTERN (A):

| | | | | | | | | | | | | | | | | | | | | | |
|---|---|---|---|---|---|---|---|---|---|---|---|---|---|---|---|---|---|---|---|---|---|
| 45 | 44 | 14 | 12 | 13 | 52 | 11 | 46 | 53 | 48 | 18 | 16 | 49 | 21 | 17 | 15 | 58 | 54 | 47 | 50 | 51 | 19 |
| 31 | 23 | 97 | 32 | 30 | 24 | 151 | 92 | 88 | 93 | 95 | 98 | 25 | 89 | 29 | 28 | 91 | 26 | 27 | 94 | 90 | 96 |
| 67 | 73 | 142 | 140 | 144 | 39 | 71 | 38 | 76 | 135 | 69 | 141 | 40 | 75 | 106 | 134 | 74 | 137 | 22 | 66 | 70 | 156 |
| 35 | 148 | 37 | 42 | 57 | 64 | 109 | 132 | 60 | 161 | 63 | 61 | 65 | 43 | 34 | 62 | 36 | 56 | 20 | 33 | 138 | 55 |
| 159 | 163 | 143 | 167 | 113 | 80 | 162 | 81 | 103 | 77 | 83 | 86 | 87 | 82 | 160 | 119 | 68 | 165 | 168 | 85 | 84 | 78 |
| 157 | 118 | 149 | 166 | 147 | 112 | 79 | 120 | 139 | 110 | 111 | 116 | 108 | 146 | 155 | 145 | 150 | 115 | 154 | 59 | 117 | 158 |
| 177 | 176 | 179 | 41 | 173 | 104 | 171 | 100 | 99 | 107 | 170 | 172 | 101 | 105 | 175 | 72 | 8 | 114 | 102 | 164 | 178 | 169 |
| 2 | 4 | 3 | 126 | 6 | 174 | 127 | 1 | 125 | 121 | 7 | 130 | 5 | 128 | 124 | 10 | 9 | 0 | 123 | 131 | 122 | 129 |
| 133 | 152 | 136 | 153 | | | | | | | | | | | | | | | | | | |

FIG. 276

256QAM CR 11/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 27 | 68 | 35 | 117 | 138 | 83 | 127 | 10 | 60 | 73 | 47 | 115 | 155 | 81 | 170 | 9 | 65 | 66 | 52 | 112 | 150 | 77 |
| 171 | 161 | 22 | 20 | 39 | 106 | 147 | 90 | 126 | 165 | 23 | 16 | 45 | 113 | 154 | 86 | 173 | 158 | 24 | 71 | 40 | 107 |
| 136 | 94 | 128 | 163 | 31 | 72 | 33 | 101 | 134 | 80 | 175 | 7 | 61 | 19 | 49 | 111 | 135 | 92 | 130 | 6 | 62 | 74 |
| 43 | 116 | 133 | 89 | 129 | 8 | 28 | 15 | 34 | 105 | 146 | 84 | 174 | 4 | 32 | 75 | 44 | 118 | 132 | 96 | 169 | 159 |
| 58 | 18 | 42 | 100 | 141 | 87 | 131 | 157 | 63 | 11 | 48 | 108 | 151 | 79 | 177 | 168 | 26 | 17 | 36 | 102 | 137 | 95 |
| 122 | 1 | 25 | 21 | 50 | 120 | 153 | 97 | 121 | 0 | 55 | 14 | 46 | 114 | 152 | 91 | 178 | 3 | 30 | 13 | 37 | 103 |
| 145 | 82 | 125 | 166 | 57 | 76 | 51 | 99 | 144 | 85 | 123 | 162 | 56 | 12 | 53 | 119 | 139 | 78 | 179 | 5 | 64 | 70 |
| 54 | 110 | 148 | 93 | 172 | 164 | 29 | 69 | 38 | 109 | 143 | 88 | 124 | 160 | 59 | 67 | 41 | 104 | 149 | 98 | 176 | 2 |
| 167 | 156 | 140 | 142 | | | | | | | | | | | | | | | | | | |

⇩

CONVERTED PATTERN (A):

| | | | | | | | | | | | | | | | | | | | | | |
|---|---|---|---|---|---|---|---|---|---|---|---|---|---|---|---|---|---|---|---|---|---|
| 27 | 60 | 65 | 22 | 23 | 24 | 31 | 61 | 62 | 28 | 32 | 58 | 63 | 26 | 25 | 55 | 30 | 57 | 56 | 64 | 29 | 59 |
| 68 | 73 | 66 | 20 | 16 | 71 | 72 | 19 | 74 | 15 | 75 | 18 | 11 | 17 | 21 | 14 | 13 | 76 | 12 | 70 | 69 | 67 |
| 35 | 47 | 52 | 39 | 45 | 40 | 33 | 49 | 43 | 34 | 44 | 42 | 48 | 36 | 50 | 46 | 37 | 51 | 53 | 54 | 38 | 41 |
| 117 | 115 | 112 | 106 | 113 | 107 | 101 | 111 | 116 | 105 | 118 | 100 | 108 | 102 | 120 | 114 | 103 | 99 | 119 | 110 | 109 | 104 |
| 138 | 155 | 150 | 147 | 154 | 136 | 134 | 135 | 133 | 146 | 132 | 141 | 151 | 137 | 153 | 152 | 145 | 144 | 139 | 148 | 143 | 149 |
| 83 | 81 | 77 | 90 | 86 | 94 | 80 | 92 | 89 | 84 | 96 | 87 | 79 | 95 | 97 | 91 | 82 | 85 | 78 | 93 | 88 | 98 |
| 127 | 170 | 171 | 126 | 173 | 128 | 175 | 130 | 129 | 174 | 169 | 131 | 177 | 122 | 121 | 178 | 125 | 123 | 179 | 172 | 124 | 176 |
| 10 | 9 | 161 | 165 | 158 | 163 | 7 | 6 | 8 | 4 | 159 | 157 | 168 | 1 | 0 | 3 | 166 | 162 | 5 | 164 | 160 | 2 |
| 167 | 156 | 140 | 142 | | | | | | | | | | | | | | | | | | |

FIG. 277

256QAM CR 12/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 51 | 122 | 91 | 111 | 95 | 100 | 119 | 130 | 78 | 57 | 65 | 26 | 61 | 126 | 105 | 143 | 70 | 132 | 39 | 102 | 115 | 116 |
| 6 | 14 | 3 | 21 | 71 | 134 | 2 | 0 | 140 | 106 | 7 | 118 | 23 | 35 | 20 | 17 | 50 | 48 | 112 | 13 | 66 | 5 |
| 75 | 42 | 129 | 107 | 30 | 45 | 137 | 114 | 37 | 87 | 53 | 85 | 101 | 141 | 120 | 99 | 88 | 117 | 64 | 28 | 135 | 138 |
| 108 | 113 | 58 | 97 | 38 | 124 | 86 | 33 | 74 | 32 | 29 | 128 | 67 | 104 | 80 | 127 | 56 | 34 | 89 | 94 | 49 | 55 |
| 93 | 136 | 68 | 62 | 54 | 40 | 81 | 103 | 121 | 76 | 44 | 84 | 96 | 123 | 154 | 98 | 82 | 142 | 46 | 169 | 131 | 72 |
| 47 | 69 | 125 | 31 | 83 | 36 | 59 | 90 | 79 | 52 | 133 | 60 | 92 | 139 | 110 | 27 | 73 | 43 | 77 | 109 | 63 | 41 |
| 168 | 147 | 161 | 165 | 175 | 162 | 164 | 158 | 157 | 160 | 150 | 171 | 167 | 145 | 151 | 153 | 9 | 155 | 170 | 146 | 166 | 149 |
| 15 | 159 | 11 | 176 | 152 | 156 | 144 | 148 | 172 | 178 | 24 | 22 | 179 | 4 | 163 | 174 | 173 | 19 | 10 | 177 | 12 | 16 |
| 1 | 8 | 18 | 25 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 51 | 6 | 75 | 108 | 93 | 47 | 168 | 15 | 122 | 14 | 42 | 113 | 136 | 69 | 147 | 159 | 91 | 3 | 129 | 58 | 68 | 125 |
| 161 | 11 | 111 | 21 | 107 | 97 | 62 | 31 | 165 | 176 | 95 | 71 | 30 | 38 | 54 | 83 | 175 | 152 | 100 | 134 | 45 | 124 |
| 40 | 36 | 162 | 156 | 119 | 2 | 137 | 86 | 81 | 59 | 164 | 144 | 130 | 0 | 114 | 33 | 103 | 90 | 158 | 148 | 78 | 140 |
| 37 | 74 | 121 | 79 | 157 | 172 | 57 | 106 | 87 | 32 | 76 | 52 | 160 | 178 | 65 | 7 | 53 | 29 | 44 | 133 | 150 | 24 |
| 26 | 118 | 85 | 128 | 84 | 60 | 171 | 22 | 61 | 23 | 101 | 67 | 96 | 92 | 167 | 179 | 126 | 35 | 141 | 104 | 123 | 139 |
| 145 | 4 | 105 | 20 | 120 | 80 | 154 | 110 | 151 | 163 | 143 | 17 | 99 | 127 | 98 | 27 | 153 | 174 | 70 | 50 | 88 | 56 |
| 82 | 73 | 9 | 173 | 132 | 48 | 117 | 34 | 142 | 43 | 155 | 19 | 39 | 112 | 64 | 89 | 46 | 77 | 170 | 10 | 102 | 13 |
| 28 | 94 | 169 | 109 | 146 | 177 | 115 | 66 | 135 | 49 | 131 | 63 | 166 | 12 | 116 | 5 | 138 | 55 | 72 | 41 | 149 | 16 |
| 1 | 8 | 18 | 25 | | | | | | | | | | | | | | | | | | |

FIG. 278

256QAM CR 13/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 59 | 85 | 108 | 128 | 49 | 91 | 163 | 3 | 58 | 16 | 106 | 126 | 74 | 141 | 167 | 35 | 57 | 82 | 30 | 123 | 68 | 95 |
| 160 | 42 | 62 | 21 | 102 | 131 | 52 | 142 | 157 | 10 | 55 | 79 | 24 | 130 | 73 | 92 | 179 | 2 | 61 | 11 | 104 | 122 |
| 45 | 140 | 159 | 43 | 148 | 19 | 23 | 111 | 76 | 135 | 169 | 39 | 63 | 77 | 25 | 117 | 75 | 94 | 155 | 5 | 145 | 14 |
| 26 | 127 | 46 | 138 | 158 | 38 | 64 | 86 | 105 | 118 | 50 | 137 | 175 | 7 | 144 | 84 | 22 | 113 | 54 | 98 | 172 | 9 |
| 146 | 17 | 27 | 114 | 51 | 139 | 156 | 37 | 147 | 78 | 103 | 115 | 66 | 97 | 168 | 34 | 60 | 83 | 107 | 121 | 48 | 93 |
| 174 | 33 | 65 | 87 | 99 | 124 | 71 | 136 | 154 | 0 | 150 | 20 | 101 | 112 | 70 | 96 | 170 | 1 | 149 | 80 | 28 | 125 |
| 53 | 90 | 173 | 6 | 153 | 13 | 29 | 116 | 72 | 88 | 165 | 8 | 143 | 12 | 31 | 119 | 47 | 89 | 164 | 40 | 151 | 81 |
| 109 | 110 | 44 | 134 | 162 | 36 | 152 | 15 | 100 | 129 | 67 | 133 | 166 | 41 | 56 | 18 | 32 | 120 | 69 | 132 | 161 | 4 |
| 177 | 176 | 178 | 171 | | | | | | | | | | | | | | | | | | |

⇩

CONVERTED PATTERN (A):

| | | | | | | | | | | | | | | | | | | | | | |
|---|---|---|---|---|---|---|---|---|---|---|---|---|---|---|---|---|---|---|---|---|---|
| 59 | 58 | 57 | 62 | 55 | 61 | 148 | 63 | 145 | 64 | 144 | 146 | 147 | 60 | 65 | 150 | 149 | 153 | 143 | 151 | 152 | 56 |
| 85 | 16 | 82 | 21 | 79 | 11 | 19 | 77 | 14 | 86 | 84 | 17 | 78 | 83 | 87 | 20 | 80 | 13 | 12 | 81 | 15 | 18 |
| 108 | 106 | 30 | 102 | 24 | 104 | 23 | 25 | 26 | 105 | 22 | 27 | 103 | 107 | 99 | 101 | 28 | 29 | 31 | 109 | 100 | 32 |
| 128 | 126 | 123 | 131 | 130 | 122 | 111 | 117 | 127 | 118 | 113 | 114 | 115 | 121 | 124 | 112 | 125 | 116 | 119 | 110 | 129 | 120 |
| 49 | 74 | 68 | 52 | 73 | 45 | 76 | 75 | 46 | 50 | 54 | 51 | 66 | 48 | 71 | 70 | 53 | 72 | 47 | 44 | 67 | 69 |
| 91 | 141 | 95 | 142 | 92 | 140 | 135 | 94 | 138 | 137 | 98 | 139 | 97 | 93 | 136 | 96 | 90 | 88 | 89 | 134 | 133 | 132 |
| 163 | 167 | 160 | 157 | 179 | 159 | 169 | 155 | 158 | 175 | 172 | 156 | 168 | 174 | 154 | 170 | 173 | 165 | 164 | 162 | 166 | 161 |
| 3 | 35 | 42 | 10 | 2 | 43 | 39 | 5 | 38 | 7 | 9 | 37 | 34 | 33 | 0 | 1 | 6 | 8 | 40 | 36 | 41 | 4 |
| 177 | 176 | 178 | 171 | | | | | | | | | | | | | | | | | | |

FIG. 279

1024QAM CR 2/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 157 | 25 | 107 | 160 | 37 | 138 | 111 | 35 | 29 | 44 | 15 | 162 | 66 | 20 | 49 | 126 | 89 | 147 | 159 | 174 | 142 | 26 |
| 146 | 10 | 164 | 152 | 57 | 110 | 83 | 167 | 169 | 16 | 6 | 172 | 62 | 173 | 7 | 145 | 4 | 67 | 115 | 50 | 39 | 72 |
| 79 | 74 | 40 | 132 | 42 | 30 | 163 | 161 | 55 | 143 | 63 | 117 | 86 | 121 | 2 | 28 | 69 | 150 | 24 | 177 | 43 | 158 |
| 27 | 21 | 128 | 46 | 118 | 114 | 127 | 135 | 92 | 76 | 19 | 94 | 179 | 3 | 52 | 101 | 137 | 84 | 73 | 108 | 91 | 120 |
| 47 | 1 | 102 | 58 | 68 | 82 | 59 | 119 | 64 | 31 | 61 | 105 | 103 | 151 | 124 | 70 | 8 | 155 | 90 | 166 | 41 | 45 |
| 178 | 113 | 140 | 75 | 148 | 109 | 100 | 125 | 11 | 116 | 34 | 36 | 176 | 170 | 156 | 136 | 171 | 122 | 78 | 87 | 106 | 123 |
| 149 | 17 | 99 | 175 | 18 | 9 | 165 | 153 | 12 | 81 | 77 | 60 | 93 | 104 | 13 | 5 | 88 | 96 | 141 | 133 | 154 | 144 |
| 48 | 97 | 23 | 14 | 98 | 53 | 134 | 112 | 65 | 0 | 130 | 32 | 168 | 33 | 131 | 22 | 38 | 56 | 80 | 95 | 71 | 85 |
| 139 | 129 | 51 | 54 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 157 | 159 | 7 | 63 | 127 | 102 | 41 | 171 | 93 | 65 | 25 | 174 | 145 | 117 | 135 | 58 | 45 | 122 | 104 | 0 | 107 | 142 |
| 4 | 86 | 92 | 68 | 178 | 78 | 13 | 130 | 160 | 26 | 67 | 121 | 76 | 82 | 113 | 87 | 5 | 32 | 37 | 146 | 115 | 2 |
| 19 | 59 | 140 | 106 | 88 | 168 | 138 | 10 | 50 | 28 | 94 | 119 | 75 | 123 | 96 | 33 | 111 | 164 | 39 | 69 | 179 | 64 |
| 148 | 149 | 141 | 131 | 35 | 152 | 72 | 150 | 3 | 31 | 109 | 17 | 133 | 22 | 29 | 57 | 79 | 24 | 52 | 61 | 100 | 99 |
| 154 | 38 | 44 | 110 | 74 | 177 | 101 | 105 | 125 | 175 | 144 | 56 | 15 | 83 | 40 | 43 | 137 | 103 | 11 | 18 | 48 | 80 |
| 162 | 167 | 132 | 158 | 84 | 151 | 116 | 9 | 97 | 95 | 66 | 169 | 42 | 27 | 73 | 124 | 34 | 165 | 23 | 71 | 20 | 16 |
| 30 | 21 | 108 | 70 | 36 | 153 | 14 | 85 | 49 | 6 | 163 | 128 | 91 | 8 | 176 | 12 | 98 | 139 | 126 | 172 | 161 | 46 |
| 120 | 155 | 170 | 81 | 53 | 129 | 89 | 62 | 55 | 118 | 47 | 90 | 156 | 77 | 134 | 51 | 147 | 173 | 143 | 114 | 1 | 166 |
| 136 | 60 | 112 | 54 | | | | | | | | | | | | | | | | | | |

FIG. 280

1024QAM CR 3/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 113 | 153 | 13 | 8 | 103 | 115 | 137 | 69 | 151 | 111 | 18 | 38 | 42 | 150 | 179 | 130 | 148 | 6 | 4 | 31 | 44 | 68 |
| 145 | 126 | 106 | 24 | 100 | 93 | 21 | 35 | 143 | 57 | 166 | 65 | 53 | 41 | 122 | 7 | 29 | 25 | 136 | 162 | 158 | 26 |
| 124 | 32 | 17 | 168 | 56 | 12 | 39 | 176 | 131 | 132 | 51 | 89 | 101 | 160 | 49 | 87 | 14 | 55 | 127 | 37 | 169 | 110 |
| 83 | 134 | 107 | 46 | 33 | 114 | 108 | 82 | 125 | 109 | 95 | 174 | 62 | 164 | 144 | 16 | 121 | 58 | 80 | 2 | 163 | 159 |
| 157 | 90 | 104 | 23 | 172 | 112 | 19 | 133 | 102 | 75 | 45 | 86 | 63 | 22 | 54 | 105 | 155 | 77 | 178 | 70 | 98 | 40 |
| 118 | 84 | 78 | 0 | 99 | 123 | 5 | 34 | 71 | 96 | 175 | 10 | 30 | 72 | 28 | 74 | 154 | 61 | 91 | 85 | 135 | 152 |
| 15 | 88 | 165 | 60 | 52 | 149 | 147 | 59 | 116 | 120 | 3 | 64 | 140 | 67 | 94 | 27 | 9 | 81 | 43 | 11 | 167 | 139 |
| 92 | 129 | 20 | 117 | 128 | 50 | 119 | 47 | 1 | 156 | 142 | 170 | 171 | 48 | 177 | 66 | 161 | 79 | 73 | 76 | 173 | 97 |
| 36 | 141 | 146 | 138 | | | | | | | | | | | | | | | | | | |

CONVERTED PATTERN (B):

| | | | | | | | | | | | | | | | | | | | | | |
|---|---|---|---|---|---|---|---|---|---|---|---|---|---|---|---|---|---|---|---|---|---|
| 113 | 4 | 122 | 51 | 108 | 104 | 98 | 154 | 140 | 1 | 153 | 31 | 7 | 89 | 82 | 23 | 40 | 61 | 67 | 156 | 13 | 44 |
| 29 | 101 | 125 | 172 | 118 | 91 | 94 | 142 | 8 | 68 | 25 | 160 | 109 | 112 | 84 | 85 | 27 | 170 | 103 | 145 | 136 | 49 |
| 95 | 19 | 78 | 135 | 9 | 171 | 115 | 126 | 162 | 87 | 174 | 133 | 0 | 152 | 81 | 48 | 137 | 106 | 158 | 14 | 62 | 102 |
| 99 | 15 | 43 | 177 | 69 | 24 | 26 | 55 | 164 | 75 | 123 | 88 | 11 | 66 | 151 | 100 | 124 | 127 | 144 | 45 | 5 | 165 |
| 167 | 161 | 111 | 93 | 32 | 37 | 16 | 86 | 34 | 60 | 139 | 79 | 18 | 21 | 17 | 169 | 121 | 63 | 71 | 52 | 92 | 73 |
| 38 | 35 | 168 | 110 | 58 | 22 | 96 | 149 | 129 | 76 | 42 | 143 | 56 | 83 | 80 | 54 | 175 | 147 | 20 | 173 | 150 | 57 |
| 12 | 134 | 2 | 105 | 10 | 59 | 117 | 97 | 179 | 166 | 39 | 107 | 163 | 155 | 30 | 116 | 128 | 36 | 130 | 65 | 176 | 46 |
| 159 | 77 | 72 | 120 | 50 | 141 | 148 | 53 | 131 | 33 | 157 | 178 | 28 | 3 | 119 | 146 | 6 | 41 | 132 | 114 | 90 | 70 |
| 74 | 64 | 47 | 138 | | | | | | | | | | | | | | | | | | |

FIG. 281

1024QAM CR 4/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 114 | 133 | 4 | 73 | 8 | 139 | 7 | 5 | 177 | 88 | 66 | 11 | 24 | 74 | 49 | 45 | 167 | 81 | 117 | 137 | 46 | 22 |
| 165 | 51 | 68 | 110 | 6 | 1 | 16 | 132 | 130 | 143 | 169 | 2 | 20 | 140 | 94 | 21 | 91 | 126 | 172 | 27 | 162 | 34 |
| 113 | 142 | 166 | 115 | 106 | 160 | 84 | 136 | 175 | 0 | 26 | 151 | 69 | 174 | 59 | 159 | 161 | 170 | 52 | 164 | 80 | 108 |
| 3 | 23 | 101 | 33 | 125 | 111 | 63 | 124 | 98 | 40 | 145 | 9 | 39 | 155 | 149 | 147 | 67 | 76 | 48 | 120 | 119 | 53 |
| 54 | 138 | 179 | 156 | 127 | 13 | 152 | 129 | 123 | 141 | 109 | 89 | 121 | 50 | 10 | 37 | 104 | 144 | 86 | 178 | 96 | 148 |
| 128 | 56 | 64 | 153 | 95 | 12 | 105 | 41 | 154 | 99 | 25 | 171 | 92 | 17 | 134 | 19 | 61 | 32 | 85 | 102 | 14 | 71 |
| 146 | 163 | 173 | 118 | 57 | 18 | 36 | 42 | 78 | 31 | 97 | 55 | 58 | 116 | 90 | 168 | 43 | 72 | 15 | 112 | 93 | 60 |
| 38 | 103 | 87 | 158 | 35 | 29 | 176 | 150 | 77 | 79 | 122 | 47 | 28 | 135 | 100 | 83 | 65 | 131 | 75 | 157 | 62 | 70 |
| 44 | 30 | 107 | 82 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 114 | 117 | 94 | 26 | 63 | 179 | 96 | 61 | 58 | 77 | 133 | 137 | 21 | 151 | 124 | 156 | 148 | 32 | 116 | 79 | 4 | 46 |
| 91 | 69 | 98 | 127 | 128 | 85 | 90 | 122 | 73 | 22 | 126 | 174 | 40 | 13 | 56 | 102 | 168 | 47 | 8 | 165 | 172 | 59 |
| 145 | 152 | 64 | 14 | 43 | 28 | 139 | 51 | 27 | 159 | 9 | 129 | 153 | 71 | 72 | 135 | 7 | 68 | 162 | 161 | 39 | 123 |
| 95 | 146 | 15 | 100 | 5 | 110 | 34 | 170 | 155 | 141 | 12 | 163 | 112 | 83 | 177 | 6 | 113 | 52 | 149 | 109 | 105 | 173 |
| 93 | 65 | 88 | 1 | 142 | 164 | 147 | 89 | 41 | 118 | 60 | 131 | 66 | 16 | 166 | 80 | 67 | 121 | 154 | 57 | 38 | 75 |
| 11 | 132 | 115 | 108 | 76 | 50 | 99 | 18 | 103 | 157 | 24 | 130 | 106 | 3 | 48 | 10 | 25 | 36 | 87 | 62 | 74 | 143 |
| 160 | 23 | 120 | 37 | 171 | 42 | 158 | 70 | 49 | 169 | 84 | 101 | 119 | 104 | 92 | 78 | 35 | 44 | 45 | 2 | 136 | 33 |
| 53 | 144 | 17 | 31 | 29 | 30 | 167 | 20 | 175 | 125 | 54 | 86 | 134 | 97 | 176 | 107 | 81 | 140 | 0 | 111 | 138 | 178 |
| 19 | 55 | 150 | 82 | | | | | | | | | | | | | | | | | | |

FIG. 282

1024QAM CR 5/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 128 | 4 | 162 | 8 | 77 | 29 | 91 | 44 | 176 | 107 | 149 | 1 | 150 | 9 | 119 | 99 | 71 | 124 | 104 | 41 | 62 | 5 |
| 118 | 50 | 174 | 54 | 111 | 40 | 156 | 92 | 46 | 11 | 17 | 52 | 47 | 97 | 179 | 24 | 153 | 145 | 129 | 2 | 12 | 88 |
| 101 | 139 | 114 | 69 | 96 | 32 | 134 | 55 | 167 | 132 | 123 | 136 | 112 | 102 | 159 | 31 | 87 | 141 | 15 | 61 | 84 | 98 |
| 37 | 63 | 20 | 85 | 53 | 7 | 39 | 117 | 170 | 138 | 116 | 126 | 161 | 120 | 57 | 13 | 76 | 6 | 121 | 155 | 175 | 38 |
| 158 | 35 | 86 | 78 | 10 | 103 | 166 | 95 | 125 | 172 | 67 | 30 | 177 | 73 | 151 | 169 | 163 | 23 | 108 | 43 | 81 | 157 |
| 58 | 105 | 65 | 26 | 122 | 135 | 146 | 72 | 142 | 34 | 133 | 0 | 148 | 89 | 168 | 60 | 109 | 83 | 18 | 27 | 131 | 70 |
| 56 | 48 | 64 | 93 | 68 | 127 | 21 | 75 | 110 | 80 | 14 | 49 | 82 | 143 | 115 | 178 | 154 | 100 | 59 | 74 | 152 | 51 |
| 137 | 140 | 36 | 42 | 19 | 25 | 94 | 45 | 164 | 16 | 113 | 79 | 22 | 28 | 66 | 106 | 130 | 171 | 147 | 90 | 144 | 165 |
| 3 | 173 | 160 | 33 | | | | | | | | | | | | | | | | | | |

⇩

CONVERTED PATTERN (A):

| | | | | | | | | | | | | | | | | | | | | | |
|---|---|---|---|---|---|---|---|---|---|---|---|---|---|---|---|---|---|---|---|---|---|
| 128 | 149 | 62 | 46 | 129 | 134 | 87 | 53 | 57 | 86 | 177 | 58 | 133 | 131 | 110 | 59 | 94 | 130 | 4 | 1 | 5 | 11 |
| 2 | 55 | 141 | 7 | 13 | 78 | 73 | 105 | 0 | 70 | 80 | 74 | 45 | 171 | 162 | 150 | 118 | 17 | 12 | 167 | 15 | 39 |
| 76 | 10 | 151 | 65 | 148 | 56 | 14 | 152 | 164 | 147 | 8 | 9 | 50 | 52 | 88 | 132 | 61 | 117 | 6 | 103 | 169 | 26 |
| 89 | 48 | 49 | 51 | 16 | 90 | 77 | 119 | 174 | 47 | 101 | 123 | 84 | 170 | 121 | 166 | 163 | 122 | 168 | 64 | 82 | 137 |
| 113 | 144 | 29 | 99 | 54 | 97 | 139 | 136 | 98 | 138 | 155 | 95 | 23 | 135 | 60 | 93 | 143 | 140 | 79 | 165 | 91 | 71 |
| 111 | 179 | 114 | 112 | 37 | 116 | 175 | 125 | 108 | 146 | 109 | 68 | 115 | 36 | 22 | 3 | 44 | 124 | 40 | 24 | 69 | 102 |
| 63 | 126 | 38 | 172 | 43 | 72 | 83 | 127 | 178 | 42 | 28 | 173 | 176 | 104 | 156 | 153 | 96 | 159 | 20 | 161 | 158 | 67 |
| 81 | 142 | 18 | 21 | 154 | 19 | 66 | 160 | 107 | 41 | 92 | 145 | 32 | 31 | 85 | 120 | 35 | 30 | 157 | 34 | 27 | 75 |
| 100 | 25 | 106 | 33 | | | | | | | | | | | | | | | | | | |

FIG. 283

1024QAM CR 6/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 66 | 21 | 51 | 55 | 54 | 24 | 33 | 12 | 70 | 63 | 47 | 65 | 145 | 8 | 0 | 57 | 23 | 71 | 59 | 14 | 40 | 42 |
| 62 | 56 | 2 | 43 | 64 | 58 | 67 | 53 | 68 | 61 | 39 | 52 | 69 | 1 | 22 | 31 | 161 | 38 | 30 | 19 | 17 | 18 |
| 4 | 41 | 25 | 44 | 136 | 29 | 36 | 26 | 126 | 177 | 15 | 37 | 148 | 9 | 13 | 45 | 46 | 152 | 50 | 49 | 27 | 77 |
| 60 | 35 | 48 | 178 | 28 | 34 | 106 | 127 | 76 | 131 | 105 | 138 | 75 | 130 | 101 | 167 | 117 | 173 | 113 | 108 | 92 | 135 |
| 124 | 121 | 97 | 149 | 143 | 81 | 32 | 96 | 3 | 78 | 107 | 86 | 98 | 16 | 162 | 150 | 111 | 158 | 172 | 139 | 74 | 142 |
| 166 | 7 | 5 | 119 | 20 | 144 | 151 | 90 | 11 | 156 | 100 | 175 | 83 | 155 | 159 | 128 | 88 | 87 | 93 | 103 | 94 | 140 |
| 165 | 6 | 137 | 157 | 10 | 85 | 141 | 129 | 146 | 122 | 73 | 112 | 132 | 125 | 174 | 169 | 168 | 79 | 84 | 118 | 179 | 147 |
| 91 | 160 | 163 | 115 | 89 | 80 | 102 | 104 | 134 | 82 | 95 | 133 | 164 | 154 | 120 | 110 | 170 | 114 | 153 | 72 | 109 | 171 |
| 176 | 99 | 116 | 123 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 66 | 59 | 22 | 15 | 106 | 97 | 74 | 88 | 132 | 134 | 21 | 14 | 31 | 37 | 127 | 149 | 142 | 87 | 125 | 82 | 51 | 40 |
| 161 | 148 | 76 | 143 | 166 | 93 | 174 | 95 | 55 | 42 | 38 | 9 | 131 | 81 | 7 | 103 | 169 | 133 | 54 | 62 | 30 | 13 |
| 105 | 32 | 5 | 94 | 168 | 164 | 24 | 56 | 19 | 45 | 138 | 96 | 119 | 140 | 79 | 154 | 33 | 2 | 17 | 46 | 75 | 3 |
| 20 | 165 | 84 | 120 | 12 | 43 | 18 | 152 | 130 | 78 | 144 | 6 | 118 | 110 | 70 | 64 | 4 | 50 | 101 | 107 | 151 | 137 |
| 179 | 170 | 63 | 58 | 41 | 49 | 167 | 86 | 90 | 157 | 147 | 114 | 47 | 67 | 25 | 27 | 117 | 98 | 11 | 10 | 91 | 153 |
| 65 | 53 | 44 | 77 | 173 | 16 | 156 | 85 | 160 | 72 | 145 | 68 | 136 | 60 | 113 | 162 | 100 | 141 | 163 | 109 | 8 | 61 |
| 29 | 35 | 108 | 150 | 175 | 129 | 115 | 171 | 0 | 39 | 36 | 48 | 92 | 111 | 83 | 146 | 89 | 176 | 57 | 52 | 26 | 178 |
| 135 | 158 | 155 | 122 | 80 | 99 | 23 | 69 | 126 | 28 | 124 | 172 | 159 | 73 | 102 | 116 | 71 | 1 | 177 | 34 | 121 | 139 |
| 128 | 112 | 104 | 123 | | | | | | | | | | | | | | | | | | |

FIG. 284

1024QAM CR 7/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 117 | 61 | 46 | 179 | 24 | 161 | 142 | 133 | 11 | 6 | 121 | 44 | 103 | 76 | 22 | 63 | 136 | 151 | 33 | 8 | 123 | 60 |
| 105 | 175 | 18 | 160 | 138 | 147 | 10 | 0 | 125 | 57 | 49 | 75 | 21 | 154 | 140 | 150 | 9 | 169 | 124 | 55 | 48 | 173 |
| 23 | 157 | 97 | 129 | 30 | 7 | 122 | 54 | 99 | 74 | 19 | 153 | 94 | 128 | 15 | 170 | 87 | 59 | 51 | 80 | 111 | 64 |
| 137 | 146 | 13 | 2 | 83 | 62 | 45 | 176 | 108 | 71 | 91 | 131 | 34 | 168 | 82 | 56 | 102 | 72 | 26 | 155 | 92 | 132 |
| 31 | 166 | 119 | 36 | 101 | 178 | 113 | 67 | 98 | 152 | 14 | 5 | 118 | 41 | 104 | 177 | 114 | 70 | 96 | 134 | 32 | 162 |
| 84 | 40 | 100 | 174 | 110 | 158 | 93 | 149 | 27 | 4 | 86 | 38 | 53 | 77 | 115 | 159 | 143 | 130 | 35 | 163 | 89 | 58 |
| 106 | 73 | 20 | 66 | 90 | 127 | 16 | 3 | 85 | 37 | 107 | 172 | 116 | 156 | 95 | 144 | 17 | 165 | 81 | 43 | 50 | 78 |
| 109 | 68 | 135 | 126 | 29 | 167 | 120 | 39 | 47 | 171 | 112 | 69 | 141 | 145 | 28 | 1 | 88 | 42 | 52 | 79 | 25 | 65 |
| 139 | 148 | 12 | 164 | | | | | | | | | | | | | | | | | | |

⇩

CONVERTED PATTERN (A):

| | | | | | | | | | | | | | | | | | | | | | |
|---|---|---|---|---|---|---|---|---|---|---|---|---|---|---|---|---|---|---|---|---|---|
| 117 | 121 | 123 | 125 | 124 | 122 | 87 | 83 | 82 | 119 | 118 | 84 | 86 | 89 | 85 | 81 | 120 | 88 | 61 | 44 | 60 | 57 |
| 55 | 54 | 59 | 62 | 56 | 36 | 41 | 40 | 38 | 58 | 37 | 43 | 39 | 42 | 46 | 103 | 105 | 49 | 48 | 99 | 51 | 45 |
| 102 | 101 | 104 | 100 | 53 | 106 | 107 | 50 | 47 | 52 | 179 | 76 | 175 | 75 | 173 | 74 | 80 | 176 | 72 | 178 | 177 | 174 |
| 77 | 73 | 172 | 78 | 171 | 79 | 24 | 22 | 18 | 21 | 23 | 19 | 111 | 108 | 26 | 113 | 114 | 110 | 115 | 20 | 116 | 109 |
| 112 | 25 | 161 | 63 | 160 | 154 | 157 | 153 | 64 | 71 | 155 | 67 | 70 | 158 | 159 | 66 | 156 | 68 | 69 | 65 | 142 | 136 |
| 138 | 140 | 97 | 94 | 137 | 91 | 92 | 98 | 96 | 93 | 143 | 90 | 95 | 135 | 141 | 139 | 133 | 151 | 147 | 150 | 129 | 128 |
| 146 | 131 | 132 | 152 | 134 | 149 | 130 | 127 | 144 | 126 | 145 | 148 | 11 | 33 | 10 | 9 | 30 | 15 | 13 | 34 | 31 | 14 |
| 32 | 27 | 35 | 16 | 17 | 29 | 28 | 12 | 6 | 8 | 0 | 169 | 7 | 170 | 2 | 168 | 166 | 5 | 162 | 4 | 163 | 3 |
| 165 | 167 | 1 | 164 | | | | | | | | | | | | | | | | | | |

FIG. 285

1024QAM CR 8/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 77 | 48 | 82 | 51 | 57 | 69 | 65 | 6 | 71 | 90 | 84 | 81 | 50 | 88 | 61 | 55 | 53 | 73 | 39 | 13 | 79 | 75 |
| 41 | 18 | 38 | 89 | 49 | 93 | 36 | 64 | 47 | 40 | 42 | 76 | 70 | 56 | 3 | 72 | 2 | 54 | 52 | 145 | 19 | 78 |
| 80 | 63 | 87 | 67 | 86 | 10 | 1 | 58 | 17 | 14 | 175 | 91 | 68 | 85 | 94 | 15 | 43 | 74 | 60 | 66 | 37 | 92 |
| 4 | 9 | 16 | 83 | 46 | 44 | 102 | 30 | 112 | 122 | 110 | 29 | 20 | 105 | 138 | 101 | 174 | 33 | 137 | 136 | 131 | 166 |
| 59 | 34 | 62 | 125 | 28 | 26 | 45 | 24 | 23 | 21 | 157 | 98 | 35 | 95 | 22 | 32 | 103 | 27 | 113 | 31 | 119 | 173 |
| 168 | 118 | 120 | 114 | 149 | 159 | 155 | 179 | 160 | 161 | 130 | 123 | 172 | 139 | 124 | 153 | 0 | 109 | 167 | 128 | 107 | 117 |
| 147 | 177 | 96 | 164 | 152 | 11 | 148 | 158 | 129 | 163 | 176 | 151 | 171 | 8 | 106 | 144 | 150 | 169 | 108 | 162 | 143 | 111 |
| 141 | 133 | 178 | 134 | 146 | 99 | 132 | 142 | 104 | 115 | 135 | 121 | 100 | 12 | 170 | 156 | 126 | 5 | 127 | 154 | 97 | 140 |
| 116 | 165 | 7 | 25 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 77 | 39 | 3 | 175 | 102 | 62 | 119 | 0 | 171 | 104 | 48 | 13 | 72 | 91 | 30 | 125 | 173 | 109 | 8 | 115 | 82 | 79 |
| 2 | 68 | 112 | 28 | 168 | 167 | 106 | 135 | 51 | 75 | 54 | 85 | 122 | 26 | 118 | 128 | 144 | 121 | 57 | 41 | 52 | 94 |
| 110 | 45 | 120 | 107 | 150 | 100 | 69 | 18 | 145 | 15 | 29 | 24 | 114 | 117 | 169 | 12 | 65 | 38 | 19 | 43 | 20 | 23 |
| 149 | 147 | 108 | 170 | 6 | 89 | 78 | 74 | 105 | 21 | 159 | 177 | 162 | 156 | 71 | 49 | 80 | 60 | 138 | 157 | 155 | 96 |
| 143 | 126 | 90 | 93 | 63 | 66 | 101 | 98 | 179 | 164 | 111 | 5 | 84 | 36 | 87 | 37 | 174 | 35 | 160 | 152 | 141 | 127 |
| 81 | 64 | 67 | 92 | 33 | 95 | 161 | 11 | 133 | 154 | 50 | 47 | 86 | 4 | 137 | 22 | 130 | 148 | 178 | 97 | 88 | 40 |
| 10 | 9 | 136 | 32 | 123 | 158 | 134 | 140 | 61 | 42 | 1 | 16 | 131 | 103 | 172 | 129 | 146 | 116 | 55 | 76 | 58 | 83 |
| 166 | 27 | 139 | 163 | 99 | 165 | 53 | 70 | 17 | 46 | 59 | 113 | 124 | 176 | 132 | 7 | 73 | 56 | 14 | 44 | 34 | 31 |
| 153 | 151 | 142 | 25 | | | | | | | | | | | | | | | | | | |

FIG. 286

1024QAM CR 9/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 42 | 36 | 135 | 126 | 3 | 17 | 82 | 87 | 172 | 32 | 65 | 70 | 143 | 131 | 10 | 1 | 85 | 147 | 31 | 176 | 66 | 47 |
| 97 | 128 | 8 | 9 | 146 | 73 | 162 | 164 | 57 | 64 | 139 | 91 | 5 | 110 | 150 | 83 | 18 | 27 | 48 | 45 | 133 | 132 |
| 111 | 124 | 89 | 78 | 177 | 19 | 46 | 50 | 102 | 103 | 122 | 4 | 74 | 161 | 175 | 34 | 60 | 58 | 136 | 100 | 115 | 118 |
| 81 | 75 | 28 | 21 | 40 | 61 | 140 | 138 | 113 | 112 | 157 | 151 | 23 | 30 | 69 | 41 | 94 | 96 | 7 | 109 | 152 | 149 |
| 33 | 179 | 71 | 43 | 92 | 105 | 12 | 13 | 154 | 159 | 178 | 24 | 44 | 49 | 107 | 98 | 16 | 2 | 76 | 155 | 35 | 168 |
| 62 | 56 | 129 | 141 | 116 | 123 | 160 | 77 | 25 | 170 | 54 | 39 | 90 | 95 | 121 | 11 | 72 | 153 | 169 | 167 | 51 | 67 |
| 104 | 134 | 0 | 117 | 79 | 80 | 26 | 29 | 37 | 55 | 99 | 142 | 108 | 114 | 86 | 88 | 166 | 163 | 59 | 63 | 101 | 93 |
| 119 | 15 | 144 | 145 | 165 | 22 | 52 | 53 | 130 | 137 | 125 | 6 | 158 | 84 | 20 | 174 | 38 | 68 | 127 | 106 | 14 | 120 |
| 148 | 156 | 171 | 173 | | | | | | | | | | | | | | | | | | |

⇩

CONVERTED PATTERN (A):

| | | | | | | | | | | | | | | | | | | | | | |
|---|---|---|---|---|---|---|---|---|---|---|---|---|---|---|---|---|---|---|---|---|---|
| 42 | 65 | 66 | 57 | 48 | 46 | 60 | 40 | 69 | 71 | 44 | 62 | 54 | 51 | 37 | 59 | 52 | 38 | 36 | 70 | 47 | 64 |
| 45 | 50 | 58 | 61 | 41 | 43 | 49 | 56 | 39 | 67 | 55 | 63 | 53 | 68 | 135 | 143 | 97 | 139 | 133 | 102 | 136 | 140 |
| 94 | 92 | 107 | 129 | 90 | 104 | 99 | 101 | 130 | 127 | 126 | 131 | 128 | 91 | 132 | 103 | 100 | 138 | 96 | 105 | 98 | 141 |
| 95 | 134 | 142 | 93 | 137 | 106 | 3 | 10 | 8 | 5 | 111 | 122 | 115 | 113 | 7 | 12 | 16 | 116 | 121 | 0 | 108 | 119 |
| 125 | 14 | 17 | 1 | 9 | 110 | 124 | 4 | 118 | 112 | 109 | 13 | 2 | 123 | 11 | 117 | 114 | 15 | 6 | 120 | 82 | 85 |
| 146 | 150 | 89 | 74 | 81 | 157 | 152 | 154 | 76 | 160 | 72 | 79 | 86 | 144 | 158 | 148 | 87 | 147 | 73 | 83 | 78 | 161 |
| 75 | 151 | 149 | 159 | 155 | 77 | 153 | 80 | 88 | 145 | 84 | 156 | 172 | 31 | 162 | 18 | 177 | 175 | 28 | 23 | 33 | 178 |
| 35 | 25 | 169 | 26 | 166 | 165 | 20 | 171 | 32 | 176 | 164 | 27 | 19 | 34 | 21 | 30 | 179 | 24 | 168 | 170 | 167 | 29 |
| 163 | 22 | 174 | 173 | | | | | | | | | | | | | | | | | | |

FIG. 287

1024QAM CR 10/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 100 | 22 | 60 | 121 | 40 | 44 | 164 | 170 | 176 | 101 | 88 | 26 | 35 | 4 | 21 | 173 | 140 | 145 | 175 | 174 | 81 | 28 |
| 72 | 112 | 132 | 106 | 42 | 56 | 151 | 147 | 82 | 49 | 91 | 64 | 179 | 89 | 160 | 52 | 139 | 17 | 97 | 63 | 116 | 131 |
| 154 | 71 | 109 | 96 | 135 | 146 | 55 | 38 | 166 | 117 | 65 | 127 | 120 | 129 | 15 | 136 | 74 | 23 | 98 | 43 | 123 | 130 |
| 69 | 99 | 143 | 161 | 46 | 51 | 94 | 61 | 83 | 67 | 156 | 33 | 144 | 148 | 163 | 47 | 92 | 2 | 122 | 24 | 86 | 75 |
| 108 | 152 | 14 | 77 | 7 | 10 | 29 | 19 | 104 | 128 | 142 | 1 | 79 | 107 | 162 | 0 | 118 | 66 | 54 | 153 | 141 | 9 |
| 85 | 37 | 32 | 114 | 53 | 134 | 41 | 158 | 178 | 138 | 76 | 50 | 78 | 84 | 172 | 48 | 133 | 168 | 125 | 13 | 169 | 25 |
| 16 | 8 | 124 | 159 | 167 | 58 | 5 | 11 | 68 | 95 | 27 | 110 | 93 | 62 | 102 | 137 | 126 | 150 | 87 | 105 | 113 | 30 |
| 119 | 6 | 103 | 57 | 31 | 149 | 80 | 70 | 45 | 165 | 111 | 73 | 36 | 157 | 171 | 3 | 20 | 18 | 90 | 12 | 59 | 39 |
| 115 | 34 | 177 | 155 | | | | | | | | | | | | | | | | | | |

⇩

CONVERTED PATTERN (A):

| | | | | | | | | | | | | | | | | | | | | | |
|---|---|---|---|---|---|---|---|---|---|---|---|---|---|---|---|---|---|---|---|---|---|
| 100 | 88 | 81 | 82 | 97 | 55 | 74 | 46 | 163 | 14 | 79 | 85 | 76 | 169 | 68 | 87 | 80 | 20 | 22 | 26 | 28 | 49 |
| 63 | 38 | 23 | 51 | 47 | 77 | 107 | 37 | 50 | 25 | 95 | 105 | 70 | 18 | 60 | 35 | 72 | 91 | 116 | 166 | 98 | 94 |
| 92 | 7 | 162 | 32 | 78 | 16 | 27 | 113 | 45 | 90 | 121 | 4 | 112 | 64 | 131 | 117 | 43 | 61 | 2 | 10 | 0 | 114 |
| 84 | 8 | 110 | 30 | 165 | 12 | 40 | 21 | 132 | 179 | 154 | 65 | 123 | 83 | 122 | 29 | 118 | 53 | 172 | 124 | 93 | 119 |
| 111 | 59 | 44 | 173 | 106 | 89 | 71 | 127 | 130 | 67 | 24 | 19 | 66 | 134 | 48 | 159 | 62 | 6 | 73 | 39 | 164 | 140 |
| 42 | 160 | 109 | 120 | 69 | 156 | 86 | 104 | 54 | 41 | 133 | 167 | 102 | 103 | 36 | 115 | 170 | 145 | 56 | 52 | 96 | 129 |
| 99 | 33 | 75 | 128 | 153 | 158 | 168 | 58 | 137 | 57 | 157 | 34 | 176 | 175 | 151 | 139 | 135 | 15 | 143 | 144 | 108 | 142 |
| 141 | 178 | 125 | 5 | 126 | 31 | 171 | 177 | 101 | 174 | 147 | 17 | 146 | 136 | 161 | 148 | 152 | 1 | 9 | 138 | 13 | 11 |
| 150 | 149 | 3 | 155 | | | | | | | | | | | | | | | | | | |

FIG. 288

1024QAM CR 11/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 33 | 73 | 90 | 107 | 99 | 94 | 53 | 151 | 124 | 8 | 12 | 117 | 21 | 58 | 158 | 77 | 72 | 59 | 123 | 2 | 125 | 157 |
| 50 | 62 | 109 | 75 | 42 | 146 | 118 | 153 | 85 | 10 | 131 | 70 | 32 | 41 | 24 | 143 | 113 | 1 | 93 | 162 | 20 | 35 |
| 74 | 45 | 149 | 161 | 173 | 4 | 28 | 23 | 127 | 148 | 34 | 61 | 96 | 144 | 171 | 140 | 119 | 16 | 126 | 39 | 40 | 57 |
| 165 | 106 | 172 | 139 | 81 | 47 | 164 | 92 | 63 | 105 | 108 | 170 | 3 | 135 | 101 | 121 | 68 | 6 | 111 | 65 | 147 | 150 |
| 122 | 7 | 84 | 46 | 22 | 103 | 86 | 169 | 134 | 44 | 175 | 167 | 89 | 128 | 27 | 31 | 56 | 43 | 102 | 156 | 160 | 141 |
| 67 | 9 | 110 | 159 | 133 | 78 | 154 | 176 | 174 | 5 | 82 | 11 | 25 | 80 | 130 | 163 | 88 | 36 | 166 | 137 | 104 | 48 |
| 129 | 87 | 95 | 55 | 49 | 145 | 178 | 0 | 98 | 64 | 54 | 100 | 37 | 79 | 69 | 38 | 177 | 136 | 114 | 17 | 52 | 19 |
| 30 | 97 | 51 | 168 | 132 | 138 | 83 | 76 | 13 | 18 | 115 | 71 | 91 | 179 | 112 | 155 | 15 | 14 | 26 | 60 | 29 | 116 |
| 66 | 120 | 142 | 152 | | | | | | | | | | | | | | | | | | |

⇩

CONVERTED PATTERN (A):

| | | | | | | | | | | | | | | | | | | | | | |
|---|---|---|---|---|---|---|---|---|---|---|---|---|---|---|---|---|---|---|---|---|---|
| 33 | 12 | 125 | 85 | 93 | 28 | 119 | 81 | 101 | 84 | 89 | 67 | 82 | 104 | 98 | 114 | 83 | 15 | 73 | 117 | 157 | 10 |
| 162 | 23 | 16 | 47 | 121 | 46 | 128 | 9 | 11 | 48 | 64 | 17 | 76 | 14 | 90 | 21 | 50 | 131 | 20 | 127 | 126 | 164 |
| 68 | 22 | 27 | 110 | 25 | 129 | 54 | 52 | 13 | 26 | 107 | 58 | 62 | 70 | 35 | 148 | 39 | 92 | 6 | 103 | 31 | 159 |
| 80 | 87 | 100 | 19 | 18 | 60 | 99 | 158 | 109 | 32 | 74 | 34 | 40 | 63 | 111 | 86 | 56 | 133 | 130 | 95 | 37 | 30 |
| 115 | 29 | 94 | 77 | 75 | 41 | 45 | 61 | 57 | 105 | 65 | 169 | 43 | 78 | 163 | 55 | 79 | 97 | 71 | 116 | 53 | 72 |
| 42 | 24 | 149 | 96 | 165 | 108 | 147 | 134 | 102 | 154 | 88 | 49 | 69 | 51 | 91 | 66 | 151 | 59 | 146 | 143 | 161 | 144 |
| 106 | 170 | 150 | 44 | 156 | 176 | 36 | 145 | 38 | 168 | 179 | 120 | 124 | 123 | 118 | 113 | 173 | 171 | 172 | 3 | 122 | 175 |
| 160 | 174 | 166 | 178 | 177 | 132 | 112 | 142 | 8 | 2 | 153 | 1 | 4 | 140 | 139 | 135 | 7 | 167 | 141 | 5 | 137 | 0 |
| 136 | 138 | 155 | 152 | | | | | | | | | | | | | | | | | | |

FIG. 289

1024QAM CR 12/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 91 | 19 | 11 | 106 | 14 | 40 | 20 | 67 | 32 | 22 | 31 | 23 | 78 | 68 | 79 | 141 | 117 | 95 | 88 | 136 | 52 | 121 |
| 1 | 133 | 4 | 2 | 21 | 122 | 38 | 12 | 69 | 111 | 81 | 82 | 58 | 46 | 112 | 60 | 33 | 73 | 53 | 92 | 75 | 48 |
| 47 | 110 | 80 | 76 | 138 | 87 | 85 | 65 | 130 | 57 | 102 | 83 | 64 | 86 | 100 | 39 | 49 | 125 | 108 | 119 | 6 | 118 |
| 35 | 61 | 71 | 30 | 45 | 94 | 26 | 116 | 98 | 37 | 55 | 44 | 70 | 25 | 7 | 34 | 114 | 135 | 128 | 137 | 84 | 51 |
| 28 | 97 | 27 | 89 | 29 | 62 | 50 | 139 | 56 | 109 | 77 | 59 | 127 | 142 | 96 | 105 | 99 | 90 | 13 | 124 | 120 | 115 |
| 126 | 143 | 149 | 74 | 41 | 178 | 129 | 18 | 131 | 42 | 165 | 101 | 134 | 36 | 140 | 132 | 103 | 72 | 164 | 93 | 54 | 166 |
| 43 | 123 | 113 | 0 | 154 | 10 | 63 | 107 | 162 | 157 | 66 | 104 | 17 | 147 | 167 | 174 | 179 | 3 | 173 | 160 | 155 | 161 |
| 152 | 156 | 177 | 24 | 170 | 9 | 159 | 16 | 15 | 148 | 5 | 146 | 163 | 172 | 175 | 151 | 169 | 176 | 150 | 153 | 171 | 158 |
| 168 | 144 | 8 | 145 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 91 | 88 | 112 | 102 | 26 | 27 | 120 | 103 | 17 | 15 | 19 | 136 | 60 | 83 | 116 | 89 | 115 | 72 | 147 | 148 | 11 | 52 |
| 33 | 64 | 98 | 29 | 126 | 164 | 167 | 5 | 106 | 121 | 73 | 86 | 37 | 62 | 143 | 93 | 174 | 146 | 14 | 1 | 53 | 100 |
| 55 | 50 | 149 | 54 | 179 | 163 | 40 | 133 | 92 | 39 | 44 | 139 | 74 | 166 | 3 | 172 | 20 | 4 | 75 | 49 | 70 | 56 |
| 41 | 43 | 173 | 175 | 67 | 2 | 48 | 125 | 25 | 109 | 178 | 123 | 160 | 151 | 32 | 21 | 47 | 108 | 7 | 77 | 129 | 113 |
| 155 | 169 | 22 | 122 | 110 | 119 | 34 | 59 | 18 | 0 | 161 | 176 | 31 | 38 | 80 | 6 | 114 | 127 | 131 | 154 | 152 | 150 |
| 23 | 12 | 76 | 118 | 135 | 142 | 42 | 10 | 156 | 153 | 78 | 69 | 138 | 35 | 128 | 96 | 165 | 63 | 177 | 171 | 68 | 111 |
| 87 | 61 | 137 | 105 | 101 | 107 | 24 | 158 | 79 | 81 | 85 | 71 | 84 | 99 | 134 | 162 | 170 | 168 | 141 | 82 | 65 | 30 |
| 51 | 90 | 36 | 157 | 9 | 144 | 117 | 58 | 130 | 45 | 28 | 13 | 140 | 66 | 159 | 8 | 95 | 46 | 57 | 94 | 97 | 124 |
| 132 | 104 | 16 | 145 | | | | | | | | | | | | | | | | | | |

FIG. 290

1024QAM CR 13/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 49 | 2 | 57 | 47 | 31 | 35 | 24 | 39 | 59 | 0 | 45 | 41 | 55 | 53 | 51 | 37 | 33 | 43 | 56 | 38 | 48 | 32 |
| 50 | 23 | 34 | 54 | 1 | 36 | 44 | 52 | 40 | 58 | 122 | 46 | 42 | 30 | 3 | 75 | 73 | 65 | 145 | 71 | 79 | 67 |
| 69 | 83 | 85 | 147 | 63 | 81 | 77 | 61 | 5 | 26 | 62 | 64 | 74 | 70 | 82 | 149 | 76 | 4 | 78 | 84 | 80 | 86 |
| 66 | 68 | 72 | 6 | 60 | 154 | 103 | 95 | 101 | 143 | 9 | 89 | 141 | 128 | 97 | 137 | 133 | 7 | 13 | 99 | 91 | 93 |
| 87 | 11 | 136 | 90 | 88 | 94 | 10 | 8 | 14 | 96 | 104 | 92 | 132 | 142 | 100 | 98 | 12 | 102 | 152 | 139 | 150 | 106 |
| 146 | 130 | 27 | 108 | 153 | 112 | 114 | 29 | 110 | 134 | 116 | 15 | 127 | 125 | 123 | 120 | 148 | 151 | 113 | 126 | 124 | 135 |
| 129 | 109 | 25 | 28 | 158 | 117 | 105 | 115 | 111 | 131 | 107 | 121 | 18 | 170 | 164 | 20 | 140 | 160 | 166 | 162 | 119 | 155 |
| 168 | 178 | 22 | 174 | 172 | 176 | 16 | 157 | 159 | 171 | 161 | 118 | 17 | 163 | 21 | 165 | 19 | 179 | 177 | 167 | 138 | 173 |
| 156 | 144 | 169 | 175 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 49 | 56 | 3 | 62 | 103 | 136 | 150 | 148 | 18 | 159 | 2 | 38 | 75 | 64 | 95 | 90 | 106 | 151 | 170 | 171 | 57 | 48 |
| 73 | 74 | 101 | 88 | 146 | 113 | 164 | 161 | 47 | 32 | 65 | 70 | 143 | 94 | 130 | 126 | 20 | 118 | 31 | 50 | 145 | 82 |
| 9 | 10 | 27 | 124 | 140 | 17 | 35 | 23 | 71 | 149 | 89 | 8 | 108 | 135 | 160 | 163 | 24 | 34 | 79 | 76 | 141 | 14 |
| 153 | 129 | 166 | 21 | 39 | 54 | 67 | 4 | 128 | 96 | 112 | 109 | 162 | 165 | 59 | 1 | 69 | 78 | 97 | 104 | 114 | 25 |
| 119 | 19 | 0 | 36 | 83 | 84 | 137 | 92 | 29 | 28 | 155 | 179 | 45 | 44 | 85 | 80 | 133 | 132 | 110 | 158 | 168 | 177 |
| 41 | 52 | 147 | 86 | 7 | 142 | 134 | 117 | 178 | 167 | 55 | 40 | 63 | 66 | 13 | 100 | 116 | 105 | 22 | 138 | 53 | 58 |
| 81 | 68 | 99 | 98 | 15 | 115 | 174 | 173 | 51 | 122 | 77 | 72 | 91 | 12 | 127 | 111 | 172 | 156 | 37 | 46 | 61 | 6 |
| 93 | 102 | 125 | 131 | 176 | 144 | 33 | 42 | 5 | 60 | 87 | 152 | 123 | 107 | 16 | 169 | 43 | 30 | 26 | 154 | 11 | 139 |
| 120 | 121 | 157 | 175 | | | | | | | | | | | | | | | | | | |

FIG. 291

4096QAM CR 2/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 14 | 129 | 71 | 96 | 171 | 36 | 144 | 64 | 162 | 4 | 86 | 128 | 113 | 7 | 105 | 131 | 2 | 133 | 106 | 79 | 11 | 152 |
| 26 | 118 | 158 | 126 | 17 | 55 | 45 | 111 | 138 | 84 | 6 | 52 | 167 | 38 | 20 | 101 | 31 | 120 | 5 | 112 | 74 | 69 |
| 121 | 9 | 154 | 15 | 146 | 116 | 63 | 1 | 114 | 83 | 124 | 109 | 39 | 75 | 123 | 57 | 49 | 30 | 21 | 40 | 43 | 77 |
| 157 | 44 | 13 | 99 | 34 | 147 | 166 | 56 | 155 | 176 | 95 | 102 | 119 | 161 | 37 | 159 | 97 | 68 | 122 | 163 | 89 | 61 |
| 107 | 22 | 10 | 127 | 87 | 103 | 179 | 172 | 66 | 59 | 8 | 145 | 88 | 132 | 110 | 54 | 47 | 153 | 25 | 32 | 73 | 42 |
| 148 | 150 | 28 | 91 | 18 | 24 | 19 | 53 | 136 | 48 | 76 | 35 | 151 | 173 | 149 | 142 | 160 | 94 | 117 | 169 | 165 | 141 |
| 80 | 67 | 170 | 164 | 82 | 65 | 60 | 135 | 168 | 23 | 100 | 134 | 90 | 98 | 125 | 85 | 137 | 81 | 41 | 156 | 50 | 3 |
| 29 | 16 | 72 | 177 | 0 | 78 | 62 | 139 | 93 | 46 | 12 | 175 | 130 | 51 | 178 | 92 | 115 | 174 | 27 | 70 | 58 | 33 |
| 104 | 140 | 108 | 143 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 14 | 131 | 138 | 9 | 49 | 176 | 10 | 153 | 76 | 164 | 41 | 175 | 129 | 2 | 84 | 154 | 30 | 95 | 127 | 25 | 35 | 82 |
| 156 | 130 | 71 | 133 | 6 | 15 | 21 | 102 | 87 | 32 | 151 | 65 | 50 | 51 | 96 | 106 | 52 | 146 | 40 | 119 | 103 | 73 |
| 173 | 60 | 3 | 178 | 171 | 79 | 167 | 116 | 43 | 161 | 179 | 42 | 149 | 135 | 29 | 92 | 36 | 11 | 38 | 63 | 77 | 37 |
| 172 | 148 | 142 | 168 | 16 | 115 | 144 | 152 | 20 | 1 | 157 | 159 | 66 | 150 | 160 | 23 | 72 | 174 | 64 | 26 | 101 | 114 |
| 44 | 97 | 59 | 28 | 94 | 100 | 177 | 27 | 162 | 118 | 31 | 83 | 13 | 68 | 8 | 91 | 117 | 134 | 0 | 70 | 4 | 158 |
| 120 | 124 | 99 | 122 | 145 | 18 | 169 | 90 | 78 | 58 | 86 | 126 | 5 | 109 | 34 | 163 | 88 | 24 | 165 | 98 | 62 | 33 |
| 128 | 17 | 112 | 39 | 147 | 89 | 132 | 19 | 141 | 125 | 139 | 104 | 113 | 55 | 74 | 75 | 166 | 61 | 110 | 53 | 80 | 85 |
| 93 | 140 | 7 | 45 | 69 | 123 | 56 | 107 | 54 | 136 | 67 | 137 | 46 | 108 | 105 | 111 | 121 | 57 | 155 | 22 | 47 | 48 |
| 170 | 81 | 12 | 143 | | | | | | | | | | | | | | | | | | |

FIG. 292

4096QAM CR 3/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 136 | 20 | 44 | 36 | 17 | 120 | 89 | 142 | 66 | 35 | 42 | 116 | 14 | 119 | 117 | 29 | 47 | 125 | 11 | 158 | 74 | 25 |
| 37 | 175 | 41 | 145 | 100 | 131 | 173 | 179 | 16 | 77 | 112 | 40 | 58 | 23 | 82 | 168 | 106 | 83 | 34 | 49 | 122 | 2 |
| 157 | 107 | 79 | 137 | 53 | 96 | 33 | 70 | 19 | 38 | 121 | 90 | 118 | 126 | 165 | 109 | 154 | 140 | 10 | 178 | 143 | 92 |
| 63 | 176 | 146 | 134 | 177 | 139 | 3 | 113 | 172 | 9 | 50 | 138 | 61 | 93 | 94 | 88 | 132 | 105 | 151 | 170 | 86 | 12 |
| 1 | 7 | 56 | 59 | 101 | 155 | 95 | 54 | 85 | 13 | 39 | 15 | 76 | 130 | 97 | 110 | 174 | 72 | 150 | 55 | 73 | 99 |
| 111 | 162 | 26 | 21 | 156 | 28 | 160 | 149 | 133 | 104 | 81 | 69 | 84 | 4 | 6 | 147 | 48 | 115 | 169 | 127 | 161 | 71 |
| 68 | 80 | 91 | 98 | 8 | 57 | 171 | 135 | 52 | 5 | 141 | 65 | 75 | 163 | 43 | 144 | 167 | 159 | 129 | 46 | 31 | 30 |
| 166 | 0 | 148 | 128 | 102 | 103 | 60 | 32 | 18 | 51 | 87 | 114 | 64 | 22 | 164 | 24 | 123 | 27 | 62 | 124 | 152 | 78 |
| 108 | 67 | 153 | 45 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 136 | 29 | 16 | 107 | 154 | 9 | 56 | 72 | 81 | 98 | 129 | 114 | 20 | 47 | 77 | 79 | 140 | 50 | 59 | 150 | 69 | 8 |
| 46 | 64 | 44 | 125 | 112 | 137 | 10 | 138 | 101 | 55 | 84 | 57 | 31 | 22 | 36 | 11 | 40 | 53 | 178 | 61 | 155 | 73 |
| 4 | 171 | 30 | 164 | 17 | 158 | 58 | 96 | 143 | 93 | 95 | 99 | 6 | 135 | 166 | 24 | 120 | 74 | 23 | 33 | 92 | 94 |
| 54 | 111 | 147 | 52 | 0 | 123 | 89 | 25 | 82 | 70 | 63 | 88 | 85 | 162 | 48 | 5 | 148 | 27 | 142 | 37 | 168 | 19 |
| 176 | 132 | 13 | 26 | 115 | 141 | 128 | 62 | 66 | 175 | 106 | 38 | 146 | 105 | 39 | 21 | 169 | 65 | 102 | 124 | 35 | 41 |
| 83 | 121 | 134 | 151 | 15 | 156 | 127 | 75 | 103 | 152 | 42 | 145 | 34 | 90 | 177 | 170 | 76 | 28 | 161 | 163 | 60 | 78 |
| 116 | 100 | 49 | 118 | 139 | 86 | 130 | 160 | 71 | 43 | 32 | 108 | 14 | 131 | 122 | 126 | 3 | 12 | 97 | 149 | 68 | 144 |
| 18 | 67 | 119 | 173 | 2 | 165 | 113 | 1 | 110 | 133 | 80 | 167 | 51 | 153 | 117 | 179 | 157 | 109 | 172 | 7 | 174 | 104 |
| 91 | 159 | 87 | 45 | | | | | | | | | | | | | | | | | | |

FIG. 293

4096QAM CR 4/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 91 | 52 | 36 | 30 | 35 | 6 | 121 | 29 | 150 | 47 | 163 | 2 | 89 | 39 | 65 | 157 | 64 | 122 | 101 | 40 | 84 | 69 |
| 90 | 129 | 10 | 9 | 15 | 162 | 21 | 171 | 43 | 44 | 132 | 158 | 104 | 4 | 72 | 169 | 177 | 103 | 76 | 28 | 78 | 53 |
| 1 | 151 | 161 | 88 | 148 | 42 | 160 | 109 | 100 | 126 | 138 | 108 | 38 | 25 | 3 | 112 | 17 | 124 | 155 | 172 | 134 | 86 |
| 119 | 94 | 145 | 178 | 68 | 26 | 130 | 140 | 115 | 152 | 139 | 37 | 22 | 102 | 14 | 118 | 11 | 98 | 154 | 61 | 146 | 164 |
| 107 | 131 | 159 | 63 | 93 | 7 | 79 | 5 | 137 | 165 | 59 | 77 | 55 | 80 | 117 | 13 | 173 | 144 | 85 | 153 | 66 | 106 |
| 49 | 34 | 48 | 41 | 143 | 142 | 27 | 136 | 18 | 111 | 175 | 123 | 147 | 114 | 19 | 125 | 166 | 149 | 113 | 46 | 31 | 141 |
| 120 | 57 | 74 | 8 | 20 | 96 | 170 | 128 | 97 | 16 | 60 | 110 | 156 | 45 | 82 | 105 | 62 | 99 | 23 | 92 | 32 | 50 |
| 73 | 56 | 167 | 95 | 24 | 168 | 33 | 116 | 75 | 127 | 81 | 67 | 179 | 174 | 70 | 12 | 58 | 87 | 176 | 0 | 51 | 135 |
| 83 | 133 | 54 | 71 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 91 | 157 | 43 | 151 | 17 | 152 | 159 | 144 | 175 | 8 | 23 | 67 | 52 | 64 | 44 | 161 | 124 | 139 | 63 | 85 | 123 | 20 |
| 92 | 179 | 36 | 122 | 132 | 88 | 155 | 37 | 93 | 153 | 147 | 96 | 32 | 174 | 30 | 101 | 158 | 148 | 172 | 22 | 7 | 66 |
| 114 | 170 | 50 | 70 | 35 | 40 | 104 | 42 | 134 | 102 | 79 | 106 | 19 | 128 | 73 | 12 | 6 | 84 | 4 | 160 | 86 | 14 |
| 5 | 49 | 125 | 97 | 56 | 58 | 121 | 69 | 72 | 109 | 119 | 118 | 137 | 34 | 166 | 16 | 167 | 87 | 29 | 90 | 169 | 100 |
| 94 | 11 | 165 | 48 | 149 | 60 | 95 | 176 | 150 | 129 | 177 | 126 | 145 | 98 | 59 | 41 | 113 | 110 | 24 | 0 | 47 | 10 |
| 103 | 138 | 178 | 154 | 77 | 143 | 46 | 156 | 168 | 51 | 163 | 9 | 76 | 108 | 68 | 61 | 55 | 142 | 31 | 45 | 33 | 135 |
| 2 | 15 | 28 | 38 | 26 | 146 | 80 | 27 | 141 | 82 | 116 | 83 | 89 | 162 | 78 | 25 | 130 | 164 | 117 | 136 | 120 | 105 |
| 75 | 133 | 39 | 21 | 53 | 3 | 140 | 107 | 13 | 18 | 57 | 62 | 127 | 54 | 65 | 171 | 1 | 112 | 115 | 131 | 173 | 111 |
| 74 | 99 | 81 | 71 | | | | | | | | | | | | | | | | | | |

FIG. 294

4096QAM CR 5/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 146 | 89 | 57 | 16 | 164 | 138 | 91 | 78 | 90 | 66 | 122 | 12 | 9 | 157 | 14 | 68 | 112 | 128 | 74 | 45 | 28 | 87 |
| 158 | 56 | 61 | 168 | 18 | 161 | 95 | 99 | 139 | 22 | 65 | 130 | 166 | 118 | 150 | 49 | 142 | 44 | 36 | 1 | 121 | 6 |
| 46 | 29 | 88 | 47 | 0 | 58 | 105 | 43 | 80 | 64 | 107 | 21 | 55 | 151 | 8 | 145 | 163 | 7 | 98 | 123 | 17 | 11 |
| 153 | 136 | 52 | 3 | 13 | 34 | 160 | 102 | 125 | 114 | 152 | 84 | 32 | 97 | 33 | 60 | 62 | 79 | 37 | 129 | 38 | 165 |
| 71 | 75 | 59 | 144 | 127 | 132 | 104 | 53 | 162 | 103 | 120 | 54 | 155 | 116 | 48 | 77 | 76 | 73 | 113 | 119 | 179 | 177 |
| 41 | 19 | 92 | 109 | 31 | 143 | 178 | 108 | 39 | 140 | 106 | 40 | 5 | 25 | 81 | 176 | 101 | 124 | 126 | 72 | 111 | 4 |
| 173 | 156 | 134 | 86 | 174 | 2 | 170 | 35 | 175 | 137 | 15 | 24 | 69 | 96 | 30 | 117 | 67 | 171 | 149 | 169 | 63 | 23 |
| 20 | 167 | 27 | 147 | 51 | 10 | 82 | 131 | 85 | 110 | 94 | 135 | 172 | 148 | 50 | 154 | 42 | 70 | 115 | 26 | 83 | 141 |
| 100 | 133 | 93 | 159 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 146 | 68 | 139 | 29 | 163 | 114 | 59 | 73 | 106 | 86 | 149 | 135 | 89 | 112 | 22 | 88 | 7 | 152 | 144 | 113 | 40 | 174 |
| 169 | 172 | 57 | 128 | 65 | 47 | 98 | 84 | 127 | 119 | 5 | 2 | 63 | 148 | 16 | 74 | 130 | 0 | 123 | 32 | 132 | 179 |
| 25 | 170 | 23 | 50 | 164 | 45 | 166 | 58 | 17 | 97 | 104 | 177 | 81 | 35 | 20 | 154 | 138 | 28 | 118 | 105 | 11 | 33 |
| 53 | 41 | 176 | 175 | 167 | 42 | 91 | 87 | 150 | 43 | 153 | 60 | 162 | 19 | 101 | 137 | 27 | 70 | 78 | 158 | 49 | 80 |
| 136 | 62 | 103 | 92 | 124 | 15 | 147 | 115 | 90 | 56 | 142 | 64 | 52 | 79 | 120 | 109 | 126 | 24 | 51 | 26 | 66 | 61 |
| 44 | 107 | 3 | 37 | 54 | 31 | 72 | 69 | 10 | 83 | 122 | 168 | 36 | 21 | 13 | 129 | 155 | 143 | 111 | 96 | 82 | 141 |
| 12 | 18 | 1 | 55 | 34 | 38 | 116 | 178 | 4 | 30 | 131 | 100 | 9 | 161 | 121 | 151 | 160 | 165 | 48 | 108 | 173 | 117 |
| 85 | 133 | 157 | 95 | 6 | 8 | 102 | 71 | 77 | 39 | 156 | 67 | 110 | 93 | 14 | 99 | 46 | 145 | 125 | 75 | 76 | 140 |
| 134 | 171 | 94 | 159 | | | | | | | | | | | | | | | | | | |

FIG. 295

4096QAM CR 6/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 66 | 21 | 51 | 55 | 117 | 24 | 33 | 12 | 70 | 63 | 47 | 65 | 145 | 8 | 0 | 57 | 23 | 71 | 59 | 14 | 40 | 42 |
| 15 | 56 | 2 | 43 | 64 | 58 | 67 | 53 | 68 | 61 | 39 | 52 | 69 | 1 | 22 | 31 | 161 | 38 | 30 | 19 | 17 | 18 |
| 4 | 41 | 25 | 44 | 136 | 29 | 36 | 26 | 126 | 177 | 62 | 37 | 148 | 9 | 13 | 45 | 46 | 152 | 50 | 49 | 27 | 77 |
| 60 | 35 | 48 | 178 | 28 | 34 | 106 | 127 | 76 | 131 | 105 | 138 | 75 | 130 | 101 | 167 | 54 | 173 | 113 | 108 | 92 | 135 |
| 124 | 121 | 97 | 149 | 143 | 81 | 32 | 96 | 3 | 78 | 107 | 86 | 98 | 16 | 162 | 150 | 111 | 158 | 172 | 139 | 74 | 142 |
| 166 | 7 | 5 | 119 | 20 | 144 | 151 | 90 | 11 | 156 | 100 | 175 | 83 | 155 | 159 | 128 | 88 | 87 | 93 | 103 | 94 | 140 |
| 165 | 6 | 137 | 157 | 10 | 85 | 141 | 129 | 146 | 122 | 73 | 112 | 132 | 125 | 174 | 169 | 168 | 79 | 84 | 118 | 179 | 147 |
| 91 | 160 | 163 | 115 | 89 | 80 | 102 | 104 | 134 | 82 | 95 | 133 | 164 | 154 | 120 | 110 | 170 | 114 | 153 | 72 | 109 | 171 |
| 176 | 99 | 116 | 123 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 66 | 57 | 68 | 41 | 46 | 131 | 97 | 158 | 100 | 157 | 84 | 133 | 21 | 23 | 61 | 25 | 152 | 105 | 149 | 172 | 175 | 10 |
| 118 | 164 | 51 | 71 | 39 | 44 | 50 | 138 | 143 | 139 | 83 | 85 | 179 | 154 | 55 | 59 | 52 | 136 | 49 | 75 | 81 | 74 |
| 155 | 141 | 147 | 120 | 117 | 14 | 69 | 29 | 27 | 130 | 32 | 142 | 159 | 129 | 91 | 110 | 24 | 40 | 1 | 36 | 77 | 101 |
| 96 | 166 | 128 | 146 | 160 | 170 | 33 | 42 | 22 | 26 | 60 | 167 | 3 | 7 | 88 | 122 | 163 | 114 | 12 | 15 | 31 | 126 |
| 35 | 54 | 78 | 5 | 87 | 73 | 115 | 153 | 70 | 56 | 161 | 177 | 48 | 173 | 107 | 119 | 93 | 112 | 89 | 72 | 63 | 2 |
| 38 | 62 | 178 | 113 | 86 | 20 | 103 | 132 | 80 | 109 | 47 | 43 | 30 | 37 | 28 | 108 | 98 | 144 | 94 | 125 | 102 | 171 |
| 65 | 64 | 19 | 148 | 34 | 92 | 16 | 151 | 140 | 174 | 104 | 176 | 145 | 58 | 17 | 9 | 106 | 135 | 162 | 90 | 165 | 169 |
| 134 | 99 | 8 | 67 | 18 | 13 | 127 | 124 | 150 | 11 | 6 | 168 | 82 | 116 | 0 | 53 | 4 | 45 | 76 | 121 | 111 | 156 |
| 137 | 79 | 95 | 123 | | | | | | | | | | | | | | | | | | |

FIG. 296

4096QAM CR 7/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 59 | 60 | 0 | 48 | 87 | 30 | 29 | 146 | 142 | 8 | 150 | 171 | 20 | 121 | 23 | 122 | 144 | 76 | 162 | 106 | 50 | 39 |
| 63 | 108 | 165 | 74 | 16 | 85 | 58 | 43 | 161 | 34 | 13 | 92 | 79 | 82 | 175 | 86 | 69 | 68 | 15 | 113 | 84 | 118 |
| 27 | 93 | 120 | 61 | 73 | 104 | 10 | 38 | 45 | 7 | 173 | 75 | 24 | 77 | 137 | 21 | 37 | 46 | 3 | 6 | 168 | 148 |
| 109 | 123 | 103 | 140 | 64 | 117 | 158 | 114 | 136 | 112 | 31 | 70 | 134 | 163 | 98 | 91 | 33 | 115 | 95 | 176 | 154 | 107 |
| 97 | 131 | 111 | 129 | 40 | 66 | 170 | 41 | 74 | 138 | 99 | 179 | 81 | 157 | 32 | 19 | 26 | 62 | 172 | 78 | 160 | 57 |
| 22 | 159 | 51 | 135 | 2 | 55 | 164 | 153 | 155 | 14 | 42 | 149 | 127 | 133 | 83 | 96 | 139 | 89 | 36 | 125 | 130 | 143 |
| 147 | 67 | 18 | 102 | 94 | 35 | 101 | 44 | 49 | 177 | 88 | 11 | 105 | 151 | 12 | 132 | 25 | 128 | 119 | 65 | 145 | 4 |
| 54 | 90 | 71 | 167 | 166 | 1 | 156 | 56 | 124 | 17 | 141 | 72 | 9 | 28 | 5 | 110 | 100 | 47 | 80 | 169 | 116 | 53 |
| 152 | 52 | 126 | 178 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 59 | 122 | 161 | 93 | 37 | 112 | 111 | 62 | 42 | 102 | 119 | 72 | 60 | 144 | 34 | 120 | 46 | 31 | 129 | 172 | 149 | 94 |
| 65 | 9 | 0 | 76 | 13 | 61 | 3 | 70 | 40 | 78 | 127 | 35 | 145 | 28 | 48 | 162 | 92 | 73 | 6 | 134 | 66 | 160 |
| 133 | 101 | 4 | 5 | 87 | 106 | 79 | 104 | 168 | 163 | 170 | 57 | 83 | 44 | 54 | 110 | 30 | 50 | 82 | 10 | 148 | 98 |
| 41 | 22 | 96 | 49 | 90 | 100 | 29 | 39 | 175 | 38 | 109 | 91 | 74 | 159 | 139 | 177 | 71 | 47 | 146 | 63 | 86 | 45 |
| 123 | 33 | 138 | 51 | 89 | 88 | 167 | 80 | 142 | 108 | 69 | 7 | 103 | 115 | 99 | 135 | 36 | 11 | 166 | 169 | 8 | 165 |
| 68 | 173 | 140 | 95 | 179 | 2 | 125 | 105 | 1 | 116 | 150 | 174 | 15 | 75 | 64 | 176 | 81 | 55 | 130 | 151 | 156 | 53 |
| 171 | 16 | 113 | 24 | 117 | 154 | 157 | 164 | 143 | 12 | 56 | 152 | 20 | 85 | 84 | 77 | 158 | 107 | 32 | 153 | 147 | 132 |
| 124 | 52 | 121 | 58 | 118 | 137 | 114 | 97 | 19 | 155 | 67 | 25 | 17 | 126 | 23 | 43 | 27 | 21 | 136 | 131 | 26 | 14 |
| 18 | 128 | 141 | 178 | | | | | | | | | | | | | | | | | | |

FIG. 297

4096QAM CR 8/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 77 | 48 | 82 | 51 | 57 | 69 | 65 | 6 | 71 | 90 | 84 | 81 | 50 | 88 | 61 | 55 | 53 | 73 | 39 | 13 | 79 | 75 |
| 41 | 18 | 38 | 89 | 49 | 93 | 36 | 64 | 47 | 40 | 42 | 76 | 70 | 56 | 3 | 72 | 2 | 54 | 52 | 145 | 19 | 78 |
| 80 | 63 | 87 | 67 | 86 | 10 | 1 | 58 | 17 | 14 | 175 | 91 | 68 | 85 | 94 | 15 | 43 | 74 | 60 | 66 | 37 | 92 |
| 4 | 9 | 16 | 83 | 46 | 44 | 102 | 30 | 112 | 122 | 110 | 29 | 20 | 105 | 138 | 101 | 174 | 33 | 137 | 136 | 131 | 166 |
| 59 | 34 | 62 | 125 | 28 | 26 | 45 | 24 | 23 | 21 | 157 | 98 | 35 | 95 | 22 | 32 | 103 | 27 | 113 | 31 | 119 | 173 |
| 168 | 118 | 120 | 114 | 149 | 159 | 155 | 179 | 160 | 161 | 130 | 123 | 172 | 139 | 124 | 153 | 0 | 109 | 167 | 128 | 107 | 117 |
| 147 | 177 | 96 | 164 | 152 | 11 | 148 | 158 | 129 | 163 | 176 | 151 | 171 | 8 | 106 | 144 | 150 | 169 | 108 | 162 | 143 | 111 |
| 141 | 133 | 178 | 134 | 146 | 99 | 132 | 142 | 104 | 115 | 135 | 121 | 100 | 12 | 170 | 156 | 126 | 5 | 127 | 154 | 7 | 140 |
| 116 | 165 | 7 | 25 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 77 | 55 | 47 | 63 | 43 | 122 | 62 | 27 | 130 | 164 | 108 | 121 | 48 | 53 | 40 | 87 | 74 | 110 | 125 | 113 | 123 | 152 |
| 162 | 100 | 82 | 73 | 42 | 67 | 60 | 29 | 28 | 31 | 172 | 11 | 143 | 12 | 51 | 39 | 76 | 86 | 66 | 20 | 26 | 119 |
| 139 | 148 | 111 | 170 | 57 | 13 | 70 | 10 | 37 | 105 | 45 | 173 | 124 | 158 | 141 | 156 | 69 | 79 | 56 | 1 | 92 | 138 |
| 24 | 168 | 153 | 129 | 133 | 126 | 65 | 75 | 3 | 58 | 4 | 101 | 23 | 118 | 0 | 163 | 178 | 5 | 6 | 41 | 72 | 17 |
| 9 | 174 | 21 | 120 | 109 | 176 | 134 | 127 | 71 | 18 | 2 | 14 | 16 | 33 | 157 | 114 | 167 | 151 | 146 | 154 | 90 | 38 |
| 54 | 175 | 83 | 137 | 98 | 149 | 128 | 171 | 99 | 97 | 84 | 89 | 52 | 91 | 46 | 136 | 35 | 159 | 107 | 8 | 132 | 140 |
| 81 | 49 | 145 | 68 | 44 | 131 | 95 | 155 | 117 | 106 | 142 | 116 | 50 | 93 | 19 | 85 | 102 | 166 | 22 | 179 | 147 | 144 |
| 104 | 165 | 88 | 36 | 78 | 94 | 30 | 59 | 32 | 160 | 177 | 150 | 115 | 7 | 61 | 64 | 80 | 15 | 112 | 34 | 103 | 161 |
| 96 | 169 | 135 | 25 | | | | | | | | | | | | | | | | | | |

FIG. 298

4096QAM CR 9/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 67 | 79 | 72 | 175 | 1 | 92 | 63 | 65 | 36 | 73 | 18 | 3 | 43 | 78 | 5 | 40 | 82 | 20 | 15 | 76 | 28 | 84 |
| 59 | 91 | 93 | 54 | 58 | 60 | 2 | 19 | 66 | 44 | 85 | 48 | 0 | 50 | 166 | 89 | 41 | 24 | 83 | 75 | 55 | 64 |
| 52 | 98 | 39 | 141 | 34 | 74 | 33 | 45 | 99 | 46 | 10 | 69 | 94 | 101 | 56 | 9 | 97 | 96 | 37 | 14 | 31 | 70 |
| 106 | 113 | 80 | 62 | 100 | 13 | 32 | 88 | 57 | 127 | 53 | 68 | 146 | 61 | 7 | 107 | 71 | 51 | 161 | 81 | 49 | 86 |
| 95 | 103 | 30 | 25 | 126 | 87 | 22 | 47 | 27 | 171 | 102 | 6 | 132 | 77 | 90 | 38 | 167 | 4 | 35 | 26 | 118 | 140 |
| 104 | 128 | 179 | 124 | 109 | 159 | 42 | 110 | 21 | 105 | 148 | 142 | 134 | 23 | 117 | 122 | 160 | 12 | 154 | 114 | 156 | 151 |
| 145 | 169 | 11 | 139 | 177 | 129 | 155 | 178 | 138 | 176 | 147 | 121 | 136 | 165 | 170 | 133 | 149 | 150 | 174 | 168 | 125 | 116 |
| 115 | 164 | 29 | 119 | 153 | 157 | 162 | 173 | 112 | 144 | 172 | 123 | 137 | 16 | 120 | 131 | 111 | 135 | 163 | 17 | 130 | 152 |
| 108 | 8 | 158 | 143 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 67 | 40 | 66 | 98 | 97 | 127 | 30 | 4 | 148 | 139 | 174 | 123 | 79 | 82 | 44 | 39 | 96 | 53 | 25 | 35 | 142 | 177 |
| 168 | 137 | 72 | 20 | 85 | 141 | 37 | 68 | 126 | 26 | 134 | 129 | 125 | 16 | 175 | 15 | 48 | 34 | 14 | 146 | 87 | 118 |
| 23 | 155 | 116 | 120 | 1 | 76 | 0 | 74 | 31 | 61 | 22 | 140 | 117 | 178 | 115 | 131 | 92 | 28 | 50 | 33 | 70 | 7 |
| 47 | 104 | 122 | 138 | 164 | 111 | 63 | 84 | 166 | 45 | 106 | 107 | 27 | 128 | 160 | 176 | 29 | 135 | 65 | 59 | 89 | 99 |
| 113 | 71 | 171 | 179 | 12 | 147 | 119 | 163 | 36 | 91 | 41 | 46 | 80 | 51 | 102 | 124 | 154 | 121 | 153 | 17 | 73 | 93 |
| 24 | 10 | 62 | 161 | 6 | 109 | 114 | 136 | 157 | 130 | 18 | 54 | 83 | 69 | 100 | 81 | 132 | 159 | 156 | 165 | 162 | 152 |
| 3 | 58 | 75 | 94 | 13 | 49 | 77 | 42 | 151 | 170 | 173 | 108 | 43 | 60 | 55 | 101 | 32 | 86 | 90 | 110 | 145 | 133 |
| 112 | 8 | 78 | 2 | 64 | 56 | 88 | 95 | 38 | 21 | 169 | 149 | 144 | 158 | 5 | 19 | 52 | 9 | 57 | 103 | 167 | 105 |
| 11 | 150 | 172 | 143 | | | | | | | | | | | | | | | | | | |

FIG. 299

4096QAM CR 10/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 36 | 21 | 117 | 71 | 38 | 108 | 42 | 61 | 13 | 88 | 97 | 68 | 2 | 67 | 50 | 64 | 95 | 63 | 100 | 9 | 82 | 51 |
| 45 | 78 | 31 | 18 | 103 | 39 | 119 | 25 | 40 | 28 | 72 | 11 | 73 | 86 | 131 | 84 | 111 | 24 | 58 | 60 | 81 | 37 |
| 89 | 1 | 93 | 56 | 69 | 96 | 35 | 57 | 116 | 130 | 55 | 74 | 41 | 169 | 54 | 14 | 26 | 65 | 83 | 165 | 107 | 0 |
| 52 | 144 | 75 | 101 | 8 | 115 | 118 | 85 | 48 | 112 | 80 | 90 | 32 | 173 | 76 | 33 | 16 | 77 | 164 | 104 | 46 | 20 |
| 98 | 109 | 29 | 114 | 7 | 110 | 99 | 53 | 133 | 70 | 87 | 106 | 145 | 4 | 113 | 27 | 59 | 34 | 5 | 102 | 148 | 142 |
| 79 | 19 | 44 | 159 | 174 | 155 | 136 | 94 | 43 | 49 | 152 | 161 | 66 | 3 | 121 | 135 | 147 | 17 | 157 | 30 | 153 | 154 |
| 137 | 168 | 92 | 149 | 171 | 10 | 177 | 134 | 143 | 176 | 179 | 105 | 172 | 47 | 146 | 160 | 23 | 175 | 141 | 91 | 140 | 163 |
| 132 | 6 | 126 | 124 | 12 | 170 | 167 | 151 | 125 | 139 | 150 | 15 | 129 | 162 | 120 | 166 | 156 | 62 | 158 | 178 | 128 | 127 |
| 22 | 122 | 123 | 138 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 36 | 64 | 40 | 1 | 26 | 112 | 29 | 34 | 152 | 149 | 141 | 15 | 21 | 95 | 28 | 93 | 65 | 80 | 114 | 5 | 161 | 171 |
| 91 | 129 | 117 | 63 | 72 | 56 | 83 | 90 | 7 | 102 | 66 | 10 | 140 | 162 | 71 | 100 | 11 | 69 | 165 | 32 | 110 | 148 |
| 3 | 177 | 163 | 120 | 38 | 9 | 73 | 96 | 107 | 173 | 99 | 142 | 121 | 134 | 132 | 166 | 108 | 82 | 86 | 35 | 0 | 76 |
| 53 | 79 | 135 | 143 | 6 | 156 | 42 | 51 | 131 | 57 | 52 | 33 | 133 | 19 | 147 | 176 | 126 | 62 | 61 | 45 | 84 | 116 |
| 144 | 16 | 70 | 44 | 17 | 179 | 124 | 158 | 13 | 78 | 111 | 130 | 75 | 77 | 87 | 159 | 157 | 105 | 12 | 178 | 88 | 31 |
| 24 | 55 | 101 | 164 | 106 | 174 | 30 | 172 | 170 | 128 | 97 | 18 | 58 | 74 | 8 | 104 | 145 | 155 | 153 | 47 | 167 | 127 |
| 68 | 103 | 60 | 41 | 115 | 46 | 4 | 136 | 154 | 146 | 151 | 22 | 2 | 39 | 81 | 169 | 118 | 20 | 113 | 94 | 137 | 160 |
| 125 | 122 | 67 | 119 | 37 | 54 | 85 | 98 | 27 | 43 | 168 | 23 | 139 | 123 | 50 | 25 | 89 | 14 | 48 | 109 | 59 | 49 |
| 92 | 175 | 150 | 138 | | | | | | | | | | | | | | | | | | |

FIG. 300

4096QAM CR 11/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 77 | 97 | 3 | 44 | 119 | 72 | 83 | 116 | 40 | 0 | 111 | 8 | 68 | 43 | 24 | 102 | 49 | 92 | 65 | 31 | 93 | 60 |
| 17 | 76 | 89 | 118 | 70 | 87 | 15 | 67 | 22 | 59 | 95 | 46 | 38 | 125 | 48 | 58 | 140 | 104 | 73 | 47 | 14 | 120 |
| 1 | 50 | 80 | 63 | 62 | 45 | 9 | 25 | 114 | 19 | 82 | 54 | 150 | 121 | 130 | 123 | 37 | 55 | 23 | 98 | 81 | 122 |
| 103 | 85 | 126 | 101 | 78 | 5 | 128 | 148 | 57 | 12 | 107 | 36 | 2 | 109 | 52 | 39 | 66 | 115 | 42 | 156 | 90 | 51 |
| 91 | 29 | 84 | 18 | 144 | 10 | 94 | 64 | 100 | 86 | 71 | 27 | 30 | 32 | 110 | 33 | 113 | 131 | 35 | 34 | 112 | 26 |
| 108 | 16 | 61 | 56 | 75 | 41 | 117 | 69 | 172 | 96 | 149 | 127 | 124 | 173 | 13 | 74 | 105 | 53 | 161 | 146 | 174 | 79 |
| 88 | 28 | 129 | 134 | 139 | 136 | 145 | 170 | 135 | 158 | 154 | 162 | 7 | 169 | 99 | 106 | 137 | 165 | 143 | 4 | 175 | 138 |
| 133 | 171 | 168 | 147 | 167 | 141 | 163 | 176 | 179 | 142 | 11 | 177 | 153 | 151 | 159 | 132 | 20 | 164 | 6 | 157 | 178 | 21 |
| 166 | 155 | 160 | 152 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 77 | 102 | 22 | 50 | 37 | 12 | 84 | 131 | 149 | 134 | 143 | 177 | 97 | 49 | 59 | 80 | 55 | 107 | 18 | 35 | 127 | 139 |
| 4 | 153 | 3 | 92 | 95 | 63 | 23 | 36 | 144 | 34 | 124 | 136 | 175 | 151 | 44 | 65 | 46 | 62 | 98 | 2 | 10 | 112 |
| 173 | 145 | 138 | 159 | 119 | 31 | 38 | 45 | 81 | 109 | 94 | 26 | 13 | 170 | 133 | 132 | 72 | 93 | 125 | 9 | 122 | 52 |
| 64 | 108 | 74 | 135 | 171 | 20 | 83 | 60 | 48 | 25 | 103 | 39 | 100 | 16 | 105 | 158 | 168 | 164 | 116 | 17 | 58 | 114 |
| 85 | 66 | 86 | 61 | 53 | 154 | 147 | 6 | 40 | 76 | 140 | 19 | 126 | 115 | 71 | 56 | 161 | 162 | 167 | 157 | 0 | 89 |
| 104 | 82 | 101 | 42 | 27 | 75 | 146 | 7 | 141 | 178 | 111 | 118 | 73 | 54 | 78 | 156 | 30 | 41 | 174 | 169 | 163 | 21 |
| 8 | 70 | 47 | 150 | 5 | 90 | 32 | 117 | 79 | 99 | 176 | 166 | 68 | 87 | 14 | 121 | 128 | 51 | 110 | 69 | 88 | 106 |
| 179 | 155 | 43 | 15 | 120 | 130 | 148 | 91 | 33 | 172 | 28 | 137 | 142 | 160 | 24 | 67 | 1 | 123 | 57 | 29 | 113 | 96 |
| 129 | 165 | 11 | 152 | | | | | | | | | | | | | | | | | | |

FIG. 301

4096QAM CR 12/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 110 | 16 | 64 | 100 | 55 | 70 | 48 | 26 | 60 | 71 | 93 | 1 | 59 | 88 | 97 | 136 | 67 | 94 | 90 | 72 | 49 | 23 |
| 41 | 92 | 9 | 35 | 37 | 113 | 101 | 111 | 8 | 52 | 56 | 19 | 134 | 151 | 84 | 126 | 159 | 63 | 44 | 65 | 139 | 31 |
| 57 | 103 | 22 | 116 | 172 | 38 | 95 | 36 | 46 | 141 | 114 | 4 | 106 | 149 | 85 | 86 | 66 | 51 | 121 | 105 | 109 | 87 |
| 6 | 135 | 127 | 47 | 123 | 39 | 10 | 148 | 43 | 131 | 147 | 45 | 143 | 5 | 108 | 81 | 2 | 140 | 120 | 132 | 76 | 58 |
| 137 | 18 | 29 | 125 | 17 | 30 | 32 | 156 | 133 | 78 | 91 | 161 | 104 | 174 | 53 | 61 | 50 | 74 | 77 | 33 | 171 | 138 |
| 28 | 69 | 112 | 119 | 12 | 102 | 20 | 167 | 99 | 122 | 117 | 24 | 98 | 115 | 124 | 42 | 7 | 79 | 75 | 128 | 82 | 68 |
| 80 | 3 | 11 | 54 | 96 | 40 | 129 | 142 | 107 | 73 | 175 | 14 | 83 | 150 | 165 | 118 | 89 | 130 | 15 | 163 | 34 | 166 |
| 173 | 146 | 168 | 153 | 154 | 177 | 62 | 145 | 0 | 178 | 155 | 157 | 179 | 144 | 158 | 152 | 13 | 25 | 176 | 162 | 169 | 164 |
| 27 | 21 | 160 | 170 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 110 | 136 | 8 | 103 | 66 | 131 | 29 | 74 | 117 | 54 | 15 | 157 | 16 | 67 | 52 | 22 | 51 | 147 | 125 | 77 | 24 | 96 |
| 163 | 179 | 64 | 94 | 56 | 116 | 121 | 45 | 17 | 33 | 98 | 40 | 34 | 144 | 100 | 90 | 19 | 172 | 105 | 143 | 30 | 171 |
| 115 | 129 | 166 | 158 | 55 | 72 | 134 | 38 | 109 | 5 | 32 | 138 | 124 | 142 | 173 | 152 | 70 | 49 | 151 | 95 | 87 | 108 |
| 156 | 28 | 42 | 107 | 146 | 13 | 48 | 23 | 84 | 36 | 6 | 81 | 133 | 69 | 7 | 73 | 168 | 25 | 26 | 41 | 126 | 46 |
| 135 | 2 | 78 | 112 | 79 | 175 | 153 | 176 | 60 | 92 | 159 | 141 | 127 | 140 | 91 | 119 | 75 | 14 | 154 | 162 | 71 | 9 |
| 63 | 114 | 47 | 120 | 161 | 12 | 128 | 83 | 177 | 169 | 93 | 35 | 44 | 4 | 123 | 132 | 104 | 102 | 82 | 150 | 62 | 164 |
| 1 | 37 | 65 | 106 | 39 | 76 | 174 | 20 | 68 | 165 | 145 | 27 | 59 | 113 | 139 | 149 | 10 | 58 | 53 | 167 | 80 | 118 |
| 0 | 21 | 88 | 101 | 31 | 85 | 148 | 137 | 61 | 99 | 3 | 89 | 178 | 160 | 97 | 111 | 57 | 86 | 43 | 18 | 50 | 122 |
| 11 | 130 | 155 | 170 | | | | | | | | | | | | | | | | | | |

FIG. 302

4096QAM CR 13/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 87 | 50 | 6 | 42 | 82 | 54 | 96 | 0 | 62 | 124 | 109 | 126 | 23 | 64 | 53 | 20 | 41 | 111 | 145 | 135 | 68 | 2 |
| 122 | 128 | 107 | 7 | 28 | 14 | 125 | 136 | 154 | 10 | 92 | 99 | 84 | 86 | 151 | 108 | 24 | 94 | 148 | 29 | 123 | 13 |
| 88 | 52 | 35 | 61 | 102 | 132 | 95 | 70 | 40 | 129 | 101 | 36 | 51 | 150 | 142 | 152 | 121 | 131 | 116 | 97 | 104 | 31 |
| 59 | 137 | 83 | 112 | 113 | 57 | 77 | 32 | 93 | 49 | 58 | 117 | 78 | 1 | 149 | 37 | 11 | 100 | 85 | 79 | 72 | 66 |
| 130 | 18 | 63 | 55 | 91 | 46 | 146 | 21 | 143 | 44 | 110 | 75 | 138 | 16 | 76 | 45 | 114 | 144 | 119 | 38 | 140 | 65 |
| 30 | 133 | 153 | 33 | 89 | 71 | 115 | 105 | 90 | 56 | 25 | 103 | 147 | 73 | 60 | 47 | 118 | 27 | 69 | 9 | 74 | 48 |
| 19 | 39 | 43 | 34 | 81 | 139 | 3 | 164 | 106 | 134 | 5 | 67 | 80 | 141 | 120 | 98 | 155 | 8 | 156 | 162 | 163 | 165 |
| 26 | 161 | 168 | 176 | 159 | 170 | 4 | 127 | 22 | 173 | 157 | 171 | 178 | 158 | 17 | 174 | 179 | 167 | 12 | 172 | 166 | 160 |
| 177 | 169 | 175 | 15 | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 87 | 20 | 154 | 52 | 121 | 49 | 63 | 144 | 25 | 34 | 156 | 171 | 50 | 41 | 10 | 35 | 131 | 58 | 55 | 119 | 103 | 81 |
| 162 | 178 | 6 | 111 | 92 | 61 | 116 | 117 | 91 | 38 | 147 | 139 | 163 | 158 | 42 | 145 | 99 | 102 | 97 | 78 | 46 | 140 |
| 73 | 3 | 165 | 17 | 82 | 135 | 84 | 132 | 104 | 1 | 146 | 65 | 60 | 164 | 26 | 174 | 54 | 68 | 86 | 95 | 31 | 149 |
| 21 | 30 | 47 | 106 | 161 | 179 | 96 | 2 | 151 | 70 | 59 | 37 | 143 | 133 | 118 | 134 | 168 | 167 | 0 | 122 | 108 | 40 |
| 137 | 11 | 44 | 153 | 27 | 5 | 176 | 12 | 62 | 128 | 24 | 129 | 83 | 100 | 110 | 33 | 69 | 67 | 159 | 172 | 124 | 107 |
| 94 | 101 | 112 | 85 | 75 | 89 | 9 | 80 | 170 | 166 | 109 | 7 | 148 | 36 | 113 | 79 | 138 | 71 | 74 | 141 | 4 | 160 |
| 126 | 28 | 29 | 51 | 57 | 72 | 16 | 115 | 48 | 120 | 127 | 177 | 23 | 14 | 123 | 150 | 77 | 66 | 76 | 105 | 19 | 98 |
| 22 | 169 | 64 | 125 | 13 | 142 | 32 | 130 | 45 | 90 | 39 | 155 | 173 | 175 | 53 | 136 | 88 | 152 | 93 | 18 | 114 | 56 |
| 43 | 8 | 157 | 15 | | | | | | | | | | | | | | | | | | |

FIG. 303

| MOD \ CR | 2 | 3 | 4 | 5 | 6 | 7 | 8 | 9 | 10 | 11 | 12 | 13 |
|---|---|---|---|---|---|---|---|---|---|---|---|---|
| 2 | A | A | A | A | B | B | A | B | A | A | A | A |
| 4 | A | A | A | A | B | B | A | B | A | B | A | B |
| 6 | A | A | A | A | B | B | A | B | A | A | A | A |
| 8 | A | A | A | A | B | A | A | A | A | B | A | A |

FIG. 307

QPSK CR 5/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 35 | 7 | 29 | 11 | 14 | 32 | 38 | 28 | 20 | 17 | 25 | 39 | 19 | 4 | 1 | 12 | 10 | 30 | 0 | 44 | 43 | 2 |
| 21 | 5 | 13 | 34 | 37 | 23 | 15 | 36 | 18 | 42 | 16 | 33 | 31 | 27 | 22 | 3 | 6 | 40 | 24 | 41 | 9 | 26 |
| 8 | | | | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 35 | 21 | 7 | 5 | 29 | 13 | 11 | 34 | 14 | 37 | 32 | 23 | 38 | 15 | 28 | 36 | 20 | 18 | 17 | 42 | 25 | 16 |
| 39 | 33 | 19 | 31 | 4 | 27 | 1 | 22 | 12 | 3 | 10 | 6 | 30 | 40 | 0 | 24 | 44 | 41 | 43 | 9 | 2 | 26 |
| 8 | | | | | | | | | | | | | | | | | | | | | |

FIG. 308

QPSK CR 6/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 7 | 4 | 0 | 5 | 27 | 30 | 25 | 13 | 31 | 9 | 34 | 10 | 17 | 11 | 8 | 12 | 15 | 16 | 18 | 19 | 20 | 21 |
| 22 | 23 | 1 | 35 | 24 | 29 | 33 | 6 | 26 | 14 | 32 | 28 | 2 | 3 | 36 | 37 | 38 | 39 | 40 | 41 | 42 | 43 |
| 44 | | | | | | | | | | | | | | | | | | | | | |

⇨

CONVERTED PATTERN (A):

| | | | | | | | | | | | | | | | | | | | | | |
|---|---|---|---|---|---|---|---|---|---|---|---|---|---|---|---|---|---|---|---|---|---|
| 7 | 0 | 27 | 25 | 31 | 34 | 17 | 8 | 15 | 18 | 20 | 22 | 1 | 24 | 33 | 26 | 32 | 2 | 36 | 38 | 40 | 42 |
| 4 | 5 | 30 | 13 | 9 | 10 | 11 | 12 | 16 | 19 | 21 | 23 | 35 | 29 | 6 | 14 | 28 | 3 | 37 | 39 | 41 | 43 |
| 44 | | | | | | | | | | | | | | | | | | | | | |

FIG. 309

QPSK CR 7/15:

ORIGINAL PATTERN (B):

| | | | | | | | | | | | | | | | | | | | | | |
|---|---|---|---|---|---|---|---|---|---|---|---|---|---|---|---|---|---|---|---|---|---|
| 3 | 7 | 1 | 4 | 18 | 21 | 22 | 6 | 9 | 5 | 17 | 14 | 13 | 15 | 10 | 20 | 8 | 19 | 16 | 12 | 0 | 11 |
| 2 | 23 | 24 | 25 | 26 | 27 | 28 | 29 | 30 | 31 | 32 | 33 | 34 | 35 | 36 | 37 | 38 | 39 | 40 | 41 | 42 | 43 |

| |
|---|
| 44 |

BIT GROUP

⇨

CONVERTED PATTERN (A):

| | | | | | | | | | | | | | | | | | | | | | |
|---|---|---|---|---|---|---|---|---|---|---|---|---|---|---|---|---|---|---|---|---|---|
| 3 | 1 | 18 | 22 | 9 | 17 | 13 | 10 | 8 | 16 | 0 | 2 | 24 | 26 | 28 | 30 | 32 | 34 | 36 | 38 | 40 | 42 |
| 7 | 4 | 21 | 6 | 5 | 14 | 15 | 20 | 19 | 12 | 11 | 23 | 25 | 27 | 29 | 31 | 33 | 35 | 37 | 39 | 41 | 43 |

| |
|---|
| 44 |

FIG. 312

QPSK CR 10/15:

ORIGINAL PATTERN (A):

| | | | | | | | | | | | | | | | | | | | | | |
|---|---|---|---|---|---|---|---|---|---|---|---|---|---|---|---|---|---|---|---|---|---|
| 1 | 4 | 5 | 6 | 24 | 21 | 18 | 7 | 17 | 12 | 8 | 20 | 23 | 29 | 28 | 30 | 32 | 34 | 36 | 38 | 40 | 42 |
| 0 | 2 | 3 | 14 | 22 | 13 | 10 | 25 | 9 | 27 | 19 | 16 | 15 | 26 | 11 | 31 | 33 | 35 | 37 | 39 | 41 | 43 |

| |
|---|
| 44 |

BIT GROUP

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 1 | 0 | 4 | 2 | 5 | 3 | 6 | 14 | 24 | 22 | 21 | 13 | 18 | 10 | 7 | 25 | 17 | 9 | 12 | 27 | 8 | 19 |
| 20 | 16 | 23 | 15 | 29 | 26 | 28 | 11 | 30 | 31 | 32 | 33 | 34 | 35 | 36 | 37 | 38 | 39 | 40 | 41 | 42 | 43 |

| |
|---|
| 44 |

FIG. 315

QPSK CR 13/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 26 | 10 | 12 | 38 | 28 | 15 | 0 | 44 | 34 | 24 | 14 | 8 | 40 | 30 | 20 | 13 | 42 | 32 | 22 | 11 | 9 | 36 |
| 25 | 7 | 5 | 37 | 27 | 4 | 16 | 43 | 33 | 23 | 2 | 18 | 39 | 29 | 19 | 6 | 41 | 31 | 21 | 3 | 17 | 35 |
| 1 | | | | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 26 | 25 | 10 | 7 | 12 | 5 | 38 | 37 | 28 | 27 | 15 | 4 | 0 | 16 | 44 | 43 | 34 | 33 | 24 | 23 | 14 | 2 |
| 8 | 18 | 40 | 39 | 30 | 29 | 20 | 19 | 13 | 6 | 42 | 41 | 32 | 31 | 22 | 21 | 11 | 3 | 9 | 17 | 36 | 35 |
| 1 | | | | | | | | | | | | | | | | | | | | | |

FIG. 316

16QAM CR 2/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 5 | 33 | 18 | 8 | 29 | 10 | 21 | 14 | 30 | 26 | 11 | 23 | 27 | 4 | 7 | 6 | 24 | 44 | 38 | 31 | 34 | 43 |
| 13 | 0 | 15 | 42 | 17 | 2 | 20 | 12 | 40 | 39 | 35 | 32 | 1 | 3 | 41 | 37 | 9 | 25 | 19 | 22 | 16 | 28 |
| 36 | | | | | | | | | | | | | | | | | | | | | |

CONVERTED PATTERN (B):

| | | | | | | | | | | | | | | | | | | | | | |
|---|---|---|---|---|---|---|---|---|---|---|---|---|---|---|---|---|---|---|---|---|---|
| 5 | 23 | 13 | 32 | 33 | 27 | 0 | 1 | 18 | 4 | 15 | 3 | 8 | 7 | 42 | 41 | 29 | 6 | 17 | 37 | 10 | 24 |
| 2 | 9 | 21 | 44 | 20 | 25 | 14 | 38 | 12 | 19 | 30 | 31 | 40 | 22 | 26 | 34 | 39 | 16 | 11 | 43 | 35 | 28 |
| 36 | | | | | | | | | | | | | | | | | | | | | |

FIG. 317

16QAM CR 3/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 18 | 16 | 5 | 29 | 26 | 43 | 23 | 6 | 1 | 24 | 7 | 19 | 37 | 2 | 27 | 3 | 10 | 15 | 36 | 39 | 22 | 12 |
| 35 | 33 | 4 | 17 | 30 | 31 | 21 | 9 | 11 | 41 | 0 | 32 | 20 | 40 | 25 | 8 | 34 | 38 | 28 | 14 | 44 | 13 |
| 42 | | | | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 18 | 19 | 35 | 32 | 16 | 37 | 33 | 20 | 5 | 2 | 4 | 40 | 29 | 27 | 17 | 25 | 26 | 3 | 30 | 8 | 43 | 10 |
| 31 | 34 | 23 | 15 | 21 | 38 | 6 | 36 | 9 | 28 | 1 | 39 | 11 | 14 | 24 | 22 | 41 | 44 | 7 | 12 | 0 | 13 |
| 42 | | | | | | | | | | | | | | | | | | | | | |

FIG. 318

16QAM CR 4/15:

ORIGINAL PATTERN (A):

| | | | | | | | | | | | | | | | | | | | | | |
|---|---|---|---|---|---|---|---|---|---|---|---|---|---|---|---|---|---|---|---|---|---|
| 34 | 3 | 19 | 35 | 25 | 2 | 17 | 36 | 26 | 38 | 0 | 40 | 27 | 10 | 7 | 43 | 21 | 28 | 15 | 6 | 1 | 37 |
| 18 | 30 | 32 | 33 | 29 | 22 | 12 | 13 | 5 | 23 | 44 | 14 | 4 | 31 | 20 | 39 | 42 | 11 | 9 | 16 | 41 | 8 |
| 24 | | | | | | | | | | | | | | | | | | | | | |

BIT GROUP

⇨

CONVERTED PATTERN (B):

| | | | | | | | | | | | | | | | | | | | | | |
|---|---|---|---|---|---|---|---|---|---|---|---|---|---|---|---|---|---|---|---|---|---|
| 34 | 40 | 18 | 14 | 3 | 27 | 30 | 4 | 19 | 10 | 32 | 31 | 35 | 7 | 33 | 20 | 25 | 43 | 29 | 39 | 2 | 21 |
| 22 | 42 | 17 | 28 | 12 | 11 | 36 | 15 | 13 | 9 | 26 | 6 | 5 | 16 | 38 | 1 | 23 | 41 | 0 | 37 | 44 | 8 |
| 24 | | | | | | | | | | | | | | | | | | | | | |

FIG. 319

16QAM CR 5/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 3 | 33 | 39 | 2 | 38 | 29 | 0 | 10 | 25 | 17 | 7 | 21 | 44 | 37 | 8 | 34 | 20 | 1 | 4 | 31 | 11 | 42 |
| 22 | 13 | 12 | 28 | 26 | 43 | 30 | 14 | 16 | 23 | 24 | 15 | 5 | 18 | 9 | 36 | 6 | 19 | 32 | 40 | 41 | 35 |
| 27 | | | | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 3 | 21 | 22 | 15 | 33 | 44 | 13 | 5 | 39 | 37 | 12 | 18 | 2 | 8 | 28 | 9 | 38 | 34 | 26 | 36 | 29 | 20 |
| 43 | 6 | 0 | 1 | 30 | 19 | 10 | 4 | 14 | 32 | 25 | 31 | 16 | 40 | 17 | 11 | 23 | 41 | 7 | 42 | 24 | 35 |
| 27 | | | | | | | | | | | | | | | | | | | | | |

FIG. 321

16QAM CR 7/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 19 | 3 | 32 | 38 | 16 | 17 | 29 | 33 | 14 | 10 | 6 | 2 | 20 | 15 | 40 | 39 | 12 | 22 | 23 | 34 | 31 | 13 |
| 44 | 43 | 36 | 24 | 37 | 42 | 0 | 9 | 4 | 21 | 5 | 35 | 26 | 41 | 7 | 28 | 11 | 25 | 8 | 18 | 1 | 30 |
| 27 | | | | | | | | | | | | | | | | | | | | | |

⇨

CONVERTED PATTERN (A):

| | | | | | | | | | | | | | | | | | | | | | |
|---|---|---|---|---|---|---|---|---|---|---|---|---|---|---|---|---|---|---|---|---|---|
| 19 | 16 | 14 | 20 | 12 | 31 | 36 | 0 | 5 | 7 | 8 | 3 | 17 | 10 | 15 | 22 | 13 | 24 | 9 | 35 | 28 | 18 |
| 32 | 29 | 6 | 40 | 23 | 44 | 37 | 4 | 26 | 11 | 1 | 38 | 33 | 2 | 39 | 34 | 43 | 42 | 21 | 41 | 25 | 30 |
| 27 | | | | | | | | | | | | | | | | | | | | | |

FIG. 322

16QAM CR 8/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 36 | 5 | 22 | 26 | 1 | 13 | 3 | 33 | 9 | 6 | 23 | 20 | 35 | 10 | 17 | 41 | 30 | 15 | 21 | 42 | 29 | 11 |
| 37 | 4 | 2 | 38 | 44 | 0 | 18 | 19 | 8 | 31 | 28 | 43 | 14 | 34 | 32 | 25 | 40 | 12 | 16 | 24 | 39 | 27 |
| 7 | | | | | | | | | | | | | | | | | | | | | |

CONVERTED PATTERN (B):

| | | | | | | | | | | | | | | | | | | | | | |
|---|---|---|---|---|---|---|---|---|---|---|---|---|---|---|---|---|---|---|---|---|---|
| 36 | 20 | 37 | 43 | 5 | 35 | 4 | 14 | 22 | 10 | 2 | 34 | 26 | 17 | 38 | 32 | 1 | 41 | 44 | 25 | 13 | 30 |
| 0 | 40 | 3 | 15 | 18 | 12 | 33 | 21 | 19 | 16 | 9 | 42 | 8 | 24 | 6 | 29 | 31 | 39 | 23 | 11 | 28 | 27 |
| 7 | | | | | | | | | | | | | | | | | | | | | |

FIG. 323

16QAM CR 9/15:

ORIGINAL PATTERN (B):

| | | | | | | | | | | | | | | | | | | | | | |
|---|---|---|---|---|---|---|---|---|---|---|---|---|---|---|---|---|---|---|---|---|---|
| 4 | 6 | 19 | 2 | 5 | 30 | 20 | 11 | 22 | 12 | 15 | 0 | 36 | 37 | 38 | 39 | 26 | 14 | 34 | 35 | 16 | 13 |
| 18 | 42 | 7 | 10 | 25 | 43 | 40 | 17 | 41 | 24 | 33 | 31 | 23 | 32 | 21 | 3 | 27 | 28 | 8 | 9 | 29 | 1 |
| 44 | | | | | | | | | | | | | | | | | | | | | |

BIT GROUP

CONVERTED PATTERN (A):

| | | | | | | | | | | | | | | | | | | | | | |
|---|---|---|---|---|---|---|---|---|---|---|---|---|---|---|---|---|---|---|---|---|---|
| 4 | 5 | 22 | 36 | 26 | 16 | 7 | 40 | 33 | 21 | 8 | 6 | 30 | 12 | 37 | 14 | 13 | 10 | 17 | 31 | 3 | 9 |
| 19 | 20 | 15 | 38 | 34 | 18 | 25 | 41 | 23 | 27 | 29 | 2 | 11 | 0 | 39 | 35 | 42 | 43 | 24 | 32 | 28 | 1 |
| 44 | | | | | | | | | | | | | | | | | | | | | |

FIG. 324

16QAM CR 10/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 27 | 11 | 20 | 1 | 7 | 5 | 29 | 35 | 9 | 10 | 34 | 18 | 25 | 28 | 6 | 13 | 17 | 0 | 23 | 16 | 41 | 15 |
| 19 | 44 | 24 | 37 | 4 | 31 | 8 | 32 | 14 | 42 | 12 | 2 | 40 | 30 | 36 | 39 | 43 | 21 | 3 | 22 | 26 | 33 |
| 38 | | | | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 27 | 18 | 19 | 2 | 11 | 25 | 44 | 40 | 20 | 28 | 24 | 30 | 1 | 6 | 37 | 36 | 7 | 13 | 4 | 39 | 5 | 17 |
| 31 | 43 | 29 | 0 | 8 | 21 | 35 | 23 | 32 | 3 | 9 | 16 | 14 | 22 | 10 | 41 | 42 | 26 | 34 | 15 | 12 | 33 |
| 38 | | | | | | | | | | | | | | | | | | | | | |

FIG. 325

16QAM CR 11/15:

ORIGINAL PATTERN (B):

| | | | | | | | | | | | | | | | | | | | | | |
|---|---|---|---|---|---|---|---|---|---|---|---|---|---|---|---|---|---|---|---|---|---|
| 2 | 4 | 41 | 8 | 13 | 7 | 0 | 24 | 3 | 22 | 5 | 32 | 10 | 9 | 36 | 37 | 29 | 11 | 25 | 16 | 20 | 21 |
| 35 | 34 | 15 | 1 | 6 | 14 | 27 | 30 | 33 | 12 | 17 | 28 | 23 | 40 | 26 | 31 | 38 | 39 | 18 | 19 | 42 | 43 |
| 44 | | | | | | | | | | | | | | | | | | | | | |

BIT GROUP

⇒

CONVERTED PATTERN (A):

| | | | | | | | | | | | | | | | | | | | | | |
|---|---|---|---|---|---|---|---|---|---|---|---|---|---|---|---|---|---|---|---|---|---|
| 2 | 13 | 3 | 10 | 29 | 20 | 15 | 27 | 17 | 26 | 18 | 4 | 7 | 22 | 9 | 11 | 21 | 1 | 30 | 28 | 31 | 19 |
| 41 | 0 | 5 | 36 | 25 | 35 | 6 | 33 | 23 | 38 | 42 | 8 | 24 | 32 | 37 | 16 | 34 | 14 | 12 | 40 | 39 | 43 |
| 44 | | | | | | | | | | | | | | | | | | | | | |

FIG. 326

16QAM CR 12/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 3 | 6 | 7 | 27 | 2 | 23 | 10 | 30 | 22 | 28 | 24 | 20 | 37 | 21 | 4 | 14 | 11 | 42 | 16 | 9 | 15 | 26 |
| 33 | 40 | 5 | 8 | 44 | 34 | 18 | 0 | 32 | 29 | 19 | 41 | 38 | 17 | 25 | 43 | 35 | 36 | 13 | 39 | 12 | 1 |
| 31 | | | | | | | | | | | | | | | | | | | | | |

⇨

CONVERTED PATTERN (B):

| | | | | | | | | | | | | | | | | | | | | | |
|---|---|---|---|---|---|---|---|---|---|---|---|---|---|---|---|---|---|---|---|---|---|
| 3 | 20 | 33 | 41 | 6 | 37 | 40 | 38 | 7 | 21 | 5 | 17 | 27 | 4 | 8 | 25 | 2 | 14 | 44 | 43 | 23 | 11 |
| 34 | 35 | 10 | 42 | 18 | 36 | 30 | 16 | 0 | 13 | 22 | 9 | 32 | 39 | 28 | 15 | 29 | 12 | 24 | 26 | 19 | 1 |
| 31 | | | | | | | | | | | | | | | | | | | | | |

FIG. 327

16QAM CR 13/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 12 | 7 | 20 | 43 | 29 | 13 | 32 | 30 | 25 | 0 | 17 | 18 | 9 | 1 | 41 | 42 | 6 | 33 | 28 | 14 | 16 | 11 |
| 39 | 40 | 15 | 4 | 23 | 5 | 2 | 24 | 22 | 38 | 10 | 8 | 19 | 34 | 26 | 36 | 37 | 27 | 21 | 31 | 3 | 35 |
| 44 | | | | | | | | | | | | | | | | | | | | | |

⇩

CONVERTED PATTERN (A):

| | | | | | | | | | | | | | | | | | | | | | |
|---|---|---|---|---|---|---|---|---|---|---|---|---|---|---|---|---|---|---|---|---|---|
| 12 | 29 | 25 | 9 | 6 | 16 | 15 | 2 | 10 | 26 | 21 | 7 | 13 | 0 | 1 | 33 | 11 | 4 | 24 | 8 | 36 | 31 |
| 20 | 32 | 17 | 41 | 28 | 39 | 23 | 22 | 19 | 37 | 3 | 43 | 30 | 18 | 42 | 14 | 40 | 5 | 38 | 34 | 27 | 35 |
| 44 | | | | | | | | | | | | | | | | | | | | | |

FIG. 328

64QAM CR 2/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 7 | 11 | 4 | 38 | 19 | 25 | 2 | 43 | 15 | 26 | 18 | 14 | 9 | 29 | 44 | 32 | 0 | 5 | 35 | 10 | 1 | 12 |
| 6 | 36 | 21 | 33 | 37 | 34 | 3 | 31 | 20 | 16 | 40 | 23 | 41 | 22 | 30 | 39 | 13 | 24 | 17 | 42 | 28 | 8 |
| 27 | | | | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 7 | 43 | 44 | 12 | 3 | 22 | 11 | 15 | 32 | 6 | 31 | 30 | 4 | 26 | 0 | 36 | 20 | 39 | 38 | 18 | 5 | 21 |
| 16 | 13 | 19 | 14 | 35 | 33 | 40 | 24 | 25 | 9 | 10 | 37 | 23 | 17 | 2 | 29 | 1 | 34 | 41 | 42 | 28 | 8 |
| 27 | | | | | | | | | | | | | | | | | | | | | |

FIG. 330

64QAM CR 4/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 41 | 34 | 32 | 37 | 5 | 8 | 13 | 15 | 30 | 31 | 22 | 25 | 42 | 20 | 23 | 17 | 1 | 40 | 44 | 12 | 6 | 43 |
| 7 | 29 | 33 | 16 | 11 | 0 | 35 | 4 | 14 | 28 | 21 | 3 | 24 | 19 | 18 | 36 | 10 | 38 | 26 | 2 | 39 | 27 |
| 9 | | | | | | | | | | | | | | | | | | | | | |

CONVERTED PATTERN (B):

| | | | | | | | | | | | | | | | | | | | | | |
|---|---|---|---|---|---|---|---|---|---|---|---|---|---|---|---|---|---|---|---|---|---|
| 41 | 15 | 23 | 43 | 35 | 19 | 34 | 30 | 17 | 7 | 4 | 18 | 32 | 31 | 1 | 29 | 14 | 36 | 37 | 22 | 40 | 33 |
| 28 | 10 | 5 | 25 | 44 | 16 | 21 | 38 | 8 | 42 | 12 | 11 | 3 | 26 | 13 | 20 | 6 | 0 | 24 | 2 | 39 | 27 |
| 9 | | | | | | | | | | | | | | | | | | | | | |

FIG. 331

64QAM CR 5/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 25 | 44 | 8 | 39 | 37 | 2 | 11 | 7 | 0 | 12 | 4 | 31 | 33 | 38 | 43 | 21 | 26 | 13 | 28 | 29 | 1 | 27 |
| 18 | 17 | 34 | 3 | 42 | 10 | 19 | 20 | 32 | 36 | 40 | 9 | 41 | 5 | 35 | 30 | 22 | 15 | 16 | 6 | 24 | 23 |
| 14 | | | | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 25 | 7 | 43 | 27 | 19 | 5 | 44 | 0 | 21 | 18 | 20 | 35 | 8 | 12 | 26 | 17 | 32 | 30 | 39 | 4 | 13 | 34 |
| 36 | 22 | 37 | 31 | 28 | 3 | 40 | 15 | 2 | 33 | 29 | 42 | 9 | 16 | 11 | 38 | 1 | 10 | 41 | 6 | 24 | 23 |
| 14 | | | | | | | | | | | | | | | | | | | | | |

FIG. 332

64QAM CR 6/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 31 | 12 | 39 | 32 | 30 | 24 | 28 | 15 | 38 | 23 | 27 | 41 | 0 | 6 | 17 | 37 | 42 | 20 | 11 | 4 | 40 | 2 |
| 3 | 26 | 10 | 7 | 13 | 25 | 1 | 18 | 8 | 5 | 14 | 36 | 35 | 33 | 22 | 9 | 44 | 16 | 34 | 19 | 21 | 29 |
| 43 | | | | | | | | | | | | | | | | | | | | | |

⇨

CONVERTED PATTERN (A):

| | | | | | | | | | | | | | | | | | | | | | |
|---|---|---|---|---|---|---|---|---|---|---|---|---|---|---|---|---|---|---|---|---|---|
| 31 | 28 | 0 | 11 | 10 | 8 | 22 | 12 | 15 | 6 | 4 | 7 | 5 | 9 | 39 | 38 | 17 | 40 | 13 | 14 | 44 | 32 |
| 23 | 37 | 2 | 25 | 36 | 16 | 30 | 27 | 42 | 3 | 1 | 35 | 34 | 24 | 41 | 20 | 26 | 18 | 33 | 19 | 21 | 29 |
| 43 | | | | | | | | | | | | | | | | | | | | | |

FIG. 335

64QAM CR 9/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 21 | 5 | 43 | 38 | 40 | 1 | 3 | 17 | 11 | 37 | 10 | 41 | 9 | 15 | 25 | 44 | 14 | 27 | 7 | 18 | 20 | 35 |
| 16 | 0 | 6 | 19 | 8 | 22 | 29 | 28 | 34 | 31 | 33 | 30 | 32 | 42 | 13 | 4 | 24 | 26 | 36 | 2 | 23 | 12 |
| 39 | | | | | | | | | | | | | | | | | | | | | |

⇩

CONVERTED PATTERN (A):

| | | | | | | | | | | | | | | | | | | | | | |
|---|---|---|---|---|---|---|---|---|---|---|---|---|---|---|---|---|---|---|---|---|---|
| 21 | 3 | 9 | 7 | 6 | 34 | 13 | 5 | 17 | 15 | 18 | 19 | 31 | 4 | 43 | 11 | 25 | 20 | 8 | 33 | 24 | 38 |
| 37 | 44 | 35 | 22 | 30 | 26 | 40 | 10 | 14 | 16 | 29 | 32 | 36 | 1 | 41 | 27 | 0 | 28 | 42 | 2 | 23 | 12 |
| 39 | | | | | | | | | | | | | | | | | | | | | |

FIG. 336

64QAM CR 10/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 14 | 22 | 18 | 11 | 28 | 26 | 2 | 38 | 10 | 0 | 5 | 12 | 24 | 17 | 29 | 16 | 39 | 13 | 23 | 8 | 25 | 43 |
| 34 | 33 | 27 | 15 | 7 | 1 | 9 | 35 | 40 | 32 | 30 | 20 | 36 | 31 | 21 | 41 | 44 | 3 | 42 | 6 | 19 | 37 |
| 4 | | | | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 14 | 38 | 29 | 43 | 9 | 31 | 22 | 10 | 16 | 34 | 35 | 21 | 18 | 0 | 39 | 33 | 40 | 41 | 11 | 5 | 13 | 27 |
| 32 | 44 | 28 | 12 | 23 | 15 | 30 | 3 | 26 | 24 | 8 | 7 | 20 | 42 | 2 | 17 | 25 | 1 | 36 | 6 | 19 | 37 |
| 4 | | | | | | | | | | | | | | | | | | | | | |

FIG. 337

64QAM CR 11/15:

ORIGINAL PATTERN (A):

| | | | | | | | | | | | | | | | | | | | | | |
|---|---|---|---|---|---|---|---|---|---|---|---|---|---|---|---|---|---|---|---|---|---|
| 31 | 20 | 21 | 25 | 4 | 16 | 9 | 3 | 17 | 24 | 5 | 10 | 12 | 28 | 6 | 19 | 8 | 15 | 13 | 11 | 29 | 22 |
| 27 | 14 | 23 | 34 | 26 | 18 | 42 | 2 | 37 | 44 | 39 | 33 | 35 | 41 | 0 | 36 | 7 | 40 | 38 | 1 | 30 | 32 |
| 43 | | | | | | | | | | | | | | | | | | | | | |

BIT GROUP

CONVERTED PATTERN (B):

| | | | | | | | | | | | | | | | | | | | | | |
|---|---|---|---|---|---|---|---|---|---|---|---|---|---|---|---|---|---|---|---|---|---|
| 31 | 3 | 6 | 22 | 42 | 41 | 20 | 17 | 19 | 27 | 2 | 0 | 21 | 24 | 8 | 14 | 37 | 36 | 25 | 5 | 15 | 23 |
| 44 | 7 | 4 | 10 | 13 | 34 | 39 | 40 | 16 | 12 | 11 | 26 | 33 | 38 | 9 | 28 | 29 | 18 | 35 | 1 | 30 | 32 |
| 43 | | | | | | | | | | | | | | | | | | | | | |

FIG. 338

64QAM CR 12/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 17 | 11 | 14 | 7 | 31 | 10 | 2 | 26 | 0 | 32 | 29 | 22 | 33 | 12 | 20 | 28 | 27 | 39 | 37 | 15 | 4 | 5 |
| 8 | 13 | 38 | 18 | 23 | 34 | 24 | 6 | 1 | 9 | 16 | 44 | 21 | 3 | 36 | 30 | 40 | 35 | 43 | 42 | 25 | 19 |
| 41 | | | | | | | | | | | | | | | | | | | | | |

⇩

CONVERTED PATTERN (B):

| | | | | | | | | | | | | | | | | | | | | | |
|---|---|---|---|---|---|---|---|---|---|---|---|---|---|---|---|---|---|---|---|---|---|
| 17 | 26 | 20 | 5 | 24 | 3 | 11 | 0 | 28 | 8 | 6 | 36 | 14 | 32 | 27 | 13 | 1 | 30 | 7 | 29 | 39 | 38 |
| 9 | 40 | 31 | 22 | 37 | 18 | 16 | 35 | 10 | 33 | 15 | 23 | 44 | 43 | 2 | 12 | 4 | 34 | 21 | 42 | 25 | 19 |
| 41 | | | | | | | | | | | | | | | | | | | | | |

FIG. 339

64QAM CR 13/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 9 | 7 | 15 | 10 | 11 | 12 | 13 | 6 | 21 | 17 | 14 | 20 | 26 | 8 | 25 | 32 | 34 | 23 | 2 | 4 | 31 | 18 |
| 5 | 27 | 29 | 3 | 38 | 36 | 39 | 43 | 41 | 42 | 40 | 44 | 1 | 28 | 33 | 22 | 16 | 19 | 24 | 0 | 30 | 35 |
| 37 | | | | | | | | | | | | | | | | | | | | | |

CONVERTED PATTERN (B):

| | | | | | | | | | | | | | | | | | | | | | |
|---|---|---|---|---|---|---|---|---|---|---|---|---|---|---|---|---|---|---|---|---|---|
| 9 | 6 | 25 | 18 | 39 | 28 | 7 | 21 | 32 | 5 | 43 | 33 | 15 | 17 | 34 | 27 | 41 | 22 | 10 | 14 | 23 | 29 |
| 42 | 16 | 11 | 20 | 2 | 3 | 40 | 19 | 12 | 26 | 4 | 38 | 44 | 24 | 13 | 8 | 31 | 36 | 1 | 0 | 30 | 35 |
| 37 | | | | | | | | | | | | | | | | | | | | | |

FIG. 342

256QAM CR 4/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 38 | 20 | 0 | 34 | 33 | 41 | 14 | 30 | 44 | 7 | 37 | 8 | 4 | 9 | 43 | 15 | 19 | 32 | 23 | 5 | 22 | 26 |
| 10 | 12 | 3 | 31 | 36 | 21 | 24 | 11 | 16 | 18 | 17 | 29 | 35 | 42 | 13 | 40 | 1 | 28 | 2 | 25 | 6 | 39 |
| 27 | | | | | | | | | | | | | | | | | | | | | |

⇨

CONVERTED PATTERN (B):

| | | | | | | | | | | | | | | | | | | | | | |
|---|---|---|---|---|---|---|---|---|---|---|---|---|---|---|---|---|---|---|---|---|---|
| 38 | 41 | 37 | 15 | 22 | 31 | 16 | 42 | 20 | 14 | 8 | 19 | 26 | 36 | 18 | 13 | 0 | 30 | 4 | 32 | 10 | 21 |
| 17 | 40 | 34 | 44 | 9 | 23 | 12 | 24 | 29 | 1 | 33 | 7 | 43 | 5 | 3 | 11 | 35 | 28 | 2 | 25 | 6 | 39 |
| 27 | | | | | | | | | | | | | | | | | | | | | |

FIG. 344

256QAM CR 6/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 17 | 13 | 25 | 24 | 14 | 21 | 1 | 37 | 2 | 3 | 11 | 22 | 18 | 5 | 10 | 23 | 12 | 4 | 26 | 16 | 38 | 36 |
| 33 | 39 | 0 | 6 | 7 | 31 | 32 | 34 | 27 | 35 | 15 | 9 | 30 | 28 | 19 | 8 | 20 | 29 | 40 | 41 | 42 | 43 |
| 44 | | | | | | | | | | | | | | | | | | | | | |

⇨

CONVERTED PATTERN (A):

| | | | | | | | | | | | | | | | | | | | | | |
|---|---|---|---|---|---|---|---|---|---|---|---|---|---|---|---|---|---|---|---|---|---|
| 17 | 2 | 12 | 0 | 15 | 13 | 3 | 4 | 6 | 9 | 25 | 11 | 26 | 7 | 30 | 24 | 22 | 16 | 31 | 28 | 14 | 18 |
| 38 | 32 | 19 | 21 | 5 | 36 | 34 | 8 | 1 | 10 | 33 | 27 | 20 | 37 | 23 | 39 | 35 | 29 | 40 | 41 | 42 | 43 |
| 44 | | | | | | | | | | | | | | | | | | | | | |

FIG. 346

256QAM CR 8/15:

ORIGINAL PATTERN (A):

BIT GROUP

| | | | | | | | | | | | | | | | | | | | | | |
|---|---|---|---|---|---|---|---|---|---|---|---|---|---|---|---|---|---|---|---|---|---|
| 41 | 2 | 12 | 6 | 33 | 1 | 13 | 11 | 26 | 10 | 39 | 43 | 36 | 23 | 42 | 7 | 44 | 20 | 8 | 38 | 18 | 22 |
| 24 | 40 | 4 | 28 | 29 | 19 | 14 | 5 | 9 | 0 | 30 | 25 | 35 | 37 | 27 | 32 | 31 | 34 | 21 | 3 | 15 | 17 |
| 16 | | | | | | | | | | | | | | | | | | | | | |

CONVERTED PATTERN (B):

| | | | | | | | | | | | | | | | | | | | | | |
|---|---|---|---|---|---|---|---|---|---|---|---|---|---|---|---|---|---|---|---|---|---|
| 41 | 1 | 39 | 7 | 18 | 28 | 9 | 37 | 2 | 13 | 43 | 44 | 22 | 29 | 0 | 27 | 12 | 11 | 36 | 20 | 24 | 19 |
| 30 | 32 | 6 | 26 | 23 | 8 | 40 | 14 | 25 | 31 | 33 | 10 | 42 | 38 | 4 | 5 | 35 | 34 | 21 | 3 | 15 | 17 |
| 16 | | | | | | | | | | | | | | | | | | | | | |

FIG. 349

256QAM CR 11/15:

ORIGINAL PATTERN (B):

BIT GROUP

| | | | | | | | | | | | | | | | | | | | | | |
|---|---|---|---|---|---|---|---|---|---|---|---|---|---|---|---|---|---|---|---|---|---|
| 8 | 13 | 0 | 11 | 9 | 4 | 36 | 37 | 16 | 3 | 10 | 14 | 24 | 20 | 33 | 34 | 25 | 2 | 21 | 31 | 12 | 19 |
| 7 | 5 | 27 | 23 | 26 | 1 | 18 | 22 | 35 | 6 | 32 | 30 | 28 | 15 | 29 | 17 | 39 | 38 | 40 | 41 | 42 | 43 |
| 44 | | | | | | | | | | | | | | | | | | | | | |

⇨

CONVERTED PATTERN (A):

| | | | | | | | | | | | | | | | | | | | | | |
|---|---|---|---|---|---|---|---|---|---|---|---|---|---|---|---|---|---|---|---|---|---|
| 8 | 16 | 25 | 27 | 32 | 13 | 3 | 2 | 23 | 30 | 0 | 10 | 21 | 26 | 28 | 11 | 14 | 31 | 1 | 15 | 9 | 24 |
| 12 | 18 | 29 | 4 | 20 | 19 | 22 | 17 | 36 | 33 | 7 | 35 | 39 | 37 | 34 | 5 | 6 | 38 | 40 | 41 | 42 | 43 |
| 44 | | | | | | | | | | | | | | | | | | | | | |

FIG. 352

QPSK 64k:

PATTERN A:

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇩

PATTERN B:

| | | | | | | | | | | | | | | | | | | | | | |
|---|---|---|---|---|---|---|---|---|---|---|---|---|---|---|---|---|---|---|---|---|---|
| 0 | 90 | 1 | 91 | 2 | 92 | 3 | 93 | 4 | 94 | 5 | 95 | 6 | 96 | 7 | 97 | 8 | 98 | 9 | 99 | 10 | 100 |
| 11 | 101 | 12 | 102 | 13 | 103 | 14 | 104 | 15 | 105 | 16 | 106 | 17 | 107 | 18 | 108 | 19 | 109 | 20 | 110 | 21 | 111 |
| 22 | 112 | 23 | 113 | 24 | 114 | 25 | 115 | 26 | 116 | 27 | 117 | 28 | 118 | 29 | 119 | 30 | 120 | 31 | 121 | 32 | 122 |
| 33 | 123 | 34 | 124 | 35 | 125 | 36 | 126 | 37 | 127 | 38 | 128 | 39 | 129 | 40 | 130 | 41 | 131 | 42 | 132 | 43 | 133 |
| 44 | 134 | 45 | 135 | 46 | 136 | 47 | 137 | 48 | 138 | 49 | 139 | 50 | 140 | 51 | 141 | 52 | 142 | 53 | 143 | 54 | 144 |
| 55 | 145 | 56 | 146 | 57 | 147 | 58 | 148 | 59 | 149 | 60 | 150 | 61 | 151 | 62 | 152 | 63 | 153 | 64 | 154 | 65 | 155 |
| 66 | 156 | 67 | 157 | 68 | 158 | 69 | 159 | 70 | 160 | 71 | 161 | 72 | 162 | 73 | 163 | 74 | 164 | 75 | 165 | 76 | 166 |
| 77 | 167 | 78 | 168 | 79 | 169 | 80 | 170 | 81 | 171 | 82 | 172 | 83 | 173 | 84 | 174 | 85 | 175 | 86 | 176 | 87 | 177 |
| 88 | 178 | 89 | 179 | | | | | | | | | | | | | | | | | | |

FIG. 353

16QAM 64k:

PATTERN A:

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇩

PATTERN B:

| | | | | | | | | | | | | | | | | | | | | | |
|---|---|---|---|---|---|---|---|---|---|---|---|---|---|---|---|---|---|---|---|---|---|
| 0 | 45 | 90 | 135 | 1 | 46 | 91 | 136 | 2 | 47 | 92 | 137 | 3 | 48 | 93 | 138 | 4 | 49 | 94 | 139 | 5 | 50 |
| 95 | 140 | 6 | 51 | 96 | 141 | 7 | 52 | 97 | 142 | 8 | 53 | 98 | 143 | 9 | 54 | 99 | 144 | 10 | 55 | 100 | 145 |
| 11 | 56 | 101 | 146 | 12 | 57 | 102 | 147 | 13 | 58 | 103 | 148 | 14 | 59 | 104 | 149 | 15 | 60 | 105 | 150 | 16 | 61 |
| 106 | 151 | 17 | 62 | 107 | 152 | 18 | 63 | 108 | 153 | 19 | 64 | 109 | 154 | 20 | 65 | 110 | 155 | 21 | 66 | 111 | 156 |
| 22 | 67 | 112 | 157 | 23 | 68 | 113 | 158 | 24 | 69 | 114 | 159 | 25 | 70 | 115 | 160 | 26 | 71 | 116 | 161 | 27 | 72 |
| 117 | 162 | 28 | 73 | 118 | 163 | 29 | 74 | 119 | 164 | 30 | 75 | 120 | 165 | 31 | 76 | 121 | 166 | 32 | 77 | 122 | 167 |
| 33 | 78 | 123 | 168 | 34 | 79 | 124 | 169 | 35 | 80 | 125 | 170 | 36 | 81 | 126 | 171 | 37 | 82 | 127 | 172 | 38 | 83 |
| 128 | 173 | 39 | 84 | 129 | 174 | 40 | 85 | 130 | 175 | 41 | 86 | 131 | 176 | 42 | 87 | 132 | 177 | 43 | 88 | 133 | 178 |
| 44 | 89 | 134 | 179 | | | | | | | | | | | | | | | | | | |

FIG. 354

64QAM 64k:

PATTERN A:

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇩

PATTERN B:

| | | | | | | | | | | | | | | | | | | | | | |
|---|---|---|---|---|---|---|---|---|---|---|---|---|---|---|---|---|---|---|---|---|---|
| 0 | 30 | 60 | 90 | 120 | 150 | 1 | 31 | 61 | 91 | 121 | 151 | 2 | 32 | 62 | 92 | 122 | 152 | 3 | 33 | 63 | 93 |
| 123 | 153 | 4 | 34 | 64 | 94 | 124 | 154 | 5 | 35 | 65 | 95 | 125 | 155 | 6 | 36 | 66 | 96 | 126 | 156 | 7 | 37 |
| 67 | 97 | 127 | 157 | 8 | 38 | 68 | 98 | 128 | 158 | 9 | 39 | 69 | 99 | 129 | 159 | 10 | 40 | 70 | 100 | 130 | 160 |
| 11 | 41 | 71 | 101 | 131 | 161 | 12 | 42 | 72 | 102 | 132 | 162 | 13 | 43 | 73 | 103 | 133 | 163 | 14 | 44 | 74 | 104 |
| 134 | 164 | 15 | 45 | 75 | 105 | 135 | 165 | 16 | 46 | 76 | 106 | 136 | 166 | 17 | 47 | 77 | 107 | 137 | 167 | 18 | 48 |
| 78 | 108 | 138 | 168 | 19 | 49 | 79 | 109 | 139 | 169 | 20 | 50 | 80 | 110 | 140 | 170 | 21 | 51 | 81 | 111 | 141 | 171 |
| 22 | 52 | 82 | 112 | 142 | 172 | 23 | 53 | 83 | 113 | 143 | 173 | 24 | 54 | 84 | 114 | 144 | 174 | 25 | 55 | 85 | 115 |
| 145 | 175 | 26 | 56 | 86 | 116 | 146 | 176 | 27 | 57 | 87 | 117 | 147 | 177 | 28 | 58 | 88 | 118 | 148 | 178 | 29 | 59 |
| 89 | 119 | 149 | 179 | | | | | | | | | | | | | | | | | | |

FIG. 355

256QAM 64k:

PATTERN A:

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇩

PATTERN B:

| | | | | | | | | | | | | | | | | | | | | | |
|---|---|---|---|---|---|---|---|---|---|---|---|---|---|---|---|---|---|---|---|---|---|
| 0 | 22 | 44 | 66 | 88 | 110 | 132 | 154 | 1 | 23 | 45 | 67 | 89 | 111 | 133 | 155 | 2 | 24 | 46 | 68 | 90 | 112 |
| 134 | 156 | 3 | 25 | 47 | 69 | 91 | 113 | 135 | 157 | 4 | 26 | 48 | 70 | 92 | 114 | 136 | 158 | 5 | 27 | 49 | 71 |
| 93 | 115 | 137 | 159 | 6 | 28 | 50 | 72 | 94 | 116 | 138 | 160 | 7 | 29 | 51 | 73 | 95 | 117 | 139 | 161 | 8 | 30 |
| 52 | 74 | 96 | 118 | 140 | 162 | 9 | 31 | 53 | 75 | 97 | 119 | 141 | 163 | 10 | 32 | 54 | 76 | 98 | 120 | 142 | 164 |
| 11 | 33 | 55 | 77 | 99 | 121 | 143 | 165 | 12 | 34 | 56 | 78 | 100 | 122 | 144 | 166 | 13 | 35 | 57 | 79 | 101 | 123 |
| 145 | 167 | 14 | 36 | 58 | 80 | 102 | 124 | 146 | 168 | 15 | 37 | 59 | 81 | 103 | 125 | 147 | 169 | 16 | 38 | 60 | 82 |
| 104 | 126 | 148 | 170 | 17 | 39 | 61 | 83 | 105 | 127 | 149 | 171 | 18 | 40 | 62 | 84 | 106 | 128 | 150 | 172 | 19 | 41 |
| 63 | 85 | 107 | 129 | 151 | 173 | 20 | 42 | 64 | 86 | 108 | 130 | 152 | 174 | 21 | 43 | 65 | 87 | 109 | 131 | 153 | 175 |
| 176 | 177 | 178 | 179 | | | | | | | | | | | | | | | | | | |

FIG. 356

1024QAM 64k:

PATTERN A:

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇩

PATTERN B:

| | | | | | | | | | | | | | | | | | | | | | |
|---|---|---|---|---|---|---|---|---|---|---|---|---|---|---|---|---|---|---|---|---|---|
| 0 | 18 | 36 | 54 | 72 | 90 | 108 | 126 | 144 | 162 | 1 | 19 | 37 | 55 | 73 | 91 | 109 | 127 | 145 | 163 | 2 | 20 |
| 38 | 56 | 74 | 92 | 110 | 128 | 146 | 164 | 3 | 21 | 39 | 57 | 75 | 93 | 111 | 129 | 147 | 165 | 4 | 22 | 40 | 58 |
| 76 | 94 | 112 | 130 | 148 | 166 | 5 | 23 | 41 | 59 | 77 | 95 | 113 | 131 | 149 | 167 | 6 | 24 | 42 | 60 | 78 | 96 |
| 114 | 132 | 150 | 168 | 7 | 25 | 43 | 61 | 79 | 97 | 115 | 133 | 151 | 169 | 8 | 26 | 44 | 62 | 80 | 98 | 116 | 134 |
| 152 | 170 | 9 | 27 | 45 | 63 | 81 | 99 | 117 | 135 | 153 | 171 | 10 | 28 | 46 | 64 | 82 | 100 | 118 | 136 | 154 | 172 |
| 11 | 29 | 47 | 65 | 83 | 101 | 119 | 137 | 155 | 173 | 12 | 30 | 48 | 66 | 84 | 102 | 120 | 138 | 156 | 174 | 13 | 31 |
| 49 | 67 | 85 | 103 | 121 | 139 | 157 | 175 | 14 | 32 | 50 | 68 | 86 | 104 | 122 | 140 | 158 | 176 | 15 | 33 | 51 | 69 |
| 87 | 105 | 123 | 141 | 159 | 177 | 16 | 34 | 52 | 70 | 88 | 106 | 124 | 142 | 160 | 178 | 17 | 35 | 53 | 71 | 89 | 107 |
| 125 | 143 | 161 | 179 | | | | | | | | | | | | | | | | | | |

FIG. 357

4096QAM 64k:

PATTERN A:

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇩

PATTERN B:

| | | | | | | | | | | | | | | | | | | | | | |
|---|---|---|---|---|---|---|---|---|---|---|---|---|---|---|---|---|---|---|---|---|---|
| 0 | 15 | 30 | 45 | 60 | 75 | 90 | 105 | 120 | 135 | 150 | 165 | 1 | 16 | 31 | 46 | 61 | 76 | 91 | 106 | 121 | 136 |
| 151 | 166 | 2 | 17 | 32 | 47 | 62 | 77 | 92 | 107 | 122 | 137 | 152 | 167 | 3 | 18 | 33 | 48 | 63 | 78 | 93 | 108 |
| 123 | 138 | 153 | 168 | 4 | 19 | 34 | 49 | 64 | 79 | 94 | 109 | 124 | 139 | 154 | 169 | 5 | 20 | 35 | 50 | 65 | 80 |
| 95 | 110 | 125 | 140 | 155 | 170 | 6 | 21 | 36 | 51 | 66 | 81 | 96 | 111 | 126 | 141 | 156 | 171 | 7 | 22 | 37 | 52 |
| 67 | 82 | 97 | 112 | 127 | 142 | 157 | 172 | 8 | 23 | 38 | 53 | 68 | 83 | 98 | 113 | 128 | 143 | 158 | 173 | 9 | 24 |
| 39 | 54 | 69 | 84 | 99 | 114 | 129 | 144 | 159 | 174 | 10 | 25 | 40 | 55 | 70 | 85 | 100 | 115 | 130 | 145 | 160 | 175 |
| 11 | 26 | 41 | 56 | 71 | 86 | 101 | 116 | 131 | 146 | 161 | 176 | 12 | 27 | 42 | 57 | 72 | 87 | 102 | 117 | 132 | 147 |
| 162 | 177 | 13 | 28 | 43 | 58 | 73 | 88 | 103 | 118 | 133 | 148 | 163 | 178 | 14 | 29 | 44 | 59 | 74 | 89 | 104 | 119 |
| 134 | 149 | 164 | 179 | | | | | | | | | | | | | | | | | | |

DATA PROCESSING APPARATUS AND METHOD

CROSS-REFERENCE TO RELATED APPLICATION

This application is a continuation of U.S. Ser. No. 14/840,888 filed Aug. 31, 2015, which claims the benefit of priority of U.S. Provisional Application Ser. No. 62/102,941, filed Jan. 13, 2015, and U.S. Provisional Application Ser. No. 62/105,494, filed Jan. 20, 2015, the entire contents of which are incorporated herein by reference.

BACKGROUND

The present technology relates to a data processing apparatus and a data processing method, and more specifically, it relates to a data processing apparatus and a data processing method capable of allowing a plurality of block interleaving methods to efficiently coexist in data transmission using, for example, an LDPC code.

Some information described in the present specification and drawings is offered from Samsung Electronics Co., Ltd. (hereinafter, referred to as Samsung), LGE Inc., the NERC, and CRC/ETRI (specified in the drawing).

A low density parity check (LDPC) code has high error correcting capability, and has been widely used in transmission schemes of digital broadcasting such as digital video broadcasting (DVB)-S.2, DVB-T.2 or DVB-C.2 in Europe, and advanced television systems committee (ATSC) 3.0 in the United States (for example, see DVB-S2X: ETSI EN 302 307-2 V1.1.1 (2014-10)) in recent years.

According to recent research, similarly to a turbo code, when the LDPC code is used, it has been found that it is possible to obtain performance approximate to the Shannon limit having long code length. Since the LDPC code has the feature that a minimum distance is proportional to a code length, the LDPC code features good block error probability characteristics, and has a merit that a so-called error floor phenomenon which is observed in decoding characteristics on the turbo code does not occur.

SUMMARY

For example, in the data transmission using the LDPC code, the LDPC code is changed (is symbolized) to a symbol of quadrature modulation (digital modulation) such as quadrature phase shift keying (QPSK), and the symbol is mapped to a signal point of quadrature modulation and is transmitted. The data transmission using the LDPC code described above has been widely used all over the world.

However, when bit interleaving is performed on the LDPC code, a plurality of block interleaving methods may be adopted, and the plurality of block interleaving methods have to efficiently coexist.

The present technology has been made in view of such circumstances, and it is possible to allow a plurality of block interleaving methods to efficiently coexist in data transmission using an LDPC code.

According to an embodiment of the present technology, there is provided a first data processing apparatus/method. The first data processing apparatus/method is a data processing apparatus/method including a group-wise interleaving unit/group-wise interleaving that performs group-wise interleaving which interleaves an LDPC code having a code length (N) of 16,200 bits or 64,800 bits for every bit group of 360 bits; and a block interleaving unit/block interleaving that performs block interleaving in such a manner that an LDPC code obtained by performing the group-wise interleaving is written in m number of columns as storage regions arranged in the row direction, m bits are obtained by respectively reading the LDPC code from m number of columns bit by bit, and the m bits are interleaved into one symbol corresponding to any one of $2^m$ number of signal points defined by a modulation scheme. A type of the block interleaving includes a type A in which the writing of an LDPC code obtained by performing the group-wise interleaving in the column direction of the columns is iteratively performed on m number of columns, and a type B in which the writing of an LDPC code obtained by performing the group-wise interleaving in the row direction of m number of columns for every bit group is iteratively performed. A MODCOD which is a combination of the LDPC code and the modulation scheme includes a MODCOD-A which is a MODCOD based on the assumption that the block interleaving of the type A is performed, and a MDOCOD-B which is a MDOCOD based on the assumption that the block interleaving of the type B is performed. When the block interleaving of the type A is performed on the LDPC code of the MODCOD-B, the group-wise interleaving unit/group-wise interleaving performs the group-wise interleaving on the LDPC code of the MODCOD-B such that the same block interleaving result as the block interleaving result obtained when the block interleaving of the type B is performed is obtained, or when the block interleaving of the type B is performed on the LDPC code of the MODCOD-A, the group-wise interleaving unit/group-wise interleaving performs the group-wise interleaving on the LDPC code of the MDOCOD-A such that the same block interleaving result as the block interleaving result obtained when the block interleaving of the type A is performed is obtained.

In the first data processing apparatus/method, group-wise interleaving which interleaves an LDPC code having a code length (N) of 16,200 bits or 64,800 bits for every bit group of 360 bits is performed, and block interleaving is performed in such a manner that an LDPC code obtained by performing the group-wise interleaving is written in m number of columns as storage regions arranged in the row direction, m bits are obtained by respectively reading the LDPC code from m number of columns bit by bit, and the m bits are interleaved into one symbol corresponding to any one of $2^m$ number of signal points defined by a modulation scheme. A type of the block interleaving includes a type A in which the writing of an LDPC code obtained by performing the group-wise interleaving in the column direction of the columns is iteratively performed on m number of columns, and a type B in which the writing of an LDPC code obtained by performing the group-wise interleaving in the row direction of m number of columns for every bit group is iteratively performed. A MODCOD which is a combination of the LDPC code and the modulation scheme includes a MODCOD-A which is a MODCOD based on the assumption that the block interleaving of the type A is performed, and a MDOCOD-B which is a MDOCOD based on the assumption that the block interleaving of the type B is performed. When the block interleaving of the type A is performed on the LDPC code of the MODCOD-B, in the group-wise interleaving, the group-wise interleaving is performed on the LDPC code of the MODCOD-B such that the same block interleaving result as the block interleaving result obtained when the block interleaving of the type B is performed is obtained, or when the block interleaving of the type B is performed on the LDPC code of the MODCOD-A, in the group-wise interleaving, the group-wise interleaving is performed on the LDPC code of the MDOCOD-A such that the same block interleaving result as the block interleaving result obtained when the block interleaving of the type A is performed is obtained.

According to another embodiment of the present technology, there is provided a second data processing apparatus/method. The second data processing apparatus/method is a data processing apparatus/method including a block deinterleaving unit/block deinterleaving that performs block deinterleaving which returns m bits of a symbol obtained from data transmitted from a transmission apparatus to an LDPC code obtained by performing group-wise interleaving; and a group-wise deinterleaving unit/group-wise deinterleaving that performs group-wise deinterleaving which returns the arrangement of the LDPC code obtained by performing the group-wise interleaving on the original arrangement. The transmission apparatus includes a group-wise interleaving unit that performs group-wise interleaving which interleaves an LDPC code having a code length (N) of 16,200 bits or 64,800 bits for every bit group of 360 bits, and a block interleaving unit that performs block interleaving in such a manner that an LDPC code obtained by performing the group-wise interleaving is written in m number of columns as storage regions arranged in the row direction, m bits are obtained by respectively reading the LDPC code from m number of columns bit by bit, and the m bits are interleaved into one symbol corresponding to any one of $2^m$ number of signal points defined by a modulation scheme. A type of the block interleaving includes a type A in which the writing of an LDPC code obtained by performing the group-wise interleaving in the column direction of the columns is iteratively performed on m number of columns, and a type B in which the writing of an LDPC code obtained by performing the group-wise interleaving in the row direction of m number of columns for every bit group is iteratively performed. A MODCOD which is a combination of the LDPC code and the modulation scheme includes a MODCOD-A which is a MODCOD based on the assumption that the block interleaving of the type A is performed, and a MDOCOD-B which is a MDOCOD based on the assumption that the block interleaving of the type B is performed. When the block interleaving of the type A is performed on the LDPC code of the MODCOD-B, the group-wise interleaving unit performs the group-wise interleaving on the LDPC code of the MODCOD-B such that the same block interleaving result as the block interleaving result obtained when the block interleaving of the type B is performed is obtained, or when the block interleaving of the type B is performed on the LDPC code of the MODCOD-A, the group-wise interleaving unit performs the group-wise interleaving on the LDPC code of the MDOCOD-A such that the same block interleaving result as the block interleaving result obtained when the block interleaving of the type A is performed is obtained.

In the second data processing apparatus/method, block deinterleaving which returns m bits of a symbol obtained from data transmitted from a transmission apparatus to an LDPC code obtained by performing group-wise interleaving is performed, and group-wise deinterleaving which returns the arrangement of the LDPC code obtained by performing the group-wise interleaving on the original arrangement is performed. The transmission apparatus includes a group-wise interleaving unit that performs group-wise interleaving which interleaves an LDPC code having a code length (N) of 16,200 bits or 64,800 bits for every bit group of 360 bits, and a block interleaving unit that performs block interleaving in such a manner that an LDPC code obtained by performing the group-wise interleaving is written in m number of columns as storage regions arranged in the row direction, m bits are obtained by respectively reading the LDPC code from m number of columns bit by bit, and the m bits are interleaved into one symbol corresponding to any one of $2^m$ number of signal points defined by a modulation scheme. A type of the block interleaving includes a type A in which the writing of an LDPC code obtained by performing the group-wise interleaving in the column direction of the columns is iteratively performed on m number of columns, and a type B in which the writing of an LDPC code obtained by performing the group-wise interleaving in the row direction of m number of columns for every bit group is iteratively performed. A MODCOD which is a combination of the LDPC code and the modulation scheme includes a MODCOD-A which is a MODCOD based on the assumption that the block interleaving of the type A is performed, and a MDOCOD-B which is a MDOCOD based on the assumption that the block interleaving of the type B is performed. When the block interleaving of the type A is performed on the LDPC code of the MODCOD-B, the group-wise interleaving unit performs the group-wise interleaving on the LDPC code of the MODCOD-B such that the same block interleaving result as the block interleaving result obtained when the block interleaving of the type B is performed is obtained, or when the block interleaving of the type B is performed on the LDPC code of the MODCOD-A, the group-wise interleaving unit performs the group-wise interleaving on the LDPC code of the MDOCOD-A such that the same block interleaving result as the block interleaving result obtained when the block interleaving of the type A is performed is obtained.

The data processing apparatuses may be one independent apparatus, or may be internal blocks constituting one apparatus.

According to the present technology, it is possible to allow a plurality of block interleaving methods to efficiently coexist in data transmission using an LDPC code.

The effects described herein are not necessarily limited, and may be any one of the effects described in the present disclosure.

BRIEF DESCRIPTION OF THE DRAWINGS

FIG. 3 is a diagram showing an example of the parity check matrix of the LDPC code;

FIG. 13 is a diagram for describing the parity check matrix of the LDPC code defined by the standard of DVB-T.2;

FIG. 21 is a diagram for describing a method of obtaining the parity check matrix H from the parity check matrix initial value table;

FIG. 30 is a diagram showing an example of the parity check matrix initial value table;

FIG. 31 is a diagram showing an example of the parity check matrix initial value table;

FIG. 32 is a diagram showing an example of the parity check matrix initial value table;

FIG. 33 is a diagram showing an example of the parity check matrix initial value table;

FIG. 34 is a diagram showing an example of the parity check matrix initial value table;

FIG. 35 is a diagram showing an example of the parity check matrix initial value table;

FIG. 36 is a diagram showing an example of the parity check matrix initial value table;

FIG. 37 is a diagram showing an example of the parity check matrix initial value table;

FIG. 38 is a diagram showing an example of the parity check matrix initial value table;

FIG. 39 is a diagram showing an example of the parity check matrix initial value table;

FIG. 40 is a diagram showing an example of the parity check matrix initial value table;

FIG. 41 is a diagram showing an example of the parity check matrix initial value table;

FIG. 43 is a diagram showing an example of the parity check matrix initial value table;

FIG. 44 is a diagram showing an example of the parity check matrix initial value table;

FIG. 45 is a diagram showing an example of the parity check matrix initial value table;

FIG. 46 is a diagram showing an example of the parity check matrix initial value table;

FIG. 47 is a diagram showing an example of the parity check matrix initial value table;

FIG. 48 is a diagram showing an example of the parity check matrix initial value table;

FIG. 49 is a diagram showing an example of the parity check matrix initial value table;

FIG. 50 is a diagram showing an example of the parity check matrix initial value table;

FIG. 51 is a diagram showing an example of the parity check matrix initial value table;

FIG. 52 is a diagram showing an example of the parity check matrix initial value table;

FIG. 53 is a diagram showing an example of the parity check matrix initial value table;

FIG. 54 is a diagram showing an example of the parity check matrix initial value table;

FIG. 55 is a diagram showing an example of the parity check matrix initial value table;

FIG. 56 is a diagram showing an example of the parity check matrix initial value table;

FIG. 57 is a diagram showing an example of the parity check matrix initial value table;

FIG. 58 is a diagram showing an example of the parity check matrix initial value table;

FIG. 59 is a diagram showing an example of the parity check matrix initial value table;

FIG. 60 is a diagram showing an example of the parity check matrix initial value table;

FIG. 61 is a diagram showing an example of the parity check matrix initial value table;

FIG. 62 is a diagram showing an example of the parity check matrix initial value table;

FIG. 63 is a diagram showing an example of the parity check matrix initial value table;

FIG. 64 is a diagram showing an example of the parity check matrix initial value table;

FIG. 65 is a diagram showing an example of the parity check matrix initial value table;

FIG. 66 is a diagram showing an example of the parity check matrix initial value table;

FIG. 67 is a diagram showing an example of the parity check matrix initial value table;

FIG. 68 is a diagram showing an example of the parity check matrix initial value table;

FIG. 69 is a diagram showing an example of the parity check matrix initial value table;

FIG. 70 is a diagram showing an example of the parity check matrix initial value table;

FIG. 71 is a diagram showing an example of the parity check matrix initial value table;

FIG. 72 is a diagram showing an example of the parity check matrix initial value table;

FIG. 89 is a diagram showing an example of a coordinate of a signal point of UC when a modulation scheme is QPSK;

FIG. 90 is a diagram showing an example of a coordinate of a signal point of 2D NUC when a modulation scheme is 16-QAM;

FIG. 91 is a diagram showing an example of a coordinate of a signal point of 2D NUC when a modulation scheme is 64-QAM;

FIG. 92 is a diagram showing an example of a coordinate of a signal point of 2D NUC when a modulation scheme is 256-QAM;

FIG. 93 is a diagram showing an example of a coordinate of a signal point of 2D NUC when a modulation scheme is 256-QAM;

FIG. 94 is a diagram showing an example of a coordinate of a signal point of 1D NUC when a modulation scheme is 1024-QAM;

FIGS. 95A and 95B are diagrams showing the relationship between a symbol of 1024-QAM and a real part and an imaginary part of a complex number as a coordinate of a signal point of the 1D NUC corresponding to the symbol;

FIG. 96 is a diagram showing an example of the coordinate of the signal point of the 1D NUC when the modulation scheme is 4096-QAM;

FIGS. 97A and 97B are diagrams showing the relationship between the symbol of 4096-QAM and the real part and the imaginary part of the complex number as the coordinate of the signal point of the 1D NUC corresponding to the symbol;

FIG. 101 is a diagram showing another example of a coordinate of a signal point of 2D NUC when a modulation scheme is 16-QAM;

FIG. 102 is a diagram showing another example of a coordinate of a signal point of 2D NUC when a modulation scheme is 64-QAM;

FIG. 103 is a diagram showing another example of a coordinate of a signal point of 2D NUC when a modulation scheme is 256-QAM;

FIG. 104 is a diagram showing another example of a coordinate of a signal point of 2D NUC when a modulation scheme is 256-QAM;

FIG. 106 is a diagram showing the number of columns of parts for combinations of code lengths and modulation schemes and part column lengths;

FIG. 109 is a diagram showing a first example of a GW pattern for an LDPC code having a code length of 64 k bits;

FIG. 110 is a diagram showing a second example of the GW pattern for the LDPC code having a code length of 64 k bits;

FIG. 111 is a diagram showing a third example of the GW pattern for the LDPC code having the code length of 64 k bits;

FIG. 112 is a diagram showing a fourth example of the GW pattern for the LDPC code having the code length of 64 k bits.

FIG. 114 is a diagram showing a sixth example of the GW pattern for the LDPC code having the code length of 64 k bits;

FIG. 116 is a diagram showing an eighth example of the GW pattern for the LDPC code having the code length of 64 k bits;

FIG. 117 is a diagram showing a ninth example of the GW pattern for the LDPC code having the code length of 64 k bits;

FIG. 119 is a diagram showing an eleventh example of the GW pattern for the LDPC code having the code length of 64 k bits;

FIG. 120 is a diagram showing a twelfth example of the GW pattern for the LDPC code having the code length of 64 k bits;

FIG. 121 is a diagram showing a thirteenth example of the GW pattern for the LDPC code having the code length of 64 k bits;

FIG. 122 is a diagram showing a fourteenth example of the GW pattern for the LDPC code having the code length of 64 k bits;

FIG. 123 is a diagram showing a fifteenth example of the GW pattern for the LDPC code having the code length of 64 k bits;

FIG. 124 is a diagram showing a sixteenth example of the GW pattern for the LDPC code having the code length of 64 k bits;

FIG. 125 is a diagram showing a seventeenth example of the GW pattern for the LDPC code having the code length of 64 k bits;

FIG. 126 is a diagram showing an eighteenth example of the GW pattern for the LDPC code having the code length of 64 k bits;

FIG. 127 is a diagram showing a nineteenth example of the GW pattern for the LDPC code having the code length of 64 k bits;

FIG. 128 is a diagram showing a twentieth example of the GW pattern for the LDPC code having the code length of 64 k bits;

FIG. 129 is a diagram showing a twenty-first example of the GW pattern for the LDPC code having the code length of 64 k bits;

FIG. 130 is a diagram showing a twenty-second example of the GW pattern for the LDPC code having the code length of 64 k bits;

FIG. 131 is a diagram showing a twenty-third example of the GW pattern for the LDPC code having the code length of 64 k bits;

FIG. 132 is a diagram showing a twenty-fourth example of the GW pattern for the LDPC code having the code length of 64 k bits;

Figure 138:
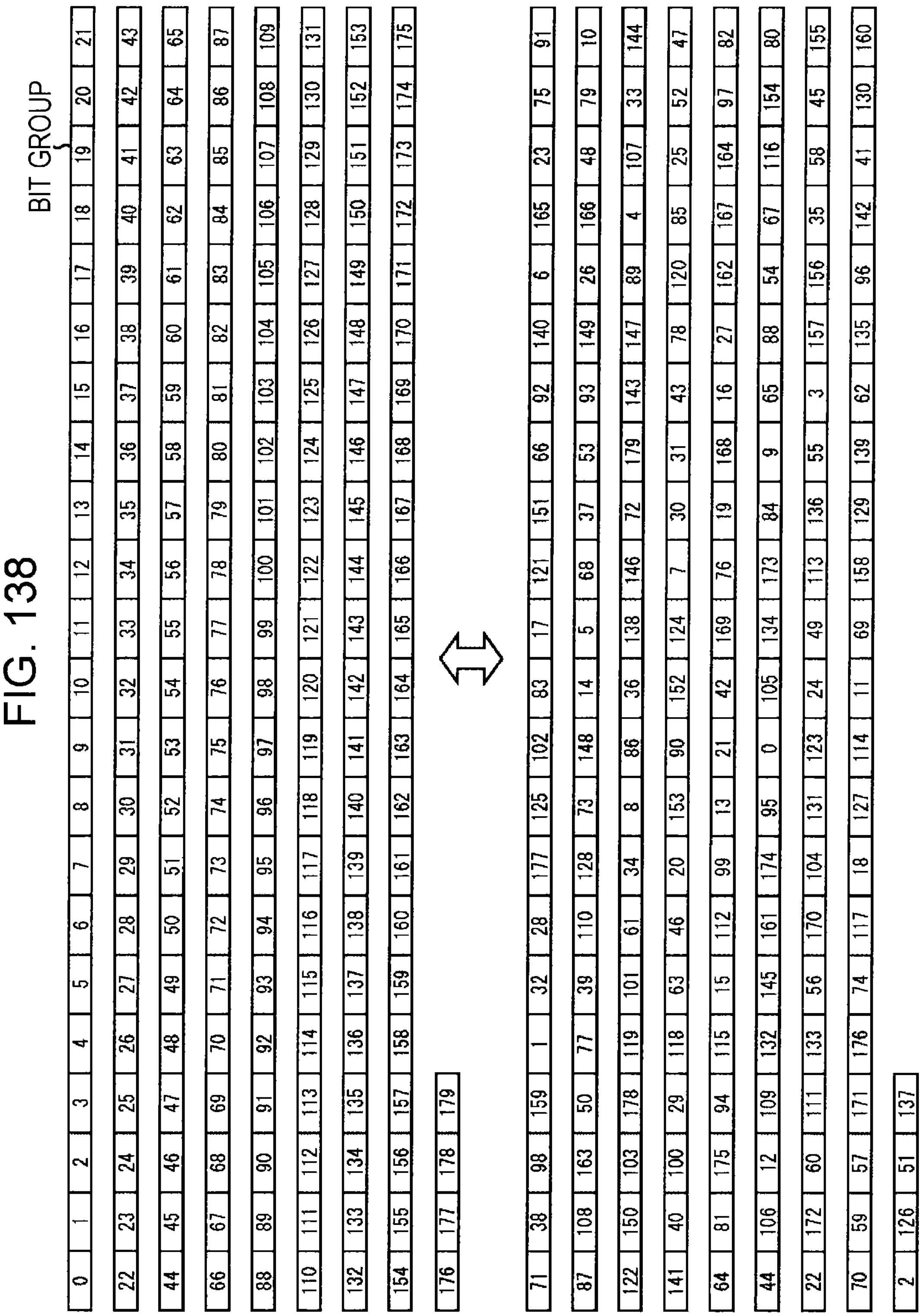
Figure 141:
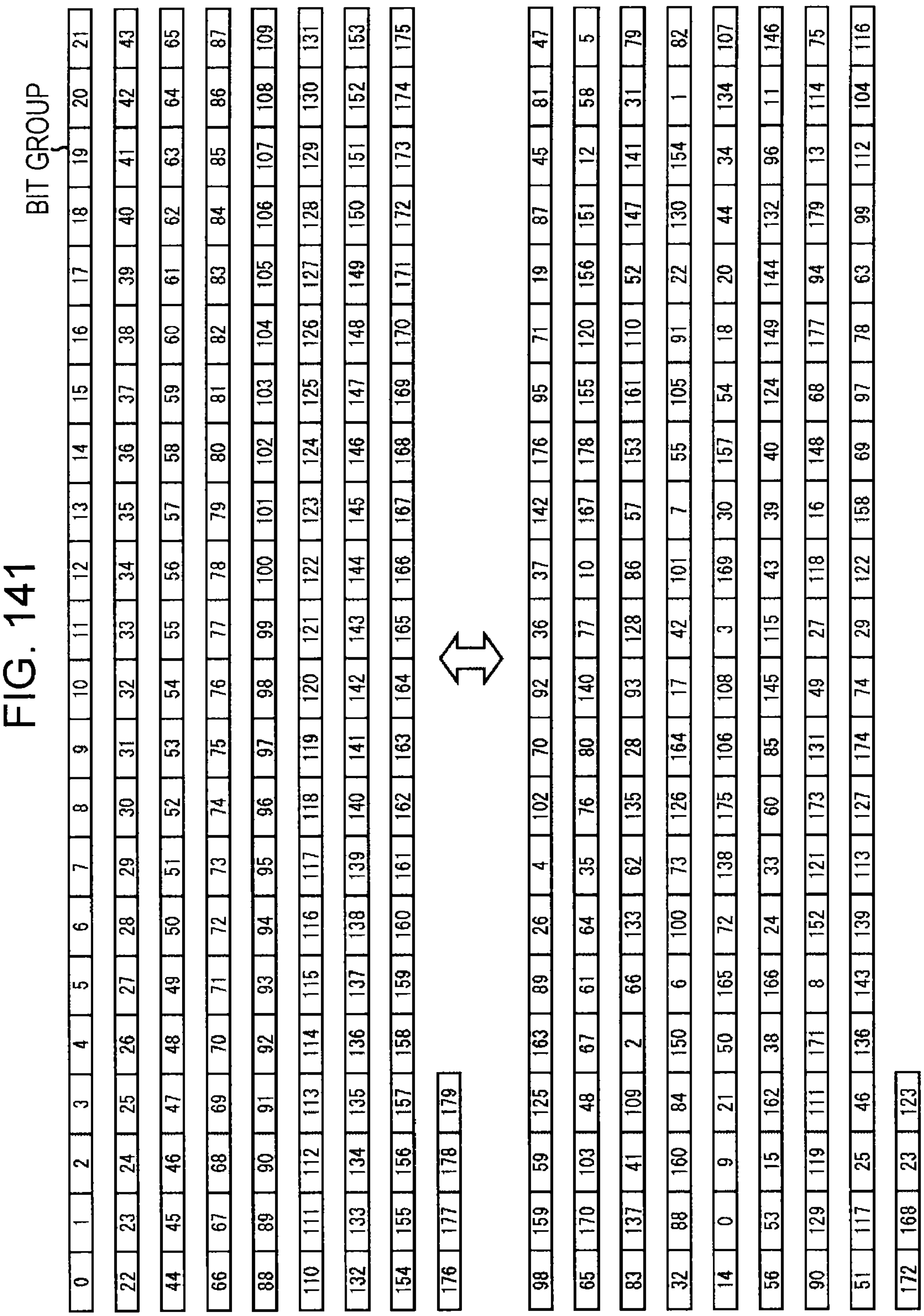
Figure 142:
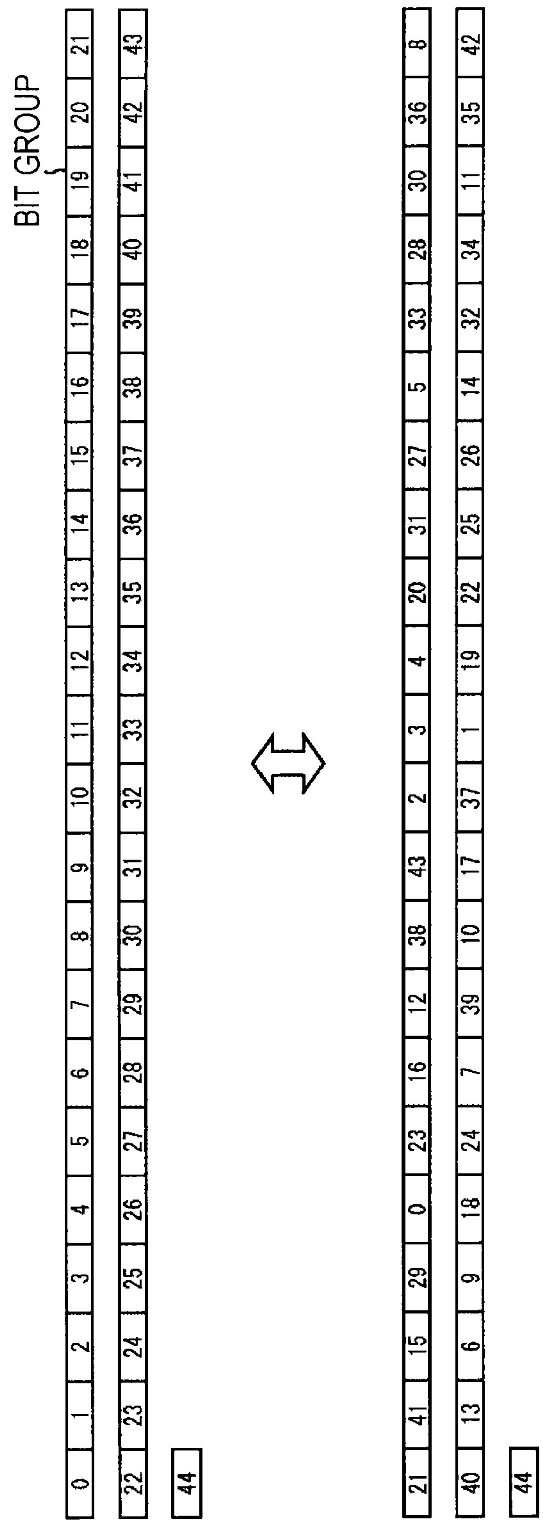
Figure 143:
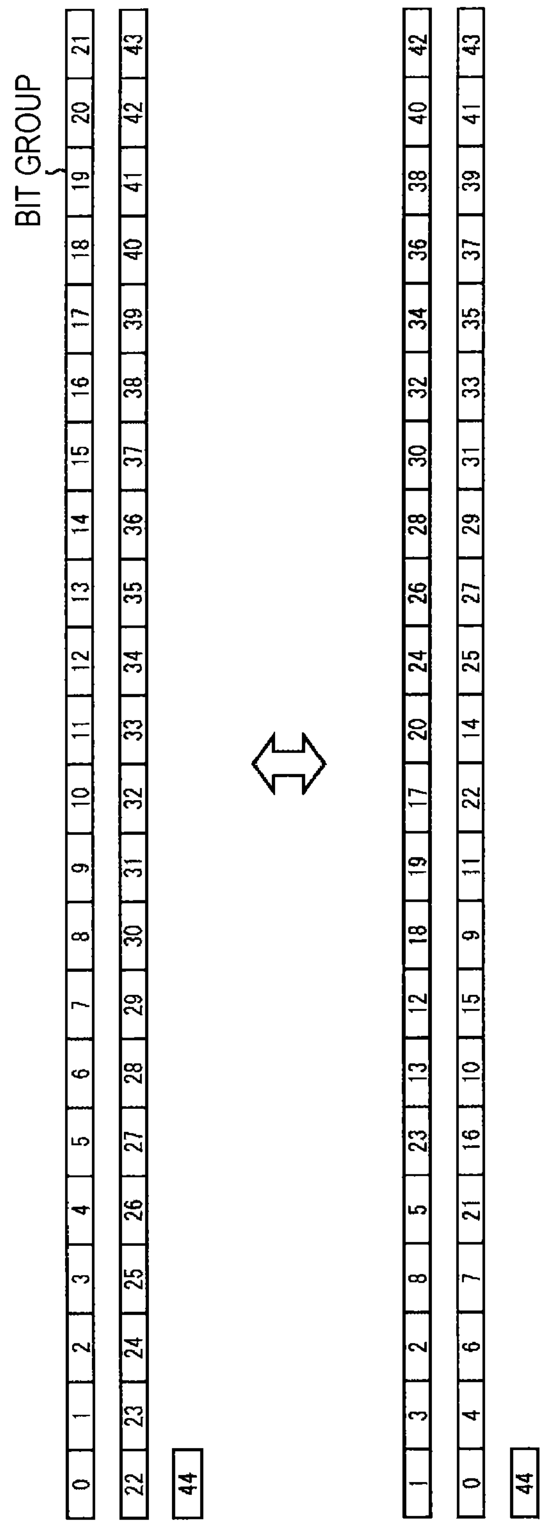
Figure 144:
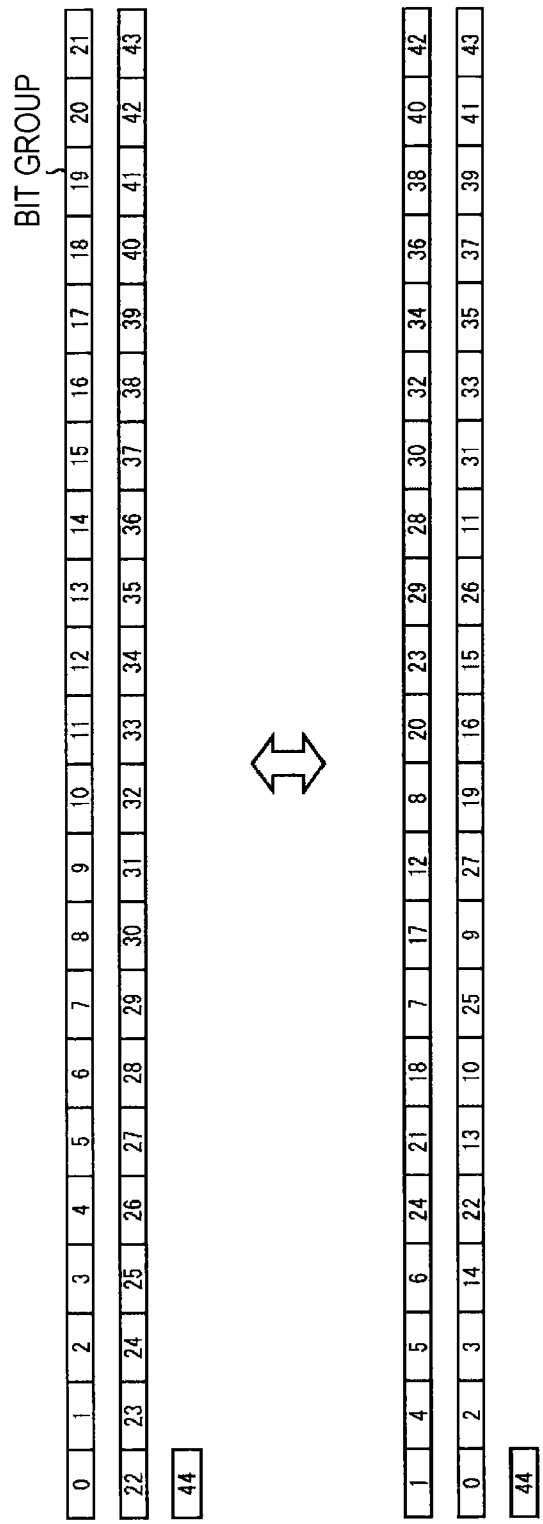
Figure 145:
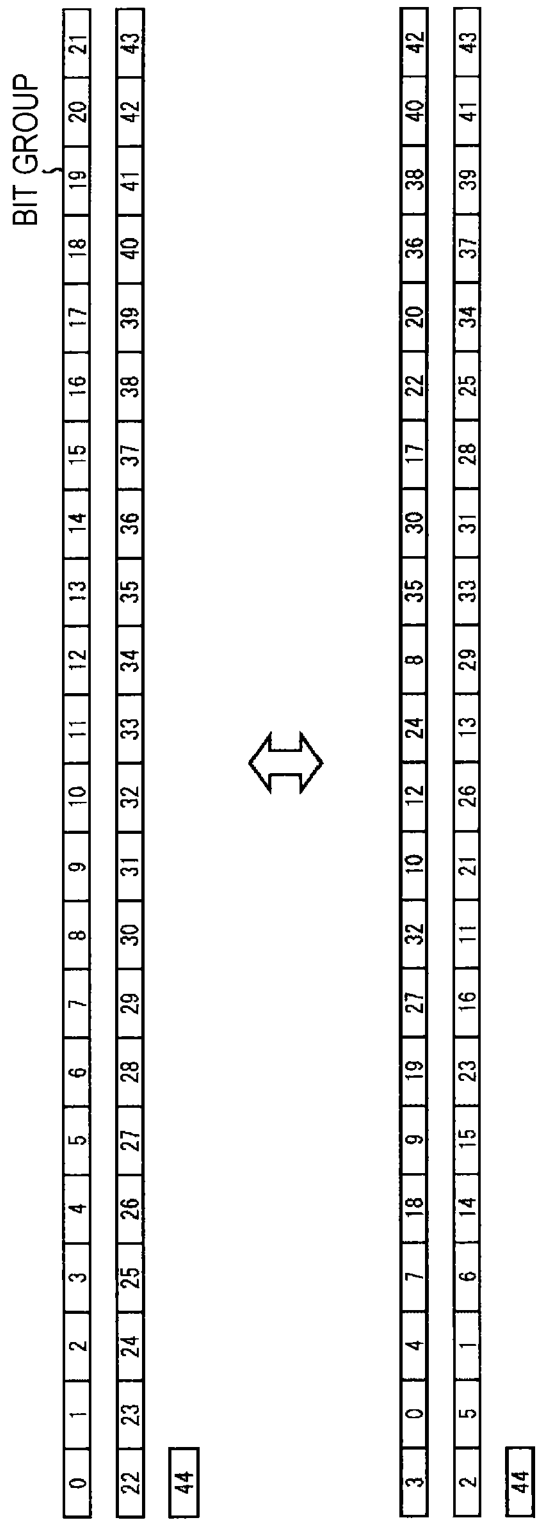
Figure 146:
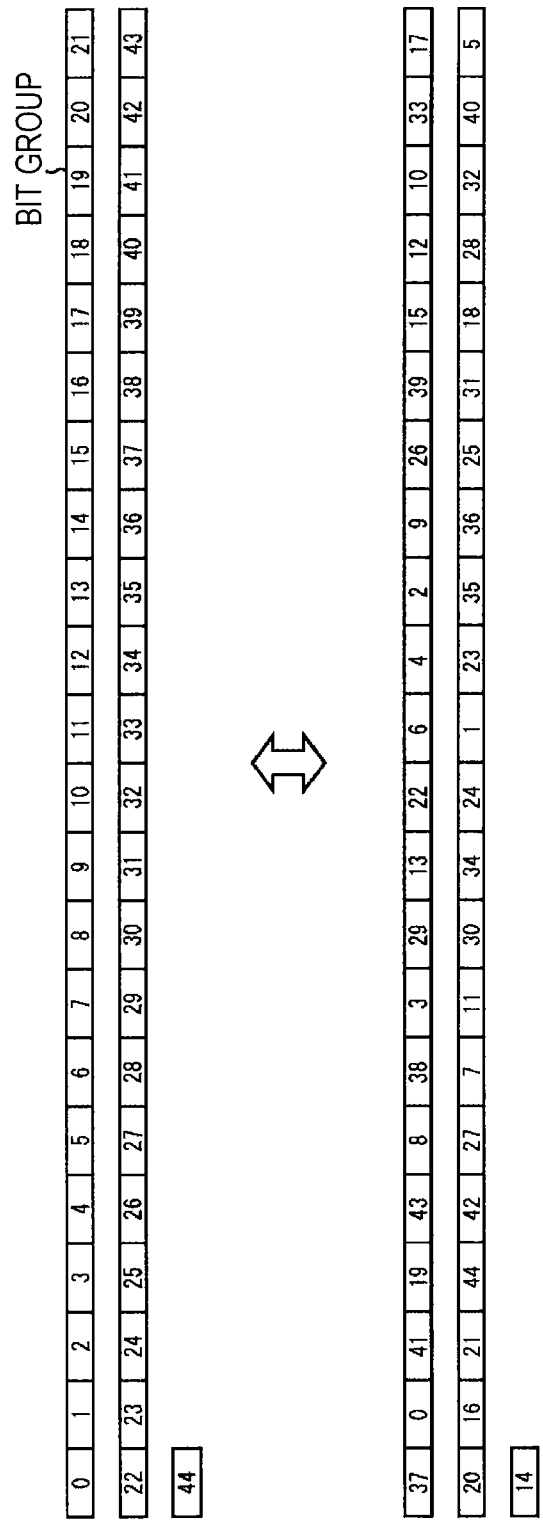
Figure 147:
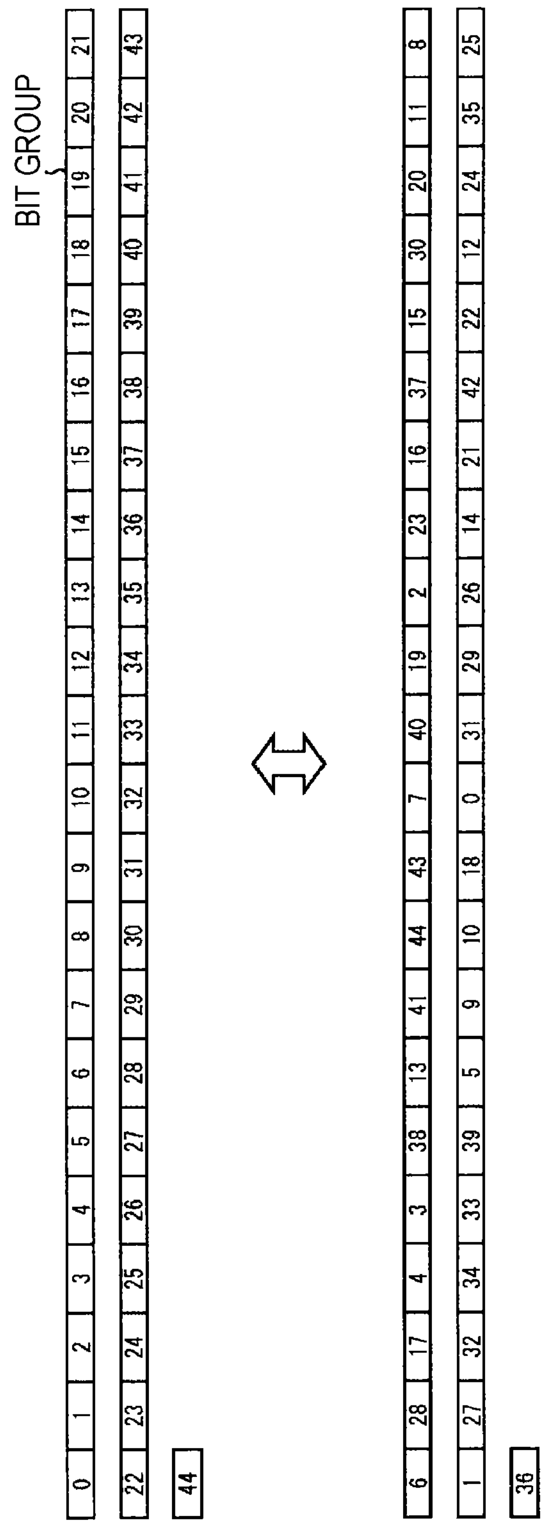
Figure 148:
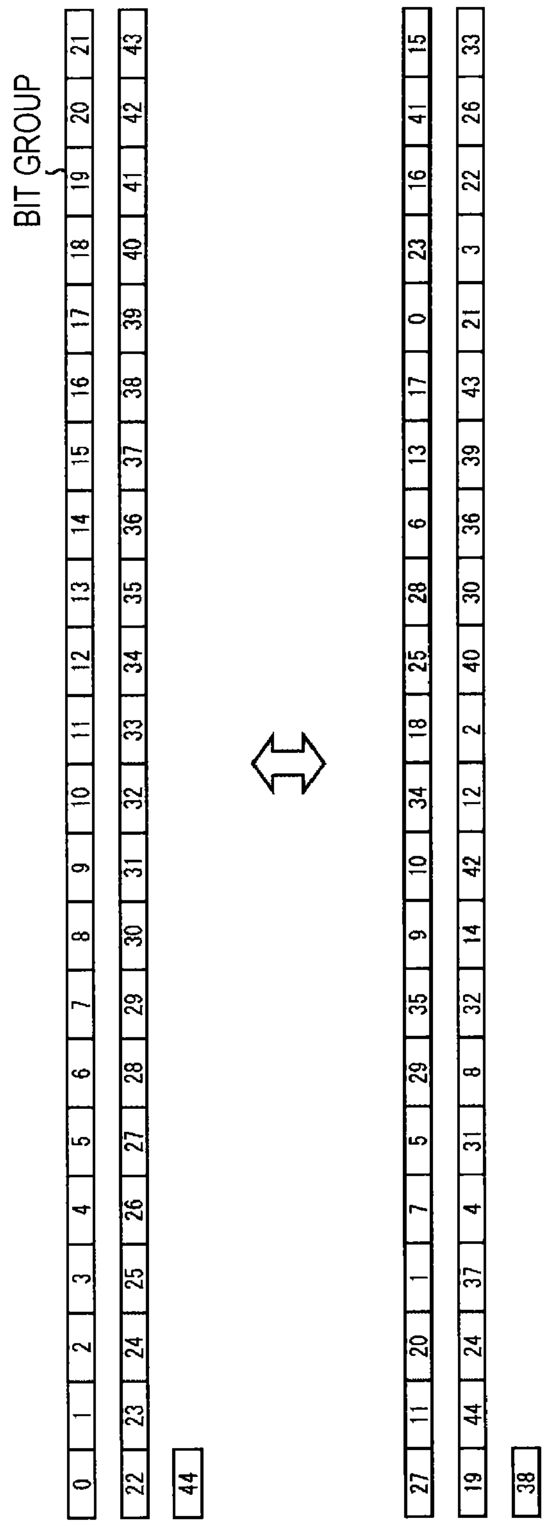
Figure 149:
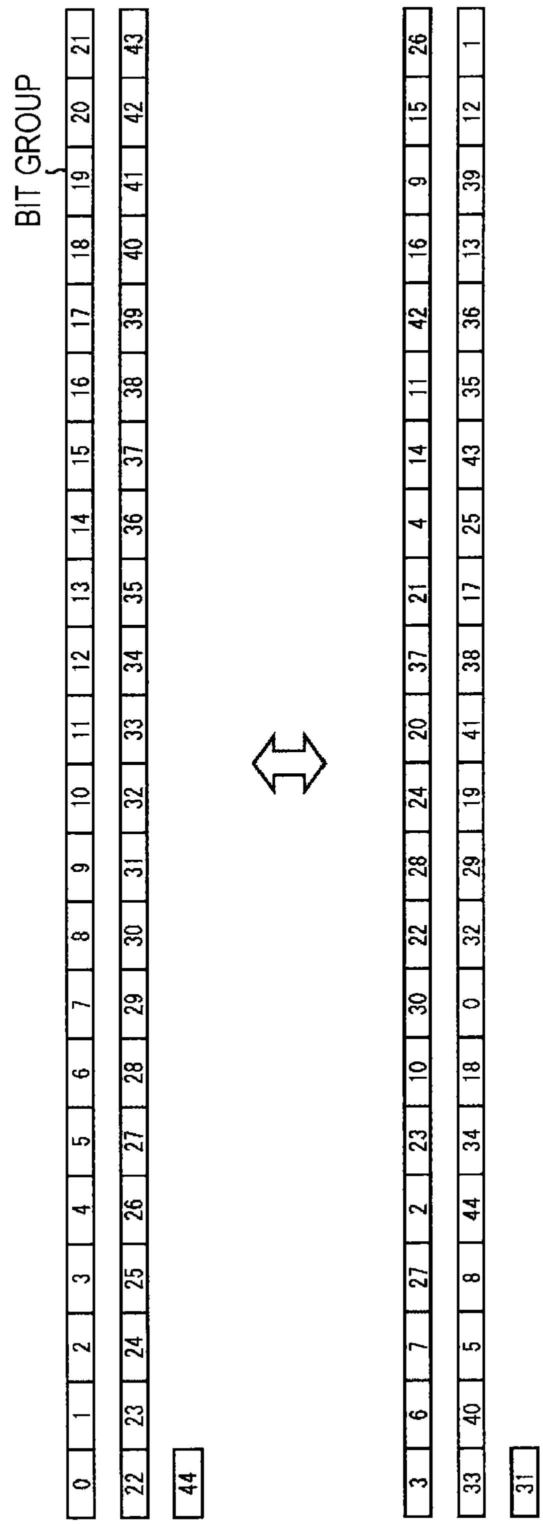
Figure 150:
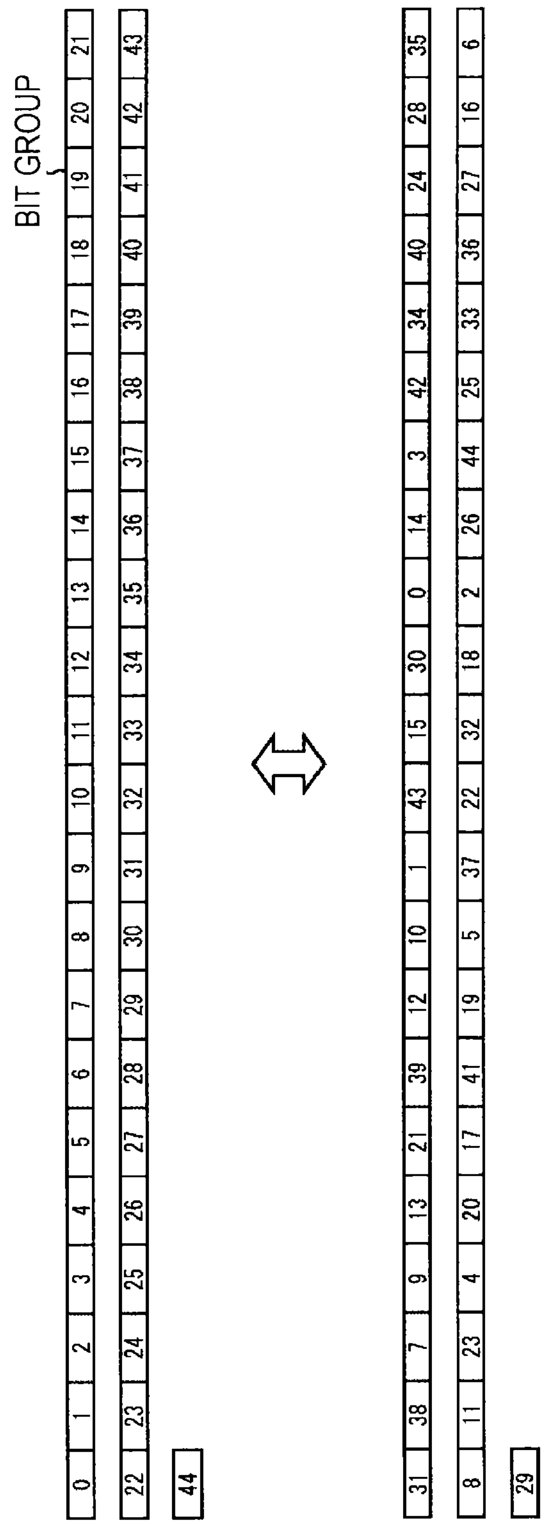
Figure 151:
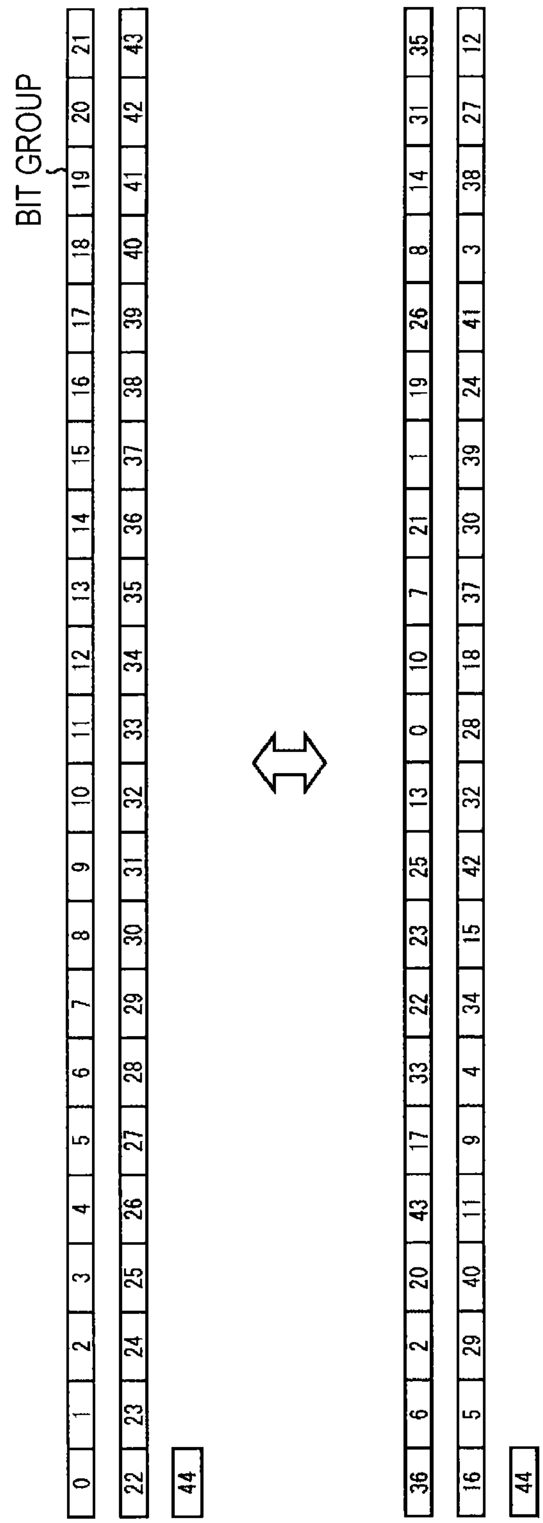
Figure 152:
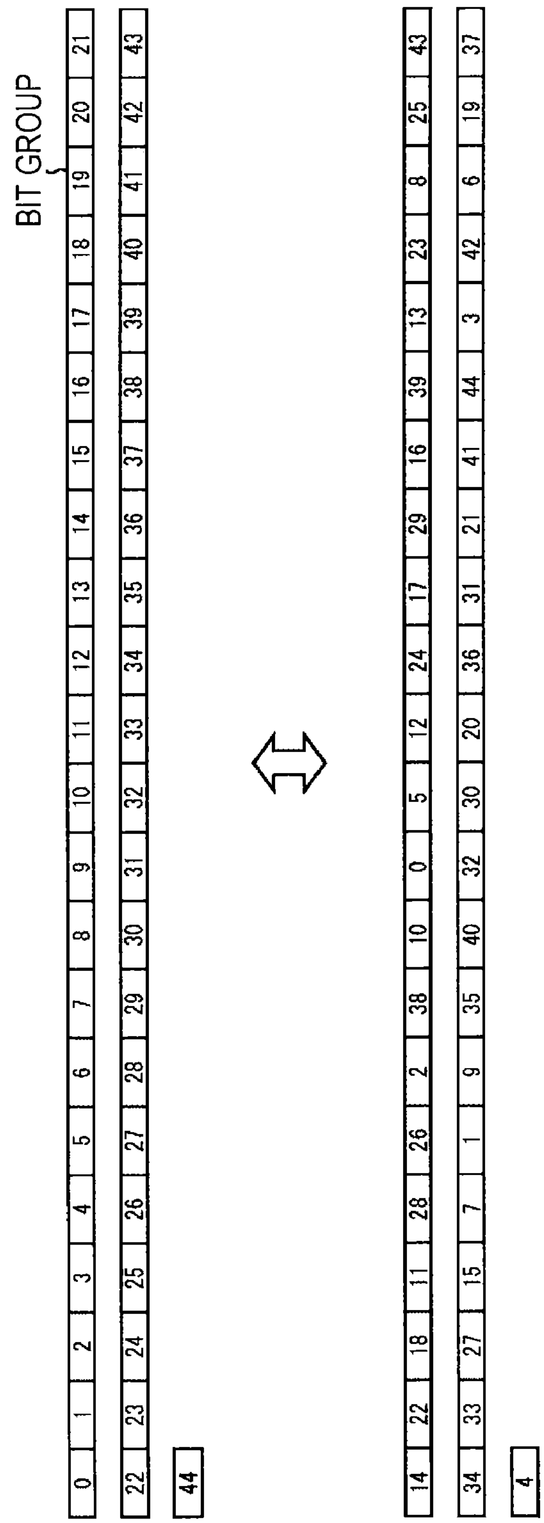
Figure 153:
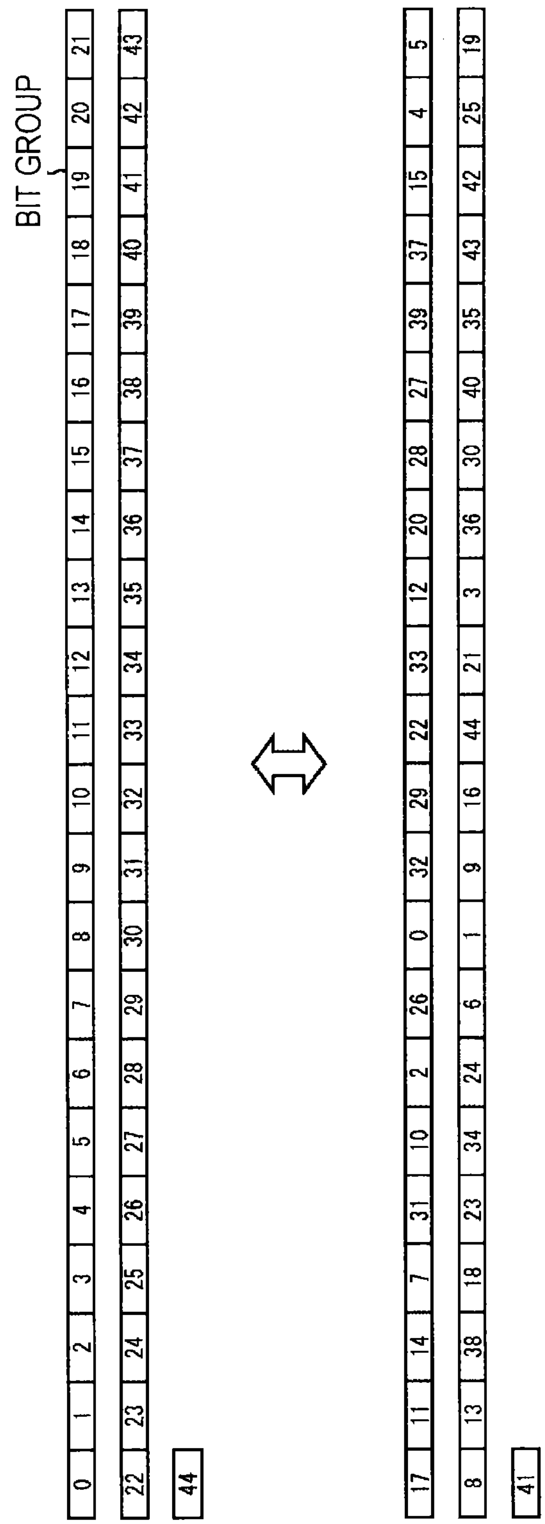
Figure 154:
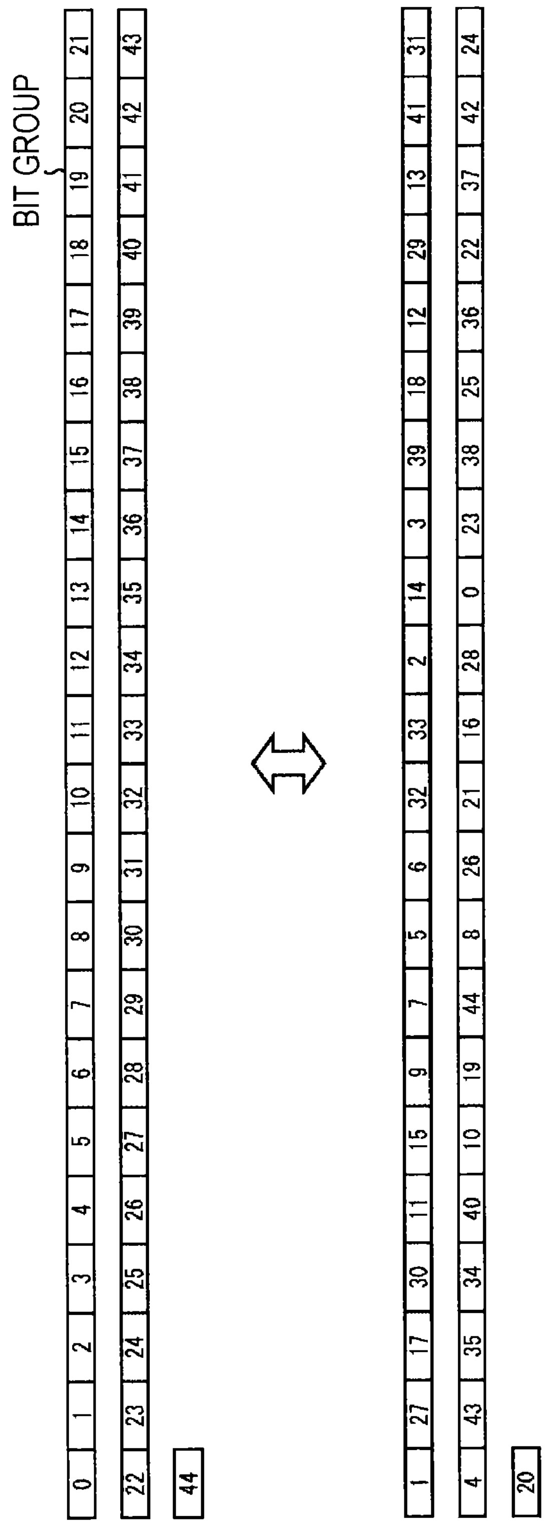
Figure 155:
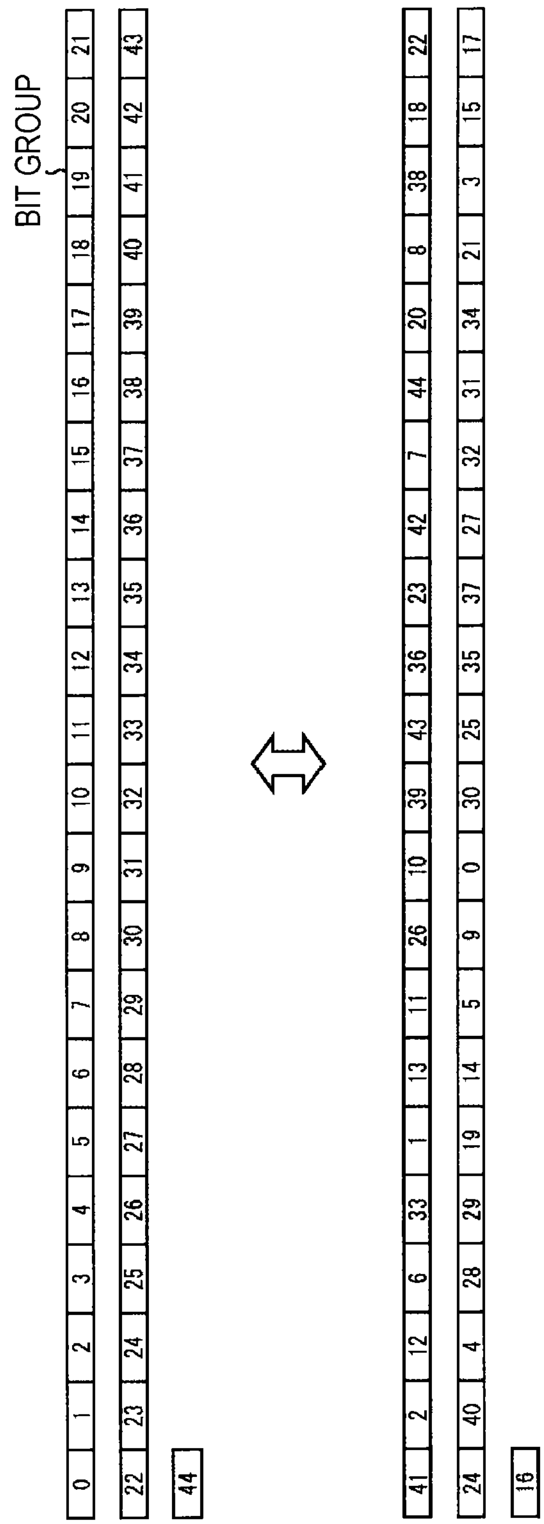
Figure 156:
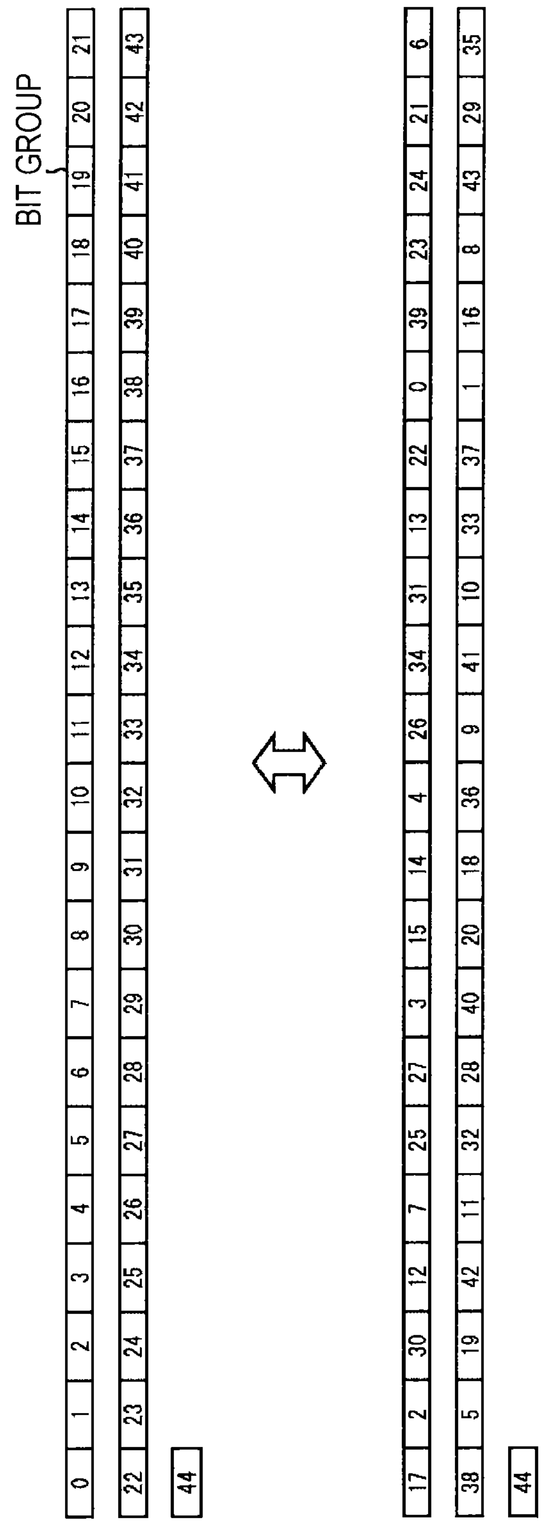
Figure 157:
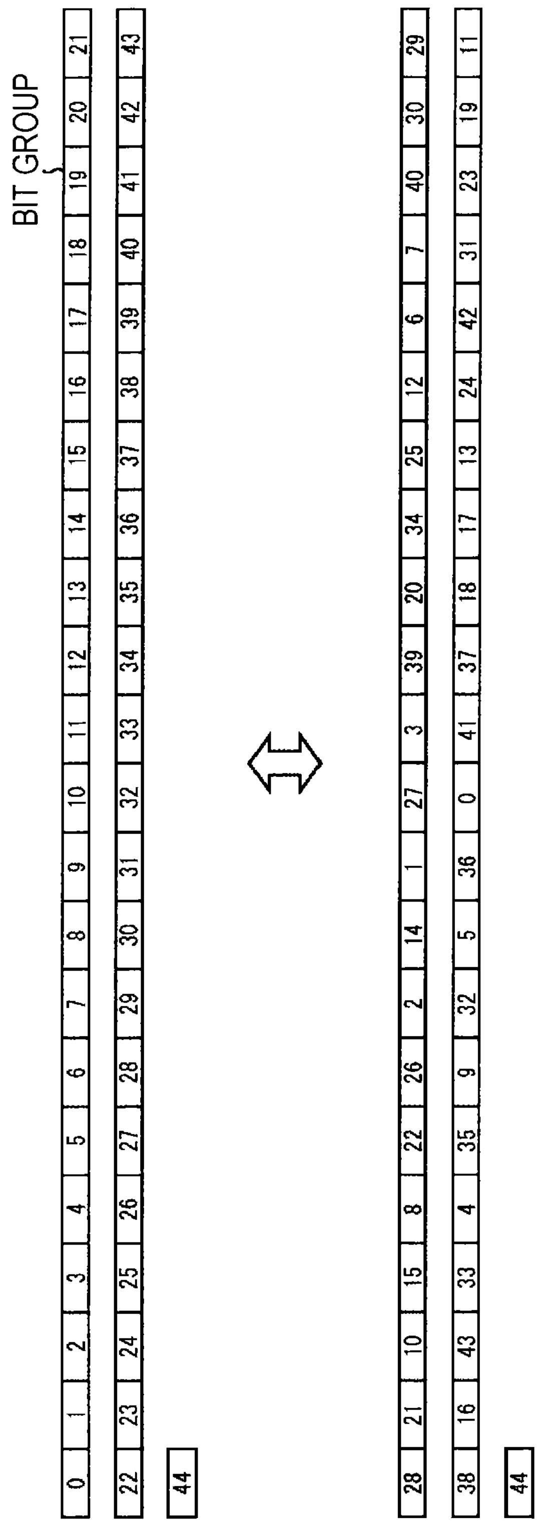
Figure 158:
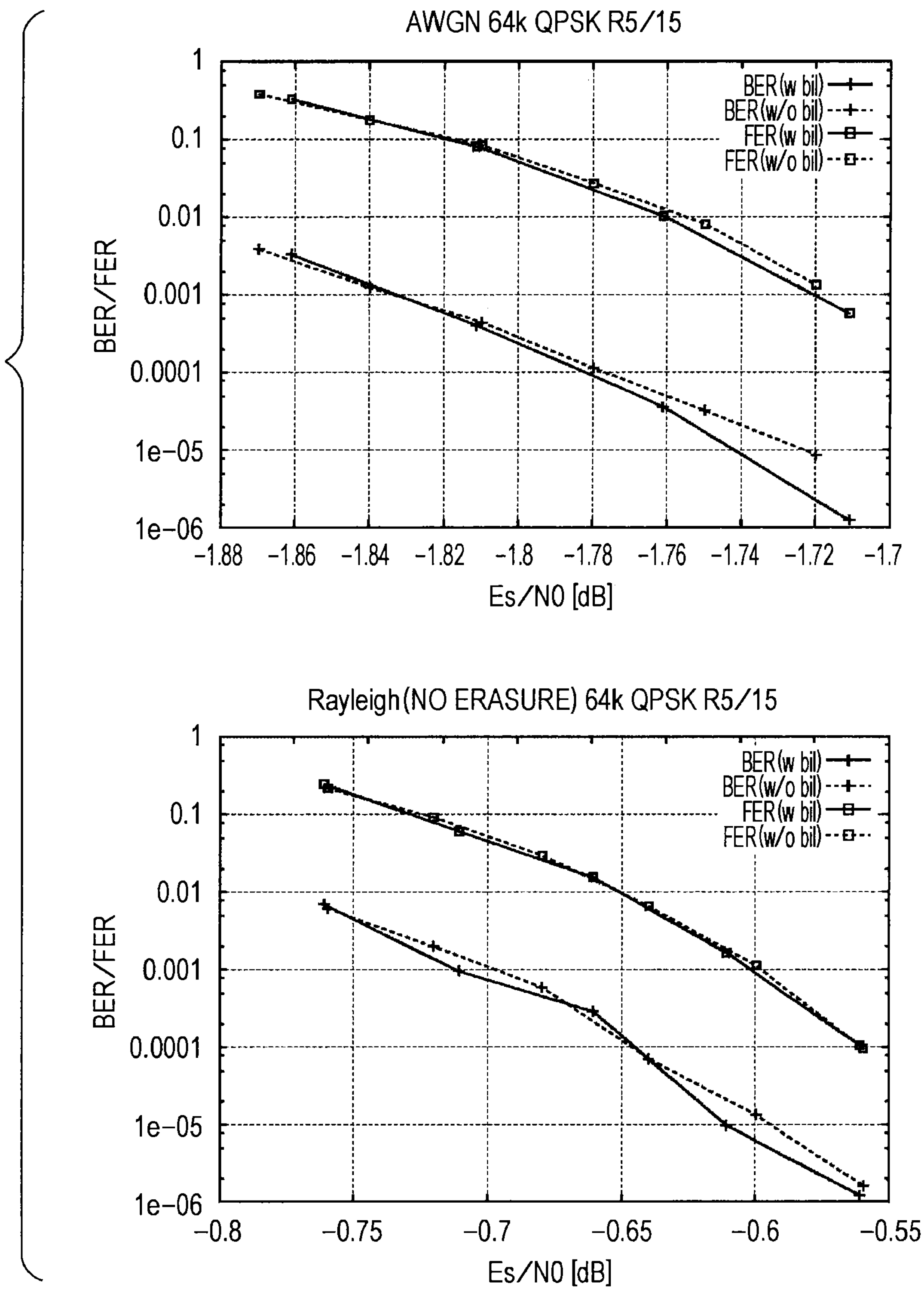
Figure 159:
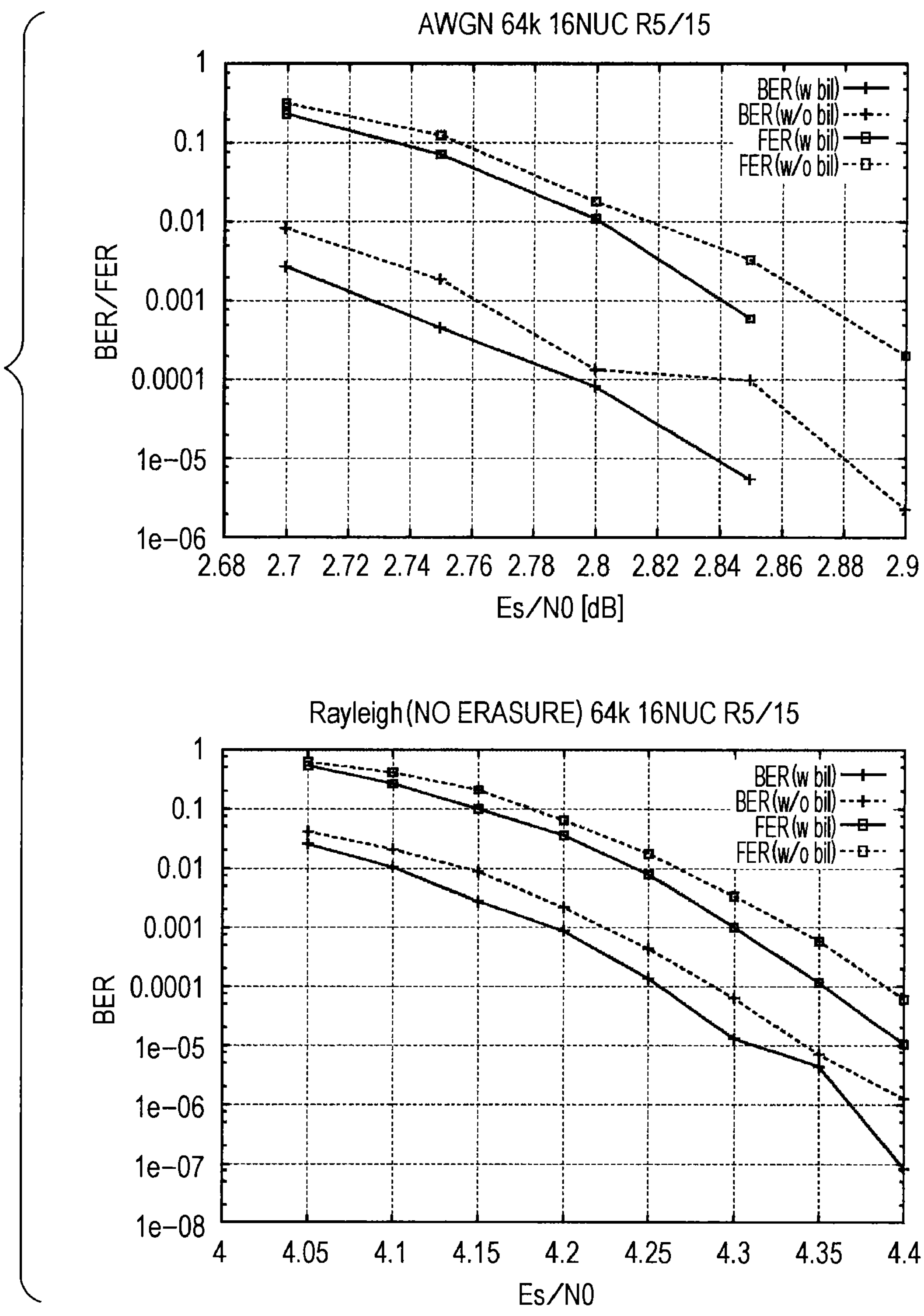
Figure 160:
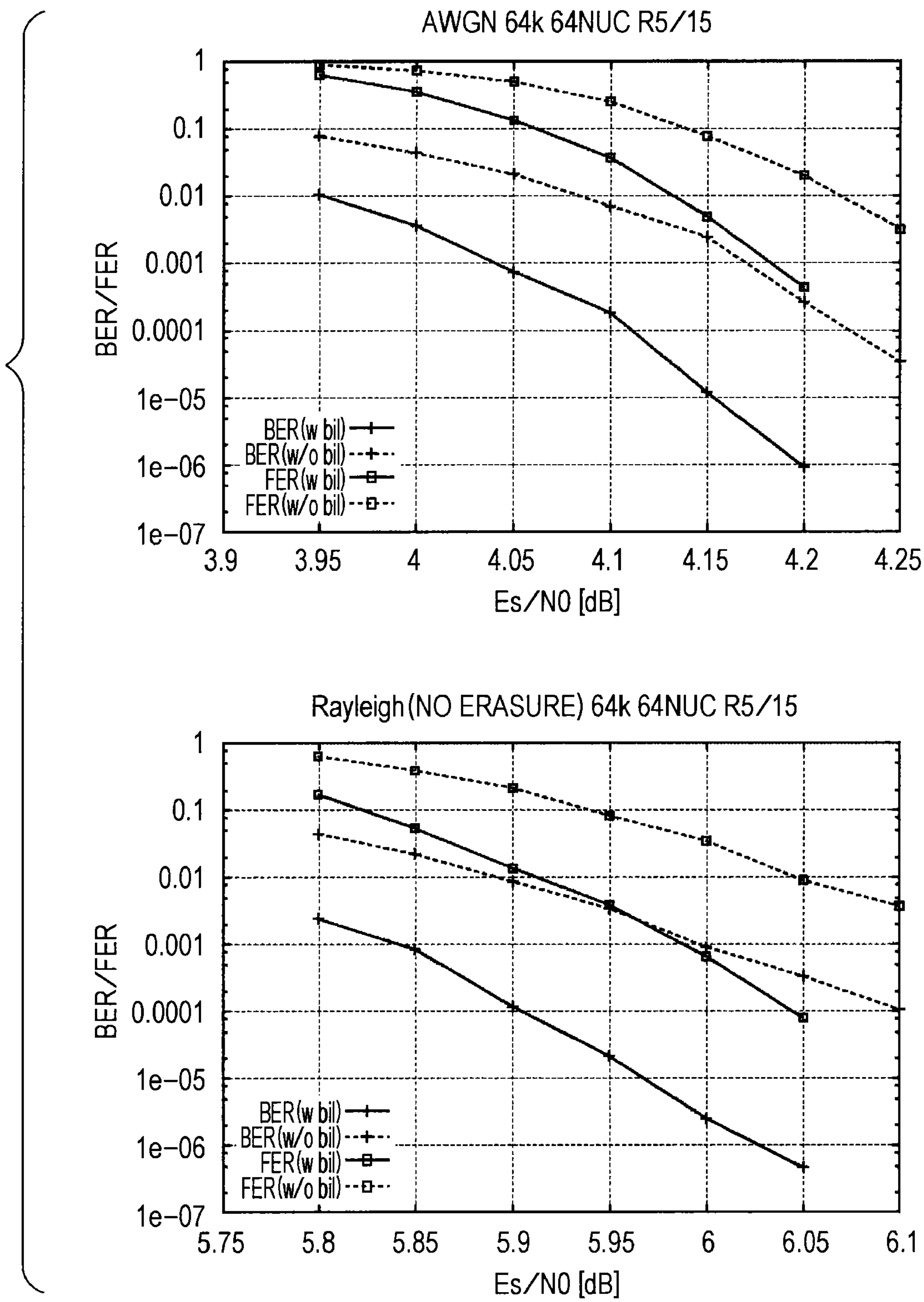
Figure 161:
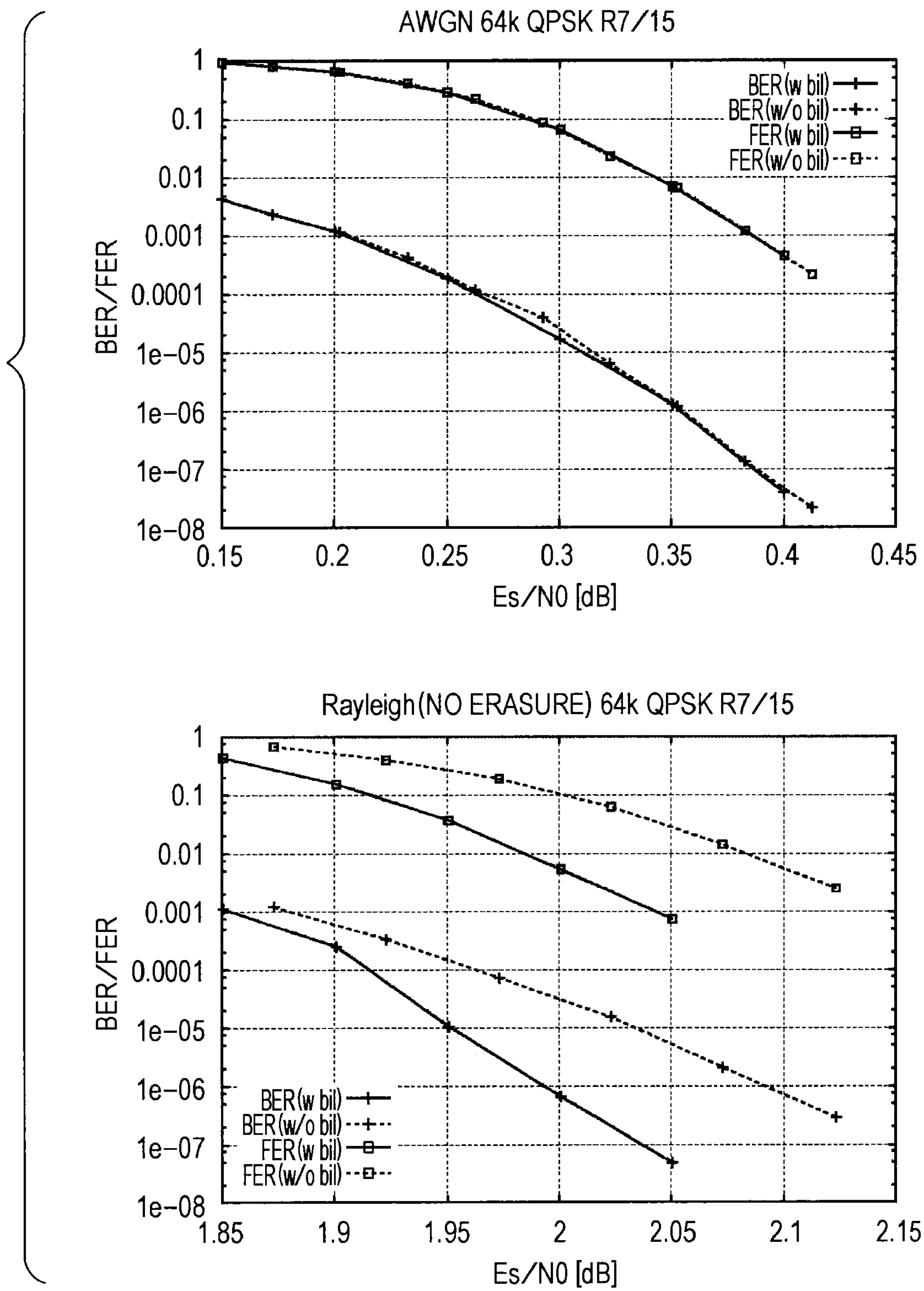
Figure 163:
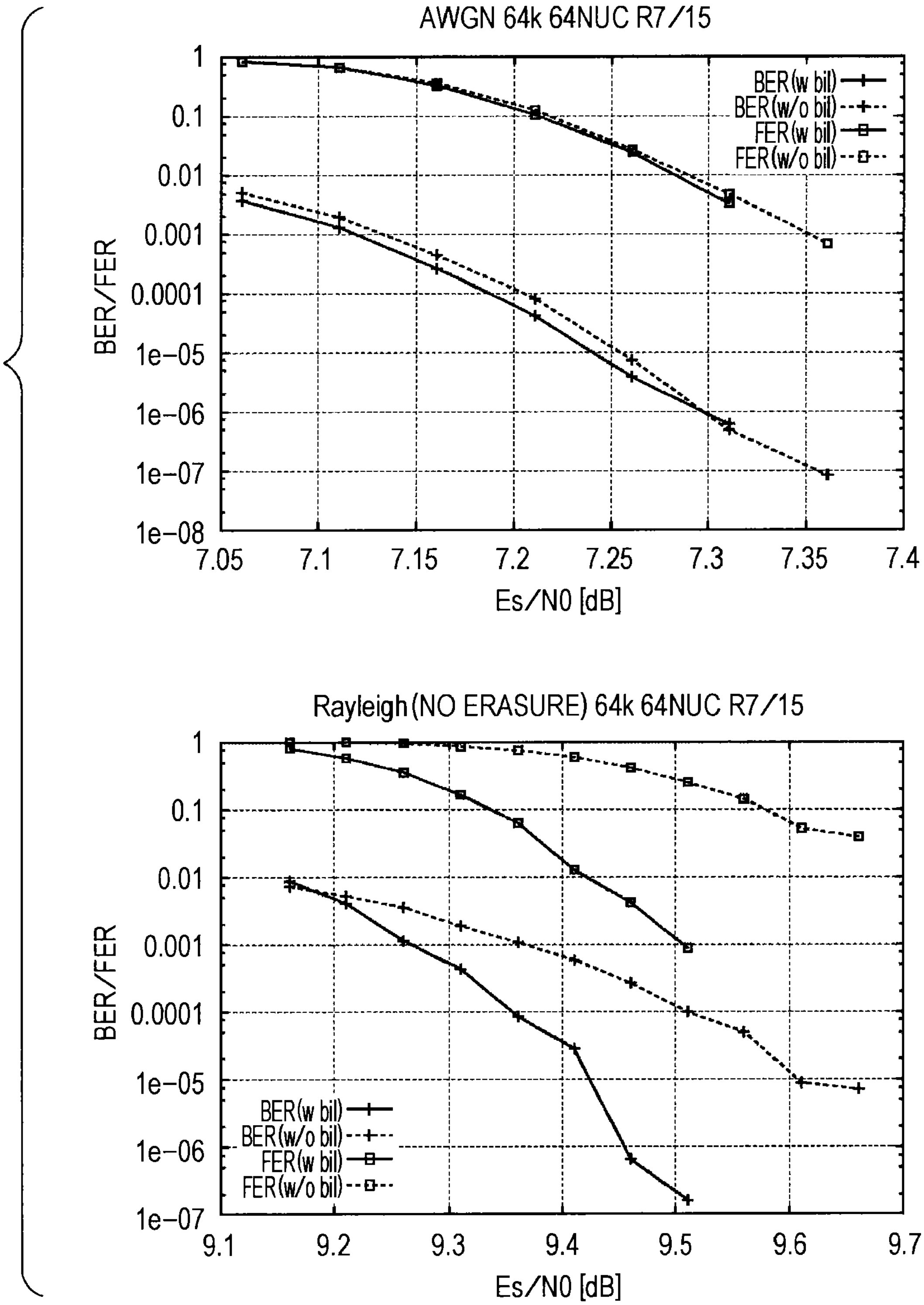
Figure 164:
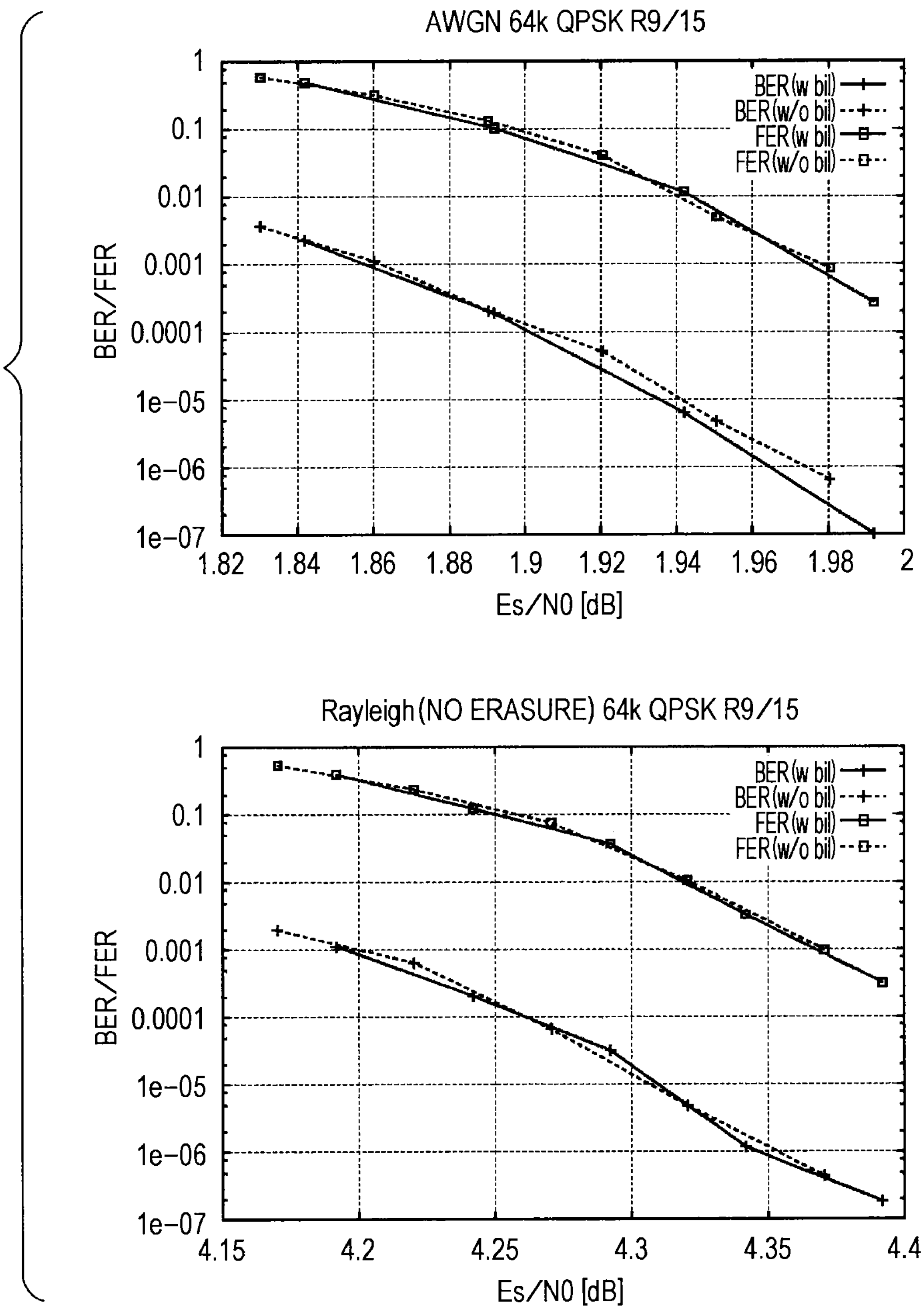
Figure 165:
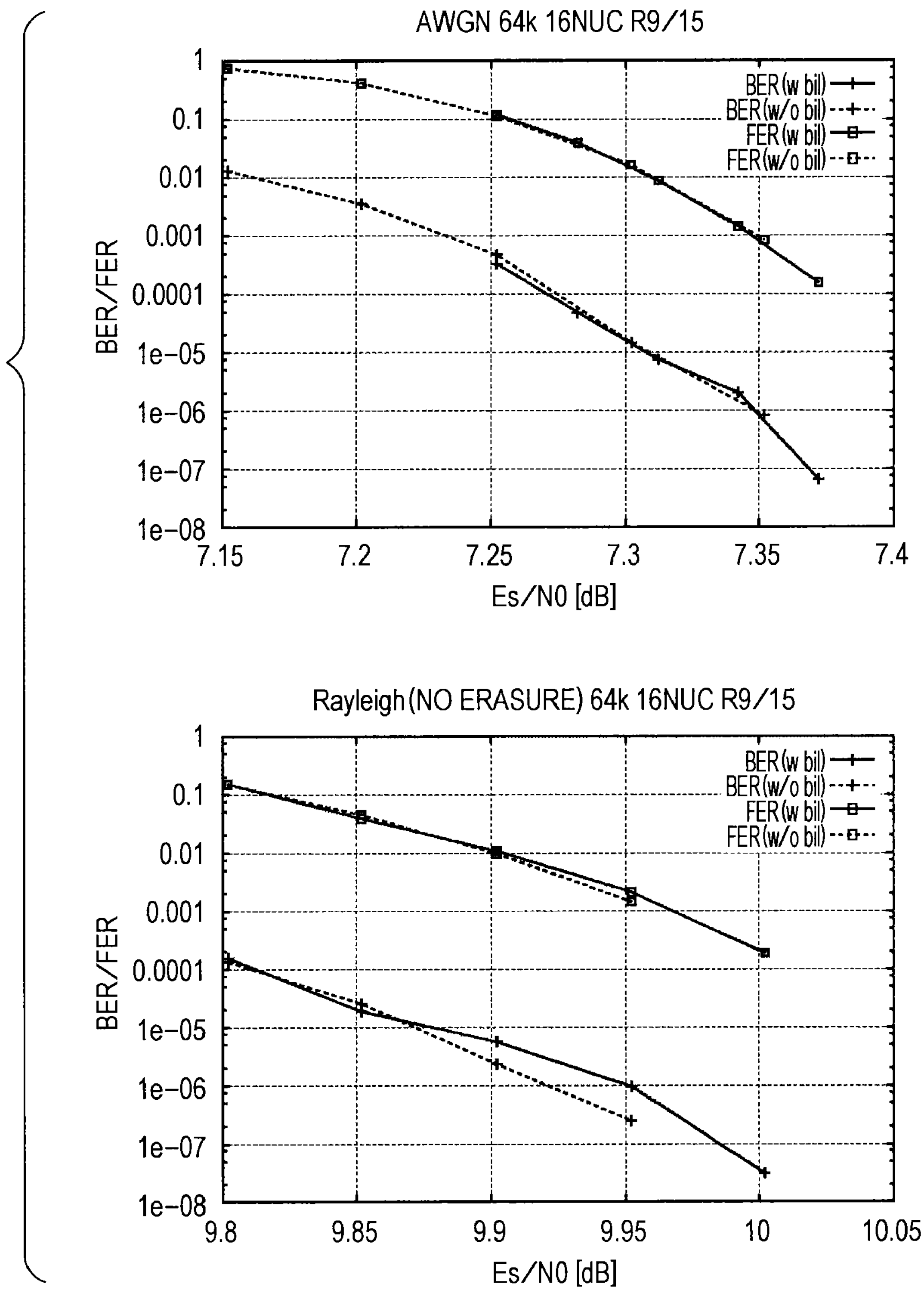
Figure 166:
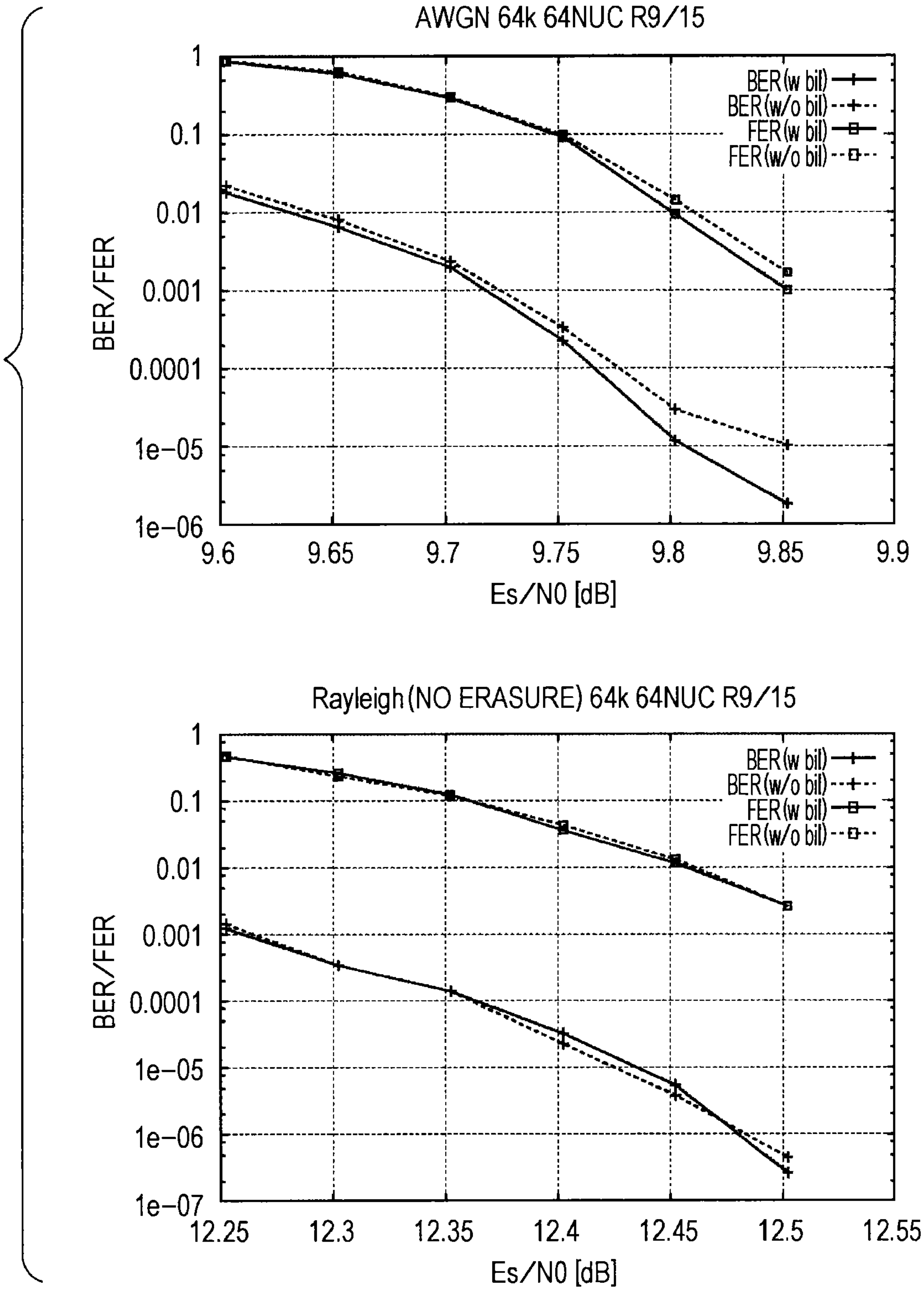
Figure 167:
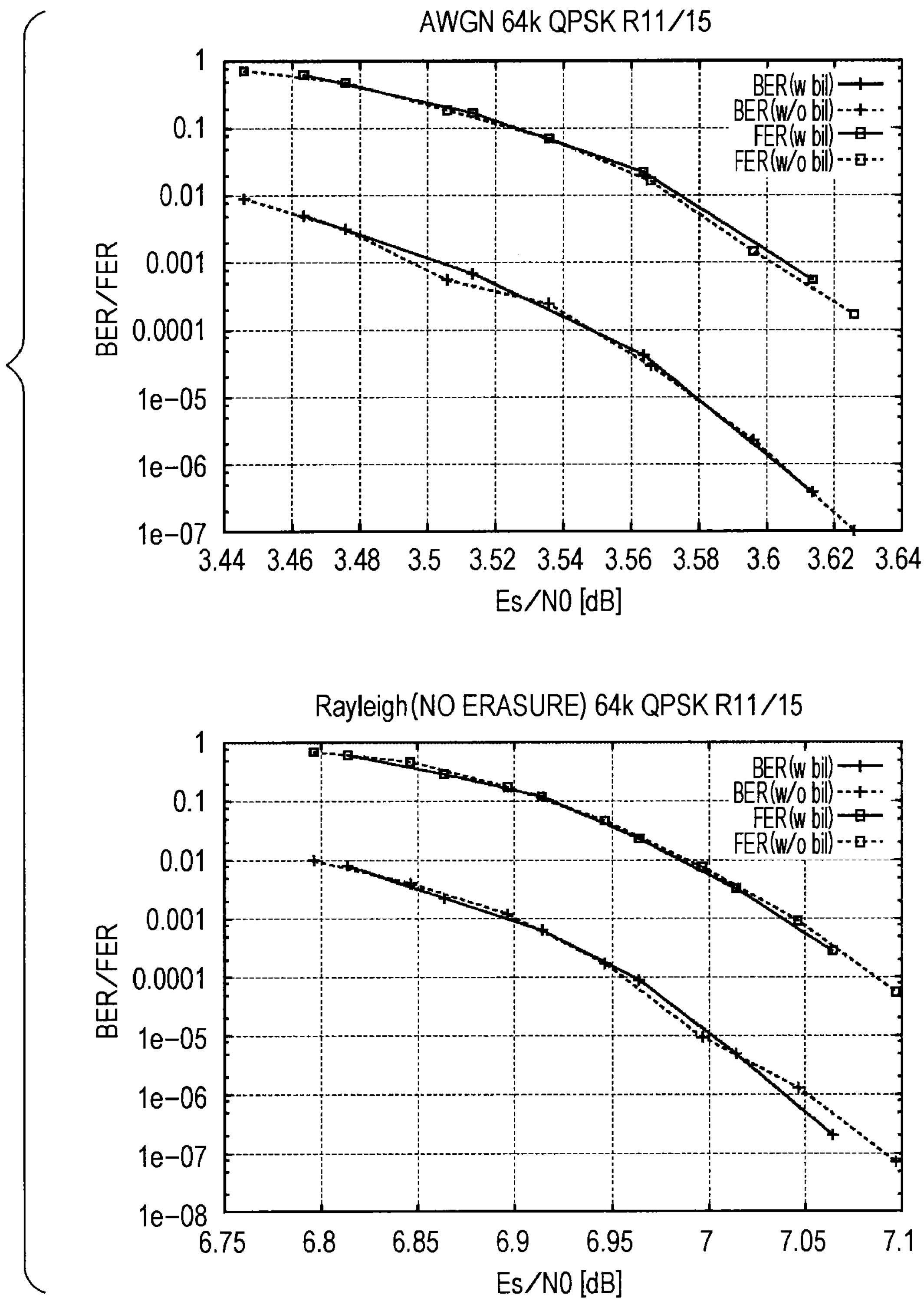
Figure 168:
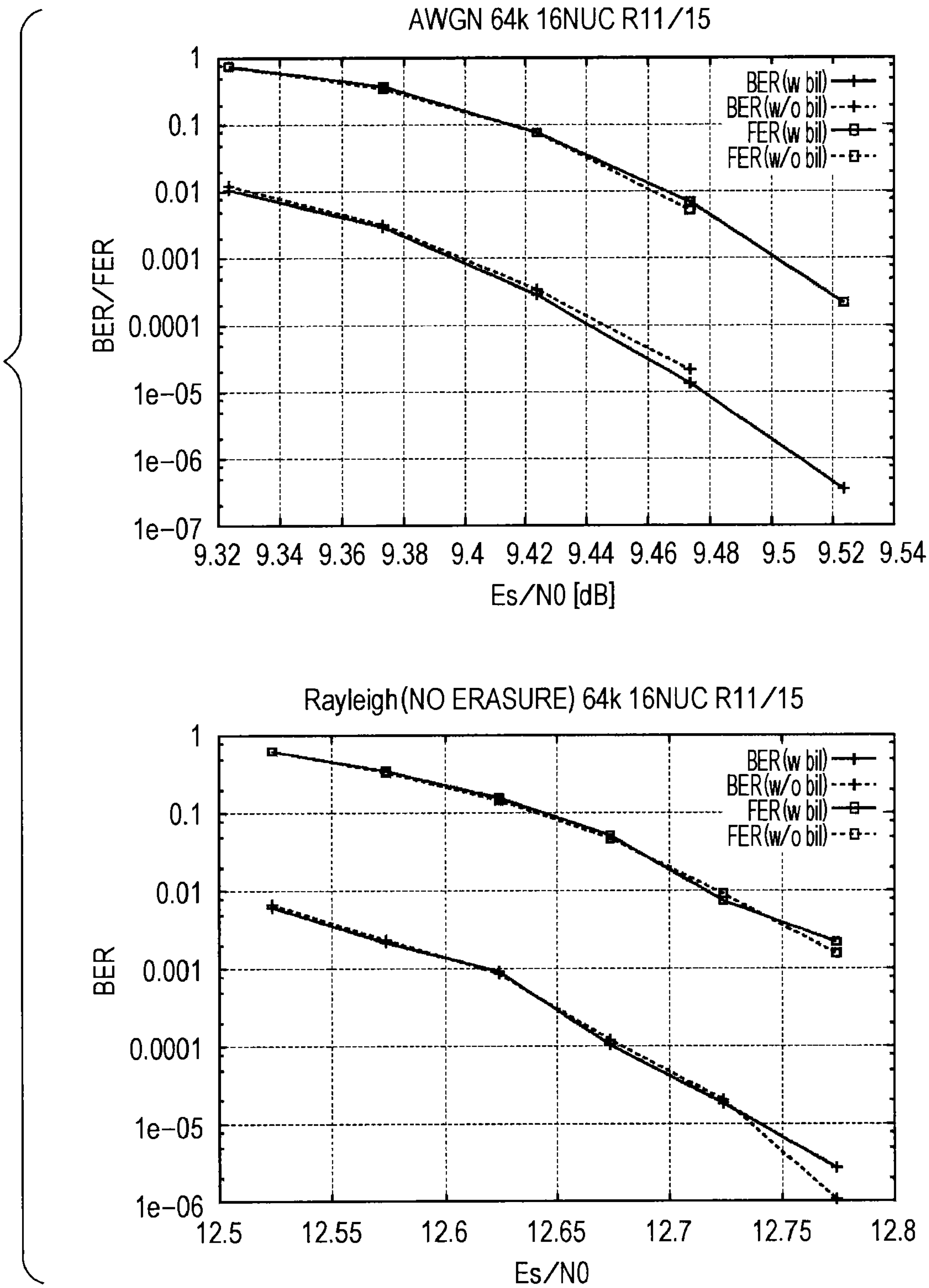
Figure 169:
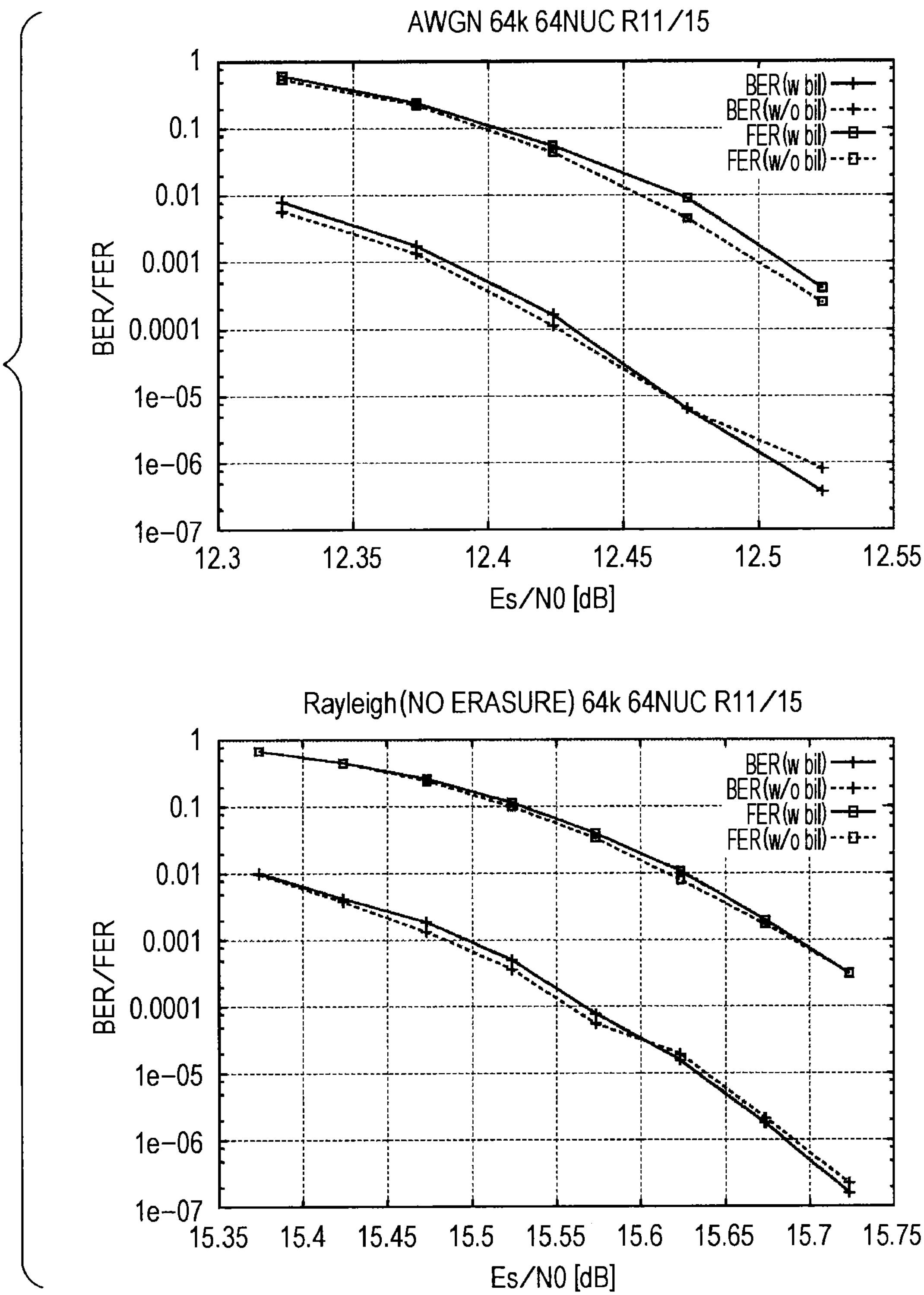
Figure 170:
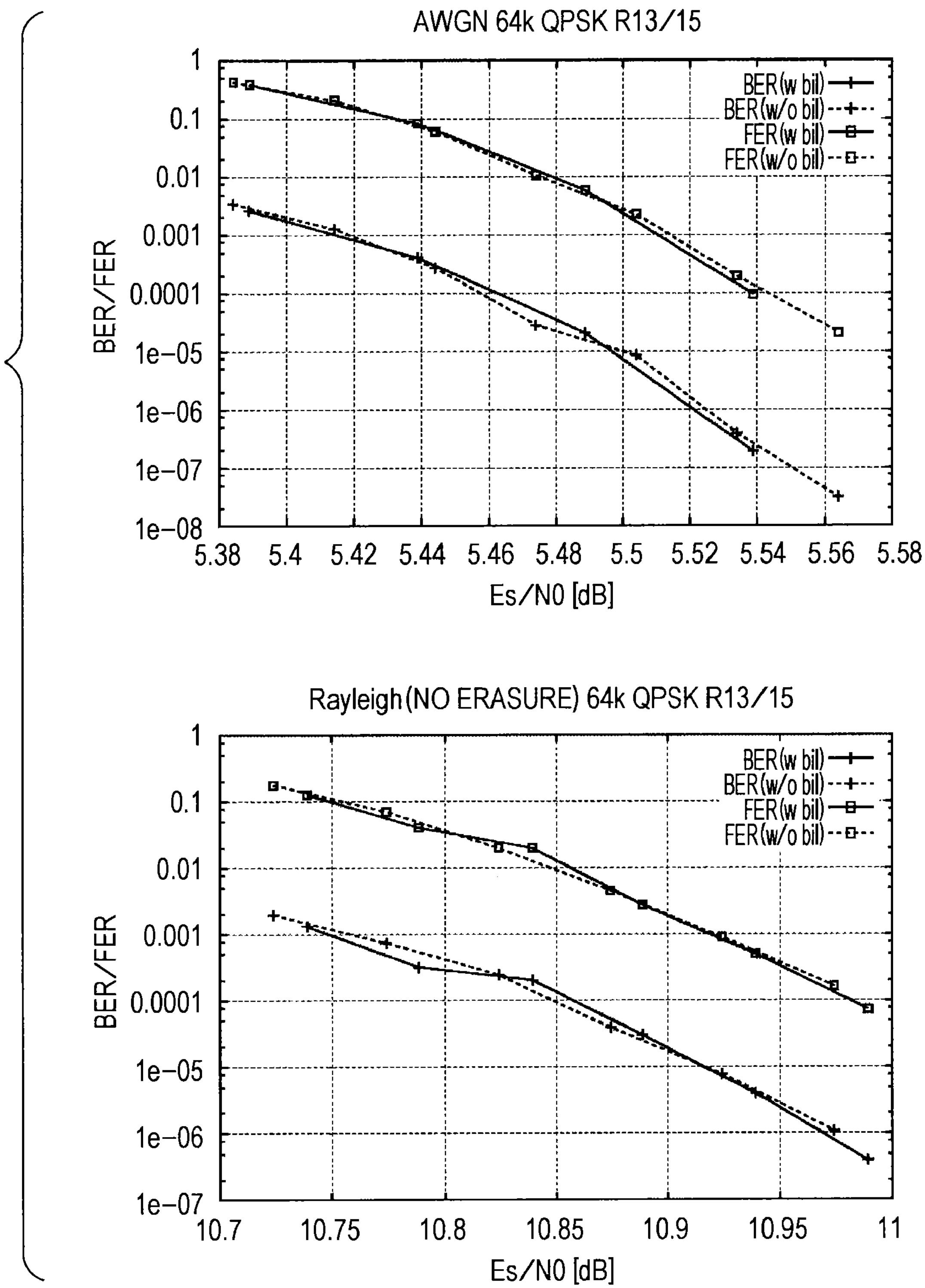
Figure 171:
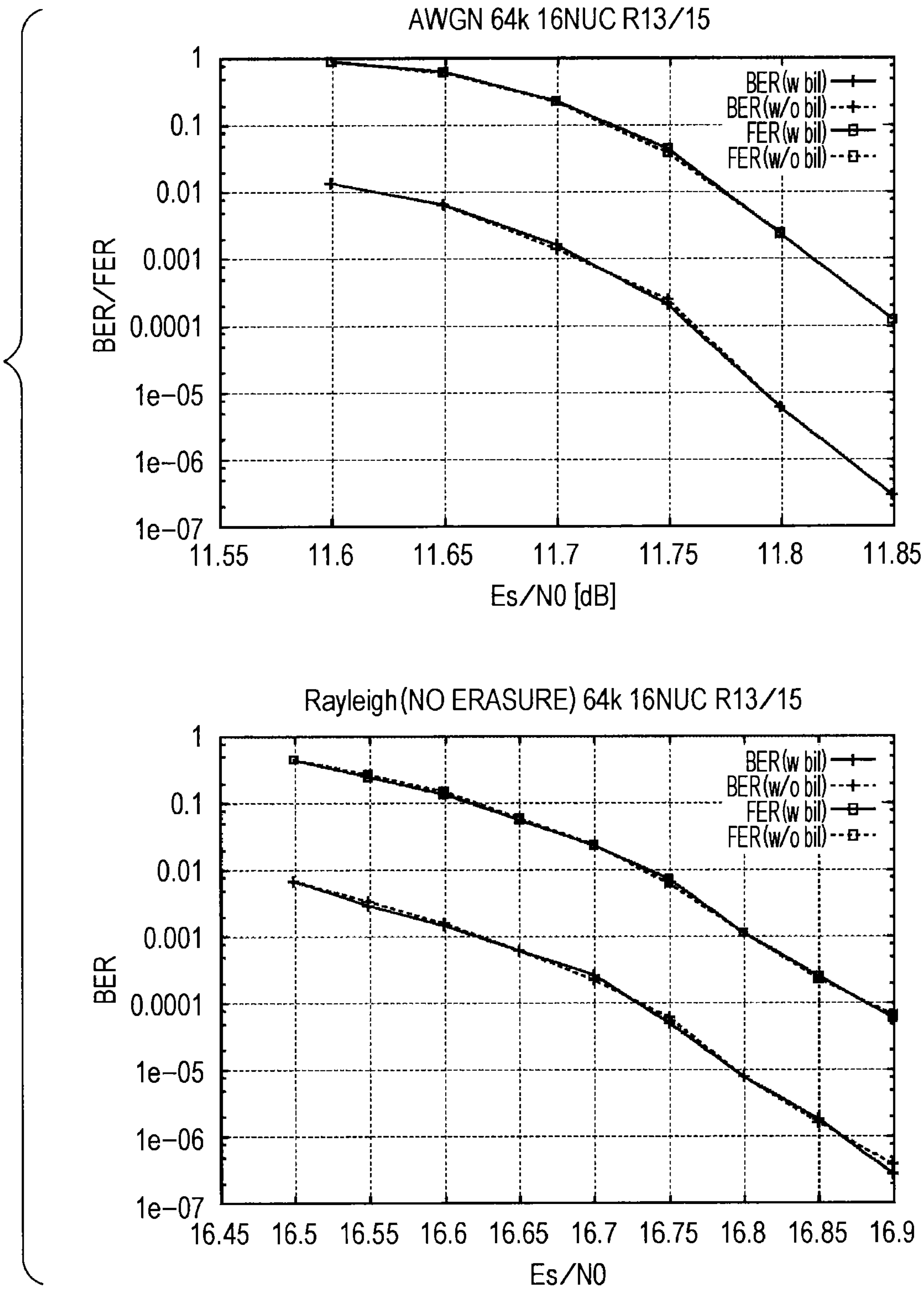
Figure 172:
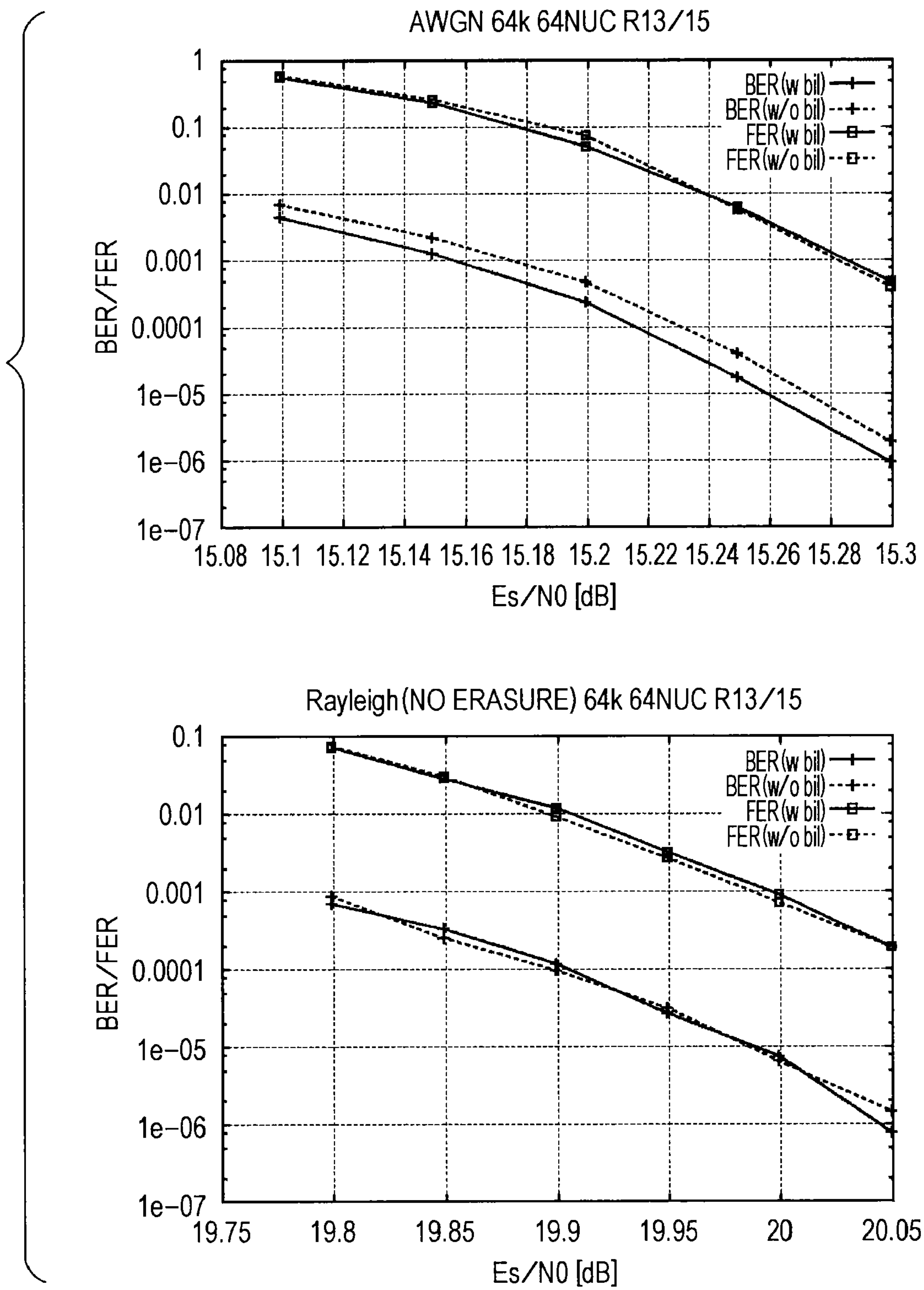
Figure 173:
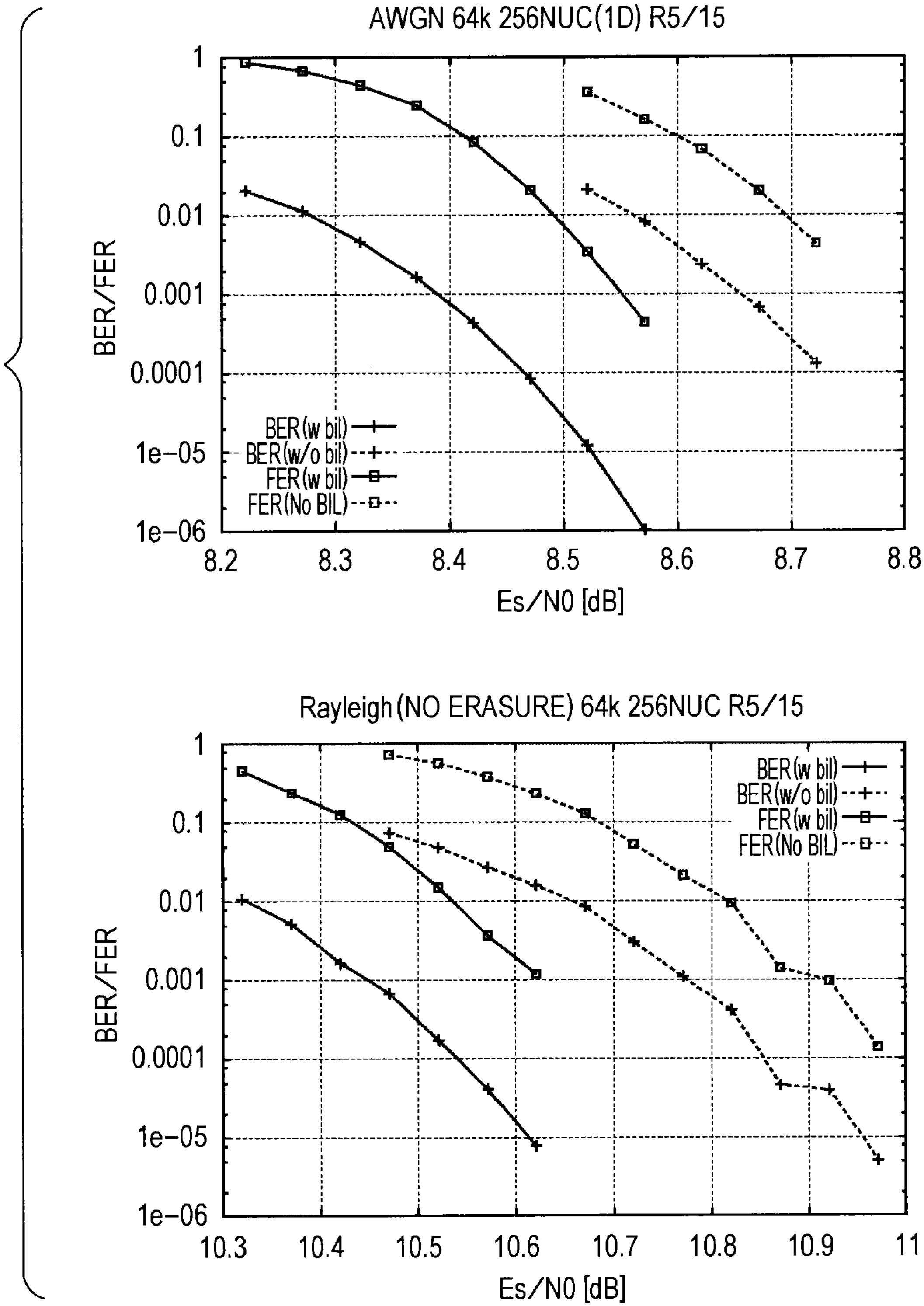
Figure 174:
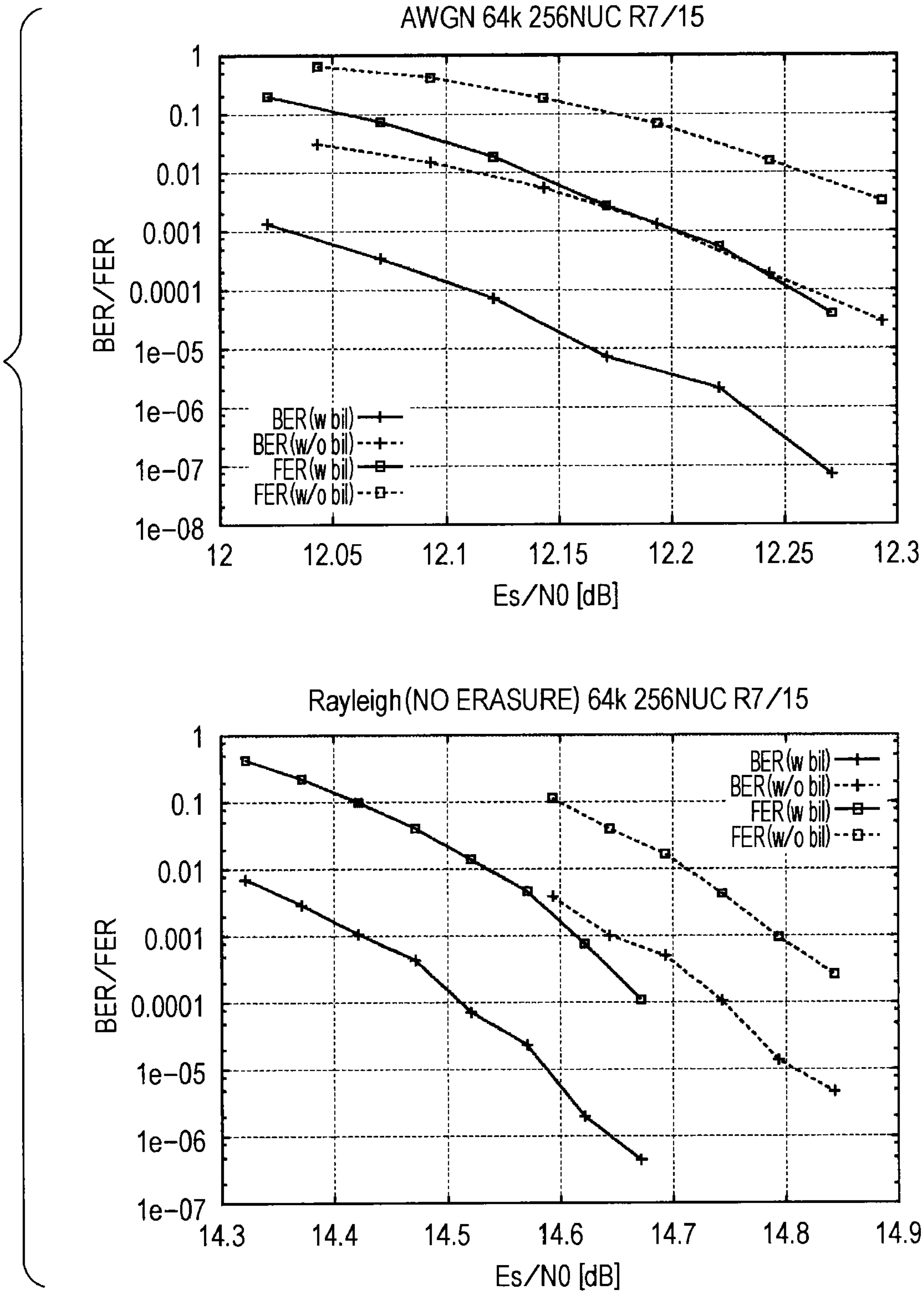
Figure 175:
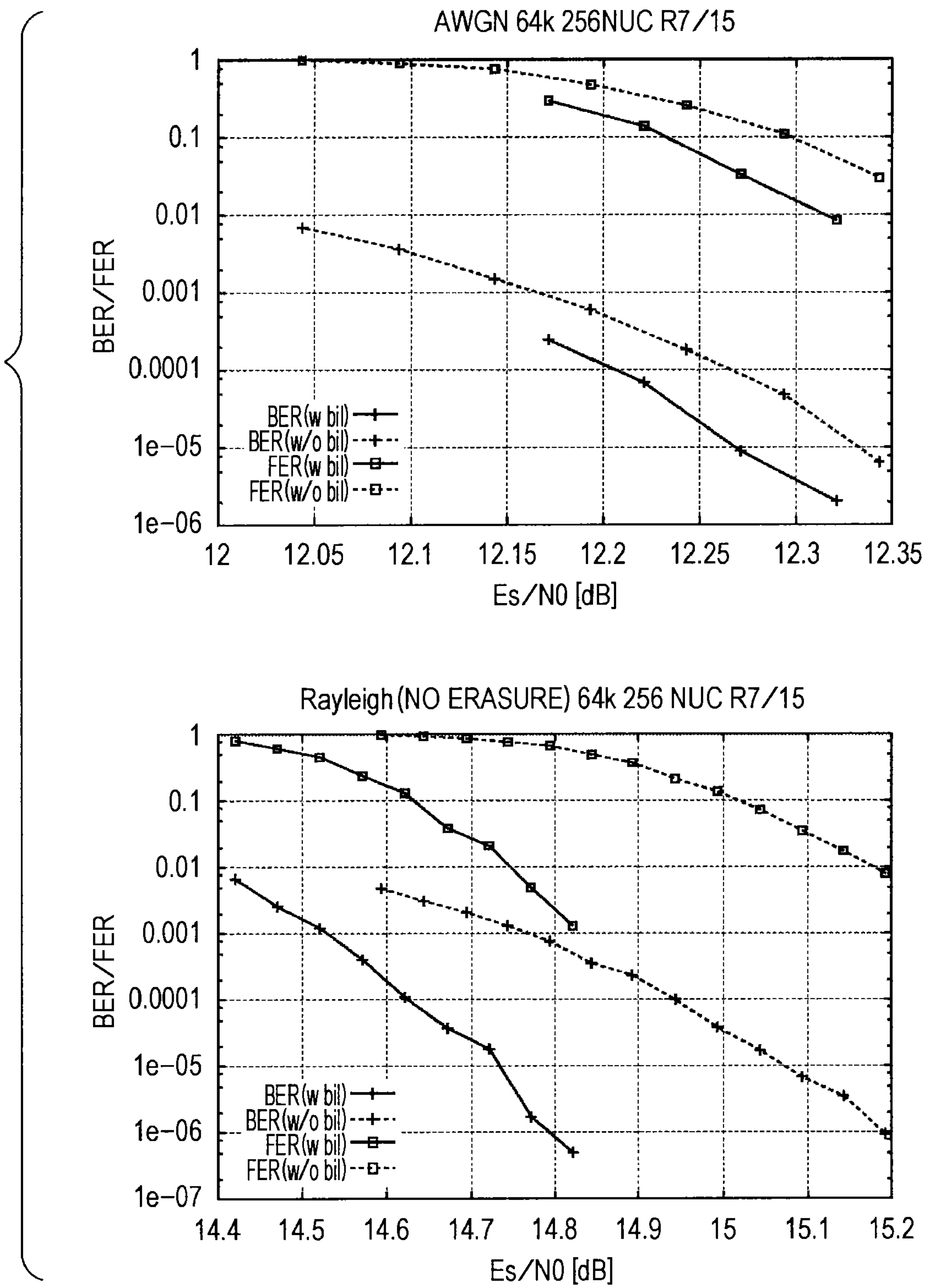
Figure 176:
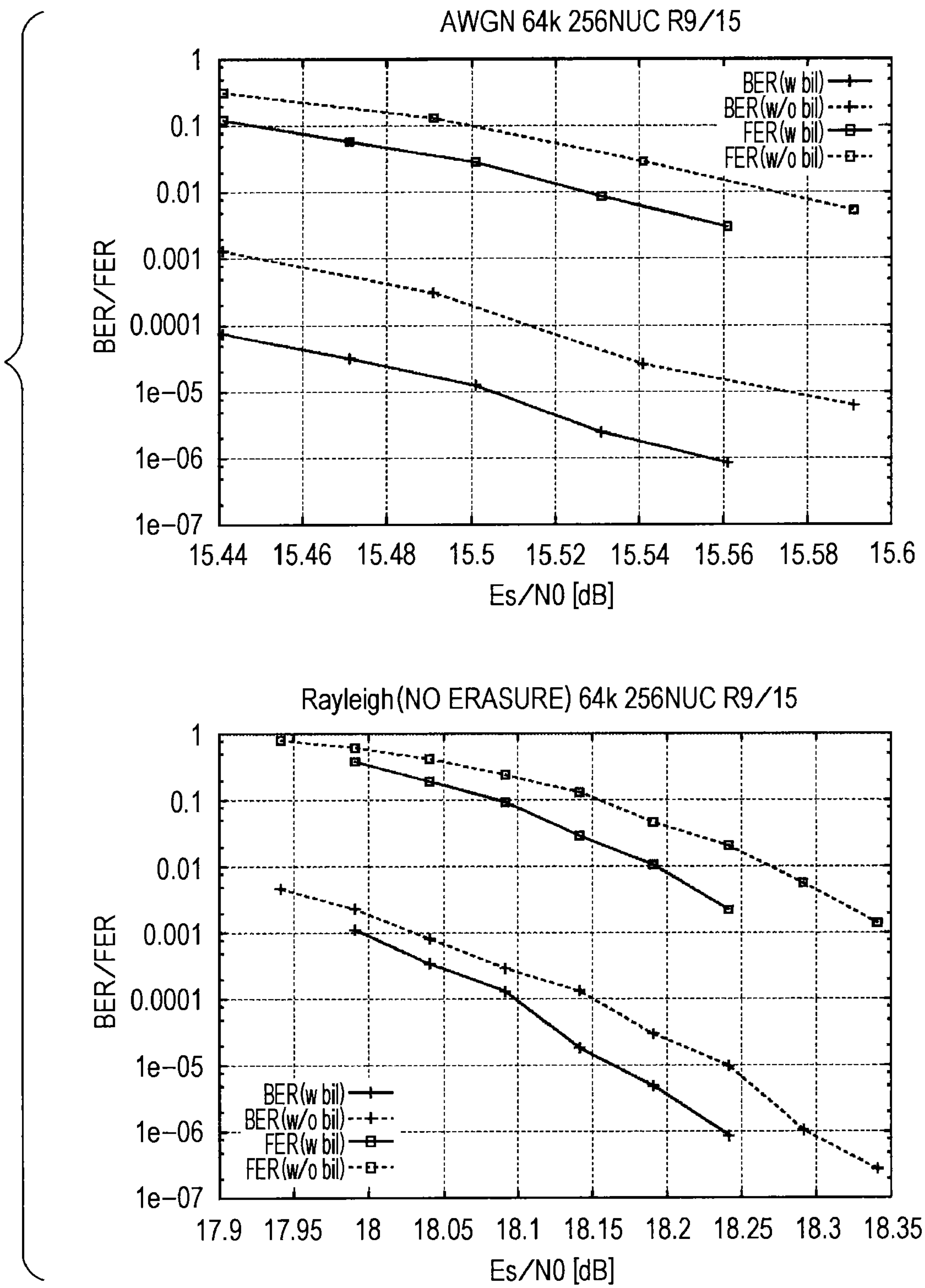
Figure 177:
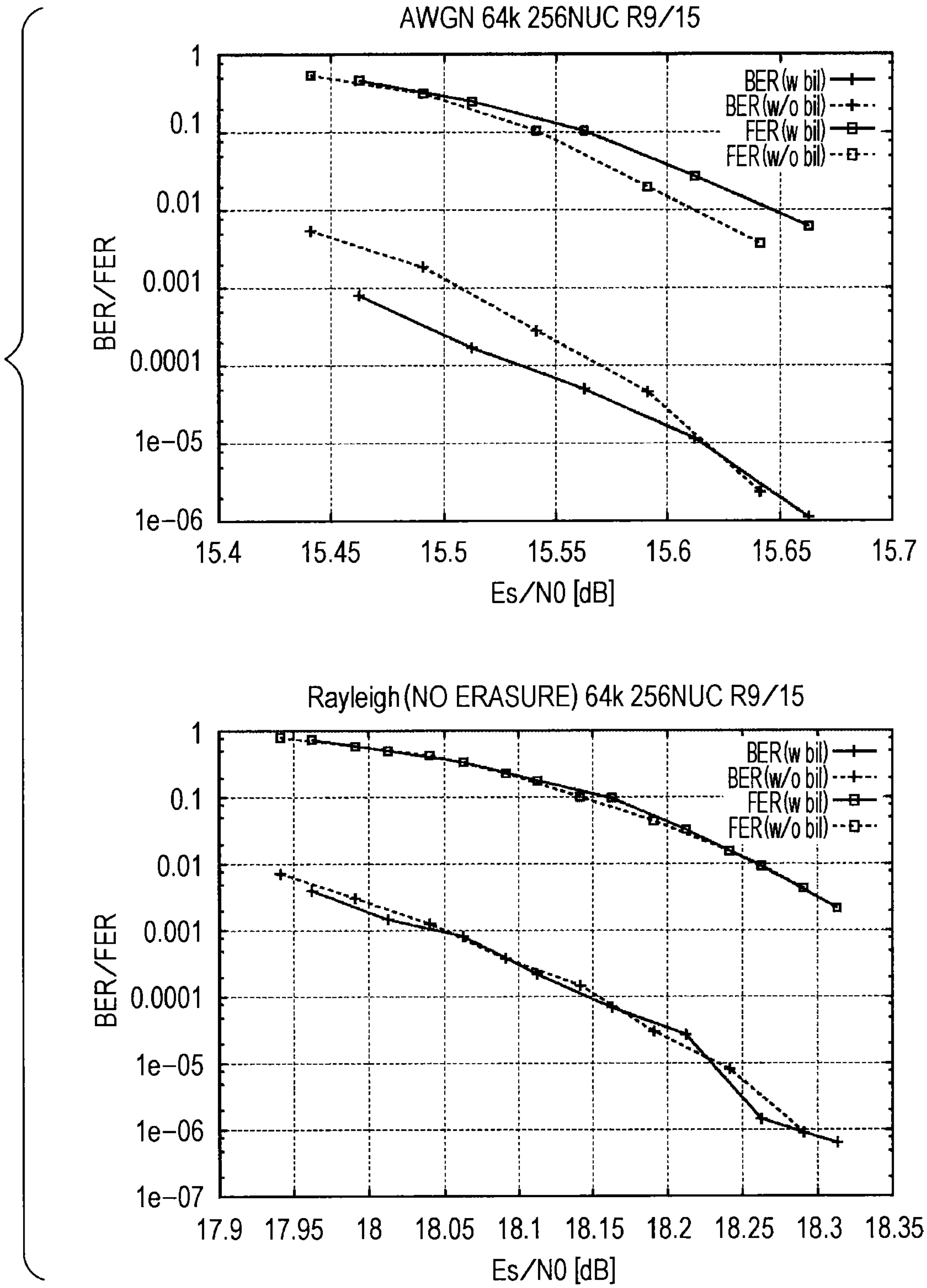
Figure 178:
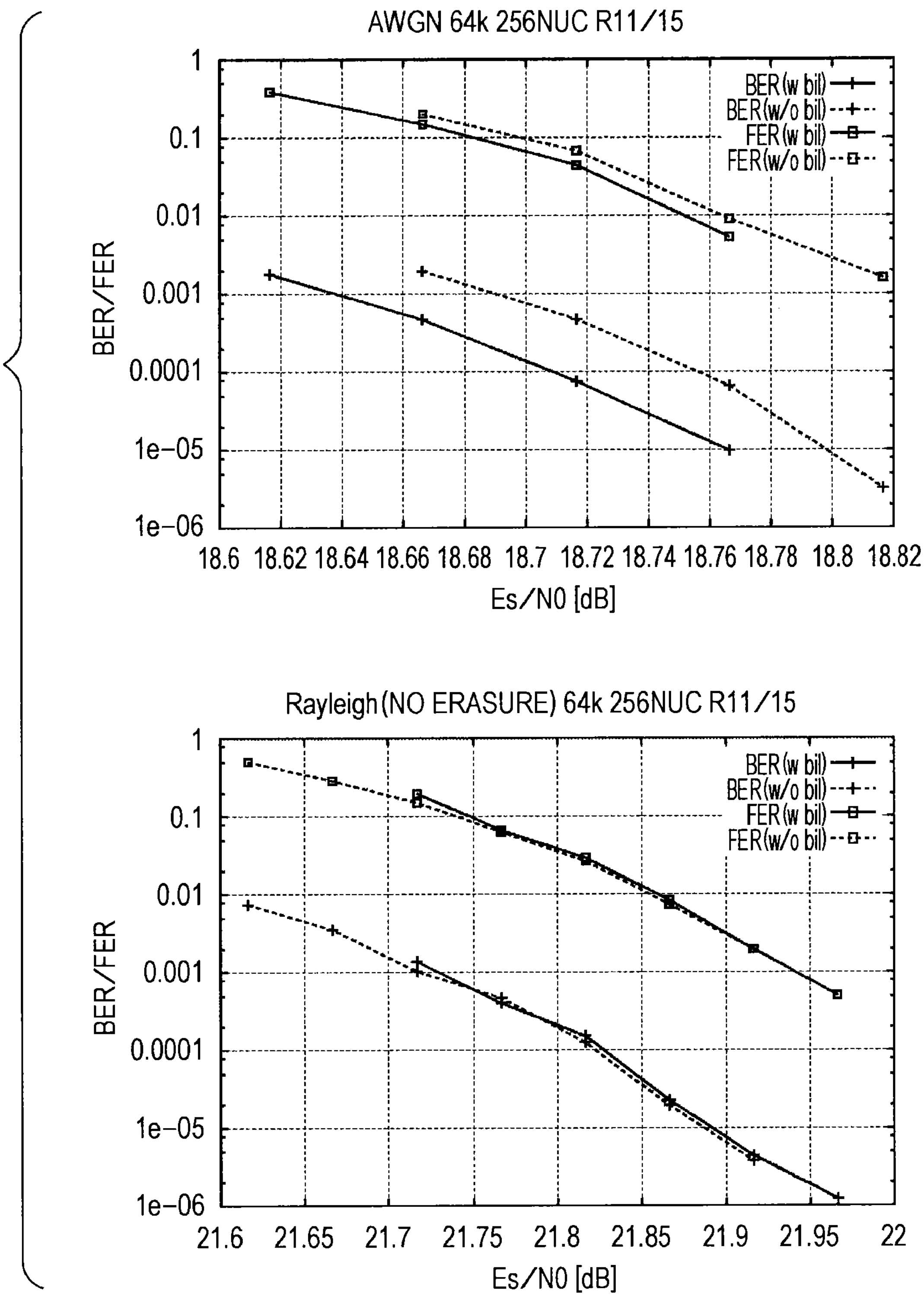
Figure 179:
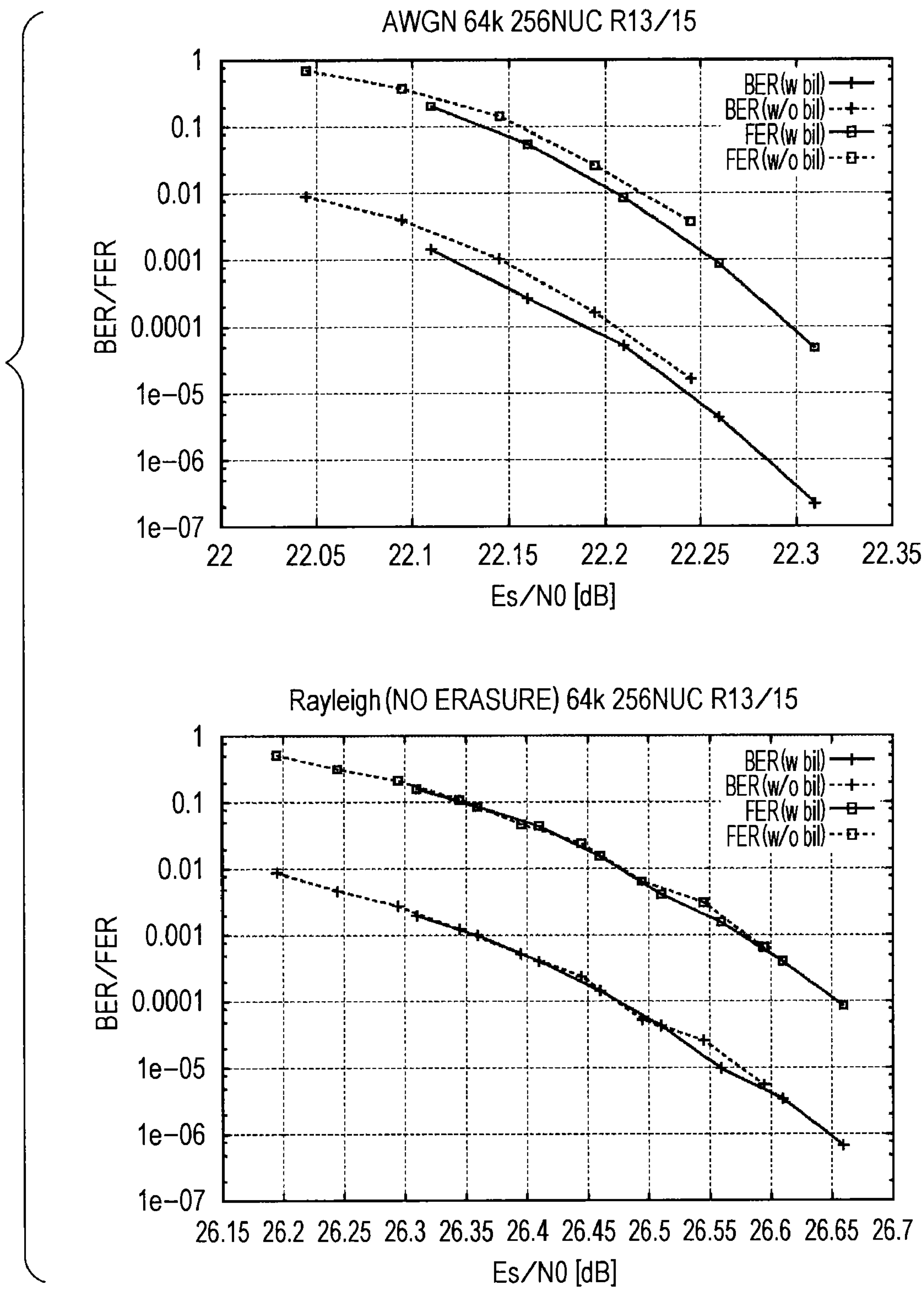
Figure 180:
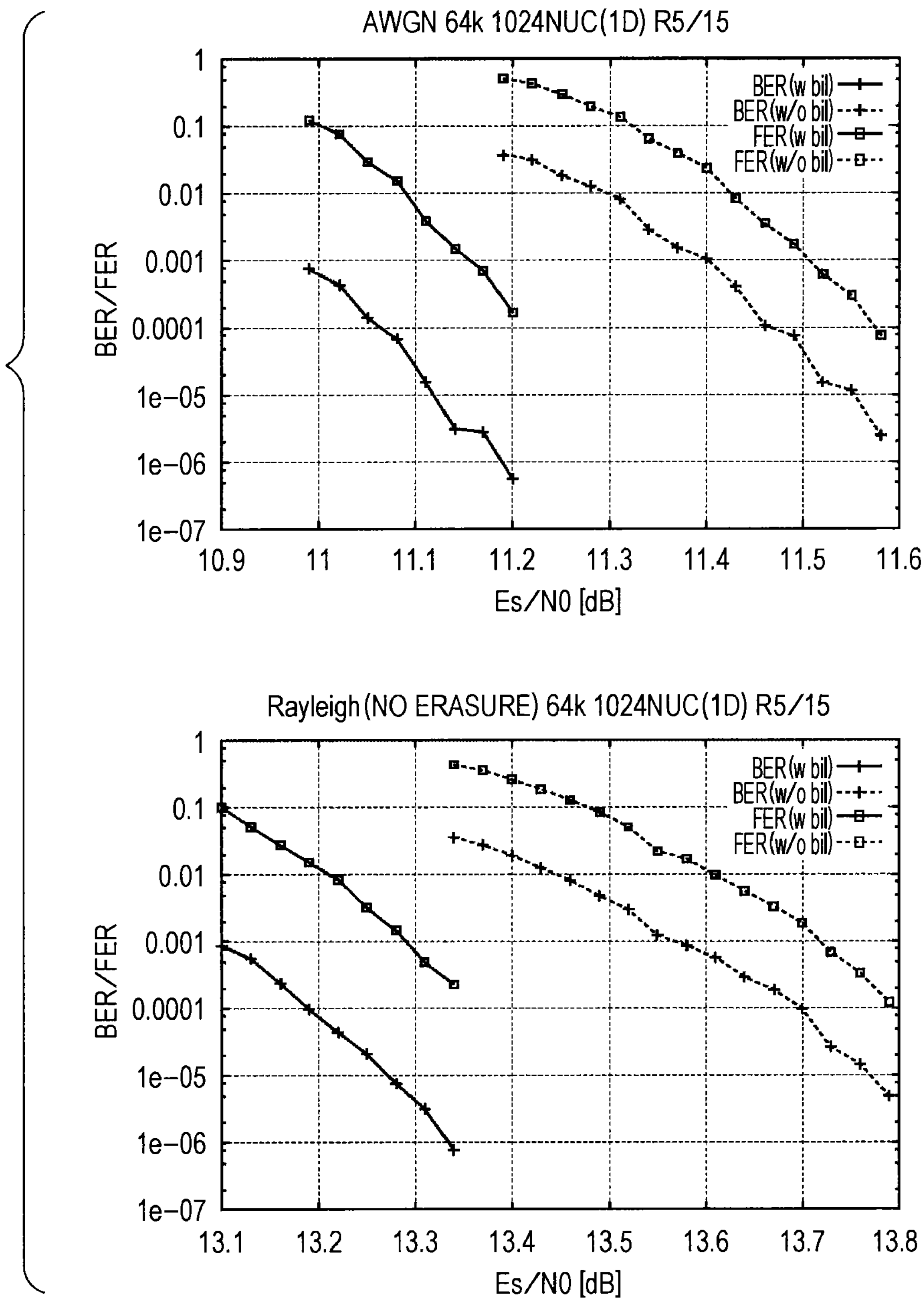
Figure 181:
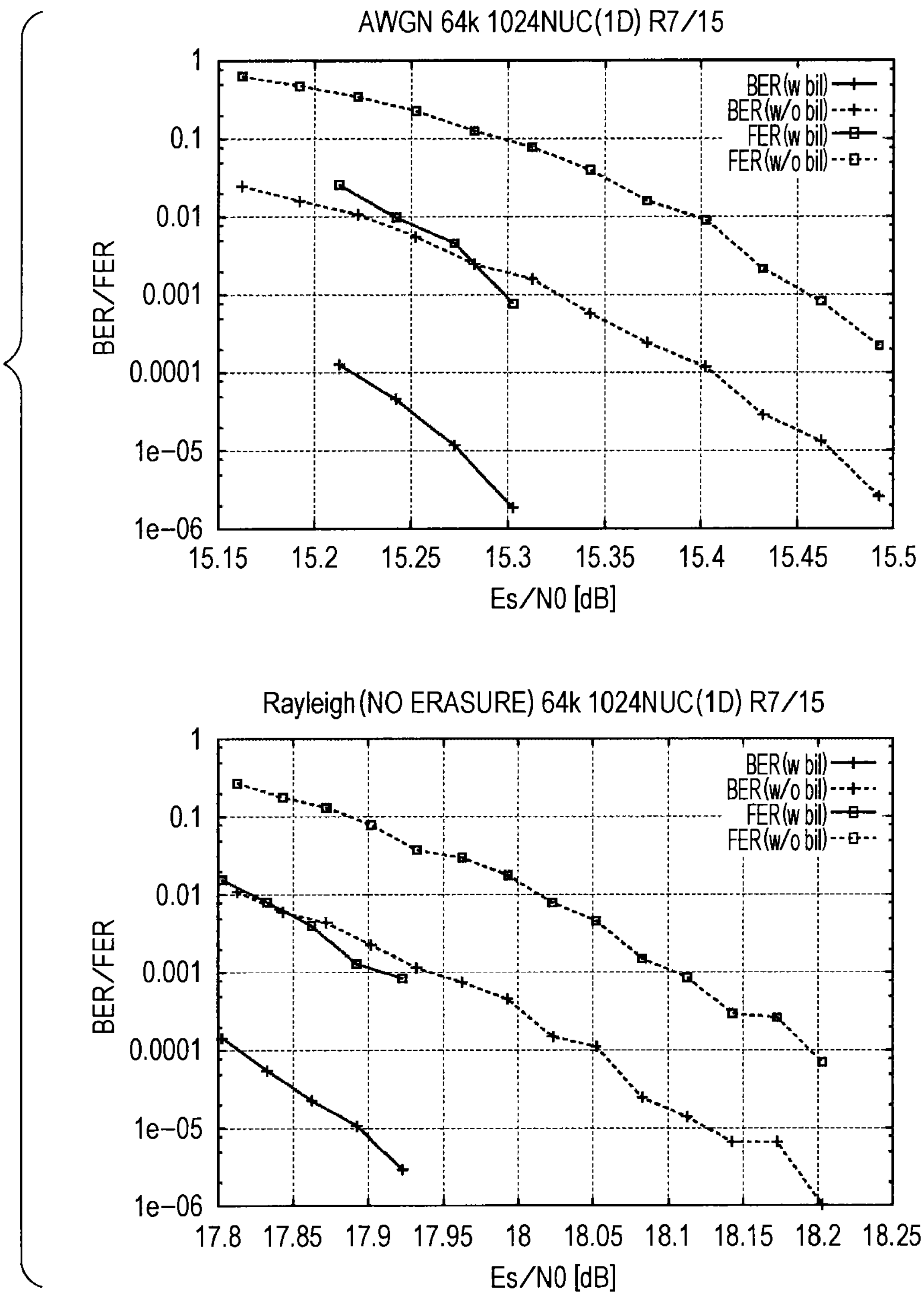
Figure 182:
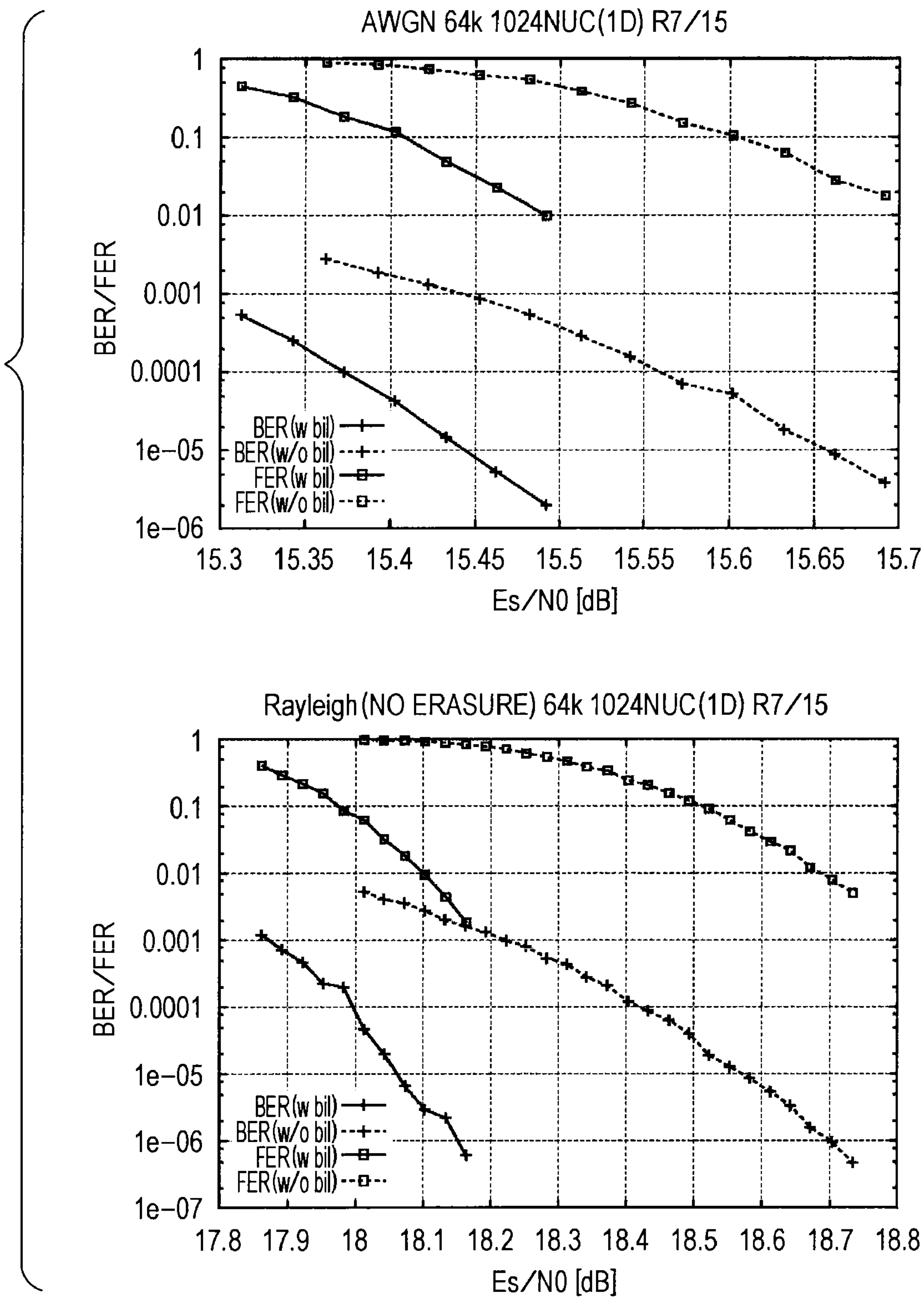
Figure 183:
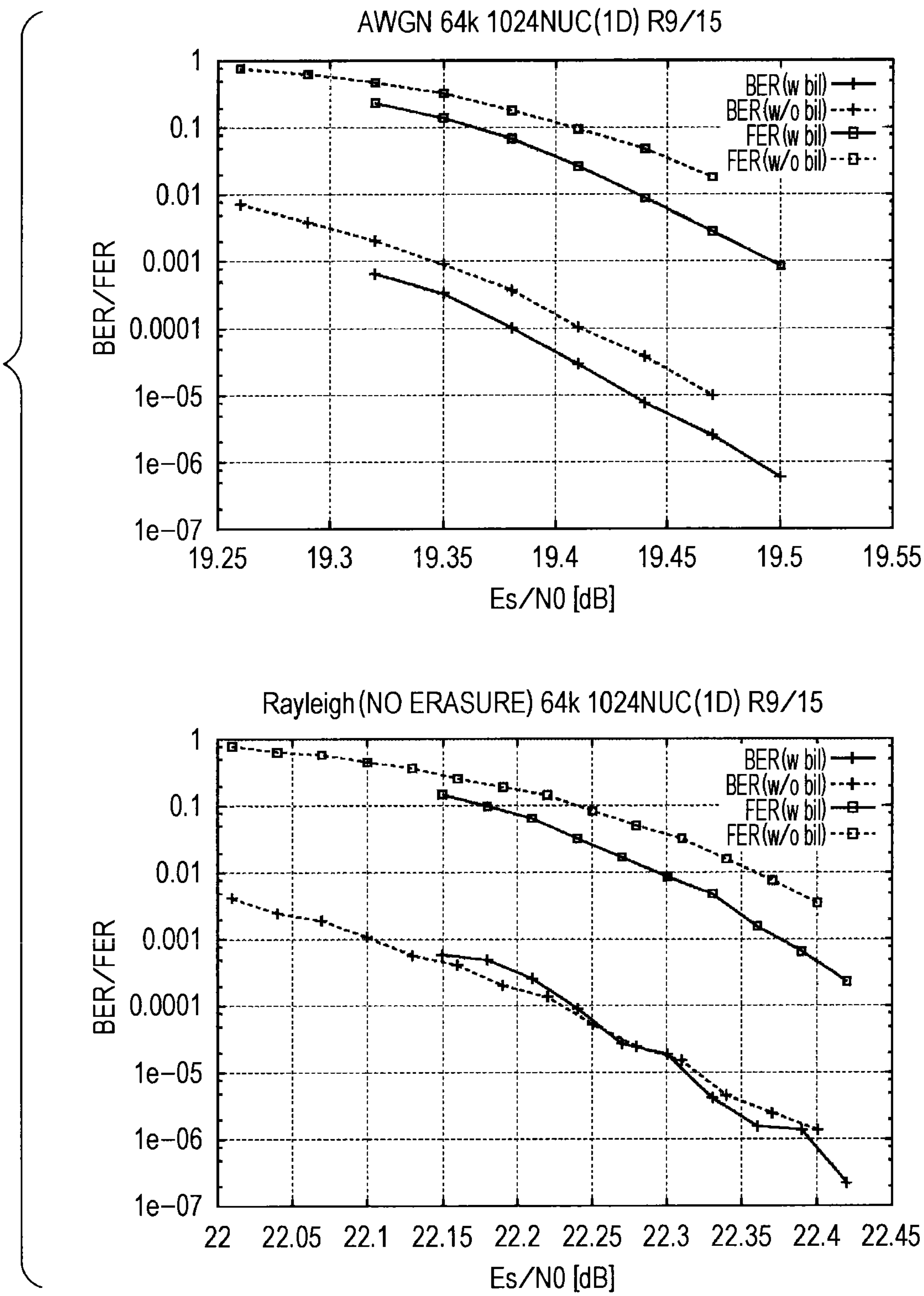
Figure 185:
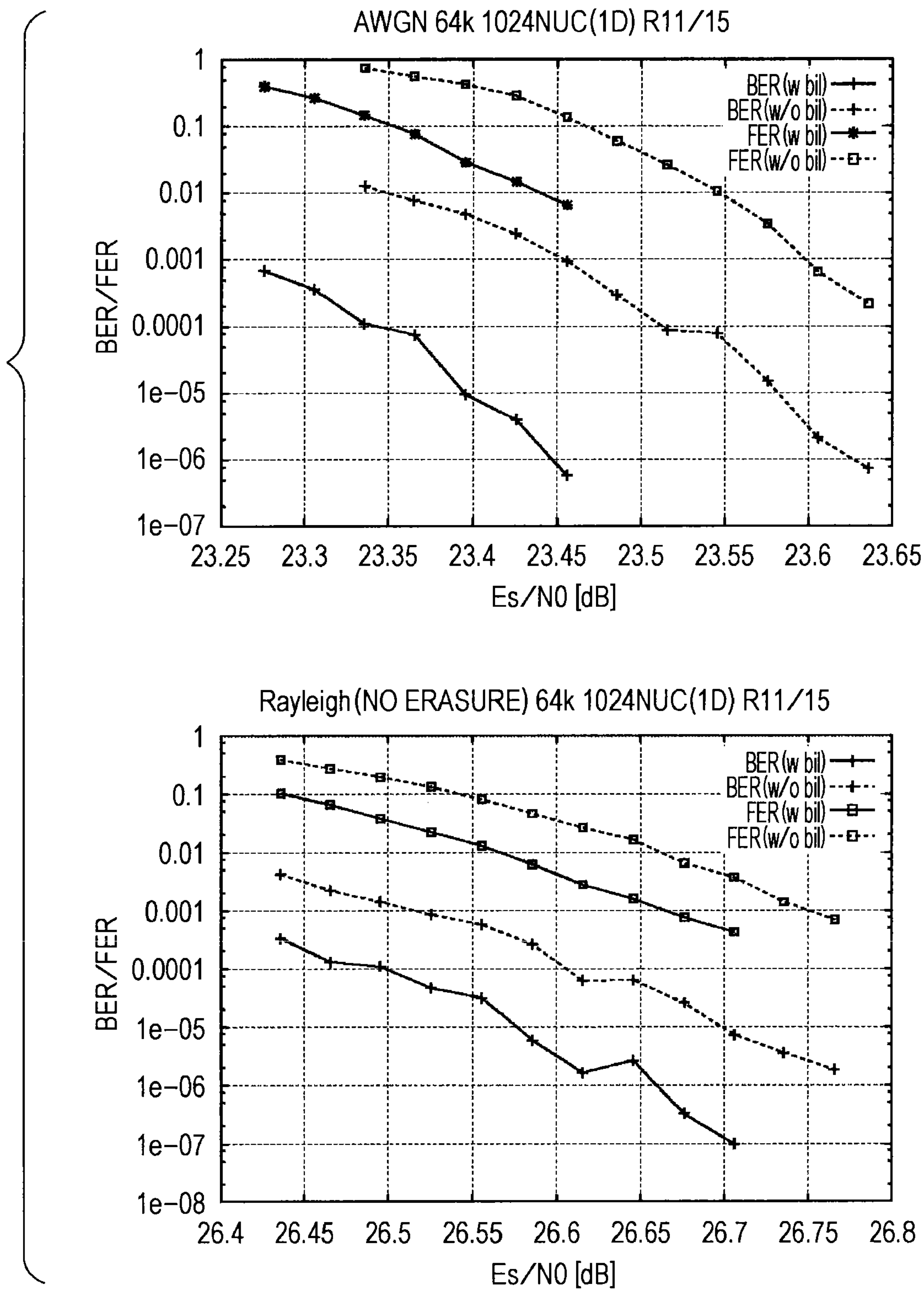
Figure 186:
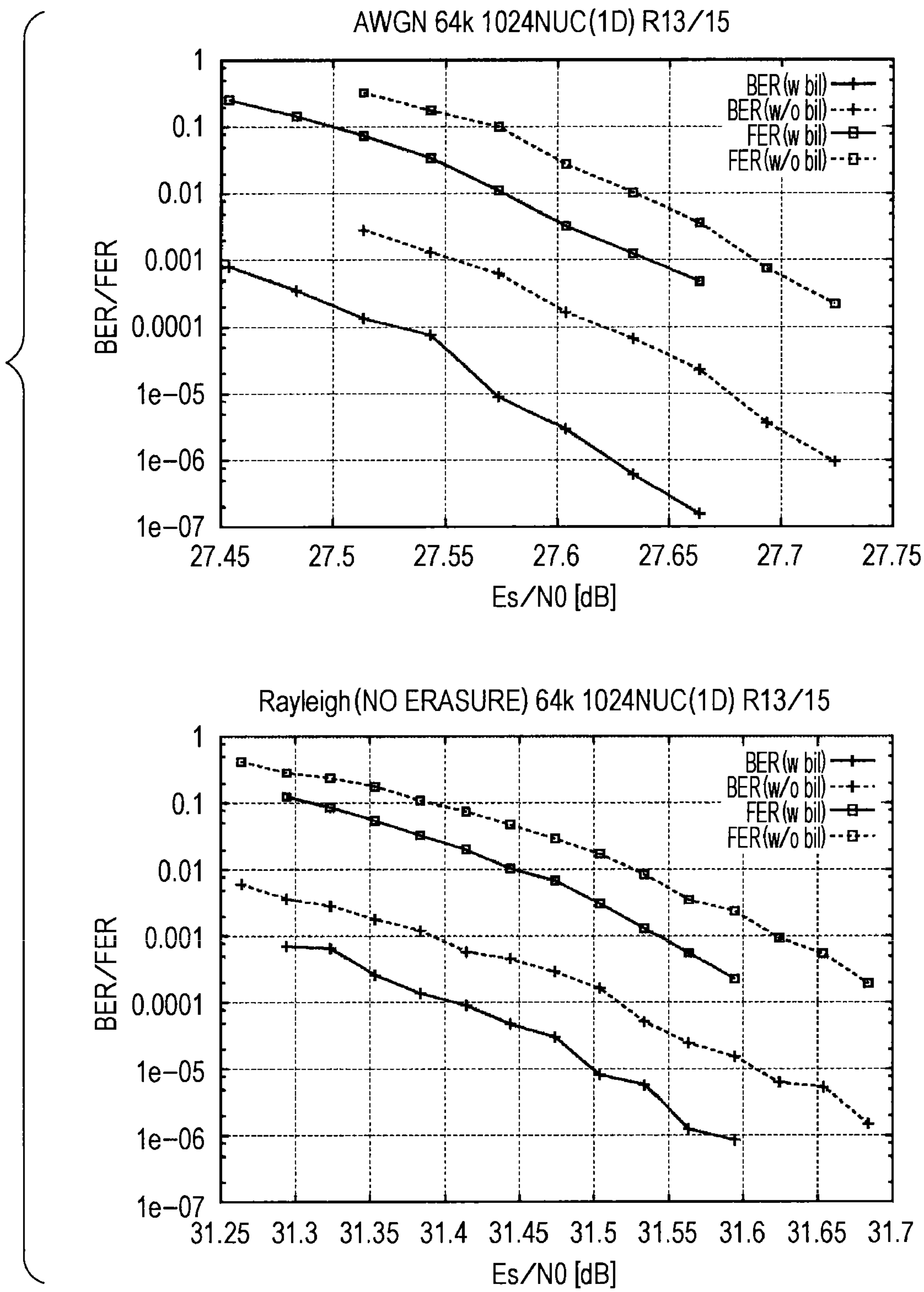
Figure 187:
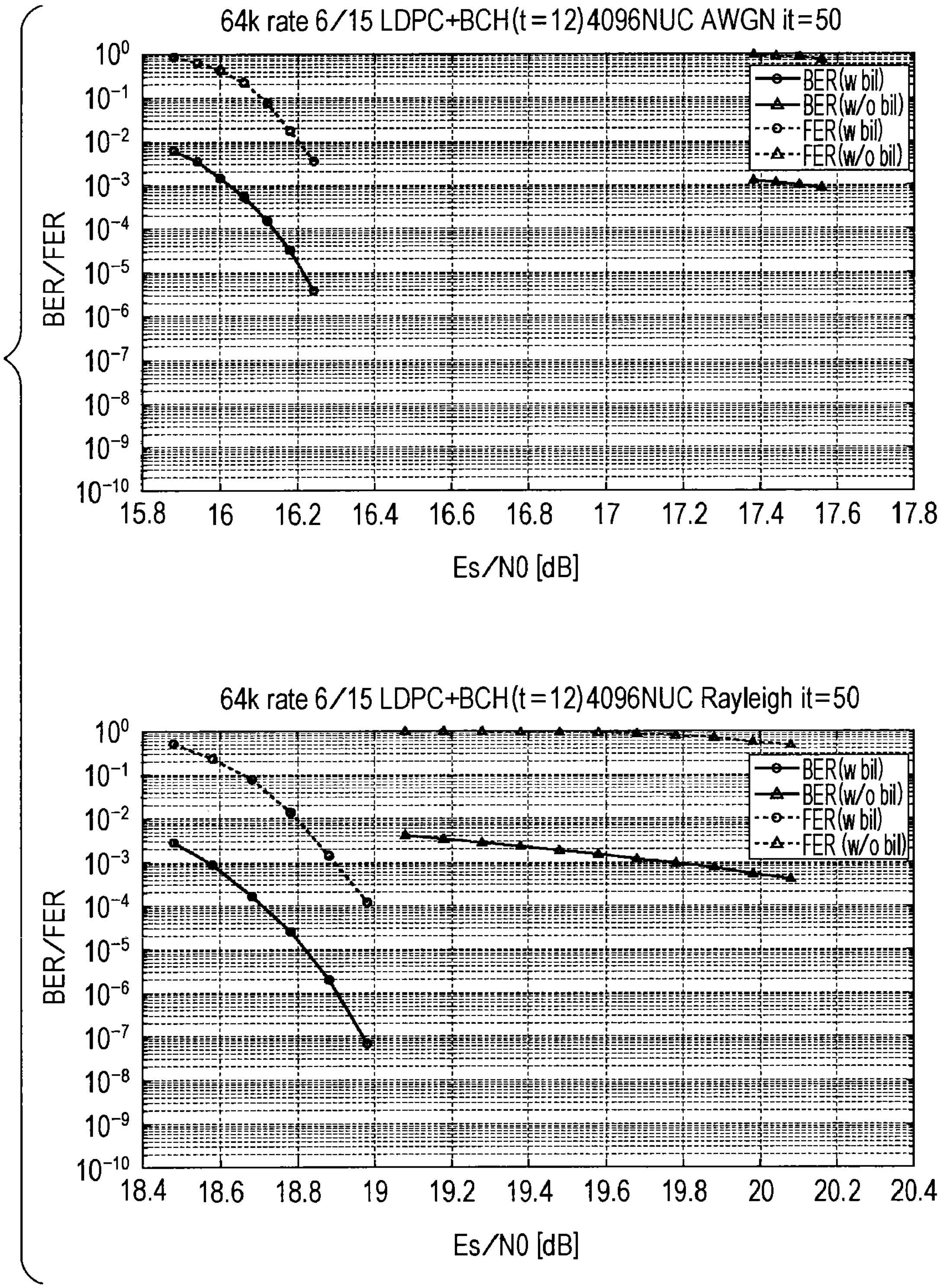
Figure 188:
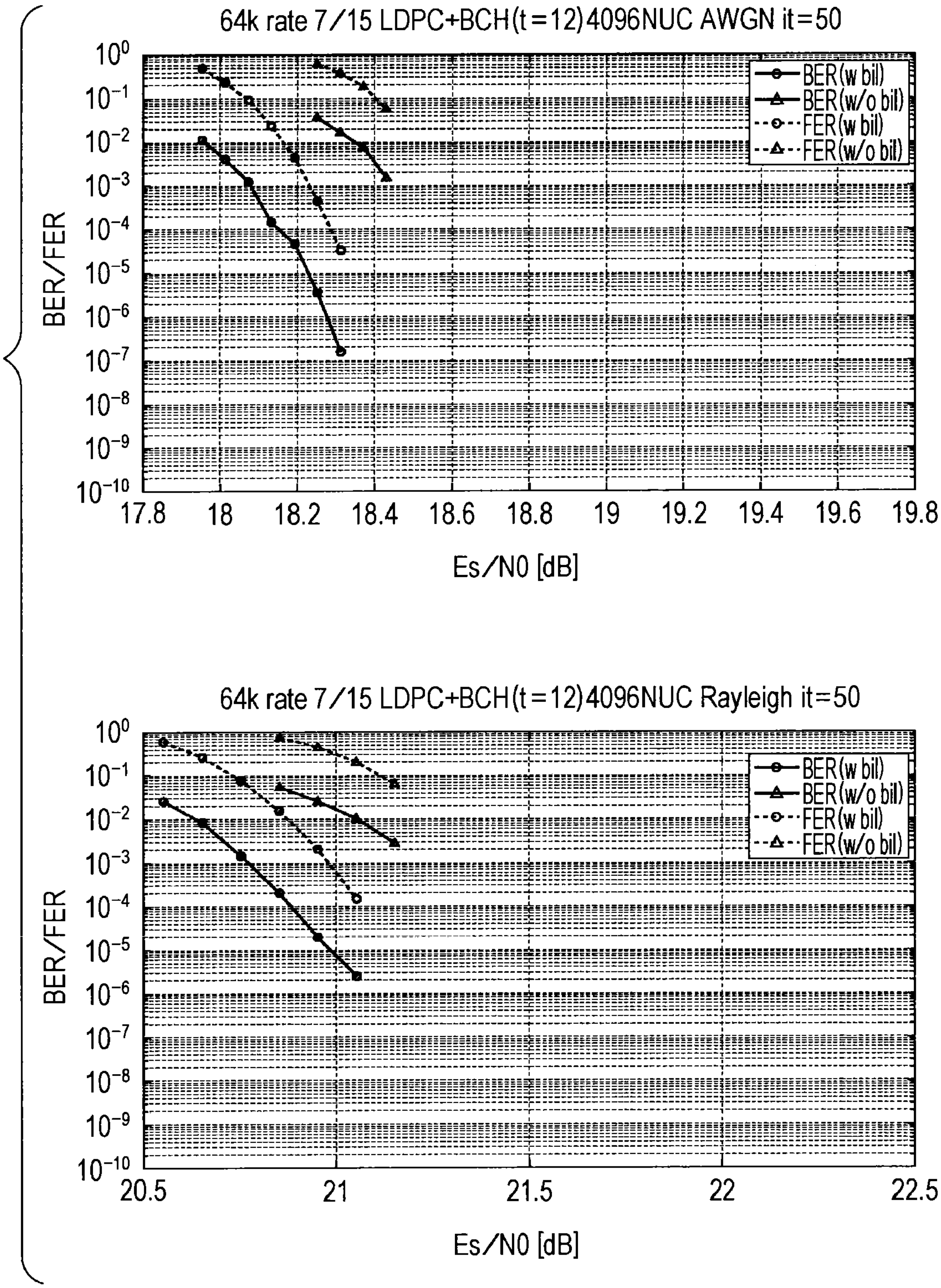
Figure 189:
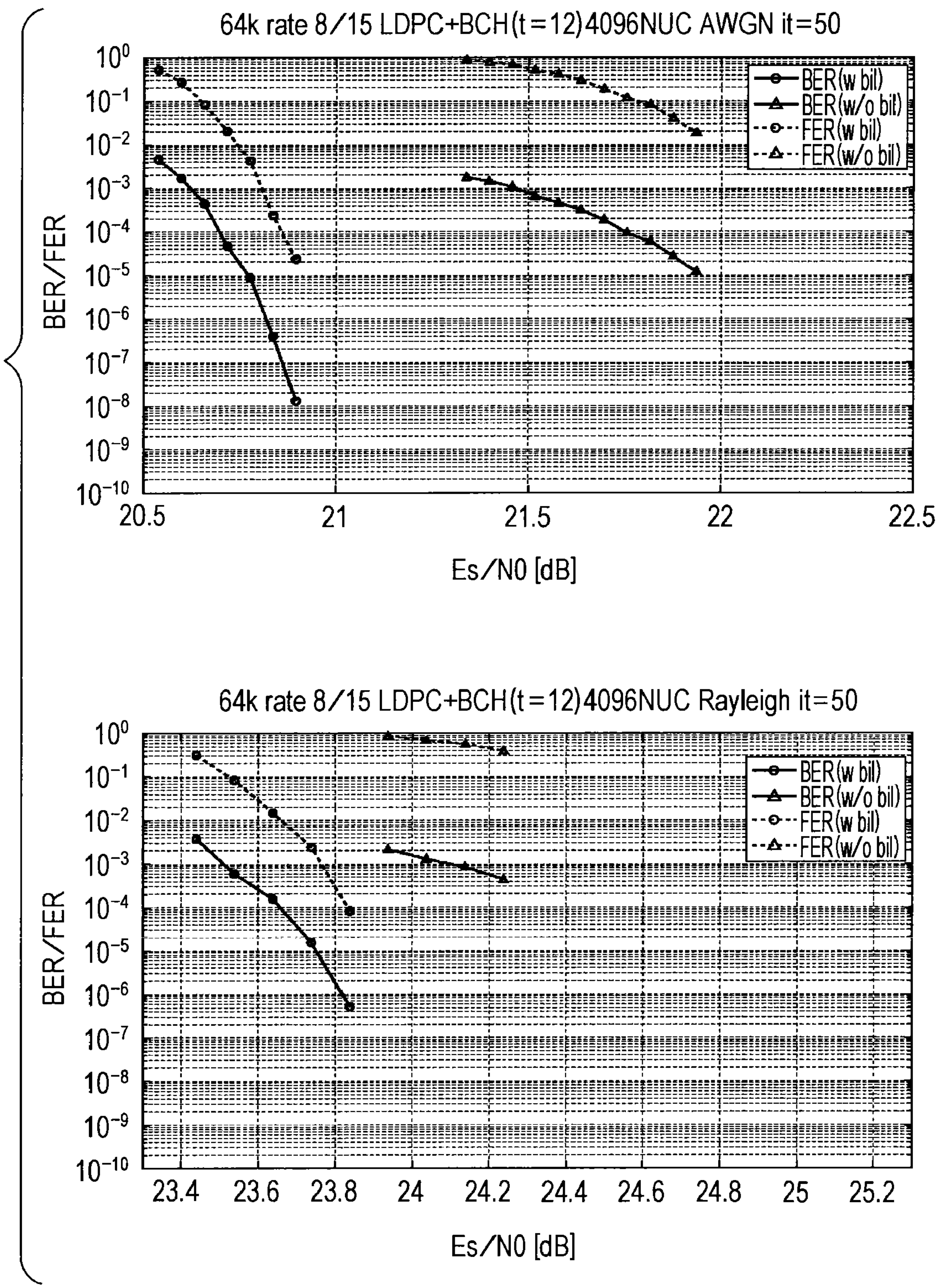
Figure 190:
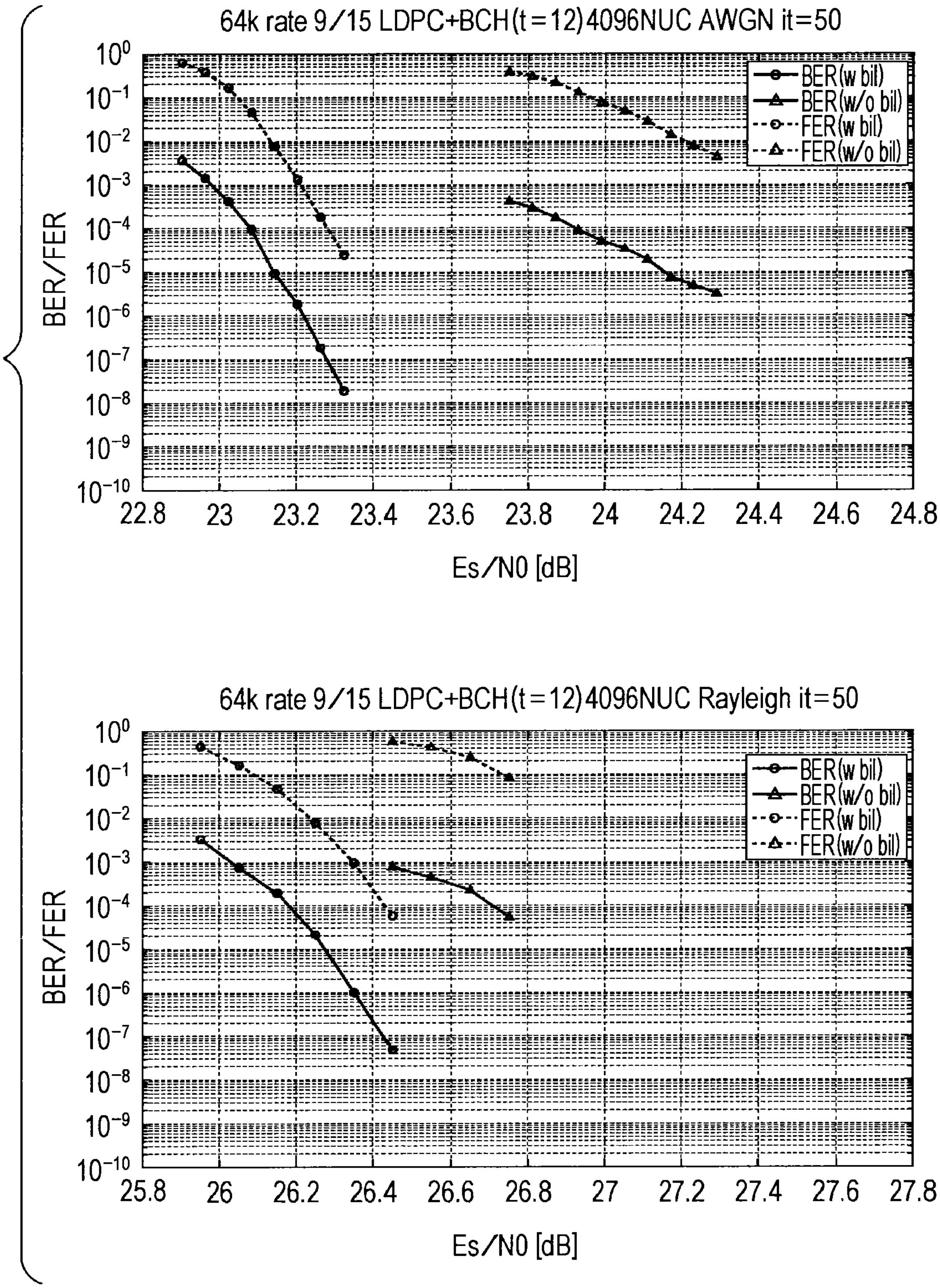
Figure 191:
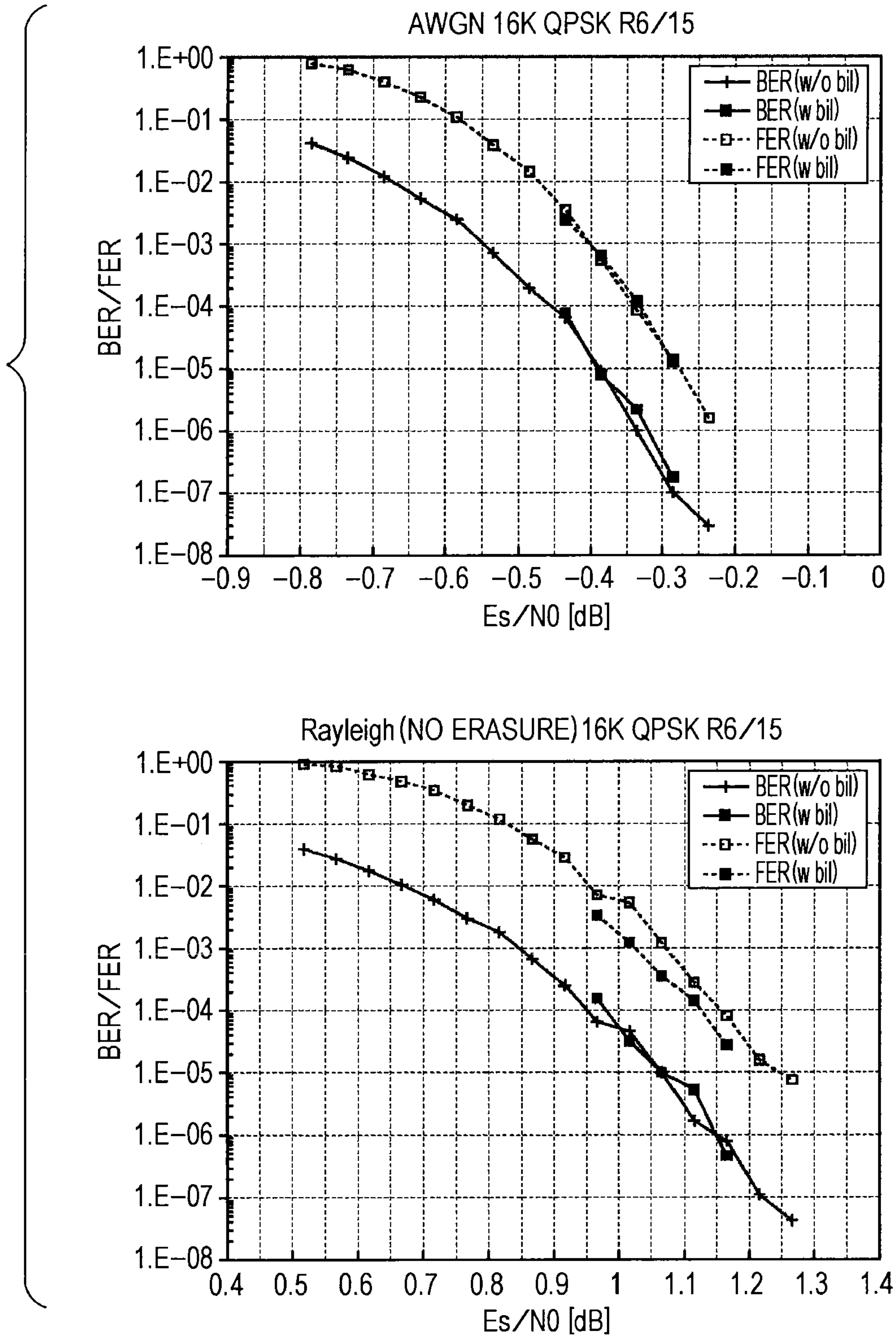
Figure 192:
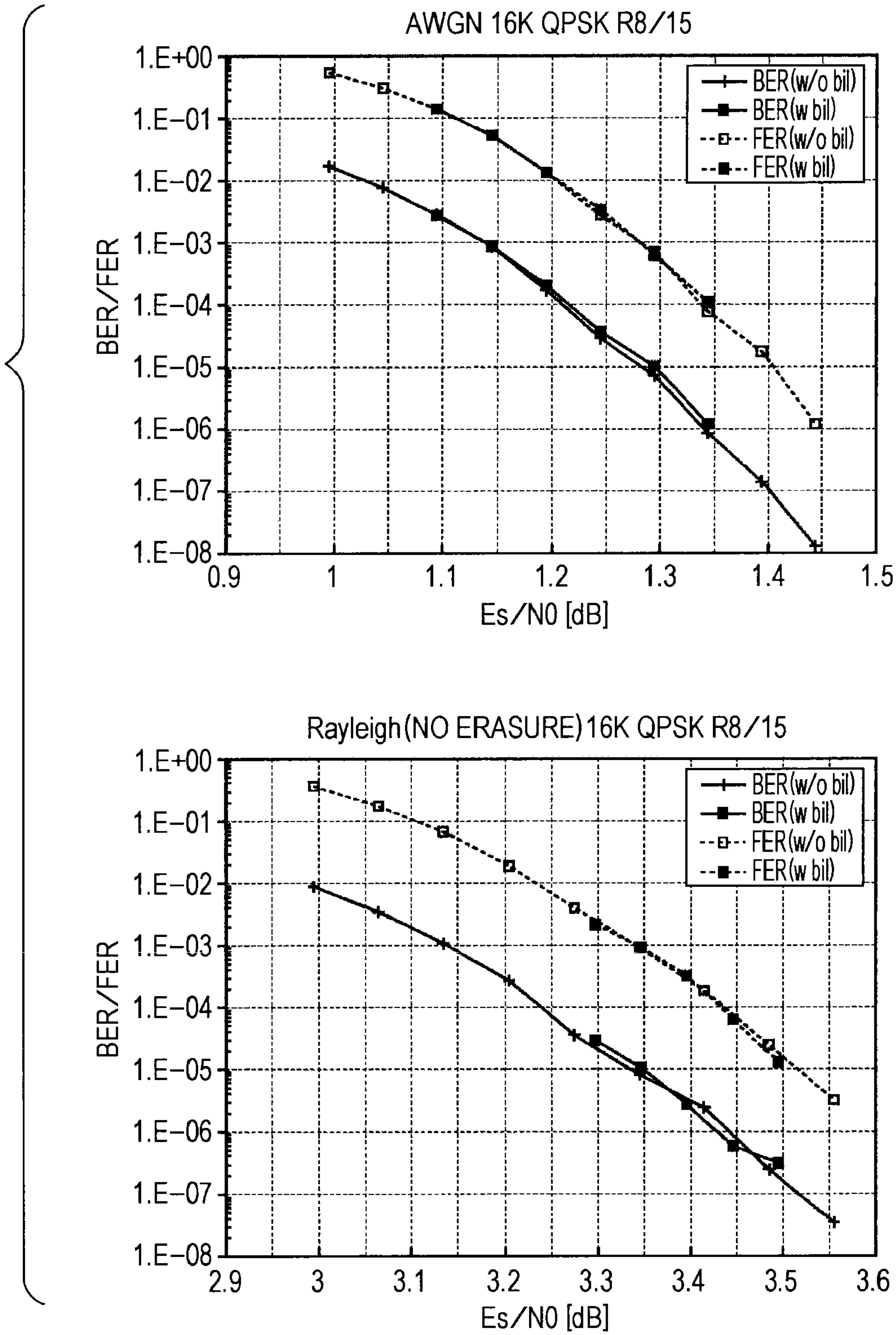
Figure 193:
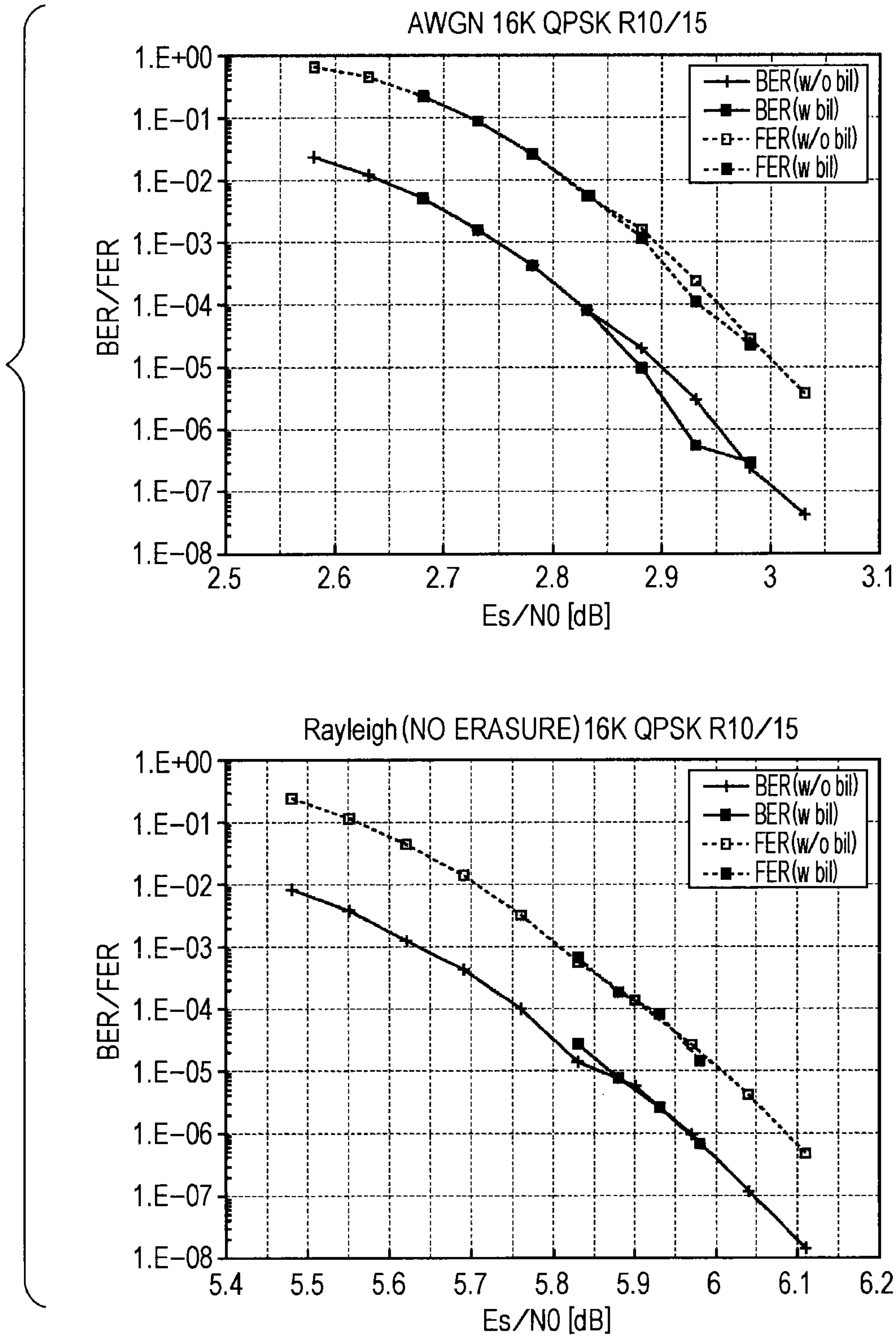
Figure 194:
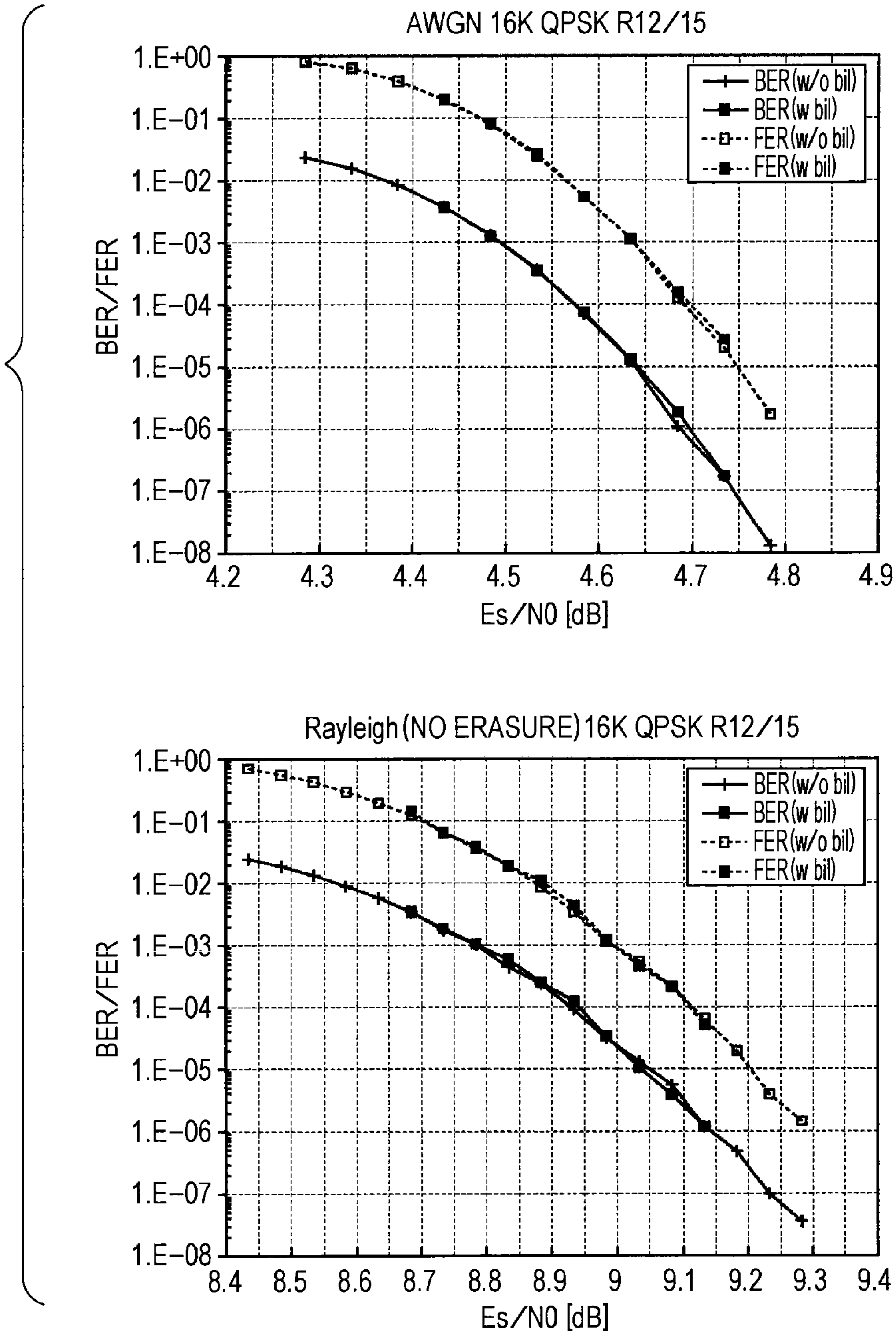
Figure 195:
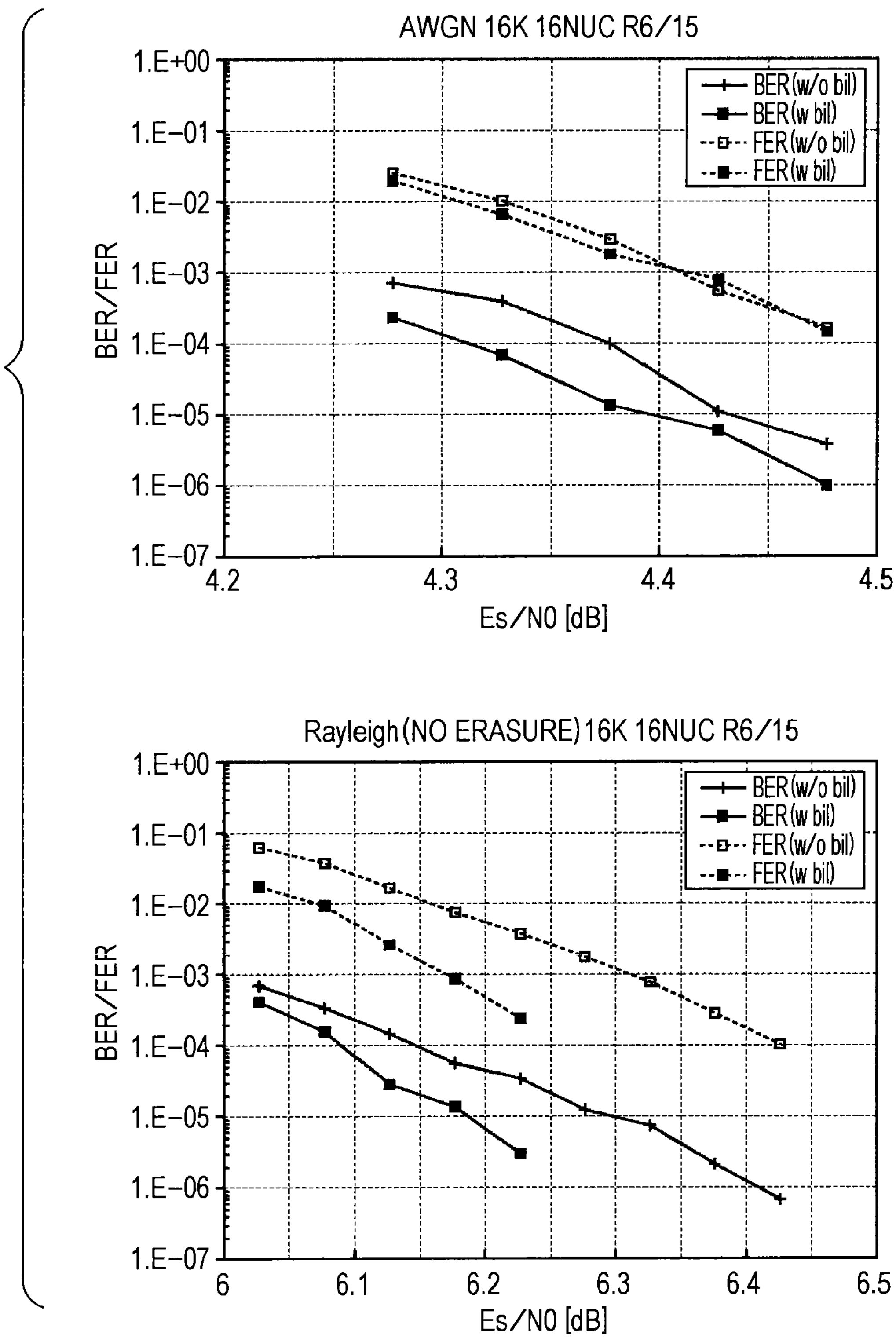
Figure 196:
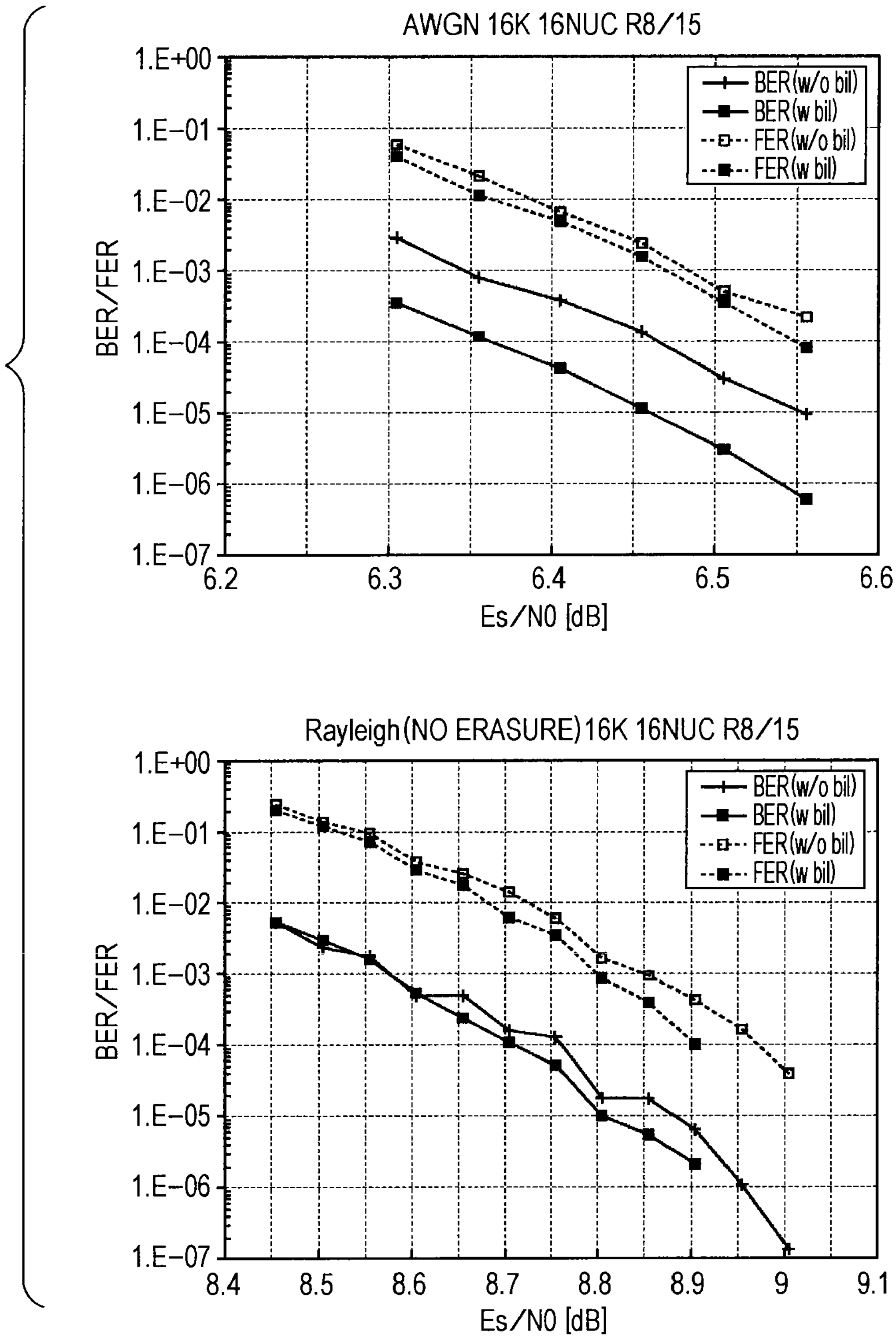
Figure 197:
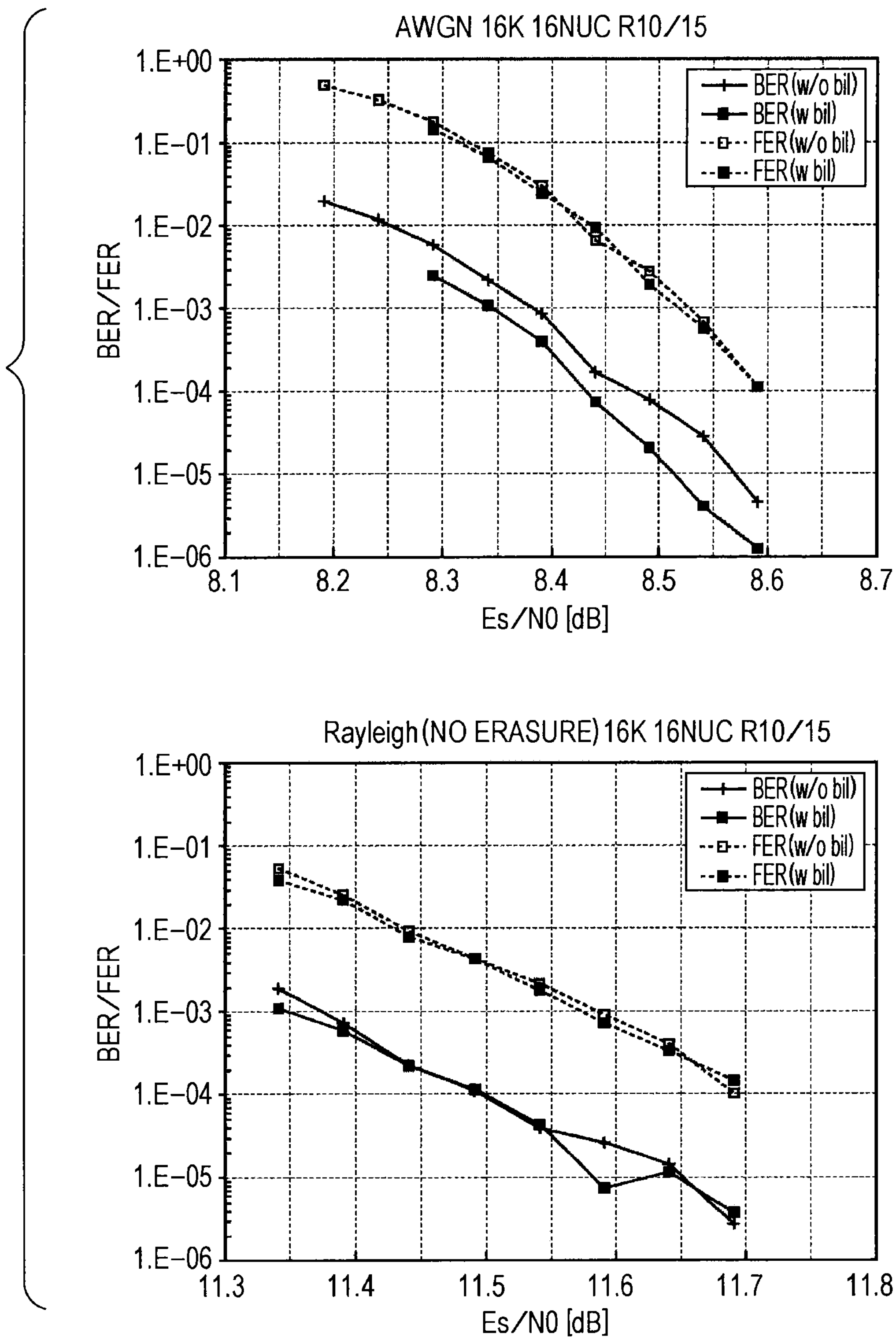
Figure 198:
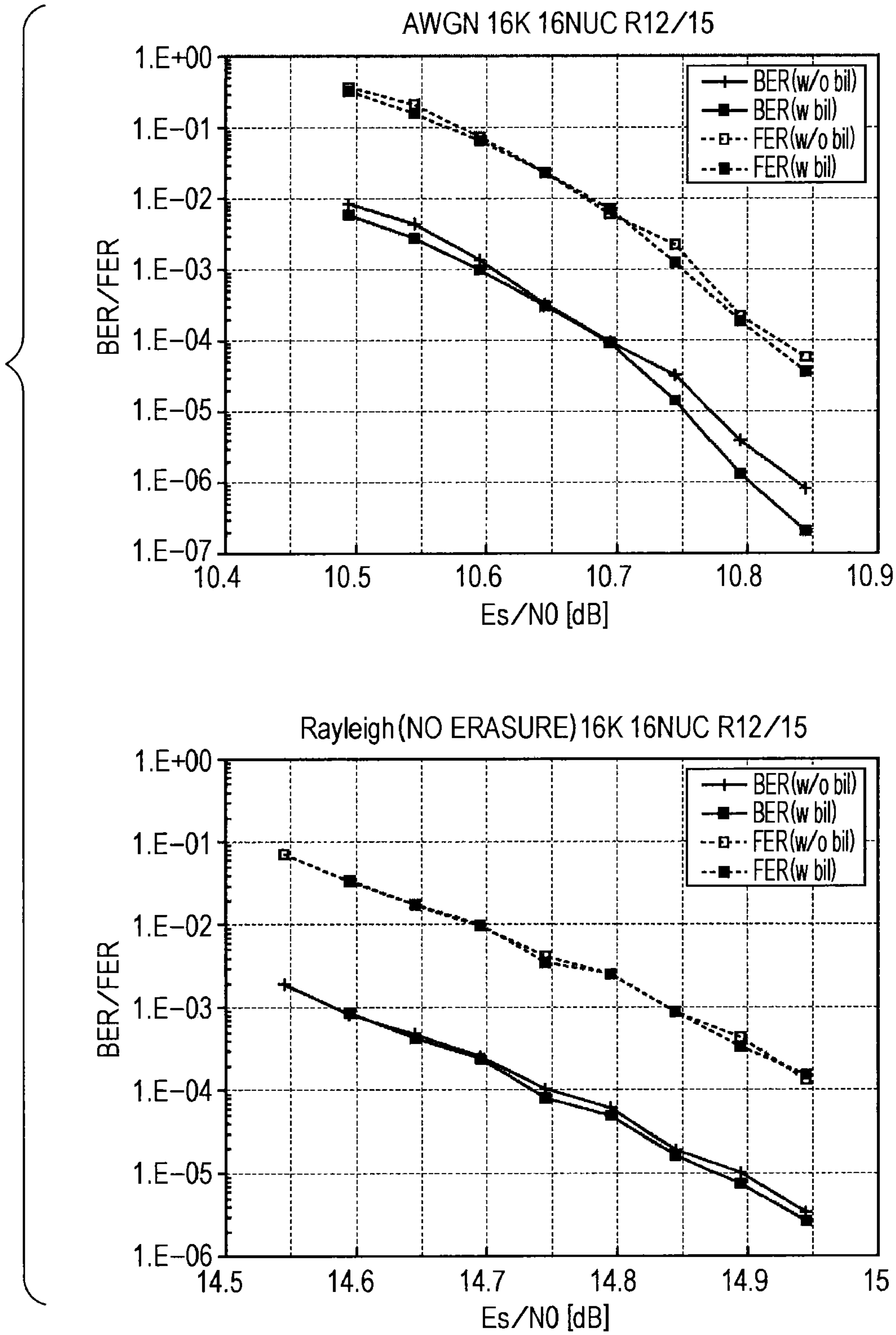
Figure 199:
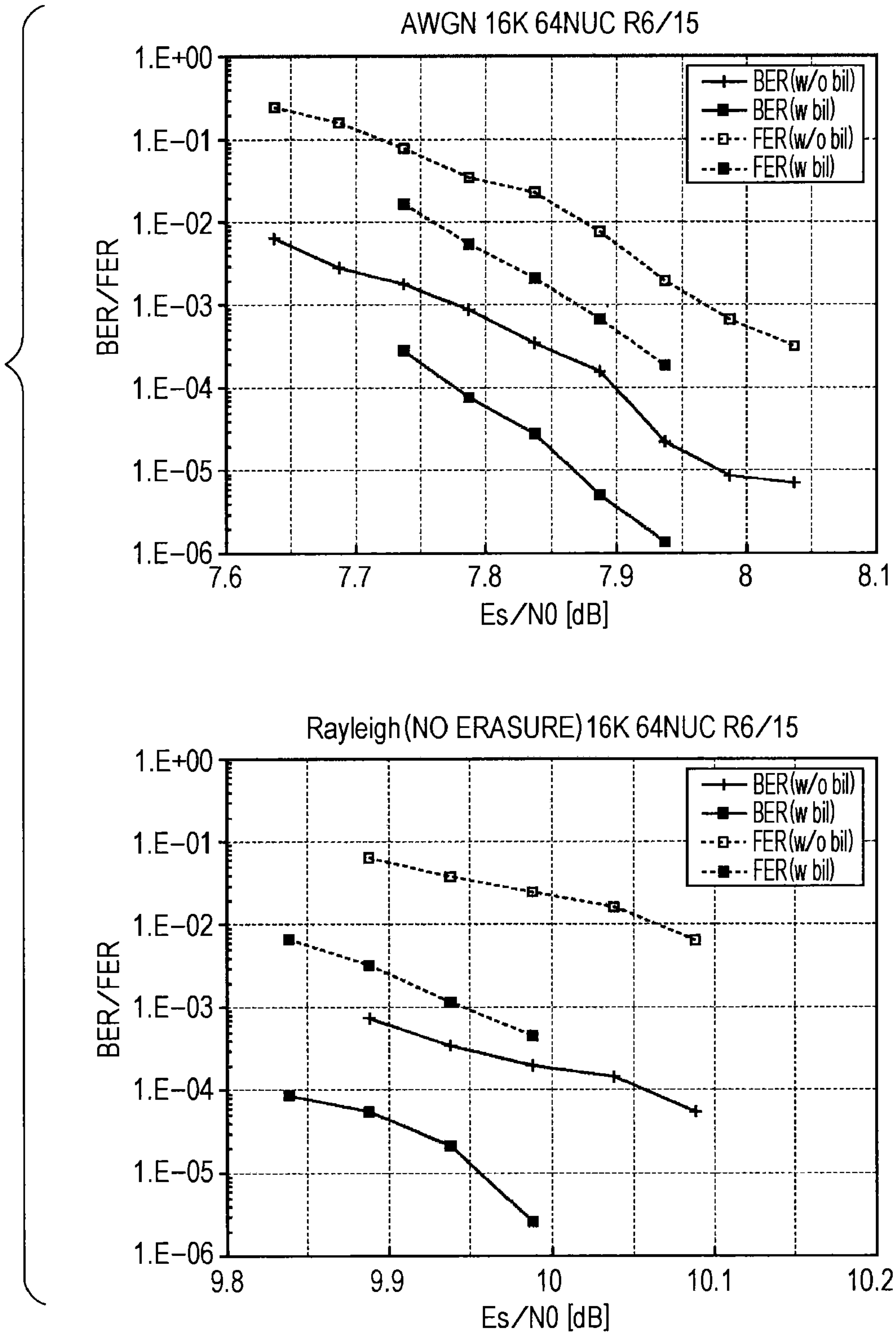
Figure 200:
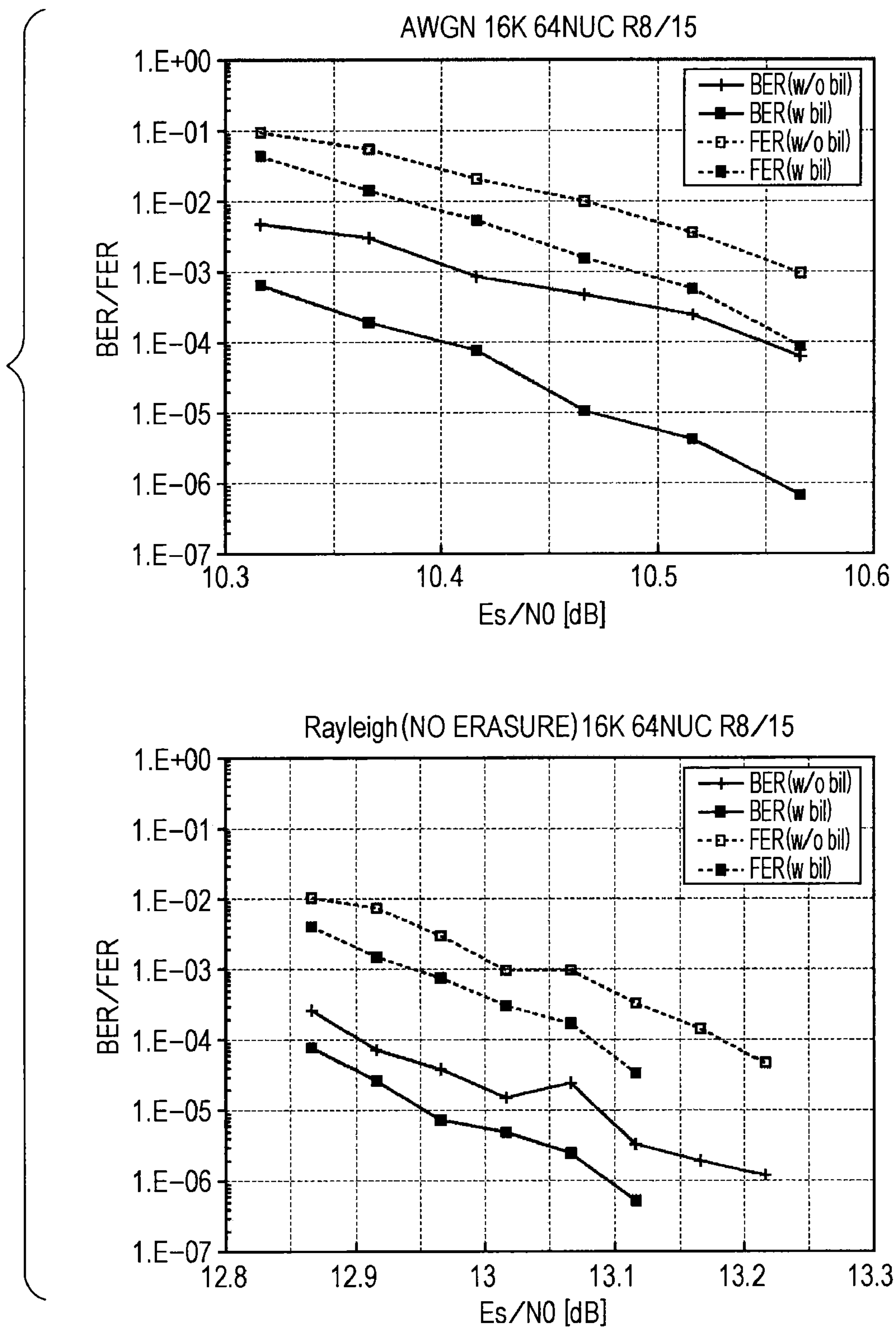
Figure 201:
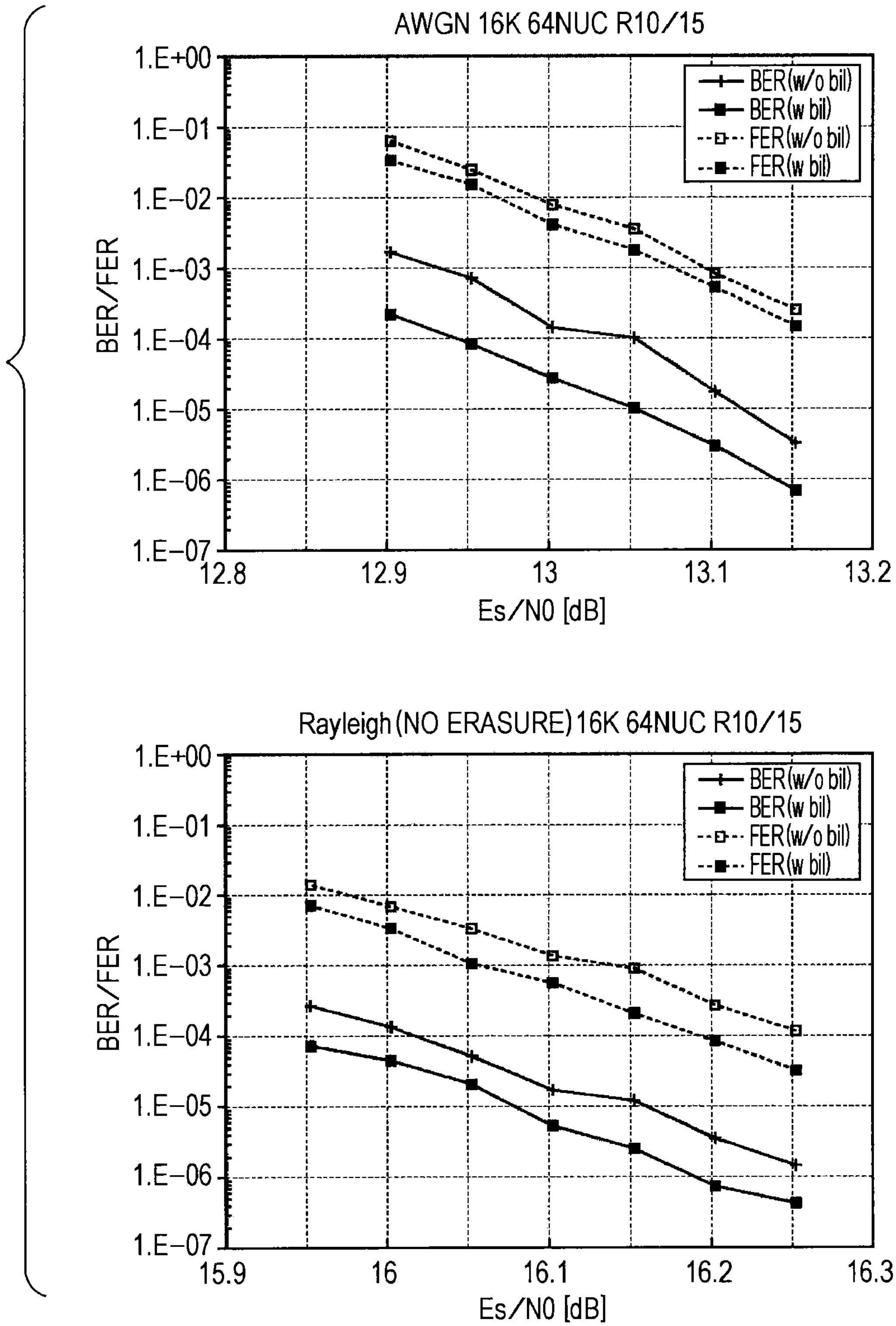
Figure 202:
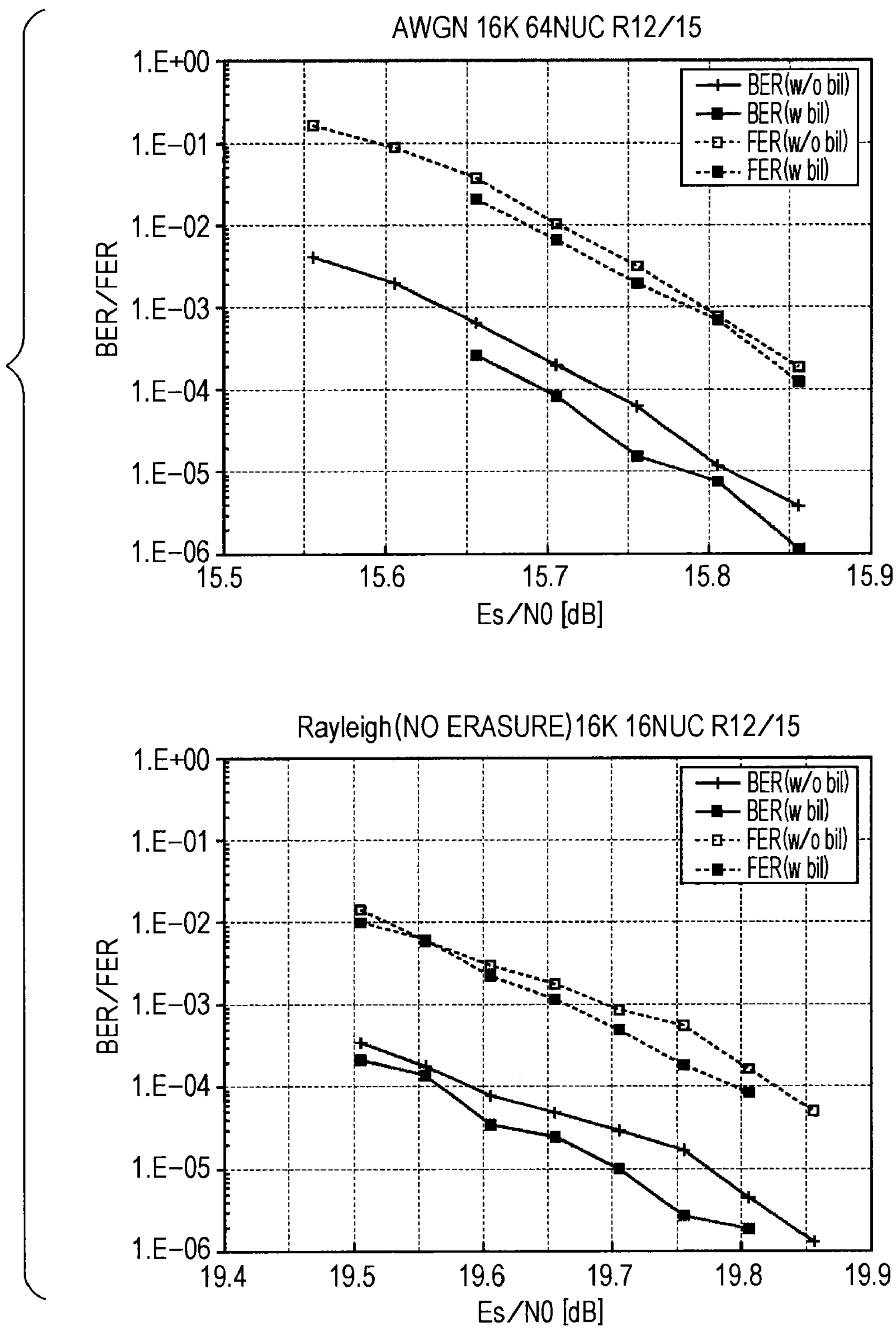
Figure 203:
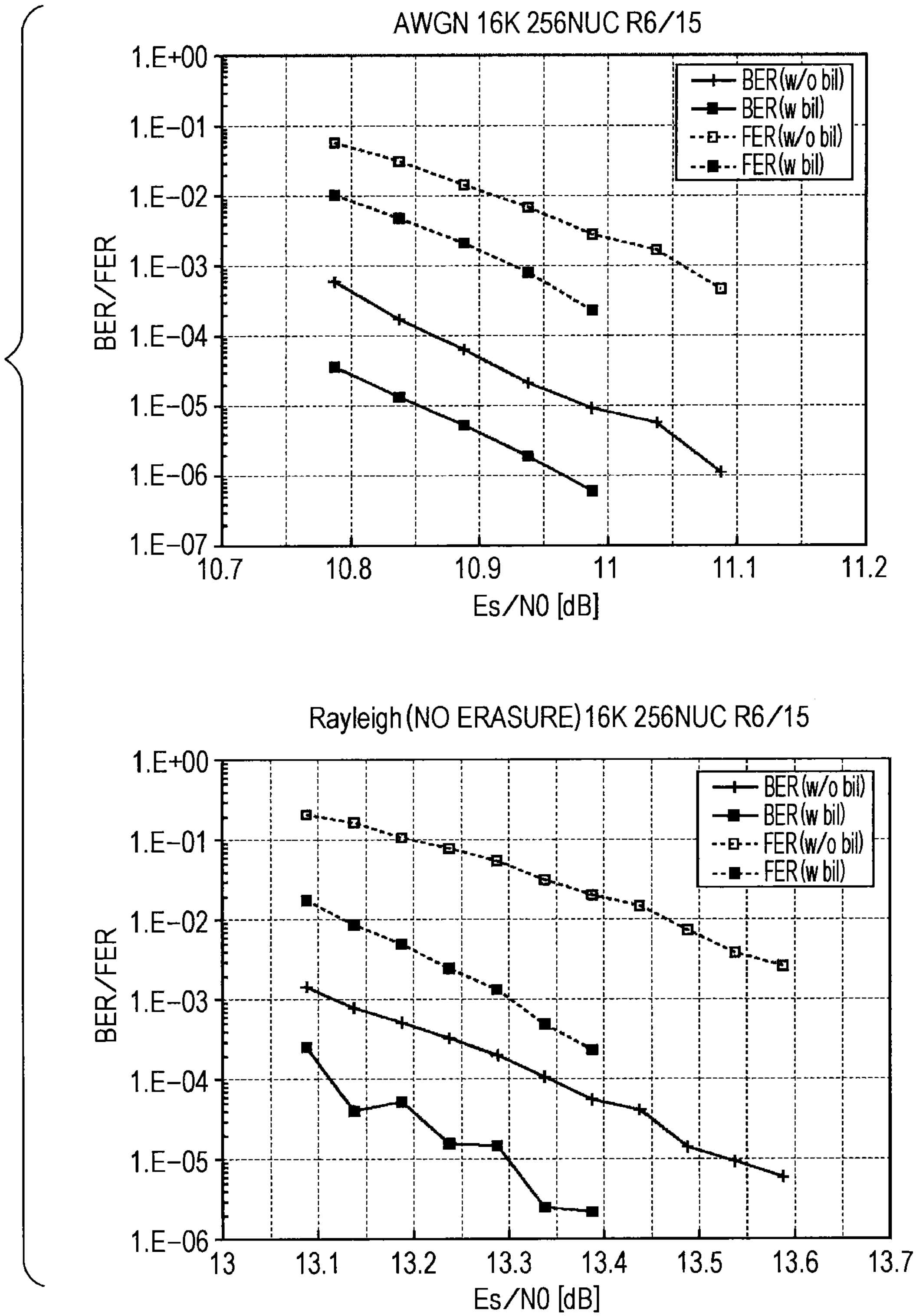
Figure 204:
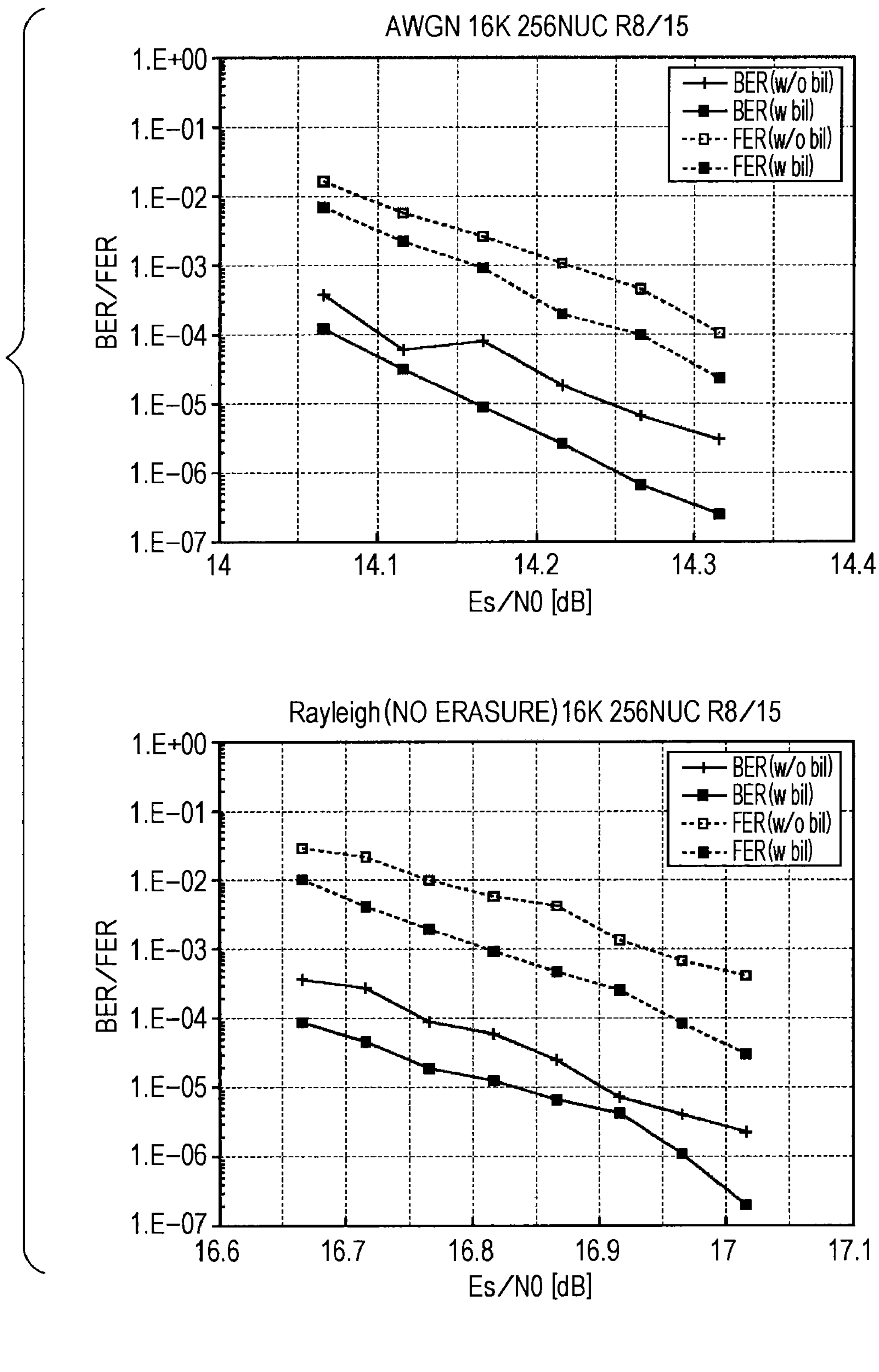
Figure 205:
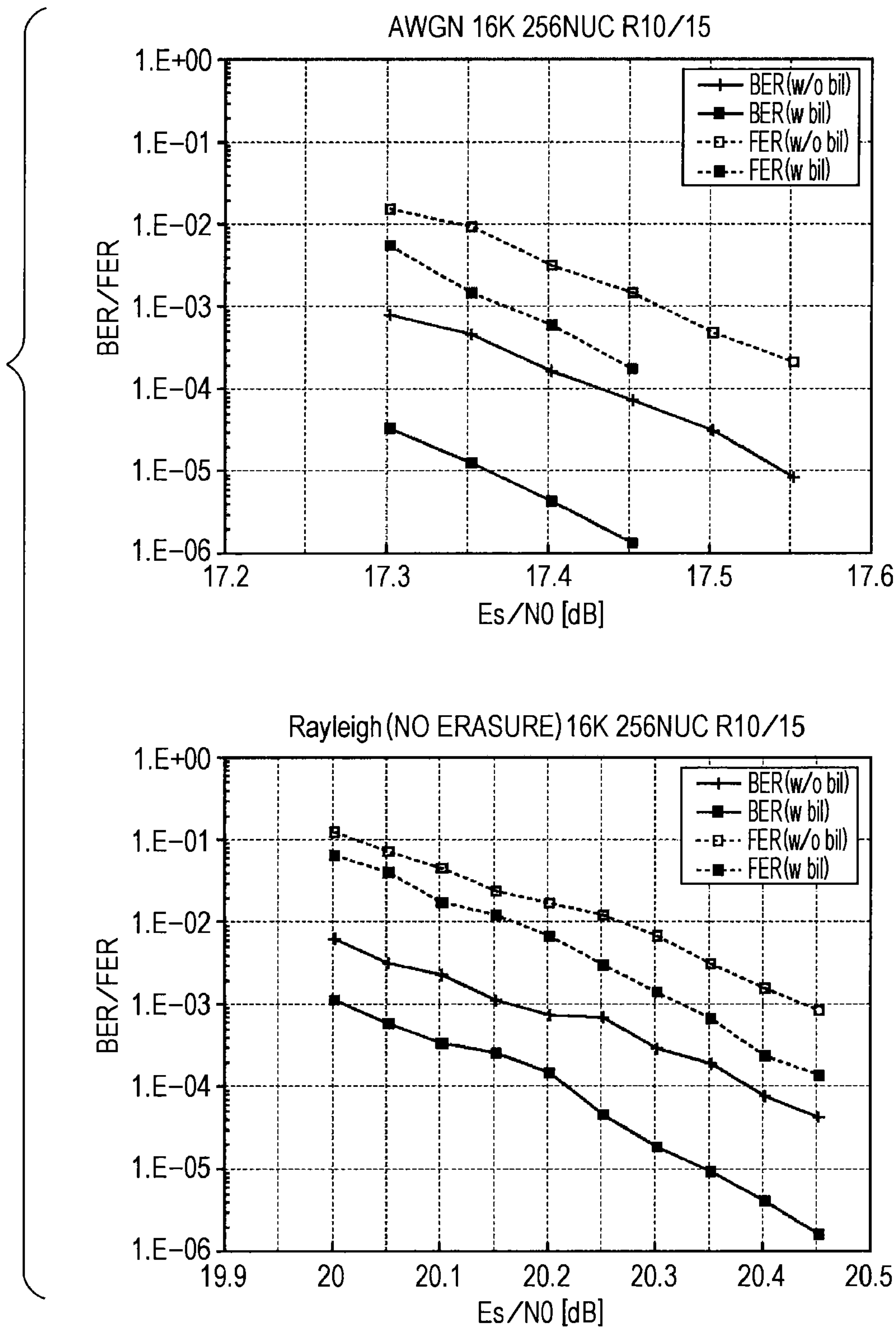
Figure 206:
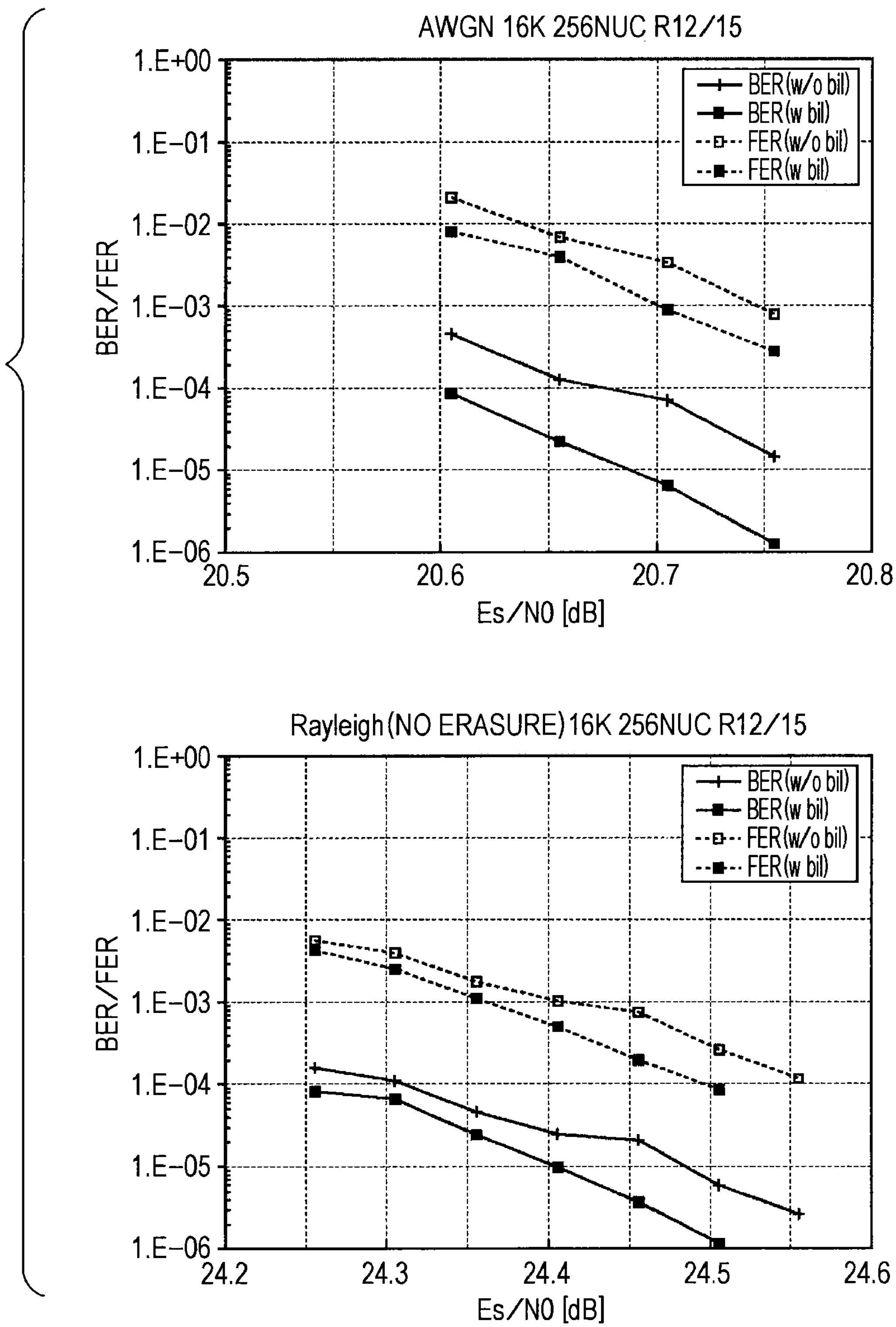
Figure 207:
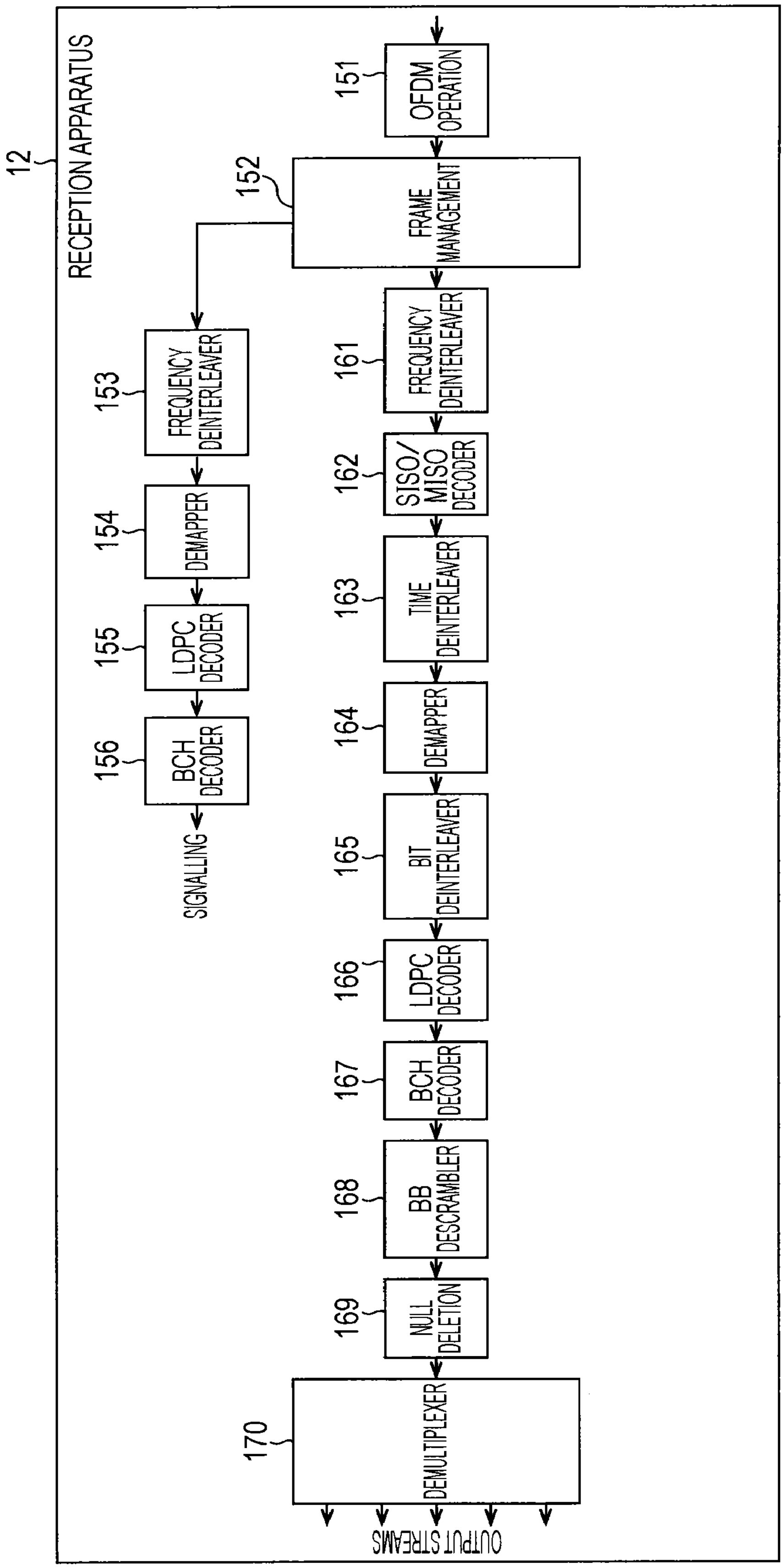
Figure 208:
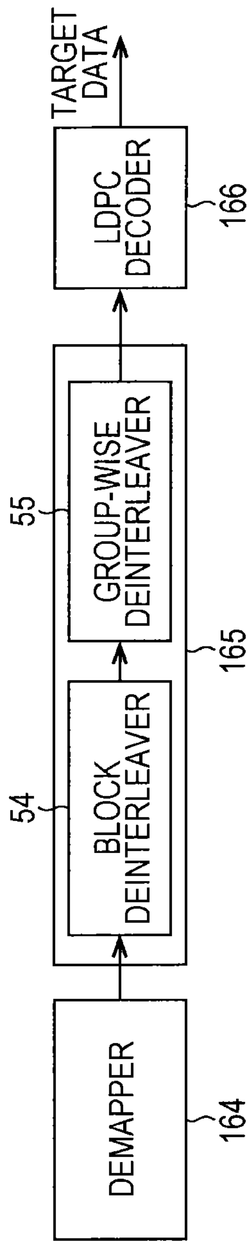
Figure 209:
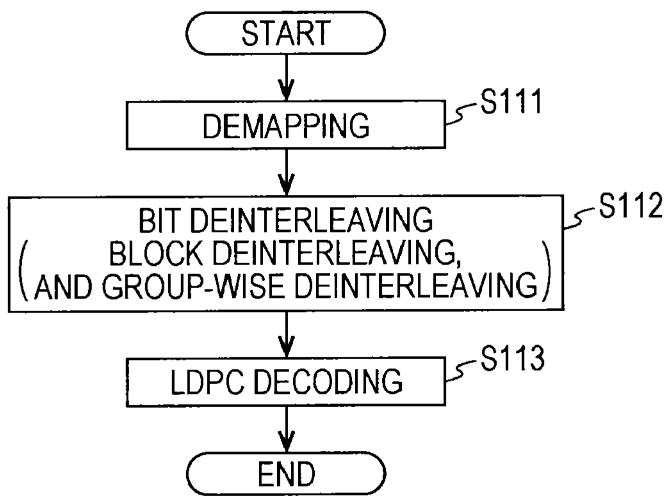
Figure 210:
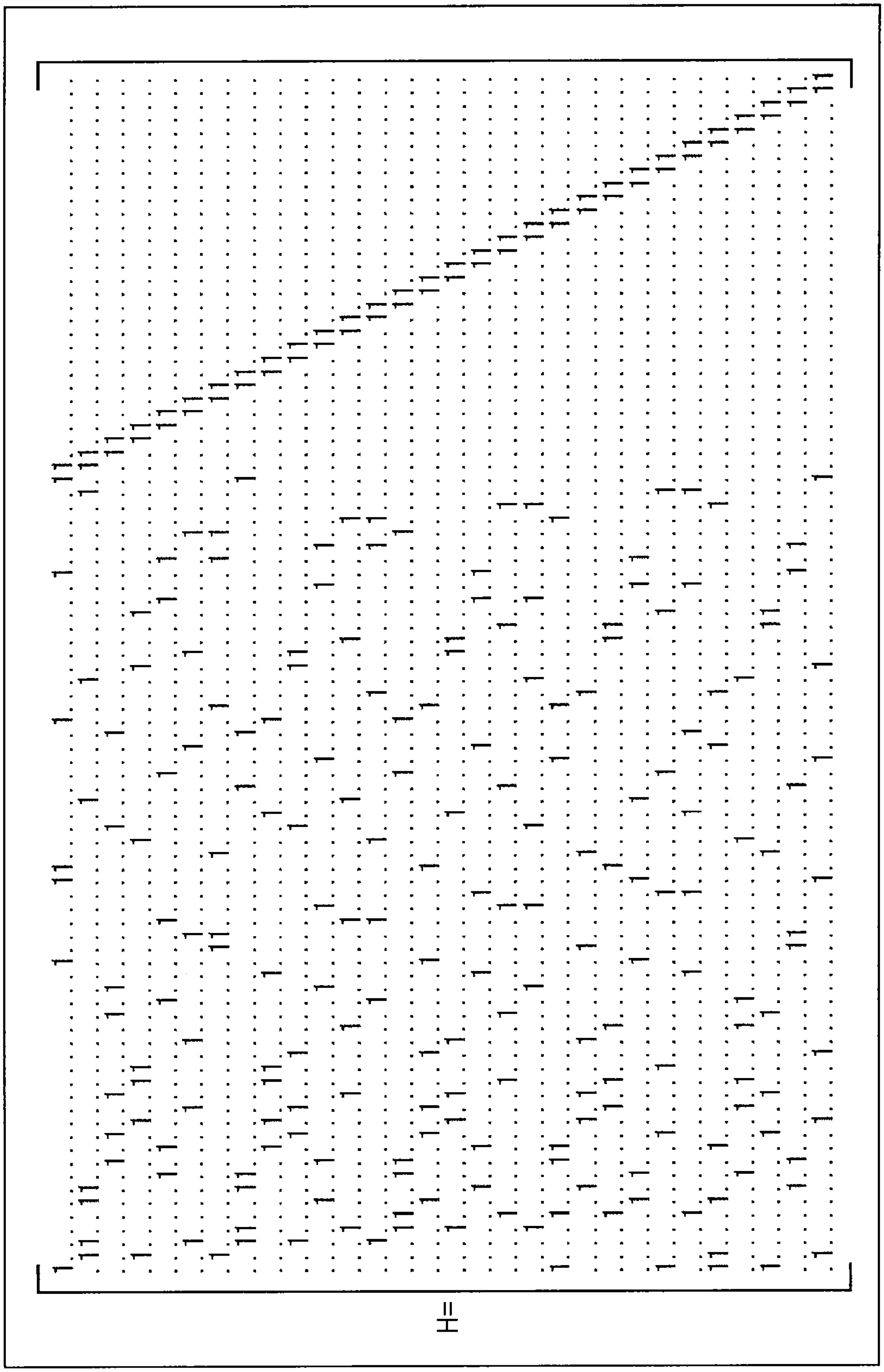
Figure 211:
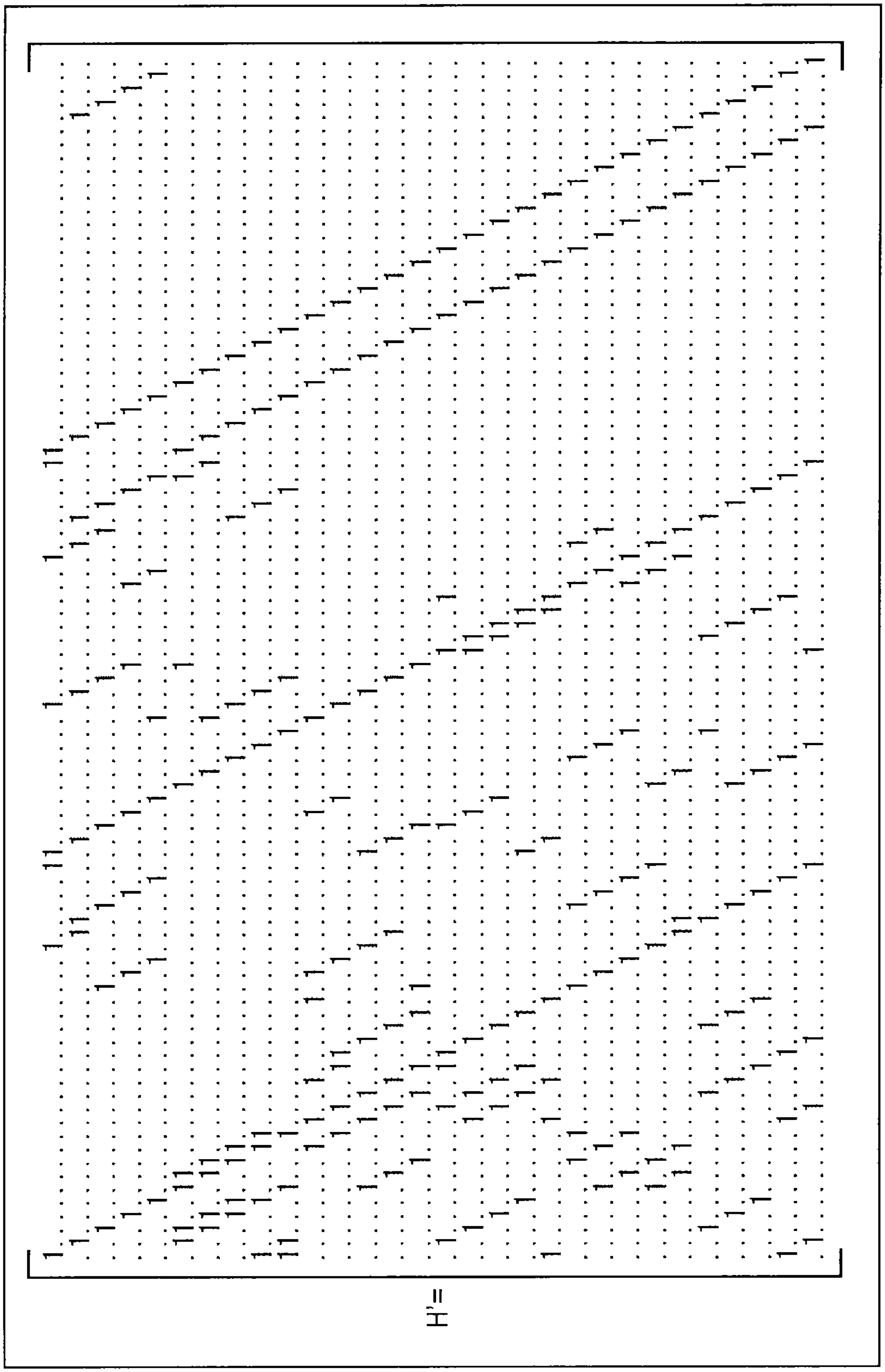
Figure 212:
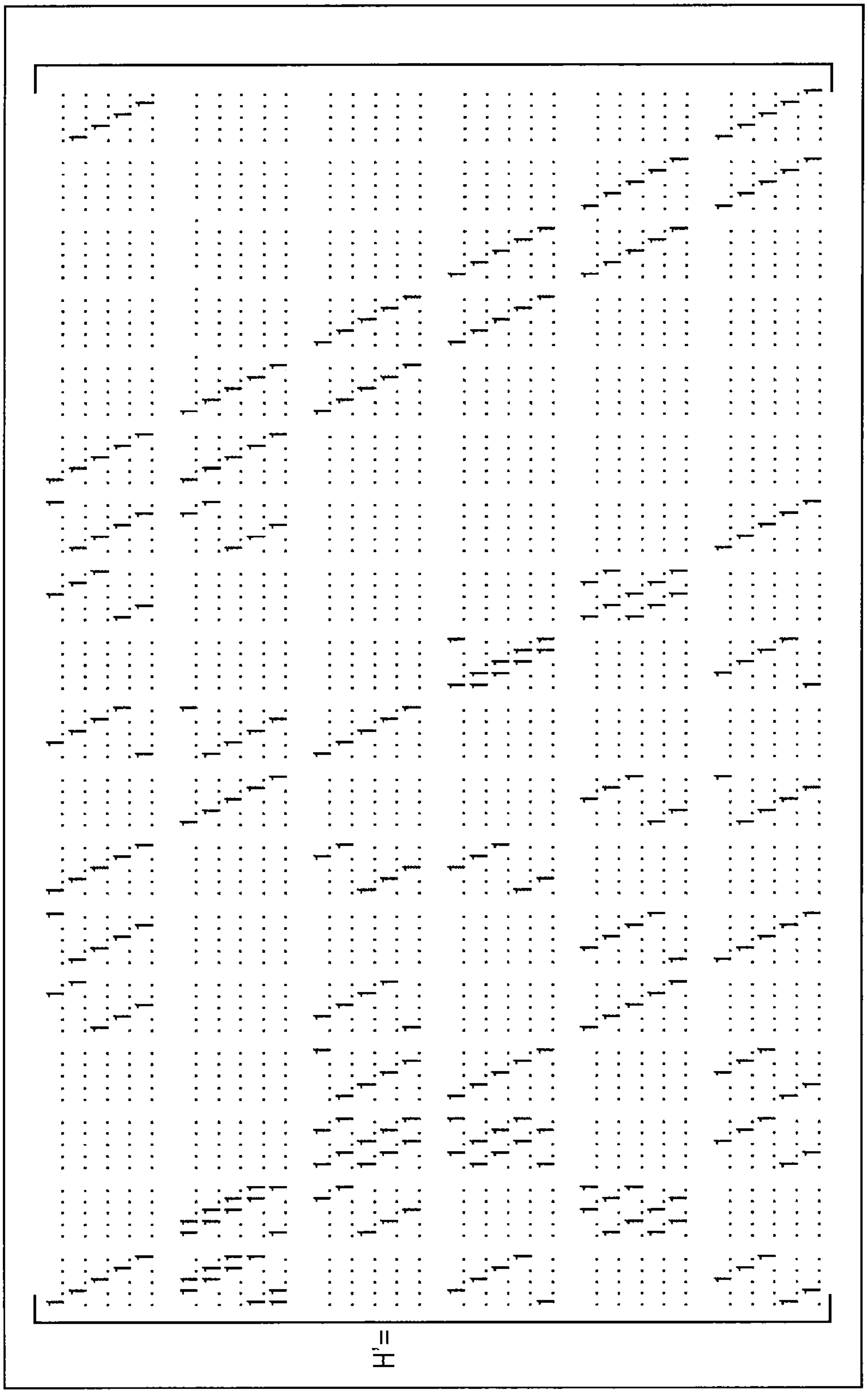
Figure 213:
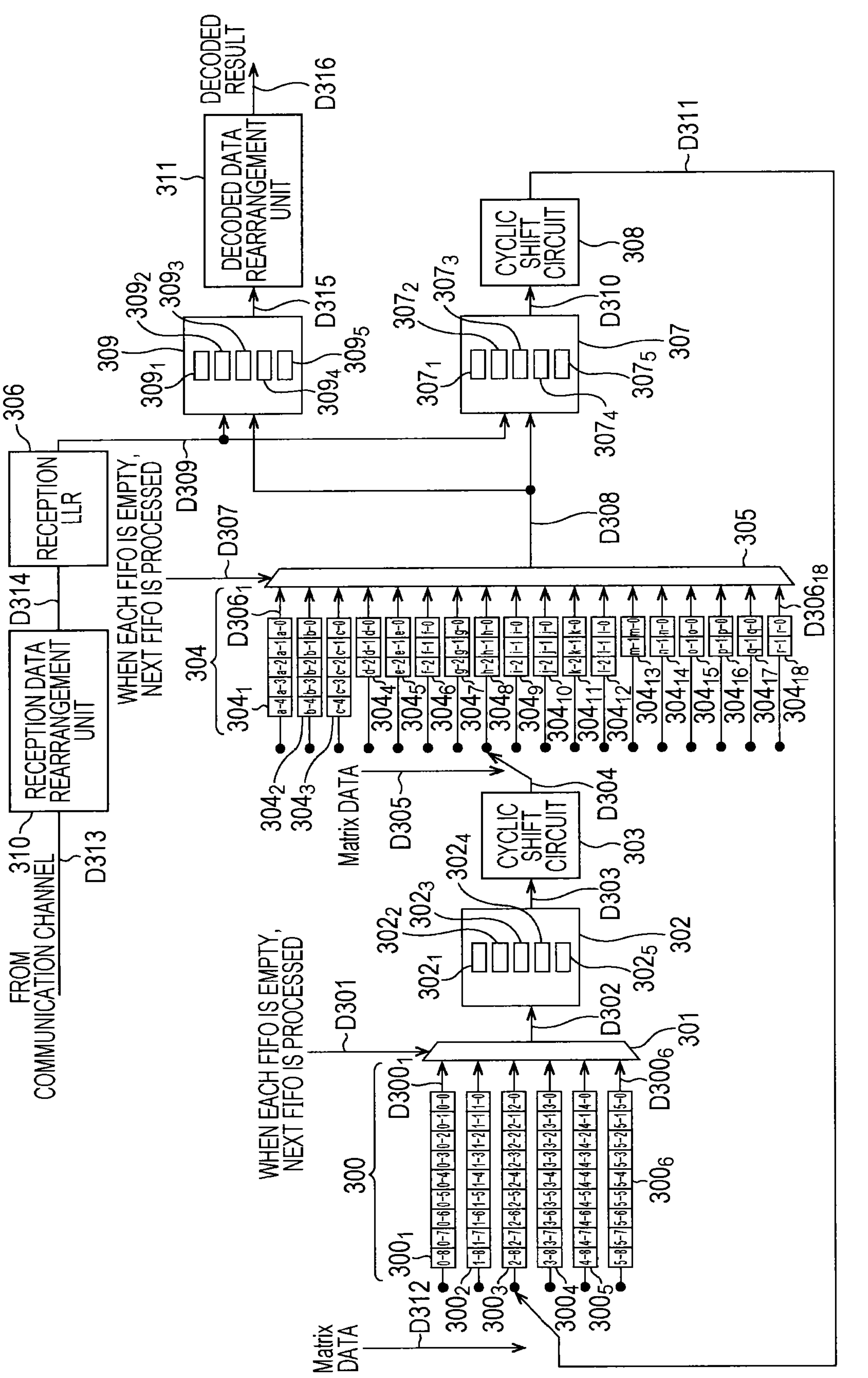
Figure 214:
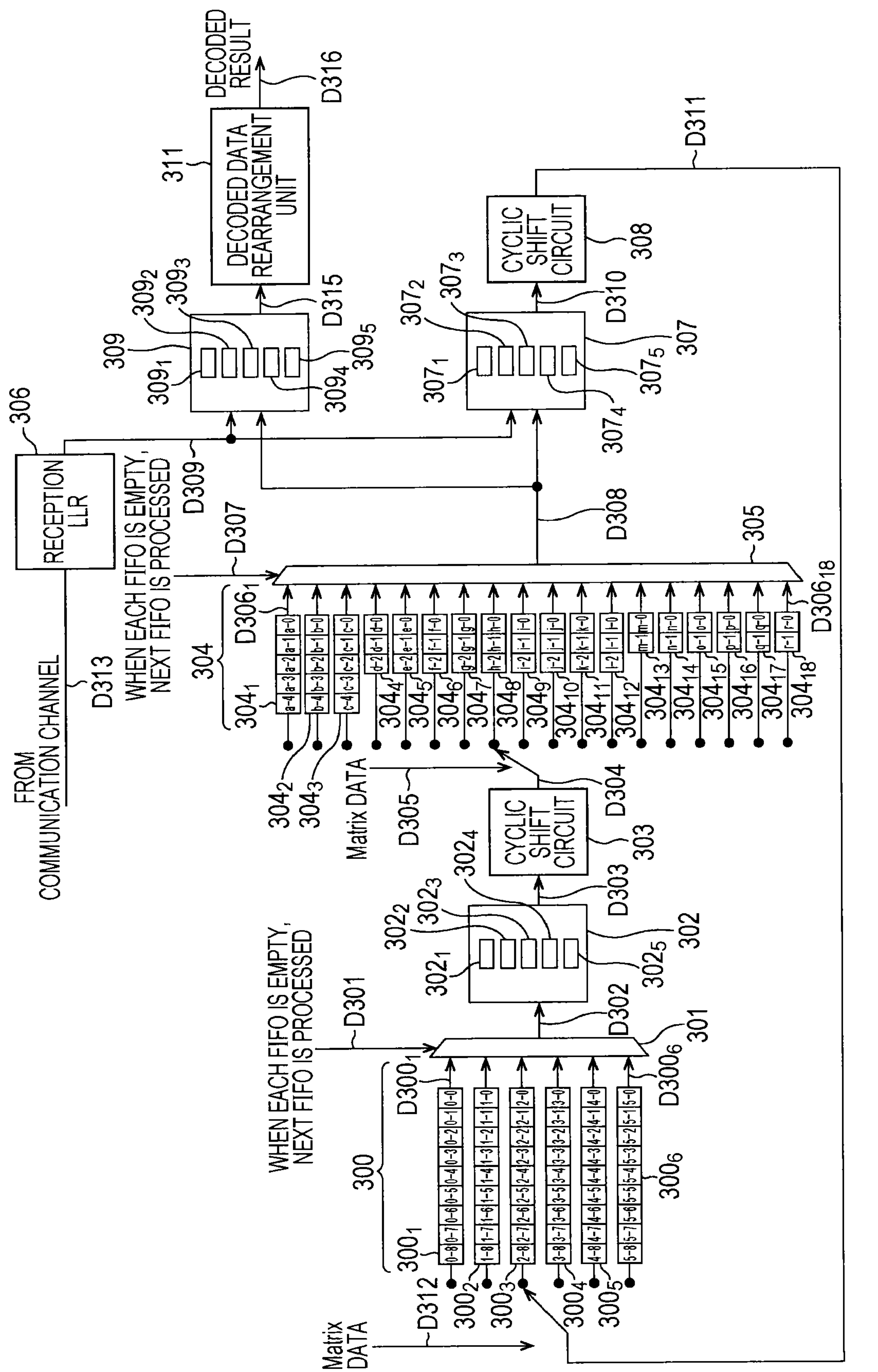
Figure 215:
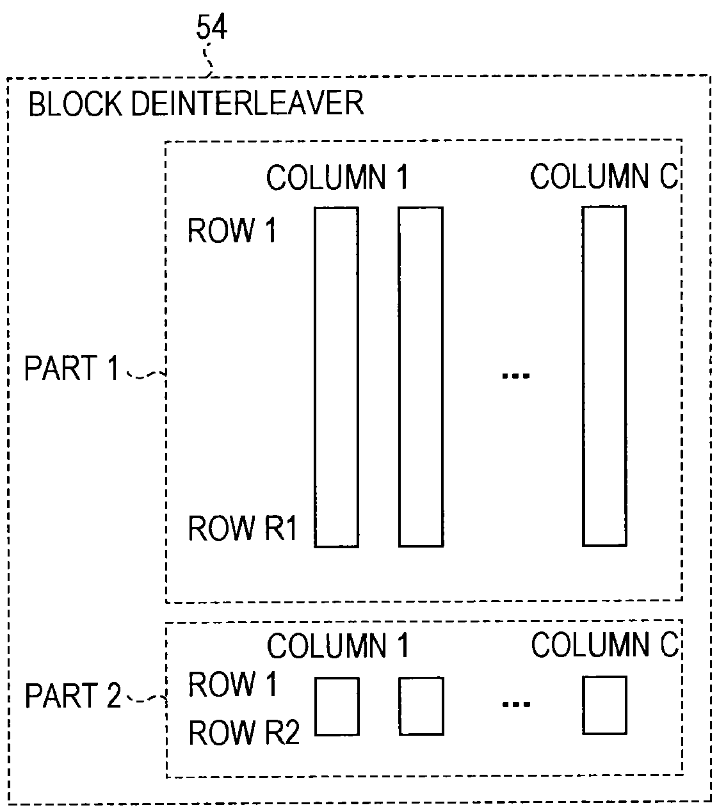
Figure 216:
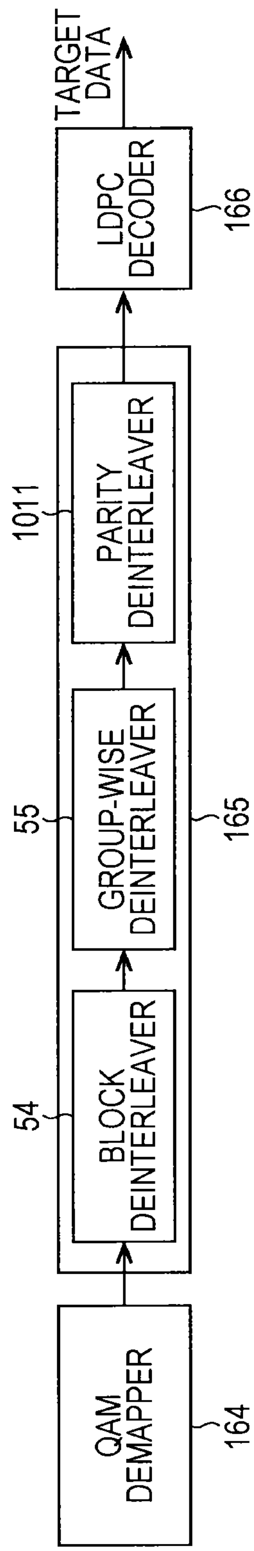
Figure 217:
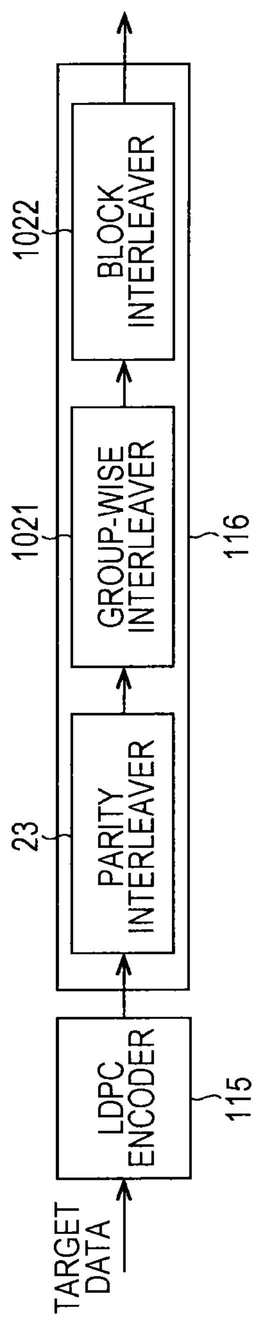
Figure 218:
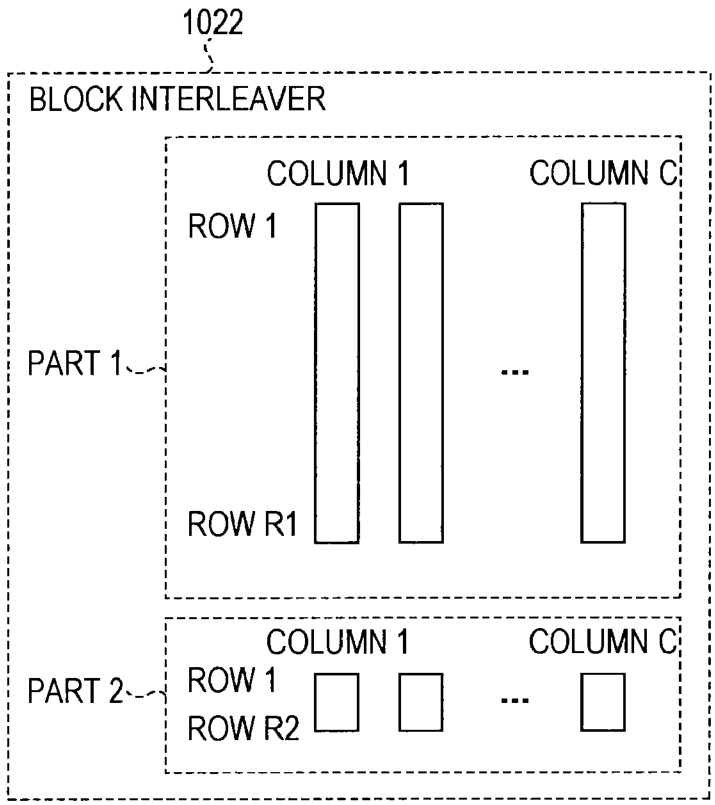
Figure 220A:
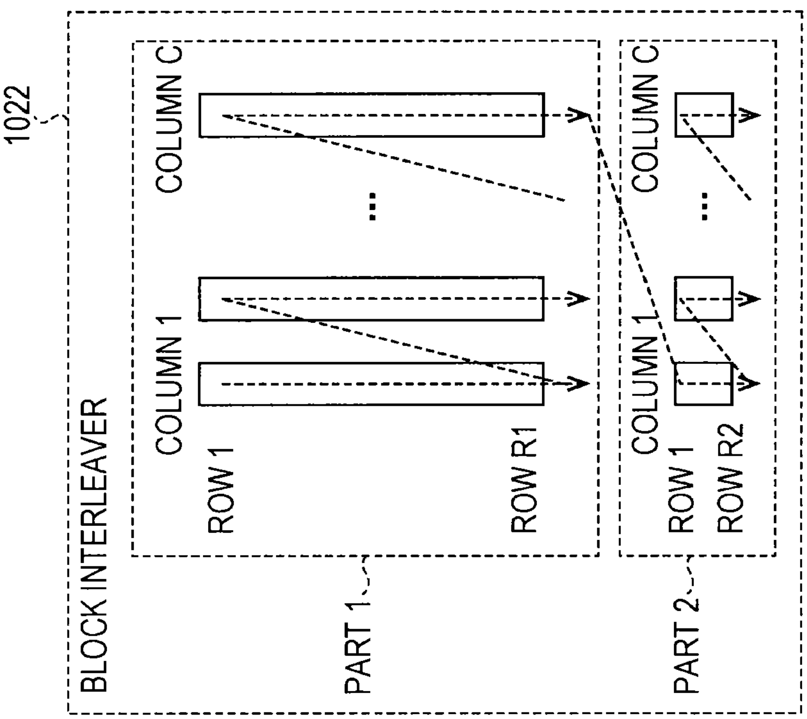
Figure 220B:
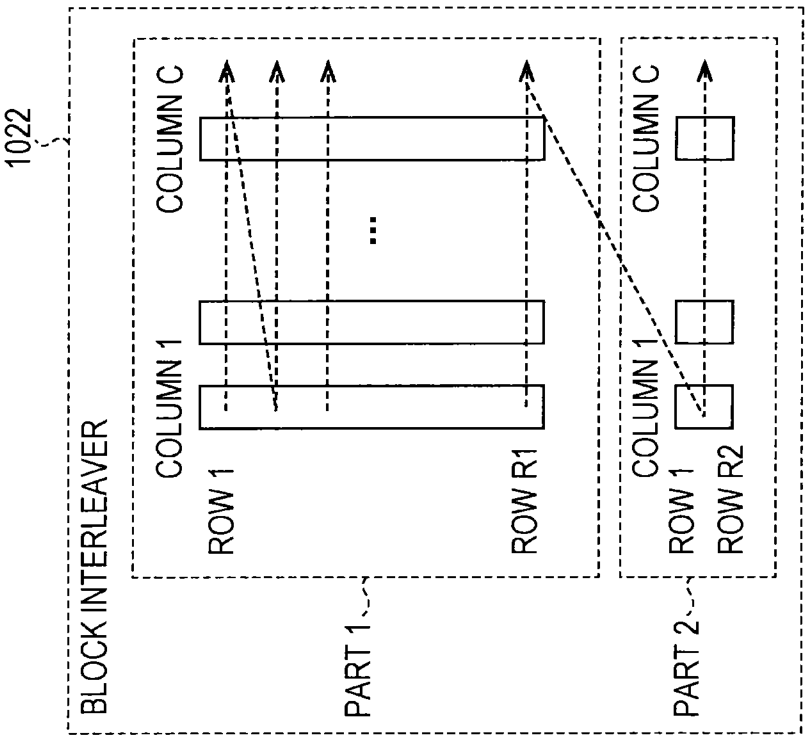
Figure 221:
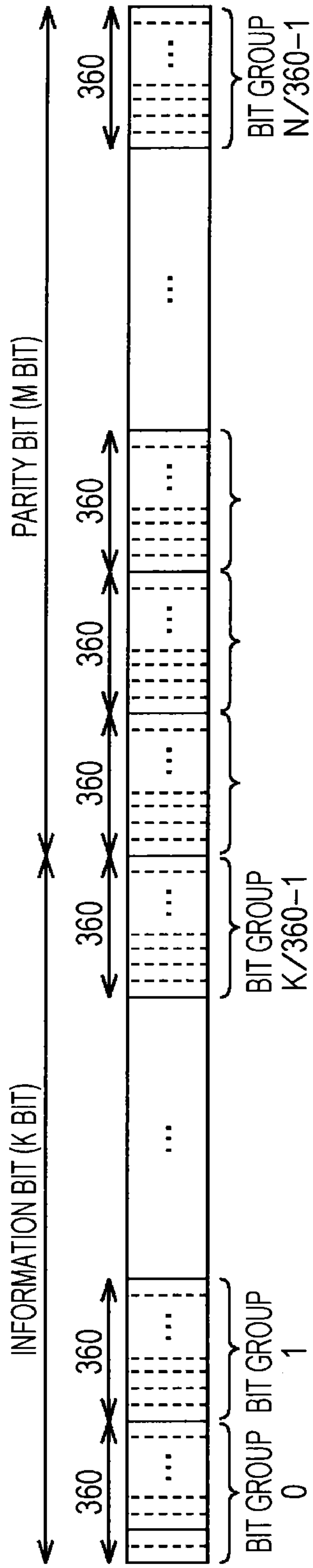
Figure 222:
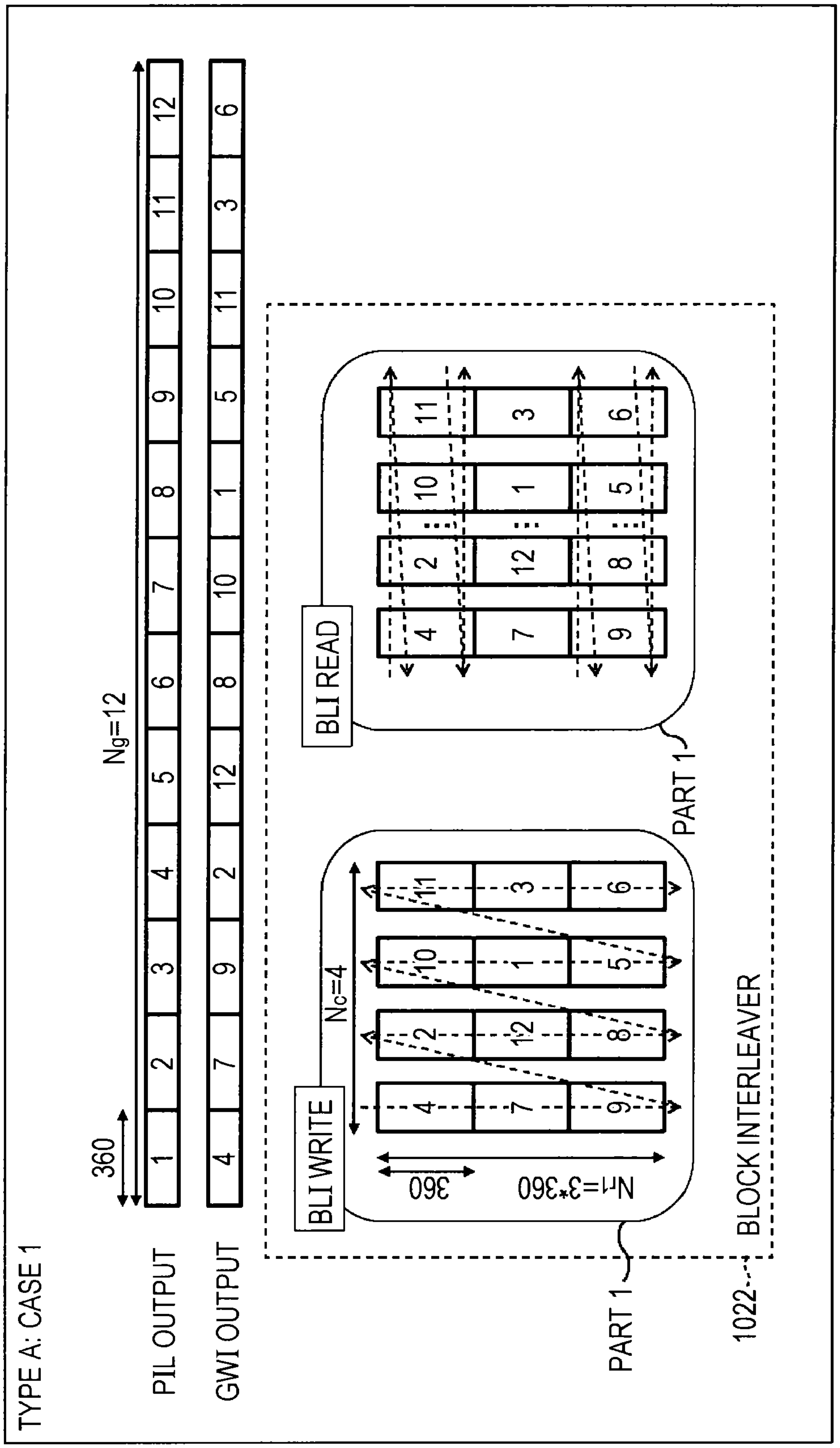
Figure 223:
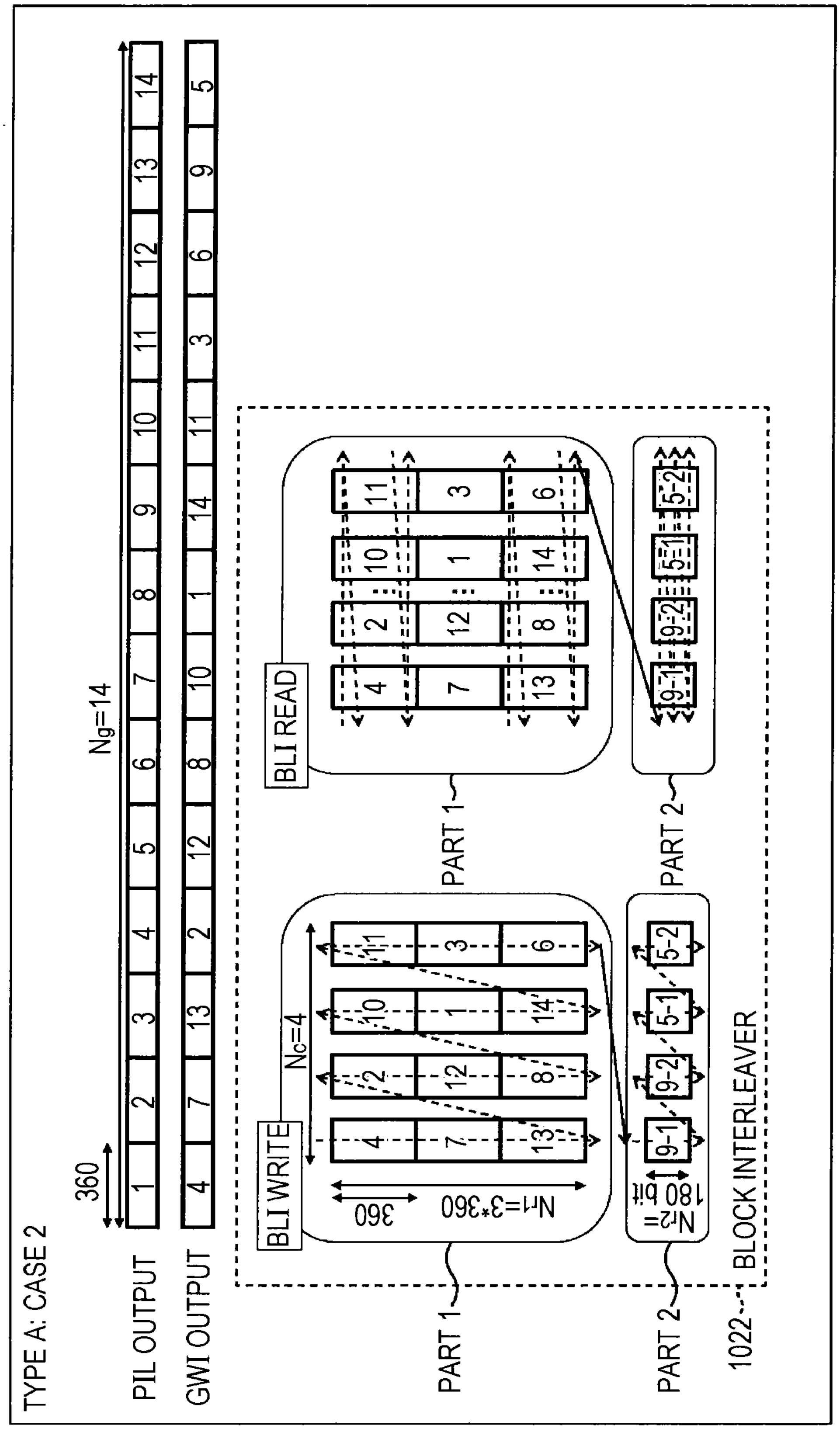
Figure 224:
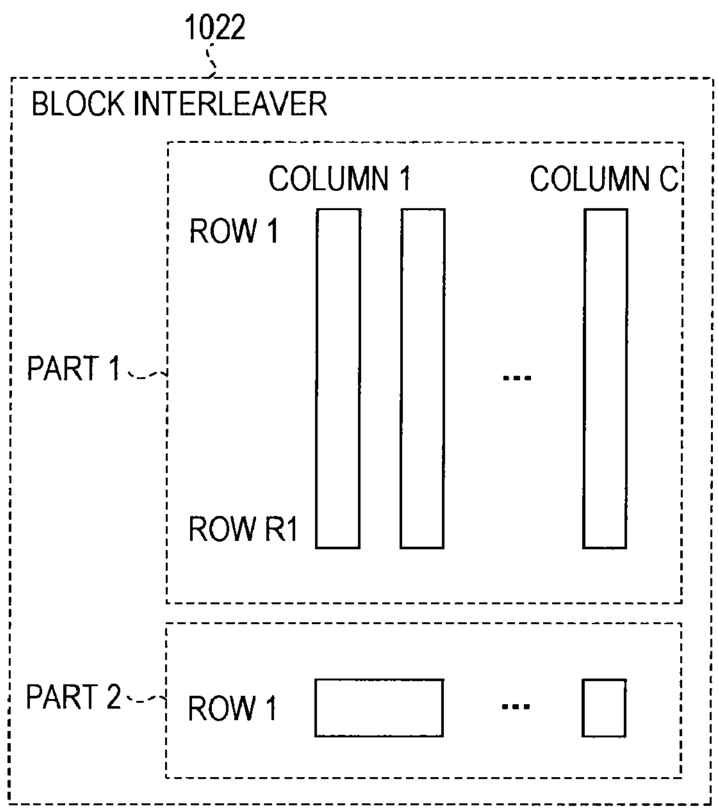
Figure 225B:
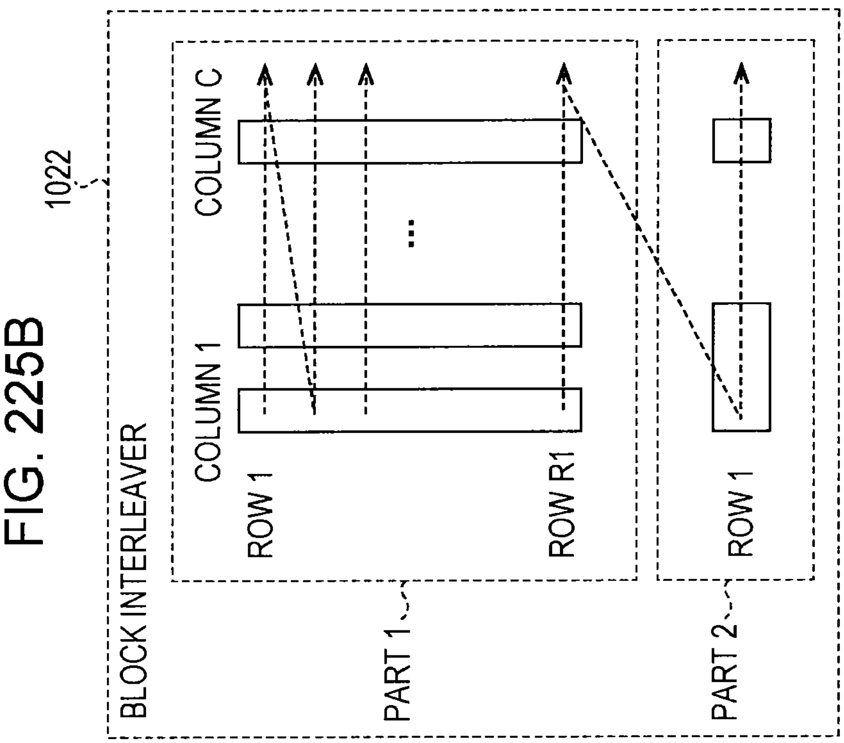
Figure 225A:
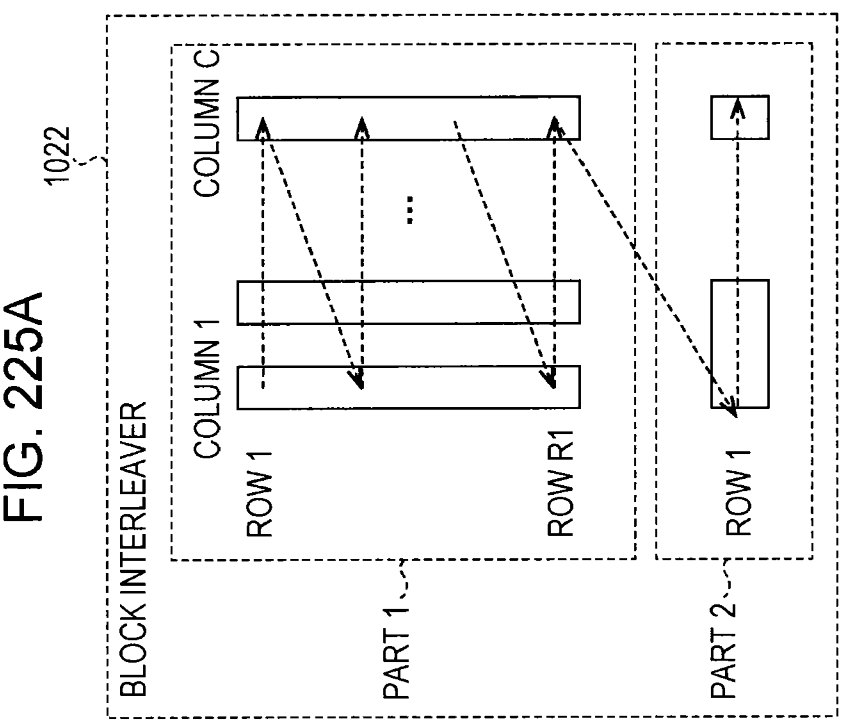
Figure 226:
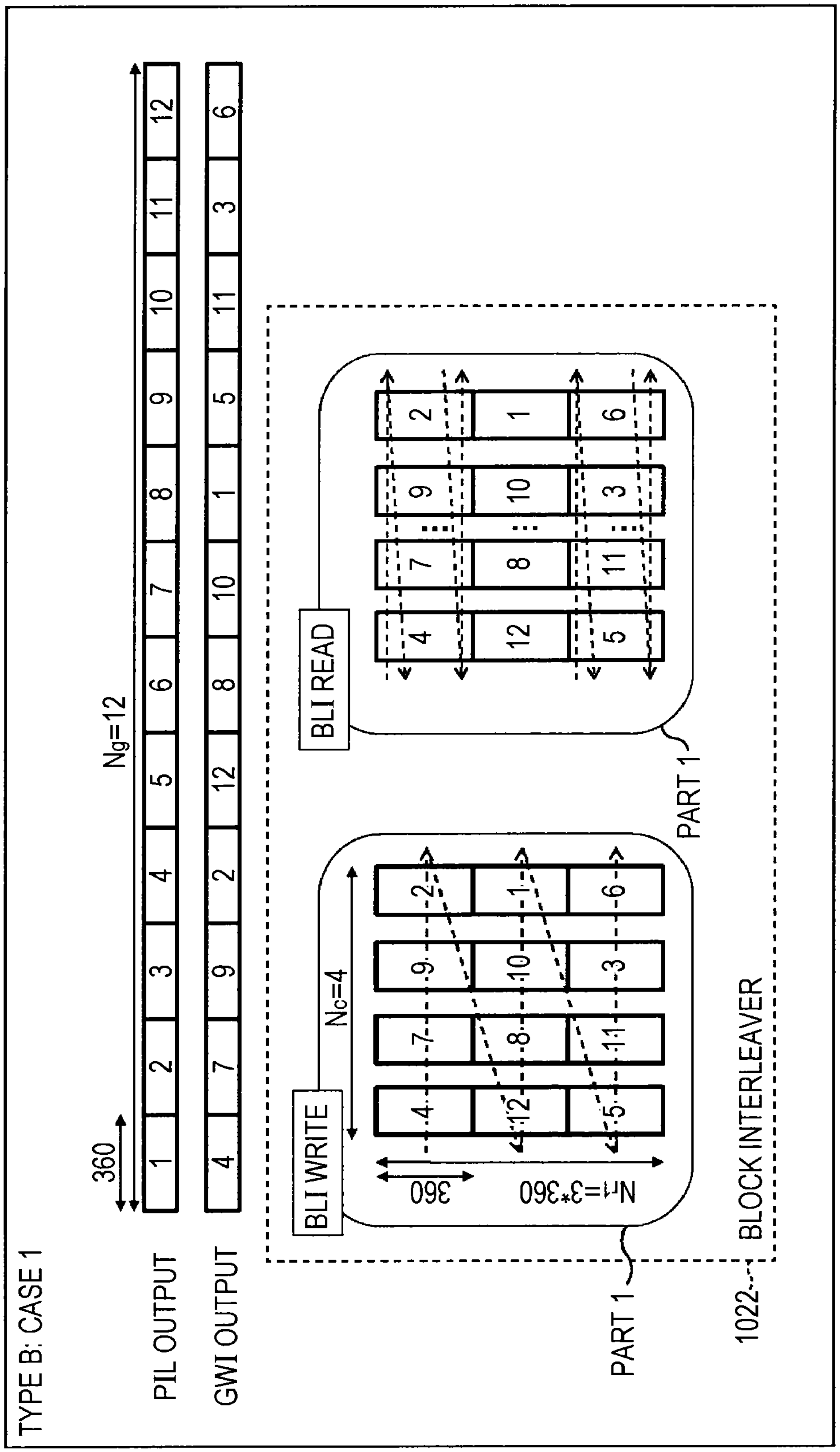
Figure 227:
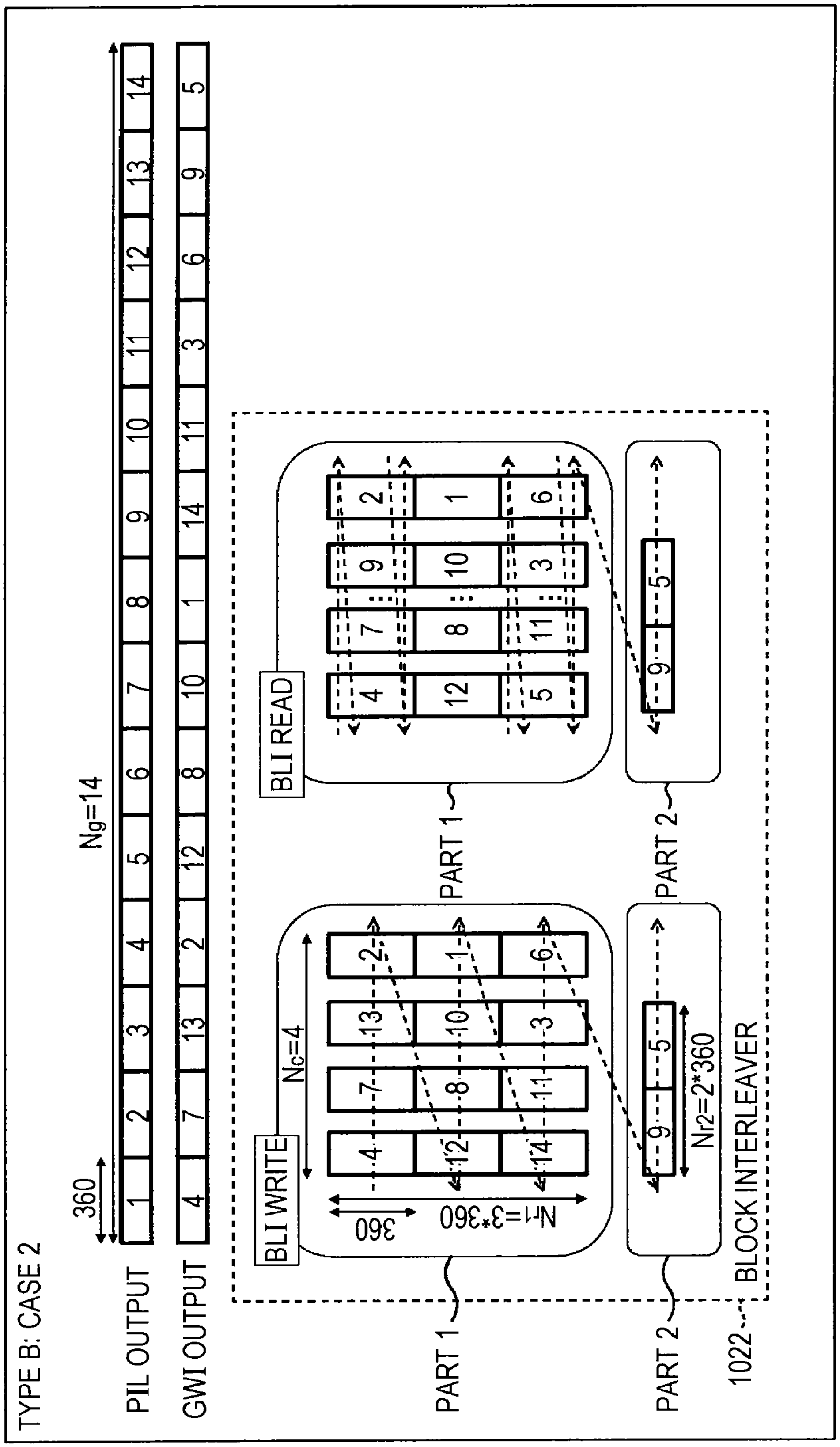
Figure 228:
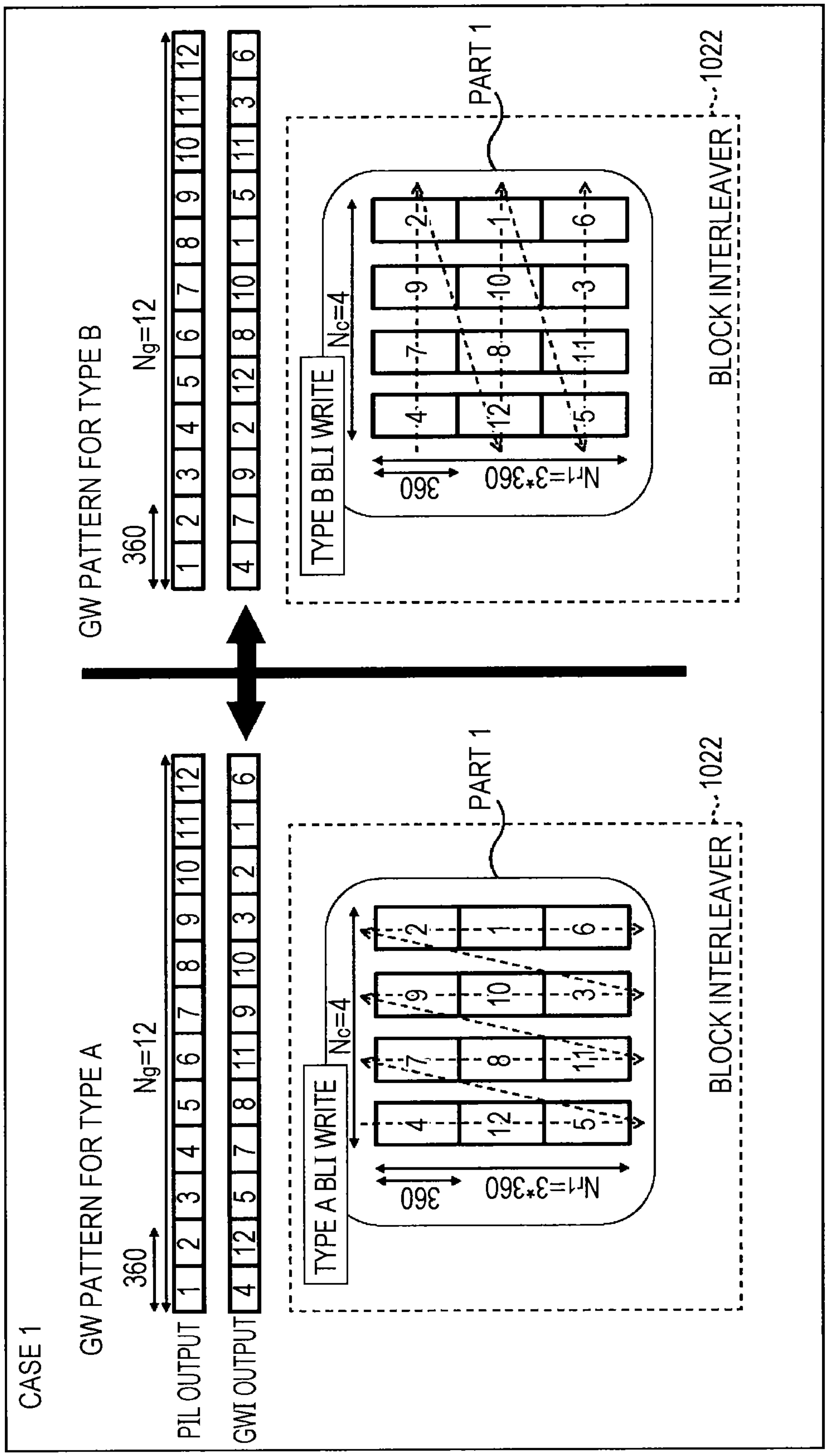
Figure 229:
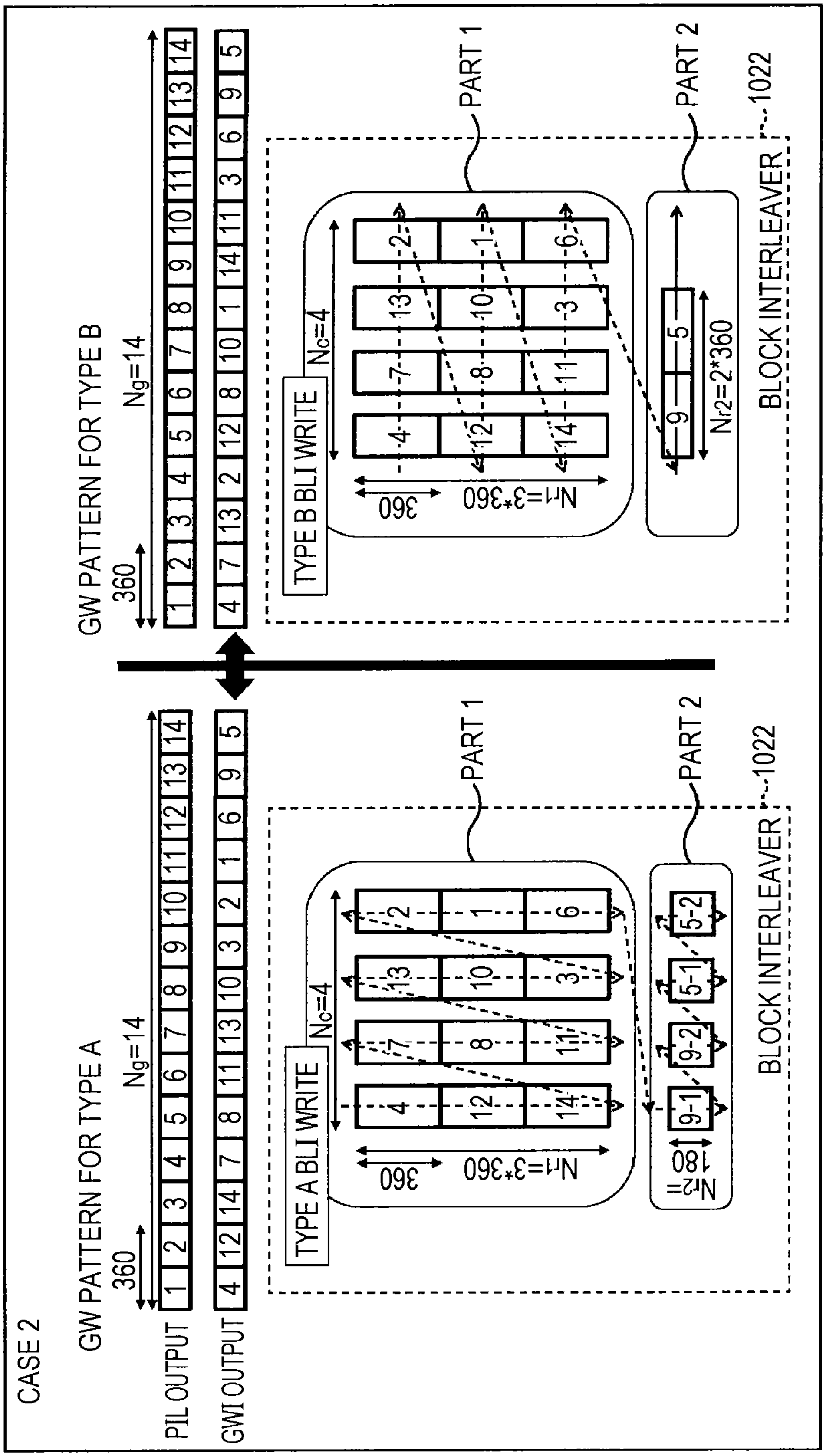
Figure 304:
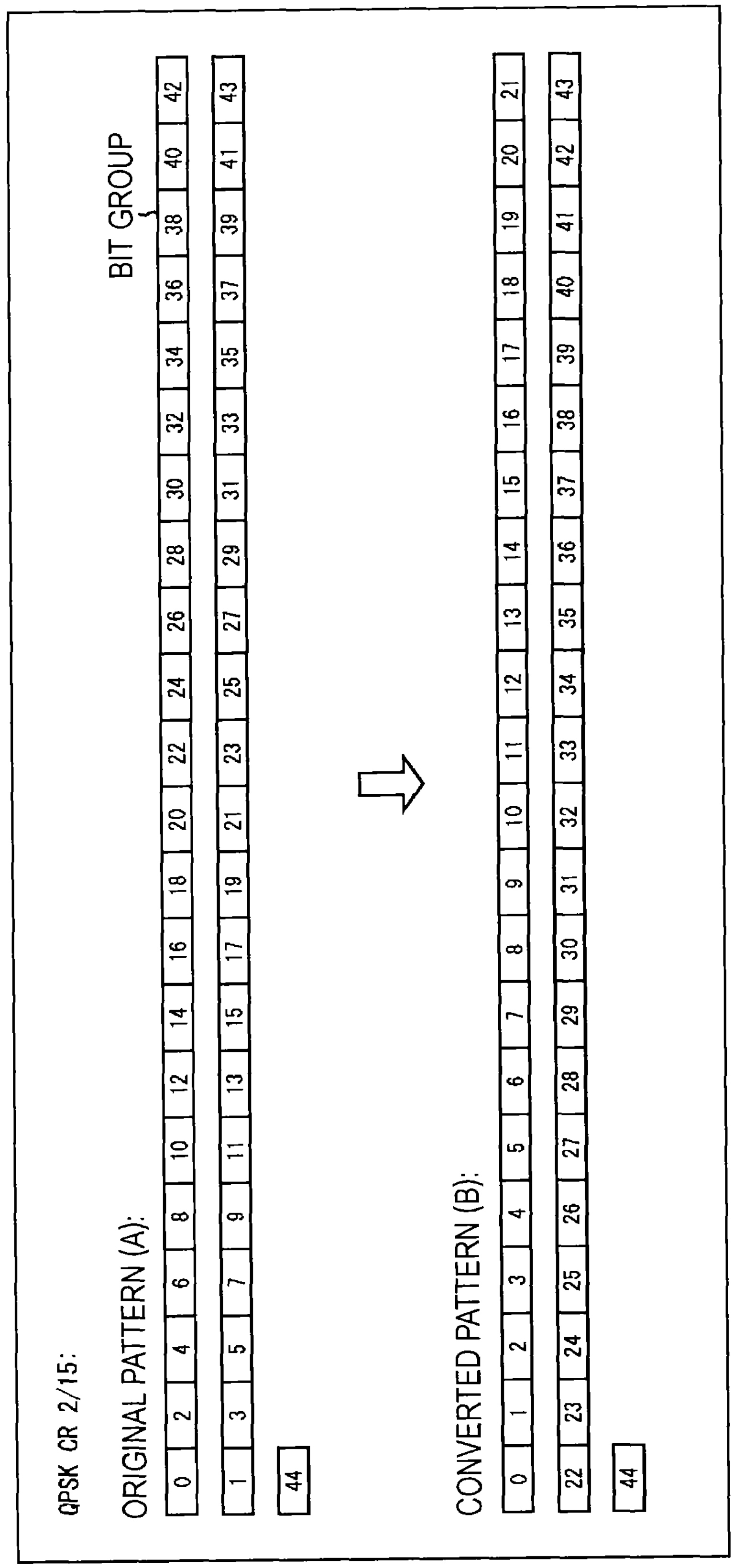
Figure 305:
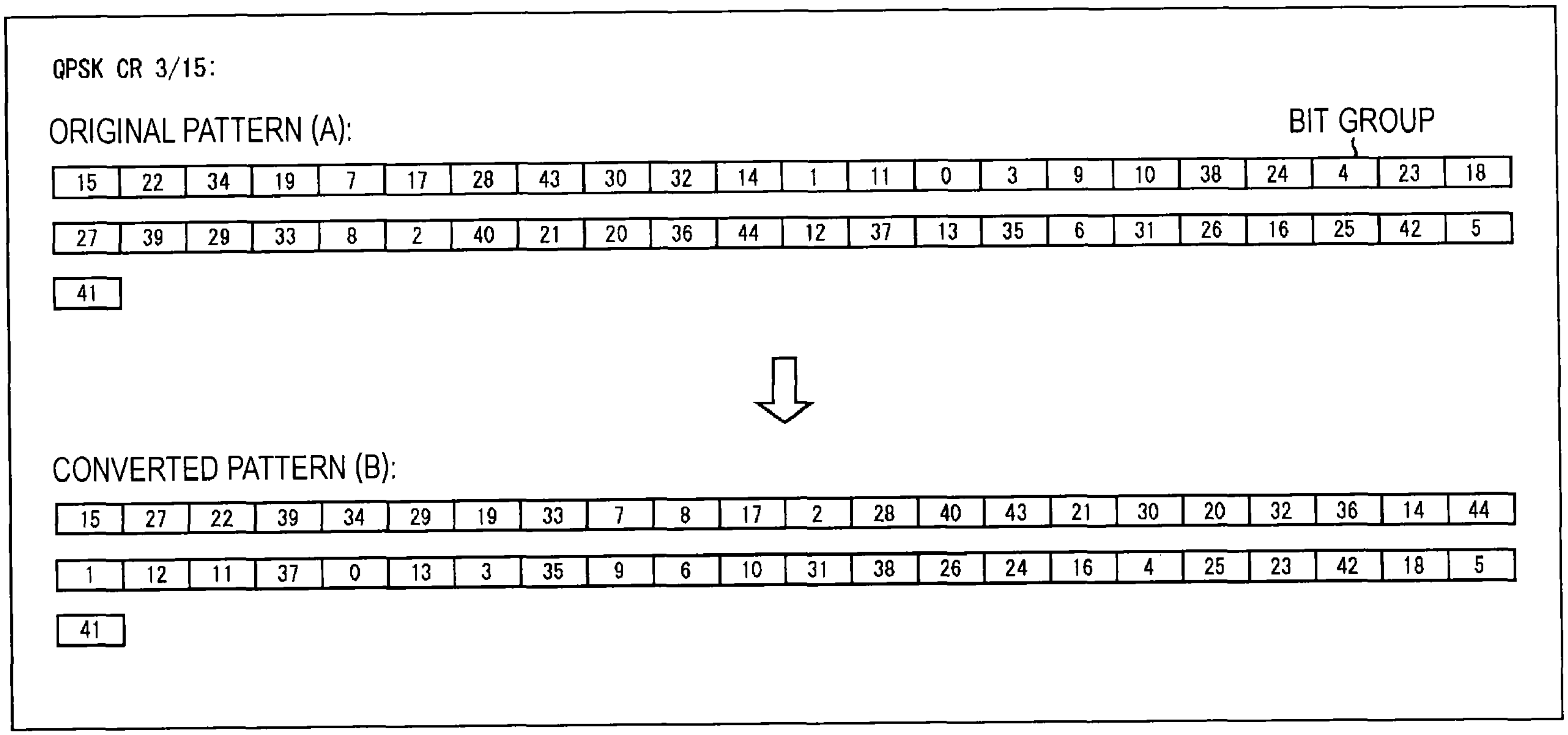
Figure 306:
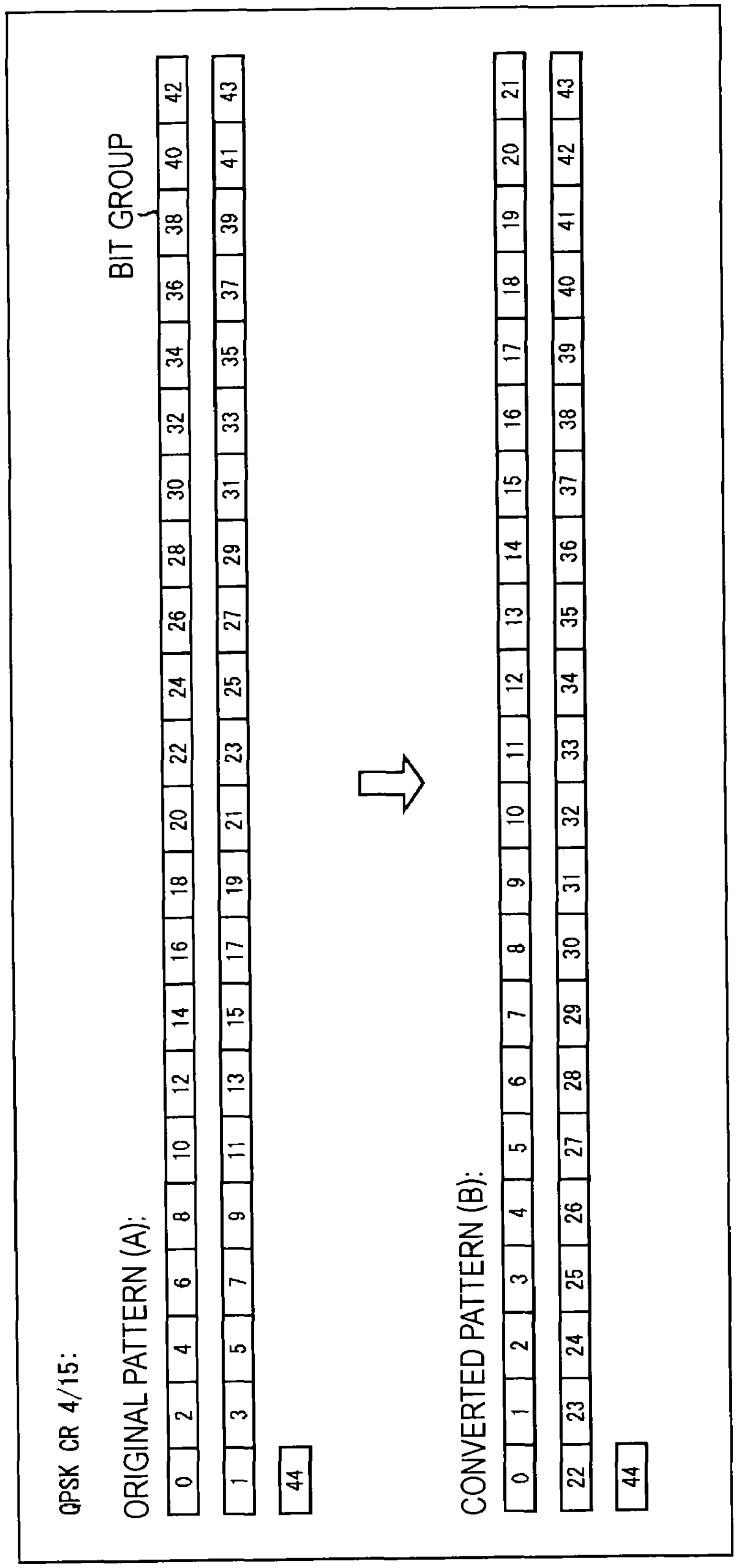
Figure 310:
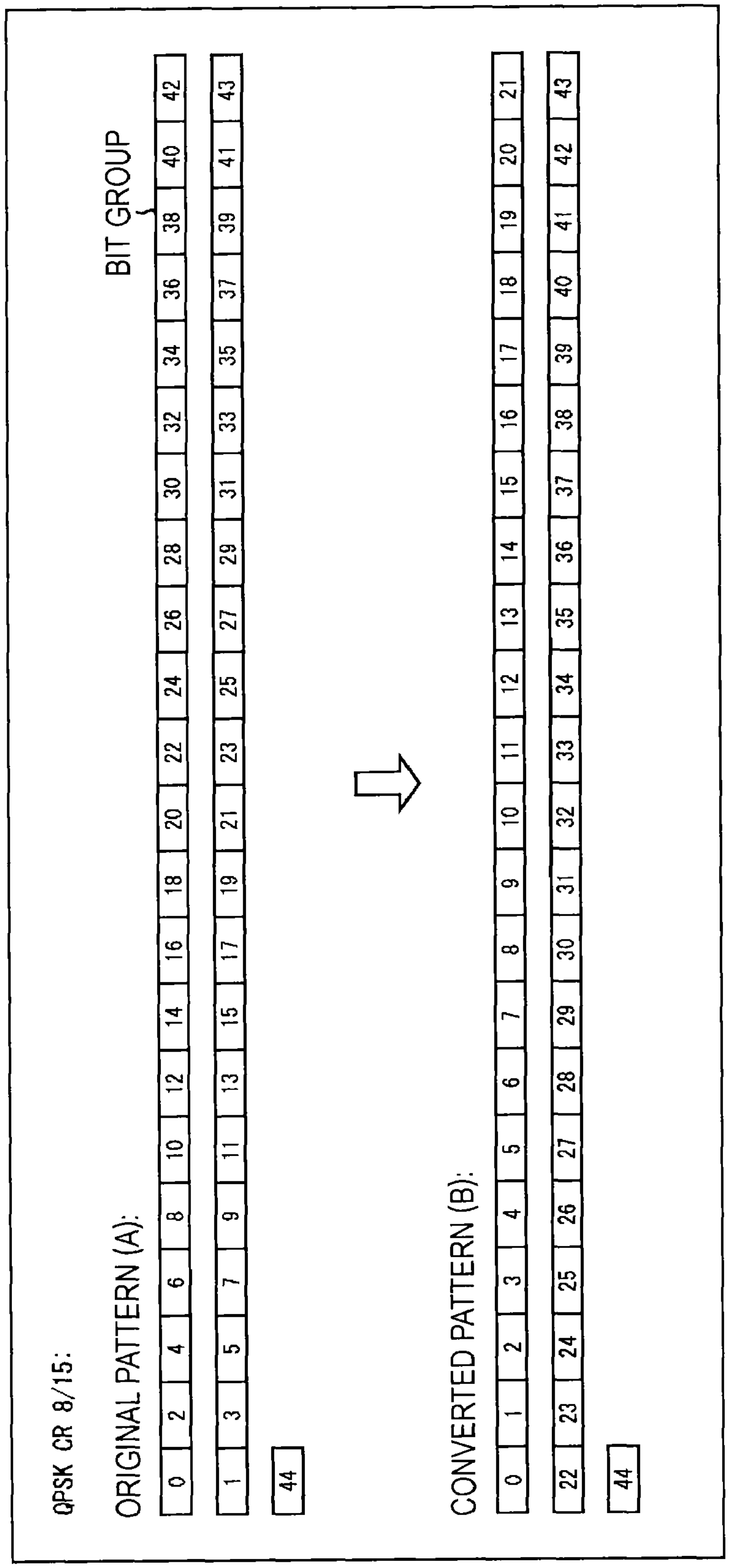
Figure 311:
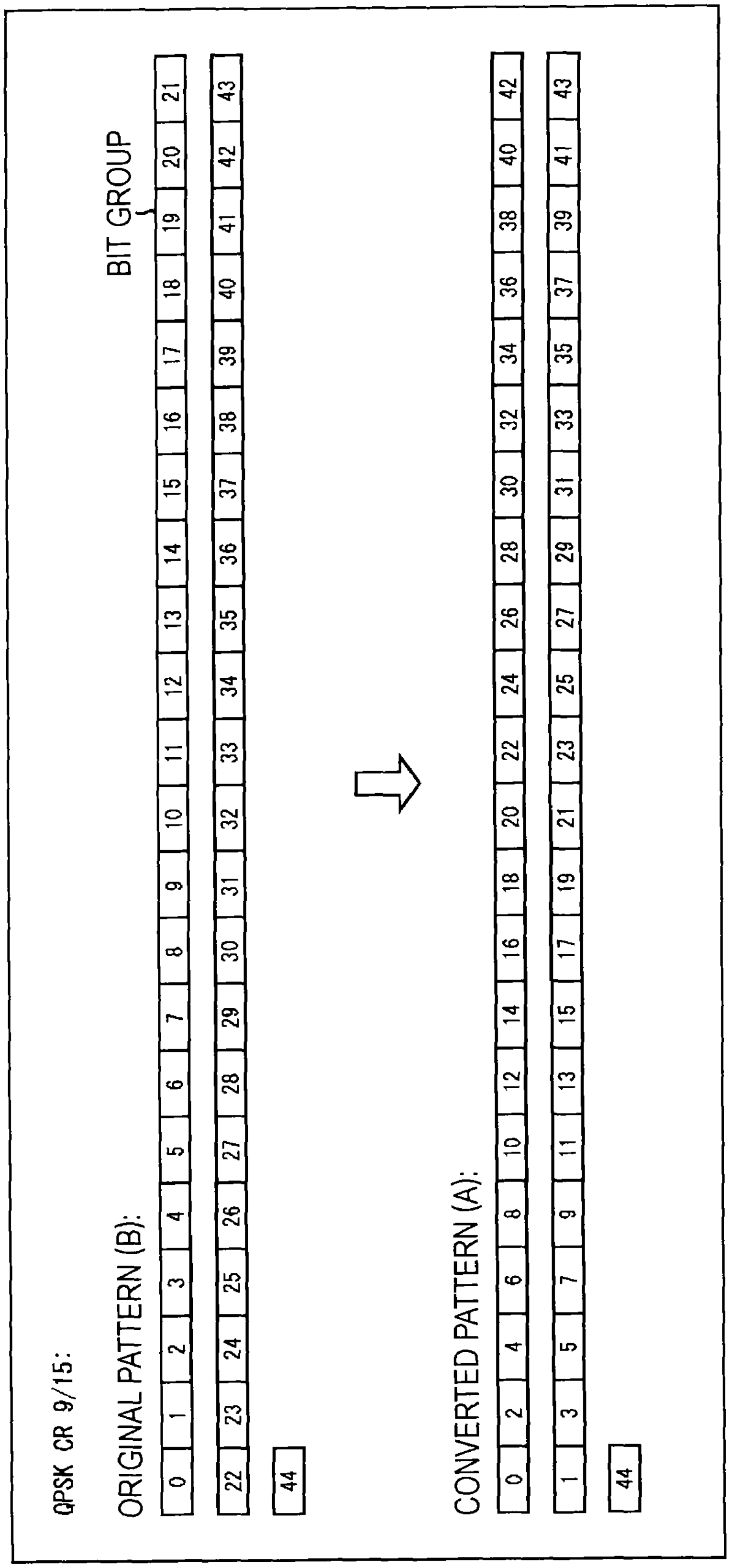
Figure 313:
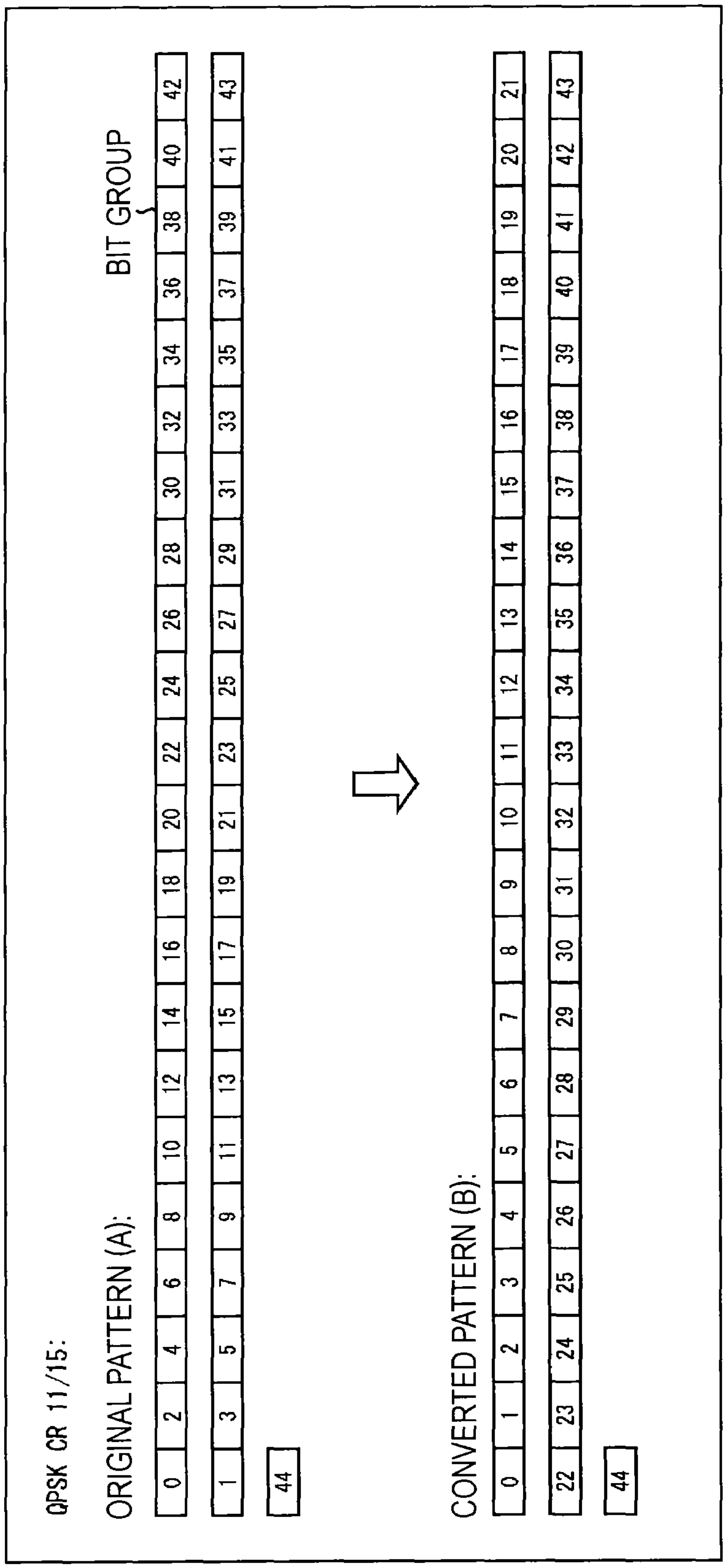
Figure 314:
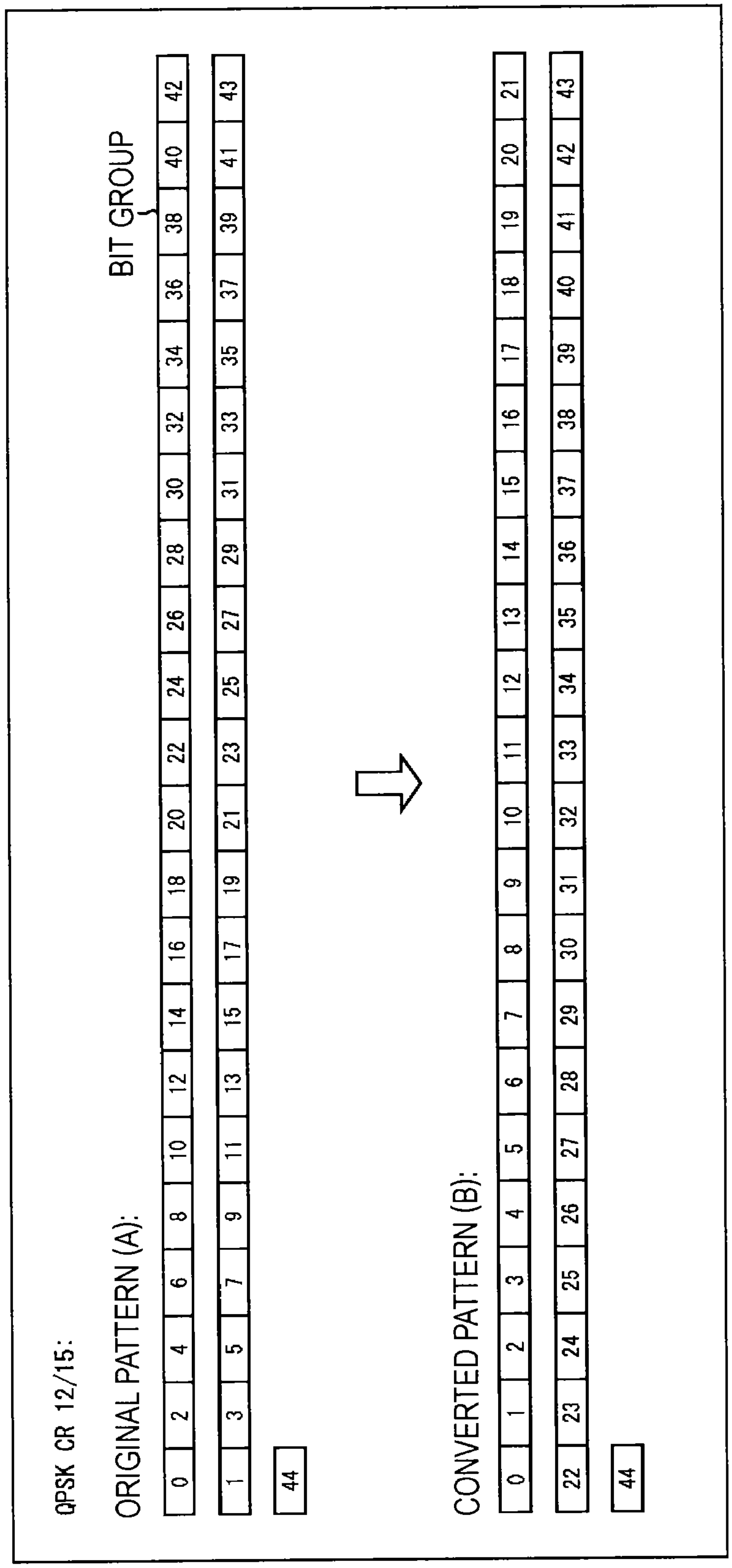
Figure 320:
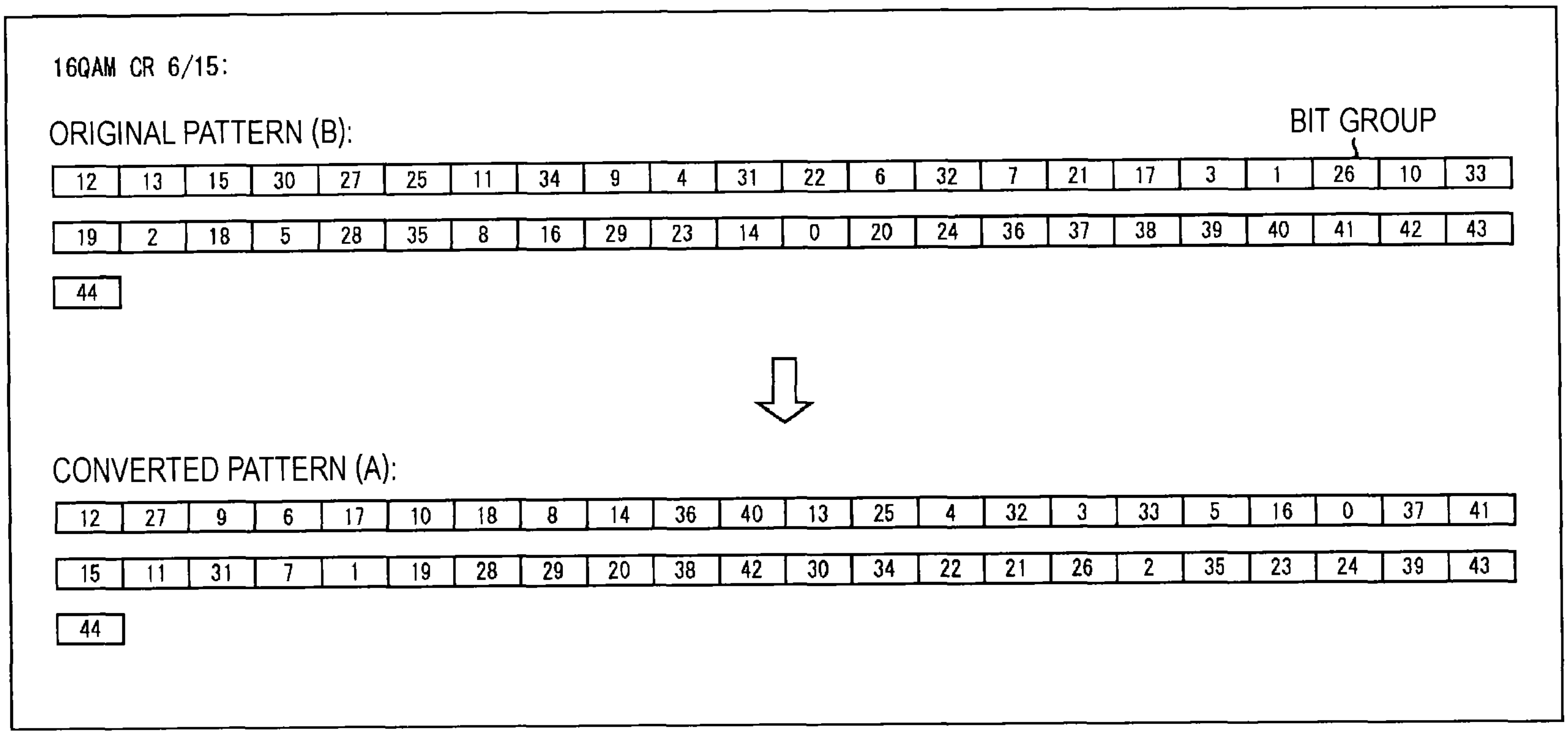
Figure 329:
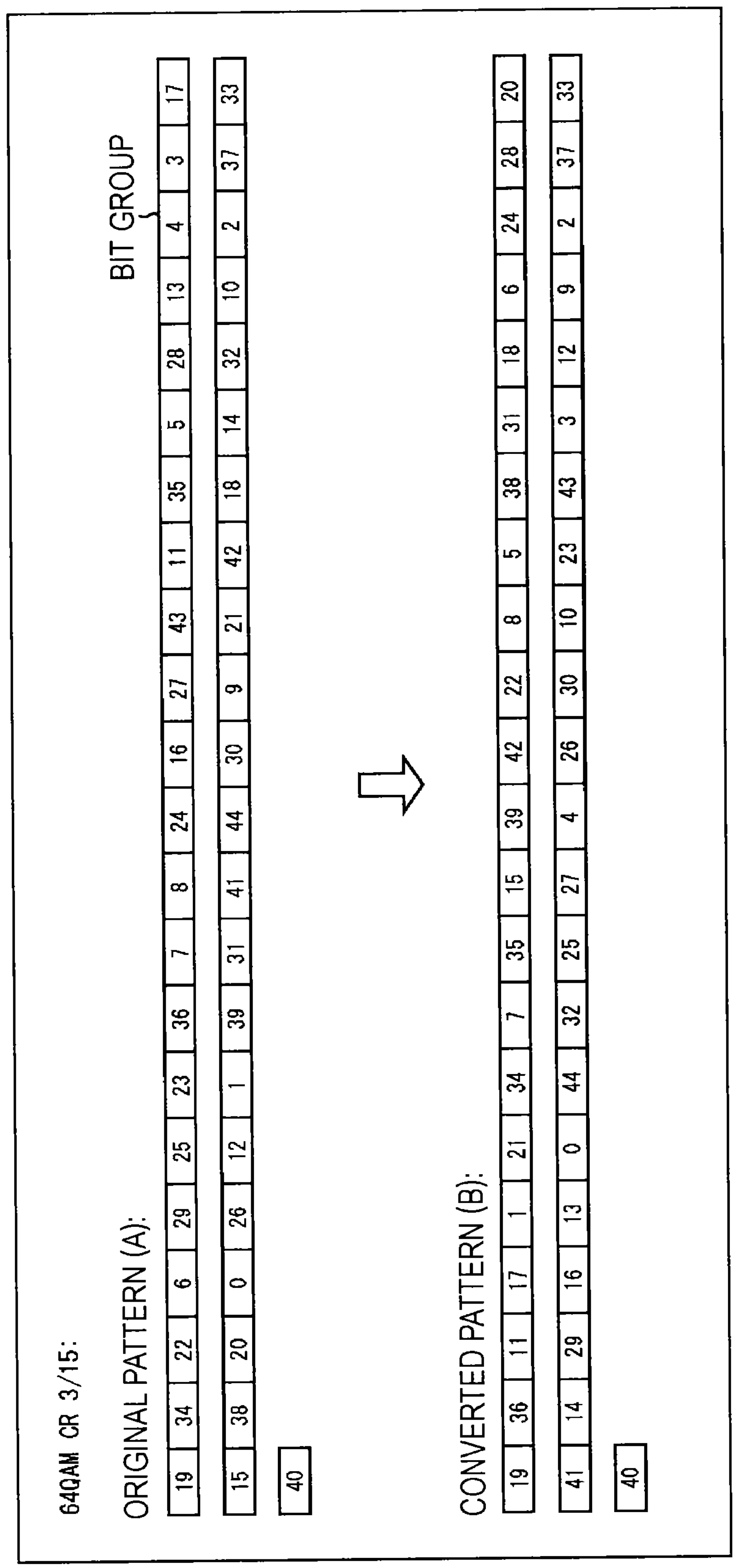
Figure 333:
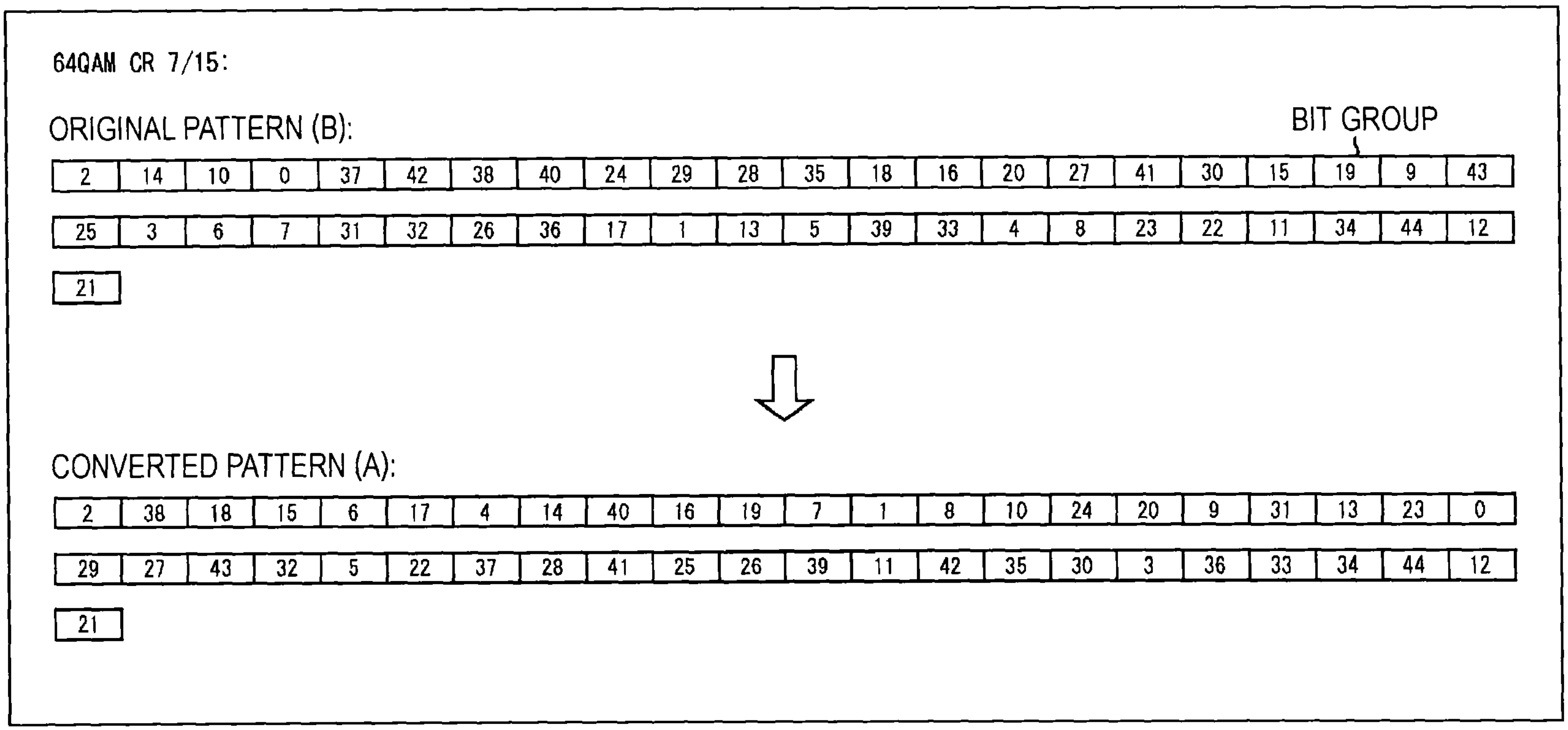
Figure 334:
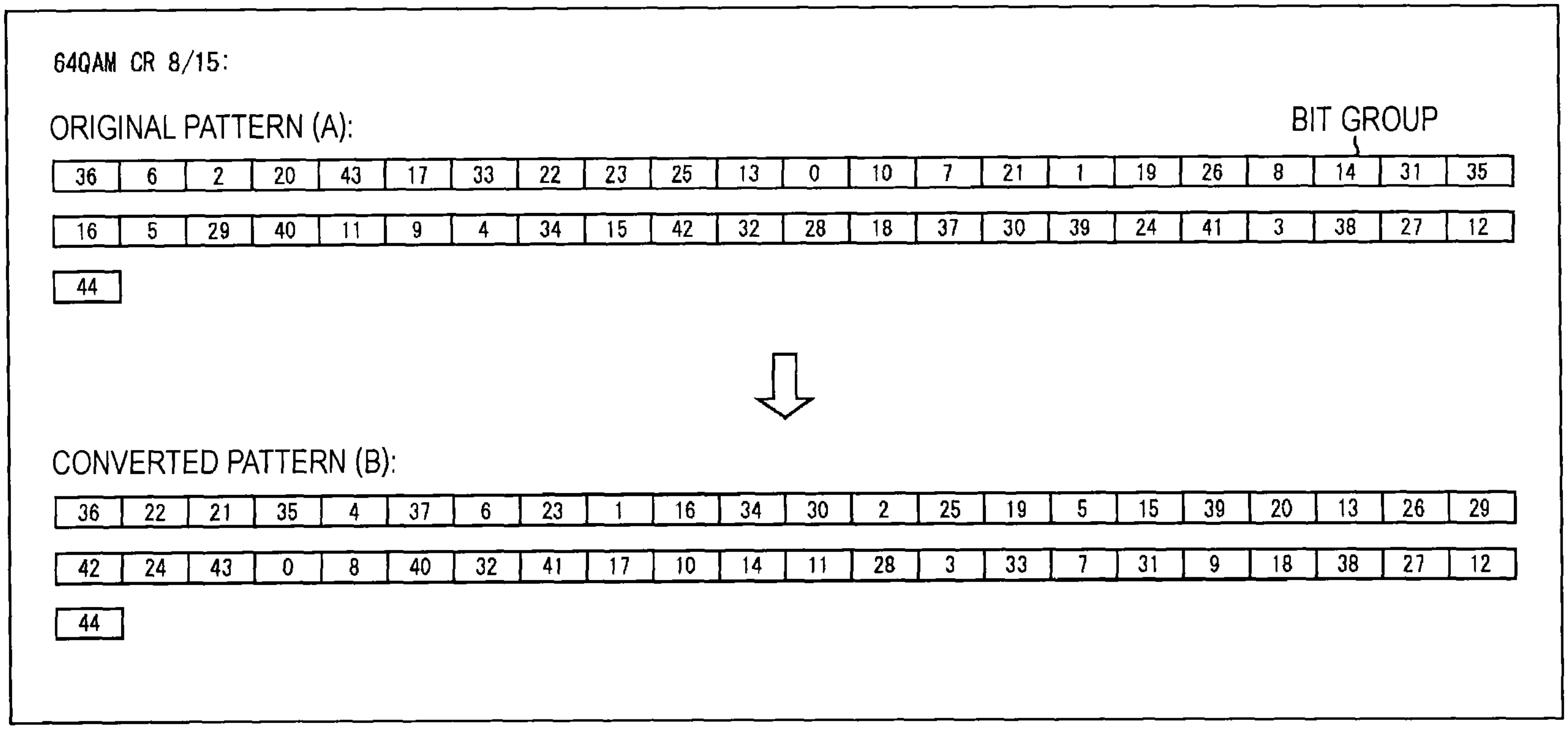
Figure 340:
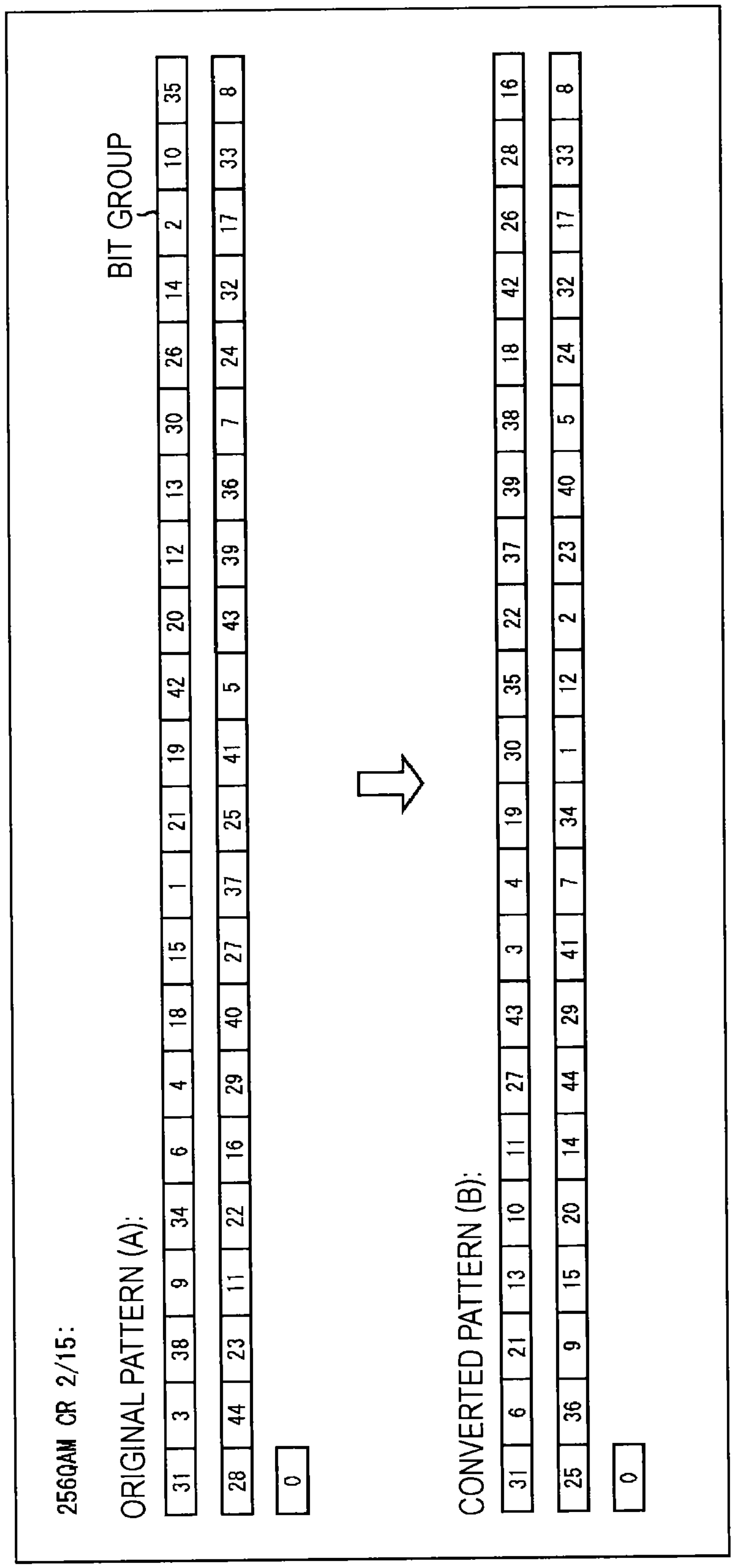
Figure 341:
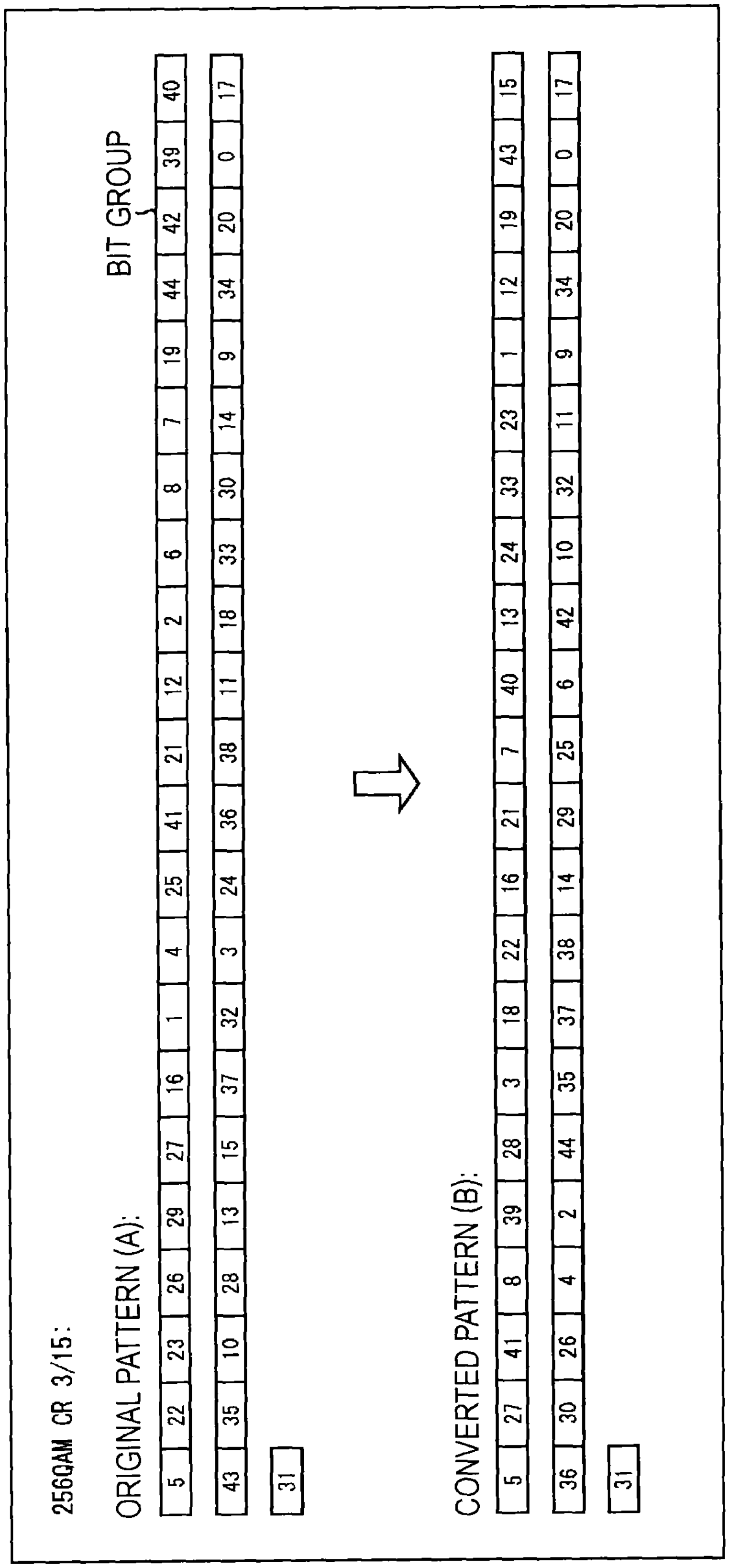
Figure 343:
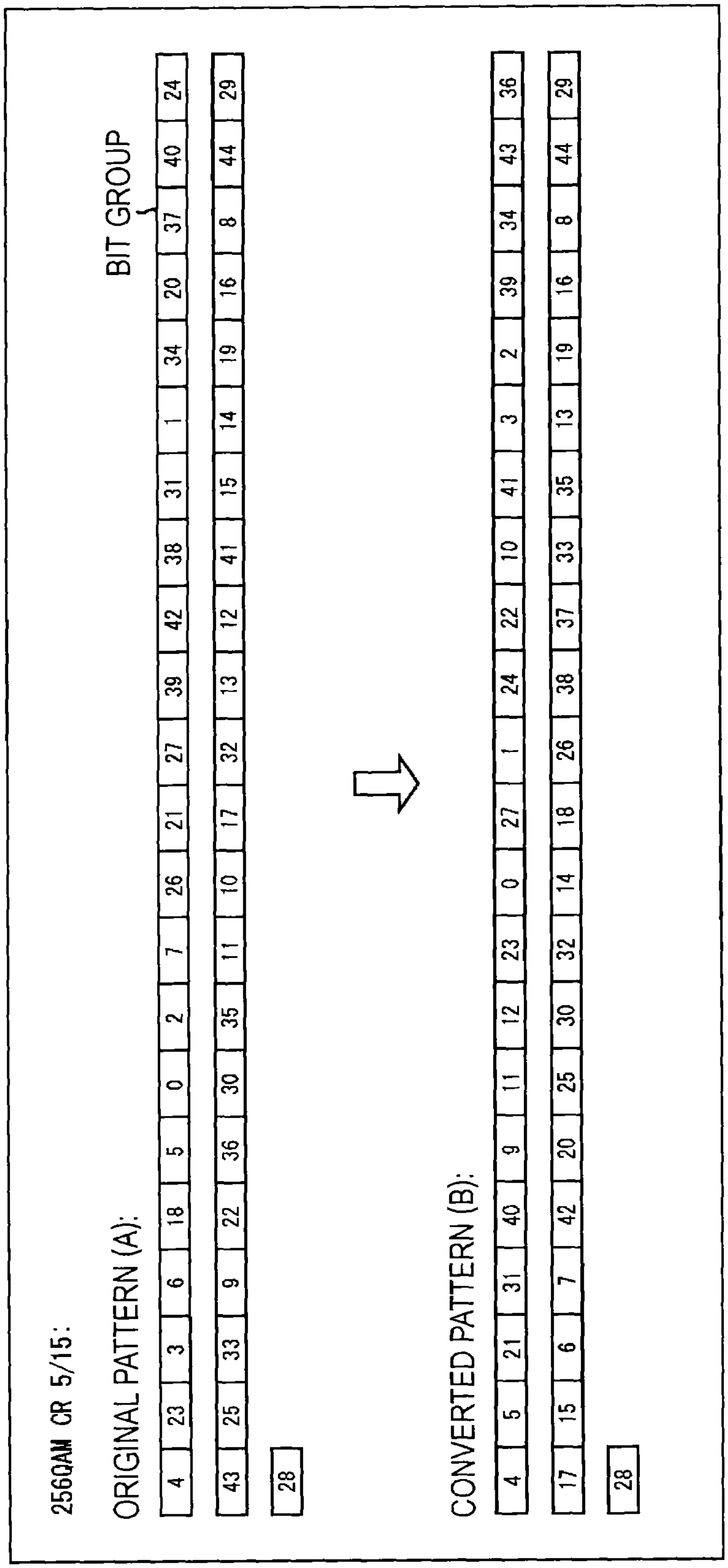
Figure 345:
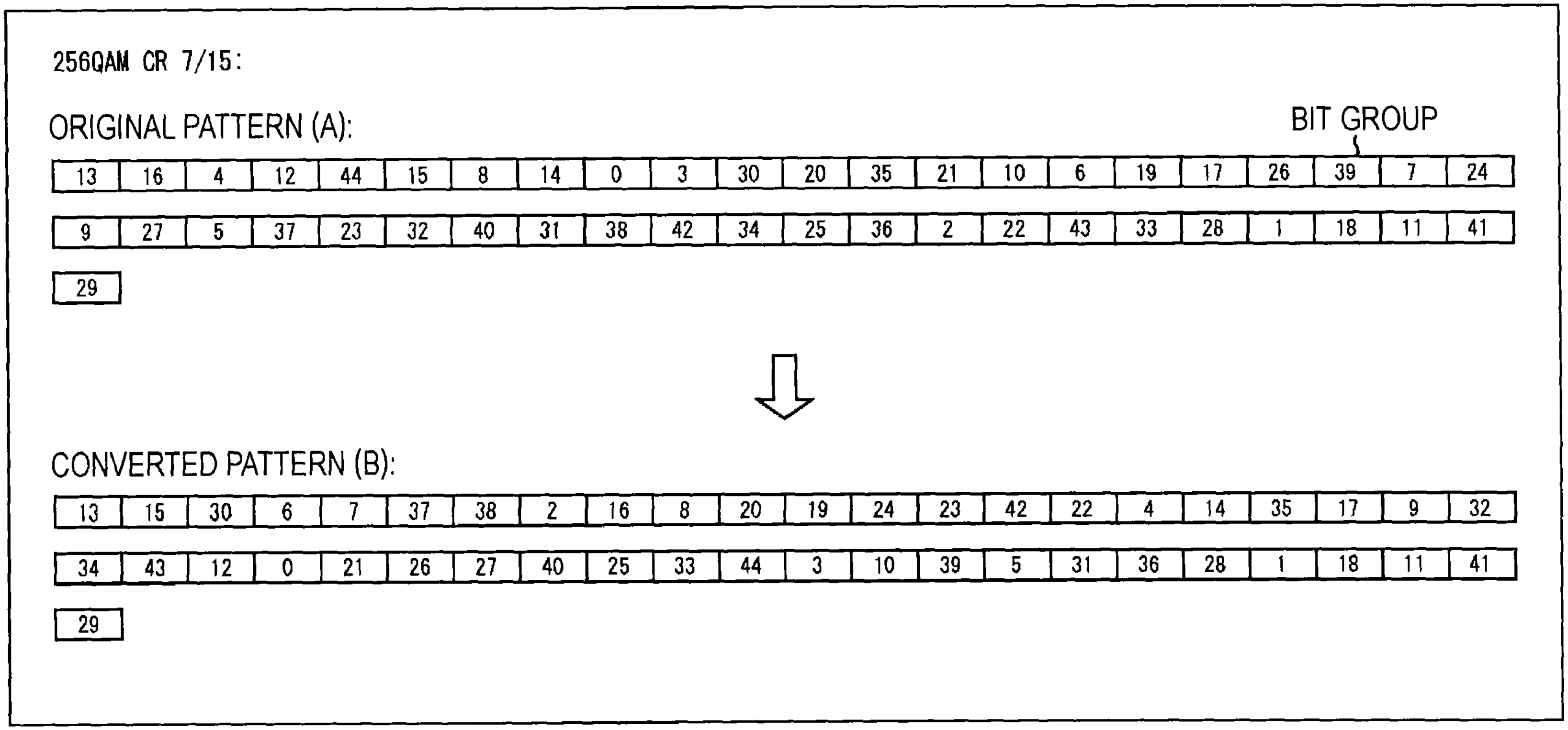
Figure 347:
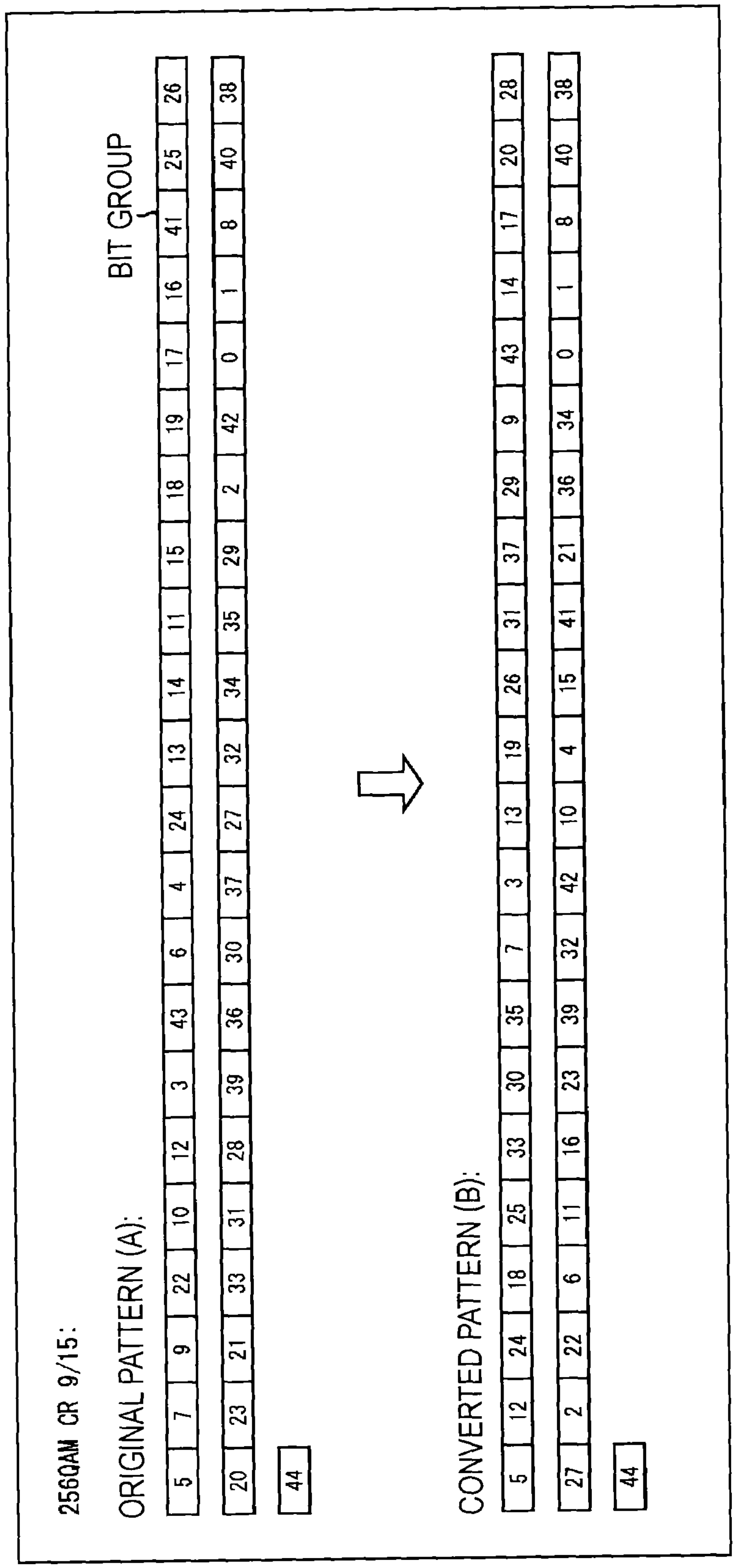
Figure 348:
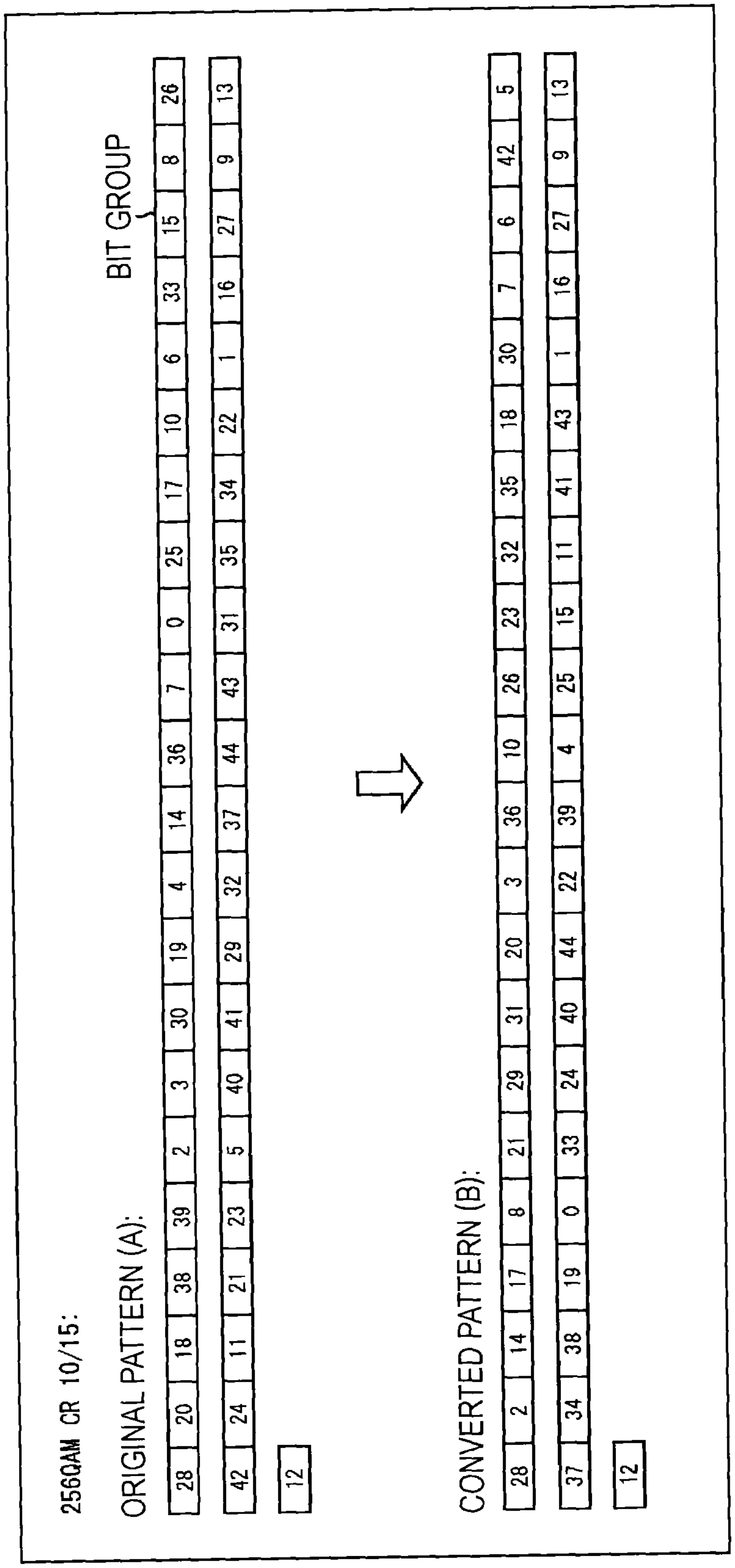
Figure 350:
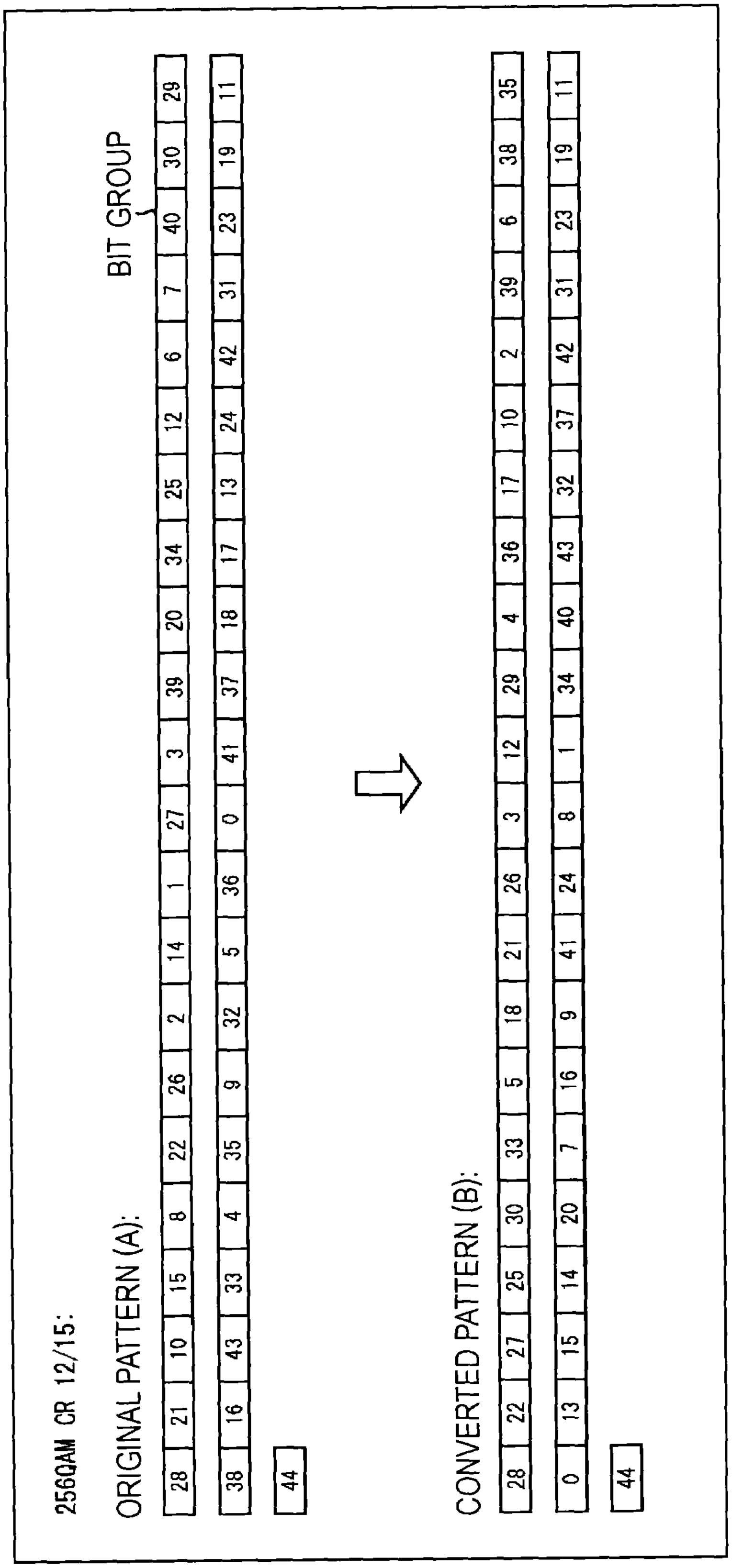
Figure 351:
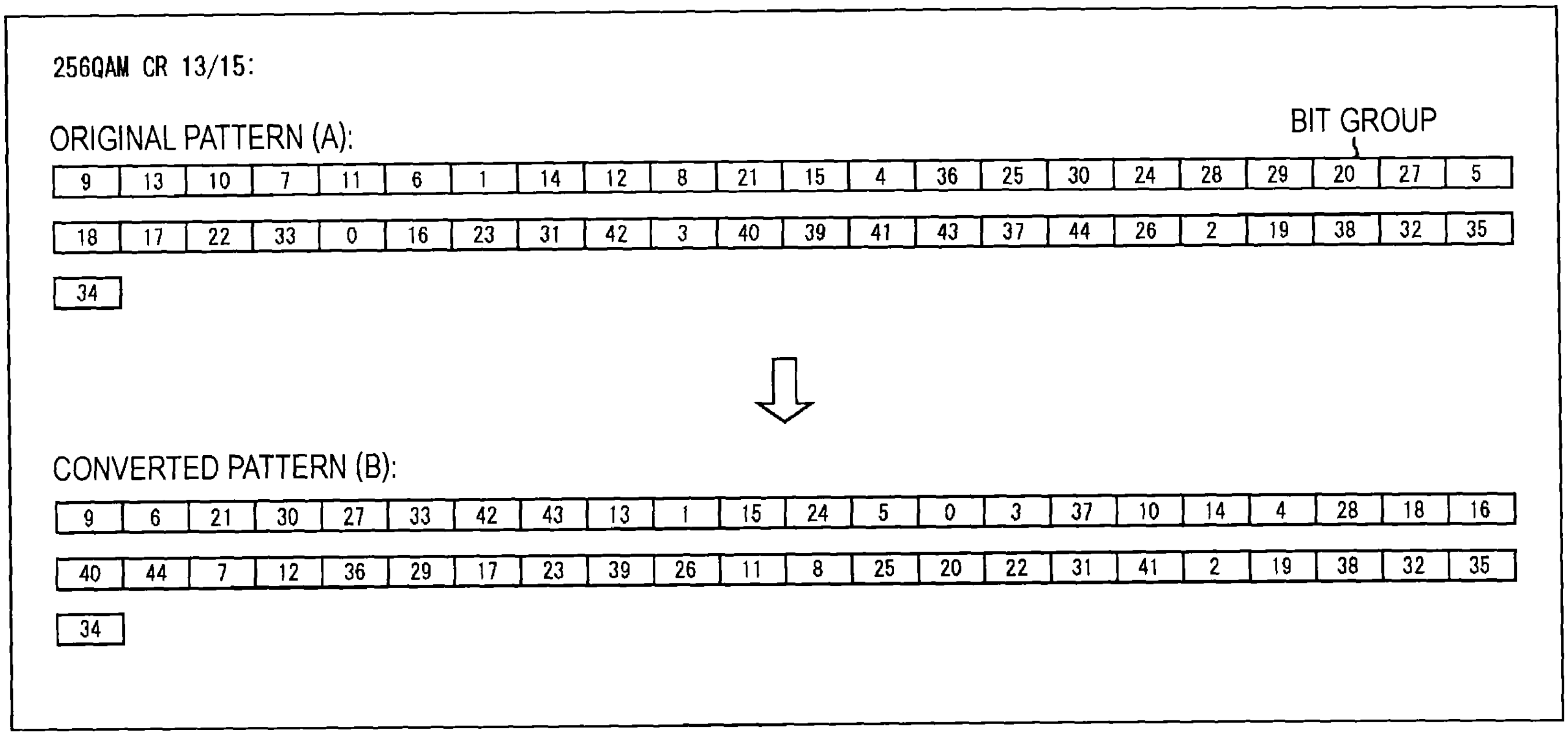
Figure 358:
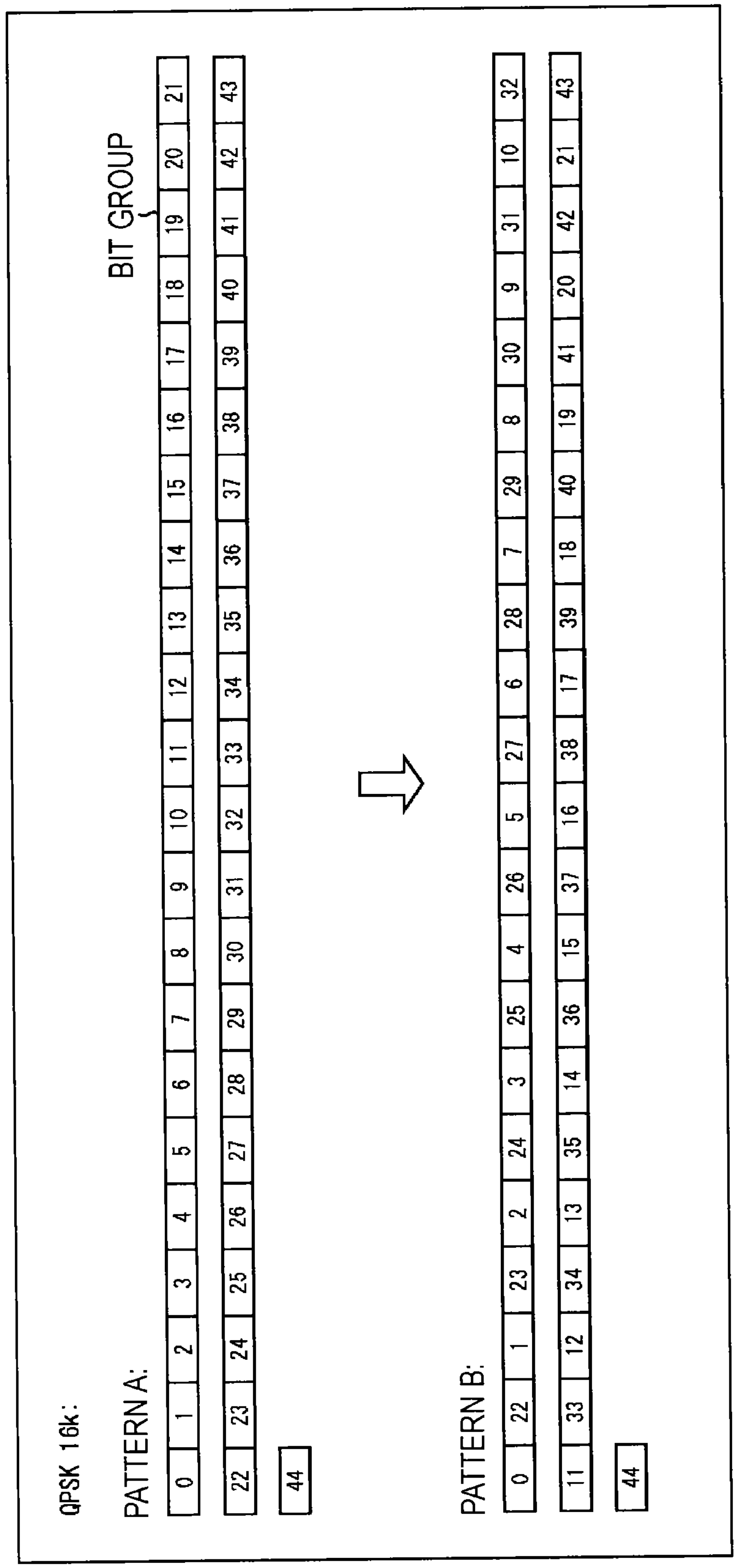
Figure 359:
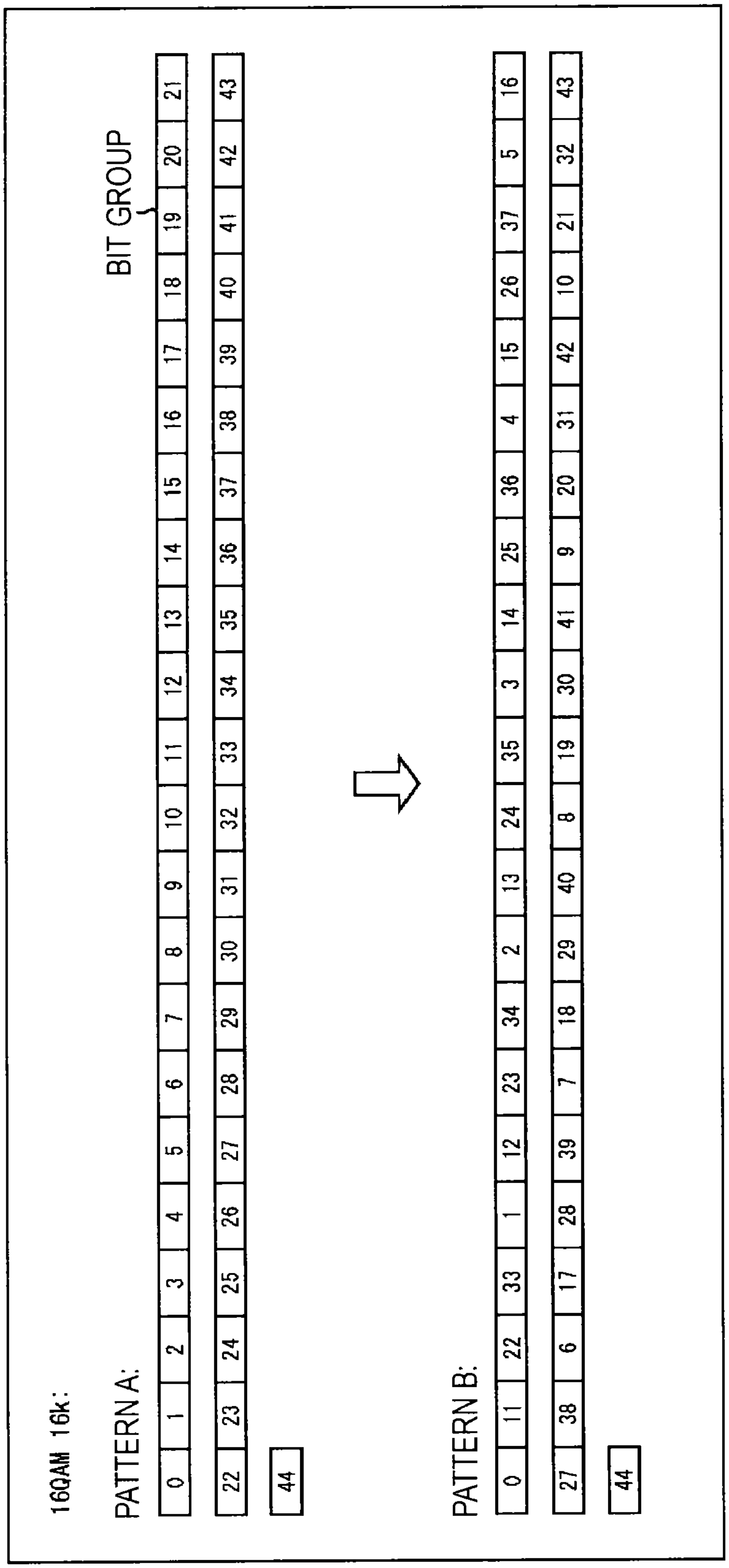
Figure 360:
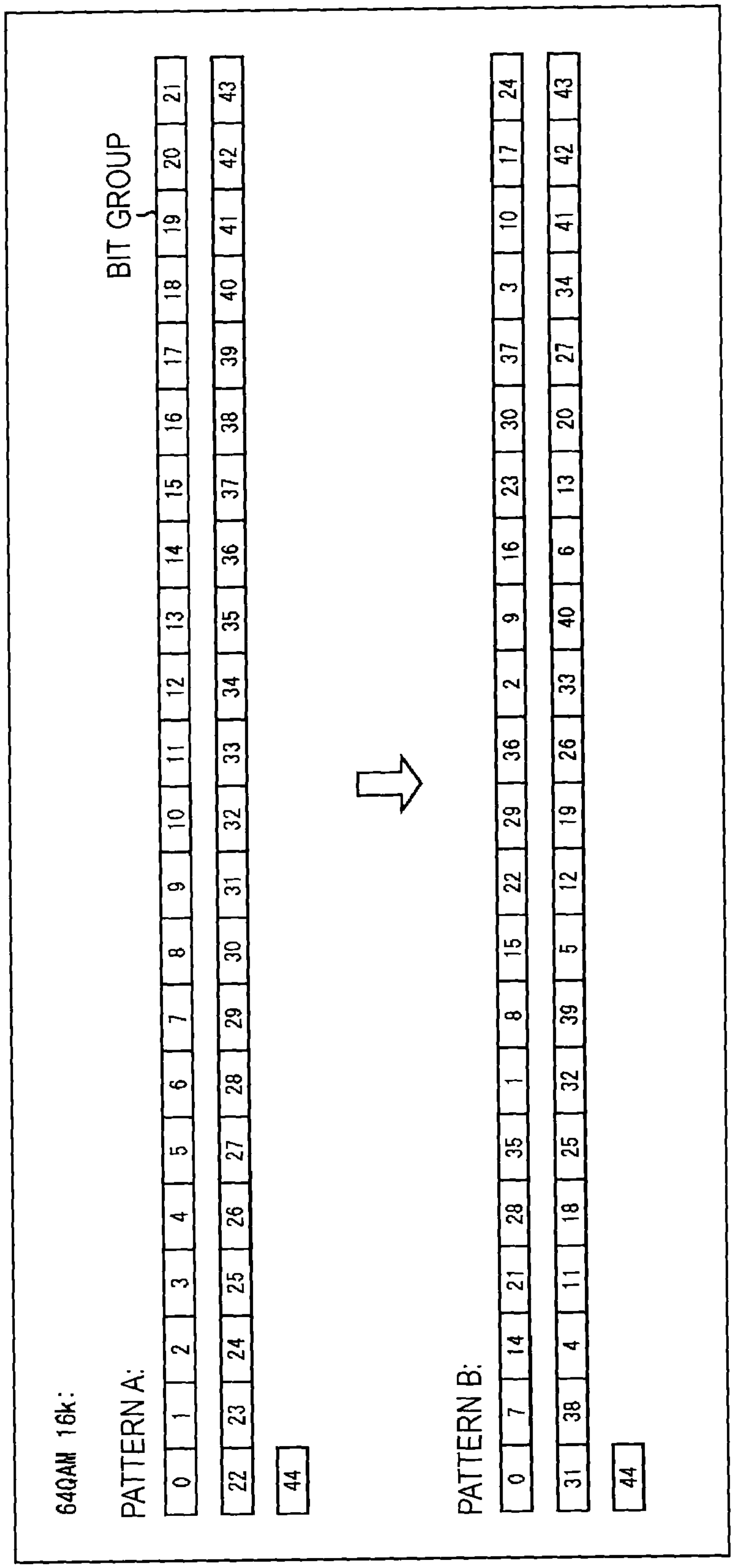
Figure 361:
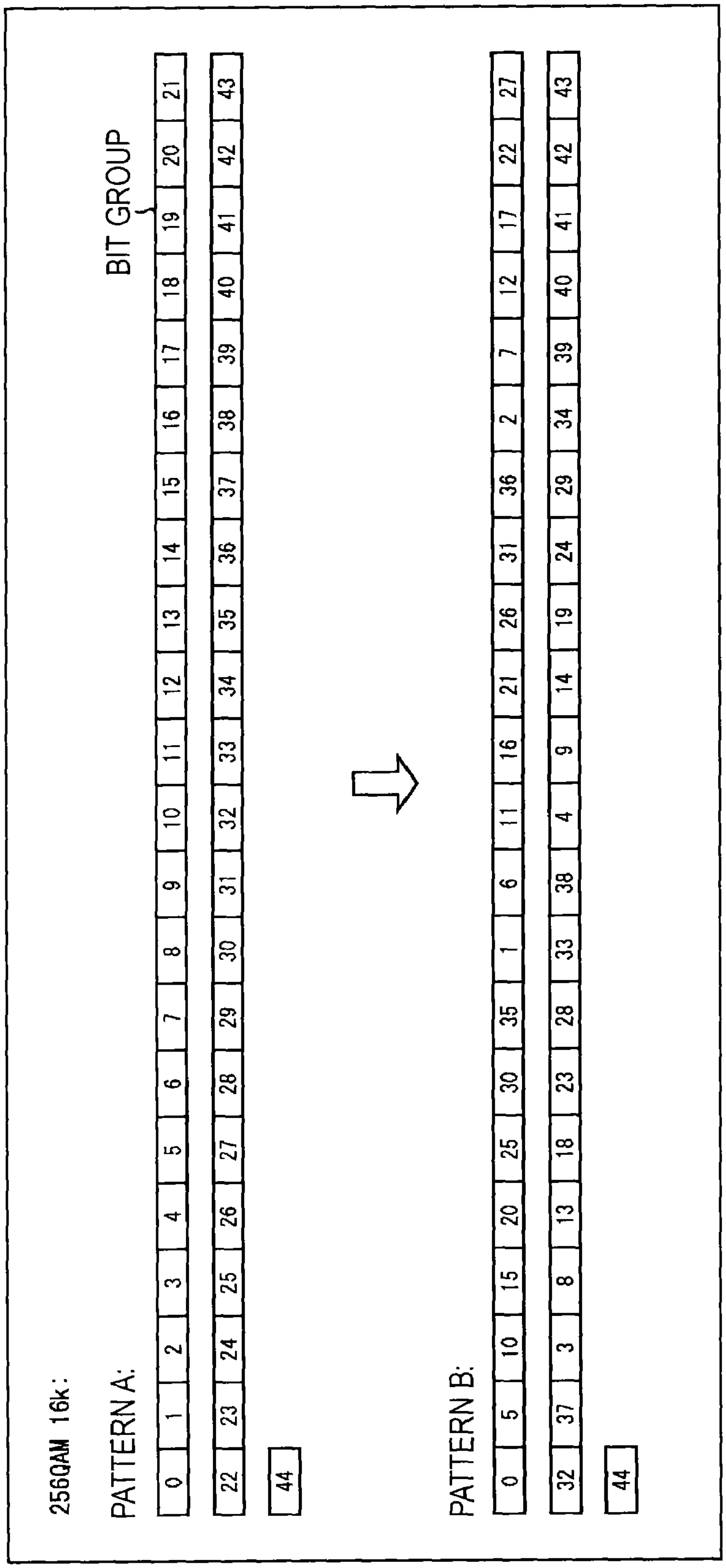
Figure 362:
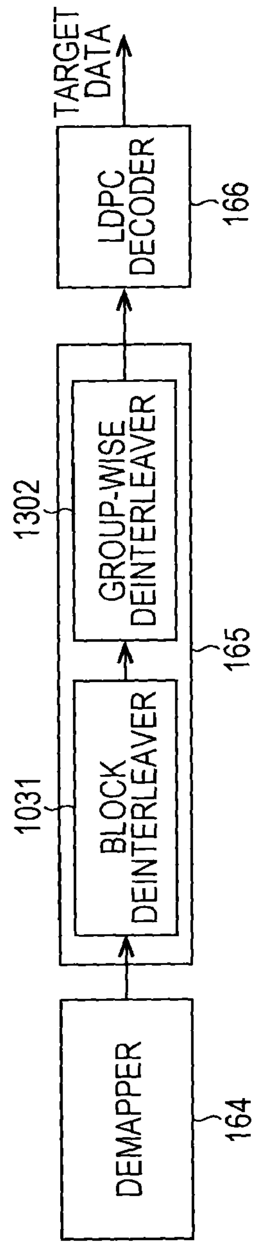
Figure 363:
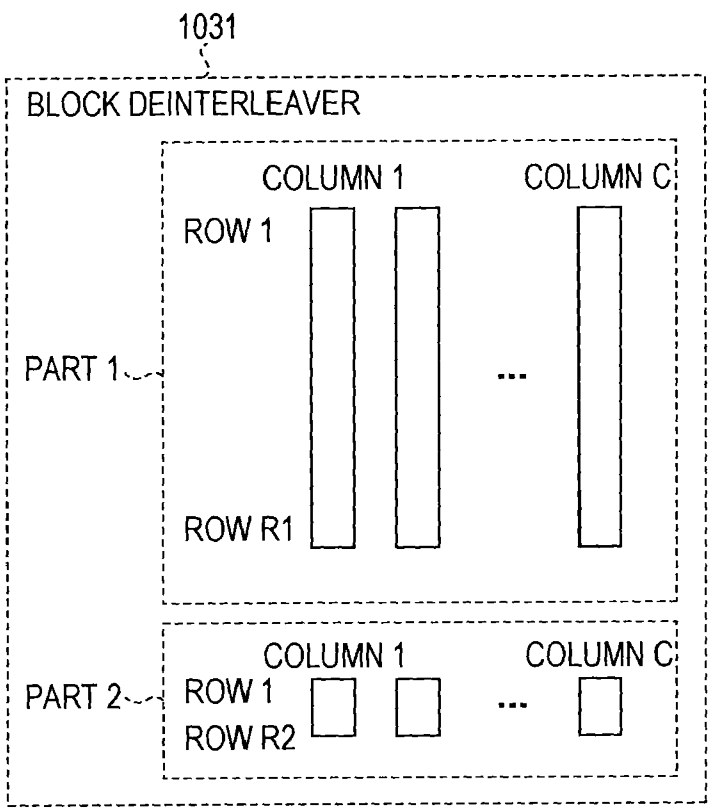
Figure 364:
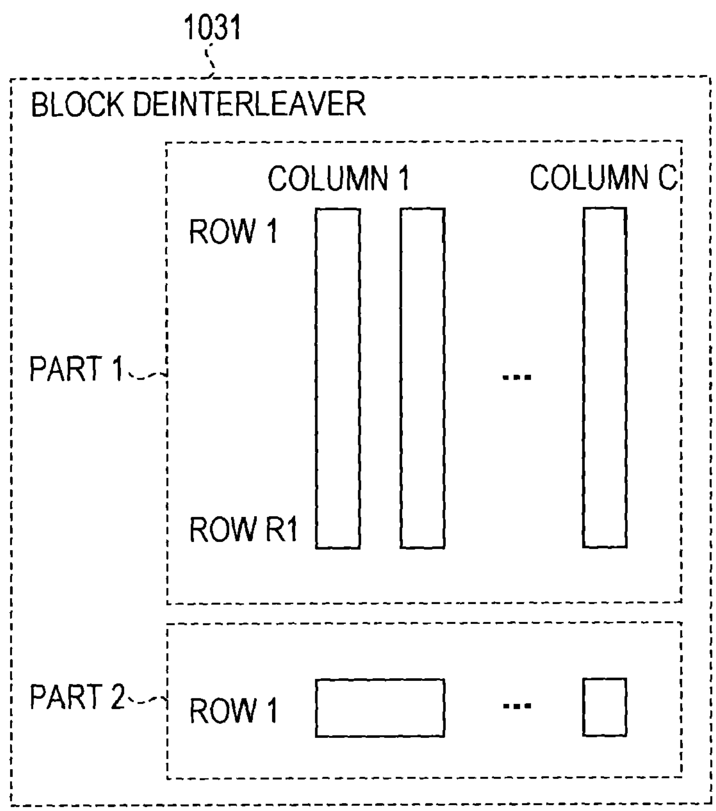
Figure 365:
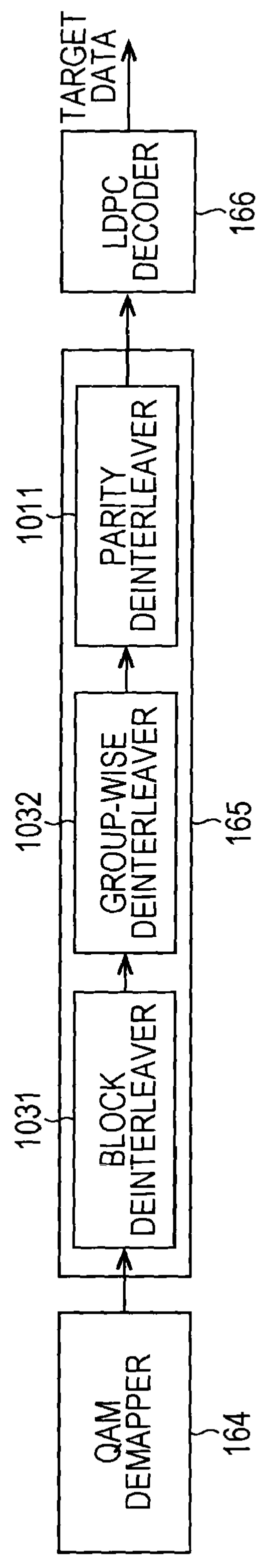
Figure 366:
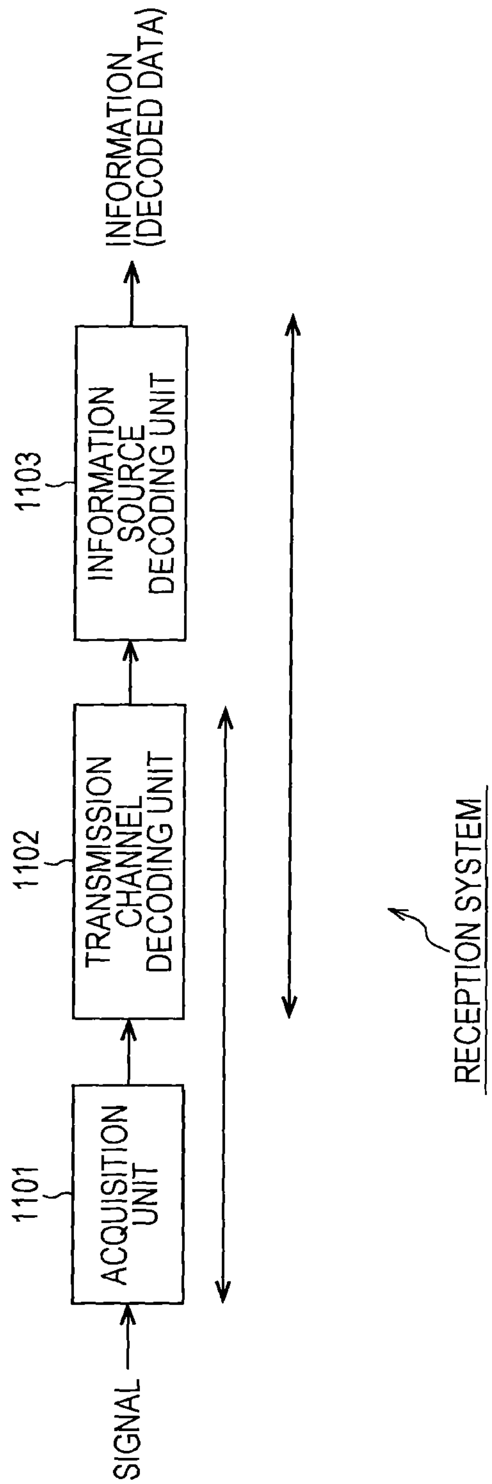
Figure 367:
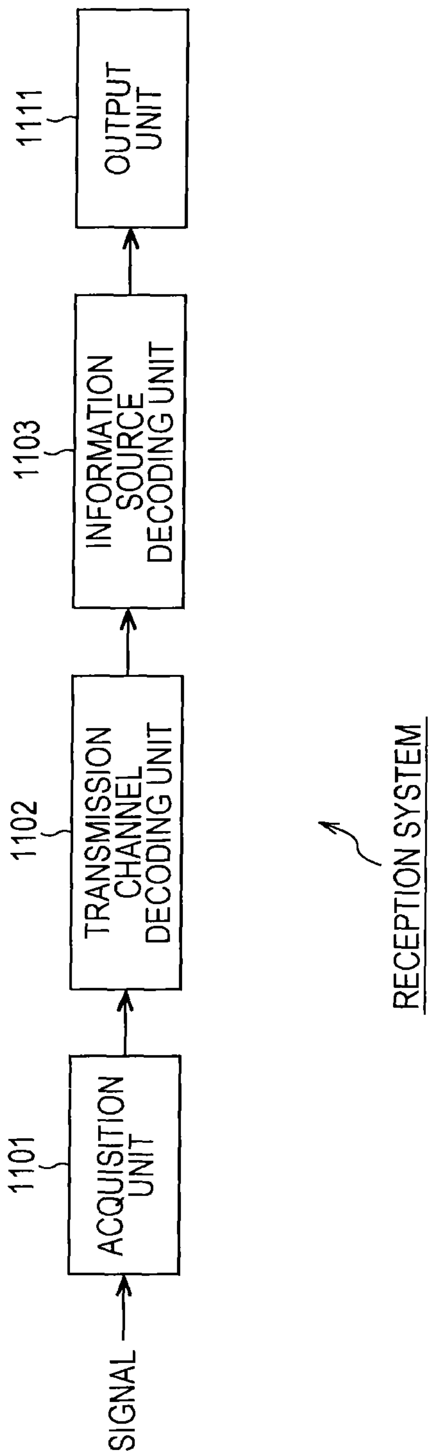
Figure 368:
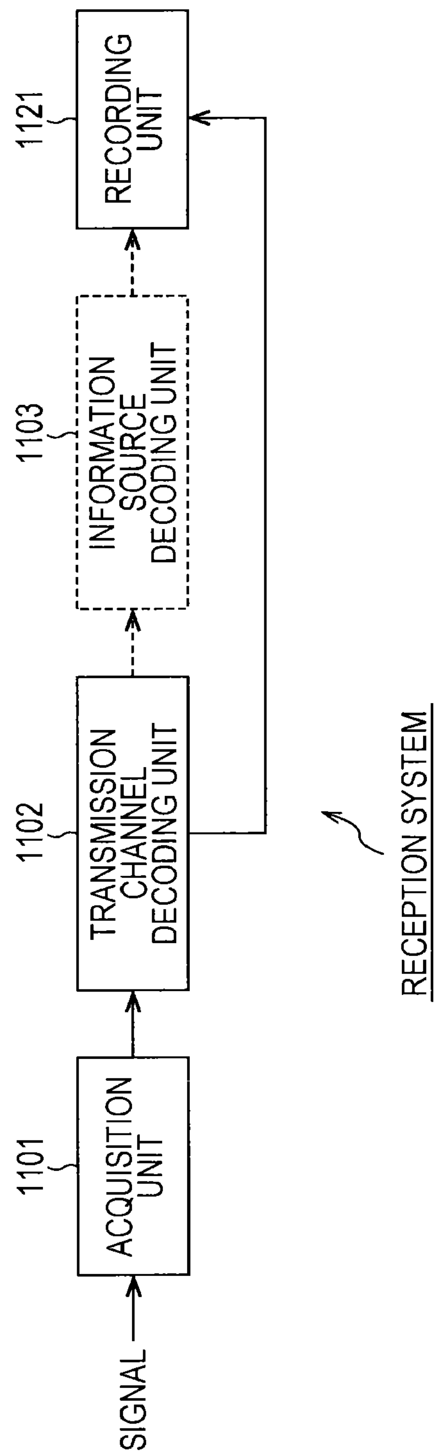
Figure 369:
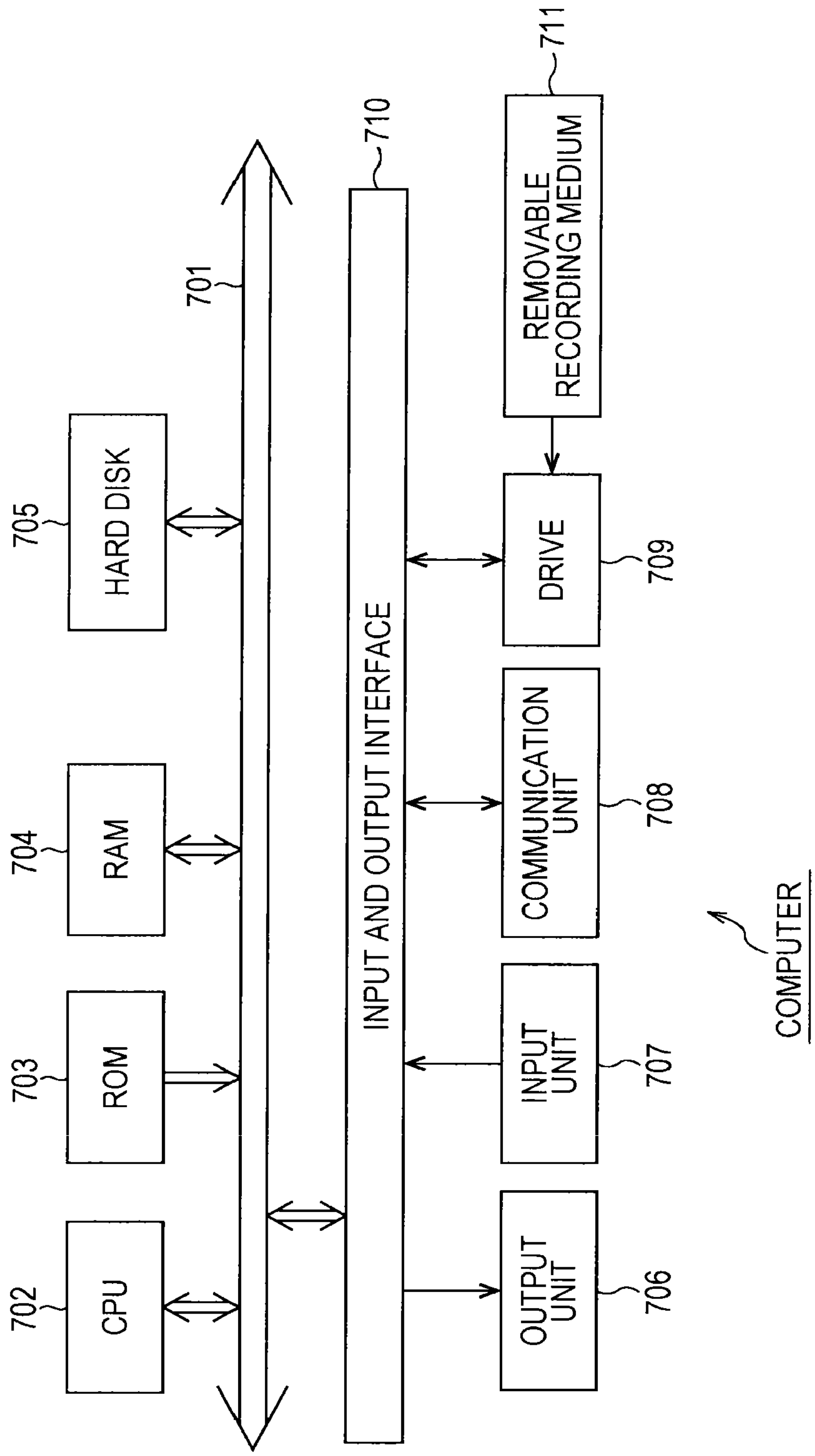

FIG. 133 is a diagram showing a twenty-fifth example of the GW pattern for the LDPC code having the code length of 64 k bits;

FIG. 134 is a diagram showing a twenty-sixth example of the GW pattern for the LDPC code having the code length of 64 k bits;

FIG. 135 is a diagram showing a twenty-seventh example of the GW pattern for the LDPC code having the code length of 64 k bits;

FIG. 136 is a diagram showing a twenty-eighth example of the GW pattern for the LDPC code having the code length of 64 k bits;

FIG. 137 is a diagram showing a twenty-ninth example of the GW pattern for the LDPC code having the code length of 64 k bits;

FIG. 138 is a diagram showing a thirtieth example of the GW pattern for the LDPC code having the code length of 64 k bits;

FIG. 139 is a diagram showing a thirty-first example of the GW pattern for the LDPC code having the code length of 64 k bits;

FIG. 140 is a diagram showing a thirty-second example of the GW pattern for the LDPC code having the code length of 64 k bits;

FIG. 141 is a diagram showing a thirty-third example of the GW pattern for the LDPC code having the code length of 64 k bits;

FIG. 142 is a diagram showing a first example of a GW pattern for an LDPC code having a code length of 16 k bits;

FIG. 143 is a diagram showing a second example of the GW pattern for the LDPC code having the code length of 16 k bits;

FIG. 144 is a diagram showing a third example of the GW pattern for the LDPC code having the code length of 16 k bits;

FIG. 145 is a diagram showing a fourth example of the GW pattern for the LDPC code having the code length of 16 k bits;

FIG. 146 is a diagram showing a fifth example of the GW pattern for the LDPC code having the code length of 16 k bits;

FIG. 147 is a diagram showing a sixth example of the GW pattern for the LDPC code having the code length of 16 k bits;

FIG. 148 is a diagram showing a seventh example of the GW pattern for the LDPC code having the code length of 16 k bits;

FIG. 149 is a diagram showing an eighth example of the GW pattern for the LDPC code having the code length of 16 k bits;

FIG. 150 is a diagram showing a ninth example of the GW pattern for the LDPC code having the code length of 16 k bits;

FIG. 151 is a diagram showing a tenth example of the GW pattern for the LDPC code having the code length of 16 k bits;

FIG. 152 is a diagram showing an eleventh example of the GW pattern for the LDPC code having the code length of 16 k bits;

FIG. 153 is a diagram showing a twelfth example of the GW pattern for the LDPC code having the code length of 16 k bits;

FIG. 154 is a diagram showing a thirteenth example of the GW pattern for the LDPC code having the code length of 16 k bits;

FIG. 155 is a diagram showing a fourteenth example of the GW pattern for the LDPC code having the code length of 16 k bits;

FIG. 156 is a diagram showing a fifteenth example of the GW pattern for the LDPC code having the code length of 16 k bits;

FIG. 157 is a diagram showing a sixteenth example of the GW pattern for the LDPC code having the code length of 16 k bits;

FIG. 158 is a diagram showing a simulation result of a simulation that measures an error rate;

FIG. 159 is a diagram showing a simulation result of a simulation that measures an error rate;

FIG. 160 is a diagram showing a simulation result of a simulation that measures an error rate;

FIG. 161 is a diagram showing a simulation result of a simulation that measures an error rate;

FIG. 162 is a diagram showing a simulation result of a simulation that measures an error rate;

FIG. 163 is a diagram showing a simulation result of a simulation that measures an error rate;

FIG. 164 is a diagram showing a simulation result of a simulation that measures an error rate;

FIG. 165 is a diagram showing a simulation result of a simulation that measures an error rate;

FIG. 166 is a diagram showing a simulation result of a simulation that measures an error rate;

FIG. 167 is a diagram showing a simulation result of a simulation that measures an error rate;

FIG. 168 is a diagram showing a simulation result of a simulation that measures an error rate;

FIG. 169 is a diagram showing a simulation result of a simulation that measures an error rate;

FIG. 170 is a diagram showing a simulation result of a simulation that measures an error rate;

FIG. 171 is a diagram showing a simulation result of a simulation that measures an error rate;

FIG. 172 is a diagram showing a simulation result of a simulation that measures an error rate;

FIG. 173 is a diagram showing a simulation result of a simulation that measures an error rate;

FIG. 174 is a diagram showing a simulation result of a simulation that measures an error rate;

FIG. 175 is a diagram showing a simulation result of a simulation that measures an error rate;

FIG. 176 is a diagram showing a simulation result of a simulation that measures an error rate;

FIG. 177 is a diagram showing a simulation result of a simulation that measures an error rate;

FIG. 178 is a diagram showing a simulation result of a simulation that measures an error rate;

FIG. 179 is a diagram showing a simulation result of a simulation that measures an error rate;

FIG. 180 is a diagram showing a simulation result of a simulation that measures an error rate;

FIG. 181 is a diagram showing a simulation result of a simulation that measures an error rate;

FIG. 182 is a diagram showing a simulation result of a simulation that measures an error rate;

FIG. 183 is a diagram showing a simulation result of a simulation that measures an error rate;

FIG. 184 is a diagram showing a simulation result of a simulation that measures an error rate;

FIG. 185 is a diagram showing a simulation result of a simulation that measures an error rate;

FIG. 186 is a diagram showing a simulation result of a simulation that measures an error rate;

FIG. 187 is a diagram showing a simulation result of a simulation that measures an error rate;

FIG. 188 is a diagram showing a simulation result of a simulation that measures an error rate;

FIG. 189 is a diagram showing a simulation result of a simulation that measures an error rate;

FIG. 190 is a diagram showing a simulation result of a simulation that measures an error rate;

FIG. 191 is a diagram showing a simulation result of a simulation that measures an error rate;

FIG. 192 is a diagram showing a simulation result of a simulation that measures an error rate;

FIG. 193 is a diagram showing a simulation result of a simulation that measures an error rate;

FIG. 194 is a diagram showing a simulation result of a simulation that measures an error rate;

FIG. 195 is a diagram showing a simulation result of a simulation that measures an error rate;

FIG. 196 is a diagram showing a simulation result of a simulation that measures an error rate;

FIG. 197 is a diagram showing a simulation result of a simulation that measures an error rate;

FIG. 198 is a diagram showing a simulation result of a simulation that measures an error rate;

FIG. 199 is a diagram showing a simulation result of a simulation that measures an error rate;

FIG. 200 is a diagram showing a simulation result of a simulation that measures an error rate;

FIG. 201 is a diagram showing a simulation result of a simulation that measures an error rate;

FIG. 202 is a diagram showing a simulation result of a simulation that measures an error rate;

FIG. 203 is a diagram showing a simulation result of a simulation that measures an error rate;

FIG. 204 is a diagram showing a simulation result of a simulation that measures an error rate;

FIG. 205 is a diagram showing a simulation result of a simulation that measures an error rate;

FIG. 206 is a diagram showing a simulation result of a simulation that measures an error rate;

FIG. 207 is a block diagram showing a configuration example of the reception apparatus;

FIG. 208 is a block diagram showing a configuration example of a bit deinterleaver;

FIG. 209 is a flowchart for describing an example of the process performed by a demapper, the bit deinterleaver and an LDPC decoder;

FIG. 210 is a diagram showing an example of a parity check matrix of the LDPC code;

FIG. 211 is a diagram showing an example of a matrix (transformation check matrix) obtained by performing row permutation and column permutation on the parity check matrix;

FIG. 212 is a diagram showing an example of the transformation check matrix divided into a unit of a 5×5 matrix;

FIG. 213 is a block diagram showing a configuration example of a decoding device that performs node calculation P times all at once;

FIG. 214 is a block diagram showing a configuration example of the LDPC decoder;

FIG. 215 is a block diagram showing a configuration example of a block deinterleaver;

FIG. 216 is a block diagram showing another configuration example of the bit deinterleaver;

FIG. 217 is a block diagram showing a configuration example of the bit interleaver;

FIG. 218 is a block diagram showing a configuration example of a block interleaver corresponding to block interleaving of a type A;

FIG. 219 is a diagram showing the number of columns of parts for combinations of code lengths and modulation schemes and part column lengths;

FIGS. 220A and 220B are diagrams for describing block interleaving performed in the block interleaver corresponding to the block interleaving of the type A;

FIG. 221 is a diagram for describing group-wise interleaving performed in a group-wise interleaver;

FIG. 222 is a diagram for describing a specific example (case 1) of the block interleaving of the type A;

FIG. 223 is a diagram for describing a specific example (case 2) of the block interleaving of the type A;

FIG. 224 is a block diagram showing a configuration example of the block interleaver corresponding to block interleaving of a type B;

FIGS. 225A and 225B are diagrams for describing block interleaving performed in the block interleaver corresponding to the block interleaving of the type B;

FIG. 226 is a diagram for describing a specific example (case 1) of the block interleaving of the type B;

FIG. 227 is a diagram for describing a specific example (case 2) of the block interleaving of the type B;

FIG. 228 a diagram for describing a specific conversion example (case 1) of the GW pattern performed in the group-wise interleaver;

FIG. 229 is a diagram for describing a specific conversion example (case 2) of the GW pattern performed in the group-wise interleaver;

FIG. 230 shows an example of the GW pattern set to a MODCOD which is the combination of the LDPC code of 64 k bits and the modulation scheme;

FIG. 231 is a diagram showing an example of the GW pattern for the LDPC code of 64 k bits when the modulation scheme is QPSK and the code rate is 2/15;

FIG. 232 is a diagram showing an example of the GW pattern for the LDPC code of 64 k bits when the modulation scheme is QPSK and the code rate is 3/15;

FIG. 233 is a diagram showing an example of the GW pattern for the LDPC code of 64 k bits when the modulation scheme is QPSK and the code rate is 4/15;

FIG. 234 is a diagram showing an example of the GW pattern for the LDPC code of 64 k bits when the modulation scheme is QPSK and the code rate is 5/15;

FIG. 235 is a diagram showing an example of the GW pattern for the LDPC code of 64 k bits when the modulation scheme is QPSK and the code rate is 6/15;

FIG. 236 is a diagram showing an example of the GW pattern for the LDPC code of 64 k bits when the modulation scheme is QPSK and the code rate is 7/15;

FIG. 237 is a diagram showing an example of the GW pattern for the LDPC code of 64 k bits when the modulation scheme is QPSK and the code rate is 8/15;

FIG. 238 is a diagram showing an example of the GW pattern for the LDPC code of 64 k bits when the modulation scheme is QPSK and the code rate is 9/15;

FIG. 239 is a diagram showing an example of the GW pattern for the LDPC code of 64 k bits when the modulation scheme is QPSK and the code rate is 10/15;

FIG. 240 is a diagram showing an example of the GW pattern for the LDPC code of 64 k bits when the modulation scheme is QPSK and the code rate is 11/15;

FIG. 241 is a diagram showing an example of the GW pattern for the LDPC code of 64 k bits when the modulation scheme is QPSK and the code rate is 12/15;

FIG. 242 is a diagram showing an example of the GW pattern for the LDPC code of 64 k bits when the modulation scheme is QPSK and the code rate is 13/15;

FIG. 243 is a diagram showing an example of the GW pattern for the LDPC code of 64 k bits when the modulation scheme is 16-QAM and the code rate is 2/15;

FIG. 244 is a diagram showing an example of the GW pattern for the LDPC code of 64 k bits when the modulation scheme is 16-QAM and the code rate is 3/15;

FIG. 245 is a diagram showing an example of the GW pattern for the LDPC code of 64 k bits when the modulation scheme is 16-QAM and the code rate is 4/15;

FIG. 246 is a diagram showing an example of the GW pattern for the LDPC code of 64 k bits when the modulation scheme is 16-QAM and the code rate is 5/15;

FIG. 247 is a diagram showing an example of the GW pattern for the LDPC code of 64 k bits when the modulation scheme is 16-QAM and the code rate is 6/15;

FIG. 248 is a diagram showing an example of the GW pattern for the LDPC code of 64 k bits when the modulation scheme is 16-QAM and the code rate is 7/15;

FIG. 249 is a diagram showing an example of the GW pattern for the LDPC code of 64 k bits when the modulation scheme is 16-QAM and the code rate is 8/15;

FIG. 250 is a diagram showing an example of the GW pattern for the LDPC code of 64 k bits when the modulation scheme is 16-QAM and the code rate is 9/15;

FIG. 251 is a diagram showing an example of the GW pattern for the LDPC code of 64 k bits when the modulation scheme is 16-QAM and the code rate is 10/15;

FIG. 252 is a diagram showing an example of the GW pattern for the LDPC code of 64 k bits when the modulation scheme is 16-QAM and the code rate is 11/15;

FIG. 253 is a diagram showing an example of the GW pattern for the LDPC code of 64 k bits when the modulation scheme is 16-QAM and the code rate is 12/15;

FIG. 254 is a diagram showing an example of the GW pattern for the LDPC code of 64 k bits when the modulation scheme is 16-QAM and the code rate is 13/15;

FIG. 255 is a diagram showing an example of the GW pattern for the LDPC code of 64 k bits when the modulation scheme is 64-QAM and the code rate is 2/15;

FIG. 256 is a diagram showing an example of the GW pattern for the LDPC code of 64 k bits when the modulation scheme is 64-QAM and the code rate is 3/15;

FIG. 257 is a diagram showing an example of the GW pattern for the LDPC code of 64 k bits when the modulation scheme is 64-QAM and the code rate is 4/15;

FIG. 258 is a diagram showing an example of the GW pattern for the LDPC code of 64 k bits when the modulation scheme is 64-QAM and the code rate is 5/15;

FIG. 259 is a diagram showing an example of the GW pattern for the LDPC code of 64 k bits when the modulation scheme is 64-QAM and the code rate is 6/15;

FIG. 260 is a diagram showing an example of the GW pattern for the LDPC code of 64 k bits when the modulation scheme is 64-QAM and the code rate is 7/15;

FIG. 261 is a diagram showing an example of the GW pattern for the LDPC code of 64 k bits when the modulation scheme is 64-QAM and the code rate is 8/15;

FIG. 262 is a diagram showing an example of the GW pattern for the LDPC code of 64 k bits when the modulation scheme is 64-QAM and the code rate is 9/15;

FIG. 263 is a diagram showing an example of the GW pattern for the LDPC code of 64 k bits when the modulation scheme is 64-QAM and the code rate is 10/15;

FIG. 264 is a diagram showing an example of the GW pattern for the LDPC code of 64 k bits when the modulation scheme is 64-QAM and the code rate is 11/15;

FIG. 265 is a diagram showing an example of the GW pattern for the LDPC code of 64 k bits when the modulation scheme is 64-QAM and the code rate is 12/15;

FIG. 266 is a diagram showing an example of the GW pattern for the LDPC code of 64 k bits when the modulation scheme is 64-QAM and the code rate is 13/15;

FIG. 267 is a diagram showing an example of the GW pattern for the LDPC code of 64 k bits when the modulation scheme is 256-QAM and the code rate is 2/15;

FIG. 268 is a diagram showing an example of the GW pattern for the LDPC code of 64 k bits when the modulation scheme is 256-QAM and the code rate is 3/15;

FIG. 269 is a diagram showing an example of the GW pattern for the LDPC code of 64 k bits when the modulation scheme is 256-QAM and the code rate is 4/15;

FIG. 270 is a diagram showing an example of the GW pattern for the LDPC code of 64 k bits when the modulation scheme is 256-QAM and the code rate is 5/15;

FIG. 271 is a diagram showing an example of the GW pattern for the LDPC code of 64 k bits when the modulation scheme is 256-QAM and the code rate is 6/15;

FIG. 272 is a diagram showing an example of the GW pattern for the LDPC code of 64 k bits when the modulation scheme is 256-QAM and the code rate is 7/15;

FIG. 273 is a diagram showing an example of the GW pattern for the LDPC code of 64 k bits when the modulation scheme is 256-QAM and the code rate is 8/15;

FIG. 274 is a diagram showing an example of the GW pattern for the LDPC code of 64 k bits when the modulation scheme is 256-QAM and the code rate is 9/15;

FIG. 275 is a diagram showing an example of the GW pattern for the LDPC code of 64 k bits when the modulation scheme is 256-QAM and the code rate is 10/15;

FIG. 276 is a diagram showing an example of the GW pattern for the LDPC code of 64 k bits when the modulation scheme is 256-QAM and the code rate is 11/15;

FIG. 277 is a diagram showing an example of the GW pattern for the LDPC code of 64 k bits when the modulation scheme is 256-QAM and the code rate is 12/15;

FIG. 278 is a diagram showing an example of the GW pattern for the LDPC code of 64 k bits when the modulation scheme is 256-QAM and the code rate is 13/15;

FIG. 279 is a diagram showing an example of the GW pattern for the LDPC code of 64 k bits when the modulation scheme is 1024-QAM and the code rate is 2/15;

FIG. 280 is a diagram showing an example of the GW pattern for the LDPC code of 64 k bits when the modulation scheme is 1024-QAM and the code rate is 3/15;

FIG. 281 is a diagram showing an example of the GW pattern for the LDPC code of 64 k bits when the modulation scheme is 1024-QAM and the code rate is 4/15;

FIG. 282 is a diagram showing an example of the GW pattern for the LDPC code of 64 k bits when the modulation scheme is 1024-QAM and the code rate is 5/15;

FIG. 283 is a diagram showing an example of the GW pattern for the LDPC code of 64 k bits when the modulation scheme is 1024-QAM and the code rate is 6/15;

FIG. 284 is a diagram showing an example of the GW pattern for the LDPC code of 64 k bits when the modulation scheme is 1024-QAM and the code rate is 7/15;

FIG. 285 is a diagram showing an example of the GW pattern for the LDPC code of 64 k bits when the modulation scheme is 1024-QAM and the code rate is 8/15;

FIG. 286 is a diagram showing an example of the GW pattern for the LDPC code of 64 k bits when the modulation scheme is 1024-QAM and the code rate is 9/15;

FIG. 287 is a diagram showing an example of the GW pattern for the LDPC code of 64 k bits when the modulation scheme is 1024-QAM and the code rate is 10/15;

FIG. 288 is a diagram showing an example of the GW pattern for the LDPC code of 64 k bits when the modulation scheme is 1024-QAM and the code rate is 11/15;

FIG. 289 is a diagram showing an example of the GW pattern for the LDPC code of 64 k bits when the modulation scheme is 1024-QAM and the code rate is 12/15;

FIG. 290 is a diagram showing an example of the GW pattern for the LDPC code of 64 k bits when the modulation scheme is 1024-QAM and the code rate is 13/15;

FIG. 291 is a diagram showing an example of the GW pattern for the LDPC code of 64 k bits when the modulation scheme is 4096-QAM and the code rate is 2/15;

FIG. 292 is a diagram showing an example of the GW pattern for the LDPC code of 64 k bits when the modulation scheme is 4096-QAM and the code rate is 3/15;

FIG. 293 is a diagram showing an example of the GW pattern for the LDPC code of 64 k bits when the modulation scheme is 4096-QAM and the code rate is 4/15;

FIG. 294 is a diagram showing an example of the GW pattern for the LDPC code of 64 k bits when the modulation scheme is 4096-QAM and the code rate is 5/15;

FIG. 295 is a diagram showing an example of the GW pattern for the LDPC code of 64 k bits when the modulation scheme is 4096-QAM and the code rate is 6/15;

FIG. 296 is a diagram showing an example of the GW pattern for the LDPC code of 64 k bits when the modulation scheme is 4096-QAM and the code rate is 7/15;

FIG. 297 is a diagram showing an example of the GW pattern for the LDPC code of 64 k bits when the modulation scheme is 4096-QAM and the code rate is 8/15;

FIG. 298 is a diagram showing an example of the GW pattern for the LDPC code of 64 k bits when the modulation scheme is 4096-QAM and the code rate is 9/15;

FIG. 299 is a diagram showing an example of the GW pattern for the LDPC code of 64 k bits when the modulation scheme is 4096-QAM and the code rate is 10/15;

FIG. 300 is a diagram showing an example of the GW pattern for the LDPC code of 64 k bits when the modulation scheme is 4096-QAM and the code rate is 11/15;

FIG. 301 is a diagram showing an example of the GW pattern for the LDPC code of 64 k bits when the modulation scheme is 4096-QAM and the code rate is 12/15;

FIG. 302 is a diagram showing an example of the GW pattern for the LDPC code of 64 k bits when the modulation scheme is 4096-QAM and the code rate is 13/15;

FIG. 303 shows an example of the GW pattern set to a MODCOD which is the combination of the modulation scheme and the LDPC code of 16 k bits;

FIG. 304 is a diagram showing an example of the GW pattern for the LDPC code of 16 k bits when the modulation scheme is QPSK and the code rate is 2/15;

FIG. 305 is a diagram showing an example of the GW pattern for the LDPC code of 16 k bits when the modulation scheme is QPSK and the code rate is 3/15;

FIG. 306 is a diagram showing an example of the GW pattern for the LDPC code of 16 k bits when the modulation scheme is QPSK and the code rate is 4/15;

FIG. 307 is a diagram showing an example of the GW pattern for the LDPC code of 16 k bits when the modulation scheme is QPSK and the code rate is 5/15;

FIG. 308 is a diagram showing an example of the GW pattern for the LDPC code of 16 k bits when the modulation scheme is QPSK and the code rate is 6/15;

FIG. 309 is a diagram showing an example of the GW pattern for the LDPC code of 16 k bits when the modulation scheme is QPSK and the code rate is 7/15;

FIG. 310 is a diagram showing an example of the GW pattern for the LDPC code of 16 k bits when the modulation scheme is QPSK and the code rate is 8/15;

FIG. 311 is a diagram showing an example of the GW pattern for the LDPC code of 16 k bits when the modulation scheme is QPSK and the code rate is 9/15;

FIG. 312 is a diagram showing an example of the GW pattern for the LDPC code of 16 k bits when the modulation scheme is QPSK and the code rate is 10/15;

FIG. 313 is a diagram showing an example of the GW pattern for the LDPC code of 16 k bits when the modulation scheme is QPSK and the code rate is 11/15;

FIG. 314 is a diagram showing an example of the GW pattern for the LDPC code of 16 k bits when the modulation scheme is QPSK and the code rate is 12/15;

FIG. 315 is a diagram showing an example of the GW pattern for the LDPC code of 16 k bits when the modulation scheme is QPSK and the code rate is 13/15;

FIG. 316 is a diagram showing an example of the GW pattern for the LDPC code of 16 k bits when the modulation scheme is 16-QAM and the code rate is 2/15;

FIG. 317 is a diagram showing an example of the GW pattern for the LDPC code of 16 k bits when the modulation scheme is 16-QAM and the code rate is 3/15;

FIG. 318 is a diagram showing an example of the GW pattern for the LDPC code of 16 k bits when the modulation scheme is 16-QAM and the code rate is 4/15;

FIG. 319 is a diagram showing an example of the GW pattern for the LDPC code of 16 k bits when the modulation scheme is 16-QAM and the code rate is 5/15;

FIG. 320 is a diagram showing an example of the GW pattern for the LDPC code of 16 k bits when the modulation scheme is 16-QAM and the code rate is 6/15;

FIG. 321 is a diagram showing an example of the GW pattern for the LDPC code of 16 k bits when the modulation scheme is 16-QAM and the code rate is 7/15;

FIG. 322 is a diagram showing an example of the GW pattern for the LDPC code of 16 k bits when the modulation scheme is 16-QAM and the code rate is 8/15;

FIG. 323 is a diagram showing an example of the GW pattern for the LDPC code of 16 k bits when the modulation scheme is 16-QAM and the code rate is 9/15;

FIG. 324 is a diagram showing an example of the GW pattern for the LDPC code of 16 k bits when the modulation scheme is 16-QAM and the code rate is 10/15;

FIG. 325 is a diagram showing an example of the GW pattern for the LDPC code of 16 k bits when the modulation scheme is 16-QAM and the code rate is 11/15;

FIG. 326 is a diagram showing an example of the GW pattern for the LDPC code of 16 k bits when the modulation scheme is 16-QAM and the code rate is 12/15;

FIG. 327 is a diagram showing an example of the GW pattern for the LDPC code of 16 k bits when the modulation scheme is 16-QAM and the code rate is 13/15;

FIG. 328 is a diagram showing an example of the GW pattern for the LDPC code of 16 k bits when the modulation scheme is 64-QAM and the code rate is 2/15;

FIG. 329 is a diagram showing an example of the GW pattern for the LDPC code of 16 k bits when the modulation scheme is 64-QAM and the code rate is 3/15;

FIG. 330 is a diagram showing an example of the GW pattern for the LDPC code of 16 k bits when the modulation scheme is 64-QAM and the code rate is 4/15;

FIG. 331 is a diagram showing an example of the GW pattern for the LDPC code of 16 k bits when the modulation scheme is 64-QAM and the code rate is 5/15;

FIG. 332 is a diagram showing an example of the GW pattern for the LDPC code of 16 k bits when the modulation scheme is 64-QAM and the code rate is 6/15;

FIG. 333 is a diagram showing an example of the GW pattern for the LDPC code of 16 k bits when the modulation scheme is 64-QAM and the code rate is 7/15;

FIG. 334 is a diagram showing an example of the GW pattern for the LDPC code of 16 k bits when the modulation scheme is 64-QAM and the code rate is 8/15;

FIG. 335 is a diagram showing an example of the GW pattern for the LDPC code of 16 k bits when the modulation scheme is 64-QAM and the code rate is 9/15;

FIG. 336 is a diagram showing an example of the GW pattern for the LDPC code of 16 k bits when the modulation scheme is 64-QAM and the code rate is 10/15;

FIG. 337 is a diagram showing an example of the GW pattern for the LDPC code of 16 k bits when the modulation scheme is 64-QAM and the code rate is 11/15;

FIG. 338 is a diagram showing an example of the GW pattern for the LDPC code of 16 k bits when the modulation scheme is 64-QAM and the code rate is 12/15;

FIG. 339 is a diagram showing an example of the GW pattern for the LDPC code of 16 k bits when the modulation scheme is 64-QAM and the code rate is 13/15;

FIG. 340 is a diagram showing an example of the GW pattern for the LDPC code of 16 k bits when the modulation scheme is 256-QAM and the code rate is 2/15;

FIG. 341 is a diagram showing an example of the GW pattern for the LDPC code of 16 k bits when the modulation scheme is 256-QAM and the code rate is 3/15;

FIG. 342 is a diagram showing an example of the GW pattern for the LDPC code of 16 k bits when the modulation scheme is 256-QAM and the code rate is 4/15;

FIG. 343 is a diagram showing an example of the GW pattern for the LDPC code of 16 k bits when the modulation scheme is 256-QAM and the code rate is 5/15;

FIG. 344 is a diagram showing an example of the GW pattern for the LDPC code of 16 k bits when the modulation scheme is 256-QAM and the code rate is 6/15;

FIG. 345 is a diagram showing an example of the GW pattern for the LDPC code of 16 k bits when the modulation scheme is 256-QAM and the code rate is 7/15;

FIG. 346 is a diagram showing an example of the GW pattern for the LDPC code of 16 k bits when the modulation scheme is 256-QAM and the code rate is 8/15;

FIG. 347 is a diagram showing an example of the GW pattern for the LDPC code of 16 k bits when the modulation scheme is 256-QAM and the code rate is 9/15;

FIG. 348 is a diagram showing an example of the GW pattern for the LDPC code of 16 k bits when the modulation scheme is 256-QAM and the code rate is 10/15;

FIG. 349 is a diagram showing an example of the GW pattern for the LDPC code of 16 k bits when the modulation scheme is 256-QAM and the code rate is 11/15;

FIG. 350 is a diagram showing an example of the GW pattern for the LDPC code of 16 k bits when the modulation scheme is 256-QAM and the code rate is 12/15;

FIG. 351 is a diagram showing an example of the GW pattern for the LDPC code of 16 k bits when the modulation scheme is 256-QAM and the code rate is 13/15;

FIG. 352 is a diagram showing the relationship between the GW pattern (A) and the GW pattern (B) for the LDPC code of 64 k bits when the modulation scheme is QPSK;

FIG. 353 is a diagram showing the relationship between the GW pattern (A) and the GW pattern (B) for the LDPC code of 64 k bits when the modulation scheme is 16-QAM;

FIG. 354 is a diagram showing the relationship between the GW pattern (A) and the GW pattern (B) for the LDPC code of 64 k bits when the modulation scheme is 64-QAM;

FIG. 355 is a diagram showing the relationship between the GW pattern (A) and the GW pattern (B) for the LDPC code of 64 k bits when the modulation scheme is 256-QAM;

FIG. 356 is a diagram showing the relationship between the GW pattern (A) and the GW pattern (B) for the LDPC code of 64 k bits when the modulation scheme is 1024-QAM;

FIG. 357 is a diagram showing the relationship between the GW pattern (A) and the GW pattern (B) for the LDPC code of 64 k bits when the modulation scheme is 4096-QAM;

FIG. 358 is a diagram showing the relationship between the GW pattern (A) and the GW pattern (B) for the LDPC code of 16 k bits when the modulation scheme is QPSK;

FIG. 359 is a diagram showing the relationship between the GW pattern (A) and the GW pattern (B) for the LDPC code of 16 k bits when the modulation scheme is 16-QAM;

FIG. 360 is a diagram showing the relationship between the GW pattern (A) and the GW pattern (B) for the LDPC code of 16 k bits when the modulation scheme is 64-QAM;

FIG. 361 is a diagram showing the relationship between the GW pattern (A) and the GW pattern (B) for the LDPC code of 16 k bits when the modulation scheme is 256-QAM;

FIG. 362 is a block diagram showing a configuration example of the bit deinterleaver;

FIG. 363 is a block diagram showing a configuration example of a block deinterleaver corresponding to block deinterleaving of a type A;

FIG. 364 is a block diagram showing a configuration example of the block deinterleaver corresponding to block deinterleaving of a type B;

FIG. 365 is a block diagram showing another configuration example of the bit deinterleaver;

FIG. 366 is a block diagram showing a first configuration example of a reception system to which the reception apparatus can be applied;

FIG. 367 is a block diagram showing a second configuration example of the reception system to which the reception apparatus can be applied;

FIG. 368 is a block diagram showing a third configuration example of the reception system to which the reception apparatus can be applied; and FIG. 369 is a block diagram showing a configuration example of an embodiment of a computer to which the present technology is applied.

DETAILED DESCRIPTION OF EMBODIMENTS

1. First Embodiment

Hereinafter, an embodiment of the present technology will be described, but an LDPC code will be described prior to the description.

LDPC Code

The LDPC code is a linear code, and is not necessarily a two-dimensional code. Here, it will be described that the LDPC code is a two-dimensional code.

The LDPC code has a greatest feature in that a parity check matrix which defines the LDPC code is a sparse matrix. Here, the sparse matrix refers to a matrix (matrix in which most of the elements are zero) in which the number of "1"s which are elements in a matrix is extremely small.

Figure 1:
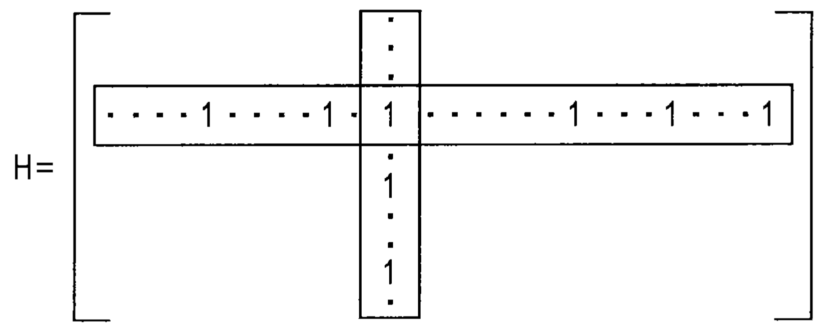
FIG. 1 is a diagram for describing a parity check matrix H of an LDPC code.

FIG. 1 is a diagram showing an example of a parity check matrix H of the LDPC code.

In the parity check matrix H of FIG. 1, a weight of each column (column weight) (the number of "1" s) is "3", and a weight of each row (row weight) is "6".

In the encoding (LDPC encoding) using the LDPC code, for example, a codeword (LDPC code) is generated by generating a generator matrix G based on the parity check matrix H and multiplying two-dimensional information bits by the generator matrix G.

Specifically, an encoding device that performs the LDPC encoding calculates the generator matrix G in which the expression $GH^T=0$ is established between a transposed matrix $H_T$ of the parity check matrix H and the generator matrix. Here, when the generator matrix G is a K×N matrix, the encoding device generates an N-bit codeword c (=uG) by multiplying by the generator matrix G by a K-bit string (vector u) of the information bits. The codeword (LDPC code) generated by the encoding device is received by a reception side through a predetermined communication channel.

The LDPC code can be decoded by a message passing algorithm which is called probabilistic decoding suggested by Gallager and uses belief propagation on a so-called Tanner graph which includes a variable node (referred to as a message node) and a check node. Hereinafter, appropriately, the variable node and the check node are simply referred to as a node.

Figure 2:
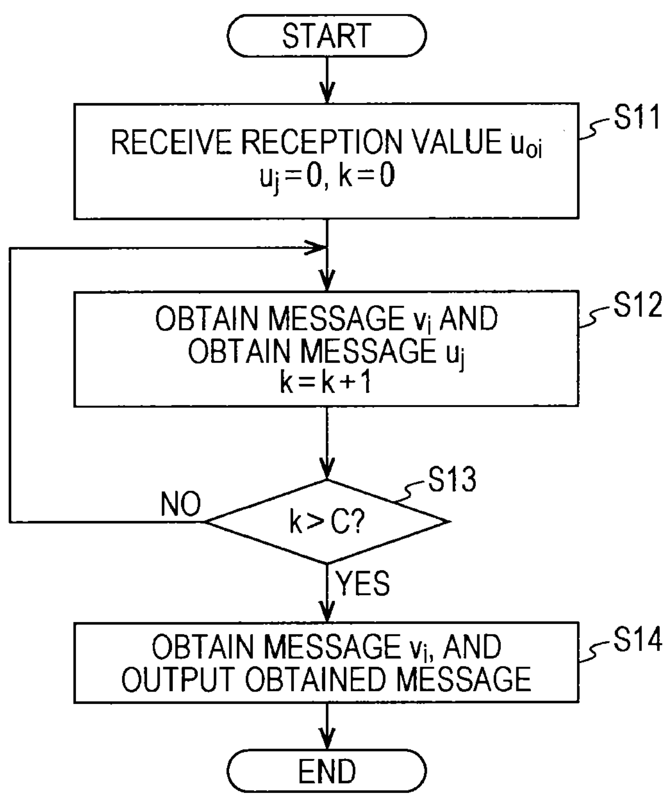
FIG. 2 is a flowchart for describing a decoding procedure of the LDPC code.

FIG. 2 is a flowchart showing a procedure of decoding the LDPC code. Hereinafter, a real number value (reception LLR) obtained by representing the likelihood that the value of an i-th code bit of the LDPC code (one codeword) received by the reception side will be "0" using a log-likelihood ratio is appropriately referred to as a reception value $u_{0i}$. A message output from the check node is represented as $u_j$, and a message output from the variable node is represented as $v_i$.

As shown in FIG. 2, in the decoding of the LDPC code, in step S11, after the LDPC code is received, the message (check node message) $u_j$ is initialized by setting its value to "0", a variable k expressed as an integer as a counter of an iteration process is initialized by setting its value to "0", and the procedure proceeds to step S12. In step S12, the message (variable node message) $v_i$ is obtained by performing a calculation (variable node calculation) represented by Expression (1) based on the reception value $u_{0i}$ obtained by receiving the LDPC code, and the message $u_j$ is obtained by performing a calculation (check node calculation) represented by Expression (2) based on the message $v_i$.

$$v_i = u_{0i} + \sum_{j=1}^{d_v-1} u_j \tag{1}$$

$$\tanh\left(\frac{u_j}{2}\right) = \prod_{i=1}^{d_c-1} \tanh\left(\frac{v_i}{2}\right) \tag{2}$$

Where, $d_v$ and $d_c$ in Expression (1) and Expression (2) are respectively parameters, which indicate the number of "1"s in the longitudinal direction (column) and the transverse direction (row) of the parity check matrix H and can be arbitrarily selected. For example, in the case of the LDPC code ((3, 6) LDPC code) for the parity check matrix H shown in FIG. 1 in which the column weight is 3 and the row weight is 6, $d_v=3$, and $d_c=6$.

In the variable node calculation of Expression (1) and the check node calculation of Expression (2), since messages input from edges (lines connecting the variable node and the check node) to respectively output messages are not used as calculation targets, a calculation range is from 1 to $d_v-1$ or from 1 to $d_c-1$. A table of a function $R(v_1, v_2)$ represented by Expression (3) defined by one output for two inputs $v_i$ and $v_2$ is created in advance, and the check node calculation of Expression (2) is performed by continuously (recursively) using the table as shown in Expression (4).

$$x=2\tan h^{-1}\{\tan h(v_1/2)\tan h(v_2/2)\}=R(v_1v_2) \tag{3}$$

$$u_j=R(v_1,R(v_2,R(v_3, \ldots R(V_{d_c-2},V_{d_c1})))) \tag{4}$$

In step S12, the variable k is increased by "1", and the procedure proceeds to step S13. In step S13, it is determined whether or not the variable k is greater than a predetermined iterative decoding number C. In step S13, when it is determined that the variable k is not greater than C, the procedure returns to step S12, and the same process is iterated.

In step S13, when it is determined that the variable k is greater than C, the procedure proceeds to step S14. Thereafter, the message $v_i$ as a decoding result that is ultimately output is obtained by performing a calculation represented by Expression (5), and the obtained message is output. The decoding process of the LDPC code is ended.

$$v_i = u_{0i} + \sum_{j=1}^{d_v} u_j \tag{5}$$

Here, the calculation of Expression (5) is different from the variable node calculation of Expression (1), and is performed using the messages $u_j$ from all edges that are connected to the variable node.

FIG. 3 is a diagram showing an example of the parity check matrix H of the (3, 6) LDPC code (a code rate of 1/2 and a code length of 12).

Similarly to FIG. 1, in the parity check matrix H of FIG. 3, the column weight is 3, and the row weight is 6.

Figure 4:
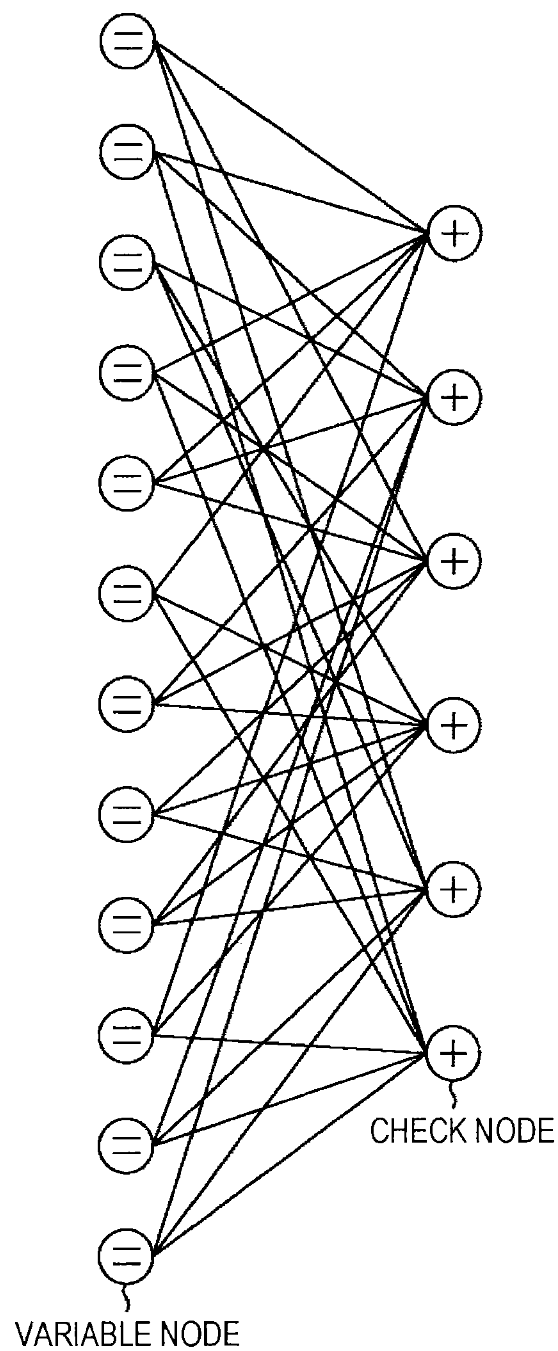
FIG. 4 is a diagram showing an example of a Tanner graph of the parity check matrix.

FIG. 4 is a diagram showing the Tanner graph of the parity check matrix H of FIG. 3.

Here, in FIG. 4, nodes expressed as a plus "+" are check nodes, and nodes expressed as an equal sign "=" are variable nodes. The check nodes and the variable nodes correspond to the rows and columns of the parity check matrix H, respectively. Lines connecting the check nodes and the variable nodes are edges, and correspond to "1"s which are elements of the parity check matrix.

That is, when an element in the j-th row and the i-th column is 1, an i-th variable node ("=" node) from the top and a j-th check node ("+" node) from the top are connected through an edge in FIG. 4. The edge indicates that a code bit corresponding to the variable node has a constraint condition corresponding to the check node.

In a sum-product algorithm which is a method of decoding the LDPC code, the variable node calculation and the check node calculation are iteratively performed.

Figure 5:
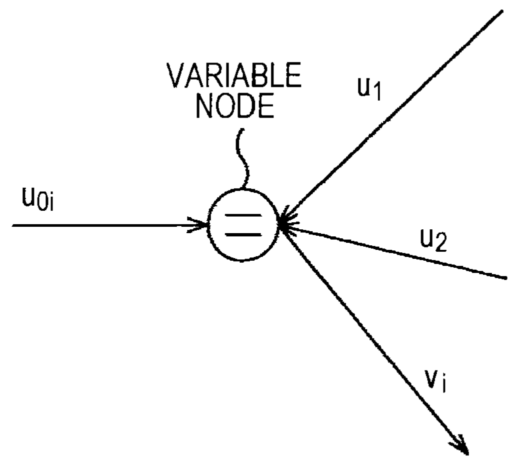
FIG. 5 is a diagram showing an example of a variable node.

FIG. 5 is a diagram showing the variable node calculation performed in the variable node.

In the variable node, the message $v_i$ corresponding to the edge to be calculated is obtained using the variable node calculation of Expression (1) using the reception value $u_{0i}$ and the messages $u_1$ and $u_2$ from the remaining edges connected to the variable node. Messages corresponding to other edges are similarly obtained.

Figure 6:
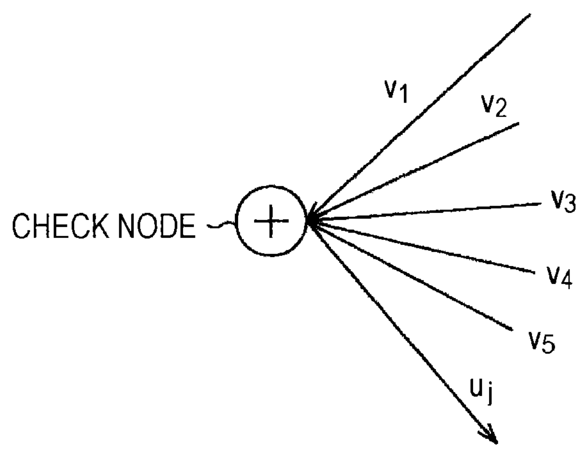
FIG. 6 is a diagram showing an example of a check node.

FIG. 6 is a diagram showing the check node calculation performed in the check node.

Here, the check node calculation of Expression (2) can be rewritten as Expression (6) by using a relationship of an expression $a \times b = \exp\{\ln(|a|)+\ln(|b|)\} \times \mathrm{sign}(a) \times \mathrm{sign}(b)$. In this case, sign(x) is 1 when $x \geq 0$, and is −1 when $x<0$.

$$\begin{aligned} u_j &= 2\tanh^{-1}\left(\prod_{i=1}^{d_c-1} \tanh\left(\frac{v_i}{2}\right)\right) \\ &= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \mathrm{sign}\left(\tanh\left(\frac{v_i}{2}\right)\right)\right] \\ &= 2\tanh^{-1}\left[\exp\left\{-\left(\sum_{i=1}^{d_c-1} -\ln\left(\tanh\left(\frac{|v_i|}{2}\right)\right)\right)\right\}\right] \times \prod_{i=1}^{d_c-1} \mathrm{sign}(v_i) \end{aligned} \tag{6}$$

In $x \geq 0$, when a function φ(x) is defined as the expression $\phi(x)=\ln(\tan h(x/2))$, since the expression $\phi^{-1}(x)=2 \tan h^{-1}(e^{-x})$ is established, Expression (6) can be modified into Expression (7).

$$u_j = \phi^{-1}\left(\sum_{i=1}^{d_c-1} \phi(|v_i|)\right) \times \prod_{i=1}^{d_c-1} \mathrm{sign}(v_i) \tag{7}$$

In the check node, the check node calculation of Expression (2) is performed according to Expression (7).

That is, as shown in FIG. 6, in the check node, the message $u_j$ corresponding to the edge to be calculated is calculated by the check node calculation of Expression (7) using messages $v_1$, $v_2$, $v_3$, $v_4$ and $v_5$ from the remaining edges connected to the check node. Messages corresponding to other edges are similarly calculated.

The function φ(x) of Expression (7) can be expressed as the expression $\phi(x)=\ln((e^x+1)/(e^x-1))$, and when $x>0$, $\phi(x)=\phi^{-1}(x)$. When the functions φ(x) and $\phi^{-1}(x)$ are implemented on hardware, these functions are implemented using a lookup table (LUT) in some cases, and the same LUT is used for both of these functions.

Figure 7:
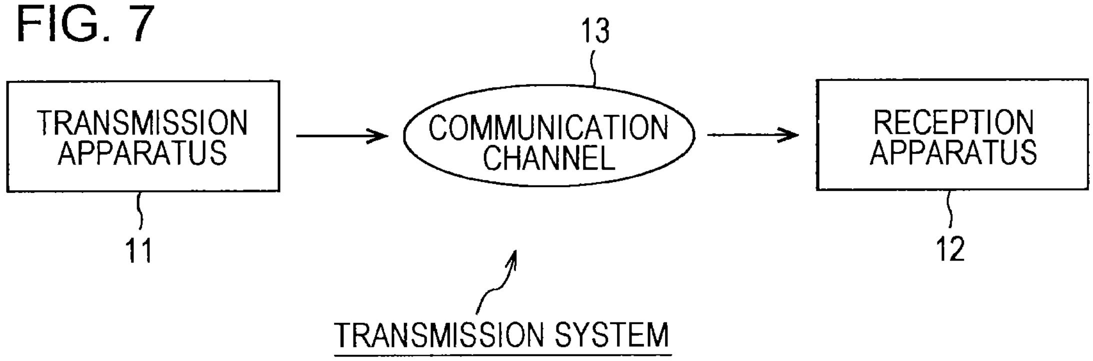
FIG. 7 is a diagram showing a configuration example of an embodiment of a transmission system to which the present technology is applied.

Configuration Example of Transmission System to which Present Technology is Applied FIG. 7 is a diagram showing a configuration example of an embodiment of a transmission system (refers to a system in which a plurality of apparatuses is logically integrated irrespective of whether or not the respective apparatuses are present in the same housing) to which the present technology is applied.

In FIG. 7, the transmission system includes a transmission apparatus 11, and a reception apparatus 12.

The transmission apparatus 11 transmits (broadcasts) (sends), for example, television broadcasting programs. That is, the transmission apparatus 11 encodes, for example, target data which is a transmission target such as image data or voice data as the program into the LDPC code, and transmits the encoded code through a communication channel 13 such as a satellite channel, a terrestrial channel or a cable (wired channel).

The reception apparatus 12 receives the LDPC code transmitted from the transmission apparatus 11 through the communication channel 13, decodes the received code into the target data, and outputs the decoded data.

Here, it is understand that the LDPC code used in the transmission system of FIG. 7 exhibits extremely high capability in an additive white Gaussian noise (AWGN) communication channel.

Meanwhile, in the communication channel 13, a burst error or erasure may occur. For example, when the communication channel 13 is specifically a terrestrial channel, in an orthogonal frequency division multiplexing (OFDM) system, the power of a particular symbol may become zero (erasure) due to the delay of an echo (a path other than a main path) in a multi-path environment in which a desired-to-undesired (D/U) ratio is 0 dB (undesired=echo power is equal to desired=main path power).

Even in flutter (communication path in which the delay is zero and the echo to which the Doppler frequency is applied is added), when the D/U is 0 dB, the power of all OFDM symbols at a particular time may become zero (erasure) by the Doppler frequency.

A burst error may occur due to a state of a wiring from a reception unit (not shown) of the reception apparatus 12 such as an antenna that receives a signal from the transmission apparatus 11 to the reception apparatus 12 or instability of a power supply of the reception apparatus 12.

Meanwhile, in the decoding of the LDPC code, in the columns of the parity check matrix H and the variable nodes corresponding to the code bits of the LDPC code, since the variable node calculation of Expression (1) for performing the addition of (reception value $u_{0i}$) of the code bits of the LDPC code is performed as shown in FIG. 5, if the code bits used for the variable node calculation are in error, the accuracy of the obtained message is decreased.

In the decoding of the LDPC code, since the check node calculation of Expression (7) is performed in the check node by using the messages obtained in the variable nodes connected to the check node, when the number of check nodes in which errors (including erasure) simultaneously occur in (the code bits of the LDPC code corresponding to) the plurality of connected variable nodes is increased, decoding performance is degraded.

That is, for example, when the erasure simultaneously occurs in two or more variable nodes connected to the check node, the check node returns an equal-probability message in which a probability that the value will be zero and a probability that the value will be one are equal to each other to all of the variable nodes. In this case, the check node that returns the equal-probability message does not contribute to one decoding process (one set of the variable node calculation and the check node calculation), and thus, it is necessary to increase the number of times the decoding process is iterated. Accordingly, the decoding performance is degraded, and the power consumption of the reception apparatus 12 that decodes the LDPC code is increased.

Thus, in the transmission system of FIG. 7, it is possible to improve tolerance to the burst error or the erasure while maintaining performance in the AWGN communication channel (AWGN channel).

Configuration Example of Transmission Apparatus 11

Figure 8:
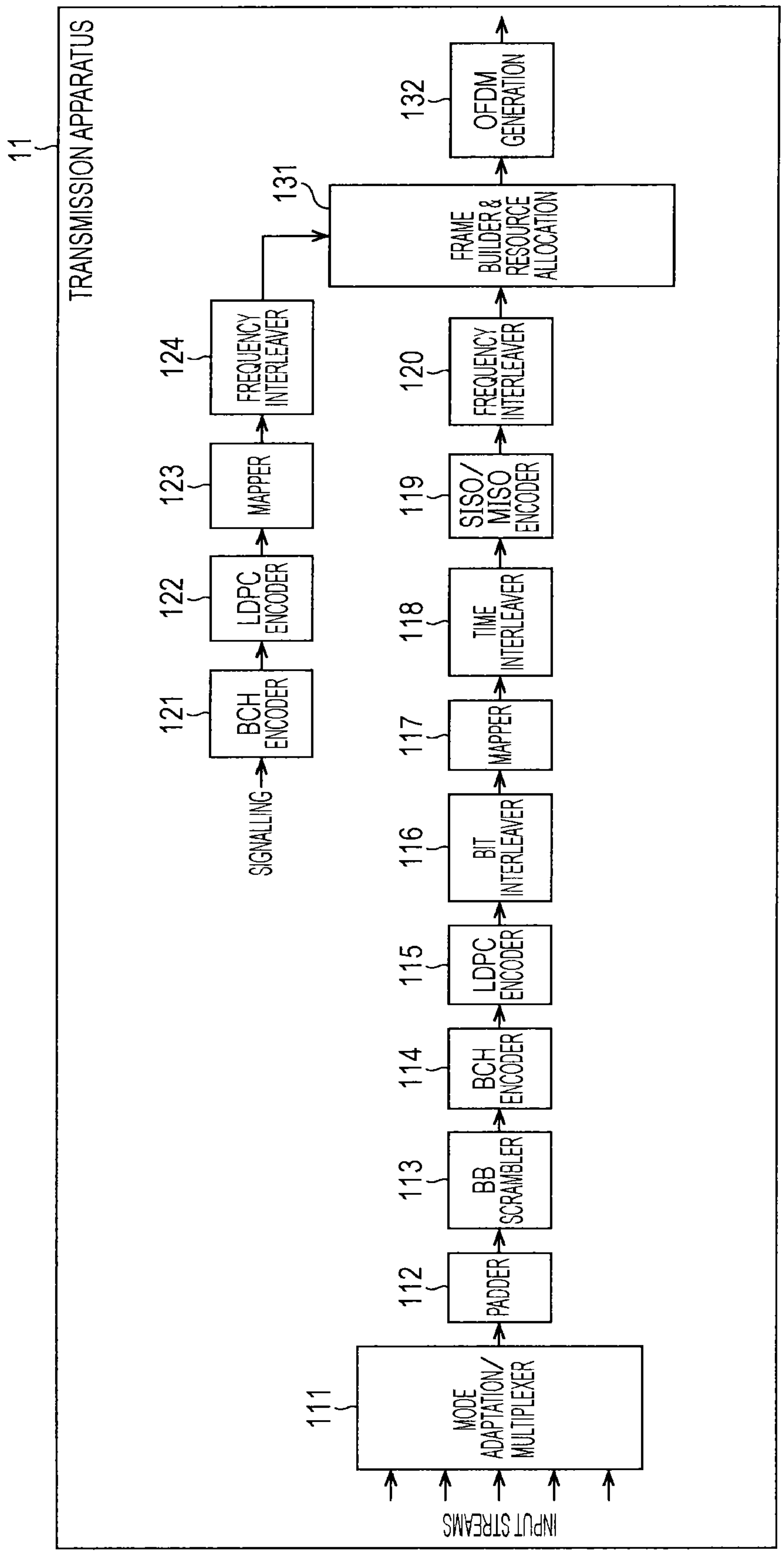
FIG. 8 is a block diagram showing a configuration example of a transmission apparatus.

FIG. 8 is a block diagram showing a configuration example of the transmission apparatus 11 of FIG. 7.

In the transmission apparatus 11, one or more input streams as target data are supplied to a mode adaptation/multiplexer 111.

The mode adaptation/multiplexer 111 performs a mode selection and a process such as multiplexing on one or more input streams being supplied thereto when necessary, and supplies data obtained as the result to a padder 112.

The padder 112 performs necessary zero padding (insertion of Nulls) on the data from the mode adaptation/multiplexer 111, and supplies data obtained as the result to a BB scrambler 113.

The BB scrambler 113 performs base-band (BB) scrambling on the data from the padder 112, and supplies data obtained as the result to a BCH encoder 114.

The BCH encoder 114 performs BCH encoding the data from the BB scrambler 113, and supplies data obtained as the processing result as LDPC target data which is an LDPC encoding target to an LDPC encoder 115.

The LDPC encoder 115 performs, for example, the LDPC encoding in accordance with the parity check matrix in which the parity matrix which is a part corresponding to the parity bits of the LDPC code has a dual diagonal structure on the LDPC target data from the BCH encoder 114, and outputs the LDPC code using the LDPC target data as the information bits.

That is, the LDPC encoder 115 performs the LDPC encoding that encodes the LDPC target data into the LDPC code (corresponding to the parity check matrix) defined by a predetermined standard such as DVB-S.2, DVB-T.2 or DVB-C.2, or the LDPC code (corresponding to the parity check matrix) to be adopted by ATSC 3.0, and outputs the LDPC code obtained as the result.

Here, the LDPC code defined by the DVB-T.2 standard or the LDPC code to be adopted by ATSC 3.0 is an irregular repeat-accumulate (IRA) code, and the parity matrix in the parity check matrix of the LDPC code has the dual diagonal structure. The parity matrix and the dual diagonal structure will be described below. The IRA code is described in, for example, "Irregular Repeat-Accumulate Codes," H. Jin, A. Khandekar, and R. J. McEliece, in Proceedings of 2nd International Symposium on Turbo codes and Related Topics, pp. 1-8, September 2000.

The LDPC code output from the LDPC encoder 115 is supplied to a bit interleaver 116.

The bit interleaver 116 performs bit interleaving to be described below on the LDPC code from the LDPC encoder 115, and supplies the LDPC code on which the bit interleaving has been performed to a mapper 117.

The mapper 117 performs quadrature modulation (multilevel modulation) by mapping the LDPC code from the bit interleaver 116 to a signal point representing one symbol of the quadrature modulation for every one or more code bits of the LDPC code (for every symbol).

That is, the mapper 117 performs the quadrature modulation by mapping the LDPC code from the bit interleaver 116 to a signal point determined through a modulation scheme that performs the quadrature modulation of the LDPC code on an IQ plane (IQ constellation) defined using an I axis indicating an I component having the same phase as that of a carrier wave and a Q axis indicating a Q component perpendicular to the carrier wave.

When the number of signal points determined through the modulation scheme of the quadrature modulation performed by the mapper 117 is $2^m$, in the mapper 117, the LDPC code from the bit interleaver 116 is mapped to a signal point of $2^m$ number of signal points indicating a symbol for every symbol by using m number of code bits of the LDPC code as a symbol (one symbol).

Here, examples of the modulation scheme of the quadrature modulation performed by the mapper 117 include a modulation scheme defined by DVB-T.2, a modulation scheme to be adopted by ATSC 3.0, or other modulation schemes, that is, binary phase-shift keying (BPSK), quadrature phase-shift keying (QPSK), 8 phase-shift keying (PSK), 16 amplitude and phase-shift keying (APSK), 32 APSK, 16 quadrature amplitude modulation (QAM), 64-QAM, 256-QAM, 1024-QAM, 4096-QAM and 4 pulse-amplitude modulation (PAM). In the mapper 117, whether to perform quadrature modulation of any modulation scheme is previously set depending on, for example, an operation input of an operator of the transmission apparatus 11.

The data (mapping result obtained by mapping the symbol to the signal point) obtained by the process in the mapper 117 is supplied to a time interleaver 118.

The time interleaver 118 performs time interleaving (interleaving in the time direction) on the data from the mapper 117 for every symbol, and supplies data obtained as the result to a single-input single-output/multiple-input single-output (SISO/MISO) encoder 119.

The SISO/MISO encoder 119 performs space-time encoding on the data from the time interleaver 118, and supplies the encoded data to a frequency interleaver 120.

The frequency interleaver 120 performs frequency interleaving (interleaving in the frequency direction) on the data from the SISO/MISO encoder 119 for every symbol, and supplies data to a frame builder and resource allocation unit 131.

Meanwhile, control data (signaling) for transmission control such as base-band (BB) signaling (BB header) is supplied to a BCH encoder 121.

Similarly to the BCH encoder 114, the BCH encoder 121 performs BCH encoding on the supplied control data, and supplies data obtained as the result to an LDPC encoder 122.

Similarly to the LDPC encoder 115, the LDPC encoder 122 performs LDPC encoding on the data from the BCH encoder 121 as LDPC target data, and supplies an LDPC code obtained as the result to a mapper 123.

Similarly to the mapper 117, the mapper 123 performs quadrature modulation by mapping the LDPC code from the LDPC encoder 122 for every one or more bits of the LDPC code (unit of the symbol) to a signal point indicating one symbol of the quadrature modulation, and supplies data obtained as the result to a frequency interleaver 124.

Similarly to the frequency interleaver 120, the frequency interleaver 124 performs frequency interleaving on the data from the mapper 123 for every symbol, and supplies data to the frame builder and resource allocation unit 131.

The frame builder and resource allocation unit 131 inserts pilot symbols into necessary positions of the data (symbol) from the frequency interleavers 120 and 124, constructs a frame (for example, a physical layer (PL) frame, a T2 frame, or a C2 frame) including a predetermined number of symbols from the data (symbol) obtained as the result, and supplies the constructed frame to an OFDM generation unit 132.

The OFDM generation unit 132 generates an OFDM signal corresponding to the frame, based on the frame from the frame builder and resource allocation unit 131, and transmits the generated signal through the communication channel 13 (FIG. 7).

The transmission apparatus 11 can be configured without including some of the blocks shown in FIG. 8 such as the time interleaver 118, the SISO/MISO encoder 119, the frequency interleaver 120 and the frequency interleaver 124.

Configuration Example of Bit Interleaver 116

Figure 9:
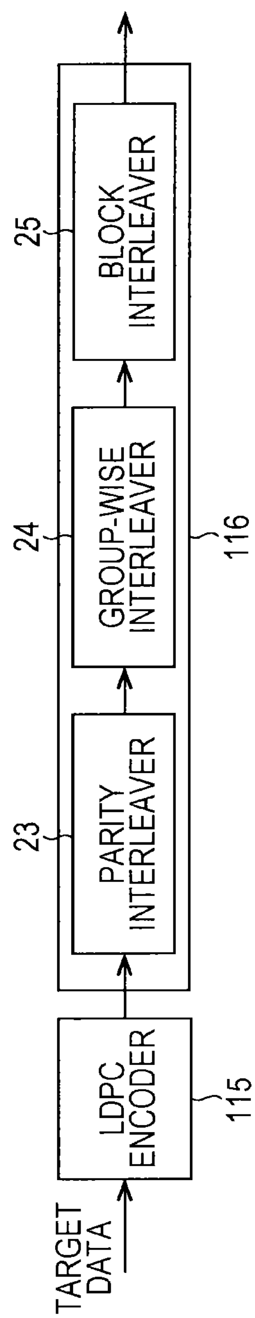
FIG. 9 is a block diagram showing a configuration example of a bit interleaver.

FIG. 9 is a block diagram showing a configuration example of the bit interleaver 116 of FIG. 8.

The bit interleaver 116 has a function of interleaving data, and includes a parity interleaver 23, a group-wise interleaver 24, and a block interleaver 25.

The parity interleaver 23 performs parity interleaving that interleaves parity bits of the LDPC code from the LDPC encoder 115 into positions of other parity bits, and supplies the LDPC code on which the parity interleaving has been performed to the group-wise interleaver 24.

The group-wise interleaver 24 performs group-wise interleaving on the LDPC code from the parity interleaver 23, and supplies the LDPC code on which the group-wise interleaving has been performed to the block interleaver 25.

Here, in the group-wise interleaving, 360 bits of one group obtained by dividing the LDPC code corresponding to one code from a leading code thereof into a unit of 360 bits equal to a unit size P to be described below are grouped as a bit group, and the LDPC code from the parity interleaver 23 is interleaved for every bit group.

It is possible to further enhance an error rate when the group-wise interleaving is performed than when the group-wise interleaving is not performed. As a result, it is possible to ensure favorable communication quality in data transmission.

By performing block interleaving for demultiplexing the LDPC code from the group-wise interleaver 24, the block interleaver 25 symbolizes the LDPC code corresponding to one code into, for example, an m-bit symbol which is a unit of mapping, and the symbolized symbol is supplied to the mapper 117 (FIG. 8).

Here, in the block interleaving, the LDPC code from the group-wise interleaver 24 is written in a column (longitudinal) direction in a storage region in which columns as storage regions storing a predetermined number of bits in the column direction are arranged by the number corresponding to m number of bits of the symbol in a row direction (transverse direction), and is read in the row direction. Thus, the LDPC code corresponding to one code is symbolized into, for example, the m-bit symbol.

Parity Check Matrix of LDPC Code

Figure 10:
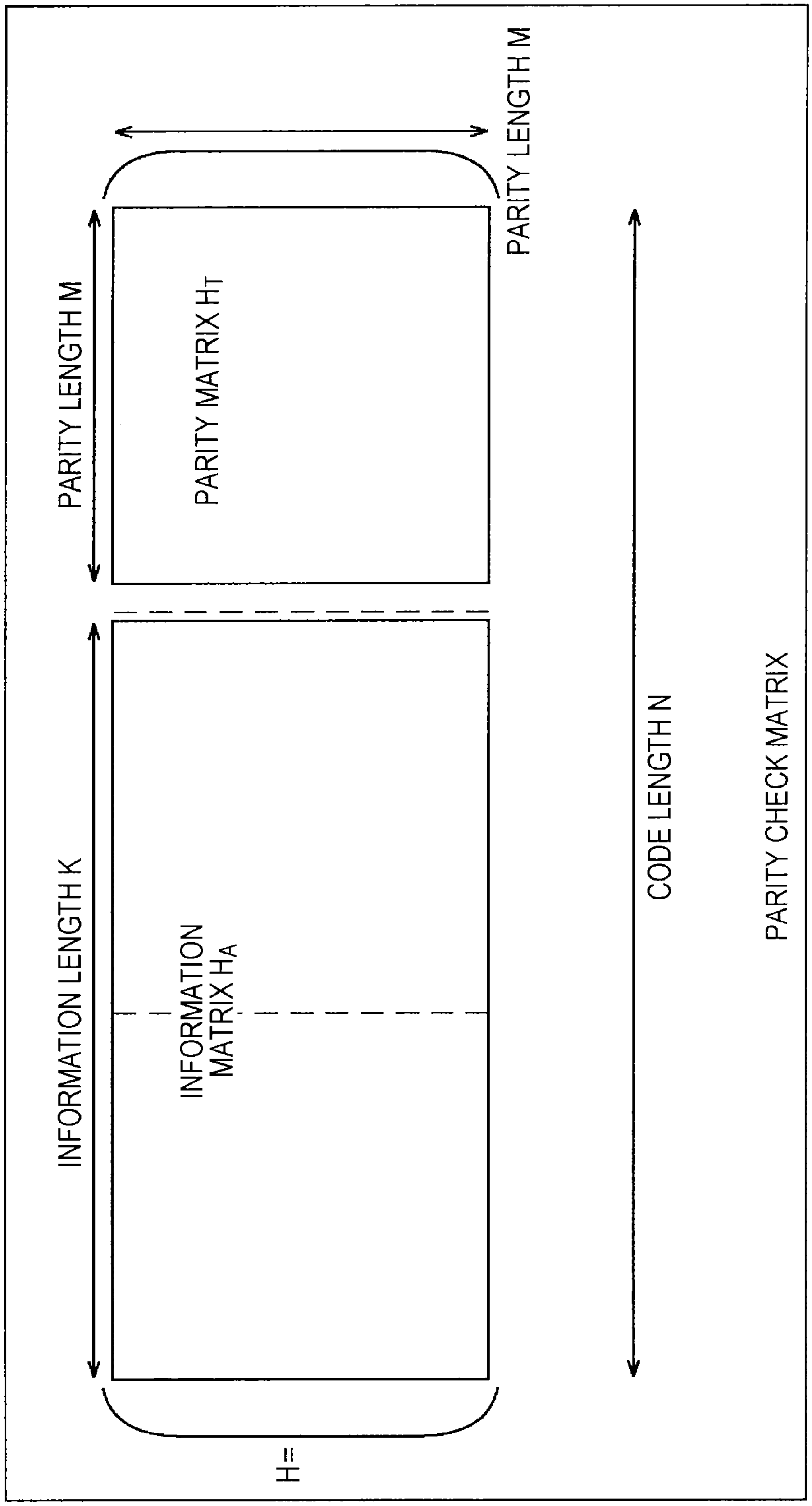
FIG. 10 is a diagram showing an example of the parity check matrix.

FIG. 10 is a diagram showing an example of the parity check matrix H used for the LDPC encoding in the LDPC encoder 115 of FIG. 8.

The parity check matrix H has a low-density generator matrix (LDGM) structure, and can be expressed as the expression $H=[H_A|H_T]$ (a matrix in which an element of an information matrix $H_A$ is used as a left element, and an element of a parity matrix $H_T$ is used as a right element) by the information matrix $H_A$ which is a part corresponding to the information bits of the code bits of the LDPC code and the parity matrix $H_T$ corresponding to the parity bits.

Here, the number of bits of the information bits of the code bits of the LDPC code (one codeword) of the one code and the number of bits of the parity bits are respectively referred to as an information length K and a parity length M, and the number of bits of the code bits of the LDPC code of one code (one codeword) is referred to as a code length N (=K+M).

The information length K and the parity length M of the LDPC code having a certain code length N are determined depending on a code rate. The parity check matrix H is a matrix in which row×column is M×N (matrix of M row×N column). The information matrix $H_A$ is an M×K matrix, and the parity matrix $H_T$ is an M×M matrix.

Figure 11:
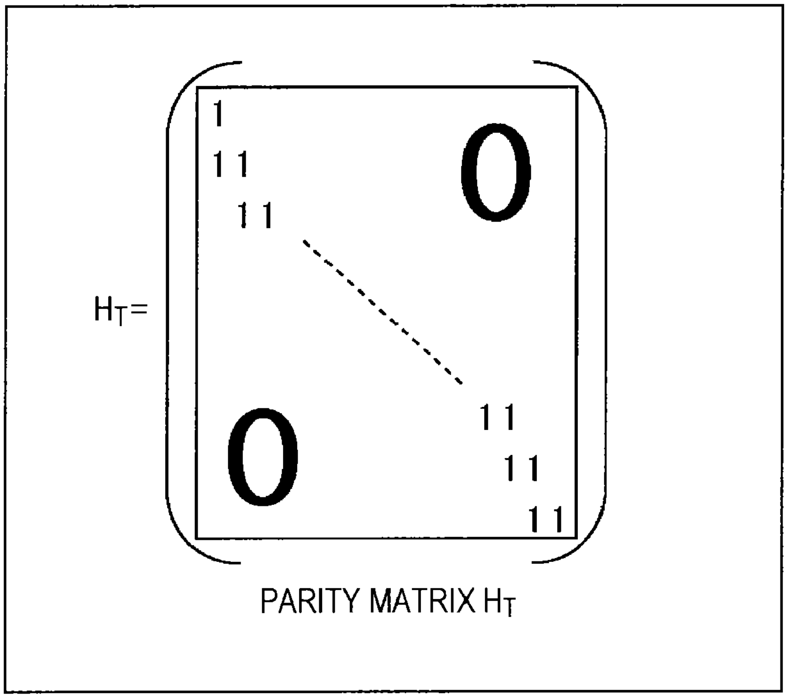
FIG. 11 is a diagram showing an example of a parity matrix.

FIG. 11 is a diagram showing an example of the parity matrix $H_T$ of the parity check matrix H used for the LDPC encoding in the LDPC encoder 115 of FIG. 8.

The parity matrix $H_T$ of the parity check matrix H used for the LDPC encoding in the LDPC encoder 115 is the same as the parity matrix $H_T$ of the parity check matrix H of the LDPC code defined by the standard such as DVB-T.2.

As shown in FIG. 11, the parity matrix $H_T$ of the parity check matrix H of the LDPC code defined by the standard such as DVB-T.2 is a matrix having a dual diagonal structure (lower bidiagonal matrix) in which the elements of 1s are arranged in a so-called dual diagonal form. The row weight of the parity matrix $H_T$ is 1 for the first row, and is 2 for all of the remaining rows. The column weight is 1 for the last column, and is 2 for all of the remaining columns.

As mentioned above, the LDPC code of the parity check matrix H of which the parity matrix $H_T$ has the dual diagonal structure can be generated using the parity check matrix H.

That is, the LDPC code (one codeword) is expressed as a row vector c, and a column vector which is the transpose of the row vector is expressed as $c^T$. A part of the information bits of the row vector c which is the LDPC code is expressed as a row vector A, and a part of the parity bits is expressed as a row vector T.

In this case, the row vector c can be expressed as the express $c=[A|T]$ (row vector in which an element of the row vector A is used as a left element and an element of the row vector T is used as a right element) by the row vector A as the information bits and the row vector T as the parity bits.

The parity check matrix H and the row vector $c=[A|T]$ as the LDPC code are necessary to satisfy the expression $Hc^T=0$, and when the parity matrix $H_T$ of the parity check matrix $H=[H_A|H_T]$ has the dual diagonal structure shown in FIG. 11, the row vector T as the parity bits constituting the row vector $c=[A|T]$ that satisfies the expression $Hc^T=0$ can be successively (sequentially) calculated by sequentially changing the elements of the respective rows to zero from the first element of the column vector $Hc^T$ in the expression $Hc^T=0$.

Figure 12:
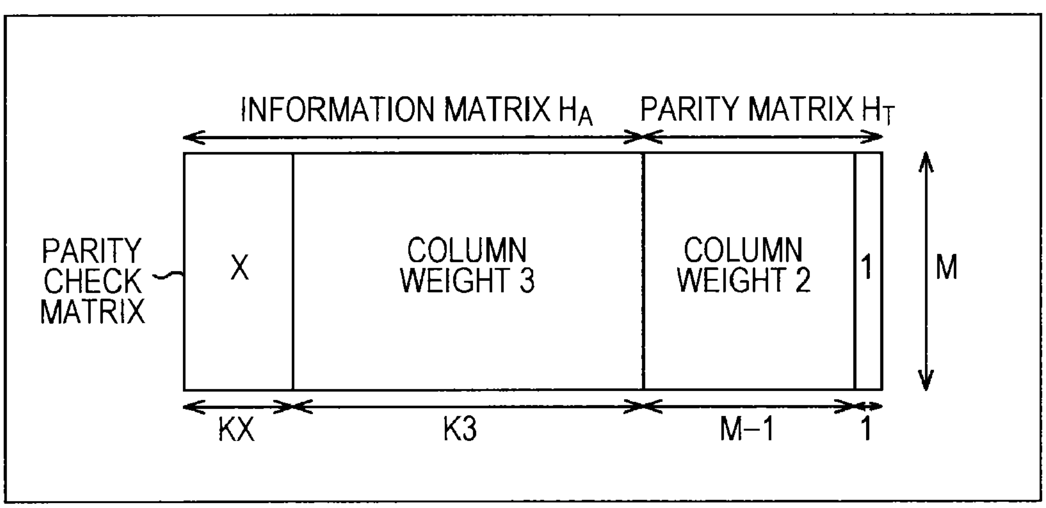
FIG. 12 is a diagram for describing a parity check matrix of an LDPC code defined by the standard of DVB-T.2.

FIG. 12 is a diagram showing the parity check matrix H of the LDPC code defined by the standard such as DVB-T.2.

The column weight of a KX column from the first column of the parity check matrix H of the LDPC code defined by the standard such as DVB-T.2 is X, the column weight of the K3 column is 3, the column weight of the M−1 column is 2, and the column weight of the last column is 1.

Here, KX+K3+M−1+1 is equal to the code length N.

FIG. 13 is a diagram showing column numbers KX, K3 and M and a column weight X with respect to the respective code rates r of the LDPC code defined by the standard such as DVB-T.2.

In the standard such as DVB-T.2, the LDPC codes having the code lengths N of 64,800 bits and 16,200 bits are defined.

Eleven code rates (nominal rates) of 1/4, 1/3, 2/5, 1/2, 3/5, 2/3, 3/4, 4/5, 5/6, 8/9, and 9/10 are defined for the LDPC code having the code length N of 64,800 bits, and ten code rates of 1/4, 1/3, 2/5, 1/2, 3/5, 2/3, 3/4, 4/5, 5/6, and 8/9 are defined for the LDPC code having the code length N of 16,200 bits.

Here, the code length N of 64,800 bits is referred to as 64 k bits, and the code length N of 16,200 bits is referred to as 16 k bits.

In the case of the LDPC code, code bits of the parity check matrix H corresponding to columns having a larger column weight tend to have lower error rates.

In the parity check matrix H defined by the standard such as DVB-T.2 shown in FIGS. 12 and 13, the column weight of the column on the leading side (the left side) tends to be large, and thus, in the case of the LDPC code corresponding to the parity check matrix H, the first code bit tends to have high error tolerance (has tolerance to an error), and the last code bit tends to have low error tolerance.

Parity Interleaving

The parity interleaving performed by the parity interleaver 23 of FIG. 9 will be described with reference to FIGS. 14 to 16.

Figure 14:
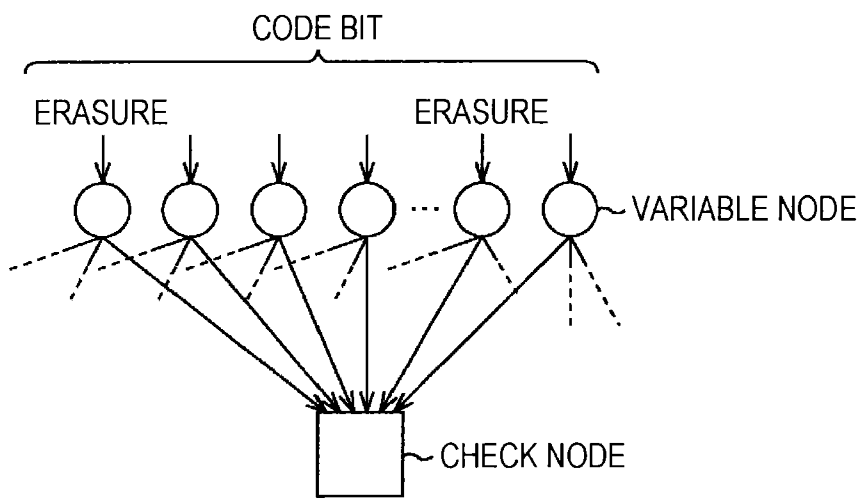
FIG. 14 is a diagram showing an example of a Tanner graph for the decoding of the LDPC code.

FIG. 14 is a diagram showing an example of (a part of) the Tanner graph of the parity check matrix of the LDPC code.

As shown in FIG. 14, when errors such as erasure simultaneously occur in (code bits corresponding to) the plurality of variable nodes such as two variable nodes connected to the check node, the check node returns the equal-probability message in which the probability that the value will be zero and the probability that the value will be one are equal to all of the variable nodes connected to the check node. Thus, when the erasure simultaneously occurs in the plurality of variable nodes connected to the same check node, the decoding performance is degraded.

However, the LDPC code output from the LDPC encoder 115 of FIG. 8 is an IRA code similarly to the LDPC code defined by the standard such as DVB-T.2, and the parity matrix $H_T$ of the parity check matrix H has the dual diagonal structure as shown in FIG. 11.

Figure 15A:
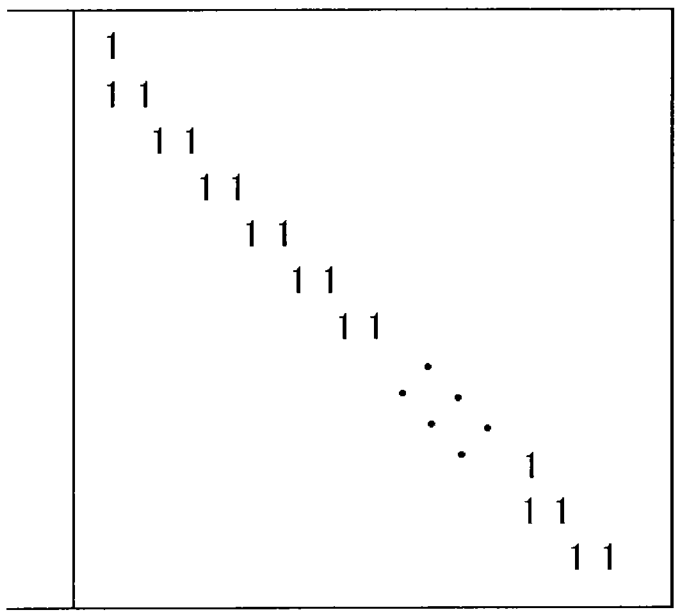
FIGS. 15A and 15B are diagrams showing examples of a parity matrix having a dual diagonal structure and a Tanner graph corresponding to the parity matrix.
Figure 15B:
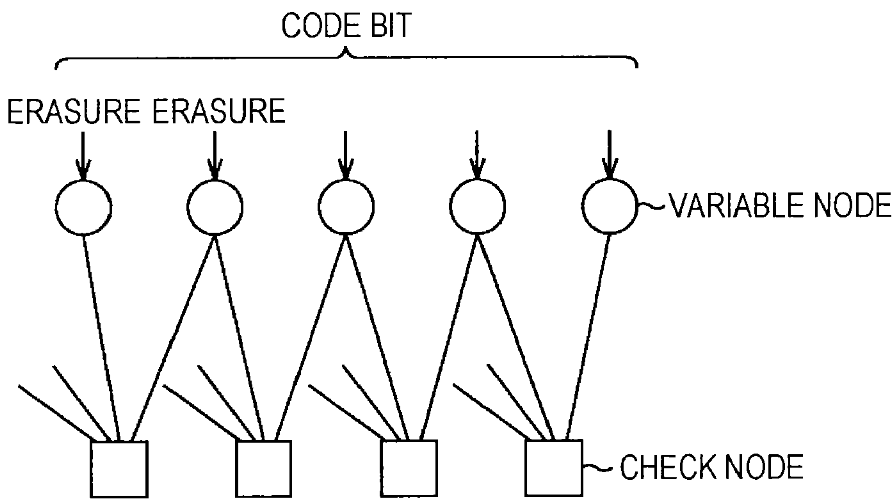

FIGS. 15A and 15B are diagrams showing examples of the parity matrix $H_T$ having the dual diagonal structure as shown in FIG. 11 and the Tanner graph corresponding to the parity matrix $H_T$.

FIG. 15A shows an example of the parity matrix $H_T$ having the dual diagonal structure, and FIG. 15B shows the Tanner graph corresponding to the parity matrix $H_T$ of FIG. 15A.

In the parity matrix $H_T$ having the dual diagonal structure, the elements of "1"s are adjacent to each other in the respective rows (except for the first column). For this reason, in the Tanner graph of the parity matrix $H_T$, two adjacent variable nodes corresponding to columns of two adjacent elements in which the values of the parity matrix $H_T$ are 1s are connected to the same check node.

Accordingly, when the parity bits corresponding to the two adjacent variable nodes are simultaneously in error due to the burst error or the erasure, since the check node connected to the two variable nodes (variable nodes requesting messages using the parity bits) corresponding to the two parity bits in error returns the equal-probability message in which the probability that the value will be zero and the probability that the value will be one are equal to the variable nodes connected to the check node, the decoding performance is degraded. When a burst length (the number of bits of the parity bits that are continuously in error) is increased, the number of check nodes that return the equal-probability message is increased, and thus, the decoding performance is further degraded.

Thus, in order to prevent the degradation of the decoding performance, the parity interleaver 23 (FIG. 9) performs the parity interleaving that interleaves the parity bits of the LDPC code from the LDPC encoder 115 into positions of other parity bits.

Figure 16:
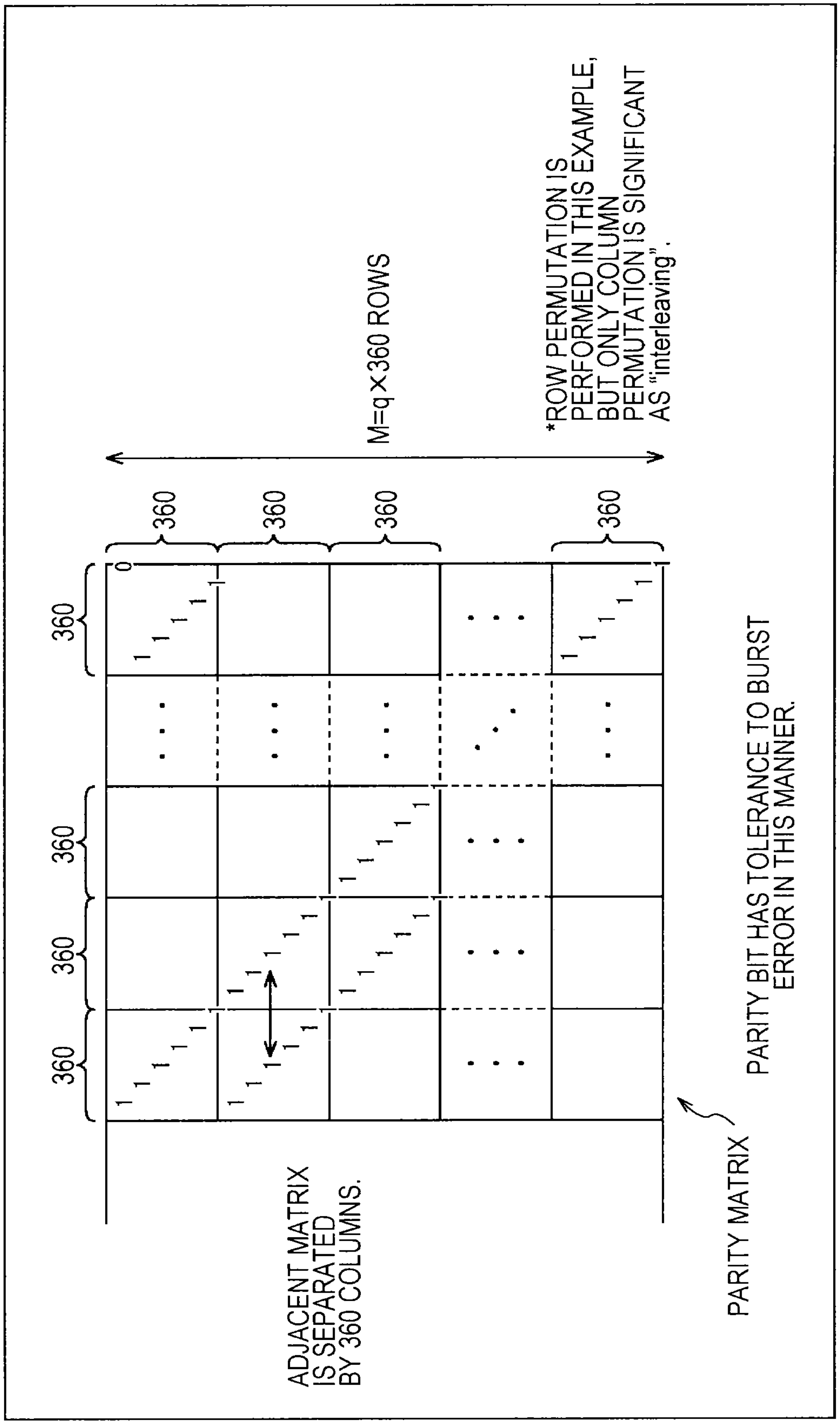
FIG. 16 is a diagram showing an example of the parity matrix of the parity check matrix corresponding to the LDPC code on which parity interleaving has been performed.

FIG. 16 is a diagram showing the parity matrix $H_T$ of the parity check matrix H corresponding to the LDPC code on which the parity interleaving has been performed by the parity interleaver 23 of FIG. 9.

Here, the information matrix $H_A$ of the parity check matrix H corresponding to the LDPC code output from the LDPC encoder 115 has a cyclic structure similarly to the information matrix of the parity check matrix H corresponding to the LDPC code defined by the standard such as DVB-T.2.

The cyclic structure refers to a structure in which a certain column coincides with a column obtained by performing cyclic shifting on another column, and includes, for example, a structure in which the positions of 1s of the respective rows of the P column for each of the P columns are positions obtained by performing cyclic-shifting in the column direction by a predetermined value such as a value proportional to a value q obtained by dividing the first column of the P column by the parity length M. Hereinafter, the P column in the cyclic structure is appropriately referred to as a unit size.

As described in FIGS. 12 and 13, as the LDPC code defined by the standard of DVB-T.2, there are two types of LDPC codes of which the code lengths N are 64,800 bits and 16,200 bits, and the unit size P of both of these two types of LDPC codes is defined as 360 which is one of divisors except for 1 and M of divisors of the parity length M.

Further, the parity length M is a value other than a prime number represented by the expression M=q×P=q×360 by using the value q different depending on the code rate. Accordingly, similarly to the unit size P, the value q is another one of the divisors except for 1 and M of the divisors of the parity length M, and is obtained by dividing the parity length M by the unit size P (the product of P and q which are divisors of the parity length M is the parity length M).

As described above, when the information length is K, an integer which is 0 or greater and less than P is x, an integer which is 0 or greater and less than q is y, the parity interleaver 23 interleaves the (K+qx+y+1)-th code bit of the code bits of the N-bit LDPC code into the position of the (K+Py+x+1)-th code bit.

Since both of the (K+qx+y+1)-th code bit and the (K+Py+x+1)-th code bit are code bits subsequent to a (K+1)-th code bit, these bits are parity bits. Accordingly, the positions of the parity bits of the LDPC code are moved through the parity interleaving.

According to the parity interleaving, since (the parity bits corresponding to) the variable nodes connected to the same check node are separated by the unit size P, that is, 360 bits, when the burst length is less than 360 bits, it is possible to avoid the situation that the plurality of variable nodes connected to the same check node are simultaneously in error, and as a result, it is possible to improve tolerance to the burst error.

The LDPC code on which the parity interleaving that interleaves the (K+qx+y+1)-th code bit into the position of the (K+Py+x+1)-th code bit has been performed coincides with the LDPC code (hereinafter, referred to as a permutation parity check matrix) of the parity check matrix obtained by performing column permutation that permutes the (K+qx+y+1)-th column of the original parity check matrix H into the (K+Py+x+1)-th column.

As shown in FIG. 16, a pseudo-cyclic structure having the P columns (360 columns in FIG. 16) as a unit appears in the parity matrix of the permutation parity check matrix.

Here, the pseudo-cyclic structure refers to a structure in which parts except for a part have the cyclic structure.

The permutation parity check matrix obtained by performing the column permutation corresponding to the parity interleaving on the parity check matrix of the LDPC code defined by the standard such as DVB-T.2 is a so-called pseudo-cyclic structure not the (complete) cyclic structure in which the number of the elements of 1s is short by one (the element of 1 becomes the element of 0) in a part of 360 rows×360 columns (shift matrix to be described below) which is an upper-right corner part of the permutation parity check matrix.

Similarly to the permutation parity check matrix for the parity check matrix of the LDPC code defined by the standard such as DVB-T.2, the permutation parity check matrix for the parity check matrix of the LDPC code output from the LDPC encoder 115 has, for example, the pseudo-cyclic structure.

The permutation parity check matrix of FIG. 16 is a matrix on which the permutation of rows (row permutation) has performed on the original parity check matrix H in order to allow the permutation parity check matrix to be constructed as constitutive matrices to be described below in addition to the column permutation corresponding to the parity interleaving.

Figure 17:
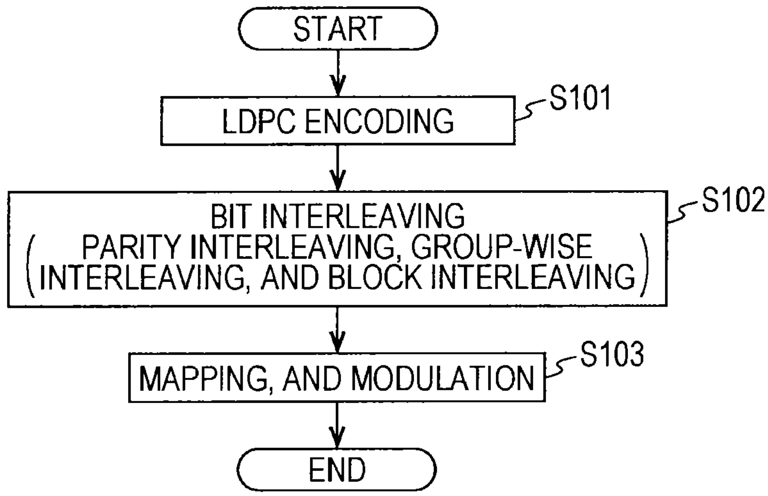
FIG. 17 is a flowchart for describing an example of a process performed in the bit interleaver and a mapper.

FIG. 17 is a flowchart for describing a process performed in the LDPC encoder 115, the bit interleaver 116 and the mapper 117 of FIG. 8.

The LDPC encoder 115 waits for the LDPC target data to be supplied from the BCH encoder 114, encodes the LDPC target data into the LDPC code in step S101, and supplies the LDPC code to the bit interleaver 116. The process proceeds to step S102.

In step S102, the bit interleaver 116 performs the bit interleaving on the LDPC code from the LDPC encoder 115, and supplies a symbol obtained by performing the bit interleaving to the mapper 117. The process proceeds to step S103.

That is, in step S102, the parity interleaver 23 of the bit interleaver 116 (FIG. 9) performs the parity interleaving on the LDPC code from the LDPC encoder 115, and supplies the LDPC code on which the parity interleaving has been performed to the group-wise interleaver 24.

The group-wise interleaver 24 performs the group-wise interleaving on the LDPC code from the parity interleaver 23, and supplies the LDPC code to the block interleaver 25.

The block interleaver 25 performs the block interleaving on the LDPC code on which the group-wise interleaving has been performed by the group-wise interleaver 24, and supplies an m-bit symbol obtained as the result to the mapper 117.

In step S103, the mapper 117 performs the quadrature modulation by mapping the symbol from the block interleaver 25 to any one of 2' number of signal points determined through the modulation scheme of the quadrature modulation performed by the mapper 117, and supplies data obtained as the result to the time interleaver 118.

As stated above, it is possible to improve the error rate when the plurality of code bits of the LDPC code is transmitted as one symbol by performing the parity interleaving and the group-wise interleaving.

Here, for the sake of convenience in the description, although it has been described in FIG. 9 that the parity interleaver 23 which is the block that performs the parity interleaving and the group-wise interleaver 24 which is the block that performs the group-wise interleaving are individually provided, the parity interleaver 23 and the group-wise interleaver 24 may be integrally configured.

That is, both of the parity interleaver and the group-wise interleaving can be performed by writing and reading the code bits in and from the memory, and can be expressed by a matrix for converting an address (write address) where the code bits are written into an address (read address) where the code bits are read.

Accordingly, if a matrix obtained by multiplying a matrix representing the parity interleaving and a matrix representing the group-wise interleaving is obtained, the code bits are converted by using these matrices. Therefore, it is possible to obtain the result on which the parity interleaving is performed and the group-wise interleaving is performed on the LDPC code on which the parity interleaving has been performed.

It is possible to integrally configure the block interleaver 25 in addition to the parity interleaver 23 and the group-wise interleaver 24.

That is, the block interleaving performed in the block interleaver 25 can also be expressed by a matrix for converting a write address where the LDPC code is stored into a read address.

Accordingly, if a matrix obtained by multiplying the matrix representing the parity interleaving, the matrix representing the group-wise interleaving and the matrix representing the block interleaving is obtained, it is possible to collectively perform the parity interleaving, the group-wise interleaving and the block interleaving by using these matrices.

Configuration Example of LDPC Encoder 115

Figure 18:
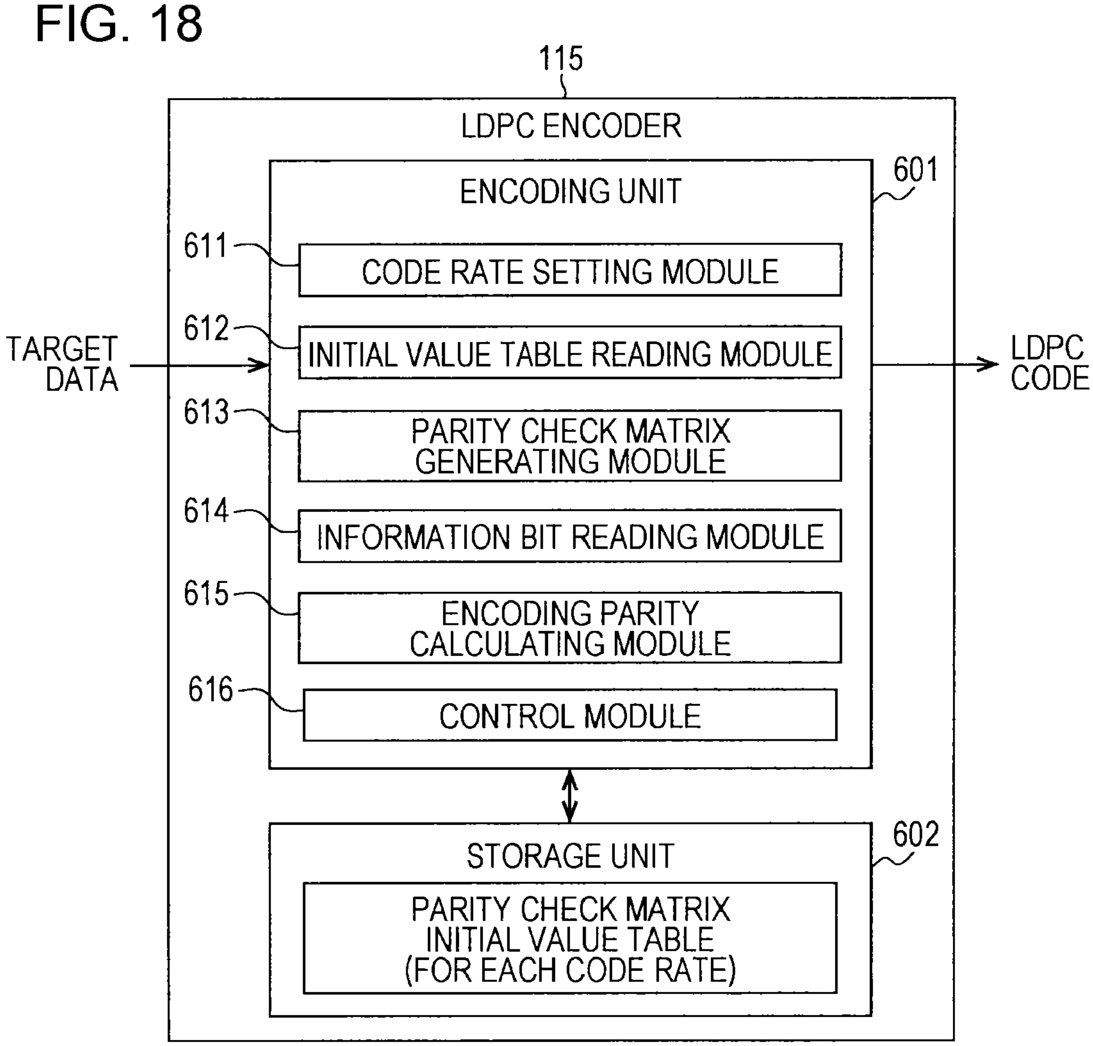
FIG. 18 is a block diagram showing a configuration example of an LDPC encoder.

FIG. 18 is a block diagram showing a configuration example of the LDPC encoder 115 of FIG. 8.

The LDPC encoder 122 of FIG. 8 also has the same configuration.

As described in FIGS. 12 and 13, in the standard such as DVB-T.2, two types of LDPC codes having the code lengths N of 64,800 bits and 16,200 bits are defined.

Eleven code rates of 1/4, 1/3, 2/5, 1/2, 3/5, 2/3, 3/4, 4/5, 5/6, 8/9 and 9/10 are defined for the LDPC code having the code length N of 64,800 bits, and tens code rates of 1/4, 1/3, 2/5, 1/2, 3/5, 2/3, 3/4, 4/5, 5/6 and 8/9 are defined for the LDPC code having the code length N of 16,200 bits (FIGS. 12 and 13).

For example, the LDPC encoder 115 can perform encoding (error-correction encoding) using the LDPC codes of the respective code rates which have the code lengths N of 64,800 bits and 16,200 bits according to the parity check matrix H provided for each the code lengths N and each code rate.

The LDPC encoder 115 includes an encoding unit 601, and a storage unit 602.

The encoding unit 601 includes a code rate setting module 611, an initial value table reading module 612, a parity check matrix generating module 613, an information bit reading module 614, an encoding parity calculating module 615, and a control module 616. The encoding unit performs the LDPC encoding on the LDPC target data supplied to the LDPC encoder 115, and supplies the LDPC code obtained as the result to the bit interleaver 116 (FIG. 8).

That is, the code rate setting module 611 sets the code length N and the code rate of the LDPC code depending on, for example, an operation input of the operator.

The initial value table reading module 612 reads a parity check matrix initial value table to be described below, which corresponds to the code length N and the code rate set by the code rate setting module 611, from the storage unit 602.

The parity check matrix generating module 613 generates the parity check matrix H by arranging the elements of 1s of the information matrix $H_A$ corresponding to the information length K (=code length N−parity length M) according to the code rate and the code length N set by the code rate setting module 611 for every 360 columns (unit size P) in the column direction based on the parity check matrix initial value table read by the initial value table reading module 612, and stores the generated parity check matrix in the storage unit 602.

The information bit reading module 614 reads (extracts) the information bits having the information length K from the LDPC target data supplied to the LDPC encoder 115.

The encoding parity calculating module 615 reads the parity check matrix H generated by the parity check matrix generating module 613 from the storage unit 602, and generates the codeword (LDPC code) by calculating the parity bits with respect to the information bits read by the information bit reading module 614 based on the predetermined expression by using the parity check matrix H.

The control module 616 controls the respective blocks constituting the encoding unit 601.

For example, a plurality of parity check matrix initial value tables corresponding to the plurality of code rates shown in FIGS. 12 and 13 for the code lengths N of 64,800 bits and 16,200 bits is stored in the storage unit 602. The storage unit 602 temporarily stores necessary data in the process of the encoding unit 601.

Figures 19, 20:
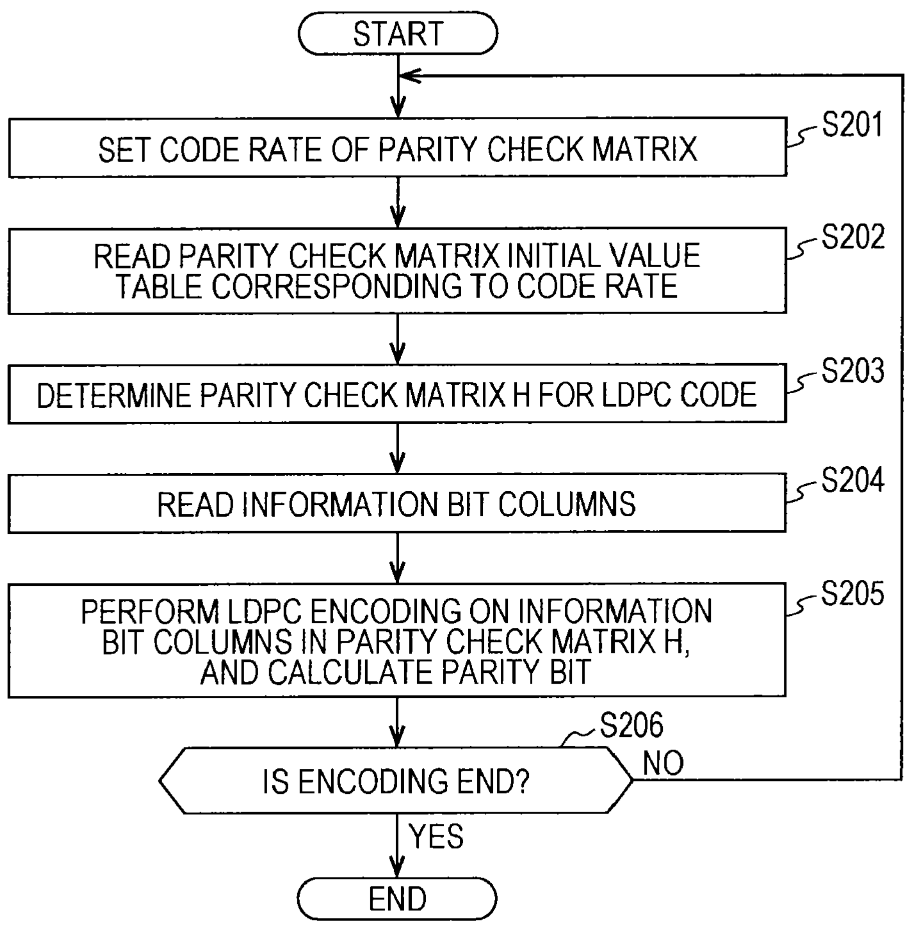
FIG. 19 is a flowchart for describing an example of the process of the LDPC encoder.
FIG. 20 is a diagram showing an example of a parity check matrix initial value table in which a code rate is 1/4 and a code length is 16,200.

FIG. 19 is a flowchart for describing an example of the process of the LDPC encoder 115 of FIG. 18.

In step S201, the code rate setting module 611 determines (sets) the code length N and the code rate r for performing the LDPC encoding.

In step S202, the initial value table reading module 612 reads a predetermined parity check matrix initial value table corresponding to the code length N and the code rate r determined by the code rate setting module 611 from the storage unit 602.

In step S203, the parity check matrix generating module 613 obtains (generates) the parity check matrix H of the LDPC code having the code length N and the code rate r determined by the code rate setting module 611 by using the parity check matrix initial value table read from the storage unit 602 by the initial value table reading module 612, and stores the obtained parity check matrix in the storage unit 602.

In step S204, the information bit reading module 614 reads the information bits having the information length K (=N×r) corresponding to the code length N and the code rate r determined by the code rate setting module 611 from the LDPC target data supplied to the LDPC encoder 115, reads the parity check matrix H obtained by the parity check matrix generating module 613 from the storage unit 602, and supplies the read information bits and the parity check matrix to the encoding parity calculating module 615.

In step S205, the encoding parity calculating module 615 calculates the parity bits of the codeword c satisfying Expression (8) by using the parity check matrix H and the information bits from the information bit reading module 614.

$$Hc^T=0 \tag{8}$$

In Expression (8), c represents a row vector as the codeword (LDPC code), and $c^T$ represents the transpose of the row vector c.

Here, as stated above, a part of the information bits of the row vector c as the LDPC code (one codeword) is represented as a row vector A, and when a part of the parity bits is represented by a row vector T, the row vector c can be expressed by the expression c=[A|T] by using the row vector A as the information bits and the row vector T as the parity bits.

When the parity matrix $H_T$ of the parity check matrix $H=[H_A|H_T]$ has the dual diagonal structure shown in FIG. 11, the parity check matrix H and the row vector c=[A|T] as the LDPC code are necessary to satisfy the expression $Hc^T=0$, and the row vector T as the parity bits constituting the row vector c=[A|T] satisfying the expression $Hc^T=0$ can be sequentially obtained by sequentially converting the elements of the respective rows into zero from the elements of the first row of the column vector $Hc^T$ in the expression $Hc^T=0$.

The encoding parity calculating module 615 obtains the parity bits T for the information bits A from the information bit reading module 614, and outputs the codeword c=[A|T] expressed by the information bits A and the parity bits T as the result of the LDPC encoding of the information bits A.

Thereafter, in step S206, the control module 616 determines whether or not the LDPC encoding has ended. In step S206, when it is determined that the LDPC encoding has not ended, that is, when, for example, the LDPC target data to be subject to the LDPC encoding is still present, the process returns to step S201 (or step S204), and thereinafter, the processes of step S201 (or step S204) to step S206 are repeated.

In step S206, when it is determined that the LDPC encoding has ended, that is, when, for example, the LDPC target data to be subject to the LDPC encoding is not present, the LDPC encoder 115 ends the process.

As mentioned above, the parity check matrix initial value table corresponding to the code rates r and the code lengths N is provided, and the LDPC encoder 115 performs the LDPC encoding with a predetermined code length N and a predetermined cord rate r by using the parity check matrix H generated from the parity check matrix initial value table corresponding to the predetermined code length N and the predetermined code rate r.

Example of Parity Check Matrix Initial Value Table

The parity check matrix initial value table is a table in which the positions of the elements of 1s of the information matrix $H_A$ (FIG. 10) of the parity check matrix H corresponding to the information length K depending on the code rate r and the code length N of the LDPC code (LDPC code defined by the parity check matrix H) are represented for every 360 columns (unit size P), and is previously created for each parity check matrix H of each code length N and each code rate r.

That is, in the parity check matrix initial value table, at least the positions of the elements of 1s of the information matrix $H_A$ are represented for every 360 columns (unit size P).

As the parity check matrix H, there are a parity check matrix which is defined by DVB-T.2 and in which (all of) the parity matrices $H_T$ have the dual diagonal structure, and a parity check matrix which is suggested by CRC/ETRI and in which a part of the parity matrix $H_T$ has the dual diagonal structure and the remaining part has a diagonal matrix (unit matrix).

Hereinafter, an expression method of a parity check matrix initial value table representing the parity check matrix which is defined by DVB-T.2 and in which the parity matrix $H_T$ has the dual diagonal structure is referred to as a DVB method, and an expression method of a parity check matrix initial value table representing the parity check matrix suggested by CRC/ETRI is referred to as a ETRI method.

FIG. 20 is a diagram showing an example of the parity check matrix initial value table of the DVB method.

That is, FIG. 20 shows a parity check matrix initial value table for a parity check matrix H which is defined by the standard of DVB-T.2 and has a code length N of 16,200 bits and a code rate (code rate described in DVB-T.2) r of 1/4.

The parity check matrix generating module 613 (FIG. 18) obtains the parity check matrix H by using the parity check matrix initial value table of the DVB method as will be described below.

FIG. 21 is a diagram for describing a method of obtaining the parity check matrix H from the parity check matrix initial value table of the DVB method.

That is, FIG. 21 is a parity check matrix initial value table for a parity check matrix H which is defined by the standard of DVB-T.2 and has a code length N of 16,200 bits and a code rate r of 2/3.

The parity check matrix initial value table of the DVB method is a table in which the positions of all of the elements of 1s of the information matrix $H_A$ corresponding to the information length K in accordance with the code rate r and the code length N of the LDPC code are represented for every 360 columns (unit size P), and row numbers of the elements of 1s of the (1+360×(i−1))-th column of the parity check matrix H (row numbers in which a row number of the first row of the parity check matrix H is zero) are arranged in the i-th row by the number of a column weight of the (1+360×(i−1))-th column.

Here, since the parity check matrix $H_T$ (FIG. 10) of the parity check matrix H of the DVB method corresponding to the parity length M is determined to have the dual diagonal structure as shown in FIG. 15, if the information matrix $H_A$ (FIG. 10) corresponding to the information length K can be obtained using the parity check matrix initial value table, it is possible to obtain the parity check matrix H.

A row number k+1 of the parity check matrix initial value table of the DVB method is different depending on the information length K.

The relationship of Expression (9) is established between the information length K and the row number k+1 of the parity check matrix initial value table.

$$K=(k+1)\times 360 \tag{9}$$

Here, 360 of Expression (9) is the unit size P described in FIG. 16.

In the parity check matrix initial value table of FIG. 21, thirteen values are arranged from the first row to the third row, and three values are arranged from the fourth row to the (k+1)-th row (30th row in FIG. 21).

Accordingly, the column weight of the parity check matrix H obtained from the parity check matrix initial value table of FIG. 21 is 13 from the first column to the (1+360×(3−1)−1)-th column, and is 3 from the (1+360×(3−1))-th column to the K-th column.

The first row of the parity check matrix initial value table of FIG. 21 is 0, 2084, 1613, 1548, 1286, 1460, 3196, 4297, 2481, 3369, 3451, 4620, and 2622, and this means that the elements of the rows having row numbers of 0, 2084, 1613, 1548, 1286, 1460, 3196, 4297, 2481, 3369, 3451, 4620, and 2622 are 1s (and other elements are 0s) in the first column of parity check matrix H.

The second row of the parity check matrix initial value table of FIG. 21 is 1, 122, 1516, 3448, 2880, 1407, 1847, 3799, 3529, 373, 971, 4358, and 3108, and this means that the elements of the rows having row numbers of 1, 122, 1516, 3448, 2880, 1407, 1847, 3799, 3529, 373, 971, 4358, and 3108 are 1s in the (361(=1+360×(2−1)))-th row of the parity check matrix H.

As stated above, in the parity check matrix initial value table, the positions of the elements of 1s of the information matrix $H_A$ of the parity check matrix H are represented for every 360 columns.

Columns other than the (1+360×(i−1))-th column of the parity check matrix H, that is, the respective columns from the (2+360×(i−1))-th column to the (360×i)-th column are arranged by periodically cyclic-shifting the elements of 1s of the (1+360×(i−1))-th column determined by the parity check matrix initial value table in the lower direction (lower direction of the columns) according to the parity length M.

That is, for example, the (2+360×(i−1))-th column is obtained by cyclic-shifting the (1+360×(i−1))-th column in the lower direction by M/360(=q), and the next (3+360×(i−1))-th column is obtained by cyclic-shifting ((2+360×(i−1))-th column obtained by cyclic-shifting the (1+360×(i−1))-th column in the lower direction by 2×M/360(=2×q) in the lower direction by M/360(=q).

When the value of the j-th column (the j-th column from the left) of the i-th row (i-th row from the top) of the parity check matrix initial value table is represented as $h_{i,j}$, and a row number of a j-th element of 1 of the w-th column of the parity check matrix H is represented as $H_{w-j}$, the row number $H_{w-j}$ of the element of 1 of the w-th column which is a column other than the (1+360×(i−1))-th column of the parity check matrix H can be obtained using Expression (10).

$$H_{w-j}=\mathrm{mod}\{h_{i,j}+\mathrm{mod}((w-1),P)\times q,M\} \tag{10}$$

Where, mod(x, y) means a remainder obtained by dividing x by y.

In the first embodiment, P is the aforementioned unit size, and is 360 as in the standard of, for example, DVB-S.2, DVB-T.2 and DVB-C.2. Furthermore, q is a value of M/360 obtained by dividing the parity length M by the unit size P (=360).

The parity check matrix generating module 613 (FIG. 18) specifies the row number of the element of 1 of the (1+360×(i−1))-th column of the parity check matrix H by using the parity check matrix initial value table.

Moreover, the parity check matrix generating module 613 (FIG. 18) obtains the row number $H_{w-j}$ of the element of 1 of the w-th column which is the column other than the (1+360×(i−1))-th column of the parity check matrix H according to Expression (10), and the parity check matrix H having the element of 1 of the row number as obtained above is generated.

Figures 22, 23:
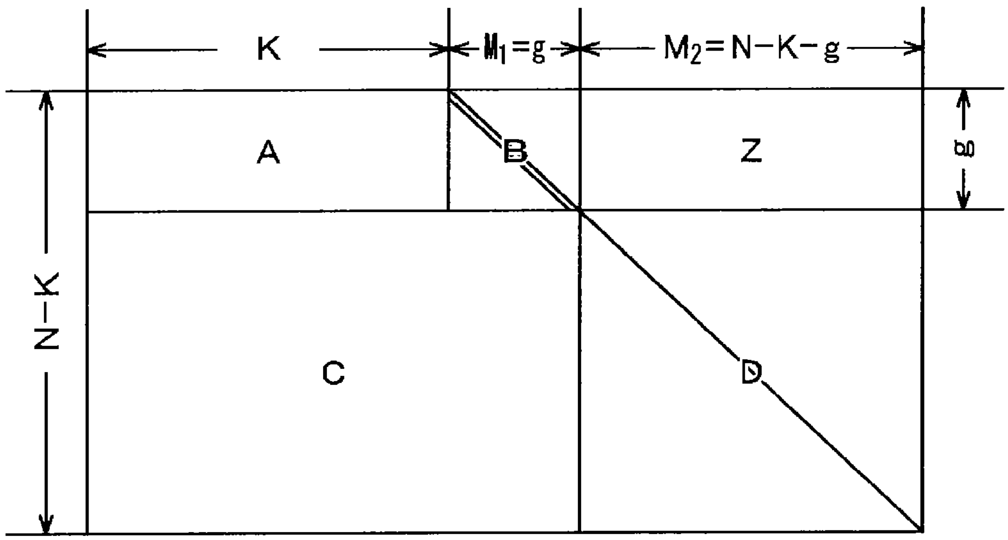
FIG. 22 is a diagram showing a structure of the parity check matrix.
FIG. 23 is a diagram showing an example of the parity check matrix initial value table.

FIG. 22 is a diagram showing the structure of the parity check matrix of the ETRI method.

The parity check matrix of the ETRI method includes an A matrix, a B matrix, a C matrix, a D matrix, and a Z matrix.

The A matrix is a matrix on an upper left side of the parity check matrix which is expressed as information length K of LDPC code=code length N×code rate r and a predetermined value g and has g rows and k columns.

The B matrix is a matrix which has g rows and g columns and has a dual diagonal structure which is adjacent to a right side of the A matrix.

The C matrix is a matrix which has N−K−g rows and K+g columns and is adjacent to a lower side of the A matrix and the B matrix.

The D matrix is a unit matrix which has N−K−g rows and N−K−g columns and is adjacent to a right side of the C matrix.

The Z matrix is a zero matrix (0 matrix) which has g rows and N−K−g columns and is adjacent to a right side of the B matrix.

In the parity check matrix of the ETRI method including the A matrix to the D matrix and the Z matrix described above, a part of the A matrix and the C matrix constitutes the information matrix, and the remaining part of the B matrix and the C matrix, the D matrix and the Z matrix constitute the parity matrix.

Since the B matrix is the matrix having the dual diagonal structure and the D matrix is the unit matrix, a part (a part of the B matrix) of the parity matrix of the parity check matrix of the ETRI method has the dual diagonal structure, and the remaining part thereof (a part of the D matrix) is the diagonal matrix (unit matrix).

Similarly to the information matrix of the parity check matrix of the DVB method, the A matrix and the C matrix have the cyclic structure for every 360 columns (unit size P), and in the parity check matrix initial value table of the ETRI method, the positions of the elements of 1s of the A matrix and the C matrix are represented for every 360 columns.

Here, as described above, since a part of the A matrix and the C matrix constitutes the information matrix, in the parity check matrix initial value table of the ETRI method in which the positions of the elements of 1s of the A matrix and the C matrix are represented for every 360 columns, at least the positions of the elements of 1s of the information matrix can be represented for every 360 columns.

FIG. 23 is a diagram showing an example of the parity check matrix initial value table of the ETRI method.

That is, FIG. 23 shows an example of the parity check matrix initial value table for the parity check matrix having a code length N of 50 bits and a code rate r of 1/2.

The parity check matrix initial value table of the ETRI method is a table in which the positions of the elements of 1s of the A matrix and the C matrix are represented for each unit size P, and the row numbers of the elements of 1s of the (1+P×(i−1))-th column of the parity check matrix (the row numbers in which the row numbers of the first row of the parity check matrix are 0s) are arranged in the i-th column by the column weight of the columns of the (1+P×(i−1))-th column.

Here, for the sake of convenience in the description, the unit size P is, for example, 5.

As parameters of the parity check matrix of the ETRI method, there are $g=M_1$, $M_2$, $Q_1$, and $Q_2$.

$g=M_1$ is a parameter for determining the size of the B matrix, and is a value of a multiple of the unit size P. When the performance of the LDPC code is changed by adjusting $g=M_1$ and the parity check matrix is determined, a predetermined value is adjusted. Here, it is assumed that $g=M_1$, and the unit size P=5 multiplied by 3=15.

$M_2$ is a value $M-M_1$ which is the parity length M minus $M_1$.

Here, since the information length K is N×r=50×1/2=25 and the parity length M is N−K=50−25=25, $M_2$ is $M-M_1=25-15=10$.

$Q_1$ is obtained according to the expression $Q_1=M_1/P$, and represents the number of shifts (the number of rows) in the cyclic shifting in the A matrix.

That is, the columns other than the (1+P×(i−1))-th column of the A matrix of the parity check matrix of the ETRI method, that is, the respective columns from the (2+P×(i−1))-th column to the (P×i)-th column are arranged by periodically cyclic-shifting the elements of 1s of the (1+360×(i−1))-th columns determined by the parity check matrix initial value table in the lower direction (lower direction of the columns), and $Q_1$ represents the number of shifts in the cyclic shifting in the A matrix.

$Q_2$ is obtained according to the expression $Q_2=M_2/P$, and represents the number of shifts (the number of rows) in the cyclic shifting in the C matrix.

That is, the columns other than the (1+P×(i−1))-th column of the C matrix of the parity check matrix of the ETRI method, that is, the respective columns from the (2+P×(i−1))-th column to the (P×i)-th column are arranged by periodically cyclic-shifting the elements of 1s of the (1+360×(i−1))-th column determined by the parity check matrix initial value table in the lower direction (lower direction of the columns), and $Q_2$ represents the number of shifts in the cyclic shifting in the C matrix.

Here, $Q_1$ is $M_1/P=15/5=3$, and $Q_2$ is $M_2/P=10/5=2$.

In the parity check matrix initial value table of FIG. 23, three values are arranged in the first row and the second row, and one value is arranged from the third row to the fifth row. According to the arrangement of these values, the column weight of the parity check matrix obtained from the parity check matrix initial value table of FIG. 23 is 3 from the first column to the (1+5×(2−1)−1)-th column, and is 1 from the (1+5×(2−1))-th column to the fifth column.

That is, the first row of the parity check matrix initial value table of FIG. 23 is 2, 6, and 18, and this means that the elements of the respective rows having the row numbers of 2, 6, and 18 are 1s (and other elements are 0s) in the first column of the parity check matrix.

In this case, since the A matrix is a matrix in 15 rows and 25 columns (g rows and K columns) and the C matrix is the matrix in 10 rows and 40 columns (N−K−g rows and K+g columns), the rows having row numbers of 0 to 14 of the parity check matrix are the rows of the A matrix, and the rows having row numbers of 15 to 24 of the parity check matrix are rows of the C matrix.

Accordingly, among the rows having the row numbers of 2, 6 and 18 (hereinafter, described as the rows #2, #6, and #18), the rows #2 and #6 are the rows of the A matrix, and the row #18 is the row of the C matrix.

The second row of the parity check matrix initial value table of FIG. 23 is 2, 10, and 19, and this means that the elements of the rows #2, #10, and #19 are 1s in the 6(=1+5×(2−1))-th column of the parity check matrix.

Here, the rows #2 and #10 of the rows #2, #10, and #19 in the 6(=1+5×(2−1))-th column of the parity check matrix are the rows of the A matrix, and the row #19 is the row of the C matrix.

The third row of the parity check matrix initial value table of FIG. 23 is 22, and this means that the elements of the row #22 in the 11(=1+5×(3−1))-th row of the parity check matrix are 1s.

Here, the row #22 in the 11(=1+5×(3−1))-th row of the parity check matrix is the row of the C matrix.

Similarly, 19 of the fourth row of the parity check matrix initial value table of FIG. 23 means that the elements of the row #19 in the 16(=1+5×(4-1))-th column of the parity check matrix are 1s, and 15 of the fifth row of the parity check matrix initial value table of FIG. 23 means that the elements of the row #15 in the 21(=1+5×(5-1))-th column are 1s.

As stated above, in the parity check matrix initial value table, the positions of the elements of 1s of the A matrix and the C matrix of the parity check matrix are represented for each unit size P=5.

The columns other than the (1+5×(i−1))-th column of the A matrix and the C matrix of the parity check matrix, that is, the respective columns from the (2+5×(i−1))-th column to the (5×i)-th column are arranged by periodically cyclic-shifting the elements of 1s of the (1+5×(i−1))-th columns determined by the parity check matrix initial value table in the lower direction (lower direction of the columns) according to the parameters $Q_1$ and $Q_2$.

That is, for example, the (2+5×(i−1))-th column of the A matrix is obtained by cyclic-shifting the (1+5×(i−1))-th column in the lower direction by $Q_1$(=3), and the next (3+5×(i−1))-th column is obtained by cyclic-shifting the (2+5×(i−1))-th column obtained by cyclic shifting the (1+5×(i−1))-th column in the lower direction by $2\times Q_1$(=2×3) in the lower direction by $Q_1$.

For example, the (2+5×(i−1))-th column of the C matrix is obtained by cyclic-shifting the (1+5×(i−1))-th column in the lower direction by $Q_2$(=2), and the next (3+5×(i−1))-th column is obtained by cyclic-shifting the (2+5×(i−1))-th column obtained by cyclic-shifting the (1+5×(i−1))-th column in the lower direction by $2\times Q_2$(=2×2) in the lower direction by $Q_2$.

Figure 24:
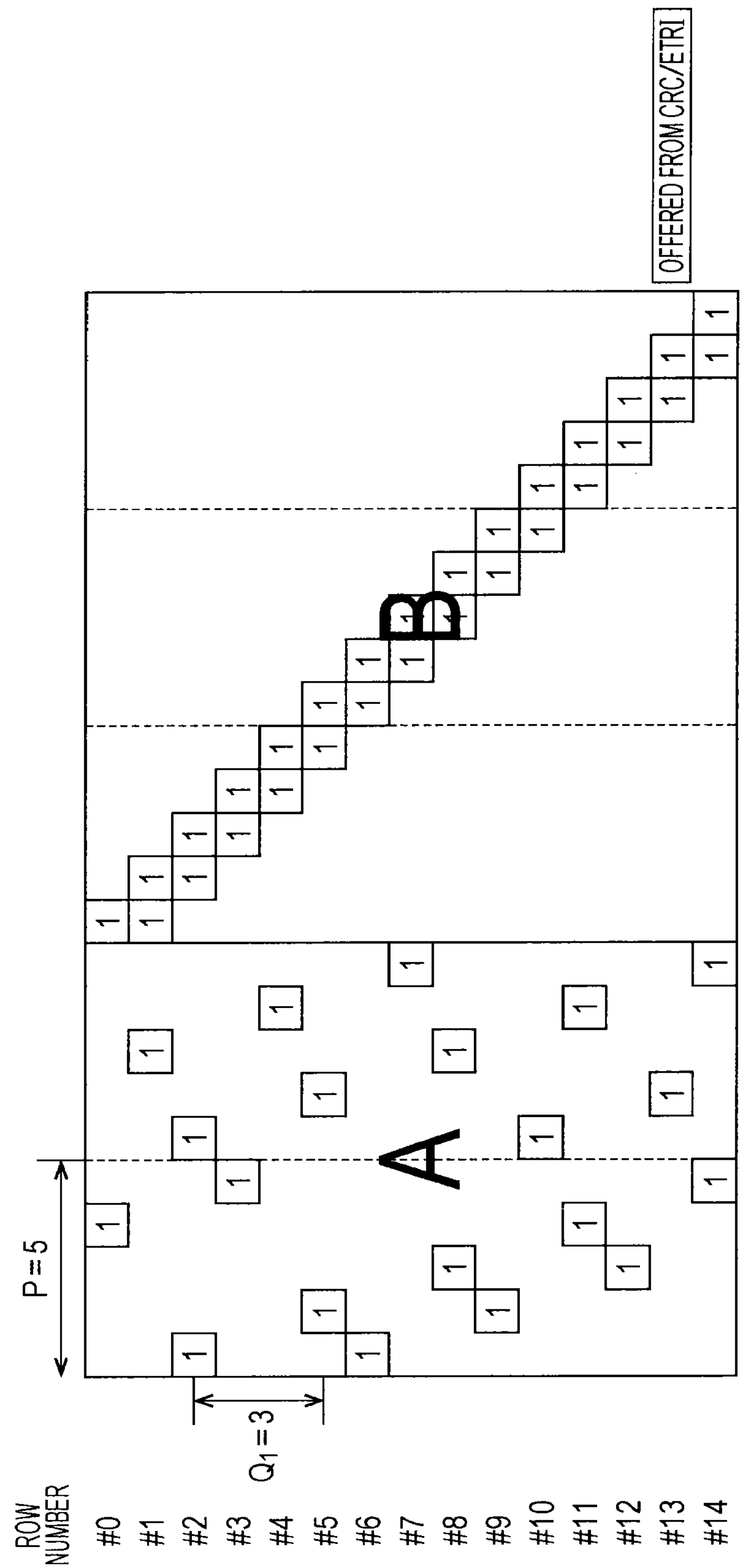
FIG. 24 is a diagram for describing an A matrix generated from the parity check matrix initial value table.

FIG. 24 is a diagram showing the A matrix generated from the parity check matrix initial value table of FIG. 23.

In the A matrix of FIG. 24, according to the first row of the parity check matrix initial value table of FIG. 23, the elements of the rows #2 and #6 of the 1(=1+5×(1−1))-st column are 1s.

Moreover, the respective columns from the 2(=2+5×(1-1))-nd column to the 5(=5+5×(1-1))-th column are obtained by cyclic-shifting the immediately previous columns in the lower direction by $Q_1$=3.

In the A matrix of FIG. 24, according to the second row of the parity check matrix initial value table of FIG. 23, the elements of the rows #2 and #10 of the 6(=1+5×(2−1))-th column are 1s.

The respective columns from the 7(=2+5×(2−1))-th column to the 10(=5+5×(2−1))-th column are obtained by cyclic-shifting the immediately previous columns in the lower direction by $Q_1$=3.

Figure 25:
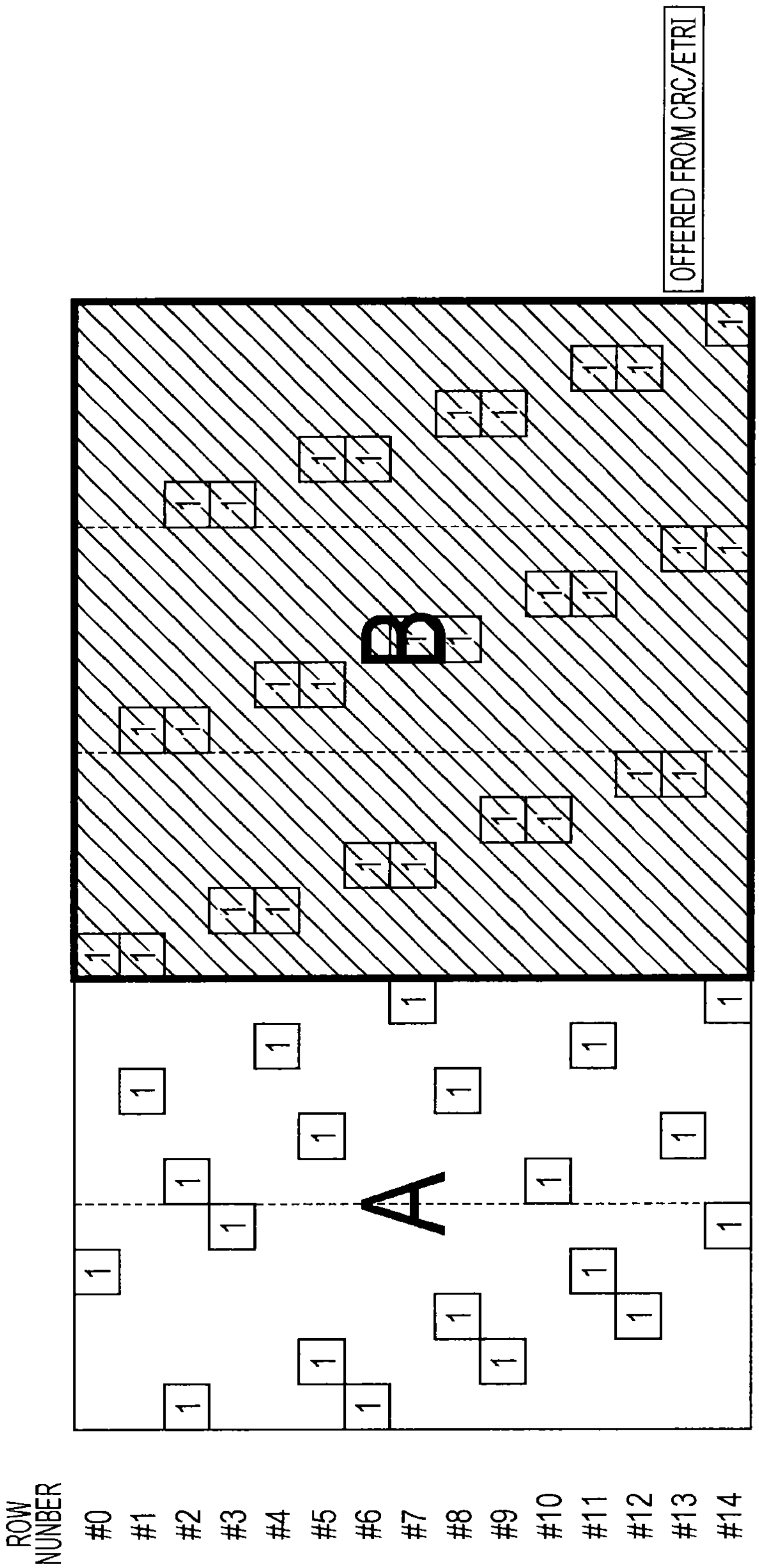
FIG. 25 is a diagram for describing parity interleaving on a B matrix.

FIG. 25 is a diagram showing the parity interleaving on the B matrix.

The parity check matrix generating module 613 (FIG. 18) generates the A matrix by using the parity check matrix initial value table, and arranges the B matrix having the dual diagonal structure so as to be adjacent to the right side of the A matrix. The parity check matrix generating module 613 regards the B matrix as the parity matrix, and performs the parity interleaving such that the adjacent elements of 1s of the B matrix having the dual diagonal structure are separated from each other by the unit size P=5 in the row direction.

FIG. 25 shows the B matrix and the A matrix on which the parity interleaving has been performed on the B matrix.

Figure 26:
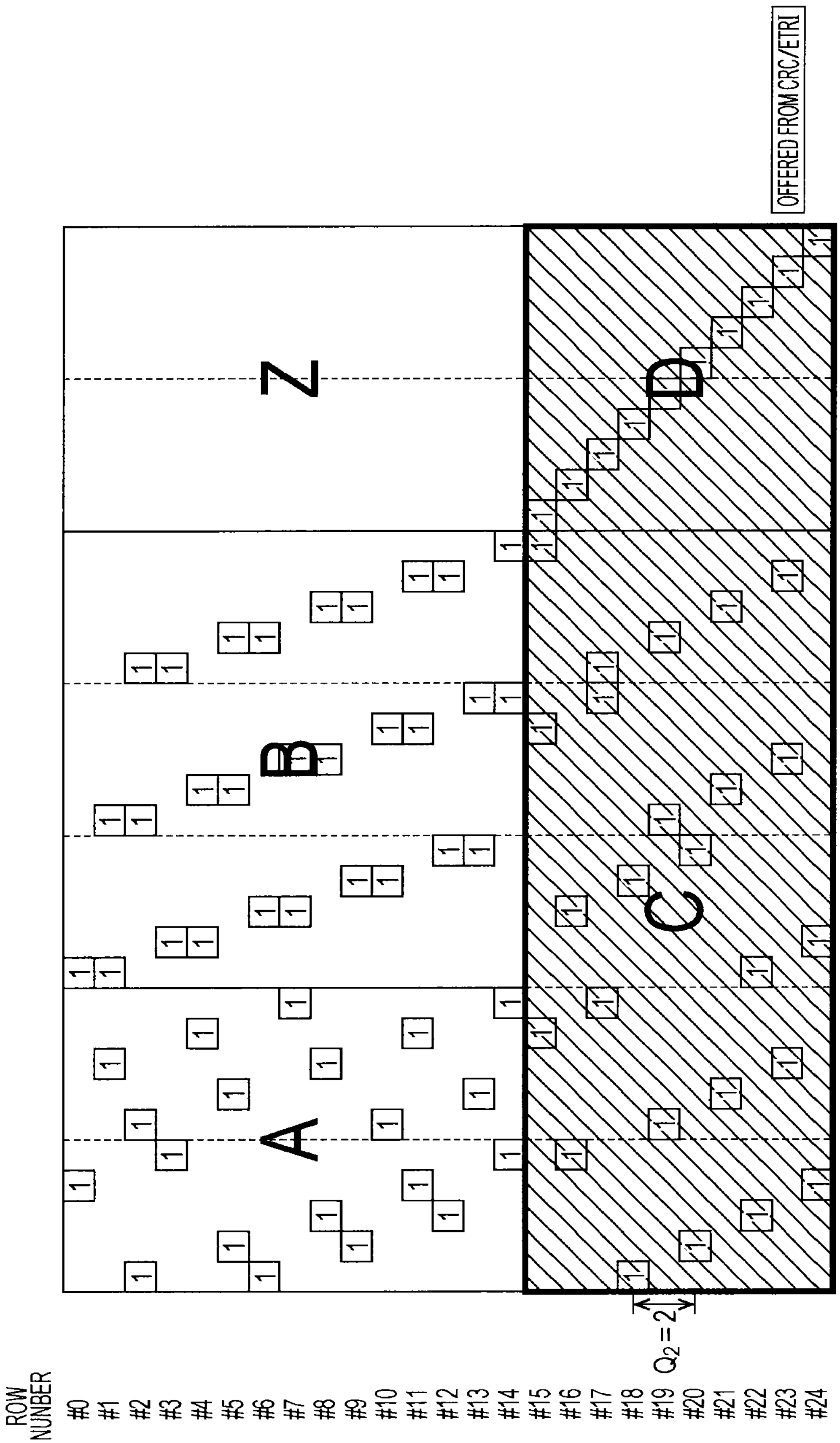
FIG. 26 is a diagram for describing a C matrix generated from the parity check matrix initial value table.

FIG. 26 is a diagram showing the C matrix generated from the parity check matrix initial value table of FIG. 23.

In the C matrix of FIG. 26, according to the first row of the parity check matrix initial value table of FIG. 23, the elements of the row #18 of the 1(=1+5×(1−1))-st column of the parity check matrix are 1s.

The respective columns from the 2(=2+5×(1-1))-nd column to the 5(=5+5×(1−1))-th column of the C matrix are obtained by cyclic-shifting the immediately previous columns in the lower direction by $Q_2$=2.

In the C matrix of FIG. 26, according to the second row to the fifth row of the parity check matrix initial value table of FIG. 23, the elements of the row #19 of the 6(=1+5×(2−1))-th column of the parity check matrix, the row #22 of the 11(=1+5×(3−1))-th column, the row #19 of the 16(=1+5×(4−1))-th column, and the row #15 of the 21(=1+5×(5-1))-st column are 1s.

The respective columns from the 7(=2+5×(2−1))-th column to the 10(=5+5×(2−1))-th column, the respective columns from the 12(=2+5×(3-1))-th column to the 15(=5+5×(3−1))-th column, the respective columns from the 17(=2+5×(4−1))-th column to the 20(=5+5×(4−1))-th column, and the respective columns from the 22(=2+5×(5−1))-nd column to the 25(=5+5×(5−1))-th column are obtained by cyclic shifting the immediately previous columns in the lower direction by $Q_2$=2.

The parity check matrix generating module 613 (FIG. 18) generates the C matrix by using the parity check matrix initial value table, and arranges the C matrix under the A matrix and the B matrix (on which the parity interleaving has been performed).

Further, the parity check matrix generating module 613 arranges the Z matrix so as to be adjacent to the right side of the B matrix, arranges the D matrix to be adjacent to the right side of the C matrix, and generates the parity check matrix shown in FIG. 26.

Figure 27:
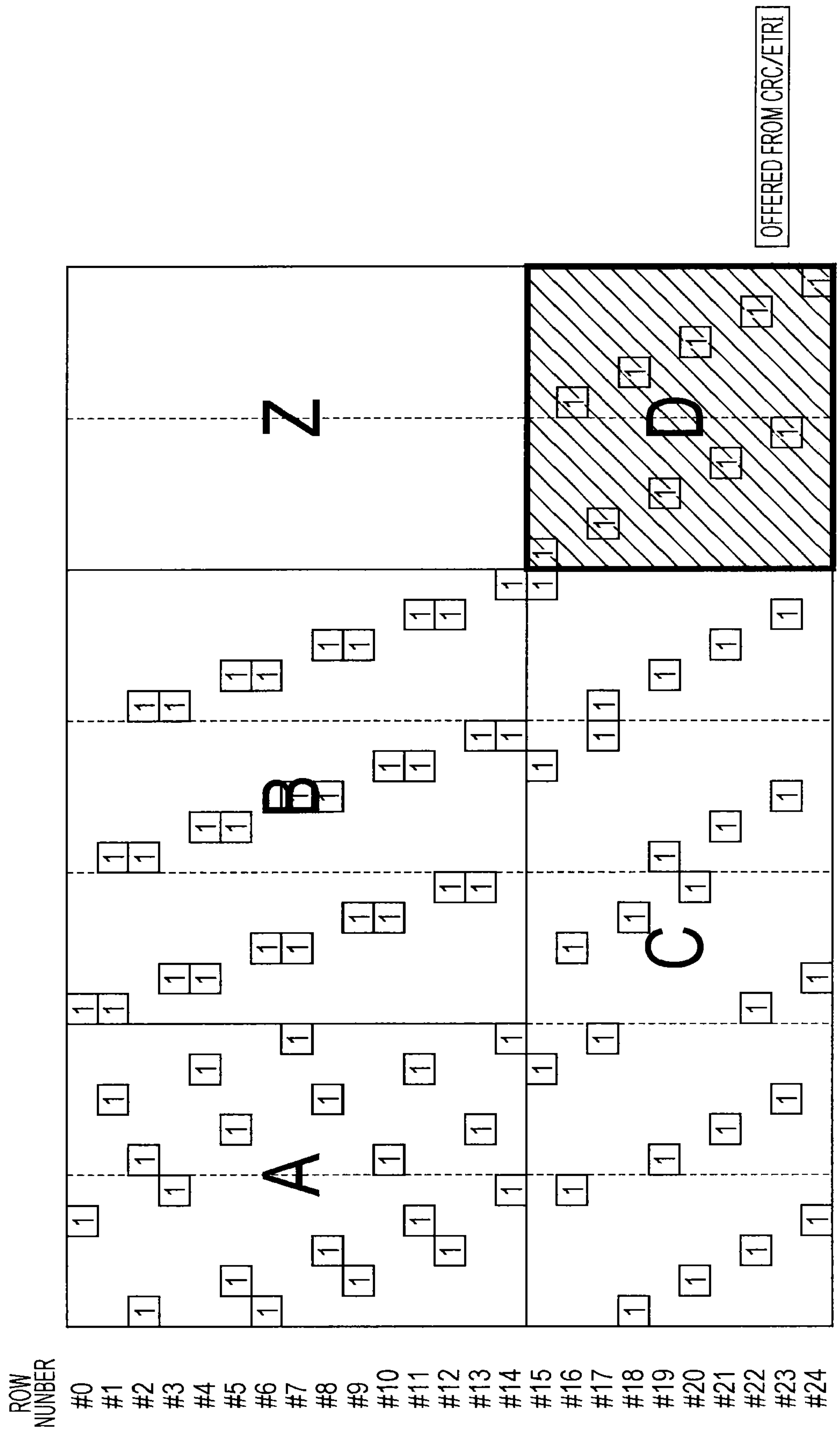
FIG. 27 is a diagram for describing parity interleaving on a D matrix.

FIG. 27 is a diagram showing the parity interleaving on the D matrix.

After the parity check matrix of FIG. 26 is generated, the parity check matrix generating module 613 regards the D matrix as the parity matrix, and performs the parity interleaving on only the D matrix such that the elements of 1s of the odd-number rows and the next even-number rows of the D matrix of the unit matrix are separated from each other by the unit size P=5.

FIG. 27 shows the parity check matrix on which the parity interleaving has been performed on the D matrix for the parity check matrix of FIG. 26.

(The encoding parity calculating module 615 (FIG. 18) of) the LDPC encoder 115 performs the LDPC encoding (generates the LDPC code) by using, for example, the parity check matrix of FIG. 27.

Here, the LDPC code generated using the parity check matrix of FIG. 27 is the LDPC code on which the parity interleaving has been performed, and thus, it is not necessary to perform the parity interleaving on the LDPC code generated using the parity check matrix of FIG. 27 in the parity interleaver 23 (FIG. 9).

Figure 28:
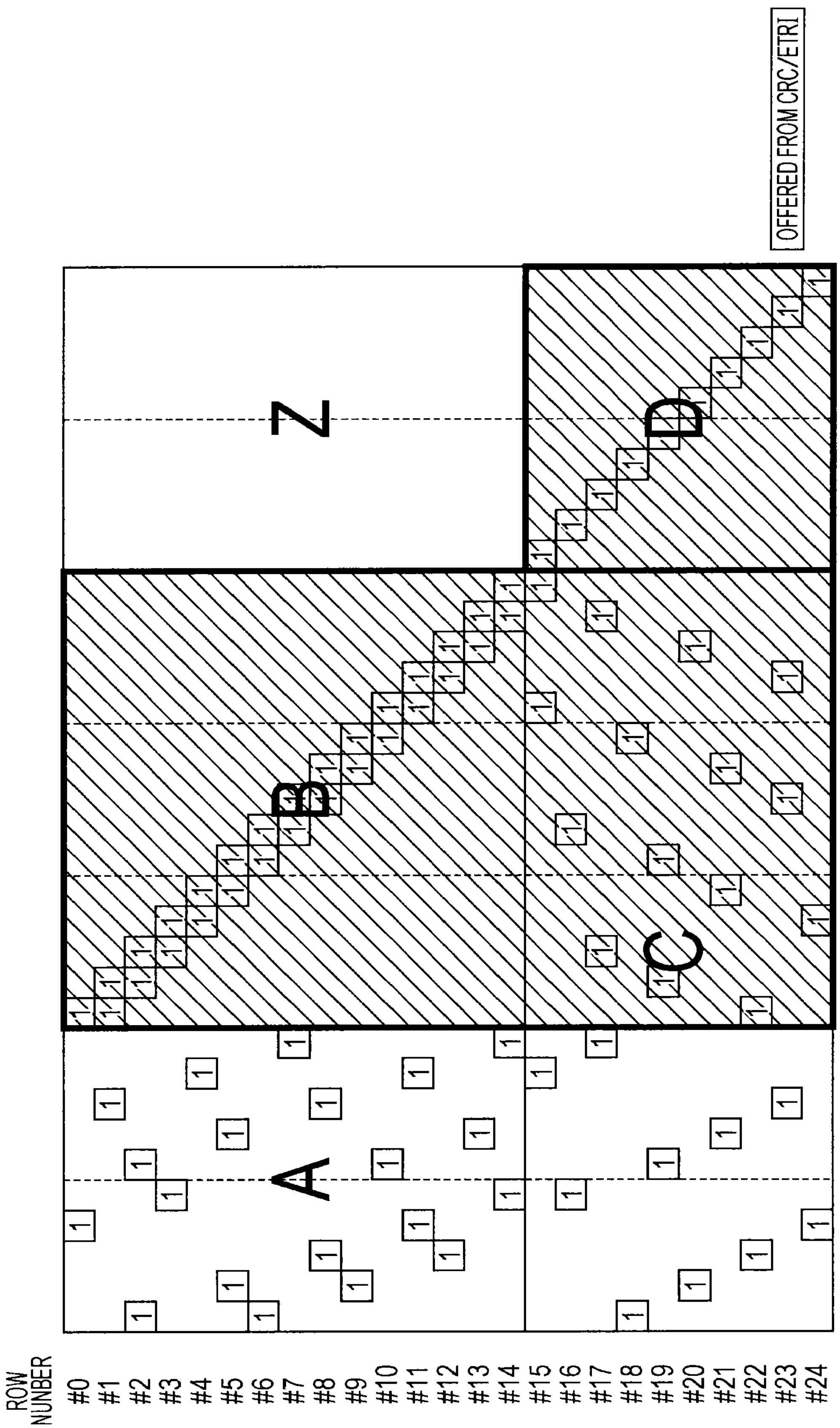
FIG. 28 is a diagram showing a parity check matrix obtained by performing column permutation as parity interleaving that returns the parity interleaving to an original state on the parity check matrix.

FIG. 28 is a diagram showing a parity check matrix obtained by performing the column permutation as the parity interleaving that returns the parity interleaving to the original state on the B matrix, a part of the C matrix (a part of the C matrix which is arranged under the B matrix) and the D matrix of the parity check matrix of FIG. 27.

In the LDPC encoder 115, it is possible to perform the LDPC encoding (generate the LDPC code) by using the parity check matrix of FIG. 28.

When the LDPC encoding is performed using the parity check matrix of FIG. 28, the LDPC code on which the parity interleaving has not been performed is obtained according to the LDPC encoding. Accordingly, when the LDPC encoding is performed using the parity check matrix of FIG. 28, the parity interleaving is performed in the parity interleaver 23 (FIG. 9).

Figure 29:
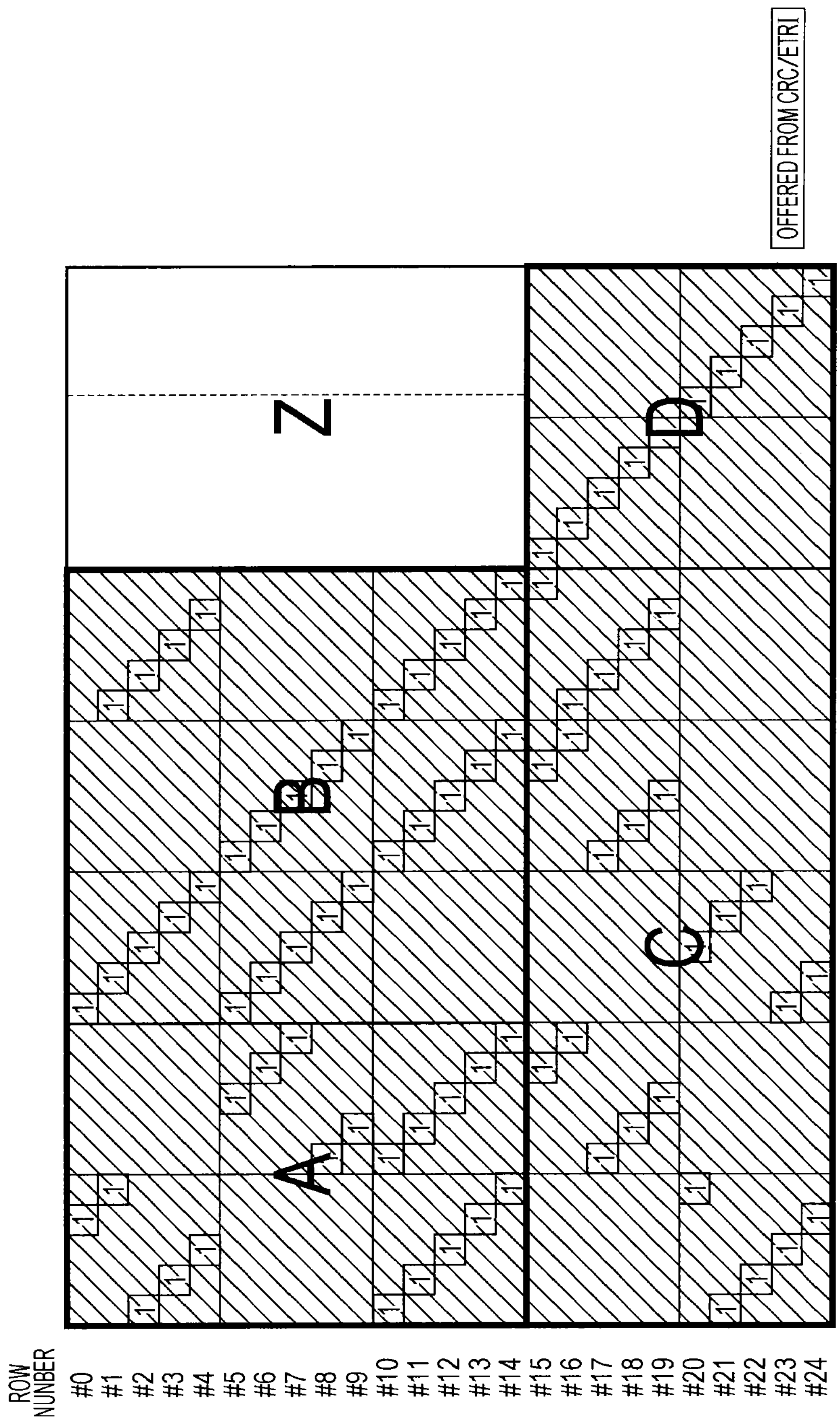
FIG. 29 is a diagram showing a transformation check matrix obtained by performing row permutation on the parity check matrix.

FIG. 29 is a diagram showing a transformation check matrix obtained by performing the row permutation on the parity check matrix of FIG. 27.

As will be described below, the transformation check matrix is a matrix represented by combining a unit matrix of P×P, a quasi-unit matrix in which one or more 1s of 1s of the unit matrix are 0s, a shift matrix obtained by cyclic-shifting the unit matrix or the quasi-unit matrix, a sum matrix which is the sum of two or more matrices of the unit matrix, the quasi-unit matrix and the shift matrix, and a 0 matrix of P×P.

By using the transformation check matrix in the decoding of the LDPC code, it is possible to adopt an architecture in which the check node calculation and the variable node calculation are simultaneously performed P times in the decoding of the LDPC code, as will be described below.

New LDPC Code

The standard of the terrestrial digital television broadcasting called ATSC 3.0 is currently being developed.

Now, a renewed LDPC code (hereinafter, referred to as a new LDPC code) capable of being used in data transmission other than ATSC 3.0 will be described.

For example, as the new LDPC code, it is possible to adopt the LDPC code of the ETRI method or the LDPC code of the DVB method which has the unit size P of 360 which is the same as that of DVB-T.2, and corresponds to the parity check matrix having the cyclic structure.

The LDPC encoder 115 (FIG. 8 and FIG. 18) can perform the LDPC encoding on the new LDPC code by using the parity check matrix obtained from the parity check matrix initial value table of the new LDPC code having a code length N of 16 k bits or 64 k bits and a code rate r of any one of 5/15, 6, 15, 7/15, 8/15, 9/15, 10/15, 11/15, 12/15, and 13/15.

In this case, the parity check matrix initial value table of the new LDPC code is stored in the storage unit 602 of the LDPC encoder 115 (FIG. 8).

Figure 30:
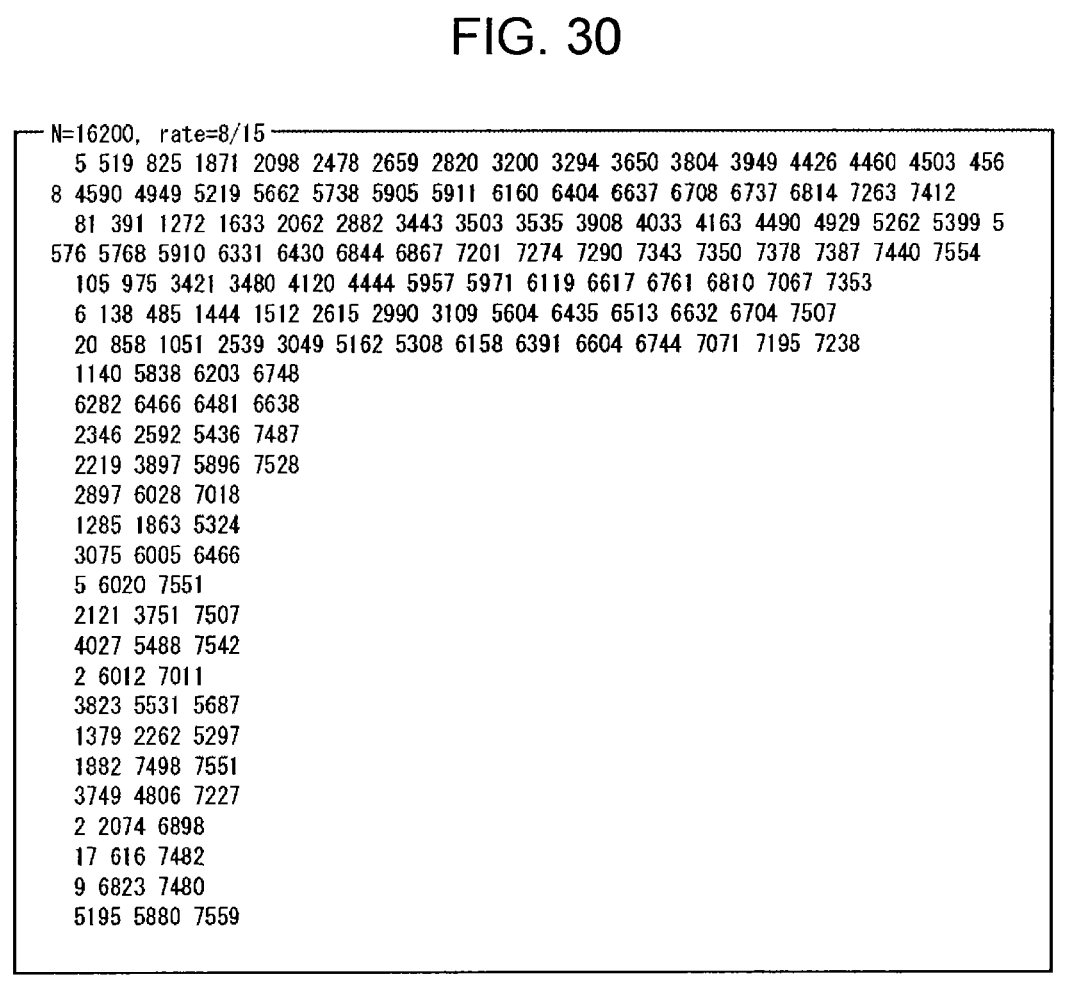

FIG. 30 is a diagram showing an example of the parity check matrix initial value table of the DVB method for the parity check matrix of the new LDPC code (hereinafter, referred to as a Sony code of (16 k, 8/15)) which has a code length N of 16 k bits and a code rate r of 8/15 and is suggested by the present applicant.

Figure 31:
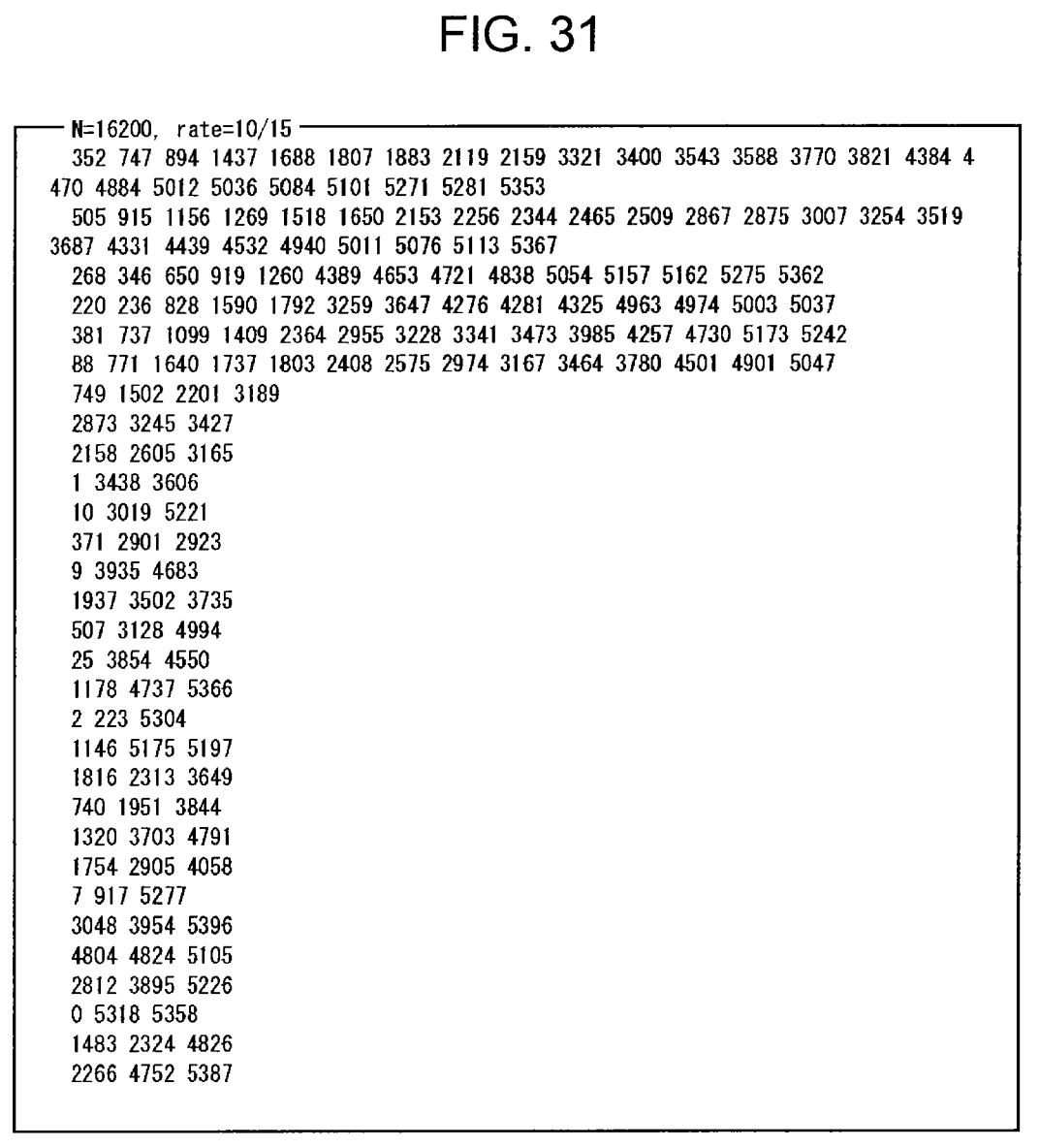

FIG. 31 is a diagram showing an example of the parity check matrix initial value table of the DVB method for the parity check matrix of the new LDPC code (hereinafter, referred to as a Sony code of (16 k, 10/15)) which has a code length N of 16 k bits and a code rate r of 10/15 and is suggested by the present applicant.

FIG. 32 is a diagram showing an example of the parity check matrix initial value table of the DVB method for the parity check matrix of the new LDPC code (hereinafter, referred to as a Sony code of (16 k, 12/15)) which has a code length N of 16 k bits and a code rate r of 12/15 and is suggested by the present applicant.

Figure 33:
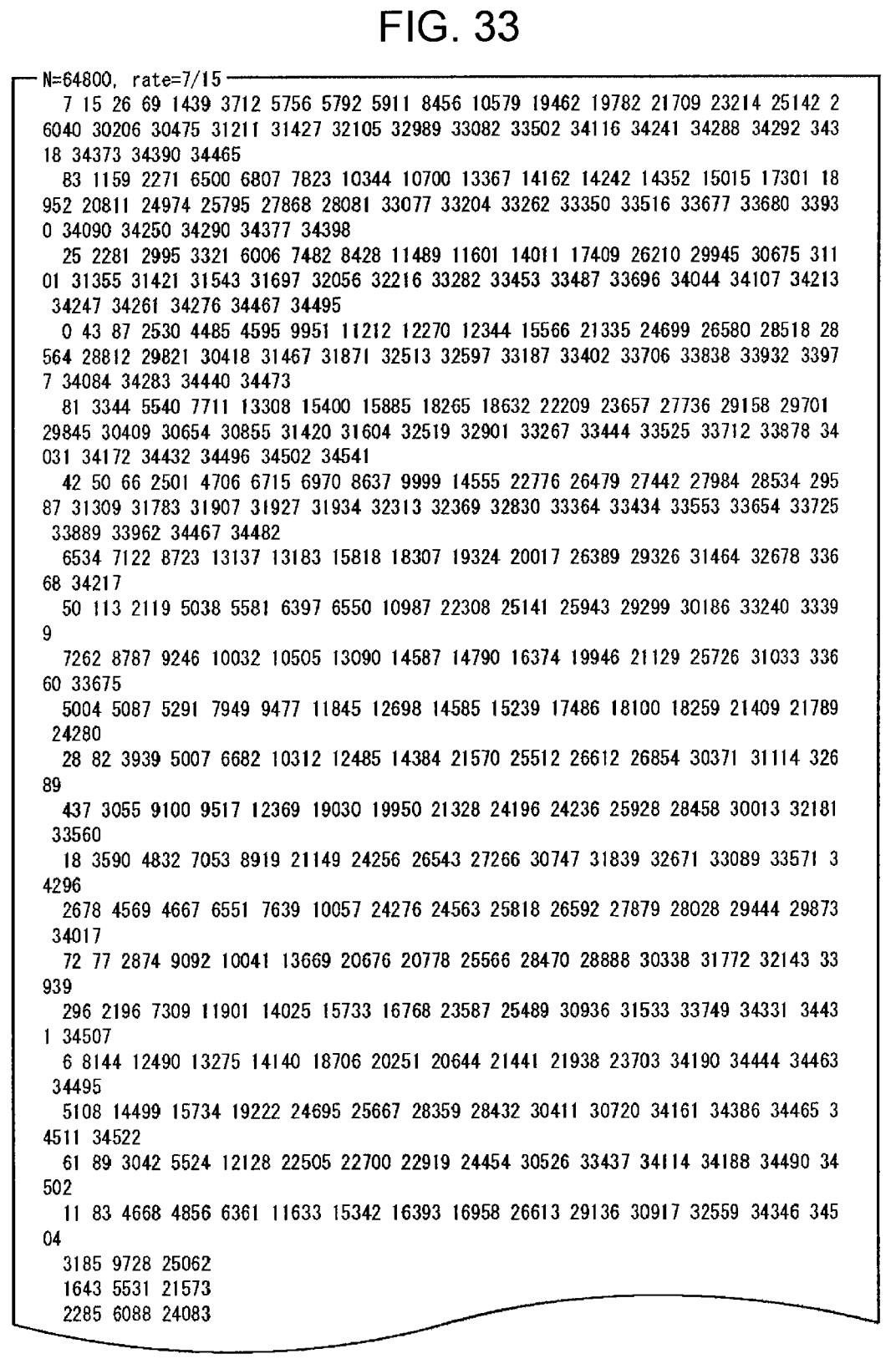
Figure 34:
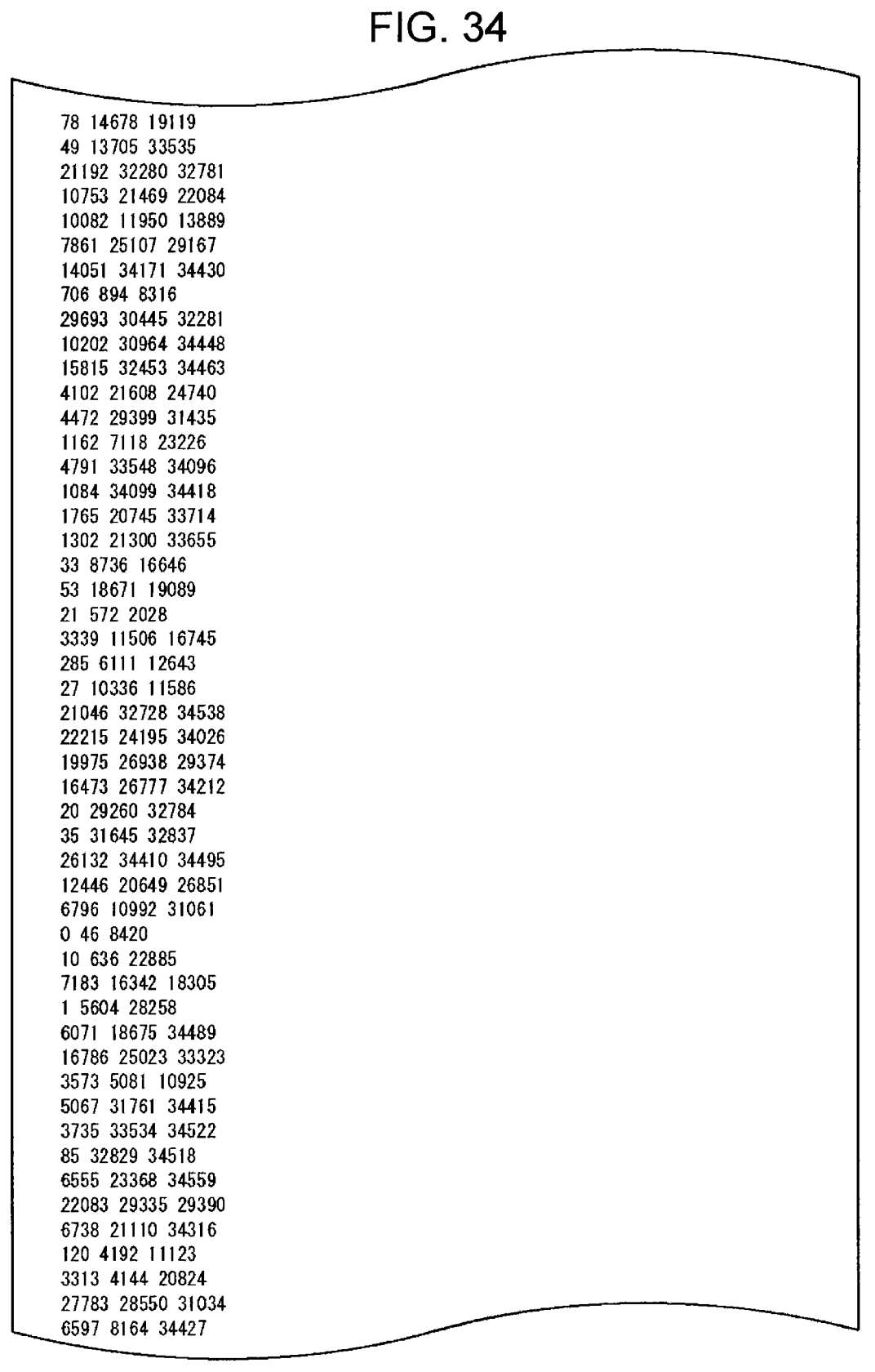
Figure 35:
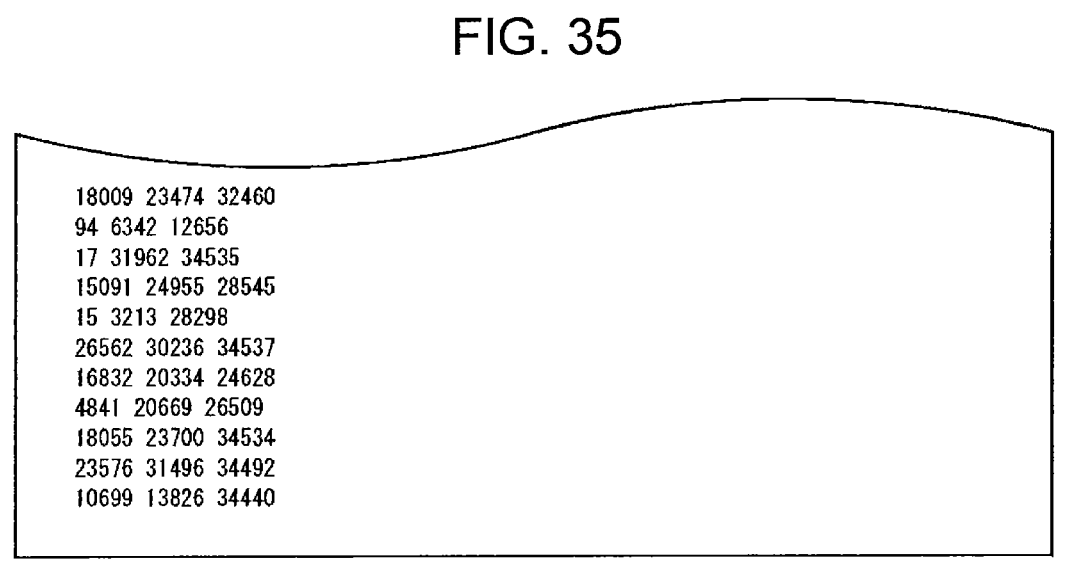

FIGS. 33, 34 and 35 are diagrams showing an example of the parity check matrix initial value table of the DVB method for the parity check matrix of the new LDPC code (hereinafter, referred to as a Sony code of (64 k, 7/15)) which has a code length N of 64 k bits and a code rate of 7/15 and is suggested by the present applicant.

FIG. 34 is a drawing subsequent to FIG. 33, and FIG. 35 is a drawing subsequent to FIG. 34.

Figure 36:
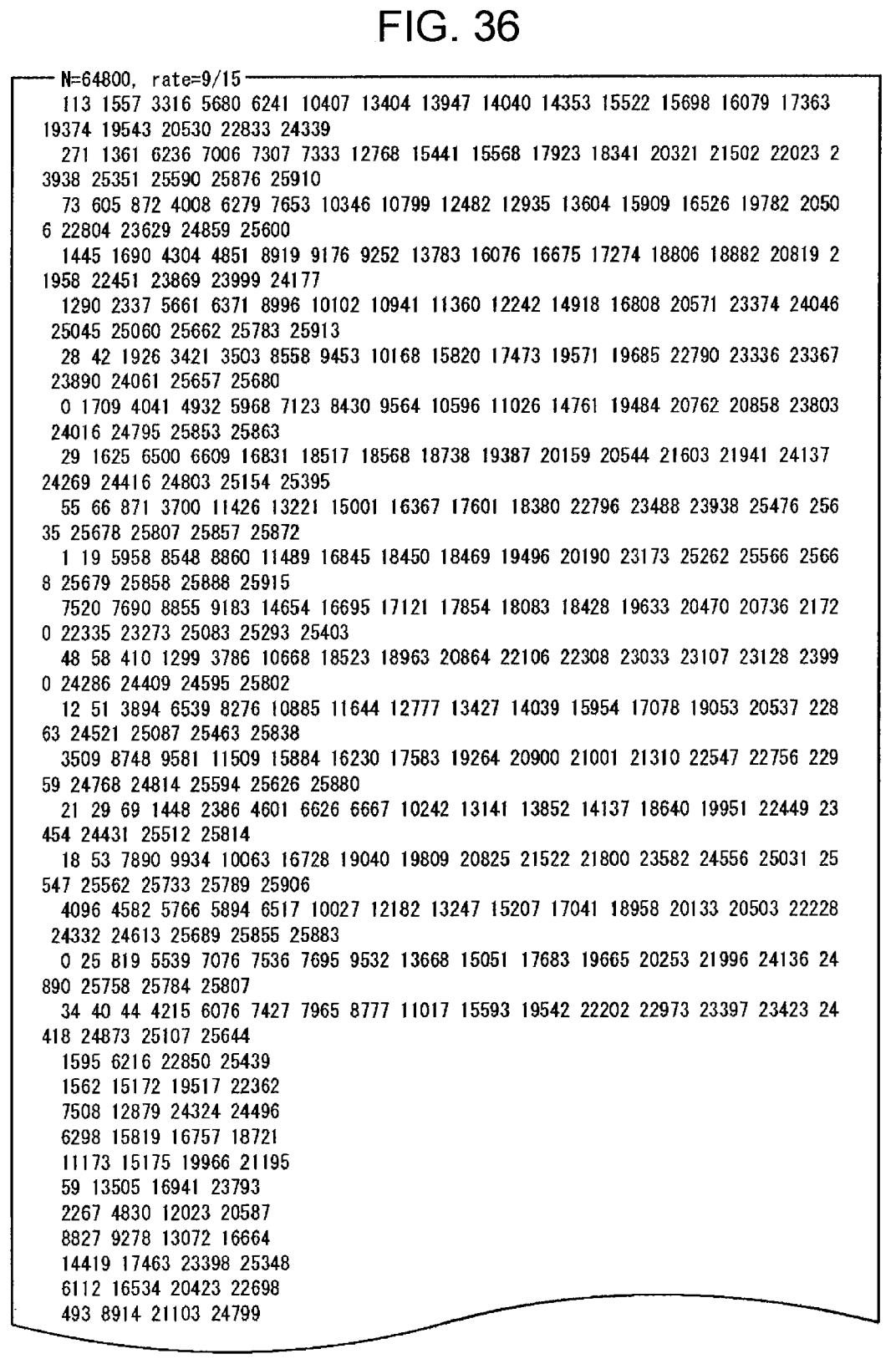
Figure 37:
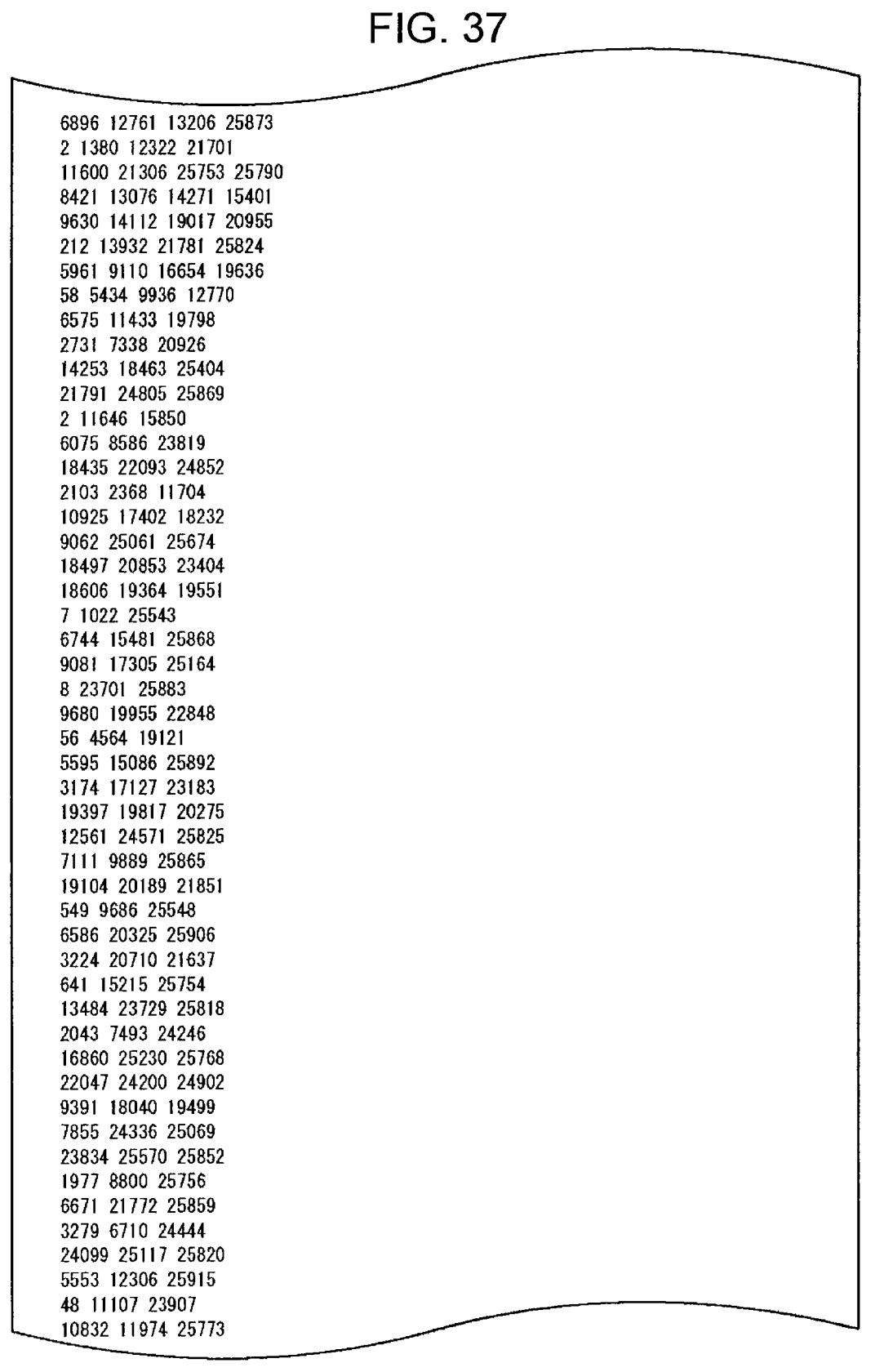
Figure 38:
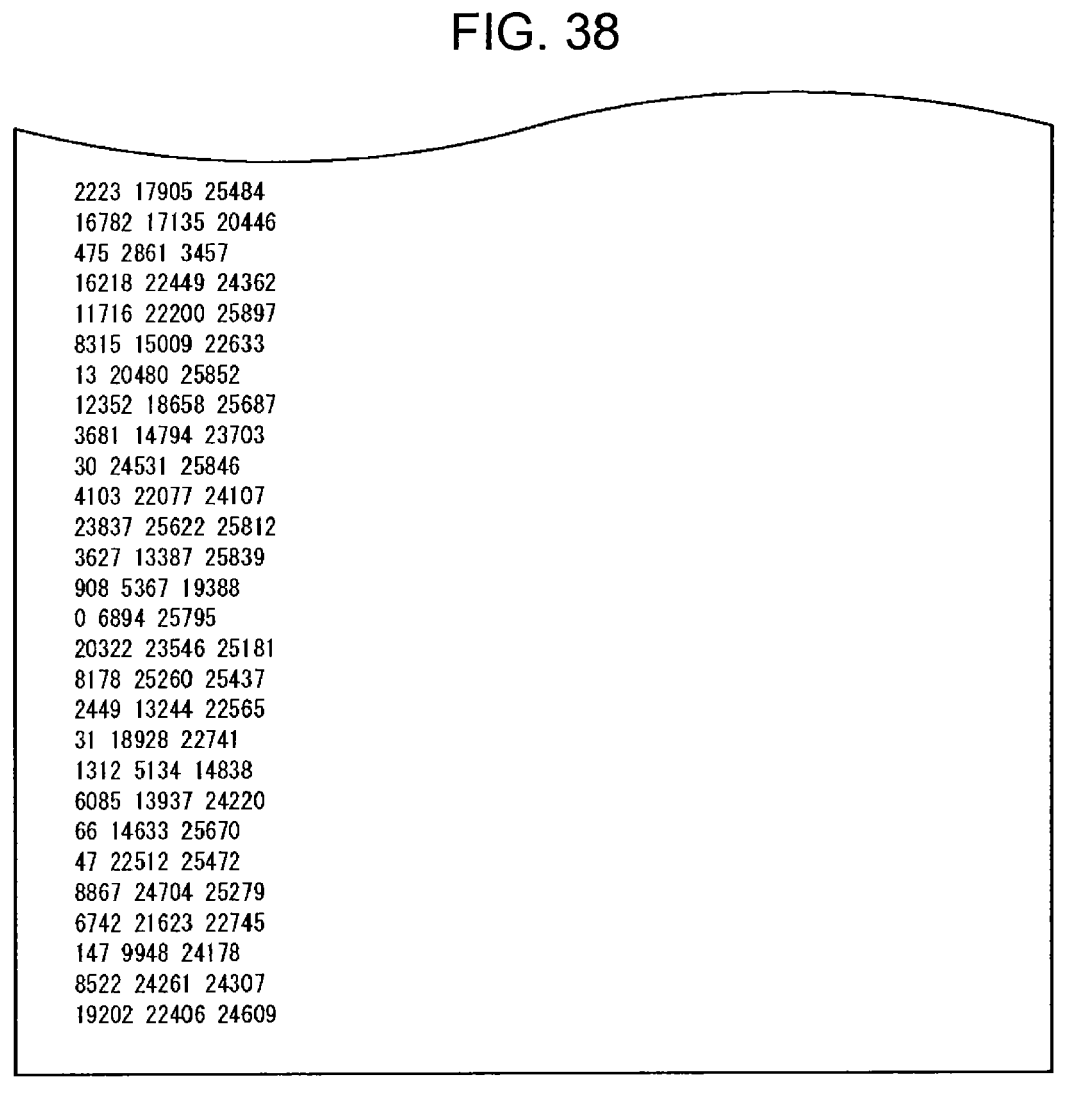

FIGS. 36, 37 and 38 are diagrams showing an example of the parity check matrix initial value table of the DVB method for the parity check matrix of the new LDPC code (hereinafter, referred to as a Sony code of (64 k, 9/15)) which has a code length N of 64 k bits and a code rate r of 9/15 and is suggested by the present applicant.

FIG. 37 is a drawing subsequent to FIG. 36, and FIG. 38 is a drawing subsequent to FIG. 37.

FIGS. 39, 40, 41 and 42 are diagrams showing an example of the parity check matrix initial value table of the DVB method for the parity check matrix of the new LDPC code (hereinafter, referred to as a Sony code of (64 k, 11/15)) which has a code length N of 64 k bits and a code rate r of 11/15 and is suggested by the present applicant.

Figure 39:
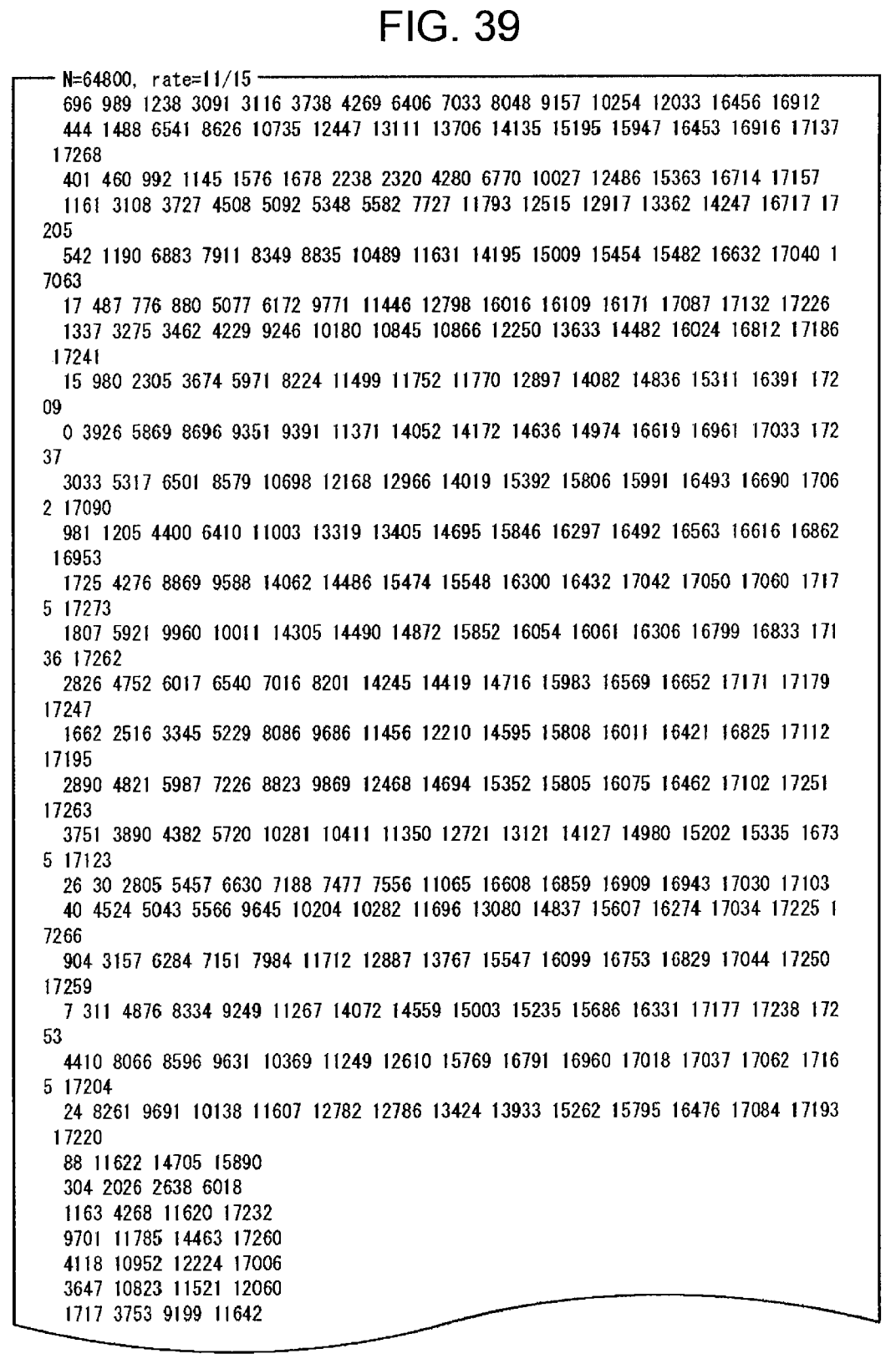
Figure 40:
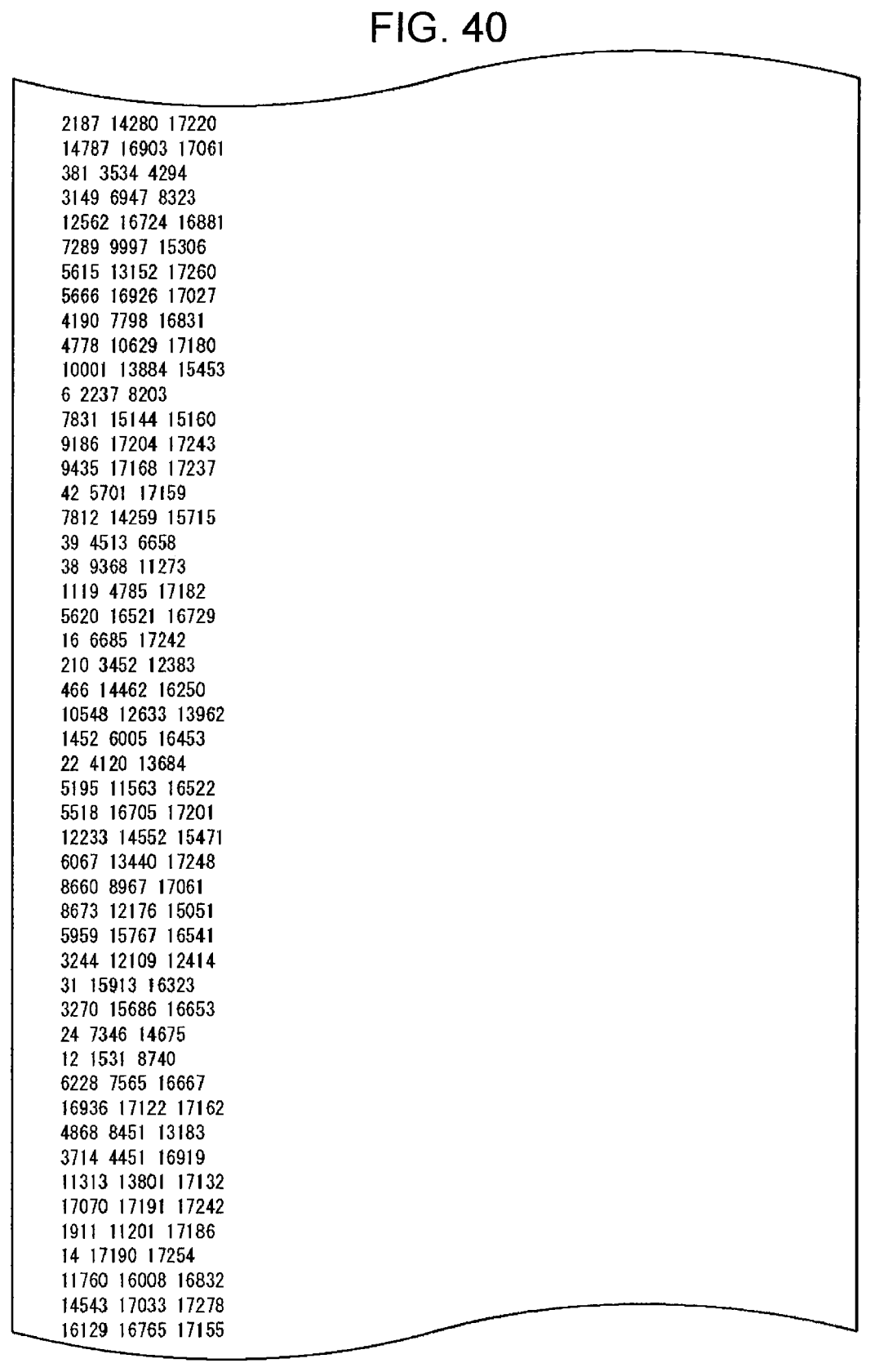
Figure 41:
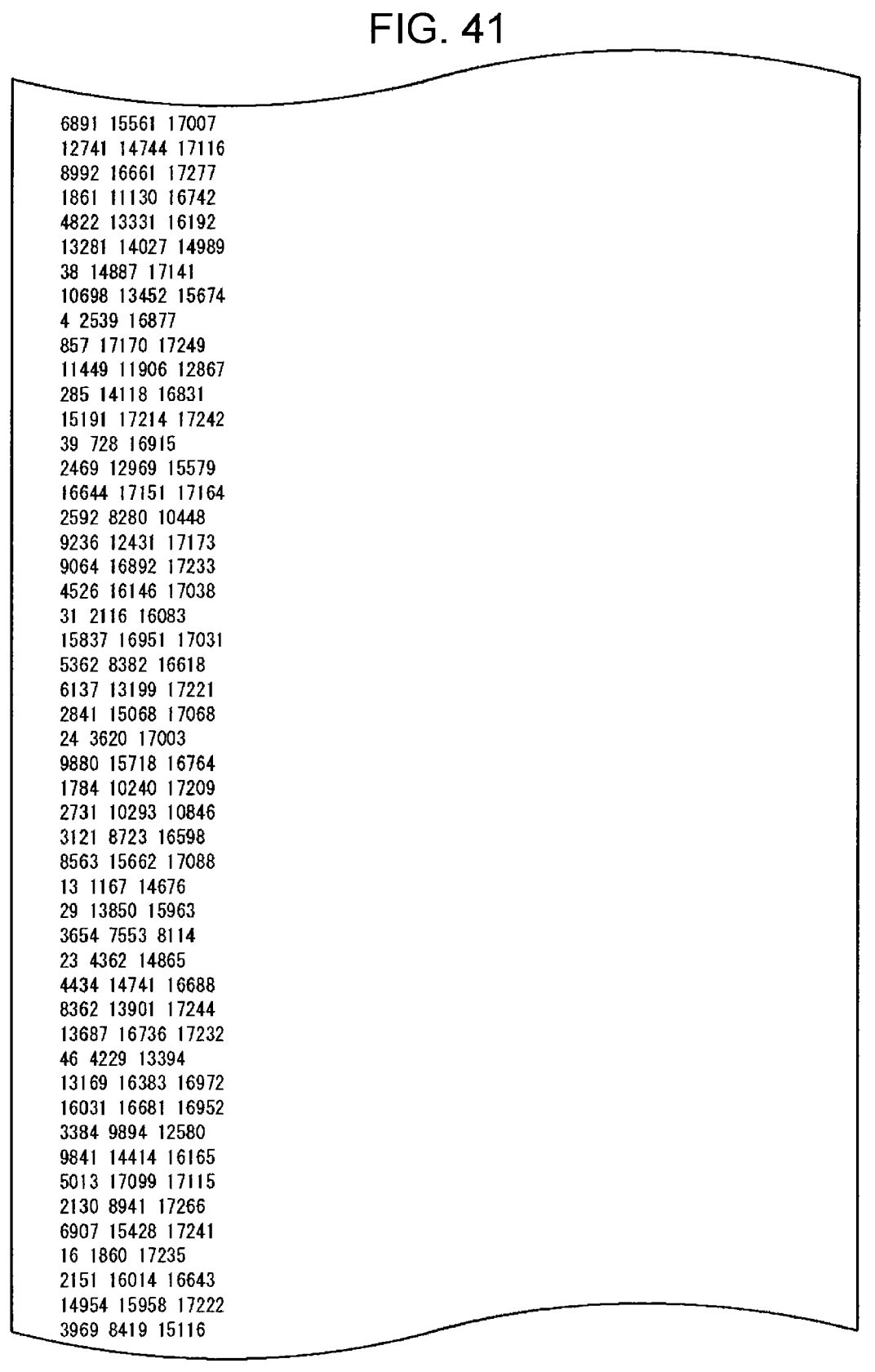
Figure 42:
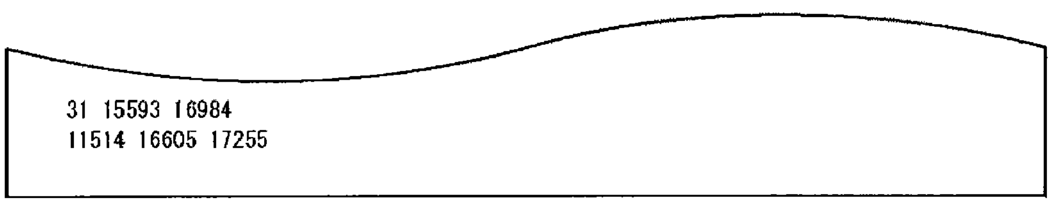
FIG. 42 is a diagram showing an example of the parity check matrix initial value table.

FIG. 40 is a drawing subsequent to FIG. 39, FIG. 41 is a drawing subsequent to FIG. 40, and FIG. 42 is a drawing subsequent to FIG. 41.

FIGS. 43, 44, 45 and 46 are diagrams showing an example of the parity check matrix initial value table of the DVB method for the parity check matrix of the new LDPC code (hereinafter, referred to as a Sony code of (64 k, 13/15)) which has a code length N of 64 k bits and a code rate r of 13/15 and is suggested by the present applicant.

Figure 43:
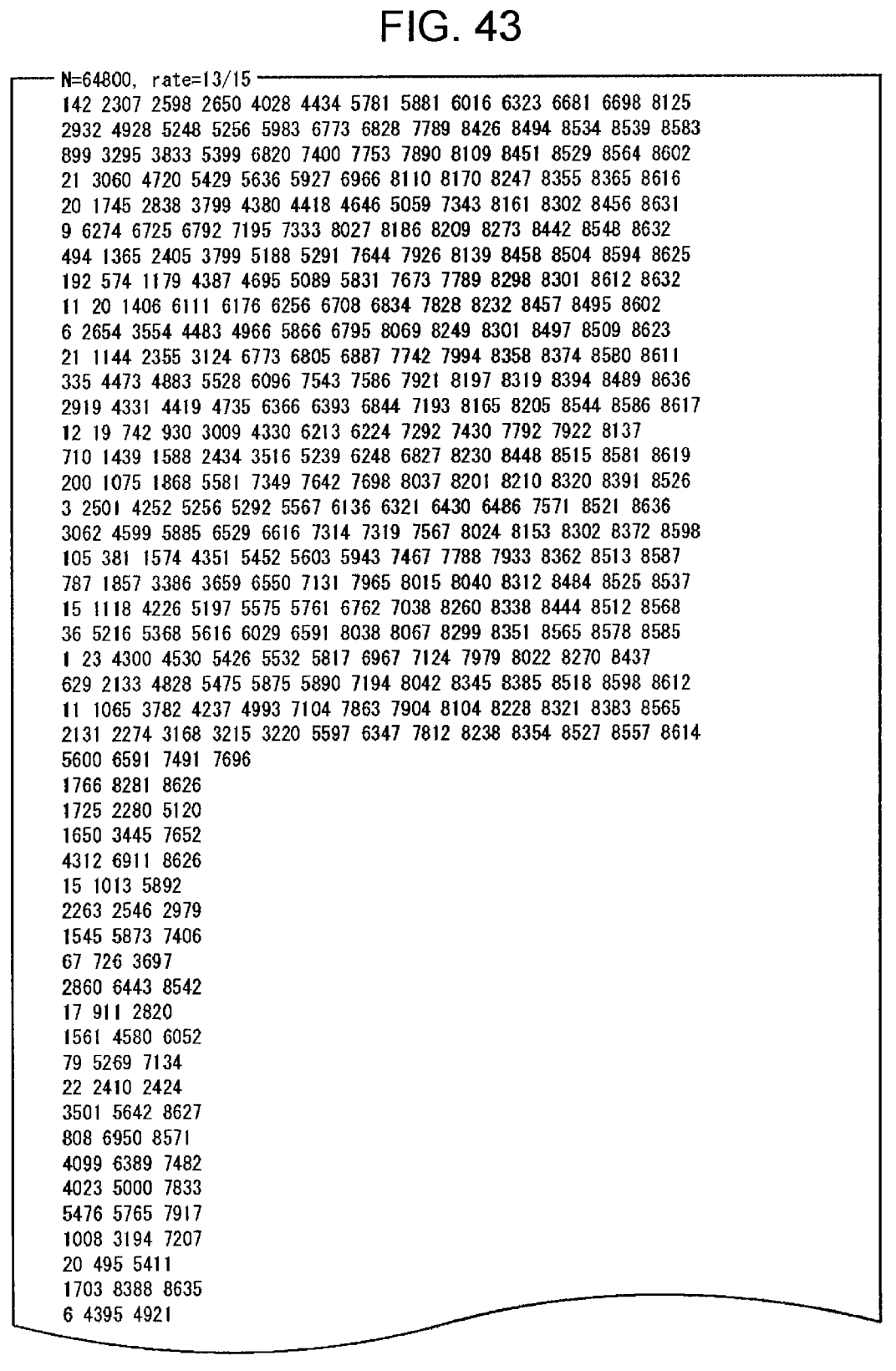
Figure 44:
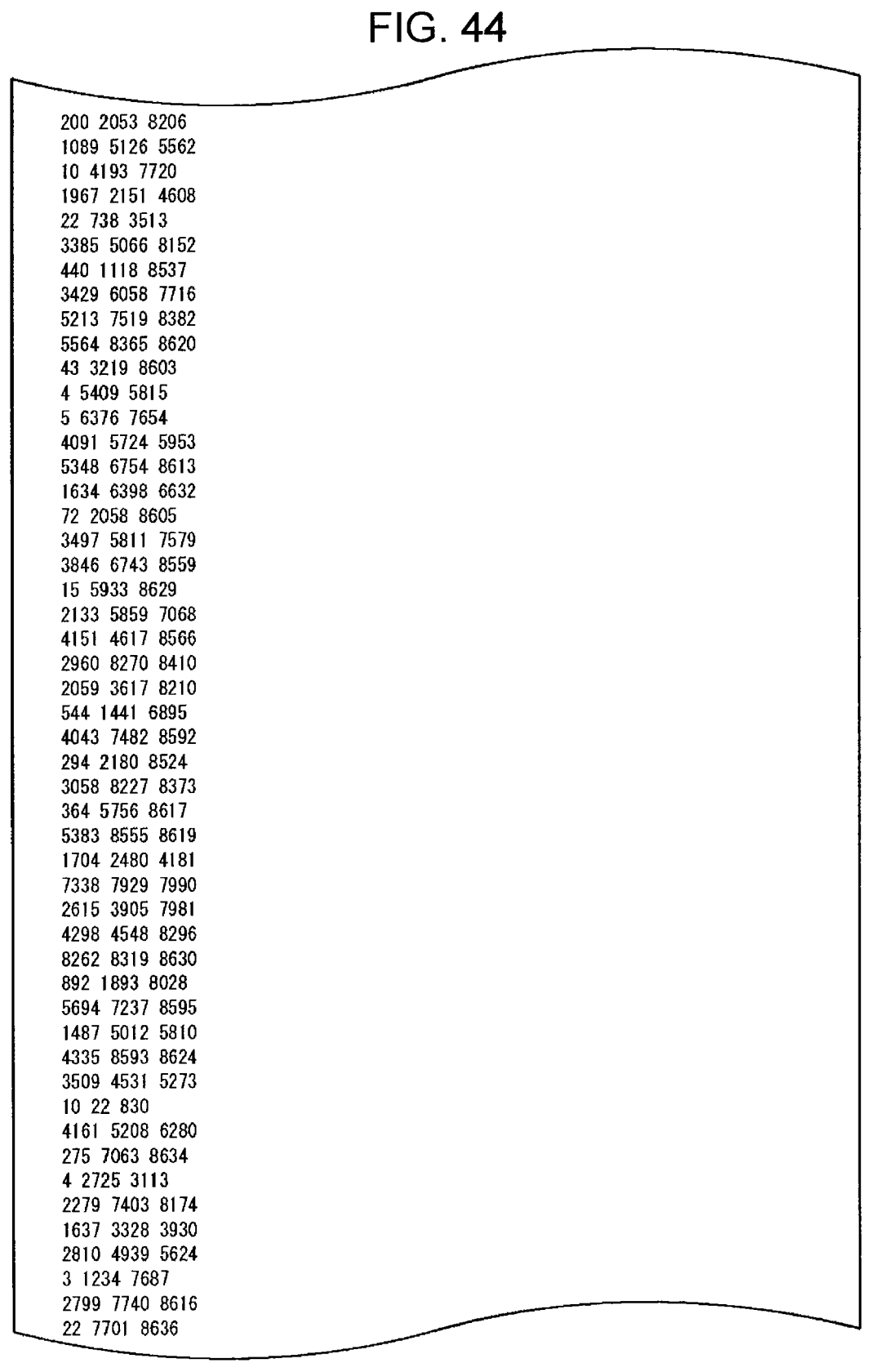
Figure 45:
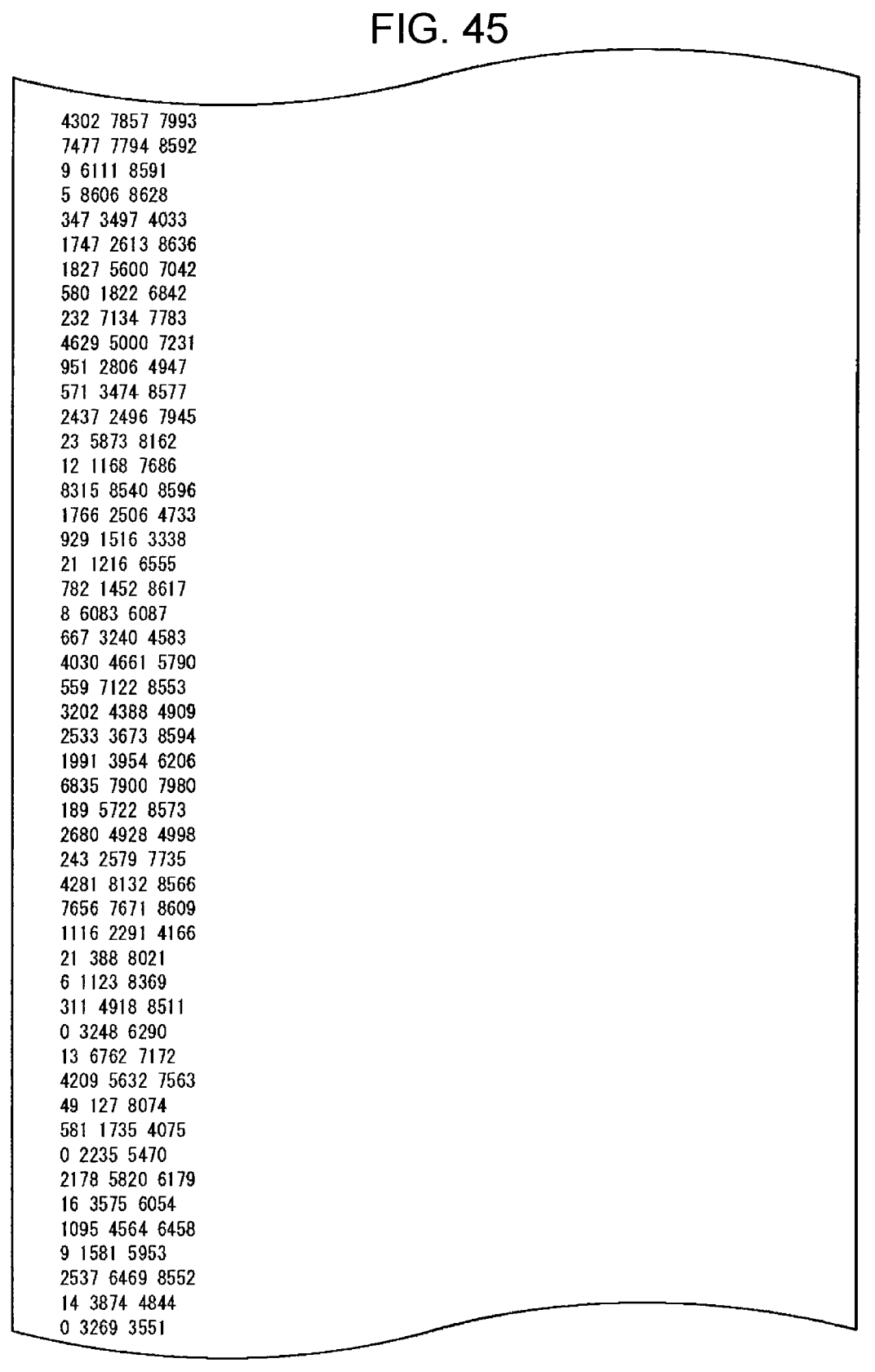
Figure 46:
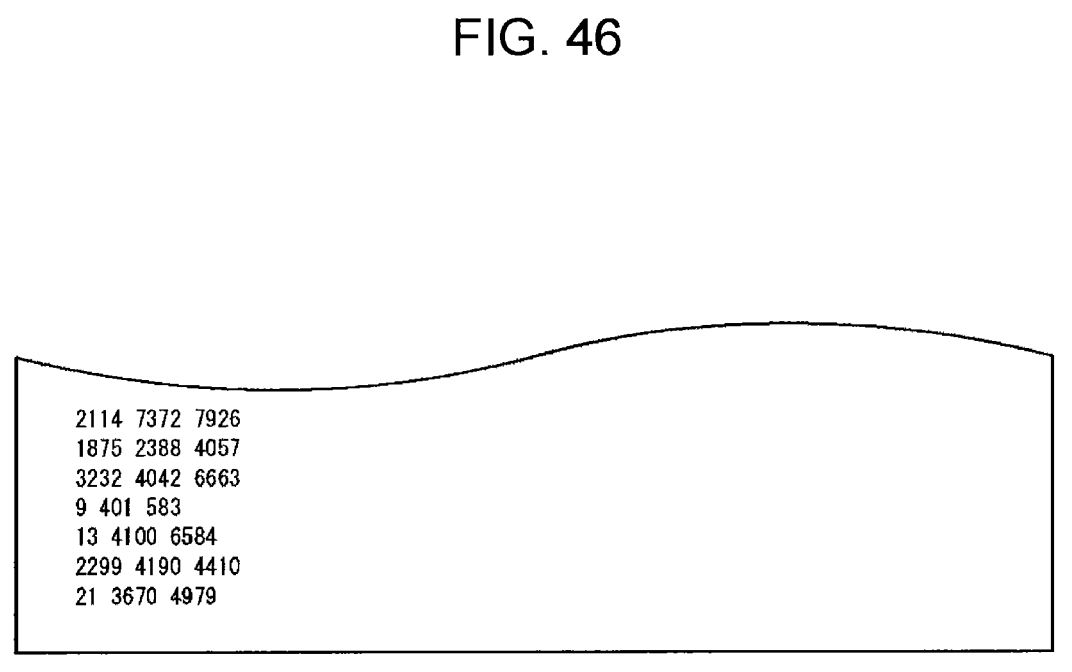

FIG. 44 is a drawing subsequent to FIG. 43, FIG. 45 is a drawing subsequent to FIG. 44, and FIG. 46 is a drawing subsequent to FIG. 45.

Figure 48:
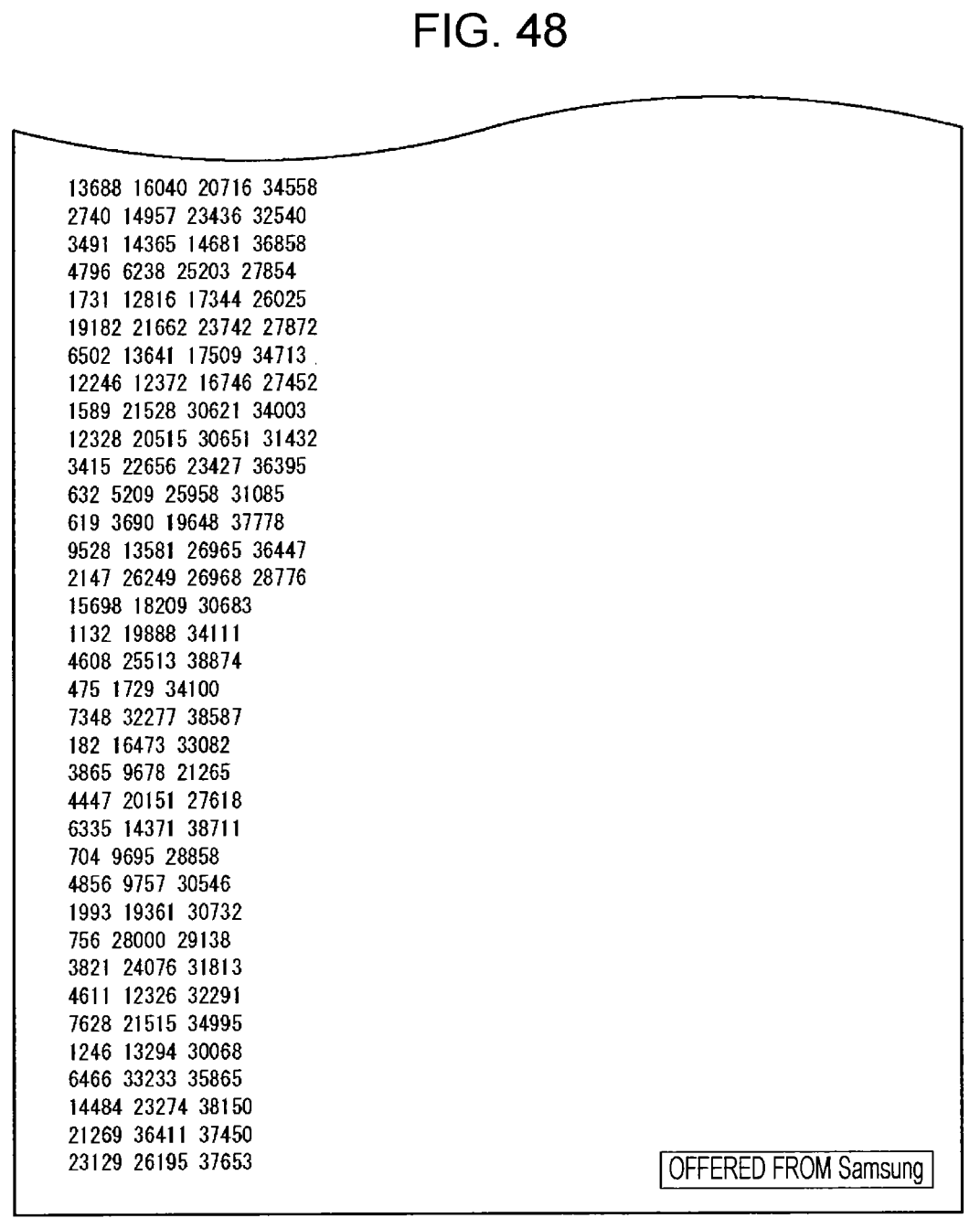

FIGS. 47 and 48 are diagrams showing an example of the parity check matrix initial value table of the DVB method for the parity check matrix of the new LDPC code (hereinafter, a Samsung code of (64 k, 6/15)) which has a code length N of 64 k bits and a code rate r of 6/15 and is suggested by Samsung Electronics Co., Ltd.

FIG. 48 is a drawing subsequent to FIG. 47.

Figure 50:
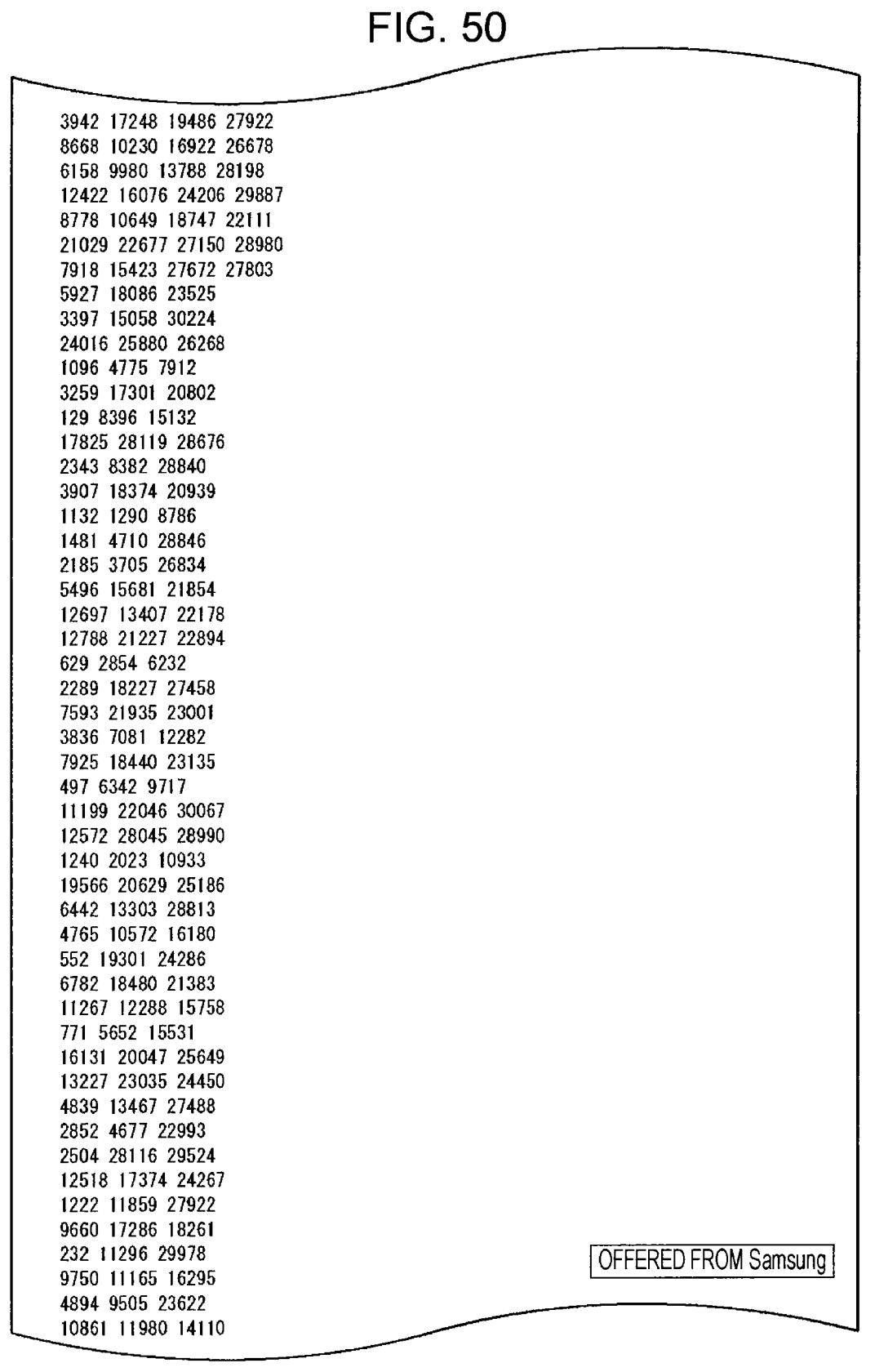
Figure 51:
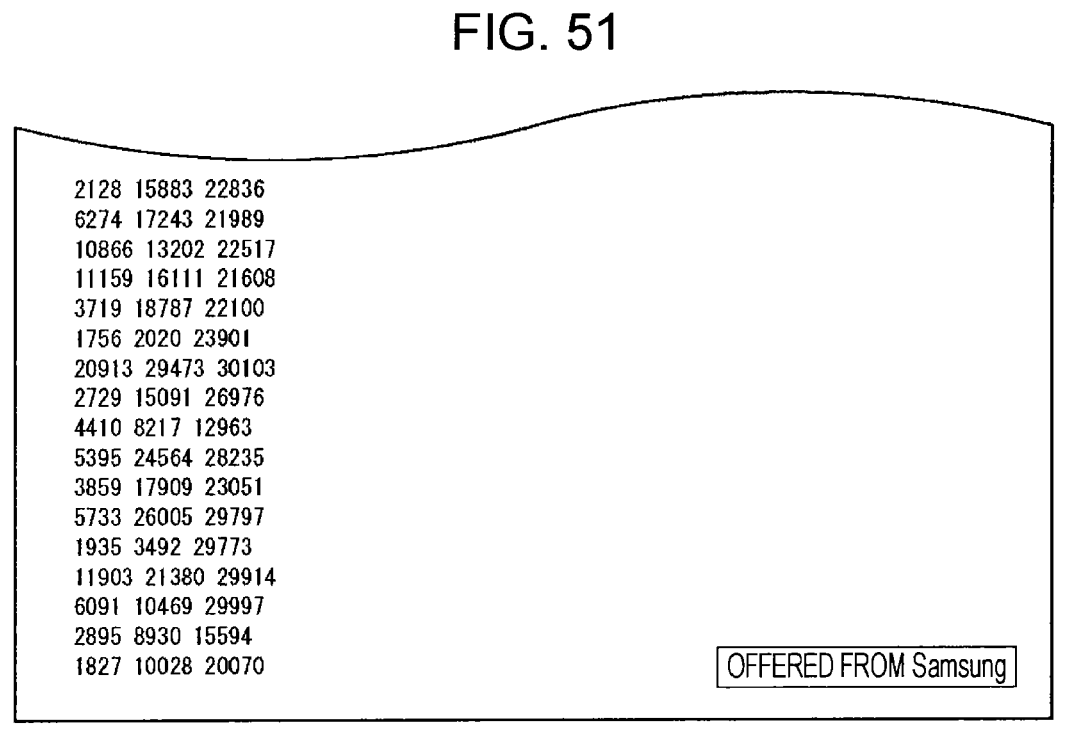

FIGS. 49, 50 and 51 are diagrams showing an example of the parity check matrix initial value table of the DVB method for the parity check matrix of the new LDPC code (hereinafter, a Samsung code of (64 k, 8/15)) which has a code length N of 64 k bits and a code rate r of 8/15 and is suggested by Samsung Electronics Co., Ltd.

FIG. 50 is a drawing subsequent to FIG. 49, and FIG. 51 is a drawing subsequent to FIG. 50.

Figure 53:
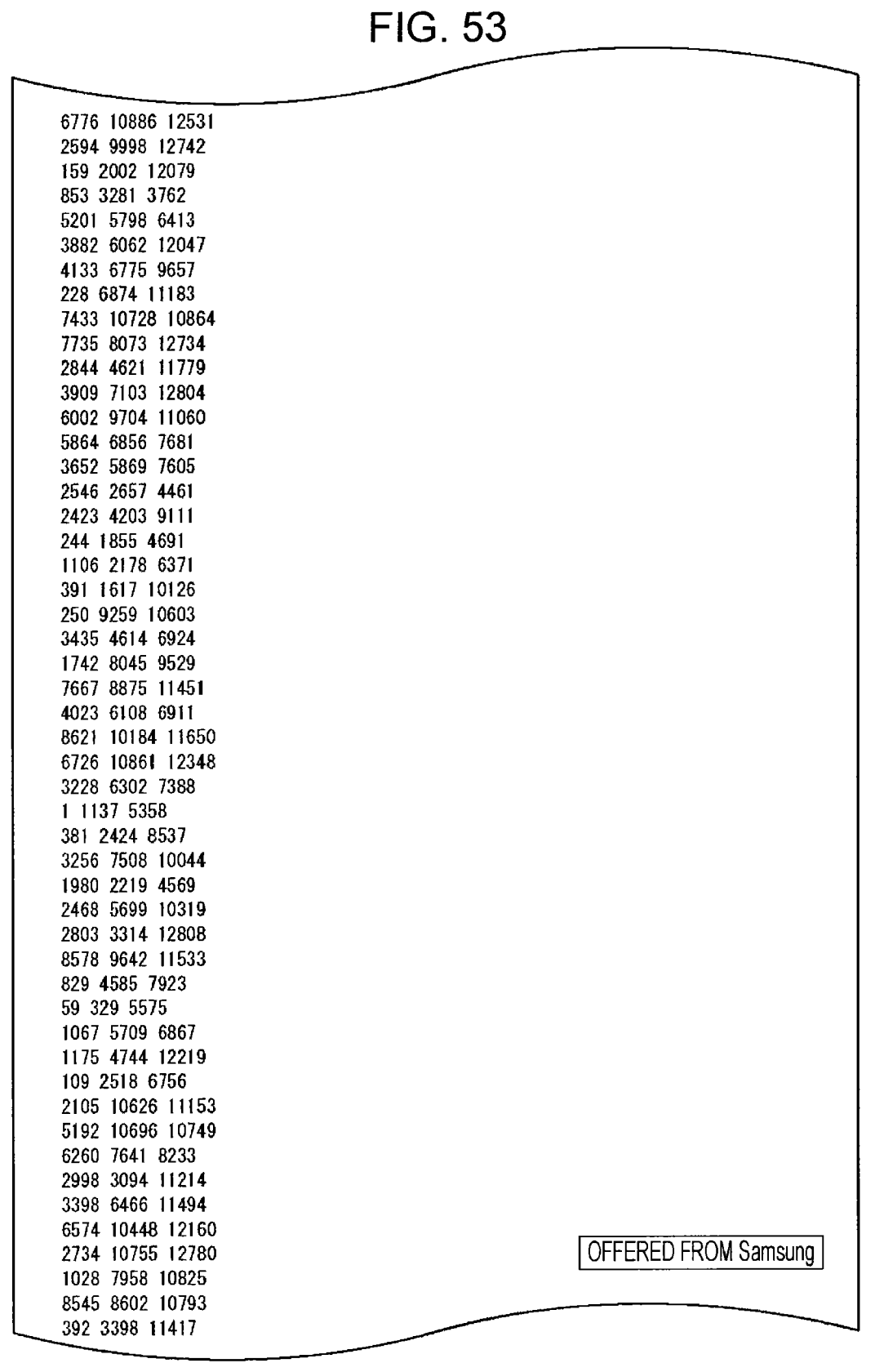
Figure 54:
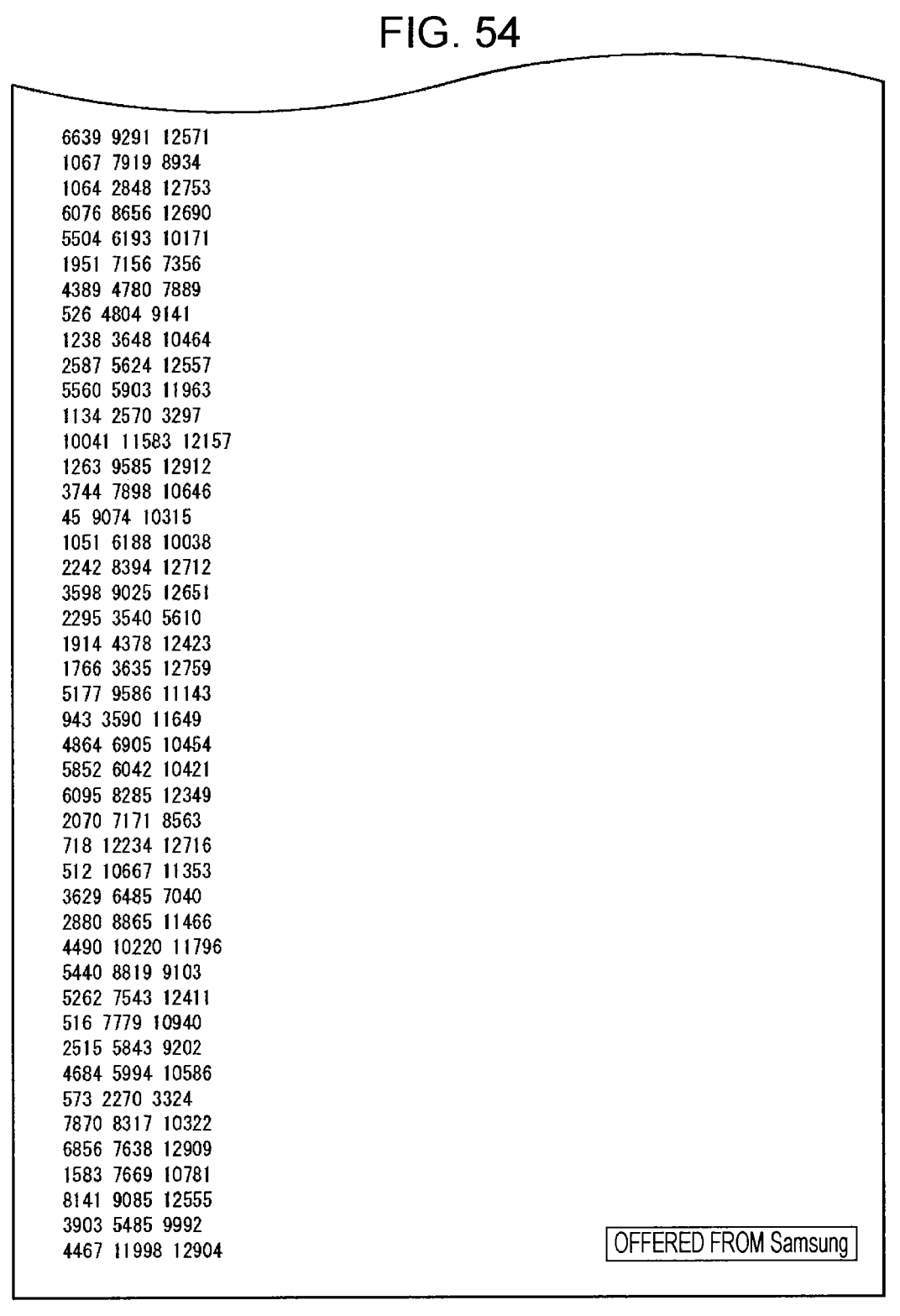

FIGS. 52, 53 and 54 are diagrams showing an example of the parity check matrix initial value table of the DVB method for the parity check matrix of the new LDPC code (hereinafter, a Samsung code of (64 k, 12/15)) which has a code length N of 64 k bits and a code rate r of 12/15 and is suggested by Samsung Electronics Co., Ltd.

FIG. 53 is a drawing subsequent to FIG. 52, and FIG. 54 is a drawing subsequent to FIG. 53.

FIG. 55 is a diagram showing an example of the parity check matrix initial value table of the DVB method for the parity check matrix of the new LDPC code (hereinafter, referred to as a LGE code of (16 k, 6/15)) which has a code length N of 16 k bits and a code rate r of 6/15 and is suggested by LGE Inc.

FIG. 56 is a diagram showing an example of the parity check matrix initial value table of the DVB method for the parity check matrix of the new LDPC code (hereinafter, a LGE code O (16 k, 7/15)) which has a code length N of 16 k bits and a code rate r of 7/15 and is suggested by LGE Inc.

FIG. 57 is a diagram showing an example of the parity check matrix initial value table of the DVB method for the parity check matrix of the new LDPC code (hereinafter, a LGE code of (16 k, 9/15)) which has a code length N of 16 k bits and a code rate r of 9/15 and is suggested by LGE Inc.

FIG. 58 is a diagram showing an example of the parity check matrix initial value table of the DVB method for the parity check matrix of the new LDPC code (hereinafter, a LGE code of (16 k, 11/15)) which has a code length N of 16 k bits and a code rate r of 11/15 and is suggested by LGE Inc.

FIG. 59 is a diagram showing an example of the parity check matrix initial value table of the DVB method for the parity check matrix of the new LDPC code (hereinafter, a LGE code of (16 k, 13/15)) which has a code length N of 16 k bits and a code rate r of 13/15 and is suggested by LGE Inc.

Figure 61:
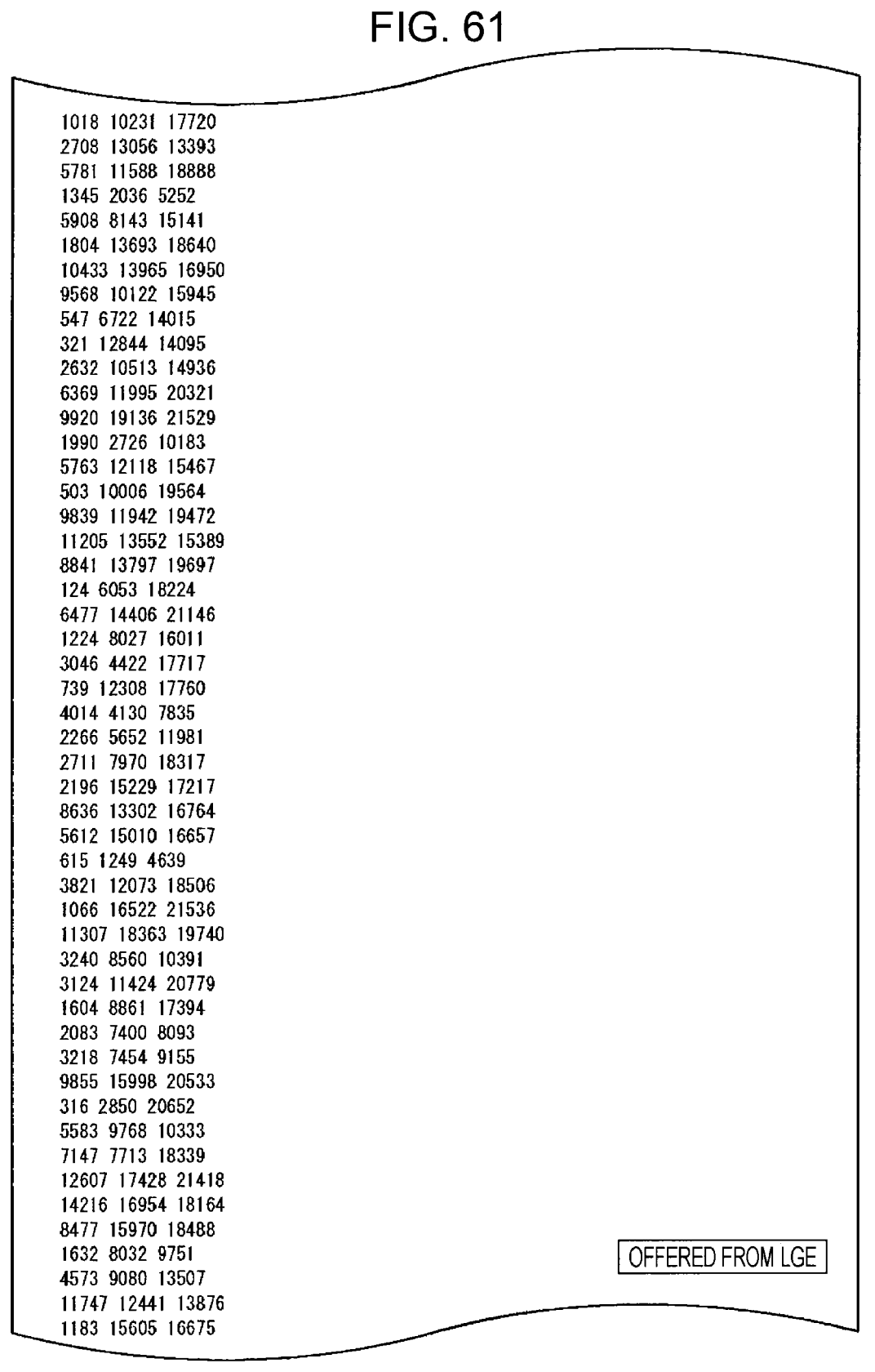
Figure 62:
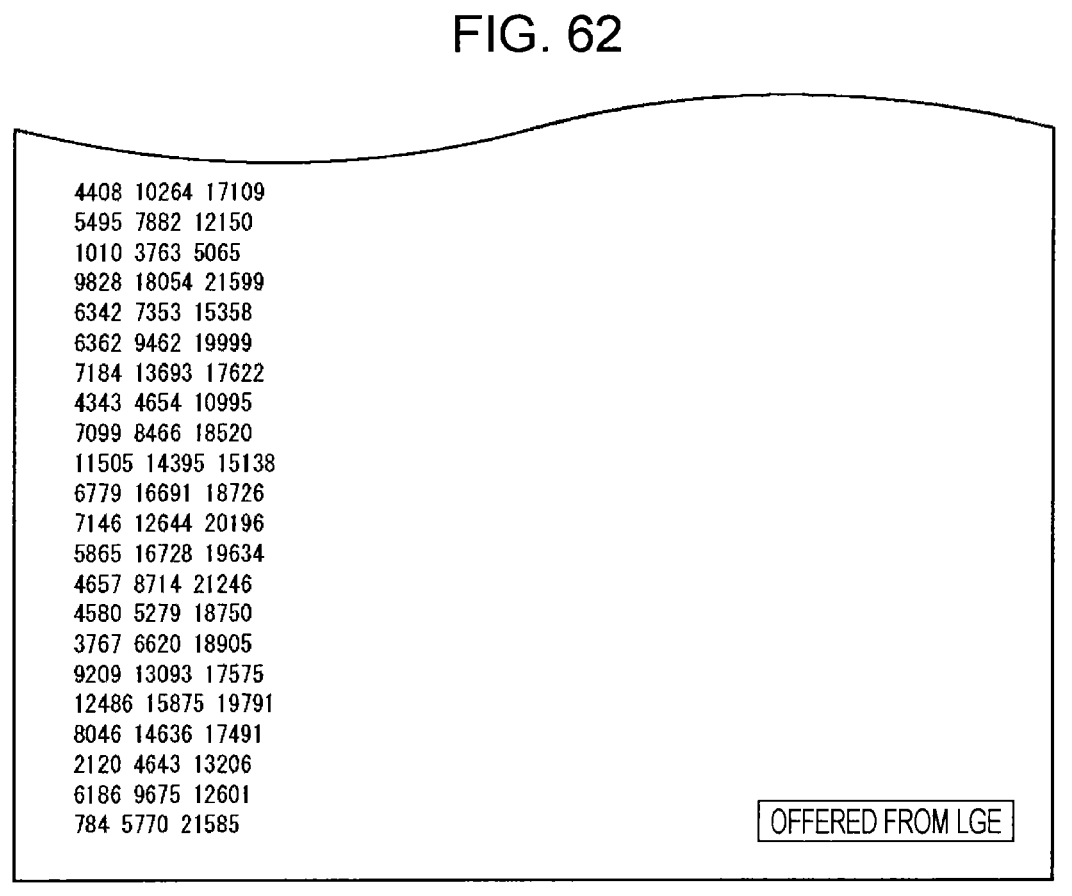

FIGS. 60, 61 and 62 are diagrams showing an example of the parity check matrix initial value table of the DVB method for the parity check matrix of the new LDPC code (hereinafter, a LGE code of (64 k, 10/15)) which has a code length N of 64 k bits and a code rate r of 10/15 and is suggested by LGE Inc.

FIG. 61 is a drawing subsequent to FIG. 60, and FIG. 62 is a drawing subsequent to FIG. 61.

Figure 64:
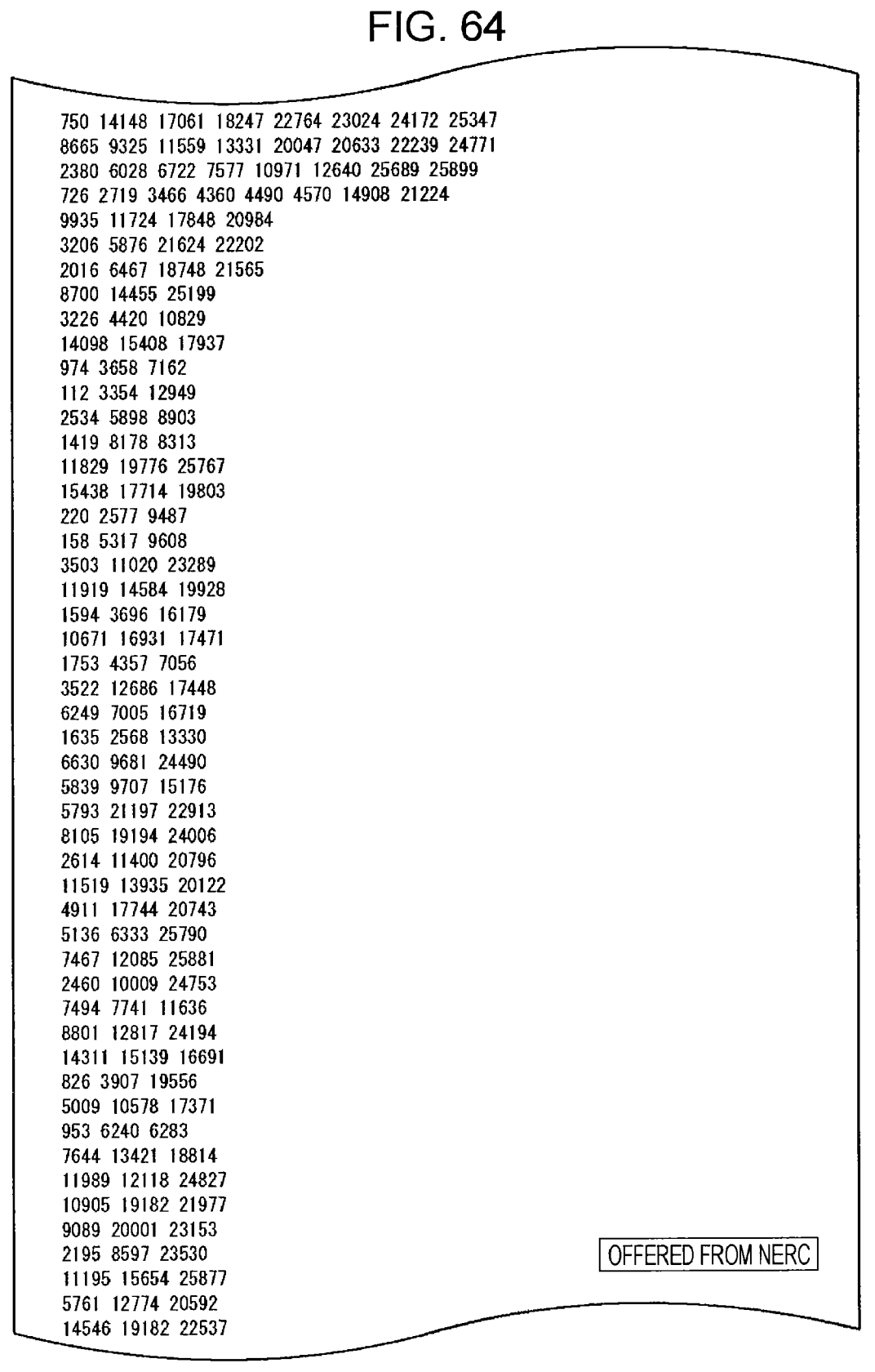
Figure 65:
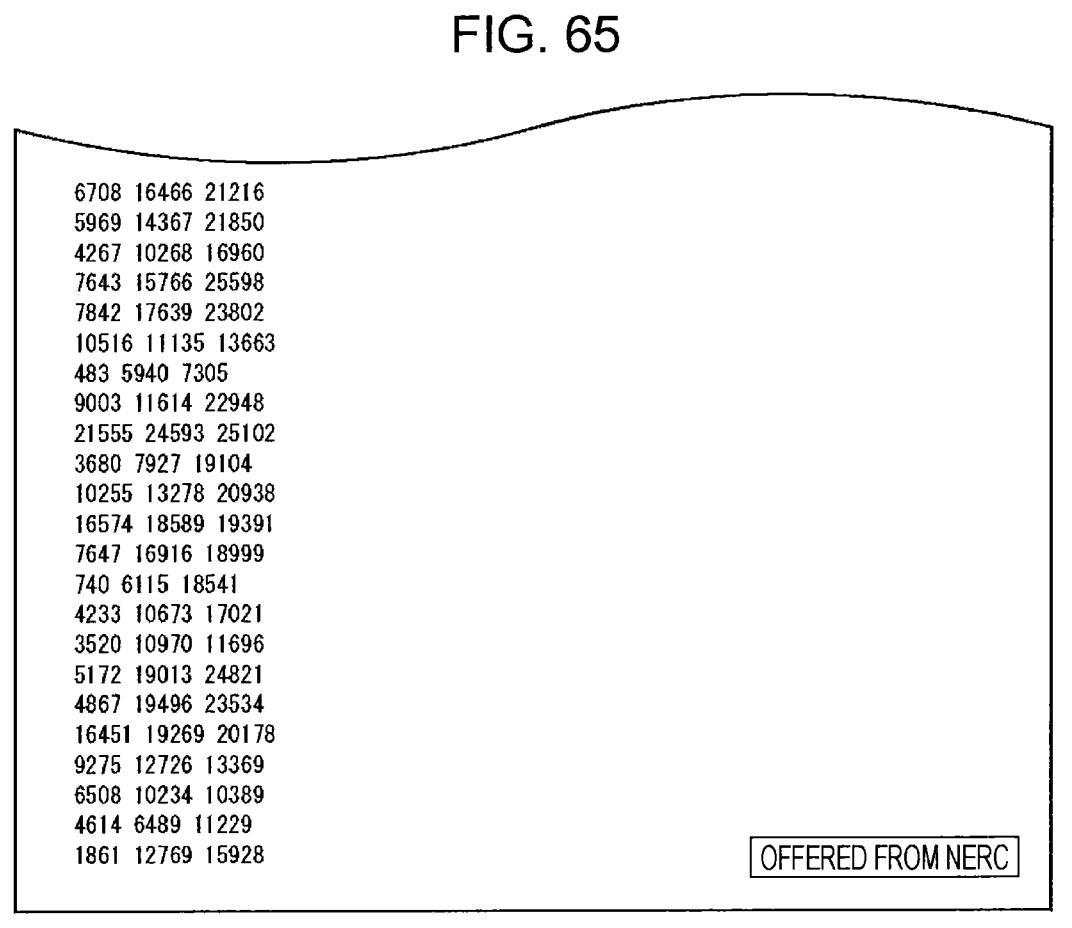

FIGS. 63, 64 and 65 are diagrams showing an example of the parity check matrix initial value table of the DVB method for the parity check matrix of the new LDPC code (hereinafter, a NERC code of (64 k, 9/15)) which has a code length N of 64 k bits and a code rate r of 9/15 and is suggested by the NERC.

FIG. 64 is a drawing subsequent to FIG. 63, and FIG. 65 is a drawing subsequent to FIG. 64.

FIG. 66 is a diagram showing an example of the parity check matrix initial value table of the ETRI method for the parity check matrix of the new LDPC code (hereinafter, a ETRI code of (16 k, 5/15)) which has a code length N of 16 k bits and a code rate r of 5/15 and is suggested by CRC/ETRI.

Figure 68:
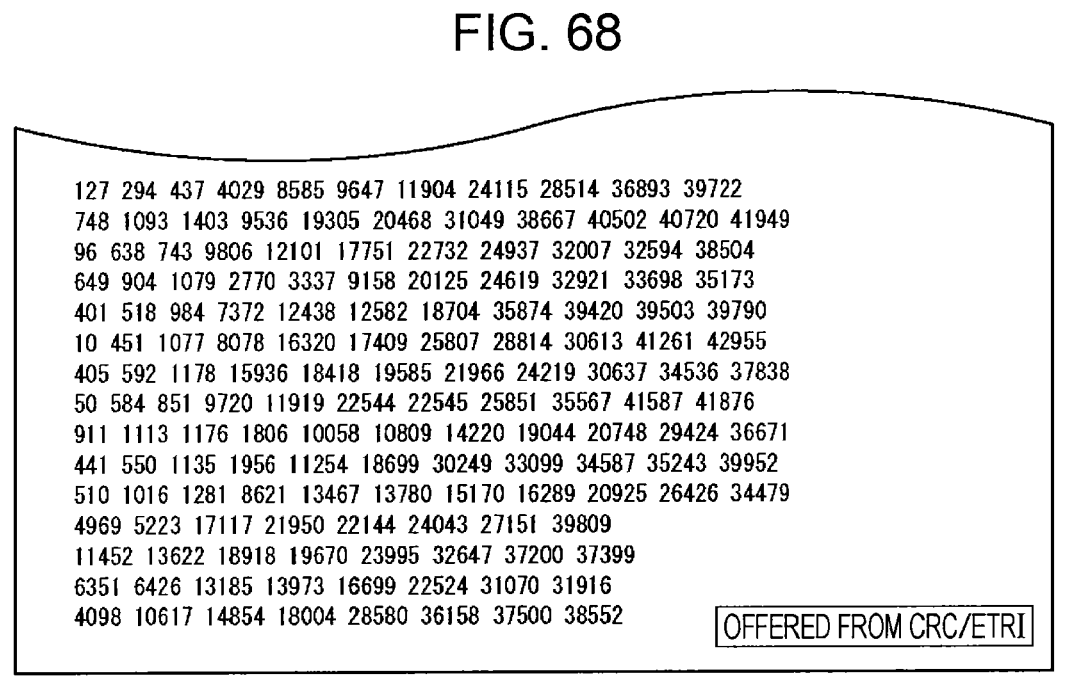

FIGS. 67 and 68 are diagrams showing an example of the parity check matrix initial value table of the ETRI method for the parity check matrix of the new LDPC code (hereinafter, referred to as a ETRI code of (64 k, 5/15)) which has a code length N of 64 k bits and a code rate r of 5/15 and is suggested by CRC/ETRI.

FIG. 68 is a drawing subsequent to FIG. 67.

Figure 70:
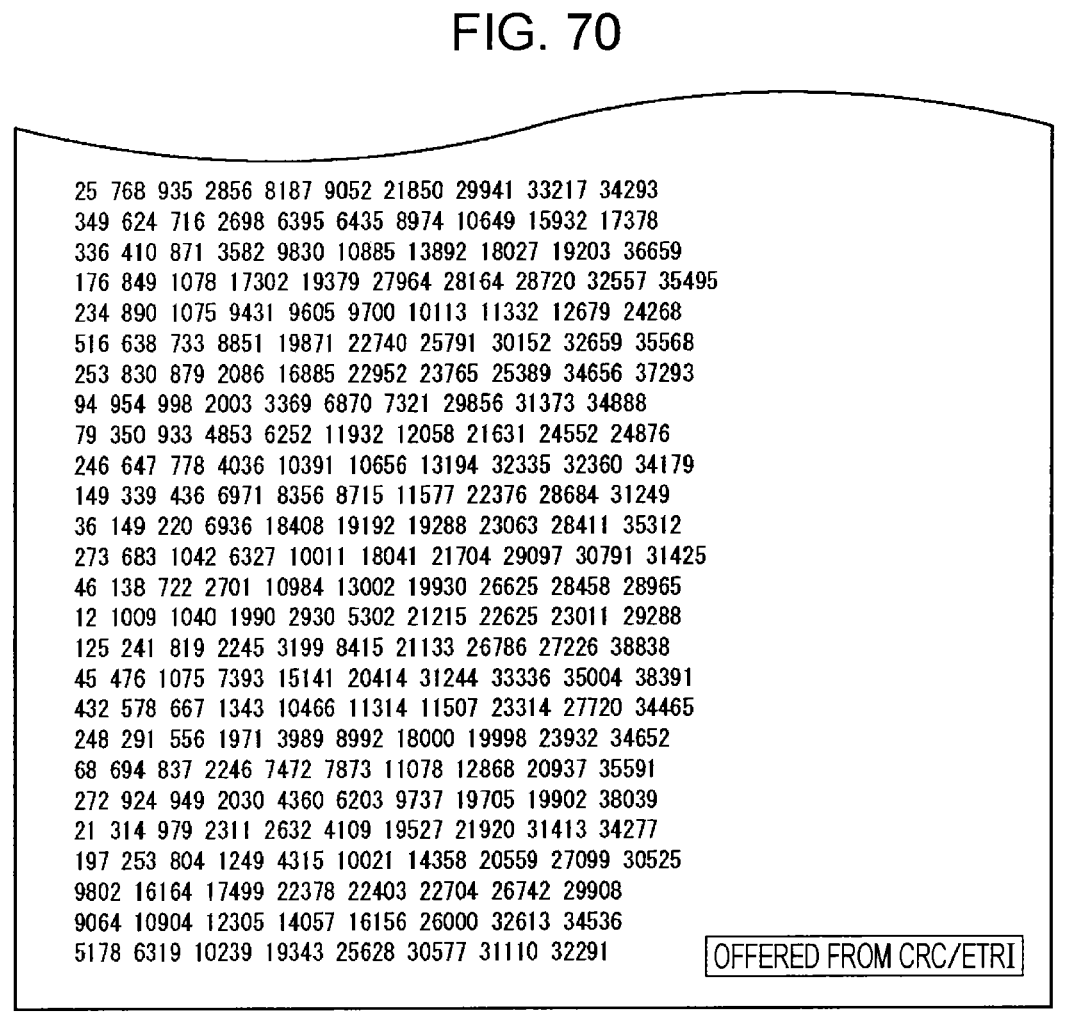

FIGS. 69 and 70 are diagrams showing an example of the parity check matrix initial value table of the ETRI method for the parity check matrix of the new LDPC code (hereinafter, referred to as a ETRI code of (64 k, 6/15)) which has a code length N of 64 k bits and a code rate r of 6/15 and is suggested by CRC/ETRI.

FIG. 70 is a drawing subsequent to FIG. 69.

Figure 72:
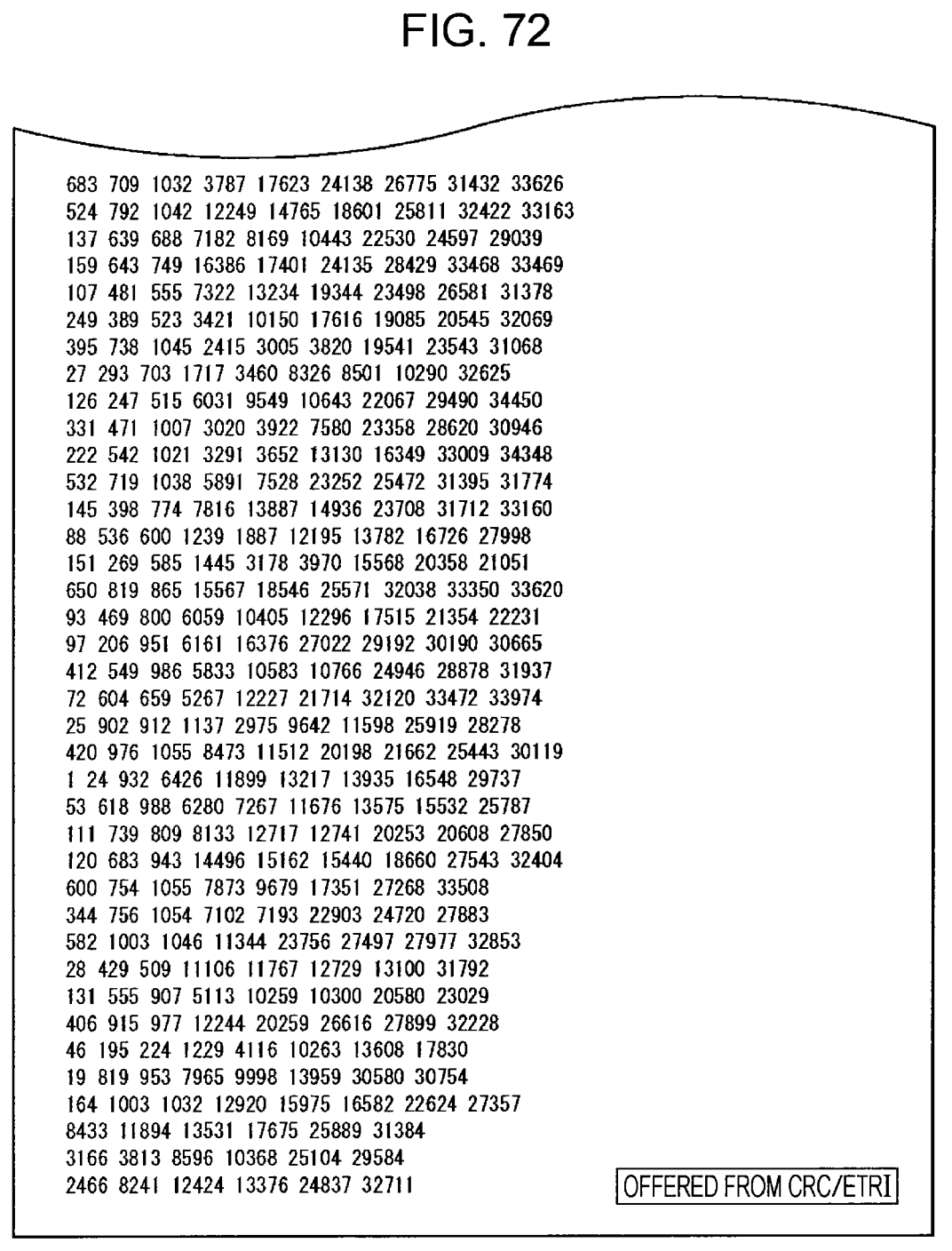

FIGS. 71 and 72 are diagrams showing an example of the parity check matrix initial value table of the ETRI method for the parity check matrix of the new LDPC code (hereinafter, referred to as a ETRI code of (64 k, 7/15)) which has a code length N of 64 k bits and a code rate r of 7/15 and is suggested by CRC/ETRI.

FIG. 72 is a drawing subsequent to FIG. 71.

Among the new LDPC codes, particularly, the Sony codes are LDPC codes having good performance.

Here, the LDPC codes having good performance are LDPC codes obtained from an appropriate parity check matrix H.

For example, the appropriate parity check matrix H is a parity check matrix which has a smaller BER (bit error rate) (and FER (frame error rate)) and satisfies a predetermined condition when the LDPC code obtained from the parity check matrix H is transmitted with a low $E_s/N_0$ or $E_b/N_o$ (the ratio of the signal power to the noise power per one bit).

It is possible to obtain the appropriate parity check matrix H by performing, for example, a simulation that measures a BER when the LDPC codes obtained from various parity check matrices satisfying a predetermined condition are transmitted with a low $E_s/N_o$.

As the predetermined conditions to be satisfied by the appropriate parity check matrix H, there are a condition in which an analysis result obtained by a code performance analysis method called density evolution is favorable and a condition in which a loop of the elements of 1s called cycle-4 is not present.

In the information matrix $H_A$, when the elements of 1s are concentrated as in cycle-4, it is considered that the decoding performance of the LDPC code is degraded, and thus, a condition in which cycle-4 is not present is necessary as the predetermined condition to be satisfied by the appropriate parity check matrix H.

It is possible to appropriately determine the predetermined condition to be satisfied by the appropriate parity check matrix H in order to improve the decoding performance of the LDPC code or easily perform (simplify) the decoding process of the LDPC code.

Figure 73:
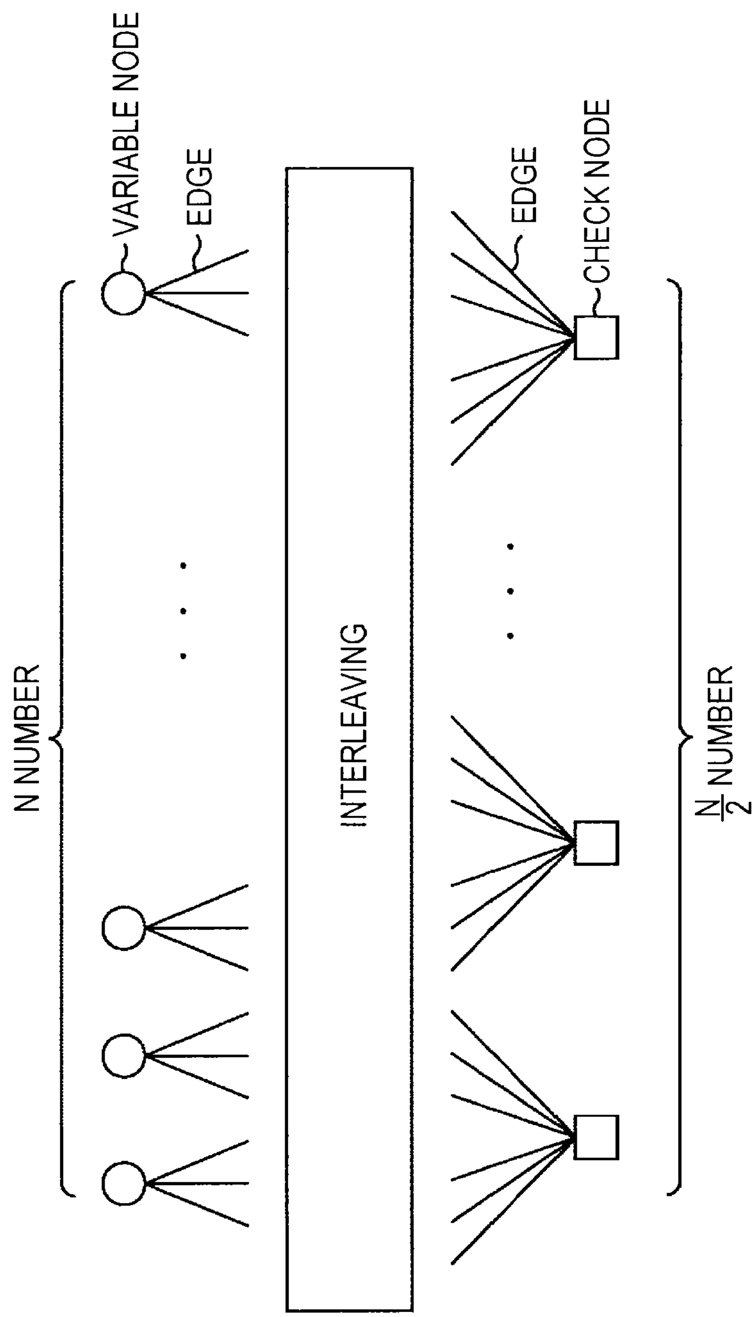
FIG. 73 shows an example of a Tanner graph of a degree sequence ensemble in which column weights are 3 and row weights are 6.
Figure 74:
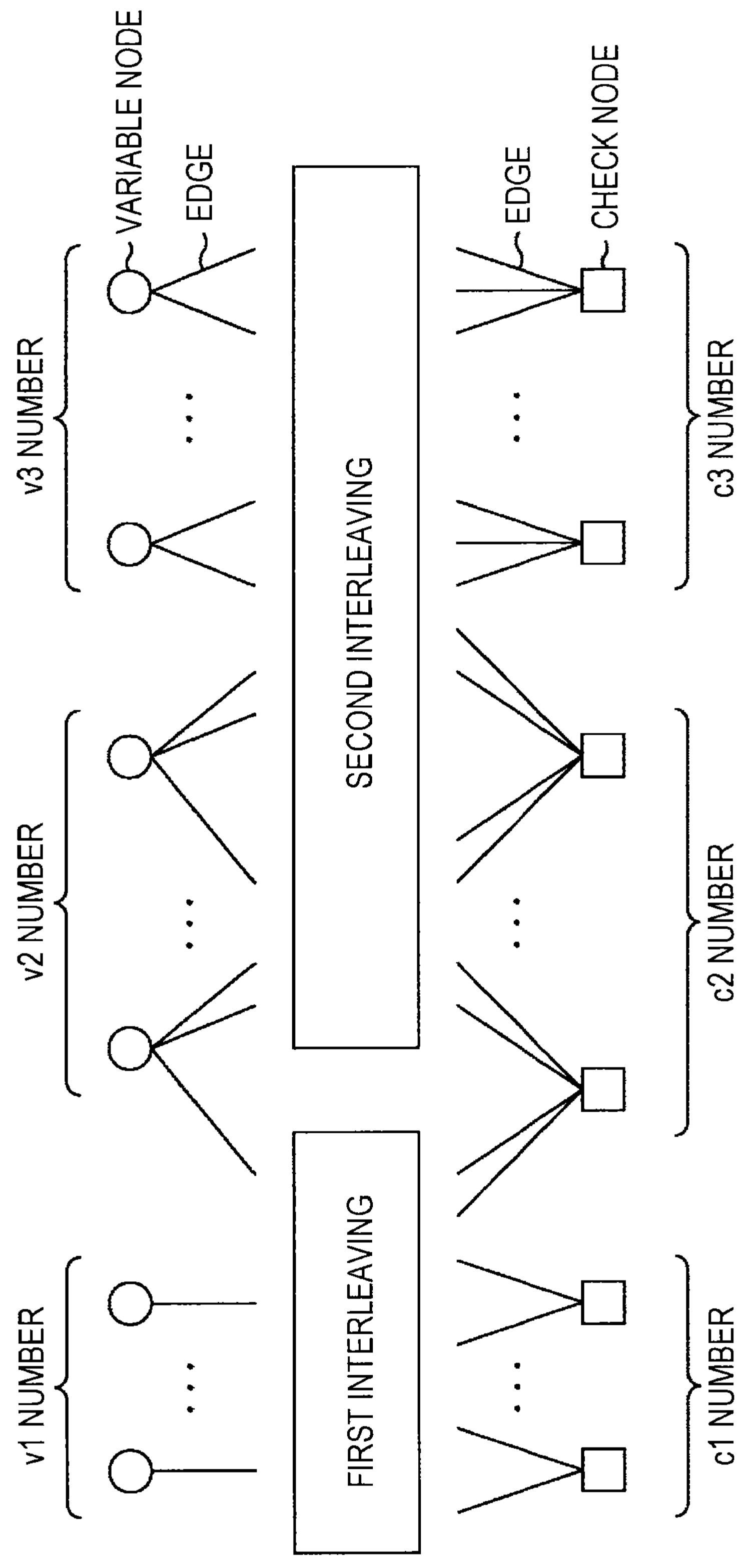
FIG. 74 shows an example of a Tanner graph of a multi-edge type ensemble.

FIGS. 73 and 74 are diagrams for describing the density evolution that obtains the analysis result as the predetermined condition to be satisfied by the appropriate parity check matrix H.

The density evolution is a code analysis method of calculating an expectation value of an error probability of an ensemble of LDPC codes which is specified by a degree sequence to be described below and has a code length N of ∞.

For example, when the variance of noise is steadily increased from zero on an AWGN channel, an expectation value of an error possibility of a certain ensemble is initially zero, but when the variance of noise is equal to or greater than a certain threshold, the expectation value thereof does not become zero.

According to the density evolution, it is possible to determine if the performance of the ensemble is good or bad (appropriateness of the parity check matrix) by comparing the expectation value with a threshold (hereinafter, referred to as a performance threshold) of the variance of noise in which the expectation value of the error probability does not become zero.

With regard to a specific LDPC code, when an ensemble to which the LDPC code belongs is determined and the density evolution is performed, it is possible to roughly predict performance of the LDPC code.

Accordingly, if the ensemble having good performance is found, it is possible to find the LDPC code having good performance from the LDPC codes belonging to the ensemble.

Here, the aforementioned degree sequence means what percentage of the variable nodes or the check nodes having the respective weight values are present in the LDPC code having the code length N.

For example, a regular (3, 6) LDPC code having a code rate of 1/2 belongs to an ensemble specified by the degree sequence in which the weights (column weights) of all variable nodes are 3 and the weights (row weights) of all check nodes are 6.

FIG. 73 shows a Tanner graph of such an ensemble.

In the Tanner graph of FIG. 73, variable nodes shown by a circle (O mark) in the drawing are present by an N number equal to the code length N, and check nodes shown by a square (square mark) in the drawing are present by a N/2 number equal to a multiplication value obtained by multiplying the code length N by the code rate of 1/2.

Three edges equal to the column weight are connected to the respective variable nodes, and thus, edges connected to the N number of variable nodes are present by a 3N number in total.

Six edges equal to the row weight are connected to the respective check nodes, and thus, edges connected to N/2 number of check nodes are present by a 3N number in total.

Furthermore, in the Tanner graph of FIG. 73, one interleaver is present.

The interleaver randomly rearranges 3N number of edges connected to N number of variable nodes, and connects the rearranged edges to any one of 3N number of edges connected to N/2 number of check nodes.

As a rearrangement pattern in which 3N number of edges connected to N number of variable nodes are rearranged in the interleaver, there are (3N)!(=(3N)×(3N−1)× . . . ×1) number of methods. Accordingly, an ensemble specified by the degree sequence in which the weights of all variable nodes are 3 and the weights of all check nodes are 6 is a set of (3N)! number of LDPC codes.

In the simulation for obtaining the LDPC code (appropriate parity check matrix) having good performance, a multi-edge type ensemble is used in the density evolution.

In the multi-edge type, the interleaver through which the edges connected to the variable nodes and the edges connected to the check nodes pass is divided into multiple edges, and thus, the ensemble is more precisely specified.

FIG. 74 shows an example of the Tanner graph of the multi-edge type ensemble.

In the Tanner graph of FIG. 74, two interleavers including a first interleaver and a second interleaver are present.

In the Tanner graph of FIG. 74, v1 number of variable nodes of which one edge is connected to the first interleaver and no edges are connected to the second interleaver, and v2 number of variable nodes of which one edge is connected to the first interleaver and two edges are connected to the second interleaver, and v3 number of variable nodes of which no edges are connected to the first interleaver and two edges are connected to the second interleaver are presented.

In the Tanner graph of FIG. 74, c1 number of check nodes of which two edges are connected to the first interleaver and no edges are connected to the second interleaver, c2 number of check nodes of which two edges are connected to the first interleaver and two edges are connected to the second interleaver, and c3 number of check nodes of which no edges are connected to the first interleaver and three edges are connected to the second interleaver are present.

The density evolution and the implementation thereof are described in, for example, "On the Design of Low-Density Parity-Check Codes within 0.0045 dB of the Shannon Limit", S. Y. Chung, G. D. Forney, T. J. Richardson, R. Urbanke, IEEE Communications Leggers, VOL. 5, NO. 2, February 2001.

In the simulation for obtaining (the parity check matrix initial value table of) the Sony codes, an ensemble of which a performance threshold which is $E_b/N_0$ (ratio of signal power to noise power per one bit) at which a BER starts to be decreased (become smaller) is equal to or less than a predetermined value is found through the multi-edge type density evolution, and the LDPC code capable of reducing the BER when one or more quadrature modulation schemes such as QPSK are used is selected as the LDPC code having good performance from the LDPC codes belonging to the found ensemble.

The parity check matrix initial value table of the Sony codes is obtained through the simulation described above.

Therefore, according to the Sony codes obtained from the parity check matrix initial value table, it is possible to ensure favorable communication quality in data transmission.

Figure 75:
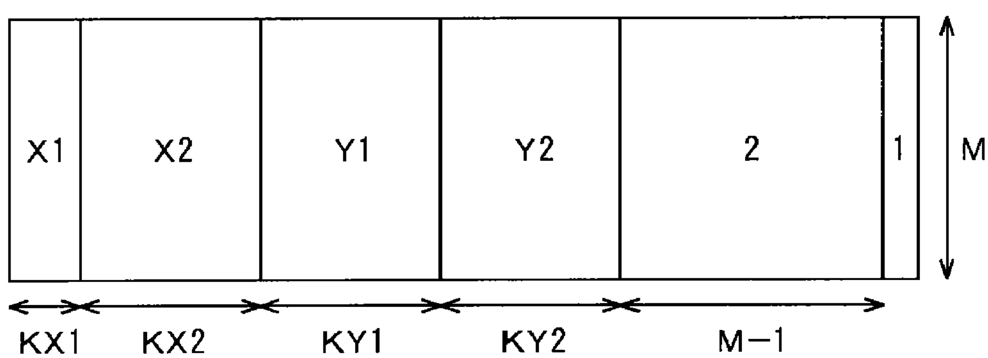
FIG. 75 is a diagram for describing the parity check matrix.

FIG. 75 is a diagram for describing the parity check matrices H (hereinafter, described as "parity check matrices H of the Sony codes of (16 k, 8/15), (16 k, 10/15), and (16 k, 12/15)") obtained from the parity check matrix initial value table of the Sony codes of (16 k, 8/15), (16 k, 10/15), and (16 k, 12/15).

All minimum cycle lengths of the parity check matrix H of the Sony codes of (16 k, 8/15), (16 k, 10/15), and (16 k, 12/15) exceed the cycle-4, and thus, the cycle-4 (a loop of the elements of 1s which has a loop length of 4) is not present. Here, the minimum cycle length (girth) means the minimum value of the length of the loop (loop length) constructed by the elements of 1s of the parity check matrix H.

A performance threshold of the Sony code of (16 k, 8/15) is 0.805765, a performance threshold of the Sony code of (16 k, 10/15) is 2.471011, and a performance threshold of the Sony code of (16 k, 12/15) is 4.269922.

In the parity check matrix H of the Sony codes of (16 k, 8/15), (16 k, 10/15), and (16 k, 12/15), column weights from the first column to the KX1-th column are X1, a column weight of the KX2-th column is X2, a column weight of the KY1-th column is Y1, a column weight of the KY2-th column is Y2, a column weight of the (M−1)-th column is 2, and a column weight of the last column is 1.

Here, KX1+KX2+KY1+KY2+M−1+1 is equal to the code length N=16,200 bits of the Sony codes of (16 k, 8/15), (16 k, 10/15), and (16 k, 12/15).

The column numbers KX1, KX2, KY1, KY2, and M and the column weights X1, X2, Y1, and Y2 of the parity check matrix H of the Sony codes of (16 k, 8/15), (16 k, 10/15), and (16 k, 12/15) are shown in FIG. 75.

Similarly to the parity check matrix described in FIGS. 12 and 13, in the parity check matrix H of the Sony codes of (16 k, 8/15), (16 k, 10/15), and (16 k, 12/15), the column weight of the column on the leading side (on the left side) tends to be large, and thus, the code bits of the Sony code on the leading side tend to have high error tolerance (have tolerance to an error).

According to the simulation performed by the present applicant, favorable BER/FER are obtained for the Sony codes of (16 k, 8/15), (16 k, 10/15), and (16 k, 12/15), and thus, it is possible to ensure favorable communication quality in data transmission using the Sony codes of (16 k, 8/15), (16 k, 10/15), and (16 k, 12/15).

Figure 76:
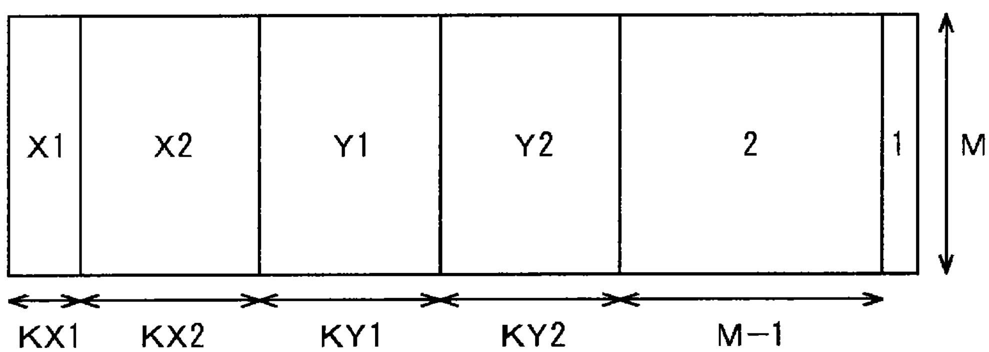
FIG. 76 is a diagram for describing the parity check matrix.

FIG. 76 is a diagram for describing the parity check matrix H of the Sony codes of (64 k, 7/15), (64 k, 9/15), (64 k, 11/15), and (64 k, 13/15).

All minimum cycle lengths of the parity check matrix H of the Sony codes of (64 k, 7/15), (64 k, 9/15), (64 k, 11/15), and (64 k, 13/15) exceed the cycle-4, and thus, the cycle-4 is not present.

A performance threshold of the Sony code of (64 k, 7/15) is −0.093751, a performance threshold of the Sony code of (64 k, 9/15) is 1.658523, a performance threshold of the Sony code of (64 k, 11/15) is 3.351930, and a performance threshold of the Sony code of (64 k, 13/15) is 5.301749.

In the parity check matrix H of the Sony codes of (64 k, 7/15), (64 k, 9/15), (64 k, 11/15), and (64 k, 13/15), column weights from the first column to the KX1-th column are X1, a column weight of the KX2-th column is X2, a column weight of the KY1-th column is Y1, a column weight of the KY2-th column is Y2, a column weight of the (M−1)-th column is 2, and a column weight of the last column is 1.

KX1+KX2+KY1+KY2+M−1+1 is equal to the code length N=64,800 bits of the Sony codes of (64 k, 7/15), (64 k, 9/15), (64 k, 11/15), and (64 k, 13/15).

The column numbers KX1, KX2, KY1, KY2, and M and the column weights X1, X2, Y1, and Y2 of the parity check matrix H of the Sony codes of (64 k, 7/15), (64 k, 9/15), (64 k, 11/15), and (64 k, 13/15) are shown in FIG. 76.

Similarly to the parity check matrix described in FIGS. 12 and 13, in the parity check matrix H of the Sony code of (64 k, 7/15), (64 k, 9/15), (64 k, 11/15), and (64 k, 13/15), the column weight of the column on the leading side (on the left side) tends to be large, and thus, the code bits of the Sony code on the leading side tend to have high error tolerance.

According to the simulation performed by the present applicant, favorable BER/FER are obtained for the Sony codes of (64 k, 7/15), (64 k, 9/15), (64 k, 11/15), and (64 k, 13/15), and thus, it is possible to ensure favorable communication quality in data transmission using the Sony codes of (64 k, 7/15), (64 k, 9/15), (64 k, 11/15), and (64 k, 13/15).

Figure 77:
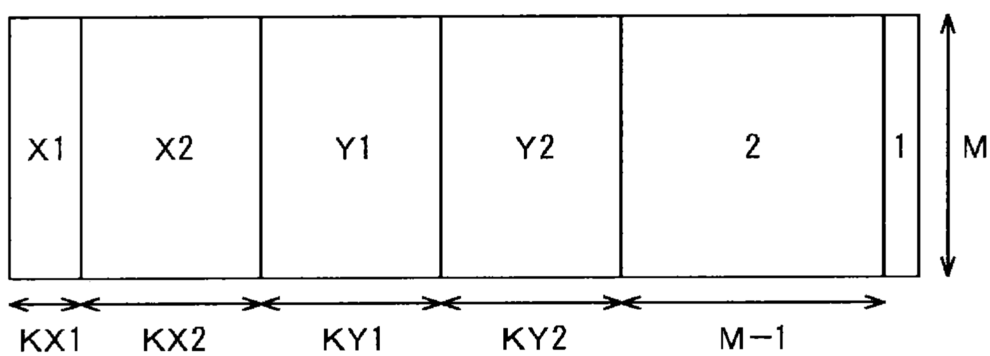
FIG. 77 is a diagram for describing the parity check matrix.

FIG. 77 is a diagram for describing the parity check matrix H of the Samsung codes of (64 k, 6/15), (64 k, 8/15), and (64 k, 12/15).

In the parity check matrix H of the Samsung codes of (64 k, 6/15), (64 k, 8/15), and (64 k, 12/15), column weights from the first column to the KX1-th column are X1, a column weight of the KX2-th column is X2, a column weight of the KY1-th column is Y1, a column weight of the KY2-th is Y2, a column weight of the (M−1)-th column is 2, and a column weight of the last column is 1.

Here, KX1+KX2+KY1+KY2+M−1+1 is equal to the code length N=64,800 bits of the Samsung codes of (64 k, 6/15), (64 k, 8/15), and (64 k, 12/15).

The column numbers KX1, KX2, KY1, KY2, and M and the column weights X1, X2, Y1, and Y2 of the parity check matrix H of the Samsung codes of (64 k, 6/15), (64 k, 8/15), and (64 k, 12/15) are shown in FIG. 77.

Figure 78:
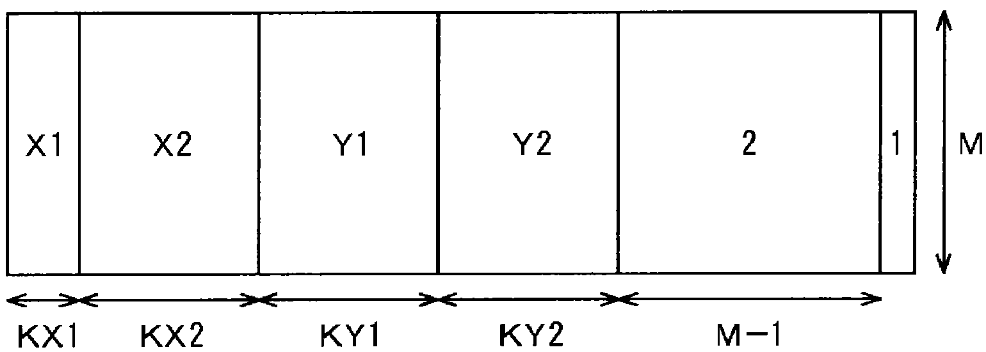
FIG. 78 is a diagram for describing the parity check matrix.

FIG. 78 is a diagram for describing the parity check matrix H of the LGE codes of (16 k, 6/15), (16 k, 7/15), (16 k, 9/15), (16 k, 11/15), and (16 k, 13/15).

In the parity check matrix H of the LGE codes of (16 k, 6/15), (16 k, 7/15), (16 k, 9/15), (16 k, 11/15), and (16 k, 13/15), column weights from the first column to the KX1-th column are X1, a column weight of the KX2-th column is X2, a column weight of the KY1-th column is Y1, a column weight of the KY2-th column is Y2, a column weight of the (M−1)-th column is 2, and a column weight of the last column is 1.

Here, KX1+KX2+KY1+KY2+M−1+1 is equal to the code length N=16,200 bits of the LGE codes of (16 k, 6/15), (16 k, 7/15), (16 k, 9/15), (16 k, 11/15), and (16 k, 13/15).

The column numbers KX1, KX2, KY1, KY2, and M and the column weights X1, X2, Y1, and Y2 of the parity check matrix H of the LGE codes of (16 k, 6/15), (16 k, 7/15), (16 k, 9/15), (16 k, 11/15), and (16 k, 13/15) are shown in FIG. 78.

Figure 79:
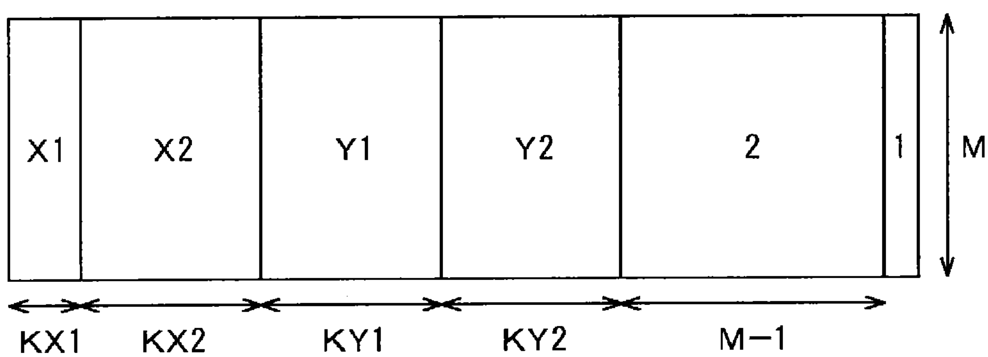
FIG. 79 is a diagram for describing the parity check matrix.

FIG. 79 is a diagram for describing the parity check matrix H of the LGE code of (64 k, 10/15).

In the parity check matrix H of the LGE code of (64 k, 10/15), a column weight from the first column to the KX1-th column is X1, a column weight of the KX2-th column is X2, a column weight of the KY1-th column is Y1, a column weight of the KY2-th is Y2, a column weight of the (M−1)-th column is 2, and a column weight of the last column is 1.

Here, KX1+KX2+KY1+KY2+M−1+1 is equal to the code length N=64,800 bits of the LGE code of (64 k, 10/15).

The column numbers KX1, KX2, KY1, KY2, and M and the column weights X1, X2, Y1, and Y2 of the parity check matrix H of the LGE code of (64 k, 10/15) are shown in FIG. 79.

Figure 80:
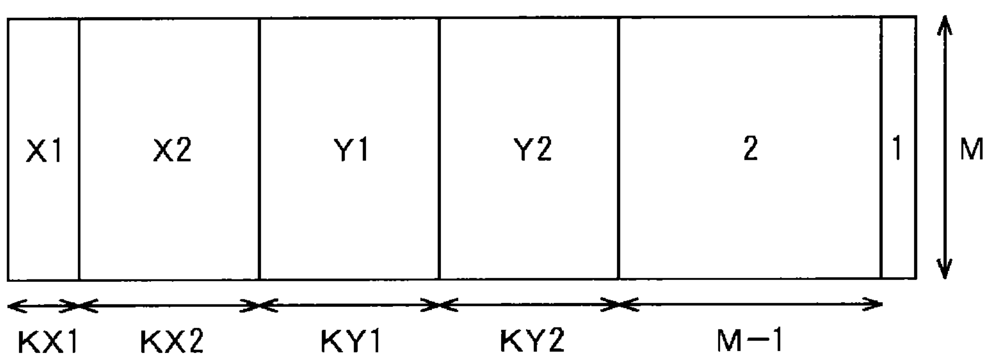
FIG. 80 is a diagram for describing the parity check matrix.

FIG. 80 is a diagram for describing the parity check matrix H of the NERC code of (64 k, 9/15).

In the parity check matrix H of the NERC code of (64 k, 9/15), column weights from the first column to the KX1-th column are X1, a column weight of the KX2-th column is X2, a column weight of the KY1-th column is Y1, a column weight of the KY2-th column is Y2, a column weight of the (M−1)-th column is 2, and a column weight of the last column is 1.

Here, KX1+KX2+KY1+KY2+M−1+1 is equal to the code length N=64,800 bits of the NERC code of (64 k, 9/15).

The column numbers KX1, KX2, KY1, KY2, and M and the column weights X1, X2, Y1, and Y2 of the parity check matrix H of the NERC code of (64 k, 9/15) are shown in FIG. 80.

Figure 81:
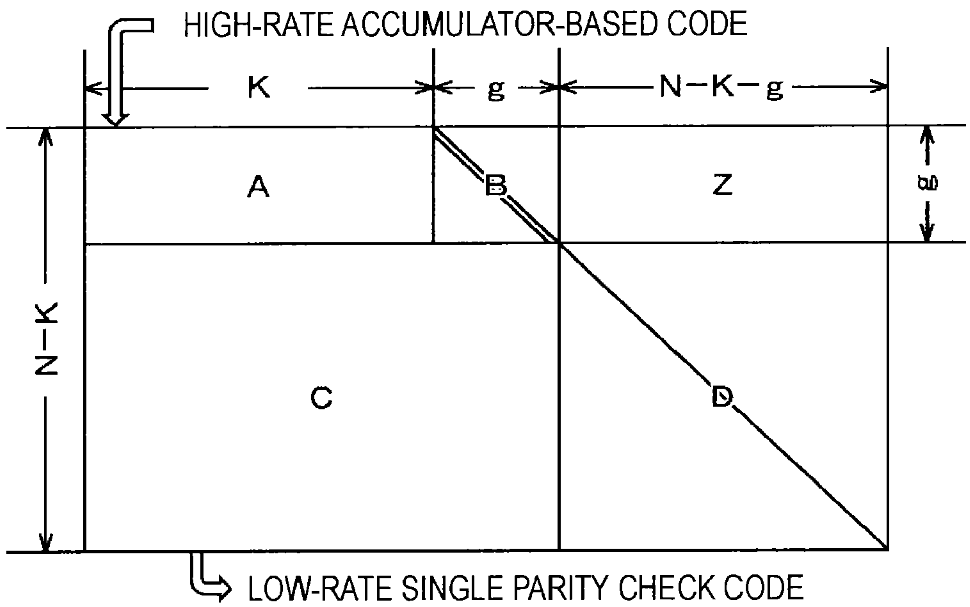
FIG. 81 is a diagram for describing the parity check matrix.

FIG. 81 is a diagram for describing the parity check matrix H of the ETRI code of (16 k, 5/15).

In the parity check matrix H of the ETRI code of (16 k, 5/15), a parameter $g=M_1$ is 720.

Since the ETRI code of (16 k, 5/15) has a code length N of 16,200 and a code rate r of 5/15, an information length K=N×r is 16,200×5/15=5,400, and a parity length M=N−K is 16,200-5,400=10,800.

A parameter $M_2=M-M_1=N-K-g$ is 10,800−720=10,080.

Accordingly, a parameter $Q_1=M_1/P$ is 720/360=2, and a parameter $Q_2=M_2/P$ is 10,080/360=28.

Figure 82:
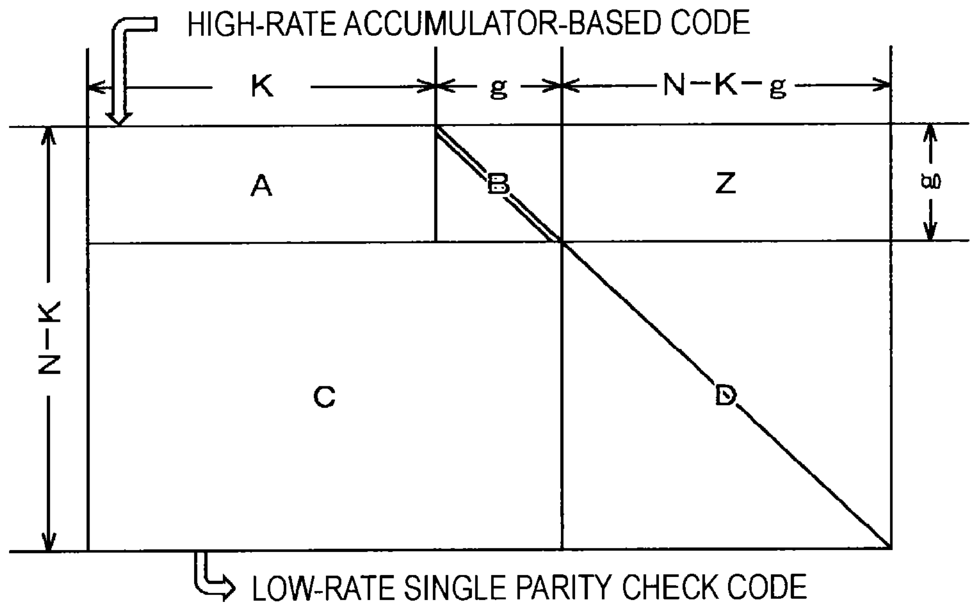
FIG. 82 is a diagram for describing the parity check matrix.

FIG. 82 is a diagram for describing the parity check matrix H of the ETRI codes of (64 k, 5/15), (64 k, 6/15), and (64 k, 7/15).

Parameters $g=M_1$, $M_2$, $Q_1$ and $Q_2$ for the parity check matrix H of the ETRI codes of (64 k, 5/15), (64 k, 6/15), and (64 k, 7/15) are shown in FIG. 82.

Constellation

FIGS. 83 to 104 are diagrams showing an example of the type of a constellation adopted by the transmission system of FIG. 7.

For example, in the transmission system of FIG. 7, it is possible to set a constellation to be used in MODCOD to the MODCOD which is a combination of the modulation scheme and the LDPC code.

That is, in the transmission system of FIG. 7, the LDPC code is classified into nine types of LDPC codes having code rates r of 5/15, 6/15, 7/15, 8/15, 9/15, 10/15, 11/15, 12, 15, and 13/15 according to the code rate r (regardless of the code length N), and combinations of these nine types of LDPC codes (the LDPC codes having code rates r of 5/15, 6/15, 7/15, 8/15, 9/15, 10/15, 11/15, 12, 15, and 13/15) and the respective modulation schemes can be adopted as the MODCOD.

In the transmission system of FIG. 7, it is possible to set one or more constellations to be used in one MODCOD modulation scheme to the MODCOD.

As the constellation, there are a uniform constellation (UC) in which signal points are uniformly arranged, and a non-uniform constellation (NUC) in which signal points are not uniformly arranged.

As the NUC, for example, there is a constellation called a 1-dimensional $M^2$-QAM non-uniform constellation (1D NUC) and a constellation called a 2-dimensional QQAM non-uniform constellation (2D NUC).

In general, the 1D NUC can improve a BER further than the UC, and the 2D NUC can improve a BER further than the 1D NUC.

The constellation of the QPSK modulation scheme is the UC. As the constellation of the 16-QAM, 64-QAM or 256-QAM modulation scheme, it is possible to adopt, for example, the 2D NUC, and as the constellation of the 1024-QAM or 4096-QAM modulation scheme, it is possible to adopt, for example, the 1D NUC.

Hereinafter, the NUC constellation used in the MODCOD in which the modulation scheme is a modulation scheme of mapping a m-bit symbol to any one of $2^m$ number of signal points and the code rate of the LDPC code is r is described as a NUC_$2^m$_r.

For example, "NUC_16_6/15" refers to the NUC constellation used in the MODCOD in which the modulation scheme is a 16-QAM modulation scheme (in addition, a modulation scheme of mapping a symbol to any one of 16 signal points) and the code rate r of the LDPC code is 6/15.

In the transmission system of FIG. 7, when the modulation scheme is QPSK, the same constellation is used for the respective code rates r of the LDPC code.

In the transmission system of FIG. 7, when the modulation scheme is 16-QAM, 64-QAM or 256-QAM, different 2D NUC constellations are used for the code rates r of the LDPC code.

Moreover, in the transmission system of FIG. 7, when the modulation scheme is 1024-QAM or 4096-QAM, different 1D NUC constellations are used for the code rates r of the LDPC code.

Accordingly, as described above, when the LDPC code is classified into nine types of LDPC codes having r=5/15, 6/15, 7/15, 8/15, 9/15, 10/15, 11/15, 12, 15, 13/15 according to the code rate r, one type of constellation is provided for QPSK, nine types of 2D NUC constellations are provided for 16-QAM, 64-QAM and 256-QAM, and nine types of 1D NUC constellations are provided for 1024-QAM and 4096-QAM.

Figure 83:
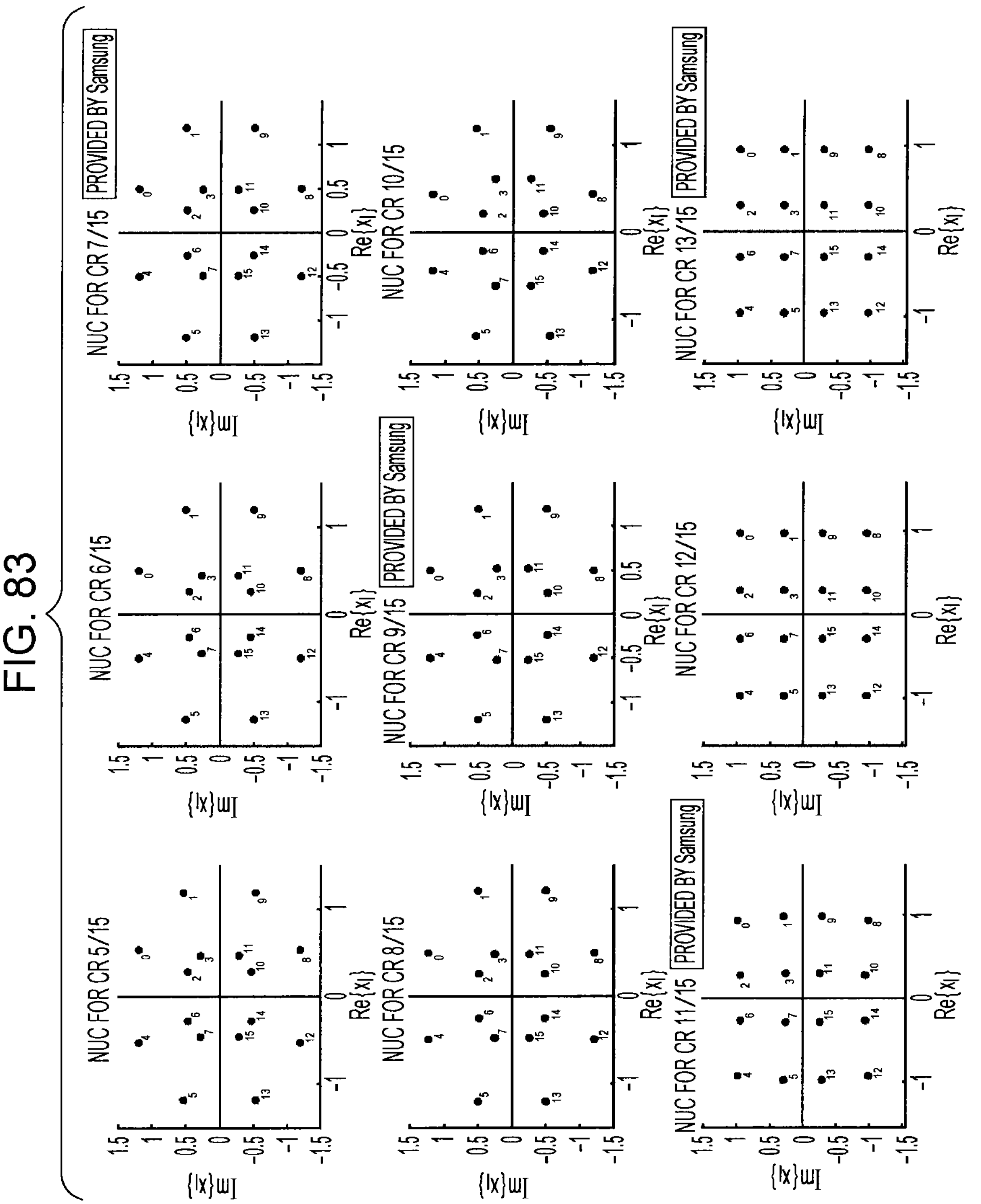
FIG. 83 is a diagram showing an example of a constellation when a modulation scheme is 16-QAM.

FIG. 83 is a diagram showing examples of the 2D NUC constellations for the nine types of LDPC codes having the code rates r (=5/15, 6/15, 7/15, 8/15, 9/15, 10/15, 11/15, 12, 15, and 13/15) when the modulation scheme is 16-QAM.

Figure 84:
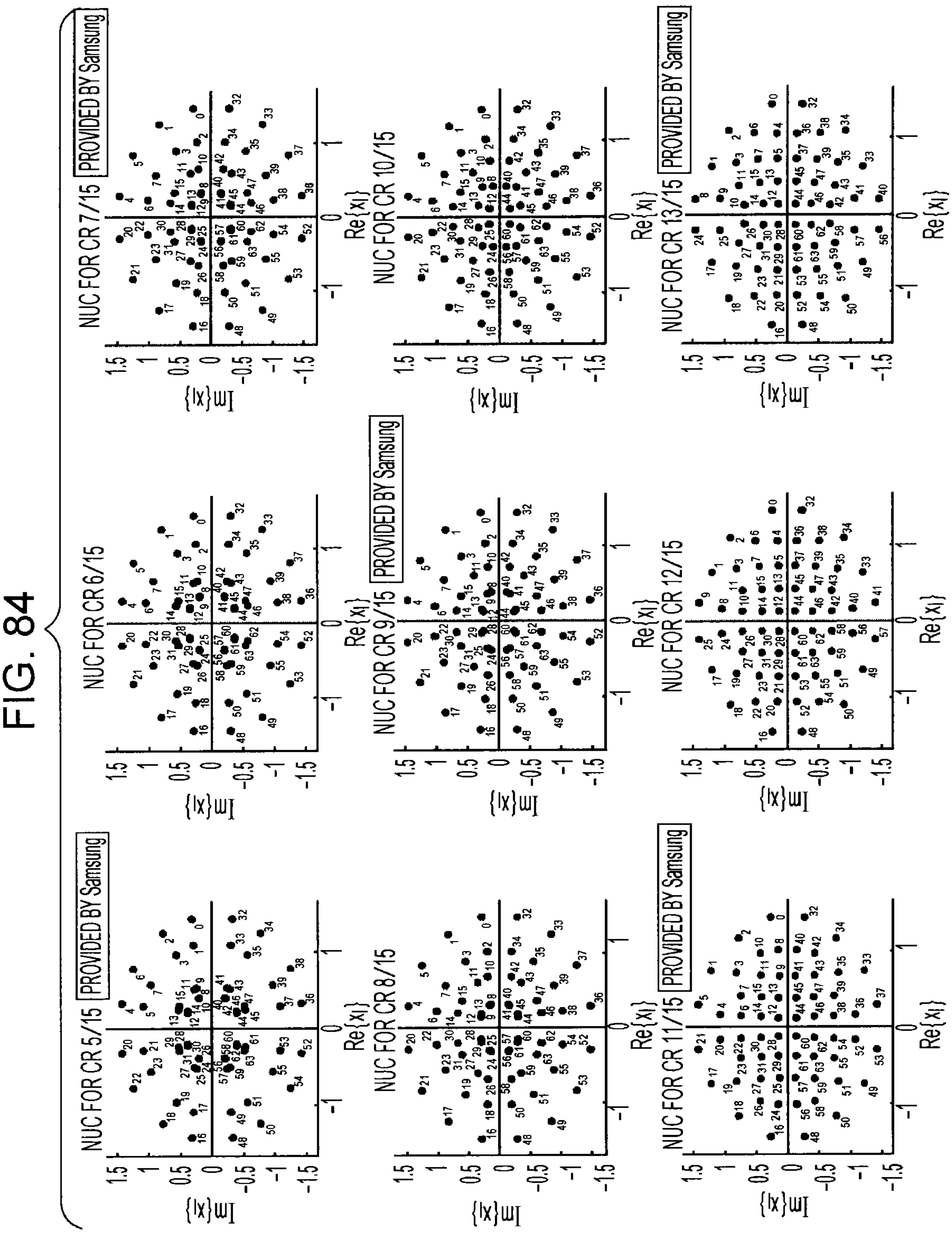
FIG. 84 is a diagram showing an example of a constellation when a modulation scheme is 64-QAM.

FIG. 84 is a diagram showing examples of the 2D NUC constellations for the nine types of LDPC codes having the code rates r (=5/15, 6/15, 7/15, 8/15, 9/15, 10/15, 11/15, 12, 15, and 13/15) when the modulation scheme is 64-QAM.

Figure 85:
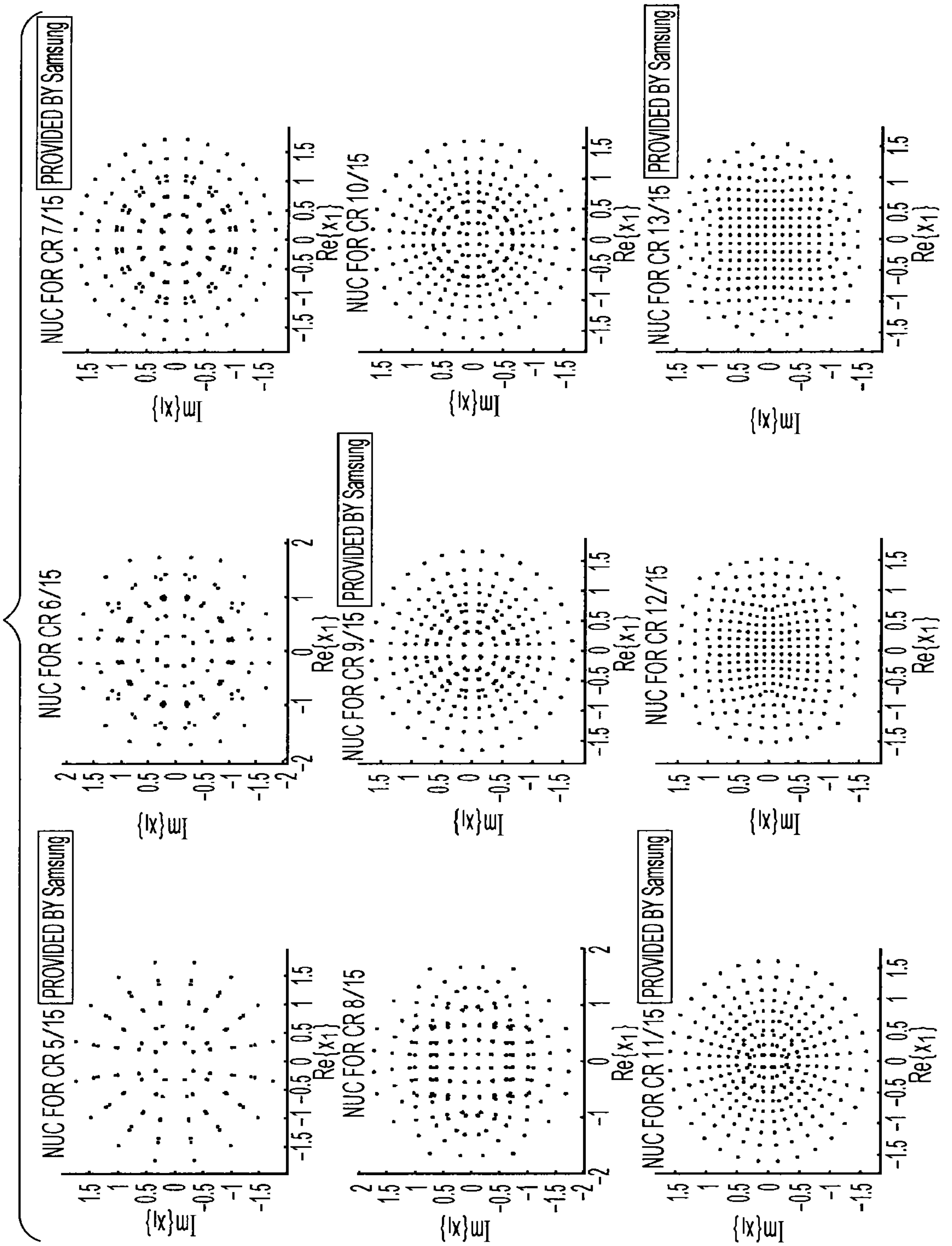
FIG. 85 is a diagram showing an example of a constellation when a modulation scheme is 256-QAM.

FIG. 85 is a diagram showing examples of the 2D NUC constellations for the nine types of code rates r (=5/15, 6/15, 7/15, 8/15, 9/15, 10/15, 11/15, 12, 15, and 13/15) of the LDPC codes when the modulation scheme is 256-QAM.

Figure 86:
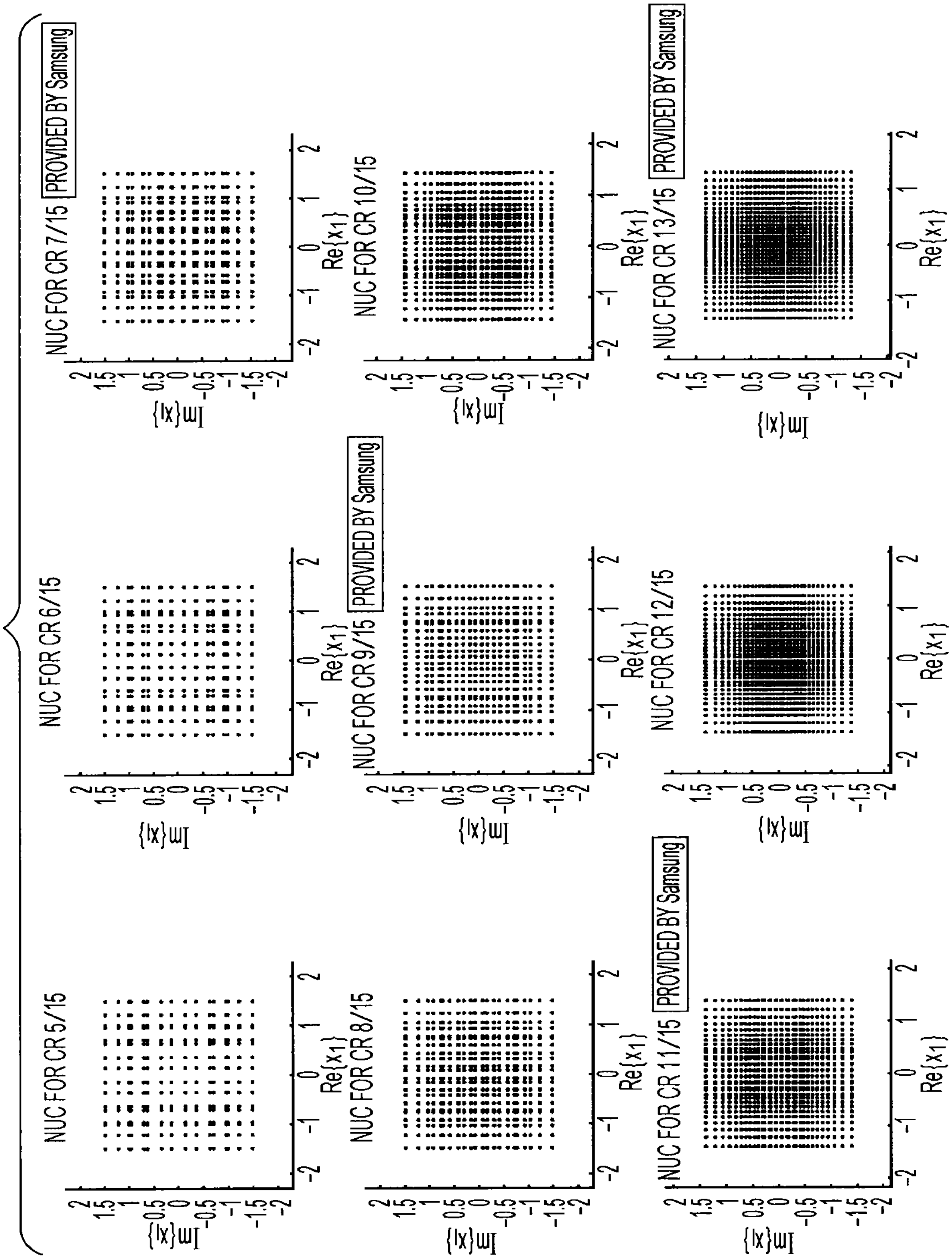
FIG. 86 is a diagram showing an example of a constellation when a modulation scheme is 1024-QAM.

FIG. 86 is a diagram showing examples of the 1D NUC constellations for the nine types of LDPC codes having the code rates r (=5/15, 6/15, 7/15, 8/15, 9/15, 10/15, 11/15, 12, 15, and 13/15) when the modulation scheme is 1024-QAM.

Figure 87:
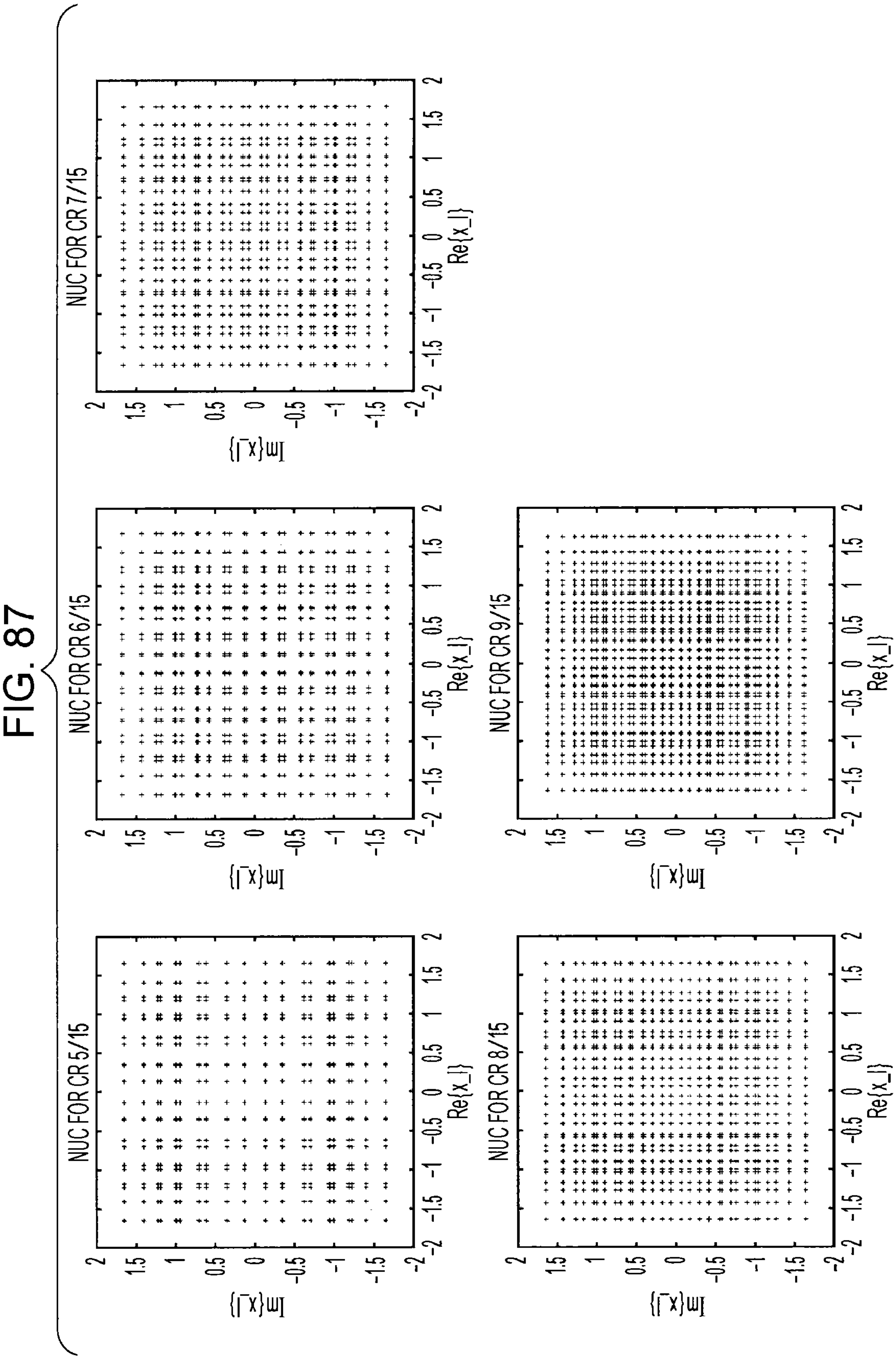
FIG. 87 is a diagram showing an example of a constellation when a modulation scheme is 4096-QAM.
Figure 88:
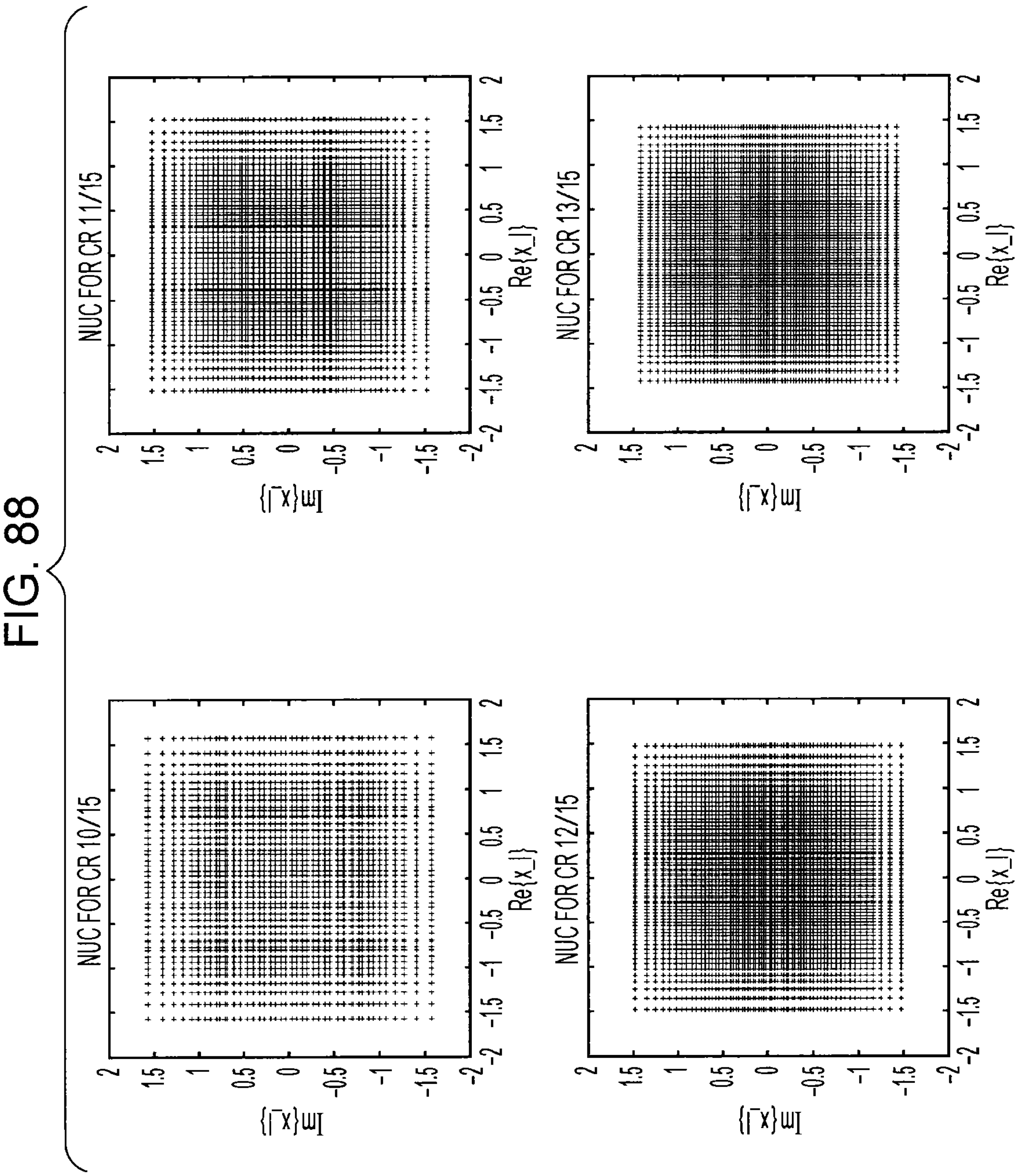
FIG. 88 is a diagram showing an example of a constellation when a modulation scheme is 4096-QAM.

FIGS. 87 and 88 are diagrams showing examples of the 1D NUC constellations for the nine types of LDPC codes having the code rates r (=5/15, 6/15, 7/15, 8/15, 9/15, 10/15, 11/15, 12, 15, and 13/15) when the modulation scheme is 4096-QAM.

In FIGS. 83 to 88, a horizontal axis and a vertical axis are respectively an I axis and a Q axis, and $Re\{x_1\}$ and $Im\{x_1\}$ are respectively a real part and an imaginary part of a signal point $x_1$, as a coordinate of the signal point $x_1$.

In FIGS. 83 to 88, a value described before "for CR" represents the code rate r of the LDPC code.

FIG. 89 is a diagram showing an example of the coordinate of the signal point of the UC that is commonly used for the nine types of code rates r (=5/15, 6/15, 7/15, 8/15, 9/15, 10/15, 11/15, 12, 15, and 13/15) of the LDPC code when the modulation scheme is QPSK.

In FIG. 89, "Input cell word y" represents a 2-bit symbol mapped to the UC of QPSK, and "Constellation point $z_q$" represents the coordinate of a signal point $z_q$. The index q of the signal point $z_q$ represents a discrete time of a symbol (a time interval between a given symbol and the next symbol).

In FIG. 89, the coordinate of the signal point $z_q$ is represented in the form of a complex number, and i represents an imaginary unit ($\sqrt{(-1)}$).

FIG. 90 is diagram showing an example of the coordinate of the signal point of the 2D NUC of FIG. 83 used for the nine types of code rates r (=5/15, 6/15, 7/15, 8/15, 9/15, 10/15, 11/15, 12, 15, and 13/15) of the LDPC code when the modulation scheme is 16-QAM.

FIG. 91 is diagram showing an example of the coordinate of the signal point of the 2D NUC of FIG. 84 used for the nine types of code rates r (=5/15, 6/15, 7/15, 8/15, 9/15, 10/15, 11/15, 12, 15, and 13/15) of the LDPC code when the modulation scheme is 64-QAM.

FIGS. 92 and 93 are diagrams showing an example of the coordinate of the signal point of the 2D NUC of FIG. 85 used for the nine types of code rates r (=5/15, 6/15, 7/15, 8/15, 9/15, 10/15, 11/15, 12, 15, and 13/15) of the LDPC code when the modulation scheme is 256-QAM.

In FIGS. 90 to 93, NUC_$2^m$_r represents the coordinate of the signal point of the 2D NUC used when the modulation scheme is $2^m$-QAM and the code rate of the LDPC code is r.

Similarly to FIG. 89, in FIGS. 90 to 93, the coordinate of the signal point $z_q$ is represented in the form of a complex number, and i represents an imaginary unit.

In FIGS. 90 to 93, w#k represents the coordinate of a signal point in a first quadrant of the constellation.

In the 2D NUC, a signal point in a second quadrant of the constellation is disposed in a position where the signal point in the first quadrant is symmetrically moved with respect to the Q axis, and a signal point in a third quadrant of the constellation is disposed in a position where the signal point in the first quadrant is symmetrically moved with respect to an origin. A signal point in a fourth quadrant of the constellation is disposed in a position where the signal point in the first quadrant is symmetrically moved with respect to the I axis.

Here, when the modulation scheme is $2^m$-QAM, m bits are used as one symbol, and the one symbol is mapped to a signal corresponding to the symbol.

The m-bit symbol is represented as, for example, an integer value of 0 to $2^m$-1. However, when b=$2^m$/4, symbols y(0), y(1), . . . , and y($2^m$−1) that are expressed as integer values of 0 to $2^m$−1 can be classified into four symbols including symbols y(0) to y(b−1), y(b) to y(2b−1), y(2b) to y(3b−1), and y(3b) to y(4b−1).

In FIGS. 90 to 93, the suffix k in w#k is represented as an integer value in a range of 0 to b−1, and w#k represents the coordinate of a signal point corresponding to a symbol y(k) in a range of symbols y(0) to y(b−1).

The coordinate of a signal point corresponding to a symbol y(k+b) in a range of symbols y(b) to y(2b−1) is represented as −conj(w#k), the coordinate of a signal point corresponding to a symbol y(k+2b) in a range of symbols y(2b) to y(3b−1) is represented as conj(w#k), and the coordinate of a signal point corresponding to a symbol y(k+3b) in a range of symbols y(3b) to y(4b−1) is represented as −w#k.

Here, conj(w#k) represents complex conjugates of w#k.

For example, when the modulation scheme is 16-QAM, symbols y(0), y(1), . . . , and y(15) of m=4 bits are classified into four symbols including symbols y(0) to y(3), y(4) to y(7), y(8) to y(11) and y(12) to y(15) since $b=2^4/4=4$.

Furthermore, for example, since the symbol y(12) of the symbols y(0) to y(15) is a symbol y(k+3b)=y(0+3×4) in a range of symbols y(3b) to y(4b−1) and k=0, the coordinate of a signal point of the symbol y(12) is −w#k=−w0.

When the code rate r of the LDPC code is, for example, 9/15, since w0 (NUC_16_9/15) when the modulation scheme is 16-QAM and the code rate r is 9/15 is 0.4967+1.1932i according to FIG. 90, the coordinate −w0 of the signal point corresponding to the symbol y(12) is −(0.4967+1.1932i).

FIG. 94 is a diagram showing an example of the coordinate of the signal point of the 1D NUC of FIG. 86 used for the nine types of code rates r (=5/15, 6/15, 7/15, 8/15, 9/15, 10/15, 11/15, 12, 15, and 13/15) of the LDPC code when the modulation scheme is 1024-QAM.

In FIG. 94, rows of NUC_1 k_r represent values of u#k representing the coordinate of the signal point of the 1D NUC used when the modulation scheme is 1024-QAM and the code rate of the LDPC code is r.

u#k represents a real part $Re(z_q)$ and an imaginary part $Im(z_q)$ of a complex number as the coordinate of the signal point $z_q$ of the 1D NUC.

FIG. 95 is a diagram showing the relationship between a symbol y of 1024-QAM and u#k as the real part $Re(z_q)$ and the imaginary part $Im(z_q)$ of the complex number representing the coordinate of the signal point $z_q$ of the 1D NUC corresponding to the symbol y.

It is assumed that a 10-bit symbol y of 1024-QAM is represents as $y_{0,q}, y_{1,q}, y_{2,q}, y_{3,q}, y_{4,q}, y_{5,q}, y_{6,q}, y_{7,q}, y_{8,q}, y_{9,q}$ from the leading bit (most significant bit).

FIG. 95A shows the correspondence relationship between five odd-numbered bits $y_{0,q}, y_{2,q}, y_{4,q}, y_{6,q}, y_{8,q}$ of the symbol y and u#k representing the real part $Re(z_q)$ of (the coordinate of) the signal point $z_q$ corresponding to the symbol y.

FIG. 95B shows the correspondence relationship between five even-numbered bits $y_{1,q}, y_{3,q}, y_{5,q}, y_{7,q}, y_{9,q}$ of the symbol y and u#k representing the imaginary part $Im(z_q)$ of (the coordinate of) the signal point $z_q$ corresponding to the symbol y.

When the 10-bit symbol $y=(y_{0,q}, y_{1,q}, y_{2,q}, y_{3,q}, y_{4,q}, y_{5,q}, y_{6,q}, y_{7,q}, y_{8,q}, y_{9,q})$ of 1024-QAM is, for example, (0, 0, 1, 0, 0, 1, 1, 1, 0, 0), five odd-numbered bits $(y_{0,q}, y_{2,q}, y_{4,q}, y_{6,q}, y_{8,q})$ are (0, 1, 0, 1, 0), and five even-numbered bits $(y_{1,q}, y_{3,q}, y_{5,q}, y_{7,q}, y_{9,q})$ are (0, 0, 1, 1, 0).

In FIG. 95A, the five odd-numbered bits (0, 1, 0, 1, 0) correspond to u3, and thus, the real part $Re(z_q)$ of the signal point $z_q$ corresponding to the symbol y=(0, 0, 1, 0, 0, 1, 1, 1, 0, 0) corresponds to u3.

Moreover, in FIG. 95B, the five even-numbered bits (0, 0, 1, 1, 0) correspond to u11, and thus, the imaginary part $Im(z_q)$ of the signal point $z_q$ corresponding to the symbol y=(0, 0, 1, 0, 0, 1, 1, 1, 0, 0) is u11.

Meanwhile, when it is assumed that the code rate r of the LDPC code is, for example, 7/15, u3 of the 1D NUC (NUC_1 k_7/15) used when the modulation scheme is 1024-QAM and the code rate r of the LDPC code is 7/15 is 1.1963, and u11 is 6.9391 according to FIG. 94 described above.

Accordingly, the real part $Re(z_q)$ of the signal point $z_q$ corresponding to the symbol y=(0, 0, 1, 0, 0, 1, 1, 1, 0, 0) is u3=1.1963, and $Im(z_q)$ is u11=6.9391. As a result, the coordinate of a signal point $z_q$ corresponding to the symbol y=(0, 0, 1, 0, 0, 1, 1, 1, 0, 0) is represented as 1.1963+6.9391i.

FIG. 96 is a diagram showing an example of the coordinate of the signal point of the 1D NUC of FIGS. 87 and 88 used for the nine types of code rates r (=5/15, 6/15, 7/15, 8/15, 9/15, 10/15, 11/15, 12, 15, and 13/15) of the LDPC code when the modulation scheme is 4096-QAM.

In FIG. 96, the respective rows represent values of u#k representing the coordinate of the signal point of the 1D NUC used when the modulation scheme is 4096-QAM and the code rates of the LDPC code are r=5/15, 6/15, 7/15, 8/15, 9/15, 10/15, 11/15, 12, 15, and 13/15.

u#k represents a real part $Re(z_q)$ and an imaginary part $Im(z_q)$ of a complex number as the coordinate of the signal point $z_q$ of the 1D NUC.

FIGS. 97A and 97B are diagrams showing the relationship between the symbol y of 4096-QAM and u#k as the real part $Re(z_q)$ and the imaginary part $Im(z_q)$ of the complex number representing the coordinate of the signal point $z_q$ of the 1D NUC corresponding to the symbol y.

Since a method of obtaining the coordinate of the signal point of the 1D NUC of 4096-QAM using FIGS. 96 and 97 is the same as the method of obtaining the coordinate of the signal point of the 1D NUC of 1024-QAM using FIGS. 94 and 95, the description thereof will be omitted.

Figure 98:
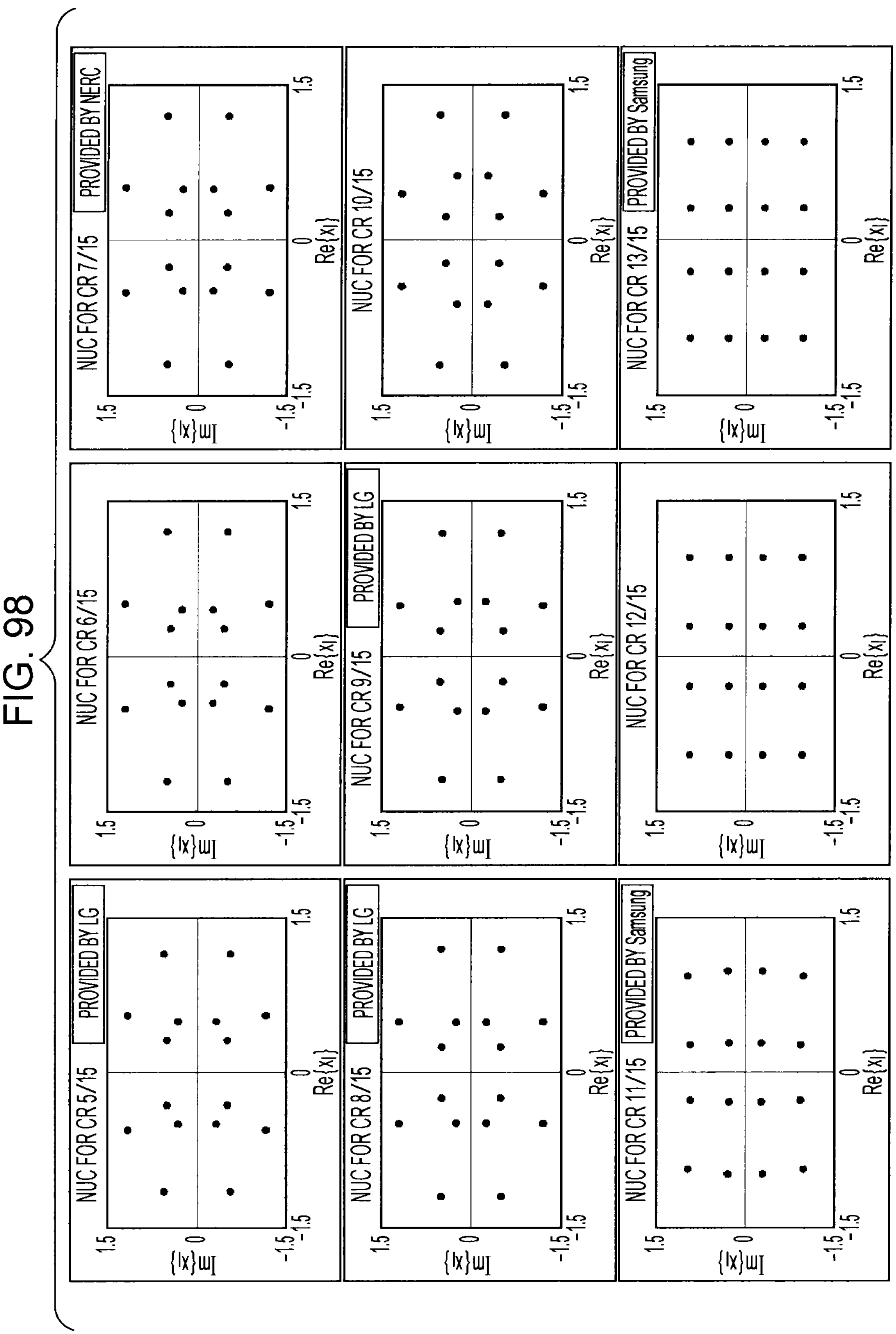
FIG. 98 is a diagram showing another example of a constellation when a modulation scheme is 16-QAM.

FIG. 98 is a diagram showing another example of the constellation of the 2D NUC for the nine types of code rates r of the LDPC code when the modulation scheme is 16-QAM.

Figure 99:
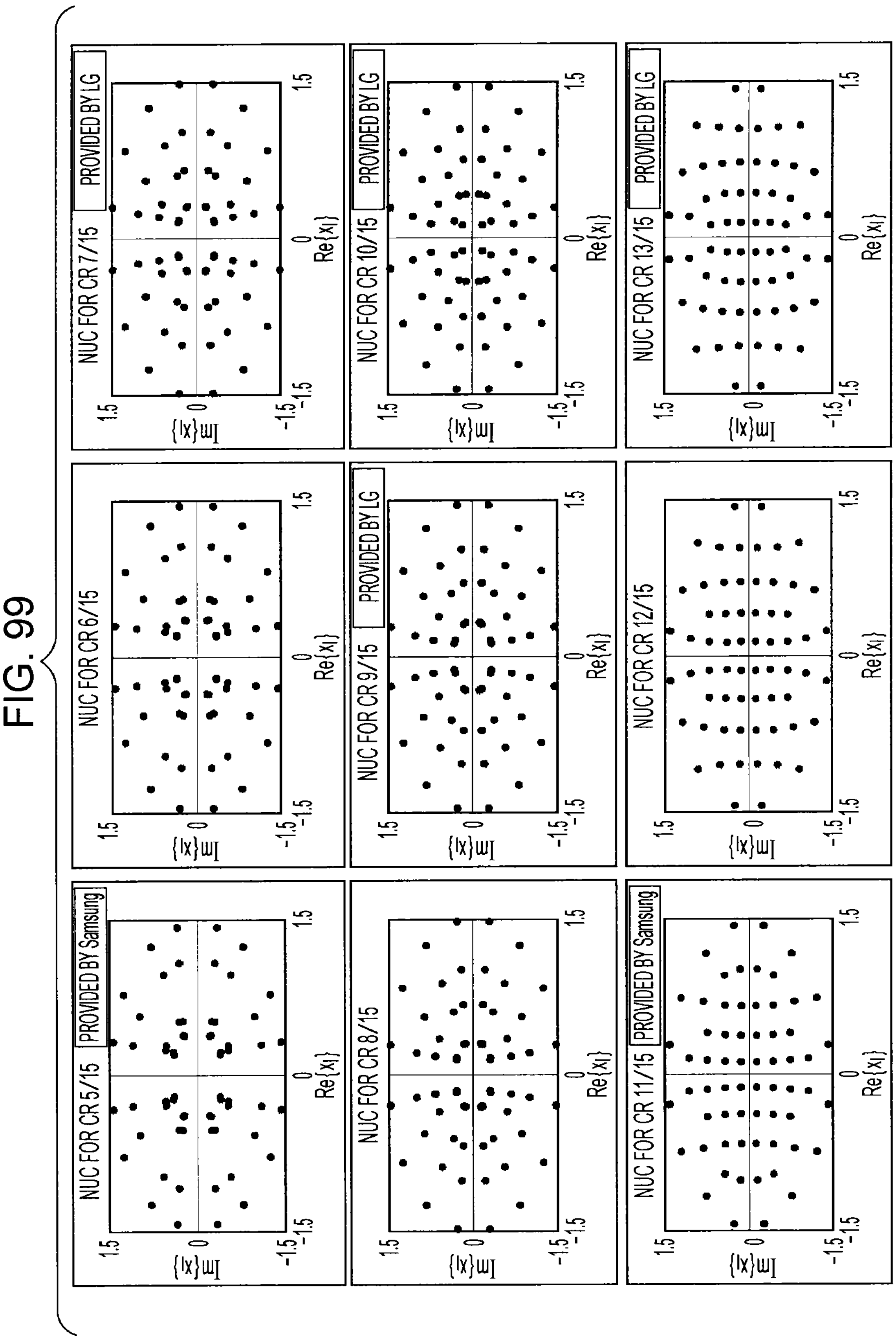
FIG. 99 is a diagram showing another example of a constellation when a modulation scheme is 64-QAM.

FIG. 99 is a diagram showing another example of the constellation of the 2D NUC for the nine types of code rates r of the LDPC code when the modulation scheme is 64-QAM.

Figure 100:
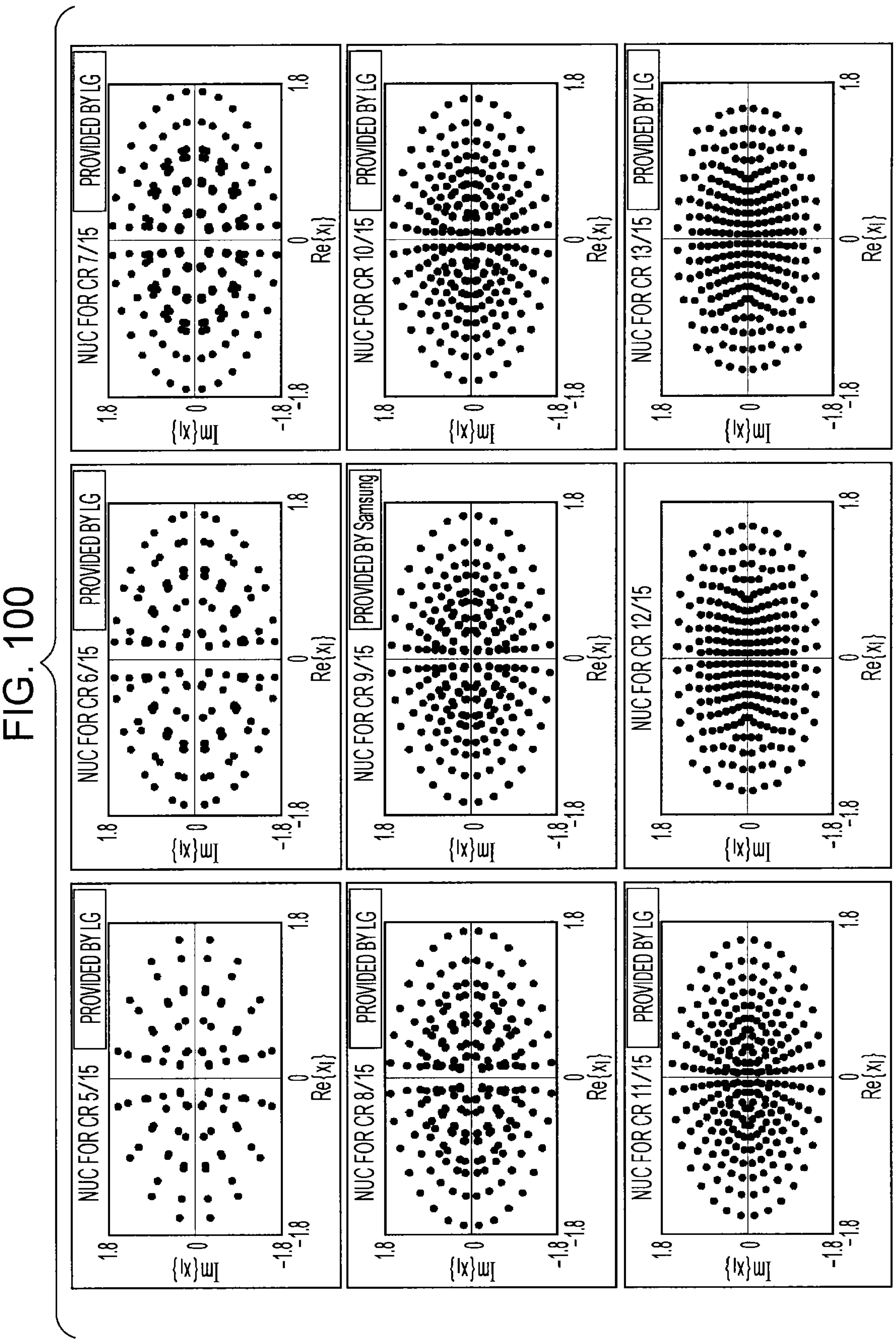
FIG. 100 is a diagram showing another example of a constellation when a modulation scheme is 256-QAM.

FIG. 100 is a diagram showing another example of the constellation of the 2D NUC for the nine types of code rates r of the LDPC code when the modulation scheme is 256-QAM.

Similarly to FIGS. 83 to 88, in FIGS. 98 to 100, a horizontal axis and a vertical axis are respectively an I axis and a Q axis, and $Re\{x_1\}$ and $Im\{x_1\}$ represent a real part and an imaginary part of a signal point $x_1$ as the coordinate of the signal point $x_1$. In FIGS. 98 to 100, values described before "for CR" represent the code rates r of the LDPC code.

FIG. 101 is a diagram showing an example of the coordinate of the signal point of the 2D NUC of FIG. 98 used for the nine types of code rates of the LDPC code when the modulation scheme is 16-QAM.

FIG. 102 is a diagram showing an example of the coordinate of the signal point of the 2D NUC of FIG. 99 used for the nine types of code rates of the LDPC code when the modulation scheme is 64-QAM.

FIGS. 103 and 104 are diagrams showing an example of the coordinate of the signal point of the 2D NUC of FIG. 100 used for the nine types of code rates of the LDPC code when the modulation scheme is 256-QAM.

In FIGS. 101 to 104, NUC_$2^m$_r represents the coordinate of the signal point of the 2D NUC used when the modulation scheme is $2^m$-QAM and the code rate of the LDPC code is r, similarly to FIGS. 90 to 93.

The signal points of the 1D NUC are arranged in a straight line parallel to the I axis or a straight line parallel to the Q axis in a lattice shape. An interval between the signal points is not uniform. When (data mapped to) the signal points is transmitted, an average power of the signal point on the constellation is normalized. When it is assumed that a root-mean-square value of an absolute value of (coordinates of) all signal points on the constellation is represented as $P_{ave}$, the normalization is performed by multiplying the reciprocal $1/\sqrt{P_{ave}}$) of the respective signal points $z_q$ on the constellation by the square root $\sqrt{P_{ave}}$ of the root-mean-square value $P_{ave}$.

According to the constellations described in FIGS. 83 to 104, it can be seen that a favorable error rate is obtained.

Block Interleaver 25

Figure 105:
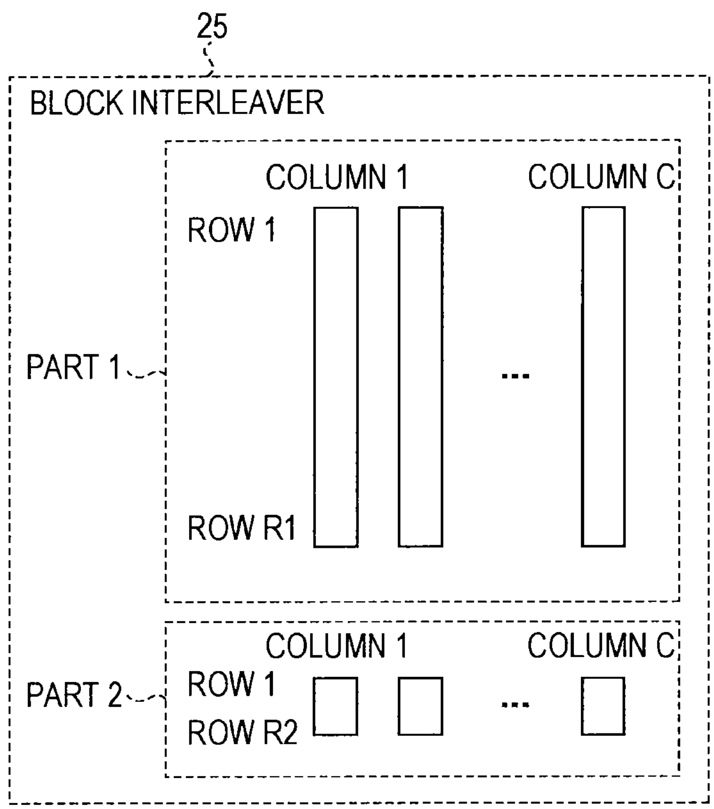
FIG. 105 is a block diagram showing a configuration example of a block interleaver.

FIG. 105 is a block diagram showing a configuration example of the block interleaver 25 of FIG. 9.

The block interleaver 25 includes a storage region called a part 1, and a storage region called a part 2.

Both of the parts 1 and 2 are configured in such a manner that columns as storage regions that store one bit in a row (transverse) direction and store a predetermined number of bits in a column (longitudinal) direction are arranged by a number C equal to m which is the number of bits of a symbol in the row direction.

When it is assumed that the number of bits (hereinafter, referred to as a part column length) stored in the column direction by the columns of the part 1 is represented as R1 and the part column length of the columns of the part 2 is represented as R2, (R1+R2)×C is equal to the code length N (64,800 bits or 16,200 bits in the first embodiment) of the LDPC code to be subject to the block interleaving.

The part column length R1 is equal to a multiple of 360 bits which is the unit size P, and the part column length R2 is equal to the remainder when the sum (hereinafter, referred to as a column length) R1+R2 of the part column length R1 of the part 1 and the part column length R2 of the part 2 is divided by 360 bits which is the unit size P.

Here, the column length R1+R2 is equal to the value obtained by dividing the code length N of the LDPC code to be subject to the block interleaving by the number of bits m of the symbol.

When 16-QAM is adopted as the modulation scheme, since the number of bits m of the symbol is 4 bits, the column length R1+R2 of the LDPC code having a code length N of 16,200 bits is 4,050(=16,200/4) bits.

Furthermore, since the remainder when the column length R1+R2=4,050 is divided by 360 bits which is the unit size P is 90, the part column length R2 of the part 2 is 90 bits.

The part column length R1 of the part 1 is R1+R2-R2=4,050−90=3,960 bits.

FIG. 106 is a diagram showing the number of columns C of the parts 1 and 2 for combinations of the code lengths N and the modulation schemes and the part column lengths (the number of rows) R1 and R2.

FIG. 106 shows the number of columns C of the parts 1 and 2 for the combinations of the LDPC codes having the code lengths N of 16,200 bits and 64,800 bits and the modulation schemes of QPSK, 16-QAM, 64-QAM, 256-QAM, 1024-QAM, and 4096-QAM and the part column lengths R1 and R2.

FIG. 107 is a diagram for describing the block interleaving performed in the block interleaver 25 of FIG. 105.

The block interleaver 25 performs the block interleaving by writing and reading the LDPC code in and from the parts 1 and 2.

Figure 107A:
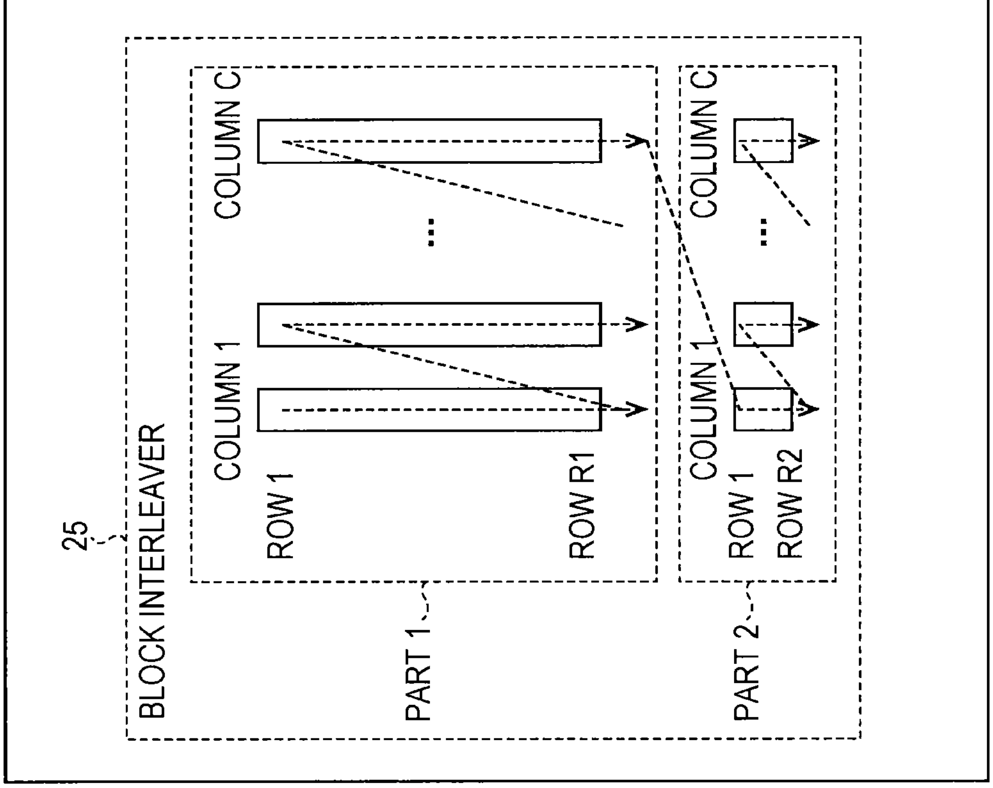
FIGS. 107A and 107B are diagrams for describing block interleaving performed in the block interleaver.

That is, in the block interleaving, as shown in FIG. 107A, the writing of the code bits of the LDPC code of the one codeword in the columns of the part 1 from the top to the bottom (in column direction) is performed in the columns from the left to the right.

When the writing of the code bits in the bottommost region of the rightmost column (C-th column) of the columns of the part 1 is ended, the writing of the remaining code bits in the columns of the part 2 from the top to the bottom (in the column direction) is performed in the columns from the left to the right.

Figure 107B:
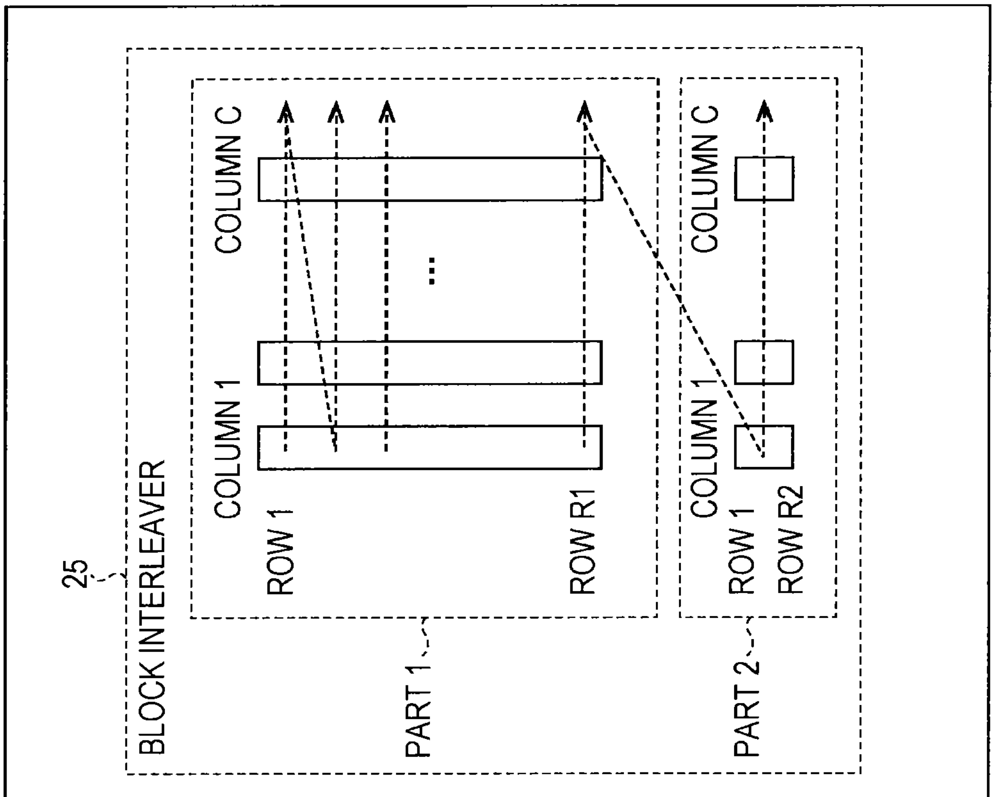

Subsequently, when the writing of the code bits in the bottommost region of the rightmost column (C-th column) of the columns of the part 2 is ended, the code bits are read from the first columns of all of C number of columns of the part 1 in the row direction for every C=m bits as shown in FIG. 107B.

The reading of the code bits from all of C number of columns of the part 1 is sequentially performed in the lower rows, and when the reading from the R1 row which is the last row is ended, the code bits are read from the first rows of all of C number of columns of the part 2 in the row direction for every C=m bits.

The reading of the code bits from all of C number of columns of the part 2 is sequentially performed in the lower rows, and the reading is performed up to the R2 row which is the last row.

As stated above, the code bits read for every m bits from the parts 1 and 2 are supplied as the symbol to the mapper 117 (FIG. 8).

Group-Wise Interleaving

Figure 108:
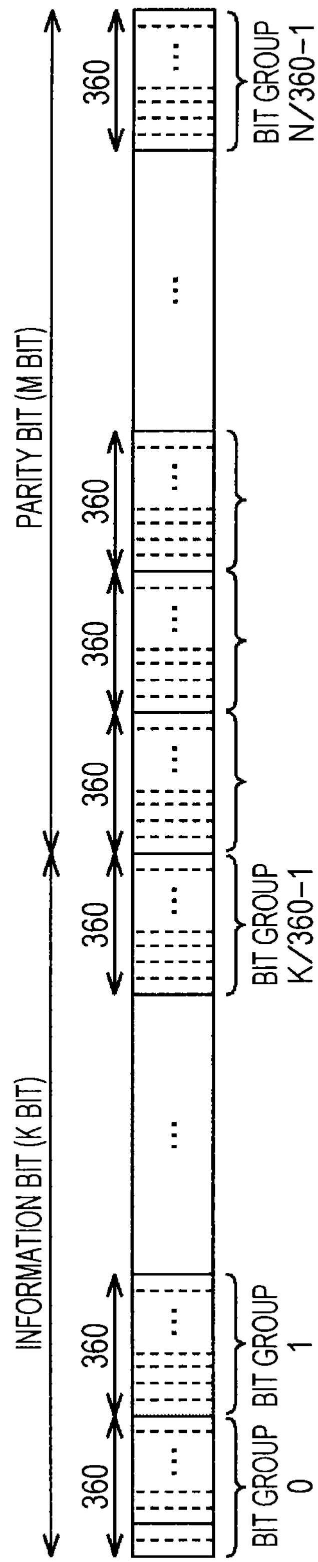
FIG. 108 is a diagram for describing group-wise interleaving performed in a group-wise interleaver.

FIG. 108 is a diagram for describing the group-wise interleaving performed in the group-wise interleaver 24 of FIG. 9.

In the group-wise interleaving, the LDPC code of one codeword is interleaved for every bit group according to a predetermined pattern (hereinafter, referred to as a GW pattern) by using 360 bits corresponding to one group obtained by dividing the LDPC code of one codeword from the leading code for every 360 bits equal to the unit size P into the bit groups.

Hereinafter, a (i+1)-th bit group from a leading bit group when the LDPC code of one codeword is divided into the bit groups is referred to as a bit group i.

When the unit size P is 360 bits, the LDPC code having the code length N of, for example, 1,800 bits is divided into 5 (=1,800/360) bit groups of bit groups 0, 1, 2, 3 and 4. For example, the LDPC code having the code length N of 16,200 bits is divided into 45 (=16,200/360) bit groups of bit groups 0, 1, and 44, and the LDPC code having the code length N of 64,800 bits is divided into 180 (=64,800/360) bit groups of bit groups 0, 1, . . . , and 179.

In the following description, it is assumed that the GW pattern is represented as the arrangement of numbers representing the bit groups. For example, the GW pattern of 4, 2, 0, 3, 1 for the LDPC code having the code length N of 1,800 bits represents that the arrangement of bit groups 0, 1, 2, 3 and 4 is interleaved (rearranged) into the arrangement of bit groups 4, 2, 0, 3 and 1.

The GW pattern can be set for at least the code length N of the LDPC code.

Example of GW Pattern for LDPC code of 64 k Bits

FIG. 109 is a diagram showing a first example of the GW pattern for the LDPC code having a code length N of 64 k bits.

According to the GW pattern of FIG. 109, the arrangement of bit groups 0 to 179 of the LDPC code of 64 k bits is interleaved into bit groups 39, 47, 96, 176, 33, 75, 165, 38, 27, 58, 90, 76, 17, 46, 10, 91, 133, 69, 171, 32, 117, 78, 13, 146, 101, 36, 0, 138, 25, 77, 122, 49, 14, 125, 140, 93, 130, 2, 104, 102, 128, 4, 111, 151, 84, 167, 35, 127, 156, 55, 82, 85, 66, 114, 8, 147, 115, 113, 5, 31, 100, 106, 48, 52, 67, 107, 18, 126, 112, 50, 9, 143, 28, 160, 71, 79, 43, 98, 86, 94, 64, 3, 166, 105, 103, 118, 63, 51, 139, 172, 141, 175, 56, 74, 95, 29, 45, 129, 120, 168, 92, 150, 7, 162, 153, 137, 108, 159, 157, 173, 23, 89, 132, 57, 37, 70, 134, 40, 21, 149, 80, 1, 121, 59, 110, 142, 152, 15, 154, 145, 12, 170, 54, 155, 99, 22, 123, 72, 177, 131, 116, 44, 158, 73, 11, 65, 164, 119, 174, 34, 83, 53, 24, 42, 60, 26, 161, 68, 178, 41, 148, 109, 87, 144, 135, 20, 62, 81, 169, 124, 6, 19, 30, 163, 61, 179, 136, 97, 16, and 88.

FIG. 110 is a diagram showing a second example of the GW pattern for the LDPC code having the code length N of 64 k bits.

According to the GW pattern of FIG. 110, the arrangement of bit groups 0 to 179 of the LDPC code of 64 k bits is interleaved into the arrangement of bit groups 6, 14, 1, 127, 161, 177, 75, 123, 62, 103, 17, 18, 167, 88, 27, 34, 8, 110, 7, 78, 94, 44, 45, 166, 149, 61, 163, 145, 155, 157, 82, 130, 70, 92, 151, 139, 160, 133, 26, 2, 79, 15, 95, 122, 126, 178, 101, 24, 138, 146, 179, 30, 86, 58, 11, 121, 159, 49, 84, 132, 117, 119, 50, 52, 4, 51, 48, 74, 114, 59, 40, 131, 33, 89, 66, 136, 72, 16, 134, 37, 164, 77, 99, 173, 20, 158, 156, 90, 41, 176, 81, 42, 60, 109, 22, 150, 105, 120, 12, 64, 56, 68, 111, 21, 148, 53, 169, 97, 108, 35, 140, 91, 115, 152, 36, 106, 154, 0, 25, 54, 63, 172, 80, 168, 142, 118, 162, 135, 73, 83, 153, 141, 9, 28, 55, 31, 112, 107, 85, 100, 175, 23, 57, 47, 38, 170, 137, 76, 147, 93, 19, 98, 124, 39, 87, 174, 144, 46, 10, 129, 69, 71, 125, 96, 116, 171, 128, 65, 102, 5, 43, 143, 104, 13, 67, 29, 3, 113, 32, and 165.

FIG. 111 is a diagram showing a third example of the GW pattern for the LDPC code having the code length N of 64 k bits.

According to the GW pattern of FIG. 111, the arrangement of bit groups 0 to 179 of the LDPC code of 64 k bits is interleaved into the arrangement of bit groups 103, 116, 158, 0, 27, 73, 140, 30, 148, 36, 153, 154, 10, 174, 122, 178, 6, 106, 162, 59, 142, 112, 7, 74, 11, 51, 49, 72, 31, 65, 156, 95, 171, 105, 173, 168, 1, 155, 125, 82, 86, 161, 57, 165, 54, 26, 121, 25, 157, 93, 22, 34, 33, 39, 19, 46, 150, 141, 12, 9, 79, 118, 24, 17, 85, 117, 67, 58, 129, 160, 89, 61, 146, 77, 130, 102, 101, 137, 94, 69, 14, 133, 60, 149, 136, 16, 108, 41, 90, 28, 144, 13, 175, 114, 2, 18, 63, 68, 21, 109, 53, 123, 75, 81, 143, 169, 42, 119, 138, 104, 4, 131, 145, 8, 5, 76, 15, 88, 177, 124, 45, 97, 64, 100, 37, 132, 38, 44, 107, 35, 43, 80, 50, 91, 152, 78, 166, 55, 115, 170, 159, 147, 167, 87, 83, 29, 96, 172, 48, 98, 62, 139, 70, 164, 84, 47, 151, 134, 126, 113, 179, 110, 111, 128, 32, 52, 66, 40, 135, 176, 99, 127, 163, 3, 120, 71, 56, 92, 23 and 20.

FIG. 112 is a diagram showing a fourth example of the GW pattern for the LDPC code having the code length N of 64 k bits.

According to the GW pattern of FIG. 112, the arrangement of bit groups 0 to 179 of the LDPC code of 64 k bits is interleaved into the arrangement of bit groups 139, 106, 125, 81, 88, 104, 3, 66, 60, 65, 2, 95, 155, 24, 151, 5, 51, 53, 29, 75, 52, 85, 8, 22, 98, 93, 168, 15, 86, 126, 173, 100, 130, 176, 20, 10, 87, 92, 175, 36, 143, 110, 67, 146, 149, 127, 133, 42, 84, 64, 78, 1, 48, 159, 79, 138, 46, 112, 164, 31, 152, 57, 144, 69, 27, 136, 122, 170, 132, 171, 129, 115, 107, 134, 89, 157, 113, 119, 135, 45, 148, 83, 114, 71, 128, 161, 140, 26, 13, 59, 38, 35, 96, 28, 0, 80, 174, 137, 49, 16, 101, 74, 179, 91, 44, 55, 169, 131, 163, 123, 145, 162, 108, 178, 12, 77, 167, 21, 154, 82, 54, 90, 177, 17, 41, 39, 7, 102, 156, 62, 109, 14, 37, 23, 153, 6, 147, 50, 47, 63, 18, 70, 68, 124, 72, 33, 158, 32, 118, 99, 105, 94, 25, 121, 166, 120, 160, 141, 165, 111, 19, 150, 97, 76, 73, 142, 117, 4, 172, 58, 11, 30, 9, 103, 40, 61, 43, 34, 56, and 116.

Figure 113:
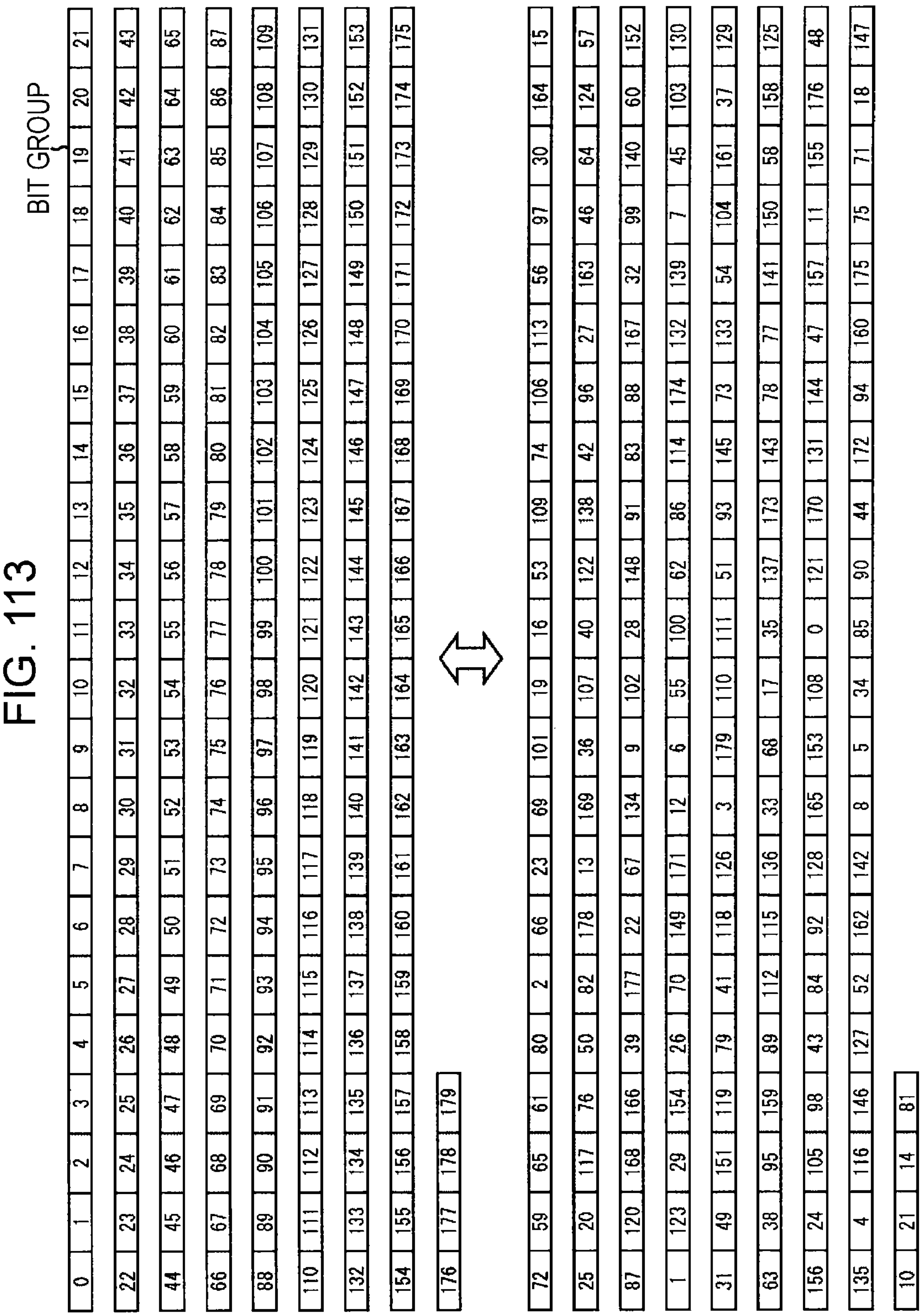
FIG. 113 is a diagram showing a fifth example of the GW pattern for the LDPC code having the code length of 64 k bits.

FIG. 113 is a diagram showing a fifth example of the GW pattern for the LDPC code having the code length N of 64 k bits.

According to the GW pattern of FIG. 113, the arrangement of bit groups 0 to 179 of the LDPC code of 64 k bits is interleaved into the arrangement of bit groups 72, 59, 65, 61, 80, 2, 66, 23, 69, 101, 19, 16, 53, 109, 74, 106, 113, 56, 97, 30, 164, 15, 25, 20, 117, 76, 50, 82, 178, 13, 169, 36, 107, 40, 122, 138, 42, 96, 27, 163, 46, 64, 124, 57, 87, 120, 168, 166, 39, 177, 22, 67, 134, 9, 102, 28, 148, 91, 83, 88, 167, 32, 99, 140, 60, 152, 1, 123, 29, 154, 26, 70, 149, 171, 12, 6, 55, 100, 62, 86, 114, 174, 132, 139, 7, 45, 103, 130, 31, 49, 151, 119, 79, 41, 118, 126, 3, 179, 110, 111, 51, 93, 145, 73, 133, 54, 104, 161, 37, 129, 63, 38, 95, 159, 89, 112, 115, 136, 33, 68, 17, 35, 137, 173, 143, 78, 77, 141, 150, 58, 158, 125, 156, 24, 105, 98, 43, 84, 92, 128, 165, 153, 108, 0, 121, 170, 131, 144, 47, 157, 11, 155, 176, 48, 135, 4, 116, 146, 127, 52, 162, 142, 8, 5, 34, 85, 90, 44, 172, 94, 160, 175, 75, 71, 18, 147, 10, 21, 14, and 81.

FIG. 114 is a diagram showing a sixth example of the GW pattern for the LDPC code having the code length N of 64 k bits.

According to the GW pattern of FIG. 114, the arrangement of bit groups 0 to 179 of the LDPC code of 64 k bits is interleaved into the arrangement of bit groups 8, 27, 7, 70, 75, 84, 50, 131, 146, 99, 96, 141, 155, 157, 82, 57, 120, 38, 137, 13, 83, 23, 40, 9, 56, 171, 124, 172, 39, 142, 20, 128, 133, 2, 89, 153, 103, 112, 129, 151, 162, 106, 14, 62, 107, 110, 73, 71, 177, 154, 80, 176, 24, 91, 32, 173, 25, 16, 17, 159, 21, 92, 6, 67, 81, 37, 15, 136, 100, 64, 102, 163, 168, 18, 78, 76, 45, 140, 123, 118, 58, 122, 11, 19, 86, 98, 119, 111, 26, 138, 125, 74, 97, 63, 10, 152, 161, 175, 87, 52, 60, 22, 79, 104, 30, 158, 54, 145, 49, 34, 166, 109, 179, 174, 93, 41, 116, 48, 3, 29, 134, 167, 105, 132, 114, 169, 147, 144, 77, 61, 170, 90, 178, 0, 43, 149, 130, 117, 47, 44, 36, 115, 88, 101, 148, 69, 46, 94, 143, 164, 139, 126, 160, 156, 33, 113, 65, 121, 53, 42, 66, 165, 85, 127, 135, 5, 55, 150, 72, 35, 31, 51, 4, 1, 68, 12, 28, 95, 59, and 108.

Figure 115:
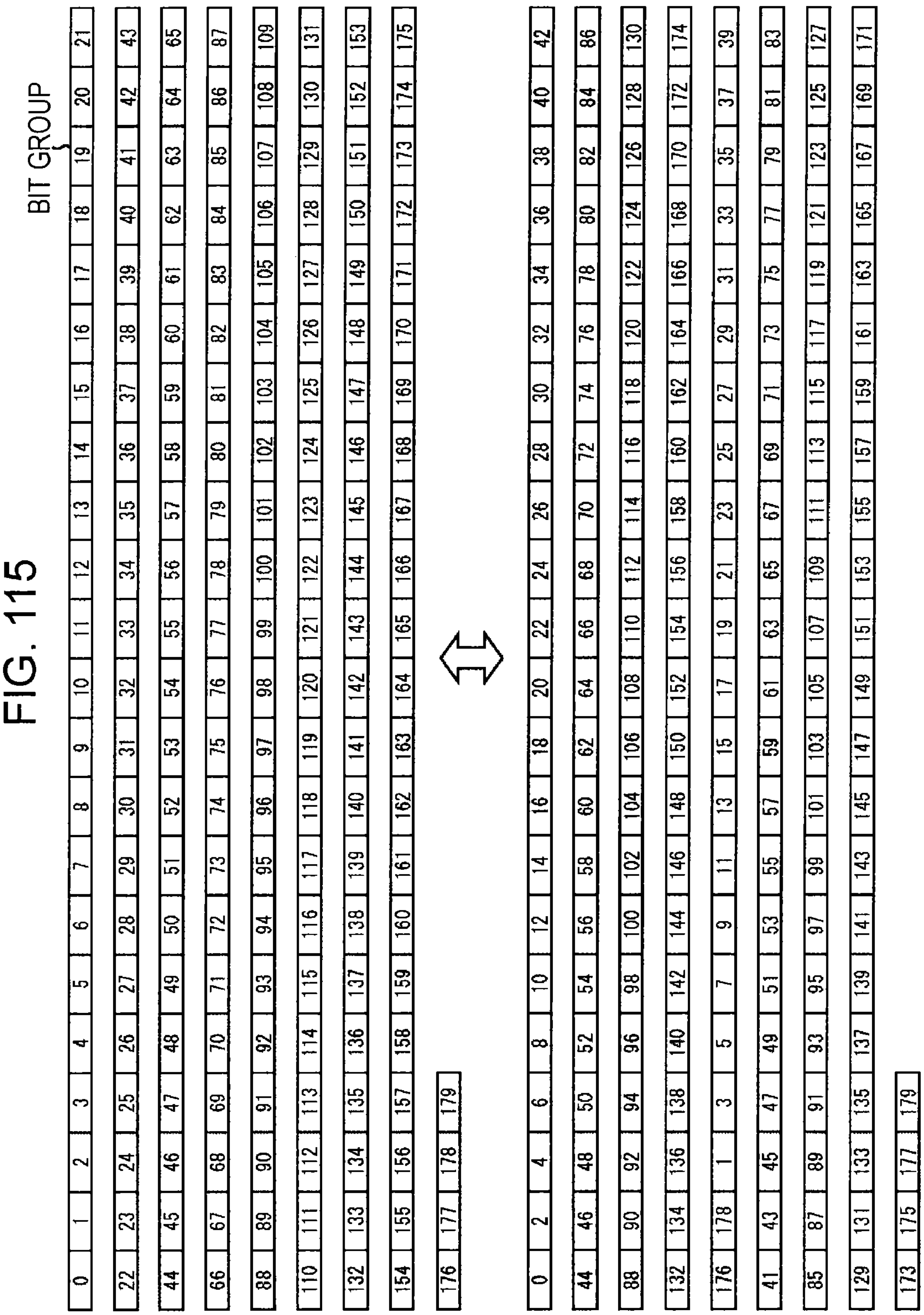
FIG. 115 is a diagram showing a seventh example of the GW pattern for the LDPC code having the code length of 64 k bits.

FIG. 115 is a diagram showing a seventh example of the GW pattern for the LDPC code having the code length N of 64 k bits.

According to the GW pattern of FIG. 115, the arrangement of bit groups 0 to 179 of the LDPC code of 64 k bits is interleaved into the arrangement of bit groups 0, 2, 4, 6, 8, 10, 12, 14, 16, 18, 20, 22, 24, 26, 28, 30, 32, 34, 36, 38, 40, 42, 44, 46, 48, 50, 52, 54, 56, 58, 60, 62, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126, 128, 130, 132, 134, 136, 138, 140, 142, 144, 146, 148, 150, 152, 154, 156, 158, 160, 162, 164, 166, 168, 170, 172, 174, 176, 178, 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, 63, 65, 67, 69, 71, 73, 75, 77, 79, 81, 83, 85, 87, 89, 91, 93, 95, 97, 99, 101, 103, 105, 107, 109, 111, 113, 115, 117, 119, 121, 123, 125, 127, 129, 131, 133, 135, 137, 139, 141, 143, 145, 147, 149, 151, 153, 155, 157, 159, 161, 163, 165, 167, 169, 171, 173, 175, 177, and 179.

FIG. 116 is a diagram showing an eighth example of the GW pattern for the LDPC code having the code length N of 64 k bits.

According to the GW pattern of FIG. 116, the arrangement of bit groups 0 to 179 of the LDPC code of 64 k bits is interleaved into the arrangement of bit groups 11, 5, 8, 18, 1, 25, 32, 31, 19, 21, 50, 102, 65, 85, 45, 86, 98, 104, 64, 78, 72, 53, 103, 79, 93, 41, 82, 108, 112, 116, 120, 124, 128, 132, 136, 140, 144, 148, 152, 156, 160, 164, 168, 172, 176, 4, 12, 15, 3, 10, 20, 26, 34, 23, 33, 68, 63, 69, 92, 44, 90, 75, 56, 100, 47, 106, 42, 39, 97, 99, 89, 52, 109, 113, 117, 121, 125, 129, 133, 137, 141, 145, 149, 153, 157, 161, 165, 169, 173, 177, 6, 16, 14, 7, 13, 36, 28, 29, 37, 73, 70, 54, 76, 91, 66, 80, 88, 51, 96, 81, 95, 38, 57, 105, 107, 59, 61, 110, 114, 118, 122, 126, 130, 134, 138, 142, 146, 150, 154, 158, 162, 166, 170, 174, 178, 0, 9, 17, 2, 27, 30, 24, 22, 35, 77, 74, 46, 94, 62, 87, 83, 101, 49, 43, 84, 48, 60, 67, 71, 58, 40, 55, 111, 115, 119, 123, 127, 131, 135, 139, 143, 147, 151, 155, 159, 163, 167, 171, 175, and 179.

FIG. 117 is a diagram showing a ninth example of the GW pattern for the LDPC code having the code length N of 64 k bits.

According to the GW pattern of FIG. 117, the arrangement of bit groups 0 to 179 of the LDPC code of 64 k bits is interleaved into the arrangement of bit groups 9, 18, 15, 13, 35, 26, 28, 99, 40, 68, 85, 58, 63, 104, 50, 52, 94, 69, 108, 114, 120, 126, 132, 138, 144, 150, 156, 162, 168, 174, 8, 16, 17, 24, 37, 23, 22, 103, 64, 43, 47, 56, 92, 59, 70, 42, 106, 60, 109, 115, 121, 127, 133, 139, 145, 151, 157, 163, 169, 175, 4, 1, 10, 19, 30, 31, 89, 86, 77, 81, 51, 79, 83, 48, 45, 62, 67, 65, 110, 116, 122, 128, 134, 140, 146, 152, 158, 164, 170, 176, 6, 2, 0, 25, 20, 34, 98, 105, 82, 96, 90, 107, 53, 74, 73, 93, 55, 102, 111, 117, 123, 129, 135, 141, 147, 153, 159, 165, 171, 177, 14, 7, 3, 27, 21, 33, 44, 97, 38, 75, 72, 41, 84, 80, 100, 87, 76, 57, 112, 118, 124, 130, 136, 142, 148, 154, 160, 166, 172, 178, 5, 11, 12, 32, 29, 36, 88, 71, 78, 95, 49, 54, 61, 66, 46, 39, 101, 91, 113, 119, 125, 131, 137, 143, 149, 155, 161, 167, 173, and 179.

Figure 118:
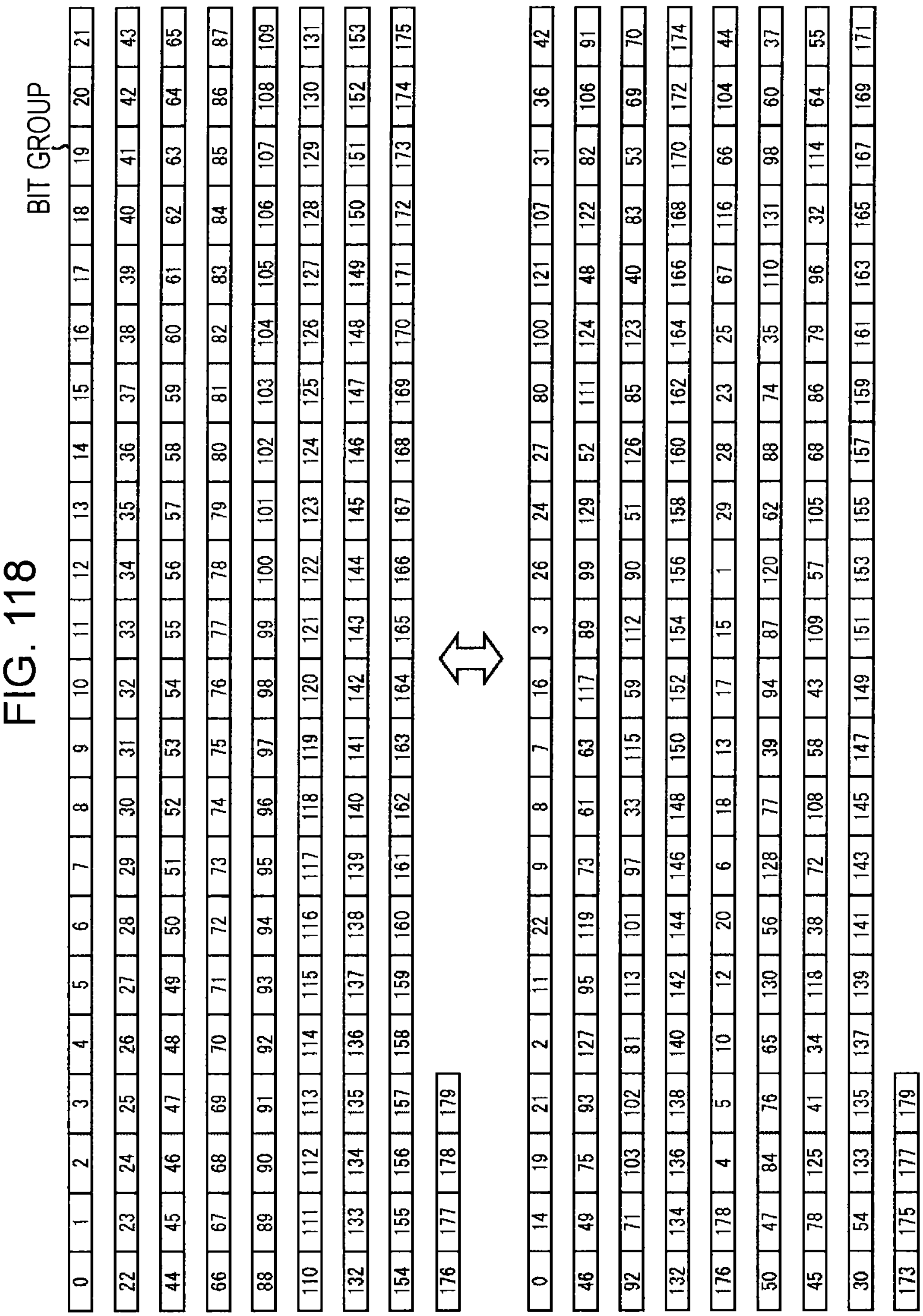
FIG. 118 is a diagram showing a tenth example of the GW pattern for the LDPC code having the code length of 64 k bits.

FIG. 118 is a diagram showing a tenth example of the GW pattern for the LDPC code having the code length N of 64 k bits.

According to the GW pattern of FIG. 118, the arrangement of bit groups 0 to 179 of the LDPC code of 64 k bits is interleaved into the arrangement of bit groups 0, 14, 19, 21, 2, 11, 22, 9, 8, 7, 16, 3, 26, 24, 27, 80, 100, 121, 107, 31, 36, 42, 46, 49, 75, 93, 127, 95, 119, 73, 61, 63, 117, 89, 99, 129, 52, 111, 124, 48, 122, 82, 106, 91, 92, 71, 103, 102, 81, 113, 101, 97, 33, 115, 59, 112, 90, 51, 126, 85, 123, 40, 83, 53, 69, 70, 132, 134, 136, 138, 140, 142, 144, 146, 148, 150, 152, 154, 156, 158, 160, 162, 164, 166, 168, 170, 172, 174, 176, 178, 4, 5, 10, 12, 20, 6, 18, 13, 17, 15, 1, 29, 28, 23, 25, 67, 116, 66, 104, 44, 50, 47, 84, 76, 65, 130, 56, 128, 77, 39, 94, 87, 120, 62, 88, 74, 35, 110, 131, 98, 60, 37, 45, 78, 125, 41, 34, 118, 38, 72, 108, 58, 43, 109, 57, 105, 68, 86, 79, 96, 32, 114, 64, 55, 30, 54, 133, 135, 137, 139, 141, 143, 145, 147, 149, 151, 153, 155, 157, 159, 161, 163, 165, 167, 169, 171, 173, 175, 177, and 179.

FIG. 119 is a diagram showing an eleventh example of the GW pattern for the LDPC code having the code length N of 64 k bits.

According to the GW pattern of FIG. 119, the arrangement of bit groups 0 to 179 of the LDPC code of 64 k bits is interleaved into the arrangement of bit groups 21, 11, 12, 9, 0, 6, 24, 25, 85, 103, 118, 122, 71, 101, 41, 93, 55, 73, 100, 40, 106, 119, 45, 80, 128, 68, 129, 61, 124, 36, 126, 117, 114, 132, 136, 140, 144, 148, 152, 156, 160, 164, 168, 172, 176, 20, 18, 10, 13, 16, 8, 26, 27, 54, 111, 52, 44, 87, 113, 115, 58, 116, 49, 77, 95, 86, 30, 78, 81, 56, 125, 53, 89, 94, 50, 123, 65, 83, 133, 137, 141, 145, 149, 153, 157, 161, 165, 169, 173, 177, 2, 17, 1, 4, 7, 15, 29, 82, 32, 102, 76, 121, 92, 130, 127, 62, 107, 38, 46, 43, 110, 75, 104, 70, 91, 69, 96, 120, 42, 34, 79, 35, 105, 134, 138, 142, 146, 150, 154, 158, 162, 166, 170, 174, 178, 19, 5, 3, 14, 22, 28, 23, 109, 51, 108, 131, 33, 84, 88, 64, 63, 59, 57, 97, 98, 48, 31, 99, 37, 72, 39, 74, 66, 60, 67, 47, 112, 90, 135, 139, 143, 147, 151, 155, 159, 163, 167, 171, 175, and 179.

FIG. 120 is a diagram showing a twelfth example of the GW pattern for the LDPC code having the code length N of 64 k bits.

According to the GW pattern of FIG. 120, the arrangement of bit groups 0 to 179 of the LDPC code of 64 k bits is interleaved into the arrangement of bit groups 12, 15, 2, 16, 27, 50, 35, 74, 38, 70, 108, 32, 112, 54, 30, 122, 72, 116, 36, 90, 49, 85, 132, 138, 144, 150, 156, 162, 168, 174, 0, 14, 9, 5, 23, 66, 68, 52, 96, 117, 84, 128, 100, 63, 60, 127, 81, 99, 53, 55, 103, 95, 133, 139, 145, 151, 157, 163, 169, 175, 10, 22, 13, 11, 28, 104, 37, 57, 115, 46, 65, 129, 107, 75, 119, 110, 31, 43, 97, 78, 125, 58, 134, 140, 146, 152, 158, 164, 170, 176, 4, 19, 6, 8, 24, 44, 101, 94, 118, 130, 69, 71, 83, 34, 86, 124, 48, 106, 89, 40, 102, 91, 135, 141, 147, 153, 159, 165, 171, 177, 3, 20, 7, 17, 25, 87, 41, 120, 47, 80, 59, 62, 88, 45, 56, 131, 61, 126, 113, 92, 51, 98, 136, 142, 148, 154, 160, 166, 172, 178, 21, 18, 1, 26, 29, 39, 73, 121, 105, 77, 42, 114, 93, 82, 111, 109, 67, 79, 123, 64, 76, 33, 137, 143, 149, 155, 161, 167, 173, and 179.

Figure 121:
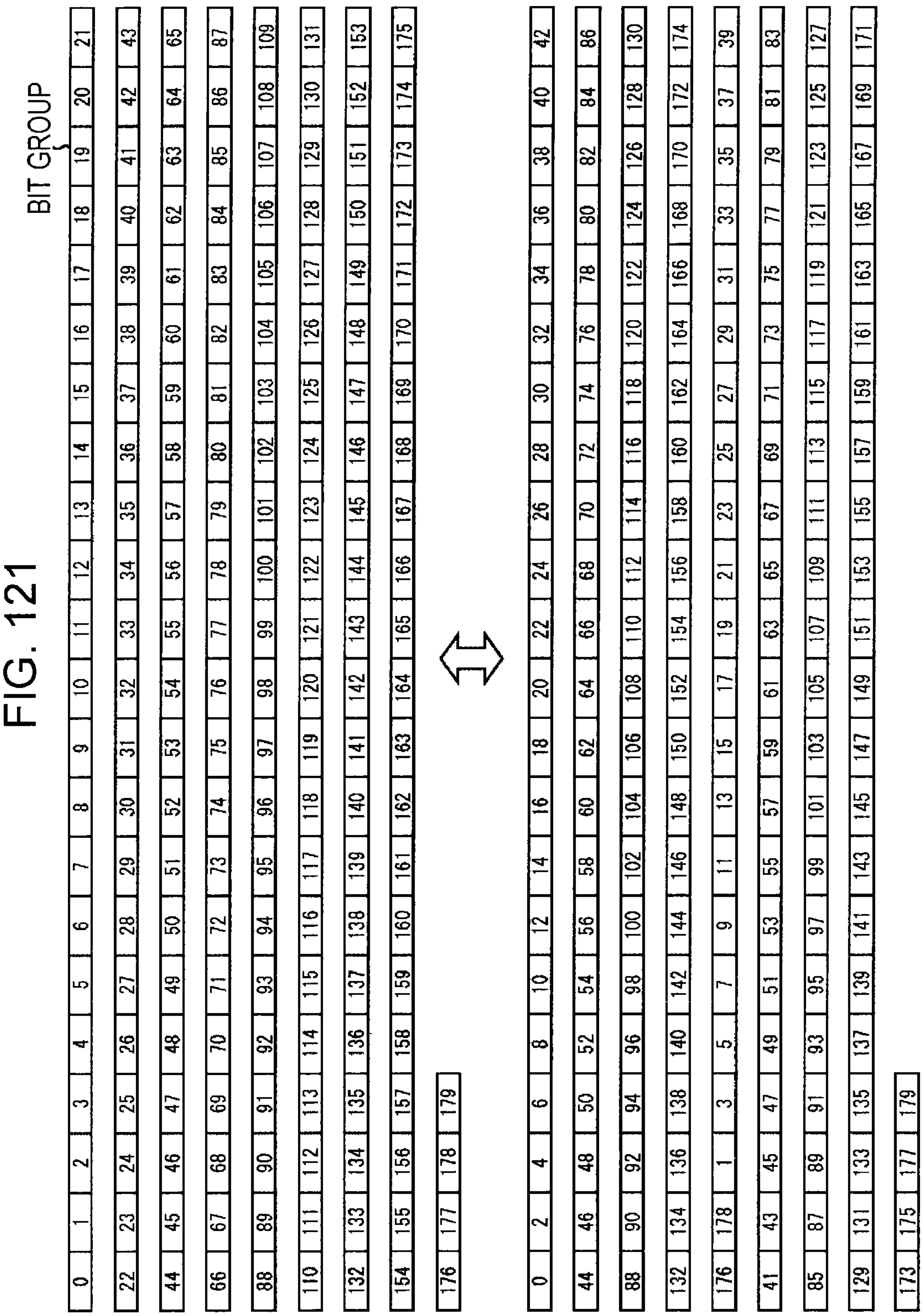

FIG. 121 is a diagram showing a thirteenth example of the GW pattern for the LDPC code having the code length N of 64 k bits.

According to the GW pattern of FIG. 121, the arrangement of bit groups 0 to 179 of the LDPC code of 64 k bits is interleaved into the arrangement of bit groups 0, 2, 4, 6, 8, 10, 12, 14, 16, 18, 20, 22, 24, 26, 28, 30, 32, 34, 36, 38, 40, 42, 44, 46, 48, 50, 52, 54, 56, 58, 60, 62, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126, 128, 130, 132, 134, 136, 138, 140, 142, 144, 146, 148, 150, 152, 154, 156, 158, 160, 162, 164, 166, 168, 170, 172, 174, 176, 178, 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, 63, 65, 67, 69, 71, 73, 75, 77, 79, 81, 83, 85, 87, 89, 91, 93, 95, 97, 99, 101, 103, 105, 107, 109, 111, 113, 115, 117, 119, 121, 123, 125, 127, 129, 131, 133, 135, 137, 139, 141, 143, 145, 147, 149, 151, 153, 155, 157, 159, 161, 163, 165, 167, 169, 171, 173, 175, 177, and 179.

Figure 122:
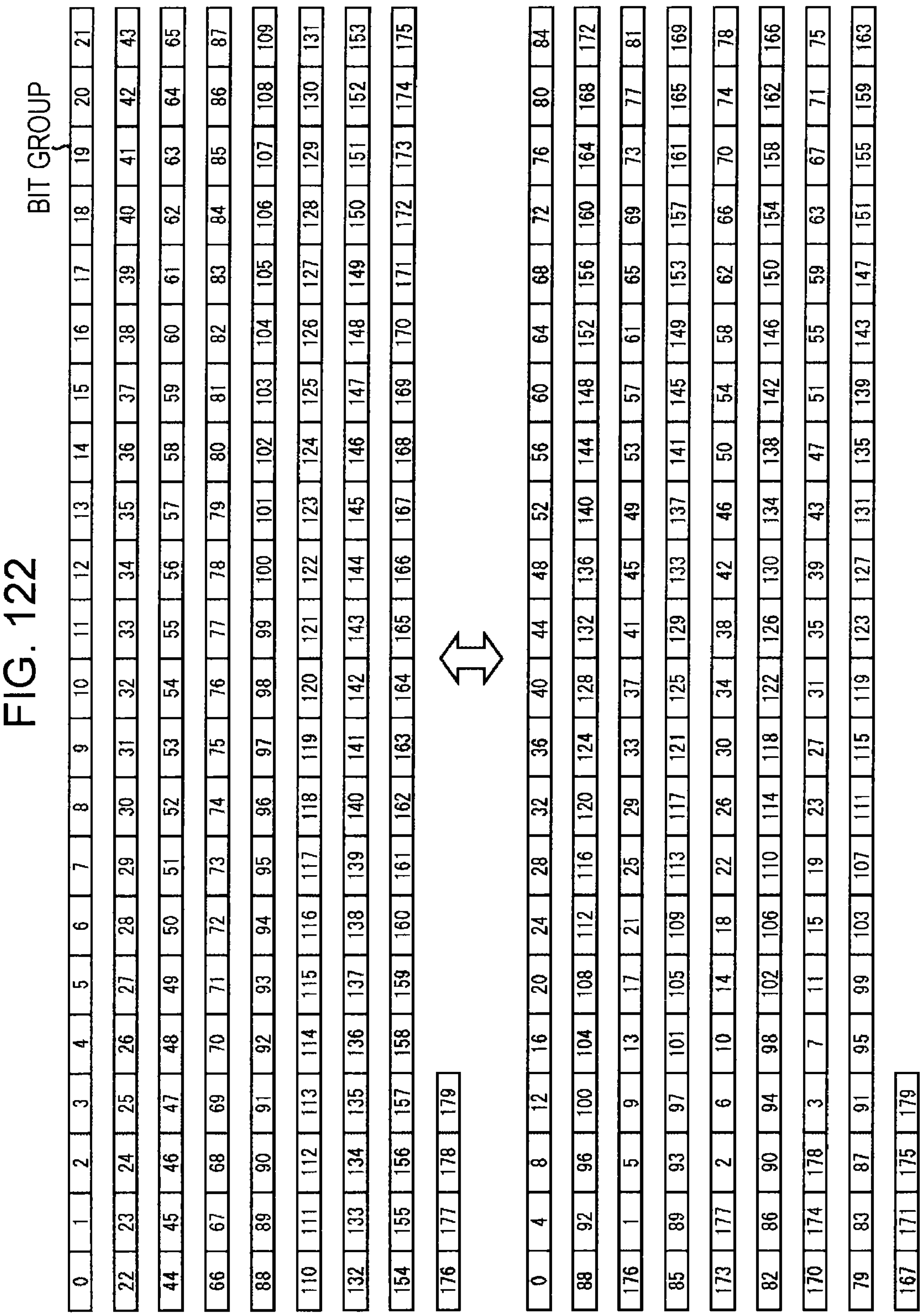

FIG. 122 is a diagram showing a fourteenth example of the GW pattern for the LDPC code having the code length N of 64 k bits.

According to the GW pattern of FIG. 122, the arrangement of bit groups 0 to 179 of the LDPC code of 64 k bits is interleaved into the arrangement of bit groups 0, 4, 8, 12, 16, 20, 24, 28, 32, 36, 40, 44, 48, 52, 56, 60, 64, 68, 72, 76, 80, 84, 88, 92, 96, 100, 104, 108, 112, 116, 120, 124, 128, 132, 136, 140, 144, 148, 152, 156, 160, 164, 168, 172, 176, 1, 5, 9, 13, 17, 21, 25, 29, 33, 37, 41, 45, 49, 53, 57, 61, 65, 69, 73, 77, 81, 85, 89, 93, 97, 101, 105, 109, 113, 117, 121, 125, 129, 133, 137, 141, 145, 149, 153, 157, 161, 165, 169, 173, 177, 2, 6, 10, 14, 18, 22, 26, 30, 34, 38, 42, 46, 50, 54, 58, 62, 66, 70, 74, 78, 82, 86, 90, 94, 98, 102, 106, 110, 114, 118, 122, 126, 130, 134, 138, 142, 146, 150, 154, 158, 162, 166, 170, 174, 178, 3, 7, 11, 15, 19, 23, 27, 31, 35, 39, 43, 47, 51, 55, 59, 63, 67, 71, 75, 79, 83, 87, 91, 95, 99, 103, 107, 111, 115, 119, 123, 127, 131, 135, 139, 143, 147, 151, 155, 159, 163, 167, 171, 175, and 179.

FIG. 123 is a diagram showing a fifteenth example of the GW pattern for the LDPC code having the code length N of 64 k bits.

According to the GW pattern of FIG. 123, the arrangement of bit groups 0 to 179 of the LDPC code of 64 k bits is interleaved into the arrangement of bit groups 8, 112, 92, 165, 12, 55, 5, 126, 87, 70, 69, 94, 103, 78, 137, 148, 9, 60, 13, 7, 178, 79, 43, 136, 34, 68, 118, 152, 49, 15, 99, 61, 66, 28, 109, 125, 33, 167, 81, 93, 97, 26, 35, 30, 153, 131, 122, 71, 107, 130, 76, 4, 95, 42, 58, 134, 0, 89, 75, 40, 129, 31, 80, 101, 52, 16, 142, 44, 138, 46, 116, 27, 82, 88, 143, 128, 72, 29, 83, 117, 172, 14, 51, 159, 48, 160, 100, 1, 102, 90, 22, 3, 114, 19, 108, 113, 39, 73, 111, 155, 106, 105, 91, 150, 54, 25, 135, 139, 147, 36, 56, 123, 6, 67, 104, 96, 157, 10, 62, 164, 86, 74, 133, 120, 174, 53, 140, 156, 171, 149, 127, 85, 59, 124, 84, 11, 21, 132, 41, 145, 158, 32, 17, 23, 50, 169, 170, 38, 18, 151, 24, 166, 175, 2, 47, 57, 98, 20, 177, 161, 154, 176, 163, 37, 110, 168, 141, 64, 65, 173, 162, 121, 45, 77, 115, 179, 63, 119, 146, and 144.

FIG. 124 is a diagram showing a sixteenth example of the GW pattern for the LDPC code having the code length N of 64 k bits.

According to the GW pattern of FIG. 124, the arrangement of bit groups 0 to 179 of the LDPC code of 64 k bits is interleaved into the arrangement of bit groups 103, 138, 168, 82, 116, 45, 178, 28, 160, 2, 129, 148, 150, 23, 54, 106, 24, 78, 49, 87, 145, 179, 26, 112, 119, 12, 18, 174, 21, 48, 134, 137, 102, 147, 152, 72, 68, 3, 22, 169, 30, 64, 108, 142, 131, 13, 113, 115, 121, 37, 133, 136, 101, 59, 73, 161, 38, 164, 43, 167, 42, 144, 41, 85, 91, 58, 128, 154, 172, 57, 75, 17, 157, 19, 4, 86, 15, 25, 35, 9, 105, 123, 14, 34, 56, 111, 60, 90, 74, 149, 146, 62, 163, 31, 16, 141, 88, 6, 155, 130, 89, 107, 135, 79, 8, 10, 124, 171, 114, 162, 33, 66, 126, 71, 44, 158, 51, 84, 165, 173, 120, 7, 11, 170, 176, 1, 156, 96, 175, 153, 36, 47, 110, 63, 132, 29, 95, 143, 98, 70, 20, 122, 53, 100, 93, 140, 109, 139, 76, 151, 52, 61, 46, 125, 94, 50, 67, 81, 69, 65, 40, 127, 77, 32, 39, 27, 99, 97, 159, 166, 80, 117, 55, 92, 118, 0, 5, 83, 177, and 104.

FIG. 125 is a diagram showing a seventeenth example of the GW pattern for the LDPC code having the code length N of 64 k bits.

According to the GW pattern of FIG. 125, the arrangement of bit groups 0 to 179 of the LDPC code of 64 k bits is interleaved into the arrangement of bit groups 104, 120, 47, 136, 116, 109, 22, 20, 117, 61, 52, 108, 86, 99, 76, 90, 37, 58, 36, 138, 95, 130, 177, 93, 56, 33, 24, 82, 0, 67, 83, 46, 79, 70, 154, 18, 75, 43, 49, 63, 162, 16, 167, 80, 125, 1, 123, 107, 9, 45, 53, 15, 38, 23, 57, 141, 4, 178, 165, 113, 21, 105, 11, 124, 126, 77, 146, 29, 131, 27, 176, 40, 74, 91, 140, 64, 73, 44, 129, 157, 172, 51, 10, 128, 119, 163, 103, 28, 85, 156, 78, 6, 8, 173, 160, 106, 31, 54, 122, 25, 139, 68, 150, 164, 87, 135, 97, 166, 42, 169, 161, 137, 26, 39, 133, 5, 94, 69, 2, 30, 171, 149, 115, 96, 145, 101, 92, 143, 12, 88, 81, 71, 19, 147, 50, 152, 159, 155, 151, 174, 60, 32, 3, 142, 72, 14, 170, 112, 65, 89, 175, 158, 17, 114, 62, 144, 13, 98, 66, 59, 7, 118, 48, 153, 100, 134, 84, 111, 132, 127, 41, 168, 110, 102, 34, 121, 179, 148, 55, and 35.

FIG. 126 is a diagram showing an eighteenth example of the GW pattern for the LDPC code having the code length N of 64 k bits.

According to the GW pattern of FIG. 126, the arrangement of bit groups 0 to 179 of the LDPC code of 64 k bits is interleaved into the arrangement of bit groups 37, 98, 160, 63, 18, 6, 94, 136, 8, 50, 0, 75, 65, 32, 107, 60, 108, 17, 21, 156, 157, 5, 73, 66, 38, 177, 162, 130, 171, 76, 57, 126, 103, 62, 120, 134, 154, 101, 143, 29, 13, 149, 16, 33, 55, 56, 159, 128, 23, 146, 153, 141, 169, 49, 46, 152, 89, 155, 111, 127, 48, 14, 93, 41, 7, 78, 135, 69, 123, 179, 36, 87, 27, 58, 88, 170, 125, 110, 15, 97, 178, 90, 121, 173, 30, 102, 10, 80, 104, 166, 64, 4, 147, 1, 52, 45, 148, 68, 158, 31, 140, 100, 85, 115, 151, 70, 39, 82, 122, 79, 12, 91, 133, 132, 22, 163, 47, 19, 119, 144, 35, 25, 42, 83, 92, 26, 72, 138, 54, 124, 24, 74, 118, 117, 168, 71, 109, 112, 106, 176, 175, 44, 145, 11, 9, 161, 96, 77, 174, 137, 34, 84, 2, 164, 129, 43, 150, 61, 53, 20, 165, 113, 142, 116, 95, 3, 28, 40, 81, 99, 139, 114, 59, 67, 172, 131, 105, 167, 51, and 86.

FIG. 127 is a diagram showing a nineteenth example of the GW pattern for the LDPC code having the code length N of 64 k bits.

According to the GW pattern of FIG. 127, the arrangement of bit groups 0 to 179 of the LDPC code of 64 k bits is interleaved into the arrangement of bit groups 58, 70, 23, 32, 26, 63, 55, 48, 35, 41, 53, 20, 38, 51, 61, 65, 44, 29, 7, 2, 113, 68, 96, 104, 106, 89, 27, 0, 119, 21, 4, 49, 46, 100, 13, 36, 57, 98, 102, 9, 42, 39, 33, 62, 22, 95, 101, 15, 91, 25, 93, 132, 69, 87, 47, 59, 67, 124, 17, 11, 31, 43, 40, 37, 85, 50, 97, 140, 45, 92, 56, 30, 34, 60, 107, 24, 52, 94, 64, 5, 71, 90, 66, 103, 88, 86, 84, 19, 169, 159, 147, 126, 28, 130, 14, 162, 144, 166, 108, 153, 115, 135, 120, 122, 112, 139, 151, 156, 16, 172, 164, 123, 99, 54, 136, 81, 105, 128, 116, 150, 155, 76, 18, 142, 170, 175, 83, 146, 78, 109, 73, 131, 127, 82, 167, 77, 110, 79, 137, 152, 3, 173, 148, 72, 158, 117, 1, 6, 12, 8, 161, 74, 143, 133, 168, 171, 134, 163, 138, 121, 141, 160, 111, 10, 149, 80, 75, 165, 157, 174, 129, 145, 114, 125, 154, 118, 176, 177, 178, and 179.

FIG. 128 is a diagram showing a twentieth example of the GW pattern for the LDPC code having the code length N of 64 k bits.

According to the GW pattern of FIG. 128, the arrangement of bit groups 0 to 179 of the LDPC code of 64 k bits is interleaved into the arrangement of bit groups 40, 159, 100, 14, 88, 75, 53, 24, 157, 84, 23, 77, 140, 145, 32, 28, 112, 39, 76, 50, 93, 27, 107, 25, 152, 101, 127, 5, 129, 71, 9, 21, 96, 73, 35, 106, 158, 49, 136, 30, 137, 115, 139, 48, 167, 85, 74, 72, 7, 110, 161, 41, 170, 147, 82, 128, 149, 33, 8, 120, 47, 68, 58, 67, 87, 155, 11, 18, 103, 151, 29, 36, 83, 135, 79, 150, 97, 54, 70, 138, 156, 31, 121, 34, 20, 130, 61, 57, 2, 166, 117, 15, 6, 165, 118, 98, 116, 131, 109, 62, 126, 175, 22, 111, 164, 16, 133, 102, 55, 105, 64, 177, 78, 37, 162, 124, 119, 19, 4, 69, 132, 65, 123, 160, 17, 52, 38, 1, 80, 90, 42, 81, 104, 13, 144, 51, 114, 3, 43, 146, 163, 59, 45, 89, 122, 169, 44, 94, 86, 99, 66, 171, 173, 0, 141, 148, 176, 26, 143, 178, 60, 153, 142, 91, 179, 12, 168, 113, 95, 174, 56, 134, 92, 46, 108, 125, 10, 172, 154, and 63.

FIG. 129 is a diagram showing a twenty-first example of the GW pattern for the LDPC code having the code length N of 64 k bits.

According to the GW pattern of FIG. 129, the arrangement of bit groups 0 to 179 of the LDPC code of 64 k bits is interleaved into the arrangement of bit groups 143, 57, 67, 26, 134, 112, 136, 103, 13, 94, 16, 116, 169, 95, 98, 6, 174, 173, 102, 15, 114, 39, 127, 78, 18, 123, 121, 4, 89, 115, 24, 108, 74, 63, 175, 82, 48, 20, 104, 92, 27, 3, 33, 106, 62, 148, 154, 25, 129, 69, 178, 156, 87, 83, 100, 122, 70, 93, 50, 140, 43, 125, 166, 41, 128, 85, 157, 49, 86, 66, 79, 130, 133, 171, 21, 165, 126, 51, 153, 38, 142, 109, 10, 65, 23, 91, 90, 73, 61, 42, 47, 131, 77, 9, 58, 96, 101, 37, 7, 159, 44, 2, 170, 160, 162, 0, 137, 31, 45, 110, 144, 88, 8, 11, 40, 81, 168, 135, 56, 151, 107, 105, 32, 120, 132, 1, 84, 161, 179, 72, 176, 71, 145, 139, 75, 141, 97, 17, 149, 124, 80, 60, 36, 52, 164, 53, 158, 113, 34, 76, 5, 111, 155, 138, 19, 35, 167, 172, 14, 147, 55, 152, 59, 64, 54, 117, 146, 118, 119, 150, 29, 163, 68, 99, 46, 177, 28, 22, 30, and 12.

Figure 130:
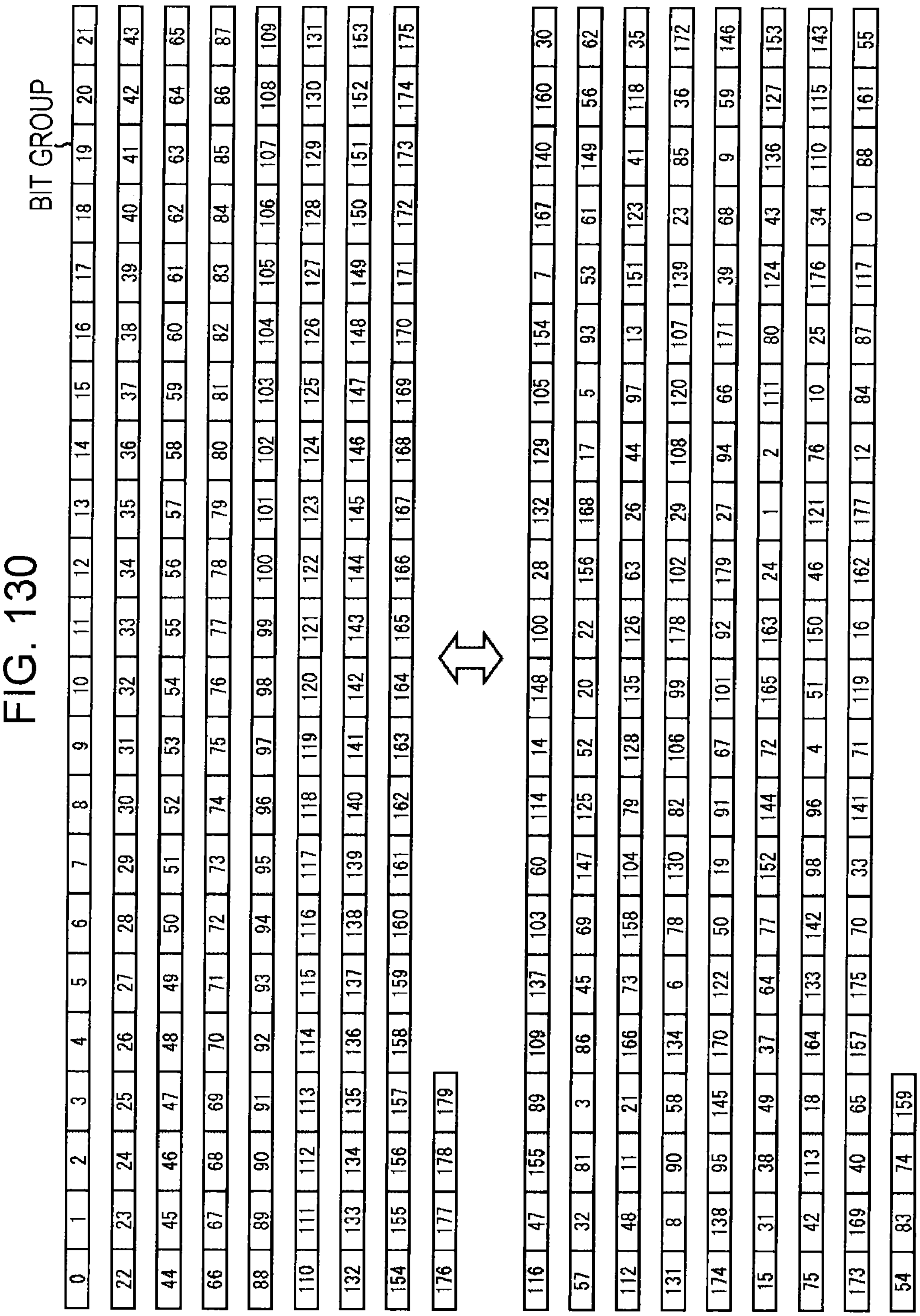

FIG. 130 is a diagram showing a twenty-second example of the GW pattern for the LDPC code having the code length N of 64 k bits.

According to the GW pattern of FIG. 130, the arrangement of bit groups 0 to 179 of the LDPC code of 64 k bits is interleaved into the arrangement of bit groups 116, 47, 155, 89, 109, 137, 103, 60, 114, 14, 148, 100, 28, 132, 129, 105, 154, 7, 167, 140, 160, 30, 57, 32, 81, 3, 86, 45, 69, 147, 125, 52, 20, 22, 156, 168, 17, 5, 93, 53, 61, 149, 56, 62, 112, 48, 11, 21, 166, 73, 158, 104, 79, 128, 135, 126, 63, 26, 44, 97, 13, 151, 123, 41, 118, 35, 131, 8, 90, 58, 134, 6, 78, 130, 82, 106, 99, 178, 102, 29, 108, 120, 107, 139, 23, 85, 36, 172, 174, 138, 95, 145, 170, 122, 50, 19, 91, 67, 101, 92, 179, 27, 94, 66, 171, 39, 68, 9, 59, 146, 15, 31, 38, 49, 37, 64, 77, 152, 144, 72, 165, 163, 24, 1, 2, 111, 80, 124, 43, 136, 127, 153, 75, 42, 113, 18, 164, 133, 142, 98, 96, 4, 51, 150, 46, 121, 76, 10, 25, 176, 34, 110, 115, 143, 173, 169, 40, 65, 157, 175, 70, 33, 141, 71, 119, 16, 162, 177, 12, 84, 87, 117, 0, 88, 161, 55, 54, 83, 74, and 159.

FIG. 131 is a diagram showing a twenty-third example of the GW pattern for the LDPC code having the code length N of 64 k bits.

According to the GW pattern of FIG. 131, the arrangement of bit groups 0 to 179 of the LDPC code of 64 k bits is interleaved into the arrangement of bit groups 62, 17, 10, 25, 174, 13, 159, 14, 108, 0, 42, 57, 78, 67, 41, 132, 110, 87, 77, 27, 88, 56, 8, 161, 7, 164, 171, 44, 75, 176, 145, 165, 157, 34, 142, 98, 103, 52, 11, 82, 141, 116, 15, 158, 139, 120, 36, 61, 20, 112, 144, 53, 128, 24, 96, 122, 114, 104, 150, 50, 51, 80, 109, 33, 5, 95, 59, 16, 134, 105, 111, 21, 40, 146, 18, 133, 60, 23, 160, 106, 32, 79, 55, 6, 1, 154, 117, 19, 152, 167, 166, 30, 35, 100, 74, 131, 99, 156, 39, 76, 86, 43, 178, 155, 179, 177, 136, 175, 81, 64, 124, 153, 84, 163, 135, 115, 125, 47, 45, 143, 72, 48, 172, 97, 85, 107, 126, 91, 129, 137, 83, 118, 54, 2, 9, 58, 169, 73, 123, 4, 92, 168, 162, 94, 138, 119, 22, 31, 63, 89, 90, 69, 49, 173, 28, 127, 26, 29, 101, 170, 93, 140, 147, 149, 148, 66, 65, 121, 12, 71, 37, 70, 102, 46, 38, 68, 130, 3, 113, and 151.

FIG. 132 is a diagram showing a twenty-fourth example of the GW pattern for the LDPC code having the code length N of 64 k bits.

According to the GW pattern of FIG. 132, the arrangement of bit groups 0 to 179 of the LDPC code of 64 k bits is interleaved into the arrangement of bit groups 168, 18, 46, 131, 88, 90, 11, 89, 111, 174, 172, 38, 78, 153, 9, 80, 53, 27, 44, 79, 35, 83, 171, 51, 37, 99, 95, 119, 117, 127, 112, 166, 28, 123, 33, 160, 29, 6, 135, 10, 66, 69, 74, 92, 15, 109, 106, 178, 65, 141, 0, 3, 154, 156, 164, 7, 45, 115, 122, 148, 110, 24, 121, 126, 23, 175, 21, 113, 58, 43, 26, 143, 56, 142, 39, 147, 30, 25, 101, 145, 136, 19, 4, 48, 158, 118, 133, 49, 20, 102, 14, 151, 5, 2, 72, 103, 75, 60, 84, 34, 157, 169, 31, 161, 81, 70, 85, 159, 132, 41, 152, 179, 98, 144, 36, 16, 87, 40, 91, 1, 130, 108, 139, 94, 97, 8, 104, 13, 150, 137, 47, 73, 62, 12, 50, 61, 105, 100, 86, 146, 165, 22, 17, 57, 167, 59, 96, 120, 155, 77, 162, 55, 68, 140, 134, 82, 76, 125, 32, 176, 138, 173, 177, 163, 107, 170, 71, 129, 63, 93, 42, 52, 116, 149, 54, 128, 124, 114, 67, and 64.

FIG. 133 is a diagram showing a twenty-fifth example of the GW pattern for the LDPC code having the code length N of 64 k bits.

According to the GW pattern of FIG. 133, the arrangement of bit groups 0 to 179 of the LDPC code of 64 k bits is interleaved into the arrangement of bit groups 18, 150, 165, 42, 81, 48, 63, 45, 93, 152, 25, 16, 174, 29, 47, 83, 8, 60, 30, 66, 11, 113, 44, 148, 4, 155, 59, 33, 134, 99, 32, 176, 109, 72, 36, 111, 106, 73, 170, 126, 64, 88, 20, 17, 172, 154, 120, 121, 139, 77, 98, 43, 105, 133, 19, 41, 78, 15, 7, 145, 94, 136, 131, 163, 65, 31, 96, 79, 119, 143, 10, 95, 9, 146, 14, 118, 162, 37, 97, 49, 22, 51, 127, 6, 71, 132, 87, 21, 39, 38, 54, 115, 159, 161, 84, 108, 13, 102, 135, 103, 156, 67, 173, 76, 75, 164, 52, 142, 69, 130, 56, 153, 74, 166, 158, 124, 141, 58, 116, 85, 175, 169, 168, 147, 35, 62, 5, 123, 100, 90, 122, 101, 149, 112, 140, 86, 68, 89, 125, 27, 177, 160, 0, 80, 55, 151, 53, 2, 70, 167, 114, 129, 179, 138, 1, 92, 26, 50, 28, 110, 61, 82, 91, 117, 107, 178, 34, 157, 137, 128, 40, 24, 57, 3, 171, 46, 104, 12, 144, and 23.

FIG. 134 is a diagram showing a twenty-sixth example of the GW pattern for the LDPC code having the code length N of 64 k bits.

According to the GW pattern of FIG. 134, the arrangement of bit groups 0 to 179 of the LDPC code of 64 k bits is interleaved into the arrangement of bit groups 18, 8, 166, 117, 4, 111, 142, 148, 176, 91, 120, 144, 99, 124, 20, 25, 31, 78, 36, 72, 2, 98, 93, 74, 174, 52, 152, 62, 88, 75, 23, 97, 147, 15, 71, 1, 127, 138, 81, 83, 68, 94, 112, 119, 121, 89, 163, 85, 86, 28, 17, 64, 14, 44, 158, 159, 150, 32, 128, 70, 90, 29, 30, 63, 100, 65, 129, 140, 177, 46, 84, 92, 10, 33, 58, 7, 96, 151, 171, 40, 76, 6, 3, 37, 104, 57, 135, 103, 141, 107, 116, 160, 41, 153, 175, 55, 130, 118, 131, 42, 27, 133, 95, 179, 34, 21, 87, 106, 105, 108, 79, 134, 113, 26, 164, 114, 73, 102, 77, 22, 110, 161, 43, 122, 123, 82, 5, 48, 139, 60, 49, 154, 115, 146, 67, 69, 137, 109, 143, 24, 101, 45, 16, 12, 19, 178, 80, 51, 47, 149, 50, 172, 170, 169, 61, 9, 39, 136, 59, 38, 54, 156, 126, 125, 145, 0, 13, 155, 132, 162, 11, 157, 66, 165, 173, 56, 168, 167, 53, and 35.

FIG. 135 is a diagram showing a twenty-seventh example of the GW pattern for the LDPC code having the code length N of 64 k bits.

According to the GW pattern of FIG. 135, the arrangement of bit groups 0 to 179 of the LDPC code of 64 k bits is interleaved into the arrangement of bit groups 77, 50, 109, 128, 153, 12, 48, 17, 147, 55, 173, 172, 135, 121, 99, 162, 52, 40, 129, 168, 103, 87, 134, 105, 179, 10, 131, 151, 3, 26, 100, 15, 123, 88, 18, 91, 54, 160, 49, 1, 76, 80, 74, 31, 47, 58, 161, 9, 16, 34, 41, 21, 177, 11, 63, 6, 39, 165, 169, 125, 114, 57, 37, 67, 93, 96, 73, 106, 83, 166, 24, 51, 142, 65, 43, 64, 53, 72, 156, 81, 4, 155, 33, 163, 56, 150, 70, 167, 107, 112, 144, 149, 36, 32, 35, 59, 101, 29, 127, 138, 176, 90, 141, 92, 170, 102, 119, 25, 75, 14, 0, 68, 20, 97, 110, 28, 89, 118, 154, 126, 2, 22, 124, 85, 175, 78, 46, 152, 23, 86, 27, 79, 130, 66, 45, 113, 111, 62, 61, 7, 30, 133, 108, 171, 143, 60, 178, 5, 122, 44, 38, 148, 157, 84, 42, 139, 145, 8, 104, 115, 71, 137, 132, 146, 164, 98, 13, 117, 174, 158, 95, 116, 140, 94, 136, 120, 82, 69, 159, and 19.

FIG. 136 is a diagram showing a twenty-eighth example of the GW pattern for the LDPC code having the code length N of 64 k bits.

According to the GW pattern of FIG. 136, the arrangement of bit groups 0 to 179 of the LDPC code of 64 k bits is interleaved into the arrangement of bit groups 51, 47, 53, 43, 55, 59, 49, 33, 35, 31, 24, 37, 0, 2, 45, 41, 39, 57, 42, 44, 52, 40, 23, 30, 32, 34, 54, 56, 46, 50, 122, 48, 1, 36, 38, 58, 77, 3, 65, 81, 67, 147, 83, 69, 26, 75, 85, 73, 79, 145, 71, 63, 5, 61, 70, 78, 68, 62, 66, 6, 64, 149, 60, 82, 80, 4, 76, 84, 72, 154, 86, 74, 89, 128, 137, 91, 141, 93, 101, 7, 87, 9, 103, 99, 95, 11, 13, 143, 97, 133, 136, 12, 100, 94, 14, 88, 142, 96, 92, 8, 152, 10, 139, 102, 104, 132, 90, 98, 114, 112, 146, 123, 110, 15, 125, 150, 120, 153, 29, 106, 134, 27, 127, 108, 130, 116, 28, 107, 126, 25, 131, 124, 129, 151, 121, 105, 111, 115, 135, 148, 109, 117, 158, 113, 170, 119, 162, 178, 155, 176, 18, 20, 164, 157, 160, 22, 140, 16, 168, 166, 172, 174, 175, 179, 118, 138, 156, 19, 169, 167, 163, 173, 161, 177, 165, 144, 171, 17, 21, and 159.

FIG. 137 is a diagram showing a twenty-ninth example of the GW pattern for the LDPC code having the code length N of 64 k bits.

According to the GW pattern of FIG. 137, the arrangement of bit groups 0 to 179 of the LDPC code of 64 k bits is interleaved into the arrangement of bit groups 49, 2, 57, 47, 31, 35, 24, 39, 59, 0, 45, 41, 55, 53, 51, 37, 33, 43, 56, 38, 48, 32, 50, 23, 34, 54, 1, 36, 44, 52, 40, 58, 122, 46, 42, 30, 3, 75, 73, 65, 145, 71, 79, 67, 69, 83, 85, 147, 63, 81, 77, 61, 5, 26, 62, 64, 74, 70, 82, 149, 76, 4, 78, 84, 80, 86, 66, 68, 72, 6, 60, 154, 103, 95, 101, 143, 9, 89, 141, 128, 97, 137, 133, 7, 13, 99, 91, 93, 87, 11, 136, 90, 88, 94, 10, 8, 14, 96, 104, 92, 132, 142, 100, 98, 12, 102, 152, 139, 150, 106, 146, 130, 27, 108, 153, 112, 114, 29, 110, 134, 116, 15, 127, 125, 123, 120, 148, 151, 113, 126, 124, 135, 129, 109, 25, 28, 158, 117, 105, 115, 111, 131, 107, 121, 18, 170, 164, 20, 140, 160, 166, 162, 119, 155, 168, 178, 22, 174, 172, 176, 16, 157, 159, 171, 161, 118, 17, 163, 21, 165, 19, 179, 177, 167, 138, 173, 156, 144, 169, and 175.

FIG. 138 is a diagram showing a thirtieth example of the GW pattern for the LDPC code having the code length N of 64 k bits.

According to the GW pattern of FIG. 138, the arrangement of bit groups 0 to 179 of the LDPC code of 64 k bits is interleaved into the arrangement of bit groups 71, 38, 98, 159, 1, 32, 28, 177, 125, 102, 83, 17, 121, 151, 66, 92, 140, 6, 165, 23, 75, 91, 87, 108, 163, 50, 77, 39, 110, 128, 73, 148, 14, 5, 68, 37, 53, 93, 149, 26, 166, 48, 79, 10, 122, 150, 103, 178, 119, 101, 61, 34, 8, 86, 36, 138, 146, 72, 179, 143, 147, 89, 4, 107, 33, 144, 141, 40, 100, 29, 118, 63, 46, 20, 153, 90, 152, 124, 7, 30, 31, 43, 78, 120, 85, 25, 52, 47, 64, 81, 175, 94, 115, 15, 112, 99, 13, 21, 42, 169, 76, 19, 168, 16, 27, 162, 167, 164, 97, 82, 44, 106, 12, 109, 132, 145, 161, 174, 95, 0, 105, 134, 173, 84, 9, 65, 88, 54, 67, 116, 154, 80, 22, 172, 60, 111, 133, 56, 170, 104, 131, 123, 24, 49, 113, 136, 55, 3, 157, 156, 35, 58, 45, 155, 70, 59, 57, 171, 176, 74, 117, 18, 127, 114, 11, 69, 158, 129, 139, 62, 135, 96, 142, 41, 130, 160, 2, 126, 51, and 137.

FIG. 139 is a diagram showing a thirty-first example of the GW pattern for the LDPC code having the code length N of 64 k bits.

According to the GW pattern of FIG. 139, the arrangement of bit groups 0 to 179 of the LDPC code of 64 k bits is interleaved into the arrangement of bit groups 66, 61, 150, 157, 63, 42, 78, 44, 23, 154, 133, 101, 82, 26, 84, 123, 89, 31, 45, 102, 36, 134, 83, 117, 170, 27, 73, 137, 25, 32, 62, 91, 4, 20, 144, 145, 21, 74, 113, 148, 24, 135, 5, 19, 2, 34, 43, 168, 14, 64, 142, 115, 87, 38, 147, 39, 51, 152, 56, 86, 122, 76, 57, 129, 172, 6, 126, 10, 97, 85, 164, 3, 80, 90, 79, 124, 138, 120, 17, 103, 99, 116, 46, 98, 162, 151, 143, 11, 175, 160, 96, 132, 81, 171, 94, 65, 118, 161, 125, 178, 95, 112, 88, 174, 13, 35, 1, 167, 0, 128, 12, 58, 29, 169, 67, 28, 119, 166, 60, 55, 54, 130, 92, 146, 177, 149, 111, 9, 173, 179, 176, 75, 77, 114, 48, 159, 8, 141, 107, 139, 52, 100, 136, 105, 127, 47, 18, 69, 109, 16, 121, 59, 163, 165, 108, 106, 70, 22, 93, 41, 33, 110, 53, 140, 153, 158, 50, 15, 37, 72, 156, 7, 131, 49, 71, 68, 104, 30, 40, and 155.

FIG. 140 is a diagram showing a thirty-second example of the GW pattern for the LDPC code having the code length N of 64 k bits.

According to the GW pattern of FIG. 140, the arrangement of bit groups 0 to 179 of the LDPC code of 64 k bits is interleaved into the arrangement of bit groups 75, 83, 11, 24, 86, 104, 156, 76, 37, 173, 127, 61, 43, 139, 106, 69, 49, 2, 128, 140, 68, 14, 100, 8, 36, 73, 148, 65, 16, 47, 177, 6, 132, 45, 5, 30, 13, 22, 29, 27, 101, 150, 23, 90, 41, 93, 89, 92, 135, 4, 71, 87, 44, 124, 26, 64, 1, 129, 157, 130, 107, 18, 91, 118, 3, 82, 144, 113, 121, 54, 84, 97, 122, 120, 7, 154, 56, 134, 57, 161, 33, 116, 28, 96, 72, 172, 12, 115, 38, 164, 32, 167, 145, 17, 88, 39, 151, 80, 0, 136, 169, 142, 74, 147, 126, 166, 163, 40, 110, 171, 50, 160, 131, 70, 175, 103, 125, 77, 162, 31, 85, 66, 67, 52, 108, 159, 133, 42, 153, 21, 51, 119, 123, 98, 35, 48, 111, 149, 25, 58, 60, 158, 102, 59, 117, 20, 141, 143, 46, 53, 155, 15, 165, 152, 112, 176, 105, 178, 99, 174, 168, 114, 179, 78, 10, 19, 62, 63, 170, 138, 34, 109, 9, 146, 95, 94, 55, 137, 81, and 79.

FIG. 141 is a diagram showing a thirty-third example of the GW pattern for the LDPC code having the code length N of 64 k bits.

According to the GW pattern of FIG. 141, the arrangement of bit groups 0 to 179 of the LDPC code of 64 k bits is interleaved into the arrangement of bit groups 98, 159, 59, 125, 163, 89, 26, 4, 102, 70, 92, 36, 37, 142, 176, 95, 71, 19, 87, 45, 81, 47, 65, 170, 103, 48, 67, 61, 64, 35, 76, 80, 140, 77, 10, 167, 178, 155, 120, 156, 151, 12, 58, 5, 83, 137, 41, 109, 2, 66, 133, 62, 135, 28, 93, 128, 86, 57, 153, 161, 110, 52, 147, 141, 31, 79, 32, 88, 160, 84, 150, 6, 100, 73, 126, 164, 17, 42, 101, 7, 55, 105, 91, 22, 130, 154, 1, 82, 14, 0, 9, 21, 50, 165, 72, 138, 175, 106, 108, 3, 169, 30, 157, 54, 18, 20, 44, 34, 134, 107, 56, 53, 15, 162, 38, 166, 24, 33, 60, 85, 145, 115, 43, 39, 40, 124, 149, 144, 132, 96, 11, 146, 90, 129, 119, 111, 171, 8, 152, 121, 173, 131, 49, 27, 118, 16, 148, 68, 177, 94, 179, 13, 114, 75, 51, 117, 25, 46, 136, 143, 139, 113, 127, 174, 74, 29, 122, 158, 69, 97, 78, 63, 99, 112, 104, 116, 172, 168, 23, and 123.

It is possible to apply the first to thirty-third examples of the GW pattern for the LDPC code having the code length N of 64 k bits described above to any combination of LDPC codes having a code length N of 64 k bits and an arbitrary code rate r and an arbitrary modulation scheme (constellation).

It is possible to further improve an error rate of each of the combinations by setting the GW pattern to be applied for each of the combinations of the code lengths N of the LDPC code and the code rates r of the LDPC code and the modulation schemes (constellations) in the group-wise interleaving.

It is possible to achieve a favorable error rate by applying the GW pattern of FIG. 109 to specifically the combination of the ETRI code of (64 k, 5/15) and QPSK of FIG. 89, for example.

It is possible to achieve a favorable error rate by applying the GW pattern of FIG. 110 to specifically the combination of the ETRI code of (64 k, 5/15) and 16-QAM of FIG. 90, for example.

It is possible to achieve a favorable error rate by applying the GW pattern of FIG. 111 to specifically the combination of the ETRI code of (64 k, 5/15) and 64-QAM of FIG. 91, for example.

It is possible to achieve a favorable error rate by applying the GW pattern of FIG. 112 to specifically the combination of the Sony code of (64 k, 7/15) and QPSK of FIG. 89, for example.

It is possible to achieve a favorable error rate by applying the GW pattern of FIG. 113 to specifically the combination of the Sony code of (64 k, 7/15) and 16-QAM of FIG. 90, for example.

It is possible to achieve a favorable error rate by applying the GW pattern of FIG. 114 to specifically the combination of the Sony code of (64 k, 7/15) and 64-QAM of FIG. 91, for example.

It is possible to achieve a favorable error rate by applying the GW pattern of FIG. 115 to specifically the combination of the Sony code of (64 k, 9/15) and QPSK of FIG. 89, for example.

It is possible to achieve a favorable error rate by applying the GW pattern of FIG. 116 to specifically the combination of the Sony code of (64 k, 9/15) and 16-QAM of FIG. 90, for example.

It is possible to achieve a favorable error rate by applying the GW pattern of FIG. 117 to specifically the combination of the Sony code of (64 k, 9/15) and 64-QAM of FIG. 91, for example.

It is possible to achieve a favorable error rate by applying the GW pattern of FIG. 118 to specifically the combination of the Sony code of (64 k, 11/15) and QPSK of FIG. 89, for example.

It is possible to achieve a favorable error rate by applying the GW pattern of FIG. 119 to specifically the combination of the Sony code of (64 k, 11/15) and 16-QAM of FIG. 90, for example.

It is possible to achieve a favorable error rate by applying the GW pattern of FIG. 120 to specifically the combination of the Sony code of (64 k, 11/15) and 64-QAM of FIG. 91, for example.

It is possible to achieve a favorable error rate by applying the GW pattern of FIG. 121 to specifically the combination of the Sony code of (64 k, 13/15) and QPSK of FIG. 89, for example.

It is possible to achieve a favorable error rate by applying the GW pattern of FIG. 122 to specifically the combination of the Sony code of (64 k, 13/15) and 16-QAM of FIG. 90, for example.

It is possible to achieve a favorable error rate by applying the GW pattern of FIG. 123 to specifically the combination of the Sony code of (64 k, 13/15) and 64-QAM of FIG. 91, for example.

It is possible to achieve a favorable error rate by applying the GW pattern of FIG. 124 to specifically the combination of the ETRI code of (64 k, 5/15) and 256-QAM of FIGS. 92 and 93, for example.

It is possible to achieve a favorable error rate by applying the GW pattern of FIG. 125 to specifically the combination of the ETRI code of (64 k, 7/15) and 256-QAM of FIGS. 92 and 93, for example.

It is possible to achieve a favorable error rate by applying the GW pattern of FIG. 126 to specifically the combination of the Sony code of (64 k, 7/15) and 256-QAM of FIGS. 92 and 93, for example.

It is possible to achieve a favorable error rate by applying the GW pattern of FIG. 127 to specifically the combination of the Sony code of (64 k, 9/15) and 256-QAM of FIGS. 92 and 93, for example.

It is possible to achieve a favorable error rate by applying the GW pattern of FIG. 128 to specifically the combination of the NERC code of (64 k, 9/15) and 256-QAM of FIGS. 92 and 93, for example.

It is possible to achieve a favorable error rate by applying the GW pattern of FIG. 129 to specifically the combination of the Sony code of (64 k, 11/15) and 256-QAM of FIGS. 92 and 93, for example.

It is possible to achieve a favorable error rate by applying the GW pattern of FIG. 130 to specifically the combination of the Sony code of (64 k, 13/15) and 256-QAM of FIGS. 92 and 93, for example.

It is possible to achieve a favorable error rate by applying the GW pattern of FIG. 131 to specifically the combination of the ETRI code of (64 k, 5/15) and 1024-QAM of FIGS. 94 and 95, for example.

It is possible to achieve a favorable error rate by applying the GW pattern of FIG. 132 to specifically the combination of the ETRI code of (64 k, 7/15) and 1024-QAM of FIGS. 94 and 95, for example.

It is possible to achieve a favorable error rate by applying the GW pattern of FIG. 133 to specifically the combination of the Sony code of (64 k, 7/15) and 1024-QAM of FIGS. 94 and 95, for example.

It is possible to achieve a favorable error rate by applying the GW pattern of FIG. 134 to specifically the combination of the Sony code of (64 k, 9/15) and 1024-QAM of FIGS. 94 and 95, for example.

It is possible to achieve a favorable error rate by applying the GW pattern of FIG. 135 to specifically the combination of the NERC code of (64 k, 9/15) and 1024-QAM of FIGS. 94 and 95, for example.

It is possible to achieve a favorable error rate by applying the GW pattern of FIG. 136 to specifically the combination of the Sony code of (64 k, 11/15) and 1024-QAM of FIGS. 94 and 95, for example.

It is possible to achieve a favorable error rate by applying the GW pattern of FIG. 137 to specifically the combination of the Sony code of (64 k, 13/15) and 1024-QAM of FIGS. 94 and 95, for example.

It is possible to achieve a favorable error rate by applying the GW pattern of FIG. 138 to specifically the combination of the Samsung code of (64 k, 6/15) and 4096-QAM of FIGS. 96 and 97, for example.

It is possible to achieve a favorable error rate by applying the GW pattern of FIG. 139 to specifically the combination of the ETRI code of (64 k, 7/15) and 4096-QAM of FIGS. 96 and 97, for example.

It is possible to achieve a favorable error rate by applying the GW pattern of FIG. 140 to specifically the combination of the Samsung code of (64 k, 8/15) and 4096-QAM of FIGS. 96 and 97, for example.

It is possible to achieve a favorable error rate by applying the GW pattern of FIG. 141 to specifically the combination of the Sony code of (64 k, 9/15) and 4096-QAM of FIGS. 96 and 97, for example.

Example of GW Pattern for LDPC code of 16 k Bits FIG. 142 is a diagram showing a first example of the GW pattern for the LDPC code having a code length N of 16 k bits.

According to the GW pattern of FIG. 142, the arrangement of bit groups 0 to 44 of the LDPC code of 16 k bits is interleaved into the arrangement of bit groups 21, 41, 15, 29, 0, 23, 16, 12, 38, 43, 2, 3, 4, 20, 31, 27, 5, 33, 28, 30, 36, 8, 40, 13, 6, 9, 18, 24, 7, 39, 10, 17, 37, 1, 19, 22, 25, 26, 14, 32, 34, 11, 35, 42, and 44.

FIG. 143 is a diagram showing a second example of the GW pattern for the LDPC code having the code length N of 16 k bits.

According to the GW pattern of FIG. 143, the arrangement of bit groups 0 to 44 of the LDPC code of 16 k bits is interleaved into the arrangement of bit groups 1, 3, 2, 8, 5, 23, 13, 12, 18, 19, 17, 20, 24, 26, 28, 30, 32, 34, 36, 38, 40, 42, 0, 4, 6, 7, 21, 16, 10, 15, 9, 11, 22, 14, 25, 27, 29, 31, 33, 35, 37, 39, 41, 43, and 44.

FIG. 144 is a diagram showing a third example of the GW pattern for the LDPC code having the code length N of 16 k bits.

According to the GW pattern of FIG. 144, the arrangement of bit groups 0 to 44 of the LDPC code of 16 k bits is interleaved into the arrangement of bit groups 1, 4, 5, 6, 24, 21, 18, 7, 17, 12, 8, 20, 23, 29, 28, 30, 32, 34, 36, 38, 40, 42, 0, 2, 3, 14, 22, 13, 10, 25, 9, 27, 19, 16, 15, 26, 11, 31, 33, 35, 37, 39, 41, 43, and 44.

FIG. 145 is a diagram showing a fourth example of the GW pattern for the LDPC code having the code length N of 16 k bits.

According to the GW pattern of FIG. 145, the arrangement of bit groups 0 to 44 of the LDPC code of 16 k bits is interleaved into the arrangement of bit groups 3, 0, 4, 7, 18, 9, 19, 27, 32, 10, 12, 24, 8, 35, 30, 17, 22, 20, 36, 38, 40, 42, 2, 5, 1, 6, 14, 15, 23, 16, 11, 21, 26, 13, 29, 33, 31, 28, 25, 34, 37, 39, 41, 43, and 44.

FIG. 146 is a diagram showing a fifth example of the GW pattern for the LDPC code having the code length N of 16 k bits.

According to the GW pattern of FIG. 146, the arrangement of bit groups 0 to 44 of the LDPC code of 16 k bits is interleaved into the arrangement of bit groups 37, 0, 41, 19, 43, 8, 38, 3, 29, 13, 22, 6, 4, 2, 9, 26, 39, 15, 12, 10, 33, 17, 20, 16, 21, 44, 42, 27, 7, 11, 30, 34, 24, 1, 23, 35, 36, 25, 31, 18, 28, 32, 40, 5, and 14.

FIG. 147 is a diagram showing a sixth example of the GW pattern for the LDPC code having the code length N of 16 k bits.

According to the GW pattern of FIG. 147, the arrangement of bit groups 0 to 44 of the LDPC code of 16 k bits is interleaved into the arrangement of bit groups 6, 28, 17, 4, 3, 38, 13, 41, 44, 43, 7, 40, 19, 2, 23, 16, 37, 15, 30, 20, 11, 8, 1, 27, 32, 34, 33, 39, 5, 9, 10, 18, 0, 31, 29, 26, 14, 21, 42, 22, 12, 24, 35, 25, and 36.

FIG. 148 is a diagram showing a seventh example of the GW pattern for the LDPC code having the code length N of 16 k bits.

According to the GW pattern of FIG. 148, the arrangement of bit groups 0 to 44 of the LDPC code of 16 k bits is interleaved into the arrangement of bit groups 27, 11, 20, 1, 7, 5, 29, 35, 9, 10, 34, 18, 25, 28, 6, 13, 17, 0, 23, 16, 41, 15, 19, 44, 24, 37, 4, 31, 8, 32, 14, 42, 12, 2, 40, 30, 36, 39, 43, 21, 3, 22, 26, 33, and 38.

FIG. 149 is a diagram showing an eighth example of the GW pattern for the LDPC code having the code length N of 16 k bits.

According to the GW pattern of FIG. 149, the arrangement of bit groups 0 to 44 of the LDPC code of 16 k bits is interleaved into the arrangement of bit groups 3, 6, 7, 27, 2, 23, 10, 30, 22, 28, 24, 20, 37, 21, 4, 14, 11, 42, 16, 9, 15, 26, 33, 40, 5, 8, 44, 34, 18, 0, 32, 29, 19, 41, 38, 17, 25, 43, 35, 36, 13, 39, 12, 1, and 31.

FIG. 150 is a diagram showing a ninth example of the GW pattern for the LDPC code having the code length N of 16 k bits.

According to the GW pattern of FIG. 150, the arrangement of bit groups 0 to 44 of the LDPC code of 16 k bits is interleaved into the arrangement of bit groups 31, 38, 7, 9, 13, 21, 39, 12, 10, 1, 43, 15, 30, 0, 14, 3, 42, 34, 40, 24, 28, 35, 8, 11, 23, 4, 20, 17, 41, 19, 5, 37, 22, 32, 18, 2, 26, 44, 25, 33, 36, 27, 16, 6, and 29.

FIG. 151 is a diagram showing a tenth example of the GW pattern for the LDPC code having the code length N of 16 k bits.

According to the GW pattern of FIG. 151, the arrangement of bit groups 0 to 44 of the LDPC code of 16 k bits is interleaved into the arrangement of bit groups 36, 6, 2, 20, 43, 17, 33, 22, 23, 25, 13, 0, 10, 7, 21, 1, 19, 26, 8, 14, 31, 35, 16, 5, 29, 40, 11, 9, 4, 34, 15, 42, 32, 28, 18, 37, 30, 39, 24, 41, 3, 38, 27, 12, and 44.

FIG. 152 is a diagram showing an eleventh example of the GW pattern for the LDPC code having the code length N of 16 k bits.

According to the GW pattern of FIG. 152, the arrangement of bit groups 0 to 44 of the LDPC code of 16 k bits is interleaved into the arrangement of bit groups 14, 22, 18, 11, 28, 26, 2, 38, 10, 0, 5, 12, 24, 17, 29, 16, 39, 13, 23, 8, 25, 43, 34, 33, 27, 15, 7, 1, 9, 35, 40, 32, 30, 20, 36, 31, 21, 41, 44, 3, 42, 6, 19, 37, and 4.

FIG. 153 is a diagram showing a twelfth example of the GW pattern for the LDPC code having the code length N of 16 k bits.

According to the GW pattern of FIG. 153, the arrangement of bit groups 0 to 44 of the LDPC code of 16 k bits is interleaved into the arrangement of bit groups 17, 11, 14, 7, 31, 10, 2, 26, 0, 32, 29, 22, 33, 12, 20, 28, 27, 39, 37, 15, 4, 5, 8, 13, 38, 18, 23, 34, 24, 6, 1, 9, 16, 44, 21, 3, 36, 30, 40, 35, 43, 42, 25, 19, and 41.

FIG. 154 is a diagram showing a thirteenth example of the GW pattern for the LDPC code having the code length N of 16 k bits.

According to the GW pattern of FIG. 154, the arrangement of bit groups 0 to 44 of the LDPC code of 16 k bits is interleaved into the arrangement of bit groups 1, 27, 17, 30, 11, 15, 9, 7, 5, 6, 32, 33, 2, 14, 3, 39, 18, 12, 29, 13, 41, 31, 4, 43, 35, 34, 40, 10, 19, 44, 8, 26, 21, 16, 28, 0, 23, 38, 25, 36, 22, 37, 42, 24, and 20.

FIG. 155 is a diagram showing a fourteenth example of the GW pattern for the LDPC code having the code length N of 16 k bits.

According to the GW pattern of FIG. 155, the arrangement of bit groups 0 to 44 of the LDPC code of 16 k bits is interleaved into the arrangement of bit groups 41, 2, 12, 6, 33, 1, 13, 11, 26, 10, 39, 43, 36, 23, 42, 7, 44, 20, 8, 38, 18, 22, 24, 40, 4, 28, 29, 19, 14, 5, 9, 0, 30, 25, 35, 37, 27, 32, 31, 34, 21, 3, 15, 17, and 16.

FIG. 156 is a diagram showing a fifteenth example of the GW pattern for the LDPC code having the code length N of 16 k bits.

According to the GW pattern of FIG. 156, the arrangement of bit groups 0 to 44 of the LDPC code of 16 k bits is interleaved into the arrangement of bit groups 17, 2, 30, 12, 7, 25, 27, 3, 15, 14, 4, 26, 34, 31, 13, 22, 0, 39, 23, 24, 21, 6, 38, 5, 19, 42, 11, 32, 28, 40, 20, 18, 36, 9, 41, 10, 33, 37, 1, 16, 8, 43, 29, 35, and 44.

FIG. 157 is a diagram showing a sixteenth example of the GW pattern for the LDPC code having the code length N of 16 k bits.

According to the GW pattern of FIG. 157, the arrangement of bit groups 0 to 44 of the LDPC code of 16 k bits is interleaved into the arrangement of bit groups 28, 21, 10, 15, 8, 22, 26, 2, 14, 1, 27, 3, 39, 20, 34, 25, 12, 6, 7, 40, 30, 29, 38, 16, 43, 33, 4, 35, 9, 32, 5, 36, 0, 41, 37, 18, 17, 13, 24, 42, 31, 23, 19, 11, and 44.

It is possible to apply the first to sixteenth examples of the GW pattern for the LDPC code having the code length N of 16 k bits to any combination of LDPC codes having a code length N of 16 k bits and an arbitrary code rate r and an arbitrary modulation scheme (constellation).

As mentioned above, it is possible to further improve an error rate of each of the combinations by setting the GW pattern to be applied for each of the combinations of the code lengths N of the LDPC code and the code rates r of the LDPC code and the modulation schemes (constellations) in the group-wise interleaving.

It is possible to achieve a favorable error rate by applying the GW pattern of FIG. 142 to specifically the combination of the LGE code of (16 k, 6/15) and QPSK of FIG. 89, for example.

It is possible to achieve a favorable error rate by applying the GW pattern of FIG. 143 to specifically the combination of the Sony code of (16 k, 8/15) and QPSK of FIG. 89, for example.

It is possible to achieve a favorable error rate by applying the GW pattern of FIG. 144 to specifically the combination of the Sony code of (16 k, 10/15) and QPSK of FIG. 89, for example.

It is possible to achieve a favorable error rate by applying the GW pattern of FIG. 145 to specifically the combination of the Sony code of (16 k, 12/15) and QPSK of FIG. 89, for example.

It is possible to achieve a favorable error rate by applying the GW pattern of FIG. 146 to specifically the combination of the LGE code of (16 k, 6/15) and 16-QAM of FIG. 101, for example.

It is possible to achieve a favorable error rate by applying the GW pattern of FIG. 147 to specifically the combination of the Sony code of (16 k, 8/15) and 16-QAM of FIG. 101, for example.

It is possible to achieve a favorable error rate by applying the GW pattern of FIG. 148 to specifically the combination of the Sony code of (16 k, 10/15) and 16-QAM of FIG. 101, for example.

It is possible to achieve a favorable error rate by applying the GW pattern of FIG. 149 to specifically the combination of the Sony code of (16 k, 12/15) and 16-QAM of FIG. 101, for example.

It is possible to achieve a favorable error rate by applying the GW pattern of FIG. 150 to specifically the combination of the LGE code of (16 k, 6/15) and 64-QAM of FIG. 102, for example.

It is possible to achieve a favorable error rate by applying the GW pattern of FIG. 151 to specifically the combination of the Sony code of (16 k, 8/15) and 64-QAM of FIG. 102, for example.

It is possible to achieve a favorable error rate by applying the GW pattern of FIG. 152 to specifically the combination of the Sony code of (16 k, 10/15) and 64-QAM of FIG. 102, for example.

It is possible to achieve a favorable error rate by applying the GW pattern of FIG. 153 to specifically the combination of the Sony code of (16 k, 12/15) and 64-QAM of FIG. 102, for example.

It is possible to achieve a favorable error rate by applying the GW pattern of FIG. 154 to specifically the combination of the LGE code of (16 k, 6/15) and 256-QAM of FIGS. 103 and 104, for example.

It is possible to achieve a favorable error rate by applying the GW pattern of FIG. 155 to specifically the combination of the Sony code of (16 k, 8/15) and 256-QAM of FIGS. 103 and 104, for example.

It is possible to achieve a favorable error rate by applying the GW pattern of FIG. 156 to specifically the combination of the Sony code of (16 k, 10/15) and 256-QAM of FIGS. 103 and 104, for example.

It is possible to achieve a favorable error rate by applying the GW pattern of FIG. 157 to specifically the combination of the Sony code of (16 k, 12/15) and 256-QAM of FIGS. 103 and 104, for example.

Simulation Result

FIG. 158 is a diagram showing a BER/FER curve as a simulation result of a simulation that measures an error rate when the GW pattern of FIG. 109 is applied to the combination of the ETRI code of (64 k, 5/15) and QPSK of FIG. 89.

FIG. 159 is a diagram showing a BER/FER curve as a simulation result of a simulation that measures an error rate when the GW pattern of FIG. 110 is applied to the combination of the ETRI code of (64 k, 5/15) and 16-QAM of FIG. 90.

FIG. 160 is a diagram showing a BER/FER curve as a simulation result of a simulation that measures an error rate when the GW pattern of FIG. 111 is applied to the combination of the ETRI code of (64 k, 5/15) and 64-QAM of FIG. 91.

FIG. 161 is a diagram showing a BER/FER curve as a simulation result of a simulation that measures an error rate when the GW pattern of FIG. 112 is applied to the combination of the Sony code of (64 k, 7/15) and QPSK of FIG. 89.

FIG. 162 is a diagram showing a BER/FER curve as a simulation result of a simulation that measures an error rate when the GW pattern of FIG. 113 is applied to the combination of the Sony code of (64 k, 7/15) and 16-QAM of FIG. 90.

FIG. 163 is a diagram showing a BER/FER curve as a simulation result of a simulation that measures an error rate when the GW pattern of FIG. 114 is applied to the combination of the Sony code of (64 k, 7/15) and 64-QAM of FIG. 91.

FIG. 164 is a diagram showing a BER/FER curve as a simulation result of a simulation that measures an error rate when the GW pattern of FIG. 115 is applied to the combination of the Sony code of (64 k, 9/15) and QPSK of FIG. 89.

FIG. 165 is a diagram showing a BER/FER curve as a simulation result of a simulation that measures an error rate when the GW pattern of FIG. 116 is applied to the combination of the Sony code of (64 k, 9/15) and 16-QAM of FIG. 90.

FIG. 166 is a diagram showing a BER/FER curve as a simulation result of a simulation that measures an error rate when the GW pattern of FIG. 117 is applied to the combination of the Sony code of (64 k, 9/15) and 64-QAM of FIG. 91.

FIG. 167 is a diagram showing a BER/FER curve as a simulation result of a simulation that measures an error rate when the GW pattern of FIG. 118 is applied to the combination of the Sony code of (64 k, 11/15) and QPSK of FIG. 89.

FIG. 168 is a diagram showing a BER/FER curve as a simulation result of a simulation that measures an error rate when the GW pattern of FIG. 119 is applied to the combination of the Sony code of (64 k, 11/15) and 16-QAM of FIG. 90.

FIG. 169 is a diagram showing a BER/FER curve as a simulation result of a simulation that measures an error rate when the GW pattern of FIG. 120 is applied to the combination of the Sony code of (64 k, 11/15) and 64-QAM of FIG. 91.

FIG. 170 is a diagram showing a BER/FER curve as a simulation result of a simulation that measures an error rate when the GW pattern of FIG. 121 is applied to the combination of the Sony code of (64 k, 13/15) and QPSK of FIG. 89.

FIG. 171 is a diagram showing a BER/FER curve as a simulation result of a simulation that measures an error rate when the GW pattern of FIG. 122 is applied to the combination of the Sony code of (64 k, 13/15) and 16-QAM of FIG. 90.

FIG. 172 is a diagram showing a BER/FER curve as a simulation result of a simulation that measures an error rate when the GW pattern of FIG. 123 is applied to the combination of the Sony code of (64 k, 13/15) and 64-QAM of FIG. 91.

FIG. 173 is a diagram showing a BER/FER curve as a simulation result of a simulation that measures an error rate when the GW pattern of FIG. 124 is applied to the combination of the ETRI code of (64 k, 5/15) and 256-QAM of FIGS. 92 and 93.

FIG. 174 is a diagram showing a BER/FER curve as a simulation result of a simulation that measures an error rate when the GW pattern of FIG. 125 is applied to the combination of the ETRI code of (64 k, 7/15) and 256-QAM of FIGS. 92 and 93.

FIG. 175 is a diagram showing a BER/FER curve as a simulation result of a simulation that measures an error rate when the GW pattern of FIG. 126 is applied to the combination of the Sony code of (64 k, 7/15) and 256-QAM of FIGS. 92 and 93.

FIG. 176 is a diagram showing a BER/FER curve as a simulation result of a simulation that measures an error rate when the GW pattern of FIG. 127 is applied to the combination of the Sony code of (64 k, 9/15) and 256-QAM of FIGS. 92 and 93.

FIG. 177 is a diagram showing a BER/FER curve as a simulation result of a simulation that measures an error rate when the GW pattern of FIG. 128 is applied to the combination of the NERC code of (64 k, 9/15) and 256-QAM of FIGS. 92 and 93.

FIG. 178 is a diagram showing a BER/FER curve as a simulation result of a simulation that measures an error rate when the GW pattern of FIG. 129 is applied to the combination of the Sony code of (64 k, 11/15) and 256-QAM of FIGS. 92 and 93.

FIG. 179 is a diagram showing a BER/FER curve as a simulation result of a simulation that measures an error rate when the GW pattern of FIG. 130 is applied to the combination of the Sony code of (64 k, 13/15) and 256-QAM of FIGS. 92 and 93.

FIG. 180 is a diagram showing a BER/FER curve as a simulation result of a simulation that measures an error rate when the GW pattern of FIG. 131 is applied to the combination of the ETRI code of (64 k, 5/15) and 1024-QAM of FIGS. 94 and 95.

FIG. 181 is a diagram showing a BER/FER curve as a simulation result of a simulation that measures an error rate when the GW pattern of FIG. 132 is applied to the combination of the ETRI code of (64 k, 7/15) and 1024-QAM of FIGS. 94 and 95.

FIG. 182 is a diagram showing a BER/FER curve as a simulation result of a simulation that measures an error rate when the GW pattern of FIG. 133 is applied to the combination of the Sony code of (64 k, 7/15) and 1024-QAM of FIGS. 94 and 95.

FIG. 183 is a diagram showing a BER/FER curve as a simulation result of a simulation that measures an error rate when the GW pattern of FIG. 134 is applied to the combination of the Sony code of (64 k, 9/15) and 1024-QAM of FIGS. 94 and 95.

FIG. 184 is a diagram showing a BER/FER curve as a simulation result of a simulation that measures an error rate when the GW pattern of FIG. 135 is applied to the combination of the NERC code of (64 k, 9/15) and 1024-QAM of FIGS. 94 and 95.

FIG. 185 is a diagram showing a BER/FER curve as a simulation result of a simulation that measures an error rate when the GW pattern of FIG. 136 is applied to the combination of the Sony code of (64 k, 11/15) and 1024-QAM of FIGS. 94 and 95.

FIG. 186 is a diagram showing a BER/FER curve as a simulation result of a simulation that measures an error rate when the GW pattern of FIG. 137 is applied to the combination of the Sony code of (64 k, 13/15) and 1024-QAM of FIGS. 94 and 95.

FIG. 187 is a diagram showing a BER/FER curve as a simulation result of a simulation that measures an error rate when the GW pattern of FIG. 138 is applied to the combination of the Samsung code of (64 k, 6/15) and 4096-QAM of FIGS. 96 and 97.

FIG. 188 is a diagram showing a BER/FER curve as a simulation result of a simulation that measures an error rate when the GW pattern of FIG. 139 is applied to the combination of the ETRI code of (64 k, 7/15) and 4096-QAM of FIGS. 96 and 97.

FIG. 189 is a diagram showing a BER/FER curve as a simulation result of a simulation that measures an error rate when the GW pattern of FIG. 140 is applied to the combination of the Samsung code of (64 k, 8/15) and 4096-QAM of FIGS. 96 and 97.

FIG. 190 is a diagram showing a BER/FER curve as a simulation result of a simulation that measures an error rate when the GW pattern of FIG. 141 is applied to the combination of the Sony code of (64 k, 9/15) and 4096-QAM of FIGS. 96 and 97.

FIG. 191 is a diagram showing a BER/FER curve as a simulation result of a simulation that measures an error rate when the GW pattern of FIG. 142 is applied to the combination of the LGE code of (16 k, 6/15) and QPSK of FIG. 89.

FIG. 192 is a diagram showing a BER/FER curve as a simulation result of a simulation that measures an error rate when the GW pattern of FIG. 143 is applied to the combination of the Sony code of (16 k, 8/15) and QPSK of FIG. 89.

FIG. 193 is a diagram showing a BER/FER curve as a simulation result of a simulation that measures an error rate when the GW pattern of FIG. 144 is applied to the combination of the Sony code of (16 k, 10/15) and QPSK of FIG. 89.

FIG. 194 is a diagram showing a BER/FER curve as a simulation result of a simulation that measures an error rate when the GW pattern of FIG. 145 is applied to the combination of the Sony code of (16 k, 12/15) and QPSK of FIG. 89.

FIG. 195 is a diagram showing a BER/FER curve as a simulation result of a simulation that measures an error rate when the GW pattern of FIG. 146 is applied to the combination of the LGE code of (16 k, 6/15) and 16-QAM of FIG. 101.

FIG. 196 is a diagram showing a BER/FER curve as a simulation result of a simulation that measures an error rate when the GW pattern of FIG. 147 is applied to the combination of the Sony code of (16 k, 8/15) and 16-QAM of FIG. 101.

FIG. 197 is a diagram showing a BER/FER curve as a simulation result of a simulation that measures an error rate when the GW pattern of FIG. 148 is applied to the combination of the Sony code of (16 k, 10/15) and 16-QAM of FIG. 101.

FIG. 198 is a diagram showing a BER/FER curve as a simulation result of a simulation that measures an error rate when the GW pattern of FIG. 149 is applied to the combination of the Sony code of (16 k, 12/15) and 16-QAM of FIG. 101.

FIG. 199 is a diagram showing a BER/FER curve as a simulation result of a simulation that measures an error rate when the GW pattern of FIG. 150 is applied to the combination of the LGE code of (16 k, 6/15) and 64-QAM of FIG. 102.

FIG. 200 is a diagram showing a BER/FER curve as a simulation result of a simulation that measures an error rate when the GW pattern of FIG. 151 is applied to the combination of the Sony code of (16 k, 8/15) and 64-QAM of FIG. 102.

FIG. 201 is a diagram showing a BER/FER curve as a simulation result of a simulation that measures an error rate when the GW pattern of FIG. 152 is applied to the combination of the Sony code of (16 k,10/15) and 64-QAM of FIG. 102.

FIG. 202 is a diagram showing a BER/FER curve as a simulation result of a simulation that measures an error rate when the GW pattern of FIG. 153 is applied to the combination of the Sony code of (16 k, 12/15) and 64-QAM of FIG. 102.

FIG. 203 is a diagram showing a BER/FER curve as a simulation result of a simulation that measures an error rate when the GW pattern of FIG. 154 is applied to the combination of the LGE code of (16 k, 6/15) and 256-QAM of FIGS. 103 and 104.

FIG. 204 is a diagram showing a BER/FER curve as a simulation result of a simulation that measures an error rate when the GW pattern of FIG. 155 is applied to the combination of the Sony code of (16 k, 8/15) and 256-QAM of FIGS. 103 and 104.

FIG. 205 is a diagram showing a BER/FER curve as a simulation result of a simulation that measures an error rate when the GW pattern of FIG. 156 is applied to the combination of the Sony code of (16 k, 10/15) and 256-QAM of FIGS. 103 and 104.

FIG. 206 is a diagram showing a BER/FER curve as a simulation result of a simulation that measures an error rate when the GW pattern of FIG. 157 is applied to the combination of the Sony code of (16 k, 12/15) and 256-QAM of FIGS. 103 and 104.

FIGS. 158 to 206 show BER/FER curves when an AWGN channel is used as the communication channel 13 (FIG. 7) (upper drawings) and when a Rayleigh (fading) channel is used as the communication channel (lower drawings).

In FIGS. 158 to 206, "wbil" represents BER/FER curves when the parity interleaving, the group-wise interleaving and the block interleaving are performed, and "w/obil" represents BER/FER curves when the parity interleaving, the group-wise interleaving and the block interleaving are not performed.

According to FIGS. 158 to 206, unlike in the case where the parity interleaving, the group-wise interleaving and the block-wise interleaving are not performed, it can be seen that it is possible to improve the BER/FER and it is possible to achieve the favorable error rate in the case where the parity interleaving, the group-wise interleaving and the block interleaving are performed.

In addition to the QPSK, 16-QAM, 64-QAM, 256-QAM, 1024-QAM, and 4096-QAM constellations having the arrangements of signal points shown in FIGS. 83 to 104 described above, it is possible to apply the GW patterns of FIGS. 109 to 157 to a constellation in which the arrangements of signal points shown in FIGS. 83 to 104 are symmetrically moved with respect to the I axis or the Q axis, a constellation in which the arrangements of signal points are symmetrically moved with respect to the origin, and a constellation in which the arrangements of signal points are rotated at an arbitrary angle with the origin as its center, and it is possible to obtain the same effects when the arrangements of signal points shown in FIGS. 83 to 104 are applied to the QPSK, 16-QAM, 64-QAM, 256-QAM, 1024-QAM, and 4096-QAM constellations.

In addition to the QPSK, 16-QAM, 64-QAM, 256-QAM, 1024-QAM, and 4096-QAM constellations having the arrangements of signal points shown in FIGS. 83 to 104 described above, it is possible to apply the GW patterns of FIGS. 109 to 157 to a constellation in which most significant bits (MSBs) and least significant bits (LSBs) of the symbols corresponding the signal points are switched in the arrangements of signal points shown in FIGS. 83 to 104, and it is possible to obtain the same effects when the arrangements of signal points shown in FIGS. 83 to 104 are applied to the QPSK, 16-QAM, 64-QAM, 256-QAM, 1024-QAM, and 4096-QAM constellations.

Configuration Example of Reception Apparatus 12

FIG. 207 is a block diagram showing a configuration example of the reception apparatus 12 of FIG. 7.

An OFDM operation unit 151 receives an OFDM signal from the transmission apparatus 11 (FIG. 7), and performs signal processing on the OFDM signal. Data obtained by performing the signal processing with the OFDM operation unit 151 is supplied to a frame management unit 152.

The frame management unit 152 performs processing (frame analysis) on a frame constituted by data supplied from the OFDM operation unit 151, and respectively supplies a signal of target data obtained as the result and a signal of control data to frequency deinterleavers 161 and 153.

The frequency deinterleaver 153 performs frequency deinterleaving on the data from the frame management unit 152 for every symbol, and supplies data obtained as the result to a demapper 154.

The demapper 154 performs quadrature demodulation by demapping (signal point arrangement decoding) data (data on the constellation) from the frequency deinterleaver 153 based on the arrangement (constellation) of signal points determined through the quadrature modulation performed by the transmission apparatus 11, and supplies data ((likelihood of) LDPC code) obtained as the result to an LDPC decoder 155.

The LDPC decoder 155 performs LDPC decoding on the LDPC code from the demapper 154, and supplies LDPC target data (here, a BCH code) obtained as the result to a BCH decoder 156.

The BCH decoder 156 performs BCH decoding on the LDPC target data from the LDPC decoder 155, and outputs control data (signaling) obtained as the result.

Meanwhile, the frequency deinterleaver 161 performs frequency deinterleaving on the data from the frame management unit 152 for every symbol, and supplies data obtained as the result to a SISO/MISO decoder 162.

The SISO/MISO decoder 162 performs space-time decoding on the data from the frequency deinterleaver 161, and supplies data obtained as the result to a time deinterleaver 163.

The time deinterleaver 163 performs time deinterleaving on the data from the SISO/MISO decoder 162 for every symbol, and supplies data obtained as the result to a demapper 164.

The demapper 164 performs quadrature demodulation by demapping (signal point arrangement decoding) the data (data on the constellation) from the time deinterleaver 163 based on the arrangement (constellation) of signal points determined through the quadrature modulation performed by the transmission apparatus 11, and supplies data obtained as the result to a bit deinterleaver 165.

The bit deinterleaver 165 performs bit deinterleaving on the data from the demapper 164, and supplies (likelihood of) an LDPC code which is data on which the bit interleaving has been performed to an LDPC decoder 166.

The LDPC decoder 166 performs LDPC decoding on the LDPC code from the bit deinterleaver 165, and supplies LDPC target data (here, a BCH code) obtained as the result to a BCH decoder 167.

The BCH decoder 167 performs BCH decoding on the LDPC target data from the LDPC decoder 155, and supplies data obtained as the result to a BB descrambler 168.

The BB descrambler 168 performs BB descrambling on the data from the BCH decoder 167, and supplies data obtained as the result to a null deletion unit 169.

The null deletion unit 169 deletes the Nulls inserted by the padder 112 of FIG. 8 from the data from the BB descrambler 168, and supplies data obtained as the result to a demultiplexer 170.

The demultiplexer 170 splits one or more streams (target data) multiplexed to the data from the null deletion unit 169, performs necessary processing on the split data items, and outputs the processed data items as an output stream.

The reception apparatus 12 may be configured without including some of the blocks shown in FIG. 207. That is, for example, when the transmission apparatus 11 (FIG. 8) is configured without including the time interleaver 118, the SISO/MISO encoder 119, the frequency interleaver 120 and the frequency interleaver 124, the reception apparatus 12 may be configured without including the time deinterleaver 163, the SISO/MISO decoder 162, the frequency deinterleaver 161 and the frequency deinterleaver 153 which are the blocks respectively corresponding to the time interleaver 118, the SISO/MISO encoder 119, the frequency interleaver 120 and the frequency interleaver 124 of the transmission apparatus 11.

Configuration Example of Bit Deinterleaver 165

FIG. 208 is a block diagram showing a configuration example of the bit deinterleaver 165 of FIG. 207.

The bit deinterleaver 165 includes a block deinterleaver 54, and a group-wise deinterleaver 55, and performs (bit) deinterleaving of symbol bits of a symbol which is the data from the demapper 164 (FIG. 207).

That is, the block deinterleaver 54 performs block deinterleaving (reverse processing of the block interleaving) corresponding to the block interleaving performed by the block interleaver 25 of FIG. 9 on the symbol bits of the symbol from the demapper 164 as a target, that is, block deinterleaving that returns the positions of (likelihood of) the code bits of the LDPC code rearranged by the block interleaving to the original positions, and supplies an LDPC code obtained as the result to the group-wise deinterleaver 55.

The group-wise deinterleaver 55 performs group-wise deinterleaving (reverse processing of the group-wise interleaving) corresponding to the group-wise interleaving performed by the group-wise interleaver 24 of FIG. 9 on the LDPC code from the block deinterleaver 54 as a target, that is, group-wise deinterleaving which returns the arrangement to the original arrangement by rearranging the code bits of the LDPC code whose arrangement is changed for every bit group by, for example, the group-wise interleaving described in FIG. 108.

Here, when the parity interleaving, the group-wise interleaving and the block interleaving are performed on the LDPC code supplied to the bit deinterleaver 165 from the demapper 164, it is possible to perform all of parity deinterleaving (reverse processing of the parity interleaving, that is, parity deinterleaving that returns the arrangement of the code bits of the LDPC code whose arrangement is changed by the parity interleaving to the original arrangement) corresponding to the parity interleaving, block deinterleaving corresponding to the block interleaving, and group-wise deinterleaving corresponding to the group-wise interleaving in the bit deinterleaver 165.

In the bit deinterleaver 165 of FIG. 208, the block deinterleaver 54 that performs the block deinterleaving corresponding to the block interleaving, and the group-wise deinterleaver 55 that performs the group-wise deinterleaving corresponding to the group-wise interleaving are provided. However, the block that performs the parity deinterleaving corresponding to the parity interleaving is not provided, and thus, the parity deinterleaving is not performed.

Accordingly, the LDPC code on which the block deinterleaving and the group-wise deinterleaving have been performed and the parity deinterleaving has not been performed is supplied to the LDPC decoder 166 from (the group-wise deinterleaver 55 of) the bit deinterleaver 165.

The LDPC decoder 166 performs the LDPC decoding on the LDPC code from the bit deinterleaver 165 by using a transformation check matrix (or the transformation check matrix (FIG. 29) obtained by performing row permutation on the parity check matrix of the ETRI method (FIG. 27)) obtained by at least performing column permutation corresponding to the parity interleaving on the parity check matrix H of the DVB method used in the LDPC encoding performed by the LDPC encoder 115 of FIG. 8, and outputs data obtained as the result as a decoded result of the LDPC target data.

FIG. 209 is a flowchart for describing the process performed by the demapper 164, the bit deinterleaver 165 and the LDPC decoder 166 of FIG. 208.

In step S111, the demapper 164 performs quadrature demodulation by demapping the data (data on the constellation mapped to the signal point) from the time deinterleaver 163, and supplies data obtained as the result to the bit deinterleaver 165. The process then proceeds to step S112.

In step S112, the bit deinterleaver 165 performs the deinterleaving (bit deinterleaving) on the data from the demapper 164, and the process proceeds to step S113.

That is, in step S112, in the bit deinterleaver 165, the block deinterleaver 54 performs the block deinterleaving on the data (symbol) from the demapper 164 as a target, and supplies the code bits of the LDPC code obtained as the result to the group-wise deinterleaver 55.

The group-wise deinterleaver 55 performs the group-wise interleaving on the LDPC code from the block deinterleaver 54 as a target, and supplies (the likelihood of) the LDPC code obtained as the result to the LDPC decoder 166.

In step S113, the LDPC decoder 166 performs the LDPC decoding on the LDPC code from the group-wise deinterleaver 55 by using the parity check matrix H used in the LDPC encoding performed by the LDPC encoder 115 of FIG. 8, that is, by using, for example, the transformation check matrix obtained from the parity check matrix H, and outputs data obtained as the result as a decoded result of the LDPC target data to the BCH decoder 167.

Similarly to the case of FIG. 9, for the sake of convenience in the description, even in FIG. 208, the block deinterleaver 54 that performs the block deinterleaving and the group-wise deinterleaver 55 that performs the group-wise deinterleaving are individually provided, but the block deinterleaver 54 and the group-wise deinterleaver 55 may be integrally configured.

LDPC Decoding

The LDPC decoding performed in the LDPC decoder 166 of FIG. 207 will be further described.

As described above, in the LDPC decoder 166 of FIG. 207, the LDPC decoding is performed on the LDPC code from the group-wise deinterleaver 55 on which the block deinterleaving and the group-wise deinterleaving have been performed and the parity deinterleaving has not been performed by using the transformation check matrix (or the transformation check matrix (FIG. 29) obtained by performing the row permutation on the parity check matrix of the ETRI method (FIG. 27)) obtained by at least performing the column permutation corresponding to the parity deinterleaving on the parity check matrix H of the DVB method used in the LDPC encoding performed by the LDPC encoder 115 of FIG. 8.

Here, it has been previously suggested to use the LDPC decoding capable of allowing an operation frequency to fall within a sufficiently realizable range while suppressing a circuit scale by performing the LDPC decoding using the transformation check matrix (for example, see U.S. Pat. No. 4,224,777).

The LDPC decoding using the transformation check matrix that has been previously suggested will be described with reference to FIGS. 210 to 213.

FIG. 210 is a diagram showing an example of a parity check matrix H of the LDPC code having a code length N of 90 and a code rate of 2/3.

In FIG. 210 (similarly in FIGS. 211 and 212 to be described below), 0 is represented as a period (.).

In the parity check matrix H of FIG. 210, the parity matrix has the dual diagonal structure.

FIG. 211 is a diagram showing a parity check matrix H' obtained by performing row permutation of Expression (11) and column permutation of Expression (12) on the parity check matrix H of FIG. 210.

Row permutation: $(6s+t+1)$-th row→$(5t+s+1)$-th row (11)

Column permutation: $(6x+y+61)$-th column→$(5y+x+61)$-th column (12)

Here, in Expressions (11) and (12), s, t, x and y are respectively integers in a range of 0≤s≤5, 0≤t<6, 0≤x<5, and 0≤t<6.

According to the row permutation of Expression (11), the $1^{st}$, $7^{th}$, $13^{th}$, $19^{th}$ and $25^{th}$ rows which have a remainder of 1 by being divided by 6 are respectively permuted to the 1st, $2^{nd}$, $3^{rd}$, $4^{th}$, and $5^{th}$ throws, and the $2^{nd}$, $8^{th}$, $14^{th}$, $20^{th}$ and $26^{th}$ rows which have a remainder of 2 by being divided by 6 are respectively permuted to the 6th, $7^{th}$, $8^{th}$, $9^{th}$ and $10^{th}$ rows.

According to the column permutation of Expression (12), the permutation is performed on the $61^{st}$ column and the subsequent columns (parity matrix) such that the $61^{st}$, $67^{th}$, $73^{rd}$, $79^{th}$ and $85^{th}$ columns which have a remainder of 1 by being divided by 6 are respectively permuted to the $61^{st}$, $62^{nd}$, $63^{rd}$, $64^{th}$ and $65^{th}$ columns, and $62^{nd}$, 68th, $74^{th}$, $80^{th}$ and $86^{th}$ columns which have a remainder 2 by being divided by 6 are respectively permuted to the $66^{th}$, $67^{th}$, $69^{th}$, $69^{th}$ and $70^{th}$ columns.

In this manner, the matrix obtained by performing the row and column permutations on the parity check matrix H of FIG. 210 is the parity check matrix H' of FIG. 211.

Here, the arrangement of the code bits of the LDPC code are not influenced even when the row permutation of the parity check matrix H is performed.

The column permutation of Expression (12) corresponds to the parity interleaving when the information length K is 60, the unit size P is 5 and the divisor q(=M/P) of the parity length M (here, 30) is 6 in the parity interleaving that interleaves the (K+qx+y+1)-th code bit into the position of the (K+Py+x+1)-th code bit.

Accordingly, the parity check matrix H' of FIG. 211 is a transformation check matrix obtained by at least performing the column permutation for permuting the (K+qx+y+1)-th column of the parity check matrix (hereinafter, appropriately referred to as an original parity check matrix) H of FIG. 210 to the (K+Py+x+1)-th column.

When the LDPC code of the original parity check matrix H of FIG. 210 is multiplied by the LDPC code on which the same permutation as Expression (12) has been performed, a 0 vector is output to the transformation check matrix H' of FIG. 211. That is, when a row vector obtained by performing the column permutation of Expression (12) on the row vector c as the LDPC code (one codeword) of the original parity check matrix H is expressed as c', since $Hc^T$ becomes the 0 vector in view of properties of the parity check matrix, $H'c'^T$ also becomes the 0 vector.

As stated above, the transformation parity check matrix H' of FIG. 211 is a parity check matrix of the LDPC code c' obtained by performing the column permutation of Expression (12) on the LDPC code c of the original parity check matrix H.

Accordingly, the column permutation of Expression (12) is performed on the LDPC code c of the original parity check matrix H, and decoding (LDPC decoding) is performed on the LDPC code c' after the column permutation by using the transformation check matrix H' of FIG. 211. As the decoded result, since reverse permutation of the column permutation of Expression (12) is performed, it is possible to obtain the same decoded result as that in the decoding of the LDPC code of the original parity check matrix H using the parity check matrix H.

FIG. 212 is a diagram showing the transformation check matrix H' of FIG. 211 with a predetermined space for every 5×5 matrix.

In FIG. 212, the transformation check matrix H' is represented as a combination of a 5×5 (=p×p) unit matrix which is the unit size P, a unit (hereinafter, appropriately referred to as a quasi-unit matrix) in which one or more is of the unit matrix become 0s, a matrix (hereinafter, approximately referred to as a shift matrix) obtained by cyclic-shifting the unit matrix or the quasi-unit matrix, the sum (hereinafter, appropriately referred to as a sum matrix) of two or more matrices of the unit matrix, the quasi-unit matrix and the shift matrix, and a 5×5 0 matrix.

The transformation check matrix H' of FIG. 212 may include the 5×5 unit matrix, the quasi-unit matrix, the shift matrix, the sum matrix, and the 0 matrix. Thus, hereinafter, these 5×5 matrices (the unit matrix, the quasi-unit matrix, the shift matrix, the sum matrix, and the 0 matrix) constituting the transformation check matrix H' are appropriately referred to as constitutive matrices.

It is possible to use an architecture in which the check node calculation and the variable node calculation are simultaneously performed p times in the decoding of the LDPC code of the parity check matrix represented as P×P constitutive matrices.

FIG. 213 is a block diagram showing a configuration example of a decoding device that performs such decoding.

That is, FIG. 213 shows the configuration example of the decoding device that performs decoding on the LDPC code by using the transformation check matrix H' of FIG. 212 obtained by at least performing the column permutation of Expression (12) on the original parity check matrix H of FIG. 210.

The decoding device of FIG. 213 includes an edge data storing memory 300 including six FIFOs $\mathbf{300}_1$ to $\mathbf{300}_6$, a selector 301 that selects the FIFOs $\mathbf{300}_1$ to $\mathbf{300}_6$, a check node calculating unit 302, two cyclic shift circuits 303 and 308, an edge data storing memory 304 including 18 FIFOs $\mathbf{304}_1$ to $\mathbf{304}_{16}$, a selector 305 that selects the FIFOs $\mathbf{304}_1$ to $\mathbf{304}_{16}$, a reception data memory 306 that stores reception data, a variable node calculating unit 307, a decoded word calculating unit 309, a reception data rearrangement unit 310, and a decoded data rearrangement unit 311.

A method of storing data in the edge data storing memories 300 and 304 will be initially described.

The edge data storing memory 300 includes the FIFOs $\mathbf{300}_1$ to $\mathbf{300}_6$ of which there are 6 which is a value obtained by dividing 30 which is the number of rows of the transformation check matrix H' of FIG. 212 by 5 which is the number of rows (unit size P) of the constitutive matrices. The FIFO $\mathbf{300}_y$ (y=1, 2, . . . , and 6) includes storage regions of multiple stages, and messages corresponding to five edges of which the number thereof corresponds to the number of the rows and the number of columns (unit size P) can be simultaneously read from and written in the storage region of each stage. The number of the stages of the storage regions of the FIFO $\mathbf{300}_y$ is 9 which is the maximum number of the number of 1s (Hamming weight) of the transformation check matrix of FIG. 212 in the row direction.

Data (message $v_i$ from the variable nodes) corresponding to the positions of 1s from the first row to the fifth row of the transformation check matrix H' of FIG. 212 is stored in the FIFO $\mathbf{300}_1$ while the data and the respective rows fill in the transverse direction (0 is ignored). That is, when an element in the j-th row and the i-th column is represented as (j, i), data corresponding to the positions of 1s of the 5×5 unit matrix from (1, 1) to (5, 5) of the transformation check matrix H' is stored in the storage region of the first stage of the FIFO $\mathbf{300}_1$. Data corresponding to the positions of 1s of the shift matrix (matrix obtained by cyclic-shifting the 5×5 unit matrix to the right by 3) from (1, 21) to (5, 25) of the transformation check matrix H' is stored in the storage region of the second stage. Similarly, data are stored in the storage regions of the third and eighth stages so as to be associated with the transformation check matrix H'. Data corresponding to the positions of 1s of the shift matrix (matrix obtained by cyclic-shifting a matrix obtained by replacing 1s of the first row of the 5×5 unit matrix with 0s to the right by 1) from (1, 86) to (5, 90) of the transformation check matrix H' is stored in the storage region of the ninth stage.

Data corresponding to the positions of 1s from the sixth row to the tenth row of the transformation check matrix H' of FIG. 212 is stored in the FIFO $\mathbf{300}_2$. That is, data corresponding to the positions of 1s of the first shift matrix constituting the sum matrix (sum matrix which is the sum of the first shift matrix obtained by cyclic-shifting the 5×5 unit matrix to the right by 1 and the second shift matrix obtained by cyclic-shifting the 5×5 unit matrix to the right by 2) from (6, 1) to (10, 5) of the transformation check matrix H' is stored in the storage region of the first stage of the FIFO $\mathbf{300}_2$. Further, data corresponding to the positions of 1s of the second shift matrix constituting the sum matrix from (6, 1) to (10, 5) of the transformation check matrix H' is stored in the storage region of the second stage.

That is, in the case of the constitutive matrices having two or more weights, when the constitutive matrices are represented as the sum of multiple matrices of a P×P unit matrix having a weight of 1, a quasi-unit matrix in which one or more 1s of the elements of 1s of the unit matrix become 0s, and a shift matrix obtained by cyclic-shifting the unit matrix or the quasi-unit matrix, data (messages corresponding to the edges belonging to the unit matrix, the quasi-unit matrix or the shift matrix) corresponding to the positions of 1s of the unit matrix having the weight of 1, the quasi-unit matrix or the shift matrix is stored in the same address (the same FIFO of the FIFOs $\mathbf{300}_1$ to $\mathbf{300}_6$).

Hereinafter, data are stored in the storage regions of the third to ninth stages so as to be associated with the transformation check matrix H'.

Similarly, data are stored in the FIFOs $\mathbf{300}_3$ to $\mathbf{300}_6$ so as to be associated with the transformation check matrix H'.

The edge data storing memory 304 includes FIFOs $\mathbf{304}_1$ to $\mathbf{304}_{18}$ of which there are 18 which is a value obtained by dividing 90 which is the number of rows of the transformation check matrix H' by 5 which is the number of columns (unit size P) of the constitutive matrices. The FIFO $\mathbf{304}_x$ (x=1, 2, . . . , and 18) includes storage regions of multiple stages, and messages corresponding to five edges of which the number thereof corresponds to the number of rows and the number of columns (unit size P) can be simultaneously read from and written in the storage regions of the multiple stages.

Data (messages $u_j$ from the check nodes) corresponding to the positions of 1s from the first column to the fifth column of the transformation check matrix H' of FIG. 212 are stored in the FIFO $\mathbf{304}_1$ while the data and the respective columns fill in the longitudinal direction (0 is ignored). That is, data corresponding to the positions of 1s of the 5×5 unit matrix from (1, 1) to (5, 5) of the transformation check matrix H' is stored in the storage region of the first stage of the FIFO $\mathbf{304}_1$. Data corresponding to the positions of 1s of the first shift matrix constituting the sum matrix (sum matrix of the first shift matrix obtained by cyclic-shifting the 5×5 unit matrix to the right by 1 and the second shift matrix obtained by cyclic-shifting the 5×5 unit matrix to the right by 2) from (6, 1) to (10, 5) of the transformation check matrix H' is stored in the storage region of the second stage. Furthermore, data corresponding to the positions of 1s of the second shift matrix constituting the sum matrix from (6, 1) to (10, 5) of the transformation check matrix H' is stored in the storage region of the third stage.

That is, in the case of the constitutive matrices having two or more weights, when the constitutive matrices are represented as the sum of multiple matrices of a P×P unit matrix having a weight of 1, a quasi-unit matrix in which one or more 1s of the elements of 1s of the unit matrix become 0s, and a shift matrix obtained by cyclic-shifting the unit matrix or the quasi-unit matrix, data (messages corresponding to the edges belonging to the unit matrix, the quasi-unit matrix or the shift matrix) corresponding to the positions of 1s of the unit matrix having the weight of 1, the quasi-unit matrix or the shift matrix is stored in the same address (the same FIFO of the FIFOs $\mathbf{304}_1$ to $\mathbf{304}_{18}$).

Hereinafter, data are stored in the storage regions of the fourth and fifth stages so as to be associated with the transformation check matrix H'. The number of the stages of the storage regions of the FIFO $\mathbf{304}_1$ is 5 which is the maximum number of the number of 1s (Hamming weight) from the first column to the fifth column of the transformation check matrix H' in the row direction.

Similarly, data are stored in the FIFOs $\mathbf{304}_2$ to $\mathbf{304}_3$ so as to be associated with the transformation check matrix H', and the respective lengths thereof (the number of stages) are 5. Similarly, data are stored in the FIFOs $304_4$ to $304_{12}$ so as to be associated with the transformation check matrix H', and the respective lengths thereof are 3. Similarly, data are stored in the FIFOs $304_{13}$ to $304_{18}$ so as to be associated with the transformation check matrix H', and the respective lengths thereof are 2.

Next, the operation of the decoding device of FIG. 213 will be described.

The edge data storing memory 300 includes the 6 FIFOs $300_1$ to $300_6$, and the FIFO for storing data is selected from the FIFOs $300_1$ to $300_6$ based on information (matrix data) D312 indicating a row of the transformation check matrix H' of FIG. 212 to which 5 messages D311 supplied from the cyclic shift circuit 308 at the previous stage belong, and the five messages D311 are sequentially stored in the selected FIFO all at once. When data is read, the edge data storing memory 300 sequentially reads the five messages D$300_1$ from the FIFO $300_1$, and supplies the read messages to the selector 301 at the next stage. After the reading of the messages from the FIFO $300_1$ is finished, the edge data storing memory 300 sequentially reads the messages from the FIFO $300_2$ to $300_6$, and supplies the read messages to the selector 301.

The selector 301 selects the five messages from the FIFO of the FIFOs $300_1$ to $300_6$ from which the data is currently being read in response to a selector signal D301, and supplies the selected messages as messages D302 to the check node calculating unit 302.

The check node calculating unit 302 includes five check node calculators $302_1$ to $302_5$, performs the check node calculation according to Expression (7) by using the messages D302 (D$302_1$ to D$302_5$) (messages $v_i$ of Expression (7)) supplied through the selector 301, and supplies five messages D303 (D$303_1$ to D$303_5$) (messages $u_j$ of Expression (7)) obtained as the result of the check node calculation to the cyclic shift circuit 303.

The cyclic shift circuit 303 performs cyclic-shifting of the five messages D$303_1$ to D$303_5$ obtained in the check node calculating unit 302 based on information (matrix data) D305 indicating the corresponding edge based on how many times the cyclic-shifting is performed on the unit matrix (or the qausi-unit matrix) as the original matrix in the transformation check matrix H', and supplies the result as a message D304 to the edge data storing memory 304.

The edge data storing memory 304 includes the 18 FIFO $304_1$ to $304_{18}$, and the FIFO for storing data is selected from the FIFOs $304_1$ to $304_{18}$ based on information D305 indicating the row of the transformation check matrix H' to which the 5 messages D304 supplied from the cyclic shift circuit 303 at the previous stage belong, and the five messages D304 are sequentially stored in the selected FIFO all at once. When data is read, the edge data storing memory 304 sequentially reads the five messages D$306_1$ from the FIFO $304_1$, and supplies the read messages to the selector 305 at the next stage. After the reading of the data from the FIFO $304_1$ is finished, the edge data storing memory 304 sequentially reads the messages from the FIFO $304_2$ to $304_{18}$, and supplies the read messages to the selector 305.

The selector 305 selects the five messages from the FIFO of the FIFOs $304_1$ to $304_{18}$ from which the data is currently being read in response to a selector signal D307, and supplies the selected messages as messages D308 to the variable node calculating unit 307 and the decoded word calculating unit 309.

Meanwhile, the reception data rearrangement unit 310 rearranges an LDPC code D313 corresponding to the parity check matrix H of FIG. 210 which is received through the communication channel 13 by the column permutation of Expression (12), and supplies the rearranged LDPC code as reception data D314 to the reception data memory 306. The reception data memory 306 calculates reception LLRs (log-likelihood ratios) from the reception data D314 supplied from the reception data rearrangement unit 310, and supplies the reception LLRs as reception values D309 to the variable node calculating unit 307 and the decoded word calculating unit 309 by 5 LLRs all at once.

The variable node calculating unit 307 includes the five variable node calculators $307_1$ to $307_5$, performs the variable node calculation according to Expression (1) by using the messages D308 (D$308_1$ to D$308_5$) (messages $u_j$ of Expression (1)) supplied through the selector 305 and the five reception values D309 (reception values $u_{0i}$ of Expression (1)) supplied from the reception data memory 306, and supplies messages D310 (D$310_1$ to D$310_5$) (messages $v_i$ of Expression (1)) to the cyclic shift circuit 308.

The cyclic shift circuit 308 performs the cyclic-shifting the messages D$310_1$ to D$310_5$ calculated in the variable node calculating unit 307 based on information indicating the corresponding edge based on how many times the cyclic-shifting is performed on the unit matrix (or the qausi-unit matrix) as the original matrix in the transformation check matrix H', and supplies the result as a message D311 to the edge data storing memory 300.

It is possible to perform one decoding process (variable node calculation and check node calculation) on the LDPC code by performing the aforementioned operation once. After the LDPC code is decoded by a predetermined number of times, the decoding device of FIG. 213 obtains a final decoded result and outputs the obtained result in the decoded word calculating unit 309 and the decoded data rearrangement unit 311.

That is, the decoded word calculating unit 309 includes five decoded word calculators $309_1$ to $309_5$, calculates the decoded result (decoded word) based on Expression (5) by using the five messages D308 (D$308_1$ to D$308_5$) (messages $u_j$ of Expression (5)) output from the selector 305 and the five reception values D309 (reception values $u_{0i}$ of Expression (5)) supplied from the reception data memory 306, as the final stage of the multiple decoding processes, and supplies decoded data D315 obtained as the result to the decoded data rearrangement unit 311.

The decoded data rearrangement unit 311 rearranges the decoded data D315 supplied from the decoded word calculating unit 309 by performing reverse permutation of the column permutation of Expression (12) on the decoded data, and outputs the rearranged data as a final decoded result D316.

As described above, by performing one or both of the row permutation and the column permutation on the parity check matrix (original parity check matrix) and transforming the parity check matrix to the parity check matrix (transformation check matrix) capable of being represented as the combination of the P×P unit matrix, the qausi-unit matrix in which one or more 1s of the elements of 1s of the unit matrix become 0s, the shift matrix obtained by cyclic-shifting the unit matrix or the qausi-unit matrix, the sum matrix which is the sum of multiple matrices of the unit matrix, the qausi-unit matrix and the shift matrix, and the P×P 0 matrix, that is, the combination of the constitutive matrices, it is possible to adopt the architecture in which the check node calculation and the variable node calculation are simultaneously performed P times which is less than the number of rows and the number of columns in the decoding of the LDPC code. When the architecture in which the node calculations (the check node calculation and the variable node calculation) are simultaneously performed P times which is less than the number of rows and the number of column of the parity check matrix is adopted, it is possible to allow the operation frequency to fall within the realizable range and to repeatedly perform the decoding multiple times unlike in the case where the node calculations are simultaneously performed by the number equal to the number of rows and the number of columns of the parity check matrix.

Similarly to the decoding device of FIG. 213, for example, the LDPC decoder 166 constituting the reception apparatus 12 of FIG. 207 is configured to perform the LDPC decoding by simultaneously performing the check node calculation and the variable node calculation P times.

That is, for the sake of convenience in the description, when the parity check matrix of the LDPC code output from the LDPC encoder 115 constituting the transmission apparatus 11 of FIG. 8 is, for example, the parity check matrix H which is shown in FIG. 210 and includes the parity matrix having the dual diagonal structure, in the parity interleaver 23 of the transmission apparatus 11, the parity interleaving that interleaves the (K+qx+y+1)-th code bit to the position of the (K+Py+x+1)-th code bit is performed while the information length K is 60, the unit size P is 5 and the divisor q (=M/P) of the parity length M is 6.

As mentioned above, since the parity interleaving corresponds to the column permutation of Expression (12), it is not necessary to perform the column permutation of Expression (12) in the LDPC decoder 166.

For this reason, in the reception apparatus 12 of FIG. 207, the LDPC code on which the parity interleaving has not been performed, that is, the LDPC code on which the column permutation of Expression (12) has been performed is supplied to the LDPC decoder 166 from the group-wise deinterleaver 55, and the same processing as that of the decoding device of FIG. 213 is performed in the LDPC decoder 166 except for the fact that the column permutation of Expression (12) is not performed.

That is, FIG. 214 is a diagram showing a configuration example of the LDPC decoder 166 of FIG. 207.

In FIG. 214, since the LDPC decoder 166 has the same configuration as that of the decoding device of FIG. 213 except for the fact that the reception data rearrangement unit 310 of FIG. 213 is not provided and performs the same processing as that of the decoding device of FIG. 213 except for the fact that the column permutation of Expression (12) is not performed, the description thereof will be omitted.

As stated above, since the LDPC decoder 166 can be configured without including the reception data rearrangement unit 310, it is possible to reduce the scale further than that of the decoding device of FIG. 213.

For the sake of convenience in the description, in FIGS. 210 to 214, the code length N of the LDPC code is 90, the information length K is 60, the unit size (the number of rows and the number of columns of the constitutive matrices) P is 5, and the divisor q (=M/P) of the parity length M is 6. However, the code length N, the information length K, the unit size P, and the divisor q (=M/P) are not limited to the aforementioned values.

That is, in the transmission apparatus 11 of FIG. 8, the LDPC encoder 115 outputs, for example, the LDPC code in which the code length N is 64,800 or 16,200, the information length K is N−Pq(=N−M), the unit size P is 360 and the divisor q is M/P. However, it is possible to apply the LDPC decoder 166 of FIG. 214 to the case where the LDPC decoding is performed by simultaneously performing the check node calculation and the variable node calculation on the LDPC code P times.

Moreover, after the LDPC code is decoded in the LDPC decoder 166, when the part of the parity bits of the decoded result is not necessary and only the information bits of the decoded result are output, it is possible to configure the LDPC decoder 166 without providing the decoded data rearrangement unit 311.

Configuration Example of Block Deinterleaver 54

FIG. 215 is a block diagram showing a configuration example of the block deinterleaver 54 of FIG. 208.

The block deinterleaver 54 has the same configuration as that of the block interleaver 25 described in FIG. 105.

Accordingly, the block deinterleaver 54 includes the storage region called the part 1, and the storage region called the part 2, and both of the parts 1 and 2 are configured in such a manner that columns as the storage regions that store one bit in the row direction and store the predetermined number of bits in the column direction are arranged in the row direction by the number C equal to the number of bits m of the symbol.

The block deinterleaver 54 performs block interleaving by writing and reading the LDPC code in and from the parts 1 and 2.

In the block deinterleaving, the writing of the LDPC code (which is the symbol) is performed in the reading order of the LDPC code by the block interleaver 25 of FIG. 105.

In addition, in the block deinterleaving, the reading of the LDPC code is performed in the writing order of the LDPC code by the block interleaver 25 of FIG. 105.

That is, in the block interleaving performed in the block interleaver 25 of FIG. 105, the LDPC code is written in the column direction and is read in the row direction with respect to the parts 1 and 2. However, in the block deinterleaving performed by the block deinterleaver 54 of FIG. 215, the LDPC code is written in the row direction and is read in the column direction with respect to the parts 1 and 2.

Another Configuration Example of Bit Deinterleaver 165

FIG. 216 is a block diagram showing another configuration example of the bit deinterleaver 165 of FIG. 207.

In the drawing, the parts corresponding to the parts of FIG. 208 will be assigned the same reference numerals, and the description thereof will be appropriately omitted in the following description.

That is, the bit deinterleaver 165 of FIG. 216 has the same configuration as that of FIG. 208 except for the fact that the parity deinterleaver 1011 is newly provided.

In FIG. 216, the bit deinterleaver 165 includes a block deinterleaver 54, a group-wise deinterleaver 55, and a parity deinterleaver 1011, and performs bit interleaving on the code bits of the LDPC code from the demapper 164.

That is, the block deinterleaver 54 performs the block deinterleaving (reverse processing of the block interleaving) corresponding to the block interleaving performed by the block interleaver 25 of the transmission apparatus 11, that is, the block deinterleaving that returns the positions of the code bits switched by the block interleaving to the original positions on the LDPC code from the demapper 164 as a target, and supplies the LDPC code obtained as the result to the group-wise deinterleaver 55.

The group-wise deinterleaver 55 performs the group-wise deinterleaving corresponding to the group-wise interleaving as rearrangement processing performed by the group-wise interleaver 24 of the transmission apparatus 11 on the LDPC code from the block deinterleaver 54 as a target.

The LDPC code obtained as the result of the group-wise deinterleaving is supplied to the parity deinterleaver 1011 from the group-wise deinterleaver 55.

The parity deinterleaver 1011 performs parity deinterleaving (reverse processing of the parity interleaving) corresponding to the parity interleaving performed by the parity interleaver 23 of the transmission apparatus 11, that is, parity deinterleaving that returns the code bits of the LDPC code whose arrangement is changed by the parity interleaving to the original rearrangement on the code bits on which the group-wise deinterleaving in the group-wise deinterleaver 55 has been performed as a target.

The LDPC code obtained as the result of the parity deinterleaving is supplied to the LDPC decoder 166 from the parity deinterleaver 1011.

Accordingly, in the bit deinterleaver 165 of FIG. 216, the LDPC code on which the block deinterleaving, the group-wise deinterleaving and the parity deinterleaving have been performed, that is, the LDPC code obtained by the LDPC encoding according to the parity check matrix H is supplied to the LDPC decoder 166.

The LDPC decoder 166 performs the LDPC decoding on the LDPC code from the bit deinterleaver 165 by using the parity check matrix H used in the LDPC encoding performed by the LDPC encoder 115 of the transmission apparatus 11. That is, the LDPC decoder 166 performs the LDPC decoding on the LDPC code from the bit deinterleaver 165 by using the parity check matrix H (of the DVB method) used in the LDPC encoding performed by the LDPC encoder 115 of the transmission apparatus 11, using the transformation check matrix obtained by at least performing the column permutation corresponding to the parity interleaving on the parity check matrix H (in the ETRI method, parity check matrix (FIG. 28) obtained by performing the column permutation on the parity check matrix (FIG. 27) used in the LDPC encoding), or using the transformation check matrix (FIG. 29) obtained by performing the row permutation on the parity check matrix (FIG. 27) used in the LDPC encoding.

Here, in FIG. 216, since the LDPC code obtained by the LDPC encoding according to the parity check matrix H is supplied to the LDPC decoder 166 from (the parity deinterleaver 1011 of) the bit deinterleaver 165, when the LDPC decoding on the LDPC code is performed using the parity check matrix H (of the DVB method) used in the LDPC encoding performed by the LDPC encoder 115 of the transmission apparatus 11 (in the ETRI method, the parity check matrix (FIG. 28) obtained by performing the column permutation on the parity check matrix (FIG. 27) used in the LDPC encoding), the LDPC decoder 166 may be configured using a decoding device that performs the LDPC decoding using, for example, a full serial decoding scheme in which the calculation of the messages (check node messages and the variable node messages) is sequentially performed on the nodes bit by bit or a decoding device that performs the LDPC decoding using a full parallel decoding scheme in which the calculation of the messages is simultaneously performed on all of the nodes (in parallel).

When the LDPC decoding on the LDPC code is performed using the transformation check matrix obtained by at least performing the column permutation corresponding to the parity interleaving (in the ETRI method, the transformation check matrix (FIG. 29) obtained by performing the row permutation on the parity check matrix (FIG. 27) used in the LDPC encoding) on the parity check matrix H (of the DVB method) used in the LDPC encoding performed by the LDPC encoder 115 of the transmission apparatus 11 in the LDPC decoder 166, the LDPC decoder 166 may be configured as a decoding device of an architecture in which the check node calculation and the variable node calculation are simultaneously performed P (or divisors of P other than 1) times. Here, the decoding device may be a decoding device (FIG. 213) having the reception data rearrangement unit 310 that switches the code bits of the LDPC code by performing the same column permutation as the column permutation (parity interleaving) for obtaining the transformation check matrix on the LDPC code.

For the sake in convenience in the description, in FIG. 216, the block deinterleaver 54 that performs the block deinterleaving, the group-wise deinterleaver 55 that performs the group-wise deinterleaving, and the parity deinterleaver 1011 that performs the parity deinterleaving are individually configured. However, similarly to the parity interleaver 23, the group-wise interleaver 24 and the block interleaver 25 of the transmission apparatus 11, two or more of the block deinterleaver 54, the group-wise deinterleaver 55 and the parity deinterleaver 1011 may be integrally configured.

2. Second Embodiment

However, in ATSC 3.0, two types of methods including a type A and a type B are adopted as the block interleaving method performed in (the block interleaver of) the bit interleaver 116 of FIG. 8.

Here, the block interleaving of the type A is a method in which the writing of the LDPC code on which the group-wise interleaving has been performed in the column direction of columns as m number of storage regions that are arranged in the row direction is iteratively performed on m number of columns. The block interleaving of the type B is a method in which the writing of the LDPC code on which the group-wise interleaving has been performed for every bit group in the row direction of m number of columns is iteratively performed.

As stated above, since the two types of methods including the type A and the type B are adopted as the block interleaving method, in the transmission apparatus 11, when the block interleaving is performed by (the block interleaver) of the bit interleaver 116, the LDPC code is written in and read from the storage regions depending on the type A or the type B.

However, in the block interleaving of the type A and the block interleaving of the type B, since the writing method and a part of the reading method performed on the storage regions are different, it is necessary to provide two types of address generating circuits for generating a write address of the LDPC code and a read address of the LDPC code in (the block interleaver of) the bit interleaver 116.

Similarly, in the reception apparatus 12, even when the block deinterleaving is performed by (the block deinterleaver of) the bit deinterleaver 165, the reading method and a part of the writing method performed on the storage regions are different depending on the type. For this reason, it is necessary to provide two types of address generating circuits for generating a read address of the LDPC code and a write address of the LDPC code in (the block deinterleaver of) the bit deinterleaver 165.

As mentioned above, since it is necessary to provide two types of address generating circuits by adopting two types of method including the type A and the type B as the block interleaving method, it has been requested that the two types of methods including the type A and the type B efficiently coexist by realizing the block interleaving of the type A and the block interleaving of the type B by using a common address generating circuit.

Thus, as the second embodiment, a method of allowing a plurality of block interleaving methods (type A and type B) to efficiently coexist in the data transmission using the LDPC code will be described.

Configuration Example of Bit Interleaver 116

FIG. 217 is a block diagram showing a configuration example of the bit interleaver 116 of FIG. 8.

In the drawing, the parts corresponding to those in FIG. 9 will be assigned the same reference numerals, and the description thereof will be appropriately omitted in the following description.

That is, the bit interleaver 116 of FIG. 217 has the shame configuration as that in FIG. 9 except for the fact that a group-wise interleaver 1021 and a block interleaver 1022 are provided instead of the group-wise interleaver 24 and the block interleaver 25 of FIG. 9.

In FIG. 217, the bit interleaver 116 includes the parity interleaver 23, the group-wise interleaver 1021, and the block interleaver 1022, and performs bit interleaving on the code bits of the LDPC code from the LDPC encoder 115.

The group-wise interleaver 1021 performs group-wise interleaving on the LDPC code from the parity interleaver 23, and supplies the LDPC code on which the group-wise interleaving has been performed to the block interleaver 1022.

Here, when it is assumed that the block interleaving of the type B is performed, the group-wise interleaver 1021 rewrites the GW pattern for the block interleaving of the type B into the GW pattern for the block interleaving of the type A such that when the block interleaving of the type A is performed, the same block interleaving result as that when the block interleaving of the type B is performed is obtained.

Further, when it is assumed that the block interleaving of the type A is performed, the group-wise interleaver 1021 rewrites the GW pattern for the block interleaving of the type A into the GW pattern for the block interleaving of the type B such that when the block interleaving of the type B is performed, the same block interleaving result as that when the block interleaving of the type A is performed is obtained.

For example, the block interleaver 1022 symbolizes the LDPC code corresponding to one code to a m-bit symbol which is a unit of mapping by performing the block interleaving for demultiplexing the LDPC code from the group-wise interleaver 1021, and supplies the symbol to the mapper 117 (FIG. 8).

The block interleaver 1022 corresponds to the block interleaving of the type A or the type B, and can perform the block interleaving of the type A or the type B.

Block Interleaver 1022 Corresponding to Block Interleaving of Type A

Here, the block interleaving of the type A will be described. FIG. 218 is a block diagram showing a configuration example of the block interleaver 1022 (FIG. 217) corresponding to the block interleaving of the type A.

The block interleaver 1022 corresponding to the block interleaving of the type A includes a storage region called a part 1, and a storage region called to a part 2.

Both of the parts 1 and 2 are configured in such a manner that columns as storage regions which store one bit in the row (transverse) direction and store a predetermined number of bits in the column (longitudinal) direction are arranged in the row direction by the number C equal to the number of bits m of the symbol.

When a part column length of the part 1 which is the number of bits stored in the column direction by columns of the part 1 is represented as R1 and a part column length of columns of the part 2 is represented as R2, (R1+R2)×C is equal to the code length N (64,800 bits or 16,200 bits in the second embodiment) of the LDPC code to be subject to the interleaving.

Moreover, the part column length R1 is equal to a multiple of 360 bits which is the unit size P, and the part column length R2 is equal to a remainder obtained by dividing a column length R1+R2 which is the sum of the part column length R1 of the part 1 and the part column length R2 of the part 2 by 360 bits which is the unit size P.

Here, the column length R1+R2 is equal to a value obtained by dividing the code length N of the LDPC code to be subjected to the block interleaving by m which is the number of bits of the symbol.

For example, when the modulation scheme of 16-QAM is performed on the LDPC code having a length code N of 16,200 bits, since the number of bits m of the symbol is 4 bits, the column length R1+R2 is 4,050 (=16,200/4) bits.

Further, since the remainder obtained by dividing the column length R1+R2=4,050 by 360 bits which is the unit size P is 90, the part column length R2 of the part 2 is 90 bits.

The part column length R1 of the part 1 is R1+R2-R2=4,050−90=3,960 bits.

FIG. 219 is a diagram showing the number of columns C of the parts 1 and 2 for combinations of the code lengths N and the modulation schemes and the part column lengths (the number of rows) R1 and R2.

FIG. 219 shows the number of columns C of the parts 1 and 2 for the combinations of the LDPC codes having the code lengths N of 16,200 bits and 64,800 bits and the modulation schemes of QPSK, 16-QAM, 64-QAM, 256-QAM, 1024-QAM, and 4096-QAM and the part column lengths R1 and R2.

FIG. 220 is a diagram for describing the block interleaving of the type A performed in the block interleaver 1022 (FIG. 217).

The block interleaver 1022 performs the block interleaving of the type A by writing and reading the LDPC code in and from the parts 1 and 2.

That is, as shown in FIG. 220A, in the block interleaving of the type A, the writing of the code bits of the LDPC code of one codeword from the top to the bottom (in the column direction) of the columns of the part 1 is performed in the columns from the left to the right.

When the writing of the code bits in the bottommost region of the rightmost column (C-th column) of the columns of the part 1 is ended, the writing of the remaining code bits in the columns of the part 2 from the top to the bottom (in the column direction) is performed in the columns from the left to the right.

Subsequently, when the writing of the code bits in the bottommost region of the rightmost column (C-th column) of the columns of the part 2 is ended, the code bits are read from the first rows of all of C number of columns of the part 1 in the row direction for every C=m bits, as shown in FIG. 220B.

The reading of the code bits from all of C number of columns of the part 1 is sequentially performed in the lower rows, and when the reading from the R1 row which is the last row is ended, the code bits are read from the first rows of all of C number of columns of the part 2 in the row direction for every C=m bits.

The reading of the code bits from all of C number of columns of the part 2 is sequentially performed in the lower rows, and the reading is performed up to the R2 row which is the last row.

In this manner, the code bits read from the parts 1 and 2 for every m bits are supplied as a symbol to the mapper 117 (FIG. 8).

Group-Wise Interleaving

FIG. 221 is a diagram for describing the group-wise interleaving performed in the group-wise interleaver 1021 of FIG. 217.

In the group-wise interleaving, the LDPC code of one codeword is interleaved for every bit group according to a predetermined pattern (hereinafter, referred to as a GW pattern) by using 360 bits corresponding to one group obtained by dividing the LDPC code of one codeword from the leading code for every 360 bits equal to the unit size P into the bit groups.

When the unit size P is 360 bits, the LDPC code having the code length N of, for example, 1,800 bits is divided into 5 (=1,800/360) bit groups of bit groups 0, 1, 2, 3 and 4. For example, the LDPC code having the code length N of 16,200 bits is divided into 45 (=16,200/360) bit groups of bit groups 0, 1, and 44, and the LDPC code having the code length N of 64,800 bits is divided into 180 (=64,800/360) bit groups of bit groups 0, 1, . . . , and 179.

Hereinafter, the (i+1)-th bit group from the leading bit group when the LDPC code of one codeword is divided into the bit groups is represented as a bit group i. In the following description, it is assumed that the GW pattern is represented as the arrangement of numbers representing the bit groups. For example, the GW pattern of 4, 2, 0, 3, 1 for the LDPC code having the code length N of 1,800 bits represents that the arrangement of bit groups 0, 1, 2, 3 and 4 is interleaved (rearranged) into the arrangement of bit groups 4, 2, 0, 3 and 1.

Specific Example of Block Interleaving of Type A

Next, the bit interleaving performed in the bit interleaver 116 including the block interleaver 1022 corresponding to the block interleaving of the type A will be described with reference to FIGS. 222 and 223.

FIG. 222 shows a case 1 where the number of bit groups is $N_g$=12 and the number of columns is $N_c$=4 as a specific example of the block interleaving of the type A. In FIG. 222, each bit group is divided for every 360 bits.

In the case 1 of the block interleaving of the type A, a column length $N_{r1}$ of the part 1 is floor($N_g/N_c$)×360=12/4×360=3×360 bits. Since a column length $N_{r2}$ of the part 2 is ($N_g$×360−$N_{r1}$×$N_c$)/$N_c$=(12×360−3×360×4)/4=0 bits, only the storage region of the part 1 is used, and the storage region of the part 2 is not used. A floor function is a function obtained by rounding numbers after a decimal point.

In FIG. 222, a parity interleaver (PIL) output represents an output from the parity interleaver 23, that is, an input of the group-wise interleaver 1021, and a group-wise interleaver (GWI) output represents an output of the group-wise interleaver 1021. That is, the group-wise interleaver 1021 interleaves the arrangement of bit groups 1, 2, 3, 4, 5, 6, 7, 8, 9, 10, 11, and 12 into the arrangement of bit groups 4, 7, 9, 2, 12, 8, 10, 1, 5, 11, 3, and 6 according to the GW pattern of 4, 7, 9, 2, 12, 8, 10, 1, 5, 11, 3, 6.

The block interleaver 1022 performs the writing of the output from the group-wise interleaver 1021 in the columns of the part 1 from the top to the bottom (in the column direction) in the columns from the left to the right.

Thus, as shown in "block interleaver (BLI) write" of FIG. 222, the code bits of the bit groups 4, 7 and 9 are written in the first column (leftmost column), the code bits of the bit groups 2, 12 and 8 are written in the second column, the code bits of the bit groups 10, 1 and 5 are written in the third column, and the code bits of the bit groups 11, 3 and 6 are written in the fourth column (rightmost column).

Thereafter, the writing of the code bits in the bottommost region of the fourth column (rightmost column) of the columns of the part 1 is ended, as shown in "BLI read" of FIG. 222, the code bits are read from the first rows of all of four columns of the part 1 in the row direction for every C=m bits. The reading of the code bits from all of four columns of the part 1 is sequentially performed in the lower rows, and the reading is performed up to the last row.

In this manner, the code bits read from the part 1 for every m bits are supplied as a symbol to the mapper 117 (FIG. 8). In the mapper 117, the LDPC code from the bit interleaver 116 is mapped to a signal point of 16 ($\mathbf{2^4}$) signal points representing the symbol for every symbol.

FIG. 223 shows a case 2 where the number of bit groups is $N_g$=14 and the number of columns is $N_c$=4 as a specific example of the block interleaving of the type A. In FIG. 223, each bit group is divided for every 360 bits.

In the case 2 of the block interleaving of the type A, a column length $N_{r1}$ of the part 1 is floor($N_g/N_c$)×360=14/4×360=3×360 bits. Since a column length $N_{r2}$ of the part 2 is ($N_g$×360−$N_{r1}$×$N_c$)/$N_c$=(14×360−3×360×4)/4=(2×360)/4=180 bits, the storage region of the part 2 is used in addition to the storage region of the part 1.

In FIG. 223, the PIL output and the GWI output represent the input and output of the group-wise interleaver 1021. That is, the group-wise interleaver 1021 interleaves the arrangement of bit groups 1, 2, 3, 4, 5, 6, 7, 8, 9, 10, 11, 12, 13, and 14 into the arrangement of bit groups 4, 7, 13, 2, 12, 8, 10, 1, 14, 11, 3, 6, 9, and 5 according to the GW pattern of 4, 7, 13, 2, 12, 8, 10, 1, 14, 11, 3, 6, 9, 5.

The block interleaver 1022 performs the writing of the output from the group-wise interleaver 1021 in the columns of the part 1 from the top to the bottom (in the column direction) in the columns from the left to the right. When the writing of the code bits in the bottommost region of the rightmost column of the columns of the part 1 is ended, the writing of the remaining code bits in the columns of the part 2 from the top to the bottom (in the column direction) is performed in the columns from the left to the right.

Thus, as shown in "BLI write" of FIG. 223, in the part 1, the code bits of the bit groups 4, 7, and 13 are written in the first column (leftmost column), the code bits of the bit groups 2, 12, and 8 are written in the second column, the code bits of the bit groups 10, 1, and 14 are written in the third column, and the code bits of the bit groups 11, 3, and 6 are written in the fourth column (rightmost column).

In the part 2, the coding bits of the bit group 9-1 are written in the first column (left most column), the coding bits of the bit group 9-2 are written in the second column, the coding bits of the bit group 5-1 are written in the third column, and the coding bits of the bit group 5-2 are written in the fourth column (rightmost column).

Here, the bit group 9-1 and the bit group 9-2 are respectively 180 bits, and the bit group 9 is formed by these bit groups. The bit group 5-1 and the bit group 5-2 are respectively 180 bits, and the bit group 5 is formed by these bit groups.

Subsequently, when the writing of the cod bits in the bottommost region of the fourth column (rightmost column) of the columns of the part 2 is ended, the code bits are read from the first rows of all of four columns of the part 1 in the row direction for every C=m bits as shown in "BLI read" of FIG. 223.

The writing of the code bits from all of four columns of the part 1 is sequentially performed in the lower rows, and when the reading from the last row is ended, the code bits are read from the first rows of all of four columns of the part 2 in the row direction for every C=m bits.

The reading of the code bits from all of four columns of the part 2 is sequentially performed in the lower rows, and is performed up to the last row.

In this manner, the code bits read from the parts 1 and 2 for every m bits are supplied as the symbol to the mapper 117 (FIG. 8). In the mapper 117, the LDPC code from the bit interleaver 116 is mapped to a signal point of 16 ($2^4$) signal points representing the symbol for every symbol.

Block Interleaver 1022 Corresponding to Block Interleaving of Type B

Next, the block interleaving of the type B will be described. FIG. 224 is a block diagram showing a configuration example of the block interleaver 1022 (FIG. 217) corresponding to the block interleaving of the type B.

The block interleaver 1022 corresponding to the block interleaving of the type B includes a storage region called a part 1, and a storage region called a part 2.

The part 1 is configured in such a manner that columns as storage regions that store one bit in the row (transverse) direction and store a predetermined number of bits in the column (longitudinal) direction are arranged in the row direction by the number C equal to the number of bits m of the symbol. The part 2 is configured in such a manner that rows as storage regions that store one bit in the column (longitudinal) direction and store a predetermined number of bits are arranged in the row (transverse) direction in the row direction.

When a part column length which is the number of bits stored in the column direction by the columns of the part 1 is represented as R1 and a low length of the rows of the part 2 is represented as R2, R1×C+R2 is equal to the code length N (in the second embodiment, 64,800 bits or 16,200 bits) of the LDPC code to be subject to the block interleaving.

The part column length R1 is equal to a multiple of 360 bits which is the unit size P, and the row length R2 is equal to a value obtained by multiplying the remainder when the column length R1+R2/C which is the sum of the part column length R1 of the part 1 and a value obtained by dividing the row length R2 by C is divided by 360 bits which is the unit size P by C.

Here, the column length R1+R2/C is equal to a value obtained by dividing the code length N of the LDPC code to be subject to the block interleaving by the number of bits m of the symbol.

For example, when the 16-QAM modulation scheme is performed on the LDPC code having a code length N of 16,200 bits, since the number of bits m of the symbol is 4 bits, the column length R1+R2/C is 4,050 (=16,200/4) bits.

In addition, the remainder when the column length R1+R2/C=4,050 is divided by 360 bits which is the unit size P is 90, the row length R2 of the part 2 is 360(=90×4) bits.

The part column length R1 of the part 1 is R1+R2/C-R2/4=4,050-90=3,960 bits.

FIG. 225 is a diagram for describing the block interleaving of the type B performed in the block interleaver 1022 (FIG. 217).

The block interleaver 1022 performs the block interleaving of the type B by writing and reading the LDPC code in and from the parts 1 and 2.

That is, as shown in FIG. 225A, in the block interleaving of the type B, the writing of the code bits of the LDPC code of one codeword in the columns of the part 1 from the left to the right (in the row direction) for every bit group is iteratively performed.

When the writing of the code bits in the bottommost region of the rightmost column (C-th column) of the columns of the part 1 is ended, the writing of the remaining code bits is performed in the rows of the part 2 from the left to the right (in the row direction).

Thereafter, when the writing of the code bits in the rightmost row of the rows of the part 2 is ended, the code bits are read from the first rows of all of C number of columns of the part 1 in the row direction for every C=m bits, as shown in FIG. 225B.

The reading of the code bits from all of C number of columns of the part 1 is sequentially performed in the lower rows, and when the reading from the R1 row which is the last row is ended, the code bits are read from the rows of the part 2 from the left to the right (in the row direction) for every C=m bits.

In this manner, the code bits read from the parts 1 and 2 for every m bits are supplied as the symbol to the mapper 117 (FIG. 8).

Specific Example of Block Interleaving of Type B

Next, the bit interleaving performed in the bit interleaver 116 having the block interleaver 1022 corresponding to the block interleaving of the type B will be described with reference to FIGS. 226 and 227.

FIG. 226 shows a case 1 where the number of bit groups is $N_g$=12 and the number of columns is $N_c$=4 as a specific example of the block interleaving of the type B. In FIG. 226, each bit group is divided for every 360 bits.

In the case 1 of the block interleaving of the type B, a column length $N_{r1}$ of the part 1 is floor($N_g/N_c$)×360=12/4×360=3×360 bits. Since a row length $N_{r2}$ of the part 2 is $N_g\lambda 360-N_{r1}\lambda N_c$=12×360−3×360×4=0 bits, only the storage region of the part 1 is used, and the storage region of the part 2 is not used.

In FIG. 226, a PIL output and a GWI output represent an input and an output of the group-wise interleaver 1021. That is, the group-wise interleaver 1021 interleaves the arrangement of bit groups 1, 2, 3, 4, 5, 6, 7, 8, 9, 10, 11, and 12 into the arrangement of bit groups 4, 7, 9, 2, 12, 8, 10, 1, 5, 11, 3, and 6 according to the GW pattern of 4, 7, 9, 2, 12, 8, 10, 1, 5, 11, 3, 6.

The block interleaver 1022 iteratively performs the writing of the output from the group-wise interleaver 1021 in the columns of the part 1 from the left to the right (in the row direction) for every bit group.

Thus, as shown in "BLI write" of FIG. 226, the code bits of the bit groups 4, 12, and 5 are written in the first column (leftmost column), the code bits of the bit groups 7, 8, and 11 are written in the second column, the code bits of the bit groups 9, 10 and 3 are written in the third column, and the code bits of the bit groups 2, 1 and 6 are written in the fourth column (rightmost column).

Thereafter, when the writing of the code bits in the bottommost region of the fourth column (rightmost column) of the part 1 is ended, as shown in "BLI read" of FIG. 226, the code bits are read from the first rows of all of four columns of the part 1 in the row direction for every C=m bits. The reading of the code bits from all of four columns of the part 1 is sequentially performed in the lower rows, and is performed up to the last row.

In this manner, the code bits read from the part 1 for every m bits are supplied as the symbol to the mapper 117 (FIG.

8). In the mapper 117, the LDPC code from the bit interleaver 116 is mapped to a signal point of 16 ($2^4$) signal points representing the symbol for every symbol.

FIG. 227 shows a case 2 where the number of bit groups is $N_g$=14 and the number of columns is $N_c$=4 as a specific example of the block interleaving of the type B. In FIG. 227, each bit group is divided for every 360 bits.

In the case 2 of the block interleaving of the type B, a column length $N_{r1}$ of the part 1 is floor($N_g/N_c$)×360=14/4×360=3×360 bits. Since a row length $N_{r2}$ of the part 2 is $N_g λ 360 - N_{r1} λ N_c$=14×360−3×360×4=2×360 bits, the storage region of the part 2 is used in addition to the storage region of the part 1.

In FIG. 227, a PIL output and a GWI output represent an input and an output of the group-wise interleaver 1021. That is, the group-wise interleaver 1021 interleaves the arrangement of bit groups 1, 2, 3, 4, 5, 6, 7, 8, 9, 10, 11, 12, 13, and 14 into the arrangement of bit groups 4, 7, 13, 2, 12, 8, 10, 1, 14, 11, 3, 6, 9, and 5 according to the GW pattern of 4, 7, 13, 2, 12, 8, 10, 1, 14, 11, 3, 6, 9, 5.

The block interleaver 1022 iteratively performs the writing of the output from the group-wise interleaver 1021 in the columns of the part 1 from the left to the right (in the row direction) for every bit group. When the writing of the code bits in the bottommost region of the rightmost column of the columns of the part 1 is ended, the writing of the remaining code bits is performed on the rows of the part 2 from the left to the right (in the row direction).

Thus, as shown in "BLI write" of FIG. 227, in the part 1, the code bits of the bit groups 4, 12, and 14 are written in the first column (leftmost column), the code bits of the bit groups 7, 8, and 11 are written in the second column, the code bits of the bit groups 13, 10, and 3 are written in the third column, and the code bits of the bit groups 2, 1, and 6 are written in the fourth column (rightmost column). The code bits of the bit groups 9 and 5 are written in the rows of the part 2.

Subsequently, when the writing of the code bits in the rightmost row of the part 2 is ended, the code bits are read from the first rows of all of four columns of the part 1 in the row direction for every C=m bits, as shown in "BLI read" of FIG. 227.

The reading of the code bits from all of four columns of the part 1 is sequentially performed in the lower rows, and when the reading in the last row is ended, the code bits are read from the rows of the part 2 from the left to the right (in the row direction) for every C=m bits. Here, the code bits of the bit groups 9 and 5 written in the rows of the part 2 are read by 4 bits in sequence from the leading bit.

In this manner, the code bits read from the parts 1 and 2 for every m bits are supplied as the symbol to the mapper 117 (FIG. 8). In the mapper 117, the LDPC code from the bit interleaver 116 is mapped to a signal point of 16 ($2^4$) signal points representing the symbol for every symbol.

Rewriting of GW Pattern Depending on Type of Block Interleaving

The group-wise interleaver 1021 has to prepare the GW pattern for the block interleaving of the type A and the GW pattern for the block interleaving of the type B depending on the type of the block interleaving performed in the block interleaver 1022 provided at the latter stage.

In the block interleaving of the type A and the block interleaving of the type B, since the writing method and a part of the reading method performed on the storage regions are different, it is necessary to provide two types of address generating circuits for each type. For this reason, it has been requested that the block interleaving of the type A and the block interleaving of the type B are realized by using a common address generating circuit as described above.

Thus, in the group-wise interleaver 1021, it is possible to realize the common address generating circuit by converting the GW pattern for the block interleaving of the type B into the GW pattern for the block interleaving of the type A or the GW pattern for the block interleaving of the type A into the GW pattern for the block interleaving of the type B.

Here, the rewriting (converting) of the GW pattern performed in the group-wise interleaver 1021 will be described with reference to FIGS. 228 and 229.

FIG. 228 shows a case 1 where the number of bit groups is $N_g$=12 and the number of columns is $N_c$=4 as a specific conversion example of the GW pattern.

In FIG. 228, the block interleaver 1022 corresponding to the block interleaving of the type A is illustrated on the left side in the drawing, and the block interleaver 1022 corresponding to the block interleaving of the type B is illustrated on the right side in the drawing.

Similarly to FIGS. 222 and 226 described above, in FIG. 228, in the block interleaving, only the storage region of the part 1 is used, and the storage region of the part 2 is not used. Each bit group is divided for every 360 bits.

In FIG. 228, a PIL output and a GWI output represent an output and an input of the group-wise interleaver 1021. As shown on the left side in the drawing, the group-wise interleaver 1021 interleaves the arrangement of bit groups 1, 2, 3, 4, 5, 6, 7, 8, 9, 10, 11, and 12 into the number of bit groups 4, 12, 5, 7, 8, 11, 9, 10, 3, 2, 1, and 6, and outputs the interleaved arrangement to the block interleaver 1022 corresponding to the block interleaving of the type A.

That is, the group-wise interleaver 1021 interleaves the arrangement of bit groups 1, 2, 3, 4, 5, 6, 7, 8, 9, 10, 11, and 12 into the arrangement of bit groups 4, 12, 5, 7, 8, 11, 9, 10, 3, 2, 1, and 6 according to the GW pattern of 4, 12, 5, 7, 8, 11, 9, 10, 3, 2, 1, 6 for the block interleaving of the type A.

The block interleaver 1022 corresponding to the block interleaving of the type A performs the writing of the output from the group-wise interleaver 1021 in the columns of the part 1 from the top to the bottom (in the column direction) in the columns from the left to the right.

Thus, as shown in "Type ABLI write" on the left side in the drawing, the code bits of the bit groups 4, 12, and 5 are written in the first column (leftmost column), the code bits of the bit groups 7, 8, and 11 are written in the second column, the code bits of the bit groups 9, 10, and 3 are written in the third column, and the code bits of the bit groups 2, 1, and 6 are written in the fourth column (rightmost column). When the writing of the code bits in the bottommost region of the fourth column of the columns of the part 1 is ended, the writing of the code bits is ended.

Meanwhile, as shown on the right side in the drawing, the group-wise interleaver 1021 interleaves the arrangement of bit groups 1, 2, 3, 4, 5, 6, 7, 8, 9, 10, 11, and 12 into the arrangement of bit groups 4, 7, 9, 2, 12, 8, 10, 1, 5, 11, 3, and 6, and outputs the interleaved arrangement to the block interleaver 1022 corresponding to the block interleaving of the type B.

That is, the group-wise interleaver 1021 interleaves the arrangement of bit groups 1, 2, 3, 4, 5, 6, 7, 8, 9, 10, 11, and 12 into the arrangement of bit groups 4, 7, 9, 2, 12, 8, 10, 1, 5, 11, 3, and 6 according to the GW pattern of 4, 7, 9, 2, 12, 8, 10, 1, 5, 11, 3, 6 for the block interleaving of the type B.

The block interleaver 1022 corresponding to the block interleaving of the type B iteratively performs the writing of the output from the group-wise interleaver 1021 in the columns of the part 1 from the left to the right (in the row direction) for every bit group.

Thus, as shown in "Type B BLI write" on the right side in the drawing, the code bits of the bit groups 4, 12, and 5 are written in the first column (leftmost column), the code bits of the bit groups 7, 8, and 11 are written in the second column, the code bits of the bit groups 9, 10, and 3 are written in the third column, and the code bits of the bit groups 2, 1, and 6 are written in the fourth column (rightmost column). When the writing of the code bits in the bottommost region of the fourth column of the columns of the part 1 is ended, the writing of the code bits is ended.

In this manner, the group-wise interleaver 1021 performs the interleaving according to the GW pattern depending on the type of the block interleaving, and thus, in the block interleaver 1022, the writing results of the code bits written in the columns of the part 1 are the same in the block interleaving of the type A and the block interleaving of the type B.

That is, in both of the block interleaving of the type A and the block interleaving of the type B, the code bits of the bit groups 4, 12, and 5 are written in the first column, the code bits of the bit groups 7, 8, and 11 are written in the second column, the code bits of the bit groups 9, 10, and 3 are written in the third column, the code bits of the bit groups 2, 1, and 6 are written in the fourth column.

As stated above, if the writing results of the code bits written in the columns of the part 1 are the same, it is possible to use the write address generated in any one of the address generating circuit for the block interleaving of the type A and the address generating circuit for the block interleaving of the type B. That is, it is possible to realize the block interleaving of the type A and the block interleaving of the type B by using the common address generating circuit.

Thus, in the group-wise interleaver 1021 of FIG. 228, when it is assumed that the block interleaving of the type B is performed, the GW pattern is rewritten such that the block interleaving result (the writing result of the code bits written in the columns of the part 1) obtained when the block interleaving of the type A is performed is the same as the block interleaving result obtained when the block interleaving of the type B is performed.

For example, in the group-wise interleaver 1021 of FIG. 228, when it is assumed that the block interleaving of the type B is performed, a case 1-1 where the GW pattern of 4, 7, 9, 2, 12, 8, 10, 1, 5, 11, 3, 6 is set as the GW pattern for the block interleaving of the type B is supposed.

In this case 1-1, when the block interleaving is performed in the block interleaver 1022, the group-wise interleaver 1021 rewrites the GW pattern of 4, 7, 9, 2, 12, 8, 10, 1, 5, 11, 3, 6 for the block interleaving of the type B into the GW pattern of 4, 12, 5, 7, 8, 11, 9, 10, 3, 2, 1, 6 for the block interleaving of the type A. Thus, the block interleaving result of the type A performed by the group-wise interleaver 1021 is the same as the block interleaving result of the type B.

In the group-wise interleaver 1021 of FIG. 228, when it is assumed that the block interleaving of the type A is performed, the GW pattern is rewritten such that the block interleaving result (writing result of the code bits written in the columns of the part 1) obtained when the block interleaving of the type B is performed is the same as the block interleaving result obtained when the block interleaving of the type A is performed.

For example, in the group-wise interleaver 1021 of FIG. 228, when it is assumed that the block interleaving of the type A is performed, a case 1-2 where the GW pattern of 4, 12, 5, 7, 8, 11, 9, 10, 3, 2, 1, 6 is set as the GW pattern for the block interleaving of the type A is supposed.

In the case 1-2, when the block interleaving of the type B is performed in the block interleaver 1022, the group-wise interleaver 1021 rewrites the GW pattern of 4, 12, 5, 7, 8, 11, 9, 10, 3, 2, 1, 6 for the block interleaving of the type A into the GW pattern of 4, 7, 9, 2, 12, 8, 10, 1, 5, 11, 3, 6 for the block interleaving of the type B. Thus, the block interleaving result of the type B performed by the group-wise interleaver 1021 is the same as the block interleaving result of the type A.

As mentioned above, it is possible to achieve the common address generating circuit by converting the GW pattern for the block interleaving of the type B into the GW pattern for the block interleaving of the type A or the GW pattern for the block interleaving of the type A into the GW pattern for the block interleaving of the type B by the group-wise interleaver 1021.

Further, since the GW pattern is merely rewritten in the group-wise interleaver 1021 depending on the type of the block interleaving, performance degradation due to the converting of the GW pattern does not occur. For example, when it is assumed that the block interleaving of the type A is performed, since the completely same performance is obtained in the case where the block interleaving of the type A is performed according to the GW pattern for the block interleaving of the type A and the case where the block interleaving of the type B is performed according to the GW pattern for the block interleaving of the type B, the performance degradation due to the converting of the GW pattern does not occur.

Similarly to FIGS. 222 and 226 described above, in the block interleaver 1022 of FIG. 228, the code bits are read from the columns of the part 1. In this manner, the code bits read from the part 1 are supplied as the symbol to the mapper 117 (FIG. 8).

FIG. 229 shows a case 2 where the number of bit groups is $N_g$=14 and the number of columns is $N_c$=4 as a specific conversion example of the GW pattern.

Similarly to FIG. 228 described above, in FIG. 229, the block interleaver 1022 corresponding to the block interleaving of the type A is illustrated on the right side in the drawing, and the block interleaver 1022 corresponding to the block interleaving of the type B is illustrated on the right side in the drawing.

Similarly to FIGS. 223 and 227 described above, in FIG. 229, in the block interleaving, the storage region of the part 2 is used in addition to the storage region of the part 1. Each bit group is divided for every 360 bits.

In FIG. 229, a PIL output and a GWI output represent an input and an output of the group-wise interleaver 1021. As shown on the left side in the drawing, the group-wise interleaver 1021 interleaves the arrangement of bit groups 1, 2, 3, 4, 5, 6, 7, 8, 9, 10, 11, 12, 13, and 14 into the arrangement of bit groups 4, 12, 14, 7, 8, 11, 13, 10, 3, 2, 1, 6, 9, and 5, and outputs the interleaved arrangement to the block interleaver 1022 corresponding to the block interleaving of the type A.

That is, the group-wise interleaver 1021 interleaves the arrangement of bit groups 1, 2, 3, 4, 5, 6, 7, 8, 9, 10, 11, 12, 13, and 14 into the arrangement of bit groups 4, 12, 14, 7, 8, 11, 13, 10, 3, 2, 1, 6, 9, and 5 according to the GW pattern of 4, 12, 14, 7, 8, 11, 13, 10, 3, 2, 1, 6, 9, 5 for the block interleaving of the type A.

The block interleaver 1022 corresponding to the block interleaving of the type A performs the writing of the output from the group-wise interleaver 1021 in the columns of the part 1 from the top to the bottom (in the column direction) in the columns from the left to the right. When the writing of the code bits in the bottommost region of the rightmost column of the columns of the part 1 is ended, the writing of the remaining code bits in the columns of the part 2 from the top to the bottom (in the column direction) is performed in the columns from the left to the right.

Thus, as shown in "Type A BLI write" on the left side in the drawing, the code bits of the bit groups 4, 12, and 14 are written in the first column (leftmost column), the code bits of the bit groups 7, 8 and 11 are written in the second column, the code bits of the bit groups 13, 10, and 3 are written in the third column, and the code bits of the bit groups 2, 1, and 6 are written in the fourth column (rightmost column).

In the part 2, the coding bits of the bit group 9-1 are written in the first column (leftmost column), the coding bits of the bit group 9-2 are written in the second column, the coding bits of the bit group 5-1 are written in the third column, and the coding bits of the bit group 5-2 are written in the fourth column (rightmost column).

Here, the bit group 9-1 and the bit group 9-2 are respectively 180 bits, and the bit group 9 is formed by these groups. Further, the bit group 5-1 and the bit group 5-2 are respectively 180 bits, and the bit group 5 is formed by these groups. When the writing of the code bits in the bottommost region of the fourth column of the columns of the part 2 is ended, the writing of the code bits is ended.

Meanwhile, as shown on the right side in the drawing, the group-wise interleaver 1021 interleaves the arrangement of bit groups 1, 2, 3, 4, 5, 6, 7, 8, 9, 10, 11, 12, 13, and 14 into the arrangement of bit groups 4, 7, 13, 2, 12, 8, 10, 1, 14, 11, 3, 6, 9, and 5, and outputs the interleaved arrangement to the block interleaver 1022 corresponding to the block interleaving of the type B.

That is, the group-wise interleaver 1021 interleaves the arrangement of bit groups 1, 2, 3, 4, 5, 6, 7, 8, 9, 10, 11, 12, 13, and 14 into the arrangement of bit groups 4, 7, 13, 2, 12, 8, 10, 1, 14, 11, 3, 6, 9, and 5 according to the GW pattern of 4, 7, 13, 2, 12, 8, 10, 1, 14, 11, 3, 6, 9, 5 for the block interleaving of the type B.

The block interleaver 1022 corresponding to the block interleaving of the type B iteratively performs the writing of the output from the group-wise interleaver 1021 in the columns of the part 1 from the left to the right (in the row direction) for every bit group. When the writing of the code bits in the bottommost region of the rightmost column of the columns of the part 1 is ended, the writing of the remaining code bits in the rows of the part 2 from the left to the right (in the row direction) is performed.

Thus, as shown in "Type B BLI write" on the right side in the drawing, the code bits of the bit groups 4, 12, and 14 are written in the first column (leftmost column), the code bits of the bit groups 7, 8 and 11 are written in the second column, the code bits of the bit groups 13, 10, and 3 are written in the third column, and the code bits of the bit groups 2, 1, and 6 are written in the fourth column (rightmost column). The code bits of the bit groups 9, and 5 are written in the rows of the part 2. When the writing of the code bits in the rightmost row of the rows of the part 2 is ended, the writing of the code bits is ended.

In this manner, the group-wise interleaver 1021 performs the interleaving according to the GW pattern depending on the type of the block interleaving, and thus, the writing results of the code bits written in the columns of the part 1 are the same in the block interleaving of the type A and the block interleaving of the type B in the block interleaver 1022.

That is, in both of the block interleaving of the type A and the block interleaving of the type B, the code bits of the bit groups 4, 12, and 14 are written in the first column, the code bits of the bit groups 7, 8, and 11 are written in the second column, the code bits of the bit groups 13, 10, and 3 are written in the third column, and the code bits of the bit groups 2, 1, and 6 are written in the fourth column.

Similarly to FIG. 228 described above, if the writing results of the code bits written in the columns of the part 1 are the same, it is possible to realize the block interleaving of the type A and the block interleaving of the type B by using the common address generating circuit.

Thus, in the group-wise interleaver 1021 of FIG. 229, when it is assumed that the block interleaving of the type B is performed, the GW pattern is rewritten such that the block interleaving result (writing result of the code bits written in the columns of the part 1) obtained when the block interleaving of the type A is performed is the same as the block interleaving result obtained when the block interleaving of the type B is performed.

For example, in the group-wise interleaver 1021 of FIG. 229, when it is assumed that the block interleaving of the type B is performed, a case 2-1 where the GW pattern of 4, 7, 13, 2, 12, 8, 10, 1, 14, 11, 3, 6, 9, 5 is set as the GW pattern for the block interleaving of the type B is supposed.

In the case 2-1, when the block interleaving of the type A is performed in the block interleaver 1022, the group-wise interleaver 1021 rewrites the GW pattern of 4, 7, 13, 2, 12, 8, 10, 1, 14, 11, 3, 6, 9, 5 for the block interleaving of the type B into the GW pattern of 4, 12, 14, 7, 8, 11, 13, 10, 3, 2, 1, 6, 9, 5 for the block interleaving of the type A. Thus, the block interleaving result of the type A performed by the group-wise interleaver 1021 is the same as the block interleaving result of the type B.

In the group-wise interleaver 1021 of FIG. 229, when it is assumed that the block interleaving of the type A is performed, the GW pattern is rewritten such that the block interleaving result (writing result of the code bits written in the columns of the part 1) obtained when the block interleaving of the type B is performed is the same as the block interleaving result obtained when the block interleaving of the type A is performed.

For example, in the group-wise interleaver 1021 of FIG. 229, when it is assumed that the block interleaving of the type A is performed, a case 2-2 where the GW pattern of 4, 12, 14, 7, 8, 11, 13, 10, 3, 2, 1, 6, 9, 5 is set as the GW pattern for the block interleaving of the type A is supposed.

In this case 2-2, when the block interleaving of the type B is performed in the block interleaver 1022, the group-wise interleaver 1021 rewrites the GW pattern of 4, 12, 14, 7, 8, 11, 13, 10, 3, 2, 1, 6, 9, 5 for the block interleaving of the type A into the GW pattern of 4, 7, 13, 2, 12, 8, 10, 1, 14, 11, 3, 6, 9, 5 for the block interleaving of the type B. Thus, the block interleaving result of the type B performed by the group-wise interleaver 1021 is the same as the block interleaving result of the type A.

In this manner, it is possible to realize the common address generating circuit of the columns of the part 1 by converting the GW pattern for the block interleaving of the type B into the GW pattern for the block interleaving of the type A or the GW pattern for the block interleaving of the type A into the GW pattern for the block interleaving of the type B by the group-wise interleaver 1021.

Moreover, since the GW pattern is merely rewritten depending on the type of the block interleaving in the group-wise interleaver 1021, performance degradation due to the GW pattern does not occur. For example, when it is assumed that the block interleaving of the type B is performed, since the completely same performance is obtained in the case where the block interleaving of the type B is performed according to the GW pattern for the block interleaving of the type B and the case where the block interleaving of the type A is performed according to the GW pattern for the block interleaving of the rewritten type A, the performance degradation due to the converting of the GW pattern does not occur.

Here, since the write addresses of the code bits are different in the block interleaving of the type A and the block interleaving of the type B for (the storage region) of the part 2, it is necessary to provide the address generating circuit for each type.

Similarly to FIGS. 223 and 227 described above, in the block interleaver 1022 of FIG. 229, the code bits are read from (the storage regions of) the part 1 and the part 2. In this manner, the code bits read from (the storage regions of) the part 1 and the part 2 are supplied as the symbol to the mapper 117 (FIG. 8).

Example of GW Pattern Set to MODCOD (LDPC Code of 64 k Bits)

FIG. 230 shows an example of the GW pattern set to the MODCOD which is the combination of the LDPC code of 64 k bits and the modulation scheme.

In FIG. 230, a case where "A"s are described in MODCODs which are combinations of code rates (CR) of 12 types of LDPC codes and 6 types of modulation schemes (MODs) means that it is assumed that the block interleaving of the type A is performed, and the GW patterns for the block interleaving of the type A are set to the MODCODs. A case where "B"s are described in MODCODS means that it is assumed that the block interleaving of the type B is performed, and the GW patterns for the block interleaving of the type B are set to the MODCODs.

In FIG. 230, in the MODCOD in which the modulation scheme is QPSK (MOD 2) and the code rate r of the LDPC code of 64 k bits is 2/15, it is assumed that the block interleaving of the type A is performed. Similarly, in the MODCODs in which the modulation scheme is QPSK (MOD 2) and the code rates r of the LDPC code of 64 k bits are 3/15, 4/15, 5/15, 6/15, 7/15, 8/15, 9/15, 10/15, 11/15, 12/15, and 13/15, it is assumed that the block interleaving of the type A is performed.

In FIG. 230, in the MODCODs in which the modulation scheme is 16-QAM (MOD 4) and the code rates r of the LDPC code of 64 k bits are 2/15, 3/15, 4/15, 6/15, 7/15, 10/15, 11/15, 12/15, and 13/15, it is assumed that the block interleaving of the type A is performed. Meanwhile, in the MODCODs in which the modulation scheme is 16-QAM (MOD 4) and the code rates r of the LDPC code of 64 k bits are 5/15, 8/15, and 9/15, it is assumed that the block interleaving of the type B is performed.

In FIG. 230, in the MODCODs in which the modulation scheme is 64-QAM (MOD 6) and the code rates r of the LDPC code of 64 k bits are 2/15, 3/15, 4/15, 5/15, 6/15, 8/15, 11/15, and 12/15, it is assumed that the block interleaving of the type A is performed. Meanwhile, in the MODCODs in which the modulation scheme is 64-QAM (MOD 6) and the code rates r of the LDPC code of 64 k bits are 7/15, 9/15, 10/15, and 13/15, it is assumed that the block interleaving of the type B is performed.

In FIG. 230, in the MODCODs in which the modulation scheme is 256-QAM (MOD 8) and the code rates r of the LDPC code of 64 k bits are 2/15, 3/15, 4/15, 9/15, and 12/15, it is assumed that the block interleaving of the type A is performed. Meanwhile, in the MODCODs in which the modulation scheme is 256-QAM (MOD 8) and the code rates r of the LDPC code of 64 k bits are 5/15, 6/15, 7/15, 8/15, 10/15, 11/15, and 13/15, it is assumed that the block interleaving of the type B is performed.

In FIG. 230, in the MODCODs in which the modulation scheme is 1024-QAM (MOD 10) and the code rates r of the LDPC code of 64 k bits are 2/15, 3/15, 4/15, 6/15, 8/15, 12/15, and 13/15, it is assumed that the block interleaving of the type A is performed. Meanwhile, in the MODCODs in which the modulation scheme is 1024-QAM (MOD 10) and the code rates r of the LDPC code of 64 k bits are 5/15, 7/15, 9/15, 10/15, and 11/15, it is assumed that the block interleaving of the type B is performed.

In FIG. 230, in the MODCODs in which the modulation scheme is 4096-QAM (MOD 12) and the code rates r of the LDPC code of 64 k bits are 2/15, 3/15, 4/15, 5/15, 6/15, 7/15, 8/15, 9/15, 10/15, 11/15, 12/15, and 13/15, it is assumed that the block interleaving of the type A is performed.

As stated above, the GW pattern for the block interleaving of the type A or the GW pattern for the block interleaving of the type B are set for each MODCOD which is the combination of the LDPC code of 64 k bits and the modulation scheme depending on the assumed type.

As described above, in the group-wise interleaver 1021, when it is assumed that the block interleaving of the type B is performed, the GW pattern for the block interleaving of the type B is rewritten into the GW pattern for the block interleaving of the type A such that the block interleaving result obtained when the block interleaving of the type A is performed is the same as the block interleaving result obtained when the block interleaving of the type B is performed.

Further, in the group-wise interleaver 1021, when it is assumed that the block interleaving of the type A is performed, the GW pattern for the block interleaving of the type A is rewritten into the GW pattern for the block interleaving of the type B such that the block interleaving result obtained when the block interleaving of the type B is performed is the same as the block interleaving result obtained when the block interleaving of the type A is performed.

Hereinafter, as a specific example of the GW pattern set to each MODCOD shown in FIG. 230, the GW pattern (hereinafter, referred to as an original GW pattern) for the block interleaving of the assumed type and the GW pattern rewritten (hereinafter, referred to as a converted pattern) in order to perform the block interleaving of the type different from the assumed type will be described. It is possible to apply the uniform constellation (UC) or the non-uniform constellation (NUC) to the QAM constellation such as 16-QAM.

In each MODCOD, when the GW pattern for the block interleaving of the type A is set as the original GW pattern (A), the GW pattern for the block interleaving of the type B is set as the converted GW pattern (B). By contrast, when the GW pattern for the block interleaving of the type B is set as the original GW pattern (B), the GW pattern for the block interleaving of the type A is set as the converted GW pattern (A).

FIG. 231 is a diagram showing an example of the GW pattern for the LDPC code having a code length N of 64 k bits when the modulation scheme is QPSK and the code rate r is 2/15.

According to the original GW pattern (A) of FIG. 231, the arrangement of bit groups 0 to 179 of the LDPC code of 64 k bits is interleaved into the arrangement of bit groups 70, 149, 136, 153, 104, 110, 134, 61, 129, 126, 58, 150, 177, 168, 78, 71, 120, 60, 155, 175, 9, 161, 103, 123, 91, 173, 57, 106, 143, 151, 89, 86, 35, 77, 133, 31, 7, 23, 51, 5, 121, 83, 64, 176, 119, 98, 49, 130, 128, 79, 162, 32, 172, 87, 131, 45, 114, 93, 96, 39, 68, 105, 85, 109, 13, 33, 145, 18, 12, 54, 111, 14, 156, 8, 16, 73, 2, 84, 47, 42, 101, 63, 88, 25, 52, 170, 24, 69, 142, 178, 20, 65, 97, 66, 80, 11, 59, 19, 115, 154, 26, 147, 28, 50, 160, 102, 55, 139, 125, 116, 138, 167, 53, 169, 165, 99, 159, 148, 179, 0, 146, 90, 6, 100, 74, 117, 48, 75, 135, 41, 137, 76, 92, 164, 113, 152, 72, 36, 3, 163, 15, 46, 21, 44, 108, 34, 56, 140, 127, 158, 94, 67, 122, 1, 27, 171, 30, 157, 112, 81, 118, 43, 29, 124, 22, 62, 37, 40, 4, 107, 166, 82, 95, 10, 144, 141, 132, 174, 38, and 17.

According to the converted GW pattern (B) of FIG. 231, the arrangement of bit groups 0 to 179 of the LDPC code of 64 k bits is interleaved into the arrangement of bit groups 70, 20, 149, 65, 136, 97, 153, 66, 104, 80, 110, 11, 134, 59, 61, 19, 129, 115, 126, 154, 58, 26, 150, 147, 177, 28, 168, 50, 78, 160, 71, 102, 120, 55, 60, 139, 155, 125, 175, 116, 9, 138, 161, 167, 103, 53, 123, 169, 91, 165, 173, 99, 57, 159, 106, 148, 143, 179, 151, 0, 89, 146, 86, 90, 35, 6, 77, 100, 133, 74, 31, 117, 7, 48, 23, 75, 51, 135, 5, 41, 121, 137, 83, 76, 64, 92, 176, 164, 119, 113, 98, 152, 49, 72, 130, 36, 128, 3, 79, 163, 162, 15, 32, 46, 172, 21, 87, 44, 131, 108, 45, 34, 114, 56, 93, 140, 96, 127, 39, 158, 68, 94, 105, 67, 85, 122, 109, 1, 13, 27, 33, 171, 145, 30, 18, 157, 12, 112, 54, 81, 111, 118, 14, 43, 156, 29, 8, 124, 16, 22, 73, 62, 2, 37, 84, 40, 47, 4, 42, 107, 101, 166, 63, 82, 88, 95, 25, 10, 52, 144, 170, 141, 24, 132, 69, 174, 142, 38, 178, and 17.

FIG. 232 is a diagram showing an example of the GW pattern for the LDPC code having the code length N of 64 k bits when the modulation scheme is QPSK and the code rate r is 3/15.

According to the original GW pattern (A) of FIG. 232, the arrangement of bit groups 0 to 179 of the LDPC code of 64 k bits is interleaved into the arrangement of bit groups 75, 170, 132, 174, 7, 111, 30, 4, 49, 133, 50, 160, 92, 106, 27, 126, 116, 178, 41, 166, 88, 84, 80, 153, 103, 51, 58, 107, 167, 39, 108, 24, 145, 96, 74, 65, 8, 40, 76, 140, 44, 68, 125, 119, 82, 53, 152, 102, 38, 28, 86, 162, 171, 61, 93, 147, 117, 32, 150, 26, 59, 3, 148, 173, 141, 130, 154, 97, 33, 172, 115, 118, 127, 6, 16, 0, 143, 9, 100, 67, 98, 110, 2, 169, 47, 83, 164, 155, 123, 159, 42, 105, 12, 158, 81, 20, 66, 57, 121, 25, 1, 90, 175, 35, 60, 79, 87, 135, 10, 139, 156, 177, 77, 89, 73, 113, 52, 109, 134, 36, 176, 54, 69, 146, 31, 15, 71, 18, 95, 124, 85, 14, 78, 129, 161, 19, 72, 13, 122, 21, 63, 137, 120, 144, 91, 157, 48, 34, 46, 22, 29, 104, 45, 56, 151, 62, 43, 94, 163, 99, 64, 138, 101, 23, 11, 17, 136, 128, 114, 112, 165, 5, 142, 179, 37, 70, 131, 55, 168, and 149.

According to the converted GW pattern (B) of FIG. 232, the arrangement of bit groups 0 to 179 of the LDPC code of 64 k bits is interleaved into the arrangement of bit groups 75, 42, 170, 105, 132, 12, 174, 158, 7, 81, 111, 20, 30, 66, 4, 57, 49, 121, 133, 25, 50, 1, 160, 90, 92, 175, 106, 35, 27, 60, 126, 79, 116, 87, 178, 135, 41, 10, 166, 139, 88, 156, 84, 177, 80, 77, 153, 89, 103, 73, 51, 113, 58, 52, 107, 109, 167, 134, 39, 36, 108, 176, 24, 54, 145, 69, 96, 146, 74, 31, 65, 15, 8, 71, 40, 18, 76, 95, 140, 124, 44, 85, 68, 14, 125, 78, 119, 129, 82, 161, 53, 19, 152, 72, 102, 13, 38, 122, 28, 21, 86, 63, 162, 137, 171, 120, 61, 144, 93, 91, 147, 157, 117, 48, 32, 34, 150, 46, 26, 22, 59, 29, 3, 104, 148, 45, 173, 56, 141, 151, 130, 62, 154, 43, 97, 94, 33, 163, 172, 99, 115, 64, 118, 138, 127, 101, 6, 23, 16, 11, 0, 17, 143, 136, 9, 128, 100, 114, 67, 112, 98, 165, 110, 5, 2, 142, 169, 179, 47, 37, 83, 70, 164, 131, 155, 55, 123, 168, 159, and 149.

FIG. 233 is a diagram showing an example of the GW pattern for the LDPC code having the code length N of 64 k bits when the modulation scheme is QPSK and the code rate r is 4/15.

According to the original GW pattern (A) of FIG. 233, the arrangement of bit groups 0 to 179 of the LDPC code of 64 k bits is interleaved into the arrangement of bit groups 141, 86, 22, 20, 176, 21, 37, 82, 6, 122, 130, 40, 62, 44, 24, 117, 8, 145, 36, 79, 172, 149, 127, 163, 9, 160, 73, 100, 16, 153, 124, 110, 49, 154, 152, 4, 168, 54, 177, 158, 113, 57, 2, 102, 161, 147, 18, 103, 1, 41, 104, 144, 39, 105, 131, 77, 69, 108, 159, 61, 45, 156, 0, 83, 157, 119, 112, 118, 92, 109, 75, 67, 142, 96, 51, 139, 31, 166, 179, 89, 167, 23, 34, 60, 93, 165, 128, 90, 19, 33, 70, 173, 174, 129, 55, 98, 88, 97, 146, 123, 84, 111, 132, 71, 140, 136, 10, 115, 63, 46, 42, 50, 138, 81, 59, 53, 15, 52, 72, 164, 150, 29, 17, 91, 101, 14, 38, 35, 66, 64, 7, 125, 151, 56, 126, 171, 68, 121, 28, 65, 106, 78, 47, 143, 12, 169, 120, 27, 74, 48, 133, 43, 116, 137, 94, 3, 25, 134, 13, 107, 162, 32, 99, 85, 175, 80, 170, 5, 135, 178, 11, 26, 76, 95, 87, 155, 58, 30, 148, and 114.

According to the converted GW pattern (B) of FIG. 233, the arrangement of bit groups 0 to 179 of the LDPC code of 64 k bits is interleaved into the arrangement of bit groups 141, 70, 86, 173, 22, 174, 20, 129, 176, 55, 21, 98, 37, 88, 82, 97, 6, 146, 122, 123, 130, 84, 40, 111, 62, 132, 44, 71, 24, 140, 117, 136, 8, 10, 145, 115, 36, 63, 79, 46, 172, 42, 149, 50, 127, 138, 163, 81, 9, 59, 160, 53, 73, 15, 100, 52, 16, 72, 153, 164, 124, 150, 110, 29, 49, 17, 154, 91, 152, 101, 4, 14, 168, 38, 54, 35, 177, 66, 158, 64, 113, 7, 57, 125, 2, 151, 102, 56, 161, 126, 147, 171, 18, 68, 103, 121, 1, 28, 41, 65, 104, 106, 144, 78, 39, 47, 105, 143, 131, 12, 77, 169, 69, 120, 108, 27, 159, 74, 61, 48, 45, 133, 156, 43, 0, 116, 83, 137, 157, 94, 119, 3, 112, 25, 118, 134, 92, 13, 109, 107, 75, 162, 67, 32, 142, 99, 96, 85, 51, 175, 139, 80, 31, 170, 166, 5, 179, 135, 89, 178, 167, 11, 23, 26, 34, 76, 60, 95, 93, 87, 165, 155, 128, 58, 90, 30, 19, 148, 33, and 114.

FIG. 234 is a diagram showing an example of the GW pattern for the LDPC code having the code length N of 64 k bits when the modulation scheme is QPSK and the code rate r is 5/15.

According to the original GW pattern (A) of FIG. 234, the arrangement of bit groups 0 to 179 of the LDPC code of 64 k bits is interleaved into the arrangement of bit groups 39, 47, 96, 176, 33, 75, 165, 38, 27, 58, 90, 76, 17, 46, 10, 91, 133, 69, 171, 32, 117, 78, 13, 146, 101, 36, 0, 138, 25, 77, 122, 49, 14, 125, 140, 93, 130, 2, 104, 102, 128, 4, 111, 151, 84, 167, 35, 127, 156, 55, 82, 85, 66, 114, 8, 147, 115, 113, 5, 31, 100, 106, 48, 52, 67, 107, 18, 126, 112, 50, 9, 143, 28, 160, 71, 79, 43, 98, 86, 94, 64, 3, 166, 105, 103, 118, 63, 51, 139, 172, 141, 175, 56, 74, 95, 29, 45, 129, 120, 168, 92, 150, 7, 162, 153, 137, 108, 159, 157, 173, 23, 89, 132, 57, 37, 70, 134, 40, 21, 149, 80, 1, 121, 59, 110, 142, 152, 15, 154, 145, 12, 170, 54, 155, 99, 22, 123, 72, 177, 131, 116, 44, 158, 73, 11, 65, 164, 119, 174, 34, 83, 53, 24, 42, 60, 26, 161, 68, 178, 41, 148, 109, 87, 144, 135, 20, 62, 81, 169, 124, 6, 19, 30, 163, 61, 179, 136, 97, 16, and 88.

According to the converted GW pattern (B) of FIG. 234, the arrangement of bit groups 0 to 179 of the LDPC code of 64 k bits is interleaved into the arrangement of bit groups 39, 141, 47, 175, 96, 56, 176, 74, 33, 95, 75, 29, 165, 45, 38, 129, 27, 120, 58, 168, 90, 92, 76, 150, 17, 7, 46, 162, 10, 153, 91, 137, 133, 108, 69, 159, 171, 157, 32, 173, 117, 23, 78, 89, 13, 132, 146, 57, 101, 37, 36, 70, 0, 134, 138, 40, 25, 21, 77, 149, 122, 80, 49, 1, 14, 121, 125, 59, 140, 110, 93, 142, 130, 152, 2, 15, 104, 154, 102, 145, 128, 12, 4, 170, 111, 54, 151, 155, 84, 99, 167, 22, 35, 123, 127, 72, 156, 177, 55, 131, 82, 116, 85, 44, 66, 158, 114, 73, 8, 11, 147, 65, 115, 164, 113, 119, 5, 174, 31, 34, 100, 83, 106, 53, 48, 24, 52, 42, 67, 60, 107, 26, 18, 161, 126, 68, 112, 178, 50, 41, 9, 148, 143, 109, 28, 87, 160, 144, 71, 135, 79, 20, 43, 62, 98, 81, 86, 169, 94, 124, 64, 6, 3, 19, 166, 30, 105, 163, 103, 61, 118, 179, 63, 136, 51, 97, 139, 16, 172, and 88.

FIG. 235 is a diagram showing an example of the GW pattern for the LDPC code having the code length N of 64 k bits when the modulation scheme is QPSK and the code rate r is 6/15.

According to the original GW pattern (A) of FIG. 235, the arrangement of bit groups 0 to 179 of the LDPC code of 64 k bits is interleaved into the arrangement of bit groups 0, 14, 19, 21, 2, 11, 22, 9, 8, 7, 16, 3, 26, 24, 27, 80, 100, 121, 107, 31, 36, 42, 46, 49, 75, 93, 127, 95, 119, 73, 61, 63, 117, 89, 99, 129, 52, 111, 124, 48, 122, 82, 106, 91, 92, 71, 103, 102, 81, 113, 101, 97, 33, 115, 59, 112, 90, 51, 126, 85, 123, 40, 83, 53, 69, 70, 132, 134, 136, 138, 140, 142, 144, 146, 148, 150, 152, 154, 156, 158, 160, 162, 164, 166, 168, 170, 172, 174, 176, 178, 4, 5, 10, 12, 20, 6, 18, 13, 17, 15, 1, 29, 28, 23, 25, 67, 116, 66, 104, 44, 50, 47, 84, 76, 65, 130, 56, 128, 77, 39, 94, 87, 120, 62, 88, 74, 35, 110, 131, 98, 60, 37, 45, 78, 125, 41, 34, 118, 38, 72, 108, 58, 43, 109, 57, 105, 68, 86, 79, 96, 32, 114, 64, 55, 30, 54, 133, 135, 137, 139, 141, 143, 145, 147, 149, 151, 153, 155, 157, 159, 161, 163, 165, 167, 169, 171, 173, 175, 177, and 179.

According to the converted GW pattern (B) of FIG. 235, the arrangement of bit groups 0 to 179 of the LDPC code of 64 k bits is interleaved into the arrangement of bit groups 0, 4, 14, 5, 19, 10, 21, 12, 2, 20, 11, 6, 22, 18, 9, 13, 8, 17, 7, 15, 16, 1, 3, 29, 26, 28, 24, 23, 27, 25, 80, 67, 100, 116, 121, 66, 107, 104, 31, 44, 36, 50, 42, 47, 46, 84, 49, 76, 75, 65, 93, 130, 127, 56, 95, 128, 119, 77, 73, 39, 61, 94, 63, 87, 117, 120, 89, 62, 99, 88, 129, 74, 52, 35, 111, 110, 124, 131, 48, 98, 122, 60, 82, 37, 106, 45, 91, 78, 92, 125, 71, 41, 103, 34, 102, 118, 81, 38, 113, 72, 101, 108, 97, 58, 33, 43, 115, 109, 59, 57, 112, 105, 90, 68, 51, 86, 126, 79, 85, 96, 123, 32, 40, 114, 83, 64, 53, 55, 69, 30, 70, 54, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, and 179.

FIG. 236 is a diagram showing an example of the GW pattern for the LDPC code having the code length N of 64 k bits when the modulation scheme is QPSK and the code rate r is 7/15.

According to the original GW pattern (A) of FIG. 236, the arrangement of bit groups 0 to 179 of the LDPC code of 64 k bits is interleaved into the arrangement of bit groups 152, 172, 113, 167, 100, 163, 159, 144, 114, 47, 161, 125, 99, 89, 179, 123, 149, 177, 1, 132, 37, 26, 16, 57, 166, 81, 133, 112, 33, 151, 117, 83, 52, 178, 85, 124, 143, 28, 59, 130, 31, 157, 170, 44, 61, 102, 155, 111, 153, 55, 54, 176, 17, 68, 169, 20, 104, 38, 147, 7, 174, 6, 90, 15, 56, 120, 13, 34, 48, 122, 110, 154, 76, 64, 75, 84, 162, 77, 103, 156, 128, 150, 87, 27, 42, 3, 23, 96, 171, 145, 91, 24, 78, 5, 69, 175, 8, 29, 106, 137, 131, 43, 93, 160, 108, 164, 12, 140, 71, 63, 141, 109, 129, 82, 80, 173, 105, 9, 66, 65, 92, 32, 41, 72, 74, 4, 36, 94, 67, 158, 10, 88, 142, 45, 126, 2, 86, 118, 73, 79, 121, 148, 95, 70, 51, 53, 21, 115, 135, 25, 168, 11, 136, 18, 138, 134, 119, 146, 0, 97, 22, 165, 40, 19, 60, 46, 14, 49, 139, 58, 101, 39, 116, 127, 30, 98, 50, 107, 35, and 62.

According to the converted GW pattern (B) of FIG. 236, the arrangement of bit groups 0 to 179 of the LDPC code of 64 k bits is interleaved into the arrangement of bit groups 152, 91, 172, 24, 113, 78, 167, 5, 100, 69, 163, 175, 159, 8, 144, 29, 114, 106, 47, 137, 161, 131, 125, 43, 99, 93, 89, 160, 179, 108, 123, 164, 149, 12, 177, 140, 1, 71, 132, 63, 37, 141, 26, 109, 16, 129, 57, 82, 166, 80, 81, 173, 133, 105, 112, 9, 33, 66, 151, 65, 117, 92, 83, 32, 52, 41, 178, 72, 85, 74, 124, 4, 143, 36, 28, 94, 59, 67, 130, 158, 31, 10, 157, 88, 170, 142, 44, 45, 61, 126, 102, 2, 155, 86, 111, 118, 153, 73, 55, 79, 54, 121, 176, 148, 17, 95, 68, 70, 169, 51, 20, 53, 104, 21, 38, 115, 147, 135, 7, 25, 174, 168, 6, 11, 90, 136, 15, 18, 56, 138, 120, 134, 13, 119, 34, 146, 48, 0, 122, 97, 110, 22, 154, 165, 76, 40, 64, 19, 75, 60, 84, 46, 162, 14, 77, 49, 103, 139, 156, 58, 128, 101, 150, 39, 87, 116, 27, 127, 42, 30, 3, 98, 23, 50, 96, 107, 171, 35, 145, and 62.

FIG. 237 is a diagram showing an example of the GW pattern for the LDPC code having the code length N of 64 k bits when the modulation scheme is QPSK and the code rate r is 8/15.

According to the original GW pattern (A) of FIG. 237, the arrangement of bit groups 0 to 179 of the LDPC code of 64 k bits is interleaved into the arrangement of bit groups 0, 2, 4, 6, 8, 10, 12, 14, 16, 18, 20, 22, 24, 26, 28, 30, 32, 34, 36, 38, 40, 42, 44, 46, 48, 50, 52, 54, 56, 58, 60, 62, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126, 128, 130, 132, 134, 136, 138, 140, 142, 144, 146, 148, 150, 152, 154, 156, 158, 160, 162, 164, 166, 168, 170, 172, 174, 176, 178, 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, 63, 65, 67, 69, 71, 73, 75, 77, 79, 81, 83, 85, 87, 89, 91, 93, 95, 97, 99, 101, 103, 105, 107, 109, 111, 113, 115, 117, 119, 121, 123, 125, 127, 129, 131, 133, 135, 137, 139, 141, 143, 145, 147, 149, 151, 153, 155, 157, 159, 161, 163, 165, 167, 169, 171, 173, 175, 177, and 179.

According to the converted GW pattern (B) of FIG. 237, the arrangement of bit groups 0 to 179 of the LDPC code of 64 k bits is interleaved into the arrangement of bit groups 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, and 179.

FIG. 238 is a diagram showing an example of the GW pattern for the LDPC code having the code length N of 64 k bits when the modulation scheme is QPSK and the code rate r is 9/15.

According to the original GW pattern (A) of FIG. 238, the arrangement of bit groups 0 to 179 of the LDPC code of 64 k bits is interleaved into the arrangement of bit groups 0, 2, 4, 6, 8, 10, 12, 14, 16, 18, 20, 22, 24, 26, 28, 30, 32, 34, 36, 38, 40, 42, 44, 46, 48, 50, 52, 54, 56, 58, 60, 62, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126, 128, 130, 132, 134, 136, 138, 140, 142, 144, 146, 148, 150, 152, 154, 156, 158, 160, 162, 164, 166, 168, 170, 172, 174, 176, 178, 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, 63, 65, 67, 69, 71, 73, 75, 77, 79, 81, 83, 85, 87, 89, 91, 93, 95, 97, 99, 101, 103, 105, 107, 109, 111, 113, 115, 117, 119, 121, 123, 125, 127, 129, 131, 133, 135, 137, 139, 141, 143, 145, 147, 149, 151, 153, 155, 157, 159, 161, 163, 165, 167, 169, 171, 173, 175, 177, and 179.

According to the converted GW pattern (B) of FIG. 238, the arrangement of bit groups 0 to 179 of the LDPC code of 64 k bits is interleaved into the arrangement of bit groups 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, and 179.

FIG. 239 is a diagram showing an example of the GW pattern for the LDPC code having the code length N of 64 k bits when the modulation scheme is QPSK and the code rate r is 10/15.

According to the original GW pattern (A) of FIG. 239, the arrangement of bit groups 0 to 179 of the LDPC code of 64 k bits is interleaved into the arrangement of bit groups 0, 2, 4, 6, 8, 10, 12, 14, 16, 18, 20, 22, 24, 26, 28, 30, 32, 34, 36, 38, 40, 42, 44, 46, 48, 50, 52, 54, 56, 58, 60, 62, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126, 128, 130, 132, 134, 136, 138, 140, 142, 144, 146, 148, 150, 152, 154, 156, 158, 160, 162, 164, 166, 168, 170, 172, 174, 176, 178, 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, 63, 65, 67, 69, 71, 73, 75, 77, 79, 81, 83, 85, 87, 89, 91, 93, 95, 97, 99, 101, 103, 105, 107, 109, 111, 113, 115, 117, 119, 121, 123, 125, 127, 129, 131, 133, 135, 137, 139, 141, 143, 145, 147, 149, 151, 153, 155, 157, 159, 161, 163, 165, 167, 169, 171, 173, 175, 177, and 179.

According to the converted GW pattern (B) of FIG. 239, the arrangement of bit groups 0 to 179 of the LDPC code of 64 k bits is interleaved into the arrangement of bit groups 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, and 179.

FIG. 240 is a diagram showing an example of the GW pattern for the LDPC code having the code length N of 64 k bits when the modulation scheme is QPSK and the code rate r is 11/15.

According to the original GW pattern (A) of FIG. 240, the arrangement of bit groups 0 to 179 of the LDPC code of 64 k bits is interleaved into the arrangement of bit groups 0, 14, 19, 21, 2, 11, 22, 9, 8, 7, 16, 3, 26, 24, 27, 80, 100, 121, 107, 31, 36, 42, 46, 49, 75, 93, 127, 95, 119, 73, 61, 63, 117, 89, 99, 129, 52, 111, 124, 48, 122, 82, 106, 91, 92, 71, 103, 102, 81, 113, 101, 97, 33, 115, 59, 112, 90, 51, 126, 85, 123, 40, 83, 53, 69, 70, 132, 134, 136, 138, 140, 142, 144, 146, 148, 150, 152, 154, 156, 158, 160, 162, 164, 166, 168, 170, 172, 174, 176, 178, 4, 5, 10, 12, 20, 6, 18, 13, 17, 15, 1, 29, 28, 23, 25, 67, 116, 66, 104, 44, 50, 47, 84, 76, 65, 130, 56, 128, 77, 39, 94, 87, 120, 62, 88, 74, 35, 110, 131, 98, 60, 37, 45, 78, 125, 41, 34, 118, 38, 72, 108, 58, 43, 109, 57, 105, 68, 86, 79, 96, 32, 114, 64, 55, 30, 54, 133, 135, 137, 139, 141, 143, 145, 147, 149, 151, 153, 155, 157, 159, 161, 163, 165, 167, 169, 171, 173, 175, 177, and 179.

According to the converted GW pattern (B) of FIG. 240, the arrangement of bit groups 0 to 179 of the LDPC code of 64 k bits is interleaved into the arrangement of bit groups 0, 4, 14, 5, 19, 10, 21, 12, 2, 20, 11, 6, 22, 18, 9, 13, 8, 17, 7, 15, 16, 1, 3, 29, 26, 28, 24, 23, 27, 25, 80, 67, 100, 116, 121, 66, 107, 104, 31, 44, 36, 50, 42, 47, 46, 84, 49, 76, 75, 65, 93, 130, 127, 56, 95, 128, 119, 77, 73, 39, 61, 94, 63, 87, 117, 120, 89, 62, 99, 88, 129, 74, 52, 35, 111, 110, 124, 131, 48, 98, 122, 60, 82, 37, 106, 45, 91, 78, 92, 125, 71, 41, 103, 34, 102, 118, 81, 38, 113, 72, 101, 108, 97, 58, 33, 43, 115, 109, 59, 57, 112, 105, 90, 68, 51, 86, 126, 79, 85, 96, 123, 32, 40, 114, 83, 64, 53, 55, 69, 30, 70, 54, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, and 179.

FIG. 241 is a diagram showing an example of the GW pattern for the LDPC code having the code length N of 64 k bits when the modulation scheme is QPSK and the code rate r is 12/15.

According to the original GW pattern (A) of FIG. 241, the arrangement of bit groups 0 to 179 of the LDPC code of 64 k bits is interleaved into the arrangement of bit groups 0, 2, 4, 6, 8, 10, 12, 14, 16, 18, 20, 22, 24, 26, 28, 30, 32, 34, 36, 38, 40, 42, 44, 46, 48, 50, 52, 54, 56, 58, 60, 62, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126, 128, 130, 132, 134, 136, 138, 140, 142, 144, 146, 148, 150, 152, 154, 156, 158, 160, 162, 164, 166, 168, 170, 172, 174, 176, 178, 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, 63, 65, 67, 69, 71, 73, 75, 77, 79, 81, 83, 85, 87, 89, 91, 93, 95, 97, 99, 101, 103, 105, 107, 109, 111, 113, 115, 117, 119, 121, 123, 125, 127, 129, 131, 133, 135, 137, 139, 141, 143, 145, 147, 149, 151, 153, 155, 157, 159, 161, 163, 165, 167, 169, 171, 173, 175, 177, and 179.

According to the converted GW pattern (B) of FIG. 241, the arrangement of bit groups 0 to 179 of the LDPC code of 64 k bits is interleaved into the arrangement of bit groups 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, and 179.

FIG. 242 is a diagram showing an example of the GW pattern for the LDPC code having the code length N of 64 k bits when the modulation scheme is QPSK and the code rate r is 13/15.

According to the original GW pattern (A) of FIG. 242, the arrangement of bit groups 0 to 179 of the LDPC code of 64 k bits is interleaved into the arrangement of bit groups 0, 2, 4, 6, 8, 10, 12, 14, 16, 18, 20, 22, 24, 26, 28, 30, 32, 34, 36, 38, 40, 42, 44, 46, 48, 50, 52, 54, 56, 58, 60, 62, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126, 128, 130, 132, 134, 136, 138, 140, 142, 144, 146, 148, 150, 152, 154, 156, 158, 160, 162, 164, 166, 168, 170, 172, 174, 176, 178, 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, 63, 65, 67, 69, 71, 73, 75, 77, 79, 81, 83, 85, 87, 89, 91, 93, 95, 97, 99, 101, 103, 105, 107, 109, 111, 113, 115, 117, 119, 121, 123, 125, 127, 129, 131, 133, 135, 137, 139, 141, 143, 145, 147, 149, 151, 153, 155, 157, 159, 161, 163, 165, 167, 169, 171, 173, 175, 177, and 179.

According to the converted GW pattern (B) of FIG. 242, the arrangement of bit groups 0 to 179 of the LDPC code of 64 k bits is interleaved into the arrangement of bit groups 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, and 179.

FIG. 243 is a diagram showing an example of the GW pattern for the LDPC code having the code length N of 64 k bits when the modulation scheme is 16-QAM and the code rate r is 2/15.

According to the original GW pattern (A) of FIG. 243, the arrangement of bit groups 0 to 179 of the LDPC code of 64 k bits is interleaved into the arrangement of bit groups 5, 58, 29, 154, 125, 34, 0, 169, 80, 59, 13, 42, 77, 167, 32, 87, 24, 92, 124, 143, 114, 120, 166, 138, 64, 136, 149, 57, 18, 101, 119, 35, 33, 113, 75, 108, 104, 3, 27, 39, 172, 159, 129, 62, 146, 142, 19, 147, 111, 70, 74, 79, 10, 132, 1, 161, 155, 90, 15, 133, 47, 112, 84, 28, 160, 117, 150, 49, 7, 81, 44, 63, 118, 4, 158, 148, 82, 69, 36, 162, 86, 71, 22, 26, 61, 40, 126, 170, 177, 23, 91, 68, 56, 110, 21, 93, 107, 85, 20, 128, 109, 66, 83, 12, 179, 141, 97, 78, 157, 72, 130, 99, 165, 45, 11, 152, 168, 14, 16, 2, 137, 140, 121, 173, 50, 55, 94, 144, 73, 51, 98, 174, 178, 17, 100, 9, 122, 54, 38, 156, 131, 127, 164, 102, 116, 176, 30, 37, 139, 95, 43, 135, 53, 89, 106, 171, 76, 175, 153, 96, 151, 115, 52, 6, 123, 134, 31, 103, 163, 65, 105, 48, 25, 8, 60, 67, 88, 46, 41, and 145.

According to the converted GW pattern (B) of FIG. 243, the arrangement of bit groups 0 to 179 of the LDPC code of 64 k bits is interleaved into the arrangement of bit groups 5, 142, 91, 9, 58, 19, 68, 122, 29, 147, 56, 54, 154, 111, 110, 38, 125, 70, 21, 156, 34, 74, 93, 131, 0, 79, 107, 127, 169, 10, 85, 164, 80, 132, 20, 102, 59, 1, 128, 116, 13, 161, 109, 176, 42, 155, 66, 30, 77, 90, 83, 37, 167, 15, 12, 139, 32, 133, 179, 95, 87, 47, 141, 43, 24, 112, 97, 135, 92, 84, 78, 53, 124, 28, 157, 89, 143, 160, 72, 106, 114, 117, 130, 171, 120, 150, 99, 76, 166, 49, 165, 175, 138, 7, 45, 153, 64, 81, 11, 96, 136, 44, 152, 151, 149, 63, 168, 115, 57, 118, 14, 52, 18, 4, 16, 6, 101, 158, 2, 123, 119, 148, 137, 134, 35, 82, 140, 31, 33, 69, 121, 103, 113, 36, 173, 163, 75, 162, 50, 65, 108, 86, 55, 105, 104, 71, 94, 48, 3, 22, 144, 25, 27, 26, 73, 8, 39, 61, 51, 60, 172, 40, 98, 67, 159, 126, 174, 88, 129, 170, 178, 46, 62, 177, 17, 41, 146, 23, 100, and 145.

FIG. 244 is a diagram showing an example of the GW pattern for the LDPC code having the code length N of 64 k bits when the modulation scheme is 16-QAM and the code rate r is 3/15.

According to the original GW pattern (A) of FIG. 244, the arrangement of bit groups 0 to 179 of the LDPC code of 64 k bits is interleaved into the arrangement of bit groups 52, 92, 175, 26, 45, 81, 117, 74, 119, 147, 120, 135, 144, 87, 3, 51, 20, 170, 143, 125, 15, 39, 5, 174, 79, 16, 176, 44, 19, 69, 11, 111, 121, 37, 160, 88, 50, 76, 129, 138, 157, 86, 113, 164, 142, 98, 9, 93, 166, 78, 73, 167, 168, 40, 131, 27, 89, 156, 177, 171, 116, 152, 0, 127, 36, 8, 153, 59, 75, 13, 105, 55, 122, 132, 172, 2, 58, 126, 162, 30, 77, 158, 17, 96, 100, 42, 63, 134, 154, 6, 90, 128, 83, 60, 146, 124, 178, 99, 123, 108, 133, 159, 151, 145, 61, 53, 68, 31, 41, 94, 35, 21, 49, 82, 80, 4, 155, 7, 57, 95, 62, 56, 65, 140, 163, 148, 23, 161, 169, 47, 67, 139, 72, 43, 110, 46, 150, 109, 115, 32, 14, 179, 85, 165, 112, 25, 64, 173, 10, 102, 114, 71, 66, 84, 24, 141, 29, 104, 107, 54, 12, 91, 1, 118, 136, 18, 101, 149, 130, 103, 106, 38, 70, 48, 28, 137, 97, 34, 22, and 33.

According to the converted GW pattern (B) of FIG. 244, the arrangement of bit groups 0 to 179 of the LDPC code of 64 k bits is interleaved into the arrangement of bit groups 52, 98, 90, 46, 92, 9, 128, 150, 175, 93, 83, 109, 26, 166, 60, 115, 45, 78, 146, 32, 81, 73, 124, 14, 117, 167, 178, 179, 74, 168, 99, 85, 119, 40, 123, 165, 147, 131, 108, 112, 120, 27, 133, 25, 135, 89, 159, 64, 144, 156, 151, 173, 87, 177, 145, 10, 3, 171, 61, 102, 51, 116, 53, 114, 20, 152, 68, 71, 170, 0, 31, 66, 143, 127, 41, 84, 125, 36, 94, 24, 15, 8, 35, 141, 39, 153, 21, 29, 5, 59, 49, 104, 174, 75, 82, 107, 79, 13, 80, 54, 16, 105, 4, 12, 176, 55, 155, 91, 44, 122, 7, 1, 19, 132, 57, 118, 69, 172, 95, 136, 11, 2, 62, 18, 111, 58, 56, 101, 121, 126, 65, 149, 37, 162, 140, 130, 160, 30, 163, 103, 88, 77, 148, 106, 50, 158, 23, 38, 76, 17, 161, 70, 129, 96, 169, 48, 138, 100, 47, 28, 157, 42, 67, 137, 86, 63, 139, 97, 113, 134, 72, 34, 164, 154, 43, 22, 142, 6, 110, and 33.

FIG. 245 is a diagram showing an example of the GW pattern for the LDPC code having the code length N of 64 k bits when the modulation scheme is 16-QAM and the code rate r is 4/15.

According to the original GW pattern (A) of FIG. 245, the arrangement of bit groups 0 to 179 of the LDPC code of 64 k bits is interleaved into the arrangement of bit groups 165, 8, 136, 2, 58, 30, 127, 64, 38, 164, 123, 45, 78, 17, 47, 105, 159, 134, 124, 147, 148, 109, 67, 98, 157, 57, 156, 170, 46, 12, 172, 29, 9, 3, 144, 97, 83, 151, 26, 52, 10, 39, 50, 104, 92, 163, 72, 125, 36, 14, 55, 48, 1, 149, 33, 110, 6, 130, 140, 89, 77, 22, 171, 139, 112, 113, 152, 16, 7, 85, 11, 28, 153, 73, 62, 44, 135, 116, 4, 61, 117, 53, 111, 178, 94, 81, 68, 114, 173, 75, 101, 88, 65, 99, 126, 141, 43, 15, 18, 90, 35, 24, 142, 25, 120, 19, 154, 0, 174, 93, 167, 150, 107, 86, 129, 175, 87, 21, 66, 106, 82, 179, 118, 41, 95, 145, 37, 23, 168, 166, 49, 103, 108, 56, 91, 69, 128, 121, 96, 133, 100, 161, 143, 119, 102, 59, 20, 40, 70, 79, 80, 51, 13, 177, 131, 132, 176, 155, 31, 63, 5, 162, 76, 42, 160, 115, 71, 158, 54, 137, 146, 32, 169, 122, 138, 84, 74, 60, 34, and 27.

According to the converted GW pattern (B) of FIG. 245, the arrangement of bit groups 0 to 179 of the LDPC code of 64 k bits is interleaved into the arrangement of bit groups 165, 163, 101, 69, 8, 72, 88, 128, 136, 125, 65, 121, 2, 36, 99, 96, 58, 14, 126, 133, 30, 55, 141, 100, 127, 48, 43, 161, 64, 1, 15, 143, 38, 149, 18, 119, 164, 33, 90, 102, 123, 110, 35, 59, 45, 6, 24, 20, 78, 130, 142, 40, 17, 140, 25, 70, 47, 89, 120, 79, 105, 77, 19, 80, 159, 22, 154, 51, 134, 171, 0, 13, 124, 139, 174, 177, 147, 112, 93, 131, 148, 113, 167, 132, 109, 152, 150, 176, 67, 16, 107, 155, 98, 7, 86, 31, 157, 85, 129, 63, 57, 11, 175, 5, 156, 28, 87, 162, 170, 153, 21, 76, 46, 73, 66, 42, 12, 62, 106, 160, 172, 44, 82, 115, 29, 135, 179, 71, 9, 116, 118, 158, 3, 4, 41, 54, 144, 61, 95, 137, 97, 117, 145, 146, 83, 53, 37, 32, 151, 111, 23, 169, 26, 178, 168, 122, 52, 94, 166, 138, 10, 81, 49, 84, 39, 68, 103, 74, 50, 114, 108, 60, 104, 173, 56, 34, 92, 75, 91, and 27.

FIG. 246 is a diagram showing an example of the GW pattern for the LDPC code having the code length N of 64 k bits when the modulation scheme is 16-QAM and the code rate r is 5/15.

According to the original GW pattern (B) of FIG. 246, the arrangement of bit groups 0 to 179 of the LDPC code of 64 k bits is interleaved into the arrangement of bit groups 129, 65, 160, 140, 32, 50, 162, 86, 177, 57, 157, 9, 134, 104, 24, 7, 122, 46, 17, 77, 31, 92, 163, 148, 133, 99, 18, 0, 167, 101, 110, 135, 124, 71, 107, 5, 123, 69, 108, 141, 179, 96, 113, 83, 176, 52, 117, 81, 125, 59, 15, 137, 170, 63, 112, 88, 34, 61, 106, 3, 42, 100, 152, 87, 171, 72, 161, 4, 178, 64, 150, 10, 128, 49, 26, 75, 41, 102, 28, 2, 168, 93, 156, 12, 38, 45, 151, 142, 44, 66, 25, 139, 173, 51, 29, 147, 175, 90, 164, 80, 131, 58, 114, 145, 121, 70, 115, 146, 120, 55, 158, 8, 39, 97, 159, 138, 33, 47, 116, 79, 174, 74, 21, 6, 130, 54, 109, 76, 35, 98, 155, 144, 36, 94, 23, 78, 165, 56, 154, 89, 132, 67, 119, 143, 40, 53, 20, 136, 172, 91, 27, 13, 127, 73, 105, 85, 30, 103, 19, 84, 37, 48, 153, 11, 166, 60, 111, 14, 169, 95, 118, 1, 126, 68, 22, 149, 43, 62, 16, and 82.

According to the converted GW pattern (A) of FIG. 246, the arrangement of bit groups 0 to 179 of the LDPC code of 64 k bits is interleaved into the arrangement of bit groups 129, 32, 177, 134, 122, 31, 133, 167, 124, 123, 179, 176, 125, 170, 34, 42, 171, 178, 128, 41, 168, 38, 44, 173, 175, 131, 121, 120, 39, 33, 174, 130, 35, 36, 165, 132, 40, 172, 127, 30, 37, 166, 169, 126, 43, 65, 50, 57, 104, 46, 92, 99, 101, 71, 69, 96, 52, 59, 63, 61, 100, 72, 64, 49, 102, 93, 45, 66, 51, 90, 58, 70, 55, 97, 47, 74, 54, 98, 94, 56, 67, 53, 91, 73, 103, 48, 60, 95, 68, 62, 160, 162, 157, 24, 17, 163, 18, 110, 107, 108, 113, 117, 15, 112, 106, 152, 161, 150, 26, 28, 156, 151, 25, 29, 164, 114, 115, 158, 159, 116, 21, 109, 155, 23, 154, 119, 20, 27, 105, 19, 153, 111, 118, 22, 16, 140, 86, 9, 7, 77, 148, 0, 135, 5, 141, 83, 81, 137, 88, 3, 87, 4, 10, 75, 2, 12, 142, 139, 147, 80, 145, 146, 8, 138, 79, 6, 76, 144, 78, 89, 143, 136, 13, 85, 84, 11, 14, 1, 149, and 82.

FIG. 247 is a diagram showing an example of the GW pattern for the LDPC code having the code length N of 64 k bits when the modulation scheme is 16-QAM and the code rate r is 6/15.

According to the original GW pattern (A) of FIG. 247, the arrangement of bit groups 0 to 179 of the LDPC code of 64 k bits is interleaved into the arrangement of bit groups 55, 146, 83, 52, 62, 176, 160, 68, 53, 56, 81, 97, 79, 113, 163, 61, 58, 69, 133, 108, 66, 71, 86, 144, 57, 67, 116, 59, 70, 156, 172, 65, 149, 155, 82, 138, 136, 141, 111, 96, 170, 90, 140, 64, 159, 15, 14, 37, 54, 44, 63, 43, 18, 47, 7, 25, 34, 29, 30, 26, 39, 16, 41, 45, 36, 0, 23, 32, 28, 27, 38, 48, 33, 22, 49, 51, 60, 46, 21, 4, 3, 20, 13, 50, 35, 24, 40, 17, 42, 6, 112, 93, 127, 101, 94, 115, 105, 31, 19, 177, 74, 10, 145, 162, 102, 120, 126, 95, 73, 152, 129, 174, 125, 72, 128, 78, 171, 8, 142, 178, 154, 85, 107, 75, 12, 9, 151, 77, 117, 109, 80, 106, 134, 98, 1, 122, 173, 161, 150, 110, 175, 166, 131, 119, 103, 139, 148, 157, 114, 147, 87, 158, 121, 164, 104, 89, 179, 123, 118, 99, 88, 11, 92, 165, 84, 168, 124, 169, 2, 130, 167, 153, 137, 143, 91, 100, 5, 76, 132, and 135.

According to the converted GW pattern (B) of FIG. 247, the arrangement of bit groups 0 to 179 of the LDPC code of 64 k bits is interleaved into the arrangement of bit groups 55, 15, 112, 122, 146, 14, 93, 173, 83, 37, 127, 161, 52, 54, 101, 150, 62, 44, 94, 110, 176, 63, 115, 175, 160, 43, 105, 166, 68, 18, 31, 131, 53, 47, 19, 119, 56, 7, 177, 103, 81, 25, 74, 139, 97, 34, 10, 148, 79, 29, 145, 157, 113, 30, 162, 114, 163, 26, 102, 147, 61, 39, 120, 87, 58, 16, 126, 158, 69, 41, 95, 121, 133, 45, 73, 164, 108, 36, 152, 104, 66, 0, 129, 89, 71, 23, 174, 179, 86, 32, 125, 123, 144, 28, 72, 118, 57, 27, 128, 99, 67, 38, 78, 88, 116, 48, 171, 11, 59, 33, 8, 92, 70, 22, 142, 165, 156, 49, 178, 84, 172, 51, 154, 168, 65, 60, 85, 124, 149, 46, 107, 169, 155, 21, 75, 2, 82, 4, 12, 130, 138, 3, 9, 167, 136, 20, 151, 153, 141, 13, 77, 137, 111, 50, 117, 143, 96, 35, 109, 91, 170, 24, 80, 100, 90, 40, 106, 5, 140, 17, 134, 76, 64, 42, 98, 132, 159, 6, 1, and 135.

FIG. 248 is a diagram showing an example of the GW pattern for the LDPC code having the code length N of 64 k bits when the modulation scheme is 16-QAM and the code rate r is 7/15.

According to the original GW pattern (A) of FIG. 248, the arrangement of bit groups 0 to 179 of the LDPC code of 64 k bits is interleaved into the arrangement of bit groups 174, 148, 56, 168, 38, 7, 110, 9, 42, 153, 160, 15, 46, 21, 121, 88, 114, 85, 13, 83, 74, 81, 70, 27, 119, 118, 144, 31, 80, 109, 73, 141, 93, 45, 16, 77, 108, 57, 36, 78, 124, 79, 169, 143, 6, 58, 75, 67, 5, 104, 125, 140, 172, 8, 39, 17, 29, 159, 86, 87, 41, 99, 89, 47, 128, 43, 161, 154, 101, 163, 116, 94, 120, 71, 158, 145, 37, 112, 68, 95, 1, 113, 64, 72, 90, 92, 35, 167, 44, 149, 66, 28, 82, 178, 176, 152, 23, 115, 130, 98, 123, 102, 24, 129, 150, 34, 136, 171, 54, 107, 2, 3, 60, 69, 10, 117, 91, 157, 33, 105, 155, 62, 162, 40, 127, 14, 165, 26, 52, 19, 48, 137, 4, 22, 122, 173, 18, 11, 111, 106, 76, 53, 61, 147, 97, 175, 32, 59, 166, 179, 135, 177, 103, 100, 139, 50, 146, 134, 133, 96, 49, 126, 151, 84, 156, 30, 138, 164, 132, 12, 0, 20, 63, 170, 142, 65, 55, 25, 51, and 131.

According to the converted GW pattern (B) of FIG. 248, the arrangement of bit groups 0 to 179 of the LDPC code of 64 k bits is interleaved into the arrangement of bit groups 174, 58, 66, 173, 148, 75, 28, 18, 56, 67, 82, 11, 168, 5, 178, 111, 38, 104, 176, 106, 7, 125, 152, 76, 110, 140, 23, 53, 9, 172, 115, 61, 42, 8, 130, 147, 153, 39, 98, 97, 160, 17, 123, 175, 15, 29, 102, 32, 46, 159, 24, 59, 21, 86, 129, 166, 121, 87, 150, 179, 88, 41, 34, 135, 114, 99, 136, 177, 85, 89, 171, 103, 13, 47, 54, 100, 83, 128, 107, 139, 74, 43, 2, 50, 81, 161, 3, 146, 70, 154, 60, 134, 27, 101, 69, 133, 119, 163, 10, 96, 118, 116, 117, 49, 144, 94, 91, 126, 31, 120, 157, 151, 80, 71, 33, 84, 109, 158, 105, 156, 73, 145, 155, 30, 141, 37, 62, 138, 93, 112, 162, 164, 45, 68, 40, 132, 16, 95, 127, 12, 77, 1, 14, 0, 108, 113, 165, 20, 57, 64, 26, 63, 36, 72, 52, 170, 78, 90, 19, 142, 124, 92, 48, 65, 79, 35, 137, 55, 169, 167, 4, 25, 143, 44, 22, 51, 6, 149, 122, and 131.

FIG. 249 is a diagram showing an example of the GW pattern for the LDPC code having the code length N of 64 k bits when the modulation scheme is 16-QAM and the code rate r is 8/15.

According to the original GW pattern (B) of FIG. 249, the arrangement of bit groups 0 to 179 of the LDPC code of 64 k bits is interleaved into the arrangement of bit groups 71, 81, 170, 101, 143, 77, 128, 112, 155, 41, 40, 54, 57, 28, 179, 114, 97, 13, 18, 151, 91, 88, 79, 92, 137, 27, 122, 107, 135, 82, 125, 103, 74, 36, 9, 93, 0, 86, 63, 158, 148, 25, 167, 116, 70, 43, 102, 106, 149, 24, 169, 113, 127, 34, 165, 100, 136, 75, 134, 156, 96, 84, 178, 150, 140, 20, 126, 73, 68, 130, 121, 48, 53, 22, 129, 99, 11, 33, 124, 157, 161, 29, 123, 160, 55, 26, 168, 98, 67, 15, 7, 94, 144, 1, 61, 65, 146, 42, 172, 115, 59, 76, 4, 162, 39, 85, 12, 72, 58, 44, 132, 47, 141, 35, 176, 104, 139, 80, 6, 95, 87, 90, 173, 163, 69, 32, 8, 154, 145, 23, 177, 111, 60, 38, 171, 62, 46, 21, 5, 153, 49, 78, 2, 109, 147, 89, 166, 152, 138, 31, 14, 131, 50, 37, 16, 117, 66, 19, 10, 159, 142, 105, 3, 164, 51, 83, 174, 108, 52, 17, 64, 119, 45, 133, 175, 110, 56, 30, 120, and 118.

According to the converted GW pattern (A) of FIG. 249, the arrangement of bit groups 0 to 179 of the LDPC code of 64 k bits is interleaved into the arrangement of bit groups 71, 143, 155, 57, 97, 91, 137, 135, 74, 0, 148, 70, 149, 127, 136, 96, 140, 68, 53, 11, 161, 55, 67, 144, 146, 59, 39, 58, 141, 139, 87, 69, 145, 60, 46, 49, 147, 138, 50, 66, 142, 51, 52, 45, 56, 81, 77, 41, 28, 13, 88, 27, 82, 36, 86, 25, 43, 24, 34, 75, 84, 20, 130, 22, 33, 29, 26, 15, 1, 42, 76, 85, 44, 35, 80, 90, 32, 23, 38, 21, 78, 89, 31, 37, 19, 105, 83, 17, 133, 30, 170, 128, 40, 179, 18, 79, 122, 125, 9, 63, 167, 102, 169, 165, 134, 178, 126, 121, 129, 124, 123, 168, 7, 61, 172, 4, 12, 132, 176, 6, 173, 8, 177, 171, 5, 2, 166, 14, 16, 10, 3, 174, 64, 175, 120, 101, 112, 54, 114, 151, 92, 107, 103, 93, 158, 116, 106, 113, 100, 156, 150, 73, 48, 99, 157, 160, 98, 94, 65, 115, 162, 72, 47, 104, 95, 163, 154, 111, 62, 153, 109, 152, 131, 117, 159, 164, 108, 119, 110, and 118.

FIG. 250 is a diagram showing an example of the GW pattern for the LDPC code having the code length N of 64 k bits when the modulation scheme is 16-QAM and the code rate r is 9/15.

According to the original GW pattern (B) of FIG. 250, the arrangement of bit groups 0 to 179 of the LDPC code of 64 k bits is interleaved into the arrangement of bit groups 23, 89, 10, 142, 19, 41, 1, 146, 68, 87, 9, 51, 114, 92, 121, 69, 107, 97, 166, 162, 55, 174, 126, 149, 110, 128, 172, 28, 111, 78, 82, 120, 71, 52, 5, 141, 29, 30, 132, 148, 72, 85, 17, 160, 156, 154, 131, 164, 65, 76, 125, 50, 16, 130, 129, 143, 133, 98, 0, 42, 63, 83, 173, 49, 74, 43, 8, 147, 61, 36, 167, 119, 27, 86, 102, 48, 115, 99, 38, 163, 73, 101, 4, 153, 118, 90, 124, 151, 66, 93, 123, 157, 24, 44, 168, 80, 15, 39, 178, 45, 21, 37, 11, 136, 113, 77, 122, 158, 64, 81, 6, 60, 54, 35, 13, 57, 171, 100, 117, 46, 62, 33, 175, 137, 59, 103, 127, 70, 108, 88, 179, 40, 112, 104, 170, 140, 67, 32, 105, 159, 26, 96, 169, 135, 109, 47, 177, 56, 116, 79, 106, 150, 25, 94, 134, 152, 22, 84, 176, 139, 20, 34, 165, 138, 7, 91, 12, 145, 58, 95, 2, 144, 53, 75, 14, 155, 18, 31, 3, and 161.

According to the converted GW pattern (A) of FIG. 250, the arrangement of bit groups 0 to 179 of the LDPC code of 64 k bits is interleaved into the arrangement of bit groups 23, 19, 68, 114, 107, 55, 110, 111, 71, 29, 72, 156, 65, 16, 133, 63, 74, 61, 27, 115, 73, 118, 66, 24, 15, 21, 113, 64, 54, 171, 62, 59, 108, 112, 67, 26, 109, 116, 25, 22, 20, 7, 58, 53, 18, 89, 41, 87, 92, 97, 174, 128, 78, 52, 30, 85, 154, 76, 130, 98, 83, 43, 36, 86, 99, 101, 90, 93, 44, 39, 37, 77, 81, 35, 100, 33, 103, 88, 104, 32, 96, 47, 79, 94, 84, 34, 91, 95, 75, 31, 10, 1, 9, 121, 166, 126, 172, 82, 5, 132, 17, 131, 125, 129, 0, 173, 8, 167, 102, 38, 4, 124, 123, 168, 178, 11, 122, 6, 13, 117, 175, 127, 179, 170, 105, 169, 177, 106, 134, 176, 165, 12, 2, 14, 3, 142, 146, 51, 69, 162, 149, 28, 120, 141, 148, 160, 164, 50, 143, 42, 49, 147, 119, 48, 163, 153, 151, 157, 80, 45, 136, 158, 60, 57, 46, 137, 70, 40, 140, 159, 135, 56, 150, 152, 139, 138, 145, 144, 155, and 161.

FIG. 251 is a diagram showing an example of the GW pattern for the LDPC code having the code length N of 64 k bits when the modulation scheme is 16-QAM and the code rate r is 10/15.

According to the original GW pattern (A) of FIG. 251, the arrangement of bit groups 0 to 179 of the LDPC code of 64 k bits is interleaved into the arrangement of bit groups 68, 71, 54, 19, 25, 21, 102, 32, 105, 29, 16, 79, 53, 82, 107, 91, 67, 94, 85, 48, 83, 58, 42, 57, 28, 76, 31, 26, 96, 65, 119, 114, 109, 9, 125, 81, 43, 103, 93, 70, 46, 89, 112, 61, 45, 66, 38, 77, 115, 56, 87, 113, 100, 75, 72, 60, 47, 92, 36, 98, 4, 59, 6, 44, 20, 86, 3, 73, 95, 104, 8, 34, 0, 84, 111, 35, 30, 64, 55, 80, 40, 97, 101, 2, 69, 63, 74, 62, 118, 110, 159, 18, 50, 33, 7, 175, 51, 131, 106, 134, 88, 140, 117, 132, 147, 153, 116, 161, 10, 39, 126, 136, 90, 37, 174, 41, 158, 5, 120, 12, 52, 99, 146, 144, 78, 155, 128, 165, 141, 179, 150, 157, 171, 143, 108, 170, 22, 49, 11, 27, 160, 178, 133, 142, 121, 168, 173, 123, 13, 15, 154, 127, 139, 151, 163, 172, 138, 176, 145, 129, 162, 152, 177, 137, 149, 167, 1, 14, 169, 124, 148, 164, 130, 17, 156, 122, 23, 166, 135, and 24.

According to the converted GW pattern (B) of FIG. 251, the arrangement of bit groups 0 to 179 of the LDPC code of 64 k bits is interleaved into the arrangement of bit groups 68, 66, 159, 170, 71, 38, 18, 22, 54, 77, 50, 49, 19, 115, 33, 11, 25, 56, 7, 27, 21, 87, 175, 160, 102, 113, 51, 178, 32, 100, 131, 133, 105, 75, 106, 142, 29, 72, 134, 121, 16, 60, 88, 168, 79, 47, 140, 173, 53, 92, 117, 123, 82, 36, 132, 13, 107, 98, 147, 15, 91, 4, 153, 154, 67, 59, 116, 127, 94, 6, 161, 139, 85, 44, 10, 151, 48, 20, 39, 163, 83, 86, 126, 172, 58, 3, 136, 138, 42, 73, 90, 176, 57, 95, 37, 145, 28, 104, 174, 129, 76, 8, 41, 162, 31, 34, 158, 152, 26, 0, 5, 177, 96, 84, 120, 137, 65, 111, 12, 149, 119, 35, 52, 167, 114, 30, 99, 1, 109, 64, 146, 14, 9, 55, 144, 169, 125, 80, 78, 124, 81, 40, 155, 148, 43, 97, 128, 164, 103, 101, 165, 130, 93, 2, 141, 17, 70, 69, 179, 156, 46, 63, 150, 122, 89, 74, 157, 23, 112, 62, 171, 166, 61, 118, 143, 135, 45, 110, 108, and 24.

FIG. 252 is a diagram showing an example of the GW pattern for the LDPC code having the code length N of 64 k bits when the modulation scheme is 16-QAM and the code rate r is 11/15.

According to the original GW pattern (A) of FIG. 252, the arrangement of bit groups 0 to 179 of the LDPC code of 64 k bits is interleaved into the arrangement of bit groups 21, 11, 12, 9, 0, 6, 24, 25, 85, 103, 118, 122, 71, 101, 41, 93, 55, 73, 100, 40, 106, 119, 45, 80, 128, 68, 129, 61, 124, 36, 126, 117, 114, 132, 136, 140, 144, 148, 152, 156, 160, 164, 168, 172, 176, 20, 18, 10, 13, 16, 8, 26, 27, 54, 111, 52, 44, 87, 113, 115, 58, 116, 49, 77, 95, 86, 30, 78, 81, 56, 125, 53, 89, 94, 50, 123, 65, 83, 133, 137, 141, 145, 149, 153, 157, 161, 165, 169, 173, 177, 2, 17, 1, 4, 7, 15, 29, 82, 32, 102, 76, 121, 92, 130, 127, 62, 107, 38, 46, 43, 110, 75, 104, 70, 91, 69, 96, 120, 42, 34, 79, 35, 105, 134, 138, 142, 146, 150, 154, 158, 162, 166, 170, 174, 178, 19, 5, 3, 14, 22, 28, 23, 109, 51, 108, 131, 33, 84, 88, 64, 63, 59, 57, 97, 98, 48, 31, 99, 37, 72, 39, 74, 66, 60, 67, 47, 112, 90, 135, 139, 143, 147, 151, 155, 159, 163, 167, 171, 175, and 179.

According to the converted GW pattern (B) of FIG. 252, the arrangement of bit groups 0 to 179 of the LDPC code of 64 k bits is interleaved into the arrangement of bit groups 21, 20, 2, 19, 11, 18, 17, 5, 12, 10, 1, 3, 9, 13, 4, 14, 0, 16, 7, 22, 6, 8, 15, 28, 24, 26, 29, 23, 25, 27, 82, 109, 85, 54, 32, 51, 103, 111, 102, 108, 118, 52, 76, 131, 122, 44, 121, 33, 71, 87, 92, 84, 101, 113, 130, 88, 41, 115, 127, 64, 93, 58, 62, 63, 55, 116, 107, 59, 73, 49, 38, 57, 100, 77, 46, 97, 40, 95, 43, 98, 106, 86, 110, 48, 119, 30, 75, 31, 45, 78, 104, 99, 80, 81, 70, 37, 128, 56, 91, 72, 68, 125, 69, 39, 129, 53, 96, 74, 61, 89, 120, 66, 124, 94, 42, 60, 36, 50, 34, 67, 126, 123, 79, 47, 117, 65, 35, 112, 114, 83, 105, 90, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, and 179.

FIG. 253 is a diagram showing an example of the GW pattern for the LDPC code having the code length N of 64 k bits when the modulation scheme is 16-QAM and the code rate r is 12/15.

According to the original GW pattern (A) of FIG. 253, the arrangement of bit groups 0 to 179 of the LDPC code of 64 k bits is interleaved into the arrangement of bit groups 120, 32, 38, 113, 71, 31, 65, 109, 36, 106, 134, 66, 29, 86, 136, 108, 83, 70, 79, 81, 105, 48, 30, 125, 107, 44, 99, 75, 64, 78, 51, 95, 88, 49, 60, 54, 122, 140, 137, 89, 74, 129, 82, 164, 59, 3, 67, 92, 98, 42, 77, 28, 121, 87, 18, 21, 93, 72, 2, 142, 112, 9, 50, 8, 90, 139, 14, 97, 63, 85, 104, 124, 52, 20, 118, 34, 5, 94, 41, 68, 80, 110, 12, 133, 131, 53, 116, 123, 96, 61, 111, 33, 173, 165, 175, 166, 169, 174, 159, 148, 158, 155, 145, 178, 126, 100, 154, 156, 179, 157, 46, 149, 171, 37, 153, 163, 152, 146, 177, 103, 160, 147, 76, 172, 144, 150, 132, 176, 168, 167, 162, 170, 138, 151, 161, 40, 26, 130, 119, 114, 117, 115, 84, 57, 62, 13, 47, 24, 0, 7, 10, 69, 19, 127, 17, 16, 27, 91, 4, 73, 35, 102, 15, 55, 23, 25, 11, 56, 45, 58, 128, 43, 135, 1, 143, 141, 6, 22, 101, and 39.

According to the converted GW pattern (B) of FIG. 253, the arrangement of bit groups 0 to 179 of the LDPC code of 64 k bits is interleaved into the arrangement of bit groups 120, 3, 111, 40, 32, 67, 33, 26, 38, 92, 173, 130, 113, 98, 165, 119, 71, 42, 175, 114, 31, 77, 166, 117, 65, 28, 169, 115, 109, 121, 174, 84, 36, 87, 159, 57, 106, 18, 148, 62, 134, 21, 158, 13, 66, 93, 155, 47, 29, 72, 145, 24, 86, 2, 178, 0, 136, 142, 126, 7, 108, 112, 100, 10, 83, 9, 154, 69, 70, 50, 156, 19, 79, 8, 179, 127, 81, 90, 157, 17, 105, 139, 46, 16, 48, 14, 149, 27, 30, 97, 171, 91, 125, 63, 37, 4, 107, 85, 153, 73, 44, 104, 163, 35, 99, 124, 152, 102, 75, 52, 146, 15, 64, 20, 177, 55, 78, 118, 103, 23, 51, 34, 160, 25, 95, 5, 147, 11, 88, 94, 76, 56, 49, 41, 172, 45, 60, 68, 144, 58, 54, 80, 150, 128, 122, 110, 132, 43, 140, 12, 176, 135, 137, 133, 168, 1, 89, 131, 167, 143, 74, 53, 162, 141, 129, 116, 170, 6, 82, 123, 138, 22, 164, 96, 151, 101, 59, 61, 161, and 39.

FIG. 254 is a diagram showing an example of the GW pattern for the LDPC code having the code length N of 64 k bits when the modulation scheme is 16-QAM and the code rate r is 13/15.

According to the original GW pattern (A) of FIG. 254, the arrangement of bit groups 0 to 179 of the LDPC code of 64 k bits is interleaved into the arrangement of bit groups 0, 4, 8, 12, 16, 20, 24, 28, 32, 36, 40, 44, 48, 52, 56, 60, 64, 68, 72, 76, 80, 84, 88, 92, 96, 100, 104, 108, 112, 116, 120, 124, 128, 132, 136, 140, 144, 148, 152, 156, 160, 164, 168, 172, 176, 1, 5, 9, 13, 17, 21, 25, 29, 33, 37, 41, 45, 49, 53, 57, 61, 65, 69, 73, 77, 81, 85, 89, 93, 97, 101, 105, 109, 113, 117, 121, 125, 129, 133, 137, 141, 145, 149, 153, 157, 161, 165, 169, 173, 177, 2, 6, 10, 14, 18, 22, 26, 30, 34, 38, 42, 46, 50, 54, 58, 62, 66, 70, 74, 78, 82, 86, 90, 94, 98, 102, 106, 110, 114, 118, 122, 126, 130, 134, 138, 142, 146, 150, 154, 158, 162, 166, 170, 174, 178, 3, 7, 11, 15, 19, 23, 27, 31, 35, 39, 43, 47, 51, 55, 59, 63, 67, 71, 75, 79, 83, 87, 91, 95, 99, 103, 107, 111, 115, 119, 123, 127, 131, 135, 139, 143, 147, 151, 155, 159, 163, 167, 171, 175, and 179.

According to the converted GW pattern (B) of FIG. 254, the arrangement of bit groups 0 to 179 of the LDPC code of 64 k bits is interleaved into the arrangement of bit groups 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, and 179.

FIG. 255 is a diagram showing an example of the GW pattern for the LDPC code having the code length N of 64 k bits when the modulation scheme is 64-QAM and the code rate r is 2/15.

According to the original GW pattern (A) of FIG. 255, the arrangement of bit groups 0 to 179 of the LDPC code of 64 k bits is interleaved into the arrangement of bit groups 57, 149, 83, 142, 29, 20, 30, 52, 5, 100, 156, 22, 130, 167, 121, 126, 137, 158, 132, 82, 138, 128, 89, 88, 162, 32, 107, 3, 97, 166, 125, 129, 1, 6, 68, 148, 40, 87, 0, 80, 49, 24, 78, 101, 43, 112, 75, 172, 23, 154, 12, 146, 19, 135, 48, 170, 123, 147, 95, 91, 13, 35, 127, 61, 60, 139, 44, 59, 55, 109, 157, 177, 153, 165, 66, 152, 77, 98, 131, 11, 81, 62, 175, 141, 171, 51, 155, 76, 150, 174, 58, 143, 37, 63, 31, 41, 140, 118, 94, 27, 10, 70, 56, 93, 176, 124, 151, 106, 46, 163, 179, 4, 18, 144, 178, 161, 145, 71, 114, 7, 105, 133, 84, 86, 17, 21, 28, 54, 74, 65, 110, 122, 169, 64, 111, 119, 42, 85, 73, 8, 116, 79, 120, 69, 53, 115, 67, 104, 16, 173, 92, 15, 159, 134, 99, 96, 117, 38, 9, 26, 164, 47, 103, 113, 136, 168, 102, 14, 45, 72, 25, 50, 34, 36, 90, 160, 2, 33, 39, and 108.

According to the converted GW pattern (B) of FIG. 255, the arrangement of bit groups 0 to 179 of the LDPC code of 64 k bits is interleaved into the arrangement of bit groups 57, 125, 13, 58, 105, 92, 149, 129, 35, 143, 133, 15, 83, 1, 127, 37, 84, 159, 142, 6, 61, 63, 86, 134, 29, 68, 60, 31, 17, 99, 20, 148, 139, 41, 21, 96, 30, 40, 44, 140, 28, 117, 52, 87, 59, 118, 54, 38, 5, 0, 55, 94, 74, 9, 100, 80, 109, 27, 65, 26, 156, 49, 157, 10, 110, 164, 22, 24, 177, 70, 122, 47, 130, 78, 153, 56, 169, 103, 167, 101, 165, 93, 64, 113, 121, 43, 66, 176, 111, 136, 126, 112, 152, 124, 119, 168, 137, 75, 77, 151, 42, 102, 158, 172, 98, 106, 85, 14, 132, 23, 131, 46, 73, 45, 82, 154, 11, 163, 8, 72, 138, 12, 81, 179, 116, 25, 128, 146, 62, 4, 79, 50, 89, 19, 175, 18, 120, 34, 88, 135, 141, 144, 69, 36, 162, 48, 171, 178, 53, 90, 32, 170, 51, 161, 115, 160, 107, 123, 155, 145, 67, 2, 3, 147, 76, 71, 104, 33, 97, 95, 150, 114, 16, 39, 166, 91, 174, 7, 173, and 108.

FIG. 256 is a diagram showing an example of the GW pattern for the LDPC code having the code length N of 64 k bits when the modulation scheme is 64-QAM and the code rate r is 3/15.

According to the original GW pattern (A) of FIG. 256, the arrangement of bit groups 0 to 179 of the LDPC code of 64 k bits is interleaved into the arrangement of bit groups 74, 72, 104, 62, 122, 35, 130, 0, 95, 150, 139, 151, 133, 109, 31, 59, 18, 148, 9, 105, 57, 132, 102, 100, 115, 101, 7, 21, 141, 30, 8, 1, 93, 92, 163, 108, 52, 159, 24, 89, 117, 88, 178, 113, 98, 179, 144, 156, 54, 164, 12, 63, 39, 22, 25, 137, 13, 41, 44, 80, 87, 111, 145, 23, 85, 166, 83, 55, 154, 20, 84, 58, 26, 126, 170, 103, 11, 33, 172, 155, 116, 169, 142, 70, 161, 47, 3, 162, 77, 19, 28, 97, 124, 6, 168, 107, 60, 76, 143, 121, 42, 157, 65, 43, 173, 56, 171, 90, 131, 119, 94, 5, 68, 138, 149, 73, 67, 53, 61, 4, 86, 99, 75, 36, 15, 48, 177, 167, 174, 51, 176, 81, 120, 158, 123, 34, 49, 128, 10, 134, 147, 96, 160, 50, 146, 16, 38, 78, 91, 152, 46, 127, 27, 175, 135, 79, 125, 82, 2, 129, 153, 14, 40, 32, 114, 106, 17, 110, 140, 71, 136, 112, 45, 64, 29, 69, 118, 66, 37, and 165.

According to the converted GW pattern (B) of FIG. 256, the arrangement of bit groups 0 to 179 of the LDPC code of 64 k bits is interleaved into the arrangement of bit groups 74, 8, 87, 28, 86, 46, 72, 1, 111, 97, 99, 127, 104, 93, 145, 124, 75, 27, 62, 92, 23, 6, 36, 175, 122, 163, 85, 168, 15, 135, 35, 108, 166, 107, 48, 79, 130, 52, 83, 60, 177, 125, 0, 159, 55, 76, 167, 82, 95, 24, 154, 143, 174, 2, 150, 89, 20, 121, 51, 129, 139, 117, 84, 42, 176, 153, 151, 88, 58, 157, 81, 14, 133, 178, 26, 65, 120, 40, 109, 113, 126, 43, 158, 32, 31, 98, 170, 173, 123, 114, 59, 179, 103, 56, 34, 106, 18, 144, 11, 171, 49, 17, 148, 156, 33, 90, 128, 110, 9, 54, 172, 131, 10, 140, 105, 164, 155, 119, 134, 71, 57, 12, 116, 94, 147, 136, 132, 63, 169, 5, 96, 112, 102, 39, 142, 68, 160, 45, 100, 22, 70, 138, 50, 64, 115, 25, 161, 149, 146, 29, 101, 137, 47, 73, 16, 69, 7, 13, 3, 67, 38, 118, 21, 41, 162, 53, 78, 66, 141, 44, 77, 61, 91, 37, 30, 80, 19, 4, 152, and 165.

FIG. 257 is a diagram showing an example of the GW pattern for the LDPC code having the code length N of 64 k bits when the modulation scheme is 64-QAM and the code rate r is 4/15.

According to the original GW pattern (A) of FIG. 257, the arrangement of bit groups 0 to 179 of the LDPC code of 64 k bits is interleaved into the arrangement of bit groups 141, 80, 47, 89, 44, 7, 46, 11, 175, 173, 99, 2, 155, 52, 86, 128, 174, 33, 170, 31, 35, 162, 64, 95, 92, 4, 16, 49, 137, 104, 29, 9, 60, 167, 50, 23, 43, 176, 121, 71, 132, 103, 144, 39, 12, 90, 114, 131, 106, 76, 118, 66, 24, 58, 122, 150, 57, 149, 93, 53, 14, 73, 165, 82, 126, 97, 59, 133, 154, 153, 72, 36, 5, 96, 120, 134, 101, 61, 115, 0, 28, 42, 18, 145, 156, 85, 146, 6, 161, 10, 22, 138, 127, 151, 87, 54, 20, 139, 140, 152, 13, 91, 111, 25, 123, 77, 78, 69, 3, 177, 41, 81, 19, 107, 45, 148, 70, 160, 51, 21, 116, 48, 157, 17, 125, 142, 83, 110, 37, 98, 179, 129, 168, 172, 1, 40, 166, 159, 147, 56, 100, 63, 26, 169, 135, 15, 75, 84, 163, 79, 143, 113, 94, 74, 102, 30, 38, 178, 68, 108, 136, 105, 158, 117, 34, 109, 67, 62, 32, 119, 124, 171, 8, 55, 65, 130, 88, 112, 27, and 164.

According to the converted GW pattern (B) of FIG. 257, the arrangement of bit groups 0 to 179 of the LDPC code of 64 k bits is interleaved into the arrangement of bit groups 141, 29, 14, 22, 116, 143, 80, 9, 73, 138, 48, 113, 47, 60, 165, 127, 157, 94, 89, 167, 82, 151, 17, 74, 44, 50, 126, 87, 125, 102, 7, 23, 97, 54, 142, 30, 46, 43, 59, 20, 83, 38, 11, 176, 133, 139, 110, 178, 175, 121, 154, 140, 37, 68, 173, 71, 153, 152, 98, 108, 99, 132, 72, 13, 179, 136, 2, 103, 36, 91, 129, 105, 155, 144, 5, 111, 168, 158, 52, 39, 96, 25, 172, 117, 86, 12, 120, 123, 1, 34, 128, 90, 134, 77, 40, 109, 174, 114, 101, 78, 166, 67, 33, 131, 61, 69, 159, 62, 170, 106, 115, 3, 147, 32, 31, 76, 0, 177, 56, 119, 35, 118, 28, 41, 100, 124, 162, 66, 42, 81, 63, 171, 64, 24, 18, 19, 26, 8, 95, 58, 145, 107, 169, 55, 92, 122, 156, 45, 135, 65, 4, 150, 85, 148, 15, 130, 16, 57, 146, 70, 75, 88, 49, 149, 6, 160, 84, 112, 137, 93, 161, 51, 163, 27, 104, 53, 10, 21, 79, and 164.

FIG. 258 is a diagram showing an example of the GW pattern for the LDPC code having the code length N of 64 k bits when the modulation scheme is 64-QAM and the code rate r is 5/15.

According to the original GW pattern (A) of FIG. 258, the arrangement of bit groups 0 to 179 of the LDPC code of 64 k bits is interleaved into the arrangement of bit groups 166, 54, 6, 27, 141, 134, 58, 46, 55, 91, 56, 100, 172, 80, 18, 152, 12, 108, 170, 29, 144, 147, 106, 165, 17, 127, 57, 88, 35, 72, 5, 63, 118, 1, 85, 77, 61, 62, 84, 159, 92, 102, 98, 177, 132, 139, 59, 149, 11, 8, 154, 129, 33, 15, 143, 4, 95, 101, 53, 42, 40, 9, 111, 130, 123, 82, 81, 114, 119, 175, 157, 41, 38, 128, 161, 52, 142, 7, 26, 145, 2, 68, 28, 126, 121, 70, 16, 65, 83, 125, 50, 79, 37, 74, 164, 168, 160, 122, 60, 32, 24, 138, 75, 69, 0, 36, 97, 117, 14, 109, 173, 120, 112, 87, 176, 124, 151, 67, 13, 94, 105, 133, 64, 76, 153, 31, 136, 140, 150, 39, 96, 66, 3, 115, 20, 99, 171, 49, 25, 45, 22, 30, 156, 158, 163, 135, 21, 146, 90, 169, 78, 93, 178, 116, 19, 155, 110, 73, 104, 167, 44, 113, 162, 89, 47, 43, 86, 48, 107, 71, 137, 51, 174, 103, 131, 179, 148, 10, 23, and 34.

According to the converted GW pattern (B) of FIG. 258, the arrangement of bit groups 0 to 179 of the LDPC code of 64 k bits is interleaved into the arrangement of bit groups 166, 5, 40, 50, 105, 78, 54, 63, 9, 79, 133, 93, 6, 118, 111, 37, 64, 178, 27, 1, 130, 74, 76, 116, 141, 85, 123, 164, 153, 19, 134, 77, 82, 168, 31, 155, 58, 61, 81, 160, 136, 110, 46, 62, 114, 122, 140, 73, 55, 84, 119, 60, 150, 104, 91, 159, 175, 32, 39, 167, 56, 92, 157, 24, 96, 44, 100, 102, 41, 138, 66, 113, 172, 98, 38, 75, 3, 162, 80, 177, 128, 69, 115, 89, 18, 132, 161, 0, 20, 47, 152, 139, 52, 36, 99, 43, 12, 59, 142, 97, 171, 86, 108, 149, 7, 117, 49, 48, 170, 11, 26, 14, 25, 107, 29, 8, 145, 109, 45, 71, 144, 154, 2, 173, 22, 137, 147, 129, 68, 120, 30, 51, 106, 33, 28, 112, 156, 174, 165, 15, 126, 87, 158, 103, 17, 143, 121, 176, 163, 131, 127, 4, 70, 124, 135, 179, 57, 95, 16, 151, 21, 148, 88, 101, 65, 67, 146, 10, 35, 53, 83, 13, 90, 23, 72, 42, 125, 94, 169, and 34.

FIG. 259 is a diagram showing an example of the GW pattern for the LDPC code having the code length N of 64 k bits when the modulation scheme is 64-QAM and the code rate r is 6/15.

According to the original GW pattern (A) of FIG. 259, the arrangement of bit groups 0 to 179 of the LDPC code of 64 k bits is interleaved into the arrangement of bit groups 29, 17, 38, 37, 27, 43, 31, 35, 16, 46, 44, 9, 23, 1, 34, 45, 14, 18, 156, 19, 22, 40, 50, 24, 56, 49, 26, 42, 69, 47, 59, 61, 66, 52, 64, 65, 67, 54, 170, 68, 132, 51, 70, 41, 21, 5, 160, 7, 13, 55, 62, 53, 63, 58, 3, 167, 71, 57, 151, 60, 36, 25, 74, 39, 32, 72, 85, 86, 107, 113, 48, 88, 2, 129, 137, 20, 73, 166, 75, 77, 142, 174, 15, 149, 28, 145, 92, 169, 30, 133, 163, 119, 82, 176, 152, 134, 139, 148, 164, 99, 173, 104, 83, 106, 112, 135, 153, 0, 128, 144, 98, 171, 94, 97, 143, 110, 118, 127, 84, 79, 108, 126, 131, 93, 111, 91, 4, 125, 162, 157, 158, 109, 140, 123, 154, 150, 80, 11, 12, 146, 96, 81, 165, 8, 89, 138, 105, 141, 103, 6, 100, 161, 172, 78, 101, 115, 179, 147, 116, 136, 122, 87, 33, 130, 124, 175, 120, 90, 102, 10, 114, 159, 76, 177, 178, 121, 168, 95, 117, and 155.

According to the converted GW pattern (B) of FIG. 259, the arrangement of bit groups 0 to 179 of the LDPC code of 64 k bits is interleaved into the arrangement of bit groups 29, 59, 36, 163, 108, 100, 17, 61, 25, 119, 126, 161, 38, 66, 74, 82, 131, 172, 37, 52, 39, 176, 93, 78, 27, 64, 32, 152, 111, 101, 43, 65, 72, 134, 91, 115, 31, 67, 85, 139, 4, 179, 35, 54, 86, 148, 125, 147, 16, 170, 107, 164, 162, 116, 46, 68, 113, 99, 157, 136, 44, 132, 48, 173, 158, 122, 9, 51, 88, 104, 109, 87, 23, 70, 2, 83, 140, 33, 1, 41, 129, 106, 123, 130, 34, 21, 137, 112, 154, 124, 45, 5, 20, 135, 150, 175, 14, 160, 73, 153, 80, 120, 18, 7, 166, 0, 11, 90, 156, 13, 75, 128, 12, 102, 19, 55, 77, 144, 146, 10, 22, 62, 142, 98, 96, 114, 40, 53, 174, 171, 81, 159, 50, 63, 15, 94, 165, 76, 24, 58, 149, 97, 8, 177, 56, 3, 28, 143, 89, 178, 49, 167, 145, 110, 138, 121, 26, 71, 92, 118, 105, 168, 42, 57, 169, 127, 141, 95, 69, 151, 30, 84, 103, 117, 47, 60, 133, 79, 6, and 155.

FIG. 260 is a diagram showing an example of the GW pattern for the LDPC code having the code length N of 64 k bits when the modulation scheme is 64-QAM and the code rate r is 7/15.

According to the original GW pattern (B) of FIG. 260, the arrangement of bit groups 0 to 179 of the LDPC code of 64 k bits is interleaved into the arrangement of bit groups 103, 36, 155, 175, 52, 130, 16, 178, 141, 86, 49, 129, 73, 84, 142, 177, 110, 8, 96, 77, 139, 167, 109, 2, 17, 37, 146, 169, 54, 134, 101, 78, 135, 70, 153, 6, 29, 41, 143, 63, 47, 124, 90, 31, 152, 98, 59, 133, 15, 79, 164, 67, 50, 128, 23, 34, 154, 69, 45, 9, 27, 35, 156, 170, 113, 127, 102, 82, 149, 176, 46, 13, 22, 30, 163, 60, 114, 11, 92, 44, 157, 74, 48, 132, 24, 87, 140, 66, 118, 123, 104, 89, 136, 64, 107, 14, 99, 43, 115, 71, 117, 12, 26, 38, 147, 62, 57, 131, 94, 33, 151, 172, 116, 10, 25, 75, 144, 179, 51, 120, 20, 80, 160, 174, 106, 1, 21, 88, 137, 61, 105, 5, 18, 32, 158, 72, 56, 125, 28, 42, 161, 168, 53, 7, 100, 40, 145, 171, 55, 3, 95, 83, 162, 173, 119, 126, 91, 39, 150, 165, 112, 122, 93, 76, 138, 166, 108, 121, 97, 81, 148, 65, 111, 4, 19, 85, 159, 68, 58, and 0.

According to the converted GW pattern (A) of FIG. 260, the arrangement of bit groups 0 to 179 of the LDPC code of 64 k bits is interleaved into the arrangement of bit groups 103, 16, 73, 96, 17, 101, 29, 90, 15, 23, 27, 102, 22, 92, 24, 104, 99, 26, 94, 25, 20, 21, 18, 28, 100, 95, 91, 93, 97, 19, 36, 178, 84, 77, 37, 78, 41, 31, 79, 34, 35, 82, 30, 44, 87, 89, 43, 38, 33, 75, 80, 88, 32, 42, 40, 83, 39, 76, 81, 85, 155, 141, 142, 139, 146, 135, 143, 152, 164, 154, 156, 149, 163, 157, 140, 136, 115, 147, 151, 144, 160, 137, 158, 161, 145, 162, 150, 138, 148, 159, 175, 86, 177, 167, 169, 70, 63, 98, 67, 69, 170, 176, 60, 74, 66, 64, 71, 62, 172, 179, 174, 61, 72, 168, 171, 173, 165, 166, 65, 68, 52, 49, 110, 109, 54, 153, 47, 59, 50, 45, 113, 46, 114, 48, 118, 107, 117, 57, 116, 51, 106, 105, 56, 53, 55, 119, 112, 108, 111, 58, 130, 129, 8, 2, 134, 6, 124, 133, 128, 9, 127, 13, 11, 132, 123, 14, 12, 131, 10, 120, 1, 5, 125, 7, 3, 126, 122, 121, 4, and 0.

FIG. 261 is a diagram showing an example of the GW pattern for the LDPC code having the code length N of 64 k bits when the modulation scheme is 64-QAM and the code rate r is 8/15.

According to the original GW pattern (A) of FIG. 261, the arrangement of bit groups 0 to 179 of the LDPC code of 64 k bits is interleaved into the arrangement of bit groups 86, 71, 51, 48, 89, 94, 46, 81, 67, 49, 80, 37, 55, 61, 36, 57, 52, 92, 60, 82, 76, 72, 44, 42, 91, 62, 50, 90, 40, 78, 53, 58, 47, 85, 70, 4, 69, 43, 54, 84, 93, 38, 8, 64, 6, 18, 77, 95, 66, 59, 83, 73, 17, 87, 3, 75, 65, 88, 79, 14, 151, 117, 32, 22, 123, 30, 33, 162, 144, 9, 121, 108, 139, 142, 24, 34, 20, 157, 159, 138, 143, 29, 140, 163, 150, 175, 114, 31, 12, 35, 145, 28, 27, 26, 16, 98, 102, 103, 133, 161, 21, 25, 107, 153, 45, 156, 23, 125, 141, 56, 166, 5, 1, 170, 119, 68, 134, 41, 74, 179, 2, 129, 169, 101, 99, 109, 127, 168, 176, 11, 0, 122, 110, 113, 146, 132, 165, 19, 13, 39, 7, 164, 106, 172, 154, 149, 10, 173, 131, 167, 63, 147, 155, 100, 171, 158, 160, 15, 178, 148, 152, 104, 124, 177, 97, 130, 118, 137, 111, 126, 120, 105, 115, 136, 112, 96, 135, 116, 174, and 128.

According to the converted GW pattern (B) of FIG. 261, the arrangement of bit groups 0 to 179 of the LDPC code of 64 k bits is interleaved into the arrangement of bit groups 86, 53, 151, 145, 2, 63, 71, 58, 117, 28, 129, 147, 51, 47, 32, 27, 169, 155, 48, 85, 22, 26, 101, 100, 89, 70, 123, 16, 99, 171, 94, 4, 30, 98, 109, 158, 46, 69, 33, 102, 127, 160, 81, 43, 162, 103, 168, 15, 67, 54, 144, 133, 176, 178, 49, 84, 9, 161, 11, 148, 80, 93, 121, 21, 0, 152, 37, 38, 108, 25, 122, 104, 55, 8, 139, 107, 110, 124, 61, 64, 142, 153, 113, 177, 36, 6, 24, 45, 146, 97, 57, 18, 34, 156, 132, 130, 52, 77, 20, 23, 165, 118, 92, 95, 157, 125, 19, 137, 60, 66, 159, 141, 13, 111, 82, 59, 138, 56, 39, 126, 76, 83, 143, 166, 7, 120, 72, 73, 29, 5, 164, 105, 44, 17, 140, 1, 106, 115, 42, 87, 163, 170, 172, 136, 91, 3, 150, 119, 154, 112, 62, 75, 175, 68, 149, 96, 50, 65, 114, 134, 10, 135, 90, 88, 31, 41, 173, 116, 40, 79, 12, 74, 131, 174, 78, 14, 35, 179, 167, and 128.

FIG. 262 is a diagram showing an example of the GW pattern for the LDPC code having the code length N of 64 k bits when the modulation scheme is 64-QAM and the code rate r is 9/15.

According to the original GW pattern (B) of FIG. 262, the arrangement of bit groups 0 to 179 of the LDPC code of 64 k bits is interleaved into the arrangement of bit groups 175, 60, 133, 11, 5, 4, 70, 97, 131, 80, 42, 136, 50, 104, 32, 75, 176, 87, 109, 61, 39, 107, 0, 172, 23, 90, 54, 160, 48, 173, 27, 100, 129, 14, 7, 142, 20, 103, 38, 126, 157, 144, 21, 64, 44, 79, 105, 146, 49, 93, 1, 84, 81, 145, 18, 15, 106, 91, 12, 169, 63, 71, 125, 37, 120, 138, 17, 113, 31, 130, 140, 8, 25, 74, 134, 115, 9, 171, 46, 68, 33, 116, 2, 179, 52, 92, 36, 78, 164, 177, 24, 72, 122, 118, 162, 121, 16, 73, 45, 53, 77, 110, 30, 66, 29, 76, 158, 148, 111, 94, 43, 83, 139, 10, 56, 98, 114, 117, 152, 174, 47, 62, 128, 85, 155, 178, 26, 96, 41, 82, 150, 143, 58, 69, 127, 86, 13, 141, 35, 101, 149, 108, 3, 154, 51, 95, 132, 135, 163, 137, 28, 102, 123, 112, 151, 167, 59, 19, 156, 119, 153, 168, 55, 65, 34, 6, 159, 170, 57, 67, 40, 89, 147, 165, 22, 99, 124, 88, 161, and 166.

According to the converted GW pattern (A) of FIG. 262, the arrangement of bit groups 0 to 179 of the LDPC code of 64 k bits is interleaved into the arrangement of bit groups 175, 70, 50, 109, 23, 27, 20, 21, 49, 18, 63, 17, 25, 46, 52, 24, 16, 30, 111, 56, 47, 26, 58, 35, 51, 28, 59, 55, 57, 22, 60, 97, 104, 61, 90, 100, 103, 64, 93, 15, 71, 113, 74, 68, 92, 72, 73, 66, 94, 98, 62, 96, 69, 101, 95, 102, 19, 65, 67, 99, 133, 131, 32, 39, 54, 129, 38, 44, 1, 106, 125, 31, 134, 33, 36, 122, 45, 29, 43, 114, 128, 41, 127, 149, 132, 123, 156, 34, 40, 124, 11, 80, 75, 107, 160, 14, 126, 79, 84, 91, 37, 130, 115, 116, 78, 118, 53, 76, 83, 117, 85, 82, 86, 108, 135, 112, 119, 6, 89, 88, 5, 42, 176, 0, 48, 7, 157, 105, 81, 12, 120, 140, 9, 2, 164, 162, 77, 158, 139, 152, 155, 150, 13, 3, 163, 151, 153, 159, 147, 161, 4, 136, 87, 172, 173, 142, 144, 146, 145, 169, 138, 8, 171, 179, 177, 121, 110, 148, 10, 174, 178, 143, 141, 154, 137, 167, 168, 170, 165, and 166.

FIG. 263 is a diagram showing an example of the GW pattern for the LDPC code having the code length N of 64 k bits when the modulation scheme is 64-QAM and the code rate r is 10/15.

According to the original GW pattern (B) of FIG. 263, the arrangement of bit groups 0 to 179 of the LDPC code of 64 k bits is interleaved into the arrangement of bit groups 16, 163, 92, 56, 111, 141, 65, 118, 78, 55, 5, 148, 19, 153, 75, 128, 32, 178, 22, 156, 99, 124, 4, 168, 20, 115, 87, 122, 9, 166, 27, 155, 94, 134, 38, 137, 67, 161, 90, 127, 43, 171, 64, 162, 98, 133, 34, 138, 73, 154, 100, 58, 103, 169, 23, 117, 88, 50, 13, 175, 68, 39, 102, 54, 37, 149, 29, 150, 104, 59, 3, 139, 69, 110, 77, 131, 42, 142, 25, 158, 80, 47, 35, 143, 72, 151, 84, 57, 8, 176, 61, 46, 41, 51, 10, 173, 63, 107, 125, 48, 11, 177, 24, 30, 91, 76, 109, 140, 74, 114, 82, 120, 1, 79, 66, 119, 93, 159, 36, 174, 26, 112, 101, 123, 44, 145, 60, 157, 97, 45, 33, 167, 70, 152, 85, 126, 40, 135, 62, 108, 95, 49, 31, 147, 71, 113, 89, 132, 6, 144, 18, 105, 83, 130, 2, 172, 17, 164, 81, 52, 7, 179, 28, 160, 136, 121, 14, 146, 15, 106, 86, 129, 12, 170, 21, 116, 96, 53, 0, and 165.

According to the converted GW pattern (A) of FIG. 263, the arrangement of bit groups 0 to 179 of the LDPC code of 64 k bits is interleaved into the arrangement of bit groups 16, 65, 19, 22, 20, 27, 67, 64, 73, 23, 68, 29, 69, 25, 72, 61, 63, 24, 74, 66, 26, 60, 70, 62, 71, 18, 17, 28, 15, 21, 163, 118, 153, 156, 115, 155, 161, 162, 154, 117, 39, 150, 110, 158, 151, 46, 107, 30, 114, 119, 112, 157, 152, 108, 113, 105, 164, 160, 106, 116, 92, 78, 75, 99, 87, 94, 90, 98, 100, 88, 102, 104, 77, 80, 84, 41, 125, 91, 82, 93, 101, 97, 85, 95, 89, 83, 81, 136, 86, 96, 56, 55, 128, 124, 122, 134, 127, 133, 58, 50, 54, 59, 131, 47, 57, 51, 48, 76, 120, 159, 123, 45, 126, 49, 132, 130, 52, 121, 129, 53, 111, 5, 32, 4, 9, 38, 43, 34, 103, 13, 37, 3, 42, 35, 8, 10, 11, 109, 1, 36, 44, 33, 40, 31, 6, 2, 7, 14, 12, 0, 141, 148, 178, 168, 166, 137, 171, 138, 169, 175, 149, 139, 142, 143, 176, 173, 177, 140, 79, 174, 145, 167, 135, 147, 144, 172, 179, 146, 170, and 165.

FIG. 264 is a diagram showing an example of the GW pattern for the LDPC code having the code length N of 64 k bits when the modulation scheme is 64-QAM and the code rate r is 11/15.

According to the original GW pattern (A) of FIG. 264, the arrangement of bit groups 0 to 179 of the LDPC code of 64 k bits is interleaved into the arrangement of bit groups 12, 15, 2, 16, 27, 50, 35, 74, 38, 70, 108, 32, 112, 54, 30, 122, 72, 116, 36, 90, 49, 85, 132, 138, 144, 150, 156, 162, 168, 174, 0, 14, 9, 5, 23, 66, 68, 52, 96, 117, 84, 128, 100, 63, 60, 127, 81, 99, 53, 55, 103, 95, 133, 139, 145, 151, 157, 163, 169, 175, 10, 22, 13, 11, 28, 104, 37, 57, 115, 46, 65, 129, 107, 75, 119, 110, 31, 43, 97, 78, 125, 58, 134, 140, 146, 152, 158, 164, 170, 176, 4, 19, 6, 8, 24, 44, 101, 94, 118, 130, 69, 71, 83, 34, 86, 124, 48, 106, 89, 40, 102, 91, 135, 141, 147, 153, 159, 165, 171, 177, 3, 20, 7, 17, 25, 87, 41, 120, 47, 80, 59, 62, 88, 45, 56, 131, 61, 126, 113, 92, 51, 98, 136, 142, 148, 154, 160, 166, 172, 178, 21, 18, 1, 26, 29, 39, 73, 121, 105, 77, 42, 114, 93, 82, 111, 109, 67, 79, 123, 64, 76, 33, 137, 143, 149, 155, 161, 167, 173, and 179.

According to the converted GW pattern (B) of FIG. 264, the arrangement of bit groups 0 to 179 of the LDPC code of 64 k bits is interleaved into the arrangement of bit groups 12, 0, 10, 4, 3, 21, 15, 14, 22, 19, 20, 18, 2, 9, 13, 6, 7, 1, 16, 5, 11, 8, 17, 26, 27, 23, 28, 24, 25, 29, 50, 66, 104, 44, 87, 39, 35, 68, 37, 101, 41, 73, 74, 52, 57, 94, 120, 121, 38, 96, 115, 118, 47, 105, 70, 117, 46, 130, 80, 77, 108, 84, 65, 69, 59, 42, 32, 128, 129, 71, 62, 114, 112, 100, 107, 83, 88, 93, 54, 63, 75, 34, 45, 82, 30, 60, 119, 86, 56, 111, 122, 127, 110, 124, 131, 109, 72, 81, 31, 48, 61, 67, 116, 99, 43, 106, 126, 79, 36, 53, 97, 89, 113, 123, 90, 55, 78, 40, 92, 64, 49, 103, 125, 102, 51, 76, 85, 95, 58, 91, 98, 33, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, and 179.

FIG. 265 is a diagram showing an example of the GW pattern for the LDPC code having the code length N of 64 k bits when the modulation scheme is 64-QAM and the code rate r is 12/15.

According to the original GW pattern (A) of FIG. 265, the arrangement of bit groups 0 to 179 of the LDPC code of 64 k bits is interleaved into the arrangement of bit groups 83, 93, 94, 47, 55, 40, 38, 77, 110, 124, 87, 61, 102, 76, 33, 35, 92, 59, 74, 11, 138, 72, 67, 37, 10, 95, 139, 131, 44, 57, 97, 53, 142, 0, 136, 9, 143, 86, 100, 21, 15, 75, 62, 19, 65, 129, 101, 79, 22, 68, 73, 23, 18, 81, 98, 112, 8, 128, 103, 25, 43, 126, 54, 90, 28, 109, 46, 91, 41, 82, 113, 134, 52, 105, 78, 27, 135, 96, 56, 140, 64, 66, 89, 34, 120, 108, 63, 45, 69, 121, 88, 39, 29, 133, 106, 117, 127, 32, 42, 58, 71, 118, 51, 84, 85, 80, 104, 132, 111, 30, 26, 48, 50, 31, 141, 116, 123, 114, 70, 107, 178, 145, 173, 36, 144, 130, 176, 171, 175, 125, 99, 162, 159, 20, 164, 115, 169, 172, 165, 161, 151, 119, 122, 152, 157, 4, 137, 148, 153, 170, 154, 166, 13, 150, 16, 167, 174, 163, 49, 6, 168, 147, 146, 1, 149, 158, 179, 12, 5, 160, 177, 60, 24, 156, 7, 155, 17, 3, 2, and 14.

According to the converted GW pattern (B) of FIG. 265, the arrangement of bit groups 0 to 179 of the LDPC code of 64 k bits is interleaved into the arrangement of bit groups 83, 97, 43, 88, 178, 154, 93, 53, 126, 39, 145, 166, 94, 142, 54, 29, 173, 13, 47, 0, 90, 133, 36, 150, 55, 136, 28, 106, 144, 16, 40, 9, 109, 117, 130, 167, 38, 143, 46, 127, 176, 174, 77, 86, 91, 32, 171, 163, 110, 100, 41, 42, 175, 49, 124, 21, 82, 58, 125, 6, 87, 15, 113, 71, 99, 168, 61, 75, 134, 118, 162, 147, 102, 62, 52, 51, 159, 146, 76, 19, 105, 84, 20, 1, 33, 65, 78, 85, 164, 149, 35, 129, 27, 80, 115, 158, 92, 101, 135, 104, 169, 179, 59, 79, 96, 132, 172, 12, 74, 22, 56, 111, 165, 5, 11, 68, 140, 30, 161, 160, 138, 73, 64, 26, 151, 177, 72, 23, 66, 48, 119, 60, 67, 18, 89, 50, 122, 24, 37, 81, 34, 31, 152, 156, 10, 98, 120, 141, 157, 7, 95, 112, 108, 116, 4, 155, 139, 8, 63, 123, 137, 17, 131, 128, 45, 114, 148, 3, 44, 103, 69, 70, 153, 2, 57, 25, 121, 107, 170, and 14.

FIG. 266 is a diagram showing an example of the GW pattern for the LDPC code having the code length N of 64 k bits when the modulation scheme is 64-QAM and the code rate r is 13/15.

According to the original GW pattern (B) of FIG. 266, the arrangement of bit groups 0 to 179 of the LDPC code of 64 k bits is interleaved into the arrangement of bit groups 146, 91, 63, 144, 46, 12, 58, 137, 25, 79, 70, 33, 134, 148, 66, 38, 163, 118, 139, 130, 72, 92, 160, 23, 133, 153, 128, 86, 152, 106, 53, 93, 61, 5, 158, 172, 121, 135, 44, 149, 168, 0, 124, 143, 27, 30, 151, 114, 113, 43, 138, 89, 159, 17, 120, 136, 102, 81, 170, 176, 142, 104, 21, 78, 155, 8, 52, 95, 62, 40, 174, 6, 131, 48, 18, 1, 179, 34, 123, 77, 26, 84, 157, 85, 56, 147, 67, 76, 162, 10, 51, 103, 140, 87, 175, 115, 4, 101, 69, 80, 169, 75, 49, 97, 154, 83, 14, 2, 132, 96, 16, 37, 166, 109, 54, 42, 28, 32, 171, 119, 55, 94, 65, 20, 165, 3, 47, 90, 117, 88, 177, 11, 59, 68, 73, 41, 150, 111, 127, 100, 110, 31, 167, 13, 122, 145, 71, 22, 173, 116, 126, 141, 29, 39, 178, 57, 125, 36, 19, 7, 156, 107, 9, 98, 74, 45, 161, 112, 50, 99, 24, 35, 164, 64, 129, 15, 60, 82, 108, and 105.

According to the converted GW pattern (A) of FIG. 266, the arrangement of bit groups 0 to 179 of the LDPC code of 64 k bits is interleaved into the arrangement of bit groups 146, 58, 134, 139, 133, 53, 121, 124, 113, 120, 142, 52, 131, 123, 56, 51, 4, 49, 132, 54, 55, 47, 59, 127, 122, 126, 125, 9, 50, 129, 91, 137, 148, 130, 153, 93, 135, 143, 43, 136, 104, 95, 48, 77, 147, 103, 101, 97, 96, 42, 94, 90, 68, 100, 145, 141, 36, 98, 99, 15, 63, 25, 66, 72, 128, 61, 44, 27, 138, 102, 21, 62, 18, 26, 67, 140, 69, 154, 16, 28, 65, 117, 73, 110, 71, 29, 19, 74, 24, 60, 144, 79, 38, 92, 86, 5, 149, 30, 89, 81, 78, 40, 1, 84, 76, 87, 80, 83, 37, 32, 20, 88, 41, 31, 22, 39, 7, 45, 35, 82, 46, 70, 163, 160, 152, 158, 168, 151, 159, 170, 155, 174, 179, 157, 162, 175, 169, 14, 166, 171, 165, 177, 150, 167, 173, 178, 156, 161, 164, 108, 12, 33, 118, 23, 106, 172, 0, 114, 17, 176, 8, 6, 34, 85, 10, 115, 75, 2, 109, 119, 3, 11, 111, 13, 116, 57, 107, 112, 64, and 105.

FIG. 267 is a diagram showing an example of the GW pattern for the LDPC code having the code length N of 64 k bits when the modulation scheme is 256-QAM and the code rate r is 2/15.

According to the original GW pattern (A) of FIG. 267, the arrangement of bit groups 0 to 179 of the LDPC code of 64 k bits is interleaved into the arrangement of bit groups 112, 78, 104, 6, 59, 80, 49, 120, 114, 27, 113, 3, 109, 44, 69, 164, 91, 137, 39, 31, 21, 127, 151, 8, 47, 176, 117, 68, 122, 148, 79, 73, 7, 166, 51, 50, 116, 66, 152, 61, 29, 107, 22, 154, 118, 94, 24, 35, 55, 38, 88, 54, 2, 15, 19, 67, 101, 74, 169, 138, 41, 162, 175, 136, 62, 161, 121, 163, 115, 135, 123, 25, 140, 156, 58, 33, 119, 111, 146, 129, 150, 147, 97, 18, 60, 4, 81, 168, 43, 105, 36, 65, 13, 5, 108, 145, 23, 70, 20, 173, 159, 100, 128, 172, 170, 1, 37, 83, 102, 103, 157, 139, 179, 32, 144, 92, 131, 75, 155, 14, 9, 149, 63, 11, 134, 53, 99, 17, 57, 90, 30, 98, 64, 40, 87, 158, 77, 93, 124, 46, 171, 141, 133, 85, 177, 132, 26, 160, 42, 34, 82, 96, 48, 10, 142, 125, 178, 153, 72, 45, 89, 52, 28, 126, 143, 167, 76, 86, 130, 110, 174, 16, 165, 56, 84, 95, 0, 106, 12, and 71.

According to the converted GW pattern (B) of FIG. 267, the arrangement of bit groups 0 to 179 of the LDPC code of 64 k bits is interleaved into the arrangement of bit groups 112, 151, 118, 121, 43, 157, 64, 142, 78, 8, 94, 163, 105, 139, 40, 125, 104, 47, 24, 115, 36, 179, 87, 178, 6, 176, 35, 135, 65, 32, 158, 153, 59, 117, 55, 123, 13, 144, 77, 72, 80, 68, 38, 25, 5, 92, 93, 45, 49, 122, 88, 140, 108, 131, 124, 89, 120, 148, 54, 156, 145, 75, 46, 52, 114, 79, 2, 58, 23, 155, 171, 28, 27, 73, 15, 33, 70, 14, 141, 126, 113, 7, 19, 119, 20, 9, 133, 143, 3, 166, 67, 111, 173, 149, 85, 167, 109, 51, 101, 146, 159, 63, 177, 76, 44, 50, 74, 129, 100, 11, 132, 86, 69, 116, 169, 150, 128, 134, 26, 130, 164, 66, 138, 147, 172, 53, 160, 110, 91, 152, 41, 97, 170, 99, 42, 174, 137, 61, 162, 18, 1, 17, 34, 16, 39, 29, 175, 60, 37, 57, 82, 165, 31, 107, 136, 4, 83, 90, 96, 56, 21, 22, 62, 81, 102, 30, 48, 84, 127, 154, 161, 168, 103, 98, 10, 95, 0, 106, 12, and 71.

FIG. 268 is a diagram showing an example of the GW pattern for the LDPC code having the code length N of 64 k bits when the modulation scheme is 256-QAM and the code rate r is 3/15.

According to the original GW pattern (A) of FIG. 268, the arrangement of bit groups 0 to 179 of the LDPC code of 64 k bits is interleaved into the arrangement of bit groups 136, 28, 85, 38, 40, 89, 133, 117, 3, 58, 154, 77, 14, 179, 96, 101, 26, 169, 37, 83, 162, 165, 24, 66, 109, 126, 10, 155, 70, 157, 105, 175, 67, 158, 32, 42, 147, 140, 30, 7, 92, 59, 119, 56, 0, 5, 90, 174, 13, 47, 76, 88, 86, 108, 27, 18, 12, 8, 61, 145, 75, 125, 112, 69, 120, 137, 116, 20, 178, 98, 176, 29, 68, 168, 124, 21, 35, 150, 131, 159, 163, 84, 23, 123, 65, 103, 93, 99, 102, 31, 64, 74, 46, 94, 80, 129, 142, 128, 148, 111, 134, 173, 60, 118, 2, 170, 135, 1, 115, 143, 95, 177, 73, 43, 11, 114, 91, 78, 107, 172, 25, 36, 164, 149, 153, 110, 44, 146, 82, 127, 45, 33, 50, 41, 52, 156, 34, 4, 79, 141, 138, 122, 53, 160, 81, 16, 100, 130, 71, 121, 132, 9, 22, 113, 6, 152, 15, 171, 17, 57, 49, 151, 161, 63, 55, 139, 166, 97, 19, 51, 72, 167, 106, 48, 144, 87, 104, 62, 54, and 39.

According to the converted GW pattern (B) of FIG. 268, the arrangement of bit groups 0 to 179 of the LDPC code of 64 k bits is interleaved into the arrangement of bit groups 136, 24, 0, 116, 102, 95, 50, 6, 28, 66, 5, 20, 31, 177, 41, 152, 85, 109, 90, 178, 64, 73, 52, 15, 38, 126, 174, 98, 74, 43, 156, 171, 40, 10, 13, 176, 46, 11, 34, 17, 89, 155, 47, 29, 94, 114, 4, 57, 133, 70, 76, 68, 80, 91, 79, 49, 117, 157, 88, 168, 129, 78, 141, 151, 3, 105, 86, 124, 142, 107, 138, 161, 58, 175, 108, 21, 128, 172, 122, 63, 154, 67, 27, 35, 148, 25, 53, 55, 77, 158, 18, 150, 111, 36, 160, 139, 14, 32, 12, 131, 134, 164, 81, 166, 179, 42, 8, 159, 173, 149, 16, 97, 96, 147, 61, 163, 60, 153, 100, 19, 101, 140, 145, 84, 118, 110, 130, 51, 26, 30, 75, 23, 2, 44, 71, 72, 169, 7, 125, 123, 170, 146, 121, 167, 37, 92, 112, 65, 135, 82, 132, 106, 83, 59, 69, 103, 1, 127, 9, 48, 162, 119, 120, 93, 115, 45, 22, 144, 165, 56, 137, 99, 143, 33, 113, 87, 104, 62, 54, and 39.

FIG. 269 is a diagram showing an example of the GW pattern for the LDPC code having the code length N of 64 k bits when the modulation scheme is 256-QAM and the code rate r is 4/15.

According to the original GW pattern (A) of FIG. 269, the arrangement of bit groups 0 to 179 of the LDPC code of 64 k bits is interleaved into the arrangement of bit groups 13, 121, 137, 29, 27, 1, 70, 116, 35, 132, 109, 51, 55, 58, 11, 67, 136, 25, 145, 7, 75, 107, 45, 21, 127, 52, 90, 22, 100, 123, 69, 112, 155, 92, 151, 59, 5, 179, 44, 87, 56, 139, 65, 170, 46, 0, 124, 78, 166, 8, 61, 97, 120, 103, 4, 19, 64, 79, 28, 134, 93, 86, 60, 135, 126, 53, 63, 14, 122, 17, 150, 76, 42, 39, 23, 153, 95, 66, 50, 141, 176, 34, 161, 26, 106, 10, 43, 85, 131, 2, 147, 148, 144, 54, 115, 146, 101, 172, 114, 119, 3, 96, 133, 99, 167, 164, 9, 142, 68, 149, 94, 83, 16, 175, 73, 38, 143, 159, 130, 84, 169, 18, 138, 102, 72, 47, 32, 160, 82, 81, 168, 30, 12, 173, 156, 158, 125, 98, 62, 178, 48, 163, 117, 110, 91, 37, 80, 105, 31, 174, 111, 49, 113, 108, 74, 157, 128, 24, 118, 40, 88, 177, 154, 6, 162, 129, 77, 36, 165, 20, 89, 140, 15, 33, 104, 152, 71, 171, 57, and 41.

According to the converted GW pattern (B) of FIG. 269, the arrangement of bit groups 0 to 179 of the LDPC code of 64 k bits is interleaved into the arrangement of bit groups 13, 45, 46, 63, 131, 94, 12, 74, 121, 21, 0, 14, 2, 83, 173, 157, 137, 127, 124, 122, 147, 16, 156, 128, 29, 52, 78, 17, 148, 175, 158, 24, 27, 90, 166, 150, 144, 73, 125, 118, 1, 22, 8, 76, 54, 38, 98, 40, 70, 100, 61, 42, 115, 143, 62, 88, 116, 123, 97, 39, 146, 159, 178, 177, 35, 69, 120, 23, 101, 130, 48, 154, 132, 112, 103, 153, 172, 84, 163, 6, 109, 155, 4, 95, 114, 169, 117, 162, 51, 92, 19, 66, 119, 18, 110, 129, 55, 151, 64, 50, 3, 138, 91, 77, 58, 59, 79, 141, 96, 102, 37, 36, 11, 5, 28, 176, 133, 72, 80, 165, 67, 179, 134, 34, 99, 47, 105, 20, 136, 44, 93, 161, 167, 32, 31, 89, 25, 87, 86, 26, 164, 160, 174, 140, 145, 56, 60, 106, 9, 82, 111, 15, 7, 139, 135, 10, 142, 81, 49, 33, 75, 65, 126, 43, 68, 168, 113, 104, 107, 170, 53, 85, 149, 30, 108, 152, 71, 171, 57, and 41.

FIG. 270 is a diagram showing an example of the GW pattern for the LDPC code having the code length N of 64 k bits when the modulation scheme is 256-QAM and the code rate r is 5/15.

According to the original GW pattern (B) of FIG. 270, the arrangement of bit groups 0 to 179 of the LDPC code of 64 k bits is interleaved into the arrangement of bit groups 39, 45, 128, 84, 143, 148, 2, 75, 43, 50, 130, 87, 137, 151, 7, 71, 55, 51, 133, 90, 140, 149, 6, 177, 37, 124, 99, 83, 23, 159, 0, 176, 41, 121, 96, 89, 30, 161, 18, 172, 60, 49, 134, 104, 139, 166, 14, 179, 62, 48, 129, 105, 146, 160, 16, 174, 33, 54, 132, 112, 145, 150, 9, 77, 34, 117, 92, 82, 136, 165, 4, 67, 36, 44, 101, 81, 141, 156, 3, 175, 58, 47, 91, 102, 32, 158, 13, 178, 63, 118, 100, 85, 26, 167, 1, 173, 38, 116, 131, 107, 138, 162, 8, 72, 42, 115, 98, 108, 24, 152, 17, 171, 64, 123, 94, 110, 28, 147, 19, 169, 61, 46, 97, 106, 144, 164, 5, 70, 59, 53, 127, 88, 31, 153, 10, 73, 66, 119, 126, 111, 29, 155, 15, 170, 57, 120, 125, 80, 142, 168, 11, 68, 56, 52, 95, 103, 27, 154, 21, 78, 40, 122, 93, 86, 25, 163, 20, 79, 35, 114, 135, 109, 22, 157, 12, 69, 65, 74, 76, and 113.

According to the converted GW pattern (A) of FIG. 270, the arrangement of bit groups 0 to 179 of the LDPC code of 64 k bits is interleaved into the arrangement of bit groups 39, 43, 55, 37, 41, 60, 62, 33, 34, 36, 58, 63, 38, 42, 64, 61, 59, 66, 57, 56, 40, 35, 45, 50, 51, 124, 121, 49, 48, 54, 117, 44, 47, 118, 116, 115, 123, 46, 53, 119, 120, 52, 122, 114, 128, 130, 133, 99, 96, 134, 129, 132, 92, 101, 91, 100, 131, 98, 94, 97, 127, 126, 125, 95, 93, 135, 84, 87, 90, 83, 89, 104, 105, 112, 82, 81, 102, 85, 107, 108, 110, 106, 88, 111, 80, 103, 86, 109, 143, 137, 140, 23, 30, 139, 146, 145, 136, 141, 32, 26, 138, 24, 28, 144, 31, 29, 142, 27, 25, 22, 148, 151, 149, 159, 161, 166, 160, 150, 165, 156, 158, 167, 162, 152, 147, 164, 153, 155, 168, 154, 163, 157, 2, 7, 6, 0, 18, 14, 16, 9, 4, 3, 13, 1, 8, 17, 19, 5, 10, 15, 11, 21, 20, 12, 75, 71, 177, 176, 172, 179, 174, 77, 67, 175, 178, 173, 72, 171, 169, 70, 73, 170, 68, 78, 79, 69, 65, 74, 76, and 113.

FIG. 271 is a diagram showing an example of the GW pattern for the LDPC code having the code length N of 64 k bits when the modulation scheme is 256-QAM and the code rate r is 6/15.

According to the original GW pattern (B) of FIG. 271, the arrangement of bit groups 0 to 179 of the LDPC code of 64 k bits is interleaved into the arrangement of bit groups 99, 100, 15, 107, 54, 76, 153, 174, 61, 0, 36, 71, 62, 137, 108, 114, 65, 98, 151, 19, 112, 109, 152, 117, 35, 93, 43, 90, 154, 73, 150, 165, 23, 16, 91, 5, 169, 175, 120, 149, 26, 59, 49, 56, 156, 136, 110, 80, 58, 55, 40, 103, 159, 83, 127, 111, 155, 167, 11, 52, 116, 142, 133, 1, 2, 96, 77, 86, 122, 6, 131, 29, 51, 21, 17, 45, 126, 12, 3, 168, 41, 30, 37, 64, 164, 78, 8, 118, 113, 39, 48, 140, 14, 60, 82, 134, 25, 33, 50, 84, 28, 105, 123, 145, 7, 27, 34, 92, 115, 147, 74, 10, 68, 102, 67, 63, 101, 18, 66, 129, 24, 4, 119, 87, 42, 170, 143, 121, 38, 57, 95, 148, 89, 81, 158, 171, 32, 22, 69, 53, 130, 104, 161, 75, 141, 9, 47, 79, 162, 146, 124, 157, 70, 106, 31, 132, 166, 128, 138, 125, 44, 13, 85, 88, 135, 144, 173, 163, 20, 46, 97, 94, 139, 172, 72, 160, 176, 177, 178, and 179.

According to the converted GW pattern (A) of FIG. 271, the arrangement of bit groups 0 to 179 of the LDPC code of 64 k bits is interleaved into the arrangement of bit groups 99, 61, 65, 35, 23, 26, 58, 155, 2, 51, 41, 113, 25, 7, 68, 24, 38, 32, 141, 70, 44, 20, 100, 0, 98, 93, 16, 59, 55, 167, 96, 21, 30, 39, 33, 27, 102, 4, 57, 22, 9, 106, 13, 46, 15, 36, 151, 43, 91, 49, 40, 11, 77, 17, 37, 48, 50, 34, 67, 119, 95, 69, 47, 31, 85, 97, 107, 71, 19, 90, 5, 56, 103, 52, 86, 45, 64, 140, 84, 92, 63, 87, 148, 53, 79, 132, 88, 94, 54, 62, 112, 154, 169, 156, 159, 116, 122, 126, 164, 14, 28, 115, 101, 42, 89, 130, 162, 166, 135, 139, 76, 137, 109, 73, 175, 136, 83, 142, 6, 12, 78, 60, 105, 147, 18, 170, 81, 104, 146, 128, 144, 172, 153, 108, 152, 150, 120, 110, 127, 133, 131, 3, 8, 82, 123, 74, 66, 143, 158, 161, 124, 138, 173, 72, 174, 114, 117, 165, 149, 80, 111, 1, 29, 168, 118, 134, 145, 10, 129, 121, 171, 75, 157, 125, 163, 160, 176, 177, 178, and 179.

FIG. 272 is a diagram showing an example of the GW pattern for the LDPC code having the code length N of 64 k bits when the modulation scheme is 256-QAM and the code rate r is 7/15.

According to the original GW pattern (B) of FIG. 272, the arrangement of bit groups 0 to 179 of the LDPC code of 64 k bits is interleaved into the arrangement of bit groups 24, 157, 0, 43, 126, 172, 135, 65, 32, 18, 114, 42, 162, 67, 104, 61, 23, 11, 4, 96, 163, 75, 109, 58, 79, 154, 3, 95, 168, 73, 103, 60, 84, 148, 113, 40, 164, 173, 143, 49, 29, 156, 7, 89, 132, 179, 138, 53, 85, 12, 117, 36, 122, 66, 107, 64, 28, 147, 2, 90, 131, 70, 144, 55, 26, 15, 112, 35, 128, 176, 106, 59, 80, 19, 6, 92, 129, 174, 99, 62, 82, 13, 121, 41, 127, 71, 139, 63, 25, 151, 9, 39, 159, 69, 142, 52, 77, 21, 119, 38, 167, 178, 101, 56, 87, 155, 5, 91, 166, 169, 146, 50, 81, 20, 111, 88, 165, 177, 108, 47, 27, 149, 115, 33, 161, 72, 102, 57, 86, 16, 110, 97, 123, 68, 100, 48, 31, 14, 8, 93, 130, 170, 133, 44, 78, 150, 118, 94, 158, 76, 134, 46, 83, 152, 1, 37, 160, 171, 136, 54, 22, 17, 116, 34, 125, 175, 105, 45, 30, 153, 10, 98, 124, 74, 137, 51, 120, 141, 140, and 145.

According to the converted GW pattern (A) of FIG. 272, the arrangement of bit groups 0 to 179 of the LDPC code of 64 k bits is interleaved into the arrangement of bit groups 24, 32, 23, 79, 84, 29, 85, 28, 26, 80, 82, 25, 77, 87, 81, 27, 86, 31, 78, 83, 22, 30, 157, 18, 11, 154, 148, 156, 12, 147, 15, 19, 13, 151, 21, 155, 20, 149, 16, 14, 150, 152, 17, 153, 0, 114, 4, 3, 113, 7, 117, 2, 112, 6, 121, 9, 119, 5, 111, 115, 110, 8, 118, 1, 116, 10, 43, 42, 96, 95, 40, 89, 36, 90, 35, 92, 41, 39, 38, 91, 88, 33, 97, 93, 94, 37, 34, 98, 126, 162, 163, 168, 164, 132, 122, 131, 128, 129, 127, 159, 167, 166, 165, 161, 123, 130, 158, 160, 125, 124, 172, 67, 75, 73, 173, 179, 66, 70, 176, 174, 71, 69, 178, 169, 177, 72, 68, 170, 76, 171, 175, 74, 135, 104, 109, 103, 143, 138, 107, 144, 106, 99, 139, 142, 101, 146, 108, 102, 100, 133, 134, 136, 105, 137, 65, 61, 58, 60, 49, 53, 64, 55, 59, 62, 63, 52, 56, 50, 47, 57, 48, 44, 46, 54, 45, 51, 120, 141, 140, and 145.

FIG. 273 is a diagram showing an example of the GW pattern for the LDPC code having the code length N of 64 k bits when the modulation scheme is 256-QAM and the code rate r is 8/15.

According to the original GW pattern (B) of FIG. 273, the arrangement of bit groups 0 to 179 of the LDPC code of 64 k bits is interleaved into the arrangement of bit groups 85, 3, 148, 161, 96, 99, 154, 13, 78, 160, 61, 36, 21, 141, 121, 115, 82, 1, 59, 72, 43, 135, 168, 139, 46, 10, 56, 67, 108, 134, 111, 105, 66, 89, 137, 130, 104, 143, 113, 11, 84, 157, 32, 73, 90, 38, 117, 146, 53, 2, 60, 93, 91, 71, 114, 19, 47, 4, 26, 75, 109, 41, 50, 153, 54, 163, 31, 24, 106, 42, 170, 62, 80, 164, 65, 128, 12, 142, 167, 155, 88, 8, 22, 131, 158, 33, 178, 145, 70, 9, 51, 69, 102, 140, 173, 147, 83, 165, 30, 126, 100, 138, 171, 103, 45, 159, 27, 74, 97, 122, 120, 16, 52, 162, 132, 124, 94, 133, 172, 149, 86, 77, 25, 68, 177, 64, 174, 15, 0, 125, 63, 35, 34, 40, 179, 20, 44, 7, 55, 28, 101, 150, 110, 18, 119, 5, 29, 76, 107, 136, 112, 144, 48, 81, 57, 49, 92, 95, 118, 17, 156, 166, 23, 129, 79, 37, 175, 152, 87, 6, 58, 127, 98, 123, 39, 14, 116, 169, 176, and 151.

According to the converted GW pattern (A) of FIG. 273, the arrangement of bit groups 0 to 179 of the LDPC code of 64 k bits is interleaved into the arrangement of bit groups 85, 78, 82, 46, 66, 84, 53, 47, 54, 80, 88, 70, 83, 45, 52, 86, 0, 44, 119, 48, 156, 87, 3, 160, 1, 10, 89, 157, 2, 4, 163, 164, 8, 9, 165, 159, 162, 77, 125, 7, 5, 81, 166, 6, 148, 61, 59, 56, 137, 32, 60, 26, 31, 65, 22, 51, 30, 27, 132, 25, 63, 55, 29, 57, 23, 58, 161, 36, 72, 67, 130, 73, 93, 75, 24, 128, 131, 69, 126, 74, 124, 68, 35, 28, 76, 49, 129, 127, 96, 21, 43, 108, 104, 90, 91, 109, 106, 12, 158, 102, 100, 97, 94, 177, 34, 101, 107, 92, 79, 98, 99, 141, 135, 134, 143, 38, 71, 41, 42, 142, 33, 140, 138, 122, 133, 64, 40, 150, 136, 95, 37, 123, 154, 121, 168, 111, 113, 117, 114, 50, 170, 167, 178, 173, 171, 120, 172, 174, 179, 110, 112, 118, 175, 39, 13, 115, 139, 105, 11, 146, 19, 153, 62, 155, 145, 147, 103, 16, 149, 15, 20, 18, 144, 17, 152, 14, 116, 169, 176, and 151.

FIG. 274 is a diagram showing an example of the GW pattern for the LDPC code having the code length N of 64 k bits when the modulation scheme is 256-QAM and the code rate r is 9/15.

According to the original GW pattern (A) of FIG. 274, the arrangement of bit groups 0 to 179 of the LDPC code of 64 k bits is interleaved into the arrangement of bit groups 58, 70, 23, 32, 26, 63, 55, 48, 35, 41, 53, 20, 38, 51, 61, 65, 44, 29, 7, 2, 113, 68, 96, 104, 106, 89, 27, 0, 119, 21, 4, 49, 46, 100, 13, 36, 57, 98, 102, 9, 42, 39, 33, 62, 22, 95, 101, 15, 91, 25, 93, 132, 69, 87, 47, 59, 67, 124, 17, 11, 31, 43, 40, 37, 85, 50, 97, 140, 45, 92, 56, 30, 34, 60, 107, 24, 52, 94, 64, 5, 71, 90, 66, 103, 88, 86, 84, 19, 169, 159, 147, 126, 28, 130, 14, 162, 144, 166, 108, 153, 115, 135, 120, 122, 112, 139, 151, 156, 16, 172, 164, 123, 99, 54, 136, 81, 105, 128, 116, 150, 155, 76, 18, 142, 170, 175, 83, 146, 78, 109, 73, 131, 127, 82, 167, 77, 110, 79, 137, 152, 3, 173, 148, 72, 158, 117, 1, 6, 12, 8, 161, 74, 143, 133, 168, 171, 134, 163, 138, 121, 141, 160, 111, 10, 149, 80, 75, 165, 157, 174, 129, 145, 114, 125, 154, 118, 176, 177, 178, and 179.

According to the converted GW pattern (B) of FIG. 274, the arrangement of bit groups 0 to 179 of the LDPC code of 64 k bits is interleaved into the arrangement of bit groups 58, 96, 22, 97, 169, 164, 127, 168, 70, 104, 95, 140, 159, 123, 82, 171, 23, 106, 101, 45, 147, 99, 167, 134, 32, 89, 15, 92, 126, 54, 77, 163, 26, 27, 91, 56, 28, 136, 110, 138, 63, 0, 25, 30, 130, 81, 79, 121, 55, 119, 93, 34, 14, 105, 137, 141, 48, 21, 132, 60, 162, 128, 152, 160, 35, 4, 69, 107, 144, 116, 3, 111, 41, 49, 87, 24, 166, 150, 173, 10, 53, 46, 47, 52, 108, 155, 148, 149, 20, 100, 59, 94, 153, 76, 72, 80, 38, 13, 67, 64, 115, 18, 158, 75, 51, 36, 124, 5, 135, 142, 117, 165, 61, 57, 17, 71, 120, 170, 1, 157, 65, 98, 11, 90, 122, 175, 6, 174, 44, 102, 31, 66, 112, 83, 12, 129, 29, 9, 43, 103, 139, 146, 8, 145, 7, 42, 40, 88, 151, 78, 161, 114, 2, 39, 37, 86, 156, 109, 74, 125, 113, 33, 85, 84, 16, 73, 143, 154, 68, 62, 50, 19, 172, 131, 133, 118, 176, 177, 178, and 179.

FIG. 275 is a diagram showing an example of the GW pattern for the LDPC code having the code length N of 64 k bits when the modulation scheme is 256-QAM and the code rate r is 10/15.

According to the original GW pattern (B) of FIG. 275, the arrangement of bit groups 0 to 179 of the LDPC code of 64 k bits is interleaved into the arrangement of bit groups 45, 31, 67, 35, 159, 157, 177, 2, 44, 23, 73, 148, 163, 118, 176, 4, 14, 97, 142, 37, 143, 149, 179, 3, 12, 32, 140, 42, 167, 166, 41, 126, 13, 30, 144, 57, 113, 147, 173, 6, 52, 24, 39, 64, 80, 112, 104, 174, 11, 151, 71, 109, 162, 79, 171, 127, 46, 92, 38, 132, 81, 120, 100, 1, 53, 88, 76, 60, 103, 139, 99, 125, 48, 93, 135, 161, 77, 110, 107, 121, 18, 95, 69, 63, 83, 111, 170, 7, 16, 98, 141, 61, 86, 116, 172, 130, 49, 25, 40, 65, 87, 108, 101, 5, 21, 89, 75, 43, 82, 146, 105, 128, 17, 29, 106, 34, 160, 155, 175, 124, 15, 28, 134, 62, 119, 145, 72, 10, 58, 91, 74, 36, 68, 150, 8, 9, 54, 26, 137, 56, 165, 115, 114, 0, 47, 27, 22, 20, 168, 154, 102, 123, 50, 94, 66, 33, 85, 59, 164, 131, 51, 90, 70, 138, 84, 117, 178, 122, 19, 96, 156, 55, 78, 158, 169, 129, 133, 152, 136, and 153.

According to the converted GW pattern (A) of FIG. 275, the arrangement of bit groups 0 to 179 of the LDPC code of 64 k bits is interleaved into the arrangement of bit groups 45, 44, 14, 12, 13, 52, 11, 46, 53, 48, 18, 16, 49, 21, 17, 15, 58, 54, 47, 50, 51, 19, 31, 23, 97, 32, 30, 24, 151, 92, 88, 93, 95, 98, 25, 89, 29, 28, 91, 26, 27, 94, 90, 96, 67, 73, 142, 140, 144, 39, 71, 38, 76, 135, 69, 141, 40, 75, 106, 134, 74, 137, 22, 66, 70, 156, 35, 148, 37, 42, 57, 64, 109, 132, 60, 161, 63, 61, 65, 43, 34, 62, 36, 56, 20, 33, 138, 55, 159, 163, 143, 167, 113, 80, 162, 81, 103, 77, 83, 86, 87, 82, 160, 119, 68, 165, 168, 85, 84, 78, 157, 118, 149, 166, 147, 112, 79, 120, 139, 110, 111, 116, 108, 146, 155, 145, 150, 115, 154, 59, 117, 158, 177, 176, 179, 41, 173, 104, 171, 100, 99, 107, 170, 172, 101, 105, 175, 72, 8, 114, 102, 164, 178, 169, 2, 4, 3, 126, 6, 174, 127, 1, 125, 121, 7, 130, 5, 128, 124, 10, 9, 0, 123, 131, 122, 129, 133, 152, 136, and 153.

FIG. 276 is a diagram showing an example of the GW pattern for the LDPC code having the code length N of 64 k bits when the modulation scheme is 256-QAM and the code rate r is 11/15.

According to the original GW pattern (B) of FIG. 276, the arrangement of bit groups 0 to 179 of the LDPC code of 64 k bits is interleaved into the arrangement of bit groups 27, 68, 35, 117, 138, 83, 127, 10, 60, 73, 47, 115, 155, 81, 170, 9, 65, 66, 52, 112, 150, 77, 171, 161, 22, 20, 39, 106, 147, 90, 126, 165, 23, 16, 45, 113, 154, 86, 173, 158, 24, 71, 40, 107, 136, 94, 128, 163, 31, 72, 33, 101, 134, 80, 175, 7, 61, 19, 49, 111, 135, 92, 130, 6, 62, 74, 43, 116, 133, 89, 129, 8, 28, 15, 34, 105, 146, 84, 174, 4, 32, 75, 44, 118, 132, 96, 169, 159, 58, 18, 42, 100, 141, 87, 131, 157, 63, 11, 48, 108, 151, 79, 177, 168, 26, 17, 36, 102, 137, 95, 122, 1, 25, 21, 50, 120, 153, 97, 121, 0, 55, 14, 46, 114, 152, 91, 178, 3, 30, 13, 37, 103, 145, 82, 125, 166, 57, 76, 51, 99, 144, 85, 123, 162, 56, 12, 53, 119, 139, 78, 179, 5, 64, 70, 54, 110, 148, 93, 172, 164, 29, 69, 38, 109, 143, 88, 124, 160, 59, 67, 41, 104, 149, 98, 176, 2, 167, 156, 140, and 142.

According to the converted GW pattern (A) of FIG. 276, the arrangement of bit groups 0 to 179 of the LDPC code of 64 k bits is interleaved into the arrangement of bit groups 27, 60, 65, 22, 23, 24, 31, 61, 62, 28, 32, 58, 63, 26, 25, 55, 30, 57, 56, 64, 29, 59, 68, 73, 66, 20, 16, 71, 72, 19, 74, 15, 75, 18, 11, 17, 21, 14, 13, 76, 12, 70, 69, 67, 35, 47, 52, 39, 45, 40, 33, 49, 43, 34, 44, 42, 48, 36, 50, 46, 37, 51, 53, 54, 38, 41, 117, 115, 112, 106, 113, 107, 101, 111, 116, 105, 118, 100, 108, 102, 120, 114, 103, 99, 119, 110, 109, 104, 138, 155, 150, 147, 154, 136, 134, 135, 133, 146, 132, 141, 151, 137, 153, 152, 145, 144, 139, 148, 143, 149, 83, 81, 77, 90, 86, 94, 80, 92, 89, 84, 96, 87, 79, 95, 97, 91, 82, 85, 78, 93, 88, 98, 127, 170, 171, 126, 173, 128, 175, 130, 129, 174, 169, 131, 177, 122, 121, 178, 125, 123, 179, 172, 124, 176, 10, 9, 161, 165, 158, 163, 7, 6, 8, 4, 159, 157, 168, 1, 0, 3, 166, 162, 5, 164, 160, 2, 167, 156, 140, and 142.

FIG. 277 is a diagram showing an example of the GW pattern for the LDPC code having the code length N of 64 k bits when the modulation scheme is 256-QAM and the code rate r is 12/15.

According to the original GW pattern (A) of FIG. 277, the arrangement of bit groups 0 to 179 of the LDPC code of 64 k bits is interleaved into the arrangement of bit groups 51, 122, 91, 111, 95, 100, 119, 130, 78, 57, 65, 26, 61, 126, 105, 143, 70, 132, 39, 102, 115, 116, 6, 14, 3, 21, 71, 134, 2, 0, 140, 106, 7, 118, 23, 35, 20, 17, 50, 48, 112, 13, 66, 5, 75, 42, 129, 107, 30, 45, 137, 114, 37, 87, 53, 85, 101, 141, 120, 99, 88, 117, 64, 28, 135, 138, 108, 113, 58, 97, 38, 124, 86, 33, 74, 32, 29, 128, 67, 104, 80, 127, 56, 34, 89, 94, 49, 55, 93, 136, 68, 62, 54, 40, 81, 103, 121, 76, 44, 84, 96, 123, 154, 98, 82, 142, 46, 169, 131, 72, 47, 69, 125, 31, 83, 36, 59, 90, 79, 52, 133, 60, 92, 139, 110, 27, 73, 43, 77, 109, 63, 41, 168, 147, 161, 165, 175, 162, 164, 158, 157, 160, 150, 171, 167, 145, 151, 153, 9, 155, 170, 146, 166, 149, 15, 159, 11, 176, 152, 156, 144, 148, 172, 178, 24, 22, 179, 4, 163, 174, 173, 19, 10, 177, 12, 16, 1, 8, 18, and 25.

According to the converted GW pattern (B) of FIG. 277, the arrangement of bit groups 0 to 179 of the LDPC code of 64 k bits is interleaved into the arrangement of bit groups 51, 6, 75, 108, 93, 47, 168, 15, 122, 14, 42, 113, 136, 69, 147, 159, 91, 3, 129, 58, 68, 125, 161, 11, 111, 21, 107, 97, 62, 31, 165, 176, 95, 71, 30, 38, 54, 83, 175, 152, 100, 134, 45, 124, 40, 36, 162, 156, 119, 2, 137, 86, 81, 59, 164, 144, 130, 0, 114, 33, 103, 90, 158, 148, 78, 140, 37, 74, 121, 79, 157, 172, 57, 106, 87, 32, 76, 52, 160, 178, 65, 7, 53, 29, 44, 133, 150, 24, 26, 118, 85, 128, 84, 60, 171, 22, 61, 23, 101, 67, 96, 92, 167, 179, 126, 35, 141, 104, 123, 139, 145, 4, 105, 20, 120, 80, 154, 110, 151, 163, 143, 17, 99, 127, 98, 27, 153, 174, 70, 50, 88, 56, 82, 73, 9, 173, 132, 48, 117, 34, 142, 43, 155, 19, 39, 112, 64, 89, 46, 77, 170, 10, 102, 13, 28, 94, 169, 109, 146, 177, 115, 66, 135, 49, 131, 63, 166, 12, 116, 5, 138, 55, 72, 41, 149, 16, 1, 8, 18, and 25.

FIG. 278 is a diagram showing an example of the GW pattern for the LDPC code having the code length N of 64 k bits when the modulation scheme is 256-QAM and the code rate r is 13/15.

According to the original GW pattern (B) of FIG. 278, the arrangement of bit groups 0 to 179 of the LDPC code of 64 k bits is interleaved into the arrangement of bit groups 59, 85, 108, 128, 49, 91, 163, 3, 58, 16, 106, 126, 74, 141, 167, 35, 57, 82, 30, 123, 68, 95, 160, 42, 62, 21, 102, 131, 52, 142, 157, 10, 55, 79, 24, 130, 73, 92, 179, 2, 61, 11, 104, 122, 45, 140, 159, 43, 148, 19, 23, 111, 76, 135, 169, 39, 63, 77, 25, 117, 75, 94, 155, 5, 145, 14, 26, 127, 46, 138, 158, 38, 64, 86, 105, 118, 50, 137, 175, 7, 144, 84, 22, 113, 54, 98, 172, 9, 146, 17, 27, 114, 51, 139, 156, 37, 147, 78, 103, 115, 66, 97, 168, 34, 60, 83, 107, 121, 48, 93, 174, 33, 65, 87, 99, 124, 71, 136, 154, 0, 150, 20, 101, 112, 70, 96, 170, 1, 149, 80, 28, 125, 53, 90, 173, 6, 153, 13, 29, 116, 72, 88, 165, 8, 143, 12, 31, 119, 47, 89, 164, 40, 151, 81, 109, 110, 44, 134, 162, 36, 152, 15, 100, 129, 67, 133, 166, 41, 56, 18, 32, 120, 69, 132, 161, 4, 177, 176, 178, and 171.

According to the converted GW pattern (A) of FIG. 278, the arrangement of bit groups 0 to 179 of the LDPC code of 64 k bits is interleaved into the arrangement of bit groups 59, 58, 57, 62, 55, 61, 148, 63, 145, 64, 144, 146, 147, 60, 65, 150, 149, 153, 143, 151, 152, 56, 85, 16, 82, 21, 79, 11, 19, 77, 14, 86, 84, 17, 78, 83, 87, 20, 80, 13, 12, 81, 15, 18, 108, 106, 30, 102, 24, 104, 23, 25, 26, 105, 22, 27, 103, 107, 99, 101, 28, 29, 31, 109, 100, 32, 128, 126, 123, 131, 130, 122, 111, 117, 127, 118, 113, 114, 115, 121, 124, 112, 125, 116, 119, 110, 129, 120, 49, 74, 68, 52, 73, 45, 76, 75, 46, 50, 54, 51, 66, 48, 71, 70, 53, 72, 47, 44, 67, 69, 91, 141, 95, 142, 92, 140, 135, 94, 138, 137, 98, 139, 97, 93, 136, 96, 90, 88, 89, 134, 133, 132, 163, 167, 160, 157, 179, 159, 169, 155, 158, 175, 172, 156, 168, 174, 154, 170, 173, 165, 164, 162, 166, 161, 3, 35, 42, 10, 2, 43, 39, 5, 38, 7, 9, 37, 34, 33, 0, 1, 6, 8, 40, 36, 41, 4, 177, 176, 178, and 171.

FIG. 279 is a diagram showing an example of the GW pattern for the LDPC code having the code length N of 64 k bits when the modulation scheme is 1024-QAM and the code rate r is 2/15.

According to the original GW pattern (A) of FIG. 279, the arrangement of bit groups 0 to 179 of the LDPC code of 64 k bits is interleaved into the arrangement of bit groups 157, 25, 107, 160, 37, 138, 111, 35, 29, 44, 15, 162, 66, 20, 49, 126, 89, 147, 159, 174, 142, 26, 146, 10, 164, 152, 57, 110, 83, 167, 169, 16, 6, 172, 62, 173, 7, 145, 4, 67, 115, 50, 39, 72, 79, 74, 40, 132, 42, 30, 163, 161, 55, 143, 63, 117, 86, 121, 2, 28, 69, 150, 24, 177, 43, 158, 27, 21, 128, 46, 118, 114, 127, 135, 92, 76, 19, 94, 179, 3, 52, 101, 137, 84, 73, 108, 91, 120, 47, 1, 102, 58, 68, 82, 59, 119, 64, 31, 61, 105, 103, 151, 124, 70, 8, 155, 90, 166, 41, 45, 178, 113, 140, 75, 148, 109, 100, 125, 11, 116, 34, 36, 176, 170, 156, 136, 171, 122, 78, 87, 106, 123, 149, 17, 99, 175, 18, 9, 165, 153, 12, 81, 77, 60, 93, 104, 13, 5, 88, 96, 141, 133, 154, 144, 48, 97, 23, 14, 98, 53, 134, 112, 65, 0, 130, 32, 168, 33, 131, 22, 38, 56, 80, 95, 71, 85, 139, 129, 51, and 54.

According to the converted GW pattern (B) of FIG. 279, the arrangement of bit groups 0 to 179 of the LDPC code of 64 k bits is interleaved into the arrangement of bit groups 157, 159, 7, 63, 127, 102, 41, 171, 93, 65, 25, 174, 145, 117, 135, 58, 45, 122, 104, 0, 107, 142, 4, 86, 92, 68, 178, 78, 13, 130, 160, 26, 67, 121, 76, 82, 113, 87, 5, 32, 37, 146, 115, 2, 19, 59, 140, 106, 88, 168, 138, 10, 50, 28, 94, 119, 75, 123, 96, 33, 111, 164, 39, 69, 179, 64, 148, 149, 141, 131, 35, 152, 72, 150, 3, 31, 109, 17, 133, 22, 29, 57, 79, 24, 52, 61, 100, 99, 154, 38, 44, 110, 74, 177, 101, 105, 125, 175, 144, 56, 15, 83, 40, 43, 137, 103, 11, 18, 48, 80, 162, 167, 132, 158, 84, 151, 116, 9, 97, 95, 66, 169, 42, 27, 73, 124, 34, 165, 23, 71, 20, 16, 30, 21, 108, 70, 36, 153, 14, 85, 49, 6, 163, 128, 91, 8, 176, 12, 98, 139, 126, 172, 161, 46, 120, 155, 170, 81, 53, 129, 89, 62, 55, 118, 47, 90, 156, 77, 134, 51, 147, 173, 143, 114, 1, 166, 136, 60, 112, and 54.

FIG. 280 is a diagram showing an example of the GW pattern for the LDPC code having the code length N of 64 k bits when the modulation scheme is 1024-QAM and the code rate r is 3/15.

According to the original GW pattern (A) of FIG. 280, the arrangement of bit groups 0 to 179 of the LDPC code of 64 k bits is interleaved into the arrangement of bit groups 113, 153, 13, 8, 103, 115, 137, 69, 151, 111, 18, 38, 42, 150, 179, 130, 148, 6, 4, 31, 44, 68, 145, 126, 106, 24, 100, 93, 21, 35, 143, 57, 166, 65, 53, 41, 122, 7, 29, 25, 136, 162, 158, 26, 124, 32, 17, 168, 56, 12, 39, 176, 131, 132, 51, 89, 101, 160, 49, 87, 14, 55, 127, 37, 169, 110, 83, 134, 107, 46, 33, 114, 108, 82, 125, 109, 95, 174, 62, 164, 144, 16, 121, 58, 80, 2, 163, 159, 157, 90, 104, 23, 172, 112, 19, 133, 102, 75, 45, 86, 63, 22, 54, 105, 155, 77, 178, 70, 98, 40, 118, 84, 78, 0, 99, 123, 5, 34, 71, 96, 175, 10, 30, 72, 28, 74, 154, 61, 91, 85, 135, 152, 15, 88, 165, 60, 52, 149, 147, 59, 116, 120, 3, 64, 140, 67, 94, 27, 9, 81, 43, 11, 167, 139, 92, 129, 20, 117, 128, 50, 119, 47, 1, 156, 142, 170, 171, 48, 177, 66, 161, 79, 73, 76, 173, 97, 36, 141, 146, and 138.

According to the converted GW pattern (B) of FIG. 280, the arrangement of bit groups 0 to 179 of the LDPC code of 64 k bits is interleaved into the arrangement of bit groups 113, 4, 122, 51, 108, 104, 98, 154, 140, 1, 153, 31, 7, 89, 82, 23, 40, 61, 67, 156, 13, 44, 29, 101, 125, 172, 118, 91, 94, 142, 8, 68, 25, 160, 109, 112, 84, 85, 27, 170, 103, 145, 136, 49, 95, 19, 78, 135, 9, 171, 115, 126, 162, 87, 174, 133, 0, 152, 81, 48, 137, 106, 158, 14, 62, 102, 99, 15, 43, 177, 69, 24, 26, 55, 164, 75, 123, 88, 11, 66, 151, 100, 124, 127, 144, 45, 5, 165, 167, 161, 111, 93, 32, 37, 16, 86, 34, 60, 139, 79, 18, 21, 17, 169, 121, 63, 71, 52, 92, 73, 38, 35, 168, 110, 58, 22, 96, 149, 129, 76, 42, 143, 56, 83, 80, 54, 175, 147, 20, 173, 150, 57, 12, 134, 2, 105, 10, 59, 117, 97, 179, 166, 39, 107, 163, 155, 30, 116, 128, 36, 130, 65, 176, 46, 159, 77, 72, 120, 50, 141, 148, 53, 131, 33, 157, 178, 28, 3, 119, 146, 6, 41, 132, 114, 90, 70, 74, 64, 47, and 138.

FIG. 281 is a diagram showing an example of the GW pattern for the LDPC code having the code length N of 64 k bits when the modulation scheme is 1024-QAM and the code rate r is 4/15.

According to the original GW pattern (A) of FIG. 281, the arrangement of bit groups 0 to 179 of the LDPC code of 64 k bits is interleaved into the arrangement of bit groups 114, 133, 4, 73, 8, 139, 7, 5, 177, 88, 66, 11, 24, 74, 49, 45, 167, 81, 117, 137, 46, 22, 165, 51, 68, 110, 6, 1, 16, 132, 130, 143, 169, 2, 20, 140, 94, 21, 91, 126, 172, 27, 162, 34, 113, 142, 166, 115, 106, 160, 84, 136, 175, 0, 26, 151, 69, 174, 59, 159, 161, 170, 52, 164, 80, 108, 3, 23, 101, 33, 125, 111, 63, 124, 98, 40, 145, 9, 39, 155, 149, 147, 67, 76, 48, 120, 119, 53, 54, 138, 179, 156, 127, 13, 152, 129, 123, 141, 109, 89, 121, 50, 10, 37, 104, 144, 86, 178, 96, 148, 128, 56, 64, 153, 95, 12, 105, 41, 154, 99, 25, 171, 92, 17, 134, 19, 61, 32, 85, 102, 14, 71, 146, 163, 173, 118, 57, 18, 36, 42, 78, 31, 97, 55, 58, 116, 90, 168, 43, 72, 15, 112, 93, 60, 38, 103, 87, 158, 35, 29, 176, 150, 77, 79, 122, 47, 28, 135, 100, 83, 65, 131, 75, 157, 62, 70, 44, 30, 107, and 82.

According to the converted GW pattern (B) of FIG. 281, the arrangement of bit groups 0 to 179 of the LDPC code of 64 k bits is interleaved into the arrangement of bit groups 114, 117, 94, 26, 63, 179, 96, 61, 58, 77, 133, 137, 21, 151, 124, 156, 148, 32, 116, 79, 4, 46, 91, 69, 98, 127, 128, 85, 90, 122, 73, 22, 126, 174, 40, 13, 56, 102, 168, 47, 8, 165, 172, 59, 145, 152, 64, 14, 43, 28, 139, 51, 27, 159, 9, 129, 153, 71, 72, 135, 7, 68, 162, 161, 39, 123, 95, 146, 15, 100, 5, 110, 34, 170, 155, 141, 12, 163, 112, 83, 177, 6, 113, 52, 149, 109, 105, 173, 93, 65, 88, 1, 142, 164, 147, 89, 41, 118, 60, 131, 66, 16, 166, 80, 67, 121, 154, 57, 38, 75, 11, 132, 115, 108, 76, 50, 99, 18, 103, 157, 24, 130, 106, 3, 48, 10, 25, 36, 87, 62, 74, 143, 160, 23, 120, 37, 171, 42, 158, 70, 49, 169, 84, 101, 119, 104, 92, 78, 35, 44, 45, 2, 136, 33, 53, 144, 17, 31, 29, 30, 167, 20, 175, 125, 54, 86, 134, 97, 176, 107, 81, 140, 0, 111, 138, 178, 19, 55, 150, and 82.

FIG. 282 is a diagram showing an example of the GW pattern for the LDPC code having the code length N of 64 k bits when the modulation scheme is 1024-QAM and the code rate r is 5/15.

According to the original GW pattern (B) of FIG. 282, the arrangement of bit groups 0 to 179 of the LDPC code of 64 k bits is interleaved into the arrangement of bit groups 128, 4, 162, 8, 77, 29, 91, 44, 176, 107, 149, 1, 150, 9, 119, 99, 71, 124, 104, 41, 62, 5, 118, 50, 174, 54, 111, 40, 156, 92, 46, 11, 17, 52, 47, 97, 179, 24, 153, 145, 129, 2, 12, 88, 101, 139, 114, 69, 96, 32, 134, 55, 167, 132, 123, 136, 112, 102, 159, 31, 87, 141, 15, 61, 84, 98, 37, 63, 20, 85, 53, 7, 39, 117, 170, 138, 116, 126, 161, 120, 57, 13, 76, 6, 121, 155, 175, 38, 158, 35, 86, 78, 10, 103, 166, 95, 125, 172, 67, 30, 177, 73, 151, 169, 163, 23, 108, 43, 81, 157, 58, 105, 65, 26, 122, 135, 146, 72, 142, 34, 133, 0, 148, 89, 168, 60, 109, 83, 18, 27, 131, 70, 56, 48, 64, 93, 68, 127, 21, 75, 110, 80, 14, 49, 82, 143, 115, 178, 154, 100, 59, 74, 152, 51, 137, 140, 36, 42, 19, 25, 94, 45, 164, 16, 113, 79, 22, 28, 66, 106, 130, 171, 147, 90, 144, 165, 3, 173, 160, and 33.

According to the converted GW pattern (A) of FIG. 282, the arrangement of bit groups 0 to 179 of the LDPC code of 64 k bits is interleaved into the arrangement of bit groups 128, 149, 62, 46, 129, 134, 87, 53, 57, 86, 177, 58, 133, 131, 110, 59, 94, 130, 4, 1, 5, 11, 2, 55, 141, 7, 13, 78, 73, 105, 0, 70, 80, 74, 45, 171, 162, 150, 118, 17, 12, 167, 15, 39, 76, 10, 151, 65, 148, 56, 14, 152, 164, 147, 8, 9, 50, 52, 88, 132, 61, 117, 6, 103, 169, 26, 89, 48, 49, 51, 16, 90, 77, 119, 174, 47, 101, 123, 84, 170, 121, 166, 163, 122, 168, 64, 82, 137, 113, 144, 29, 99, 54, 97, 139, 136, 98, 138, 155, 95, 23, 135, 60, 93, 143, 140, 79, 165, 91, 71, 111, 179, 114, 112, 37, 116, 175, 125, 108, 146, 109, 68, 115, 36, 22, 3, 44, 124, 40, 24, 69, 102, 63, 126, 38, 172, 43, 72, 83, 127, 178, 42, 28, 173, 176, 104, 156, 153, 96, 159, 20, 161, 158, 67, 81, 142, 18, 21, 154, 19, 66, 160, 107, 41, 92, 145, 32, 31, 85, 120, 35, 30, 157, 34, 27, 75, 100, 25, 106, and 33.

FIG. 283 is a diagram showing an example of the GW pattern for the LDPC code having the code length N of 64 k bits when the modulation scheme is 1024-QAM and the code rate r is 6/15.

According to the original GW pattern (A) of FIG. 283, the arrangement of bit groups 0 to 179 of the LDPC code of 64 k bits is interleaved into the arrangement of bit groups 66, 21, 51, 55, 54, 24, 33, 12, 70, 63, 47, 65, 145, 8, 0, 57, 23, 71, 59, 14, 40, 42, 62, 56, 2, 43, 64, 58, 67, 53, 68, 61, 39, 52, 69, 1, 22, 31, 161, 38, 30, 19, 17, 18, 4, 41, 25, 44, 136, 29, 36, 26, 126, 177, 15, 37, 148, 9, 13, 45, 46, 152, 50, 49, 27, 77, 60, 35, 48, 178, 28, 34, 106, 127, 76, 131, 105, 138, 75, 130, 101, 167, 117, 173, 113, 108, 92, 135, 124, 121, 97, 149, 143, 81, 32, 96, 3, 78, 107, 86, 98, 16, 162, 150, 111, 158, 172, 139, 74, 142, 166, 7, 5, 119, 20, 144, 151, 90, 11, 156, 100, 175, 83, 155, 159, 128, 88, 87, 93, 103, 94, 140, 165, 6, 137, 157, 10, 85, 141, 129, 146, 122, 73, 112, 132, 125, 174, 169, 168, 79, 84, 118, 179, 147, 91, 160, 163, 115, 89, 80, 102, 104, 134, 82, 95, 133, 164, 154, 120, 110, 170, 114, 153, 72, 109, 171, 176, 99, 116, and 123.

According to the converted GW pattern (B) of FIG. 283, the arrangement of bit groups 0 to 179 of the LDPC code of 64 k bits is interleaved into the arrangement of bit groups 66, 59, 22, 15, 106, 97, 74, 88, 132, 134, 21, 14, 31, 37, 127, 149, 142, 87, 125, 82, 51, 40, 161, 148, 76, 143, 166, 93, 174, 95, 55, 42, 38, 9, 131, 81, 7, 103, 169, 133, 54, 62, 30, 13, 105, 32, 5, 94, 168, 164, 24, 56, 19, 45, 138, 96, 119, 140, 79, 154, 33, 2, 17, 46, 75, 3, 20, 165, 84, 120, 12, 43, 18, 152, 130, 78, 144, 6, 118, 110, 70, 64, 4, 50, 101, 107, 151, 137, 179, 170, 63, 58, 41, 49, 167, 86, 90, 157, 147, 114, 47, 67, 25, 27, 117, 98, 11, 10, 91, 153, 65, 53, 44, 77, 173, 16, 156, 85, 160, 72, 145, 68, 136, 60, 113, 162, 100, 141, 163, 109, 8, 61, 29, 35, 108, 150, 175, 129, 115, 171, 0, 39, 36, 48, 92, 111, 83, 146, 89, 176, 57, 52, 26, 178, 135, 158, 155, 122, 80, 99, 23, 69, 126, 28, 124, 172, 159, 73, 102, 116, 71, 1, 177, 34, 121, 139, 128, 112, 104, and 123.

FIG. 284 is a diagram showing an example of the GW pattern for the LDPC code having the code length N of 64 k bits when the modulation scheme is 1024-QAM and the code rate r is 7/15.

According to the original GW pattern (B) of FIG. 284, the arrangement of bit groups 0 to 179 of the LDPC code of 64 k bits is interleaved into the arrangement of bit groups 117, 61, 46, 179, 24, 161, 142, 133, 11, 6, 121, 44, 103, 76, 22, 63, 136, 151, 33, 8, 123, 60, 105, 175, 18, 160, 138, 147, 10, 0, 125, 57, 49, 75, 21, 154, 140, 150, 9, 169, 124, 55, 48, 173, 23, 157, 97, 129, 30, 7, 122, 54, 99, 74, 19, 153, 94, 128, 15, 170, 87, 59, 51, 80, 111, 64, 137, 146, 13, 2, 83, 62, 45, 176, 108, 71, 91, 131, 34, 168, 82, 56, 102, 72, 26, 155, 92, 132, 31, 166, 119, 36, 101, 178, 113, 67, 98, 152, 14, 5, 118, 41, 104, 177, 114, 70, 96, 134, 32, 162, 84, 40, 100, 174, 110, 158, 93, 149, 27, 4, 86, 38, 53, 77, 115, 159, 143, 130, 35, 163, 89, 58, 106, 73, 20, 66, 90, 127, 16, 3, 85, 37, 107, 172, 116, 156, 95, 144, 17, 165, 81, 43, 50, 78, 109, 68, 135, 126, 29, 167, 120, 39, 47, 171, 112, 69, 141, 145, 28, 1, 88, 42, 52, 79, 25, 65, 139, 148, 12, and 164.

According to the converted GW pattern (A) of FIG. 284, the arrangement of bit groups 0 to 179 of the LDPC code of 64 k bits is interleaved into the arrangement of bit groups 117, 121, 123, 125, 124, 122, 87, 83, 82, 119, 118, 84, 86, 89, 85, 81, 120, 88, 61, 44, 60, 57, 55, 54, 59, 62, 56, 36, 41, 40, 38, 58, 37, 43, 39, 42, 46, 103, 105, 49, 48, 99, 51, 45, 102, 101, 104, 100, 53, 106, 107, 50, 47, 52, 179, 76, 175, 75, 173, 74, 80, 176, 72, 178, 177, 174, 77, 73, 172, 78, 171, 79, 24, 22, 18, 21, 23, 19, 111, 108, 26, 113, 114, 110, 115, 20, 116, 109, 112, 25, 161, 63, 160, 154, 157, 153, 64, 71, 155, 67, 70, 158, 159, 66, 156, 68, 69, 65, 142, 136, 138, 140, 97, 94, 137, 91, 92, 98, 96, 93, 143, 90, 95, 135, 141, 139, 133, 151, 147, 150, 129, 128, 146, 131, 132, 152, 134, 149, 130, 127, 144, 126, 145, 148, 11, 33, 10, 9, 30, 15, 13, 34, 31, 14, 32, 27, 35, 16, 17, 29, 28, 12, 6, 8, 0, 169, 7, 170, 2, 168, 166, 5, 162, 4, 163, 3, 165, 167, 1, and 164.

FIG. 285 is a diagram showing an example of the GW pattern for the LDPC code having the code length N of 64 k bits when the modulation scheme is 1024-QAM and the code rate r is 8/15.

According to the original GW pattern (A) of FIG. 285, the arrangement of bit groups 0 to 179 of the LDPC code of 64 k bits is interleaved into the arrangement of bit groups 77, 48, 82, 51, 57, 69, 65, 6, 71, 90, 84, 81, 50, 88, 61, 55, 53, 73, 39, 13, 79, 75, 41, 18, 38, 89, 49, 93, 36, 64, 47, 40, 42, 76, 70, 56, 3, 72, 2, 54, 52, 145, 19, 78, 80, 63, 87, 67, 86, 10, 1, 58, 17, 14, 175, 91, 68, 85, 94, 15, 43, 74, 60, 66, 37, 92, 4, 9, 16, 83, 46, 44, 102, 30, 112, 122, 110, 29, 20, 105, 138, 101, 174, 33, 137, 136, 131, 166, 59, 34, 62, 125, 28, 26, 45, 24, 23, 21, 157, 98, 35, 95, 22, 32, 103, 27, 113, 31, 119, 173, 168, 118, 120, 114, 149, 159, 155, 179, 160, 161, 130, 123, 172, 139, 124, 153, 0, 109, 167, 128, 107, 117, 147, 177, 96, 164, 152, 11, 148, 158, 129, 163, 176, 151, 171, 8, 106, 144, 150, 169, 108, 162, 143, 111, 141, 133, 178, 134, 146, 99, 132, 142, 104, 115, 135, 121, 100, 12, 170, 156, 126, 5, 127, 154, 97, 140, 116, 165, 7, and 25.

According to the converted GW pattern (B) of FIG. 285, the arrangement of bit groups 0 to 179 of the LDPC code of 64 k bits is interleaved into the arrangement of bit groups 77, 39, 3, 175, 102, 62, 119, 0, 171, 104, 48, 13, 72, 91, 30, 125, 173, 109, 8, 115, 82, 79, 2, 68, 112, 28, 168, 167, 106, 135, 51, 75, 54, 85, 122, 26, 118, 128, 144, 121, 57, 41, 52, 94, 110, 45, 120, 107, 150, 100, 69, 18, 145, 15, 29, 24, 114, 117, 169, 12, 65, 38, 19, 43, 20, 23, 149, 147, 108, 170, 6, 89, 78, 74, 105, 21, 159, 177, 162, 156, 71, 49, 80, 60, 138, 157, 155, 96, 143, 126, 90, 93, 63, 66, 101, 98, 179, 164, 111, 5, 84, 36, 87, 37, 174, 35, 160, 152, 141, 127, 81, 64, 67, 92, 33, 95, 161, 11, 133, 154, 50, 47, 86, 4, 137, 22, 130, 148, 178, 97, 88, 40, 10, 9, 136, 32, 123, 158, 134, 140, 61, 42, 1, 16, 131, 103, 172, 129, 146, 116, 55, 76, 58, 83, 166, 27, 139, 163, 99, 165, 53, 70, 17, 46, 59, 113, 124, 176, 132, 7, 73, 56, 14, 44, 34, 31, 153, 151, 142, and 25.

FIG. 286 is a diagram showing an example of the GW pattern for the LDPC code having the code length N of 64 k bits when the modulation scheme is 1024-QAM and the code rate r is 9/15.

According to the original GW pattern (B) of FIG. 286, the arrangement of bit groups 0 to 179 of the LDPC code of 64 k bits is interleaved into the arrangement of bit groups 42, 36, 135, 126, 3, 17, 82, 87, 172, 32, 65, 70, 143, 131, 10, 1, 85, 147, 31, 176, 66, 47, 97, 128, 8, 9, 146, 73, 162, 164, 57, 64, 139, 91, 5, 110, 150, 83, 18, 27, 48, 45, 133, 132, 111, 124, 89, 78, 177, 19, 46, 50, 102, 103, 122, 4, 74, 161, 175, 34, 60, 58, 136, 100, 115, 118, 81, 75, 28, 21, 40, 61, 140, 138, 113, 112, 157, 151, 23, 30, 69, 41, 94, 96, 7, 109, 152, 149, 33, 179, 71, 43, 92, 105, 12, 13, 154, 159, 178, 24, 44, 49, 107, 98, 16, 2, 76, 155, 35, 168, 62, 56, 129, 141, 116, 123, 160, 77, 25, 170, 54, 39, 90, 95, 121, 11, 72, 153, 169, 167, 51, 67, 104, 134, 0, 117, 79, 80, 26, 29, 37, 55, 99, 142, 108, 114, 86, 88, 166, 163, 59, 63, 101, 93, 119, 15, 144, 145, 165, 22, 52, 53, 130, 137, 125, 6, 158, 84, 20, 174, 38, 68, 127, 106, 14, 120, 148, 156, 171, and 173.

According to the converted GW pattern (A) of FIG. 286, the arrangement of bit groups 0 to 179 of the LDPC code of 64 k bits is interleaved into the arrangement of bit groups 42, 65, 66, 57, 48, 46, 60, 40, 69, 71, 44, 62, 54, 51, 37, 59, 52, 38, 36, 70, 47, 64, 45, 50, 58, 61, 41, 43, 49, 56, 39, 67, 55, 63, 53, 68, 135, 143, 97, 139, 133, 102, 136, 140, 94, 92, 107, 129, 90, 104, 99, 101, 130, 127, 126, 131, 128, 91, 132, 103, 100, 138, 96, 105, 98, 141, 95, 134, 142, 93, 137, 106, 3, 10, 8, 5, 111, 122, 115, 113, 7, 12, 16, 116, 121, 0, 108, 119, 125, 14, 17, 1, 9, 110, 124, 4, 118, 112, 109, 13, 2, 123, 11, 117, 114, 15, 6, 120, 82, 85, 146, 150, 89, 74, 81, 157, 152, 154, 76, 160, 72, 79, 86, 144, 158, 148, 87, 147, 73, 83, 78, 161, 75, 151, 149, 159, 155, 77, 153, 80, 88, 145, 84, 156, 172, 31, 162, 18, 177, 175, 28, 23, 33, 178, 35, 25, 169, 26, 166, 165, 20, 171, 32, 176, 164, 27, 19, 34, 21, 30, 179, 24, 168, 170, 167, 29, 163, 22, 174, and 173.

FIG. 287 is a diagram showing an example of the GW pattern for the LDPC code having the code length N of 64 k bits when the modulation scheme is 1024-QAM and the code rate r is 10/15.

According to the original GW pattern (B) of FIG. 287, the arrangement of bit groups 0 to 179 of the LDPC code of 64 k bits is interleaved into the arrangement of bit groups 100, 22, 60, 121, 40, 44, 164, 170, 176, 101, 88, 26, 35, 4, 21, 173, 140, 145, 175, 174, 81, 28, 72, 112, 132, 106, 42, 56, 151, 147, 82, 49, 91, 64, 179, 89, 160, 52, 139, 17, 97, 63, 116, 131, 154, 71, 109, 96, 135, 146, 55, 38, 166, 117, 65, 127, 120, 129, 15, 136, 74, 23, 98, 43, 123, 130, 69, 99, 143, 161, 46, 51, 94, 61, 83, 67, 156, 33, 144, 148, 163, 47, 92, 2, 122, 24, 86, 75, 108, 152, 14, 77, 7, 10, 29, 19, 104, 128, 142, 1, 79, 107, 162, 0, 118, 66, 54, 153, 141, 9, 85, 37, 32, 114, 53, 134, 41, 158, 178, 138, 76, 50, 78, 84, 172, 48, 133, 168, 125, 13, 169, 25, 16, 8, 124, 159, 167, 58, 5, 11, 68, 95, 27, 110, 93, 62, 102, 137, 126, 150, 87, 105, 113, 30, 119, 6, 103, 57, 31, 149, 80, 70, 45, 165, 111, 73, 36, 157, 171, 3, 20, 18, 90, 12, 59, 39, 115, 34, 177, and 155.

According to the converted GW pattern (A) of FIG. 287, the arrangement of bit groups 0 to 179 of the LDPC code of 64 k bits is interleaved into the arrangement of bit groups 100, 88, 81, 82, 97, 55, 74, 46, 163, 14, 79, 85, 76, 169, 68, 87, 80, 20, 22, 26, 28, 49, 63, 38, 23, 51, 47, 77, 107, 37, 50, 25, 95, 105, 70, 18, 60, 35, 72, 91, 116, 166, 98, 94, 92, 7, 162, 32, 78, 16, 27, 113, 45, 90, 121, 4, 112, 64, 131, 117, 43, 61, 2, 10, 0, 114, 84, 8, 110, 30, 165, 12, 40, 21, 132, 179, 154, 65, 123, 83, 122, 29, 118, 53, 172, 124, 93, 119, 111, 59, 44, 173, 106, 89, 71, 127, 130, 67, 24, 19, 66, 134, 48, 159, 62, 6, 73, 39, 164, 140, 42, 160, 109, 120, 69, 156, 86, 104, 54, 41, 133, 167, 102, 103, 36, 115, 170, 145, 56, 52, 96, 129, 99, 33, 75, 128, 153, 158, 168, 58, 137, 57, 157, 34, 176, 175, 151, 139, 135, 15, 143, 144, 108, 142, 141, 178, 125, 5, 126, 31, 171, 177, 101, 174, 147, 17, 146, 136, 161, 148, 152, 1, 9, 138, 13, 11, 150, 149, 3, and 155.

FIG. 288 is a diagram showing an example of the GW pattern for the LDPC code having the code length N of 64 k bits when the modulation scheme is 1024-QAM and the code rate r is 11/15.

According to the original GW pattern (B) of FIG. 288, the arrangement of bit groups 0 to 179 of the LDPC code of 64 k bits is interleaved into the arrangement of bit groups 33, 73, 90, 107, 99, 94, 53, 151, 124, 8, 12, 117, 21, 58, 158, 77, 72, 59, 123, 2, 125, 157, 50, 62, 109, 75, 42, 146, 118, 153, 85, 10, 131, 70, 32, 41, 24, 143, 113, 1, 93, 162, 20, 35, 74, 45, 149, 161, 173, 4, 28, 23, 127, 148, 34, 61, 96, 144, 171, 140, 119, 16, 126, 39, 40, 57, 165, 106, 172, 139, 81, 47, 164, 92, 63, 105, 108, 170, 3, 135, 101, 121, 68, 6, 111, 65, 147, 150, 122, 7, 84, 46, 22, 103, 86, 169, 134, 44, 175, 167, 89, 128, 27, 31, 56, 43, 102, 156, 160, 141, 67, 9, 110, 159, 133, 78, 154, 176, 174, 5, 82, 11, 25, 80, 130, 163, 88, 36, 166, 137, 104, 48, 129, 87, 95, 55, 49, 145, 178, 0, 98, 64, 54, 100, 37, 79, 69, 38, 177, 136, 114, 17, 52, 19, 30, 97, 51, 168, 132, 138, 83, 76, 13, 18, 115, 71, 91, 179, 112, 155, 15, 14, 26, 60, 29, 116, 66, 120, 142, and 152.

According to the converted GW pattern (A) of FIG. 288, the arrangement of bit groups 0 to 179 of the LDPC code of 64 k bits is interleaved into the arrangement of bit groups 33, 12, 125, 85, 93, 28, 119, 81, 101, 84, 89, 67, 82, 104, 98, 114, 83, 15, 73, 117, 157, 10, 162, 23, 16, 47, 121, 46, 128, 9, 11, 48, 64, 17, 76, 14, 90, 21, 50, 131, 20, 127, 126, 164, 68, 22, 27, 110, 25, 129, 54, 52, 13, 26, 107, 58, 62, 70, 35, 148, 39, 92, 6, 103, 31, 159, 80, 87, 100, 19, 18, 60, 99, 158, 109, 32, 74, 34, 40, 63, 111, 86, 56, 133, 130, 95, 37, 30, 115, 29, 94, 77, 75, 41, 45, 61, 57, 105, 65, 169, 43, 78, 163, 55, 79, 97, 71, 116, 53, 72, 42, 24, 149, 96, 165, 108, 147, 134, 102, 154, 88, 49, 69, 51, 91, 66, 151, 59, 146, 143, 161, 144, 106, 170, 150, 44, 156, 176, 36, 145, 38, 168, 179, 120, 124, 123, 118, 113, 173, 171, 172, 3, 122, 175, 160, 174, 166, 178, 177, 132, 112, 142, 8, 2, 153, 1, 4, 140, 139, 135, 7, 167, 141, 5, 137, 0, 136, 138, 155, and 152.

FIG. 289 is a diagram showing an example of the GW pattern for the LDPC code having the code length N of 64 k bits when the modulation scheme is 1024-QAM and the code rate r is 12/15.

According to the original GW pattern (A) of FIG. 289, the arrangement of bit groups 0 to 179 of the LDPC code of 64 k bits is interleaved into the arrangement of bit groups 91, 19, 11, 106, 14, 40, 20, 67, 32, 22, 31, 23, 78, 68, 79, 141, 117, 95, 88, 136, 52, 121, 1, 133, 4, 2, 21, 122, 38, 12, 69, 111, 81, 82, 58, 46, 112, 60, 33, 73, 53, 92, 75, 48, 47, 110, 80, 76, 138, 87, 85, 65, 130, 57, 102, 83, 64, 86, 100, 39, 49, 125, 108, 119, 6, 118, 35, 61, 71, 30, 45, 94, 26, 116, 98, 37, 55, 44, 70, 25, 7, 34, 114, 135, 128, 137, 84, 51, 28, 97, 27, 89, 29, 62, 50, 139, 56, 109, 77, 59, 127, 142, 96, 105, 99, 90, 13, 124, 120, 115, 126, 143, 149, 74, 41, 178, 129, 18, 131, 42, 165, 101, 134, 36, 140, 132, 103, 72, 164, 93, 54, 166, 43, 123, 113, 0, 154, 10, 63, 107, 162, 157, 66, 104, 17, 147, 167, 174, 179, 3, 173, 160, 155, 161, 152, 156, 177, 24, 170, 9, 159, 16, 15, 148, 5, 146, 163, 172, 175, 151, 169, 176, 150, 153, 171, 158, 168, 144, 8, and 145.

According to the converted GW pattern (B) of FIG. 289, the arrangement of bit groups 0 to 179 of the LDPC code of 64 k bits is interleaved into the arrangement of bit groups 91, 88, 112, 102, 26, 27, 120, 103, 17, 15, 19, 136, 60, 83, 116, 89, 115, 72, 147, 148, 11, 52, 33, 64, 98, 29, 126, 164, 167, 5, 106, 121, 73, 86, 37, 62, 143, 93, 174, 146, 14, 1, 53, 100, 55, 50, 149, 54, 179, 163, 40, 133, 92, 39, 44, 139, 74, 166, 3, 172, 20, 4, 75, 49, 70, 56, 41, 43, 173, 175, 67, 2, 48, 125, 25, 109, 178, 123, 160, 151, 32, 21, 47, 108, 7, 77, 129, 113, 155, 169, 22, 122, 110, 119, 34, 59, 18, 0, 161, 176, 31, 38, 80, 6, 114, 127, 131, 154, 152, 150, 23, 12, 76, 118, 135, 142, 42, 10, 156, 153, 78, 69, 138, 35, 128, 96, 165, 63, 177, 171, 68, 111, 87, 61, 137, 105, 101, 107, 24, 158, 79, 81, 85, 71, 84, 99, 134, 162, 170, 168, 141, 82, 65, 30, 51, 90, 36, 157, 9, 144, 117, 58, 130, 45, 28, 13, 140, 66, 159, 8, 95, 46, 57, 94, 97, 124, 132, 104, 16, and 145.

FIG. 290 is a diagram showing an example of the GW pattern for the LDPC code having the code length N of 64 k bits when the modulation scheme is 1024-QAM and the code rate r is 13/15.

According to the original GW pattern (A) of FIG. 290, the arrangement of bit groups 0 to 179 of the LDPC code of 64 k bits is interleaved into the arrangement of bit groups 49, 2, 57, 47, 31, 35, 24, 39, 59, 0, 45, 41, 55, 53, 51, 37, 33, 43, 56, 38, 48, 32, 50, 23, 34, 54, 1, 36, 44, 52, 40, 58, 122, 46, 42, 30, 3, 75, 73, 65, 145, 71, 79, 67, 69, 83, 85, 147, 63, 81, 77, 61, 5, 26, 62, 64, 74, 70, 82, 149, 76, 4, 78, 84, 80, 86, 66, 68, 72, 6, 60, 154, 103, 95, 101, 143, 9, 89, 141, 128, 97, 137, 133, 7, 13, 99, 91, 93, 87, 11, 136, 90, 88, 94, 10, 8, 14, 96, 104, 92, 132, 142, 100, 98, 12, 102, 152, 139, 150, 106, 146, 130, 27, 108, 153, 112, 114, 29, 110, 134, 116, 15, 127, 125, 123, 120, 148, 151, 113, 126, 124, 135, 129, 109, 25, 28, 158, 117, 105, 115, 111, 131, 107, 121, 18, 170, 164, 20, 140, 160, 166, 162, 119, 155, 168, 178, 22, 174, 172, 176, 16, 157, 159, 171, 161, 118, 17, 163, 21, 165, 19, 179, 177, 167, 138, 173, 156, 144, 169, and 175.

According to the converted GW pattern (B) of FIG. 290, the arrangement of bit groups 0 to 179 of the LDPC code of 64 k bits is interleaved into the arrangement of bit groups 49, 56, 3, 62, 103, 136, 150, 148, 18, 159, 2, 38, 75, 64, 95, 90, 106, 151, 170, 171, 57, 48, 73, 74, 101, 88, 146, 113, 164, 161, 47, 32, 65, 70, 143, 94, 130, 126, 20, 118, 31, 50, 145, 82, 9, 10, 27, 124, 140, 17, 35, 23, 71, 149, 89, 8, 108, 135, 160, 163, 24, 34, 79, 76, 141, 14, 153, 129, 166, 21, 39, 54, 67, 4, 128, 96, 112, 109, 162, 165, 59, 1, 69, 78, 97, 104, 114, 25, 119, 19, 0, 36, 83, 84, 137, 92, 29, 28, 155, 179, 45, 44, 85, 80, 133, 132, 110, 158, 168, 177, 41, 52, 147, 86, 7, 142, 134, 117, 178, 167, 55, 40, 63, 66, 13, 100, 116, 105, 22, 138, 53, 58, 81, 68, 99, 98, 15, 115, 174, 173, 51, 122, 77, 72, 91, 12, 127, 111, 172, 156, 37, 46, 61, 6, 93, 102, 125, 131, 176, 144, 33, 42, 5, 60, 87, 152, 123, 107, 16, 169, 43, 30, 26, 154, 11, 139, 120, 121, 157, and 175.

FIG. 291 is a diagram showing an example of the GW pattern for the LDPC code having the code length N of 64 k bits when the modulation scheme is 4096-QAM and the code rate r is 2/15.

According to the original GW pattern (A) of FIG. 291, the arrangement of bit groups 0 to 179 of the LDPC code of 64 k bits is interleaved into the arrangement of bit groups 14, 129, 71, 96, 171, 36, 144, 64, 162, 4, 86, 128, 113, 7, 105, 131, 2, 133, 106, 79, 11, 152, 26, 118, 158, 126, 17, 55, 45, 111, 138, 84, 6, 52, 167, 38, 20, 101, 31, 120, 5, 112, 74, 69, 121, 9, 154, 15, 146, 116, 63, 1, 114, 83, 124, 109, 39, 75, 123, 57, 49, 30, 21, 40, 43, 77, 157, 44, 13, 99, 34, 147, 166, 56, 155, 176, 95, 102, 119, 161, 37, 159, 97, 68, 122, 163, 89, 61, 107, 22, 10, 127, 87, 103, 179, 172, 66, 59, 8, 145, 88, 132, 110, 54, 47, 153, 25, 32, 73, 42, 148, 150, 28, 91, 18, 24, 19, 53, 136, 48, 76, 35, 151, 173, 149, 142, 160, 94, 117, 169, 165, 141, 80, 67, 170, 164, 82, 65, 60, 135, 168, 23, 100, 134, 90, 98, 125, 85, 137, 81, 41, 156, 50, 3, 29, 16, 72, 177, 0, 78, 62, 139, 93, 46, 12, 175, 130, 51, 178, 92, 115, 174, 27, 70, 58, 33, 104, 140, 108, and 143.

According to the converted GW pattern (B) of FIG. 291, the arrangement of bit groups 0 to 179 of the LDPC code of 64 k bits is interleaved into the arrangement of bit groups 14, 131, 138, 9, 49, 176, 10, 153, 76, 164, 41, 175, 129, 2, 84, 154, 30, 95, 127, 25, 35, 82, 156, 130, 71, 133, 6, 15, 21, 102, 87, 32, 151, 65, 50, 51, 96, 106, 52, 146, 40, 119, 103, 73, 173, 60, 3, 178, 171, 79, 167, 116, 43, 161, 179, 42, 149, 135, 29, 92, 36, 11, 38, 63, 77, 37, 172, 148, 142, 168, 16, 115, 144, 152, 20, 1, 157, 159, 66, 150, 160, 23, 72, 174, 64, 26, 101, 114, 44, 97, 59, 28, 94, 100, 177, 27, 162, 118, 31, 83, 13, 68, 8, 91, 117, 134, 0, 70, 4, 158, 120, 124, 99, 122, 145, 18, 169, 90, 78, 58, 86, 126, 5, 109, 34, 163, 88, 24, 165, 98, 62, 33, 128, 17, 112, 39, 147, 89, 132, 19, 141, 125, 139, 104, 113, 55, 74, 75, 166, 61, 110, 53, 80, 85, 93, 140, 7, 45, 69, 123, 56, 107, 54, 136, 67, 137, 46, 108, 105, 111, 121, 57, 155, 22, 47, 48, 170, 81, 12, and 143.

FIG. 292 is a diagram showing an example of the GW pattern for the LDPC code having the code length N of 64 k bits when the modulation scheme is 4096-QAM and the code rate r is 3/15.

According to the original GW pattern (A) of FIG. 292, the arrangement of bit groups 0 to 179 of the LDPC code of 64 k bits is interleaved into the arrangement of bit groups 136, 20, 44, 36, 17, 120, 89, 142, 66, 35, 42, 116, 14, 119, 117, 29, 47, 125, 11, 158, 74, 25, 37, 175, 41, 145, 100, 131, 173, 179, 16, 77, 112, 40, 58, 23, 82, 168, 106, 83, 34, 49, 122, 2, 157, 107, 79, 137, 53, 96, 33, 70, 19, 38, 121, 90, 118, 126, 165, 109, 154, 140, 10, 178, 143, 92, 63, 176, 146, 134, 177, 139, 3, 113, 172, 9, 50, 138, 61, 93, 94, 88, 132, 105, 151, 170, 86, 12, 1, 7, 56, 59, 101, 155, 95, 54, 85, 13, 39, 15, 76, 130, 97, 110, 174, 72, 150, 55, 73, 99, 111, 162, 26, 21, 156, 28, 160, 149, 133, 104, 81, 69, 84, 4, 6, 147, 48, 115, 169, 127, 161, 71, 68, 80, 91, 98, 8, 57, 171, 135, 52, 5, 141, 65, 75, 163, 43, 144, 167, 159, 129, 46, 31, 30, 166, 0, 148, 128, 102, 103, 60, 32, 18, 51, 87, 114, 64, 22, 164, 24, 123, 27, 62, 124, 152, 78, 108, 67, 153, and 45.

According to the converted GW pattern (B) of FIG. 292, the arrangement of bit groups 0 to 179 of the LDPC code of 64 k bits is interleaved into the arrangement of bit groups 136, 29, 16, 107, 154, 9, 56, 72, 81, 98, 129, 114, 20, 47, 77, 79, 140, 50, 59, 150, 69, 8, 46, 64, 44, 125, 112, 137, 10, 138, 101, 55, 84, 57, 31, 22, 36, 11, 40, 53, 178, 61, 155, 73, 4, 171, 30, 164, 17, 158, 58, 96, 143, 93, 95, 99, 6, 135, 166, 24, 120, 74, 23, 33, 92, 94, 54, 111, 147, 52, 0, 123, 89, 25, 82, 70, 63, 88, 85, 162, 48, 5, 148, 27, 142, 37, 168, 19, 176, 132, 13, 26, 115, 141, 128, 62, 66, 175, 106, 38, 146, 105, 39, 21, 169, 65, 102, 124, 35, 41, 83, 121, 134, 151, 15, 156, 127, 75, 103, 152, 42, 145, 34, 90, 177, 170, 76, 28, 161, 163, 60, 78, 116, 100, 49, 118, 139, 86, 130, 160, 71, 43, 32, 108, 14, 131, 122, 126, 3, 12, 97, 149, 68, 144, 18, 67, 119, 173, 2, 165, 113, 1, 110, 133, 80, 167, 51, 153, 117, 179, 157, 109, 172, 7, 174, 104, 91, 159, 87, and 45.

FIG. 293 is a diagram showing an example of the GW pattern for the LDPC code having the code length N of 64 k bits when the modulation scheme is 4096-QAM and the code rate r is 4/15.

According to the original GW pattern (A) of FIG. 293, the arrangement of bit groups 0 to 179 of the LDPC code of 64 k bits is interleaved into the arrangement of bit groups 91, 52, 36, 30, 35, 6, 121, 29, 150, 47, 163, 2, 89, 39, 65, 157, 64, 122, 101, 40, 84, 69, 90, 129, 10, 9, 15, 162, 21, 171, 43, 44, 132, 158, 104, 4, 72, 169, 177, 103, 76, 28, 78, 53, 1, 151, 161, 88, 148, 42, 160, 109, 100, 126, 138, 108, 38, 25, 3, 112, 17, 124, 155, 172, 134, 86, 119, 94, 145, 178, 68, 26, 130, 140, 115, 152, 139, 37, 22, 102, 14, 118, 11, 98, 154, 61, 146, 164, 107, 131, 159, 63, 93, 7, 79, 5, 137, 165, 59, 77, 55, 80, 117, 13, 173, 144, 85, 153, 66, 106, 49, 34, 48, 41, 143, 142, 27, 136, 18, 111, 175, 123, 147, 114, 19, 125, 166, 149, 113, 46, 31, 141, 120, 57, 74, 8, 20, 96, 170, 128, 97, 16, 60, 110, 156, 45, 82, 105, 62, 99, 23, 92, 32, 50, 73, 56, 167, 95, 24, 168, 33, 116, 75, 127, 81, 67, 179, 174, 70, 12, 58, 87, 176, 0, 51, 135, 83, 133, 54, and 71.

According to the converted GW pattern (B) of FIG. 293, the arrangement of bit groups 0 to 179 of the LDPC code of 64 k bits is interleaved into the arrangement of bit groups 91, 157, 43, 151, 17, 152, 159, 144, 175, 8, 23, 67, 52, 64, 44, 161, 124, 139, 63, 85, 123, 20, 92, 179, 36, 122, 132, 88, 155, 37, 93, 153, 147, 96, 32, 174, 30, 101, 158, 148, 172, 22, 7, 66, 114, 170, 50, 70, 35, 40, 104, 42, 134, 102, 79, 106, 19, 128, 73, 12, 6, 84, 4, 160, 86, 14, 5, 49, 125, 97, 56, 58, 121, 69, 72, 109, 119, 118, 137, 34, 166, 16, 167, 87, 29, 90, 169, 100, 94, 11, 165, 48, 149, 60, 95, 176, 150, 129, 177, 126, 145, 98, 59, 41, 113, 110, 24, 0, 47, 10, 103, 138, 178, 154, 77, 143, 46, 156, 168, 51, 163, 9, 76, 108, 68, 61, 55, 142, 31, 45, 33, 135, 2, 15, 28, 38, 26, 146, 80, 27, 141, 82, 116, 83, 89, 162, 78, 25, 130, 164, 117, 136, 120, 105, 75, 133, 39, 21, 53, 3, 140, 107, 13, 18, 57, 62, 127, 54, 65, 171, 1, 112, 115, 131, 173, 111, 74, 99, 81, and 71.

FIG. 294 is a diagram showing an example of the GW pattern for the LDPC code having the code length N of 64 k bits when the modulation scheme is 4096-QAM and the code rate r is 5/15.

According to the original GW pattern (A) of FIG. 294, the arrangement of bit groups 0 to 179 of the LDPC code of 64 k bits is interleaved into the arrangement of bit groups 146, 89, 57, 16, 164, 138, 91, 78, 90, 66, 122, 12, 9, 157, 14, 68, 112, 128, 74, 45, 28, 87, 158, 56, 61, 168, 18, 161, 95, 99, 139, 22, 65, 130, 166, 118, 150, 49, 142, 44, 36, 1, 121, 6, 46, 29, 88, 47, 0, 58, 105, 43, 80, 64, 107, 21, 55, 151, 8, 145, 163, 7, 98, 123, 17, 11, 153, 136, 52, 3, 13, 34, 160, 102, 125, 114, 152, 84, 32, 97, 33, 60, 62, 79, 37, 129, 38, 165, 71, 75, 59, 144, 127, 132, 104, 53, 162, 103, 120, 54, 155, 116, 48, 77, 76, 73, 113, 119, 179, 177, 41, 19, 92, 109, 31, 143, 178, 108, 39, 140, 106, 40, 5, 25, 81, 176, 101, 124, 126, 72, 111, 4, 173, 156, 134, 86, 174, 2, 170, 35, 175, 137, 15, 24, 69, 96, 30, 117, 67, 171, 149, 169, 63, 23, 20, 167, 27, 147, 51, 10, 82, 131, 85, 110, 94, 135, 172, 148, 50, 154, 42, 70, 115, 26, 83, 141, 100, 133, 93, and 159.

According to the converted GW pattern (B) of FIG. 294, the arrangement of bit groups 0 to 179 of the LDPC code of 64 k bits is interleaved into the arrangement of bit groups 146, 68, 139, 29, 163, 114, 59, 73, 106, 86, 149, 135, 89, 112, 22, 88, 7, 152, 144, 113, 40, 174, 169, 172, 57, 128, 65, 47, 98, 84, 127, 119, 5, 2, 63, 148, 16, 74, 130, 0, 123, 32, 132, 179, 25, 170, 23, 50, 164, 45, 166, 58, 17, 97, 104, 177, 81, 35, 20, 154, 138, 28, 118, 105, 11, 33, 53, 41, 176, 175, 167, 42, 91, 87, 150, 43, 153, 60, 162, 19, 101, 137, 27, 70, 78, 158, 49, 80, 136, 62, 103, 92, 124, 15, 147, 115, 90, 56, 142, 64, 52, 79, 120, 109, 126, 24, 51, 26, 66, 61, 44, 107, 3, 37, 54, 31, 72, 69, 10, 83, 122, 168, 36, 21, 13, 129, 155, 143, 111, 96, 82, 141, 12, 18, 1, 55, 34, 38, 116, 178, 4, 30, 131, 100, 9, 161, 121, 151, 160, 165, 48, 108, 173, 117, 85, 133, 157, 95, 6, 8, 102, 71, 77, 39, 156, 67, 110, 93, 14, 99, 46, 145, 125, 75, 76, 140, 134, 171, 94, and 159.

FIG. 295 is a diagram showing an example of the GW pattern for the LDPC code having the code length N of 64 k bits when the modulation scheme is 4096-QAM and the code rate r is 6/15.

According to the original GW pattern (A) of FIG. 295, the arrangement of bit groups 0 to 179 of the LDPC code of 64 k bits is interleaved into the arrangement of bit groups 66, 21, 51, 55, 117, 24, 33, 12, 70, 63, 47, 65, 145, 8, 0, 57, 23, 71, 59, 14, 40, 42, 15, 56, 2, 43, 64, 58, 67, 53, 68, 61, 39, 52, 69, 1, 22, 31, 161, 38, 30, 19, 17, 18, 4, 41, 25, 44, 136, 29, 36, 26, 126, 177, 62, 37, 148, 9, 13, 45, 46, 152, 50, 49, 27, 77, 60, 35, 48, 178, 28, 34, 106, 127, 76, 131, 105, 138, 75, 130, 101, 167, 54, 173, 113, 108, 92, 135, 124, 121, 97, 149, 143, 81, 32, 96, 3, 78, 107, 86, 98, 16, 162, 150, 111, 158, 172, 139, 74, 142, 166, 7, 5, 119, 20, 144, 151, 90, 11, 156, 100, 175, 83, 155, 159, 128, 88, 87, 93, 103, 94, 140, 165, 6, 137, 157, 10, 85, 141, 129, 146, 122, 73, 112, 132, 125, 174, 169, 168, 79, 84, 118, 179, 147, 91, 160, 163, 115, 89, 80, 102, 104, 134, 82, 95, 133, 164, 154, 120, 110, 170, 114, 153, 72, 109, 171, 176, 99, 116, and 123.

According to the converted GW pattern (B) of FIG. 295, the arrangement of bit groups 0 to 179 of the LDPC code of 64 k bits is interleaved into the arrangement of bit groups 66, 57, 68, 41, 46, 131, 97, 158, 100, 157, 84, 133, 21, 23, 61, 25, 152, 105, 149, 172, 175, 10, 118, 164, 51, 71, 39, 44, 50, 138, 143, 139, 83, 85, 179, 154, 55, 59, 52, 136, 49, 75, 81, 74, 155, 141, 147, 120, 117, 14, 69, 29, 27, 130, 32, 142, 159, 129, 91, 110, 24, 40, 1, 36, 77, 101, 96, 166, 128, 146, 160, 170, 33, 42, 22, 26, 60, 167, 3, 7, 88, 122, 163, 114, 12, 15, 31, 126, 35, 54, 78, 5, 87, 73, 115, 153, 70, 56, 161, 177, 48, 173, 107, 119, 93, 112, 89, 72, 63, 2, 38, 62, 178, 113, 86, 20, 103, 132, 80, 109, 47, 43, 30, 37, 28, 108, 98, 144, 94, 125, 102, 171, 65, 64, 19, 148, 34, 92, 16, 151, 140, 174, 104, 176, 145, 58, 17, 9, 106, 135, 162, 90, 165, 169, 134, 99, 8, 67, 18, 13, 127, 124, 150, 11, 6, 168, 82, 116, 0, 53, 4, 45, 76, 121, 111, 156, 137, 79, 95, and 123.

FIG. 296 is a diagram showing an example of the GW pattern for the LDPC code having the code length N of 64 k bits when the modulation scheme is 4096-QAM and the code rate r is 7/15.

According to the original GW pattern (A) of FIG. 296, the arrangement of bit groups 0 to 179 of the LDPC code of 64 k bits is interleaved into the arrangement of bit groups 59, 60, 0, 48, 87, 30, 29, 146, 142, 8, 150, 171, 20, 121, 23, 122, 144, 76, 162, 106, 50, 39, 63, 108, 165, 174, 16, 85, 58, 43, 161, 34, 13, 92, 79, 82, 175, 86, 69, 68, 15, 113, 84, 118, 27, 93, 120, 61, 73, 104, 10, 38, 45, 7, 173, 75, 24, 77, 137, 21, 37, 46, 3, 6, 168, 148, 109, 123, 103, 140, 64, 117, 158, 114, 136, 112, 31, 70, 134, 163, 98, 91, 33, 115, 95, 176, 154, 107, 97, 131, 111, 129, 40, 66, 170, 41, 74, 138, 99, 179, 81, 157, 32, 19, 26, 62, 172, 78, 160, 57, 22, 159, 51, 135, 2, 55, 164, 153, 155, 14, 42, 149, 127, 133, 83, 96, 139, 89, 36, 125, 130, 143, 147, 67, 18, 102, 94, 35, 101, 44, 49, 177, 88, 11, 105, 151, 12, 132, 25, 128, 119, 65, 145, 4, 54, 90, 71, 167, 166, 1, 156, 56, 124, 17, 141, 72, 9, 28, 5, 110, 100, 47, 80, 169, 116, 53, 152, 52, 126, and 178.

According to the converted GW pattern (B) of FIG. 296, the arrangement of bit groups 0 to 179 of the LDPC code of 64 k bits is interleaved into the arrangement of bit groups 59, 122, 161, 93, 37, 112, 111, 62, 42, 102, 119, 72, 60, 144, 34, 120, 46, 31, 129, 172, 149, 94, 65, 9, 0, 76, 13, 61, 3, 70, 40, 78, 127, 35, 145, 28, 48, 162, 92, 73, 6, 134, 66, 160, 133, 101, 4, 5, 87, 106, 79, 104, 168, 163, 170, 57, 83, 44, 54, 110, 30, 50, 82, 10, 148, 98, 41, 22, 96, 49, 90, 100, 29, 39, 175, 38, 109, 91, 74, 159, 139, 177, 71, 47, 146, 63, 86, 45, 123, 33, 138, 51, 89, 88, 167, 80, 142, 108, 69, 7, 103, 115, 99, 135, 36, 11, 166, 169, 8, 165, 68, 173, 140, 95, 179, 2, 125, 105, 1, 116, 150, 174, 15, 75, 64, 176, 81, 55, 130, 151, 156, 53, 171, 16, 113, 24, 117, 154, 157, 164, 143, 12, 56, 152, 20, 85, 84, 77, 158, 107, 32, 153, 147, 132, 124, 52, 121, 58, 118, 137, 114, 97, 19, 155, 67, 25, 17, 126, 23, 43, 27, 21, 136, 131, 26, 14, 18, 128, 141, and 178.

FIG. 297 is a diagram showing an example of the GW pattern for the LDPC code having the code length N of 64 k bits when the modulation scheme is 4096-QAM and the code rate r is 8/15.

According to the original GW pattern (A) of FIG. 297, the arrangement of bit groups 0 to 179 of the LDPC code of 64 k bits is interleaved into the arrangement of bit groups 77, 48, 82, 51, 57, 69, 65, 6, 71, 90, 84, 81, 50, 88, 61, 55, 53, 73, 39, 13, 79, 75, 41, 18, 38, 89, 49, 93, 36, 64, 47, 40, 42, 76, 70, 56, 3, 72, 2, 54, 52, 145, 19, 78, 80, 63, 87, 67, 86, 10, 1, 58, 17, 14, 175, 91, 68, 85, 94, 15, 43, 74, 60, 66, 37, 92, 4, 9, 16, 83, 46, 44, 102, 30, 112, 122, 110, 29, 20, 105, 138, 101, 174, 33, 137, 136, 131, 166, 59, 34, 62, 125, 28, 26, 45, 24, 23, 21, 157, 98, 35, 95, 22, 32, 103, 27, 113, 31, 119, 173, 168, 118, 120, 114, 149, 159, 155, 179, 160, 161, 130, 123, 172, 139, 124, 153, 0, 109, 167, 128, 107, 117, 147, 177, 96, 164, 152, 11, 148, 158, 129, 163, 176, 151, 171, 8, 106, 144, 150, 169, 108, 162, 143, 111, 141, 133, 178, 134, 146, 99, 132, 142, 104, 115, 135, 121, 100, 12, 170, 156, 126, 5, 127, 154, 97, 140, 116, 165, 7, and 25.

According to the converted GW pattern (B) of FIG. 297, the arrangement of bit groups 0 to 179 of the LDPC code of 64 k bits is interleaved into the arrangement of bit groups 77, 55, 47, 63, 43, 122, 62, 27, 130, 164, 108, 121, 48, 53, 40, 87, 74, 110, 125, 113, 123, 152, 162, 100, 82, 73, 42, 67, 60, 29, 28, 31, 172, 11, 143, 12, 51, 39, 76, 86, 66, 20, 26, 119, 139, 148, 111, 170, 57, 13, 70, 10, 37, 105, 45, 173, 124, 158, 141, 156, 69, 79, 56, 1, 92, 138, 24, 168, 153, 129, 133, 126, 65, 75, 3, 58, 4, 101, 23, 118, 0, 163, 178, 5, 6, 41, 72, 17, 9, 174, 21, 120, 109, 176, 134, 127, 71, 18, 2, 14, 16, 33, 157, 114, 167, 151, 146, 154, 90, 38, 54, 175, 83, 137, 98, 149, 128, 171, 99, 97, 84, 89, 52, 91, 46, 136, 35, 159, 107, 8, 132, 140, 81, 49, 145, 68, 44, 131, 95, 155, 117, 106, 142, 116, 50, 93, 19, 85, 102, 166, 22, 179, 147, 144, 104, 165, 88, 36, 78, 94, 30, 59, 32, 160, 177, 150, 115, 7, 61, 64, 80, 15, 112, 34, 103, 161, 96, 169, 135, and 25.

FIG. 298 is a diagram showing an example of the GW pattern for the LDPC code having the code length N of 64 k bits when the modulation scheme is 4096-QAM and the code rate r is 9/15.

According to the original GW pattern (A) of FIG. 298, the arrangement of bit groups 0 to 179 of the LDPC code of 64 k bits is interleaved into the arrangement of bit groups 67, 79, 72, 175, 1, 92, 63, 65, 36, 73, 18, 3, 43, 78, 5, 40, 82, 20, 15, 76, 28, 84, 59, 91, 93, 54, 58, 60, 2, 19, 66, 44, 85, 48, 0, 50, 166, 89, 41, 24, 83, 75, 55, 64, 52, 98, 39, 141, 34, 74, 33, 45, 99, 46, 10, 69, 94, 101, 56, 9, 97, 96, 37, 14, 31, 70, 106, 113, 80, 62, 100, 13, 32, 88, 57, 127, 53, 68, 146, 61, 7, 107, 71, 51, 161, 81, 49, 86, 95, 103, 30, 25, 126, 87, 22, 47, 27, 171, 102, 6, 132, 77, 90, 38, 167, 4, 35, 26, 118, 140, 104, 128, 179, 124, 109, 159, 42, 110, 21, 105, 148, 142, 134, 23, 117, 122, 160, 12, 154, 114, 156, 151, 145, 169, 11, 139, 177, 129, 155, 178, 138, 176, 147, 121, 136, 165, 170, 133, 149, 150, 174, 168, 125, 116, 115, 164, 29, 119, 153, 157, 162, 173, 112, 144, 172, 123, 137, 16, 120, 131, 111, 135, 163, 17, 130, 152, 108, 8, 158, and 143.

According to the converted GW pattern (B) of FIG. 298, the arrangement of bit groups 0 to 179 of the LDPC code of 64 k bits is interleaved into the arrangement of bit groups 67, 40, 66, 98, 97, 127, 30, 4, 148, 139, 174, 123, 79, 82, 44, 39, 96, 53, 25, 35, 142, 177, 168, 137, 72, 20, 85, 141, 37, 68, 126, 26, 134, 129, 125, 16, 175, 15, 48, 34, 14, 146, 87, 118, 23, 155, 116, 120, 1, 76, 0, 74, 31, 61, 22, 140, 117, 178, 115, 131, 92, 28, 50, 33, 70, 7, 47, 104, 122, 138, 164, 111, 63, 84, 166, 45, 106, 107, 27, 128, 160, 176, 29, 135, 65, 59, 89, 99, 113, 71, 171, 179, 12, 147, 119, 163, 36, 91, 41, 46, 80, 51, 102, 124, 154, 121, 153, 17, 73, 93, 24, 10, 62, 161, 6, 109, 114, 136, 157, 130, 18, 54, 83, 69, 100, 81, 132, 159, 156, 165, 162, 152, 3, 58, 75, 94, 13, 49, 77, 42, 151, 170, 173, 108, 43, 60, 55, 101, 32, 86, 90, 110, 145, 133, 112, 8, 78, 2, 64, 56, 88, 95, 38, 21, 169, 149, 144, 158, 5, 19, 52, 9, 57, 103, 167, 105, 11, 150, 172, and 143.

FIG. 299 is a diagram showing an example of the GW pattern for the LDPC code having the code length N of 64 k bits when the modulation scheme is 4096-QAM and the code rate r is 10/15.

According to the original GW pattern (A) of FIG. 299, the arrangement of bit groups 0 to 179 of the LDPC code of 64 k bits is interleaved into the arrangement of bit groups 36, 21, 117, 71, 38, 108, 42, 61, 13, 88, 97, 68, 2, 67, 50, 64, 95, 63, 100, 9, 82, 51, 45, 78, 31, 18, 103, 39, 119, 25, 40, 28, 72, 11, 73, 86, 131, 84, 111, 24, 58, 60, 81, 37, 89, 1, 93, 56, 69, 96, 35, 57, 116, 130, 55, 74, 41, 169, 54, 14, 26, 65, 83, 165, 107, 0, 52, 144, 75, 101, 8, 115, 118, 85, 48, 112, 80, 90, 32, 173, 76, 33, 16, 77, 164, 104, 46, 20, 98, 109, 29, 114, 7, 110, 99, 53, 133, 70, 87, 106, 145, 4, 113, 27, 59, 34, 5, 102, 148, 142, 79, 19, 44, 159, 174, 155, 136, 94, 43, 49, 152, 161, 66, 3, 121, 135, 147, 17, 157, 30, 153, 154, 137, 168, 92, 149, 171, 10, 177, 134, 143, 176, 179, 105, 172, 47, 146, 160, 23, 175, 141, 91, 140, 163, 132, 6, 126, 124, 12, 170, 167, 151, 125, 139, 150, 15, 129, 162, 120, 166, 156, 62, 158, 178, 128, 127, 22, 122, 123, and 138.

According to the converted GW pattern (B) of FIG. 299, the arrangement of bit groups 0 to 179 of the LDPC code of 64 k bits is interleaved into the arrangement of bit groups 36, 64, 40, 1, 26, 112, 29, 34, 152, 149, 141, 15, 21, 95, 28, 93, 65, 80, 114, 5, 161, 171, 91, 129, 117, 63, 72, 56, 83, 90, 7, 102, 66, 10, 140, 162, 71, 100, 11, 69, 165, 32, 110, 148, 3, 177, 163, 120, 38, 9, 73, 96, 107, 173, 99, 142, 121, 134, 132, 166, 108, 82, 86, 35, 0, 76, 53, 79, 135, 143, 6, 156, 42, 51, 131, 57, 52, 33, 133, 19, 147, 176, 126, 62, 61, 45, 84, 116, 144, 16, 70, 44, 17, 179, 124, 158, 13, 78, 111, 130, 75, 77, 87, 159, 157, 105, 12, 178, 88, 31, 24, 55, 101, 164, 106, 174, 30, 172, 170, 128, 97, 18, 58, 74, 8, 104, 145, 155, 153, 47, 167, 127, 68, 103, 60, 41, 115, 46, 4, 136, 154, 146, 151, 22, 2, 39, 81, 169, 118, 20, 113, 94, 137, 160, 125, 122, 67, 119, 37, 54, 85, 98, 27, 43, 168, 23, 139, 123, 50, 25, 89, 14, 48, 109, 59, 49, 92, 175, 150, and 138.

FIG. 300 is a diagram showing an example of the GW pattern for the LDPC code having the code length N of 64 k bits when the modulation scheme is 4096-QAM and the code rate r is 11/15.

According to the original GW pattern (A) of FIG. 300, the arrangement of bit groups 0 to 179 of the LDPC code of 64 k bits is interleaved into the arrangement of bit groups 77, 97, 3, 44, 119, 72, 83, 116, 40, 0, 111, 8, 68, 43, 24, 102, 49, 92, 65, 31, 93, 60, 17, 76, 89, 118, 70, 87, 15, 67, 22, 59, 95, 46, 38, 125, 48, 58, 140, 104, 73, 47, 14, 120, 1, 50, 80, 63, 62, 45, 9, 25, 114, 19, 82, 54, 150, 121, 130, 123, 37, 55, 23, 98, 81, 122, 103, 85, 126, 101, 78, 5, 128, 148, 57, 12, 107, 36, 2, 109, 52, 39, 66, 115, 42, 156, 90, 51, 91, 29, 84, 18, 144, 10, 94, 64, 100, 86, 71, 27, 30, 32, 110, 33, 113, 131, 35, 34, 112, 26, 108, 16, 61, 56, 75, 41, 117, 69, 172, 96, 149, 127, 124, 173, 13, 74, 105, 53, 161, 146, 174, 79, 88, 28, 129, 134, 139, 136, 145, 170, 135, 158, 154, 162, 7, 169, 99, 106, 137, 165, 143, 4, 175, 138, 133, 171, 168, 147, 167, 141, 163, 176, 179, 142, 11, 177, 153, 151, 159, 132, 20, 164, 6, 157, 178, 21, 166, 155, 160, and 152.

According to the converted GW pattern (B) of FIG. 300, the arrangement of bit groups 0 to 179 of the LDPC code of 64 k bits is interleaved into the arrangement of bit groups 77, 102, 22, 50, 37, 12, 84, 131, 149, 134, 143, 177, 97, 49, 59, 80, 55, 107, 18, 35, 127, 139, 4, 153, 3, 92, 95, 63, 23, 36, 144, 34, 124, 136, 175, 151, 44, 65, 46, 62, 98, 2, 10, 112, 173, 145, 138, 159, 119, 31, 38, 45, 81, 109, 94, 26, 13, 170, 133, 132, 72, 93, 125, 9, 122, 52, 64, 108, 74, 135, 171, 20, 83, 60, 48, 25, 103, 39, 100, 16, 105, 158, 168, 164, 116, 17, 58, 114, 85, 66, 86, 61, 53, 154, 147, 6, 40, 76, 140, 19, 126, 115, 71, 56, 161, 162, 167, 157, 0, 89, 104, 82, 101, 42, 27, 75, 146, 7, 141, 178, 111, 118, 73, 54, 78, 156, 30, 41, 174, 169, 163, 21, 8, 70, 47, 150, 5, 90, 32, 117, 79, 99, 176, 166, 68, 87, 14, 121, 128, 51, 110, 69, 88, 106, 179, 155, 43, 15, 120, 130, 148, 91, 33, 172, 28, 137, 142, 160, 24, 67, 1, 123, 57, 29, 113, 96, 129, 165, 11, and 152.

FIG. 301 is a diagram showing an example of the GW pattern for the LDPC code having the code length N of 64 k bits when the modulation scheme is 4096-QAM and the code rate r is 12/15.

According to the original GW pattern (A) of FIG. 301, the arrangement of bit groups 0 to 179 of the LDPC code of 64 k bits is interleaved into the arrangement of bit groups 110, 16, 64, 100, 55, 70, 48, 26, 60, 71, 93, 1, 59, 88, 97, 136, 67, 94, 90, 72, 49, 23, 41, 92, 9, 35, 37, 113, 101, 111, 8, 52, 56, 19, 134, 151, 84, 126, 159, 63, 44, 65, 139, 31, 57, 103, 22, 116, 172, 38, 95, 36, 46, 141, 114, 4, 106, 149, 85, 86, 66, 51, 121, 105, 109, 87, 6, 135, 127, 47, 123, 39, 10, 148, 43, 131, 147, 45, 143, 5, 108, 81, 2, 140, 120, 132, 76, 58, 137, 18, 29, 125, 17, 30, 32, 156, 133, 78, 91, 161, 104, 174, 53, 61, 50, 74, 77, 33, 171, 138, 28, 69, 112, 119, 12, 102, 20, 167, 99, 122, 117, 24, 98, 115, 124, 42, 7, 79, 75, 128, 82, 68, 80, 3, 11, 54, 96, 40, 129, 142, 107, 73, 175, 14, 83, 150, 165, 118, 89, 130, 15, 163, 34, 166, 173, 146, 168, 153, 154, 177, 62, 145, 0, 178, 155, 157, 179, 144, 158, 152, 13, 25, 176, 162, 169, 164, 27, 21, 160, and 170.

According to the converted GW pattern (B) of FIG. 301, the arrangement of bit groups 0 to 179 of the LDPC code of 64 k bits is interleaved into the arrangement of bit groups 110, 136, 8, 103, 66, 131, 29, 74, 117, 54, 15, 157, 16, 67, 52, 22, 51, 147, 125, 77, 24, 96, 163, 179, 64, 94, 56, 116, 121, 45, 17, 33, 98, 40, 34, 144, 100, 90, 19, 172, 105, 143, 30, 171, 115, 129, 166, 158, 55, 72, 134, 38, 109, 5, 32, 138, 124, 142, 173, 152, 70, 49, 151, 95, 87, 108, 156, 28, 42, 107, 146, 13, 48, 23, 84, 36, 6, 81, 133, 69, 7, 73, 168, 25, 26, 41, 126, 46, 135, 2, 78, 112, 79, 175, 153, 176, 60, 92, 159, 141, 127, 140, 91, 119, 75, 14, 154, 162, 71, 9, 63, 114, 47, 120, 161, 12, 128, 83, 177, 169, 93, 35, 44, 4, 123, 132, 104, 102, 82, 150, 62, 164, 1, 37, 65, 106, 39, 76, 174, 20, 68, 165, 145, 27, 59, 113, 139, 149, 10, 58, 53, 167, 80, 118, 0, 21, 88, 101, 31, 85, 148, 137, 61, 99, 3, 89, 178, 160, 97, 111, 57, 86, 43, 18, 50, 122, 11, 130, 155, and 170.

FIG. 302 is a diagram showing an example of the GW pattern for the LDPC code having the code length N of 64 k bits when the modulation scheme is 4096-QAM and the code rate r is 13/15.

According to the original GW pattern (A) of FIG. 302, the arrangement of bit groups 0 to 179 of the LDPC code of 64 k bits is interleaved into the arrangement of bit groups 87, 50, 6, 42, 82, 54, 96, 0, 62, 124, 109, 126, 23, 64, 53, 20, 41, 111, 145, 135, 68, 2, 122, 128, 107, 7, 28, 14, 125, 136, 154, 10, 92, 99, 84, 86, 151, 108, 24, 94, 148, 29, 123, 13, 88, 52, 35, 61, 102, 132, 95, 70, 40, 129, 101, 36, 51, 150, 142, 152, 121, 131, 116, 97, 104, 31, 59, 137, 83, 112, 113, 57, 77, 32, 93, 49, 58, 117, 78, 1, 149, 37, 11, 100, 85, 79, 72, 66, 130, 18, 63, 55, 91, 46, 146, 21, 143, 44, 110, 75, 138, 16, 76, 45, 114, 144, 119, 38, 140, 65, 30, 133, 153, 33, 89, 71, 115, 105, 90, 56, 25, 103, 147, 73, 60, 47, 118, 27, 69, 9, 74, 48, 19, 39, 43, 34, 81, 139, 3, 164, 106, 134, 5, 67, 80, 141, 120, 98, 155, 8, 156, 162, 163, 165, 26, 161, 168, 176, 159, 170, 4, 127, 22, 173, 157, 171, 178, 158, 17, 174, 179, 167, 12, 172, 166, 160, 177, 169, 175, and 15.

According to the converted GW pattern (B) of FIG. 302, the arrangement of bit groups 0 to 179 of the LDPC code of 64 k bits is interleaved into the arrangement of bit groups 87, 20, 154, 52, 121, 49, 63, 144, 25, 34, 156, 171, 50, 41, 10, 35, 131, 58, 55, 119, 103, 81, 162, 178, 6, 111, 92, 61, 116, 117, 91, 38, 147, 139, 163, 158, 42, 145, 99, 102, 97, 78, 46, 140, 73, 3, 165, 17, 82, 135, 84, 132, 104, 1, 146, 65, 60, 164, 26, 174, 54, 68, 86, 95, 31, 149, 21, 30, 47, 106, 161, 179, 96, 2, 151, 70, 59, 37, 143, 133, 118, 134, 168, 167, 0, 122, 108, 40, 137, 11, 44, 153, 27, 5, 176, 12, 62, 128, 24, 129, 83, 100, 110, 33, 69, 67, 159, 172, 124, 107, 94, 101, 112, 85, 75, 89, 9, 80, 170, 166, 109, 7, 148, 36, 113, 79, 138, 71, 74, 141, 4, 160, 126, 28, 29, 51, 57, 72, 16, 115, 48, 120, 127, 177, 23, 14, 123, 150, 77, 66, 76, 105, 19, 98, 22, 169, 64, 125, 13, 142, 32, 130, 45, 90, 39, 155, 173, 175, 53, 136, 88, 152, 93, 18, 114, 56, 43, 8, 157, and 15.

Example of GW Pattern Set to MODCOD (LDPC Code of 16 k Bits) FIG. 303 shows an example of the GW pattern set to the MODCOD which is the combination of the modulation scheme and the LDPC code of 16 k bits.

Similarly to FIG. 230, in FIG. 303, a case where "A"s are described in the MODCODs which are combinations of 4 types of modulation schemes (MODs) and code rates (CR) of 12 types of LDPC codes means that it is assumed that the block interleaving of the type A is performed, and the GW patterns for the block interleaving of the type A are set. A case where "B"s are described means that it is assumed that the block interleaving of the type B is performed, and the GW patterns for the block interleaving of the type B are set.

In FIG. 303, in the MODCODs in which the modulation scheme is QPSK (MOD 2) and the code rates r of the LDPC code of 16 k bits are 2/15, 3/15, 4/15, 5/15, 8/15, 10/15, 11/15, 12/15, and 13/15, it is assumed that the block interleaving of the type A is performed. Meanwhile, in the MODCODs in which the modulation scheme is QPSK (MOD 2) and the code rates r of the LDPC code of 16 k bits are 6/15, 7/15, and 9/15, it is assumed that the block interleaving of the type B is performed.

In FIG. 303, in the MODCODs in which the modulation scheme is 16-QAM (MOD 4) and the code rates r of the LDPC code of 16 k bits are 2/15, 3/15, 4/15, 5/15, 8/15, 10/15, and 12/15, it is assumed that the block interleaving of the type A is performed. Meanwhile, in the MODCODs in which the modulation scheme is 16-QAM (MOD 4) and the code rates r of the LDPC code of 16 k bits are 6/15, 7/15, 9/15, 11/15, and 13/15, it is assumed that the block interleaving of the type B is performed.

In FIG. 303, in the MODCODs in which the modulation scheme is 64-QAM (MOD 6) and the code rates r of the LDPC code of 16 k bits are 2/15, 3/15, 4/15, 5/15, 8/15, 10/15, 11/15, 12/15, and 13/15, it is assumed that the block interleaving of the type A is performed. Meanwhile, in the MODCODs in which the modulation scheme is 64-QAM (MOD 6) and the code rates r of the LDPC code of 16 k bits are 6/15, 7/15, and 9/15, it is assumed that the block interleaving of the type B is performed.

In FIG. 303, in the MODCODs in which the modulation scheme is 256-QAM (MOD 8) and the code rates r of the LDPC code of 16 k bits are 2/15, 3/15, 4/15, 5/15, 7/15, 8/15, 9/15, 10/15, 12/15, and 13/15, it is assumed that the block interleaving of the type A is performed. Meanwhile, in the MODCODs in which the modulation scheme is 256-QAM (MOD 8) and the code rates r of the LDPC code of 16 k bits are 6/15, and 11/15, it is assumed that the block interleaving of the type B is performed.

As stated above, the GW pattern for the block interleaving of the type A or the GW pattern for the block interleaving of the type B is set to each MODCOD which is the combination of the modulation scheme and the LDPC code of 16 k bits depending on the assumed type A.

As mentioned above, when it is assumed that the block interleaving of the type B is performed in the group-wise interleaver 1021, the GW pattern for the block interleaving of the type B is rewritten into the GW pattern for the block interleaving of the type A such that a block interleaving effect obtained when the block interleaving of the type A is performed is the same as a block interleaving effect obtained when the block interleaving of the type B is performed.

When it is assumed that the block interleaving of the type A is performed in the group-wise interleaver 1021, the GW pattern for the block interleaving of the type A is rewritten into the GW pattern for the block interleaving of the type B such that a block interleaving effect obtained when the block interleaving of the type B is performed is the same as a block interleaving effect obtained when the block interleaving of the type A is performed.

As a specific example of the GW pattern set to each MODCOD shown in FIG. 303, an original GW pattern and a converted GW pattern will be described. The UC or NUC may be applied to the QAM constellation such as 16-QAM.

In each MODCOD, when the GW pattern for the block interleaving of the type A is set as an original GW pattern (A), the GW pattern for the block interleaving of the type B is set as a converted GW pattern (B). By contrast, when the GW pattern for the block interleaving of the type B is set as an original GW pattern (B), the GW pattern for the block interleaving of the type A is set as a converted GW pattern (A).

FIG. 304 is a diagram showing an example of the GW pattern for the LDPC code having the code length N of 16 k bits when the modulation scheme is QPSK and the code rate r is 2/15.

According to the original GW pattern (A) of FIG. 304, the arrangement of bit groups 0 to 44 of the LDPC code of 16 k bits is interleaved into the arrangement of bit groups 0, 2, 4, 6, 8, 10, 12, 14, 16, 18, 20, 22, 24, 26, 28, 30, 32, 34, 36, 38, 40, 42, 1, 3, 5, 7, 9, 11, 13, 15, 17, 19, 21, 23, 25, 27, 29, 31, 33, 35, 37, 39, 41, 43, and 44.

According to the converted GW pattern (B) of FIG. 304, the arrangement of bit groups 0 to 44 of the LDPC code of 16 k bits is interleaved into the arrangement of bit groups 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, and 44.

FIG. 305 is a diagram showing an example of the GW pattern for the LDPC code having the code length N of 16 k bits when the modulation scheme is QPSK and the code rate r is 3/15.

According to the original GW pattern (A) of FIG. 305, the arrangement of bit groups 0 to 44 of the LDPC code of 16 k bits is interleaved into the arrangement of bit groups 15, 22, 34, 19, 7, 17, 28, 43, 30, 32, 14, 1, 11, 0, 3, 9, 10, 38, 24, 4, 23, 18, 27, 39, 29, 33, 8, 2, 40, 21, 20, 36, 44, 12, 37, 13, 35, 6, 31, 26, 16, 25, 42, 5, and 41.

According to the converted GW pattern (B) of FIG. 305, the arrangement of bit groups 0 to 44 of the LDPC code of 16 k bits is interleaved into the arrangement of bit groups 15, 27, 22, 39, 34, 29, 19, 33, 7, 8, 17, 2, 28, 40, 43, 21, 30, 20, 32, 36, 14, 44, 1, 12, 11, 37, 0, 13, 3, 35, 9, 6, 10, 31, 38, 26, 24, 16, 4, 25, 23, 42, 18, 5, and 41.

FIG. 306 is a diagram showing an example of the GW pattern for the LDPC code having the code length N of 16 k bits when the modulation scheme is QPSK and the code rate r is 4/15.

According to the original GW pattern (A) of FIG. 306, the arrangement of bit groups 0 to 44 of the LDPC code of 16 k bits is interleaved into the arrangement of bit groups 0, 2, 4, 6, 8, 10, 12, 14, 16, 18, 20, 22, 24, 26, 28, 30, 32, 34, 36, 38, 40, 42, 1, 3, 5, 7, 9, 11, 13, 15, 17, 19, 21, 23, 25, 27, 29, 31, 33, 35, 37, 39, 41, 43, and 44.

According to the converted GW pattern (B) of FIG. 306, the arrangement of bit groups 0 to 44 of the LDPC code of 16 k bits is interleaved into the arrangement of bit groups 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, and 44.

FIG. 307 is a diagram showing an example of the GW pattern for the LDPC code having the code length N of 16 k bits when the modulation scheme is QPSK and the code rate r is 5/15.

According to the original GW pattern (A) of FIG. 307, the arrangement of bit groups 0 to 44 of the LDPC code of 16 k bits is interleaved into the arrangement of bit groups 35, 7, 29, 11, 14, 32, 38, 28, 20, 17, 25, 39, 19, 4, 1, 12, 10, 30, 0, 44, 43, 2, 21, 5, 13, 34, 37, 23, 15, 36, 18, 42, 16, 33, 31, 27, 22, 3, 6, 40, 24, 41, 9, 26, and 8.

According to the converted GW pattern (B) of FIG. 307, the arrangement of bit groups 0 to 44 of the LDPC code of 16 k bits is interleaved into the arrangement of bit groups 35, 21, 7, 5, 29, 13, 11, 34, 14, 37, 32, 23, 38, 15, 28, 36, 20, 18, 17, 42, 25, 16, 39, 33, 19, 31, 4, 27, 1, 22, 12, 3, 10, 6, 30, 40, 0, 24, 44, 41, 43, 9, 2, 26, and 8.

FIG. 308 is a diagram showing an example of the GW pattern for the LDPC code having the code length N of 16 k bits when the modulation scheme is QPSK and the code rate r is 6/15.

According to the original GW pattern (B) of FIG. 308, the arrangement of bit groups 0 to 44 of the LDPC code of 16 k bits is interleaved into the arrangement of bit groups 7, 4, 0, 5, 27, 30, 25, 13, 31, 9, 34, 10, 17, 11, 8, 12, 15, 16, 18, 19, 20, 21, 22, 23, 1, 35, 24, 29, 33, 6, 26, 14, 32, 28, 2, 3, 36, 37, 38, 39, 40, 41, 42, 43, and 44.

According to the converted GW pattern (A) of FIG. 308, the arrangement of bit groups 0 to 44 of the LDPC code of 16 k bits is interleaved into the arrangement of bit groups 7, 0, 27, 25, 31, 34, 17, 8, 15, 18, 20, 22, 1, 24, 33, 26, 32, 2, 36, 38, 40, 42, 4, 5, 30, 13, 9, 10, 11, 12, 16, 19, 21, 23, 35, 29, 6, 14, 28, 3, 37, 39, 41, 43, and 44.

FIG. 309 is a diagram showing an example of the GW pattern for the LDPC code having the code length N of 16 k bits when the modulation scheme is QPSK and the code rate r is 7/15.

According to the original GW pattern (B) of FIG. 309, the arrangement of bit groups 0 to 44 of the LDPC code of 16 k bits is interleaved into the arrangement of bit groups 3, 7, 1, 4, 18, 21, 22, 6, 9, 5, 17, 14, 13, 15, 10, 20, 8, 19, 16, 12, 0, 11, 2, 23, 24, 25, 26, 27, 28, 29, 30, 31, 32, 33, 34, 35, 36, 37, 38, 39, 40, 41, 42, 43, and 44.

According to the converted GW pattern (A) of FIG. 309, the arrangement of bit groups 0 to 44 of the LDPC code of 16 k bits is interleaved into the arrangement of bit groups 3, 1, 18, 22, 9, 17, 13, 10, 8, 16, 0, 2, 24, 26, 28, 30, 32, 34, 36, 38, 40, 42, 7, 4, 21, 6, 5, 14, 15, 20, 19, 12, 11, 23, 25, 27, 29, 31, 33, 35, 37, 39, 41, 43, and 44.

FIG. 310 is a diagram showing an example of the GW pattern for the LDPC code having the code length N of 16 k bits when the modulation scheme is QPSK and the code rate r is 8/15.

According to the original GW pattern (A) of FIG. 310, the arrangement of bit groups 0 to 44 of the LDPC code of 16 k bits is interleaved into the arrangement of bit groups 0, 2, 4, 6, 8, 10, 12, 14, 16, 18, 20, 22, 24, 26, 28, 30, 32, 34, 36, 38, 40, 42, 1, 3, 5, 7, 9, 11, 13, 15, 17, 19, 21, 23, 25, 27, 29, 31, 33, 35, 37, 39, 41, 43, and 44.

According to the converted GW pattern (B) of FIG. 310, the arrangement of bit groups 0 to 44 of the LDPC code of 16 k bits is interleaved into the arrangement of bit groups 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, and 44.

FIG. 311 is a diagram showing an example of the GW pattern for the LDPC code having the code length N of 16 k bits when the modulation scheme is QPSK and the code rate r is 9/15.

According to the original GW pattern (B) of FIG. 311, the arrangement of bit groups 0 to 44 of the LDPC code of 16 k bits is interleaved into the arrangement of bit groups 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, and 44.

According to the converted GW pattern (A) of FIG. 311, the arrangement of bit groups 0 to 44 of the LDPC code of 16 k bits is interleaved into the arrangement of bit groups 0, 2, 4, 6, 8, 10, 12, 14, 16, 18, 20, 22, 24, 26, 28, 30, 32, 34, 36, 38, 40, 42, 1, 3, 5, 7, 9, 11, 13, 15, 17, 19, 21, 23, 25, 27, 29, 31, 33, 35, 37, 39, 41, 43, and 44.

FIG. 312 is a diagram showing an example of the GW pattern for the LDPC code having the code length N of 16 k bits when the modulation scheme is QPSK and the code rate r is 10/15.

According to the original GW pattern (A) of FIG. 312, the arrangement of bit groups 0 to 44 of the LDPC code of 16 k bits is interleaved into the arrangement of bit groups 1, 4, 5, 6, 24, 21, 18, 7, 17, 12, 8, 20, 23, 29, 28, 30, 32, 34, 36, 38, 40, 42, 0, 2, 3, 14, 22, 13, 10, 25, 9, 27, 19, 16, 15, 26, 11, 31, 33, 35, 37, 39, 41, 43, and 44.

According to the converted GW pattern (B) of FIG. 312, the arrangement of bit groups 0 to 44 of the LDPC code of 16 k bits is interleaved into the arrangement of bit groups 1, 0, 4, 2, 5, 3, 6, 14, 24, 22, 21, 13, 18, 10, 7, 25, 17, 9, 12, 27, 8, 19, 20, 16, 23, 15, 29, 26, 28, 11, 30, 31, 32, 33, 34, 35, 36, 37, 38, 39, 40, 41, 42, 43, and 44.

FIG. 313 is a diagram showing an example of the GW pattern for the LDPC code having the code length N of 16 k bits when the modulation scheme is QPSK and the code rate r is 11/15.

According to the original GW pattern (A) of FIG. 313, the arrangement of bit groups 0 to 44 of the LDPC code of 16 k bits is interleaved into the arrangement of bit groups 0, 2, 4, 6, 8, 10, 12, 14, 16, 18, 20, 22, 24, 26, 28, 30, 32, 34, 36, 38, 40, 42, 1, 3, 5, 7, 9, 11, 13, 15, 17, 19, 21, 23, 25, 27, 29, 31, 33, 35, 37, 39, 41, 43, and 44.

According to the converted GW pattern (B) of FIG. 313, the arrangement of bit groups 0 to 44 of the LDPC code of 16 k bits is interleaved into the arrangement of bit groups 0, 1, 2, 3, 4, 5, 6, 7, 8 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, and 44.

FIG. 314 is a diagram showing an example of the GW pattern for the LDPC code having the code length N of 16 k bits when the modulation scheme is QPSK and the code rate r is 12/15.

According to the original GW pattern (A) of FIG. 314, the arrangement of bit groups 0 to 44 of the LDPC code of 16 k bits is interleaved into the arrangement of bit groups 0, 2, 4, 6, 8, 10, 12, 14, 16, 18, 20, 22, 24, 26, 28, 30, 32, 34, 36, 38, 40, 42, 1, 3, 5, 7, 9, 11, 13, 15, 17, 19, 21, 23, 25, 27, 29, 31, 33, 35, 37, 39, 41, 43, and 44.

According to the converted GW pattern (B) of FIG. 314, the arrangement of bit groups 0 to 44 of the LDPC code of 16 k bits is interleaved into the arrangement of bit groups 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, and 44.

FIG. 315 is a diagram showing an example of the GW pattern for the LDPC code having the code length N of 16 k bits when the modulation scheme is QPSK and the code rate r is 13/15.

According to the original GW pattern (A) of FIG. 315, the arrangement of bit groups 0 to 44 of the LDPC code of 16 k bits is interleaved into the arrangement of bit groups 26, 10, 12, 38, 28, 15, 0, 44, 34, 24, 14, 8, 40, 30, 20, 13, 42, 32, 22, 11, 9, 36, 25, 7, 5, 37, 27, 4, 16, 43, 33, 23, 2, 18, 39, 29, 19, 6, 41, 31, 21, 3, 17, 35, and 1.

According to the converted GW pattern (B) of FIG. 315, the arrangement of bit groups 0 to 44 of the LDPC code of 16 k bits is interleaved into the arrangement of bit groups 26, 25, 10, 7, 12, 5, 38, 37, 28, 27, 15, 4, 0, 16, 44, 43, 34, 33, 24, 23, 14, 2, 8, 18, 40, 39, 30, 29, 20, 19, 13, 6, 42, 41, 32, 31, 22, 21, 11, 3, 9, 17, 36, 35, and 1.

FIG. 316 is a diagram showing an example of the GW pattern for the LDPC code having the code length N of 16 k bits when the modulation scheme is 16-QAM and the code rate r is 2/15.

According to the original GW pattern (A) of FIG. 316, the arrangement of bit groups 0 to 44 of the LDPC code of 16 k bits is interleaved into the arrangement of bit groups 5, 33, 18, 8, 29, 10, 21, 14, 30, 26, 11, 23, 27, 4, 7, 6, 24, 44, 38, 31, 34, 43, 13, 0, 15, 42, 17, 2, 20, 12, 40, 39, 35, 32, 1, 3, 41, 37, 9, 25, 19, 22, 16, 28, and 36.

According to the converted GW pattern (B) of FIG. 316, the arrangement of bit groups 0 to 44 of the LDPC code of 16 k bits is interleaved into the arrangement of bit groups 5, 23, 13, 32, 33, 27, 0, 1, 18, 4, 15, 3, 8, 7, 42, 41, 29, 6, 17, 37, 10, 24, 2, 9, 21, 44, 20, 25, 14, 38, 12, 19, 30, 31, 40, 22, 26, 34, 39, 16, 11, 43, 35, 28, and 36.

FIG. 317 is a diagram showing an example of the GW pattern for the LDPC code having the code length N of 16 k bits when the modulation scheme is 16-QAM and the code rate r is 3/15.

According to the original GW pattern (A) of FIG. 317, the arrangement of bit groups 0 to 44 of the LDPC code of 16 k bits is interleaved into the arrangement of bit groups 18, 16, 5, 29, 26, 43, 23, 6, 1, 24, 7, 19, 37, 2, 27, 3, 10, 15, 36, 39, 22, 12, 35, 33, 4, 17, 30, 31, 21, 9, 11, 41, 0, 32, 20, 40, 25, 8, 34, 38, 28, 14, 44, 13, and 42.

According to the converted GW pattern (B) of FIG. 317, the arrangement of bit groups 0 to 44 of the LDPC code of 16 k bits is interleaved into the arrangement of bit groups 18, 19, 35, 32, 16, 37, 33, 20, 5, 2, 4, 40, 29, 27, 17, 25, 26, 3, 30, 8, 43, 10, 31, 34, 23, 15, 21, 38, 6, 36, 9, 28, 1, 39, 11, 14, 24, 22, 41, 44, 7, 12, 0, 13, and 42.

FIG. 318 is a diagram showing an example of the GW pattern for the LDPC code having the code length N of 16 k bits when the modulation scheme is 16-QAM and the code rate r is 4/15.

According to the original GW pattern (A) of FIG. 318, the arrangement of bit groups 0 to 44 of the LDPC code of 16 k bits is interleaved into the arrangement of bit groups 34, 3, 19, 35, 25, 2, 17, 36, 26, 38, 0, 40, 27, 10, 7, 43, 21, 28, 15, 6, 1, 37, 18, 30, 32, 33, 29, 22, 12, 13, 5, 23, 44, 14, 4, 31, 20, 39, 42, 11, 9, 16, 41, 8, and 24.

According to the converted GW pattern (B) of FIG. 318, the arrangement of bit groups 0 to 44 of the LDPC code of 16 k bits is interleaved into the arrangement of bit groups 34, 40, 18, 14, 3, 27, 30, 4, 19, 10, 32, 31, 35, 7, 33, 20, 25, 43, 29, 39, 2, 21, 22, 42, 17, 28, 12, 11, 36, 15, 13, 9, 26, 6, 5, 16, 38, 1, 23, 41, 0, 37, 44, 8, and 24.

FIG. 319 is a diagram showing an example of the GW pattern for the LDPC code having the code length N of 16 k bits when the modulation scheme is 16-QAM and the code rate r is 5/15.

According to the original GW pattern (A) of FIG. 319, the arrangement of bit groups 0 to 44 of the LDPC code of 16 k bits is interleaved into the arrangement of bit groups 3, 33, 39, 2, 38, 29, 0, 10, 25, 17, 7, 21, 44, 37, 8, 34, 20, 1, 4, 31, 11, 42, 22, 13, 12, 28, 26, 43, 30, 14, 16, 23, 24, 15, 5, 18, 9, 36, 6, 19, 32, 40, 41, 35, and 27.

According to the converted GW pattern (B) of FIG. 319, the arrangement of bit groups 0 to 44 of the LDPC code of 16 k bits is interleaved into the arrangement of bit groups 3, 21, 22, 15, 33, 44, 13, 5, 39, 37, 12, 18, 2, 8, 28, 9, 38, 34, 26, 36, 29, 20, 43, 6, 0, 1, 30, 19, 10, 4, 14, 32, 25, 31, 16, 40, 17, 11, 23, 41, 7, 42, 24, 35, and 27.

FIG. 320 is a diagram showing an example of the GW pattern for the LDPC code having the code length N of 16 k bits when the modulation scheme is 16-QAM and the code rate r is 6/15.

According to the original GW pattern (B) of FIG. 320, the arrangement of bit groups 0 to 44 of the LDPC code of 16 k bits is interleaved into the arrangement of bit groups 12, 13, 15, 30, 27, 25, 11, 34, 9, 4, 31, 22, 6, 32, 7, 21, 17, 3, 1, 26, 10, 33, 19, 2, 18, 5, 28, 35, 8, 16, 29, 23, 14, 0, 20, 24, 36, 37, 38, 39, 40, 41, 42, 43, and 44.

According to the converted GW pattern (A) of FIG. 320, the arrangement of bit groups 0 to 44 of the LDPC code of 16 k bits is interleaved into the arrangement of bit groups 12, 27, 9, 6, 17, 10, 18, 8, 14, 36, 40, 13, 25, 4, 32, 3, 33, 5, 16, 0, 37, 41, 15, 11, 31, 7, 1, 19, 28, 29, 20, 38, 42, 30, 34, 22, 21, 26, 2, 35, 23, 24, 39, 43, and 44.

FIG. 321 is a diagram showing an example of the GW pattern for the LDPC code having the code length N of 16 k bits when the modulation scheme is 16-QAM and the code rate r is 7/15.

According to the original GW pattern (B) of FIG. 321, the arrangement of bit groups 0 to 44 of the LDPC code of 16 k bits is interleaved into the arrangement of bit groups 19, 3, 32, 38, 16, 17, 29, 33, 14, 10, 6, 2, 20, 15, 40, 39, 12, 22, 23, 34, 31, 13, 44, 43, 36, 24, 37, 42, 0, 9, 4, 21, 5, 35, 26, 41, 7, 28, 11, 25, 8, 18, 1, 30, and 27.

According to the converted GW pattern (A) of FIG. 321, the arrangement of bit groups 0 to 44 of the LDPC code of 16 k bits is interleaved into the arrangement of bit groups 19, 16, 14, 20, 12, 31, 36, 0, 5, 7, 8, 3, 17, 10, 15, 22, 13, 24, 9, 35, 28, 18, 32, 29, 6, 40, 23, 44, 37, 4, 26, 11, 1, 38, 33, 2, 39, 34, 43, 42, 21, 41, 25, 30, and 27.

FIG. 322 is a diagram showing an example of the GW pattern for the LDPC code having the code length N of 16 k bits when the modulation scheme is 16-QAM and the code rate r is 8/15.

According to the original GW pattern (A) of FIG. 322, the arrangement of bit groups 0 to 44 of the LDPC code of 16 k bits is interleaved into the arrangement of bit groups 36, 5, 22, 26, 1, 13, 3, 33, 9, 6, 23, 20, 35, 10, 17, 41, 30, 15, 21, 42, 29, 11, 37, 4, 2, 38, 44, 0, 18, 19, 8, 31, 28, 43, 14, 34, 32, 25, 40, 12, 16, 24, 39, 27, and 7.

According to the converted GW pattern (B) of FIG. 322, the arrangement of bit groups 0 to 44 of the LDPC code of 16 k bits is interleaved into the arrangement of bit groups 36, 20, 37, 43, 5, 35, 4, 14, 22, 10, 2, 34, 26, 17, 38, 32, 1, 41, 44, 25, 13, 30, 0, 40, 3, 15, 18, 12, 33, 21, 19, 16, 9, 42, 8, 24, 6, 29, 31, 39, 23, 11, 28, 27, and 7.

FIG. 323 is a diagram showing an example of the GW pattern for the LDPC code having the code length N of 16 k bits when the modulation scheme is 16-QAM and the code rate r is 9/15.

According to the original GW pattern (B) of FIG. 323, the arrangement of bit groups 0 to 44 of the LDPC code of 16 k bits is interleaved into the arrangement of bit groups 4, 6, 19, 2, 5, 30, 20, 11, 22, 12, 15, 0, 36, 37, 38, 39, 26, 14, 34, 35, 16, 13, 18, 42, 7, 10, 25, 43, 40, 17, 41, 24, 33, 31, 23, 32, 21, 3, 27, 28, 8, 9, 29, 1, and 44.

According to the converted GW pattern (A) of FIG. 323, the arrangement of bit groups 0 to 44 of the LDPC code of 16 k bits is interleaved into the arrangement of bit groups 4, 5, 22, 36, 26, 16, 7, 40, 33, 21, 8, 6, 30, 12, 37, 14, 13, 10, 17, 31, 3, 9, 19, 20, 15, 38, 34, 18, 25, 41, 23, 27, 29, 2, 11, 0, 39, 35, 42, 43, 24, 32, 28, 1, and 44.

FIG. 324 is a diagram showing an example of the GW pattern for the LDPC code having the code length N of 16 k bits when the modulation scheme is 16-QAM and the code rate r is 10/15.

According to the original GW pattern (A) of FIG. 324, the arrangement of bit groups 0 to 44 of the LDPC code of 16 k bits is interleaved into the arrangement of bit groups 27, 11, 20, 1, 7, 5, 29, 35, 9, 10, 34, 18, 25, 28, 6, 13, 17, 0, 23, 16, 41, 15, 19, 44, 24, 37, 4, 31, 8, 32, 14, 42, 12, 2, 40, 30, 36, 39, 43, 21, 3, 22, 26, 33, and 38.

According to the converted GW pattern (B) of FIG. 324, the arrangement of bit groups 0 to 44 of the LDPC code of 16 k bits is interleaved into the arrangement of bit groups 27, 18, 19, 2, 11, 25, 44, 40, 20, 28, 24, 30, 1, 6, 37, 36, 7, 13, 4, 39, 5, 17, 31, 43, 29, 0, 8, 21, 35, 23, 32, 3, 9, 16, 14, 22, 10, 41, 42, 26, 34, 15, 12, 33, and 38.

FIG. 325 is a diagram showing an example of the GW pattern for the LDPC code having the code length N of 16 k bits when the modulation scheme is 16-QAM and the code rate r is 11/15.

According to the original GW pattern (B) of FIG. 325, the arrangement of bit groups 0 to 44 of the LDPC code of 16 k bits is interleaved into the arrangement of bit groups 2, 4, 41, 8, 13, 7, 0, 24, 3, 22, 5, 32, 10, 9, 36, 37, 29, 11, 25, 16, 20, 21, 35, 34, 15, 1, 6, 14, 27, 30, 33, 12, 17, 28, 23, 40, 26, 31, 38, 39, 18, 19, 42, 43, and 44.

According to the converted GW pattern (A) of FIG. 325, the arrangement of bit groups 0 to 44 of the LDPC code of 16 k bits is interleaved into the arrangement of bit groups 2, 13, 3, 10, 29, 20, 15, 27, 17, 26, 18, 4, 7, 22, 9, 11, 21, 1, 30, 28, 31, 19, 41, 0, 5, 36, 25, 35, 6, 33, 23, 38, 42, 8, 24, 32, 37, 16, 34, 14, 12, 40, 39, 43, and 44.

FIG. 326 is a diagram showing an example of the GW pattern for the LDPC code having the code length N of 16 k bits when the modulation scheme is 16-QAM and the code rate r is 12/15.

According to the original GW pattern (A) of FIG. 326, the arrangement of bit groups 0 to 44 of the LDPC code of 16 k bits is interleaved into the arrangement of bit groups 3, 6, 7, 27, 2, 23, 10, 30, 22, 28, 24, 20, 37, 21, 4, 14, 11, 42, 16, 9, 15, 26, 33, 40, 5, 8, 44, 34, 18, 0, 32, 29, 19, 41, 38, 17, 25, 43, 35, 36, 13, 39, 12, 1, and 31.

According to the converted GW pattern (B) of FIG. 326, the arrangement of bit groups 0 to 44 of the LDPC code of 16 k bits is interleaved into the arrangement of bit groups 3, 20, 33, 41, 6, 37, 40, 38, 7, 21, 5, 17, 27, 4, 8, 25, 2, 14, 44, 43, 23, 11, 34, 35, 10, 42, 18, 36, 30, 16, 0, 13, 22, 9, 32, 39, 28, 15, 29, 12, 24, 26, 19, 1, and 31.

FIG. 327 is a diagram showing an example of the GW pattern for the LDPC code having the code length N of 16 k bits when the modulation scheme is 16-QAM and the code rate r is 13/15.

According to the original GW pattern (B) of FIG. 327, the arrangement of bit groups 0 to 44 of the LDPC code of 16 k bits is interleaved into the arrangement of bit groups 12, 7, 20, 43, 29, 13, 32, 30, 25, 0, 17, 18, 9, 1, 41, 42, 6, 33, 28, 14, 16, 11, 39, 40, 15, 4, 23, 5, 2, 24, 22, 38, 10, 8, 19, 34, 26, 36, 37, 27, 21, 31, 3, 35, and 44.

According to the converted GW pattern (A) of FIG. 327, the arrangement of bit groups 0 to 44 of the LDPC code of 16 k bits is interleaved into the arrangement of bit groups 12, 29, 25, 9, 6, 16, 15, 2, 10, 26, 21, 7, 13, 0, 1, 33, 11, 4, 24, 8, 36, 31, 20, 32, 17, 41, 28, 39, 23, 22, 19, 37, 3, 43, 30, 18, 42, 14, 40, 5, 38, 34, 27, 35, and 44.

FIG. 328 is a diagram showing an example of the GW pattern for the LDPC code having the code length N of 16 k bits when the modulation scheme is 64-QAM and the code rate r is 2/15.

According to the original GW pattern (A) of FIG. 328, the arrangement of bit groups 0 to 44 of the LDPC code of 16 k bits is interleaved into the arrangement of bit groups 7, 11, 4, 38, 19, 25, 2, 43, 15, 26, 18, 14, 9, 29, 44, 32, 0, 5, 35, 10, 1, 12, 6, 36, 21, 33, 37, 34, 3, 31, 20, 16, 40, 23, 41, 22, 30, 39, 13, 24, 17, 42, 28, 8, and 27.

According to the converted GW pattern (B) of FIG. 328, the arrangement of bit groups 0 to 44 of the LDPC code of 16 k bits is interleaved into the arrangement of bit groups 7, 43, 44, 12, 3, 22, 11, 15, 32, 6, 31, 30, 4, 26, 0, 36, 20, 39, 38, 18, 5, 21, 16, 13, 19, 14, 35, 33, 40, 24, 25, 9, 10, 37, 23, 17, 2, 29, 1, 34, 41, 42, 28, 8, and 27.

FIG. 329 is a diagram showing an example of the GW pattern for the LDPC code having the code length N of 16 k bits when the modulation scheme is 64-QAM and the code rate r is 3/15.

According to the original GW pattern (A) of FIG. 329, the arrangement of bit groups 0 to 44 of the LDPC code of 16 k bits is interleaved into the arrangement of bit groups 19, 34, 22, 6, 29, 25, 23, 36, 7, 8, 24, 16, 27, 43, 11, 35, 5, 28, 13, 4, 3, 17, 15, 38, 20, 0, 26, 12, 1, 39, 31, 41, 44, 30, 9, 21, 42, 18, 14, 32, 10, 2, 37, 33, and 40.

According to the converted GW pattern (B) of FIG. 329, the arrangement of bit groups 0 to 44 of the LDPC code of 16 k bits is interleaved into the arrangement of bit groups 19, 36, 11, 17, 1, 21, 34, 7, 35, 15, 39, 42, 22, 8, 5, 38, 31, 18, 6, 24, 28, 20, 41, 14, 29, 16, 13, 0, 44, 32, 25, 27, 4, 26, 30, 10, 23, 43, 3, 12, 9, 2, 37, 33, and 40.

FIG. 330 is a diagram showing an example of the GW pattern for the LDPC code having the code length N of 16 k bits when the modulation scheme is 64-QAM and the code rate r is 4/15.

According to the original GW pattern (A) of FIG. 330, the arrangement of bit groups 0 to 44 of the LDPC code of 16 k bits is interleaved into the arrangement of bit groups 41, 34, 32, 37, 5, 8, 13, 15, 30, 31, 22, 25, 42, 20, 23, 17, 1, 40, 44, 12, 6, 43, 7, 29, 33, 16, 11, 0, 35, 4, 14, 28, 21, 3, 24, 19, 18, 36, 10, 38, 26, 2, 39, 27, and 9.

According to the converted GW pattern (B) of FIG. 330, the arrangement of bit groups 0 to 44 of the LDPC code of 16 k bits is interleaved into the arrangement of bit groups 41, 15, 23, 43, 35, 19, 34, 30, 17, 7, 4, 18, 32, 31, 1, 29, 14, 36, 37, 22, 40, 33, 28, 10, 5, 25, 44, 16, 21, 38, 8, 42, 12, 11, 3, 26, 13, 20, 6, 0, 24, 2, 39, 27, and 9.

FIG. 331 is a diagram showing an example of the GW pattern for the LDPC code having the code length N of 16 k bits when the modulation scheme is 64-QAM and the code rate r is 5/15.

According to the original GW pattern (A) of FIG. 331, the arrangement of bit groups 0 to 44 of the LDPC code of 16 k bits is interleaved into the arrangement of bit groups 25, 44, 8, 39, 37, 2, 11, 7, 0, 12, 4, 31, 33, 38, 43, 21, 26, 13, 28, 29, 1, 27, 18, 17, 34, 3, 42, 10, 19, 20, 32, 36, 40, 9, 41, 5, 35, 30, 22, 15, 16, 6, 24, 23, and 14.

According to the converted GW pattern (B) of FIG. 331, the arrangement of bit groups 0 to 44 of the LDPC code of 16 k bits is interleaved into the arrangement of bit groups 25, 7, 43, 27, 19, 5, 44, 0, 21, 18, 20, 35, 8, 12, 26, 17, 32, 30, 39, 4, 13, 34, 36, 22, 37, 31, 28, 3, 40, 15, 2, 33, 29, 42, 9, 16, 11, 38, 1, 10, 41, 6, 24, 23, 14.

FIG. 332 is a diagram showing an example of the GW pattern for the LDPC code having the code length N of 16 k bits when the modulation scheme is 64-QAM and the code rate r is 6/15.

According to the original GW pattern (B) of FIG. 332, the arrangement of bit groups 0 to 44 of the LDPC code of 16 k bits is interleaved into the arrangement of bit groups 31, 12, 39, 32, 30, 24, 28, 15, 38, 23, 27, 41, 0, 6, 17, 37, 42, 20, 11, 4, 40, 2, 3, 26, 10, 7, 13, 25, 1, 18, 8, 5, 14, 36, 35, 33, 22, 9, 44, 16, 34, 19, 21, 29, and 43.

According to the converted GW pattern (A) of FIG. 332, the arrangement of bit groups 0 to 44 of the LDPC code of 16 k bits is interleaved into the arrangement of bit groups 31, 28, 0, 11, 10, 8, 22, 12, 15, 6, 4, 7, 5, 9, 39, 38, 17, 40, 13, 14, 44, 32, 23, 37, 2, 25, 36, 16, 30, 27, 42, 3, 1, 35, 34, 24, 41, 20, 26, 18, 33, 19, 21, 29, and 43.

FIG. 333 is a diagram showing an example of the GW pattern for the LDPC code having the code length N of 16 k bits when the modulation scheme is 64-QAM and the code rate r is 7/15.

According to the original GW pattern (B) of FIG. 333, the arrangement of bit groups 0 to 44 of the LDPC code of 16 k bits is interleaved into the arrangement of bit groups 2, 14, 10, 0, 37, 42, 38, 40, 24, 29, 28, 35, 18, 16, 20, 27, 41, 30, 15, 19, 9, 43, 25, 3, 6, 7, 31, 32, 26, 36, 17, 1, 13, 5, 39, 33, 4, 8, 23, 22, 11, 34, 44, 12, and 21.

According to the converted GW pattern (A) of FIG. 333, the arrangement of bit groups 0 to 44 of the LDPC code of 16 k bits is interleaved into the arrangement of bit groups 2, 38, 18, 15, 6, 17, 4, 14, 40, 16, 19, 7, 1, 8, 10, 24, 20, 9, 31, 13, 23, 0, 29, 27, 43, 32, 5, 22, 37, 28, 41, 25, 26, 39, 11, 42, 35, 30, 3, 36, 33, 34, 44, 12, and 21.

FIG. 334 is a diagram showing an example of the GW pattern for the LDPC code having the code length N of 16 k bits when the modulation scheme is 64-QAM and the code rate r is 8/15.

According to the original GW pattern (A) of FIG. 334, the arrangement of bit groups 0 to 44 of the LDPC code of 16 k bits is interleaved into the arrangement of bit groups 36, 6, 2, 20, 43, 17, 33, 22, 23, 25, 13, 0, 10, 7, 21, 1, 19, 26, 8, 14, 31, 35, 16, 5, 29, 40, 11, 9, 4, 34, 15, 42, 32, 28, 18, 37, 30, 39, 24, 41, 3, 38, 27, 12, and 44.

According to the converted GW pattern (B) of FIG. 334, the arrangement of bit groups 0 to 44 of the LDPC code of 16 k bits is interleaved into the arrangement of bit groups 36, 22, 21, 35, 4, 37, 6, 23, 1, 16, 34, 30, 2, 25, 19, 5, 15, 39, 20, 13, 26, 29, 42, 24, 43, 0, 8, 40, 32, 41, 17, 10, 14, 11, 28, 3, 33, 7, 31, 9, 18, 38, 27, 12, and 44.

FIG. 335 is a diagram showing an example of the GW pattern for the LDPC code having the code length N of 16 k bits when the modulation scheme is 64-QAM and the code rate r is 9/15.

According to the original GW pattern (B) of FIG. 335, the arrangement of bit groups 0 to 44 of the LDPC code of 16 k bits is interleaved into the arrangement of bit groups 21, 5, 43, 38, 40, 1, 3, 17, 11, 37, 10, 41, 9, 15, 25, 44, 14, 27, 7, 18, 20, 35, 16, 0, 6, 19, 8, 22, 29, 28, 34, 31, 33, 30, 32, 42, 13, 4, 24, 26, 36, 2, 23, 12, and 39.

According to the converted GW pattern (A) of FIG. 335, the arrangement of bit groups 0 to 44 of the LDPC code of 16 k bits is interleaved into the arrangement of bit groups 21, 3, 9, 7, 6, 34, 13, 5, 17, 15, 18, 19, 31, 4, 43, 11, 25, 20, 8, 33, 24, 38, 37, 44, 35, 22, 30, 26, 40, 10, 14, 16, 29, 32, 36, 1, 41, 27, 0, 28, 42, 2, 23, 12, and 39.

FIG. 336 is a diagram showing an example of the GW pattern for the LDPC code having the code length N of 16 k bits when the modulation scheme is 64-QAM and the code rate r is 10/15.

According to the original GW pattern (A) of FIG. 336, the arrangement of bit groups 0 to 44 of the LDPC code of 16 k bits is interleaved into the arrangement of bit groups 14, 22, 18, 11, 28, 26, 2, 38, 10, 0, 5, 12, 24, 17, 29, 16, 39, 13, 23, 8, 25, 43, 34, 33, 27, 15, 7, 1, 9, 35, 40, 32, 30, 20, 36, 31, 21, 41, 44, 3, 42, 6, 19, 37, and 4.

According to the converted GW pattern (B) of FIG. 336, the arrangement of bit groups 0 to 44 of the LDPC code of 16 k bits is interleaved into the arrangement of bit groups 14, 38, 29, 43, 9, 31, 22, 10, 16, 34, 35, 21, 18, 0, 39, 33, 40, 41, 11, 5, 13, 27, 32, 44, 28, 12, 23, 15, 30, 3, 26, 24, 8, 7, 20, 42, 2, 17, 25, 1, 36, 6, 19, 37, and 4.

FIG. 337 is a diagram showing an example of the GW pattern for the LDPC code having the code length N of 16 k bits when the modulation scheme is 64-QAM and the code rate r is 11/15.

According to the original pattern (A) of FIG. 337, the arrangement of bit groups 0 to 44 of the LDPC code of 16 k bits is interleaved into the arrangement of bit groups 31, 20, 21, 25, 4, 16, 9, 3, 17, 24, 5, 10, 12, 28, 6, 19, 8, 15, 13, 11, 29, 22, 27, 14, 23, 34, 26, 18, 42, 2, 37, 44, 39, 33, 35, 41, 0, 36, 7, 40, 38, 1, 30, 32, and 43.

According to the converted GW pattern (B) of FIG. 337, the arrangement of bit groups 0 to 44 of the LDPC code of 16 k bits is interleaved into the arrangement of bit groups 31, 3, 6, 22, 42, 41, 20, 17, 19, 27, 2, 0, 21, 24, 8, 14, 37, 36, 25, 5, 15, 23, 44, 7, 4, 10, 13, 34, 39, 40, 16, 12, 11, 26, 33, 38, 9, 28, 29, 18, 35, 1, 30, 32, and 43.

FIG. 338 is a diagram showing an example of the GW pattern for the LDPC code having the code length N of 16 k bits when the modulation scheme is 64-QAM and the code rate r is 12/15.

According to the original GW pattern (A) of FIG. 338, the arrangement of bit groups 0 to 44 of the LDPC code of 16 k bits is interleaved into the arrangement of bit groups 17, 11, 14, 7, 31, 10, 2, 26, 0, 32, 29, 22, 33, 12, 20, 28, 27, 39, 37, 15, 4, 5, 8, 13, 38, 18, 23, 34, 24, 6, 1, 9, 16, 44, 21, 3, 36, 30, 40, 35, 43, 42, 25, 19, and 41.

According to the converted GW pattern (B) of FIG. 338, the arrangement of bit groups 0 to 44 of the LDPC code of 16 k bits is interleaved into the arrangement of bit groups 17, 26, 20, 5, 24, 3, 11, 0, 28, 8, 6, 36, 14, 32, 27, 13, 1, 30, 7, 29, 39, 38, 9, 40, 31, 22, 37, 18, 16, 35, 10, 33, 15, 23, 44, 43, 2, 12, 4, 34, 21, 42, 25, 19, and 41.

FIG. 339 is a diagram showing an example of the GW pattern for the LDPC code having the code length N of 16 k bits when the modulation scheme is 64-QAM and the code rate r is 13/15.

According to the original GW pattern (A) of FIG. 339, the arrangement of bit groups 0 to 44 of the LDPC code of 16 k bits is interleaved into the arrangement of bit groups 9, 7, 15, 10, 11, 12, 13, 6, 21, 17, 14, 20, 26, 8, 25, 32, 34, 23, 2, 4, 31, 18, 5, 27, 29, 3, 38, 36, 39, 43, 41, 42, 40, 44, 1, 28, 33, 22, 16, 19, 24, 0, 30, 35, and 37.

According to the converted GW pattern (B) of FIG. 339, the arrangement of bit groups 0 to 44 of the LDPC code of 16 k bits is interleaved into the arrangement of bit groups 9, 6, 25, 18, 39, 28, 7, 21, 32, 5, 43, 33, 15, 17, 34, 27, 41, 22, 10, 14, 23, 29, 42, 16, 11, 20, 2, 3, 40, 19, 12, 26, 4, 38, 44, 24, 13, 8, 31, 36, 1, 0, 30, 35, and 37.

FIG. 340 is a diagram showing an example of the GW pattern for the LDPC code having the code length N of 16 k bits when the modulation scheme is 256-QAM and the code rate r is 2/15.

According to the original GW pattern (A) of FIG. 340, the arrangement of bit groups 0 to 44 of the LDPC code of 16 k bits is interleaved into the arrangement of bit groups 31, 3, 38, 9, 34, 6, 4, 18, 15, 1, 21, 19, 42, 20, 12, 13, 30, 26, 14, 2, 10, 35, 28, 44, 23, 11, 22, 16, 29, 40, 27, 37, 25, 41, 5, 43, 39, 36, 7, 24, 32, 17, 33, 8, and 0.

According to the converted GW pattern (B) of FIG. 340, the arrangement of bit groups 0 to 44 of the LDPC code of 16 k bits is interleaved into the arrangement of bit groups 31, 6, 21, 13, 10, 11, 27, 43, 3, 4, 19, 30, 35, 22, 37, 39, 38, 18, 42, 26, 28, 16, 25, 36, 9, 15, 20, 14, 44, 29, 41, 7, 34, 1, 12, 2, 23, 40, 5, 24, 32, 17, 33, 8, and 0.

FIG. 341 is a diagram showing an example of the GW pattern for the LDPC code having the code length N of 16 k bits when the modulation scheme is 256-QAM and the code rate r is 3/15.

According to the original GW pattern (A) of FIG. 341, the arrangement of bit groups 0 to 44 of the LDPC code of 16 k bits is interleaved into the arrangement of bit groups 5, 22, 23, 26, 29, 27, 16, 1, 4, 25, 41, 21, 12, 2, 6, 8, 7, 19, 44, 42, 39, 40, 43, 35, 10, 28, 13, 15, 37, 32, 3, 24, 36, 38, 11, 18, 33, 30, 14, 9, 34, 20, 0, 17, and 31.

According to the converted GW pattern (B) of FIG. 341, the arrangement of bit groups 0 to 44 of the LDPC code of 16 k bits is interleaved into the arrangement of bit groups 5, 27, 41, 8, 39, 28, 3, 18, 22, 16, 21, 7, 40, 13, 24, 33, 23, 1, 12, 19, 43, 15, 36, 30, 26, 4, 2, 44, 35, 37, 38, 14, 29, 25, 6, 42, 10, 32, 11, 9, 34, 20, 0, 17, and 31.

FIG. 342 is a diagram showing an example of the GW pattern for the LDPC code having the code length N of 16 k bits when the modulation scheme is 256-QAM and the code rate r is 4/15.

According to the original GW pattern (A) of FIG. 342, the arrangement of bit groups 0 to 44 of the LDPC code of 16 k bits is interleaved into the arrangement of bit groups 38, 20, 0, 34, 33, 41, 14, 30, 44, 7, 37, 8, 4, 9, 43, 15, 19, 32, 23, 5, 22, 26, 10, 12, 3, 31, 36, 21, 24, 11, 16, 18, 17, 29, 35, 42, 13, 40, 1, 28, 2, 25, 6, 39, and 27.

According to the converted GW pattern (B) of FIG. 342, the arrangement of bit groups 0 to 44 of the LDPC code of 16 k bits is interleaved into the arrangement of bit groups 38, 41, 37, 15, 22, 31, 16, 42, 20, 14, 8, 19, 26, 36, 18, 13, 0, 30, 4, 32, 10, 21, 17, 40, 34, 44, 9, 23, 12, 24, 29, 1, 33, 7, 43, 5, 3, 11, 35, 28, 2, 25, 6, 39, and 27.

FIG. 343 is a diagram showing an example of the GW pattern for the LDPC code having the code length N of 16 k bits when the modulation scheme is 256-QAM and the code rate r is 5/15.

According to the original GW pattern (A) of FIG. 343, the arrangement of bit groups 0 to 44 of the LDPC code of 16 k bits is interleaved into the arrangement of bit groups 4, 23, 3, 6, 18, 5, 0, 2, 7, 26, 21, 27, 39, 42, 38, 31, 1, 34, 20, 37, 40, 24, 43, 25, 33, 9, 22, 36, 30, 35, 11, 10, 17, 32, 13, 12, 41, 15, 14, 19, 16, 8, 44, 29, and 28.

According to the converted GW pattern (B) of FIG. 343, the arrangement of bit groups 0 to 44 of the LDPC code of 16 k bits is interleaved into the arrangement of bit groups 4, 5, 21, 31, 40, 9, 11, 12, 23, 0, 27, 1, 24, 22, 10, 41, 3, 2, 39, 34, 43, 36, 17, 15, 6, 7, 42, 20, 25, 30, 32, 14, 18, 26, 38, 37, 33, 35, 13, 19, 16, 8, 44, 29, and 28.

FIG. 344 is a diagram showing an example of the GW pattern for the LDPC code having the code length N of 16 k bits when the modulation scheme is 256-QAM and the code rate r is 6/15.

According to the original GW pattern (B) of FIG. 344, the arrangement of bit groups 0 to 44 of the LDPC code of 16 k bits is interleaved into the arrangement of bit groups 17, 13, 25, 24, 14, 21, 1, 37, 2, 3, 11, 22, 18, 5, 10, 23, 12, 4, 26, 16, 38, 36, 33, 39, 0, 6, 7, 31, 32, 34, 27, 35, 15, 9, 30, 28, 19, 8, 20, 29, 40, 41, 42, 43, and 44.

According to the converted GW pattern (A) of FIG. 344, the arrangement of bit groups 0 to 44 of the LDPC code of 16 k bits is interleaved into the arrangement of bit groups 17, 2, 12, 0, 15, 13, 3, 4, 6, 9, 25, 11, 26, 7, 30, 24, 22, 16, 31, 28, 14, 18, 38, 32, 19, 21, 5, 36, 34, 8, 1, 10, 33, 27, 20, 37, 23, 39, 35, 29, 40, 41, 42, 43, and 44.

FIG. 345 is a diagram showing an example of the GW pattern for the LDPC code having the code length N of 16 k bits when the modulation scheme is 256-QAM and the code rate r is 7/15.

According to the original GW pattern (A) of FIG. 345, the arrangement of bit groups 0 to 44 of the LDPC code of 16 k bits is interleaved into the arrangement of bit groups 13, 16, 4, 12, 44, 15, 8, 14, 0, 3, 30, 20, 35, 21, 10, 6, 19, 17, 26, 39, 7, 24, 9, 27, 5, 37, 23, 32, 40, 31, 38, 42, 34, 25, 36, 2, 22, 43, 33, 28, 1, 18, 11, 41, and 29.

According to the converted GW pattern (B) of FIG. 345, the arrangement of bit groups 0 to 44 of the LDPC code of 16 k bits is interleaved into the arrangement of bit groups 13, 15, 30, 6, 7, 37, 38, 2, 16, 8, 20, 19, 24, 23, 42, 22, 4, 14, 35, 17, 9, 32, 34, 43, 12, 0, 21, 26, 27, 40, 25, 33, 44, 3, 10, 39, 5, 31, 36, 28, 1, 18, 11, 41, and 29.

FIG. 346 is a diagram showing an example of the GW pattern for the LDPC code having the code length N of 16 k bits when the modulation scheme is 256-QAM and the code rate r is 8/15.

According to the original GW pattern (A) of FIG. 346, the arrangement of bit groups 0 to 44 of the LDPC code of 16 k bits is interleaved into the arrangement of bit groups 41, 2, 12, 6, 33, 1, 13, 11, 26, 10, 39, 43, 36, 23, 42, 7, 44, 20, 8, 38, 18, 22, 24, 40, 4, 28, 29, 19, 14, 5, 9, 0, 30, 25, 35, 37, 27, 32, 31, 34, 21, 3, 15, 17, and 16.

According to the converted GW pattern (B) of FIG. 346, the arrangement of bit groups 0 to 44 of the LDPC code of 16 k bits is interleaved into the arrangement of bit groups 41, 1, 39, 7, 18, 28, 9, 37, 2, 13, 43, 44, 22, 29, 0, 27, 12, 11, 36, 20, 24, 19, 30, 32, 6, 26, 23, 8, 40, 14, 25, 31, 33, 10, 42, 38, 4, 5, 35, 34, 21, 3, 15, 17, and 16.

FIG. 347 is a diagram showing an example of the GW pattern for the LDPC code having the code length N of 16 k bits when the modulation scheme is 256-QAM and the code rate r is 9/15.

According to the original GW pattern (A) of FIG. 347, the arrangement of bit groups 0 to 44 of the LDPC code of 16 k bits is interleaved into the arrangement of bit groups 5, 7, 9, 22, 10, 12, 3, 43, 6, 4, 24, 13, 14, 11, 15, 18, 19, 17, 16, 41, 25, 26, 20, 23, 21, 33, 31, 28, 39, 36, 30, 37, 27, 32, 34, 35, 29, 2, 42, 0, 1, 8, 40, 38, and 44.

According to the converted GW pattern (B) of FIG. 347, the arrangement of bit groups 0 to 44 of the LDPC code of 16 k bits is interleaved into the arrangement of bit groups 5, 12, 24, 18, 25, 33, 30, 35, 7, 3, 13, 19, 26, 31, 37, 29, 9, 43, 14, 17, 20, 28, 27, 2, 22, 6, 11, 16, 23, 39, 32, 42, 10, 4, 15, 41, 21, 36, 34, 0, 1, 8, 40, 38, and 44.

FIG. 348 is a diagram showing an example of the GW pattern for the LDPC code having the code length N of 16 k bits when the modulation scheme is 256-QAM and the code rate r is 10/15.

According to the original GW pattern (A) of FIG. 348, the arrangement of bit groups 0 to 44 of the LDPC code of 16 k bits is interleaved into the arrangement of bit groups 28, 20, 18, 38, 39, 2, 3, 30, 19, 4, 14, 36, 7, 0, 25, 17, 10, 6, 33, 15, 8, 26, 42, 24, 11, 21, 23, 5, 40, 41, 29, 32, 37, 44, 43, 31, 35, 34, 22, 1, 16, 27, 9, 13, and 12.

According to the converted GW pattern (B) of FIG. 348, the arrangement of bit groups 0 to 44 of the LDPC code of 16 k bits is interleaved into the arrangement of bit groups 28, 2, 14, 17, 8, 21, 29, 31, 20, 3, 36, 10, 26, 23, 32, 35, 18, 30, 7, 6, 42, 5, 37, 34, 38, 19, 0, 33, 24, 40, 44, 22, 39, 4, 25, 15, 11, 41, 43, 1, 16, 27, 9, 13, and 12.

FIG. 349 is a diagram showing an example of the GW pattern for the LDPC code having the code length N of 16 k bits when the modulation scheme is 256-QAM and the code rate r is 11/15.

According to the original GW pattern (B) of FIG. 349, the arrangement of bit groups 0 to 44 of the LDPC code of 16 k bits is interleaved into the arrangement of bit groups 8, 13, 0, 11, 9, 4, 36, 37, 16, 3, 10, 14, 24, 20, 33, 34, 25, 2, 21, 31, 12, 19, 7, 5, 27, 23, 26, 1, 18, 22, 35, 6, 32, 30, 28, 15, 29, 17, 39, 38, 40, 41, 42, 43, and 44.

According to the converted GW pattern (A) of FIG. 349, the arrangement of bit groups 0 to 44 of the LDPC code of 16 k bits is interleaved into the arrangement of bit groups 8, 16, 25, 27, 32, 13, 3, 2, 23, 30, 0, 10, 21, 26, 28, 11, 14, 31, 1, 15, 9, 24, 12, 18, 29, 4, 20, 19, 22, 17, 36, 33, 7, 35, 39, 37, 34, 5, 6, 38, 40, 41, 42, 43, and 44.

FIG. 350 is a diagram showing an example of the GW pattern for the LDPC code having the code length N of 16 k bits when the modulation scheme is 256-QAM and the code rate r is 12/15.

According to the original GW pattern (A) of FIG. 350, the arrangement of bit groups 0 to 44 of the LDPC code of 16 k bits is interleaved into the arrangement of bit groups 28, 21, 10, 15, 8, 22, 26, 2, 14, 1, 27, 3, 39, 20, 34, 25, 12, 6, 7, 40, 30, 29, 38, 16, 43, 33, 4, 35, 9, 32, 5, 36, 0, 41, 37, 18, 17, 13, 24, 42, 31, 23, 19, 11, and 44.

According to the converted GW pattern (B) of FIG. 350, the arrangement of bit groups 0 to 44 of the LDPC code of 16 k bits is interleaved into the arrangement of bit groups 28, 22, 27, 25, 30, 33, 5, 18, 21, 26, 3, 12, 29, 4, 36, 17, 10, 2, 39, 6, 38, 35, 0, 13, 15, 14, 20, 7, 16, 9, 41, 24, 8, 1, 34, 40, 43, 32, 37, 42, 31, 23, 19, 11, and 44.

FIG. 351 is a diagram showing an example of the GW pattern for the LDPC code having the code length N of 16 k bits when the modulation scheme is 256-QAM and the code rate r is 13/15.

According to the original GW pattern (A) of FIG. 351, the arrangement of bit groups 0 to 44 of the LDPC code of 16 k bits is interleaved into the arrangement of bit groups 9, 13, 10, 7, 11, 6, 1, 14, 12, 8, 21, 15, 4, 36, 25, 30, 24, 28, 29, 20, 27, 5, 18, 17, 22, 33, 0, 16, 23, 31, 42, 3, 40, 39, 41, 43, 37, 44, 26, 2, 19, 38, 32, 35, and 34.

According to the converted GW pattern (B) of FIG. 351, the arrangement of bit groups 0 to 44 of the LDPC code of 16 k bits is interleaved into the arrangement of bit groups 9, 6, 21, 30, 27, 33, 42, 43, 13, 1, 15, 24, 5, 0, 3, 37, 10, 14, 4, 28, 18, 16, 40, 44, 7, 12, 36, 29, 17, 23, 39, 26, 11, 8, 25, 20, 22, 31, 41, 2, 19, 38, 32, 35, and 34.

Relationship between Original GW Pattern and Converted GW Pattern

Next, the relationship between the original GW pattern and the converted GW pattern for each code length N of 64 k bits or 16 k bits for each modulation scheme will be described.

Here, the relationship between the GW pattern (A) and the GW pattern (B) when the GW pattern for the block interleaving of the type A (hereinafter, described as a GW pattern (A)) is set as the original GW pattern (A) and the GW pattern for the block interleaving of the type B (hereinafter, described as a GW pattern (B)) is set as the converted GW pattern (B) will be described.

For the sake of convenience in the description, only a case where the GW pattern (A) is set as the original GW pattern (A) and the GW pattern (B) is set as the converted GW pattern (B) will be described below, but it is possible to obtained the same relationship in a case where the GW pattern (B) is set as the original GW pattern (B) and the GW pattern (A) is set as the converted GW pattern (A).

FIG. 352 is a diagram showing the relationship between the GW pattern (A) and the GW pattern (B) for the LDPC code having the code length N of 64 k bits when the modulation scheme is QPSK.

In FIG. 352, the GW pattern (A) of the GW pattern of 0, 1, 2, . . . , 177, 178, 179 may be rewritten into the GW pattern (B).

According to the GW pattern (B) of FIG. 352, the arrangement of bit groups 0 to 179 of the LDPC code of 64 k bits is interleaved into the arrangement of bit groups 0, 90, 1, 91, 2, 92, 3, 93, 4, 94, 5, 95, 6, 96, 7, 97, 8, 98, 9, 99, 10, 100, 11, 101, 12, 102, 13, 103, 14, 104, 15, 105, 16, 106, 17, 107, 18, 108, 19, 109, 20, 110, 21, 111, 22, 112, 23, 113, 24, 114, 25, 115, 26, 116, 27, 117, 28, 118, 29, 119, 30, 120, 31, 121, 32, 122, 33, 123, 34, 124, 35, 125, 36, 126, 37, 127, 38, 128, 39, 129, 40, 130, 41, 131, 42, 132, 43, 133, 44, 134, 45, 135, 46, 136, 47, 137, 48, 138, 49, 139, 50, 140, 51, 141, 52, 142, 53, 143, 54, 144, 55, 145, 56, 146, 57, 147, 58, 148, 59, 149, 60, 150, 61, 151, 62, 152, 63, 153, 64, 154, 65, 155, 66, 156, 67, 157, 68, 158, 69, 159, 70, 160, 71, 161, 72, 162, 73, 163, 74, 164, 75, 165, 76, 166, 77, 167, 78, 168, 79, 169, 80, 170, 81, 171, 82, 172, 83, 173, 84, 174, 85, 175, 86, 176, 87, 177, 88, 178, 89, and 179.

FIG. 353 is a diagram showing the relationship between the GW pattern (A) and the GW pattern (B) for the LDPC code having the code length N of 64 k bits when the modulation scheme is 16-QAM.

In FIG. 353, the GW pattern (A) of the GW pattern of 0, 1, 2, . . . , 177, 178, 179 may be rewritten into the GW pattern (B).

According to the GW pattern (B) of FIG. 353, the arrangement of bit groups 0 to 179 of the LDPC code of 64 k bits is interleaved into the arrangement of bit groups 0, 45, 90, 135, 1, 46, 91, 136, 2, 47, 92, 137, 3, 48, 93, 138, 4, 49, 94, 139, 5, 50, 95, 140, 6, 51, 96, 141, 7, 52, 97, 142, 8, 53, 98, 143, 9, 54, 99, 144, 10, 55, 100, 145, 11, 56, 101, 146, 12, 57, 102, 147, 13, 58, 103, 148, 14, 59, 104, 149, 15, 60, 105, 150, 16, 61, 106, 151, 17, 62, 107, 152, 18, 63, 108, 153, 19, 64, 109, 154, 20, 65, 110, 155, 21, 66, 111, 156, 22, 67, 112, 157, 23, 68, 113, 158, 24, 69, 114, 159, 25, 70, 115, 160, 26, 71, 116, 161, 27, 72, 117, 162, 28, 73, 118, 163, 29, 74, 119, 164, 30, 75, 120, 165, 31, 76, 121, 166, 32, 77, 122, 167, 33, 78, 123, 168, 34, 79, 124, 169, 35, 80, 125, 170, 36, 81, 126, 171, 37, 82, 127, 172, 38, 83, 128, 173, 39, 84, 129, 174, 40, 85, 130, 175, 41, 86, 131, 176, 42, 87, 132, 177, 43, 88, 133, 178, 44, 89, 134, and 179.

FIG. 354 is a diagram showing the relationship between the GW pattern (A) and the GW pattern (B) for the LDPC code having the code length N of 64 k bits when the modulation scheme is 64-QAM.

In FIG. 354, the GW pattern (A) of the GW pattern of 0, 1, 2, . . . , 177, 178, 179 may be rewritten into the GW pattern (B).

According to the GW pattern (B) of FIG. 354, the arrangement of bit groups 0 to 179 of the LDPC code of 64 k bits is interleaved into the arrangement of bit groups 0, 30, 60, 90, 120, 150, 1, 31, 61, 91, 121, 151, 2, 32, 62, 92, 122, 152, 3, 33, 63, 93, 123, 153, 4, 34, 64, 94, 124, 154, 5, 35, 65, 95, 125, 155, 6, 36, 66, 96, 126, 156, 7, 37, 67, 97, 127, 157, 8, 38, 68, 98, 128, 158, 9, 39, 69, 99, 129, 159, 10, 40, 70, 100, 130, 160, 11, 41, 71, 101, 131, 161, 12, 42, 72, 102, 132, 162, 13, 43, 73, 103, 133, 163, 14, 44, 74, 104, 134, 164, 15, 45, 75, 105, 135, 165, 16, 46, 76, 106, 136, 166, 17, 47, 77, 107, 137, 167, 18, 48, 78, 108, 138, 168, 19, 49, 79, 109, 139, 169, 20, 50, 80, 110, 140, 170, 21, 51, 81, 111, 141, 171, 22, 52, 82, 112, 142, 172, 23, 53, 83, 113, 143, 173, 24, 54, 84, 114, 144, 174, 25, 55, 85, 115, 145, 175, 26, 56, 86, 116, 146, 176, 27, 57, 87, 117, 147, 177, 28, 58, 88, 118, 148, 178, 29, 59, 89, 119, 149, and 179.

FIG. 355 is a diagram showing the relationship between the GW pattern (A) and the GW pattern (B) for the LDPC code having the code length N of 64 k bits when the modulation scheme is 256-QAM.

In FIG. 355, the GW pattern (A) of the GW pattern of 0, 1, 2, . . . , 177, 178, 179 may be rewritten into the GW pattern (B).

According to the GW pattern (B) of FIG. 355, the arrangement of bit groups 0 to 179 of the LDPC code of 64 k bits is interleaved into the arrangement of bit groups 0, 22, 44, 66, 88, 110, 132, 154, 1, 23, 45, 67, 89, 111, 133, 155, 2, 24, 46, 68, 90, 112, 134, 156, 3, 25, 47, 69, 91, 113, 135, 157, 4, 26, 48, 70, 92, 114, 136, 158, 5, 27, 49, 71, 93, 115, 137, 159, 6, 28, 50, 72, 94, 116, 138, 160, 7, 29, 51, 73, 95, 117, 139, 161, 8, 30, 52, 74, 96, 118, 140, 162, 9, 31, 53, 75, 97, 119, 141, 163, 10, 32, 54, 76, 98, 120, 142, 164, 11, 33, 55, 77, 99, 121, 143, 165, 12, 34, 56, 78, 100, 122, 144, 166, 13, 35, 57, 79, 101, 123, 145, 167, 14, 36, 58, 80, 102, 124, 146, 168, 15, 37, 59, 81, 103, 125, 147, 169, 16, 38, 60, 82, 104, 126, 148, 170, 17, 39, 61, 83, 105, 127, 149, 171, 18, 40, 62, 84, 106, 128, 150, 172, 19, 41, 63, 85, 107, 129, 151, 173, 20, 42, 64, 86, 108, 130, 152, 174, 21, 43, 65, 87, 109, 131, 153, 175, 176, 177, 178, and 179.

FIG. 356 is a diagram showing the relationship between the GW pattern (A) and the GW pattern (B) for the LDPC code having the code length N of 64 k bits when the modulation scheme is 1024-QAM.

In FIG. 356, the GW pattern (A) of the GW pattern of 0, 1, 2, . . . , 177, 178, 179 may be rewritten into the GW pattern (B).

According to the GW pattern (B) of FIG. 356, the arrangement of bit groups 0 to 179 of the LDPC code of 64 k bits is interleaved into the arrangement of bit groups 0, 18, 36, 54, 72, 90, 108, 126, 144, 162, 1, 19, 37, 55, 73, 91, 109, 127, 145, 163, 2, 20, 38, 56, 74, 92, 110, 128, 146, 164, 3, 21, 39, 57, 75, 93, 111, 129, 147, 165, 4, 22, 40, 58, 76, 94, 112, 130, 148, 166, 5, 23, 41, 59, 77, 95, 113, 131, 149, 167, 6, 24, 42, 60, 78, 96, 114, 132, 150, 168, 7, 25, 43, 61, 79, 97, 115, 133, 151, 169, 8, 26, 44, 62, 80, 98, 116, 134, 152, 170, 9, 27, 45, 63, 81, 99, 117, 135, 153, 171, 10, 28, 46, 64, 82, 100, 118, 136, 154, 172, 11, 29, 47, 65, 83, 101, 119, 137, 155, 173, 12, 30, 48, 66, 84, 102, 120, 138, 156, 174, 13, 31, 49, 67, 85, 103, 121, 139, 157, 175, 14, 32, 50, 68, 86, 104, 122, 140, 158, 176, 15, 33, 51, 69, 87, 105, 123, 141, 159, 177, 16, 34, 52, 70, 88, 106, 124, 142, 160, 178, 17, 35, 53, 71, 89, 107, 125, 143, 161, and 179.

FIG. 357 is a diagram showing the relationship between the GW pattern (A) and the GW pattern (B) for the LDPC code having the code length N of 64 k bits when the modulation scheme is 4096-QAM.

In FIG. 357, the GW pattern (A) of the GW pattern of 0, 1, 2, . . . , 177, 178, 179 may be rewritten into the GW pattern (B).

According to the GW pattern (B) of FIG. 357, the arrangement of bit groups 0 to 179 of the LDPC code of 64 k bits is interleaved into the arrangement of bit groups 0, 15, 30, 45, 60, 75, 90, 105, 120, 135, 150, 165, 1, 16, 31, 46, 61, 76, 91, 106, 121, 136, 151, 166, 2, 17, 32, 47, 62, 77, 92, 107, 122, 137, 152, 167, 3, 18, 33, 48, 63, 78, 93, 108, 123, 138, 153, 168, 4, 19, 34, 49, 64, 79, 94, 109, 124, 139, 154, 169, 5, 20, 35, 50, 65, 80, 95, 110, 125, 140, 155, 170, 6, 21, 36, 51, 66, 81, 96, 111, 126, 141, 156, 171, 7, 22, 37, 52, 67, 82, 97, 112, 127, 142, 157, 172, 8, 23, 38, 53, 68, 83, 98, 113, 128, 143, 158, 173, 9, 24, 39, 54, 69, 84, 99, 114, 129, 144, 159, 174, 10, 25, 40, 55, 70, 85, 100, 115, 130, 145, 160, 175, 11, 26, 41, 56, 71, 86, 101, 116, 131, 146, 161, 176, 12, 27, 42, 57, 72, 87, 102, 117, 132, 147, 162, 177, 13, 28, 43, 58, 73, 88, 103, 118, 133, 148, 163, 178, 14, 29, 44, 59, 74, 89, 104, 119, 134, 149, 164, and 179.

FIG. 358 is a diagram showing the relationship between the GW pattern (A) and the GW pattern (B) for the LDPC code having the code length N of 16 k bits when the modulation scheme is QPSK.

In FIG. 358, the GW pattern (A) of the GW pattern of 0, 1, 2, . . . , 42, 43, 44 may be rewritten into the GW pattern (B).

According to the GW pattern (B) of FIG. 358, the arrangement of bit groups 0 to 44 of the LDPC code of 16 k bits is interleaved into the arrangement of bit groups 0, 22, 1, 23, 2, 24, 3, 25, 4, 26, 5, 27, 6, 28, 7, 29, 8, 30, 9, 31, 10, 32, 11, 33, 12, 34, 13, 35, 14, 36, 15, 37, 16, 38, 17, 39, 18, 40, 19, 41, 20, 42, 21, 43, and 44.

FIG. 359 is a diagram showing the relationship between the GW pattern (A) and the GW pattern (B) for the LDPC code having the code length N of 16 k bits when the modulation scheme is 16-QAM.

In FIG. 359, the GW pattern (A) of the GW pattern of 0, 1, 2, . . . , 42, 43, 44 may be rewritten into the GW pattern (B).

According to the GW pattern (B) of FIG. 359, the arrangement of bit groups 0 to 44 of the LDPC code of 16 k bits is interleaved into the arrangement of bit groups 0, 11, 22, 33, 1, 12, 23, 34, 2, 13, 24, 35, 3, 14, 25, 36, 4, 15, 26, 37, 5, 16, 27, 38, 6, 17, 28, 39, 7, 18, 29, 40, 8, 19, 30, 41, 9, 20, 31, 42, 10, 21, 32, 43, and 44.

FIG. 360 is a diagram showing the relationship between the GW pattern (A) and the GW pattern (B) for the LDPC code having the code length N of 16 k bits when the modulation scheme is 64-QAM.

In FIG. 360, the GW pattern (A) of the GW pattern of 0, 1, 2, . . . , 42, 43, 44 may be rewritten into the GW pattern (B).

According to the GW pattern (B) of FIG. 360, the arrangement of bit groups 0 to 44 of the LDPC code of 16 k bits is interleaved into the arrangement of bit groups 0, 7, 14, 21, 28, 35, 1, 8, 15, 22, 29, 36, 2, 9, 16, 23, 30, 37, 3, 10, 17, 24, 31, 38, 4, 11, 18, 25, 32, 39, 5, 12, 19, 26, 33, 40, 6, 13, 20, 27, 34, 41, 42, 43, and 44.

FIG. 361 is a diagram showing the relationship between the GW pattern (A) and the GW pattern (B) for the LDPC code having the code length N of 16 k bits when the modulation scheme is 256-QAM.

In FIG. 361, the GW pattern (A) of the GW pattern of 0, 1, 2, . . . , 42, 43, 44 may be rewritten into the GW pattern (B).

According to the GW pattern (B) of FIG. 361, the arrangement of bit groups 0 to 44 of the LDPC code of 64 k bits is interleaved into the arrangement of bit groups 0, 5, 10, 15, 20, 25, 30, 35, 1, 6, 11, 16, 21, 26, 31, 36, 2, 7, 12, 17, 22, 27, 32, 37, 3, 8, 13, 18, 23, 28, 33, 38, 4, 9, 14, 19, 24, 29, 34, 39, 40, 41, 42, 43, and 44.

Configuration Example of Bit Deinterleaver 165

FIG. 362 is a block diagram showing a configuration example of the bit deinterleaver 165 of FIG. 207.

The bit deinterleaver 165 includes a block deinterleaver 1031 and a group-wise deinterleaver 1032, and performs (bit) deinterleaving on the symbol bits of the symbol which is the data from the demapper 164 (FIG. 207).

That is, the block deinterleaver 1031 performs the block deinterleaving (reverse processing of the block interleaving) corresponding to the block interleaving performed by the block interleaver 1022 of FIG. 217 on the symbol bits of the symbol from the demapper 164 as a target, that is, the block deinterleaving that returns the positions of (the likelihood of) the code bits of the LDPC code rearranged through the block interleaving to the original positions, and supplies an LDPC code obtained as the result to the group-wise deinterleaver 1032.

The block deinterleaver 1031 corresponds to the block deinterleaving of the type A or the type B, and can perform the block deinterleaving of the type A or the type B.

The group-wise deinterleaver 1032 performs the group-wise deinterleaving (reverse processing of the group-wise interleaving) corresponding to the group-wise interleaving performed by the group-wise interleaver 1021 of FIG. 217 on the LDPC code from the block deinterleaver 1031 as a target, that is, the group-wise deinterleaving that returns the arrangement of the code bits to the original arrangement by, for example, rearranging the code bits of the LDPC code in which the arrangement has been changed for every bit group through the group-wise interleaving for every bit group.

Here, when it is assumed that the block deinterleaving of the type A is performed, the group-wise deinterleaver 1032 rewrites the GW pattern for the block interleaving of the type A into the GW pattern for the block deinterleaving of the type B when the block deinterleaving of the type B is performed. That is, in this case, in the group-wise deinterleaver 1032, the original GW pattern (A) is rewritten into the converted GW pattern (B).

When it is assumed that the block deinterleaving of the type B is performed, the group-wise deinterleaver 1032 rewrites the GW pattern for the block deinterleaving of the type B into the GW pattern for the block deinterleaving of the type A when the block deinterleaving of the type A is performed. That is, in this case, in the group-wise deinterleaver 1032, the original GW pattern (B) is rewritten into the converted GW pattern (A).

When the parity interleaving, the group-wise interleaving and the block interleaving are performed on the LDPC code supplied to the bit deinterleaver 165 from the demapper 164, the bit deinterleaver 165 can perform all of the parity deinterleaving (reverse processing of the parity interleaving, that is, the parity deinterleaving that returns the code bits of the LDPC code in which the arrangement has been changed through the parity interleaving to the original arrangement) corresponding to the parity interleaving, the block deinterleaving corresponding to the block interleaving, and the group-wise deinterleaving corresponding to the group-wise interleaving.

However, in the bit deinterleaver 165 of FIG. 362, the block deinterleaver 1031 that performs the block deinterleaving corresponding to the block interleaving, and the group-wise deinterleaver 1032 that performs the group-wise deinterleaving corresponding to the group-wise interleaving are provided, but the block that performs the parity deinterleaving corresponding to the parity interleaving is not provided, and the parity deinterleaving is not performed.

Accordingly, the LDPC code on which the block deinterleaving and the group-wise deinterleaving have been performed and the parity deinterleaving has not been performed is supplied to the LDPC decoder 166 from (the group-wise deinterleaver 1032 of) the bit deinterleaver 165.

The LDPC decoder 166 performs the LDPC decoding on the LDPC code from the bit deinterleaver 165 by using the transformation check matrix obtained by performing at least the column permutation corresponding to the parity interleaving on the parity check matrix H of the DVB method using the LDPC encoding by the LDPC encoder 115 of FIG. 8 (or the transformation check matrix (FIG. 29) obtained by performing the row permutation on the parity check matrix of the ETRI method (FIG. 27)), and outputs the data obtained as the result as the decoded result of the LDPC target data.

Configuration Example of Block Deinterleaver 1031 Corresponding to Block Deinterleaving of Type A FIG. 363 is a block diagram showing a configuration example of the block deinterleaver 1031 of FIG. 362.

The block deinterleaver 1031 corresponding to the block deinterleaving of the type A has the same configuration as that of the block interleaver 1022 corresponding to the block interleaving of the type A described in FIG. 218.

Accordingly, the block deinterleaver 1031 includes a storage region called a part 1, and a storage region called a part 2, and both of the parts 1 and 2 are configured in such a manner that columns as storage regions which store one bit in the row direction and store a predetermined number of bits in the column direction are arranged by the number C equal to the number of bits m of the symbol.

The block deinterleaver 1031 performs the block deinterleaving of the type A by writing and reading the LDPC code in and from the parts 1 and 2.

In the block deinterleaving of the type A, the writing of the LDPC code (as the symbol) is performed in reading order of the LDPC code performed by the block interleaver 1022 of FIG. 218.

Further, in the block deinterleaving of the type A, the reading of the LDPC code is performed in writing order of the LDPC code performed by the block interleaver 1022 of FIG. 218.

That is, in the block interleaving of the type A by the block interleaver 1022 of FIG. 218, although the LDPC code is written in the column direction and is read in the row direction with respect to the parts 1 and 2, in the block deinterleaving of the type A by the block deinterleaver 1031 of FIG. 363, the LDPC code is written in the row direction and is read in the column direction with respect to the parts 1 and 2.

Configuration Example of Block Deinterleaver 1031 Corresponding to Block Deinterleaving of Type B FIG. 364 is a block diagram showing a configuration example of a block deinterleaver 1031 of FIG. 362.

The block deinterleaver 1031 corresponding to the block deinterleaving of the type B has the same configuration as that of the block interleaver 1022 corresponding to the block interleaving of the type B described in FIG. 224.

Accordingly, the block deinterleaver 1031 includes a storage region called a part 1, and a storage region called a part 2.

The part 1 is configured in such a manner that columns as storage regions which store one bit in the row direction and store a predetermined number of bits in the column direction are arranged in the row direction by the number C equal to the number of bits m of the symbol. The part 2 is configured in such a manner that rows as storage regions which store one bit in the column direction and store a predetermined number of bits in the row direction.

The block deinterleaver 1031 performs the block deinterleaving of the type B by writing and reading the LDPC code in and from the parts 1 and 2.

However, in the block deinterleaving of the type B, the writing of the LDPC code (as the symbol) is performed in reading order of the LDPC code performed by the block interleaver 1022 of FIG. 224.

Moreover, in the block deinterleaving of the type B, the reading of the LDPC code is performed in writing order of the LDPC code performed by the block interleaver 1022 of FIG. 224.

That is, in the block interleaving of the type B by the block interleaver 1022 of FIG. 224, since the LDPC code is written in the row direction and read in the row direction with respect to the parts 1 and 2, in the block deinterleaving of the type B by the block deinterleaver 1031 of FIG. 364, the LDPC code is written in the row direction and is read in the row direction with respect to the parts 1 and 2.

Another Configuration Example of Bit Deinterleaver 165

FIG. 365 is a block diagram showing another configuration example of the bit deinterleaver 165 of FIG. 207.

In the drawing, the parts corresponding to those in FIG. 362 will be assigned the same reference numerals, and the description thereof will be appropriately omitted in the following description.

That is, the bit deinterleaver 165 of FIG. 365 has the same configuration as that in FIG. 362 except for the fact that a parity deinterleaver 1011 is newly provided.

In FIG. 365, the bit deinterleaver 165 includes the block deinterleaver 1031, the group-wise deinterleaver 1032, and the parity deinterleaver 1011, and performs the bit deinterleaving on the code bits of the LDPC code from the demapper 164.

That is, the block deinterleaver 1031 performs the block deinterleaving (reverse processing of the block interleaving) corresponding to the block interleaving performed by the block interleaver 1022 of the transmission apparatus 11 on the LDP code from the demapper 164 as a target, that is, the block deinterleaving that returns the positions of the code bits replaced through the block interleaving to the original positions, and supplies an LDPC code obtained as the result to the group-wise deinterleaver 1032.

The group-wise deinterleaver 1032 performs the group-wise deinterleaving corresponding to the group-wise interleaving as the rearranging process performed by the group-wise interleaver 1021 of the transmission apparatus 11 on the LDPC code from the block deinterleaver 1031 as a target.

The LDPC code obtained as the result of the group-wise deinterleaving is supplied to the parity deinterleaver 1011 from the group-wise deinterleaver 1032.

The parity deinterleaving performed by the parity deinterleaver 1011 and the LDPC decoding on the LDPC code performed by the LDPC decoder 166 are the same as those in FIG. 216, and thus, the description thereof will be omitted below.

For the sake of convenience in the description, although it has been described in FIG. 365 that the block deinterleaver 1031 that performs the block deinterleaving, the group-wise deinterleaver 1032 that performs the group-wise deinterleaving and the parity deinterleaver 1011 that performs the parity deinterleaving are individually provided, two or more of the block deinterleaver 1031, the group-wise deinterleaver 1032 and the parity deinterleaver 1011 may be integrally configured similarly to the parity interleaver 23, the group-wise interleaver 1021 and the block interleaver 1022 of the transmission apparatus 11.

Configuration Example of Reception System

FIG. 366 is a block diagram showing a first configuration example of a reception system to which the reception apparatus 12 can be applied.

In FIG. 366, the reception system includes an acquisition unit 1101, a transmission channel decoding unit 1102, and an information source decoding unit 1103.

The acquisition unit 1101 obtains a signal including the LDPC code obtained by performing at least the LDPC encoding on the LDPC target data such as image data or voice data of a program through a non-illustrated transmission channel (communication channel) such as terrestrial digital broadcasting, satellite digital broadcasting, a CATV network, or other networks other than the Internet, and supplies the obtained signal to the transmission channel decoding unit 1102.

Here, when the signal obtained by the acquisition unit 1101 is broadcasted from, for example, a broadcasting station through the terrestrial digital broadcasting, the satellite digital broadcasting, or the cable television (CATV) network, the acquisition unit 1101 is configured as a tuner or a set-top box (STB). When the signal obtained by the acquisition unit 1101 is transmitted using, for example, multicast such as an internet protocol television (IPTV) from a web server, the acquisition unit 1101 is configured as a network interface (I/F) such as a network interface card (NIC).

The transmission channel decoding unit 1102 corresponds to the reception apparatus 12. The transmission channel decoding unit 1102 performs transmission channel decoding including at least a process of correcting an error occurring in a transmission channel on the signal obtained by the acquisition unit 1101 through the transmission channel, and supplies a signal obtained as the result to the information source decoding unit 1103.

That is, the signal obtained by the acquisition unit 1101 through the transmission channel is a signal obtained by performing at least an error correcting encoding for correcting the error in the transmission channel, and the transmission channel decoding unit 1102 performs the transmission channel decoding such as an error correcting process on the signal.

Here, examples of the error correcting encoding includes LDPC encoding and BCH encoding. Here, as the error correcting encoding, at least the LDPC encoding is performed.

In addition, the transmission channel decoding may include decoding on a modulation signal.

The information source decoding unit 1103 performs information source decoding including at least a process of decompressing compressed information to original information on the signal on which the transmission channel decoding has been performed.

That is, in order to reduce the amount of data such as image or voice as information, compression encoding that compresses the information may be performed on the signal obtained by the acquisition unit 1101 through the transmission channel, and in this case, the information source decoding unit 1103 performs the information source decoding such as the process (decompression process) of decompressing the compressed information to the original information on the signal on which the transmission channel decoding has been performed.

When the compression encoding has not been performed on the signal obtained by the acquisition unit 1101 through the transmission channel, the information source decoding unit 1103 does not perform the process of decompressing the compressed information to the original information.

Here, as the decompression process, there is, for example, a MPEG decoding. The transmission channel decoding may include descrambling in addition to the decompression process.

In the reception system having the aforementioned configuration, the compression encoding such as MPEG encoding is performed on data such as image or voice in the acquisition unit 1101, and the signal on which the error correcting encoding such as LDPC encoding has been performed is obtained through the transmission channel and is supplied to the transmission channel decoding unit 1102.

In the transmission channel decoding unit 1102, for example, the same process as that performed by the reception apparatus 12 is performed on the signal from the acquisition unit 1101, as the transmission channel decoding, and a signal obtained as the result is supplied to the information source decoding unit 1103.

In the information source decoding unit 1103, the information source decoding such as MPEG decoding is performed on the signal from the transmission channel decoding unit 1102, and an image or a voice obtained as the result is output.

For example, the reception system of FIG. 366 described above may be applied to a television tuner that receives television broadcasting as digital broadcasting.

The acquisition unit 1101, the transmission channel decoding unit 1102 and the information source decoding unit 1103 may be independently configured as one device (hardware (integrated circuit (IC)) or software).

With regard to the acquisition unit 1101, the transmission channel decoding unit 1102 and the information source decoding unit 1103, a set of the acquisition unit 1101 and the transmission channel decoding unit 1102, a set of the transmission channel decoding unit 1102 and the information source decoding unit 1103, and a set of the acquisition unit 1101, the transmission channel decoding unit 1102 and the information source decoding unit 1103 may be independently configured as one device.

FIG. 367 is a block diagram showing a second configuration example of the reception system to which the reception apparatus 12 can be applied.

In the drawing, the parts corresponding to those in FIG. 366 will be assigned the same reference numerals, and thus, the description thereof will be appropriately omitted.

The reception system of FIG. 367 has in common with the reception system of FIG. 366 in that the acquisition unit 1101, the transmission channel decoding unit 1102 and the information source decoding unit 1103 are provided, and has a difference from the reception system of FIG. 366 in that an output unit 1111 is newly provided.

The output unit 1111 is, for example, a display unit that displays an image or a speaker that outputs a voice, and outputs an image or a voice as the signal output from the information source decoding unit 1103. That is, the output unit 1111 displays the image or outputs the voice.

For example, the reception system of FIG. 367 described above may be applied to a TV (television receiver) that receives television broadcasting as digital broadcasting or a radio receiver that receives radio broadcasting.

When the compression encoding has not been performed on the signal obtained in the acquisition unit 1101, the signal output from the transmission channel decoding unit 1102 is supplied to the output unit 1111.

FIG. 368 is a block diagram showing a third configuration example of the reception system to which the reception apparatus 12 can be applied.

In the drawing, the parts corresponding to those in FIG. 366 will be assigned the same reference numerals, and thus, the description thereof will be appropriately omitted.

The reception system of FIG. 368 has in common with the reception system in FIG. 366 in that the acquisition unit 1101 and the transmission channel decoding unit 1102 are provided.

However, the reception system of FIG. 368 has a difference from the reception system of FIG. 366 in that the information source decoding unit 1103 is not provided and a recording unit 1121 is newly provided.

The recording unit 1121 records (stores) the signal (for example, TS packet of TS of MPEC) output from the transmission channel decoding unit 1102 in a recording (storing) medium such as an optical disc, a hard disc (magnetic disc), or a flash memory.

The reception system of FIG. 368 described above may be applied to a recorder that records television broadcasting.

In FIG. 368, the reception system includes the information source decoding unit 1103, and in the information source decoding unit 1103, the signal on which the information source decoding has been performed, that is, the image or the voice obtained through decoding can be recorded in the recording unit 1121.

Embodiment of Computer

Next, a series of processes described above may be performed by hardware or may be performed by software. When the series of processes is performed by software, programs constituting the software are installed in a general-purpose computer.

Here, FIG. 369 shows a configuration example of an embodiment of a computer in which the programs for executing the series of processes are installed.

The programs may be previously recorded in a hard disc 705 or a ROM 703 as a recording medium embedded in the computer.

Alternatively, the programs may be temporarily or permanently stored (recorded) in a removable recording medium 711 such as a flexible disc, a compact disc read-only memory (CD-ROM), a magneto-optical (MO) disc, a digital versatile disc (DVD), a magnetic disc, or a semiconductor memory. The removable recording medium 711 may be provided as so-called package software.

The programs may be installed in the computer from the removable recording medium 711, may be wirelessly transmitted to the computer from a download site through an artificial satellite for digital satellite broadcasting, or may be transmitted to the computer through a network such as a local area network (LAN) or the Internet in a wired manner. In the computer, the programs transmitted in this manner may be received by a communication unit 708, and may be installed in the hard disc 705 embedded therein.

The computer includes a central processing unit (CPU) 702. An input and output interface 710 is connected to the CPU 702 through a bus 701, and when an instruction is input by an operation input of an input unit 707 including a keyboard, a mouse or a microphone by a user through the input and output interface 710, the CPU 702 executes the programs stored in the read-only memory (ROM) 703 in response to the instruction. Alternatively, the CPU 702 downloads the programs stored in the hard disc 705, the programs which is transmitted from the satellite or the network, received by the communication unit 708 and installed in the hard disc 705, and the programs which is read from the removable recording medium 711 provided in a drive 709 and is installed in the hard disc 705 in a random-access memory (RAM) 704, and executes the downloaded programs. Thus, the CPU 702 performs the process according to the flowchart described above or the process performed by the configuration of the block diagram described above. The CPU 702 outputs the processed result from an output unit 706 including a liquid crystal display (LCD) or a speaker through, for example, the input and output interface 710 when necessary, transmits the processed result from the communication unit 708, or records the processed result in the hard disc 705.

Here, in the present specification, processing steps that describe the programs for causing the computer to perform various processes are not necessarily performed in a sequence of time in the order described as the flowchart, and may include processes which are executed in parallel or individual manner (for example, a parallel process or a process by objects).

Furthermore, the programs may be processed by one computer, or may be processed in a distributed manner by a plurality of computers. Further, the programs may be executed by being transmitted to a remote computer.

The embodiments of the present technology are not limited to the embodiments described above, and can be variously changed within the scope without departing from the gist of the present technology.

That is, for example, in (the parity check matrix initial value table of) the new LDPC encoding described above, the communication channel 13 (FIG. 7) may use a satellite channel, a terrestrial channel, or a cable (wired channel), and other channels. The new LDPC code may be used in data transmission other then digital broadcasting.

The GW pattern described above may be applied to encoding other than the new LDPC encoding. Moreover, a modulation scheme to which the GW pattern described above is applied is not limited to QPSK, 16-QAM, 64-QAM, 256-QAM, 1024-QAM or 4096-QAM.

The effects described in the present specification are merely examples, and are not limited. Other effects may be obtained.

What is claimed is:

1. A transmitting apparatus for generating a signal and for decreasing a signal-to-noise power ratio of the generated signal, the transmitting apparatus comprising:

circuitry configured to perform group-wise interleaving which interleaves an LDPC code word generated using an LDPC code having a code length (N) of 16,200 bits or 64,800 bits for every bit group of 360 bits;

perform block interleaving in such a manner that an LDPC code word obtained by performing the group-wise interleaving is written in m number of columns as storage regions arranged in the row direction, m bits are obtained by respectively reading the LDPC code word from in number of columns bit by bit, and the m bits are interleaved into one symbol corresponding to any one of 2m number of signal points defined by a modulation scheme; and transmit the signal including the LDPC code word obtained by performing the group-wise interleaving and performing the block interleaving, wherein a type of the block interleaving includes a type A in which the writing of an LDPC code word obtained by performing the group-wise interleaving in the column direction of the columns is iteratively performed on m number of columns, and a type B in which the writing of an LDPC code word obtained by performing the group-wise interleaving in the row direction of m number of columns for every bit group is iteratively performed, wherein a MODCOD which is a combination of the LDPC code word and the modulation scheme includes a MODCOD-A which is a MODCOD based on the the block interleaving of the type A, and a MODCOD-B which is a MODCOD based on the block interleaving of the type B, wherein when the block interleaving of the type A is performed on the LDPC code word of the MODCOD-B, the circuitry performs the group-wise interleaving on the LDPC code word of the MODCOD-B such that a same block interleaving result as a block interleaving result obtained when the block interleaving of the type B is performed is obtained, and when the block interleaving of the type B is performed on the LDPC code word of the MODCOD-A, the circuitry performs the group-wise interleaving on the LDPC code word of the MODCOD-A such that a same block interleaving result as a block interleaving result obtained when the block interleaving of the type A is performed is obtained.

2. A transmitting method for generating a signal and for decreasing a signal-to-noise power ratio of the generated signal, the transmitting method comprising:

group-wise interleaving which interleaves an LDPC code word generated using an LDPC code having a code length (N) of 16,200 bits or 64,800 bits for every bit group of 360 bits;

block interleaving in such a manner that an LDPC code word obtained by performing the group-wise interleaving is written in m number of columns as storage regions arranged in the row direction, m bits are obtained by respectively reading the LDPC code word from m number of columns bit by bit, and the in bits are interleaved into one symbol corresponding to any one of 2m number of signal points defined by a modulation scheme; and transmitting the signal including the LDPC code word obtained by performing the group-wise interleaving and performing the block interleaving, wherein a type of the block interleaving includes a type A in which the writing of an LDPC code word obtained by performing the group-wise interleaving in the column direction of the columns is iteratively performed on m number of columns, and a type B in which the writing of an LDPC code word obtained by performing the group-wise interleaving in the row direction of m number of columns for every bit group is iteratively performed, wherein a MODCOD which is a combination of the LDPC code word and the modulation scheme includes a MODCOD-A which is a MODCOD based on block interleaving of the type A, and a MODCOD-B which is a MODCOD based on the block interleaving of the type B, wherein when the block interleaving of the type A is performed on the LDPC code word of the MODCOD-B, in the group-wise interleaving, the group-wise interleaving is performed on the LDPC code word of the MODCOD-B such that a same block interleaving result as a block interleaving result obtained when the block interleaving of the type B is performed is obtained, and when the block interleaving of the type B is performed on the LDPC code word of the MODCOD-A, in the group-wise interleaving, the group-wise interleaving is performed on the LDPC code word of the MODCOD-A such that a same block interleaving result as a block interleaving result obtained when the block interleaving of the type A is performed is obtained.

3. A receiving apparatus for use in an environment where a signal-to-noise power ratio of a received signal can be reduced, the receiving apparatus comprising:

circuitry configured to perform block deinterleaving which generates, from m bits of a symbol obtained from a signal transmitted from a transmission apparatus, an LDPC code word obtained by performing group-wise interleaving; and perform group-wise deinterleaving which generates, from the LDPC code word obtained by performing the group-wise interleaving, an original LDPC code word, wherein the data transmitted from the transmission apparatus is processed in the transmission apparatus b circuitry configured to perform group-wise interleaving which interleaves the original LDPC code word having a code length (N) of 16,200 bits or 64,800 bits for every bit group of 360 bits, perform block interleaving in such a manner that an LDPC code word obtained by performing the group-wise interleaving is written in m number of columns as storage regions arranged in the row direction, m bits are obtained by respectively reading the LDPC code word from m number of columns bit by bit, and the m bits are interleaved into one symbol corresponding to any one of 2m number of signal points defined by a modulation scheme, and transmit the signal including the LDPC code word obtained by performing the group-wise interleaving and performing the block interleaving, wherein a type of the block interleaving includes a type A in which the writing of an LDPC code word obtained by performing the group-wise interleaving in the column direction of the columns is iteratively performed on m number of columns, and a type B in which the writing of an LDPC code word obtained by performing the group-wise interleaving in the row direction of m number of columns for every bit group is iteratively performed, wherein a MODCOD which is a combination of the LDPC code word and the modulation scheme includes a MODCOD-A which is a MODCOD based on the block interleaving of the type A, and a MODCOD-B which is a MODCOD based on the block interleaving of the type B, wherein when the block interleaving of the type A is performed on the LDPC code word of the MODCOD-B, the circuitry of the transmission apparatus performs the group-wise interleaving on the LDPC code word of the MODCOD-B such that a same block interleaving result as a block interleaving result obtained when the block interleaving of the type Bis performed is obtained, and when the block interleaving of the type B is performed on the LDPC code word of the MODCOD-A, the circuitry of the transmission apparatus performs the group-wise interleaving on the LDPC code word of the MODCOD-A such that a same block interleaving result as a block interleaving result obtained when the block interleaving of the type A is performed is obtained.

4. A receiving method for use in an environment where a signal-to-noise power ratio of a received signal can be reduced, the receiving method comprising:

block deinterleaving which generates, from m bits of a symbol obtained from a signal transmitted from a transmission apparatus, an LDPC code word obtained by performing group-wise interleaving; and group-wise deinterleaving which generates, from the LDPC code word obtained by performing the group-wise interleaving, an original LDPC code word, wherein the data transmitted from the transmission apparatus is processed in the transmission apparatus b circuitry configured to perform group-wise interleaving which interleaves the original LDPC code word having a code length (N) of 16,200 bits or 64,800 bits for every bit group of 360 bits, perform block interleaving in such a manner that an LDPC code word obtained by performing the group-wise interleaving is written in m number of columns as storage regions arranged in the row direction, in bits are obtained by respectively reading the LDPC code word from m number of columns bit by bit, and the m bits are interleaved into one symbol corresponding to any one of 2m number of signal points defined by a modulation scheme, and transmit the signal including the LDPC code word obtained by performing the group-wise interleaving and performing the block interleaving, wherein a type of the block interleaving includes a type A in which the writing of an LDPC code word obtained by performing the group-wise interleaving in the column direction of the columns is iteratively performed on m number of columns, and a type B in which the writing of an LDPC code word obtained by performing the group-wise interleaving in the row direction of m number of columns for every bit group is iteratively performed, wherein a MODCOD which is a combination of the LDPC code word and the modulation scheme includes a MODCOD-A which is a MODCOD based on the block interleaving of the type A, and a MODCOD-B which is a MODCOD based on the block interleaving of the type B, and wherein when the block interleaving of the type A is performed on the LDPC code word of the MODCOD-B, the circuitry of the transmission apparatus performs the group-wise interleaving on the LDPC code word of the MODCOD-B such that a same block interleaving result as a block interleaving result obtained when the block interleaving of the type B is performed is obtained, and when the block interleaving of the type B is performed on the LDPC code word of the MODCOD-A, the circuitry of the transmission apparatus performs the group-wise interleaving on the LDPC code word of the MODCOD-A such that a same block interleaving result as a block interleaving result obtained when the block interleaving of the type A is performed is obtained.

* * * * *